US007582411B2

(12) United States Patent
Matsuzawa et al.

(10) Patent No.: US 7,582,411 B2
(45) Date of Patent: Sep. 1, 2009

(54) ANTIREFLECTIVE FILM AND EXPOSURE METHOD

(75) Inventors: Nobuyuki Matsuzawa, Tokyo (JP); Yoko Watanabe, Kanagawa (JP); Boontarika Thunnakart, Kanagawa (JP); Ken Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 408 days.

(21) Appl. No.: 11/467,983

(22) Filed: Aug. 29, 2006

(65) Prior Publication Data

US 2007/0097514 A1 May 3, 2007

(30) Foreign Application Priority Data

Sep. 6, 2005 (JP) ........................... P2005-257626
Feb. 15, 2006 (JP) ........................... P2006-092240

(51) Int. Cl.
*H01L 21/027* (2006.01)
*G03F 7/20* (2006.01)
*G03F 7/11* (2006.01)

(52) U.S. Cl. ................ 430/311; 430/272.1; 430/271.1; 430/273.1; 438/952

(58) Field of Classification Search ....................... None
See application file for complete search history.

(56) References Cited

U.S. PATENT DOCUMENTS

2006/0194125 A1* 8/2006 Matsuzawa et al. ............ 430/5

* cited by examiner

*Primary Examiner*—Cynthia Hamilton
(74) *Attorney, Agent, or Firm*—Sonnenschein Nath & Rosenthal LLP

(57) ABSTRACT

An antireflective film is provided between a resist layer and a silicon oxide layer formed on a surface of a silicon substrate, for exposure of the resist layer in an exposure system having a wavelength of 190 nm to 195 nm and a numerical aperture NA of 0.93 to 1.2. Assuming that the complex refractive indexes of upper and lower layers constituting the antireflective film are $N_1$ $(=n_1-k_1i)$ and $N_2$ $(=n_2-k_2i)$, respectively, and the thicknesses of both layers are $d_1$ and $d_2$, when a predetermined combination of values of $[n_{10}, k_{10}, d_{10}, n_{20}, k_{20}, d_{20}]$ is selected, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2\leqq 1.$$

10 Claims, 1 Drawing Sheet

FIGURE
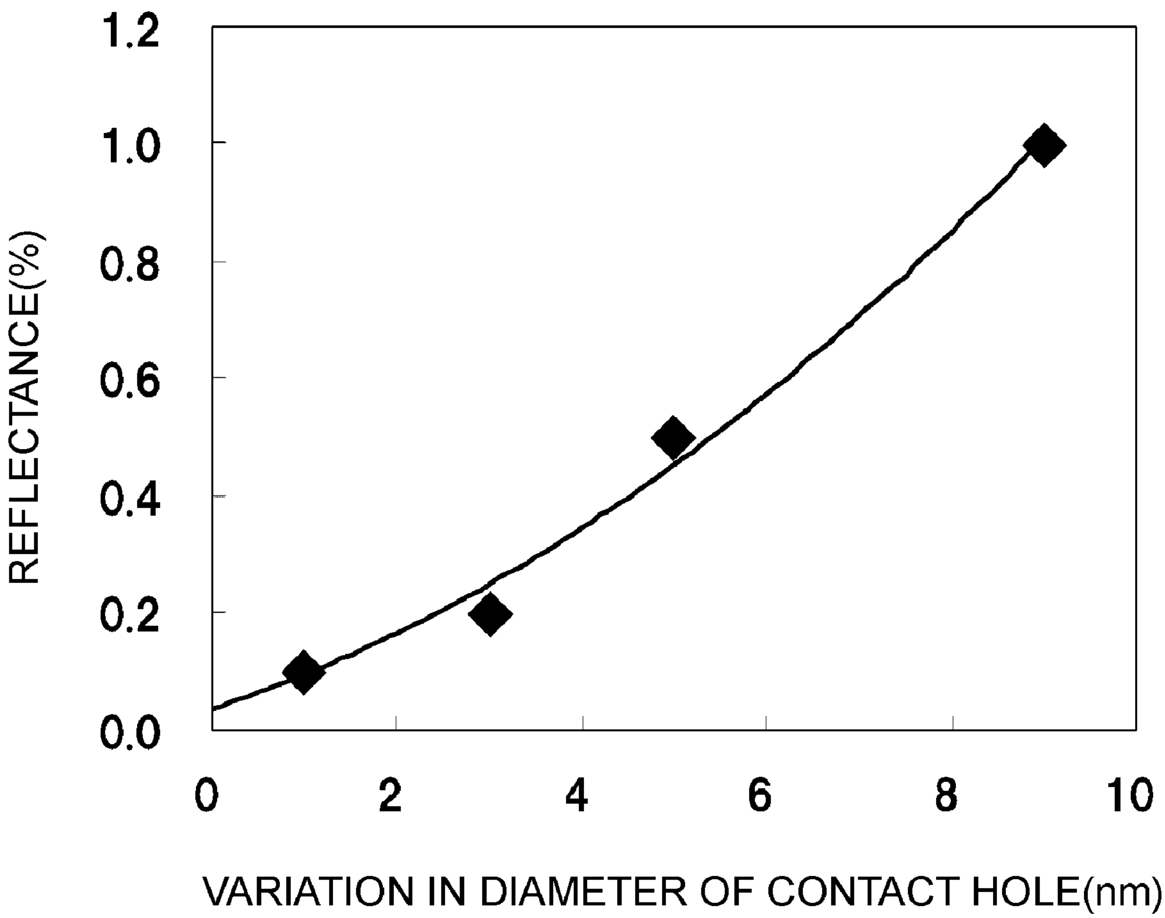

ANTIREFLECTIVE FILM AND EXPOSURE METHOD

CROSS REFERENCES TO RELATED APPLICATIONS

The present invention contains subject matter related to Japanese Patent Application JP 2005-257626 filed in the Japanese Patent Office on Sep. 6, 2005 and Japanese Patent Application JP 2006-092240 filed in the Japanese Patent Office on Feb. 15, 2006, the entire contents of which are incorporated herein by reference.

BACKGROUND OF THE INVENTION

1. Field of the Invention

The present invention relates to an antireflective film used for exposure of a resist layer in a process for manufacturing a semiconductor device, and an exposure method using the antireflective film.

2. Description of the Related Art

In the field of semiconductor devices, it has been urgent to establish a new process technique permitting processing of submicron patterns of, for example, 65 nm or less. A so-called photolithographic technique may be required for processing submicron patterns, and an argon-fluoride (ArF) excimer laser at a wavelength of 193 nm is currently used as an exposure light source in order to improve optical resolution and comply with submicron processing by shortening the wavelength of exposure light (illuminating light).

A silicon semiconductor substrate is patterned using a photosensitive resist layer which is formed by applying on a surface of the silicon semiconductor substrate coated with an oxide film. However, when exposure light (illuminating light) has high reflectance at an interface between the resist layer and the silicon oxide film used as an underlying layer, a stationary wave is significantly induced in the resist layer. As a result, the sides of the resist layer patterned by development have irregularity according to the shape of the stationary wave, thereby causing the problem of failing to form a satisfactory rectangular pattern in the resist layer. The pattern formed in the resist layer may be referred to as a "resist pattern". For example, when a resist layer having a refractive index of 1.70 is provided on a silicon oxide film of 100 nm in thickness formed on a surface of a silicon semiconductor substrate, the reflectance of exposure light at a wavelength of 193 nm is as high as about 70% in vertical incidence of the exposure light.

In order to resolve the above-mentioned problem, in a photolithographic technique using usual exposure light at a wavelength of 193 nm, a single-layer antireflective film is formed between a silicon semiconductor substrate and a resist layer. For example, when a resist layer having a refractive index of 1.70 is formed on an antireflective film having a thickness of 100 nm and a complex refractive index $N_0$ ($=n_o-k_0i$ wherein $n_o=1.75$ and $k_0=0.30$), which is formed on a silicon oxide film of 100 nm in thickness formed on a surface of a silicon semiconductor substrate, the reflectance at the interface between the resist layer and the antireflective film is greatly decreased to about 1% in vertical incidence of exposure light.

SUMMARY OF THE INVENTION

The limiting resolution of a photolithographic technique is about 0.3 times the wavelength of exposure light. Therefore, in a photolithographic technique using an ArF excimer laser at a wavelength of 193 nm as an exposure light source, the limiting resolution is about 60 nm.

As a technique for forming a finer pattern of less than about 60 nm on a silicon semiconductor substrate, there has been advanced the development of an immersion lithographic technique in which a space between an exposure system (illumination system) and a resist layer is filled with a medium (e.g., an aqueous immersion light) having a higher refractive index than that of air to realize higher resolution.

Exposure through an immersion liquid is capable of achieving higher resolving performance because the effective wavelength of exposure light is a value obtained by dividing the wavelength of exposure light in a vacuum by the refractive index of the immersion liquid. For example, in the use of an ArF excimer laser at a wavelength of 193 nm as a exposure light source and water (refractive index of 1.44 at 193 nm) as the immersion liquid, the effective wavelength is about 134 nm, and the limiting resolution is 0.3 times the effective wavelength, i.e., about 40 nm. In other words, the immersion lithographic technique using water is capable of forming a micro pattern of less than about 60 nm on a silicon semiconductor substrate.

A focus tolerance (DOF) in exposure is given by the following equation:

$$DOF=n_{Liq}\cdot K_2\cdot\lambda/NA^2$$

wherein $n_{Liq}$ is the refractive index of the immersion liquid, $K_2$ is a constant depending on the process, $\lambda$ is the wavelength of exposure light (illuminating light) in a vacuum, and NA is the numerical aperture of an exposure system (illumination system).

Therefore, when the numerical aperture NA is constant, the focus tolerance DOF in immersion lithography is $n_{Liq}$ times as large as in usual lithography by exposure in the air. Namely, immersion lithography using water as the immersion liquid has a focus tolerance DOF of 1.44 times and thus permits the construction of a mass production process with a higher tolerance.

However, such an immersion lithographic technique has the problem that a general single-layer antireflective film does not effectively function.

Exposure light is transmitted through an incident medium, incident on a resist layer, and further incident on an antireflective film. The exposure light satisfies the equation below in which $\theta_{in}$ is the angle of incidence of the exposure light from the incident medium to the resist layer, $n_{in}$ is the refractive index of the incident medium, $\theta_{IF}$ is the angle of incidence of the exposure light from the resist layer to the silicon semiconductor substrate or the antireflective film, and $n_{Res}$ is the refractive index of a resist material constituting the resist layer. Since, in a usual photolithographic technique, the incident medium is air, $n_{in}=1$, while in an immersion lithographic technique using, for example, water as the immersion liquid, $n_{in}=1.44$ because the incident medium is water.

$$NA=n_{in}\cdot\sin(\theta_{in})=n_{Res}\cdot\sin(\theta_{IF})$$

This equation indicates that at constant $\theta_{in}$, the numerical aperture NA in the immersion lithographic technique is $n_{Liq}$ times as large as in a general photolithographic technique ($\theta_{in}=1.0$). That is, when the refractive index $n_{Res}$ of the resist material constituting the resist layer is constant, $\sin(\theta_{IF})$ is increased. This means that in the immersion lithographic technique, $\theta_{IF}$ is increased. In other words, in the immersion lithographic technique, the exposure light is incident more obliquely, as compared with a general photolithographic technique.

On the other hand, the use of a single-layer antireflective film may sufficiently decrease the reflectance of exposure light in vertical incidence but has the problem of failing to sufficiently decrease the reflectance in oblique incidence.

When an antireflective film having a thickness of 100 nm and a complex refractive index $N_0$ in which $n_0$ and $k_0$ values are 1.75 and 0.30, respectively is formed on a silicon oxide film of 100 nm in thickness formed on a surface of a silicon semiconductor substrate, and a resist layer having a refractive index of 1.70 is formed on the antireflective film, the reflectance at the interface between the resist layer and the antireflective film is greatly decreased to about 1% in vertical incidence of the exposure light (i.e., incidence angle $\theta_{IF}=0°$). However, the reflectance of s waves is greatly increased to about 6% at an incidence angle $\theta_{IF}$ of about 65°.

On the other hand, the maximum permissible value of reflectance at the interface between a resist layer and a silicon oxide film formed on a surface of a silicon semiconductor substrate yearly decreases with development of micronization. In particular, the maximum permissible value of reflectance in the micron generation to which the immersion lithographic technique is applied is as very small as 0.4% in a line-and-space pattern (Boontarika, Ozawa, Someya, Extended Abstracts of the 65th meeting of the Japan Society of Applied Physics, 2p-R-9).

In the 45-nm generation to which immersion lithography may be applied, the size of contact holes to be formed is assumed to be about 90 nm (pitch 140 nm). FIG. 1 shows the results of computation, under this condition, of the reflectance dependency of variation in the diameter of contact holes relative to the shape of a stationary wave using optical profile computing software Prolith Ver. 8.1 manufactured by KLA-Tencor Corp. on the assumption that the numerical aperture NA was 1.05 corresponding to immersion lithography.

It is desirable to suppress the variation in diameter of 90 nm contact holes to 5 nm or less. FIG. 1 indicates that the reflectance is preferably controlled to about 0.4% or less for controlling the variation to 5 nm or less.

Namely, in both a line-and-space pattern and a contact hole pattern, the reflectance is preferably suppressed to 0.4% or less.

However, in the immersion lithographic technique, exposure light may be incident obliquely on a single-layer antireflective film used in a general photolithographic technique, thereby failing to sufficiently decrease reflectance. Since the reflectance is not sufficiently decreased, a stationary wave significantly appears in the resist layer, and thus it may be impossible to resolve the problem of failing to form a satisfactory rectangular pattern in the resist layer.

Accordingly, it is desirable to provide an antireflective film capable of sufficiently decreasing the reflectance at an interface between a resist layer and a silicon oxide film formed on a surface of a silicon semiconductor substrate even in more oblique incidence of exposure light (illuminating light) on the resist layer in a photolithographic technique for achieving a higher focus tolerance by increasing the numerical aperture of an exposure system, for example, in an immersion lithographic technique, and also provide an exposure method using the antireflective film.

In accordance with a first embodiment of the invention, an antireflective film has a two-layer structure and is used in a process for manufacturing a semiconductor device by being provided between a resist layer and a silicon oxide layer formed on a surface of a silicon semiconductor substrate and having a thickness T (unit: nm) described below, for exposure of the resist layer in an exposure system having a wavelength of 190 nm to 195 nm and a numerical aperture NA of $0.93 \leqq NA \leqq 1.0$. In accordance with the first embodiment of the invention, an exposure method is used in a process for manufacturing a semiconductor device and includes providing an antireflective film having a two-layer structure between a resist layer and a silicon oxide layer formed on a surface of a silicon semiconductor substrate and having a thickness T (unit: nm) described below, and exposing the resist layer in an exposure system having a wavelength of 190 nm to 195 nm and a numerical aperture NA of $0.93 \leqq NA \leqq 1.0$.

The antireflective film or the antireflective film used in the exposure method according to the first embodiment of the invention includes an upper layer having a complex refractive index $N_1$ and a lower layer having a complex refractive index $N_2$, the complex refractive indexes $N_1$ and $N_2$ being represented by the following equations:

$$N_1=n_1-k_1i$$

$$N_2=n_2-k_2i$$

Assuming that the thickness of the upper layer is $d_1$ (unit: nm) and the thickness of the lower layer is $d_2$ (unit: nm), when any one of the combinations of values of $[n_{10}, k_{10}, d_{10}, n_{20}, k_{20}, d_{20}]$ described below is selected depending on the thickness T of the silicon oxide film, $n_1$, $k_1$, $d_1$, $n_2$, $k_2$, and $d_2$ satisfy the following relational expression:

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1$$

However, a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$. In the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm)=", each value (unit: nm) in the right columns is "$d_{1m}-d_{10}$"; in the line of "When $d_1<d_{10}$, $d_{1m}$ (nm)=", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=" each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm)=", each value (unit: nm) in the right columns is "$d_{2m}-d_{20}$"; and in the line of "When $d_2<d_{20}$, $d_{2m}$ (nm)=", each value (unit: nm) in the right columns is "$d_{20}-d_{2m}$".

| 0.93 ≦ NA ≦ 1.0<br>2 ≦ T ≦ 15 | | | | | 1/35 |
|---|---|---|---|---|---|
| Case | 1-01 | 1-02 | 1-03 | 1-04 | 1-05 |
| $n_{10}$ | 2.0730 | 1.8547 | 1.8612 | 1.8596 | 1.7706 |
| $k_{10}$ | 0.1156 | 0.1676 | 0.1279 | 0.0953 | 0.0916 |
| $d_{10}$ (nm) | 23.93 | 29.84 | 20.21 | 19.98 | 91.02 |
| $n_{20}$ | 2.6749 | 2.1886 | 1.8193 | 1.8569 | 1.9614 |
| $k_{20}$ | 1.5696 | 0.6118 | 0.4029 | 0.3274 | 0.4555 |
| $d_{20}$ (nm) | 9.886 | 59.76 | 139.99 | 190.30 | 69.22 |
| When $n_1 \geqq n_{10}$, $n_{1m}$ = | 0.0910 | 0.0882 | 0.0964 | 0.0950 | 0.0763 |
| When $n_1 < n_{10}$, $n_{1m}$ = | 0.0872 | 0.0704 | 0.0762 | 0.0765 | 0.0467 |
| When $k_1 \geqq k_{10}$, $k_{1m}$ = | 0.0819 | 0.0750 | 0.0869 | 0.0875 | 0.0772 |
| When $k_1 < k_{10}$, $k_{1m}$ = | 0.0960 | 0.0840 | 0.0907 | 0.0915 | 0.0546 |
| When $d_1 \geqq d_{10}$, $d_{1m}$ (nm) = | 4.108 | 7.919 | 8.786 | 9.587 | 17.28 |
| When $d_1 < d_{10}$, $d_{1m}$ (nm) = | 3.280 | 5.652 | 6.074 | 6.698 | 8.396 |
| When $n_2 \geqq n_{20}$, $n_{2m}$ = | 0.2209 | 0.1796 | 0.1515 | 0.1552 | 0.1445 |
| When $n_2 < n_{20}$, $n_{2m}$ = | 0.2126 | 0.1920 | 0.1780 | 0.1777 | 0.1565 |
| When $k_2 \geqq k_{20}$, $k_{2m}$ = | 0.2324 | 0.2171 | 0.1921 | 0.1983 | 0.1809 |
| When $k_2 < k_{20}$, $k_{2m}$ = | 0.1960 | 0.1512 | 0.1220 | 0.1107 | 0.1235 |
| When $d_2 \geqq d_{20}$, $d_{2m}$ (nm) = | 1.715 | 13.99 | ∞ | ∞ | 9.907 |
| When $d_2 < d_{20}$, $d_{2m}$ (nm) = | 1.606 | 9.166 | 63.12 | 76.29 | 9.171 |

| 0.93 < NA ≦ 1.0<br>2 ≦ T ≦ 15 | | | | | |
|---|---|---|---|---|---|
| Case | 1-06 | 1-07 | 1-08 | 1-09 | 1-10 |
| $n_{10}$ | 1.7660 | 1.7540 | 1.7206 | 1.7312 | 1.7318 |
| $k_{10}$ | 0.0861 | 0.0810 | 0.0766 | 0.0743 | 0.0746 |
| $d_{10}$ (nm) | 89.67 | 89.26 | 163.7 | 158.4 | 156.0 |
| $n_{20}$ | 1.8683 | 1.7976 | 2.0073 | 1.9328 | 1.8226 |
| $k_{20}$ | 0.3142 | 0.2441 | 0.9100 | 0.4029 | 0.2736 |
| $d_{20}$ (nm) | 129.4 | 193.6 | 15.11 | 69.39 | 132.3 |
| When $n_1 \geqq n_{10}$, $n_{1m}$ = | 0.0725061 | 0.0712122 | 0.0876196 | 0.0743347 | 0.0699963 |
| When $n_1 < n_{10}$, $n_{1m}$ = | 0.0454077 | 0.0429834 | 0.0318030 | 0.0375427 | 0.0339148 |
| When $k_1 \geqq k_{10}$, $k_{1m}$ = | 0.0772620 | 0.0743579 | 0.0711646 | 0.0773767 | 0.0733899 |
| When $k_1 < k_{10}$, $k_{1m}$ = | 0.0551843 | 0.0575049 | 0.0410327 | 0.0412244 | 0.0408972 |
| When $d_1 \geqq d_{10}$, $d_{1m}$ (nm) = | 18.782 | 23.348 | 40.469 | 35.317 | 38.161 |
| When $d_1 < d_{10}$, $d_{1m}$ (nm) = | 8.456 | 8.860 | 9.958 | 10.432 | 9.052 |
| When $n_2 \geqq n_{20}$, $n_{2m}$ = | 0.1498401 | 0.1584961 | 0.1682336 | 0.1348816 | 0.1376196 |
| When $n_2 < n_{20}$, $n_{2m}$ = | 0.1510144 | 0.1511060 | 0.2304688 | 0.1582874 | 0.1516028 |
| When $k_2 \geqq k_{20}$, $k_{2m}$ = | 0.2049341 | 0.2252979 | 0.1710974 | 0.1537598 | 0.1868274 |
| When $k_2 < k_{20}$, $k_{2m}$ = | 0.0962390 | 0.0820935 | 0.1771240 | 0.1169067 | 0.0881860 |
| When $d_2 \geqq d_{20}$, $d_{2m}$ (nm) = | ∞ | ∞ | 3.180 | 8.501 | ∞ |
| When $d_2 < d_{20}$, $d_{2m}$ (nm) = | 17.963 | 68.303 | 3.157 | 8.798 | 14.016 |

| 0.93 ≦ NA ≦ 1.0<br>2 ≦ T ≦ 15 | | | | | 2/35 |
|---|---|---|---|---|---|
| Case | 1-11 | 1-12 | 1-13 | 1-14 | 1-15 |
| $n_{10}$ | 1.7235310 | 1.7093992 | 1.7192548 | 1.7183512 | 1.7097773 |
| $k_{10}$ | 0.0712769 | 0.0595462 | 0.0668813 | 0.0690717 | 0.0638868 |
| $d_{10}$ (nm) | 155.759 | 237.275 | 223.222 | 220.755 | 221.916 |
| $n_{20}$ | 1.7500411 | 5.0249130 | 1.9244861 | 1.7884626 | 1.7175992 |
| $k_{20}$ | 0.2147794 | 2.4786958 | 0.3767470 | 0.2530536 | 0.2031308 |
| $d_{20}$ (nm) | 197.972 | 1.776 | 68.925 | 134.430 | 199.649 |
| When $n_1 \geqq n_{10}$, $n_{1m}$ = | 0.0687000 | 0.1022864 | 0.0758325 | 0.0727087 | 0.0697119 |
| When $n_1 < n_{10}$, $n_{1m}$ = | 0.0322229 | 0.0397070 | 0.0389722 | 0.0346118 | 0.0564209 |
| When $k_1 \geqq k_{10}$, $k_{1m}$ = | 0.0698975 | 0.0795508 | 0.0762329 | 0.0700171 | 0.0722595 |
| When $k_1 < k_{10}$, $k_{1m}$ = | 0.0415723 | 0.0393457 | 0.0338635 | 0.0308765 | 0.0321350 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 9.616 | 78.998 | 12.815 | 10.464 | 72.402 |
| When $n_2 \geqq n_{20}$, $n_{2m}$ = | 0.1855957 | 0.5207629 | 0.1343335 | 0.1358569 | 0.2333704 |
| When $n_2 < n_{20}$, $n_{2m}$ = | 0.1501331 | 0.6523560 | 0.1703552 | 0.1672083 | 0.1693542 |
| When $k_2 \geqq k_{20}$, $k_{2m}$ = | 0.2047339 | 0.5424048 | 0.1363831 | 0.1710950 | 0.1947412 |
| When $k_2 < k_{20}$, $k_{2m}$ = | 0.0758948 | 0.5487781 | 0.1192529 | 0.0892212 | 0.0778406 |
| When $d_2 \geqq d_{20}$, $d_{2m}$ (nm) = | ∞ | 0.325 | 8.509 | ∞ | ∞ |
| When $d_2 < d_{20}$, $d_{2m}$ (nm) = | 29.087 | 0.351 | 7.511 | 11.451 | 31.610 |

-continued

| $0.93 \leqq NA \leqq 1.0$<br>$15 < T \leqq 25$ | | | | | |
|---|---|---|---|---|---|
| Case | 2-01 | 2-02 | 2-03 | 2-04 | 2-05 |
| $n_{10}$ | 1.8890717 | 1.8040788 | 1.8569330 | 1.8246631 | 1.8713633 |
| $k_{10}$ | 0.2231211 | 0.2224671 | 0.1887211 | 0.1852786 | 0.1359350 |
| $d_{10}$ (nm) | 31.297 | 38.783 | 31.358 | 29.866 | 20.765 |
| $n_{20}$ | 2.2536461 | 3.4285504 | 2.3482559 | 2.0267942 | 1.8449284 |
| $k_{20}$ | 1.9138327 | 0.7115044 | 0.7139401 | 0.6589875 | 0.4410677 |
| $d_{20}$ (nm) | 8.426 | 30.090 | 49.395 | 61.419 | 129.533 |
| When $n_1 \geqq n_{10}$, $n_{1m}$ = | 0.0874390 | 0.0895227 | 0.0867871 | 0.0862964 | 0.0944556 |
| When $n_1 < n_{10}$, $n_{1m}$ = | 0.0734485 | 0.0679480 | 0.0711365 | 0.0665735 | 0.0748743 |
| When $k_1 \geqq k_{10}$, $k_{1m}$ = | 0.0762256 | 0.0781921 | 0.0754639 | 0.0735010 | 0.0845789 |
| When $k_1 < k_{10}$, $k_{1m}$ = | 0.0847852 | 0.0785486 | 0.0835657 | 0.0812061 | 0.0905493 |
| When $d_1 \geqq d_{10}$, $d_{1m}$ (nm) = | 5.734 | 7.070 | 7.156 | 8.156 | 8.180 |
| When $d_1 < d_{10}$, $d_{1m}$ (nm) = | 4.509 | 5.331 | 5.325 | 5.713 | 5.655 |
| When $n_2 \geqq n_{20}$, $n_{2m}$ = | 0.3151672 | 0.1904419 | 0.1878015 | 0.1893945 | 0.1561475 |
| When $n_2 < n_{20}$, $n_{2m}$ = | 0.3095313 | 0.2189575 | 0.2044202 | 0.1933459 | 0.1801416 |
| When $k_2 \geqq k_{20}$, $k_{2m}$ = | 0.3390149 | 0.2463513 | 0.2322900 | 0.2311047 | 0.2037732 |
| When $k_2 < k_{20}$, $k_{2m}$ = | 0.3041187 | 0.1774133 | 0.1676416 | 0.1568945 | 0.1265381 |
| When $d_2 \geqq d_{20}$, $d_{2m}$ (nm) = | 1.987 | 2.182 | 8.431 | ∞ | ∞ |
| When $d_2 < d_{20}$, $d_{2m}$ (nm) = | 1.727 | 2.068 | 6.571 | 10.427 | 56.577 |

3/35

| $0.93 \leqq NA \leqq 1.0$<br>$15 < T \leqq 25$ | | | | | |
|---|---|---|---|---|---|
| Case | 2-06 | 2-07 | 2-08 | 2-09 | 2-10 |
| $n_{10}$ | 1.8537764 | 1.8773918 | 1.7913209 | 1.7961812 | 1.7719309 |
| $k_{10}$ | 0.1095380 | 0.0811836 | 0.1069315 | 0.0967122 | 0.0907051 |
| $d_{10}$ (nm) | 19.190 | 15.072 | 93.104 | 91.592 | 89.644 |
| $n_{20}$ | 1.8083352 | 1.7885130 | 2.1120296 | 2.2985234 | 1.8982310 |
| $k_{20}$ | 0.3385915 | 0.2812935 | 1.5705728 | 0.5621108 | 0.3437292 |
| $d_{20}$ (nm) | 190.096 | 250.952 | 8.709 | 49.876 | 119.550 |
| When $n_1 \geqq n_{10}$, $n_{1m}$ = | 0.0970691 | 0.1116003 | 0.0785193 | 0.0746387 | 0.0710254 |
| When $n_1 < n_{10}$, $n_{1m}$ = | 0.0765894 | 0.0899463 | 0.0387744 | 0.0446472 | 0.0434424 |
| When $k_1 \geqq k_{10}$, $k_{1m}$ = | 0.0900769 | 0.1037891 | 0.0704041 | 0.0743225 | 0.0753088 |
| When $k_1 < k_{10}$, $k_{1m}$ = | 0.0922754 | 0.0811836 | 0.0518481 | 0.0540869 | 0.0544885 |
| When $d_1 \geqq d_{10}$, $d_{1m}$ (nm) = | 9.442 | 8.843 | 12.610 | 13.182 | 16.111 |
| When $d_1 < d_{10}$, $d_{1m}$ (nm) = | 6.479 | 6.242 | 5.884 | 6.895 | 7.619 |
| When $n_2 \geqq n_{20}$, $n_{2m}$ = | 0.1545007 | 0.1511414 | 0.2353479 | 0.1499768 | 0.1563330 |
| When $n_2 < n_{20}$, $n_{2m}$ = | 0.1780847 | 0.1773486 | 0.2901843 | 0.1659082 | 0.1527185 |
| When $k_2 \geqq k_{20}$, $k_{2m}$ = | 0.1867920 | 0.1671802 | 0.2909924 | 0.1840894 | 0.2027185 |
| When $k_2 < k_{20}$, $k_{2m}$ = | 0.1126624 | 0.1034778 | 0.2557275 | 0.1387183 | 0.1013330 |
| When $d_2 \geqq d_{20}$, $d_{2m}$ (nm) = | ∞ | ∞ | 1.972 | 5.095 | ∞ |
| When $d_2 < d_{20}$, $d_{2m}$ (nm) = | 76.056 | 121.855 | 1.716 | 4.880 | 15.622 |

| $0.93 \leqq NA \leqq 1.0$<br>$15 < T \leqq 25$ | | | | | |
|---|---|---|---|---|---|
| Case | 2-11 | 2-12 | 2-13 | 2-14 | 2-15 |
| $n_{10}$ | 1.7573553 | 1.7321027 | 1.7251448 | 1.7347815 | 1.7337052 |
| $k_{10}$ | 0.0844391 | 0.0771807 | 0.0782108 | 0.0789970 | 0.0782079 |
| $d_{10}$ (nm) | 89.273 | 89.432 | 166.474 | 158.854 | 156.164 |
| $n_{20}$ | 1.8090385 | 1.7181480 | 2.6560327 | 2.0166404 | 1.8413069 |
| $k_{20}$ | 0.2599016 | 0.2108133 | 2.0752579 | 0.4697089 | 0.2975845 |
| $d_{20}$ (nm) | 184.203 | 254.601 | 4.495 | 58.957 | 122.955 |
| When $n_1 \geqq n_{10}$, $n_{1m}$ = | 0.0699780 | 0.0690137 | 0.0832959 | 0.0721558 | 0.0683105 |
| When $n_1 < n_{10}$, $n_{1m}$ = | 0.0410315 | 0.0429553 | 0.0305981 | 0.0341260 | 0.0308228 |
| When $k_1 \geqq k_{10}$, $k_{1m}$ = | 0.0723608 | 0.0738831 | 0.0729456 | 0.0742798 | 0.0703467 |
| When $k_1 < k_{10}$, $k_{1m}$ = | 0.0569189 | 0.0588879 | 0.0382764 | 0.0397253 | 0.0396069 |
| When $d_1 \geqq d_{10}$, $d_{1m}$ (nm) = | 21.648 | 30.736 | 32.939 | 31.041 | 34.229 |
| When $d_1 < d_{10}$, $d_{1m}$ (nm) = | 8.068 | 11.084 | 9.096 | 8.972 | 7.917 |
| When $n_2 \geqq n_{20}$, $n_{2m}$ = | 0.1631897 | 0.1805151 | 0.3419739 | 0.1438672 | 0.1358447 |
| When $n_2 < n_{20}$, $n_{2m}$ = | 0.1518018 | 0.1480249 | 0.4228455 | 0.1667273 | 0.1539514 |
| When $k_2 \geqq k_{20}$, $k_{2m}$ = | 0.2316443 | 0.1895435 | 0.3584204 | 0.1604712 | 0.1864905 |
| When $k_2 < k_{20}$, $k_{2m}$ = | 0.0850049 | 0.0772852 | 0.3668774 | 0.1323413 | 0.0930493 |
| When $d_2 \geqq d_{20}$, $d_{2m}$ (nm) = | ∞ | ∞ | 0.935 | 6.683 | 16.067 |
| When $d_2 < d_{20}$, $d_{2m}$ (nm) = | 28.321 | 80.547 | 0.940 | 6.845 | 12.170 |

0.93 ≦ NA ≦ 1.0
15 < T ≦ 25

4/35

| Case | 2-16 | 2-17 | 2-18 | 2-19 | 2-20 |
|---|---|---|---|---|---|
| $n_{10}$ | 1.7245076 | 1.7100620 | 1.7130788 | 1.7208745 | 1.7192161 |
| $k_{10}$ | 0.0739010 | 0.0639207 | 0.0658962 | 0.0708686 | 0.0720786 |
| $d_{10}$ (nm) | 155.712 | 155.553 | 233.281 | 223.560 | 220.745 |
| $n_{20}$ | 1.7533528 | 1.6863114 | 3.3653368 | 1.9877972 | 1.7983405 |
| $k_{20}$ | 0.2275719 | 0.1891021 | 2.7431658 | 0.4366658 | 0.2740582 |
| $d_{20}$ (nm) | 189.273 | 256.528 | 2.501 | 59.393 | 125.643 |
| When $n_1 \geqq n_{10}$, $n_{1m}$ = | 0.0671997 | 0.0648059 | 0.0864783 | 0.0735278 | 0.0707983 |
| When $n_1 < n_{10}$, $n_{1m}$ = | 0.0293323 | 0.0484583 | 0.0327734 | 0.0316724 | 0.0279663 |
| When $k_1 \geqq k_{10}$, $k_{1m}$ = | 0.0671045 | 0.0758130 | 0.0759729 | 0.0721252 | 0.0662109 |
| When $k_1 < k_{10}$, $k_{1m}$ = | 0.0403235 | 0.0462146 | 0.0340283 | 0.0320007 | 0.0290771 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 8.393 | 77.190 | 14.014 | 10.040 | 8.344 |
| When $n_2 \geqq n_{20}$, $n_{2m}$ = | 0.1922314 | 0.2150586 | 0.5377722 | 0.1455798 | 0.1365283 |
| When $n_2 < n_{20}$, $n_{2m}$ = | 0.1495129 | 0.1388159 | 0.5848816 | 0.1787549 | 0.1689587 |
| When $k_2 \geqq k_{20}$, $k_{2m}$ = | 0.2035803 | 0.1600281 | 0.4555420 | 0.1361926 | 0.1635962 |
| When $k_2 < k_{20}$, $k_{2m}$ = | 0.0785095 | 0.0698242 | 0.5466174 | 0.1332434 | 0.0942200 |
| When $d_2 \geqq d_{20}$, $d_{2m}$ (nm) = | ∞ | ∞ | 0.540 | 6.979 | ∞ |
| When $d_2 < d_{20}$, $d_{2m}$ (nm) = | 26.645 | 77.267 | 0.568 | 6.255 | 9.480 |

0.93 ≦ NA ≦ 1.0
15 < T ≦ 25

| Case | 2-21 | 2-22 |
|---|---|---|
| $n_{10}$ | 1.7100814 | 1.7028062 |
| $k_{10}$ | 0.0661341 | 0.0572529 |
| $d_{10}$ (nm) | 221.783 | 219.613 |
| $n_{20}$ | 1.7179584 | 1.6741304 |
| $k_{20}$ | 0.2146738 | 0.1784680 |
| $d_{20}$ (nm) | 191.114 | 256.090 |
| When $n_1 \geqq n_{10}$, $n_{1m}$ = | 0.0687488 | 0.0693079 |
| When $n_1 < n_{10}$, $n_{1m}$ = | 0.0502954 | 0.0688196 |
| When $k_1 \geqq k_{10}$, $k_{1m}$ = | 0.0691418 | 0.0820508 |
| When $k_1 < k_{10}$, $k_{1m}$ = | 0.0305945 | 0.0409924 |
| When $d_1 \geqq d_{10}$, $d_{1m}$ (nm) = | ∞ | ∞ |
| When $d_1 < d_{10}$, $d_{1m}$ (nm) = | 70.999 | 88.114 |
| When $n_2 \geqq n_{20}$, $n_{2m}$ = | 0.2426611 | 0.2482605 |
| When $n_2 < n_{20}$, $n_{2m}$ = | 0.1649829 | 0.1563098 |
| When $k_2 \geqq k_{20}$, $k_{2m}$ = | 0.1903906 | 0.1488330 |
| When $k_2 < k_{20}$, $k_{2m}$ = | 0.0805981 | 0.0682654 |
| When $d_2 \geqq d_{20}$, $d_{2m}$ (nm) = | ∞ | ∞ |
| When $d_2 < d_{20}$, $d_{2m}$ (nm) = | 28.403 | 77.092 |

0.93 ≦ NA ≦ 1.0
25 < T ≦ 35

5/35

| Case | 3-01 | 3-02 | 3-03 | 3-04 | 3-05 |
|---|---|---|---|---|---|
| $n_{10}$ | 1.7462297 | 1.7852920 | 1.8064124 | 1.8761841 | 1.8732427 |
| $k_{10}$ | 0.2650661 | 0.2379686 | 0.2063789 | 0.1465026 | 0.1107685 |
| $d_{10}$ (nm) | 38.584 | 38.995 | 31.400 | 22.050 | 18.888 |
| $n_{20}$ | 1.8811342 | 3.2453891 | 2.0415396 | 1.8871554 | 1.8328297 |
| $k_{20}$ | 2.5474890 | 0.8215227 | 0.7493942 | 0.4863835 | 0.3644393 |
| $d_{20}$ (nm) | 6.719 | 29.990 | 55.163 | 118.487 | 179.928 |
| When $n_1 \geqq n_{10}$, $n_{1m}$ = | 0.0769434 | 0.0851318 | 0.0833228 | 0.0906799 | 0.0968079 |
| When $n_1 < n_{10}$, $n_{1m}$ = | 0.0572766 | 0.0631555 | 0.0636389 | 0.0722144 | 0.0767554 |
| When $k_1 \geqq k_{10}$, $k_{1m}$ = | 0.0723669 | 0.0784412 | 0.0735730 | 0.0819336 | 0.0896667 |
| When $k_1 < k_{10}$, $k_{1m}$ = | 0.0683887 | 0.0725391 | 0.0776208 | 0.0882788 | 0.0940442 |
| When $d_1 \geqq d_{10}$, $d_{1m}$ (nm) = | 6.007 | 6.642 | 7.652 | 7.684 | 8.502 |
| When $d_1 < d_{10}$, $d_{1m}$ (nm) = | 4.614 | 4.982 | 5.411 | 5.323 | 5.843 |
| When $n_2 \geqq n_{20}$, $n_{2m}$ = | 0.4302271 | 0.2240894 | 0.2116187 | 0.1663196 | 0.1573621 |
| When $n_2 < n_{20}$, $n_{2m}$ = | 0.3679468 | 0.2518726 | 0.2012903 | 0.1828064 | 0.1779138 |
| When $k_2 \geqq k_{20}$, $k_{2m}$ = | 0.4458606 | 0.2938757 | 0.2488452 | 0.2239661 | 0.1924353 |
| When $k_2 < k_{20}$, $k_{2m}$ = | 0.4071558 | 0.2090601 | 0.1700916 | 0.1317957 | 0.1155774 |
| When $d_2 \geqq d_{20}$, $d_{2m}$ (nm) = | 1.849 | 2.793 | ∞ | ∞ | ∞ |
| When $d_2 < d_{20}$, $d_{2m}$ (nm) = | 1.467 | 2.486 | 8.980 | 27.259 | 71.144 |

-continued

| 0.93 ≦ NA ≦ 1.0<br>25 < T ≦ 35 | | | | | |
|---|---|---|---|---|---|
| Case | 3-06 | 3-07 | 3-08 | 3-09 | 3-10 |
| $n_{10}$ | 1.8809997 | 1.8353407 | 1.8107063 | 1.7800259 | 1.7589519 |
| $k_{10}$ | 0.0844859 | 0.1336488 | 0.1074834 | 0.0966903 | 0.0885227 |
| $d_{10}$ (nm) | 15.636 | 86.851 | 91.200 | 89.638 | 89.033 |
| $n_{20}$ | 1.8003278 | 1.6000470 | 2.5616901 | 1.9474319 | 1.8081258 |
| $k_{20}$ | 0.2965881 | 1.7695220 | 0.6655713 | 0.3779800 | 0.2753975 |
| $d_{20}$ (nm) | 241.202 | 10.059 | 40.111 | 109.424 | 177.335 |
| When $n_1 \geqq n_{10}$, $n_{1m}$ = | 0.1079370 | 0.0607556 | 0.0690979 | 0.0686230 | 0.0682776 |
| When $n_1 < n_{10}$, $n_{1m}$ = | 0.0864404 | 0.0389355 | 0.0418872 | 0.0404956 | 0.0386047 |
| When $k_1 \geqq k_{10}$, $k_{1m}$ = | 0.0999365 | 0.0690637 | 0.0736157 | 0.0727942 | 0.0702844 |
| When $k_1 < k_{10}$, $k_{1m}$ = | 0.0844859 | 0.0492517 | 0.0507898 | 0.0531238 | 0.0559766 |
| When $d_1 \geqq d_{10}$, $d_{1m}$ (nm) = | 8.565 | 8.192 | 11.124 | 13.835 | 18.997 |
| When $d_1 < d_{10}$, $d_{1m}$ (nm) = | 5.996 | 4.465 | 5.820 | 6.603 | 7.278 |
| When $n_2 \geqq n_{20}$, $n_{2m}$ = | 0.1541260 | 0.2930249 | 0.1702905 | 0.1595251 | 0.1700037 |
| When $n_2 < n_{20}$, $n_{2m}$ = | 0.1764270 | 0.2694421 | 0.1785315 | 0.1557800 | 0.1515491 |
| When $k_2 \geqq k_{20}$, $k_{2m}$ = | 0.1720203 | 0.3061462 | 0.2081555 | 0.2039343 | 0.2313416 |
| When $k_2 < k_{20}$, $k_{2m}$ = | 0.1058716 | 0.3107410 | 0.1597290 | 0.1070007 | 0.0874585 |
| When $d_2 \geqq d_{20}$, $d_{2m}$ (nm) = | ∞ | 2.242 | 3.729 | 17.032 | ∞ |
| When $d_2 < d_{20}$, $d_{2m}$ (nm) = | 115.662 | 2.067 | 3.416 | 13.482 | 26.550 |

6/35

| 0.93 ≦ NA ≦ 1.0<br>25 < T ≦ 35 | | | | | |
|---|---|---|---|---|---|
| Case | 3-11 | 3-12 | 3-13 | 3-14 | 3-15 |
| $n_{10}$ | 1.7385561 | 1.7392392 | 1.7355979 | 1.7252169 | 1.7185486 |
| $k_{10}$ | 0.0961686 | 0.0859424 | 0.0828161 | 0.0770491 | 0.0788457 |
| $d_{10}$ (nm) | 161.111 | 158.474 | 155.982 | 155.656 | 229.847 |
| $n_{20}$ | 1.8448216 | 2.1008270 | 1.8545146 | 1.7550901 | 3.2610273 |
| $k_{20}$ | 2.2148249 | 0.5469970 | 0.3232472 | 0.2413910 | 4.4183916 |
| $d_{20}$ (nm) | 5.861 | 50.862 | 115.179 | 181.353 | 1.558 |
| When $n_1 \geqq n_{10}$, $n_{1m}$ = | 0.0629041 | 0.0674426 | 0.0657153 | 0.0649670 | 0.0703149 |
| When $n_1 < n_{10}$, $n_{1m}$ = | 0.0253882 | 0.0295728 | 0.0268335 | 0.0256165 | 0.0220850 |
| When $k_1 \geqq k_{10}$, $k_{1m}$ = | 0.0668323 | 0.0703247 | 0.0663293 | 0.0632434 | 0.0659778 |
| When $k_1 < k_{10}$, $k_{1m}$ = | 0.0332373 | 0.0369910 | 0.0375085 | 0.0384131 | 0.0277441 |
| When $d_1 \geqq d_{10}$, $d_{1m}$ (nm) = | 20.469 | 26.314 | 30.753 | 47.147 | 42.683 |
| When $d_1 < d_{10}$, $d_{1m}$ (nm) = | 5.969 | 7.197 | 6.584 | 7.042 | 7.213 |
| When $n_2 \geqq n_{20}$, $n_{2m}$ = | 0.3836914 | 0.1608313 | 0.1425024 | 0.2021899 | 0.7624707 |
| When $n_2 < n_{20}$, $n_{2m}$ = | 0.3601526 | 0.1749219 | 0.1554919 | 0.1482849 | 0.7156897 |
| When $k_2 \geqq k_{20}$, $k_{2m}$ = | 0.3156946 | 0.1638635 | 0.1816882 | 0.2013940 | 0.5159863 |
| When $k_2 < k_{20}$, $k_{2m}$ = | 0.4014783 | 0.1464551 | 0.0974072 | 0.0811682 | 0.8313574 |
| When $d_2 \geqq d_{20}$, $d_{2m}$ (nm) = | 1.291 | 5.616 | 13.990 | ∞ | 0.296 |
| When $d_2 < d_{20}$, $d_{2m}$ (nm) = | 1.319 | 5.535 | 10.236 | 24.868 | 0.387 |

| 0.93 ≦ NA ≦ 1.0<br>25 < T ≦ 35 | | | |
|---|---|---|---|
| Case | 3-16 | 3-17 | 3-18 |
| $n_{10}$ | 1.7228369 | 1.7199449 | 1.7101979 |
| $k_{10}$ | 0.0769315 | 0.0760859 | 0.0687675 |
| $d_{10}$ (nm) | 222.858 | 220.491 | 221.639 |
| $n_{20}$ | 2.0210736 | 1.8037789 | 1.7165312 |
| $k_{20}$ | 0.5011654 | 0.2965908 | 0.2274377 |
| $d_{20}$ (nm) | 52.892 | 118.134 | 183.246 |
| When $n_1 \geqq n_{10}$, $n_{1m}$ = | 0.0694470 | 0.0680798 | 0.0669543 |
| When $n_1 < n_{10}$, $n_{1m}$ = | 0.0241309 | 0.0211279 | 0.0442908 |
| When $k_1 \geqq k_{10}$, $k_{1m}$ = | 0.0659106 | 0.0606384 | 0.0650562 |
| When $k_1 < k_{10}$, $k_{1m}$ = | 0.0287354 | 0.0259912 | 0.0284460 |
| When $d_1 \geqq d_{10}$, $d_{1m}$ (nm) = | ∞ | ∞ | ∞ |
| When $d_1 < d_{10}$, $d_{1m}$ (nm) = | 7.193 | 6.146 | 69.475 |
| When $n_2 \geqq n_{20}$, $n_{2m}$ = | 0.1641553 | 0.1445947 | 0.2568982 |
| When $n_2 < n_{20}$, $n_{2m}$ = | 0.1866541 | 0.1696143 | 0.1583826 |
| When $k_2 \geqq k_{20}$, $k_{2m}$ = | 0.1286877 | 0.1503394 | 0.1843665 |
| When $k_2 < k_{20}$, $k_{2m}$ = | 0.1457922 | 0.0990405 | 0.0813123 |
| When $d_2 \geqq d_{20}$, $d_{2m}$ (nm) = | 6.290 | 17.763 | ∞ |
| When $d_2 < d_{20}$, $d_{2m}$ (nm) = | 5.002 | 7.323 | 26.072 |

$0.93 \leqq NA \leqq 1.0$
$35 < T \leqq 45$

7/35

| Case | 4-01 | 4-02 | 4-03 | 4-04 | 4-05 |
|---|---|---|---|---|---|
| $n_{10}$ | 1.8047095 | 1.8098021 | 1.8915289 | 1.8869810 | 1.8679863 |
| $k_{10}$ | 0.2694194 | 0.2379756 | 0.1677232 | 0.1583242 | 0.1633407 |
| $d_{10}$ (nm) | 36.421 | 31.711 | 26.420 | 22.598 | 22.571 |
| $n_{20}$ | 2.9911125 | 2.1295160 | 2.1348336 | 1.9270572 | 1.8682373 |
| $k_{20}$ | 1.0218786 | 0.9059492 | 0.5678980 | 0.5352831 | 0.5190358 |
| $d_{20}$ (nm) | 30.087 | 46.199 | 93.459 | 108.068 | 112.596 |
| When $n_1 \geqq n_{10}$, $n_{1m}$ = | 0.0783740 | 0.0796436 | 0.0844666 | 0.0882751 | 0.0886218 |
| When $n_1 < n_{10}$, $n_{1m}$ = | 0.0596716 | 0.0601453 | 0.0678638 | 0.0698572 | 0.0685303 |
| When $k_1 \geqq k_{10}$, $k_{1m}$ = | 0.0745129 | 0.0734180 | 0.0774060 | 0.0809473 | 0.0815564 |
| When $k_1 < k_{10}$, $k_{1m}$ = | 0.0737073 | 0.0756104 | 0.0846094 | 0.0871533 | 0.0855286 |
| When $d_1 \geqq d_{10}$, $d_{1m}$ (nm) = | 5.498 | 6.440 | 6.660 | 7.044 | 7.454 |
| When $d_1 < d_{10}$, $d_{1m}$ (nm) = | 4.112 | 4.536 | 4.657 | 4.822 | 5.013 |
| When $n_2 \geqq n_{20}$, $n_{2m}$ = | 0.2827258 | 0.2488782 | 0.2107483 | 0.1777197 | 0.1733423 |
| When $n_2 < n_{20}$, $n_{2m}$ = | 0.2979187 | 0.2268945 | 0.2048547 | 0.1904834 | 0.1888538 |
| When $k_2 \geqq k_{20}$, $k_{2m}$ = | 0.3686462 | 0.2854443 | 0.2568164 | 0.2416882 | 0.2270508 |
| When $k_2 < k_{20}$, $k_{2m}$ = | 0.2566187 | 0.1919458 | 0.1493335 | 0.1371973 | 0.1348743 |
| When $d_2 \geqq d_{20}$, $d_{2m}$ (nm) = | 4.536 | ∞ | ∞ | ∞ | ∞ |
| When $d_2 < d_{20}$, $d_{2m}$ (nm) = | 3.441 | 7.549 | 17.368 | 24.447 | 26.666 |

$0.93 \leqq NA \leqq 1.0$
$35 < T \leqq 45$

| Case | 4-06 | 4-07 | 4-08 | 4-09 | 4-10 |
|---|---|---|---|---|---|
| $n_{10}$ | 1.8894047 | 1.9013640 | 1.7974174 | 1.7778270 | 1.7589001 |
| $k_{10}$ | 0.1134244 | 0.0821095 | 0.1211843 | 0.1038067 | 0.0931193 |
| $d_{10}$ (nm) | 18.623 | 14.880 | 88.331 | 88.747 | 88.775 |
| $n_{20}$ | 1.8513003 | 1.8106171 | 2.0615819 | 1.9023003 | 1.8006679 |
| $k_{20}$ | 0.3877744 | 0.3102506 | 0.7049601 | 0.4013081 | 0.2880356 |
| $d_{20}$ (nm) | 170.528 | 232.433 | 48.141 | 106.512 | 170.885 |
| When $n_1 \geqq n_{10}$, $n_{1m}$ = | 0.0963379 | 0.1102368 | 0.0634644 | 0.0662390 | 0.0666211 |
| When $n_1 < n_{10}$, $n_{1m}$ = | 0.0760864 | 0.0881848 | 0.0372961 | 0.0368457 | 0.0352515 |
| When $k_1 \geqq k_{10}$, $k_{1m}$ = | 0.0891541 | 0.1015222 | 0.0717737 | 0.0709473 | 0.0673779 |
| When $k_1 < k_{10}$, $k_{1m}$ = | 0.0954272 | 0.0821095 | 0.0478455 | 0.0509119 | 0.0546045 |
| When $d_1 \geqq d_{10}$, $d_{1m}$ (nm) = | 7.796 | 7.721 | 10.517 | 12.746 | 16.898 |
| When $d_1 < d_{10}$, $d_{1m}$ (nm) = | 5.302 | 5.383 | 5.078 | 5.794 | 6.421 |
| When $n_2 \geqq n_{20}$, $n_{2m}$ = | 0.1607617 | 0.1549121 | 0.2063647 | 0.1805920 | 0.1791541 |
| When $n_2 < n_{20}$, $n_{2m}$ = | 0.1802881 | 0.1767310 | 0.1869873 | 0.1622900 | 0.1552356 |
| When $k_2 \geqq k_{20}$, $k_{2m}$ = | 0.1971570 | 0.1718066 | 0.1998254 | 0.2205994 | 0.2284485 |
| When $k_2 < k_{20}$, $k_{2m}$ = | 0.1177856 | 0.1071863 | 0.1537903 | 0.1082654 | 0.0890710 |
| When $d_2 \geqq d_{20}$, $d_{2m}$ (nm) = | ∞ | ∞ | 7.208 | ∞ | ∞ |
| When $d_2 < d_{20}$, $d_{2m}$ (nm) = | 68.041 | 110.260 | 5.967 | 13.288 | 26.909 |

$0.93 \leqq NA \leqq 1.0$
$35 < T \leqq 45$

8/35

| Case | 4-11 | 4-12 | 4-13 | 4-14 | 4-15 |
|---|---|---|---|---|---|
| $n_{10}$ | 1.7310401 | 1.7404520 | 1.7353985 | 1.7244370 | 1.7094852 |
| $k_{10}$ | 0.0827558 | 0.0960720 | 0.0882239 | 0.0802890 | 0.0677575 |
| $d_{10}$ (nm) | 89.146 | 155.339 | 154.960 | 155.397 | 155.056 |
| $n_{20}$ | 1.7041670 | 1.9461112 | 1.8293633 | 1.7457172 | 1.6751093 |
| $k_{20}$ | 0.2282102 | 0.5942640 | 0.3421815 | 0.2519901 | 0.2044537 |
| $d_{20}$ (nm) | 240.157 | 50.887 | 110.529 | 174.646 | 241.084 |
| When $n_1 \geqq n_{10}$, $n_{1m}$ = | 0.0658081 | 0.0609131 | 0.0631018 | 0.0626184 | 0.0606677 |
| When $n_1 < n_{10}$, $n_{1m}$ = | 0.0392627 | 0.0232361 | 0.0219373 | 0.0213806 | 0.0433704 |
| When $k_1 \geqq k_{10}$, $k_{1m}$ = | 0.0703406 | 0.0642554 | 0.0612463 | 0.0585852 | 0.0715100 |
| When $k_1 < k_{10}$, $k_{1m}$ = | 0.0569983 | 0.0328662 | 0.0342212 | 0.0355737 | 0.0444800 |
| When $d_1 \geqq d_{10}$, $d_{1m}$ (nm) = | 25.085 | 16.735 | 27.723 | 38.964 | ∞ |
| When $d_1 < d_{10}$, $d_{1m}$ (nm) = | 9.551 | 5.135 | 5.136 | 5.707 | 18.661 |
| When $n_2 \geqq n_{20}$, $n_{2m}$ = | 0.1952173 | 0.1934106 | 0.1684375 | 0.2170105 | 0.2364917 |
| When $n_2 < n_{20}$, $n_{2m}$ = | 0.1461670 | 0.1873682 | 0.1611987 | 0.1494055 | 0.1341663 |
| When $k_2 \geqq k_{20}$, $k_{2m}$ = | 0.1811243 | 0.1365161 | 0.1602917 | 0.1917432 | 0.1477625 |
| When $k_2 < k_{20}$, $k_{2m}$ = | 0.0805774 | 0.1412585 | 0.0980115 | 0.0826819 | 0.0722742 |
| When $d_2 \geqq d_{20}$, $d_{2m}$ (nm) = | ∞ | 6.877 | 15.552 | ∞ | ∞ |
| When $d_2 < d_{20}$, $d_{2m}$ (nm) = | 77.061 | 5.982 | 8.340 | 24.666 | 73.559 |

-continued

| $0.93 \leqq NA \leqq 1.0$ <br> $35 < T \leqq 45$ | | | | | |
|---|---|---|---|---|---|
| Case | 4-16 | 4-17 | 4-18 | 4-19 | 4-20 |
| $n_{10}$ | 1.7305468 | 1.7234847 | 1.7196555 | 1.7094719 | 1.7026367 |
| $k_{10}$ | 0.1083688 | 0.0859582 | 0.0809985 | 0.0713058 | 0.0605694 |
| $d_{10}$ (nm) | 224.105 | 219.529 | 219.492 | 221.454 | 219.016 |
| $n_{20}$ | 3.7612310 | 1.8940064 | 1.7865237 | 1.7085534 | 1.6670562 |
| $k_{20}$ | 9.7520181 | 0.5381566 | 0.3130643 | 0.2375210 | 0.1929642 |
| $d_{20}$ (nm) | 0.557 | 52.122 | 112.555 | 175.858 | 239.742 |
| When $n_1 \geqq n_{10}$, $n_{1m}$ = | 0.0498926 | 0.0642505 | 0.0656738 | 0.0636218 | 0.0649512 |
| When $n_1 < n_{10}$, $n_{1m}$ = | 0.0031824 | 0.0153259 | 0.0138647 | 0.0294287 | 0.0615662 |
| When $k_1 \geqq k_{10}$, $k_{1m}$ = | 0.0271924 | 0.0553479 | 0.0526111 | 0.0605078 | 0.0781384 |
| When $k_1 < k_{10}$, $k_{1m}$ = | 0.0108813 | 0.0230212 | 0.0207922 | 0.0257751 | 0.0395862 |
| When $d_1 \geqq d_{10}$, $d_{1m}$ (nm) = | 12.324 | 42.526 | ∞ | ∞ | ∞ |
| When $d_1 < d_{10}$, $d_{1m}$ (nm) = | 0.823 | 4.181 | 3.891 | 14.979 | 80.387 |
| When $n_2 \geqq n_{20}$, $n_{2m}$ = | 0.4580664 | 0.1955493 | 0.1665735 | 0.2757410 | 0.2666089 |
| When $n_2 < n_{20}$, $n_{2m}$ = | 1.0705701 | 0.1254541 | 0.1755249 | 0.1566431 | 0.1466138 |
| When $k_2 \geqq k_{20}$, $k_{2m}$ = | 0.1823242 | 0.0953308 | 0.1233594 | 0.1752612 | 0.1390967 |
| When $k_2 < k_{20}$, $k_{2m}$ = | 1.8675439 | 0.1410535 | 0.1010315 | 0.0760974 | 0.0711597 |
| When $d_2 \geqq d_{20}$, $d_{2m}$ (nm) = | 0.019 | 7.428 | ∞ | ∞ | ∞ |
| When $d_2 < d_{20}$, $d_{2m}$ (nm) = | 0.155 | 3.724 | 4.890 | 25.232 | 73.082 |

9/35

| $0.93 \leqq NA \leqq 1.0$ <br> $45 < T \leqq 55$ | | | | | |
|---|---|---|---|---|---|
| Case | 5-01 | 5-02 | 5-03 | 5-04 | 5-05 |
| $n_{10}$ | 1.7952075 | 1.8907711 | 1.9054716 | 1.9347861 | 1.9562331 |
| $k_{10}$ | 0.2631488 | 0.1709411 | 0.1139096 | 0.0660701 | 0.1018371 |
| $d_{10}$ (nm) | 28.407 | 22.060 | 18.051 | 14.149 | 10.504 |
| $n_{20}$ | 1.7975159 | 1.9054700 | 1.8637077 | 1.8512928 | 1.7371318 |
| $k_{20}$ | 0.9080589 | 0.5625340 | 0.4032117 | 0.3248351 | 0.3049135 |
| $d_{20}$ (nm) | 49.215 | 101.512 | 161.182 | 218.499 | 238.789 |
| When $n_1 \geqq n_{10}$, $n_{1m}$ = | 0.0796008 | 0.0882104 | 0.0968323 | 0.1120276 | 0.1430420 |
| When $n_1 < n_{10}$, $n_{1m}$ = | 0.0558337 | 0.0676855 | 0.0756775 | 0.0900916 | 0.1115369 |
| When $k_1 \geqq k_{10}$, $k_{1m}$ = | 0.0737183 | 0.0824512 | 0.0899622 | 0.1015723 | 0.1322839 |
| When $k_1 < k_{10}$, $k_{1m}$ = | 0.0714771 | 0.0859058 | 0.0970459 | 0.0660701 | 0.1018371 |
| When $d_1 \geqq d_{10}$, $d_{1m}$ (nm) = | 6.136 | 6.696 | 7.231 | 6.738 | 5.941 |
| When $d_1 < d_{10}$, $d_{1m}$ (nm) = | 3.959 | 4.421 | 4.830 | 4.663 | 4.082 |
| When $n_2 \geqq n_{20}$, $n_{2m}$ = | 0.2206628 | 0.1836475 | 0.1640088 | 0.1560229 | 0.1493176 |
| When $n_2 < n_{20}$, $n_{2m}$ = | 0.2514893 | 0.2026611 | 0.1850330 | 0.1781982 | 0.1793958 |
| When $k_2 \geqq k_{20}$, $k_{2m}$ = | 0.2648120 | 0.2363086 | 0.1980701 | 0.1765576 | 0.1456726 |
| When $k_2 < k_{20}$, $k_{2m}$ = | 0.1661694 | 0.1390979 | 0.1188672 | 0.1083618 | 0.1075342 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 11.142 | 25.966 | 67.131 | 101.947 | 116.324 |

| $0.93 \leqq NA \leqq 1.0$ <br> $45 < T \leqq 55$ | | | | | |
|---|---|---|---|---|---|
| Case | 5-06 | 5-07 | 5-08 | 5-09 | 5-10 |
| $n_{10}$ | 1.7844085 | 1.7702622 | 1.7541370 | 1.7279592 | 1.7375980 |
| $k_{10}$ | 0.1367381 | 0.1105738 | 0.0973387 | 0.0846136 | 0.1054836 |
| $d_{10}$ (nm) | 84.299 | 87.211 | 88.132 | 88.943 | 150.710 |
| $n_{20}$ | 1.7096132 | 1.8115599 | 1.7670571 | 1.6883751 | 1.7055974 |
| $k_{20}$ | 0.6495191 | 0.4022198 | 0.2903421 | 0.2308596 | 0.5608974 |
| $d_{20}$ (nm) | 54.242 | 106.122 | 167.020 | 233.281 | 53.799 |
| When $n_1 \geqq n_{10}$, $n_{1m}$ = | 0.0647021 | 0.0659351 | 0.0664050 | 0.0646069 | 0.0607947 |
| When $n_1 < n_{10}$, $n_{1m}$ = | 0.0336169 | 0.0333887 | 0.0319458 | 0.0381165 | 0.0178674 |
| When $k_1 \geqq k_{10}$, $k_{1m}$ = | 0.0728796 | 0.0707520 | 0.0653967 | 0.0692603 | 0.0616235 |
| When $k_1 < k_{10}$, $k_{1m}$ = | 0.0421851 | 0.0477087 | 0.0524451 | 0.0553516 | 0.0270422 |
| When $d_1 \geqq d_{10}$, $d_{1m}$ (nm) = | 9.564 | 12.156 | 16.406 | 23.344 | 13.595 |
| When $d_1 < d_{10}$, $d_{1m}$ (nm) = | 4.227 | 5.119 | 5.747 | 9.303 | 3.589 |
| When $n_2 \geqq n_{20}$, $n_{2m}$ = | 0.2254211 | 0.1928967 | 0.1889099 | 0.2061182 | 0.2563867 |
| When $n_2 < n_{20}$, $n_{2m}$ = | 0.1907227 | 0.1764453 | 0.1616943 | 0.1463477 | 0.1201587 |
| When $k_2 \geqq k_{20}$, $k_{2m}$ = | 0.1398059 | 0.1815479 | 0.2086975 | 0.1714539 | 0.0974426 |
| When $k_2 < k_{20}$, $k_{2m}$ = | 0.1320325 | 0.1038733 | 0.0888391 | 0.0812170 | 0.1216650 |
| When $d_2 \geqq d_{20}$, $d_{2m}$ (nm) = | 14.246 | ∞ | ∞ | ∞ | 10.184 |
| When $d_2 < d_{20}$, $d_{2m}$ (nm) = | 7.856 | 11.965 | 30.548 | 77.806 | 4.856 |

| 0.93 ≦ NA ≦ 1.0<br>45 < T ≦ 55 | | | | | 10/35 |
|---|---|---|---|---|---|
| Case | 5-11 | 5-12 | 5-13 | 5-14 | 5-15 |
| $n_{10}$ | 1.7329681 | 1.7221048 | 1.7083331 | 1.7220084 | 1.7182277 |
| $k_{10}$ | 0.0932680 | 0.0829100 | 0.0687145 | 0.0940320 | 0.0857940 |
| $d_{10}$ (nm) | 153.145 | 154.966 | 154.712 | 214.741 | 217.589 |
| $n_{20}$ | 1.7707311 | 1.7249696 | 1.6656993 | 1.7051250 | 1.7452872 |
| $k_{20}$ | 0.3436851 | 0.2554267 | 0.2071468 | 0.5097600 | 0.3145186 |
| $d_{20}$ (nm) | 107.979 | 168.643 | 233.037 | 53.504 | 108.615 |
| When $n_1 \geqq n_{10}$, $n_{1m}$ = | 0.0625659 | 0.0612402 | 0.0592444 | 0.0643567 | 0.0658276 |
| When $n_1 < n_{10}$, $n_{1m}$ = | 0.0170984 | 0.0172632 | 0.0416833 | 0.0078064 | 0.0068054 |
| When $k_1 \geqq k_{10}$, $k_{1m}$ = | 0.0565161 | 0.0540405 | 0.0705188 | 0.0454688 | 0.0426636 |
| When $k_1 < k_{10}$, $k_{1m}$ = | 0.0297095 | 0.0318542 | 0.0432507 | 0.0149841 | 0.0129956 |
| When $d_1 \geqq d_{10}$, $d_{1m}$ (nm) = | 26.425 | 34.880 | ∞ | 35.694 | ∞ |
| When $d_1 < d_{10}$, $d_{1m}$ (nm) = | 3.834 | 4.536 | 17.051 | 1.969 | 1.835 |
| When $n_2 \geqq n_{20}$, $n_{2m}$ = | 0.2299866 | 0.2362512 | 0.2473572 | 0.2585364 | 0.2705701 |
| When $n_2 < n_{20}$, $n_{2m}$ = | 0.1752441 | 0.1521826 | 0.1336328 | 0.0467419 | 0.0530518 |
| When $k_2 \geqq k_{20}$, $k_{2m}$ = | 0.1260229 | 0.1759094 | 0.1395569 | 0.0560938 | 0.0808508 |
| When $k_2 < k_{20}$, $k_{2m}$ = | 0.0941040 | 0.0829492 | 0.0726111 | 0.1239917 | 0.0993604 |
| When $d_2 \geqq d_{20}$, $d_{2m}$ (nm) = | ∞ | ∞ | ∞ | 10.256 | ∞ |
| When $d_2 < d_{20}$, $d_{2m}$ (nm) = | 6.312 | 26.413 | 73.432 | 2.024 | 2.346 |

| 0.93 ≦ NA ≦ 1.0<br>45 < T ≦ 55 | | |
|---|---|---|
| Case | 5-16 | 5-17 |
| $n_{10}$ | 1.7079026 | 1.7021324 |
| $k_{10}$ | 0.0731017 | 0.0613637 |
| $d_{10}$ (nm) | 221.285 | 218.642 |
| $n_{20}$ | 1.6934483 | 1.6620357 |
| $k_{20}$ | 0.2412999 | 0.1957858 |
| $d_{20}$ (nm) | 168.585 | 230.920 |
| When $n_1 \geqq n_{10}$, $n_{1m}$ = | 0.0611572 | 0.0632739 |
| When $n_1 < n_{10}$, $n_{1m}$ = | 0.0235156 | 0.0581824 |
| When $k_1 \geqq k_{10}$, $k_{1m}$ = | 0.0566406 | 0.0776050 |
| When $k_1 < k_{10}$, $k_{1m}$ = | 0.0230566 | 0.0386719 |
| When $d_1 \geqq d_{10}$, $d_{1m}$ (nm) = | ∞ | ∞ |
| When $d_1 < d_{10}$, $d_{1m}$ (nm) = | 8.641 | 78.699 |
| When $n_2 \geqq n_{20}$, $n_{2m}$ = | 0.2946387 | 0.2760742 |
| When $n_2 < n_{20}$, $n_{2m}$ = | 0.1554272 | 0.1463647 |
| When $k_2 \geqq k_{20}$, $k_{2m}$ = | 0.1654895 | 0.1344739 |
| When $k_2 < k_{20}$, $k_{2m}$ = | 0.0676013 | 0.0719324 |
| When $d_2 \geqq d_{20}$, $d_{2m}$ (nm) = | ∞ | ∞ |
| When $d_2 < d_{20}$, $d_{2m}$ (nm) = | 26.199 | 53.085 |

| 0.93 ≦ NA ≦ 1.0<br>55 < T ≦ 65 | | | | | 11/35 |
|---|---|---|---|---|---|
| Case | 6-01 | 6-02 | 6-03 | 6-04 | 6-05 |
| $n_{10}$ | 1.7605068 | 1.8816347 | 1.9020430 | 1.9458467 | 1.9584022 |
| $k_{10}$ | 0.2771672 | 0.1829378 | 0.1268282 | 0.0703715 | 0.1032605 |
| $d_{10}$ (nm) | 28.706 | 20.725 | 16.538 | 13.048 | 10.534 |
| $n_{20}$ | 1.6786286 | 1.8151288 | 1.7976518 | 1.8275971 | 1.7382432 |
| $k_{20}$ | 0.9008770 | 0.5496963 | 0.3935708 | 0.3251874 | 0.3086817 |
| $d_{20}$ (nm) | 43.735 | 99.755 | 160.685 | 213.311 | 229.129 |
| When $n_1 \geqq n_{10}$, $n_{1m}$ = | 0.0840430 | 0.0931677 | 0.1035986 | 0.1192371 | 0.1431311 |
| When $n_1 < n_{10}$, $n_{1m}$ = | 0.0576428 | 0.0681458 | 0.0779578 | 0.0939172 | 0.1097058 |
| When $k_1 \geqq k_{10}$, $k_{1m}$ = | 0.0662097 | 0.0857654 | 0.0958630 | 0.1068726 | 0.1305750 |
| When $k_1 < k_{10}$, $k_{1m}$ = | 0.0706262 | 0.0861902 | 0.1004041 | 0.0703715 | 0.1032605 |
| When $d_1 \geqq d_{10}$, $d_{1m}$ (nm) = | 6.461 | 6.864 | 7.218 | 6.428 | 5.908 |
| When $d_1 < d_{10}$, $d_{1m}$ (nm) = | 4.241 | 4.337 | 4.665 | 4.365 | 3.988 |
| When $n_2 \geqq n_{20}$, $n_{2m}$ = | 0.2053870 | 0.1760388 | 0.1592407 | 0.1556714 | 0.1505713 |
| When $n_2 < n_{20}$, $n_{2m}$ = | 0.2197400 | 0.2099182 | 0.1887061 | 0.1809558 | 0.1813904 |
| When $k_2 \geqq k_{20}$, $k_{2m}$ = | 0.2532373 | 0.2078381 | 0.1779785 | 0.1687073 | 0.1458105 |
| When $k_2 < k_{20}$, $k_{2m}$ = | 0.1729968 | 0.1382983 | 0.1186841 | 0.1101477 | 0.1094250 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 9.750 | 24.367 | 71.258 | 104.445 | 116.852 |

-continued

| 0.93 ≦ NA ≦ 1.0<br>55 < T ≦ 65 | | | | | |
|---|---|---|---|---|---|
| Case | 6-06 | 6-07 | 6-08 | 6-09 | 6-10 |
| $n_{10}$ | 1.7915017 | 1.7682864 | 1.7517777 | 1.7257399 | 1.7391311 |
| $k_{10}$ | 0.1460711 | 0.1152280 | 0.1000283 | 0.0854213 | 0.1111219 |
| $d_{10}$ (nm) | 82.108 | 86.246 | 87.803 | 88.823 | 148.271 |
| $n_{20}$ | 1.6599684 | 1.7730752 | 1.7495420 | 1.6774661 | 1.6415570 |
| $k_{20}$ | 0.6598461 | 0.3999868 | 0.2902721 | 0.2313191 | 0.5493559 |
| $d_{20}$ (nm) | 47.036 | 100.473 | 159.986 | 224.881 | 47.977 |
| When $n_1 \geqq n_{10}$, $n_{1m}$ = | 0.0707507 | 0.0678174 | 0.0671436 | 0.0642444 | 0.0613611 |
| When $n_1 < n_{10}$, $n_{1m}$ = | 0.0347034 | 0.0316797 | 0.0297241 | 0.0379114 | 0.0170081 |
| When $k_1 \geqq k_{10}$, $k_{1m}$ = | 0.0716638 | 0.0707349 | 0.0637610 | 0.0688733 | 0.0614063 |
| When $k_1 < k_{10}$, $k_{1m}$ = | 0.0419373 | 0.0459045 | 0.0509448 | 0.0544250 | 0.0258569 |
| When $d_1 \geqq d_{10}$, $d_{1m}$ (nm) = | 8.814 | 11.596 | 15.946 | 22.736 | 12.264 |
| When $d_1 < d_{10}$, $d_{1m}$ (nm) = | 3.999 | 4.706 | 5.289 | 9.347 | 3.219 |
| When $n_2 \geqq n_{20}$, $n_{2m}$ = | 0.2110352 | 0.2040027 | 0.1980566 | 0.2150256 | 0.2303101 |
| When $n_2 < n_{20}$, $n_{2m}$ = | 0.1684949 | 0.1890479 | 0.1666223 | 0.1461719 | 0.0970691 |
| When $k_2 \geqq k_{20}$, $k_{2m}$ = | 0.1438293 | 0.1667627 | 0.2003491 | 0.1648621 | 0.0994629 |
| When $k_2 < k_{20}$, $k_{2m}$ = | 0.1447302 | 0.1052173 | 0.0896777 | 0.0819421 | 0.1292871 |
| When $d_2 \geqq d_{20}$, $d_{2m}$ (nm) = | 15.339 | ∞ | ∞ | ∞ | 12.574 |
| When $d_2 < d_{20}$, $d_{2m}$ (nm) = | 6.489 | 10.552 | 32.474 | 78.570 | 4.088 |

12/35

| 0.93 ≦ NA ≦ 1.0<br>55 < T ≦ 65 | | | | | |
|---|---|---|---|---|---|
| Case | 6-11 | 6-12 | 6-13 | 6-14 | 6-15 |
| $n_{10}$ | 1.7320844 | 1.7076855 | 1.7203924 | 1.7223192 | 1.7173463 |
| $k_{10}$ | 0.0968192 | 0.0689521 | 0.0842770 | 0.0985051 | 0.0890019 |
| $d_{10}$ (nm) | 152.055 | 154.586 | 154.911 | 212.081 | 216.420 |
| $n_{20}$ | 1.7411899 | 1.6612710 | 1.7118542 | 1.6387426 | 1.7205682 |
| $k_{20}$ | 0.3409343 | 0.2081961 | 0.2561923 | 0.4904233 | 0.3116849 |
| $d_{20}$ (nm) | 101.751 | 223.547 | 160.544 | 48.284 | 102.035 |
| When $n_1 \geqq n_{10}$, $n_{1m}$ = | 0.0640808 | 0.0590295 | 0.0609424 | 0.0598975 | 0.0677930 |
| When $n_1 < n_{10}$, $n_{1m}$ = | 0.0141614 | 0.0412158 | 0.0147046 | 0.0053711 | 0.0022900 |
| When $k_1 \geqq k_{10}$, $k_{1m}$ = | 0.0532275 | 0.0702893 | 0.0510400 | 0.0410706 | 0.0340332 |
| When $k_1 < k_{10}$, $k_{1m}$ = | 0.0265625 | 0.0427490 | 0.0291602 | 0.0117297 | 0.0056226 |
| When $d_1 \geqq d_{10}$, $d_{1m}$ (nm) = | 25.992 | ∞ | 33.192 | 33.998 | 50.996 |
| When $d_1 < d_{10}$, $d_{1m}$ (nm) = | 3.082 | 16.525 | 3.853 | 1.301 | 0.604 |
| When $n_2 \geqq n_{20}$, $n_{2m}$ = | 0.2268713 | 0.2531177 | 0.2476831 | 0.2556775 | 0.2704236 |
| When $n_2 < n_{20}$, $n_{2m}$ = | 0.1878772 | 0.1338721 | 0.1536694 | 0.0287537 | 0.0146338 |
| When $k_2 \geqq k_{20}$, $k_{2m}$ = | 0.1099695 | 0.1355603 | 0.1692993 | 0.0485706 | 0.0433569 |
| When $k_2 < k_{20}$, $k_{2m}$ = | 0.0948242 | 0.0734631 | 0.0770691 | 0.1286780 | 0.0774121 |
| When $d_2 \geqq d_{20}$, $d_{2m}$ (nm) = | ∞ | ∞ | ∞ | 12.209 | ∞ |
| When $d_2 < d_{20}$, $d_{2m}$ (nm) = | 4.972 | 56.744 | 27.273 | 1.327 | 0.772 |

| 0.93 ≦ NA ≦ 1.0<br>55 < T ≦ 65 | | |
|---|---|---|
| Case | 6-16 | 6-17 |
| $n_{10}$ | 1.7068337 | 1.7019545 |
| $k_{10}$ | 0.0738736 | 0.0615388 |
| $d_{10}$ (nm) | 221.446 | 218.498 |
| $n_{20}$ | 1.6845656 | 1.6606500 |
| $k_{20}$ | 0.2425094 | 0.1970435 |
| $d_{20}$ (nm) | 159.621 | 220.941 |
| When $n_1 \geqq n_{10}$, $n_{1m}$ = | 0.0603540 | 0.0631677 |
| When $n_1 < n_{10}$, $n_{1m}$ = | 0.0209692 | 0.0568018 |
| When $k_1 \geqq k_{10}$, $k_{1m}$ = | 0.0545837 | 0.0777637 |
| When $k_1 < k_{10}$, $k_{1m}$ = | 0.0216589 | 0.0384106 |
| When $d_1 \geqq d_{10}$, $d_{1m}$ (nm) = | ∞ | ∞ |
| When $d_1 < d_{10}$, $d_{1m}$ (nm) = | 7.750 | 78.234 |
| When $n_2 \geqq n_{20}$, $n_{2m}$ = | 0.3057288 | 0.2826660 |
| When $n_2 < n_{20}$, $n_{2m}$ = | 0.1553943 | 0.1472412 |
| When $k_2 \geqq k_{20}$, $k_{2m}$ = | 0.1625220 | 0.1326501 |
| When $k_2 < k_{20}$, $k_{2m}$ = | 0.0624280 | 0.0731104 |
| When $d_2 \geqq d_{20}$, $d_{2m}$ (nm) = | ∞ | ∞ |
| When $d_2 < d_{20}$, $d_{2m}$ (nm) = | 26.805 | 48.201 |

$0.93 \leqq NA \leqq 1.0$
$65 < T \leqq 75$

13/35

| Case | 7-01 | 7-02 | 7-03 | 7-04 | 7-05 |
|---|---|---|---|---|---|
| $n_{10}$ | 1.7659038 | 1.8645399 | 1.8986420 | 1.9431410 | 1.8260230 |
| $k_{10}$ | 0.3040912 | 0.1945245 | 0.1330684 | 0.1068639 | 0.1610409 |
| $d_{10}$ (nm) | 29.683 | 22.504 | 17.099 | 11.420 | 82.141 |
| $n_{20}$ | 1.6951746 | 1.8232494 | 1.7981378 | 1.7406778 | 1.8123655 |
| $k_{20}$ | 1.0159152 | 0.5745287 | 0.4053118 | 0.3159076 | 0.8416018 |
| $d_{20}$ (nm) | 32.660 | 88.735 | 150.314 | 217.432 | 29.750 |
| When $n_1 \geqq n_{10}$, $n_{1m}$ = | 0.0851306 | 0.0913562 | 0.1021387 | 0.1343896 | 0.0697156 |
| When $n_1 < n_{10}$, $n_{1m}$ = | 0.0579541 | 0.0649255 | 0.0759912 | 0.1029980 | 0.0329614 |
| When $k_1 \geqq k_{10}$, $k_{1m}$ = | 0.0588293 | 0.0796277 | 0.0923560 | 0.1221460 | 0.0674365 |
| When $k_1 < k_{10}$, $k_{1m}$ = | 0.0718896 | 0.0854541 | 0.0996875 | 0.1068639 | 0.0435559 |
| When $d_1 \geqq d_{10}$, $d_{1m}$ (nm) = | 5.966 | 7.118 | 7.275 | 6.222 | 7.298 |
| When $d_1 < d_{10}$, $d_{1m}$ (nm) = | 4.222 | 4.395 | 4.641 | 4.200 | 3.443 |
| When $n_2 \geqq n_{20}$, $n_{2m}$ = | 0.2227673 | 0.1853540 | 0.1622253 | 0.1538269 | 0.2762463 |
| When $n_2 < n_{20}$, $n_{2m}$ = | 0.2074731 | 0.2178162 | 0.1908838 | 0.1813525 | 0.2757544 |
| When $k_2 \geqq k_{20}$, $k_{2m}$ = | 0.3106860 | 0.2340100 | 0.1838708 | 0.1497839 | 0.2030774 |
| When $k_2 < k_{20}$, $k_{2m}$ = | 0.2037939 | 0.1485229 | 0.1235767 | 0.1116138 | 0.1923645 |
| When $d_2 \geqq d_{20}$, $d_{2m}$ (nm) = | ∞ | ∞ | ∞ | ∞ | 12.449 |
| When $d_2 < d_{20}$, $d_{2m}$ (nm) = | 7.750 | 24.931 | 70.207 | 113.565 | 5.408 |

$0.93 \leqq NA \leqq 1.0$
$65 < T \leqq 75$

| Case | 7-06 | 7-07 | 7-08 | 7-09 | 7-10 |
|---|---|---|---|---|---|
| $n_{10}$ | 1.7771488 | 1.7544343 | 1.7270080 | 1.7474077 | 1.7344421 |
| $k_{10}$ | 0.1183021 | 0.1010010 | 0.0859818 | 0.1187907 | 0.0986199 |
| $d_{10}$ (nm) | 86.874 | 88.257 | 88.900 | 148.872 | 153.031 |
| $n_{20}$ | 1.8193233 | 1.7618403 | 1.6808707 | 1.6925268 | 1.7617910 |
| $k_{20}$ | 0.4301648 | 0.3008540 | 0.2360835 | 0.6251022 | 0.3597954 |
| $d_{20}$ (nm) | 86.325 | 147.888 | 214.142 | 34.244 | 89.143 |
| When $n_1 \geqq n_{10}$, $n_{1m}$ = | 0.0673694 | 0.0664294 | 0.0644080 | 0.0590649 | 0.0632410 |
| When $n_1 < n_{10}$, $n_{1m}$ = | 0.0307617 | 0.0294727 | 0.0379211 | 0.0149548 | 0.0133545 |
| When $k_1 \geqq k_{10}$, $k_{1m}$ = | 0.0672144 | 0.0623938 | 0.0685620 | 0.0548840 | 0.0510083 |
| When $k_1 < k_{10}$, $k_{1m}$ = | 0.0467444 | 0.0514600 | 0.0549805 | 0.0255261 | 0.0262878 |
| When $d_1 \geqq d_{10}$, $d_{1m}$ (nm) = | 10.761 | 15.121 | 22.543 | 10.466 | 24.985 |
| When $d_1 < d_{10}$, $d_{1m}$ (nm) = | 4.433 | 5.189 | 9.219 | 2.761 | 2.901 |
| When $n_2 \geqq n_{20}$, $n_{2m}$ = | 0.2196216 | 0.2049475 | 0.2147473 | 0.2786914 | 0.2464575 |
| When $n_2 < n_{20}$, $n_{2m}$ = | 0.1907739 | 0.1643323 | 0.1459814 | 0.1244519 | 0.1858276 |
| When $k_2 \geqq k_{20}$, $k_{2m}$ = | 0.1969482 | 0.2144763 | 0.1668457 | 0.1106995 | 0.1237866 |
| When $k_2 < k_{20}$, $k_{2m}$ = | 0.1161511 | 0.0943396 | 0.0836194 | 0.1556311 | 0.1032104 |
| When $d_2 \geqq d_{20}$, $d_{2m}$ (nm) = | ∞ | ∞ | ∞ | 9.505 | ∞ |
| When $d_2 < d_{20}$, $d_{2m}$ (nm) = | 10.265 | 27.730 | 76.727 | 3.667 | 4.914 |

$0.93 \leqq NA \leqq 1.0$
$65 < T \leqq 75$

14/35

| Case | 7-11 | 7-12 | 7-13 | 7-14 | 7-15 | 7-16 |
|---|---|---|---|---|---|---|
| $n_{10}$ | 1.7082851 | 1.7212227 | 1.7256274 | 1.7180408 | 1.7074443 | 1.7023147 |
| $k_{10}$ | 0.0693971 | 0.0845898 | 0.1038247 | 0.0895343 | 0.0742263 | 0.0619030 |
| $d_{10}$ (nm) | 154.668 | 155.411 | 212.824 | 218.202 | 221.707 | 218.598 |
| $n_{20}$ | 1.6632564 | 1.7183974 | 1.6530934 | 1.7315716 | 1.6896767 | 1.6620389 |
| $k_{20}$ | 0.2120421 | 0.2642962 | 0.5317369 | 0.3280557 | 0.2496384 | 0.2005572 |
| $d_{20}$ (nm) | 213.175 | 149.129 | 36.133 | 89.506 | 148.627 | 210.752 |
| When $n_1 \geqq n_{10}$, $n_{1m}$ = | 0.0593945 | 0.0606384 | 0.0541980 | 0.0647742 | 0.0609387 | 0.0637036 |
| When $n_1 < n_{10}$, $n_{1m}$ = | 0.0413879 | 0.0149182 | 0.0029968 | 0.0021960 | 0.0208508 | 0.0577161 |
| When $k_1 \geqq k_{10}$, $k_{1m}$ = | 0.0699487 | 0.0507495 | 0.0335364 | 0.0342871 | 0.0542102 | 0.0772327 |
| When $k_1 < k_{10}$, $k_{1m}$ = | 0.0433142 | 0.0298535 | 0.0082080 | 0.0055542 | 0.0221802 | 0.0389124 |
| When $d_1 \geqq d_{10}$, $d_{1m}$ (nm) = | ∞ | 32.689 | 15.980 | 48.365 | ∞ | ∞ |
| When $d_1 < d_{10}$, $d_{1m}$ (nm) = | 16.649 | 3.913 | 0.723 | 0.594 | 7.641 | 78.427 |
| When $n_2 \geqq n_{20}$, $n_{2m}$ = | 0.2553577 | 0.2564221 | 0.2715186 | 0.1988367 | 0.3137769 | 0.2845728 |
| When $n_2 < n_{20}$, $n_{2m}$ = | 0.1341199 | 0.1522119 | 0.0214917 | 0.0208643 | 0.1570667 | 0.1478259 |
| When $k_2 \geqq k_{20}$, $k_{2m}$ = | 0.1361841 | 0.1775061 | 0.0327844 | 0.0526038 | 0.1632751 | 0.1321912 |
| When $k_2 < k_{20}$, $k_{2m}$ = | 0.0749841 | 0.0809204 | 0.1462024 | 0.0801404 | 0.0667383 | 0.0745581 |
| When $d_2 \geqq d_{20}$, $d_{2m}$ (nm) = | ∞ | ∞ | 9.604 | ∞ | ∞ | ∞ |
| When $d_2 < d_{20}$, $d_{2m}$ (nm) = | 57.367 | 24.447 | 0.813 | 0.826 | 24.310 | 48.632 |

$0.93 \leqq NA \leqq 1.0$
$75 < T \leqq 85$

15/35

| Case | 8-01 | 8-02 | 8-03 | 8-04 | 8-05 |
|---|---|---|---|---|---|
| $n_{10}$ | 1.7563588 | 1.8511230 | 1.8843188 | 1.9287462 | 1.8353218 |
| $k_{10}$ | 0.3324096 | 0.2092311 | 0.1443736 | 0.1105115 | 0.1759033 |
| $d_{10}$ (nm) | 35.374 | 25.991 | 18.736 | 12.655 | 87.389 |
| $n_{20}$ | 1.9274523 | 1.9063465 | 1.8018968 | 1.7494498 | 2.1171648 |
| $k_{20}$ | 1.4642575 | 0.6506745 | 0.4300566 | 0.3311673 | 1.3140425 |
| $d_{20}$ (nm) | 17.251 | 73.686 | 139.851 | 205.772 | 13.979 |
| When $n_1 \geqq n_{10}$, $n_{1m}$ = | 0.0785156 | 0.0867322 | 0.0972815 | 0.1243994 | 0.0679163 |
| When $n_1 < n_{10}$, $n_{1m}$ = | 0.0545728 | 0.0619702 | 0.0719873 | 0.0956885 | 0.0326843 |
| When $k_1 \geqq k_{10}$, $k_{1m}$ = | 0.0474365 | 0.0710938 | 0.0861206 | 0.1128003 | 0.0573657 |
| When $k_1 < k_{10}$, $k_{1m}$ = | 0.0515906 | 0.0859790 | 0.0958850 | 0.1105115 | 0.0462488 |
| When $d_1 \geqq d_{10}$, $d_{1m}$ (nm) = | 5.195 | 7.048 | 7.475 | 6.554 | 6.786 |
| When $d_1 < d_{10}$, $d_{1m}$ (nm) = | 4.054 | 4.401 | 4.771 | 4.433 | 3.439 |
| When $n_2 \geqq n_{20}$, $n_{2m}$ = | 0.3717346 | 0.2089124 | 0.1658667 | 0.1550732 | 0.3935315 |
| When $n_2 < n_{20}$, $n_{2m}$ = | 0.2566504 | 0.2226855 | 0.1899609 | 0.1803442 | 0.3930750 |
| When $k_2 \geqq k_{20}$, $k_{2m}$ = | 0.3327271 | 0.2900549 | 0.1962512 | 0.1555261 | 0.4058423 |
| When $k_2 < k_{20}$, $k_{2m}$ = | 0.2814465 | 0.1644043 | 0.1285254 | 0.1140686 | 0.2980408 |
| When $d_2 \geqq d_{20}$, $d_{2m}$ (nm) = | 7.242 | ∞ | ∞ | ∞ | 4.246 |
| When $d_2 < d_{20}$, $d_{2m}$ (nm) = | 5.453 | 18.064 | 63.635 | 86.244 | 4.110 |

$0.93 \leqq NA \leqq 1.0$
$75 < T \leqq 85$

| Case | 8-06 | 8-07 | 8-08 | 8-09 | 8-10 |
|---|---|---|---|---|---|
| $n_{10}$ | 1.7950810 | 1.7627960 | 1.7313791 | 1.7608801 | 1.7394221 |
| $k_{10}$ | 0.1221034 | 0.1022278 | 0.0877850 | 0.1266208 | 0.0996664 |
| $d_{10}$ (nm) | 88.670 | 88.862 | 88.999 | 153.509 | 155.305 |
| $n_{20}$ | 1.9787137 | 1.8048095 | 1.6945552 | 1.9275665 | 1.8479873 |
| $k_{20}$ | 0.5126318 | 0.3274205 | 0.2478313 | 0.9887124 | 0.4176577 |
| $d_{20}$ (nm) | 67.257 | 133.479 | 202.902 | 15.987 | 72.839 |
| When $n_1 \geqq n_{10}$, $n_{1m}$ = | 0.0661450 | 0.0654504 | 0.0644836 | 0.0595581 | 0.0618579 |
| When $n_1 < n_{10}$, $n_{1m}$ = | 0.0313049 | 0.0305920 | 0.0369946 | 0.0131787 | 0.0145801 |
| When $k_1 \geqq k_{10}$, $k_{1m}$ = | 0.0629285 | 0.0615845 | 0.0676172 | 0.0466980 | 0.0504663 |
| When $k_1 < k_{10}$, $k_{1m}$ = | 0.0495715 | 0.0531104 | 0.0563220 | 0.0260303 | 0.0287866 |
| When $d_1 \geqq d_{10}$, $d_{1m}$ (nm) = | 9.764 | 13.747 | 21.746 | 9.118 | 15.633 |
| When $d_1 < d_{10}$, $d_{1m}$ (nm) = | 4.261 | 5.184 | 8.521 | 2.425 | 3.180 |
| When $n_2 \geqq n_{20}$, $n_{2m}$ = | 0.1949426 | 0.2017102 | 0.2072998 | 0.3193018 | 0.1671875 |
| When $n_2 < n_{20}$, $n_{2m}$ = | 0.1905188 | 0.1606116 | 0.1458716 | 0.3499829 | 0.1826196 |
| When $k_2 \geqq k_{20}$, $k_{2m}$ = | 0.2324365 | 0.2397180 | 0.1749133 | 0.1658679 | 0.1587329 |
| When $k_2 < k_{20}$, $k_{2m}$ = | 0.1375964 | 0.1005615 | 0.0861584 | 0.2502869 | 0.1212964 |
| When $d_2 \geqq d_{20}$, $d_{2m}$ (nm) = | 11.495 | ∞ | ∞ | 4.383 | 10.247 |
| When $d_2 < d_{20}$, $d_{2m}$ (nm) = | 10.836 | 22.009 | 72.908 | 4.573 | 5.928 |

$0.93 \leqq NA \leqq 1.0$
$75 < T \leqq 85$

16/35

| Case | 8-11 | 8-12 | 8-13 | 8-14 | 8-15 | 8-16 |
|---|---|---|---|---|---|---|
| $n_{10}$ | 1.7245671 | 1.7098549 | 1.7314445 | 1.7204815 | 1.7093097 | 1.7029357 |
| $k_{10}$ | 0.0857616 | 0.0711157 | 0.1087664 | 0.0894136 | 0.0755678 | 0.0634027 |
| $d_{10}$ (nm) | 155.774 | 154.844 | 218.242 | 220.453 | 221.580 | 218.717 |
| $n_{20}$ | 1.7414131 | 1.6689951 | 1.7862714 | 1.7885409 | 1.7021793 | 1.6626290 |
| $k_{20}$ | 0.2835597 | 0.2212317 | 0.7962122 | 0.3769446 | 0.2655853 | 0.2083407 |
| $d_{20}$ (nm) | 136.971 | 203.148 | 18.394 | 74.763 | 137.968 | 201.624 |
| When $n_1 \geqq n_{10}$, $n_{1m}$ = | 0.0606116 | 0.0594177 | 0.0511572 | 0.0630383 | 0.0616895 | 0.0636414 |
| When $n_1 < n_{10}$, $n_{1m}$ = | 0.0160718 | 0.0405298 | 0.0015906 | 0.0046008 | 0.0190027 | 0.0583008 |
| When $k_1 \geqq k_{10}$, $k_{1m}$ = | 0.0512000 | 0.0681555 | 0.0265222 | 0.0380334 | 0.0531970 | 0.0748706 |
| When $k_1 < k_{10}$, $k_{1m}$ = | 0.0318042 | 0.0441748 | 0.0055811 | 0.0106726 | 0.0222839 | 0.0393835 |
| When $d_1 \geqq d_{10}$, $d_{1m}$ (nm) = | 31.466 | ∞ | 12.528 | 43.958 | ∞ | ∞ |
| When $d_1 < d_{10}$, $d_{1m}$ (nm) = | 4.121 | 15.106 | 0.395 | 1.266 | 6.425 | 77.927 |
| When $n_2 \geqq n_{20}$, $n_{2m}$ = | 0.2472620 | 0.2537585 | 0.2927209 | 0.1651587 | 0.3131763 | 0.2855005 |
| When $n_2 < n_{20}$, $n_{2m}$ = | 0.1515137 | 0.1338916 | 0.0324463 | 0.1927209 | 0.1573535 | 0.1457190 |
| When $k_2 \geqq k_{20}$, $k_{2m}$ = | 0.1857507 | 0.1391650 | 0.0225110 | 0.0800281 | 0.1575110 | 0.1308728 |
| When $k_2 < k_{20}$, $k_{2m}$ = | 0.0929626 | 0.0771277 | 0.2211072 | 0.1242517 | 0.0780078 | 0.0761951 |
| When $d_2 \geqq d_{20}$, $d_{2m}$ (nm) = | ∞ | ∞ | 5.339 | 11.602 | ∞ | ∞ |
| When $d_2 < d_{20}$, $d_{2m}$ (nm) = | 20.462 | 30.027 | 0.679 | 1.920 | 20.783 | 30.691 |

0.93 ≦ NA ≦ 1.0
85 < T ≦ 95

17/35

| Case | 9-01 | 9-02 | 9-03 | 9-04 | 9-05 |
|---|---|---|---|---|---|
| $n_{10}$ | 1.7289685 | 1.8452520 | 1.8988873 | 1.8877112 | 1.9267904 |
| $k_{10}$ | 0.3314086 | 0.2255929 | 0.1475831 | 0.1535471 | 0.0947520 |
| $d_{10}$ (nm) | 44.247 | 26.855 | 20.944 | 19.669 | 15.612 |
| $n_{20}$ | 5.1412592 | 1.9037614 | 1.8997324 | 1.8220692 | 1.8437835 |
| $k_{20}$ | 5.4454539 | 0.7221490 | 0.4893775 | 0.4687151 | 0.3693724 |
| $d_{20}$ (nm) | 1.484 | 66.898 | 122.094 | 129.650 | 183.529 |
| When $n_1 \geqq n_{10}$, $n_{1m}$ = | 0.0720642 | 0.0846375 | 0.0908557 | 0.0941199 | 0.1057788 |
| When $n_1 < n_{10}$, $n_{1m}$ = | 0.0586633 | 0.0599194 | 0.0695422 | 0.0700256 | 0.0833301 |
| When $k_1 \geqq k_{10}$, $k_{1m}$ = | 0.0476758 | 0.0671912 | 0.0784241 | 0.0821533 | 0.0936853 |
| When $k_1 < k_{10}$, $k_{1m}$ = | 0.0453955 | 0.0846301 | 0.0932227 | 0.0950391 | 0.0947520 |
| When $d_1 \geqq d_{10}$, $d_{1m}$ (nm) = | 4.793 | 6.632 | 6.977 | 7.158 | 6.784 |
| When $d_1 < d_{10}$, $d_{1m}$ (nm) = | 4.550 | 4.181 | 4.538 | 4.591 | 4.595 |
| When $n_2 \geqq n_{20}$, $n_{2m}$ = | 1.1337476 | 0.2089880 | 0.1771472 | 0.1681067 | 0.1597327 |
| When $n_2 < n_{20}$, $n_{2m}$ = | 1.1352368 | 0.2210583 | 0.1914734 | 0.1898022 | 0.1792920 |
| When $k_2 \geqq k_{20}$, $k_{2m}$ = | 0.8630298 | 0.2922070 | 0.2387195 | 0.2089600 | 0.1845532 |
| When $k_2 < k_{20}$, $k_{2m}$ = | 1.0641260 | 0.1706519 | 0.1365454 | 0.1328516 | 0.1184924 |
| When $d_2 \geqq d_{20}$, $d_{2m}$ (nm) = | 0.527 | ∞ | ∞ | ∞ | ∞ |
| When $d_2 < d_{20}$, $d_{2m}$ (nm) = | 0.379 | 14.827 | 35.595 | 55.475 | 73.593 |

0.93 ≦ NA ≦ 1.0
85 < T ≦ 95

| Case | 9-06 | 9-07 | 9-08 | 9-09 | 9-10 |
|---|---|---|---|---|---|
| $n_{10}$ | 1.9311024 | 1.9377300 | 1.8321358 | 1.8340055 | 1.7711711 |
| $k_{10}$ | 0.1132645 | 0.0882760 | 0.1783607 | 0.1409526 | 0.1059247 |
| $d_{10}$ (nm) | 13.318 | 11.094 | 92.959 | 90.549 | 89.053 |
| $n_{20}$ | 1.7624681 | 1.7478213 | 3.8484718 | 2.7003837 | 1.8505388 |
| $k_{20}$ | 0.3523973 | 0.2927773 | 3.7040697 | 0.6754163 | 0.3612112 |
| $d_{20}$ (nm) | 195.472 | 252.908 | 2.442 | 40.010 | 121.432 |
| When $n_1 \geqq n_{10}$, $n_{1m}$ = | 0.1192212 | 0.1370740 | 0.0646143 | 0.0640906 | 0.0642236 |
| When $n_1 < n_{10}$, $n_{1m}$ = | 0.0917322 | 0.1105750 | 0.0342749 | 0.0314893 | 0.0302832 |
| When $k_1 \geqq k_{10}$, $k_{1m}$ = | 0.1074902 | 0.1261145 | 0.0537451 | 0.0578040 | 0.0599036 |
| When $k_1 < k_{10}$, $k_{1m}$ = | 0.1132645 | 0.0882760 | 0.0424707 | 0.0518921 | 0.0535962 |
| When $d_1 \geqq d_{10}$, $d_{1m}$ (nm) = | 6.457 | 6.373 | 6.914 | 7.622 | 12.267 |
| When $d_1 < d_{10}$, $d_{1m}$ (nm) = | 4.357 | 4.610 | 3.684 | 3.553 | 4.848 |
| When $n_2 \geqq n_{20}$, $n_{2m}$ = | 0.1546643 | 0.1575439 | 0.8768713 | 0.1918994 | 0.1964832 |
| When $n_2 < n_{20}$, $n_{2m}$ = | 0.1796094 | 0.1753381 | 0.8006409 | 0.2240674 | 0.1600745 |
| When $k_2 \geqq k_{20}$, $k_{2m}$ = | 0.1600171 | 0.1481116 | 0.9241052 | 0.2582642 | 0.2396375 |
| When $k_2 < k_{20}$, $k_{2m}$ = | 0.1162842 | 0.1079150 | 0.8229163 | 0.1769763 | 0.1063232 |
| When $d_2 \geqq d_{20}$, $d_{2m}$ (nm) = | ∞ | ∞ | 0.854 | 4.088 | ∞ |
| When $d_2 < d_{20}$, $d_{2m}$ (nm) = | 79.416 | 123.401 | 0.636 | 4.130 | 18.235 |

0.93 ≦ NA ≦ 1.0
85 < T ≦ 95

18/35

| Case | 9-11 | 9-12 | 9-13 | 9-14 | 9-15 |
|---|---|---|---|---|---|
| $n_{10}$ | 1.7360863 | 1.7197908 | 1.7660895 | 1.7439719 | 1.7279356 |
| $k_{10}$ | 0.0911204 | 0.0799131 | 0.1278221 | 0.1032091 | 0.0888807 |
| $d_{10}$ (nm) | 88.900 | 88.028 | 159.319 | 156.425 | 155.640 |
| $n_{20}$ | 1.7067614 | 1.6618119 | 4.3535883 | 1.9650733 | 1.7635448 |
| $k_{20}$ | 0.2637604 | 0.2120965 | 4.0919379 | 0.4980866 | 0.3088945 |
| $d_{20}$ (nm) | 192.941 | 257.777 | 1.526 | 59.654 | 126.749 |
| When $n_1 \geqq n_{10}$, $n_{1m}$ = | 0.0638330 | 0.0656592 | 0.0584094 | 0.0605725 | 0.0597937 |
| When $n_1 < n_{10}$, $n_{1m}$ = | 0.0350525 | 0.0511377 | 0.0141675 | 0.0144019 | 0.0151697 |
| When $k_1 \geqq k_{10}$, $k_{1m}$ = | 0.0655725 | 0.0796582 | 0.0444238 | 0.0479309 | 0.0488806 |
| When $k_1 < k_{10}$, $k_{1m}$ = | 0.0571082 | 0.0562439 | 0.0291333 | 0.0298792 | 0.0316455 |
| When $d_1 \geqq d_{10}$, $d_{1m}$ (nm) = | 20.203 | 29.484 | 8.864 | 13.240 | 29.427 |
| When $d_1 < d_{10}$, $d_{1m}$ (nm) = | 7.546 | 13.995 | 2.626 | 3.070 | 3.728 |
| When $n_2 \geqq n_{20}$, $n_{2m}$ = | 0.2021118 | 0.1991125 | 0.8787561 | 0.1681836 | 0.2119507 |
| When $n_2 < n_{20}$, $n_{2m}$ = | 0.1462866 | 0.1442920 | 0.9231299 | 0.1869897 | 0.1520459 |
| When $k_2 \geqq k_{20}$, $k_{2m}$ = | 0.1808130 | 0.1431189 | 0.6934375 | 0.1601843 | 0.1789355 |
| When $k_2 < k_{20}$, $k_{2m}$ = | 0.0887085 | 0.0763562 | 1.0372803 | 0.1399158 | 0.0974194 |
| When $d_2 \geqq d_{20}$, $d_{2m}$ (nm) = | ∞ | ∞ | 0.372 | 7.404 | ∞ |
| When $d_2 < d_{20}$, $d_{2m}$ (nm) = | 33.573 | 81.452 | 0.412 | 5.841 | 17.631 |

-continued

| 0.93 ≦ NA ≦ 1.0<br>85 < T ≦ 95 | | | | | |
|---|---|---|---|---|---|
| Case | 9-16 | 9-17 | 9-18 | 9-19 | 9-20 |
| $n_{10}$ | 1.7114085 | 1.7070625 | 1.7347333 | 1.7230132 | 1.7111302 |
| $k_{10}$ | 0.0740744 | 0.0641745 | 0.1100034 | 0.0920219 | 0.0786417 |
| $d_{10}$ (nm) | 154.740 | 153.245 | 225.621 | 220.898 | 221.002 |
| $n_{20}$ | 1.6716288 | 1.6634512 | 4.2666617 | 1.8597675 | 1.7127614 |
| $k_{20}$ | 0.2338686 | 0.1921909 | 4.0109081 | 0.4430799 | 0.2870105 |
| $d_{20}$ (nm) | 194.347 | 254.410 | 1.346 | 63.229 | 128.848 |
| When $n_1 \geqq n_{10}$, $n_{1m}$ = | 0.0584460 | 0.0617004 | 0.0476050 | 0.0625842 | 0.0612109 |
| When $n_1 < n_{10}$, $n_{1m}$ = | 0.0344641 | 0.0580713 | 0.0023816 | 0.0042908 | 0.0142651 |
| When $k_1 \geqq k_{10}$, $k_{1m}$ = | 0.0648608 | 0.0822974 | 0.0260010 | 0.0346094 | 0.0487000 |
| When $k_1 < k_{10}$, $k_{1m}$ = | 0.0443103 | 0.0454309 | 0.0085535 | 0.0110950 | 0.0198962 |
| When $d_1 \geqq d_{10}$, $d_{1m}$ (nm) = | ∞ | ∞ | 11.896 | 40.249 | ∞ |
| When $d_1 < d_{10}$, $d_{1m}$ (nm) = | 12.619 | 28.388 | 0.607 | 1.162 | 4.464 |
| When $n_2 \geqq n_{20}$, $n_{2m}$ = | 0.2496582 | 0.2459351 | 0.6243091 | 0.1726245 | 0.1878369 |
| When $n_2 < n_{20}$, $n_{2m}$ = | 0.1333875 | 0.1351294 | 0.9687061 | 0.0992944 | 0.1569519 |
| When $k_2 \geqq k_{20}$, $k_{2m}$ = | 0.1378833 | 0.1234607 | 0.1299146 | 0.0597583 | 0.1385217 |
| When $k_2 < k_{20}$, $k_{2m}$ = | 0.0791492 | 0.0682422 | 1.1651697 | 0.1405090 | 0.0853906 |
| When $d_2 \geqq d_{20}$, $d_{2m}$ (nm) = | ∞ | ∞ | 0.085 | 8.765 | ∞ |
| When $d_2 < d_{20}$, $d_{2m}$ (nm) = | 27.415 | 76.157 | 0.398 | 1.778 | 18.221 |

| 0.93 ≦ NA ≦ 1.0<br>85 < T ≦ 95 | | | |
|---|---|---|---|
| Case | 9-21 | 9-22 | 9-23 |
| $n_{10}$ | 1.7035342 | 1.7027484 | 1.7001226 |
| $k_{10}$ | 0.0659797 | 0.0572097 | 0.0542621 |
| $d_{10}$ (nm) | 218.617 | 216.627 | 277.695 |
| $n_{20}$ | 1.6615801 | 1.6695991 | 1.6762439 |
| $k_{20}$ | 0.2195726 | 0.1821496 | 0.1770375 |
| $d_{20}$ (nm) | 193.289 | 251.116 | 248.521 |
| When $n_1 \geqq n_{10}$, $n_{1m}$ = | 0.0623376 | 0.0678125 | 0.0799658 |
| When $n_1 < n_{10}$, $n_{1m}$ = | 0.0535010 | 0.0686682 | 0.1014282 |
| When $k_1 \geqq k_{10}$, $k_{1m}$ = | 0.0710327 | 0.0861914 | 0.0881311 |
| When $k_1 < k_{10}$, $k_{1m}$ = | 0.0393738 | 0.0410693 | 0.0390344 |
| When $d_1 \geqq d_{10}$, $d_{1m}$ (nm) = | ∞ | ∞ | ∞ |
| When $d_1 < d_{10}$, $d_{1m}$ (nm) = | 76.543 | 86.880 | 145.024 |
| When $n_2 \geqq n_{20}$, $n_{2m}$ = | 0.2919910 | 0.2682678 | 0.2949561 |
| When $n_2 < n_{20}$, $n_{2m}$ = | 0.1427539 | 0.1485803 | 0.2037488 |
| When $k_2 \geqq k_{20}$, $k_{2m}$ = | 0.1267480 | 0.1253760 | 0.1874854 |
| When $k_2 < k_{20}$, $k_{2m}$ = | 0.0781458 | 0.0670801 | 0.0719922 |
| When $d_2 \geqq d_{20}$, $d_{2m}$ (nm) = | ∞ | ∞ | ∞ |
| When $d_2 < d_{20}$, $d_{2m}$ (nm) = | 27.736 | 75.187 | 78.004 |

19/35

| 0.93 ≦ NA ≦ 1.0<br>95 < T ≦ 105 | | | | | |
|---|---|---|---|---|---|
| Case | 10-01 | 10-02 | 10-03 | 10-04 | 10-05 |
| $n_{10}$ | 1.8593145 | 1.9010800 | 1.9204218 | 1.9438629 | 1.8201241 |
| $k_{10}$ | 0.2496127 | 0.1636004 | 0.1149718 | 0.1088618 | 0.1437532 |
| $d_{10}$ (nm) | 26.535 | 19.815 | 15.218 | 10.610 | 89.353 |
| $n_{20}$ | 1.9155767 | 1.8411706 | 1.7975616 | 1.7190727 | 2.3681639 |
| $k_{20}$ | 0.8329906 | 0.5121692 | 0.3794158 | 0.2999844 | 0.7410526 |
| $d_{20}$ (nm) | 59.684 | 120.535 | 182.059 | 250.015 | 43.212 |
| When $n_1 \geqq n_{10}$, $n_{1m}$ = | 0.0816284 | 0.0922021 | 0.1074707 | 0.1413159 | 0.0582056 |
| When $n_1 < n_{10}$, $n_{1m}$ = | 0.0571204 | 0.0681042 | 0.0820581 | 0.1125684 | 0.0261719 |
| When $k_1 \geqq k_{10}$, $k_{1m}$ = | 0.0635767 | 0.0796045 | 0.0956897 | 0.1313098 | 0.0522705 |
| When $k_1 < k_{10}$, $k_{1m}$ = | 0.0810986 | 0.0930249 | 0.1101465 | 0.1088618 | 0.0503638 |
| When $d_1 \geqq d_{10}$, $d_{1m}$ (nm) = | 5.728 | 6.581 | 6.674 | 6.005 | 7.527 |
| When $d_1 < d_{10}$, $d_{1m}$ (nm) = | 3.587 | 4.159 | 4.431 | 4.306 | 3.047 |
| When $n_2 \geqq n_{20}$, $n_{2m}$ = | 0.2110999 | 0.1699976 | 0.1589343 | 0.1579346 | 0.2155920 |
| When $n_2 < n_{20}$, $n_{2m}$ = | 0.2273865 | 0.1928259 | 0.1800378 | 0.1714307 | 0.2110571 |
| When $k_2 \geqq k_{20}$, $k_{2m}$ = | 0.3068860 | 0.2171289 | 0.1741077 | 0.1426062 | 0.2751843 |
| When $k_2 < k_{20}$, $k_{2m}$ = | 0.1756396 | 0.1352295 | 0.1186548 | 0.1082129 | 0.1794531 |
| When $d_2 \geqq d_{20}$, $d_{2m}$ (nm) = | ∞ | ∞ | ∞ | ∞ | 5.764 |
| When $d_2 < d_{20}$, $d_{2m}$ (nm) = | 12.732 | 34.057 | 73.872 | 121.675 | 5.150 |

0.93 ≦ NA ≦ 1.0
95 < T ≦ 105

20/35

| Case | 10-06 | 10-07 | 10-08 | 10-09 | 10-10 |
|---|---|---|---|---|---|
| $n_{10}$ | 1.7719135 | 1.7372876 | 1.7204595 | 1.7445424 | 1.7286821 |
| $k_{10}$ | 0.1119845 | 0.0953951 | 0.0830085 | 0.1106490 | 0.0936244 |
| $d_{10}$ (nm) | 88.526 | 88.555 | 87.798 | 155.347 | 154.936 |
| $n_{20}$ | 1.8420973 | 1.7021944 | 1.6574450 | 1.9643384 | 1.7602486 |
| $k_{20}$ | 0.3885265 | 0.2779787 | 0.2209480 | 0.5665503 | 0.3317476 |
| $d_{20}$ (nm) | 115.256 | 185.353 | 249.744 | 53.939 | 119.649 |
| When $n_1 \geqq n_{10}$, $n_{1m}$ = | 0.0621143 | 0.0621887 | 0.0641711 | 0.0553430 | 0.0576575 |
| When $n_1 < n_{10}$, $n_{1m}$ = | 0.0270313 | 0.0323645 | 0.0489441 | 0.0092163 | 0.0110840 |
| When $k_1 \geqq k_{10}$, $k_{1m}$ = | 0.0562158 | 0.0627490 | 0.0779517 | 0.0376074 | 0.0417603 |
| When $k_1 < k_{10}$, $k_{1m}$ = | 0.0520581 | 0.0564075 | 0.0555945 | 0.0251758 | 0.0276855 |
| When $d_1 \geqq d_{10}$, $d_{1m}$ (nm) = | 11.132 | 18.518 | 24.475 | 10.852 | 25.311 |
| When $d_1 < d_{10}$, $d_{1m}$ (nm) = | 4.165 | 6.637 | 12.657 | 1.885 | 2.611 |
| When $n_2 \geqq n_{20}$, $n_{2m}$ = | 0.1959729 | 0.2028772 | 0.1967151 | 0.1949902 | 0.2380078 |
| When $n_2 < n_{20}$, $n_{2m}$ = | 0.1629126 | 0.1469397 | 0.1441541 | 0.1889697 | 0.1549414 |
| When $k_2 \geqq k_{20}$, $k_{2m}$ = | 0.2347974 | 0.1750098 | 0.1399744 | 0.1001758 | 0.1456445 |
| When $k_2 < k_{20}$, $k_{2m}$ = | 0.1074329 | 0.0897974 | 0.0774023 | 0.1436816 | 0.0981848 |
| When $d_2 \geqq d_{20}$, $d_{2m}$ (nm) = | ∞ | ∞ | ∞ | 7.077 | ∞ |
| When $d_2 < d_{20}$, $d_{2m}$ (nm) = | 17.579 | 32.188 | 79.555 | 4.014 | 9.652 |

0.93 ≦ NA ≦ 1.0
95 < T ≦ 105

| Case | 10-11 | 10-12 | 10-13 | 10-14 | 10-15 |
|---|---|---|---|---|---|
| $n_{10}$ | 1.7117780 | 1.7072616 | 1.7114074 | 1.7035514 | 1.7027912 |
| $k_{10}$ | 0.0773392 | 0.0664543 | 0.0830146 | 0.0688006 | 0.0591414 |
| $d_{10}$ (nm) | 154.355 | 152.987 | 220.011 | 218.183 | 216.340 |
| $n_{20}$ | 1.6664488 | 1.6597858 | 1.7075466 | 1.6565327 | 1.6669294 |
| $k_{20}$ | 0.2460450 | 0.2000883 | 0.3068810 | 0.2307053 | 0.1896158 |
| $d_{20}$ (nm) | 186.501 | 246.239 | 121.613 | 185.316 | 242.803 |
| When $n_1 \geqq n_{10}$, $n_{1m}$ = | 0.0563684 | 0.0596582 | 0.0593091 | 0.0598755 | 0.0652673 |
| When $n_1 < n_{10}$, $n_{1m}$ = | 0.0298474 | 0.0556995 | 0.0074023 | 0.0481897 | 0.0654077 |
| When $k_1 \geqq k_{10}$, $k_{1m}$ = | 0.0607349 | 0.0799170 | 0.0390686 | 0.0670154 | 0.0838220 |
| When $k_1 < k_{10}$, $k_{1m}$ = | 0.0430676 | 0.0448303 | 0.0134863 | 0.0384473 | 0.0405530 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 9.756 | 23.688 | 2.192 | 28.661 | 83.384 |
| When $n_2 \geqq n_{20}$, $n_{2m}$ = | 0.2552490 | 0.2502368 | 0.2301306 | 0.3057727 | 0.2764221 |
| When $n_2 < n_{20}$, $n_{2m}$ = | 0.1325989 | 0.1345728 | 0.1592334 | 0.1419543 | 0.1480603 |
| When $k_2 \geqq k_{20}$, $k_{2m}$ = | 0.1285986 | 0.1190894 | 0.0974548 | 0.1182935 | 0.1218213 |
| When $k_2 < k_{20}$, $k_{2m}$ = | 0.0799036 | 0.0691528 | 0.0735474 | 0.0793201 | 0.0682898 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 26.413 | 74.134 | 17.074 | 26.587 | 73.152 |

0.93 ≦ NA ≦ 1.0
105 < T ≦ 115

21/35

| Case | 11-01 | 11-02 | 11-03 | 11-04 | 11-05 |
|---|---|---|---|---|---|
| $n_{10}$ | 1.8881577 | 1.9218914 | 1.9458883 | 1.9409291 | 1.7882093 |
| $k_{10}$ | 0.2795127 | 0.1797398 | 0.1322078 | 0.1179060 | 0.1515662 |
| $d_{10}$ (nm) | 22.871 | 17.442 | 13.080 | 10.849 | 85.800 |
| $n_{20}$ | 1.7550786 | 1.7746647 | 1.7478516 | 1.7108849 | 1.7933752 |
| $k_{20}$ | 0.8705815 | 0.5227186 | 0.3833699 | 0.3088835 | 0.6703287 |
| $d_{20}$ (nm) | 60.032 | 119.813 | 181.809 | 241.776 | 55.966 |
| When $n_1 \geqq n_{10}$, $n_{1m}$ = | 0.0826208 | 0.0977563 | 0.1186780 | 0.1376917 | 0.0543359 |
| When $n_1 < n_{10}$, $n_{1m}$ = | 0.0520789 | 0.0682861 | 0.0872974 | 0.1088391 | 0.0162500 |
| When $k_1 \geqq k_{10}$, $k_{1m}$ = | 0.0630823 | 0.0841675 | 0.1052368 | 0.1278345 | 0.0453015 |
| When $k_1 < k_{10}$, $k_{1m}$ = | 0.0771240 | 0.0966394 | 0.1209399 | 0.1179060 | 0.0399414 |
| When $d_1 \geqq d_{10}$, $d_{1m}$ (nm) = | 4.844 | 5.864 | 5.837 | 5.925 | 7.044 |
| When $d_1 < d_{10}$, $d_{1m}$ (nm) = | 2.746 | 3.528 | 3.770 | 4.232 | 1.998 |
| When $n_2 \geqq n_{20}$, $n_{2m}$ = | 0.1779102 | 0.1610864 | 0.1553113 | 0.1599890 | 0.1976709 |
| When $n_2 < n_{20}$, $n_{2m}$ = | 0.2409973 | 0.1978687 | 0.1825439 | 0.1715320 | 0.2140332 |
| When $k_2 \geqq k_{20}$, $k_{2m}$ = | 0.2513745 | 0.1848108 | 0.1557214 | 0.1414282 | 0.1190186 |
| When $k_2 < k_{20}$, $k_{2m}$ = | 0.1529724 | 0.1289783 | 0.1162878 | 0.1089014 | 0.1251477 |
| When $d_2 \geqq d_{20}$, $d_{2m}$ (nm) = | ∞ | ∞ | ∞ | ∞ | 22.520 |
| When $d_2 < d_{20}$, $d_{2m}$ (nm) = | 14.459 | 47.581 | 76.951 | 118.169 | 7.215 |

-continued

| 0.93 ≦ NA ≦ 1.0<br>105 < T ≦ 115 | | | | | |
|---|---|---|---|---|---|
| Case | 11-06 | 11-07 | 11-08 | 11-09 | 11-10 |
| $n_{10}$ | 1.7649059 | 1.7337710 | 1.7199633 | 1.7259527 | 1.7103936 |
| $k_{10}$ | 0.1193411 | 0.0996522 | 0.0855558 | 0.0989978 | 0.0800216 |
| $d_{10}$ (nm) | 87.339 | 88.039 | 87.477 | 153.714 | 153.726 |
| $n_{20}$ | 1.7745734 | 1.6760618 | 1.6497564 | 1.7204930 | 1.6497935 |
| $k_{20}$ | 0.3964773 | 0.2847568 | 0.2267213 | 0.3415865 | 0.2528816 |
| $d_{20}$ (nm) | 113.800 | 179.842 | 241.489 | 115.571 | 179.482 |
| When $n_1 \geqq n_{10}$, $n_{1m}$ = | 0.0601648 | 0.0599890 | 0.0628394 | 0.0551172 | 0.0538281 |
| When $n_1 < n_{10}$, $n_{1m}$ = | 0.0211145 | 0.0296448 | 0.0487646 | 0.0042871 | 0.0282654 |
| When $k_1 \geqq k_{10}$, $k_{1m}$ = | 0.0504663 | 0.0599475 | 0.0772742 | 0.0278052 | 0.0572974 |
| When $k_1 < k_{10}$, $k_{1m}$ = | 0.0475183 | 0.0544922 | 0.0541711 | 0.0166541 | 0.0416528 |
| When $d_1 \geqq d_{10}$, $d_{1m}$ (nm) = | 10.266 | 16.506 | 22.112 | 22.094 | 29.214 |
| When $d_1 < d_{10}$, $d_{1m}$ (nm) = | 3.195 | 5.968 | 12.188 | 0.978 | 9.029 |
| When $n_2 \geqq n_{20}$, $n_{2m}$ = | 0.1995813 | 0.2097351 | 0.1798193 | 0.2563574 | 0.2736133 |
| When $n_2 < n_{20}$, $n_{2m}$ = | 0.1736548 | 0.1494116 | 0.1464758 | 0.1632507 | 0.1337610 |
| When $k_2 \geqq k_{20}$, $k_{2m}$ = | 0.1791345 | 0.1568970 | 0.1341675 | 0.0805750 | 0.1130872 |
| When $k_2 < k_{20}$, $k_{2m}$ = | 0.1012146 | 0.0889111 | 0.0780908 | 0.0849402 | 0.0789160 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 14.312 | 35.616 | 79.447 | 3.314 | 27.322 |

22/35

| 0.93 ≦ NA ≦ 1.0<br>105 < T ≦ 115 | | | |
|---|---|---|---|
| Case | 11-11 | 11-12 | 11-13 |
| $n_{10}$ | 1.7070930 | 1.7028018 | 1.7027432 |
| $k_{10}$ | 0.0681638 | 0.0710148 | 0.0605235 |
| $d_{10}$ (nm) | 152.585 | 217.506 | 215.929 |
| $n_{20}$ | 1.6551703 | 1.6456663 | 1.6646615 |
| $k_{20}$ | 0.2055639 | 0.2376270 | 0.1950188 |
| $d_{20}$ (nm) | 237.501 | 177.429 | 233.713 |
| When $n_1 \geqq n_{10}$, $n_{1m}$ = | 0.0578955 | 0.0572009 | 0.0625354 |
| When $n_1 < n_{10}$, $n_{1m}$ = | 0.0537671 | 0.0422668 | 0.0608704 |
| When $k_1 \geqq k_{10}$, $k_{1m}$ = | 0.0790588 | 0.0645129 | 0.0827734 |
| When $k_1 < k_{10}$, $k_{1m}$ = | 0.0435974 | 0.0363208 | 0.0394031 |
| When $d_1 \geqq d_{10}$, $d_{1m}$ (nm) = | ∞ | ∞ | ∞ |
| When $d_1 < d_{10}$, $d_{1m}$ (nm) = | 20.858 | 18.787 | 80.567 |
| When $n_2 \geqq n_{20}$, $n_{2m}$ = | 0.1279260 | 0.3212610 | 0.2872583 |
| When $n_2 < n_{20}$, $n_{2m}$ = | 0.1371912 | 0.1436340 | 0.1515588 |
| When $k_2 \geqq k_{20}$, $k_{2m}$ = | 0.1138037 | 0.1091870 | 0.1188855 |
| When $k_2 < k_{20}$, $k_{2m}$ = | 0.0699854 | 0.0793604 | 0.0696228 |
| When $d_2 \geqq d_{20}$, $d_{2m}$ (nm) = | ∞ | ∞ | ∞ |
| When $d_2 < d_{20}$, $d_{2m}$ (nm) = | 73.529 | 27.402 | 72.558 |

| 0.93 ≦ NA ≦ 1.0<br>115 < T ≦ 125 | | | | | |
|---|---|---|---|---|---|
| Case | 12-01 | 12-02 | 12-03 | 12-04 | 12-05 |
| $n_{10}$ | 1.8909431 | 1.9524263 | 1.9741784 | 1.9011191 | 1.7812655 |
| $k_{10}$ | 0.3085424 | 0.1909748 | 0.1389140 | 0.1449022 | 0.1647646 |
| $d_{10}$ (nm) | 20.418 | 15.444 | 11.832 | 11.795 | 82.868 |
| $n_{20}$ | 1.5964478 | 1.7414925 | 1.7353816 | 1.6673230 | 1.6154117 |
| $k_{20}$ | 0.8353138 | 0.5288169 | 0.3892797 | 0.3043383 | 0.6141968 |
| $d_{20}$ (nm) | 60.909 | 116.361 | 176.360 | 237.538 | 58.066 |
| When $n_1 \geqq n_{10}$, $n_{1m}$ = | 0.0896326 | 0.1058130 | 0.1273743 | 0.1294861 | 0.0526233 |
| When $n_1 < n_{10}$, $n_{1m}$ = | 0.0482068 | 0.0693359 | 0.0898755 | 0.1018958 | 0.0089111 |
| When $k_1 \geqq k_{10}$, $k_{1m}$ = | 0.0687769 | 0.0897180 | 0.1101831 | 0.1230750 | 0.0397290 |
| When $k_1 < k_{10}$, $k_{1m}$ = | 0.0788684 | 0.1029199 | 0.1292102 | 0.1244238 | 0.0264612 |
| When $d_1 \geqq d_{10}$, $d_{1m}$ (nm) = | 4.348 | 5.029 | 5.176 | 6.485 | 6.077 |
| When $d_1 < d_{10}$, $d_{1m}$ (nm) = | 2.275 | 2.981 | 3.260 | 4.641 | 1.033 |
| When $n_2 \geqq n_{20}$, $n_{2m}$ = | 0.1653235 | 0.1570801 | 0.1545581 | 0.1637158 | 0.2122083 |
| When $n_2 < n_{20}$, $n_{2m}$ = | 0.1924231 | 0.2075879 | 0.1868823 | 0.1636792 | 0.1151331 |
| When $k_2 \geqq k_{20}$, $k_{2m}$ = | 0.1706042 | 0.1628406 | 0.1476868 | 0.1368591 | 0.0534973 |
| When $k_2 < k_{20}$, $k_{2m}$ = | 0.1411853 | 0.1262378 | 0.1172034 | 0.1087061 | 0.1078625 |
| When $d_2 \geqq d_{20}$, $d_{2m}$ (nm) = | ∞ | ∞ | ∞ | ∞ | 22.263 |
| When $d_2 < d_{20}$, $d_{2m}$ (nm) = | 15.932 | 41.005 | 77.327 | 119.056 | 3.631 |

0.93 ≦ NA ≦ 1.0
115 < T ≦ 125

23/35

| Case | 12-06 | 12-07 | 12-08 | 12-09 | 12-10 |
|---|---|---|---|---|---|
| $n_{10}$ | 1.7599364 | 1.7294022 | 1.7193592 | 1.7088052 | 1.7070991 |
| $k_{10}$ | 0.1268761 | 0.1028924 | 0.0869972 | 0.0815889 | 0.0689994 |
| $d_{10}$ (nm) | 86.158 | 87.627 | 87.259 | 153.347 | 152.325 |
| $n_{20}$ | 1.7200975 | 1.6470339 | 1.6442041 | 1.6346844 | 1.6535493 |
| $k_{20}$ | 0.3928633 | 0.2862372 | 0.2301394 | 0.2563356 | 0.2091466 |
| $d_{20}$ (nm) | 111.244 | 173.600 | 231.990 | 171.193 | 227.454 |
| When $n_1 \geqq n_{10}$, $n_{1m}$ = | 0.0606738 | 0.0583850 | 0.0624988 | 0.0517444 | 0.0574902 |
| When $n_1 < n_{10}$, $n_{1m}$ = | 0.0144922 | 0.0280688 | 0.0507288 | 0.0284387 | 0.0507019 |
| When $k_1 \geqq k_{10}$, $k_{1m}$ = | 0.0425989 | 0.0573376 | 0.0776721 | 0.0554700 | 0.0798230 |
| When $k_1 < k_{10}$, $k_{1m}$ = | 0.0406250 | 0.0512256 | 0.0527991 | 0.0388428 | 0.0424304 |
| When $d_1 \geqq d_{10}$, $d_{1m}$ (nm) = | 9.315 | 15.226 | 20.570 | 23.760 | ∞ |
| When $d_1 < d_{10}$, $d_{1m}$ (nm) = | 2.129 | 5.657 | 12.499 | 8.630 | 19.101 |
| When $n_2 \geqq n_{20}$, $n_{2m}$ = | 0.2113904 | 0.2168030 | 0.1303113 | 0.0779236 | 0.1123853 |
| When $n_2 < n_{20}$, $n_{2m}$ = | 0.1965198 | 0.1502832 | 0.1490173 | 0.1347925 | 0.1407104 |
| When $k_2 \geqq k_{20}$, $k_{2m}$ = | 0.1312354 | 0.1404419 | 0.1299280 | 0.1034583 | 0.1115356 |
| When $k_2 < k_{20}$, $k_{2m}$ = | 0.0975891 | 0.0892358 | 0.0798267 | 0.0797656 | 0.0721289 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 8.212 | 56.813 | 80.756 | 28.524 | 74.263 |

0.93 ≦ NA ≦ 1.0
115 < T ≦ 125

| Case | 12-11 | 12-12 |
|---|---|---|
| $n_{10}$ | 1.7021164 | 1.7030336 |
| $k_{10}$ | 0.0722203 | 0.0611451 |
| $d_{10}$ (nm) | 217.158 | 215.722 |
| $n_{20}$ | 1.6379690 | 1.6657846 |
| $k_{20}$ | 0.2419462 | 0.1987136 |
| $d_{20}$ (nm) | 168.107 | 223.276 |
| When $n_1 \geqq n_{10}$, $n_{1m}$ = | 0.0559460 | 0.0616492 |
| When $n_1 < n_{10}$, $n_{1m}$ = | 0.0369629 | 0.0571216 |
| When $k_1 \geqq k_{10}$, $k_{1m}$ = | 0.0643591 | 0.0831226 |
| When $k_1 < k_{10}$, $k_{1m}$ = | 0.0338867 | 0.0383716 |
| When $d_1 \geqq d_{10}$, $d_{1m}$ (nm) = | ∞ | ∞ |
| When $d_1 < d_{10}$, $d_{1m}$ (nm) = | 15.623 | 78.766 |
| When $n_2 \geqq n_{20}$, $n_{2m}$ = | 0.1071765 | 0.1574146 |
| When $n_2 < n_{20}$, $n_{2m}$ = | 0.1467676 | 0.1563452 |
| When $k_2 \geqq k_{20}$, $k_{2m}$ = | 0.1072412 | 0.1188721 |
| When $k_2 < k_{20}$, $k_{2m}$ = | 0.0815015 | 0.0722400 |
| When $d_2 \geqq d_{20}$, $d_{2m}$ (nm) = | ∞ | ∞ |
| When $d_2 < d_{20}$, $d_{2m}$ (nm) = | 28.758 | 73.194 |

0.93 ≦ NA ≦ 1.0
125 < T ≦ 135

24/35

| Case | 13-01 | 13-02 | 13-03 | 13-04 | 13-05 |
|---|---|---|---|---|---|
| $n_{10}$ | 1.8737564 | 1.9697383 | 1.9916260 | 1.9141720 | 1.7868889 |
| $k_{10}$ | 0.3367363 | 0.2020294 | 0.1477036 | 0.1461879 | 0.1795709 |
| $d_{10}$ (nm) | 20.276 | 14.764 | 11.315 | 11.459 | 80.605 |
| $n_{20}$ | 1.5133470 | 1.7299638 | 1.7257470 | 1.6683491 | 1.5409994 |
| $k_{20}$ | 0.8454522 | 0.5429087 | 0.3987910 | 0.3122132 | 0.6011754 |
| $d_{20}$ (nm) | 55.480 | 109.268 | 168.578 | 226.037 | 53.925 |
| When $n_1 \geqq n_{10}$, $n_{1m}$ = | 0.0919055 | 0.1108435 | 0.1324426 | 0.1321936 | 0.0477332 |
| When $n_1 < n_{10}$, $n_{1m}$ = | 0.0465112 | 0.0677783 | 0.0890894 | 0.1050525 | 0.0054248 |
| When $k_1 \geqq k_{10}$, $k_{1m}$ = | 0.0634827 | 0.0913306 | 0.1103125 | 0.1242993 | 0.0376343 |
| When $k_1 < k_{10}$, $k_{1m}$ = | 0.0777942 | 0.1046863 | 0.1330994 | 0.1263855 | 0.0172180 |
| When $d_1 \geqq d_{10}$, $d_{1m}$ (nm) = | 4.127 | 4.585 | 4.757 | 6.157 | 5.240 |
| When $d_1 < d_{10}$, $d_{1m}$ (nm) = | 2.100 | 2.651 | 2.937 | 4.469 | 0.576 |
| When $n_2 \geqq n_{20}$, $n_{2m}$ = | 0.1485144 | 0.1609766 | 0.1572363 | 0.1614685 | 0.1647119 |
| When $n_2 < n_{20}$, $n_{2m}$ = | 0.1669641 | 0.2206506 | 0.1915698 | 0.1618420 | 0.0427734 |
| When $k_2 \geqq k_{20}$, $k_{2m}$ = | 0.1498572 | 0.1556653 | 0.1444165 | 0.1361792 | 0.0323462 |
| When $k_2 < k_{20}$, $k_{2m}$ = | 0.1523499 | 0.1322424 | 0.1219958 | 0.1118262 | 0.1188306 |
| When $d_2 \geqq d_{20}$, $d_{2m}$ (nm) = | ∞ | ∞ | ∞ | ∞ | 20.169 |
| When $d_2 < d_{20}$, $d_{2m}$ (nm) = | 11.040 | 31.054 | 70.606 | 112.796 | 1.698 |

-continued

| $0.93 \leqq NA \leqq 1.0$ <br> $125 < T \leqq 135$ | | | | | |
|---|---|---|---|---|---|
| Case | 13-06 | 13-07 | 13-08 | 13-09 | 13-10 |
| $n_{10}$ | 1.7600620 | 1.7276490 | 1.7199953 | 1.7084320 | 1.7077870 |
| $k_{10}$ | 0.1342170 | 0.1044918 | 0.0874837 | 0.0820944 | 0.0691595 |
| $d_{10}$ (nm) | 85.615 | 87.663 | 87.278 | 153.448 | 152.438 |
| $n_{20}$ | 1.6974715 | 1.6338870 | 1.6452183 | 1.6304269 | 1.6574806 |
| $k_{20}$ | 0.3980869 | 0.2915200 | 0.2346970 | 0.2625567 | 0.2137196 |
| $d_{20}$ (nm) | 104.529 | 164.129 | 221.092 | 160.685 | 216.250 |
| When $n_1 \geqq n_{10}$, $n_{1m}$ = | 0.0556421 | 0.0573047 | 0.0630432 | 0.0509070 | 0.0582422 |
| When $n_1 < n_{10}$, $n_{1m}$ = | 0.0086938 | 0.0280566 | 0.0524658 | 0.0272729 | 0.0496997 |
| When $k_1 \geqq k_{10}$, $k_{1m}$ = | 0.0327625 | 0.0552051 | 0.0782056 | 0.0552515 | 0.0808813 |
| When $k_1 < k_{10}$, $k_{1m}$ = | 0.0328357 | 0.0492957 | 0.0525903 | 0.0375085 | 0.0423645 |
| When $d_1 \geqq d_{10}$, $d_{1m}$ (nm) = | 8.316 | 14.598 | 20.258 | 22.646 | ∞ |
| When $d_1 < d_{10}$, $d_{1m}$ (nm) = | 1.229 | 5.725 | 12.785 | 8.439 | 18.783 |
| When $n_2 \geqq n_{20}$, $n_{2m}$ = | 0.2312317 | 0.1156555 | 0.1151941 | 0.0670740 | 0.1089307 |
| When $n_2 < n_{20}$, $n_{2m}$ = | 0.2128992 | 0.1481116 | 0.1498755 | 0.1344946 | 0.1425024 |
| When $k_2 \geqq k_{20}$, $k_{2m}$ = | 0.1020886 | 0.1348413 | 0.1299255 | 0.1027795 | 0.1131628 |
| When $k_2 < k_{20}$, $k_{2m}$ = | 0.1027185 | 0.0927148 | 0.0827966 | 0.0840479 | 0.0754407 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 4.085 | 34.120 | 79.786 | 26.736 | 37.465 |

| $0.93 \leqq NA \leqq 1.0$ <br> $125 < T \leqq 135$ | | |
|---|---|---|
| Case | 13-11 | 13-12 |
| $n_{10}$ | 1.7022055 | 1.7036940 |
| $k_{10}$ | 0.0725208 | 0.0612465 |
| $d_{10}$ (nm) | 217.368 | 215.927 |
| $n_{20}$ | 1.6389178 | 1.6705104 |
| $k_{20}$ | 0.2487144 | 0.2029113 |
| $d_{20}$ (nm) | 157.041 | 212.129 |
| When $n_1 \geqq n_{10}$, $n_{1m}$ = | 0.0559827 | 0.0624561 |
| When $n_1 < n_{10}$, $n_{1m}$ = | 0.0346814 | 0.0563831 |
| When $k_1 \geqq k_{10}$, $k_{1m}$ = | 0.0655139 | 0.0838672 |
| When $k_1 < k_{10}$, $k_{1m}$ = | 0.0329700 | 0.0384436 |
| When $d_1 \geqq d_{10}$, $d_{1m}$ (nm) = | ∞ | ∞ |
| When $d_1 < d_{10}$, $d_{1m}$ (nm) = | 14.691 | 78.542 |
| When $n_2 \geqq n_{20}$, $n_{2m}$ = | 0.0987000 | 0.1459375 |
| When $n_2 < n_{20}$, $n_{2m}$ = | 0.1477222 | 0.1585510 |
| When $k_2 \geqq k_{20}$, $k_{2m}$ = | 0.1107947 | 0.1206909 |
| When $k_2 < k_{20}$, $k_{2m}$ = | 0.0868396 | 0.0754724 |
| When $d_2 \geqq d_{20}$, $d_{2m}$ (nm) = | ∞ | ∞ |
| When $d_2 < d_{20}$, $d_{2m}$ (nm) = | 26.886 | 30.205 |

| $0.93 \leqq NA \leqq 1.0$ <br> $135 < T \leqq 145$ | | | | | |
|---|---|---|---|---|---|
| Case | 14-01 | 14-02 | 14-03 | 14-04 | 14-05 |
| $n_{10}$ | 1.8402862 | 1.9646387 | 1.9624104 | 1.9059084 | 1.8166660 |
| $k_{10}$ | 0.3700261 | 0.2123233 | 0.1584699 | 0.1473615 | 0.1977639 |
| $d_{10}$ (nm) | 23.403 | 16.447 | 12.893 | 12.089 | 79.798 |
| $n_{20}$ | 1.4966418 | 1.7618069 | 1.7211612 | 1.6694213 | 1.5572201 |
| $k_{20}$ | 1.0039549 | 0.5971846 | 0.4176484 | 0.3203376 | 0.7204992 |
| $d_{20}$ (nm) | 41.463 | 94.995 | 156.173 | 216.011 | 40.224 |
| When $n_1 \geqq n_{10}$, $n_{1m}$ = | 0.0906067 | 0.1022083 | 0.1191650 | 0.1272498 | 0.0481567 |
| When $n_1 < n_{10}$, $n_{1m}$ = | 0.0460486 | 0.0622925 | 0.0801978 | 0.1004968 | 0.0053052 |
| When $k_1 \geqq k_{10}$, $k_{1m}$ = | 0.0548682 | 0.0821582 | 0.0987952 | 0.1188953 | 0.0360181 |
| When $k_1 < k_{10}$, $k_{1m}$ = | 0.0585999 | 0.0953162 | 0.1207214 | 0.1220581 | 0.0169287 |
| When $d_1 \geqq d_{10}$, $d_{1m}$ (nm) = | 4.196 | 4.611 | 5.209 | 6.343 | 4.539 |
| When $d_1 < d_{10}$, $d_{1m}$ (nm) = | 2.216 | 2.591 | 3.134 | 4.582 | 0.509 |
| When $n_2 \geqq n_{20}$, $n_{2m}$ = | 0.1766626 | 0.1806128 | 0.1668896 | 0.1603455 | 0.2142871 |
| When $n_2 < n_{20}$, $n_{2m}$ = | 0.1712292 | 0.2330798 | 0.1905432 | 0.1645447 | 0.0564514 |
| When $k_2 \geqq k_{20}$, $k_{2m}$ = | 0.2110498 | 0.1844238 | 0.1540930 | 0.1380908 | 0.0433691 |
| When $k_2 < k_{20}$, $k_{2m}$ = | 0.1916614 | 0.1446765 | 0.1279346 | 0.1140405 | 0.1534607 |
| When $d_2 \geqq d_{20}$, $d_{2m}$ (nm) = | ∞ | ∞ | ∞ | ∞ | 18.289 |
| When $d_2 < d_{20}$, $d_{2m}$ (nm) = | 8.143 | 21.467 | 66.145 | 96.079 | 1.264 |

0.93 ≦ NA ≦ 1.0
135 < T ≦ 145

26/35

| Case | 14-06 | 14-07 | 14-08 | 14-09 | 14-10 |
|---|---|---|---|---|---|
| $n_{10}$ | 1.7655719 | 1.7293285 | 1.7214396 | 1.7092770 | 1.7085071 |
| $k_{10}$ | 0.1384976 | 0.1055583 | 0.0882507 | 0.0826318 | 0.0697446 |
| $d_{10}$ (nm) | 86.596 | 87.952 | 87.451 | 153.805 | 152.663 |
| $n_{20}$ | 1.7129955 | 1.6364176 | 1.6482275 | 1.6322979 | 1.6592624 |
| $k_{20}$ | 0.4320226 | 0.3040668 | 0.2416232 | 0.2733763 | 0.2197085 |
| $d_{20}$ (nm) | 91.539 | 153.339 | 210.993 | 150.296 | 206.543 |
| When $n_1 \geqq n_{10}$, $n_{1m}$ = | 0.0570667 | 0.0566760 | 0.0630505 | 0.0509021 | 0.0584448 |
| When $n_1 < n_{10}$, $n_{1m}$ = | 0.0070447 | 0.0278870 | 0.0524426 | 0.0272241 | 0.0508081 |
| When $k_1 \geqq k_{10}$, $k_{1m}$ = | 0.0284875 | 0.0544165 | 0.0773682 | 0.0546399 | 0.0801599 |
| When $k_1 < k_{10}$, $k_{1m}$ = | 0.0304980 | 0.0499133 | 0.0532507 | 0.0383374 | 0.0431470 |
| When $d_1 \geqq d_{10}$, $d_{1m}$ (nm) = | 7.855 | 14.249 | 20.142 | 22.873 | ∞ |
| When $d_1 < d_{10}$, $d_{1m}$ (nm) = | 0.972 | 5.625 | 12.498 | 8.268 | 18.904 |
| When $n_2 \geqq n_{20}$, $n_{2m}$ = | 0.2760107 | 0.1009705 | 0.1137622 | 0.0657813 | 0.1088953 |
| When $n_2 < n_{20}$, $n_{2m}$ = | 0.1995349 | 0.1448511 | 0.1471863 | 0.1316589 | 0.1395239 |
| When $k_2 \geqq k_{20}$, $k_{2m}$ = | 0.1305078 | 0.1378174 | 0.1321667 | 0.1037769 | 0.1143506 |
| When $k_2 < k_{20}$, $k_{2m}$ = | 0.1154834 | 0.0970654 | 0.0846460 | 0.0880420 | 0.0769495 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 3.137 | 27.699 | 76.164 | 22.775 | 33.816 |

0.93 ≦ NA ≦ 1.0
135 < T ≦ 145

| Case | 14-11 | 14-12 |
|---|---|---|
| $n_{10}$ | 1.7027802 | 1.7041709 |
| $k_{10}$ | 0.0728517 | 0.0617202 |
| $d_{10}$ (nm) | 217.779 | 216.194 |
| $n_{20}$ | 1.6405373 | 1.6719897 |
| $k_{20}$ | 0.2588103 | 0.2085423 |
| $d_{20}$ (nm) | 146.936 | 202.593 |
| When $n_1 \geqq n_{10}$, $n_{1m}$ = | 0.0566504 | 0.0631152 |
| When $n_1 < n_{10}$, $n_{1m}$ = | 0.0353162 | 0.0583606 |
| When $k_1 \geqq k_{10}$, $k_{1m}$ = | 0.0649280 | 0.0832544 |
| When $k_1 < k_{10}$, $k_{1m}$ = | 0.0337988 | 0.0392310 |
| When $d_1 \geqq d_{10}$, $d_{1m}$ (nm) = | ∞ | ∞ |
| When $d_1 < d_{10}$, $d_{1m}$ (nm) = | 15.495 | 79.231 |
| When $n_2 \geqq n_{20}$, $n_{2m}$ = | 0.0962402 | 0.1448450 |
| When $n_2 < n_{20}$, $n_{2m}$ = | 0.1459131 | 0.1542615 |
| When $k_2 \geqq k_{20}$, $k_{2m}$ = | 0.1100769 | 0.1205054 |
| When $k_2 < k_{20}$, $k_{2m}$ = | 0.0901184 | 0.0767920 |
| When $d_2 \geqq d_{20}$, $d_{2m}$ (nm) = | ∞ | ∞ |
| When $d_2 < d_{20}$, $d_{2m}$ (nm) = | 22.790 | 28.928 |

0.93 ≦ NA ≦ 1.0
145 < T ≦ 155

27/35

| Case | 15-01 | 15-02 | 15-03 | 15-04 | 15-05 |
|---|---|---|---|---|---|
| $n_{10}$ | 1.8199816 | 1.9318464 | 1.9476580 | 1.9400781 | 1.9152409 |
| $k_{10}$ | 0.4068444 | 0.2280177 | 0.1546474 | 0.1580344 | 0.1421080 |
| $d_{10}$ (nm) | 29.022 | 20.237 | 15.042 | 15.180 | 12.506 |
| $n_{20}$ | 1.5974175 | 1.8212470 | 1.7660961 | 1.7558824 | 1.6892699 |
| $k_{20}$ | 1.4701111 | 0.6871951 | 0.4559575 | 0.4525330 | 0.3391765 |
| $d_{20}$ (nm) | 24.558 | 79.181 | 140.877 | 141.749 | 204.998 |
| When $n_1 \geqq n_{10}$, $n_{1m}$ = | 0.0783313 | 0.0902905 | 0.1062402 | 0.1057410 | 0.1233240 |
| When $n_1 < n_{10}$, $n_{1m}$ = | 0.0485986 | 0.0576099 | 0.0737439 | 0.0730676 | 0.0958533 |
| When $k_1 \geqq k_{10}$, $k_{1m}$ = | 0.0424463 | 0.0706348 | 0.0877539 | 0.0877856 | 0.1136047 |
| When $k_1 < k_{10}$, $k_{1m}$ = | 0.0340247 | 0.0852002 | 0.1066162 | 0.1062646 | 0.1201245 |
| When $d_1 \geqq d_{10}$, $d_{1m}$ (nm) = | 3.673 | 5.078 | 5.535 | 5.630 | 6.208 |
| When $d_1 < d_{10}$, $d_{1m}$ (nm) = | 2.651 | 2.819 | 3.357 | 3.413 | 4.390 |
| When $n_2 \geqq n_{20}$, $n_{2m}$ = | 0.2911646 | 0.2069556 | 0.1703650 | 0.1705981 | 0.1609875 |
| When $n_2 < n_{20}$, $n_{2m}$ = | 0.1897607 | 0.2328674 | 0.1899780 | 0.1895239 | 0.1746619 |
| When $k_2 \geqq k_{20}$, $k_{2m}$ = | 0.2661255 | 0.2545776 | 0.1755676 | 0.1739502 | 0.1429504 |
| When $k_2 < k_{20}$, $k_{2m}$ = | 0.2599438 | 0.1612646 | 0.1333740 | 0.1331494 | 0.1167700 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 5.427 | 21.100 | 63.576 | 64.042 | 84.536 |

-continued

| 0.93 ≦ NA ≦ 1.0<br>145 < T ≦ 155 | | | | | |
|---|---|---|---|---|---|
| Case | 15-06 | 15-07 | 15-08 | 15-09 | 15-10 |
| $n_{10}$ | 1.8773964 | 1.7792899 | 1.7347668 | 1.7234258 | 1.7112569 |
| $k_{10}$ | 0.2151408 | 0.1408151 | 0.1082989 | 0.0907869 | 0.0850611 |
| $d_{10}$ (nm) | 81.211 | 87.880 | 88.119 | 87.442 | 153.930 |
| $n_{20}$ | 1.7568637 | 1.7944868 | 1.6522930 | 1.6482492 | 1.6361524 |
| $k_{20}$ | 1.2210655 | 0.5090378 | 0.3260600 | 0.2516544 | 0.2898839 |
| $d_{20}$ (nm) | 20.666 | 75.457 | 142.664 | 202.556 | 141.116 |
| When $n_1 \geqq n_{10}$, $n_{1m}$ = | 0.0535974 | 0.0567944 | 0.0566736 | 0.0621204 | 0.0507385 |
| When $n_1 < n_{10}$, $n_{1m}$ = | 0.0100415 | 0.0103674 | 0.0259888 | 0.0480981 | 0.0259363 |
| When $k_1 \geqq k_{10}$, $k_{1m}$ = | 0.0386597 | 0.0332520 | 0.0534692 | 0.0749170 | 0.0514124 |
| When $k_1 < k_{10}$, $k_{1m}$ = | 0.0268323 | 0.0369287 | 0.0521716 | 0.0541968 | 0.0401160 |
| When $d_1 \geqq d_{10}$, $d_{1m}$ (nm) = | 4.095 | 7.577 | 13.934 | 19.192 | 22.547 |
| When $d_1 < d_{10}$, $d_{1m}$ (nm) = | 0.855 | 1.369 | 4.946 | 11.117 | 7.637 |
| When $n_2 \geqq n_{20}$, $n_{2m}$ = | 0.4215723 | 0.2684375 | 0.1205920 | 0.1204028 | 0.0675806 |
| When $n_2 < n_{20}$, $n_{2m}$ = | 0.3791321 | 0.1854980 | 0.1442749 | 0.1439111 | 0.1298389 |
| When $k_2 \geqq k_{20}$, $k_{2m}$ = | 0.1639099 | 0.2106580 | 0.1452100 | 0.1328479 | 0.0998340 |
| When $k_2 < k_{20}$, $k_{2m}$ = | 0.2423328 | 0.1335254 | 0.1007751 | 0.0850952 | 0.0900806 |
| When $d_2 \geqq d_{20}$, $d_{2m}$ (nm) = | 5.052 | 14.783 | ∞ | ∞ | ∞ |
| When $d_2 < d_{20}$, $d_{2m}$ (nm) = | 1.977 | 4.929 | 23.591 | 72.330 | 19.479 |

| 0.93 ≦ NA ≦ 1.0<br>145 < T ≦ 155 | | | |
|---|---|---|---|
| Case | 15-11 | 15-12 | 15-13 |
| $n_{10}$ | 1.7092054 | 1.7036310 | 1.7042855 |
| $k_{10}$ | 0.0717413 | 0.0749476 | 0.0635030 |
| $d_{10}$ (nm) | 152.725 | 217.788 | 216.233 |
| $n_{20}$ | 1.6572540 | 1.6384900 | 1.6687346 |
| $k_{20}$ | 0.2283199 | 0.2727185 | 0.2164860 |
| $d_{20}$ (nm) | 198.410 | 138.609 | 194.709 |
| When $n_1 \geqq n_{10}$, $n_{1m}$ = | 0.0574158 | 0.0563904 | 0.0624048 |
| When $n_1 < n_{10}$, $n_{1m}$ = | 0.0505359 | 0.0361853 | 0.0601721 |
| When $k_1 \geqq k_{10}$, $k_{1m}$ = | 0.0766162 | 0.0604248 | 0.0800598 |
| When $k_1 < k_{10}$, $k_{1m}$ = | 0.0439771 | 0.0350879 | 0.0400427 |
| When $d_1 \geqq d_{10}$, $d_{1m}$ (nm) = | ∞ | ∞ | ∞ |
| When $d_1 < d_{10}$, $d_{1m}$ (nm) = | 17.754 | 14.415 | 78.936 |
| When $n_2 \geqq n_{20}$, $n_{2m}$ = | 0.1103052 | 0.0951196 | 0.1487622 |
| When $n_2 < n_{20}$, $n_{2m}$ = | 0.1349475 | 0.1401550 | 0.1481909 |
| When $k_2 \geqq k_{20}$, $k_{2m}$ = | 0.1121790 | 0.1001306 | 0.1166199 |
| When $k_2 < k_{20}$, $k_{2m}$ = | 0.0769556 | 0.0916321 | 0.0768066 |
| When $d_2 \geqq d_{20}$, $d_{2m}$ (nm) = | ∞ | ∞ | ∞ |
| When $d_2 < d_{20}$, $d_{2m}$ (nm) = | 28.953 | 19.518 | 28.644 |

28/35

| 0.93 ≦ NA ≦ 1.0<br>155 < T ≦ 165 | | | | | |
|---|---|---|---|---|---|
| Case | 16-01 | 16-02 | 16-03 | 16-04 | 16-05 |
| $n_{10}$ | 1.8175791 | 1.9193642 | 1.9516445 | 1.9419697 | 1.9282358 |
| $k_{10}$ | 0.4385823 | 0.2501320 | 0.1607715 | 0.1648951 | 0.1504554 |
| $d_{10}$ (nm) | 37.187 | 21.908 | 15.944 | 16.094 | 12.282 |
| $n_{20}$ | 2.9488620 | 1.8321620 | 1.7911399 | 1.7764317 | 1.6857745 |
| $k_{20}$ | 3.6605721 | 0.7789298 | 0.4964603 | 0.4910919 | 0.3551730 |
| $d_{20}$ (nm) | 5.671 | 69.456 | 129.934 | 131.139 | 198.143 |
| When $n_1 \geqq n_{10}$, $n_{1m}$ = | 0.0604736 | 0.0852295 | 0.1013757 | 0.1010083 | 0.1240356 |
| When $n_1 < n_{10}$, $n_{1m}$ = | 0.0333899 | 0.0547046 | 0.0713342 | 0.0704993 | 0.0944006 |
| When $k_1 \geqq k_{10}$, $k_{1m}$ = | 0.0318896 | 0.0632361 | 0.0833032 | 0.0834521 | 0.1140308 |
| When $k_1 < k_{10}$, $k_{1m}$ = | 0.0127527 | 0.0803174 | 0.1011133 | 0.1007434 | 0.1227710 |
| When $d_1 \geqq d_{10}$, $d_{1m}$ (nm) = | 2.684 | 4.937 | 5.403 | 5.524 | 5.825 |
| When $d_1 < d_{10}$, $d_{1m}$ (nm) = | 1.056 | 2.746 | 3.284 | 3.349 | 4.015 |
| When $n_2 \geqq n_{20}$, $n_{2m}$ = | 0.8885571 | 0.1992395 | 0.1663013 | 0.1663708 | 0.1592810 |
| When $n_2 < n_{20}$, $n_{2m}$ = | 0.4338977 | 0.2305408 | 0.1904468 | 0.1899951 | 0.1750964 |
| When $k_2 \geqq k_{20}$, $k_{2m}$ = | 0.2239417 | 0.2871423 | 0.1858569 | 0.1831470 | 0.1419360 |
| When $k_2 < k_{20}$, $k_{2m}$ = | 0.5593811 | 0.1675525 | 0.1346912 | 0.1341003 | 0.1171777 |
| When $d_2 \geqq d_{20}$, $d_{2m}$ (nm) = | 2.121 | ∞ | ∞ | ∞ | ∞ |
| When $d_2 < d_{20}$, $d_{2m}$ (nm) = | 1.497 | 16.789 | 53.787 | 54.606 | 81.510 |

0.93 ≦ NA ≦ 1.0
155 < T ≦ 165

29/35

| Case | 16-06 | 16-07 | 16-08 | 16-09 | 16-10 |
|---|---|---|---|---|---|
| $n_{10}$ | 1.8704725 | 1.7960814 | 1.7418606 | 1.7257176 | 1.7136245 |
| $k_{10}$ | 0.2299368 | 0.1479091 | 0.1134159 | 0.0948039 | 0.0896483 |
| $d_{10}$ (nm) | 88.746 | 88.347 | 87.888 | 87.264 | 153.565 |
| $n_{20}$ | 2.8158519 | 1.9330235 | 1.6717189 | 1.6472351 | 1.6392609 |
| $k_{20}$ | 3.0739838 | 0.6225271 | 0.3550776 | 0.2650084 | 0.3111392 |
| $d_{20}$ (nm) | 4.992 | 60.492 | 132.384 | 194.269 | 132.434 |
| When $n_1 \geqq n_{10}$, $n_{1m}$ = | 0.0496790 | 0.0539771 | 0.0559290 | 0.0605103 | 0.0493213 |
| When $n_1 < n_{10}$, $n_{1m}$ = | 0.0158618 | 0.0116589 | 0.0229565 | 0.0427002 | 0.0176343 |
| When $k_1 \geqq k_{10}$, $k_{1m}$ = | 0.0339600 | 0.0324597 | 0.0502661 | 0.0714246 | 0.0448999 |
| When $k_1 < k_{10}$, $k_{1m}$ = | 0.0196045 | 0.0413477 | 0.0524426 | 0.0547058 | 0.0377209 |
| When $d_1 \geqq d_{10}$, $d_{1m}$ (nm) = | 4.203 | 6.741 | 12.890 | 17.512 | 20.755 |
| When $d_1 < d_{10}$, $d_{1m}$ (nm) = | 1.412 | 1.425 | 4.045 | 9.285 | 4.775 |
| When $n_2 \geqq n_{20}$, $n_{2m}$ = | 0.7568213 | 0.2080432 | 0.1385022 | 0.1276587 | 0.0653149 |
| When $n_2 < n_{20}$, $n_{2m}$ = | 0.6339124 | 0.1864246 | 0.1456726 | 0.1431897 | 0.1296729 |
| When $k_2 \geqq k_{20}$, $k_{2m}$ = | 0.5784314 | 0.2482080 | 0.1472144 | 0.1310840 | 0.0863611 |
| When $k_2 < k_{20}$, $k_{2m}$ = | 0.6241199 | 0.1496924 | 0.1027478 | 0.0854395 | 0.0904016 |
| When $d_2 \geqq d_{20}$, $d_{2m}$ (nm) = | 1.695 | 9.818 | ∞ | ∞ | ∞ |
| When $d_2 < d_{20}$, $d_{2m}$ (nm) = | 1.276 | 6.130 | 21.225 | 35.287 | 17.454 |

0.93 ≦ NA ≦ 1.0
155 < T ≦ 165

| Case | 16-11 | 16-12 | 16-13 | 16-14 |
|---|---|---|---|---|
| $n_{10}$ | 1.7097149 | 1.7044725 | 1.7041849 | 1.7061658 |
| $k_{10}$ | 0.0750113 | 0.0790614 | 0.0664191 | 0.0592006 |
| $d_{10}$ (nm) | 152.537 | 217.265 | 215.910 | 215.675 |
| $n_{20}$ | 1.6527377 | 1.6350180 | 1.6625759 | 1.6951633 |
| $k_{20}$ | 0.2392317 | 0.2903973 | 0.2261823 | 0.1893046 |
| $d_{20}$ (nm) | 190.639 | 130.687 | 187.261 | 240.772 |
| When $n_1 \geqq n_{10}$, $n_{1m}$ = | 0.0553772 | 0.0545740 | 0.0600366 | 0.0676270 |
| When $n_1 < n_{10}$, $n_{1m}$ = | 0.0477368 | 0.0344788 | 0.0568494 | 0.0690149 |
| When $k_1 \geqq k_{10}$, $k_{1m}$ = | 0.0715491 | 0.0525977 | 0.0752148 | 0.0835681 |
| When $k_1 < k_{10}$, $k_{1m}$ = | 0.0443665 | 0.0337817 | 0.0404053 | 0.0425281 |
| When $d_1 \geqq d_{10}$, $d_{1m}$ (nm) = | ∞ | ∞ | ∞ | ∞ |
| When $d_1 < d_{10}$, $d_{1m}$ (nm) = | 16.235 | 12.121 | 77.039 | 86.324 |
| When $n_2 \geqq n_{20}$, $n_{2m}$ = | 0.1116882 | 0.0916113 | 0.1582788 | 0.1718628 |
| When $n_2 < n_{20}$, $n_{2m}$ = | 0.1331189 | 0.1411133 | 0.1443433 | 0.1614490 |
| When $k_2 \geqq k_{20}$, $k_{2m}$ = | 0.1061816 | 0.0827698 | 0.1097974 | 0.1248706 |
| When $k_2 < k_{20}$, $k_{2m}$ = | 0.0766345 | 0.0918372 | 0.0766272 | 0.0699548 |
| When $d_2 \geqq d_{20}$, $d_{2m}$ (nm) = | ∞ | ∞ | ∞ | ∞ |
| When $d_2 < d_{20}$, $d_{2m}$ (nm) = | 27.428 | 17.505 | 27.098 | 73.085 |

0.93 ≦ NA ≦ 1.0
165 < T ≦ 175

30/35

| Case | 17-01 | 17-02 | 17-03 | 17-04 | 17-05 |
|---|---|---|---|---|---|
| $n_{10}$ | 1.9650460 | 1.9384951 | 1.9139584 | 1.7857662 | 1.7433983 |
| $k_{10}$ | 0.1748342 | 0.1550287 | 0.1299465 | 0.1574086 | 0.1202381 |
| $d_{10}$ (nm) | 15.368 | 12.323 | 11.343 | 86.539 | 87.036 |
| $n_{20}$ | 1.7719438 | 1.6895811 | 1.6883766 | 1.7907030 | 1.6559011 |
| $k_{20}$ | 0.5219218 | 0.3734128 | 0.3007198 | 0.6497694 | 0.3733381 |
| $d_{20}$ (nm) | 124.100 | 189.293 | 246.427 | 59.718 | 125.629 |
| When $n_1 \geqq n_{10}$, $n_{1m}$ = | 0.1023816 | 0.1220520 | 0.1341687 | 0.0495288 | 0.0535669 |
| When $n_1 < n_{10}$, $n_{1m}$ = | 0.0697961 | 0.0912976 | 0.1083984 | 0.0051111 | 0.0188965 |
| When $k_1 \geqq k_{10}$, $k_{1m}$ = | 0.0830420 | 0.1112122 | 0.1288184 | 0.0186707 | 0.0452673 |
| When $k_1 < k_{10}$, $k_{1m}$ = | 0.1016052 | 0.1222986 | 0.1299465 | 0.0330212 | 0.0491577 |
| When $d_1 \geqq d_{10}$, $d_{1m}$ (nm) = | 5.001 | 5.526 | 6.413 | 5.954 | 11.233 |
| When $d_1 < d_{10}$, $d_{1m}$ (nm) = | 2.956 | 3.739 | 4.697 | 0.624 | 3.144 |
| When $n_2 \geqq n_{20}$, $n_{2m}$ = | 0.1581653 | 0.1572925 | 0.1540161 | 0.0858301 | 0.1199121 |
| When $n_2 < n_{20}$, $n_{2m}$ = | 0.1927075 | 0.1754407 | 0.1685632 | 0.1889197 | 0.1519067 |
| When $k_2 \geqq k_{20}$, $k_{2m}$ = | 0.1753381 | 0.1419458 | 0.1368945 | 0.0730774 | 0.1241467 |
| When $k_2 < k_{20}$, $k_{2m}$ = | 0.1306897 | 0.1171997 | 0.1067334 | 0.1258240 | 0.0983862 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 51.895 | 79.651 | 119.351 | 3.741 | 21.467 |

-continued

| | 0.93 ≦ NA ≦ 1.0<br>165 < T ≦ 175 | | | | |
|---|---|---|---|---|---|
| Case | 17-06 | 17-07 | 17-08 | 17-09 | 17-10 |
| $n_{10}$ | 1.7262549 | 1.7236673 | 1.7140199 | 1.7096017 | 1.7107217 |
| $k_{10}$ | 0.0993784 | 0.0842645 | 0.0949670 | 0.0783956 | 0.0680252 |
| $d_{10}$ (nm) | 86.812 | 87.109 | 152.601 | 152.026 | 152.100 |
| $n_{20}$ | 1.6373093 | 1.6685549 | 1.6238426 | 1.6437329 | 1.6799600 |
| $k_{20}$ | 0.2753256 | 0.2274459 | 0.3258368 | 0.2483227 | 0.2063397 |
| $d_{20}$ (nm) | 186.729 | 241.120 | 125.450 | 182.921 | 236.403 |
| When $n_1 \geqq n_{10}$, $n_{1m}$ = | 0.0583655 | 0.0638147 | 0.0459595 | 0.0526709 | 0.0601990 |
| When $n_1 < n_{10}$, $n_{1m}$ = | 0.0389001 | 0.0503784 | 0.0111768 | 0.0448047 | 0.0600891 |
| When $k_1 \geqq k_{10}$, $k_{1m}$ = | 0.0685583 | 0.0805896 | 0.0359302 | 0.0672742 | 0.0800940 |
| When $k_1 < k_{10}$, $k_{1m}$ = | 0.0538513 | 0.0560901 | 0.0310425 | 0.0434424 | 0.0457349 |
| When $d_1 \geqq d_{10}$, $d_{1m}$ (nm) = | 15.725 | 22.939 | 17.229 | ∞ | ∞ |
| When $d_1 < d_{10}$, $d_{1m}$ (nm) = | 8.012 | 11.976 | 2.824 | 14.351 | 24.120 |
| When $n_2 \geqq n_{20}$, $n_{2m}$ = | 0.1242969 | 0.1275708 | 0.0486890 | 0.1084961 | 0.1263135 |
| When $n_2 < n_{20}$, $n_{2m}$ = | 0.1456055 | 0.1521838 | 0.1337903 | 0.1356079 | 0.1464233 |
| When $k_2 \geqq k_{20}$, $k_{2m}$ = | 0.1234131 | 0.1338855 | 0.0591821 | 0.0969312 | 0.1151416 |
| When $k_2 < k_{20}$, $k_{2m}$ = | 0.0846008 | 0.0776428 | 0.0858325 | 0.0756372 | 0.0703125 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 66.105 | 78.842 | 17.102 | 28.470 | 72.561 |

31/35

| | 0.93 ≦ NA ≦ 1.0<br>165 < T ≦ 175 | | |
|---|---|---|---|
| Case | 17-11 | 17-12 | 17-13 |
| $n_{10}$ | 1.7042582 | 1.7037677 | 1.7056779 |
| $k_{10}$ | 0.0836625 | 0.0692974 | 0.0609868 |
| $d_{10}$ (nm) | 216.186 | 215.313 | 215.198 |
| $n_{20}$ | 1.6202806 | 1.6544674 | 1.6903958 |
| $k_{20}$ | 0.3033538 | 0.2346728 | 0.1952987 |
| $d_{20}$ (nm) | 123.599 | 179.446 | 232.683 |
| When $n_1 \geqq n_{10}$, $n_{1m}$ = | 0.0501758 | 0.0567249 | 0.0651611 |
| When $n_1 < n_{10}$, $n_{1m}$ = | 0.0271130 | 0.0522852 | 0.0658081 |
| When $k_1 \geqq k_{10}$, $k_{1m}$ = | 0.0439600 | 0.0710352 | 0.0811584 |
| When $k_1 < k_{10}$, $k_{1m}$ = | 0.0300366 | 0.0394434 | 0.0413635 |
| When $d_1 \geqq d_{10}$, $d_{1m}$ (nm) = | ∞ | ∞ | ∞ |
| When $d_1 < d_{10}$, $d_{1m}$ (nm) = | 9.341 | 23.552 | 82.870 |
| When $n_2 \geqq n_{20}$, $n_{2m}$ = | 0.0785254 | 0.1613647 | 0.1758447 |
| When $n_2 < n_{20}$, $n_{2m}$ = | 0.1457166 | 0.1478357 | 0.1648547 |
| When $k_2 \geqq k_{20}$, $k_{2m}$ = | 0.0611975 | 0.1025415 | 0.1200317 |
| When $k_2 < k_{20}$, $k_{2m}$ = | 0.0887231 | 0.0762732 | 0.0707166 |
| When $d_2 \geqq d_{20}$, $d_{2m}$ (nm) = | ∞ | ∞ | ∞ |
| When $d_2 < d_{20}$, $d_{2m}$ (nm) = | 17.421 | 28.206 | 71.908 |

| | 0.93 ≦ NA ≦ 1.0<br>175 < T ≦ 185 | | | | |
|---|---|---|---|---|---|
| Case | 18-01 | 18-02 | 18-03 | 18-04 | 18-05 |
| $n_{10}$ | 1.9750220 | 1.9943589 | 1.9365478 | 1.8874503 | 1.7406539 |
| $k_{10}$ | 0.3055970 | 0.1905841 | 0.1715491 | 0.1503402 | 0.1271964 |
| $d_{10}$ (nm) | 17.312 | 13.627 | 12.200 | 12.006 | 86.109 |
| $n_{20}$ | 1.6357631 | 1.7309349 | 1.6649916 | 1.6561886 | 1.6157675 |
| $k_{20}$ | 0.8207912 | 0.5263943 | 0.3790440 | 0.2991899 | 0.3771605 |
| $d_{20}$ (nm) | 66.973 | 122.033 | 183.216 | 242.151 | 120.682 |
| When $n_1 \geqq n_{10}$, $n_{1m}$ = | 0.0935791 | 0.1114148 | 0.1215747 | 0.1285913 | 0.0513330 |
| When $n_1 < n_{10}$, $n_{1m}$ = | 0.0459473 | 0.0702148 | 0.0894250 | 0.1026367 | 0.0144434 |
| When $k_1 \geqq k_{10}$, $k_{1m}$ = | 0.0590857 | 0.0871582 | 0.1112146 | 0.1261365 | 0.0386914 |
| When $k_1 < k_{10}$, $k_{1m}$ = | 0.0823853 | 0.1098083 | 0.1208740 | 0.1243677 | 0.0453528 |
| When $d_1 \geqq d_{10}$, $d_{1m}$ (nm) = | 3.436 | 4.283 | 5.306 | 6.728 | 10.132 |
| When $d_1 < d_{10}$, $d_{1m}$ (nm) = | 1.707 | 2.491 | 3.559 | 4.870 | 2.323 |
| When $n_2 \geqq n_{20}$, $n_{2m}$ = | 0.1368286 | 0.1494128 | 0.1559277 | 0.1523608 | 0.0829712 |
| When $n_2 < n_{20}$, $n_{2m}$ = | 0.2106677 | 0.1994727 | 0.1768091 | 0.1649011 | 0.1612537 |
| When $k_2 \geqq k_{20}$, $k_{2m}$ = | 0.1566431 | 0.1521973 | 0.1368372 | 0.1332068 | 0.0933081 |
| When $k_2 < k_{20}$, $k_{2m}$ = | 0.1361353 | 0.1253687 | 0.1152344 | 0.1052795 | 0.0942554 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 18.814 | 47.829 | 81.274 | 118.000 | 24.527 |

| 0.93 ≦ NA ≦ 1.0<br>175 < T ≦ 185 | | | | | 32/35 |
|---|---|---|---|---|---|
| Case | 18-06 | 18-07 | 18-08 | 18-09 | 18-10 |
| $n_{10}$ | 1.7253418 | 1.7237735 | 1.7126639 | 1.7091592 | 1.7108527 |
| $k_{10}$ | 0.1032843 | 0.0864157 | 0.0996282 | 0.0809109 | 0.0696108 |
| $d_{10}$ (nm) | 86.339 | 86.885 | 151.701 | 151.551 | 151.827 |
| $n_{20}$ | 1.6224018 | 1.6650124 | 1.5953952 | 1.6344497 | 1.6784072 |
| $k_{20}$ | 0.2809650 | 0.2327133 | 0.3310599 | 0.2545275 | 0.2111338 |
| $d_{20}$ (nm) | 178.956 | 231.784 | 118.977 | 174.271 | 226.839 |
| When $n_1 \geqq n_{10}$, $n_{1m}$ = | 0.0565039 | 0.0626416 | 0.0424548 | 0.0505127 | 0.0583557 |
| When $n_1 < n_{10}$, $n_{1m}$ = | 0.0377893 | 0.0495728 | 0.0068591 | 0.0425964 | 0.0570093 |
| When $k_1 \geqq k_{10}$, $k_{1m}$ = | 0.0671277 | 0.0801477 | 0.0264331 | 0.0654321 | 0.0790332 |
| When $k_1 < k_{10}$, $k_{1m}$ = | 0.0514600 | 0.0546265 | 0.0262610 | 0.0409290 | 0.0440662 |
| When $d_1 \geqq d_{10}$, $d_{1m}$ (nm) = | 14.314 | 20.851 | 14.034 | 22.266 | ∞ |
| When $d_1 < d_{10}$, $d_{1m}$ (nm) = | 7.519 | 11.390 | 1.678 | 12.457 | 21.354 |
| When $n_2 \geqq n_{20}$, $n_{2m}$ = | 0.1133289 | 0.1230408 | 0.0286230 | 0.1046033 | 0.1258447 |
| When $n_2 < n_{20}$, $n_{2m}$ = | 0.1506311 | 0.1572058 | 0.1416589 | 0.1413440 | 0.1529517 |
| When $k_2 \geqq k_{20}$, $k_{2m}$ = | 0.1148096 | 0.1304126 | 0.0346130 | 0.0907129 | 0.1118689 |
| When $k_2 < k_{20}$, $k_{2m}$ = | 0.0848999 | 0.0792493 | 0.0817810 | 0.0764514 | 0.0721448 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 64.642 | 80.544 | 18.599 | 31.028 | 73.232 |

| 0.93 ≦ NA ≦ 1.0<br>175 < T ≦ 185 | | | |
|---|---|---|---|
| Case | 18-11 | 18-12 | 18-13 |
| $n_{10}$ | 1.7032995 | 1.7035257 | 1.7058486 |
| $k_{10}$ | 0.0874338 | 0.0712651 | 0.0623526 |
| $d_{10}$ (nm) | 215.388 | 214.888 | 214.924 |
| $n_{20}$ | 1.6000078 | 1.6490638 | 1.6902455 |
| $k_{20}$ | 0.3100603 | 0.2413259 | 0.1999123 |
| $d_{20}$ (nm) | 116.088 | 170.219 | 222.958 |
| When $n_1 \geqq n_{10}$, $n_{1m}$ = | 0.0459119 | 0.0540906 | 0.0637158 |
| When $n_1 < n_{10}$, $n_{1m}$ = | 0.0201135 | 0.0472498 | 0.0624988 |
| When $k_1 \geqq k_{10}$, $k_{1m}$ = | 0.0380823 | 0.0692078 | 0.0795654 |
| When $k_1 < k_{10}$, $k_{1m}$ = | 0.0261584 | 0.0371997 | 0.0400098 |
| When $d_1 \geqq d_{10}$, $d_{1m}$ (nm) = | 25.691 | ∞ | ∞ |
| When $d_1 < d_{10}$, $d_{1m}$ (nm) = | 6.401 | 18.086 | 80.109 |
| When $n_2 \geqq n_{20}$, $n_{2m}$ = | 0.0666833 | 0.1564661 | 0.1701733 |
| When $n_2 < n_{20}$, $n_{2m}$ = | 0.1555847 | 0.1549194 | 0.1734229 |
| When $k_2 \geqq k_{20}$, $k_{2m}$ = | 0.0497668 | 0.0999182 | 0.1182764 |
| When $k_2 < k_{20}$, $k_{2m}$ = | 0.0866650 | 0.0781360 | 0.0731396 |
| When $d_2 \geqq d_{20}$, $d_{2m}$ (nm) = | 13.606 | ∞ | ∞ |
| When $d_2 < d_{20}$, $d_{2m}$ (nm) = | 18.924 | 29.474 | 72.740 |

| 0.93 ≦ NA ≦ 1.0<br>185 < T ≦ 195 | | | | | 33/35 |
|---|---|---|---|---|---|
| Case | 19-01 | 19-02 | 19-03 | 19-04 | 19-05 |
| $n_{10}$ | 2.0157422 | 1.9298641 | 1.9158213 | 1.9035507 | 1.7387191 |
| $k_{10}$ | 0.3310994 | 0.1874025 | 0.1413868 | 0.0919796 | 0.1333266 |
| $d_{10}$ (nm) | 15.233 | 12.335 | 11.496 | 11.593 | 85.772 |
| $n_{20}$ | 1.5732193 | 1.6401635 | 1.6782430 | 1.7330388 | 1.5838112 |
| $k_{20}$ | 0.8191417 | 0.3856200 | 0.3150440 | 0.2716233 | 0.3839989 |
| $d_{20}$ (nm) | 66.313 | 174.874 | 226.685 | 274.138 | 113.170 |
| When $n_1 \geqq n_{10}$, $n_{1m}$ = | 0.0908862 | 0.1198010 | 0.1318933 | 0.1353418 | 0.0494861 |
| When $n_1 < n_{10}$, $n_{1m}$ = | 0.0435144 | 0.0881482 | 0.1071143 | 0.1119397 | 0.0110315 |
| When $k_1 \geqq k_{10}$, $k_{1m}$ = | 0.0607654 | 0.1097412 | 0.1276587 | 0.1301843 | 0.0306482 |
| When $k_1 < k_{10}$, $k_{1m}$ = | 0.0886279 | 0.1159265 | 0.1266907 | 0.0919796 | 0.0445325 |
| When $d_1 \geqq d_{10}$, $d_{1m}$ (nm) = | 2.825 | 5.183 | 6.173 | 7.339 | 9.205 |
| When $d_1 < d_{10}$, $d_{1m}$ (nm) = | 1.353 | 3.517 | 4.556 | 5.508 | 1.748 |
| When $n_2 \geqq n_{20}$, $n_{2m}$ = | 0.1250940 | 0.1513354 | 0.1454334 | 0.1421106 | 0.0499280 |
| When $n_2 < n_{20}$, $n_{2m}$ = | 0.1772742 | 0.1779919 | 0.1691821 | 0.1744556 | 0.1654175 |
| When $k_2 \geqq k_{20}$, $k_{2m}$ = | 0.1164954 | 0.1335864 | 0.1351135 | 0.1421582 | 0.0743848 |
| When $k_2 < k_{20}$, $k_{2m}$ = | 0.1392041 | 0.1184119 | 0.1117639 | 0.1051697 | 0.0978845 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 17.571 | 78.501 | 112.763 | 138.595 | 25.987 |

-continued

| 0.93 ≦ NA ≦ 1.0<br>185 < T ≦ 195 | | | | | |
|---|---|---|---|---|---|
| Case | 19-06 | 19-07 | 19-08 | 19-09 | 19-10 |
| $n_{10}$ | 1.7256246 | 1.7253546 | 1.7287042 | 1.7096582 | 1.7121643 |
| $k_{10}$ | 0.1055723 | 0.0874820 | 0.0760165 | 0.0821714 | 0.0705329 |
| $d_{10}$ (nm) | 86.279 | 86.928 | 87.515 | 151.624 | 152.001 |
| $n_{20}$ | 1.6177137 | 1.6696157 | 1.7081188 | 1.6358848 | 1.6853812 |
| $k_{20}$ | 0.2895611 | 0.2389730 | 0.2041866 | 0.2635969 | 0.2167566 |
| $d_{20}$ (nm) | 168.375 | 220.361 | 272.150 | 162.984 | 215.233 |
| When $n_1 \geqq n_{10}$, $n_{1m}$ = | 0.0562903 | 0.0628687 | 0.0679712 | 0.0505103 | 0.0586621 |
| When $n_1 < n_{10}$, $n_{1m}$ = | 0.0396094 | 0.0498669 | 0.0509912 | 0.0389160 | 0.0543164 |
| When $k_1 \geqq k_{10}$, $k_{1m}$ = | 0.0670349 | 0.0806128 | 0.0832776 | 0.0662488 | 0.0789514 |
| When $k_1 < k_{10}$, $k_{1m}$ = | 0.0491772 | 0.0538904 | 0.0576746 | 0.0390271 | 0.0434973 |
| When $d_1 \geqq d_{10}$, $d_{1m}$ (nm) = | 13.425 | 20.169 | 39.294 | 20.568 | ∞ |
| When $d_1 < d_{10}$, $d_{1m}$ (nm) = | 7.774 | 11.144 | 12.836 | 11.141 | 20.056 |
| When $n_2 \geqq n_{20}$, $n_{2m}$ = | 0.1053076 | 0.1213562 | 0.1287134 | 0.1062195 | 0.1257849 |
| When $n_2 < n_{20}$, $n_{2m}$ = | 0.1536951 | 0.1604126 | 0.1670996 | 0.1450281 | 0.1574817 |
| When $k_2 \geqq k_{20}$, $k_{2m}$ = | 0.1136377 | 0.1320007 | 0.1531152 | 0.0931067 | 0.1145862 |
| When $k_2 < k_{20}$, $k_{2m}$ = | 0.0898669 | 0.0840454 | 0.0776611 | 0.0825256 | 0.0770361 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 45.429 | 80.918 | 110.597 | 30.017 | 74.310 |

| 0.93 ≦ NA ≦ 1.0<br>185 < T ≦ 195 | | | | | |
|---|---|---|---|---|---|
| Case | 19-11 | 19-12 | 19-13 | 19-14 | 34/35<br>19-15 |
| $n_{10}$ | 1.7151566 | 1.7029318 | 1.7041956 | 1.7070069 | 1.7080920 |
| $k_{10}$ | 0.0645755 | 0.0900998 | 0.0721897 | 0.0633145 | 0.0595697 |
| $d_{10}$ (nm) | 152.412 | 215.656 | 215.114 | 215.207 | 215.250 |
| $n_{20}$ | 1.7135234 | 1.5920483 | 1.6533659 | 1.6971996 | 1.7125257 |
| $k_{20}$ | 0.1842756 | 0.3226491 | 0.2502000 | 0.2048445 | 0.1741269 |
| $d_{20}$ (nm) | 268.692 | 105.543 | 158.704 | 211.558 | 267.229 |
| When $n_1 \geqq n_{10}$, $n_{1m}$ = | 0.0656799 | 0.0437866 | 0.0537561 | 0.0639758 | 0.0752185 |
| When $n_1 < n_{10}$, $n_{1m}$ = | 0.0585193 | 0.0130481 | 0.0437659 | 0.0602637 | 0.0712415 |
| When $k_1 \geqq k_{10}$, $k_{1m}$ = | 0.0803796 | 0.0379236 | 0.0696973 | 0.0785339 | 0.0793298 |
| When $k_1 < k_{10}$, $k_{1m}$ = | 0.0475867 | 0.0209644 | 0.0354407 | 0.0397900 | 0.0383728 |
| When $d_1 \geqq d_{10}$, $d_{1m}$ (nm) = | ∞ | 20.412 | ∞ | ∞ | ∞ |
| When $d_1 < d_{10}$, $d_{1m}$ (nm) = | 76.169 | 3.912 | 15.725 | 78.897 | 136.900 |
| When $n_2 \geqq n_{20}$, $n_{2m}$ = | 0.1359851 | 0.0436487 | 0.1238757 | 0.1440674 | 0.1618445 |
| When $n_2 < n_{20}$, $n_{2m}$ = | 0.1709363 | 0.1590417 | 0.1491174 | 0.1814563 | 0.2117529 |
| When $k_2 \geqq k_{20}$, $k_{2m}$ = | 0.1377368 | 0.0580493 | 0.1037561 | 0.1202234 | 0.1371057 |
| When $k_2 < k_{20}$, $k_{2m}$ = | 0.0711096 | 0.0823193 | 0.0849219 | 0.0779297 | 0.0717078 |
| When $d_2 \geqq d_{20}$, $d_{2m}$ (nm) = | ∞ | 9.984 | ∞ | ∞ | ∞ |
| When $d_2 < d_{20}$, $d_{2m}$ (nm) = | 82.771 | 19.617 | 23.813 | 73.684 | 77.607 |

| 0.93 ≦ NA ≦ 1.0<br>195 < T ≦ 205 | | | | | |
|---|---|---|---|---|---|
| Case | 20-01 | 20-02 | 20-03 | 20-04 | 20-05 |
| $n_{10}$ | 1.9115074 | 1.9153788 | 1.8712999 | 1.7275221 | 1.7279210 |
| $k_{10}$ | 0.1960527 | 0.1490337 | 0.0897979 | 0.1065695 | 0.0881248 |
| $d_{10}$ (nm) | 13.258 | 11.515 | 14.536 | 86.590 | 87.122 |
| $n_{20}$ | 1.6255021 | 1.6682692 | 1.7614462 | 1.6227655 | 1.6778177 |
| $k_{20}$ | 0.3984556 | 0.3197853 | 0.2821612 | 0.3041284 | 0.2471127 |
| $d_{20}$ (nm) | 164.068 | 218.507 | 257.799 | 156.467 | 209.069 |
| When $n_1 \geqq n_{10}$, $n_{1m}$ = | 0.1142444 | 0.1325989 | 0.1158582 | 0.0562817 | 0.0637024 |
| When $n_1 < n_{10}$, $n_{1m}$ = | 0.0852515 | 0.1080505 | 0.0942114 | 0.0426550 | 0.0501379 |
| When $k_1 \geqq k_{10}$, $k_{1m}$ = | 0.1044482 | 0.1295020 | 0.1096521 | 0.0681348 | 0.0804810 |
| When $k_1 < k_{10}$, $k_{1m}$ = | 0.1084790 | 0.1269031 | 0.0897979 | 0.0488770 | 0.0543994 |
| When $d_1 \geqq d_{10}$, $d_{1m}$ (nm) = | 5.346 | 6.134 | 8.659 | 13.270 | 20.006 |
| When $d_1 < d_{10}$, $d_{1m}$ (nm) = | 3.730 | 4.524 | 6.443 | 8.305 | 10.905 |
| When $n_2 \geqq n_{20}$, $n_{2m}$ = | 0.1424097 | 0.1416443 | 0.1412390 | 0.1051294 | 0.1236353 |
| When $n_2 < n_{20}$, $n_{2m}$ = | 0.1779224 | 0.1667200 | 0.1823743 | 0.1526196 | 0.1593042 |
| When $k_2 \geqq k_{20}$, $k_{2m}$ = | 0.1351575 | 0.1341370 | 0.1542419 | 0.1188623 | 0.1364233 |
| When $k_2 < k_{20}$, $k_{2m}$ = | 0.1244714 | 0.1144324 | 0.1102271 | 0.0976929 | 0.0887854 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 70.107 | 105.511 | 128.903 | 31.502 | 77.053 |

| 0.93 ≦ NA ≦ 1.0<br>195 < T ≦ 205 | | | | | |
|---|---|---|---|---|---|
| | | | | | 35/35 |
| Case | 20-06 | 20-07 | 20-08 | 20-09 | 20-10 |
| $n_{10}$ | 1.7316602 | 1.7109076 | 1.7140510 | 1.7169074 | 1.7034522 |
| $k_{10}$ | 0.0769958 | 0.0825870 | 0.0712311 | 0.0659464 | 0.0912009 |
| $d_{10}$ (nm) | 87.563 | 152.078 | 152.368 | 152.739 | 216.873 |
| $n_{20}$ | 1.7153560 | 1.6429824 | 1.6947912 | 1.7201685 | 1.5969711 |
| $k_{20}$ | 0.2092703 | 0.2767726 | 0.2239389 | 0.1888883 | 0.3506487 |
| $d_{20}$ (nm) | 261.518 | 151.325 | 204.003 | 258.117 | 92.838 |
| When $n_1 \geqq n_{10}$, $n_{1m}$ = | 0.0685693 | 0.0512622 | 0.0601404 | 0.0671716 | 0.0436548 |
| When $n_1 < n_{10}$, $n_{1m}$ = | 0.0495715 | 0.0375720 | 0.0532251 | 0.0484131 | 0.0089709 |
| When $k_1 \geqq k_{10}$, $k_{1m}$ = | 0.0827515 | 0.0683850 | 0.0790723 | 0.0783716 | 0.0369128 |
| When $k_1 < k_{10}$, $k_{1m}$ = | 0.0588892 | 0.0391077 | 0.0446033 | 0.0456335 | 0.0165588 |
| When $d_1 \geqq d_{10}$, $d_{1m}$ (nm) = | 35.460 | 20.848 | ∞ | ∞ | 19.781 |
| When $d_1 < d_{10}$, $d_{1m}$ (nm) = | 11.967 | 10.711 | 16.311 | 17.445 | 2.680 |
| When $n_2 \geqq n_{20}$, $n_{2m}$ = | 0.1321082 | 0.1010400 | 0.1225134 | 0.1362366 | 0.0345703 |
| When $n_2 < n_{20}$, $n_{2m}$ = | 0.1646814 | 0.1448950 | 0.1569727 | 0.1688831 | 0.1562476 |
| When $k_2 \geqq k_{20}$, $k_{2m}$ = | 0.1585754 | 0.0998694 | 0.1194824 | 0.1443347 | 0.0797021 |
| When $k_2 < k_{20}$, $k_{2m}$ = | 0.0798230 | 0.0905042 | 0.0814771 | 0.0735376 | 0.0638440 |
| When $d_2 \geqq d_{20}$, $d_{2m}$ (nm) = | ∞ | ∞ | ∞ | ∞ | 10.032 |
| When $d_2 < d_{20}$, $d_{2m}$ (nm) = | 87.011 | 25.146 | 1.899 | 78.182 | 16.775 |

| 0.93 ≦ NA ≦ 1.0<br>195 < T ≦ 205 | | | |
|---|---|---|---|
| Case | 20-11 | 20-12 | 20-13 |
| $n_{10}$ | 1.7053294 | 1.7084550 | 1.7088490 |
| $k_{10}$ | 0.0723641 | 0.0642090 | 0.0611230 |
| $d_{10}$ (nm) | 215.802 | 215.782 | 215.750 |
| $n_{20}$ | 1.6624125 | 1.7063284 | 1.7155496 |
| $k_{20}$ | 0.2625944 | 0.2112603 | 0.1784523 |
| $d_{20}$ (nm) | 147.133 | 200.541 | 257.296 |
| When $n_1 \geqq n_{10}$, $n_{1m}$ = | 0.0548254 | 0.0651489 | 0.0765845 |
| When $n_1 < n_{10}$, $n_{1m}$ = | 0.0418201 | 0.0593726 | 0.0732715 |
| When $k_1 \geqq k_{10}$, $k_{1m}$ = | 0.0710583 | 0.0775024 | 0.0765796 |
| When $k_1 < k_{10}$, $k_{1m}$ = | 0.0355750 | 0.0411511 | 0.0355579 |
| When $d_1 \geqq d_{10}$, $d_{1m}$ (nm) = | ∞ | ∞ | ∞ |
| When $d_1 < d_{10}$, $d_{1m}$ (nm) = | 15.640 | 79.525 | 76.637 |
| When $n_2 \geqq n_{20}$, $n_{2m}$ = | 0.1192065 | 0.1417981 | 0.1626379 |
| When $n_2 < n_{20}$, $n_{2m}$ = | 0.1432642 | 0.1798657 | 0.2073511 |
| When $k_2 \geqq k_{20}$, $k_{2m}$ = | 0.1091699 | 0.1229614 | 0.1404065 |
| When $k_2 < k_{20}$, $k_{2m}$ = | 0.0923608 | 0.0791760 | 0.0746033 |
| When $d_2 \geqq d_{20}$, $d_{2m}$ (nm) = | ∞ | ∞ | ∞ |
| When $d_2 < d_{20}$, $d_{2m}$ (nm) = | 19.545 | 71.258 | 73.210 |

In accordance with a third embodiment of the invention, an antireflective film has a two-layer structure and is used in a process for manufacturing a semiconductor device by being provided between a resist layer and a silicon oxide layer formed on a surface of a silicon semiconductor substrate and having a thickness T (unit: nm) described below, for exposure of the resist layer in an exposure system having a wavelength of 190 nm to 195 nm and a numerical aperture NA of 1.0<NA≦1.1 In accordance with the third embodiment of the invention, an exposure method is used in a process for manufacturing a semiconductor device and includes providing an antireflective film having a two-layer structure between a resist layer and a silicon oxide layer formed on a surface of a silicon semiconductor substrate and having a thickness T (unit: nm) described below, and exposing the resist layer in an exposure system having a wavelength of 190 nm to 195 nm and a numerical aperture NA of 1.0<NA≦1.1

The antireflective film or the antireflective film used in the exposure method according to the third embodiment of the invention includes an upper layer having a complex refractive index $N_1$, and a lower layer having a complex refractive index $N_2$, the complex refractive indexes $N_1$ and $N_2$ being represented by the following equations:

$$N_1=n_1-k_1 i$$

$$N_2=n_2-k_2 i$$

Assuming that the thickness of the upper layer is $d_1$ (unit: nm) and the thickness of the lower layer is $d_2$ (unit: nm), when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the following relational expression:

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1$$

However, a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$. In the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm)=", each value (unit: nm) in the right columns is "$d_{1m}-d_{10}$"; in the line of "When $d_1<d_{10}$, $d_{1m}$ (nm)=", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm)=", each value (unit: nm) in the right columns is "$d_{2m}-d_{20}$"; and in the line of "When $d_2<d_{20}$, $d_{2m}$ (nm)=", each value (unit: nm) in the right columns is "$d_{20}-d_{2m}$".

$1.0 < NA \leqq 1.1$
$2 \leqq T \leqq 15$

1/34

| Case | 1-01 | 1-02 | 1-03 | 1-04 | 1-05 |
|---|---|---|---|---|---|
| $n_{10}$ | 2.1002530 | 1.9014716 | 1.8817545 | 1.8713707 | 1.8894555 |
| $k_{10}$ | 0.0458360 | 0.1897321 | 0.1528631 | 0.1131033 | 0.1025295 |
| $d_{10}$ (nm) | 25.245 | 35.107 | 29.787 | 20.680 | 13.808 |
| $n_{20}$ | 3.6613926 | 3.6832791 | 2.2496615 | 1.8471360 | 1.7319643 |
| $k_{20}$ | 2.0917723 | 0.6232721 | 0.5909670 | 0.3799287 | 0.2879285 |
| $d_{20}$ (nm) | 4.980 | 30.030 | 58.673 | 139.609 | 214.126 |
| When $n_1 \geqq n_{10}$, $n_{1m}$ = | 0.0805884 | 0.0768188 | 0.0754700 | 0.0824719 | 0.1060120 |
| When $n_1 < n_{10}$, $n_{1m}$ = | 0.0800293 | 0.0653833 | 0.0584985 | 0.0566113 | 0.0706006 |
| When $k_1 \geqq k_{10}$, $k_{1m}$ = | 0.0719092 | 0.0582312 | 0.0563574 | 0.0660449 | 0.0898218 |
| When $k_1 < k_{10}$, $k_{1m}$ = | 0.0458360 | 0.0865906 | 0.0835730 | 0.0866101 | 0.1025295 |
| When $d_1 \geqq d_{10}$, $d_{1m}$ (nm) = | 3.502 | 5.628 | 6.909 | 7.972 | 7.080 |
| When $d_1 < d_{10}$, $d_{1m}$ (nm) = | 2.843 | 4.121 | 4.441 | 4.574 | 4.198 |
| When $n_2 \geqq n_{20}$, $n_{2m}$ = | 0.2511194 | 0.1375208 | 0.1500757 | 0.1234998 | 0.1256079 |
| When $n_2 < n_{20}$, $n_{2m}$ = | 0.2478674 | 0.1642285 | 0.1673572 | 0.1560254 | 0.1556494 |
| When $k_2 \geqq k_{20}$, $k_{2m}$ = | 0.2675171 | 0.1813342 | 0.1899841 | 0.1681030 | 0.1175488 |
| When $k_2 < k_{20}$, $k_{2m}$ = | 0.2241895 | 0.1363525 | 0.1337048 | 0.1033130 | 0.0926782 |
| When $d_2 \geqq d_{20}$, $d_{2m}$ (nm) = | 0.668 | 1.453 | 8.618 | ∞ | ∞ |
| When $d_2 < d_{20}$, $d_{2m}$ (nm) = | 0.632 | 1.466 | 7.778 | 59.745 | 82.499 |

$1.0 < NA \leqq 1.1$
$2 \leqq T \leqq 15$

| Case | 1-06 | 1-07 | 1-08 | 1-09 | 1-10 |
|---|---|---|---|---|---|
| $n_{10}$ | 1.8919474 | 1.8730447 | 1.7734811 | 1.7581396 | 1.7209511 |
| $k_{10}$ | 0.0886250 | 0.0995044 | 0.0942049 | 0.0894114 | 0.0778149 |
| $d_{10}$ (nm) | 14.825 | 12.107 | 96.210 | 94.485 | 94.005 |
| $n_{20}$ | 1.7713589 | 1.6971361 | 2.0242448 | 1.8216770 | 1.6746822 |
| $k_{20}$ | 0.2959415 | 0.2384266 | 0.4293783 | 0.2841737 | 0.2144041 |
| $d_{20}$ (nm) | 207.437 | 276.341 | 66.416 | 135.446 | 211.729 |
| When $n_1 \geqq n_{10}$, $n_{1m}$ = | 0.1001855 | 0.1196069 | 0.0579333 | 0.0504431 | 0.0487988 |
| When $n_1 < n_{10}$, $n_{1m}$ = | 0.0678418 | 0.0862451 | 0.0202832 | 0.0122217 | 0.0195996 |
| When $k_1 \geqq k_{10}$, $k_{1m}$ = | 0.0828455 | 0.1086084 | 0.0429993 | 0.0327991 | 0.0449207 |
| When $k_1 < k_{10}$, $k_{1m}$ = | 0.0886250 | 0.0995044 | 0.0440173 | 0.0383289 | 0.0441089 |
| When $d_1 \geqq d_{10}$, $d_{1m}$ (nm) = | 7.253 | 7.622 | 12.574 | 14.854 | 20.756 |
| When $d_1 < d_{10}$, $d_{1m}$ (nm) = | 4.294 | 5.017 | 3.736 | 2.430 | 5.594 |
| When $n_2 \geqq n_{20}$, $n_{2m}$ = | 0.1250818 | 0.1274023 | 0.1038489 | 0.1178979 | 0.0654700 |
| When $n_2 < n_{20}$, $n_{2m}$ = | 0.1542432 | 0.1390320 | 0.1236121 | 0.1075012 | 0.0984851 |
| When $k_2 \geqq k_{20}$, $k_{2m}$ = | 0.1281506 | 0.1059973 | 0.1023560 | 0.1052271 | 0.0726978 |
| When $k_2 < k_{20}$, $k_{2m}$ = | 0.0937659 | 0.0853320 | 0.1026587 | 0.0735156 | 0.0618335 |
| When $d_2 \geqq d_{20}$, $d_{2m}$ (nm) = | ∞ | ∞ | 5.946 | 13.526 | ∞ |
| When $d_2 < d_{20}$, $d_{2m}$ (nm) = | 79.532 | 130.356 | 6.729 | 7.895 | 26.663 |

$1.0 < NA \leqq 1.1$
$2 \leqq T \leqq 15$

2/34

| Case | 1-11 | 1-12 | 1-13 | 1-14 | 1-15 |
|---|---|---|---|---|---|
| $n_{10}$ | 1.7166765 | 1.7166130 | 1.7322234 | 1.7049421 | 1.7064564 |
| $k_{10}$ | 0.0677623 | 0.0755230 | 0.0835200 | 0.0655754 | 0.0573750 |
| $d_{10}$ (nm) | 92.667 | 182.689 | 166.765 | 163.194 | 160.636 |
| $n_{20}$ | 1.6766991 | 6.5634515 | 1.9262925 | 1.6664527 | 1.6879767 |
| $k_{20}$ | 0.1797231 | 3.2079655 | 0.3700807 | 0.1954874 | 0.1655431 |
| $d_{20}$ (nm) | 270.198 | 1.017 | 69.546 | 208.736 | 264.028 |

-continued

| | | | | | |
|---|---|---|---|---|---|
| When $n_1 \geqq n_{10}$, $n_{1m}$ = | 0.0538269 | 0.0791455 | 0.0502930 | 0.0463574 | 0.0530786 |
| When $n_1 < n_{10}$, $n_{1m}$ = | 0.0365198 | 0.0150903 | 0.0019495 | 0.0298389 | 0.0507080 |
| When $k_1 \geqq k_{10}$, $k_{1m}$ = | 0.0633020 | 0.0382202 | 0.0176428 | 0.0426367 | 0.0606909 |
| When $k_1 < k_{10}$, $k_{1m}$ = | 0.0490027 | 0.0352063 | 0.0101367 | 0.0363086 | 0.0412036 |
| When $d_1 \geqq d_{10}$, $d_{1m}$ (nm) = | ∞ | 44.970 | 29.513 | ∞ | ∞ |
| When $d_1 < d_{10}$, $d_{1m}$ (nm) = | 11.921 | 5.503 | 0.534 | 14.465 | 82.763 |
| When $n_2 \geqq n_{20}$, $n_{2m}$ = | 0.0746594 | 0.3760779 | 0.0943127 | 0.0451807 | 0.0846008 |
| When $n_2 < n_{20}$, $n_{2m}$ = | 0.1088159 | 0.6761377 | 0.0252344 | 0.0894604 | 0.1080103 |
| When $k_2 \geqq k_{20}$, $k_{2m}$ = | 0.0728833 | 0.4281982 | 0.0109839 | 0.0413684 | 0.0543652 |
| When $k_2 < k_{20}$, $k_{2m}$ = | 0.0561267 | 0.6156824 | 0.0921399 | 0.0546765 | 0.0510388 |
| When $d_2 \geqq d_{20}$, $d_{2m}$ (nm) = | ∞ | 0.095 | 5.760 | ∞ | ∞ |
| When $d_2 < d_{20}$, $d_{2m}$ (nm) = | 76.266 | 0.159 | 0.905 | 22.049 | 32.675 |

$1.0 < NA \leqq 1.1$
$2 \leqq T \leqq 15$

| Case | 1-16 | 1-17 | 1-18 | 1-19 | 1-20 |
|---|---|---|---|---|---|
| $n_{10}$ | 1.6929499 | 1.6905856 | 1.6919500 | 1.6995270 | 1.6946661 |
| $k_{10}$ | 0.0758677 | 0.0724871 | 0.0673580 | 0.0541447 | 0.0598692 |
| $d_{10}$ (nm) | 218.538 | 210.998 | 207.119 | 221.890 | 292.769 |
| $n_{20}$ | 1.7888879 | 1.7113381 | 1.6973679 | 1.6914313 | 5.7902895 |
| $k_{20}$ | 0.3373861 | 0.2424201 | 0.1951159 | 0.1602785 | 2.6464640 |
| $d_{20}$ (nm) | 83.914 | 155.877 | 222.394 | 261.841 | 1.370 |
| When $n_1 \geqq n_{10}$, $n_{1m}$ = | 0.0154590 | 0.0284326 | 0.0459937 | 0.0695007 | 0.0688428 |
| When $n_1 < n_{10}$, $n_{1m}$ = | 0.0644519 | 0.0618115 | 0.0647253 | 0.0614612 | 0.0576074 |
| When $k_1 \geqq k_{10}$, $k_{1m}$ = | 0.0296802 | 0.0451062 | 0.0571143 | 0.0607031 | 0.0650110 |
| When $k_1 < k_{10}$, $k_{1m}$ = | 0.0222290 | 0.0323779 | 0.0391223 | 0.0380823 | 0.0345483 |
| When $d_1 \geqq d_{10}$, $d_{1m}$ (nm) = | 8.212 | ∞ | ∞ | ∞ | ∞ |
| When $d_1 < d_{10}$, $d_{1m}$ (nm) = | 25.706 | 29.733 | 39.073 | 91.262 | 43.839 |
| When $n_2 \geqq n_{20}$, $n_{2m}$ = | 0.1222742 | 0.1267554 | 0.1643848 | 0.2245898 | 0.7013342 |
| When $n_2 < n_{20}$, $n_{2m}$ = | 0.0248633 | 0.0660693 | 0.1720679 | 0.1025806 | 0.7193848 |
| When $k_2 \geqq k_{20}$, $k_{2m}$ = | 0.0580225 | 0.0965234 | 0.1267737 | 0.1053369 | 0.5239075 |
| When $k_2 < k_{20}$, $k_{2m}$ = | 0.0934216 | 0.0846191 | 0.0756384 | 0.0566919 | 0.6531299 |
| When $d_2 \geqq d_{20}$, $d_{2m}$ (nm) = | 16.998 | ∞ | ∞ | ∞ | 0.304 |
| When $d_2 < d_{20}$, $d_{2m}$ (nm) = | 2.716 | 12.405 | 72.248 | 75.278 | 0.354 |

$1.0 < NA \leqq 1.1$
$2 \leqq T \leqq 15$

3/34

| Case | 1-21 | 1-22 | 1-23 | 1-24 |
|---|---|---|---|---|
| $n_{10}$ | 1.6927273 | 1.6938682 | 1.6959215 | 1.6965163 |
| $k_{10}$ | 0.0641185 | 0.0632641 | 0.0601626 | 0.0560943 |
| $d_{10}$ (nm) | 275.960 | 269.814 | 266.236 | 263.874 |
| $n_{20}$ | 1.7993913 | 1.7248410 | 1.7076727 | 1.6984359 |
| $k_{20}$ | 0.3510467 | 0.2487428 | 0.2009217 | 0.1709410 |
| $d_{20}$ (nm) | 81.101 | 150.052 | 214.823 | 277.894 |
| When $n_1 \geqq n_{10}$, $n_{1m}$ = | 0.0462292 | 0.0536658 | 0.0656104 | 0.0800903 |
| When $n_1 < n_{10}$, $n_{1m}$ = | 0.0484851 | 0.0418225 | 0.0432129 | 0.0552332 |
| When $k_1 \geqq k_{10}$, $k_{1m}$ = | 0.0620630 | 0.0619458 | 0.0615613 | 0.0629382 |
| When $k_1 < k_{10}$, $k_{1m}$ = | 0.0362708 | 0.0377515 | 0.0406262 | 0.0422571 |
| When $d_1 \geqq d_{10}$, $d_{1m}$ (nm) = | ∞ | ∞ | ∞ | ∞ |
| When $d_1 < d_{10}$, $d_{1m}$ (nm) = | 29.467 | 27.448 | 97.485 | 175.134 |
| When $n_2 \geqq n_{20}$, $n_{2m}$ = | 0.1596558 | 0.1810303 | 0.3970593 | 0.3365332 |
| When $n_2 < n_{20}$, $n_{2m}$ = | 0.1100391 | 0.2908167 | 0.2424414 | 0.2178503 |
| When $k_2 \geqq k_{20}$, $k_{2m}$ = | 0.1557141 | 0.1886804 | 0.2145630 | 0.2194727 |
| When $k_2 < k_{20}$, $k_{2m}$ = | 0.1210901 | 0.1012720 | 0.0897449 | 0.0805957 |
| When $d_2 \geqq d_{20}$, $d_{2m}$ (nm) = | 25.591 | ∞ | ∞ | ∞ |
| When $d_2 < d_{20}$, $d_{2m}$ (nm) = | 9.432 | 27.332 | 78.495 | 131.894 |

$1.0 < NA \leqq 1.1$
$15 \leqq T \leqq 25$

| Case | 2-01 | 2-02 | 2-03 | 2-04 | 2-05 |
|---|---|---|---|---|---|
| $n_{10}$ | 1.8588603 | 1.8671897 | 1.8793061 | 1.8953035 | 1.8743725 |
| $k_{10}$ | 0.2152026 | 0.2000001 | 0.1213485 | 0.0980077 | 0.1084578 |
| $d_{10}$ (nm) | 37.726 | 35.681 | 21.414 | 14.908 | 12.201 |
| $n_{20}$ | 5.0977045 | 3.0932325 | 1.8727645 | 1.7635602 | 1.6884757 |
| $k_{20}$ | 0.6974562 | 0.7063642 | 0.4149520 | 0.3109442 | 0.2470663 |
| $d_{20}$ (nm) | 19.647 | 34.687 | 129.308 | 200.446 | 269.437 |
| When $n_1 \geqq n_{10}$, $n_{1m}$ = | 0.0758728 | 0.0747766 | 0.0798340 | 0.0988049 | 0.1178149 |

-continued

| | | | | | |
|---|---|---|---|---|---|
| When $n_1 < n_{10}$, $n_{1m}$ = | 0.0592542 | 0.0589661 | 0.0549634 | 0.0658325 | 0.0841418 |
| When $k_1 \geqq k_{10}$, $k_{1m}$ = | 0.0598401 | 0.0578650 | 0.0632202 | 0.0814417 | 0.1076917 |
| When $k_1 < k_{10}$, $k_{1m}$ = | 0.0788342 | 0.0811694 | 0.0865027 | 0.0980077 | 0.1084578 |
| When $d_1 \geqq d_{10}$, $d_{1m}$ (nm) = | 5.593 | 5.891 | 7.449 | 6.933 | 7.359 |
| When $d_1 < d_{10}$, $d_{1m}$ (nm) = | 4.233 | 4.238 | 4.249 | 4.053 | 4.794 |
| When $n_2 \geqq n_{20}$, $n_{2m}$ = | 0.1534875 | 0.1581152 | 0.1275403 | 0.1254932 | 0.1262524 |
| When $n_2 < n_{20}$, $n_{2m}$ = | 0.1697559 | 0.1894849 | 0.1565967 | 0.1540796 | 0.1389709 |
| When $k_2 \geqq k_{20}$, $k_{2m}$ = | 0.1955396 | 0.2168408 | 0.1812842 | 0.1267053 | 0.1044556 |
| When $k_2 < k_{20}$, $k_{2m}$ = | 0.1505579 | 0.1602844 | 0.1066724 | 0.0950110 | 0.0860864 |
| When $d_2 \geqq d_{20}$, $d_{2m}$ (nm) = | 0.659 | 2.512 | ∞ | ∞ | ∞ |
| When $d_2 < d_{20}$, $d_{2m}$ (nm) = | 0.674 | 2.526 | 26.047 | 76.118 | 126.536 |

$1.0 < NA \leqq 1.1$
$15 < T \leqq 25$

4/34

| Case | 2-06 | 2-07 | 2-08 | 2-09 | 2-10 |
|---|---|---|---|---|---|
| $n_{10}$ | 1.7693190 | 1.8089249 | 1.7628339 | 1.7223442 | 1.7176215 |
| $k_{10}$ | 0.1013402 | 0.1064114 | 0.0939832 | 0.0810686 | 0.0701007 |
| $d_{10}$ (nm) | 103.520 | 98.052 | 94.416 | 93.840 | 92.613 |
| $n_{20}$ | 3.2583829 | 3.5132584 | 1.8414170 | 1.6728089 | 1.6759231 |
| $k_{20}$ | 2.5781374 | 0.5501157 | 0.3092618 | 0.2260423 | 0.1876577 |
| $d_{20}$ (nm) | 3.121 | 29.615 | 125.923 | 203.086 | 261.422 |
| When $n_1 \geqq n_{10}$, $n_{1m}$ = | 0.0673926 | 0.0573926 | 0.0482458 | 0.0469287 | 0.0525317 |
| When $n_1 < n_{10}$, $n_{1m}$ = | 0.0182031 | 0.0185083 | 0.0097595 | 0.0170142 | 0.0338733 |
| When $k_1 \geqq k_{10}$, $k_{1m}$ = | 0.0401636 | 0.0390552 | 0.0281750 | 0.0413513 | 0.0608655 |
| When $k_1 < k_{10}$, $k_{1m}$ = | 0.0427917 | 0.0434326 | 0.0360242 | 0.0422778 | 0.0485864 |
| When $d_1 \geqq d_{10}$, $d_{1m}$ (nm) = | 13.610 | 8.991 | 12.525 | 18.295 | 32.066 |
| When $d_1 < d_{10}$, $d_{1m}$ (nm) = | 3.396 | 2.738 | 1.840 | 4.621 | 10.547 |
| When $n_2 \geqq n_{20}$, $n_{2m}$ = | 0.2210974 | 0.0961951 | 0.1120178 | 0.0558118 | 0.0724255 |
| When $n_2 < n_{20}$, $n_{2m}$ = | 0.3992041 | 0.1262915 | 0.1064856 | 0.0968689 | 0.1070728 |
| When $k_2 \geqq k_{20}$, $k_{2m}$ = | 0.3438342 | 0.0862598 | 0.0939502 | 0.0666077 | 0.0700989 |
| When $k_2 < k_{20}$, $k_{2m}$ = | 0.3502100 | 0.1067542 | 0.0758923 | 0.0625208 | 0.0568274 |
| When $d_2 \geqq d_{20}$, $d_{2m}$ (nm) = | 0.375 | 0.986 | 11.083 | ∞ | ∞ |
| When $d_2 < d_{20}$, $d_{2m}$ (nm) = | 0.497 | 1.167 | 5.972 | 24.056 | 73.630 |

$1.0 < NA \leqq 1.1$
$15 < T \leqq 25$

| Case | 2-11 | 2-12 | 2-13 | 2-14 | 2-15 |
|---|---|---|---|---|---|
| $n_{10}$ | 1.7053748 | 1.7067869 | 1.7234396 | 1.7309823 | 1.6924662 |
| $k_{10}$ | 0.0681661 | 0.0592936 | 0.0819972 | 0.0887627 | 0.0804140 |
| $d_{10}$ (nm) | 163.030 | 160.569 | 177.819 | 175.110 | 219.254 |
| $n_{20}$ | 1.6640911 | 1.6873274 | 5.0800961 | 9.5526510 | 1.8031504 |
| $k_{20}$ | 0.2056957 | 0.1726858 | 4.2173316 | 0.4602806 | 0.3794202 |
| $d_{20}$ (nm) | 200.113 | 255.377 | 1.054 | 10.232 | 74.951 |
| When $n_1 \geqq n_{10}$, $n_{1m}$ = | 0.0438354 | 0.0515637 | 0.0646301 | 0.0589197 | 0.0054749 |
| When $n_1 < n_{10}$, $n_{1m}$ = | 0.0254907 | 0.0493457 | 0.0095056 | 0.0049573 | 0.0624841 |
| When $k_1 \geqq k_{10}$, $k_{1m}$ = | 0.0375134 | 0.0575159 | 0.0321326 | 0.0226172 | 0.0163196 |
| When $k_1 < k_{10}$, $k_{1m}$ = | 0.0331799 | 0.0410168 | 0.0264954 | 0.0199707 | 0.0128040 |
| When $d_1 \geqq d_{10}$, $d_{1m}$ (nm) = | ∞ | ∞ | 31.849 | 25.868 | 2.747 |
| When $d_1 < d_{10}$, $d_{1m}$ (nm) = | 12.067 | 30.487 | 3.026 | 1.416 | 23.308 |
| When $n_2 \geqq n_{20}$, $n_{2m}$ = | 0.0383606 | 0.0825500 | 0.3294275 | 0.0929846 | 0.1306152 |
| When $n_2 < n_{20}$, $n_{2m}$ = | 0.0871460 | 0.1052795 | 0.6618042 | 0.0695691 | 0.0087109 |
| When $k_2 \geqq k_{20}$, $k_{2m}$ = | 0.0339417 | 0.0505530 | 0.2910742 | 0.0198328 | 0.0299487 |
| When $k_2 < k_{20}$, $k_{2m}$ = | 0.0549512 | 0.0515552 | 0.6908167 | 0.0870068 | 0.0872510 |
| When $d_2 \geqq d_{20}$, $d_{2m}$ (nm) = | ∞ | ∞ | 0.079 | 0.102 | 14.451 |
| When $d_2 < d_{20}$, $d_{2m}$ (nm) = | 19.637 | 29.589 | 0.186 | 0.076 | 0.824 |

$1.0 < NA \leqq 1.1$
$15 < T \leqq 25$

5/34

| Case | 2-16 | 2-17 | 2-18 | 2-19 | 2-20 |
|---|---|---|---|---|---|
| $n_{10}$ | 1.6899914 | 1.6915311 | 1.6993450 | 1.6920076 | 1.6934597 |
| $k_{10}$ | 0.0755734 | 0.0696615 | 0.0558443 | 0.0677866 | 0.0658489 |
| $d_{10}$ (nm) | 211.286 | 207.258 | 221.722 | 276.645 | 270.093 |

-continued

| | | | | | |
|---|---|---|---|---|---|
| $n_{20}$ | 1.7113670 | 1.6964473 | 1.6905618 | 1.8143335 | 1.7261499 |
| $k_{20}$ | 0.2592681 | 0.2049428 | 0.1670525 | 0.3967808 | 0.2668883 |
| $d_{20}$ (nm) | 147.090 | 213.635 | 253.347 | 72.378 | 141.360 |
| When $n_1 \geqq n_{10}$, $n_{1m}$ = | 0.0235022 | 0.0424463 | 0.0685596 | 0.0429663 | 0.0523279 |
| When $n_1 < n_{10}$, $n_{1m}$ = | 0.0594971 | 0.0645703 | 0.0572424 | 0.0479932 | 0.0410938 |
| When $k_1 \geqq k_{10}$, $k_{1m}$ = | 0.0403162 | 0.0547461 | 0.0583691 | 0.0593103 | 0.0600049 |
| When $k_1 < k_{10}$, $k_{1m}$ = | 0.0289734 | 0.0380127 | 0.0376013 | 0.0355176 | 0.0379749 |
| When $d_1 \geqq d_{10}$, $d_{1m}$ (nm) = | 18.036 | ∞ | ∞ | ∞ | ∞ |
| When $d_1 < d_{10}$, $d_{1m}$ (nm) = | 26.582 | 37.673 | 84.779 | 28.006 | 25.642 |
| When $n_2 \geqq n_{20}$, $n_{2m}$ = | 0.1259094 | 0.1555469 | 0.2302234 | 0.1717712 | 0.1831995 |
| When $n_2 < n_{20}$, $n_{2m}$ = | 0.0501526 | 0.1747144 | 0.0944592 | 0.1059167 | 0.2850769 |
| When $k_2 \geqq k_{20}$, $k_{2m}$ = | 0.0866736 | 0.1221960 | 0.1032471 | 0.1537634 | 0.1870032 |
| When $k_2 < k_{20}$, $k_{2m}$ = | 0.0848877 | 0.0779785 | 0.0578296 | 0.1330688 | 0.1069617 |
| When $d_2 \geqq d_{20}$, $d_{2m}$ (nm) = | ∞ | ∞ | ∞ | 19.935 | ∞ |
| When $d_2 < d_{20}$, $d_{2m}$ (nm) = | 9.771 | 69.780 | 73.090 | 7.607 | 20.837 |

1.0 < NA ≦ 1.1
15 < T ≦ 25

| Case | 2-21 | 2-22 |
|---|---|---|
| $n_{10}$ | 1.6956703 | 1.6963391 |
| $k_{10}$ | 0.0621151 | 0.0576411 |
| $d_{10}$ (nm) | 266.327 | 263.935 |
| $n_{20}$ | 1.7069279 | 1.6975975 |
| $k_{20}$ | 0.2113995 | 0.1780179 |
| $d_{20}$ (nm) | 206.262 | 269.259 |
| When $n_1 \geqq n_{10}$, $n_{1m}$ = | 0.0646936 | 0.0790869 |
| When $n_1 < n_{10}$, $n_{1m}$ = | 0.0423181 | 0.0536755 |
| When $k_1 \geqq k_{10}$, $k_{1m}$ = | 0.0600012 | 0.0616785 |
| When $k_1 < k_{10}$, $k_{1m}$ = | 0.0403015 | 0.0417126 |
| When $d_1 \geqq d_{10}$, $d_{1m}$ (nm) = | ∞ | ∞ |
| When $d_1 < d_{10}$, $d_{1m}$ (nm) = | 96.199 | 173.391 |
| When $n_2 \geqq n_{20}$, $n_{2m}$ = | 0.4184778 | 0.3488293 |
| When $n_2 < n_{20}$, $n_{2m}$ = | 0.2491736 | 0.2216455 |
| When $k_2 \geqq k_{20}$, $k_{2m}$ = | 0.2142920 | 0.2197681 |
| When $k_2 < k_{20}$, $k_{2m}$ = | 0.0934741 | 0.0831250 |
| When $d_2 \geqq d_{20}$, $d_{2m}$ (nm) = | ∞ | ∞ |
| When $d_2 < d_{20}$, $d_{2m}$ (nm) = | 76.168 | 129.228 |

1.0 < NA ≦ 1.1
25 < T ≦ 35

6/34

| Case | 3-01 | 3-02 | 3-03 | 3-04 | 3-05 |
|---|---|---|---|---|---|
| $n_{10}$ | 1.8231304 | 1.8934062 | 1.9014262 | 1.8787814 | 1.8198973 |
| $k_{10}$ | 0.2426967 | 0.1289044 | 0.1029443 | 0.1135143 | 0.1197953 |
| $d_{10}$ (nm) | 38.982 | 22.067 | 15.306 | 12.334 | 96.975 |
| $n_{20}$ | 4.7825941 | 1.9169501 | 1.7714781 | 1.6867670 | 4.7572984 |
| $k_{20}$ | 0.7852430 | 0.4577317 | 0.3309508 | 0.2583639 | 0.6218490 |
| $d_{20}$ (nm) | 19.992 | 118.684 | 191.572 | 261.269 | 20.274 |
| When $n_1 \geqq n_{10}$, $n_{1m}$ = | 0.0699695 | 0.0767236 | 0.0951282 | 0.1154443 | 0.0479663 |
| When $n_1 < n_{10}$, $n_{1m}$ = | 0.0498486 | 0.0532642 | 0.0626563 | 0.0817676 | 0.0146021 |
| When $k_1 \geqq k_{10}$, $k_{1m}$ = | 0.0588489 | 0.0605774 | 0.0772998 | 0.1052600 | 0.0370215 |
| When $k_1 < k_{10}$, $k_{1m}$ = | 0.0707385 | 0.0857886 | 0.1011462 | 0.1135143 | 0.0364331 |
| When $d_1 \geqq d_{10}$, $d_{1m}$ (nm) = | 5.137 | 6.730 | 6.574 | 7.047 | 7.725 |
| When $d_1 < d_{10}$, $d_{1m}$ (nm) = | 3.775 | 3.826 | 3.782 | 4.562 | 2.005 |
| When $n_2 \geqq n_{20}$, $n_{2m}$ = | 0.1872302 | 0.1343799 | 0.1259058 | 0.1236719 | 0.1156909 |
| When $n_2 < n_{20}$, $n_{2m}$ = | 0.2029309 | 0.1567590 | 0.1523523 | 0.1408569 | 0.1282800 |
| When $k_2 \geqq k_{20}$, $k_{2m}$ = | 0.2449841 | 0.2003137 | 0.1294177 | 0.1036865 | 0.0748242 |
| When $k_2 < k_{20}$, $k_{2m}$ = | 0.1832959 | 0.1099609 | 0.0962476 | 0.0870068 | 0.1199268 |
| When $d_2 \geqq d_{20}$, $d_{2m}$ (nm) = | 0.864 | ∞ | ∞ | ∞ | 0.532 |
| When $d_2 < d_{20}$, $d_{2m}$ (nm) = | 0.839 | 21.916 | 71.881 | 121.487 | 0.552 |

1.0 < NA ≦ 1.1
25 < T ≦ 35

| Case | 3-06 | 3-07 | 3-08 | 3-09 | 3-10 |
|---|---|---|---|---|---|
| $n_{10}$ | 1.7669399 | 1.7235821 | 1.7188964 | 1.7058208 | 1.7073313 |
| $k_{10}$ | 0.0997580 | 0.0847397 | 0.0726255 | 0.0710513 | 0.0613671 |
| $d_{10}$ (nm) | 94.208 | 93.618 | 92.505 | 162.764 | 160.462 |
| $n_{20}$ | 1.8558060 | 1.6692590 | 1.6760484 | 1.6616172 | 1.6880654 |

-continued

| | | | | | |
|---|---|---|---|---|---|
| $k_{20}$ | 0.3364471 | 0.2394056 | 0.1967286 | 0.2176394 | 0.1807904 |
| $d_{20}$ (nm) | 117.969 | 195.006 | 252.779 | 191.801 | 246.769 |
| When $n_1 \geqq n_{10}$, $n_{1m}$ = | 0.0449036 | 0.0442456 | 0.0506409 | 0.0405530 | 0.0497949 |
| When $n_1 < n_{10}$, $n_{1m}$ = | 0.0058435 | 0.0142969 | 0.0314514 | 0.0176917 | 0.0472620 |
| When $k_1 \geqq k_{10}$, $k_{1m}$ = | 0.0200403 | 0.0369336 | 0.0583228 | 0.0316150 | 0.0541370 |
| When $k_1 < k_{10}$, $k_{1m}$ = | 0.0309863 | 0.0404504 | 0.0477759 | 0.0303076 | 0.0405200 |
| When $d_1 \geqq d_{10}$, $d_{1m}$ (nm) = | 10.713 | 16.167 | 24.298 | ∞ | ∞ |
| When $d_1 < d_{10}$, $d_{1m}$ (nm) = | 1.043 | 3.709 | 9.337 | 7.078 | 23.845 |
| When $n_2 \geqq n_{20}$, $n_{2m}$ = | 0.1063135 | 0.0450122 | 0.0699963 | 0.0309314 | 0.0781641 |
| When $n_2 < n_{20}$, $n_{2m}$ = | 0.1037158 | 0.0932996 | 0.1043005 | 0.0818408 | 0.1014221 |
| When $k_2 \geqq k_{20}$, $k_{2m}$ = | 0.0686243 | 0.0581018 | 0.0668628 | 0.0258777 | 0.0465137 |
| When $k_2 < k_{20}$, $k_{2m}$ = | 0.0768091 | 0.0625977 | 0.0574854 | 0.0546838 | 0.0521045 |
| When $d_2 \geqq d_{20}$, $d_{2m}$ (nm) = | 9.637 | ∞ | ∞ | 13.452 | ∞ |
| When $d_2 < d_{20}$, $d_{2m}$ (nm) = | 3.465 | 21.705 | 32.653 | 17.168 | 25.940 |

$1.0 < NA \leqq 1.1$
$25 < T \leqq 35$

7/34

| Case | 3-11 | 3-12 | 3-13 | 3-14 | 3-15 | 3-16 |
|---|---|---|---|---|---|---|
| $n_{10}$ | 1.6893950 | 1.6912149 | 1.6993872 | 1.6931110 | 1.6955537 | 1.6962507 |
| $k_{10}$ | 0.0792587 | 0.0722082 | 0.0576769 | 0.0689939 | 0.0643335 | 0.0593120 |
| $d_{10}$ (nm) | 211.356 | 207.241 | 221.603 | 270.168 | 266.333 | 263.960 |
| $n_{20}$ | 1.7121469 | 1.6964479 | 1.6911809 | 1.7281714 | 1.7074500 | 1.6977843 |
| $k_{20}$ | 0.2795726 | 0.2163033 | 0.1749036 | 0.2885226 | 0.2235939 | 0.1860709 |
| $d_{20}$ (nm) | 139.203 | 205.754 | 244.825 | 133.446 | 198.195 | 261.024 |
| When $n_1 \geqq n_{10}$, $n_{1m}$ = | 0.0187524 | 0.0389221 | 0.0673108 | 0.0502356 | 0.0624109 | 0.0782690 |
| When $n_1 < n_{10}$, $n_{1m}$ = | 0.0561719 | 0.0620898 | 0.0525073 | 0.0397852 | 0.0411060 | 0.0522693 |
| When $k_1 \geqq k_{10}$, $k_{1m}$ = | 0.0323267 | 0.0510889 | 0.0557678 | 0.0576538 | 0.0581616 | 0.0602515 |
| When $k_1 < k_{10}$, $k_{1m}$ = | 0.0242261 | 0.0363989 | 0.0368542 | 0.0366370 | 0.0397400 | 0.0408899 |
| When $d_1 \geqq d_{10}$, $d_{1m}$ (nm) = | 9.539 | ∞ | ∞ | ∞ | ∞ | ∞ |
| When $d_1 < d_{10}$, $d_{1m}$ (nm) = | 23.792 | 36.062 | 80.743 | 23.618 | 94.755 | 119.700 |
| When $n_2 \geqq n_{20}$, $n_{2m}$ = | 0.1258521 | 0.1531580 | 0.2394678 | 0.1860962 | 0.4430444 | 0.3636609 |
| When $n_2 < n_{20}$, $n_{2m}$ = | 0.0334863 | 0.1783936 | 0.0871167 | 0.1489648 | 0.2583777 | 0.2256018 |
| When $k_2 \geqq k_{20}$, $k_{2m}$ = | 0.0734656 | 0.1167761 | 0.1010718 | 0.1855286 | 0.2138647 | 0.2198901 |
| When $k_2 < k_{20}$, $k_{2m}$ = | 0.0783704 | 0.0804089 | 0.0594067 | 0.1140149 | 0.0979895 | 0.0864600 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 6.823 | 66.025 | 33.786 | 17.363 | 72.201 | 97.445 |

$1.0 < NA \leqq 1.1$
$35 < T \leqq 45$

8/34

| Case | 4-01 | 4-02 | 4-03 | 4-04 | 4-05 |
|---|---|---|---|---|---|
| $n_{10}$ | 1.8741027 | 1.9162345 | 1.9099224 | 1.8839284 | 1.7973698 |
| $k_{10}$ | 0.2292405 | 0.1358555 | 0.1141224 | 0.1193744 | 0.1226911 |
| $d_{10}$ (nm) | 31.502 | 21.455 | 14.789 | 12.268 | 93.176 |
| $n_{20}$ | 2.4589695 | 1.9418040 | 1.7536831 | 1.6821215 | 2.1323779 |
| $k_{20}$ | 0.9273915 | 0.4998799 | 0.3442834 | 0.2672652 | 0.6525391 |
| $d_{20}$ (nm) | 39.688 | 110.373 | 186.067 | 253.238 | 46.828 |
| When $n_1 \geqq n_{10}$, $n_{1m}$ = | 0.0646472 | 0.0749023 | 0.0953894 | 0.1145032 | 0.0393335 |
| When $n_1 < n_{10}$, $n_{1m}$ = | 0.0466125 | 0.0512402 | 0.0611060 | 0.0810242 | 0.0058411 |
| When $k_1 \geqq k_{10}$, $k_{1m}$ = | 0.0535095 | 0.0588599 | 0.0769971 | 0.1049219 | 0.0222083 |
| When $k_1 < k_{10}$, $k_{1m}$ = | 0.0782300 | 0.0839917 | 0.1022253 | 0.1138464 | 0.0267273 |
| When $d_1 \geqq d_{10}$, $d_{1m}$ (nm) = | 4.763 | 5.873 | 6.052 | 6.690 | 7.237 |
| When $d_1 < d_{10}$, $d_{1m}$ (nm) = | 3.092 | 3.244 | 3.414 | 4.349 | 0.847 |
| When $n_2 \geqq n_{20}$, $n_{2m}$ = | 0.2061353 | 0.1383777 | 0.1254065 | 0.1201538 | 0.0908765 |
| When $n_2 < n_{20}$, $n_{2m}$ = | 0.1985669 | 0.1593604 | 0.1521448 | 0.1405737 | 0.1202173 |
| When $k_2 \geqq k_{20}$, $k_{2m}$ = | 0.2506677 | 0.2047961 | 0.1231897 | 0.1019714 | 0.0402307 |
| When $k_2 < k_{20}$, $k_{2m}$ = | 0.1792896 | 0.1103943 | 0.0960205 | 0.0872583 | 0.1042542 |
| When $d_2 \geqq d_{20}$, $d_{2m}$ (nm) = | 6.142 | ∞ | ∞ | ∞ | 4.028 |
| When $d_2 < d_{20}$, $d_{2m}$ (nm) = | 4.657 | 20.982 | 70.019 | 92.164 | 2.915 |

-continued

| | 1.0 < NA ≦ 1.1<br>35 < T ≦ 45 | | | | |
|---|---|---|---|---|---|
| Case | 4-06 | 4-07 | 4-08 | 4-09 | 4-10 |
| $n_{10}$ | 1.7231751 | 1.7198225 | 1.7057007 | 1.7079030 | 1.6886446 |
| $k_{10}$ | 0.0881939 | 0.0748307 | 0.0735111 | 0.0631371 | 0.0826816 |
| $d_{10}$ (nm) | 93.194 | 92.273 | 162.218 | 160.241 | 210.810 |
| $n_{20}$ | 1.6583398 | 1.6753837 | 1.6560667 | 1.6895692 | 1.7077667 |
| $k_{20}$ | 0.2493789 | 0.2040438 | 0.2270715 | 0.1875698 | 0.2975930 |
| $d_{20}$ (nm) | 187.627 | 244.025 | 183.673 | 237.741 | 132.542 |
| When $n_1 \geqq n_{10}$, $n_{1m}$ = | 0.0413782 | 0.0488660 | 0.0374475 | 0.0482141 | 0.0106323 |
| When $n_1 < n_{10}$, $n_{1m}$ = | 0.0123999 | 0.0300476 | 0.0153528 | 0.0446057 | 0.0519153 |
| When $k_1 \geqq k_{10}$, $k_{1m}$ = | 0.0333630 | 0.0568799 | 0.0277051 | 0.0515784 | 0.0235608 |
| When $k_1 < k_{10}$, $k_{1m}$ = | 0.0393298 | 0.0467004 | 0.0300195 | 0.0397412 | 0.0190234 |
| When $d_1 \geqq d_{10}$, $d_{1m}$ (nm) = | 13.894 | 20.818 | 24.657 | ∞ | 6.948 |
| When $d_1 < d_{10}$, $d_{1m}$ (nm) = | 3.123 | 8.547 | 5.758 | 21.149 | 21.403 |
| When $n_2 \geqq n_{20}$, $n_{2m}$ = | 0.0360730 | 0.0689490 | 0.0276392 | 0.0753564 | 0.1220337 |
| When $n_2 < n_{20}$, $n_{2m}$ = | 0.0901636 | 0.1032593 | 0.0781885 | 0.0941541 | 0.0190320 |
| When $k_2 \geqq k_{20}$, $k_{2m}$ = | 0.0474146 | 0.0634253 | 0.0205627 | 0.0433423 | 0.0612073 |
| When $k_2 < k_{20}$, $k_{2m}$ = | 0.0610718 | 0.0577832 | 0.0533984 | 0.0526196 | 0.0606079 |
| When $d_2 \geqq d_{20}$, $d_{2m}$ (nm) = | ∞ | ∞ | 8.473 | ∞ | ∞ |
| When $d_2 < d_{20}$, $d_{2m}$ (nm) = | 20.321 | 31.703 | 15.881 | 21.519 | 3.543 |

| | 1.0 < NA ≦ 1.1<br>35 < T ≦ 45 | | | 9/34 |
|---|---|---|---|---|
| Case | 4-11 | 4-12 | 4-13 | 4-14 |
| $n_{10}$ | 1.6995870 | 1.6927517 | 1.6954892 | 1.6961809 |
| $k_{10}$ | 0.0592337 | 0.0720967 | 0.0662812 | 0.0606151 |
| $d_{10}$ (nm) | 221.497 | 269.568 | 265.955 | 263.663 |
| $n_{20}$ | 1.6927290 | 1.7225076 | 1.7055518 | 1.6966094 |
| $k_{20}$ | 0.1818275 | 0.3075740 | 0.2340649 | 0.1927366 |
| $d_{20}$ (nm) | 235.781 | 126.653 | 190.864 | 253.572 |
| When $n_1 \geqq n_{10}$, $n_{1m}$ = | 0.0661182 | 0.0430298 | 0.0571948 | 0.0777271 |
| When $n_1 < n_{10}$, $n_{1m}$ = | 0.0480371 | 0.0376990 | 0.0396948 | 0.0514954 |
| When $k_1 \geqq k_{10}$, $k_{1m}$ = | 0.0532056 | 0.0552930 | 0.0563965 | 0.0590613 |
| When $k_1 < k_{10}$, $k_{1m}$ = | 0.0358557 | 0.0353455 | 0.0387683 | 0.0400696 |
| When $d_1 \geqq d_{10}$, $d_{1m}$ (nm) = | ∞ | ∞ | ∞ | ∞ |
| When $d_1 < d_{10}$, $d_{1m}$ (nm) = | 78.174 | 21.398 | 89.629 | 112.221 |
| When $n_2 \geqq n_{20}$, $n_{2m}$ = | 0.2507446 | 0.1898645 | 0.4617859 | 0.3498169 |
| When $n_2 < n_{20}$, $n_{2m}$ = | 0.0793469 | 0.1193628 | 0.2673291 | 0.2271130 |
| When $k_2 \geqq k_{20}$, $k_{2m}$ = | 0.0998633 | 0.1866309 | 0.2129163 | 0.2195020 |
| When $k_2 < k_{20}$, $k_{2m}$ = | 0.0613184 | 0.1217163 | 0.1026648 | 0.0902368 |
| When $d_2 \geqq d_{20}$, $d_{2m}$ (nm) = | ∞ | ∞ | ∞ | ∞ |
| When $d_2 < d_{20}$, $d_{2m}$ (nm) = | 33.021 | 15.026 | 69.134 | 84.327 |

| | 1.0 < NA ≦ 1.1<br>45 < T ≦ 55 | | | | |
|---|---|---|---|---|---|
| Case | 5-01 | 5-02 | 5-03 | 5-04 | 5-05 |
| $n_{10}$ | 1.8808544 | 1.9316654 | 1.9082705 | 1.8785232 | 1.7211644 |
| $k_{10}$ | 0.2454152 | 0.1473610 | 0.1322705 | 0.1271526 | 0.0906139 |
| $d_{10}$ (nm) | 24.855 | 18.765 | 14.189 | 12.435 | 92.694 |
| $n_{20}$ | 1.8495394 | 1.8569906 | 1.7144055 | 1.6714546 | 1.6423304 |
| $k_{20}$ | 0.8565648 | 0.5034890 | 0.3458924 | 0.2699971 | 0.2528050 |
| $d_{20}$ (nm) | 51.788 | 110.667 | 182.182 | 245.412 | 180.257 |
| When $n_1 \geqq n_{10}$, $n_{1m}$ = | 0.0633093 | 0.0784436 | 0.0967798 | 0.1127563 | 0.0394434 |
| When $n_1 < n_{10}$, $n_{1m}$ = | 0.0379272 | 0.0483252 | 0.0593640 | 0.0800098 | 0.0123450 |
| When $k_1 \geqq k_{10}$, $k_{1m}$ = | 0.0520349 | 0.0606396 | 0.0782654 | 0.1046387 | 0.0323718 |
| When $k_1 < k_{10}$, $k_{1m}$ = | 0.0704724 | 0.0844775 | 0.1016626 | 0.1111450 | 0.0404236 |
| When $d_1 \geqq d_{10}$, $d_{1m}$ (nm) = | 4.463 | 5.359 | 5.721 | 6.653 | 12.460 |
| When $d_1 < d_{10}$, $d_{1m}$ (nm) = | 2.319 | 2.677 | 3.157 | 4.357 | 3.091 |
| When $n_2 \geqq n_{20}$, $n_{2m}$ = | 0.1530676 | 0.1305420 | 0.1246069 | 0.1153186 | 0.0322009 |
| When $n_2 < n_{20}$, $n_{2m}$ = | 0.1897241 | 0.1692273 | 0.1526025 | 0.1380359 | 0.0893225 |
| When $k_2 \geqq k_{20}$, $k_{2m}$ = | 0.1919946 | 0.1591870 | 0.1122729 | 0.0997217 | 0.0401709 |
| When $k_2 < k_{20}$, $k_{2m}$ = | 0.1170728 | 0.1032434 | 0.0948108 | 0.0869653 | 0.0592017 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 9.182 | 23.164 | 70.833 | 93.569 | 20.376 |

1.0 < NA ≦ 1.1
45 < T ≦ 55

10/34

| Case | 5-06 | 5-07 | 5-08 | 5-09 | 5-10 |
|---|---|---|---|---|---|
| $n_{10}$ | 1.7204079 | 1.7050622 | 1.7085349 | .6878153 | 1.6980473 |
| $k_{10}$ | 0.0761160 | 0.0748972 | 0.0642166 | 0.0847734 | 0.0703784 |
| $d_{10}$ (nm) | 92.018 | 161.630 | 160.005 | 209.683 | 224.445 |
| $n_{20}$ | 1.6751968 | 1.6489715 | 1.6919631 | 1.6959203 | 1.6616204 |
| $k_{20}$ | 0.2080809 | 0.2315625 | 0.1914882 | 0.3070669 | 0.2238826 |
| $d_{20}$ (nm) | 234.537 | 175.108 | 227.913 | 127.092 | 171.370 |
| When $n_1 \geqq n_{10}$, $n_{1m}$ = | 0.0481116 | 0.0356750 | 0.0469714 | 0.0053320 | 0.0535730 |
| When $n_1 < n_{10}$, $n_{1m}$ = | 0.0302478 | 0.0193359 | 0.0419556 | 0.0458972 | 0.0248047 |
| When $k_1 \geqq k_{10}$, $k_{1m}$ = | 0.0572302 | 0.0287097 | 0.0507117 | 0.0169995 | 0.0427319 |
| When $k_1 < k_{10}$, $k_{1m}$ = | 0.0456555 | 0.0334753 | 0.0389539 | 0.0159290 | 0.0235608 |
| When $d_1 \geqq d_{10}$, $d_{1m}$ (nm) = | 19.317 | 21.414 | ∞ | 2.347 | ∞ |
| When $d_1 < d_{10}$, $d_{1m}$ (nm) = | 8.336 | 7.128 | 19.272 | 19.688 | 12.738 |
| When $n_2 \geqq n_{20}$, $n_{2m}$ = | 0.0703723 | 0.0326379 | 0.0750854 | 0.1108911 | 0.0566052 |
| When $n_2 < n_{20}$, $n_{2m}$ = | 0.1049292 | 0.0778333 | 0.0787329 | 0.0108118 | 0.0780139 |
| When $k_2 \geqq k_{20}$, $k_{2m}$ = | 0.0616284 | 0.0216638 | 0.0424329 | 0.0606311 | 0.0720593 |
| When $k_2 < k_{20}$, $k_{2m}$ = | 0.0584753 | 0.0525964 | 0.0537231 | 0.0383350 | 0.0623987 |
| When $d_2 \geqq d_{20}$, $d_{2m}$ (nm) = | ∞ | 8.070 | ∞ | 32.807 | ∞ |
| When $d_2 < d_{20}$, $d_{2m}$ (nm) = | 32.758 | 15.758 | 17.351 | 1.915 | 21.521 |

1.0 < NA ≦ 1.1
45 < T ≦ 55

| Case | 5-11 | 5-12 | 5-13 | 5-14 |
|---|---|---|---|---|
| $n_{10}$ | 1.6999707 | 1.6924126 | 1.6955002 | 1.6961000 |
| $k_{10}$ | 0.0601951 | 0.0742318 | 0.0674212 | 0.0611797 |
| $d_{10}$ (nm) | 221.512 | 268.357 | 265.225 | 263.146 |
| $n_{20}$ | 1.6952970 | 1.7068352 | 1.7004174 | 1.6940899 |
| $k_{20}$ | 0.1862586 | 0.3173492 | 0.2397614 | 0.1962440 |
| $d_{20}$ (nm) | 225.852 | 120.697 | 183.997 | 246.462 |
| When $n_1 \geqq n_{10}$, $n_{1m}$ = | 0.0654663 | 0.0386316 | 0.0536462 | 0.0776611 |
| When $n_1 < n_{10}$, $n_{1m}$ = | 0.0445935 | 0.0350720 | 0.0381848 | 0.0515515 |
| When $k_1 \geqq k_{10}$, $k_{1m}$ = | 0.0509546 | 0.0537524 | 0.0551721 | 0.0583948 |
| When $k_1 < k_{10}$, $k_{1m}$ = | 0.0349414 | 0.0344934 | 0.0383105 | 0.0394385 |
| When $d_1 \geqq d_{10}$, $d_{1m}$ (nm) = | ∞ | ∞ | ∞ | ∞ |
| When $d_1 < d_{10}$, $d_{1m}$ (nm) = | 76.496 | 19.128 | 37.283 | 109.648 |
| When $n_2 \geqq n_{20}$, $n_{2m}$ = | 0.1168579 | 0.1905981 | 0.3934021 | 0.3400916 |
| When $n_2 < n_{20}$, $n_{2m}$ = | 0.0700696 | 0.1027393 | 0.2743970 | 0.2283606 |
| When $k_2 \geqq k_{20}$, $k_{2m}$ = | 0.1002319 | 0.1933838 | 0.2120459 | 0.2188281 |
| When $k_2 < k_{20}$, $k_{2m}$ = | 0.0624707 | 0.1168652 | 0.1050110 | 0.0926550 |
| When $d_2 \geqq d_{20}$, $d_{2m}$ (nm) = | ∞ | ∞ | ∞ | ∞ |
| When $d_2 < d_{20}$, $d_{2m}$ (nm) = | 28.597 | 13.909 | 67.541 | 81.764 |

1.0 < NA ≦ 1.1
55 < T ≦ 65

11/34

| Case | 6-01 | 6-02 | 6-03 | 6-04 | 6-05 |
|---|---|---|---|---|---|
| $n_{10}$ | 1.8609133 | 1.9462238 | 1.9002376 | 1.8750233 | 1.8816918 |
| $k_{10}$ | 0.2699154 | 0.1588548 | 0.1498745 | 0.1302055 | 0.0811209 |
| $d_{10}$ (nm) | 23.275 | 16.938 | 13.880 | 12.592 | 12.084 |
| $n_{20}$ | 1.6780954 | 1.8061043 | 1.6764313 | 1.6672162 | 1.7277101 |
| $k_{20}$ | 0.8091000 | 0.4989592 | 0.3420875 | 0.2718902 | 0.2394028 |
| $d_{20}$ (nm) | 51.309 | 107.791 | 176.900 | 235.718 | 282.393 |
| When $n_1 \geqq n_{10}$, $n_{1m}$ = | 0.0700366 | 0.0847327 | 0.0979871 | 0.1121912 | 0.1205115 |
| When $n_1 < n_{10}$, $n_{1m}$ = | 0.0352271 | 0.0459912 | 0.0579346 | 0.0799817 | 0.0890784 |
| When $k_1 \geqq k_{10}$, $k_{1m}$ = | 0.0520923 | 0.0625745 | 0.0794043 | 0.1043726 | 0.1106958 |
| When $k_1 < k_{10}$, $k_{1m}$ = | 0.0664282 | 0.0874719 | 0.0997217 | 0.1093811 | 0.0811209 |
| When $d_1 \geqq d_{10}$, $d_{1m}$ (nm) = | 4.496 | 4.952 | 5.583 | 6.704 | 7.616 |
| When $d_1 < d_{10}$, $d_{1m}$ (nm) = | 2.084 | 2.260 | 3.039 | 4.426 | 5.147 |
| When $n_2 \geqq n_{20}$, $n_{2m}$ = | 0.1454468 | 0.1290356 | 0.1219507 | 0.1104688 | 0.1083423 |
| When $n_2 < n_{20}$, $n_{2m}$ = | 0.1338672 | 0.1849402 | 0.1524817 | 0.1364417 | 0.1532007 |
| When $k_2 \geqq k_{20}$, $k_{2m}$ = | 0.1326758 | 0.1316541 | 0.1033948 | 0.0988464 | 0.1079004 |
| When $k_2 < k_{20}$, $k_{2m}$ = | 0.1106470 | 0.1010791 | 0.0949341 | 0.0882678 | 0.0854614 |
| When $d_2 \geqq d_{20}$, $d_{2m}$ (nm) = | 18.182 | ∞ | ∞ | ∞ | ∞ |
| When $d_2 < d_{20}$, $d_{2m}$ (nm) = | 8.638 | 17.532 | 68.073 | 94.482 | 130.723 |

-continued

| Case | 1.0 < NA ≦ 1.1<br>55 < T ≦ 65<br>6-06 | 6-07 | 6-08 | 6-09 | 6-10 |
|---|---|---|---|---|---|
| $n_{10}$ | 1.7196449 | 1.7211216 | 1.7282121 | 1.7047574 | 1.7094298 |
| $k_{10}$ | 0.0916508 | 0.0765241 | 0.0683348 | 0.0753118 | 0.0647325 |
| $d_{10}$ (nm) | 92.440 | 91.942 | 92.298 | 161.355 | 159.970 |
| $n_{20}$ | 1.6323282 | 1.6777604 | 1.7222619 | 1.6462273 | 1.6962571 |
| $k_{20}$ | 0.2539653 | 0.2105462 | 0.1825246 | 0.2341241 | 0.1938378 |
| $d_{20}$ (nm) | 171.320 | 223.941 | 274.062 | 165.232 | 217.150 |
| When $n_1 \geqq n_{10}$, $n_{1m}$ = | 0.0390417 | 0.0485681 | 0.0546460 | 0.0358069 | 0.0474683 |
| When $n_1 < n_{10}$, $n_{1m}$ = | 0.0139282 | 0.0313391 | 0.0292078 | 0.0174304 | 0.0407373 |
| When $k_1 \geqq k_{10}$, $k_{1m}$ = | 0.0333240 | 0.0585132 | 0.0578357 | 0.0324670 | 0.0508789 |
| When $k_1 < k_{10}$, $k_{1m}$ = | 0.0406140 | 0.0454041 | 0.0481470 | 0.0321411 | 0.0389600 |
| When $d_1 \geqq d_{10}$, $d_{1m}$ (nm) = | 12.043 | 19.132 | 42.010 | 19.174 | ∞ |
| When $d_1 < d_{10}$, $d_{1m}$ (nm) = | 3.525 | 8.472 | 8.190 | 6.358 | 18.590 |
| When $n_2 \geqq n_{20}$, $n_{2m}$ = | 0.0324304 | 0.0734375 | 0.0906226 | 0.0327905 | 0.0764417 |
| When $n_2 < n_{20}$, $n_{2m}$ = | 0.0896448 | 0.1073743 | 0.1223853 | 0.0797839 | 0.0702637 |
| When $k_2 \geqq k_{20}$, $k_{2m}$ = | 0.0391357 | 0.0623755 | 0.0817871 | 0.0268372 | 0.0433899 |
| When $k_2 < k_{20}$, $k_{2m}$ = | 0.0597375 | 0.0603992 | 0.0593811 | 0.0545007 | 0.0559253 |
| When $d_2 \geqq d_{20}$, $d_{2m}$ (nm) = | ∞ | ∞ | ∞ | 9.153 | ∞ |
| When $d_2 < d_{20}$, $d_{2m}$ (nm) = | 20.788 | 29.764 | 77.892 | 16.109 | 14.325 |

| Case | 1.0 < NA ≦ 1.1<br>55 < T ≦ 65<br>6-11 | 6-12 | 6-13 | 6-14 | 6-15 | 12/34<br>6-16 |
|---|---|---|---|---|---|---|
| $n_{10}$ | 1.6870964 | 1.6986314 | 1.7003667 | 1.6951156 | 1.6955653 | 1.6958377 |
| $k_{10}$ | 0.0858972 | 0.0705958 | 0.0607285 | 0.0571177 | 0.0680298 | 0.0528303 |
| $d_{10}$ (nm) | 208.556 | 224.893 | 221.557 | 215.781 | 264.644 | 274.984 |
| $n_{20}$ | 1.6830399 | 1.6622291 | 1.6983916 | 1.6957463 | 1.6953987 | 1.6882898 |
| $k_{20}$ | 0.3090553 | 0.2274423 | 0.1887213 | 0.1617780 | 0.2417239 | 0.1657751 |
| $d_{20}$ (nm) | 121.249 | 160.831 | 215.383 | 277.216 | 176.078 | 275.044 |
| When $n_1 \geqq n_{10}$, $n_{1m}$ = | 0.0051123 | 0.0520032 | 0.0662122 | 0.0842517 | 0.0515662 | 0.0590991 |
| When $n_1 < n_{10}$, $n_{1m}$ = | 0.0418372 | 0.0227649 | 0.0435059 | 0.0645801 | 0.0369092 | 0.0581189 |
| When $k_1 \geqq k_{10}$, $k_{1m}$ = | 0.0150793 | 0.0436267 | 0.0489954 | 0.0563855 | 0.0542810 | 0.0684131 |
| When $k_1 < k_{10}$, $k_{1m}$ = | 0.0179541 | 0.0228833 | 0.0348535 | 0.0371240 | 0.0381006 | 0.0375098 |
| When $d_1 \geqq d_{10}$, $d_{1m}$ (nm) = | 2.247 | ∞ | ∞ | ∞ | ∞ | ∞ |
| When $d_1 < d_{10}$, $d_{1m}$ (nm) = | 18.385 | 11.933 | 75.920 | 58.822 | 33.649 | 113.219 |
| When $n_2 \geqq n_{20}$, $n_{2m}$ = | 0.1010083 | 0.0477234 | 0.1065527 | 0.2254480 | 0.3829150 | 0.2789856 |
| When $n_2 < n_{20}$, $n_{2m}$ = | 0.0100110 | 0.0759302 | 0.0611096 | 0.1540564 | 0.2775842 | 0.2219617 |
| When $k_2 \geqq k_{20}$, $k_{2m}$ = | 0.0726611 | 0.0766821 | 0.1015344 | 0.1236780 | 0.2119995 | 0.1981201 |
| When $k_2 < k_{20}$, $k_{2m}$ = | 0.0309253 | 0.0590527 | 0.0616418 | 0.0602039 | 0.1044287 | 0.0735400 |
| When $d_2 \geqq d_{20}$, $d_{2m}$ (nm) = | 25.845 | 22.079 | ∞ | ∞ | ∞ | ∞ |
| When $d_2 < d_{20}$, $d_{2m}$ (nm) = | 1.717 | 20.127 | 24.695 | 81.257 | 67.124 | 97.500 |

| Case | 1.0 < NA ≦ 1.1<br>65 < T ≦ 75<br>7-01 | 7-02 | 7-03 | 7-04 | 13/34<br>7-05 |
|---|---|---|---|---|---|
| $n_{10}$ | 1.8339628 | 1.9445237 | 1.8939902 | 1.8811858 | 1.7203230 |
| $k_{10}$ | 0.2973905 | 0.1726202 | 0.1563846 | 0.0833966 | 0.0922740 |
| $d_{10}$ (nm) | 24.925 | 17.287 | 14.253 | 12.228 | 92.527 |
| $n_{20}$ | 1.6419965 | 1.7953047 | 1.6659458 | 1.7269957 | 1.6328842 |
| $k_{20}$ | 0.8698975 | 0.5162004 | 0.3485215 | 0.2426363 | 0.2599948 |
| $d_{20}$ (nm) | 41.723 | 98.907 | 167.112 | 272.914 | 160.703 |
| When $n_1 \geqq n_{10}$, $n_{1m}$ = | 0.0734924 | 0.0853552 | 0.0964307 | 0.1197986 | 0.0394055 |
| When $n_1 < n_{10}$, $n_{1m}$ = | 0.0377722 | 0.0427490 | 0.0559692 | 0.0877673 | 0.0144592 |
| When $k_1 \geqq k_{10}$, $k_{1m}$ = | 0.0448938 | 0.0589941 | 0.0770850 | 0.1096667 | 0.0331616 |
| When $k_1 < k_{10}$, $k_{1m}$ = | 0.0453357 | 0.0848169 | 0.0975195 | 0.0833966 | 0.0410388 |
| When $d_1 \geqq d_{10}$, $d_{1m}$ (nm) = | 4.571 | 4.784 | 5.590 | 7.648 | 12.091 |
| When $d_1 < d_{10}$, $d_{1m}$ (nm) = | 2.315 | 2.092 | 3.027 | 5.109 | 3.655 |
| When $n_2 \geqq n_{20}$, $n_{2m}$ = | 0.1366638 | 0.1348682 | 0.1167786 | 0.1080664 | 0.0326196 |
| When $n_2 < n_{20}$, $n_{2m}$ = | 0.1076978 | 0.1944104 | 0.1524536 | 0.1545313 | 0.0900854 |
| When $k_2 \geqq k_{20}$, $k_{2m}$ = | 0.1648022 | 0.1338904 | 0.1021130 | 0.1080652 | 0.0396484 |

-continued

| | | | | | |
|---|---|---|---|---|---|
| When $k_2 < k_{20}$, $k_{2m}$ = | 0.1324670 | 0.1078918 | 0.0977759 | 0.0865271 | 0.0625085 |
| When $d_2 \geqq d_{20}$, $d_{2m}$ (nm) = | 12.499 | ∞ | ∞ | ∞ | ∞ |
| When $d_2 < d_{20}$, $d_{2m}$ (nm) = | 5.747 | 14.376 | 64.164 | 128.680 | 19.557 |

1.0 < NA ≦ 1.1
65 < T ≦ 75

| Case | 7-06 | 7-07 | 7-08 | 7-09 | 7-10 |
|---|---|---|---|---|---|
| $n_{10}$ | 1.7224265 | 1.7294779 | 1.7053201 | 1.7102741 | 1.7133466 |
| $k_{10}$ | 0.0770592 | 0.0692299 | 0.0757255 | 0.0654045 | 0.0629386 |
| $d_{10}$ (nm) | 92.053 | 92.385 | 161.452 | 160.136 | 160.381 |
| $n_{20}$ | 1.6819841 | 1.7252879 | 1.6485370 | 1.7000507 | 1.7220503 |
| $k_{20}$ | 0.2150120 | 0.1858377 | 0.2399747 | 0.1977447 | 0.1698335 |
| $d_{20}$ (nm) | 213.162 | 263.723 | 154.588 | 206.614 | 260.757 |
| When $n_1 \geqq n_{10}$, $n_{1m}$ = | 0.0490625 | 0.0548535 | 0.0366443 | 0.0483020 | 0.0569666 |
| When $n_1 < n_{10}$, $n_{1m}$ = | 0.0311902 | 0.0280200 | 0.0173645 | 0.0416309 | 0.0190027 |
| When $k_1 \geqq k_{10}$, $k_{1m}$ = | 0.0581604 | 0.0565332 | 0.0330920 | 0.0498926 | 0.0402344 |
| When $k_1 < k_{10}$, $k_{1m}$ = | 0.0461389 | 0.0475879 | 0.0324707 | 0.0390747 | 0.0240051 |
| When $d_1 \geqq d_{10}$, $d_{1m}$ (nm) = | 19.214 | 40.761 | 19.902 | ∞ | ∞ |
| When $d_1 < d_{10}$, $d_{1m}$ (nm) = | 8.328 | 7.705 | 6.285 | 18.989 | 5.694 |
| When $n_2 \geqq n_{20}$, $n_{2m}$ = | 0.0747375 | 0.0917908 | 0.0322156 | 0.0769946 | 0.1011584 |
| When $n_2 < n_{20}$, $n_{2m}$ = | 0.1078540 | 0.1217822 | 0.0813562 | 0.0689685 | 0.1343567 |
| When $k_2 \geqq k_{20}$, $k_{2m}$ = | 0.0634705 | 0.0827625 | 0.0283752 | 0.0430542 | 0.0435730 |
| When $k_2 < k_{20}$, $k_{2m}$ = | 0.0623401 | 0.0604163 | 0.0573535 | 0.0576453 | 0.0570081 |
| When $d_2 \geqq d_{20}$, $d_{2m}$ (nm) = | ∞ | ∞ | 9.136 | 38.239 | ∞ |
| When $d_2 < d_{20}$, $d_{2m}$ (nm) = | 27.810 | 75.918 | 15.379 | 13.085 | 10.847 |

1.0 < NA ≦ 1.1
65 < T ≦ 75

14/34

| Case | 7-11 | 7-12 | 7-13 | 7-14 | 7-15 | 7-16 |
|---|---|---|---|---|---|---|
| $n_{10}$ | 1.6861768 | 1.6990769 | 1.7003759 | 1.6946436 | 1.6954303 | 1.6957423 |
| $k_{10}$ | 0.0881028 | 0.0709373 | 0.0613969 | 0.0577579 | 0.0690806 | 0.0532811 |
| $d_{10}$ (nm) | 208.148 | 225.005 | 221.468 | 215.315 | 264.876 | 274.848 |
| $n_{20}$ | 1.6733849 | 1.6647354 | 1.6998938 | 1.6946016 | 1.6937197 | 1.6878755 |
| $k_{20}$ | 0.3136681 | 0.2329033 | 0.1918751 | 0.1634050 | 0.2458138 | 0.1674492 |
| $d_{20}$ (nm) | 112.385 | 150.349 | 205.497 | 268.128 | 165.269 | 265.685 |
| When $n_1 \geqq n_{10}$, $n_{1m}$ = | 0.0025806 | 0.0529590 | 0.0676086 | 0.0859229 | 0.0516138 | 0.0588110 |
| When $n_1 < n_{10}$, $n_{1m}$ = | 0.0409998 | 0.0231177 | 0.0444312 | 0.0666504 | 0.0367175 | 0.0575696 |
| When $k_1 \geqq k_{10}$, $k_{1m}$ = | 0.0094263 | 0.0435510 | 0.0474890 | 0.0560022 | 0.0529260 | 0.0681641 |
| When $k_1 < k_{10}$, $k_{1m}$ = | 0.0156848 | 0.0234912 | 0.0355322 | 0.0372656 | 0.0371912 | 0.0379443 |
| When $d_1 \geqq d_{10}$, $d_{1m}$ (nm) = | 1.037 | ∞ | ∞ | ∞ | ∞ | ∞ |
| When $d_1 < d_{10}$, $d_{1m}$ (nm) = | 17.094 | 12.289 | 76.126 | 56.280 | 33.058 | 112.076 |
| When $n_2 \geqq n_{20}$, $n_{2m}$ = | 0.1039172 | 0.0468506 | 0.1077234 | 0.2240735 | 0.4022729 | 0.2806909 |
| When $n_2 < n_{20}$, $n_{2m}$ = | 0.0058093 | 0.0753308 | 0.0576575 | 0.1556287 | 0.2760486 | 0.2229114 |
| When $k_2 \geqq k_{20}$, $k_{2m}$ = | 0.0664124 | 0.0758972 | 0.1012000 | 0.1249744 | 0.2123950 | 0.1986609 |
| When $k_2 < k_{20}$, $k_{2m}$ = | 0.0178174 | 0.0630115 | 0.0645288 | 0.0620288 | 0.1063135 | 0.0745801 |
| When $d_2 \geqq d_{20}$, $d_{2m}$ (nm) = | 26.367 | 19.187 | ∞ | ∞ | ∞ | ∞ |
| When $d_2 < d_{20}$, $d_{2m}$ (nm) = | 1.017 | 18.602 | 23.769 | 80.847 | 66.469 | 89.270 |

1.0 < NA ≦ 1.1
75 < T ≦ 85

15/34

| Case | 8-01 | 8-02 | 8-03 | 8-04 | 8-05 |
|---|---|---|---|---|---|
| $n_{10}$ | 1.9187259 | 1.8967518 | 1.8757876 | 1.8806788 | 1.7234296 |
| $k_{10}$ | 0.1881900 | 0.1527475 | 0.1318014 | 0.0899399 | 0.0945092 |
| $d_{10}$ (nm) | 20.509 | 15.221 | 13.247 | 12.412 | 92.722 |
| $n_{20}$ | 1.8283337 | 1.6893708 | 1.6726776 | 1.7211162 | 1.6393014 |
| $k_{20}$ | 0.5739613 | 0.3734166 | 0.2883472 | 0.2492460 | 0.2743485 |
| $d_{20}$ (nm) | 84.746 | 154.221 | 215.129 | 265.394 | 150.270 |
| When $n_1 \geqq n_{10}$, $n_{1m}$ = | 0.0766943 | 0.0922229 | 0.1080322 | 0.1177502 | 0.0391516 |
| When $n_1 < n_{10}$, $n_{1m}$ = | 0.0399988 | 0.0530884 | 0.0750195 | 0.0852625 | 0.0112524 |
| When $k_1 \geqq k_{10}$, $k_{1m}$ = | 0.0507166 | 0.0712622 | 0.0980225 | 0.1073047 | 0.0289392 |
| When $k_1 < k_{10}$, $k_{1m}$ = | 0.0771802 | 0.0964258 | 0.1069458 | 0.0899399 | 0.0412610 |
| When $d_1 \geqq d_{10}$, $d_{1m}$ (nm) = | 5.195 | 5.640 | 6.681 | 7.548 | 11.825 |

-continued

| | | | | | |
|---|---|---|---|---|---|
| When $d_1 < d_{10}$, $d_{1m}$ (nm) = | 2.249 | 2.987 | 4.301 | 4.972 | 2.719 |
| When $n_2 \geqq n_{20}$, $n_{2m}$ = | 0.1444995 | 0.1155615 | 0.1091333 | 0.1093396 | 0.0288635 |
| When $n_2 < n_{20}$, $n_{2m}$ = | 0.1897876 | 0.1532776 | 0.1435217 | 0.1541382 | 0.0890479 |
| When $k_2 \geqq k_{20}$, $k_{2m}$ = | 0.1811243 | 0.1099194 | 0.1006726 | 0.1075403 | 0.0356238 |
| When $k_2 < k_{20}$, $k_{2m}$ = | 0.1194946 | 0.1025110 | 0.0922131 | 0.0871228 | 0.0649683 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 15.313 | 64.664 | 82.555 | 124.472 | 16.892 |

$1.0 < NA \leqq 1.1$
$75 < T \leqq 85$

| Case | 8-06 | 8-07 | 8-08 | 8-09 | 8-10 |
|---|---|---|---|---|---|
| $n_{10}$ | 1.7235983 | 1.7294254 | 1.7064538 | 1.7103862 | 1.7133072 |
| $k_{10}$ | 0.0790587 | 0.0706491 | 0.0777504 | 0.0670250 | 0.0637197 |
| $d_{10}$ (nm) | 92.129 | 92.482 | 161.668 | 160.278 | 160.467 |
| $n_{20}$ | 1.6815454 | 1.7233644 | 1.6498826 | 1.6983722 | 1.7219131 |
| $k_{20}$ | 0.2228770 | 0.1918670 | 0.2514894 | 0.2047961 | 0.1752501 |
| $d_{20}$ (nm) | 204.187 | 255.172 | 145.038 | 197.922 | 251.781 |
| When $n_1 \geqq n_{10}$, $n_{1m}$ = | 0.0481958 | 0.0539050 | 0.0362122 | 0.0474792 | 0.0556775 |
| When $n_1 < n_{10}$, $n_{1m}$ = | 0.0281580 | 0.0270288 | 0.0158582 | 0.0428101 | 0.0187244 |
| When $k_1 \geqq k_{10}$, $k_{1m}$ = | 0.0546558 | 0.0547986 | 0.0255066 | 0.0459753 | 0.0391089 |
| When $k_1 < k_{10}$, $k_{1m}$ = | 0.0470496 | 0.0476624 | 0.0330371 | 0.0375122 | 0.0244470 |
| When $d_1 \geqq d_{10}$, $d_{1m}$ (nm) = | 18.433 | 40.484 | 19.881 | ∞ | ∞ |
| When $d_1 < d_{10}$, $d_{1m}$ (nm) = | 7.376 | 7.380 | 6.011 | 13.737 | 5.649 |
| When $n_2 \geqq n_{20}$, $n_{2m}$ = | 0.0719336 | 0.0903259 | 0.0311267 | 0.0755847 | 0.1032422 |
| When $n_2 < n_{20}$, $n_{2m}$ = | 0.1049182 | 0.1183936 | 0.0789893 | 0.0715295 | 0.1268079 |
| When $k_2 \geqq k_{20}$, $k_{2m}$ = | 0.0610889 | 0.0802148 | 0.0194653 | 0.0384314 | 0.0401990 |
| When $k_2 < k_{20}$, $k_{2m}$ = | 0.0626282 | 0.0606787 | 0.0584229 | 0.0575549 | 0.0569128 |
| When $d_2 \geqq d_{20}$, $d_{2m}$ (nm) = | ∞ | ∞ | 6.414 | 35.522 | ∞ |
| When $d_2 < d_{20}$, $d_{2m}$ (nm) = | 26.455 | 72.823 | 13.152 | 13.515 | 11.677 |

$1.0 < NA \leqq 1.1$
$75 < T \leqq 85$

16/34

| Case | 8-11 | 8-12 | 8-13 | 8-14 | 8-15 |
|---|---|---|---|---|---|
| $n_{10}$ | 1.6987335 | 1.6895310 | 1.6997408 | 1.6947661 | 1.6915645 |
| $k_{10}$ | 0.0728489 | 0.0798395 | 0.0628030 | 0.0583146 | 0.0796327 |
| $d_{10}$ (nm) | 224.384 | 207.056 | 221.189 | 215.749 | 269.434 |
| $n_{20}$ | 1.6635130 | 1.6873868 | 1.6972371 | 1.6943199 | 1.7013553 |
| $k_{20}$ | 0.2423517 | 0.2464201 | 0.1976117 | 0.1671130 | 0.3520060 |
| $d_{20}$ (nm) | 141.699 | 160.447 | 197.186 | 258.789 | 90.540 |
| When $n_1 \geqq n_{10}$, $n_{1m}$ = | 0.0550525 | 0.0211743 | 0.0680066 | 0.0840710 | 0.0339661 |
| When $n_1 < n_{10}$, $n_{1m}$ = | 0.0214722 | 0.0563281 | 0.0446484 | 0.0653711 | 0.0319580 |
| When $k_1 \geqq k_{10}$, $k_{1m}$ = | 0.0399634 | 0.0394690 | 0.0462439 | 0.0552136 | 0.0498462 |
| When $k_1 < k_{10}$, $k_{1m}$ = | 0.0230286 | 0.0247534 | 0.0358582 | 0.0373328 | 0.0319092 |
| When $d_1 \geqq d_{10}$, $d_{1m}$ (nm) = | ∞ | 18.382 | ∞ | ∞ | 29.764 |
| When $d_1 < d_{10}$, $d_{1m}$ (nm) = | 12.181 | 26.345 | 75.416 | 56.560 | 16.533 |
| When $n_2 \geqq n_{20}$, $n_{2m}$ = | 0.0460742 | 0.1451038 | 0.1164050 | 0.2251794 | 0.2068530 |
| When $n_2 < n_{20}$, $n_{2m}$ = | 0.0736353 | 0.0531665 | 0.0615222 | 0.1544678 | 0.0982214 |
| When $k_2 \geqq k_{20}$, $k_{2m}$ = | 0.0651685 | 0.0979858 | 0.0980493 | 0.1211584 | 0.1840808 |
| When $k_2 < k_{20}$, $k_{2m}$ = | 0.0709375 | 0.0696692 | 0.0675049 | 0.0632251 | 0.1287793 |
| When $d_2 \geqq d_{20}$, $d_{2m}$ (nm) = | 17.326 | ∞ | ∞ | ∞ | ∞ |
| When $d_2 < d_{20}$, $d_{2m}$ (nm) = | 17.676 | 13.280 | 25.586 | 81.223 | 11.833 |

$1.0 < NA \leqq 1.1$
$75 < T \leqq 85$

| Case | 8-16 | 8-17 |
|---|---|---|
| $n_{10}$ | 1.6950499 | 1.6956172 |
| $k_{10}$ | 0.0706693 | 0.0541668 |
| $d_{10}$ (nm) | 266.123 | 274.905 |
| $n_{20}$ | 1.6983222 | 1.6860233 |
| $k_{20}$ | 0.2573177 | 0.1712439 |
| $d_{20}$ (nm) | 152.851 | 257.337 |
| When $n_1 \geqq n_{10}$, $n_{1m}$ = | 0.0524487 | 0.0590308 |
| When $n_1 < n_{10}$, $n_{1m}$ = | 0.0375452 | 0.0580872 |
| When $k_1 \geqq k_{10}$, $k_{1m}$ = | 0.0517285 | 0.0672278 |
| When $k_1 < k_{10}$, $k_{1m}$ = | 0.0352881 | 0.0380591 |
| When $d_1 \geqq d_{10}$, $d_{1m}$ (nm) = | ∞ | ∞ |
| When $d_1 < d_{10}$, $d_{1m}$ (nm) = | 33.771 | 112.404 |

-continued

| | | |
|---|---|---|
| When $n_2 \geqq n_{20}$, $n_{2m}$ = | 0.2704944 | 0.2806836 |
| When $n_2 < n_{20}$, $n_{2m}$ = | 0.2755872 | 0.2222266 |
| When $k_2 \geqq k_{20}$, $k_{2m}$ = | 0.2121143 | 0.1985229 |
| When $k_2 < k_{20}$, $k_{2m}$ = | 0.1128918 | 0.0743774 |
| When $d_2 \geqq d_{20}$, $d_{2m}$ (nm) = | ∞ | ∞ |
| When $d_2 < d_{20}$, $d_{2m}$ (nm) = | 65.292 | 85.089 |

$1.0 < NA \leqq 1.1$
$85 < T \leqq 95$

17/34

| Case | 9-01 | 9-02 | 9-03 | 9-04 | 9-05 |
|---|---|---|---|---|---|
| $n_{10}$ | 1.8980776 | 1.9078109 | 1.8887573 | 1.8863613 | 1.7283563 |
| $k_{10}$ | 0.2063094 | 0.1489982 | 0.1336370 | 0.0963846 | 0.0991844 |
| $d_{10}$ (nm) | 23.234 | 16.351 | 13.295 | 12.395 | 92.796 |
| $n_{20}$ | 1.8542997 | 1.7325536 | 1.6803356 | 1.7165602 | 1.6494143 |
| $k_{20}$ | 0.6486453 | 0.4126982 | 0.3065809 | 0.2596921 | 0.2975623 |
| $d_{20}$ (nm) | 73.732 | 141.036 | 205.639 | 258.147 | 140.358 |
| When $n_1 \geqq n_{10}$, $n_{1m}$ = | 0.0711987 | 0.0870154 | 0.1059106 | 0.1162891 | 0.0375220 |
| When $n_1 < n_{10}$, $n_{1m}$ = | 0.0384509 | 0.0501709 | 0.0716760 | 0.0832544 | 0.0056213 |
| When $k_1 \geqq k_{10}$, $k_{1m}$ = | 0.0445569 | 0.0643555 | 0.0939661 | 0.1053198 | 0.0189441 |
| When $k_1 < k_{10}$, $k_{1m}$ = | 0.0730103 | 0.0941223 | 0.1072681 | 0.0963846 | 0.0324854 |
| When $d_1 \geqq d_{10}$, $d_{1m}$ (nm) = | 5.225 | 5.526 | 6.240 | 7.169 | 10.895 |
| When $d_1 < d_{10}$, $d_{1m}$ (nm) = | 2.347 | 2.839 | 3.908 | 4.670 | 1.261 |
| When $n_2 \geqq n_{20}$, $n_{2m}$ = | 0.1402551 | 0.1159338 | 0.1109766 | 0.1105359 | 0.0179150 |
| When $n_2 < n_{20}$, $n_{2m}$ = | 0.1828406 | 0.1543176 | 0.1513220 | 0.1539343 | 0.0865198 |
| When $k_2 \geqq k_{20}$, $k_{2m}$ = | 0.2259802 | 0.1235034 | 0.1018750 | 0.1065100 | 0.0230737 |
| When $k_2 < k_{20}$, $k_{2m}$ = | 0.1284644 | 0.1059631 | 0.0936096 | 0.0878577 | 0.0660486 |
| When $d_2 \geqq d_{20}$, $d_{2m}$ (nm) = | ∞ | ∞ | ∞ | ∞ | 14.635 |
| When $d_2 < d_{20}$, $d_{2m}$ (nm) = | 14.747 | 31.656 | 77.584 | 118.336 | 14.252 |

$1.0 < NA \leqq 1.1$
$85 < T \leqq 95$

| Case | 9-06 | 9-07 | 9-08 | 9-09 | 9-10 |
|---|---|---|---|---|---|
| $n_{10}$ | 1.7247011 | 1.7288637 | 1.7100270 | 1.7129082 | 1.6894084 |
| $k_{10}$ | 0.0825295 | 0.0727638 | 0.0697395 | 0.0648353 | 0.0825836 |
| $d_{10}$ (nm) | 92.134 | 92.409 | 160.277 | 160.281 | 208.412 |
| $n_{20}$ | 1.6784446 | 1.7181265 | 1.6932584 | 1.7202855 | 1.6911413 |
| $k_{20}$ | 0.2345042 | 0.1997137 | 0.2147807 | 0.1822190 | 0.2636300 |
| $d_{20}$ (nm) | 196.220 | 247.866 | 190.362 | 243.795 | 148.443 |
| When $n_1 \geqq n_{10}$, $n_{1m}$ = | 0.0458069 | 0.0520715 | 0.0445874 | 0.0530676 | 0.0168896 |
| When $n_1 < n_{10}$, $n_{1m}$ = | 0.0231628 | 0.0254517 | 0.0291443 | 0.0189783 | 0.0564331 |
| When $k_1 \geqq k_{10}$, $k_{1m}$ = | 0.0487341 | 0.0524194 | 0.0390308 | 0.0374463 | 0.0317554 |
| When $k_1 < k_{10}$, $k_{1m}$ = | 0.0471680 | 0.0474573 | 0.0341357 | 0.0249304 | 0.0174866 |
| When $d_1 \geqq d_{10}$, $d_{1m}$ (nm) = | 16.768 | 28.342 | ∞ | ∞ | 8.653 |
| When $d_1 < d_{10}$, $d_{1m}$ (nm) = | 5.875 | 6.859 | 8.481 | 5.666 | 22.933 |
| When $n_2 \geqq n_{20}$, $n_{2m}$ = | 0.0654785 | 0.0851550 | 0.0721350 | 0.0992358 | 0.1489941 |
| When $n_2 < n_{20}$, $n_{2m}$ = | 0.0999084 | 0.1129846 | 0.0702051 | 0.1184961 | 0.0323828 |
| When $k_2 \geqq k_{20}$, $k_{2m}$ = | 0.0550916 | 0.0742688 | 0.0299036 | 0.0348145 | 0.0701428 |
| When $k_2 < k_{20}$, $k_{2m}$ = | 0.0621350 | 0.0605774 | 0.0564990 | 0.0562878 | 0.0653857 |
| When $d_2 \geqq d_{20}$, $d_{2m}$ (nm) = | ∞ | ∞ | 30.126 | ∞ | ∞ |
| When $d_2 < d_{20}$, $d_{2m}$ (nm) = | 23.369 | 34.214 | 13.997 | 12.255 | 9.630 |

$1.0 < NA \leqq 1.1$
$85 < T \leqq 95$

18/34

| Case | 9-11 | 9-12 | 9-13 | 9-14 | 9-15 |
|---|---|---|---|---|---|
| $n_{10}$ | 1.6987536 | 1.6951804 | 1.6947043 | 1.6953534 | 1.6955317 |
| $k_{10}$ | 0.0651428 | 0.0592977 | 0.0728049 | 0.0654850 | 0.0555447 |
| $d_{10}$ (nm) | 220.679 | 216.421 | 267.049 | 264.587 | 274.968 |
| $n_{20}$ | 1.6918669 | 1.6944812 | 1.7045529 | 1.6939885 | 1.6840742 |
| $k_{20}$ | 0.2062686 | 0.1733276 | 0.2758626 | 0.2171518 | 0.1777252 |
| $d_{20}$ (nm) | 189.869 | 249.686 | 142.407 | 204.731 | 249.243 |
| When $n_1 \geqq n_{10}$, $n_{1m}$ = | 0.0676538 | 0.0804553 | 0.0514111 | 0.0772083 | 0.0594299 |
| When $n_1 < n_{10}$, $n_{1m}$ = | 0.0423462 | 0.0620581 | 0.0375159 | 0.0498364 | 0.0587244 |

-continued

| | | | | | |
|---|---|---|---|---|---|
| When $k_1 \geqq k_{10}$, $k_{1m}$ = | 0.0442505 | 0.0538220 | 0.0506982 | 0.0550830 | 0.0658191 |
| When $k_1 < k_{10}$, $k_{1m}$ = | 0.0341040 | 0.0375916 | 0.0340894 | 0.0384644 | 0.0372644 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 72.990 | 57.440 | 26.805 | 108.871 | 112.765 |
| When $n_2 \geqq n_{20}$, $n_{2m}$ = | 0.1307581 | 0.2319055 | 0.2365918 | 0.3979211 | 0.2850439 |
| When $n_2 < n_{20}$, $n_{2m}$ = | 0.0673376 | 0.1520984 | 0.2827087 | 0.2359326 | 0.2177148 |
| When $k_2 \geqq k_{20}$, $k_{2m}$ = | 0.0940100 | 0.1156787 | 0.2079443 | 0.2187415 | 0.1980774 |
| When $k_2 < k_{20}$, $k_{2m}$ = | 0.0673755 | 0.0629675 | 0.1183691 | 0.0982336 | 0.0755945 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 25.557 | 76.954 | 64.091 | 75.273 | 81.971 |

$1.0 < NA \leqq 1.1$
$95 < T \leqq 105$

| Case | 10-01 | 10-02 | 10-03 | 10-04 | 10-05 |
|---|---|---|---|---|---|
| $n_{10}$ | 1.9059589 | 1.9224042 | 1.8961620 | 1.8922593 | 1.7254583 |
| $k_{10}$ | 0.2274286 | 0.1550778 | 0.1385328 | 0.1041345 | 0.0865833 |
| $d_{10}$ (nm) | 23.462 | 16.599 | 13.501 | 12.282 | 91.876 |
| $n_{20}$ | 1.8553331 | 1.7510181 | 1.6829419 | 1.7097147 | 1.6727903 |
| $k_{20}$ | 0.7355051 | 0.4490690 | 0.3248659 | 0.2697702 | 0.2465542 |
| $d_{20}$ (nm) | 66.090 | 131.424 | 196.767 | 251.116 | 188.519 |
| When $n_1 \geqq n_{10}$, $n_{1m}$ = | 0.0671912 | 0.0841919 | 0.1023767 | 0.1153796 | 0.0426331 |
| When $n_1 < n_{10}$, $n_{1m}$ = | 0.0345654 | 0.0474304 | 0.0675305 | 0.0814563 | 0.0184045 |
| When $k_1 \geqq k_{10}$, $k_{1m}$ = | 0.0380615 | 0.0598425 | 0.0894568 | 0.1045068 | 0.0426917 |
| When $k_1 < k_{10}$, $k_{1m}$ = | 0.0683374 | 0.0902014 | 0.1054456 | 0.1041345 | 0.0441687 |
| When $d_1 \geqq d_{10}$, $d_{1m}$ (nm) = | 4.558 | 5.118 | 5.874 | 6.783 | 14.297 |
| When $d_1 < d_{10}$, $d_{1m}$ (nm) = | 1.985 | 2.531 | 3.589 | 4.355 | 4.476 |
| When $n_2 \geqq n_{20}$, $n_{2m}$ = | 0.1216980 | 0.1117603 | 0.1100940 | 0.1104114 | 0.0579919 |
| When $n_2 < n_{20}$, $n_{2m}$ = | 0.1802991 | 0.1554016 | 0.1498889 | 0.1534180 | 0.0956348 |
| When $k_2 \geqq k_{20}$, $k_{2m}$ = | 0.2165979 | 0.1264526 | 0.1015808 | 0.1042908 | 0.0462366 |
| When $k_2 < k_{20}$, $k_{2m}$ = | 0.1276270 | 0.1054065 | 0.0937561 | 0.0879675 | 0.0605090 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 11.858 | 29.189 | 73.755 | 91.689 | 21.669 |

$1.0 < NA \leqq 1.1$
$95 < T \leqq 105$

| Case | 10-06 | 10-07 | 10-08 | 10-09 | 10-10 |
|---|---|---|---|---|---|
| | | | | | 19/34 |
| $n_{10}$ | 1.7286512 | 1.7096319 | 1.7125109 | 1.6891198 | 1.6979687 |
| $k_{10}$ | 0.0752622 | 0.0728333 | 0.0665034 | 0.0853163 | 0.0677690 |
| $d_{10}$ (nm) | 92.185 | 159.923 | 159.852 | 208.173 | 220.140 |
| $n_{20}$ | 1.7137581 | 1.6877059 | 1.7181911 | 1.6918411 | 1.6871092 |
| $k_{20}$ | 0.2076205 | 0.2252670 | 0.1890952 | 0.2826173 | 0.2165239 |
| $d_{20}$ (nm) | 240.302 | 182.766 | 235.934 | 141.112 | 182.186 |
| When $n_1 \geqq n_{10}$, $n_{1m}$ = | 0.0500330 | 0.0406897 | 0.0503772 | 0.0132690 | 0.0644641 |
| When $n_1 < n_{10}$, $n_{1m}$ = | 0.0231873 | 0.0169287 | 0.0155139 | 0.0507471 | 0.0375525 |
| When $k_1 \geqq k_{10}$, $k_{1m}$ = | 0.0495398 | 0.0307520 | 0.0335327 | 0.0250305 | 0.0414893 |
| When $k_1 < k_{10}$, $k_{1m}$ = | 0.0465039 | 0.0291895 | 0.0230286 | 0.0142859 | 0.0317957 |
| When $d_1 \geqq d_{10}$, $d_{1m}$ (nm) = | 22.149 | ∞ | ∞ | 5.803 | ∞ |
| When $d_1 < d_{10}$, $d_{1m}$ (nm) = | 6.093 | 5.010 | 4.544 | 20.171 | 66.095 |
| When $n_2 \geqq n_{20}$, $n_{2m}$ = | 0.0807422 | 0.0673730 | 0.0968713 | 0.1414526 | 0.1231934 |
| When $n_2 < n_{20}$, $n_{2m}$ = | 0.1109875 | 0.0569836 | 0.1140344 | 0.0176575 | 0.0690576 |
| When $k_2 \geqq k_{20}$, $k_{2m}$ = | 0.0671313 | 0.0201965 | 0.0272949 | 0.0516113 | 0.0909106 |
| When $k_2 < k_{20}$, $k_{2m}$ = | 0.0601733 | 0.0546924 | 0.0555640 | 0.0644128 | 0.0681702 |
| When $d_2 \geqq d_{20}$, $d_{2m}$ (nm) = | ∞ | 22.678 | ∞ | ∞ | ∞ |
| When $d_2 < d_{20}$, $d_{2m}$ (nm) = | 33.234 | 12.401 | 9.751 | 3.545 | 24.752 |

$1.0 < NA \leqq 1.1$
$95 < T \leqq 105$

| Case | 10-11 | 10-12 | 10-13 |
|---|---|---|---|
| $n_{10}$ | 1.6953920 | 1.6945041 | 1.6957904 |
| $k_{10}$ | 0.0607310 | 0.0754015 | 0.0613078 |
| $d_{10}$ (nm) | 216.694 | 266.879 | 263.111 |
| $n_{20}$ | 1.6943518 | 1.7053190 | 1.6921380 |
| $k_{20}$ | 0.1805507 | 0.2962459 | 0.1886276 |
| $d_{20}$ (nm) | 240.824 | 134.581 | 257.166 |
| When $n_1 \geqq n_{10}$, $n_{1m}$ = | 0.0773376 | 0.0489661 | 0.0744116 |
| When $n_1 < n_{10}$, $n_{1m}$ = | 0.0532397 | 0.0362244 | 0.0544775 |
| When $k_1 \geqq k_{10}$, $k_{1m}$ = | 0.0520667 | 0.0490686 | 0.0595886 |

-continued

| | | | |
|---|---|---|---|
| When $k_1 < k_{10}$, $k_{1m}$ = | 0.0373279 | 0.0329797 | 0.0399255 |
| When $d_1 \geqq d_{10}$, $d_{1m}$ (nm) = | ∞ | ∞ | ∞ |
| When $d_1 < d_{10}$, $d_{1m}$ (nm) = | 56.748 | 22.698 | 144.280 |
| When $n_2 \geqq n_{20}$, $n_{2m}$ = | 0.2401196 | 0.2258960 | 0.3617542 |
| When $n_2 < n_{20}$, $n_{2m}$ = | 0.1505750 | 0.2863916 | 0.2146826 |
| When $k_2 \geqq k_{20}$, $k_{2m}$ = | 0.1118237 | 0.2042285 | 0.2258594 |
| When $k_2 < k_{20}$, $k_{2m}$ = | 0.0641272 | 0.1247363 | 0.0874829 |
| When $d_2 \geqq d_{20}$, $d_{2m}$ (nm) = | ∞ | ∞ | ∞ |
| When $d_2 < d_{20}$, $d_{2m}$ (nm) = | 74.466 | 22.579 | 121.018 |

$1.0 < NA \leqq 1.1$
$105 < T \leqq 115$

20/34

| Case | 11-01 | 11-02 | 11-03 | 11-04 | 11-05 |
|---|---|---|---|---|---|
| $n_{10}$ | 1.9374125 | 1.9018997 | 1.8965439 | 1.7253637 | 1.7289764 |
| $k_{10}$ | 0.1704110 | 0.1487976 | 0.1142225 | 0.0900184 | 0.0775142 |
| $d_{10}$ (nm) | 15.669 | 13.285 | 11.973 | 91.432 | 91.877 |
| $n_{20}$ | 1.7248980 | 1.6713435 | 1.6970963 | 1.6651786 | 1.7120256 |
| $k_{20}$ | 0.4663738 | 0.3352808 | 0.2748315 | 0.2549499 | 0.2134557 |
| $d_{20}$ (nm) | 126.299 | 189.496 | 244.759 | 180.505 | 231.728 |
| When $n_1 \geqq n_{10}$, $n_{1m}$ = | 0.0844495 | 0.1011877 | 0.1161206 | 0.0397363 | 0.0483887 |
| When $n_1 < n_{10}$, $n_{1m}$ = | 0.0440234 | 0.0656897 | 0.0810999 | 0.0155029 | 0.0208545 |
| When $k_1 \geqq k_{10}$, $k_{1m}$ = | 0.0577478 | 0.0888123 | 0.1065247 | 0.0388269 | 0.0469031 |
| When $k_1 < k_{10}$, $k_{1m}$ = | 0.0914417 | 0.1045447 | 0.1142225 | 0.0417639 | 0.0449243 |
| When $d_1 \geqq d_{10}$, $d_{1m}$ (nm) = | 4.564 | 5.473 | 6.423 | 12.314 | 18.889 |
| When $d_1 < d_{10}$, $d_{1m}$ (nm) = | 2.111 | 3.313 | 4.088 | 3.639 | 5.309 |
| When $n_2 \geqq n_{20}$, $n_{2m}$ = | 0.1026855 | 0.1066711 | 0.1092859 | 0.0538538 | 0.0798657 |
| When $n_2 < n_{20}$, $n_{2m}$ = | 0.1573315 | 0.1496814 | 0.1507874 | 0.0957056 | 0.1124231 |
| When $k_2 \geqq k_{20}$, $k_{2m}$ = | 0.1109265 | 0.0973877 | 0.1006897 | 0.0382251 | 0.0609106 |
| When $k_2 < k_{20}$, $k_{2m}$ = | 0.0995313 | 0.0917126 | 0.0869214 | 0.0582397 | 0.0599487 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 32.204 | 71.551 | 94.669 | 21.979 | 35.901 |

$1.0 < NA \leqq 1.1$
$105 < T \leqq 115$

| Case | 11-06 | 11-07 | 11-08 | 11-09 | 11-10 |
|---|---|---|---|---|---|
| $n_{10}$ | 1.7092919 | 1.7124011 | 1.6891266 | 1.6977739 | 1.6952347 |
| $k_{10}$ | 0.0753499 | 0.0683625 | 0.0867081 | 0.0698574 | 0.0623107 |
| $d_{10}$ (nm) | 159.318 | 159.365 | 206.818 | 219.869 | 216.627 |
| $n_{20}$ | 1.6830351 | 1.7169838 | 1.6858604 | 1.6842611 | 1.6937881 |
| $k_{20}$ | 0.2331189 | 0.1941891 | 0.2953498 | 0.2258219 | 0.1869159 |
| $d_{20}$ (nm) | 174.468 | 227.412 | 138.155 | 173.345 | 231.738 |
| When $n_1 \geqq n_{10}$, $n_{1m}$ = | 0.0373157 | 0.0484546 | 0.0121899 | 0.0603870 | 0.0758545 |
| When $n_1 < n_{10}$, $n_{1m}$ = | 0.0105005 | 0.0089343 | 0.0409204 | 0.0315625 | 0.0474512 |
| When $k_1 \geqq k_{10}$, $k_{1m}$ = | 0.0240833 | 0.0270752 | 0.0251843 | 0.0382471 | 0.0501941 |
| When $k_1 < k_{10}$, $k_{1m}$ = | 0.0246826 | 0.0176978 | 0.0193188 | 0.0296948 | 0.0358765 |
| When $d_1 \geqq d_{10}$, $d_{1m}$ (nm) = | 22.059 | ∞ | 5.261 | ∞ | ∞ |
| When $d_1 < d_{10}$, $d_{1m}$ (nm) = | 3.023 | 2.568 | 16.255 | 17.363 | 54.608 |
| When $n_2 \geqq n_{20}$, $n_{2m}$ = | 0.0659399 | 0.0944360 | 0.1154346 | 0.0831506 | 0.2493335 |
| When $n_2 < n_{20}$, $n_{2m}$ = | 0.0371252 | 0.1164661 | 0.0185925 | 0.0632410 | 0.1310596 |
| When $k_2 \geqq k_{20}$, $k_{2m}$ = | 0.0133044 | 0.0180847 | 0.0609753 | 0.0891687 | 0.1103210 |
| When $k_2 < k_{20}$, $k_{2m}$ = | 0.0529578 | 0.0555518 | 0.0785950 | 0.0680151 | 0.0652307 |
| When $d_2 \geqq d_{20}$, $d_{2m}$ (nm) = | 18.030 | ∞ | ∞ | ∞ | ∞ |
| When $d_2 < d_{20}$, $d_{2m}$ (nm) = | 8.732 | 5.378 | 3.627 | 23.361 | 52.894 |

$1.0 < NA \leqq 1.1$
$105 < T \leqq 115$

21/34

| Case | 11-11 | 11-12 |
|---|---|---|
| $n_{10}$ | 1.6944699 | 1.6958800 |
| $k_{10}$ | 0.0775933 | 0.0528961 |
| $d_{10}$ (nm) | 265.762 | 273.317 |
| $n_{20}$ | 1.6967397 | 1.6915993 |
| $k_{20}$ | 0.3115846 | 0.1649138 |

-continued

| | | |
|---|---|---|
| $d_{20}$ (nm) | 129.093 | 288.010 |
| When $n_1 \geqq n_{10}$, $n_{1m}$ = | 0.0466345 | 0.0703040 |
| When $n_1 < n_{10}$, $n_{1m}$ = | 0.0341467 | 0.0549121 |
| When $k_1 \geqq k_{10}$, $k_{1m}$ = | 0.0473621 | 0.0679175 |
| When $k_1 < k_{10}$, $k_{1m}$ = | 0.0320862 | 0.0389246 |
| When $d_1 \geqq d_{10}$, $d_{1m}$ (nm) = | ∞ | ∞ |
| When $d_1 < d_{10}$, $d_{1m}$ (nm) = | 20.031 | 180.011 |
| When $n_2 \geqq n_{20}$, $n_{2m}$ = | 0.2202100 | 0.2749866 |
| When $n_2 < n_{20}$, $n_{2m}$ = | 0.1339246 | 0.2056653 |
| When $k_2 \geqq k_{20}$, $k_{2m}$ = | 0.2018127 | 0.2031665 |
| When $k_2 < k_{20}$, $k_{2m}$ = | 0.1244751 | 0.0729272 |
| When $d_2 \geqq d_{20}$, $d_{2m}$ (nm) = | ∞ | ∞ |
| When $d_2 < d_{20}$, $d_{2m}$ (nm) = | 18.618 | 105.982 |

$1.0 < NA \leqq 1.1$
$115 < T \leqq 125$

| Case | 12-01 | 12-02 | 12-03 | 12-04 | 12-05 |
|---|---|---|---|---|---|
| $n_{10}$ | 1.9729972 | 1.9456051 | 1.9005953 | 1.8972956 | 1.7255330 |
| $k_{10}$ | 0.2768129 | 0.1915481 | 0.1591490 | 0.1121564 | 0.0922673 |
| $d_{10}$ (nm) | 17.524 | 14.612 | 13.217 | 12.290 | 91.102 |
| $n_{20}$ | 1.6663342 | 1.6781309 | 1.6561276 | 1.7051607 | 1.6614760 |
| $k_{20}$ | 0.7544777 | 0.4665054 | 0.3399716 | 0.2822449 | 0.2607016 |
| $d_{20}$ (nm) | 64.842 | 122.845 | 181.593 | 233.141 | 171.070 |
| When $n_1 \geqq n_{10}$, $n_{1m}$ = | 0.0730835 | 0.0862573 | 0.1002148 | 0.1132361 | 0.0385791 |
| When $n_1 < n_{10}$, $n_{1m}$ = | 0.0179053 | 0.0397437 | 0.0650696 | 0.0790137 | 0.0152405 |
| When $k_1 \geqq k_{10}$, $k_{1m}$ = | 0.0247314 | 0.0556897 | 0.0891748 | 0.1035071 | 0.0386047 |
| When $k_1 < k_{10}$, $k_{1m}$ = | 0.0592480 | 0.0960681 | 0.1016016 | 0.1121564 | 0.0414185 |
| When $d_1 \geqq d_{10}$, $d_{1m}$ (nm) = | 2.961 | 4.145 | 5.266 | 6.373 | 11.328 |
| When $d_1 < d_{10}$, $d_{1m}$ (nm) = | 0.729 | 1.739 | 3.220 | 4.072 | 3.483 |
| When $n_2 \geqq n_{20}$, $n_{2m}$ = | 0.0585083 | 0.0918945 | 0.1020654 | 0.1070825 | 0.0573608 |
| When $n_2 < n_{20}$, $n_{2m}$ = | 0.1382239 | 0.1611719 | 0.1504858 | 0.1560303 | 0.0993860 |
| When $k_2 \geqq k_{20}$, $k_{2m}$ = | 0.0616943 | 0.0914514 | 0.0935474 | 0.1016602 | 0.0359058 |
| When $k_2 < k_{20}$, $k_{2m}$ = | 0.0899731 | 0.0957678 | 0.0910632 | 0.0886353 | 0.0590588 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 11.368 | 38.474 | 71.143 | 98.322 | 22.477 |

$1.0 < NA \leqq 1.1$
$115 < T \leqq 125$

| Case | 12-06 | 12-07 | 12-08 | 12-09 | 12-10 |
|---|---|---|---|---|---|
| $n_{10}$ | 1.7304964 | 1.7097843 | 1.7129025 | 1.7059734 | 1.6983193 |
| $k_{10}$ | 0.0792452 | 0.0770210 | 0.0702809 | 0.0642321 | 0.0712405 |
| $d_{10}$ (nm) | 91.709 | 159.025 | 159.249 | 159.600 | 220.143 |
| $n_{20}$ | 1.7154952 | 1.6841289 | 1.7178163 | 1.6898319 | 1.6860819 |
| $k_{20}$ | 0.2175998 | 0.2392980 | 0.1978132 | 0.1677546 | 0.2336364 |
| $d_{20}$ (nm) | 221.560 | 164.463 | 217.770 | 279.371 | 162.903 |
| When $n_1 \geqq n_{10}$, $n_{1m}$ = | 0.0478430 | 0.0358972 | 0.0479553 | 0.0552173 | 0.0579871 |
| When $n_1 < n_{10}$, $n_{1m}$ = | 0.0188013 | 0.0078589 | 0.0015247 | 0.0299426 | 0.0264917 |
| When $k_1 \geqq k_{10}$, $k_{1m}$ = | 0.0447290 | 0.0214099 | 0.0152087 | 0.0363110 | 0.0340515 |
| When $k_1 < k_{10}$, $k_{1m}$ = | 0.0430518 | 0.0224402 | 0.0060950 | 0.0278772 | 0.0279150 |
| When $d_1 \geqq d_{10}$, $d_{1m}$ (nm) = | 17.323 | 17.500 | ∞ | ∞ | ∞ |
| When $d_1 < d_{10}$, $d_{1m}$ (nm) = | 4.626 | 2.208 | 0.436 | 70.406 | 11.462 |
| When $n_2 \geqq n_{20}$, $n_{2m}$ = | 0.0842468 | 0.0631323 | 0.0959070 | 0.1382263 | 0.0682983 |
| When $n_2 < n_{20}$, $n_{2m}$ = | 0.1172522 | 0.0247583 | 0.0076807 | 0.1296057 | 0.0493762 |
| When $k_2 \geqq k_{20}$, $k_{2m}$ = | 0.0583887 | 0.0111536 | 0.0046545 | 0.0357849 | 0.0882227 |
| When $k_2 < k_{20}$, $k_{2m}$ = | 0.0618323 | 0.0547961 | 0.0579968 | 0.0540967 | 0.0613330 |
| When $d_2 \geqq d_{20}$, $d_{2m}$ (nm) = | ∞ | 18.428 | ∞ | ∞ | ∞ |
| When $d_2 < d_{20}$, $d_{2m}$ (nm) = | 65.102 | 5.436 | 0.894 | 57.180 | 18.177 |

$1.0 < NA \leqq 1.1$
$115 < T \leqq 125$

| Case | 12-11 | 12-12 | 12-13 |
|---|---|---|---|
| $n_{10}$ | 1.6946755 | 1.6955425 | 1.6956989 |
| $k_{10}$ | 0.0639503 | 0.0535782 | 0.0539885 |
| $d_{10}$ (nm) | 216.344 | 213.248 | 272.929 |
| $n_{20}$ | 1.6931001 | 1.6937343 | 1.6917939 |
| $k_{20}$ | 0.1919118 | 0.1415462 | 0.1683287 |
| $d_{20}$ (nm) | 222.331 | 338.947 | 278.327 |

-continued

| | | | |
|---|---|---|---|
| When $n_1 \geqq n_{10}$, $n_{1m}$ = | 0.0359900 | 0.0869177 | 0.0714185 |
| When $n_1 < n_{10}$, $n_{1m}$ = | 0.0437024 | 0.0750378 | 0.0538635 |
| When $k_1 \geqq k_{10}$, $k_{1m}$ = | 0.0485352 | 0.0653857 | 0.0669263 |
| When $k_1 < k_{10}$, $k_{1m}$ = | 0.0346851 | 0.0370959 | 0.0388916 |
| When $d_1 \geqq d_{10}$, $d_{1m}$ (nm) = | ∞ | ∞ | ∞ |
| When $d_1 < d_{10}$, $d_{1m}$ (nm) = | 51.791 | 132.178 | 120.018 |
| When $n_2 \geqq n_{20}$, $n_{2m}$ = | 0.1409949 | 0.2291467 | 0.2819873 |
| When $n_2 < n_{20}$, $n_{2m}$ = | 0.1060889 | 0.1273120 | 0.2087952 |
| When $k_2 \geqq k_{20}$, $k_{2m}$ = | 0.1109827 | 0.1363989 | 0.2069556 |
| When $k_2 < k_{20}$, $k_{2m}$ = | 0.0639978 | 0.0571204 | 0.0743250 |
| When $d_2 \geqq d_{20}$, $d_{2m}$ (nm) = | ∞ | ∞ | ∞ |
| When $d_2 < d_{20}$, $d_{2m}$ (nm) = | 35.182 | 107.512 | 95.030 |

$1.0 < NA \leqq 1.1$
$125 < T \leqq 135$

23/34

| Case | 13-01 | 13-02 | 13-03 | 13-04 | 13-05 |
|---|---|---|---|---|---|
| $n_{10}$ | 1.8993435 | 1.9080238 | 1.7276770 | 1.7338076 | 1.7236449 |
| $k_{10}$ | 0.1093669 | 0.0778133 | 0.0934541 | 0.0808022 | 0.0736298 |
| $d_{10}$ (nm) | 12.638 | 11.189 | 91.210 | 91.869 | 92.640 |
| $n_{20}$ | 1.7156529 | 1.7380285 | 1.6689251 | 1.7256843 | 1.7007078 |
| $k_{20}$ | 0.2903108 | 0.2474831 | 0.2700133 | 0.2232282 | 0.1887087 |
| $d_{20}$ (nm) | 220.942 | 275.866 | 159.348 | 209.944 | 271.148 |
| When $n_1 \geqq n_{10}$, $n_{1m}$ = | 0.1116663 | 0.1266492 | 0.0395422 | 0.0484558 | 0.0522583 |
| When $n_1 < n_{10}$, $n_{1m}$ = | 0.0773999 | 0.0872168 | 0.0167297 | 0.0166711 | 0.0180103 |
| When $k_1 \geqq k_{10}$, $k_{1m}$ = | 0.1011877 | 0.1103088 | 0.0409973 | 0.0422058 | 0.0417761 |
| When $k_1 < k_{10}$, $k_{1m}$ = | 0.1093669 | 0.0778133 | 0.0410583 | 0.0409119 | 0.0443518 |
| When $d_1 \geqq d_{10}$, $d_{1m}$ (nm) = | 6.392 | 6.737 | 11.272 | 16.895 | 38.105 |
| When $d_1 < d_{10}$, $d_{1m}$ (nm) = | 4.063 | 4.214 | 3.733 | 3.952 | 5.177 |
| When $n_2 \geqq n_{20}$, $n_{2m}$ = | 0.1069678 | 0.1140796 | 0.0675769 | 0.0924780 | 0.1134937 |
| When $n_2 < n_{20}$, $n_{2m}$ = | 0.1606714 | 0.1563965 | 0.1033667 | 0.1197949 | 0.1230200 |
| When $k_2 \geqq k_{20}$, $k_{2m}$ = | 0.1040991 | 0.1083496 | 0.0397278 | 0.0600330 | 0.0739392 |
| When $k_2 < k_{20}$, $k_{2m}$ = | 0.0926990 | 0.0882825 | 0.0652539 | 0.0659766 | 0.0617065 |
| When $d_2 \geqq d_{20}$, $d_{2m}$ (nm) = | ∞ | ∞ | 29.488 | ∞ | ∞ |
| When $d_2 < d_{20}$, $d_{2m}$ (nm) = | 90.398 | 130.978 | 17.688 | 16.714 | 72.265 |

$1.0 < NA \leqq 1.1$
$125 < T \leqq 135$

| Case | 13-06 | 13-07 | 13-08 | 13-09 | 13-10 |
|---|---|---|---|---|---|
| $n_{10}$ | 1.7117973 | 1.7052523 | 1.6990979 | 1.6936455 | 1.6937228 |
| $k_{10}$ | 0.0782334 | 0.0648564 | 0.0723627 | 0.0657466 | 0.0602088 |
| $d_{10}$ (nm) | 159.412 | 160.141 | 220.761 | 215.539 | 212.854 |
| $n_{20}$ | 1.6949465 | 1.6847092 | 1.6931390 | 1.6916565 | 1.6917935 |
| $k_{20}$ | 0.2480962 | 0.1699839 | 0.2421156 | 0.1962143 | 0.1651159 |
| $d_{20}$ (nm) | 152.577 | 269.827 | 151.650 | 213.597 | 273.449 |
| When $n_1 \geqq n_{10}$, $n_{1m}$ = | 0.0367346 | 0.0551233 | 0.0594092 | 0.0311401 | 0.0698511 |
| When $n_1 < n_{10}$, $n_{1m}$ = | 0.0058984 | 0.0239478 | 0.0244397 | 0.0431714 | 0.0693030 |
| When $k_1 \geqq k_{10}$, $k_{1m}$ = | 0.0206287 | 0.0370862 | 0.0278687 | 0.0476123 | 0.0598901 |
| When $k_1 < k_{10}$, $k_{1m}$ = | 0.0197803 | 0.0307031 | 0.0272107 | 0.0341650 | 0.0364880 |
| When $d_1 \geqq d_{10}$, $d_{1m}$ (nm) = | 17.175 | ∞ | ∞ | ∞ | ∞ |
| When $d_1 < d_{10}$, $d_{1m}$ (nm) = | 1.642 | 10.322 | 10.135 | 48.593 | 59.568 |
| When $n_2 \geqq n_{20}$, $n_{2m}$ = | 0.0634509 | 0.0441370 | 0.0646301 | 0.1417163 | 0.2349500 |
| When $n_2 < n_{20}$, $n_{2m}$ = | 0.0185107 | 0.1268359 | 0.0304773 | 0.0878235 | 0.1413928 |
| When $k_2 \geqq k_{20}$, $k_{2m}$ = | 0.0106982 | 0.0374109 | 0.0871985 | 0.1142444 | 0.1311609 |
| When $k_2 < k_{20}$, $k_{2m}$ = | 0.0614368 | 0.0554883 | 0.0573535 | 0.0648792 | 0.0616370 |
| When $d_2 \geqq d_{20}$, $d_{2m}$ (nm) = | 20.867 | ∞ | ∞ | ∞ | ∞ |
| When $d_2 < d_{20}$, $d_{2m}$ (nm) = | 3.236 | 51.950 | 7.977 | 23.183 | 75.250 |

$1.0 < NA \leqq 1.1$
$125 < T \leqq 135$

24/34

| Case | 13-11 |
|---|---|
| $n_{10}$ | 1.6954835 |
| $k_{10}$ | 0.0549286 |

-continued

| | |
|---|---|
| $d_{10}$ (nm) | 272.481 |
| $n_{20}$ | 1.6920522 |
| $k_{20}$ | 0.1709440 |
| $d_{20}$ (nm) | 269.018 |
| When $n_1 \geqq n_{10}$, $n_{1m}$ = | 0.0732507 |
| When $n_1 < n_{10}$, $n_{1m}$ = | 0.0527002 |
| When $k_1 \geqq k_{10}$, $k_{1m}$ = | 0.0659570 |
| When $k_1 < k_{10}$, $k_{1m}$ = | 0.0396948 |
| When $d_1 \geqq d_{10}$, $d_{1m}$ (nm) = | ∞ |
| When $d_1 < d_{10}$, $d_{1m}$ (nm) = | 115.848 |
| When $n_2 \geqq n_{20}$, $n_{2m}$ = | 0.2876270 |
| When $n_2 < n_{20}$, $n_{2m}$ = | 0.2123071 |
| When $k_2 \geqq k_{20}$, $k_{2m}$ = | 0.2114355 |
| When $k_2 < k_{20}$, $k_{2m}$ = | 0.0767078 |
| When $d_2 \geqq d_{20}$, $d_{2m}$ (nm) = | ∞ |
| When $d_2 < d_{20}$, $d_{2m}$ (nm) = | 91.957 |

$1.0 < NA \leqq 1.1$
$135 < T \leqq 145$

| Case | 14-01 | 14-02 | 14-03 | 14-04 | 14-05 |
|---|---|---|---|---|---|
| $n_{10}$ | 1.9117383 | 1.8981283 | 1.9112943 | 1.7312914 | 1.7377087 |
| $k_{10}$ | 0.2302052 | 0.1070787 | 0.0649623 | 0.0945058 | 0.0827928 |
| $d_{10}$ (nm) | 15.980 | 13.384 | 12.163 | 91.544 | 92.151 |
| $n_{20}$ | 1.5953517 | 1.7296497 | 1.7710787 | 1.6819509 | 1.7372931 |
| $k_{20}$ | 0.4940730 | 0.3022759 | 0.2605013 | 0.2846338 | 0.2321492 |
| $d_{20}$ (nm) | 105.368 | 209.053 | 259.824 | 147.702 | 198.983 |
| When $n_1 \geqq n_{10}$, $n_{1m}$ = | 0.0781360 | 0.1075745 | 0.1181738 | 0.0408386 | 0.0487402 |
| When $n_1 < n_{10}$, $n_{1m}$ = | 0.0319177 | 0.0739868 | 0.0809961 | 0.0177930 | 0.0144653 |
| When $k_1 \geqq k_{10}$, $k_{1m}$ = | 0.0436902 | 0.0964282 | 0.0995044 | 0.0430859 | 0.0389966 |
| When $k_1 < k_{10}$, $k_{1m}$ = | 0.0819202 | 0.1070787 | 0.0649623 | 0.0421533 | 0.0388171 |
| When $d_1 \geqq d_{10}$, $d_{1m}$ (nm) = | 3.898 | 6.524 | 6.747 | 11.475 | 16.758 |
| When $d_1 < d_{10}$, $d_{1m}$ (nm) = | 1.590 | 4.095 | 4.185 | 3.862 | 3.299 |
| When $n_2 \geqq n_{20}$, $n_{2m}$ = | 0.0627563 | 0.1085400 | 0.1152271 | 0.0712305 | 0.0983997 |
| When $n_2 < n_{20}$, $n_{2m}$ = | 0.1565955 | 0.1599133 | 0.1627686 | 0.1038867 | 0.1174939 |
| When $k_2 \geqq k_{20}$, $k_{2m}$ = | 0.0810010 | 0.1085132 | 0.1160754 | 0.0447900 | 0.0617737 |
| When $k_2 < k_{20}$, $k_{2m}$ = | 0.1061572 | 0.0966113 | 0.0915161 | 0.0720264 | 0.0692358 |
| When $d_2 \geqq d_{20}$, $d_{2m}$ (nm) = | ∞ | ∞ | ∞ | 26.800 | ∞ |
| When $d_2 < d_{20}$, $d_{2m}$ (nm) = | 27.538 | 81.885 | 123.147 | 14.572 | 12.208 |

$1.0 < NA \leqq 1.1$
$135 < T \leqq 145$

25/34

| Case | 14-06 | 14-07 | 14-08 | 14-09 | 14-10 |
|---|---|---|---|---|---|
| $n_{10}$ | 1.7228203 | 1.7144911 | 1.7050797 | 1.6925663 | 1.6991742 |
| $k_{10}$ | 0.0749158 | 0.0796518 | 0.0657099 | 0.0675694 | 0.0739382 |
| $d_{10}$ (nm) | 92.874 | 160.015 | 160.534 | 214.049 | 220.936 |
| $n_{20}$ | 1.6951594 | 1.7090445 | 1.6817729 | 1.6900690 | 1.6992675 |
| $k_{20}$ | 0.1935801 | 0.2610315 | 0.1743389 | 0.2005073 | 0.2525134 |
| $d_{20}$ (nm) | 262.590 | 141.223 | 260.739 | 206.287 | 141.832 |
| When $n_1 \geqq n_{10}$, $n_{1m}$ = | 0.0517419 | 0.0380176 | 0.0550000 | 0.0300269 | 0.0099573 |
| When $n_1 < n_{10}$, $n_{1m}$ = | 0.0171826 | 0.0033435 | 0.0205762 | 0.0461255 | 0.0255640 |
| When $k_1 \geqq k_{10}$, $k_{1m}$ = | 0.0402747 | 0.0176941 | 0.0369080 | 0.0452966 | 0.0196790 |
| When $k_1 < k_{10}$, $k_{1m}$ = | 0.0440662 | 0.0145313 | 0.0289917 | 0.0339844 | 0.0188269 |
| When $d_1 \geqq d_{10}$, $d_{1m}$ (nm) = | 34.339 | 18.702 | ∞ | ∞ | ∞ |
| When $d_1 < d_{10}$, $d_{1m}$ (nm) = | 4.946 | 0.924 | 8.433 | 45.536 | 10.412 |
| When $n_2 \geqq n_{20}$, $n_{2m}$ = | 0.1089246 | 0.0638684 | 0.0364478 | 0.1628357 | 0.0605127 |
| When $n_2 < n_{20}$, $n_{2m}$ = | 0.1178552 | 0.0117664 | 0.1214197 | 0.0809363 | 0.0143933 |
| When $k_2 \geqq k_{20}$, $k_{2m}$ = | 0.0721460 | 0.0078210 | 0.0372485 | 0.1200403 | 0.0864673 |
| When $k_2 < k_{20}$, $k_{2m}$ = | 0.0629919 | 0.0624194 | 0.0562036 | 0.0635217 | 0.0436145 |
| When $d_2 \geqq d_{20}$, $d_{2m}$ (nm) = | ∞ | 21.562 | ∞ | ∞ | 25.612 |
| When $d_2 < d_{20}$, $d_{2m}$ (nm) = | 67.089 | 1.645 | 48.128 | 21.535 | 3.107 |

$1.0 < NA \leqq 1.1$
$135 < T \leqq 145$

| Case | 14-11 | 14-12 |
|---|---|---|
| $n_{10}$ | 1.6955775 | 1.6953573 |
| $k_{10}$ | 0.0548747 | 0.0556511 |
| $d_{10}$ (nm) | 213.500 | 272.231 |

-continued

| | | |
|---|---|---|
| $n_{20}$ | 1.6934763 | 1.6917841 |
| $k_{20}$ | 0.1457299 | 0.1736649 |
| $d_{20}$ (nm) | 319.743 | 260.476 |
| When $n_1 \geqq n_{10}$, $n_{1m}$ = | 0.0884082 | 0.0714819 |
| When $n_1 < n_{10}$, $n_{1m}$ = | 0.0760022 | 0.0518335 |
| When $k_1 \geqq k_{10}$, $k_{1m}$ = | 0.0634009 | 0.0652063 |
| When $k_1 < k_{10}$, $k_{1m}$ = | 0.0349133 | 0.0395740 |
| When $d_1 \geqq d_{10}$, $d_{1m}$ (nm) = | ∞ | ∞ |
| When $d_1 < d_{10}$, $d_{1m}$ (nm) = | 128.996 | 113.518 |
| When $n_2 \geqq n_{20}$, $n_{2m}$ = | 0.2359680 | 0.2895325 |
| When $n_2 < n_{20}$, $n_{2m}$ = | 0.1212769 | 0.2158911 |
| When $k_2 \geqq k_{20}$, $k_{2m}$ = | 0.1345789 | 0.2124060 |
| When $k_2 < k_{20}$, $k_{2m}$ = | 0.0582837 | 0.0793396 |
| When $d_2 \geqq d_{20}$, $d_{2m}$ (nm) = | ∞ | ∞ |
| When $d_2 < d_{20}$, $d_{2m}$ (nm) = | 94.216 | 91.728 |

$1.0 < NA \leqq 1.1$
$145 < T \leqq 155$

26/34

| Case | 15-01 | 15-02 | 15-03 | 15-04 | 15-05 |
|---|---|---|---|---|---|
| $n_{10}$ | 1.8842999 | 1.9020060 | 1.9176161 | 1.7347347 | 1.7402087 |
| $k_{10}$ | 0.1660082 | 0.1078045 | 0.0733974 | 0.0970436 | 0.0854812 |
| $d_{10}$ (nm) | 15.542 | 13.884 | 11.927 | 91.613 | 92.221 |
| $n_{20}$ | 1.6642092 | 1.7406676 | 1.7608162 | 1.6897518 | 1.7427648 |
| $k_{20}$ | 0.3881866 | 0.3180988 | 0.2687301 | 0.3028107 | 0.2437105 |
| $d_{20}$ (nm) | 148.595 | 199.025 | 254.127 | 138.166 | 190.058 |
| When $n_1 \geqq n_{10}$, $n_{1m}$ = | 0.0902356 | 0.1039673 | 0.1191321 | 0.0403284 | 0.0477295 |
| When $n_1 < n_{10}$, $n_{1m}$ = | 0.0608057 | 0.0712415 | 0.0806982 | 0.0168616 | 0.0123145 |
| When $k_1 \geqq k_{10}$, $k_{1m}$ = | 0.0796985 | 0.0922314 | 0.1003394 | 0.0414099 | 0.0352649 |
| When $k_1 < k_{10}$, $k_{1m}$ = | 0.0913672 | 0.1040308 | 0.0733974 | 0.0415906 | 0.0369519 |
| When $d_1 \geqq d_{10}$, $d_{1m}$ (nm) = | 5.569 | 6.401 | 6.478 | 11.141 | 16.036 |
| When $d_1 < d_{10}$, $d_{1m}$ (nm) = | 3.524 | 3.984 | 3.954 | 3.546 | 2.715 |
| When $n_2 \geqq n_{20}$, $n_{2m}$ = | 0.0975891 | 0.1093347 | 0.1166919 | 0.0721533 | 0.0993201 |
| When $n_2 < n_{20}$, $n_{2m}$ = | 0.1510022 | 0.1570532 | 0.1613013 | 0.0996582 | 0.1116626 |
| When $k_2 \geqq k_{20}$, $k_{2m}$ = | 0.1021082 | 0.1115308 | 0.1139111 | 0.0446167 | 0.0576575 |
| When $k_2 < k_{20}$, $k_{2m}$ = | 0.1042151 | 0.0981909 | 0.0922217 | 0.0735095 | 0.0699536 |
| When $d_2 \geqq d_{20}$, $d_{2m}$ (nm) = | ∞ | ∞ | ∞ | 23.089 | ∞ |
| When $d_2 < d_{20}$, $d_{2m}$ (nm) = | 36.178 | 75.817 | 118.717 | 13.060 | 9.872 |

$1.0 < NA \leqq 1.1$
$145 < T \leqq 155$

| Case | 15-06 | 15-07 | 15-08 | 15-09 | 15-10 |
|---|---|---|---|---|---|
| $n_{10}$ | 1.7232674 | 1.7163169 | 1.7052425 | 1.6979604 | 1.6919325 |
| $k_{10}$ | 0.0768076 | 0.0822242 | 0.0670983 | 0.0765182 | 0.0693101 |
| $d_{10}$ (nm) | 92.842 | 160.121 | 160.367 | 219.964 | 212.895 |
| $n_{20}$ | 1.6931409 | 1.7162208 | 1.6808978 | 1.6978817 | 1.6886216 |
| $k_{20}$ | 0.2010537 | 0.2770503 | 0.1806066 | 0.2641846 | 0.2063377 |
| $d_{20}$ (nm) | 254.319 | 132.120 | 252.327 | 134.431 | 199.162 |
| When $n_1 \geqq n_{10}$, $n_{1m}$ = | 0.0505859 | 0.0375513 | 0.0535669 | 0.0055981 | 0.0297021 |
| When $n_1 < n_{10}$, $n_{1m}$ = | 0.0155139 | 0.0002051 | 0.0181250 | 0.0232141 | 0.0494775 |
| When $k_1 \geqq k_{10}$, $k_{1m}$ = | 0.0378564 | 0.0051208 | 0.0335376 | 0.0146118 | 0.0441443 |
| When $k_1 < k_{10}$, $k_{1m}$ = | 0.0427637 | 0.0032507 | 0.0275378 | 0.0178613 | 0.0327478 |
| When $d_1 \geqq d_{10}$, $d_{1m}$ (nm) = | 33.581 | 19.229 | ∞ | 4.817 | ∞ |
| When $d_1 < d_{10}$, $d_{1m}$ (nm) = | 4.347 | 0.056 | 6.999 | 10.286 | 43.553 |
| When $n_2 \geqq n_{20}$, $n_{2m}$ = | 0.0760803 | 0.0599353 | 0.0299109 | 0.0539575 | 0.2378027 |
| When $n_2 < n_{20}$, $n_{2m}$ = | 0.1135510 | 0.0008435 | 0.1135376 | 0.0106042 | 0.0839368 |
| When $k_2 \geqq k_{20}$, $k_{2m}$ = | 0.0671289 | 0.0005420 | 0.0313745 | 0.0886438 | 0.1159473 |
| When $k_2 < k_{20}$, $k_{2m}$ = | 0.0634387 | 0.0680176 | 0.0561853 | 0.0306653 | 0.0671289 |
| When $d_2 \geqq d_{20}$, $d_{2m}$ (nm) = | ∞ | 12.405 | ∞ | 21.650 | ∞ |
| When $d_2 < d_{20}$, $d_{2m}$ (nm) = | 64.219 | 0.105 | 32.640 | 2.145 | 24.441 |

| 1.0 < NA ≦ 1.1<br>145 < T ≦ 155 | | 27/34 |
|---|---|---|
| Case | 15-11 | 15-12 |
| $n_{10}$ | 1.6933082 | 1.6953110 |
| $k_{10}$ | 0.0619759 | 0.0563706 |
| $d_{10}$ (nm) | 212.839 | 272.392 |
| $n_{20}$ | 1.6904544 | 1.6905212 |
| $k_{20}$ | 0.1723582 | 0.1778331 |
| When $n_1 \geqq n_{10}$, $n_{1m}$ = | 0.0645605 | 0.0686462 |
| When $n_1 < n_{10}$, $n_{1m}$ = | 0.0718213 | 0.0516125 |
| When $k_1 \geqq k_{10}$, $k_{1m}$ = | 0.0578125 | 0.0646021 |
| When $k_1 < k_{10}$, $k_{1m}$ = | 0.0349402 | 0.0400220 |
| When $d_1 \geqq d_{10}$, $d_{1m}$ (nm) = | ∞ | ∞ |
| When $d_1 < d_{10}$, $d_{1m}$ (nm) = | 54.857 | 112.777 |
| When $n_2 \geqq n_{20}$, $n_{2m}$ = | 0.2345605 | 0.2885852 |
| When $n_2 < n_{20}$, $n_{2m}$ = | 0.1388916 | 0.2180322 |
| When $k_2 \geqq k_{20}$, $k_{2m}$ = | 0.1280078 | 0.2117786 |
| When $k_2 < k_{20}$, $k_{2m}$ = | 0.0658081 | 0.0782971 |
| When $d_2 \geqq d_{20}$, $d_{2m}$ (nm) = | ∞ | ∞ |
| When $d_2 < d_{20}$, $d_{2m}$ (nm) = | 73.297 | 86.154 |

| 1.0 < NA ≦ 1.1<br>155 < T ≦ 165 | | | | | |
|---|---|---|---|---|---|
| Case | 16-01 | 16-02 | 16-03 | 16-04 | 16-05 |
| $n_{10}$ | 1.9162825 | 1.8960663 | 1.9085468 | 1.9232010 | 1.7368663 |
| $k_{10}$ | 0.2485644 | 0.1719364 | 0.1144956 | 0.0848488 | 0.1019026 |
| $d_{10}$ (nm) | 18.297 | 15.704 | 13.923 | 11.624 | 91.322 |
| $n_{20}$ | 1.6104232 | 1.6708316 | 1.7385514 | 1.7455678 | 1.6869885 |
| $k_{20}$ | 0.6165991 | 0.4169686 | 0.3337318 | 0.2771185 | 0.3224919 |
| $d_{20}$ (nm) | 83.442 | 139.520 | 191.444 | 248.983 | 130.342 |
| When $n_1 \geqq n_{10}$, $n_{1m}$ = | 0.0684412 | 0.0871606 | 0.1018298 | 0.1200745 | 0.0372510 |
| When $n_1 < n_{10}$, $n_{1m}$ = | 0.0186816 | 0.0568530 | 0.0690649 | 0.0803638 | 0.0125696 |
| When $k_1 \geqq k_{10}$, $k_{1m}$ = | 0.0233801 | 0.0734265 | 0.0893420 | 0.1020142 | 0.0332275 |
| When $k_1 < k_{10}$, $k_{1m}$ = | 0.0710925 | 0.0921472 | 0.1049048 | 0.0848488 | 0.0396851 |
| When $d_1 \geqq d_{10}$, $d_{1m}$ (nm) = | 3.544 | 5.170 | 6.051 | 6.159 | 10.019 |
| When $d_1 < d_{10}$, $d_{1m}$ (nm) = | 0.960 | 3.162 | 3.726 | 3.719 | 2.554 |
| When $n_2 \geqq n_{20}$, $n_{2m}$ = | 0.0392468 | 0.0938416 | 0.1080847 | 0.1165613 | 0.0639832 |
| When $n_2 < n_{20}$, $n_{2m}$ = | 0.1557959 | 0.1481714 | 0.1540210 | 0.1601440 | 0.0923059 |
| When $k_2 \geqq k_{20}$, $k_{2m}$ = | 0.0796021 | 0.1023108 | 0.1103064 | 0.1095667 | 0.0344885 |
| When $k_2 < k_{20}$, $k_{2m}$ = | 0.1143958 | 0.1026965 | 0.0973987 | 0.0917590 | 0.0690210 |
| When $d_2 \geqq d_{20}$, $d_{2m}$ (nm) = | ∞ | ∞ | ∞ | ∞ | 16.255 |
| When $d_2 < d_{20}$, $d_{2m}$ (nm) = | 16.079 | 31.215 | 71.737 | 92.392 | 12.361 |

| 1.0 < NA ≦ 1.1<br>155 < T ≦ 165 | | | | | 28/34 |
|---|---|---|---|---|---|
| Case | 16-06 | 16-07 | 16-08 | 16-09 | 16-10 |
| $n_{10}$ | 1.7401611 | 1.7243481 | 1.7054586 | 1.6959475 | 1.6918299 |
| $k_{10}$ | 0.0886217 | 0.0791015 | 0.0688139 | 0.0801582 | 0.0707672 |
| $d_{10}$ (nm) | 92.017 | 92.538 | 159.721 | 218.084 | 213.401 |
| $n_{20}$ | 1.7381402 | 1.6930588 | 1.6812702 | 1.6891859 | 1.6865968 |
| $k_{20}$ | 0.2555882 | 0.2092609 | 0.1871719 | 0.2763746 | 0.2143676 |
| $d_{20}$ (nm) | 182.755 | 245.988 | 244.029 | 128.431 | 190.286 |
| When $n_1 \geqq n_{10}$, $n_{1m}$ = | 0.0455261 | 0.0488196 | 0.0509851 | 0.0098682 | 0.0278625 |
| When $n_1 < n_{10}$, $n_{1m}$ = | 0.0098901 | 0.0131677 | 0.0163489 | 0.0140930 | 0.0421411 |
| When $k_1 \geqq k_{10}$, $k_{1m}$ = | 0.0306140 | 0.0345203 | 0.0271167 | 0.0171570 | 0.0425635 |
| When $k_1 < k_{10}$, $k_{1m}$ = | 0.0347180 | 0.0404199 | 0.0257288 | 0.0171082 | 0.0318542 |
| When $d_1 \geqq d_{10}$, $d_{1m}$ (nm) = | 14.632 | 33.648 | ∞ | 8.318 | ∞ |
| When $d_1 < d_{10}$, $d_{1m}$ (nm) = | 2.133 | 3.535 | 5.969 | 6.525 | 43.306 |
| When $n_2 \geqq n_{20}$, $n_{2m}$ = | 0.0895227 | 0.0573254 | 0.0211304 | 0.0441309 | 0.2430603 |
| When $n_2 < n_{20}$, $n_{2m}$ = | 0.1067090 | 0.1098926 | 0.1107275 | 0.0233423 | 0.0869226 |
| When $k_2 \geqq k_{20}$, $k_{2m}$ = | 0.0460217 | 0.0587354 | 0.0210486 | 0.0642297 | 0.1089050 |
| When $k_2 < k_{20}$, $k_{2m}$ = | 0.0680432 | 0.0628845 | 0.0551514 | 0.0464880 | 0.0738831 |
| When $d_2 \geqq d_{20}$, $d_{2m}$ (nm) = | ∞ | ∞ | ∞ | 19.572 | ∞ |
| When $d_2 < d_{20}$, $d_{2m}$ (nm) = | 8.553 | 37.425 | 30.745 | 5.059 | 27.273 |

-continued

| 1.0 < NA ≦ 1.1<br>155 < T ≦ 165 | | |
|---|---|---|
| Case | 16-11 | 16-12 |
| $n_{10}$ | 1.6935501 | 1.6953216 |
| $k_{10}$ | 0.0625258 | 0.0573372 |
| $d_{10}$ (nm) | 213.666 | 272.694 |
| $n_{20}$ | 1.6897170 | 1.6885432 |
| $k_{20}$ | 0.1780108 | 0.1839003 |
| $d_{20}$ (nm) | 246.097 | 243.579 |
| When $n_1 \geqq n_{10}$, $n_{1m}$ = | 0.0658508 | 0.0696008 |
| When $n_1 < n_{10}$, $n_{1m}$ = | 0.0609790 | 0.0519751 |
| When $k_1 \geqq k_{10}$, $k_{1m}$ = | 0.0564087 | 0.0639087 |
| When $k_1 < k_{10}$, $k_{1m}$ = | 0.0340259 | 0.0390979 |
| When $d_1 \geqq d_{10}$, $d_{1m}$ (nm) = | ∞ | ∞ |
| When $d_1 < d_{10}$, $d_{1m}$ (nm) = | 55.431 | 113.126 |
| When $n_2 \geqq n_{20}$, $n_{2m}$ = | 0.2425122 | 0.2917029 |
| When $n_2 < n_{20}$, $n_{2m}$ = | 0.1355713 | 0.2189172 |
| When $k_2 \geqq k_{20}$, $k_{2m}$ = | 0.1230981 | 0.2089771 |
| When $k_2 < k_{20}$, $k_{2m}$ = | 0.0647131 | 0.0785583 |
| When $d_2 \geqq d_{20}$, $d_{2m}$ (nm) = | ∞ | ∞ |
| When $d_2 < d_{20}$, $d_{2m}$ (nm) = | 74.519 | 83.205 |

| 1.0 < NA ≦ 1.1<br>165 < T ≦ 175 | | | | | |
|---|---|---|---|---|---|
| | | | | | 29/34 |
| Case | 17-01 | 17-02 | 17-03 | 17-04 | 17-05 |
| $n_{10}$ | 1.9620125 | 1.9138120 | 1.9194872 | 1.9263431 | 1.7366416 |
| $k_{10}$ | 0.2671830 | 0.1838008 | 0.1265886 | 0.0918160 | 0.1083929 |
| $d_{10}$ (nm) | 17.281 | 15.160 | 13.286 | 11.575 | 90.600 |
| $n_{20}$ | 1.6251877 | 1.6631095 | 1.7204546 | 1.7389610 | 1.6676220 |
| $k_{20}$ | 0.6875073 | 0.4399257 | 0.3440475 | 0.2853240 | 0.3363185 |
| $d_{20}$ (nm) | 75.420 | 132.541 | 186.036 | 241.421 | 124.136 |
| When $n_1 \geqq n_{10}$, $n_{1m}$ = | 0.0681287 | 0.0852625 | 0.1025696 | 0.1184741 | 0.0323010 |
| When $n_1 < n_{10}$, $n_{1m}$ = | 0.0103625 | 0.0516760 | 0.0678894 | 0.0788623 | 0.0048279 |
| When $k_1 \geqq k_{10}$, $k_{1m}$ = | 0.0130603 | 0.0684912 | 0.0894849 | 0.1012756 | 0.0174634 |
| When $k_1 < k_{10}$, $k_{1m}$ = | 0.0671069 | 0.0945691 | 0.1086621 | 0.0918160 | 0.0305151 |
| When $d_1 \geqq d_{10}$, $d_{1m}$ (nm) = | 3.029 | 4.576 | 5.503 | 5.915 | 7.890 |
| When $d_1 < d_{10}$, $d_{1m}$ (nm) = | 0.441 | 2.597 | 3.327 | 3.560 | 0.944 |
| When $n_2 \geqq n_{20}$, $n_{2m}$ = | 0.0235046 | 0.0887256 | 0.1055566 | 0.1147229 | 0.0355994 |
| When $n_2 < n_{20}$, $n_{2m}$ = | 0.1565857 | 0.1459790 | 0.1532703 | 0.1591589 | 0.0840686 |
| When $k_2 \geqq k_{20}$, $k_{2m}$ = | 0.0495569 | 0.0950366 | 0.1036096 | 0.1065601 | 0.0135376 |
| When $k_2 < k_{20}$, $k_{2m}$ = | 0.1038318 | 0.0972864 | 0.0941003 | 0.0904578 | 0.0586487 |
| When $d_2 \geqq d_{20}$, $d_{2m}$ (nm) = | ∞ | ∞ | ∞ | ∞ | 9.834 |
| When $d_2 < d_{20}$, $d_{2m}$ (nm) = | 13.490 | 32.564 | 69.289 | 94.292 | 9.844 |

| 1.0 < NA ≦ 1.1<br>165 < T ≦ 175 | | | | | |
|---|---|---|---|---|---|
| Case | 17-06 | 17-07 | 17-08 | 17-09 | 17-10 |
| $n_{10}$ | 1.7377165 | 1.7250070 | 1.7054487 | 1.6921136 | 1.6937452 |
| $k_{10}$ | 0.0918810 | 0.0812670 | 0.0704565 | 0.0719896 | 0.0634118 |
| $d_{10}$ (nm) | 91.516 | 92.096 | 158.889 | 214.506 | 214.086 |
| $n_{20}$ | 1.7225143 | 1.6922454 | 1.6815182 | 1.6833735 | 1.6893106 |
| $k_{20}$ | 0.2640565 | 0.2155950 | 0.1921887 | 0.2231205 | 0.1840166 |
| $d_{20}$ (nm) | 176.484 | 237.445 | 235.428 | 180.418 | 236.602 |
| When $n_1 \geqq n_{10}$, $n_{1m}$ = | 0.0420569 | 0.0467627 | 0.0482849 | 0.0256970 | 0.0615491 |
| When $n_1 < n_{10}$, $n_{1m}$ = | 0.0067480 | 0.0110010 | 0.0145544 | 0.0346619 | 0.0533179 |
| When $k_1 \geqq k_{10}$, $k_{1m}$ = | 0.0242395 | 0.0311426 | 0.0191064 | 0.0402332 | 0.0548975 |
| When $k_1 < k_{10}$, $k_{1m}$ = | 0.0306030 | 0.0379785 | 0.0179834 | 0.0315259 | 0.0339990 |
| When $d_1 \geqq d_{10}$, $d_{1m}$ (nm) = | 13.053 | 20.074 | ∞ | ∞ | ∞ |
| When $d_1 < d_{10}$, $d_{1m}$ (nm) = | 1.437 | 2.846 | 5.076 | 44.014 | 52.355 |
| When $n_2 \geqq n_{20}$, $n_{2m}$ = | 0.0699756 | 0.0474695 | 0.0119531 | 0.2616345 | 0.2513293 |
| When $n_2 < n_{20}$, $n_{2m}$ = | 0.1027979 | 0.1100684 | 0.1104504 | 0.0766565 | 0.1353430 |
| When $k_2 \geqq k_{20}$, $k_{2m}$ = | 0.0294397 | 0.0490112 | 0.0106458 | 0.1033704 | 0.1166565 |
| When $k_2 < k_{20}$, $k_{2m}$ = | 0.0637073 | 0.0613086 | 0.0537012 | 0.0738440 | 0.0656140 |
| When $d_2 \geqq d_{20}$, $d_{2m}$ (nm) = | ∞ | ∞ | 5.139 | ∞ | ∞ |
| When $d_2 < d_{20}$, $d_{2m}$ (nm) = | 7.091 | 63.320 | 32.177 | 24.892 | 75.277 |

1.0 < NA ≦ 1.1
165 < T ≦ 175

30/34

| Case | 17-11 | 17-12 |
|---|---|---|
| $n_{10}$ | 1.6937402 | 1.6958036 |
| $k_{10}$ | 0.0634247 | 0.0530688 |
| $d_{10}$ (nm) | 214.067 | 271.703 |
| $n_{20}$ | 1.6892020 | 1.6918593 |
| $k_{20}$ | 0.1839903 | 0.1637010 |
| $d_{20}$ (nm) | 236.644 | 291.452 |
| When $n_1 \geqq n_{10}$, $n_{1m}$ = | 0.0614392 | 0.0799048 |
| When $n_1 < n_{10}$, $n_{1m}$ = | 0.0533545 | 0.0613391 |
| When $k_1 \geqq k_{10}$, $k_{1m}$ = | 0.0548865 | 0.0657874 |
| When $k_1 < k_{10}$, $k_{1m}$ = | 0.0340295 | 0.0406555 |
| When $d_1 \geqq d_{10}$, $d_{1m}$ (nm) = | ∞ | ∞ |
| When $d_1 < d_{10}$, $d_{1m}$ (nm) = | 52.349 | 186.337 |
| When $n_2 \geqq n_{20}$, $n_{2m}$ = | 0.2512048 | 0.2852795 |
| When $n_2 < n_{20}$, $n_{2m}$ = | 0.1353552 | 0.2060364 |
| When $k_2 \geqq k_{20}$, $k_{2m}$ = | 0.1167688 | 0.2088965 |
| When $k_2 < k_{20}$, $k_{2m}$ = | 0.0656104 | 0.0720715 |
| When $d_2 \geqq d_{20}$, $d_{2m}$ (nm) = | ∞ | ∞ |
| When $d_2 < d_{20}$, $d_{2m}$ (nm) = | 75.294 | 119.308 |

1.0 < NA ≦ 1.1
175 < T ≦ 185

| Case | 18-01 | 18-02 | 18-03 | 18-04 | 18-05 |
|---|---|---|---|---|---|
| $n_{10}$ | 2.0247974 | 1.9282935 | 1.9213955 | 1.9262173 | 1.7355101 |
| $k_{10}$ | 0.2830183 | 0.1992550 | 0.1387890 | 0.1063571 | 0.0947091 |
| $d_{10}$ (nm) | 15.097 | 14.428 | 13.062 | 11.253 | 91.033 |
| $n_{20}$ | 1.6266898 | 1.6428403 | 1.7027750 | 1.7173021 | 1.7079959 |
| $k_{20}$ | 0.7191283 | 0.4517072 | 0.3507816 | 0.2869739 | 0.2693832 |
| $d_{20}$ (nm) | 71.681 | 126.823 | 179.475 | 236.027 | 169.192 |
| When $n_1 \geqq n_{10}$, $n_{1m}$ = | 0.0749963 | 0.0847278 | 0.1010168 | 0.1197595 | 0.0387598 |
| When $n_1 < n_{10}$, $n_{1m}$ = | 0.0029248 | 0.0471021 | 0.0652051 | 0.0785376 | 0.0037976 |
| When $k_1 \geqq k_{10}$, $k_{1m}$ = | 0.0038599 | 0.0655127 | 0.0884351 | 0.1039075 | 0.0170227 |
| When $k_1 < k_{10}$, $k_{1m}$ = | 0.0706714 | 0.0951611 | 0.1067810 | 0.1063571 | 0.0250378 |
| When $d_1 \geqq d_{10}$, $d_{1m}$ (nm) = | 2.365 | 4.047 | 5.170 | 5.710 | 10.979 |
| When $d_1 < d_{10}$, $d_{1m}$ (nm) = | 0.098 | 2.142 | 3.074 | 3.403 | 0.799 |
| When $n_2 \geqq n_{20}$, $n_{2m}$ = | 0.0068848 | 0.0841113 | 0.1036328 | 0.1139966 | 0.0477551 |
| When $n_2 < n_{20}$, $n_{2m}$ = | 0.1606787 | 0.1462891 | 0.1534180 | 0.1596240 | 0.1042908 |
| When $k_2 \geqq k_{20}$, $k_{2m}$ = | 0.0111658 | 0.0845300 | 0.0979260 | 0.1010864 | 0.0158423 |
| When $k_2 < k_{20}$, $k_{2m}$ = | 0.0939917 | 0.0914209 | 0.0916113 | 0.0894141 | 0.0611707 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 3.000 | 39.175 | 67.597 | 105.537 | 4.807 |

1.0 < NA ≦ 1.1
175 < T ≦ 185

31/34

| Case | 18-06 | 18-07 | 18-08 | 18-09 | 18-10 |
|---|---|---|---|---|---|
| $n_{10}$ | 1.7251933 | 1.7054174 | 1.6937830 | 1.6952847 | 1.6957027 |
| $k_{10}$ | 0.0829804 | 0.0718367 | 0.0647049 | 0.0582261 | 0.0542195 |
| $d_{10}$ (nm) | 91.728 | 158.389 | 214.330 | 213.359 | 271.586 |
| $n_{20}$ | 1.6903561 | 1.6812041 | 1.6889835 | 1.6934588 | 1.6918383 |
| $k_{20}$ | 0.2192539 | 0.1954390 | 0.1894046 | 0.1611341 | 0.1679902 |
| $d_{20}$ (nm) | 228.367 | 226.084 | 226.812 | 284.005 | 281.728 |
| When $n_1 \geqq n_{10}$, $n_{1m}$ = | 0.0450793 | 0.0463184 | 0.0575061 | 0.0820801 | 0.0778577 |
| When $n_1 < n_{10}$, $n_{1m}$ = | 0.0094861 | 0.0044336 | 0.0478479 | 0.0612256 | 0.0602185 |
| When $k_1 \geqq k_{10}$, $k_{1m}$ = | 0.0283801 | 0.0117395 | 0.0529968 | 0.0602039 | 0.0649841 |
| When $k_1 < k_{10}$, $k_{1m}$ = | 0.0362878 | 0.0115625 | 0.0337854 | 0.0347266 | 0.0400525 |
| When $d_1 \geqq d_{10}$, $d_{1m}$ (nm) = | 16.774 | ∞ | ∞ | ∞ | ∞ |
| When $d_1 < d_{10}$, $d_{1m}$ (nm) = | 2.397 | 1.386 | 50.875 | 126.709 | 185.173 |
| When $n_2 \geqq n_{20}$, $n_{2m}$ = | 0.0407971 | 0.0052539 | 0.2620386 | 0.2460583 | 0.2888794 |
| When $n_2 < n_{20}$, $n_{2m}$ = | 0.1134692 | 0.1157361 | 0.1359692 | 0.1267810 | 0.2086084 |
| When $k_2 \geqq k_{20}$, $k_{2m}$ = | 0.0417627 | 0.0042761 | 0.1123547 | 0.1276489 | 0.2100842 |
| When $k_2 < k_{20}$, $k_{2m}$ = | 0.0604272 | 0.0538147 | 0.0667053 | 0.0613220 | 0.0762817 |
| When $d_2 \geqq d_{20}$, $d_{2m}$ (nm) = | ∞ | 1.973 | ∞ | ∞ | ∞ |
| When $d_2 < d_{20}$, $d_{2m}$ (nm) = | 63.259 | 35.408 | 73.536 | 81.916 | 101.090 |

-continued

| 1.0 < NA ≦ 1.1<br>185 < T ≦ 195 | | | | | |
|---|---|---|---|---|---|
| Case | 19-01 | 19-02 | 19-03 | 19-04 | 19-05 |
| $n_{10}$ | 1.9316549 | 1.9193011 | 1.9209840 | 1.9114684 | 1.7364379 |
| $k_{10}$ | 0.2158025 | 0.1476126 | 0.1061325 | 0.1024475 | 0.0969838 |
| $d_{10}$ (nm) | 14.297 | 13.272 | 11.842 | 10.224 | 91.033 |
| $n_{20}$ | 1.6202378 | 1.6935029 | 1.7241227 | 1.6976483 | 1.7085420 |
| $k_{20}$ | 0.4645248 | 0.3598725 | 0.2946413 | 0.2438294 | 0.2774318 |
| $d_{20}$ (nm) | 119.165 | 170.049 | 224.030 | 285.021 | 158.680 |
| When $n_1 \geqq n_{10}$, $n_{1m}$ = | 0.0819873 | 0.0986853 | 0.1146375 | 0.1344971 | 0.0375342 |
| When $n_1 < n_{10}$, $n_{1m}$ = | 0.0431250 | 0.0625305 | 0.0746716 | 0.0933276 | 0.0023010 |
| When $k_1 \geqq k_{10}$, $k_{1m}$ = | 0.0616553 | 0.0860156 | 0.0981763 | 0.1190894 | 0.0118958 |
| When $k_1 < k_{10}$, $k_{1m}$ = | 0.0896899 | 0.1016528 | 0.1061325 | 0.1024475 | 0.0218677 |
| When $d_1 \geqq d_{10}$, $d_{1m}$ (nm) = | 3.700 | 5.023 | 5.787 | 6.264 | 9.942 |
| When $d_1 < d_{10}$, $d_{1m}$ (nm) = | 1.892 | 2.963 | 3.440 | 3.984 | 0.476 |
| When $n_2 \geqq n_{20}$, $n_{2m}$ = | 0.0797485 | 0.1030664 | 0.1135645 | 0.1221387 | 0.0340320 |
| When $n_2 < n_{20}$, $n_{2m}$ = | 0.1493750 | 0.1566296 | 0.1631348 | 0.1387097 | 0.1094446 |
| When $k_2 \geqq k_{20}$, $k_{2m}$ = | 0.0775891 | 0.0962708 | 0.1030847 | 0.0998328 | 0.0100928 |
| When $k_2 < k_{20}$, $k_{2m}$ = | 0.0909656 | 0.0941418 | 0.0920776 | 0.0860498 | 0.0649939 |
| When $d_2 \geqq d_{20}$, $d_{2m}$ (nm) = | ∞ | ∞ | ∞ | ∞ | 42.778 |
| When $d_2 < d_{20}$, $d_{2m}$ (nm) = | 39.461 | 66.761 | 95.735 | 134.721 | 2.964 |

| 1.0 < NA ≦ 1.1<br>185 < T ≦ 195 | | | | | |
|---|---|---|---|---|---|
| Case | 19-06 | 19-07 | 19-08 | 19-09 | 32/34<br>19-10 |
| $n_{10}$ | 1.7258494 | 1.7176246 | 1.7057732 | 1.7053832 | 1.6928552 |
| $k_{10}$ | 0.0843222 | 0.0727056 | 0.0731106 | 0.0633918 | 0.0748243 |
| $d_{10}$ (nm) | 91.766 | 91.617 | 158.709 | 158.181 | 216.444 |
| $n_{20}$ | 1.6907525 | 1.6784161 | 1.6805392 | 1.6859880 | 1.6825267 |
| $k_{20}$ | 0.2229229 | 0.1842107 | 0.1989479 | 0.1669818 | 0.2415835 |
| $d_{20}$ (nm) | 218.067 | 277.206 | 215.842 | 272.384 | 158.548 |
| When $n_1 \geqq n_{10}$, $n_{1m}$ = | 0.0445569 | 0.0497937 | 0.0455957 | 0.0532361 | 0.0209436 |
| When $n_1 < n_{10}$, $n_{1m}$ = | 0.0086951 | 0.0298450 | 0.0022034 | 0.0367859 | 0.0248157 |
| When $k_1 \geqq k_{10}$, $k_{1m}$ = | 0.0263611 | 0.0534119 | 0.0080444 | 0.0507507 | 0.0311414 |
| When $k_1 < k_{10}$, $k_{1m}$ = | 0.0359253 | 0.0504663 | 0.0097656 | 0.0393250 | 0.0256995 |
| When $d_1 \geqq d_{10}$, $d_{1m}$ (nm) = | 15.734 | 41.766 | ∞ | ∞ | 12.676 |
| When $d_1 < d_{10}$, $d_{1m}$ (nm) = | 2.168 | 9.272 | 0.695 | 75.025 | 12.180 |
| When $n_2 \geqq n_{20}$, $n_{2m}$ = | 0.0361047 | 0.0638184 | 0.0029834 | 0.0794446 | 0.0872498 |
| When $n_2 < n_{20}$, $n_{2m}$ = | 0.1156152 | 0.1202979 | 0.1187366 | 0.1037524 | 0.0413367 |
| When $k_2 \geqq k_{20}$, $k_{2m}$ = | 0.0400842 | 0.0626270 | 0.0025122 | 0.0450354 | 0.0876147 |
| When $k_2 < k_{20}$, $k_{2m}$ = | 0.0626514 | 0.0561853 | 0.0563074 | 0.0506238 | 0.0672510 |
| When $d_2 \geqq d_{20}$, $d_{2m}$ (nm) = | ∞ | ∞ | 1.098 | ∞ | ∞ |
| When $d_2 < d_{20}$, $d_{2m}$ (nm) = | 62.415 | 80.313 | 33.556 | 35.245 | 14.500 |

| 1.0 < NA ≦ 1.1<br>185 < T ≦ 195 | | | |
|---|---|---|---|
| Case | 19-11 | 19-12 | 19-13 |
| $n_{10}$ | 1.6935473 | 1.6950516 | 1.6954923 |
| $k_{10}$ | 0.0663823 | 0.0596605 | 0.0554795 |
| $d_{10}$ (nm) | 214.407 | 213.429 | 271.226 |
| $n_{20}$ | 1.6888366 | 1.6925794 | 1.6917166 |
| $k_{20}$ | 0.1945007 | 0.1643538 | 0.1716832 |
| $d_{20}$ (nm) | 217.060 | 274.430 | 272.356 |
| When $n_1 \geqq n_{10}$, $n_{1m}$ = | 0.0539099 | 0.0837012 | 0.0771448 |
| When $n_1 < n_{10}$, $n_{1m}$ = | 0.0450378 | 0.0604199 | 0.0593555 |
| When $k_1 \geqq k_{10}$, $k_{1m}$ = | 0.0507373 | 0.0587012 | 0.0639185 |
| When $k_1 < k_{10}$, $k_{1m}$ = | 0.0306738 | 0.0334839 | 0.0392737 |
| When $d_1 \geqq d_{10}$, $d_{1m}$ (nm) = | ∞ | ∞ | ∞ |
| When $d_1 < d_{10}$, $d_{1m}$ (nm) = | 49.334 | 125.965 | 183.474 |
| When $n_2 \geqq n_{20}$, $n_{2m}$ = | 0.1392200 | 0.1753748 | 0.2943286 |
| When $n_2 < n_{20}$, $n_{2m}$ = | 0.1378223 | 0.1262683 | 0.2110303 |
| When $k_2 \geqq k_{20}$, $k_{2m}$ = | 0.1089429 | 0.1267468 | 0.2119958 |
| When $k_2 < k_{20}$, $k_{2m}$ = | 0.0654358 | 0.0611353 | 0.0788904 |
| When $d_2 \geqq d_{20}$, $d_{2m}$ (nm) = | ∞ | ∞ | ∞ |
| When $d_2 < d_{20}$, $d_{2m}$ (nm) = | 37.875 | 75.613 | 93.291 |

1.0 < NA ≦ 1.1
195 < T ≦ 205

33/34

| Case | 20-01 | 20-02 | 20-03 | 20-04 | 20-05 |
|---|---|---|---|---|---|
| $n_{10}$ | 1.9124203 | 1.9240615 | 1.9069086 | 1.7409810 | 1.7270720 |
| $k_{10}$ | 0.1489422 | 0.1092971 | 0.1015424 | 0.0988730 | 0.0857435 |
| $d_{10}$ (nm) | 14.330 | 12.001 | 10.748 | 91.533 | 92.142 |
| $n_{20}$ | 1.7039618 | 1.7245262 | 1.7018591 | 1.7256420 | 1.6923707 |
| $k_{20}$ | 0.3787231 | 0.3026113 | 0.2499950 | 0.2922591 | 0.2292874 |
| $d_{20}$ (nm) | 157.291 | 214.201 | 273.963 | 146.253 | 207.814 |
| When $n_1 \geqq n_{10}$, $n_{1m}$ = | 0.0947424 | 0.1140125 | 0.1293140 | 0.0383984 | 0.0447009 |
| When $n_1 < n_{10}$, $n_{1m}$ = | 0.0592273 | 0.0732715 | 0.0895557 | 0.0020898 | 0.0081226 |
| When $k_1 \geqq k_{10}$, $k_{1m}$ = | 0.0804358 | 0.0961365 | 0.1132190 | 0.0106335 | 0.0246362 |
| When $k_1 < k_{10}$, $k_{1m}$ = | 0.0954272 | 0.1092971 | 0.1015424 | 0.0220923 | 0.0359277 |
| When $d_1 \geqq d_{10}$, $d_{1m}$ (nm) = | 5.168 | 5.724 | 6.406 | 9.801 | 15.595 |
| When $d_1 < d_{10}$, $d_{1m}$ (nm) = | 3.029 | 3.355 | 4.072 | 0.420 | 2.001 |
| When $n_2 \geqq n_{20}$, $n_{2m}$ = | 0.1047864 | 0.1153137 | 0.1226477 | 0.0347485 | 0.0318494 |
| When $n_2 < n_{20}$, $n_{2m}$ = | 0.1598962 | 0.1638757 | 0.1417261 | 0.1115564 | 0.1129541 |
| When $k_2 \geqq k_{20}$, $k_{2m}$ = | 0.1020288 | 0.1044775 | 0.1018286 | 0.0106042 | 0.0415295 |
| When $k_2 < k_{20}$, $k_{2m}$ = | 0.1029260 | 0.0959216 | 0.0891724 | 0.0737659 | 0.0663513 |
| When $d_2 \geqq d_{20}$, $d_{2m}$ (nm) = | ∞ | ∞ | ∞ | 37.674 | ∞ |
| When $d_2 < d_{20}$, $d_{2m}$ (nm) = | 61.016 | 86.078 | 130.875 | 2.293 | 32.252 |

1.0 < NA ≦ 1.1
195 < T ≦ 205

| Case | 20-06 | 20-07 | 20-08 | 20-09 | 20-10 |
|---|---|---|---|---|---|
| $n_{10}$ | 1.7180387 | 1.7063746 | 1.7058520 | 1.6924739 | 1.6928977 |
| $k_{10}$ | 0.0734703 | 0.0744769 | 0.0640895 | 0.0767908 | 0.0684401 |
| $d_{10}$ (nm) | 91.877 | 159.624 | 158.885 | 216.680 | 213.761 |
| $n_{20}$ | 1.6777924 | 1.6791348 | 1.6855365 | 1.6850078 | 1.6885850 |
| $k_{20}$ | 0.1881130 | 0.2047799 | 0.1710983 | 0.2520629 | 0.1999527 |
| $d_{20}$ (nm) | 267.481 | 205.830 | 262.479 | 148.712 | 208.689 |
| When $n_1 \geqq n_{10}$, $n_{1m}$ = | 0.0499475 | 0.0454993 | 0.0542188 | 0.0126501 | 0.0501160 |
| When $n_1 < n_{10}$, $n_{1m}$ = | 0.0300122 | 0.0018469 | 0.0331775 | 0.0226819 | 0.0449377 |
| When $k_1 \geqq k_{10}$, $k_{1m}$ = | 0.0534277 | 0.0070447 | 0.0503931 | 0.0235315 | 0.0487341 |
| When $k_1 < k_{10}$, $k_{1m}$ = | 0.0493896 | 0.0111902 | 0.0386401 | 0.0180737 | 0.0270740 |
| When $d_1 \geqq d_{10}$, $d_{1m}$ (nm) = | 33.063 | ∞ | ∞ | 10.064 | ∞ |
| When $d_1 < d_{10}$, $d_{1m}$ (nm) = | 9.229 | 0.603 | 19.062 | 10.036 | 46.531 |
| When $n_2 \geqq n_{20}$, $n_{2m}$ = | 0.0633008 | 0.0027478 | 0.0774658 | 0.0675293 | 0.1390137 |
| When $n_2 < n_{20}$, $n_{2m}$ = | 0.1171533 | 0.1127539 | 0.1100610 | 0.0218616 | 0.1442749 |
| When $k_2 \geqq k_{20}$, $k_{2m}$ = | 0.0639148 | 0.0025830 | 0.0457581 | 0.0823975 | 0.1098364 |
| When $k_2 < k_{20}$, $k_{2m}$ = | 0.0580542 | 0.0529590 | 0.0524817 | 0.0502942 | 0.0628650 |
| When $d_2 \geqq d_{20}$, $d_{2m}$ (nm) = | ∞ | 1.007 | ∞ | ∞ | ∞ |
| When $d_2 < d_{20}$, $d_{2m}$ (nm) = | 77.001 | 28.132 | 32.836 | 6.408 | 22.345 |

1.0 < NA ≦ 1.1
195 < T ≦ 205

34/34

| Case | 20-11 | 20-12 |
|---|---|---|
| $n_{10}$ | 1.6947635 | 1.6952371 |
| $k_{10}$ | 0.0610999 | 0.0566636 |
| $d_{10}$ (nm) | 213.366 | 270.653 |
| $n_{20}$ | 1.6918971 | 1.6914186 |
| $k_{20}$ | 0.1679521 | 0.1751623 |
| $d_{20}$ (nm) | 265.366 | 263.994 |
| When $n_1 \geqq n_{10}$, $n_{1m}$ = | 0.0863086 | 0.0772644 |
| When $n_1 < n_{10}$, $n_{1m}$ = | 0.0626501 | 0.0586890 |
| When $k_1 \geqq k_{10}$, $k_{1m}$ = | 0.0572302 | 0.0627917 |
| When $k_1 < k_{10}$, $k_{1m}$ = | 0.0322180 | 0.0382104 |
| When $d_1 \geqq d_{10}$, $d_{1m}$ (nm) = | ∞ | ∞ |
| When $d_1 < d_{10}$, $d_{1m}$ (nm) = | 124.819 | 121.330 |
| When $n_2 \geqq n_{20}$, $n_{2m}$ = | 0.1702917 | 0.3021582 |
| When $n_2 < n_{20}$, $n_{2m}$ = | 0.1249365 | 0.2142798 |
| When $k_2 \geqq k_{20}$, $k_{2m}$ = | 0.1249064 | 0.2136462 |
| When $k_2 < k_{20}$, $k_{2m}$ = | 0.0643469 | 0.0826477 |
| When $d_2 \geqq d_{20}$, $d_{2m}$ (nm) = | ∞ | ∞ |
| When $d_2 < d_{20}$, $d_{2m}$ (nm) = | 66.113 | 91.025 |

In accordance with a third embodiment of the invention, an antireflective film has a two-layer structure and is used in a process for manufacturing a semiconductor device by being provided between a resist layer and a silicon oxide layer formed on a surface of a silicon semiconductor substrate and having a thickness T (unit: nm) described below, for exposure of the resist layer in an exposure system having a wavelength of 190 nm to 195 nm and a numerical aperture NA of 1.1<NA≦1.2. In accordance with the third embodiment of the invention, an exposure method is used in a process for manufacturing a semiconductor device and includes providing an antireflective film having a two-layer structure between a resist layer and a silicon oxide layer formed on a surface of a silicon semiconductor substrate and having a thickness T (unit: nm) described below, and exposing the resist layer in an exposure system having a wavelength of 190 nm to 195 nm and a numerical aperture NA of 1.1<NA≦1.2.

The antireflective film or the antireflective film used in the exposure method according to the third embodiment of the invention includes an upper layer having a complex refractive index $N_1$, and a lower layer having a complex refractive index $N_2$, the complex refractive indexes $N_1$ and $N_2$ being represented by the following equations:

$$N_1=n_1-k_1i$$

$$N_2=n_2-k_2i$$

Assuming that the thickness of the upper layer is $d_1$ (unit: nm) and the thickness of the lower layer is $d_2$ (unit: nm), when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the following relational expression:

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2\leqq 1$$

However, a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$. In the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm)=", each value (unit: nm) in the right columns is "$d_{1m}-d_{10}$"; in the line of "When $d_1<d_{10}$, $d_{1m}$ (nm)=", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm)=", each value (unit: nm) in the right columns is "$d_{2m}-d_{20}$"; and in the line of "When $d_2<d_{20}$, $d_{2m}$ (nm)=", each value (unit: nm) in the right columns is "$d_{20}-d_{2m}$".

$1.1 < NA \leqq 1.2$
$2 \leqq T \leqq 15$

1/27

| Case | 1-01 | 1-02 | 1-03 | 1-04 | 1-05 |
|---|---|---|---|---|---|
| $n_{10}$ | 2.0940641 | 1.9168406 | 1.8970115 | 1.8805879 | 1.8778358 |
| $k_{10}$ | 0.0325844 | 0.1807255 | 0.1529573 | 0.1098415 | 0.1082679 |
| $d_{10}$ (nm) | 26.090 | 35.662 | 31.182 | 13.577 | 19.930 |
| $n_{20}$ | 4.2290158 | 5.4932306 | 2.4318401 | 1.7032895 | 1.8340760 |
| $k_{20}$ | 2.3935124 | 0.6123354 | 0.5958382 | 0.2751108 | 0.3677230 |
| $d_{20}$ (nm) | 3.632 | 19.087 | 52.406 | 218.193 | 142.226 |
| When $n_1 \geqq n_{10}$, $n_{1m}$ = | 0.0779846 | 0.0720874 | 0.0701013 | 0.1012354 | 0.0784314 |
| When $n_1 < n_{10}$, $n_{1m}$ = | 0.0750281 | 0.0636047 | 0.0555591 | 0.0635571 | 0.0497058 |
| When $k_1 \geqq k_{10}$, $k_{1m}$ = | 0.0672229 | 0.0527649 | 0.0494641 | 0.0853247 | 0.0590771 |
| When $k_1 < k_{10}$, $k_{1m}$ = | 0.0325844 | 0.0849731 | 0.0840393 | 0.1029980 | 0.0867822 |
| When $d_1 \geqq d_{10}$, $d_{1m}$ (nm) = | 3.416 | 5.199 | 6.198 | 6.716 | 7.382 |
| When $d_1 < d_{10}$, $d_{1m}$ (nm) = | 2.721 | 3.845 | 3.923 | 3.853 | 3.873 |
| When $n_2 \geqq n_{20}$, $n_{2m}$ = | 0.2775293 | 0.1187439 | 0.1333862 | 0.1147803 | 0.1115393 |
| When $n_2 < n_{20}$, $n_{2m}$ = | 0.2711597 | 0.1202087 | 0.1603455 | 0.1449023 | 0.1457849 |
| When $k_2 \geqq k_{20}$, $k_{2m}$ = | 0.2845105 | 0.1470557 | 0.1794812 | 0.0967163 | 0.1467151 |
| When $k_2 < k_{20}$, $k_{2m}$ = | 0.2499512 | 0.1180896 | 0.1302063 | 0.0855334 | 0.0954285 |
| When $d_2 \geqq d_{20}$, $d_{2m}$ (nm) = | 0.458 | 0.467 | 5.440 | ∞ | ∞ |
| When $d_2 < d_{20}$, $d_{2m}$ (nm) = | 0.433 | 0.450 | 5.242 | 81.747 | 30.656 |

$1.1 < NA \leqq 1.2$
$2 \leqq T \leqq 15$

| Case | 1-06 | 1-07 | 1-08 | 1-09 | 1-10 |
|---|---|---|---|---|---|
| $n_{10}$ | 1.8663312 | 1.7888608 | 1.7735009 | 1.7175310 | 1.7199475 |
| $k_{10}$ | 0.0978132 | 0.1060865 | 0.0957437 | 0.0751352 | 0.0655065 |
| $d_{10}$ (nm) | 12.232 | 103.503 | 98.181 | 95.409 | 94.621 |
| $n_{20}$ | 1.6938400 | 4.4234099 | 2.0208865 | 1.6658936 | 1.6963762 |
| $k_{20}$ | 0.2288643 | 0.4526804 | 0.4158741 | 0.2054797 | 0.1762614 |
| $d_{20}$ (nm) | 277.705 | 24.164 | 66.693 | 212.937 | 266.043 |
| When $n_1 \geqq n_{10}$, $n_{1m}$ = | 0.1143909 | 0.0588428 | 0.0489270 | 0.0419214 | 0.0484180 |
| When $n_1 < n_{10}$, $n_{1m}$ = | 0.0786536 | 0.0104822 | 0.0094507 | 0.0157727 | 0.0265735 |
| When $k_1 \geqq k_{10}$, $k_{1m}$ = | 0.1033447 | 0.0215918 | 0.0249109 | 0.0382361 | 0.0520056 |
| When $k_1 < k_{10}$, $k_{1m}$ = | 0.0978132 | 0.0439624 | 0.0358655 | 0.0399121 | 0.0459387 |
| When $d_1 \geqq d_{10}$, $d_{1m}$ (nm) = | 7.609 | 9.370 | 10.912 | 18.272 | 51.841 |
| When $d_1 < d_{10}$, $d_{1m}$ (nm) = | 4.794 | 1.739 | 1.766 | 4.805 | 8.596 |
| When $n_2 \geqq n_{20}$, $n_{2m}$ = | 0.1069236 | 0.0468066 | 0.0740674 | 0.0384924 | 0.0631091 |
| When $n_2 < n_{20}$, $n_{2m}$ = | 0.1302808 | 0.1036670 | 0.1052673 | 0.0829468 | 0.0987561 |
| When $k_2 \geqq k_{20}$, $k_{2m}$ = | 0.0918579 | 0.0409717 | 0.0495154 | 0.0385596 | 0.0522119 |
| When $k_2 < k_{20}$, $k_{2m}$ = | 0.0786169 | 0.0807788 | 0.0903577 | 0.0528296 | 0.0515430 |
| When $d_2 \geqq d_{20}$, $d_{2m}$ (nm) = | ∞ | 0.296 | 4.999 | ∞ | ∞ |
| When $d_2 < d_{20}$, $d_{2m}$ (nm) = | 128.233 | 0.621 | 5.371 | 23.038 | 34.154 |

1.1 < NA ≦ 1.2
2 ≦ T ≦ 15

2/27

| Case | 1-11 | 1-12 | 1-13 | 1-14 | 1-15 |
|---|---|---|---|---|---|
| $n_{10}$ | 1.7156729 | 1.7043499 | 1.7082412 | 1.6926126 | 1.6890888 |
| $k_{10}$ | 0.0770168 | 0.0644952 | 0.0577629 | 0.0683906 | 0.0745003 |
| $d_{10}$ (nm) | 188.315 | 165.315 | 163.169 | 237.184 | 217.718 |
| $n_{20}$ | 6.9620048 | 1.6731418 | 1.7075031 | 6.7859369 | 1.7770504 |
| $k_{20}$ | 3.4231449 | 0.1899705 | 0.1626792 | 2.9992529 | 0.3401503 |
| $d_{20}$ (nm) | 0.879 | 207.250 | 259.766 | 0.993 | 84.925 |
| When $n_1 \geqq n_{10}$, $n_{1m}$ = | 0.0649841 | 0.0417419 | 0.0509473 | 0.0348376 | 0.0194055 |
| When $n_1 < n_{10}$, $n_{1m}$ = | 0.0083154 | 0.0317078 | 0.0477380 | 0.0764368 | 0.0607605 |
| When $k_1 \geqq k_{10}$, $k_{1m}$ = | 0.0257251 | 0.0333704 | 0.0433435 | 0.0403589 | 0.0329480 |
| When $k_1 < k_{10}$, $k_{1m}$ = | 0.0275232 | 0.0338538 | 0.0333484 | 0.0319214 | 0.0242554 |
| When $d_1 \geqq d_{10}$, $d_{1m}$ (nm) = | 38.959 | ∞ | ∞ | 19.483 | 9.981 |
| When $d_1 < d_{10}$, $d_{1m}$ (nm) = | 3.134 | 16.146 | 77.216 | 43.463 | 24.681 |
| When $n_2 \geqq n_{20}$, $n_{2m}$ = | 0.2971887 | 0.0474377 | 0.0745630 | 0.5633252 | 0.1177502 |
| When $n_2 < n_{20}$, $n_{2m}$ = | 0.6091602 | 0.0721411 | 0.0651379 | 0.4300269 | 0.0317639 |
| When $k_2 \geqq k_{20}$, $k_{2m}$ = | 0.2827808 | 0.0222888 | 0.0325830 | 0.2436438 | 0.0560791 |
| When $k_2 < k_{20}$, $k_{2m}$ = | 0.6937878 | 0.0478259 | 0.0479700 | 0.5647217 | 0.0980969 |
| When $d_2 \geqq d_{20}$, $d_{2m}$ (nm) = | 0.055 | 16.772 | ∞ | 0.120 | 16.691 |
| When $d_2 < d_{20}$, $d_{2m}$ (nm) = | 0.135 | 19.208 | 16.504 | 0.176 | 3.670 |

1.1 < NA ≦ 1.2
2 ≦ T ≦ 15

| Case | 1-16 | 1-17 | 1-18 | 1-19 |
|---|---|---|---|---|
| $n_{10}$ | 1.6903292 | 1.6921355 | 1.6951475 | 1.7004017 |
| $k_{10}$ | 0.0721915 | 0.0670288 | 0.0546351 | 0.0599028 |
| $d_{10}$ (nm) | 210.963 | 207.063 | 219.259 | 265.986 |
| $n_{20}$ | 1.7111030 | 1.6978167 | 1.6889102 | 1.7029410 |
| $k_{20}$ | 0.2426612 | 0.1954345 | 0.1606659 | 0.1992607 |
| $d_{20}$ (nm) | 155.846 | 222.387 | 263.728 | 214.965 |
| When $n_1 \geqq n_{10}$, $n_{1m}$ = | 0.0284180 | 0.0456091 | 0.0773694 | 0.0612244 |
| When $n_1 < n_{10}$, $n_{1m}$ = | 0.0510327 | 0.0467078 | 0.0619885 | 0.0410486 |
| When $k_1 \geqq k_{10}$, $k_{1m}$ = | 0.0455554 | 0.0511133 | 0.0524768 | 0.0499927 |
| When $k_1 < k_{10}$, $k_{1m}$ = | 0.0320984 | 0.0388074 | 0.0353687 | 0.0377380 |
| When $d_1 \geqq d_{10}$, $d_{1m}$ (nm) = | 23.770 | ∞ | ∞ | ∞ |
| When $d_1 < d_{10}$, $d_{1m}$ (nm) = | 28.472 | 31.416 | 128.164 | 94.534 |
| When $n_2 \geqq n_{20}$, $n_{2m}$ = | 0.1260327 | 0.1631665 | 0.2120154 | 0.2674829 |
| When $n_2 < n_{20}$, $n_{2m}$ = | 0.0663647 | 0.1722144 | 0.1079456 | 0.2316101 |
| When $k_2 \geqq k_{20}$, $k_{2m}$ = | 0.0960291 | 0.1259009 | 0.1121619 | 0.2074023 |
| When $k_2 < k_{20}$, $k_{2m}$ = | 0.0846741 | 0.0757690 | 0.0591858 | 0.0894751 |
| When $d_2 \geqq d_{20}$, $d_{2m}$ (nm) = | ∞ | ∞ | ∞ | ∞ |
| When $d_2 < d_{20}$, $d_{2m}$ (nm) = | 12.288 | 72.281 | 78.597 | 77.855 |

1.1 < NA ≦ 1.2
15 < T ≦ 25

3/27

| Case | 2-01 | 2-02 | 2-03 | 2-04 | 2-05 |
|---|---|---|---|---|---|
| $n_{10}$ | 1.8738578 | 1.8839217 | 1.8842367 | 1.8705650 | 1.7997475 |
| $k_{10}$ | 0.2051029 | 0.1169859 | 0.1130268 | 0.1010320 | 0.1076402 |
| $d_{10}$ (nm) | 37.506 | 20.540 | 14.059 | 12.433 | 101.817 |
| $n_{20}$ | 6.9151921 | 1.8488520 | 1.7087850 | 1.6946915 | 5.7702673 |
| $k_{20}$ | 0.6847654 | 0.3990514 | 0.2917115 | 0.2394813 | 0.5312541 |
| $d_{20}$ (nm) | 14.288 | 132.865 | 208.377 | 268.610 | 17.283 |
| When $n_1 \geqq n_{10}$, $n_{1m}$ = | 0.0713965 | 0.0757019 | 0.0971472 | 0.1115784 | 0.0520068 |
| When $n_1 < n_{10}$, $n_{1m}$ = | 0.0555054 | 0.0476453 | 0.0599609 | 0.0759399 | 0.0098120 |
| When $k_1 \geqq k_{10}$, $k_{1m}$ = | 0.0541125 | 0.0561304 | 0.0804553 | 0.1002258 | 0.0237036 |
| When $k_1 < k_{10}$, $k_{1m}$ = | 0.0773486 | 0.0843945 | 0.1004919 | 0.1010320 | 0.0377808 |
| When $d_1 \geqq d_{10}$, $d_{1m}$ (nm) = | 5.211 | 6.923 | 6.482 | 7.316 | 8.566 |
| When $d_1 < d_{10}$, $d_{1m}$ (nm) = | 3.920 | 3.580 | 3.648 | 4.569 | 1.552 |
| When $n_2 \geqq n_{20}$, $n_{2m}$ = | 0.1375024 | 0.1133521 | 0.1126624 | 0.1051160 | 0.0578821 |
| When $n_2 < n_{20}$, $n_{2m}$ = | 0.1468335 | 0.1457764 | 0.1432654 | 0.1327966 | 0.1020337 |
| When $k_2 \geqq k_{20}$, $k_{2m}$ = | 0.1698267 | 0.1546228 | 0.0978870 | 0.0916199 | 0.0398865 |
| When $k_2 < k_{20}$, $k_{2m}$ = | 0.1355151 | 0.0979541 | 0.0869165 | 0.0797766 | 0.0850256 |
| When $d_2 \geqq d_{20}$, $d_{2m}$ (nm) = | 0.302 | ∞ | ∞ | ∞ | 0.186 |
| When $d_2 < d_{20}$, $d_{2m}$ (nm) = | 0.308 | 25.359 | 77.278 | 123.573 | 0.315 |

-continued

| | $1.1 < NA \leqq 1.2$<br>$15 < T \leqq 25$ | | | | |
|---|---|---|---|---|---|
| Case | 2-06 | 2-07 | 2-08 | 2-09 | 2-10 |
| $n_{10}$ | 1.7189014 | 1.7208712 | 1.7236639 | 1.7047019 | 1.7084293 |
| $k_{10}$ | 0.0782837 | 0.0678223 | 0.0843652 | 0.0670962 | 0.0597123 |
| $d_{10}$ (nm) | 95.289 | 94.558 | 181.922 | 165.192 | 163.108 |
| $n_{20}$ | 1.6643388 | 1.6960341 | 5.6387216 | 1.6715149 | 1.7074208 |
| $k_{20}$ | 0.2165956 | 0.1841027 | 4.7363270 | 0.1999125 | 0.1697699 |
| $d_{20}$ (nm) | 204.139 | 257.386 | 0.821 | 198.564 | 251.199 |
| When $n_1 \geqq n_{10}$, $n_{1m}$ = | 0.0400110 | 0.0468091 | 0.0526855 | 0.0398865 | 0.0490320 |
| When $n_1 < n_{10}$, $n_{1m}$ = | 0.0126721 | 0.0238684 | 0.0001306 | 0.0279565 | 0.0460034 |
| When $k_1 \geqq k_{10}$, $k_{1m}$ = | 0.0335376 | 0.0489734 | 0.0020081 | 0.0268384 | 0.0389331 |
| When $k_1 < k_{10}$, $k_{1m}$ = | 0.0373218 | 0.0446973 | 0.0057251 | 0.0295178 | 0.0306982 |
| When $d_1 \geqq d_{10}$, $d_{1m}$ (nm) = | 16.137 | 28.984 | 27.528 | ∞ | ∞ |
| When $d_1 < d_{10}$, $d_{1m}$ (nm) = | 3.682 | 7.422 | 0.042 | 13.795 | 27.544 |
| When $n_2 \geqq n_{20}$, $n_{2m}$ = | 0.0331177 | 0.0610901 | 0.0075977 | 0.0397839 | 0.0734460 |
| When $n_2 < n_{20}$, $n_{2m}$ = | 0.0802783 | 0.0961804 | 0.6135461 | 0.0646704 | 0.0518091 |
| When $k_2 \geqq k_{20}$, $k_{2m}$ = | 0.0326062 | 0.0485974 | 0.0047754 | 0.0159570 | 0.0275537 |
| When $k_2 < k_{20}$, $k_{2m}$ = | 0.0528589 | 0.0519092 | 0.7998767 | 0.0474854 | 0.0482410 |
| When $d_2 \geqq d_{20}$, $d_{2m}$ (nm) = | ∞ | ∞ | 0.001 | 11.667 | ∞ |
| When $d_2 < d_{20}$, $d_{2m}$ (nm) = | 20.507 | 30.742 | 0.141 | 16.953 | 13.761 |

| | $1.1 < NA \leqq 1.2$<br>$15 < T \leqq 25$ | | | | 4/27 |
|---|---|---|---|---|---|
| Case | 2-11 | 2-12 | 2-13 | 2-14 | 2-15 |
| $n_{10}$ | 1.6912240 | 1.6881032 | 1.6896993 | 1.6917374 | 1.6948846 |
| $k_{10}$ | 0.0750717 | 0.0788193 | 0.0752193 | 0.0692921 | 0.0562662 |
| $d_{10}$ (nm) | 235.933 | 218.423 | 211.247 | 207.206 | 219.172 |
| $n_{20}$ | 5.6089359 | 1.7881557 | 1.7110684 | 1.6970724 | 1.6877325 |
| $k_{20}$ | 4.1789938 | 0.3823123 | 0.2595743 | 0.2053429 | 0.1673191 |
| $d_{20}$ (nm) | 0.921 | 76.059 | 147.061 | 213.576 | 255.276 |
| When $n_1 \geqq n_{10}$, $n_{1m}$ = | 0.0197583 | 0.0081677 | 0.0235974 | 0.0421069 | 0.0510120 |
| When $n_1 < n_{10}$, $n_{1m}$ = | 0.0774451 | 0.0583032 | 0.0505896 | 0.0462817 | 0.0590515 |
| When $k_1 \geqq k_{10}$, $k_{1m}$ = | 0.0246448 | 0.0223682 | 0.0406641 | 0.0495398 | 0.0510083 |
| When $k_1 < k_{10}$, $k_{1m}$ = | 0.0218396 | 0.0175671 | 0.0286658 | 0.0376331 | 0.0343799 |
| When $d_1 \geqq d_{10}$, $d_{1m}$ (nm) = | 6.504 | 3.634 | 18.131 | ∞ | ∞ |
| When $d_1 < d_{10}$, $d_{1m}$ (nm) = | 42.587 | 22.206 | 26.432 | 29.901 | 81.491 |
| When $n_2 \geqq n_{20}$, $n_{2m}$ = | 0.6544434 | 0.1247424 | 0.1252808 | 0.1545593 | 0.2162573 |
| When $n_2 < n_{20}$, $n_{2m}$ = | 0.2325012 | 0.0171619 | 0.0503735 | 0.1749207 | 0.1048962 |
| When $k_2 \geqq k_{20}$, $k_{2m}$ = | 0.1484387 | 0.0366235 | 0.0860120 | 0.1212268 | 0.1092822 |
| When $k_2 < k_{20}$, $k_{2m}$ = | 0.6595715 | 0.1036670 | 0.0844458 | 0.0781323 | 0.0604700 |
| When $d_2 \geqq d_{20}$, $d_{2m}$ (nm) = | 0.071 | 14.060 | ∞ | ∞ | ∞ |
| When $d_2 < d_{20}$, $d_{2m}$ (nm) = | 0.195 | 1.711 | 9.636 | 69.774 | 76.197 |

| | $1.1 < NA \leqq 1.2$<br>$15 < T \leqq 25$ | |
|---|---|---|
| Case | 2-16 | 2-17 |
| $n_{10}$ | 1.7002883 | 1.6987256 |
| $k_{10}$ | 0.0618224 | 0.0572006 |
| $d_{10}$ (nm) | 266.113 | 264.952 |
| $n_{20}$ | 1.7025341 | 1.6934905 |
| $k_{20}$ | 0.2096252 | 0.1744162 |
| $d_{20}$ (nm) | 206.193 | 266.771 |
| When $n_1 \geqq n_{10}$, $n_{1m}$ = | 0.0602454 | 0.0764587 |
| When $n_1 < n_{10}$, $n_{1m}$ = | 0.0381921 | 0.0594568 |
| When $k_1 \geqq k_{10}$, $k_{1m}$ = | 0.0482422 | 0.0536096 |
| When $k_1 < k_{10}$, $k_{1m}$ = | 0.0371497 | 0.0384741 |
| When $d_1 \geqq d_{10}$, $d_{1m}$ (nm) = | ∞ | ∞ |
| When $d_1 < d_{10}$, $d_{1m}$ (nm) = | 92.805 | 173.726 |
| When $n_2 \geqq n_{20}$, $n_{2m}$ = | 0.2779004 | 0.2751611 |
| When $n_2 < n_{20}$, $n_{2m}$ = | 0.2377234 | 0.2053577 |
| When $k_2 \geqq k_{20}$, $k_{2m}$ = | 0.2066309 | 0.2211816 |
| When $k_2 < k_{20}$, $k_{2m}$ = | 0.0931018 | 0.0797998 |
| When $d_2 \geqq d_{20}$, $d_{2m}$ (nm) = | ∞ | ∞ |
| When $d_2 < d_{20}$, $d_{2m}$ (nm) = | 73.805 | 125.295 |

| 1.1 < NA ≦ 1.2<br>25 < T ≦ 35 | | | | | 5/27 |
|---|---|---|---|---|---|
| Case | 3-01 | 3-02 | 3-03 | 3-04 | 3-05 |
| $n_{10}$ | 1.8384852 | 1.8997218 | 1.8867733 | 1.8774399 | 1.8168537 |
| $k_{10}$ | 0.2367471 | 0.1227276 | 0.1201944 | 0.1030917 | 0.1206742 |
| $d_{10}$ (nm) | 38.632 | 21.226 | 14.426 | 12.555 | 98.976 |
| $n_{20}$ | 4.7928214 | 1.8945709 | 1.7066853 | 1.6978346 | 5.6725781 |
| $k_{20}$ | 0.7766058 | 0.4412749 | 0.3085187 | 0.2515853 | 0.5943855 |
| $d_{20}$ (nm) | 20.034 | 121.762 | 200.277 | 259.495 | 16.950 |
| When $n_1 \geqq n_{10}$, $n_{1m}$ = | 0.0640527 | 0.0719128 | 0.0931812 | 0.1089819 | 0.0387244 |
| When $n_1 < n_{10}$, $n_{1m}$ = | 0.0455762 | 0.0458093 | 0.0565320 | 0.0737622 | 0.0048828 |
| When $k_1 \geqq k_{10}$, $k_{1m}$ = | 0.0510876 | 0.0524744 | 0.0764050 | 0.0973877 | 0.0168860 |
| When $k_1 < k_{10}$, $k_{1m}$ = | 0.0717981 | 0.0817957 | 0.0981750 | 0.1030917 | 0.0269836 |
| When $d_1 \geqq d_{10}$, $d_{1m}$ (nm) = | 4.733 | 6.228 | 6.172 | 6.944 | 6.776 |
| When $d_1 < d_{10}$, $d_{1m}$ (nm) = | 3.444 | 3.186 | 3.418 | 4.320 | 0.695 |
| When $n_2 \geqq n_{20}$, $n_{2m}$ = | 0.1712317 | 0.1175342 | 0.1094324 | 0.1025208 | 0.0610400 |
| When $n_2 < n_{20}$, $n_{2m}$ = | 0.1852917 | 0.1447205 | 0.1408899 | 0.1358679 | 0.1030127 |
| When $k_2 \geqq k_{20}$, $k_{2m}$ = | 0.2079944 | 0.1727771 | 0.0971545 | 0.0913745 | 0.0239368 |
| When $k_2 < k_{20}$, $k_{2m}$ = | 0.1709546 | 0.1005322 | 0.0873328 | 0.0807227 | 0.0995679 |
| When $d_2 \geqq d_{20}$, $d_{2m}$ (nm) = | 0.789 | ∞ | ∞ | ∞ | 0.191 |
| When $d_2 < d_{20}$, $d_{2m}$ (nm) = | 0.773 | 21.526 | 73.345 | 89.127 | 0.308 |

| 1.1 < NA ≦ 1.2<br>25 < T ≦ 35 | | | | | |
|---|---|---|---|---|---|
| Case | 3-06 | 3-07 | 3-08 | 3-09 | 3-10 |
| $n_{10}$ | 1.7203847 | 1.7222308 | 1.7051744 | 1.7089344 | 1.6891179 |
| $k_{10}$ | 0.0818178 | 0.0703272 | 0.0699535 | 0.0618729 | 0.0788518 |
| $d_{10}$ (nm) | 95.097 | 94.450 | 164.924 | 162.999 | 211.328 |
| $n_{20}$ | 1.6625491 | 1.6972414 | 1.6707295 | 1.7091982 | 1.7121044 |
| $k_{20}$ | 0.2295920 | 0.1929579 | 0.2115581 | 0.1777196 | 0.2799946 |
| $d_{20}$ (nm) | 195.706 | 248.789 | 190.095 | 242.642 | 139.125 |
| When $n_1 \geqq n_{10}$, $n_{1m}$ = | 0.0370166 | 0.0449036 | 0.0362634 | 0.0468103 | 0.0189148 |
| When $n_1 < n_{10}$, $n_{1m}$ = | 0.0096326 | 0.0211206 | 0.0148706 | 0.0438916 | 0.0495532 |
| When $k_1 \geqq k_{10}$, $k_{1m}$ = | 0.0279895 | 0.0455884 | 0.0190686 | 0.0333899 | 0.0327563 |
| When $k_1 < k_{10}$, $k_{1m}$ = | 0.0346558 | 0.0433374 | 0.0247266 | 0.0269507 | 0.0238696 |
| When $d_1 \geqq d_{10}$, $d_{1m}$ (nm) = | 14.187 | 22.312 | ∞ | ∞ | 9.561 |
| When $d_1 < d_{10}$, $d_{1m}$ (nm) = | 2.673 | 6.291 | 5.065 | 24.312 | 23.646 |
| When $n_2 \geqq n_{20}$, $n_{2m}$ = | 0.0267200 | 0.0590454 | 0.0307410 | 0.0721521 | 0.1253455 |
| When $n_2 < n_{20}$, $n_{2m}$ = | 0.0766724 | 0.0932019 | 0.0523315 | 0.0386328 | 0.0336450 |
| When $k_2 \geqq k_{20}$, $k_{2m}$ = | 0.0255017 | 0.0445288 | 0.0095300 | 0.0215259 | 0.0725635 |
| When $k_2 < k_{20}$, $k_{2m}$ = | 0.0521814 | 0.0521948 | 0.0465356 | 0.0485632 | 0.0779358 |
| When $d_2 \geqq d_{20}$, $d_{2m}$ (nm) = | ∞ | ∞ | 7.007 | 43.167 | ∞ |
| When $d_2 < d_{20}$, $d_{2m}$ (nm) = | 18.077 | 28.239 | 14.543 | 10.181 | 6.908 |

| 1.1 < NA ≦ 1.2<br>25 < T ≦ 35 | | | | 6/27 |
|---|---|---|---|---|
| Case | 3-11 | 3-12 | 3-13 | 3-14 |
| $n_{10}$ | 1.6914863 | 1.6947006 | 1.7002933 | 1.6987290 |
| $k_{10}$ | 0.0717884 | 0.0580661 | 0.0640004 | 0.0588877 |
| $d_{10}$ (nm) | 207.154 | 219.137 | 266.055 | 264.992 |
| $n_{20}$ | 1.6970451 | 1.6875442 | 1.7022941 | 1.6933668 |
| $k_{20}$ | 0.2167627 | 0.1751428 | 0.2216801 | 0.1822428 |
| $d_{20}$ (nm) | 205.768 | 246.865 | 198.139 | 258.415 |
| When $n_1 \geqq n_{10}$, $n_{1m}$ = | 0.0385889 | 0.0449475 | 0.0561011 | 0.0760583 |
| When $n_1 < n_{10}$, $n_{1m}$ = | 0.0454712 | 0.0531458 | 0.0356934 | 0.0583093 |
| When $k_1 \geqq k_{10}$, $k_{1m}$ = | 0.0478943 | 0.0493811 | 0.0460974 | 0.0520996 |
| When $k_1 < k_{10}$, $k_{1m}$ = | 0.0361658 | 0.0330811 | 0.0363293 | 0.0375061 |
| When $d_1 \geqq d_{10}$, $d_{1m}$ (nm) = | ∞ | ∞ | ∞ | ∞ |
| When $d_1 < d_{10}$, $d_{1m}$ (nm) = | 28.219 | 77.448 | 91.180 | 121.680 |
| When $n_2 \geqq n_{20}$, $n_{2m}$ = | 0.1522107 | 0.2230298 | 0.2904858 | 0.2858545 |
| When $n_2 < n_{20}$, $n_{2m}$ = | 0.1781921 | 0.1009351 | 0.2457825 | 0.2068896 |
| When $k_2 \geqq k_{20}$, $k_{2m}$ = | 0.1157642 | 0.1063892 | 0.2056812 | 0.2216101 |
| When $k_2 < k_{20}$, $k_{2m}$ = | 0.0805957 | 0.0617065 | 0.0977039 | 0.0829004 |
| When $d_2 \geqq d_{20}$, $d_{2m}$ (nm) = | ∞ | ∞ | ∞ | ∞ |
| When $d_2 < d_{20}$, $d_{2m}$ (nm) = | 66.127 | 48.464 | 70.211 | 121.644 |

-continued

| $1.1 < NA \leqq 1.2$, $35 < T \leqq 45$ | | | | | |
|---|---|---|---|---|---|
| Case | 4-01 | 4-02 | 4-03 | 4-04 | 4-05 |
| $n_{10}$ | 1.8909619 | 1.9211597 | 1.8908364 | 1.8788634 | 1.7209142 |
| $k_{10}$ | 0.2198688 | 0.1299283 | 0.1293290 | 0.1089981 | 0.0850231 |
| $d_{10}$ (nm) | 30.886 | 20.325 | 14.409 | 12.666 | 94.685 |
| $n_{20}$ | 2.4457650 | 1.8999891 | 1.6971949 | 1.6934061 | 1.6569532 |
| $k_{20}$ | 0.9042920 | 0.4762728 | 0.3219355 | 0.2597468 | 0.2398462 |
| $d_{20}$ (nm) | 40.480 | 114.977 | 192.850 | 251.595 | 187.582 |
| When $n_1 \geqq n_{10}$, $n_{1m}$ = | 0.0581348 | 0.0702795 | 0.0908240 | 0.1067529 | 0.0340771 |
| When $n_1 < n_{10}$, $n_{1m}$ = | 0.0408777 | 0.0430811 | 0.0541882 | 0.0719214 | 0.0077319 |
| When $k_1 \geqq k_{10}$, $k_{1m}$ = | 0.0449243 | 0.0499243 | 0.0741248 | 0.0961597 | 0.0239465 |
| When $k_1 < k_{10}$, $k_{1m}$ = | 0.0797229 | 0.0798120 | 0.0963696 | 0.1066907 | 0.0329150 |
| When $d_1 \geqq d_{10}$, $d_{1m}$ (nm) = | 4.322 | 5.448 | 5.786 | 6.719 | 11.856 |
| When $d_1 < d_{10}$, $d_{1m}$ (nm) = | 2.642 | 2.634 | 3.166 | 4.161 | 2.071 |
| When $n_2 \geqq n_{20}$, $n_{2m}$ = | 0.1853430 | 0.1162805 | 0.1041772 | 0.0995618 | 0.0224622 |
| When $n_2 < n_{20}$, $n_{2m}$ = | 0.1757385 | 0.1461218 | 0.1390881 | 0.1365247 | 0.0731372 |
| When $k_2 \geqq k_{20}$, $k_{2m}$ = | 0.2033411 | 0.1671118 | 0.0936316 | 0.0897620 | 0.0193579 |
| When $k_2 < k_{20}$, $k_{2m}$ = | 0.1615027 | 0.0988000 | 0.0865493 | 0.0806287 | 0.0502966 |
| When $d_2 \geqq d_{20}$, $d_{2m}$ (nm) = | 5.473 | ∞ | ∞ | ∞ | 13.590 |
| When $d_2 < d_{20}$, $d_{2m}$ (nm) = | 4.339 | 20.871 | 70.442 | 87.096 | 16.661 |

| $1.1 < NA \leqq 1.2$, $35 < T \leqq 45$ | | | | | |
|---|---|---|---|---|---|
| | | | | | 7/27 |
| Case | 4-06 | 4-07 | 4-08 | 4-09 | 4-10 |
| $n_{10}$ | 1.7236493 | 1.7053690 | 1.7096103 | 1.6884398 | 1.6913141 |
| $k_{10}$ | 0.0725136 | 0.0723352 | 0.0638708 | 0.0822671 | 0.0737244 |
| $d_{10}$ (nm) | 94.253 | 164.385 | 162.799 | 210.788 | 206.649 |
| $n_{20}$ | 1.6994520 | 1.6690598 | 1.7121782 | 1.7077650 | 1.6954335 |
| $k_{20}$ | 0.2004026 | 0.2212238 | 0.1844639 | 0.2979850 | 0.2262249 |
| $d_{20}$ (nm) | 239.752 | 181.544 | 233.616 | 132.459 | 199.430 |
| When $n_1 \geqq n_{10}$, $n_{1m}$ = | 0.0432617 | 0.0328076 | 0.0449390 | 0.0103259 | 0.0357813 |
| When $n_1 < n_{10}$, $n_{1m}$ = | 0.0189111 | 0.0081836 | 0.0418201 | 0.0476318 | 0.0441882 |
| When $k_1 \geqq k_{10}$, $k_{1m}$ = | 0.0428613 | 0.0134167 | 0.0270105 | 0.0240100 | 0.0467419 |
| When $k_1 < k_{10}$, $k_{1m}$ = | 0.0419373 | 0.0221985 | 0.0217126 | 0.0186353 | 0.0353625 |
| When $d_1 \geqq d_{10}$, $d_{1m}$ (nm) = | 19.395 | 21.834 | ∞ | 7.013 | ∞ |
| When $d_1 < d_{10}$, $d_{1m}$ (nm) = | 5.406 | 2.666 | 6.246 | 21.283 | 26.527 |
| When $n_2 \geqq n_{20}$, $n_{2m}$ = | 0.0587073 | 0.0279724 | 0.0684412 | 0.1217639 | 0.1437500 |
| When $n_2 < n_{20}$, $n_{2m}$ = | 0.0913135 | 0.0359949 | 0.0242969 | 0.0190967 | 0.1057874 |
| When $k_2 \geqq k_{20}$, $k_{2m}$ = | 0.0407703 | 0.0058350 | 0.0150317 | 0.0602039 | 0.1122632 |
| When $k_2 < k_{20}$, $k_{2m}$ = | 0.0523291 | 0.0449670 | 0.0490210 | 0.0601965 | 0.0826379 |
| When $d_2 \geqq d_{20}$, $d_{2m}$ (nm) = | ∞ | 4.683 | 36.767 | ∞ | ∞ |
| When $d_2 < d_{20}$, $d_{2m}$ (nm) = | 25.916 | 13.275 | 6.151 | 3.566 | 25.291 |

| $1.1 < NA \leqq 1.2$, $35 < T \leqq 45$ | | | |
|---|---|---|---|
| Case | 4-11 | 4-12 | 4-13 |
| $n_{10}$ | 1.6945163 | 1.7002615 | 1.6987767 |
| $k_{10}$ | 0.0596605 | 0.0658973 | 0.0602453 |
| $d_{10}$ (nm) | 219.093 | 265.562 | 264.538 |
| $n_{20}$ | 1.6879518 | 1.6991117 | 1.6924357 |
| $k_{20}$ | 0.1823501 | 0.2320843 | 0.1888152 |
| $d_{20}$ (nm) | 237.943 | 190.875 | 250.808 |
| When $n_1 \geqq n_{10}$, $n_{1m}$ = | 0.0400159 | 0.0514929 | 0.0760449 |
| When $n_1 < n_{10}$, $n_{1m}$ = | 0.0454590 | 0.0339758 | 0.0578162 |
| When $k_1 \geqq k_{10}$, $k_{1m}$ = | 0.0478894 | 0.0439832 | 0.0508728 |
| When $k_1 < k_{10}$, $k_{1m}$ = | 0.0318921 | 0.0347144 | 0.0365662 |
| When $d_1 \geqq d_{10}$, $d_{1m}$ (nm) = | ∞ | ∞ | ∞ |
| When $d_1 < d_{10}$, $d_{1m}$ (nm) = | 53.950 | 89.870 | 117.603 |
| When $n_2 \geqq n_{20}$, $n_{2m}$ = | 0.2316992 | 0.3028357 | 0.2948633 |
| When $n_2 < n_{20}$, $n_{2m}$ = | 0.0956519 | 0.2532336 | 0.2085193 |
| When $k_2 \geqq k_{20}$, $k_{2m}$ = | 0.1045911 | 0.2056006 | 0.2209802 |
| When $k_2 < k_{20}$, $k_{2m}$ = | 0.0612427 | 0.1002246 | 0.0860327 |
| When $d_2 \geqq d_{20}$, $d_{2m}$ (nm) = | ∞ | ∞ | ∞ |
| When $d_2 < d_{20}$, $d_{2m}$ (nm) = | 40.957 | 67.613 | 80.377 |

1.1 < NA ≦ 1.2
45 < T ≦ 55

8/27

| Case | 5-01 | 5-02 | 5-03 | 5-04 | 5-05 |
|---|---|---|---|---|---|
| $n_{10}$ | 1.9413239 | 1.8877645 | 1.8798429 | 1.7202563 | 1.7249517 |
| $k_{10}$ | 0.1405566 | 0.1445306 | 0.1135692 | 0.0870823 | 0.0739360 |
| $d_{10}$ (nm) | 18.043 | 14.095 | 12.637 | 94.214 | 94.041 |
| $n_{20}$ | 1.8442891 | 1.6688638 | 1.6888514 | 1.6489031 | 1.7027050 |
| $k_{20}$ | 0.4845639 | 0.3235014 | 0.2638544 | 0.2445724 | 0.2047377 |
| $d_{20}$ (nm) | 113.109 | 187.292 | 243.053 | 179.182 | 229.905 |
| When $n_1 \geqq n_{10}$, $n_{1m}$ = | 0.0724768 | 0.0904346 | 0.1062329 | 0.0324084 | 0.0425623 |
| When $n_1 < n_{10}$, $n_{1m}$ = | 0.0387427 | 0.0534119 | 0.0716968 | 0.0082080 | 0.0177209 |
| When $k_1 \geqq k_{10}$, $k_{1m}$ = | 0.0483630 | 0.0753357 | 0.0968298 | 0.0243140 | 0.0418030 |
| When $k_1 < k_{10}$, $k_{1m}$ = | 0.0803040 | 0.0945715 | 0.1060376 | 0.0343469 | 0.0406653 |
| When $d_1 \geqq d_{10}$, $d_{1m}$ (nm) = | 4.823 | 5.486 | 6.573 | 10.670 | 17.560 |
| When $d_1 < d_{10}$, $d_{1m}$ (nm) = | 2.042 | 3.025 | 4.077 | 2.161 | 4.892 |
| When $n_2 \geqq n_{20}$, $n_{2m}$ = | 0.1074292 | 0.0972339 | 0.0967822 | 0.0242322 | 0.0621313 |
| When $n_2 < n_{20}$, $n_{2m}$ = | 0.1555688 | 0.1383643 | 0.1358411 | 0.0727905 | 0.0930249 |
| When $k_2 \geqq k_{20}$, $k_{2m}$ = | 0.1308459 | 0.0862097 | 0.0881348 | 0.0180859 | 0.0388489 |
| When $k_2 < k_{20}$, $k_{2m}$ = | 0.0911877 | 0.0843787 | 0.0806641 | 0.0488940 | 0.0530957 |
| When $d_2 \geqq d_{20}$, $d_{2m}$ (nm) = | ∞ | ∞ | ∞ | 10.287 | ∞ |
| When $d_2 < d_{20}$, $d_{2m}$ (nm) = | 20.712 | 69.838 | 88.098 | 16.560 | 20.064 |

1.1 < NA ≦ 1.2
45 < T ≦ 55

| Case | 5-06 | 5-07 | 5-08 | 5-09 | 5-10 |
|---|---|---|---|---|---|
| $n_{10}$ | 1.7053831 | 1.7104785 | 1.6877471 | 1.6915115 | 1.6941672 |
| $k_{10}$ | 0.0736370 | 0.0654156 | 0.0844092 | 0.0739491 | 0.0608347 |
| $d_{10}$ (nm) | 163.843 | 162.671 | 209.661 | 205.513 | 218.889 |
| $n_{20}$ | 1.6671854 | 1.7160090 | 1.6959640 | 1.6904122 | 1.6879018 |
| $k_{20}$ | 0.2267475 | 0.1885946 | 0.3073448 | 0.2298496 | 0.1872431 |
| $d_{20}$ (nm) | 172.382 | 223.774 | 127.018 | 196.556 | 228.501 |
| When $n_1 \geqq n_{10}$, $n_{1m}$ = | 0.0309619 | 0.0440515 | 0.0051978 | 0.0335425 | 0.0357227 |
| When $n_1 < n_{10}$, $n_{1m}$ = | 0.0112268 | 0.0078247 | 0.0453333 | 0.0430493 | 0.0410388 |
| When $k_1 \geqq k_{10}$, $k_{1m}$ = | 0.0149072 | 0.0196375 | 0.0173291 | 0.0473206 | 0.0467871 |
| When $k_1 < k_{10}$, $k_{1m}$ = | 0.0262830 | 0.0141846 | 0.0154602 | 0.0372058 | 0.0305029 |
| When $d_1 \geqq d_{10}$, $d_{1m}$ (nm) = | 19.247 | ∞ | 2.276 | ∞ | ∞ |
| When $d_1 < d_{10}$, $d_{1m}$ (nm) = | 3.447 | 2.046 | 19.587 | 24.997 | 50.391 |
| When $n_2 \geqq n_{20}$, $n_{2m}$ = | 0.0348413 | 0.0672729 | 0.1107800 | 0.1391333 | 0.2394653 |
| When $n_2 < n_{20}$, $n_{2m}$ = | 0.0292676 | 0.0106921 | 0.0107263 | 0.0732312 | 0.0890649 |
| When $k_2 \geqq k_{20}$, $k_{2m}$ = | 0.0073389 | 0.0081616 | 0.0597644 | 0.1152246 | 0.1047815 |
| When $k_2 < k_{20}$, $k_{2m}$ = | 0.0445459 | 0.0504346 | 0.0379138 | 0.0797473 | 0.0602527 |
| When $d_2 \geqq d_{20}$, $d_{2m}$ (nm) = | 6.326 | 35.781 | 32.689 | ∞ | ∞ |
| When $d_2 < d_{20}$, $d_{2m}$ (nm) = | 11.802 | 2.505 | 1.901 | 20.558 | 36.515 |

1.1 < NA ≦ 1.2
45 < T ≦ 55

9/27

| Case | 5-11 | 5-12 | 5-13 |
|---|---|---|---|
| $n_{10}$ | 1.6941096 | 1.7000691 | 1.6987341 |
| $k_{10}$ | 0.0560046 | 0.0669711 | 0.0608862 |
| $d_{10}$ (nm) | 215.482 | 264.757 | 263.855 |
| $n_{20}$ | 1.6938988 | 1.6924460 | 1.6911373 |
| $k_{20}$ | 0.1599964 | 0.2378630 | 0.1924284 |
| $d_{20}$ (nm) | 287.470 | 184.028 | 243.250 |
| When $n_1 \geqq n_{10}$, $n_{1m}$ = | 0.0468335 | 0.0484424 | 0.0766663 |
| When $n_1 < n_{10}$, $n_{1m}$ = | 0.0625427 | 0.0333350 | 0.0582520 |
| When $k_1 \geqq k_{10}$, $k_{1m}$ = | 0.0574133 | 0.0424146 | 0.0503235 |
| When $k_1 < k_{10}$, $k_{1m}$ = | 0.0373425 | 0.0336023 | 0.0357239 |
| When $d_1 \geqq d_{10}$, $d_{1m}$ (nm) = | ∞ | ∞ | ∞ |
| When $d_1 < d_{10}$, $d_{1m}$ (nm) = | 47.031 | 45.336 | 115.043 |
| When $n_2 \geqq n_{20}$, $n_{2m}$ = | 0.2184277 | 0.3156848 | 0.3032751 |
| When $n_2 < n_{20}$, $n_{2m}$ = | 0.1528296 | 0.2586377 | 0.2107019 |
| When $k_2 \geqq k_{20}$, $k_{2m}$ = | 0.1238171 | 0.2073083 | 0.2191870 |
| When $k_2 < k_{20}$, $k_{2m}$ = | 0.0588196 | 0.0981323 | 0.0862329 |
| When $d_2 \geqq d_{20}$, $d_{2m}$ (nm) = | ∞ | ∞ | ∞ |
| When $d_2 < d_{20}$, $d_{2m}$ (nm) = | 85.352 | 66.135 | 78.131 |

-continued

| Case | 1.1 < NA ≦ 1.2<br>55 < T ≦ 65<br>6-01 | 6-02 | 6-03 | 6-04 | 6-05 |
|---|---|---|---|---|---|
| $n_{10}$ | 1.8998120 | 1.9599431 | 1.8792360 | 1.8920036 | 1.7198405 |
| $k_{10}$ | 0.2622743 | 0.1538418 | 0.1119058 | 0.0671877 | 0.0878543 |
| $d_{10}$ (nm) | 21.573 | 15.993 | 12.895 | 11.926 | 93.971 |
| $n_{20}$ | 1.6944131 | 1.7907917 | 1.6940206 | 1.7462722 | 1.6452515 |
| $k_{20}$ | 0.7809017 | 0.4780154 | 0.2681658 | 0.2347435 | 0.2473168 |
| $d_{20}$ (nm) | 53.320 | 111.028 | 231.714 | 280.522 | 169.419 |
| When $n_1 \geqq n_{10}$, $n_{1m}$ = | 0.0603137 | 0.0799158 | 0.1051331 | 0.1164221 | 0.0325574 |
| When $n_1 < n_{10}$, $n_{1m}$ = | 0.0246228 | 0.0339001 | 0.0713818 | 0.0790796 | 0.0109656 |
| When $k_1 \geqq k_{10}$, $k_{1m}$ = | 0.0436731 | 0.0463733 | 0.0957117 | 0.1011499 | 0.0282458 |
| When $k_1 < k_{10}$, $k_{1m}$ = | 0.0527222 | 0.0842969 | 0.1045093 | 0.0671877 | 0.0383301 |
| When $d_1 \geqq d_{10}$, $d_{1m}$ (nm) = | 3.630 | 4.315 | 6.630 | 7.111 | 10.486 |
| When $d_1 < d_{10}$, $d_{1m}$ (nm) = | 1.338 | 1.548 | 4.149 | 4.416 | 2.879 |
| When $n_2 \geqq n_{20}$, $n_{2m}$ = | 0.1220337 | 0.0996899 | 0.0944202 | 0.0992114 | 0.0312585 |
| When $n_2 < n_{20}$, $n_{2m}$ = | 0.0963342 | 0.1728088 | 0.1384424 | 0.1517053 | 0.0751245 |
| When $k_2 \geqq k_{20}$, $k_{2m}$ = | 0.0896167 | 0.0986731 | 0.0889478 | 0.0981226 | 0.0215662 |
| When $k_2 < k_{20}$, $k_{2m}$ = | 0.0868945 | 0.0892566 | 0.0826782 | 0.0802551 | 0.0503503 |
| When $d_2 \geqq d_{20}$, $d_{2m}$ (nm) = | 14.581 | ∞ | ∞ | ∞ | 10.833 |
| When $d_2 < d_{20}$, $d_{2m}$ (nm) = | 7.202 | 14.530 | 88.193 | 126.095 | 17.275 |

| Case | 1.1 < NA ≦ 1.2<br>55 < T ≦ 65<br>6-06 | 6-07 | 6-08 | 6-09 | 10/27<br>6-10 |
|---|---|---|---|---|---|
| $n_{10}$ | 1.7267515 | 1.7286377 | 1.7058235 | 1.6871196 | 1.6936372 |
| $k_{10}$ | 0.0746914 | 0.0697592 | 0.0740364 | 0.0856014 | 0.0616799 |
| $d_{10}$ (nm) | 93.982 | 94.711 | 163.674 | 208.540 | 218.466 |
| $n_{20}$ | 1.7088385 | 1.7257237 | 1.6690540 | 1.6832134 | 1.6877720 |
| $k_{20}$ | 0.2076415 | 0.1796886 | 0.2306007 | 0.3092532 | 0.1900717 |
| $d_{20}$ (nm) | 218.911 | 273.487 | 161.946 | 121.170 | 218.772 |
| When $n_1 \geqq n_{10}$, $n_{1m}$ = | 0.0431396 | 0.0483069 | 0.0312061 | 0.0049573 | 0.0327710 |
| When $n_1 < n_{10}$, $n_{1m}$ = | 0.0172424 | 0.0116125 | 0.0175793 | 0.0417786 | 0.0401648 |
| When $k_1 \geqq k_{10}$, $k_{1m}$ = | 0.0418896 | 0.0318958 | 0.0202844 | 0.0152393 | 0.0462805 |
| When $k_1 < k_{10}$, $k_{1m}$ = | 0.0396252 | 0.0362695 | 0.0328467 | 0.0174036 | 0.0298352 |
| When $d_1 \geqq d_{10}$, $d_{1m}$ (nm) = | 17.247 | 40.127 | 17.394 | 2.172 | ∞ |
| When $d_1 < d_{10}$, $d_{1m}$ (nm) = | 4.621 | 3.300 | 5.870 | 18.309 | 47.643 |
| When $n_2 \geqq n_{20}$, $n_{2m}$ = | 0.0684570 | 0.0868091 | 0.0312744 | 0.1009155 | 0.2431030 |
| When $n_2 < n_{20}$, $n_{2m}$ = | 0.0962207 | 0.1095422 | 0.0318677 | 0.0098169 | 0.0838513 |
| When $k_2 \geqq k_{20}$, $k_{2m}$ = | 0.0394080 | 0.0515259 | 0.0123767 | 0.0719922 | 0.1060815 |
| When $k_2 < k_{20}$, $k_{2m}$ = | 0.0553357 | 0.0549243 | 0.0471436 | 0.0304236 | 0.0607056 |
| When $d_2 \geqq d_{20}$, $d_{2m}$ (nm) = | ∞ | ∞ | 9.995 | 25.676 | ∞ |
| When $d_2 < d_{20}$, $d_{2m}$ (nm) = | 15.791 | 73.815 | 10.017 | 1.682 | 28.435 |

| Case | 1.1 < NA ≦ 1.2<br>55 < T ≦ 65<br>6-11 | 6-12 |
|---|---|---|
| $n_{10}$ | 1.6996002 | 1.6985143 |
| $k_{10}$ | 0.0674630 | 0.0611760 |
| $d_{10}$ (nm) | 264.231 | 263.586 |
| $n_{20}$ | 1.6851097 | 1.6903246 |
| $k_{20}$ | 0.2396601 | 0.1936289 |
| $d_{20}$ (nm) | 175.944 | 234.054 |
| When $n_1 \geqq n_{10}$, $n_{1m}$ = | 0.0469604 | 0.0772302 |
| When $n_1 < n_{10}$, $n_{1m}$ = | 0.0345850 | 0.0600415 |
| When $k_1 \geqq k_{10}$, $k_{1m}$ = | 0.0413989 | 0.0503625 |
| When $k_1 < k_{10}$, $k_{1m}$ = | 0.0326746 | 0.0352795 |
| When $d_1 \geqq d_{10}$, $d_{1m}$ (nm) = | ∞ | ∞ |
| When $d_1 < d_{10}$, $d_{1m}$ (nm) = | 35.789 | 113.370 |
| When $n_2 \geqq n_{20}$, $n_{2m}$ = | 0.3361853 | 0.3175012 |
| When $n_2 < n_{20}$, $n_{2m}$ = | 0.2595898 | 0.2115027 |
| When $k_2 \geqq k_{20}$, $k_{2m}$ = | 0.2087170 | 0.2189661 |
| When $k_2 < k_{20}$, $k_{2m}$ = | 0.0954248 | 0.0859949 |
| When $d_2 \geqq d_{20}$, $d_{2m}$ (nm) = | ∞ | ∞ |
| When $d_2 < d_{20}$, $d_{2m}$ (nm) = | 64.780 | 74.733 |

1.1 < NA ≦ 1.2
65 < T ≦ 75

11/27

| Case | 7-01 | 7-02 | 7-03 | 7-04 | 7-05 |
|---|---|---|---|---|---|
| $n_{10}$ | 1.8814830 | 1.9657443 | 1.8787154 | 1.8913468 | 1.7209187 |
| $k_{10}$ | 0.2936564 | 0.1688741 | 0.1109169 | 0.0695388 | 0.0883668 |
| $d_{10}$ (nm) | 22.098 | 15.852 | 13.263 | 12.162 | 94.055 |
| $n_{20}$ | 1.6321609 | 1.7726563 | 1.6996278 | 1.7469121 | 1.6482914 |
| $k_{20}$ | 0.8097385 | 0.4923001 | 0.2745566 | 0.2387131 | 0.2540527 |
| $d_{20}$ (nm) | 46.190 | 103.170 | 220.404 | 270.807 | 158.511 |
| When $n_1 \geqq n_{10}$, $n_{1m}$ = | 0.0656360 | 0.0817346 | 0.1037085 | 0.1149512 | 0.0333252 |
| When $n_1 < n_{10}$, $n_{1m}$ = | 0.0241089 | 0.0282544 | 0.0702112 | 0.0769897 | 0.0127490 |
| When $k_1 \geqq k_{10}$, $k_{1m}$ = | 0.0378577 | 0.0400220 | 0.0934888 | 0.0991272 | 0.0301257 |
| When $k_1 < k_{10}$, $k_{1m}$ = | 0.0323035 | 0.0824512 | 0.1025916 | 0.0695388 | 0.0388867 |
| When $d_1 \geqq d_{10}$, $d_{1m}$ (nm) = | 3.610 | 3.980 | 6.711 | 7.159 | 10.691 |
| When $d_1 < d_{10}$, $d_{1m}$ (nm) = | 1.297 | 1.237 | 4.191 | 4.366 | 3.330 |
| When $n_2 \geqq n_{20}$, $n_{2m}$ = | 0.1024585 | 0.0947095 | 0.0935791 | 0.1004138 | 0.0355066 |
| When $n_2 < n_{20}$, $n_{2m}$ = | 0.0645630 | 0.1828857 | 0.1422339 | 0.1540833 | 0.0767798 |
| When $k_2 \geqq k_{20}$, $k_{2m}$ = | 0.0898303 | 0.0894482 | 0.0904114 | 0.0989551 | 0.0244946 |
| When $k_2 < k_{20}$, $k_{2m}$ = | 0.1003796 | 0.0949036 | 0.0851941 | 0.0816284 | 0.0535193 |
| When $d_2 \geqq d_{20}$, $d_{2m}$ (nm) = | 11.613 | ∞ | ∞ | ∞ | 11.010 |
| When $d_2 < d_{20}$, $d_{2m}$ (nm) = | 4.416 | 10.112 | 84.053 | 124.915 | 16.505 |

1.1 < NA ≦ 1.2
65 < T ≦ 75

| Case | 7-06 | 7-07 | 7-08 | 7-09 | 7-10 |
|---|---|---|---|---|---|
| $n_{10}$ | 1.7288665 | 1.7286370 | 1.7068032 | 1.6862856 | 1.6931399 |
| $k_{10}$ | 0.0756184 | 0.0709992 | 0.0744994 | 0.0878163 | 0.0624918 |
| $d_{10}$ (nm) | 94.090 | 94.923 | 163.814 | 208.124 | 217.968 |
| $n_{20}$ | 1.7153723 | 1.7241262 | 1.6739446 | 1.6736237 | 1.6872372 |
| $k_{20}$ | 0.2125971 | 0.1831189 | 0.2371534 | 0.3138657 | 0.1926334 |
| $d_{20}$ (nm) | 207.924 | 263.961 | 151.052 | 112.320 | 209.546 |
| When $n_1 \geqq n_{10}$, $n_{1m}$ = | 0.0437573 | 0.0483350 | 0.0322754 | 0.0025049 | 0.0316833 |
| When $n_1 < n_{10}$, $n_{1m}$ = | 0.0164966 | 0.0099878 | 0.0175537 | 0.0409570 | 0.0419177 |
| When $k_1 \geqq k_{10}$, $k_{1m}$ = | 0.0410425 | 0.0291785 | 0.0221094 | 0.0095605 | 0.0459827 |
| When $k_1 < k_{10}$, $k_{1m}$ = | 0.0388428 | 0.0344531 | 0.0333215 | 0.0151172 | 0.0300720 |
| When $d_1 \geqq d_{10}$, $d_{1m}$ (nm) = | 17.329 | 38.775 | 18.851 | 1.009 | ∞ |
| When $d_1 < d_{10}$, $d_{1m}$ (nm) = | 4.318 | 2.813 | 6.154 | 17.032 | 45.887 |
| When $n_2 \geqq n_{20}$, $n_{2m}$ = | 0.0710437 | 0.0893457 | 0.0302136 | 0.1037878 | 0.2406421 |
| When $n_2 < n_{20}$, $n_{2m}$ = | 0.0969080 | 0.1083484 | 0.0331750 | 0.0056763 | 0.0830054 |
| When $k_2 \geqq k_{20}$, $k_{2m}$ = | 0.0400586 | 0.0500842 | 0.0147241 | 0.0658289 | 0.1059290 |
| When $k_2 < k_{20}$, $k_{2m}$ = | 0.0574512 | 0.0562378 | 0.0506323 | 0.0175342 | 0.0630762 |
| When $d_2 \geqq d_{20}$, $d_{2m}$ (nm) = | ∞ | ∞ | 10.293 | 26.205 | ∞ |
| When $d_2 < d_{20}$, $d_{2m}$ (nm) = | 13.701 | 72.849 | 8.984 | 0.992 | 28.220 |

1.1 < NA ≦ 1.2
65 < T ≦ 75

12/27

| Case | 7-11 | 7-12 | 7-13 |
|---|---|---|---|
| $n_{10}$ | 1.6935780 | 1.6987845 | 1.6982075 |
| $k_{10}$ | 0.0575917 | 0.0682876 | 0.0620058 |
| $d_{10}$ (nm) | 214.501 | 264.829 | 264.409 |
| $n_{20}$ | 1.6927449 | 1.6826884 | 1.6907687 |
| $k_{20}$ | 0.1631490 | 0.2430960 | 0.1959423 |
| $d_{20}$ (nm) | 269.036 | 164.540 | 222.065 |
| When $n_1 \geqq n_{10}$, $n_{1m}$ = | 0.0479456 | 0.0478223 | 0.0756042 |
| When $n_1 < n_{10}$, $n_{1m}$ = | 0.0597888 | 0.0375256 | 0.0523840 |
| When $k_1 \geqq k_{10}$, $k_{1m}$ = | 0.0567029 | 0.0406042 | 0.0502747 |
| When $k_1 < k_{10}$, $k_{1m}$ = | 0.0379382 | 0.0306238 | 0.0354358 |
| When $d_1 \geqq d_{10}$, $d_{1m}$ (nm) = | ∞ | ∞ | ∞ |
| When $d_1 < d_{10}$, $d_{1m}$ (nm) = | 42.775 | 36.115 | 105.289 |
| When $n_2 \geqq n_{20}$, $n_{2m}$ = | 0.2180396 | 0.3702002 | 0.3412915 |
| When $n_2 < n_{20}$, $n_{2m}$ = | 0.1575122 | 0.2565369 | 0.2093115 |
| When $k_2 \geqq k_{20}$, $k_{2m}$ = | 0.1278589 | 0.2070850 | 0.2215063 |
| When $k_2 < k_{20}$, $k_{2m}$ = | 0.0614197 | 0.0951270 | 0.0864294 |
| When $d_2 \geqq d_{20}$, $d_{2m}$ (nm) = | ∞ | ∞ | ∞ |
| When $d_2 < d_{20}$, $d_{2m}$ (nm) = | 81.766 | 63.144 | 76.945 |

-continued

| | 1.1 < NA ≦ 1.2 75 < T ≦ 85 | | | | |
|---|---|---|---|---|---|
| Case | 8-01 | 8-02 | 8-03 | 8-04 | 8-05 |
| $n_{10}$ | 1.8508920 | 1.9432602 | 1.8788012 | 1.8809660 | 1.8914032 |
| $k_{10}$ | 0.3299462 | 0.1828608 | 0.1571474 | 0.1122948 | 0.0691945 |
| $d_{10}$ (nm) | 26.713 | 18.534 | 15.200 | 13.670 | 12.762 |
| $n_{20}$ | 1.6561984 | 1.7922587 | 1.6553949 | 1.7045069 | 1.7559855 |
| $k_{20}$ | 1.0215947 | 0.5435792 | 0.3498651 | 0.2862016 | 0.2487147 |
| $d_{20}$ (nm) | 31.481 | 89.452 | 157.519 | 210.391 | 259.753 |
| When $n_1 \geqq n_{10}$, $n_{1m}$ = | 0.0584900 | 0.0721143 | 0.0859290 | 0.1006885 | 0.1098987 |
| When $n_1 < n_{10}$, $n_{1m}$ = | 0.0118384 | 0.0258594 | 0.0490076 | 0.0672168 | 0.0736646 |
| When $k_1 \geqq k_{10}$, $k_{1m}$ = | 0.0281628 | 0.0341772 | 0.0681653 | 0.0888281 | 0.0935315 |
| When $k_1 < k_{10}$, $k_{1m}$ = | 0.0027112 | 0.0735254 | 0.0892920 | 0.1016174 | 0.0691945 |
| When $d_1 \geqq d_{10}$, $d_{1m}$ (nm) = | 3.227 | 4.317 | 5.436 | 6.605 | 7.111 |
| When $d_1 < d_{10}$, $d_{1m}$ (nm) = | 0.304 | 1.291 | 2.967 | 4.063 | 4.341 |
| When $n_2 \geqq n_{20}$, $n_{2m}$ = | 0.1267358 | 0.0961279 | 0.0835156 | 0.0933350 | 0.1000793 |
| When $n_2 < n_{20}$, $n_{2m}$ = | 0.0093018 | 0.1747852 | 0.1389221 | 0.1466003 | 0.1520386 |
| When $k_2 \geqq k_{20}$, $k_{2m}$ = | 0.0170300 | 0.1198535 | 0.0846472 | 0.0918018 | 0.1012305 |
| When $k_2 < k_{20}$, $k_{2m}$ = | 0.1219019 | 0.1040369 | 0.0912122 | 0.0867468 | 0.0829492 |
| When $d_2 \geqq d_{20}$, $d_{2m}$ (nm) = | 8.195 | ∞ | ∞ | ∞ | ∞ |
| When $d_2 < d_{20}$, $d_{2m}$ (nm) = | 0.369 | 9.559 | 36.990 | 78.480 | 119.640 |

| | 1.1 < NA ≦ 1.2 75 < T ≦ 85 | | | | |
|---|---|---|---|---|---|
| | | | | | 13/27 |
| Case | 8-06 | 8-07 | 8-08 | 8-09 | 8-10 |
| $n_{10}$ | 1.7233184 | 1.7297992 | 1.7292921 | 1.7076375 | 1.6902915 |
| $k_{10}$ | 0.0905387 | 0.0774990 | 0.0722395 | 0.0765186 | 0.0790058 |
| $d_{10}$ (nm) | 94.254 | 94.232 | 94.957 | 163.992 | 206.654 |
| $n_{20}$ | 1.6520214 | 1.7157415 | 1.7247476 | 1.6752795 | 1.6879680 |
| $k_{20}$ | 0.2670378 | 0.2209454 | 0.1892941 | 0.2482558 | 0.2475793 |
| $d_{20}$ (nm) | 148.504 | 198.899 | 254.857 | 141.650 | 161.284 |
| When $n_1 \geqq n_{10}$, $n_{1m}$ = | 0.0327246 | 0.0427734 | 0.0473462 | 0.0318115 | 0.0212964 |
| When $n_1 < n_{10}$, $n_{1m}$ = | 0.0093958 | 0.0147302 | 0.0094299 | 0.0087695 | 0.0407813 |
| When $k_1 \geqq k_{10}$, $k_{1m}$ = | 0.0245129 | 0.0376636 | 0.0278931 | 0.0137170 | 0.0408545 |
| When $k_1 < k_{10}$, $k_{1m}$ = | 0.0384680 | 0.0381934 | 0.0341284 | 0.0285461 | 0.0259851 |
| When $d_1 \geqq d_{10}$, $d_{1m}$ (nm) = | 10.366 | 16.607 | 38.446 | 19.131 | 18.064 |
| When $d_1 < d_{10}$, $d_{1m}$ (nm) = | 2.389 | 3.804 | 2.614 | 2.661 | 24.299 |
| When $n_2 \geqq n_{20}$, $n_{2m}$ = | 0.0285376 | 0.0673352 | 0.0815320 | 0.0313904 | 0.1426208 |
| When $n_2 < n_{20}$, $n_{2m}$ = | 0.0743250 | 0.0929968 | 0.1051160 | 0.0237683 | 0.0535938 |
| When $k_2 \geqq k_{20}$, $k_{2m}$ = | 0.0198962 | 0.0371387 | 0.0465576 | 0.0076379 | 0.0976270 |
| When $k_2 < k_{20}$, $k_{2m}$ = | 0.0547290 | 0.0576892 | 0.0565930 | 0.0508740 | 0.0749768 |
| When $d_2 \geqq d_{20}$, $d_{2m}$ (nm) = | 8.585 | ∞ | ∞ | 6.981 | ∞ |
| When $d_2 < d_{20}$, $d_{2m}$ (nm) = | 13.959 | 13.822 | 33.284 | 7.469 | 13.904 |

| | 1.1 < NA ≦ 1.2 75 < T ≦ 85 | | | | |
|---|---|---|---|---|---|
| Case | 8-11 | 8-12 | 8-13 | 8-14 | 8-15 |
| $n_{10}$ | 1.6929156 | 1.6935338 | 1.6984313 | 1.6980068 | 1.6970347 |
| $k_{10}$ | 0.0637318 | 0.0581307 | 0.0697413 | 0.0633264 | 0.0530849 |
| $d_{10}$ (nm) | 217.693 | 214.870 | 266.256 | 265.782 | 275.682 |
| $n_{20}$ | 1.6856131 | 1.6920922 | 1.6871666 | 1.6912942 | 1.6884244 |
| $k_{20}$ | 0.1973081 | 0.1667488 | 0.2538157 | 0.2022310 | 0.1714348 |
| $d_{20}$ (nm) | 201.188 | 259.776 | 152.235 | 210.360 | 256.304 |
| When $n_1 \geqq n_{10}$, $n_{1m}$ = | 0.0321716 | 0.0471802 | 0.0486719 | 0.0738318 | 0.0569543 |
| When $n_1 < n_{10}$, $n_{1m}$ = | 0.0414331 | 0.0603931 | 0.0363989 | 0.0470300 | 0.0427893 |
| When $k_1 \geqq k_{10}$, $k_{1m}$ = | 0.0451428 | 0.0559961 | 0.0398804 | 0.0494763 | 0.0598206 |
| When $k_1 < k_{10}$, $k_{1m}$ = | 0.0289417 | 0.0378210 | 0.0291638 | 0.0345105 | 0.0376172 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 45.410 | 42.667 | 37.515 | 100.900 | 104.445 |
| When $n_2 \geqq n_{20}$, $n_{2m}$ = | 0.2377576 | 0.2179382 | 0.2594739 | 0.3590393 | 0.2768311 |
| When $n_2 < n_{20}$, $n_{2m}$ = | 0.0859351 | 0.1565027 | 0.2556433 | 0.2089795 | 0.2197266 |
| When $k_2 \geqq k_{20}$, $k_{2m}$ = | 0.1024292 | 0.1246008 | 0.1994592 | 0.2211169 | 0.1929004 |
| When $k_2 < k_{20}$, $k_{2m}$ = | 0.0656946 | 0.0632471 | 0.1014087 | 0.0895886 | 0.0738538 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 33.167 | 82.155 | 62.366 | 73.160 | 83.598 |

1.1 < NA ≦ 1.2
85 < T ≦ 95

14/27

| Case | 9-01 | 9-02 | 9-03 | 9-04 | 9-05 |
| --- | --- | --- | --- | --- | --- |
| $n_{10}$ | 1.9192397 | 1.8910111 | 1.8874292 | 1.8928956 | 1.7266669 |
| $k_{10}$ | 0.1987767 | 0.1570861 | 0.1170062 | 0.0800147 | 0.0953661 |
| $d_{10}$ (nm) | 21.654 | 15.844 | 13.907 | 12.695 | 94.323 |
| $n_{20}$ | 1.8264016 | 1.6782576 | 1.7063011 | 1.7424852 | 1.6542284 |
| $k_{20}$ | 0.6189774 | 0.3828036 | 0.3024107 | 0.2571531 | 0.2869718 |
| $d_{20}$ (nm) | 76.882 | 146.288 | 201.867 | 254.323 | 139.595 |
| When $n_1 \geqq n_{10}$, $n_{1m}$ = | 0.0649170 | 0.0821021 | 0.0973254 | 0.1089844 | 0.0299609 |
| When $n_1 < n_{10}$, $n_{1m}$ = | 0.0262927 | 0.0442981 | 0.0631677 | 0.0721631 | 0.0018164 |
| When $k_1 \geqq k_{10}$, $k_{1m}$ = | 0.0313647 | 0.0611023 | 0.0836865 | 0.0928955 | 0.0075598 |
| When $k_1 < k_{10}$, $k_{1m}$ = | 0.0678699 | 0.0898816 | 0.1010254 | 0.0800147 | 0.0251917 |
| When $d_1 \geqq d_{10}$, $d_{1m}$ (nm) = | 4.482 | 5.181 | 6.239 | 6.859 | 9.178 |
| When $d_1 < d_{10}$, $d_{1m}$ (nm) = | 1.480 | 2.625 | 3.732 | 4.138 | 0.436 |
| When $n_2 \geqq n_{20}$, $n_{2m}$ = | 0.0987671 | 0.0845752 | 0.0932324 | 0.0997229 | 0.0068860 |
| When $n_2 < n_{20}$, $n_{2m}$ = | 0.1650610 | 0.1381567 | 0.1431714 | 0.1501294 | 0.0677319 |
| When $k_2 \geqq k_{20}$, $k_{2m}$ = | 0.1657446 | 0.0892700 | 0.0918542 | 0.0980688 | 0.0046692 |
| When $k_2 < k_{20}$, $k_{2m}$ = | 0.1121045 | 0.0937854 | 0.0873950 | 0.0830798 | 0.0530042 |
| When $d_2 \geqq d_{20}$, $d_{2m}$ (nm) = | ∞ | ∞ | ∞ | ∞ | 2.101 |
| When $d_2 < d_{20}$, $d_{2m}$ (nm) = | 12.789 | 29.518 | 73.873 | 87.951 | 11.267 |

1.1 < NA ≦ 1.2
85 < T ≦ 95

| Case | 9-06 | 9-07 | 9-08 | 9-09 | 9-10 |
| --- | --- | --- | --- | --- | --- |
| $n_{10}$ | 1.7296393 | 1.7299249 | 1.6899362 | 1.6928826 | 1.6935628 |
| $k_{10}$ | 0.0805906 | 0.0737621 | 0.0817785 | 0.0657282 | 0.0590519 |
| $d_{10}$ (nm) | 94.242 | 94.784 | 208.164 | 217.665 | 215.464 |
| $n_{20}$ | 1.7097783 | 1.7252153 | 1.6924320 | 1.6832004 | 1.6914497 |
| $k_{20}$ | 0.2319224 | 0.1970612 | 0.2651701 | 0.2055611 | 0.1728158 |
| $d_{20}$ (nm) | 191.543 | 246.491 | 148.618 | 193.166 | 250.826 |
| When $n_1 \geqq n_{10}$, $n_{1m}$ = | 0.0403186 | 0.0454016 | 0.0167883 | 0.0332178 | 0.0456592 |
| When $n_1 < n_{10}$, $n_{1m}$ = | 0.0112720 | 0.0089185 | 0.0424597 | 0.0374463 | 0.0611377 |
| When $k_1 \geqq k_{10}$, $k_{1m}$ = | 0.0312561 | 0.0265295 | 0.0332300 | 0.0436560 | 0.0547620 |
| When $k_1 < k_{10}$, $k_{1m}$ = | 0.0359937 | 0.0340186 | 0.0176221 | 0.0271997 | 0.0369495 |
| When $d_1 \geqq d_{10}$, $d_{1m}$ (nm) = | 14.915 | 25.988 | 8.734 | ∞ | ∞ |
| When $d_1 < d_{10}$, $d_{1m}$ (nm) = | 2.867 | 2.423 | 22.681 | 45.245 | 43.081 |
| When $n_2 \geqq n_{20}$, $n_{2m}$ = | 0.0542737 | 0.0673303 | 0.1469031 | 0.2426758 | 0.2225391 |
| When $n_2 < n_{20}$, $n_{2m}$ = | 0.0873267 | 0.0993994 | 0.0330542 | 0.0887622 | 0.1544177 |
| When $k_2 \geqq k_{20}$, $k_{2m}$ = | 0.0292090 | 0.0400476 | 0.0700159 | 0.0962317 | 0.1187769 |
| When $k_2 < k_{20}$, $k_{2m}$ = | 0.0563428 | 0.0561450 | 0.0687061 | 0.0675110 | 0.0629883 |
| When $d_2 \geqq d_{20}$, $d_{2m}$ (nm) = | 39.648 | ∞ | ∞ | ∞ | ∞ |
| When $d_2 < d_{20}$, $d_{2m}$ (nm) = | 14.552 | 29.955 | 9.727 | 29.747 | 77.934 |

1.1 < NA ≦ 1.2
85 < T ≦ 95

15/27

| Case | 9-11 | 9-12 | 9-13 |
| --- | --- | --- | --- |
| $n_{10}$ | 1.6988269 | 1.6981501 | 1.6968464 |
| $k_{10}$ | 0.0719884 | 0.0650380 | 0.0544760 |
| $d_{10}$ (nm) | 266.949 | 266.102 | 275.663 |
| $n_{20}$ | 1.6930572 | 1.6910453 | 1.6860880 |
| $k_{20}$ | 0.2717519 | 0.2123559 | 0.1778694 |
| $d_{20}$ (nm) | 142.233 | 201.439 | 248.323 |
| When $n_1 \geqq n_{10}$, $n_{1m}$ = | 0.0467688 | 0.0728052 | 0.0574890 |
| When $n_1 < n_{10}$, $n_{1m}$ = | 0.0315735 | 0.0440601 | 0.0431165 |
| When $k_1 \geqq k_{10}$, $k_{1m}$ = | 0.0383911 | 0.0476294 | 0.0587781 |
| When $k_1 < k_{10}$, $k_{1m}$ = | 0.0284839 | 0.0337549 | 0.0370691 |
| When $d_1 \geqq d_{10}$, $d_{1m}$ (nm) = | ∞ | ∞ | ∞ |
| When $d_1 < d_{10}$, $d_{1m}$ (nm) = | 35.571 | 98.568 | 104.018 |
| When $n_2 \geqq n_{20}$, $n_{2m}$ = | 0.2475818 | 0.3536121 | 0.2819006 |
| When $n_2 < n_{20}$, $n_{2m}$ = | 0.2616077 | 0.2147424 | 0.2120007 |
| When $k_2 \geqq k_{20}$, $k_{2m}$ = | 0.1929529 | 0.2177991 | 0.1925061 |
| When $k_2 < k_{20}$, $k_{2m}$ = | 0.1103821 | 0.0937061 | 0.0749585 |
| When $d_2 \geqq d_{20}$, $d_{2m}$ (nm) = | ∞ | ∞ | ∞ |
| When $d_2 < d_{20}$, $d_{2m}$ (nm) = | 61.377 | 69.390 | 80.535 |

-continued

| 1.1 < NA ≦ 1.2<br>95 < T ≦ 105 | | | | | |
|---|---|---|---|---|---|
| Case | 10-01 | 10-02 | 10-03 | 10-04 | 10-05 |
| $n_{10}$ | 1.9207610 | 1.9093240 | 1.8948938 | 1.8966282 | 1.7293323 |
| $k_{10}$ | 0.2195112 | 0.1610220 | 0.1257399 | 0.0900141 | 0.0843251 |
| $d_{10}$ (nm) | 22.312 | 16.027 | 13.855 | 12.530 | 93.974 |
| $n_{20}$ | 1.8258536 | 1.6981498 | 1.7003095 | 1.7305926 | 1.7018671 |
| $k_{20}$ | 0.6986358 | 0.4189775 | 0.3177305 | 0.2658040 | 0.2432029 |
| $d_{20}$ (nm) | 66.737 | 136.163 | 194.613 | 248.346 | 184.391 |
| When $n_1 \geqq n_{10}$, $n_{1m}$ = | 0.0601465 | 0.0788086 | 0.0949231 | 0.1082007 | 0.0364734 |
| When $n_1 < n_{10}$, $n_{1m}$ = | 0.0227283 | 0.0400269 | 0.0595679 | 0.0706311 | 0.0069092 |
| When $k_1 \geqq k_{10}$, $k_{1m}$ = | 0.0253723 | 0.0545032 | 0.0804407 | 0.0926099 | 0.0227478 |
| When $k_1 < k_{10}$, $k_{1m}$ = | 0.0628345 | 0.0889185 | 0.1005603 | 0.0900141 | 0.0311768 |
| When $d_1 \geqq d_{10}$, $d_{1m}$ (nm) = | 3.994 | 4.715 | 5.765 | 6.514 | 12.891 |
| When $d_1 < d_{10}$, $d_{1m}$ (nm) = | 1.248 | 2.209 | 3.348 | 3.879 | 1.711 |
| When $n_2 \geqq n_{20}$, $n_{2m}$ = | 0.0792419 | 0.0821826 | 0.0922205 | 0.0989185 | 0.0380920 |
| When $n_2 < n_{20}$, $n_{2m}$ = | 0.1602795 | 0.1375000 | 0.1411267 | 0.1492065 | 0.0806519 |
| When $k_2 \geqq k_{20}$, $k_{2m}$ = | 0.1589185 | 0.0905359 | 0.0891418 | 0.0944934 | 0.0182117 |
| When $k_2 < k_{20}$, $k_{2m}$ = | 0.1093127 | 0.0931641 | 0.0864453 | 0.0826196 | 0.0535706 |
| When $d_2 \geqq d_{20}$, $d_{2m}$ (nm) = | ∞ | ∞ | ∞ | ∞ | 26.631 |
| When $d_2 < d_{20}$, $d_{2m}$ (nm) = | 11.170 | 27.297 | 70.361 | 86.529 | 13.056 |

| 1.1 < NA ≦ 1.2<br>95 < T ≦ 105 | | | | | |
|---|---|---|---|---|---|
| | | | | | 16/27 |
| Case | 10-06 | 10-07 | 10-08 | 10-09 | 10-10 |
| $n_{10}$ | 1.7301568 | 1.6896128 | 1.6928686 | 1.6935394 | 1.6995193 |
| $k_{10}$ | 0.0757850 | 0.0845530 | 0.0680057 | 0.0604311 | 0.0747728 |
| $d_{10}$ (nm) | 94.458 | 207.994 | 217.789 | 215.751 | 266.467 |
| $n_{20}$ | 1.7237225 | 1.6930315 | 1.6806392 | 1.6908086 | 1.6953349 |
| $k_{20}$ | 0.2045935 | 0.2839311 | 0.2160083 | 0.1799717 | 0.2921202 |
| $d_{20}$ (nm) | 238.500 | 141.193 | 184.741 | 242.024 | 134.479 |
| When $n_1 \geqq n_{10}$, $n_{1m}$ = | 0.0430542 | 0.0132361 | 0.0331689 | 0.0442139 | 0.0436938 |
| When $n_1 < n_{10}$, $n_{1m}$ = | 0.0073706 | 0.0419458 | 0.0316418 | 0.0535156 | 0.0268311 |
| When $k_1 \geqq k_{10}$, $k_{1m}$ = | 0.0232617 | 0.0264368 | 0.0418604 | 0.0531323 | 0.0358801 |
| When $k_1 < k_{10}$, $k_{1m}$ = | 0.0323706 | 0.0142944 | 0.0250220 | 0.0355676 | 0.0274768 |
| When $d_1 \geqq d_{10}$, $d_{1m}$ (nm) = | 19.826 | 5.860 | ∞ | ∞ | ∞ |
| When $d_1 < d_{10}$, $d_{1m}$ (nm) = | 1.955 | 19.840 | 44.604 | 42.829 | 18.631 |
| When $n_2 \geqq n_{20}$, $n_{2m}$ = | 0.0534583 | 0.1398230 | 0.2538293 | 0.2308789 | 0.2386206 |
| When $n_2 < n_{20}$, $n_{2m}$ = | 0.0961475 | 0.0183801 | 0.0879700 | 0.1305579 | 0.2731067 |
| When $k_2 \geqq k_{20}$, $k_{2m}$ = | 0.0309888 | 0.0515918 | 0.0900964 | 0.1145776 | 0.1883105 |
| When $k_2 < k_{20}$, $k_{2m}$ = | 0.0550842 | 0.0676599 | 0.0668372 | 0.0642163 | 0.1153723 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 28.701 | 3.697 | 28.484 | 75.626 | 22.552 |

| 1.1 < NA ≦ 1.2<br>95 < T ≦ 105 | | |
|---|---|---|
| Case | 10-11 | 10-12 |
| $n_{10}$ | 1.6986281 | 1.6967467 |
| $k_{10}$ | 0.0669339 | 0.0559821 |
| $d_{10}$ (nm) | 265.290 | 275.562 |
| $n_{20}$ | 1.6902923 | 1.6844237 |
| $k_{20}$ | 0.2238725 | 0.1853984 |
| $d_{20}$ (nm) | 194.429 | 239.846 |
| When $n_1 \geqq n_{10}$, $n_{1m}$ = | 0.0728162 | 0.0573596 |
| When $n_1 < n_{10}$, $n_{1m}$ = | 0.0413391 | 0.0430261 |
| When $k_1 \geqq k_{10}$, $k_{1m}$ = | 0.0452283 | 0.0576135 |
| When $k_1 < k_{10}$, $k_{1m}$ = | 0.0327722 | 0.0361206 |
| When $d_1 \geqq d_{10}$, $d_{1m}$ (nm) = | ∞ | ∞ |
| When $d_1 < d_{10}$, $d_{1m}$ (nm) = | 90.187 | 103.212 |
| When $n_2 \geqq n_{20}$, $n_{2m}$ = | 0.3400000 | 0.2868152 |
| When $n_2 < n_{20}$, $n_{2m}$ = | 0.2235767 | 0.2105566 |
| When $k_2 \geqq k_{20}$, $k_{2m}$ = | 0.2178235 | 0.1919788 |
| When $k_2 < k_{20}$, $k_{2m}$ = | 0.0973718 | 0.0774072 |
| When $d_2 \geqq d_{20}$, $d_{2m}$ (nm) = | ∞ | ∞ |
| When $d_2 < d_{20}$, $d_{2m}$ (nm) = | 66.928 | 79.000 |

1.1 < NA ≦ 1.2
105 < T ≦ 115

17/27

| Case | 11-01 | 11-02 | 11-03 | 11-04 | 11-05 |
|---|---|---|---|---|---|
| $n_{10}$ | 1.9214172 | 1.9009993 | 1.8999222 | 1.7289797 | 1.7301397 |
| $k_{10}$ | 0.1753360 | 0.1351301 | 0.0954510 | 0.0876375 | 0.0779683 |
| $d_{10}$ (nm) | 15.452 | 13.611 | 12.469 | 93.472 | 94.062 |
| $n_{20}$ | 1.6804411 | 1.6899586 | 1.7262130 | 1.6943958 | 1.7208177 |
| $k_{20}$ | 0.4367098 | 0.3280314 | 0.2728992 | 0.2513033 | 0.2098777 |
| $d_{20}$ (nm) | 129.893 | 187.370 | 240.318 | 176.630 | 230.281 |
| When $n_1 \geqq n_{10}$, $n_{1m}$ = | 0.0769006 | 0.0933704 | 0.1067993 | 0.0330078 | 0.0410352 |
| When $n_1 < n_{10}$, $n_{1m}$ = | 0.0358716 | 0.0572852 | 0.0688867 | 0.0032751 | 0.0048413 |
| When $k_1 \geqq k_{10}$, $k_{1m}$ = | 0.0508276 | 0.0793042 | 0.0916321 | 0.0140979 | 0.0177686 |
| When $k_1 < k_{10}$, $k_{1m}$ = | 0.0888501 | 0.0996167 | 0.0954510 | 0.0244348 | 0.0282959 |
| When $d_1 \geqq d_{10}$, $d_{1m}$ (nm) = | 4.190 | 5.335 | 6.248 | 10.623 | 16.723 |
| When $d_1 < d_{10}$, $d_{1m}$ (nm) = | 1.818 | 3.051 | 3.681 | 0.787 | 1.251 |
| When $n_2 \geqq n_{20}$, $n_{2m}$ = | 0.0746777 | 0.0897961 | 0.0977148 | 0.0241113 | 0.0398962 |
| When $n_2 < n_{20}$, $n_{2m}$ = | 0.1378662 | 0.1400989 | 0.1490454 | 0.0784241 | 0.0968872 |
| When $k_2 \geqq k_{20}$, $k_{2m}$ = | 0.0793188 | 0.0846436 | 0.0920837 | 0.0085193 | 0.0207715 |
| When $k_2 < k_{20}$, $k_{2m}$ = | 0.0870862 | 0.0841199 | 0.0819739 | 0.0504102 | 0.0538818 |
| When $d_2 \geqq d_{20}$, $d_{2m}$ (nm) = | ∞ | ∞ | ∞ | 17.196 | ∞ |
| When $d_2 < d_{20}$, $d_{2m}$ (nm) = | 28.725 | 67.570 | 87.835 | 8.245 | 10.621 |

1.1 < NA ≦ 1.2
105 < T ≦ 115

| Case | 11-06 | 11-07 | 11-08 | 11-09 |
|---|---|---|---|---|
| $n_{10}$ | 1.6897075 | 1.6928599 | 1.6933895 | 1.6967442 |
| $k_{10}$ | 0.0859154 | 0.0698704 | 0.0619572 | 0.0572224 |
| $d_{10}$ (nm) | 206.600 | 218.100 | 215.832 | 275.439 |
| $n_{20}$ | 1.6860653 | 1.6784557 | 1.6904996 | 1.6838077 |
| $k_{20}$ | 0.2958058 | 0.2260347 | 0.1864736 | 0.1920294 |
| $d_{20}$ (nm) | 138.770 | 175.355 | 232.785 | 230.401 |
| When $n_1 \geqq n_{10}$, $n_{1m}$ = | 0.0125659 | 0.0312329 | 0.0432227 | 0.0564172 |
| When $n_1 < n_{10}$, $n_{1m}$ = | 0.0403125 | 0.0252893 | 0.0462402 | 0.0423401 |
| When $k_1 \geqq k_{10}$, $k_{1m}$ = | 0.0275024 | 0.0399890 | 0.0513623 | 0.0566272 |
| When $k_1 < k_{10}$, $k_{1m}$ = | 0.0207617 | 0.0230298 | 0.0339783 | 0.0347253 |
| When $d_1 \geqq d_{10}$, $d_{1m}$ (nm) = | 5.565 | ∞ | ∞ | ∞ |
| When $d_1 < d_{10}$, $d_{1m}$ (nm) = | 15.751 | 15.335 | 41.797 | 102.062 |
| When $n_2 \geqq n_{20}$, $n_{2m}$ = | 0.1134778 | 0.0778406 | 0.2416541 | 0.2945471 |
| When $n_2 < n_{20}$, $n_{2m}$ = | 0.0212585 | 0.0821313 | 0.1144373 | 0.2197937 |
| When $k_2 \geqq k_{20}$, $k_{2m}$ = | 0.0640356 | 0.0874658 | 0.1126599 | 0.1918506 |
| When $k_2 < k_{20}$, $k_{2m}$ = | 0.0823962 | 0.0630994 | 0.0642725 | 0.0810107 |
| When $d_2 \geqq d_{20}$, $d_{2m}$ (nm) = | ∞ | ∞ | ∞ | ∞ |
| When $d_2 < d_{20}$, $d_{2m}$ (nm) = | 4.190 | 25.396 | 50.058 | 79.342 |

1.1 < NA ≦ 1.2
115 < T ≦ 125

18/27

| Case | 12-01 | 12-02 | 12-03 | 12-04 | 12-05 |
|---|---|---|---|---|---|
| $n_{10}$ | 1.9907624 | 1.9229056 | 1.9003143 | 1.9049048 | 1.7296380 |
| $k_{10}$ | 0.2658843 | 0.1943367 | 0.1434936 | 0.0972823 | 0.0899801 |
| $d_{10}$ (nm) | 16.877 | 14.896 | 13.590 | 12.362 | 93.128 |
| $n_{20}$ | 1.6777634 | 1.6435696 | 1.6791032 | 1.7269066 | 1.6935089 |
| $k_{20}$ | 0.7245088 | 0.4392836 | 0.3336019 | 0.2779612 | 0.2572784 |
| $d_{20}$ (nm) | 66.041 | 124.711 | 179.139 | 230.763 | 167.093 |
| When $n_1 \geqq n_{10}$, $n_{1m}$ = | 0.0641870 | 0.0750415 | 0.0917773 | 0.1066382 | 0.0315833 |
| When $n_1 < n_{10}$, $n_{1m}$ = | 0.0020520 | 0.0319995 | 0.0559583 | 0.0680188 | 0.0015344 |
| When $k_1 \geqq k_{10}$, $k_{1m}$ = | 0.0028235 | 0.0481201 | 0.0790771 | 0.0912170 | 0.0085083 |
| When $k_1 < k_{10}$, $k_{1m}$ = | 0.0445386 | 0.0882983 | 0.0964502 | 0.0972823 | 0.0192114 |
| When $d_1 \geqq d_{10}$, $d_{1m}$ (nm) = | 2.498 | 3.792 | 5.133 | 6.031 | 9.518 |
| When $d_1 < d_{10}$, $d_{1m}$ (nm) = | 0.080 | 1.544 | 2.939 | 3.522 | 0.359 |
| When $n_2 \geqq n_{20}$, $n_{2m}$ = | 0.0064478 | 0.0655054 | 0.0877441 | 0.0975110 | 0.0182434 |
| When $n_2 < n_{20}$, $n_{2m}$ = | 0.1131567 | 0.1382288 | 0.1415613 | 0.1512451 | 0.0817859 |
| When $k_2 \geqq k_{20}$, $k_{2m}$ = | 0.0073132 | 0.0658899 | 0.0812854 | 0.0911096 | 0.0040100 |
| When $k_2 < k_{20}$, $k_{2m}$ = | 0.0730591 | 0.0825134 | 0.0835315 | 0.0828308 | 0.0509155 |
| When $d_2 \geqq d_{20}$, $d_{2m}$ (nm) = | 10.610 | ∞ | ∞ | ∞ | 14.228 |
| When $d_2 < d_{20}$, $d_{2m}$ (nm) = | 2.901 | 33.267 | 66.014 | 90.382 | 3.593 |

-continued

| Case | 12-06 | 12-07 | 12-08 | 12-09 | 12-10 |
|---|---|---|---|---|---|
| | $1.1 < NA \leqq 1.2$, $115 < T \leqq 125$ | | | | |
| $n_{10}$ | 1.7305285 | 1.6927568 | 1.6930586 | 1.6939267 | 1.6970265 |
| $k_{10}$ | 0.0799609 | 0.0712762 | 0.0635805 | 0.0583165 | 0.0526106 |
| $d_{10}$ (nm) | 93.907 | 218.499 | 215.646 | 213.162 | 273.430 |
| $n_{20}$ | 1.7196209 | 1.6781695 | 1.6903056 | 1.6934648 | 1.6908020 |
| $k_{20}$ | 0.2133806 | 0.2348207 | 0.1916344 | 0.1626221 | 0.1682270 |
| $d_{20}$ (nm) | 220.978 | 164.929 | 223.237 | 282.414 | 277.869 |
| When $n_1 \geqq n_{10}$, $n_{1m}$ = | 0.0401038 | 0.0280627 | 0.0367090 | 0.0617249 | 0.0695837 |
| When $n_1 < n_{10}$, $n_{1m}$ = | 0.0020569 | 0.0197937 | 0.0422595 | 0.0578455 | 0.0506836 |
| When $k_1 \geqq k_{10}$, $k_{1m}$ = | 0.0099243 | 0.0365027 | 0.0497717 | 0.0551318 | 0.0584485 |
| When $k_1 < k_{10}$, $k_{1m}$ = | 0.0219006 | 0.0215491 | 0.0327808 | 0.0369946 | 0.0381665 |
| When $d_1 \geqq d_{10}$, $d_{1m}$ (nm) = | 15.192 | ∞ | ∞ | ∞ | ∞ |
| When $d_1 < d_{10}$, $d_{1m}$ (nm) = | 0.519 | 8.747 | 40.119 | 117.750 | 120.098 |
| When $n_2 \geqq n_{20}$, $n_{2m}$ = | 0.0185596 | 0.0673242 | 0.2516089 | 0.2302490 | 0.2819116 |
| When $n_2 < n_{20}$, $n_{2m}$ = | 0.1000403 | 0.0715613 | 0.0981323 | 0.1425830 | 0.2021863 |
| When $k_2 \geqq k_{20}$, $k_{2m}$ = | 0.0105981 | 0.0901270 | 0.1132849 | 0.1293579 | 0.1967712 |
| When $k_2 < k_{20}$, $k_{2m}$ = | 0.0546692 | 0.0589612 | 0.0634204 | 0.0595032 | 0.0741577 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 3.602 | 19.014 | 34.397 | 79.670 | 93.763 |

19/27

| Case | 13-01 | 13-02 | 13-03 | 13-04 | 13-05 |
|---|---|---|---|---|---|
| | $1.1 < NA \leqq 1.2$, $125 < T \leqq 135$ | | | | |
| $n_{10}$ | 1.8968086 | 1.9070303 | 1.9016797 | 1.7329805 | 1.7161015 |
| $k_{10}$ | 0.1457981 | 0.0954881 | 0.0905797 | 0.0916823 | 0.0708259 |
| $d_{10}$ (nm) | 14.128 | 12.717 | 10.946 | 93.296 | 94.224 |
| $n_{20}$ | 1.6815336 | 1.7369802 | 1.7110902 | 1.7056329 | 1.6780965 |
| $k_{20}$ | 0.3444919 | 0.2856144 | 0.2381911 | 0.2670261 | 0.1788543 |
| $d_{20}$ (nm) | 167.613 | 218.968 | 280.601 | 155.076 | 274.399 |
| When $n_1 \geqq n_{10}$, $n_{1m}$ = | 0.0900439 | 0.1048657 | 0.1226746 | 0.0324280 | 0.0442737 |
| When $n_1 < n_{10}$, $n_{1m}$ = | 0.0549670 | 0.0656934 | 0.0785547 | 0.0012561 | 0.0190796 |
| When $k_1 \geqq k_{10}$, $k_{1m}$ = | 0.0772925 | 0.0877979 | 0.1031616 | 0.0075342 | 0.0396033 |
| When $k_1 < k_{10}$, $k_{1m}$ = | 0.0920227 | 0.0954881 | 0.0905797 | 0.0177710 | 0.0448962 |
| When $d_1 \geqq d_{10}$, $d_{1m}$ (nm) = | 5.183 | 6.019 | 6.438 | 9.368 | 34.945 |
| When $d_1 < d_{10}$, $d_{1m}$ (nm) = | 2.993 | 3.453 | 3.787 | 0.285 | 6.328 |
| When $n_2 \geqq n_{20}$, $n_{2m}$ = | 0.0877783 | 0.0991382 | 0.1111206 | 0.0250049 | 0.0400305 |
| When $n_2 < n_{20}$, $n_{2m}$ = | 0.1446509 | 0.1532288 | 0.1362280 | 0.0542139 | 0.1016638 |
| When $k_2 \geqq k_{20}$, $k_{2m}$ = | 0.0828516 | 0.0936658 | 0.0912720 | 0.0036011 | 0.0409863 |
| When $k_2 < k_{20}$, $k_{2m}$ = | 0.0884485 | 0.0865161 | 0.0819922 | 0.0570435 | 0.0508105 |
| When $d_2 \geqq d_{20}$, $d_{2m}$ (nm) = | ∞ | ∞ | ∞ | 16.698 | ∞ |
| When $d_2 < d_{20}$, $d_{2m}$ (nm) = | 63.831 | 86.162 | 129.598 | 1.884 | 53.218 |

| Case | 13-06 | 13-07 | 13-08 | 13-09 |
|---|---|---|---|---|
| | $1.1 < NA \leqq 1.2$, $125 < T \leqq 135$ | | | |
| $n_{10}$ | 1.6922053 | 1.6924923 | 1.6935584 | 1.6967916 |
| $k_{10}$ | 0.0726320 | 0.0653867 | 0.0598502 | 0.0533770 |
| $d_{10}$ (nm) | 218.650 | 214.871 | 212.072 | 273.133 |
| $n_{20}$ | 1.6800076 | 1.6897434 | 1.6927128 | 1.6904661 |
| $k_{20}$ | 0.2436881 | 0.1959626 | 0.1654173 | 0.1709158 |
| $d_{20}$ (nm) | 154.426 | 214.392 | 274.211 | 268.389 |
| When $n_1 \geqq n_{10}$, $n_{1m}$ = | 0.0253528 | 0.0324316 | 0.0605591 | 0.0715686 |
| When $n_1 < n_{10}$, $n_{1m}$ = | 0.0165808 | 0.0420508 | 0.0560315 | 0.0516870 |
| When $k_1 \geqq k_{10}$, $k_{1m}$ = | 0.0318250 | 0.0487207 | 0.0537805 | 0.0575159 |
| When $k_1 < k_{10}$, $k_{1m}$ = | 0.0192969 | 0.0323987 | 0.0370093 | 0.0369739 |
| When $d_1 \geqq d_{10}$, $d_{1m}$ (nm) = | 16.057 | ∞ | ∞ | ∞ |
| When $d_1 < d_{10}$, $d_{1m}$ (nm) = | 7.067 | 37.738 | 59.298 | 116.516 |
| When $n_2 \geqq n_{20}$, $n_{2m}$ = | 0.0399280 | 0.1505237 | 0.2298792 | 0.2878638 |
| When $n_2 < n_{20}$, $n_{2m}$ = | 0.0570007 | 0.0843848 | 0.1463525 | 0.2044592 |
| When $k_2 \geqq k_{20}$, $k_{2m}$ = | 0.0949915 | 0.1174060 | 0.1308350 | 0.1989417 |
| When $k_2 < k_{20}$, $k_{2m}$ = | 0.0566089 | 0.0642029 | 0.0608850 | 0.0765625 |
| When $d_2 \geqq d_{20}$, $d_{2m}$ (nm) = | ∞ | ∞ | ∞ | ∞ |
| When $d_2 < d_{20}$, $d_{2m}$ (nm) = | 13.778 | 24.202 | 76.110 | 90.681 |

| 1.1 < NA ≦ 1.2<br>135 < T ≦ 145 | | | | | |
|---|---|---|---|---|---|
| Case | 14-01 | 14-02 | 14-03 | 14-04 | 20/27<br>14-05 |
| $n_{10}$ | 1.8931613 | 1.9086798 | 1.8957546 | 1.7383088 | 1.7163304 |
| $k_{10}$ | 0.1437464 | 0.0925277 | 0.1021679 | 0.0935643 | 0.0717315 |
| $d_{10}$ (nm) | 15.228 | 13.463 | 11.154 | 93.735 | 94.330 |
| $n_{20}$ | 1.6981871 | 1.7547782 | 1.6965397 | 1.7255584 | 1.6763108 |
| $k_{20}$ | 0.3648670 | 0.2987738 | 0.2414267 | 0.2828024 | 0.1832109 |
| $d_{20}$ (nm) | 154.635 | 206.696 | 273.752 | 142.972 | 265.207 |
| When $n_1 \geqq n_{10}$, $n_{1m}$ = | 0.0870447 | 0.1008179 | 0.1206177 | 0.0337476 | 0.0440930 |
| When $n_1 < n_{10}$, $n_{1m}$ = | 0.0533362 | 0.0620862 | 0.0768750 | 0.0007715 | 0.0201111 |
| When $k_1 \geqq k_{10}$, $k_{1m}$ = | 0.0736633 | 0.0819543 | 0.1022961 | 0.0054871 | 0.0403162 |
| When $k_1 < k_{10}$, $k_{1m}$ = | 0.0884546 | 0.0925277 | 0.1021679 | 0.0149585 | 0.0433484 |
| When $d_1 \geqq d_{10}$, $d_{1m}$ (nm) = | 5.366 | 6.051 | 6.474 | 9.539 | 32.676 |
| When $d_1 < d_{10}$, $d_{1m}$ (nm) = | 3.110 | 3.392 | 3.792 | 0.168 | 6.615 |
| When $n_2 \geqq n_{20}$, $n_{2m}$ = | 0.0905371 | 0.1017932 | 0.1131152 | 0.0305115 | 0.0401709 |
| When $n_2 < n_{20}$, $n_{2m}$ = | 0.1457471 | 0.1521191 | 0.1323865 | 0.0291541 | 0.0974780 |
| When $k_2 \geqq k_{20}$, $k_{2m}$ = | 0.0891467 | 0.0990112 | 0.0895691 | 0.0025757 | 0.0411877 |
| When $k_2 < k_{20}$, $k_{2m}$ = | 0.0964551 | 0.0905688 | 0.0826367 | 0.0641370 | 0.0518066 |
| When $d_2 \geqq d_{20}$, $d_{2m}$ (nm) = | ∞ | ∞ | ∞ | 18.295 | ∞ |
| When $d_2 < d_{20}$, $d_{2m}$ (nm) = | 52.833 | 78.923 | 127.644 | 0.825 | 36.894 |

| 1.1 < NA ≦ 1.2<br>135 < T ≦ 145 | | | | | |
|---|---|---|---|---|---|
| Case | 14-06 | 14-07 | 14-08 | 14-09 | 14-10 |
| $n_{10}$ | 1.7036586 | 1.6919166 | 1.6911838 | 1.6942185 | 1.6965335 |
| $k_{10}$ | 0.0640636 | 0.0672926 | 0.0743991 | 0.0545821 | 0.0539924 |
| $d_{10}$ (nm) | 161.836 | 213.353 | 218.060 | 211.644 | 273.036 |
| $n_{20}$ | 1.6842842 | 1.6889376 | 1.6805827 | 1.6930391 | 1.6894839 |
| $k_{20}$ | 0.1670348 | 0.2002175 | 0.2524809 | 0.1466022 | 0.1738185 |
| $d_{20}$ (nm) | 260.021 | 207.074 | 145.761 | 321.654 | 259.712 |
| When $n_1 \geqq n_{10}$, $n_{1m}$ = | 0.0516992 | 0.0312610 | 0.0190637 | 0.0570044 | 0.0731799 |
| When $n_1 < n_{10}$, $n_{1m}$ = | 0.0203174 | 0.0465454 | 0.0159326 | 0.0625537 | 0.0527673 |
| When $k_1 \geqq k_{10}$, $k_{1m}$ = | 0.0380640 | 0.0462256 | 0.0279297 | 0.0552405 | 0.0568201 |
| When $k_1 < k_{10}$, $k_{1m}$ = | 0.0285486 | 0.0325867 | 0.0168274 | 0.0356702 | 0.0362610 |
| When $d_1 \geqq d_{10}$, $d_{1m}$ (nm) = | ∞ | ∞ | 14.138 | ∞ | ∞ |
| When $d_1 < d_{10}$, $d_{1m}$ (nm) = | 9.049 | 34.771 | 6.640 | 127.140 | 114.401 |
| When $n_2 \geqq n_{20}$, $n_{2m}$ = | 0.0375000 | 0.2427722 | 0.0321863 | 0.2263916 | 0.2897119 |
| When $n_2 < n_{20}$, $n_{2m}$ = | 0.0655225 | 0.0802039 | 0.0495178 | 0.1240515 | 0.2069202 |
| When $k_2 \geqq k_{20}$, $k_{2m}$ = | 0.0303979 | 0.1193311 | 0.0877856 | 0.1337305 | 0.1994678 |
| When $k_2 < k_{20}$, $k_{2m}$ = | 0.0483228 | 0.0645337 | 0.0566711 | 0.0596594 | 0.0781824 |
| When $d_2 \geqq d_{20}$, $d_{2m}$ (nm) = | 29.338 | ∞ | 15.130 | ∞ | ∞ |
| When $d_2 < d_{20}$, $d_{2m}$ (nm) = | 27.139 | 22.617 | 11.351 | 93.024 | 88.496 |

| 1.1 < NA ≦ 1.2<br>145 < T ≦ 155 | | | | | |
|---|---|---|---|---|---|
| Case | 15-01 | 15-02 | 15-03 | 15-04 | 21/27<br>15-05 |
| $n_{10}$ | 1.8962402 | 1.9162756 | 1.8972293 | 1.7171631 | 1.7039366 |
| $k_{10}$ | 0.1446868 | 0.0920008 | 0.1039493 | 0.0735355 | 0.0654419 |
| $d_{10}$ (nm) | 16.058 | 13.917 | 11.503 | 94.241 | 161.496 |
| $n_{20}$ | 1.7149739 | 1.7705409 | 1.6986687 | 1.6756859 | 1.6849902 |
| $k_{20}$ | 0.3909951 | 0.3160160 | 0.2516185 | 0.1901883 | 0.1728826 |
| $d_{20}$ (nm) | 143.691 | 196.340 | 264.437 | 256.660 | 251.490 |
| When $n_1 \geqq n_{10}$, $n_{1m}$ = | 0.0837915 | 0.0974329 | 0.1166235 | 0.0430017 | 0.0505029 |
| When $n_1 < n_{10}$, $n_{1m}$ = | 0.0514441 | 0.0592371 | 0.0737268 | 0.0188135 | 0.0178369 |
| When $k_1 \geqq k_{10}$, $k_{1m}$ = | 0.0700403 | 0.0772290 | 0.0977893 | 0.0384546 | 0.0357764 |
| When $k_1 < k_{10}$, $k_{1m}$ = | 0.0875134 | 0.0920008 | 0.1039493 | 0.0432324 | 0.0268848 |
| When $d_1 \geqq d_{10}$, $d_{1m}$ (nm) = | 5.323 | 5.852 | 6.362 | 32.246 | ∞ |
| When $d_1 < d_{10}$, $d_{1m}$ (nm) = | 3.062 | 3.205 | 3.699 | 5.981 | 7.380 |
| When $n_2 \geqq n_{20}$, $n_{2m}$ = | 0.0928162 | 0.1031079 | 0.1115686 | 0.0381177 | 0.0304712 |
| When $n_2 < n_{20}$, $n_{2m}$ = | 0.1435938 | 0.1490808 | 0.1351062 | 0.0929431 | 0.0597266 |
| When $k_2 \geqq k_{20}$, $k_{2m}$ = | 0.0944385 | 0.1027820 | 0.0897864 | 0.0382104 | 0.0277966 |
| When $k_2 < k_{20}$, $k_{2m}$ = | 0.0995911 | 0.0924023 | 0.0838245 | 0.0518921 | 0.0482678 |
| When $d_2 \geqq d_{20}$, $d_{2m}$ (nm) = | ∞ | ∞ | ∞ | ∞ | 23.493 |
| When $d_2 < d_{20}$, $d_{2m}$ (nm) = | 30.912 | 72.930 | 96.188 | 31.536 | 23.876 |

-continued

| 1.1 < NA ≦ 1.2<br>145 < T ≦ 155 | | | | |
|---|---|---|---|---|
| Case | 15-06 | 15-07 | 15-08 | 15-09 |
| $n_{10}$ | 1.6903081 | 1.6915399 | 1.6931731 | 1.6963857 |
| $k_{10}$ | 0.0771344 | 0.0690906 | 0.0615887 | 0.0546855 |
| $d_{10}$ (nm) | 216.305 | 212.338 | 211.917 | 273.170 |
| $n_{20}$ | 1.6786590 | 1.6881028 | 1.6918937 | 1.6879125 |
| $k_{20}$ | 0.2613948 | 0.2062149 | 0.1729009 | 0.1780863 |
| $d_{20}$ (nm) | 139.207 | 199.770 | 256.415 | 251.444 |
| When $n_1 \geqq n_{10}$, $n_{1m}$ = | 0.0195569 | 0.0307166 | 0.0591064 | 0.0699243 |
| When $n_1 < n_{10}$, $n_{1m}$ = | 0.0132800 | 0.0523120 | 0.0554614 | 0.0530347 |
| When $k_1 \geqq k_{10}$, $k_{1m}$ = | 0.0269897 | 0.0450159 | 0.0517236 | 0.0562524 |
| When $k_1 < k_{10}$, $k_{1m}$ = | 0.0101050 | 0.0313696 | 0.0355261 | 0.0367395 |
| When $d_1 \geqq d_{10}$, $d_{1m}$ (nm) = | 14.222 | ∞ | ∞ | ∞ |
| When $d_1 < d_{10}$, $d_{1m}$ (nm) = | 6.108 | 32.462 | 54.157 | 113.606 |
| When $n_2 \geqq n_{20}$, $n_{2m}$ = | 0.0246814 | 0.2330432 | 0.2286047 | 0.2890198 |
| When $n_2 < n_{20}$, $n_{2m}$ = | 0.0598340 | 0.0841870 | 0.1451465 | 0.2088098 |
| When $k_2 \geqq k_{20}$, $k_{2m}$ = | 0.0678235 | 0.1160620 | 0.1277832 | 0.1979041 |
| When $k_2 < k_{20}$, $k_{2m}$ = | 0.0514465 | 0.0682922 | 0.0664624 | 0.0771411 |
| When $d_2 \geqq d_{20}$, $d_{2m}$ (nm) = | 11.437 | ∞ | ∞ | ∞ |
| When $d_2 < d_{20}$, $d_{2m}$ (nm) = | 12.498 | 26.275 | 74.226 | 84.013 |

22/27

| 1.1 < NA ≦ 1.2<br>155 < T ≦ 165 | | | | | |
|---|---|---|---|---|---|
| Case | 16-01 | 16-02 | 16-03 | 16-04 | 16-05 |
| $n_{10}$ | 1.9078860 | 1.9270939 | 1.9009914 | 1.7182026 | 1.7037276 |
| $k_{10}$ | 0.1508452 | 0.0963716 | 0.1079582 | 0.0759211 | 0.0670447 |
| $d_{10}$ (nm) | 16.208 | 13.863 | 11.657 | 93.910 | 160.452 |
| $n_{20}$ | 1.7232027 | 1.7738090 | 1.6981472 | 1.6754262 | 1.6860603 |
| $k_{20}$ | 0.4201511 | 0.3331580 | 0.2622250 | 0.1979303 | 0.1785858 |
| $d_{20}$ (nm) | 134.826 | 188.374 | 256.036 | 248.261 | 243.357 |
| When $n_1 \geqq n_{10}$, $n_{1m}$ = | 0.0807556 | 0.0955676 | 0.1136938 | 0.0410315 | 0.0482739 |
| When $n_1 < n_{10}$, $n_{1m}$ = | 0.0492212 | 0.0570374 | 0.0706995 | 0.0157471 | 0.0155554 |
| When $k_1 \geqq k_{10}$, $k_{1m}$ = | 0.0660083 | 0.0745215 | 0.0946643 | 0.0342603 | 0.0302344 |
| When $k_1 < k_{10}$, $k_{1m}$ = | 0.0885791 | 0.0963716 | 0.1079582 | 0.0433301 | 0.0248120 |
| When $d_1 \geqq d_{10}$, $d_{1m}$ (nm) = | 4.938 | 5.477 | 6.133 | 23.554 | ∞ |
| When $d_1 < d_{10}$, $d_{1m}$ (nm) = | 2.790 | 2.920 | 3.507 | 4.784 | 6.051 |
| When $n_2 \geqq n_{20}$, $n_{2m}$ = | 0.0912793 | 0.1022461 | 0.1087073 | 0.0334387 | 0.0216223 |
| When $n_2 < n_{20}$, $n_{2m}$ = | 0.1401233 | 0.1468384 | 0.1373413 | 0.0900842 | 0.0519312 |
| When $k_2 \geqq k_{20}$, $k_{2m}$ = | 0.0948535 | 0.1014905 | 0.0883215 | 0.0321790 | 0.0239026 |
| When $k_2 < k_{20}$, $k_{2m}$ = | 0.0976477 | 0.0917578 | 0.0837280 | 0.0507922 | 0.0474658 |
| When $d_2 \geqq d_{20}$, $d_{2m}$ (nm) = | ∞ | ∞ | ∞ | ∞ | 19.461 |
| When $d_2 < d_{20}$, $d_{2m}$ (nm) = | 27.641 | 68.596 | 90.537 | 29.710 | 21.259 |

| 1.1 < NA ≦ 1.2<br>155 < T ≦ 165 | | | | |
|---|---|---|---|---|
| Case | 16-06 | 16-07 | 16-08 | 16-09 |
| $n_{10}$ | 1.6914048 | 1.6932944 | 1.6971949 | 1.6963748 |
| $k_{10}$ | 0.0705280 | 0.0619823 | 0.0758678 | 0.0557064 |
| $d_{10}$ (nm) | 212.904 | 213.027 | 268.193 | 273.316 |
| $n_{20}$ | 1.6862460 | 1.6912789 | 1.6840809 | 1.6860970 |
| $k_{20}$ | 0.2142065 | 0.1784688 | 0.2789945 | 0.1841499 |
| $d_{20}$ (nm) | 190.804 | 246.475 | 135.240 | 242.973 |
| When $n_1 \geqq n_{10}$, $n_{1m}$ = | 0.0288806 | 0.0598267 | 0.0616260 | 0.0706445 |
| When $n_1 < n_{10}$, $n_{1m}$ = | 0.0419739 | 0.0573401 | 0.0320642 | 0.0521814 |
| When $k_1 \geqq k_{10}$, $k_{1m}$ = | 0.0434460 | 0.0510059 | 0.0409424 | 0.0555554 |
| When $k_1 < k_{10}$, $k_{1m}$ = | 0.0304883 | 0.0343054 | 0.0217456 | 0.0379871 |
| When $d_1 \geqq d_{10}$, $d_{1m}$ (nm) = | ∞ | ∞ | ∞ | ∞ |
| When $d_1 < d_{10}$, $d_{1m}$ (nm) = | 31.951 | 51.898 | 19.489 | 113.780 |
| When $n_2 \geqq n_{20}$, $n_{2m}$ = | 0.2364844 | 0.2370337 | 0.2474512 | 0.2927136 |
| When $n_2 < n_{20}$, $n_{2m}$ = | 0.0869409 | 0.1403040 | 0.2270129 | 0.2100537 |
| When $k_2 \geqq k_{20}$, $k_{2m}$ = | 0.1087354 | 0.1223047 | 0.1872974 | 0.1959326 |
| When $k_2 < k_{20}$, $k_{2m}$ = | 0.0726953 | 0.0652295 | 0.1039441 | 0.0773071 |
| When $d_2 \geqq d_{20}$, $d_{2m}$ (nm) = | ∞ | ∞ | ∞ | ∞ |
| When $d_2 < d_{20}$, $d_{2m}$ (nm) = | 34.355 | 75.037 | 36.050 | 81.214 |

1.1 < NA ≦ 1.2
165 < T ≦ 175

23/27

| Case | 17-01 | 17-02 | 17-03 | 17-04 | 17-05 |
|---|---|---|---|---|---|
| $n_{10}$ | 1.9345747 | 1.9100928 | 1.9218874 | 1.7188695 | 1.7031385 |
| $k_{10}$ | 0.1082213 | 0.1149883 | 0.1634556 | 0.0782891 | 0.0685384 |
| $d_{10}$ (nm) | 13.373 | 11.317 | 15.608 | 93.463 | 159.293 |
| $n_{20}$ | 1.7554016 | 1.6916658 | 1.7091703 | 1.6745648 | 1.6866422 |
| $k_{20}$ | 0.3434593 | 0.2694423 | 0.4402763 | 0.2040549 | 0.1829170 |
| $d_{20}$ (nm) | 183.042 | 248.707 | 128.647 | 239.614 | 234.977 |
| When $n_1 \geqq n_{10}$, $n_{1m}$ = | 0.0953882 | 0.1140894 | 0.0784595 | 0.0386694 | 0.0460681 |
| When $n_1 < n_{10}$, $n_{1m}$ = | 0.0550098 | 0.0698865 | 0.0459766 | 0.0121814 | 0.0133398 |
| When $k_1 \geqq k_{10}$, $k_{1m}$ = | 0.0742224 | 0.0954895 | 0.0620923 | 0.0290149 | 0.0227319 |
| When $k_1 < k_{10}$, $k_{1m}$ = | 0.1051392 | 0.1149883 | 0.0878528 | 0.0413110 | 0.0203333 |
| When $d_1 \geqq d_{10}$, $d_{1m}$ (nm) = | 5.105 | 5.733 | 4.388 | 16.599 | ∞ |
| When $d_1 < d_{10}$, $d_{1m}$ (nm) = | 2.628 | 3.226 | 2.376 | 3.551 | 4.956 |
| When $n_2 \geqq n_{20}$, $n_{2m}$ = | 0.0995532 | 0.1061743 | 0.0849316 | 0.0275488 | 0.0132971 |
| When $n_2 < n_{20}$, $n_{2m}$ = | 0.1453674 | 0.1364294 | 0.1372107 | 0.0877344 | 0.0449780 |
| When $k_2 \geqq k_{20}$, $k_{2m}$ = | 0.0936926 | 0.0848206 | 0.0864539 | 0.0249731 | 0.0152673 |
| When $k_2 < k_{20}$, $k_{2m}$ = | 0.0884937 | 0.0821777 | 0.0909717 | 0.0487439 | 0.0459656 |
| When $d_2 \geqq d_{20}$, $d_{2m}$ (nm) = | ∞ | ∞ | ∞ | ∞ | 6.034 |
| When $d_2 < d_{20}$, $d_{2m}$ (nm) = | 65.841 | 91.823 | 28.009 | 30.737 | 19.612 |

1.1 < NA ≦ 1.2
165 < T ≦ 175

| Case | 17-06 | 17-07 | 17-08 | 17-09 |
|---|---|---|---|---|
| $n_{10}$ | 1.6934237 | 1.6934242 | 1.6985617 | 1.6963947 |
| $k_{10}$ | 0.0627890 | 0.0627998 | 0.0777714 | 0.0569261 |
| $d_{10}$ (nm) | 213.592 | 213.572 | 264.836 | 273.344 |
| $n_{20}$ | 1.6908665 | 1.6907829 | 1.6854326 | 1.6845211 |
| $k_{20}$ | 0.1844160 | 0.1843934 | 0.2962369 | 0.1907955 |
| $d_{20}$ (nm) | 236.853 | 236.891 | 131.733 | 233.824 |
| When $n_1 \geqq n_{10}$, $n_{1m}$ = | 0.0574976 | 0.0574353 | 0.0522168 | 0.0698511 |
| When $n_1 < n_{10}$, $n_{1m}$ = | 0.0521313 | 0.0521704 | 0.0296216 | 0.0506372 |
| When $k_1 \geqq k_{10}$, $k_{1m}$ = | 0.0502954 | 0.0502856 | 0.0369763 | 0.0547412 |
| When $k_1 < k_{10}$, $k_{1m}$ = | 0.0341577 | 0.0341846 | 0.0234509 | 0.0368408 |
| When $d_1 \geqq d_{10}$, $d_{1m}$ (nm) = | ∞ | ∞ | ∞ | ∞ |
| When $d_1 < d_{10}$, $d_{1m}$ (nm) = | 50.284 | 50.272 | 18.034 | 113.943 |
| When $n_2 \geqq n_{20}$, $n_{2m}$ = | 0.2442261 | 0.2441003 | 0.2108032 | 0.3045251 |
| When $n_2 < n_{20}$, $n_{2m}$ = | 0.1394958 | 0.1395251 | 0.2567761 | 0.2115186 |
| When $k_2 \geqq k_{20}$, $k_{2m}$ = | 0.1187415 | 0.1187610 | 0.1954675 | 0.1950378 |
| When $k_2 < k_{20}$, $k_{2m}$ = | 0.0660913 | 0.0660889 | 0.1128296 | 0.0795361 |
| When $d_2 \geqq d_{20}$, $d_{2m}$ (nm) = | ∞ | ∞ | ∞ | ∞ |
| When $d_2 < d_{20}$, $d_{2m}$ (nm) = | 75.634 | 75.652 | 33.470 | 80.767 |

1.1 < NA ≦ 1.2
175 < T ≦ 185

24/27

| Case | 18-01 | 18-02 | 18-03 | 18-04 | 18-05 |
|---|---|---|---|---|---|
| $n_{10}$ | 1.9329388 | 1.9368237 | 1.9141366 | 1.7191879 | 1.7029035 |
| $k_{10}$ | 0.1795701 | 0.1224596 | 0.1196035 | 0.0801581 | 0.0699625 |
| $d_{10}$ (nm) | 14.789 | 12.921 | 11.206 | 93.133 | 158.805 |
| $n_{20}$ | 1.6812994 | 1.7305084 | 1.6882344 | 1.6734445 | 1.6865116 |
| $k_{20}$ | 0.4483886 | 0.3477304 | 0.2744889 | 0.2077092 | 0.1862225 |
| $d_{20}$ (nm) | 123.825 | 177.704 | 240.000 | 230.286 | 225.674 |
| When $n_1 \geqq n_{10}$, $n_{1m}$ = | 0.0768433 | 0.0949634 | 0.1131592 | 0.0367419 | 0.0441357 |
| When $n_1 < n_{10}$, $n_{1m}$ = | 0.0412451 | 0.0529919 | 0.0684998 | 0.0095679 | 0.0109912 |
| When $k_1 \geqq k_{10}$, $k_{1m}$ = | 0.0578772 | 0.0744714 | 0.0949390 | 0.0247339 | 0.0167639 |
| When $k_1 < k_{10}$, $k_{1m}$ = | 0.0896887 | 0.1065430 | 0.1185388 | 0.0386743 | 0.0152380 |
| When $d_1 \geqq d_{10}$, $d_{1m}$ (nm) = | 3.840 | 4.794 | 5.495 | 14.453 | ∞ |
| When $d_1 < d_{10}$, $d_{1m}$ (nm) = | 1.946 | 2.409 | 3.066 | 2.710 | 3.941 |
| When $n_2 \geqq n_{20}$, $n_{2m}$ = | 0.0764294 | 0.0962097 | 0.1038733 | 0.0230908 | 0.0081592 |
| When $n_2 < n_{20}$, $n_{2m}$ = | 0.1359412 | 0.1466211 | 0.1367029 | 0.0895520 | 0.0398572 |
| When $k_2 \geqq k_{20}$, $k_{2m}$ = | 0.0734753 | 0.0852112 | 0.0825085 | 0.0197388 | 0.0086536 |
| When $k_2 < k_{20}$, $k_{2m}$ = | 0.0828125 | 0.0854419 | 0.0815332 | 0.0475061 | 0.0463342 |
| When $d_2 \geqq d_{20}$, $d_{2m}$ (nm) = | ∞ | ∞ | ∞ | 20.793 | 3.280 |
| When $d_2 < d_{20}$, $d_{2m}$ (nm) = | 32.854 | 63.574 | 95.894 | 33.693 | 18.574 |

-continued

| | 1.1 < NA ≦ 1.2<br>175 < T ≦ 185 | | |
|---|---|---|---|
| Case | 18-06 | 18-07 | 18-08 |
| $n_{10}$ | 1.6933701 | 1.6939475 | 1.6969386 |
| $k_{10}$ | 0.0640425 | 0.0576888 | 0.0533290 |
| $d_{10}$ (nm) | 213.864 | 212.435 | 271.986 |
| $n_{20}$ | 1.6904005 | 1.6925921 | 1.6924288 |
| $k_{20}$ | 0.1898312 | 0.1618810 | 0.1673219 |
| $d_{20}$ (nm) | 227.117 | 285.048 | 281.091 |
| When $n_1 \geqq n_{10}$, $n_{1m}$ = | 0.0547229 | 0.0510974 | 0.0676453 |
| When $n_1 < n_{10}$, $n_{1m}$ = | 0.0462109 | 0.0603149 | 0.0497070 |
| When $k_1 \geqq k_{10}$, $k_{1m}$ = | 0.0493457 | 0.0532312 | 0.0592920 |
| When $k_1 < k_{10}$, $k_{1m}$ = | 0.0339734 | 0.0351465 | 0.0390295 |
| When $d_1 \geqq d_{10}$, $d_{1m}$ (nm) = | ∞ | ∞ | ∞ |
| When $d_1 < d_{10}$, $d_{1m}$ (nm) = | 49.384 | 120.643 | 177.975 |
| When $n_2 \geqq n_{20}$, $n_{2m}$ = | 0.2555811 | 0.2373071 | 0.2892273 |
| When $n_2 < n_{20}$, $n_{2m}$ = | 0.1402515 | 0.1279663 | 0.2010315 |
| When $k_2 \geqq k_{20}$, $k_{2m}$ = | 0.1146326 | 0.1254919 | 0.2051270 |
| When $k_2 < k_{20}$, $k_{2m}$ = | 0.0655762 | 0.0607678 | 0.0750598 |
| When $d_2 \geqq d_{20}$, $d_{2m}$ (nm) = | ∞ | ∞ | ∞ |
| When $d_2 < d_{20}$, $d_{2m}$ (nm) = | 70.972 | 82.029 | 98.942 |

| | 1.1 < NA ≦ 1.2<br>185 < T ≦ 195 | | | | |
|---|---|---|---|---|---|
| Case | 19-01 | 19-02 | 19-03 | 19-04 | 25/27<br>19-05 |
| $n_{10}$ | 1.9315873 | 1.9153217 | 1.8972445 | 1.7198506 | 1.7209927 |
| $k_{10}$ | 0.1333486 | 0.1206110 | 0.1001874 | 0.0813984 | 0.0705203 |
| $d_{10}$ (nm) | 13.169 | 11.351 | 10.604 | 93.215 | 93.408 |
| $n_{20}$ | 1.7169625 | 1.6899751 | 1.6952918 | 1.6740113 | 1.6975541 |
| $k_{20}$ | 0.3552140 | 0.2797802 | 0.2334251 | 0.2110946 | 0.1793898 |
| $d_{20}$ (nm) | 168.729 | 229.265 | 285.679 | 219.867 | 273.456 |
| When $n_1 \geqq n_{10}$, $n_{1m}$ = | 0.0918945 | 0.1114490 | 0.1257397 | 0.0361377 | 0.0445178 |
| When $n_1 < n_{10}$, $n_{1m}$ = | 0.0499878 | 0.0671436 | 0.0846338 | 0.0086279 | 0.0205615 |
| When $k_1 \geqq k_{10}$, $k_{1m}$ = | 0.0714844 | 0.0926733 | 0.1116675 | 0.0228809 | 0.0433899 |
| When $k_1 < k_{10}$, $k_{1m}$ = | 0.1000085 | 0.1179578 | 0.1001874 | 0.0379150 | 0.0444836 |
| When $d_1 \geqq d_{10}$, $d_{1m}$ (nm) = | 4.647 | 5.413 | 6.402 | 13.674 | 40.701 |
| When $d_1 < d_{10}$, $d_{1m}$ (nm) = | 2.318 | 3.021 | 3.978 | 2.409 | 6.133 |
| When $n_2 \geqq n_{20}$, $n_{2m}$ = | 0.0938611 | 0.1021985 | 0.1009766 | 0.0217163 | 0.0601978 |
| When $n_2 < n_{20}$, $n_{2m}$ = | 0.1488745 | 0.1392834 | 0.1303809 | 0.0916943 | 0.1077124 |
| When $k_2 \geqq k_{20}$, $k_{2m}$ = | 0.0821570 | 0.0826257 | 0.0865845 | 0.0185046 | 0.0416394 |
| When $k_2 < k_{20}$, $k_{2m}$ = | 0.0869946 | 0.0832629 | 0.0782239 | 0.0491125 | 0.0501843 |
| When $d_2 \geqq d_{20}$, $d_{2m}$ (nm) = | ∞ | ∞ | ∞ | 19.431 | ∞ |
| When $d_2 < d_{20}$, $d_{2m}$ (nm) = | 61.773 | 92.529 | 127.146 | 32.148 | 73.073 |

| | 1.1 < NA ≦ 1.2<br>185 < T ≦ 195 | | | | |
|---|---|---|---|---|---|
| Case | 19-06 | 19-07 | 19-08 | 19-09 | 19-10 |
| $n_{10}$ | 1.7035608 | 1.6916743 | 1.6930483 | 1.6936984 | 1.6968810 |
| $k_{10}$ | 0.0713918 | 0.0742011 | 0.0657083 | 0.0591625 | 0.0544417 |
| $d_{10}$ (nm) | 159.462 | 216.137 | 213.861 | 212.273 | 271.786 |
| $n_{20}$ | 1.6857491 | 1.6815589 | 1.6902271 | 1.6918699 | 1.6922876 |
| $k_{20}$ | 0.1901066 | 0.2413942 | 0.1951191 | 0.1652801 | 0.1708476 |
| $d_{20}$ (nm) | 215.251 | 158.897 | 217.477 | 275.792 | 271.501 |
| When $n_1 \geqq n_{10}$, $n_{1m}$ = | 0.0427405 | 0.0223779 | 0.0519324 | 0.0514441 | 0.0684033 |
| When $n_1 < n_{10}$, $n_{1m}$ = | 0.0090222 | 0.0227649 | 0.0431079 | 0.0594763 | 0.0491284 |
| When $k_1 \geqq k_{10}$, $k_{1m}$ = | 0.0150232 | 0.0325586 | 0.0481873 | 0.0521765 | 0.0581763 |
| When $k_1 < k_{10}$, $k_{1m}$ = | 0.0160400 | 0.0253345 | 0.0315527 | 0.0340894 | 0.0370996 |
| When $d_1 \geqq d_{10}$, $d_{1m}$ (nm) = | ∞ | 13.469 | ∞ | ∞ | ∞ |
| When $d_1 < d_{10}$, $d_{1m}$ (nm) = | 3.174 | 10.839 | 47.894 | 119.682 | 177.263 |
| When $n_2 \geqq n_{20}$, $n_{2m}$ = | 0.0074805 | 0.0854517 | 0.1377869 | 0.2440918 | 0.2955884 |
| When $n_2 < n_{20}$, $n_{2m}$ = | 0.0361890 | 0.0461035 | 0.1429895 | 0.1282532 | 0.2018481 |
| When $k_2 \geqq k_{20}$, $k_{2m}$ = | 0.0083386 | 0.0888440 | 0.1120801 | 0.1247546 | 0.2080872 |
| When $k_2 < k_{20}$, $k_{2m}$ = | 0.0485754 | 0.0635596 | 0.0642932 | 0.0606433 | 0.0779761 |
| When $d_2 \geqq d_{20}$, $d_{2m}$ (nm) = | 3.092 | ∞ | ∞ | ∞ | ∞ |
| When $d_2 < d_{20}$, $d_{2m}$ (nm) = | 17.439 | 14.439 | 35.904 | 75.946 | 92.429 |

1.1 < NA ≦ 1.2
195 < T ≦ 205

26/27

| Case | 20-01 | 20-02 | 20-03 | 20-04 | 20-05 |
|---|---|---|---|---|---|
| $n_{10}$ | 1.9249373 | 1.9134695 | 1.8970797 | 1.7208445 | 1.7215107 |
| $k_{10}$ | 0.1361664 | 0.1202777 | 0.0999072 | 0.0825059 | 0.0711590 |
| $d_{10}$ (nm) | 14.155 | 11.822 | 10.899 | 93.633 | 93.747 |
| $n_{20}$ | 1.7251855 | 1.6947701 | 1.6978665 | 1.6746972 | 1.6977852 |
| $k_{20}$ | 0.3723543 | 0.2878755 | 0.2388400 | 0.2167421 | 0.1834377 |
| $d_{20}$ (nm) | 156.237 | 218.180 | 275.054 | 209.700 | 263.540 |
| When $n_1 \geqq n_{10}$, $n_{1m}$ = | 0.0879163 | 0.1083789 | 0.1230811 | 0.0362378 | 0.0448303 |
| When $n_1 < n_{10}$, $n_{1m}$ = | 0.0472876 | 0.0648938 | 0.0826709 | 0.0083032 | 0.0200745 |
| When $k_1 \geqq k_{10}$, $k_{1m}$ = | 0.0660645 | 0.0884607 | 0.1084424 | 0.0221863 | 0.0429114 |
| When $k_1 < k_{10}$, $k_{1m}$ = | 0.0933167 | 0.1148511 | 0.0999072 | 0.0377161 | 0.0440771 |
| When $d_1 \geqq d_{10}$, $d_{1m}$ (nm) = | 4.725 | 5.477 | 6.424 | 13.579 | 31.897 |
| When $d_1 < d_{10}$, $d_{1m}$ (nm) = | 2.353 | 3.040 | 3.984 | 2.294 | 5.957 |
| When $n_2 \geqq n_{20}$, $n_{2m}$ = | 0.0937048 | 0.1017651 | 0.1009302 | 0.0215295 | 0.0601208 |
| When $n_2 < n_{20}$, $n_{2m}$ = | 0.1501685 | 0.1443250 | 0.1325146 | 0.0892346 | 0.1044958 |
| When $k_2 \geqq k_{20}$, $k_{2m}$ = | 0.0870276 | 0.0848474 | 0.0878162 | 0.0191504 | 0.0424573 |
| When $k_2 < k_{20}$, $k_{2m}$ = | 0.0940491 | 0.0866907 | 0.0808813 | 0.0520386 | 0.0521252 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 59.976 | 84.859 | 127.060 | 27.072 | 71.102 |

1.1 < NA ≦ 1.2
195 < T ≦ 205

| Case | 20-06 | 20-07 | 20-08 | 20-09 | 20-10 |
|---|---|---|---|---|---|
| $n_{10}$ | 1.7046380 | 1.7071945 | 1.6911424 | 1.6924731 | 1.6944113 |
| $k_{10}$ | 0.0728087 | 0.0643745 | 0.0761042 | 0.0678273 | 0.0547711 |
| $d_{10}$ (nm) | 160.840 | 160.796 | 216.237 | 212.933 | 211.610 |
| $n_{20}$ | 1.6842748 | 1.7036838 | 1.6835271 | 1.6899027 | 1.6931553 |
| $k_{20}$ | 0.1961079 | 0.1674255 | 0.2518702 | 0.2006809 | 0.1468072 |
| $d_{20}$ (nm) | 204.946 | 259.158 | 149.208 | 209.434 | 323.528 |
| When $n_1 \geqq n_{10}$, $n_{1m}$ = | 0.0417468 | 0.0534717 | 0.0144385 | 0.0489441 | 0.0528149 |
| When $n_1 < n_{10}$, $n_{1m}$ = | 0.0080798 | 0.0311902 | 0.0202490 | 0.0431433 | 0.0592456 |
| When $k_1 \geqq k_{10}$, $k_{1m}$ = | 0.0160498 | 0.0272644 | 0.0259192 | 0.0470654 | 0.0582300 |
| When $k_1 < k_{10}$, $k_{1m}$ = | 0.0189954 | 0.0257520 | 0.0204919 | 0.0289844 | 0.0354419 |
| When $d_1 \geqq d_{10}$, $d_{1m}$ (nm) = | ∞ | ∞ | 11.042 | ∞ | ∞ |
| When $d_1 < d_{10}$, $d_{1m}$ (nm) = | 2.830 | 21.473 | 8.826 | 44.978 | 116.569 |
| When $n_2 \geqq n_{20}$, $n_{2m}$ = | 0.0092676 | 0.0660242 | 0.0583154 | 0.1383105 | 0.2397107 |
| When $n_2 < n_{20}$, $n_{2m}$ = | 0.0345349 | 0.0284167 | 0.0279346 | 0.1133557 | 0.1358362 |
| When $k_2 \geqq k_{20}$, $k_{2m}$ = | 0.0098743 | 0.0192883 | 0.0839758 | 0.1160754 | 0.1327747 |
| When $k_2 < k_{20}$, $k_{2m}$ = | 0.0439319 | 0.0493506 | 0.0539001 | 0.0650562 | 0.0582056 |
| When $d_2 \geqq d_{20}$, $d_{2m}$ (nm) = | 4.069 | ∞ | ∞ | ∞ | ∞ |
| When $d_2 < d_{20}$, $d_{2m}$ (nm) = | 16.537 | 9.202 | 10.084 | 22.297 | 94.005 |

1.1 < NA ≦ 1.2
195 < T ≦ 205

27/27

| Case | 20-11 |
|---|---|
| $n_{10}$ | 1.6967389 |
| $k_{10}$ | 0.0554960 |
| $d_{10}$ (nm) | 271.524 |
| $n_{20}$ | 1.6919127 |
| $k_{20}$ | 0.1743507 |
| $d_{20}$ (nm) | 262.739 |
| When $n_1 \geqq n_{10}$, $n_{1m}$ = | 0.0690857 |
| When $n_1 < n_{10}$, $n_{1m}$ = | 0.0487012 |
| When $k_1 \geqq k_{10}$, $k_{1m}$ = | 0.0571155 |
| When $k_1 < k_{10}$, $k_{1m}$ = | 0.0354016 |
| When $d_1 \geqq d_{10}$, $d_{1m}$ (nm) = | ∞ |
| When $d_1 < d_{10}$, $d_{1m}$ (nm) = | 122.531 |
| When $n_2 \geqq n_{20}$, $n_{2m}$ = | 0.3042639 |
| When $n_2 < n_{20}$, $n_{2m}$ = | 0.2009363 |
| When $k_2 \geqq k_{20}$, $k_{2m}$ = | 0.2111316 |
| When $k_2 < k_{20}$, $k_{2m}$ = | 0.0800171 |
| When $d_2 \geqq d_{20}$, $d_{2m}$ (nm) = | ∞ |
| When $d_2 < d_{20}$, $d_{2m}$ (nm) = | 82.974 |

In accordance with a fourth embodiment of the invention, an antireflective film has a two-layer structure and is used in a process for manufacturing a semiconductor device by being provided between a resist layer and a silicon oxide layer formed on a surface of a silicon semiconductor substrate and having a thickness T (unit: nm) described below, for exposure of the resist layer in an exposure system having a wavelength of 190 nm to 195 nm and a numerical aperture NA of 1.2<NA≦1.3. In accordance with the fourth embodiment of the invention, an exposure method is used in a process for manufacturing a semiconductor device and includes providing an antireflective film having a two-layer structure between a resist layer and a silicon oxide layer formed on a surface of a silicon semiconductor substrate having a thickness T (unit: nm) described below, and exposing the resist layer in an exposure system having a wavelength of 190 nm to 195 nm and a numerical aperture NA of 1.2<NA≦1.3.

The antireflective film or the antireflective film used in the exposure method according to the fourth embodiment of the invention includes an upper layer having a complex refractive index $N_1$ and a lower layer having a complex refractive index $N_2$, the complex refractive indexes $N_1$ and $N_2$ being represented by the following equations:

$$N_1=n_1-k_1i$$

$$N_2=n_2-k_2i$$

Assuming that the thickness of the upper layer is $d_1$ (unit: nm) and the thickness of the lower layer is $d_2$ (unit: nm), when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the following relational expression:

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2\leqq 1$$

However, a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$. In the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm)=", each value (unit: nm) in the right columns is "$d_{1m}-d_{10}$"; in the line of "When $d_1<d_{10}$, $d_{1m}$ (nm)=", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm)=", each value (unit: nm) in the right columns is "$d_{2m}-d_{20}$"; and in the line of "When $d_2<d_{20}$, $d_{2m}$ (nm)=", each value (unit: nm) in the right columns is "$d_{20}-d_{2m}$".

$1.2 < NA \leqq 1.3$
$2 \leqq T \leqq 15$

1/21

| Case | 1-01 | 1-02 | 1-03 | 1-04 | 1-05 |
|---|---|---|---|---|---|
| $n_{10}$ | 2.070 | 1.955 | 1.895 | 1.875 | 1.870 |
| $k_{10}$ | 0.020 | 0.138 | 0.133 | 0.110 | 0.101 |
| $d_{10}$ (nm) | 27.974 | 34.826 | 29.218 | 17.990 | 13.959 |
| $n_{20}$ | 5.553 | 9.284 | 2.177 | 1.753 | 1.700 |
| $k_{20}$ | 3.053 | 0.606 | 0.543 | 0.330 | 0.255 |
| $d_{20}$ (nm) | 2.024 | 10.907 | 63.407 | 152.930 | 218.765 |
| When $n_1 \geqq n_{10}$, $n_{1m}$ = | 2.141 | 2.017 | 1.952 | 1.943 | 1.957 |
| When $n_1 < n_{10}$, $n_{1m}$ = | 2.006 | 1.896 | 1.854 | 1.843 | 1.821 |
| When $k_1 \geqq k_{10}$, $k_{1m}$ = | 0.075 | 0.180 | 0.166 | 0.155 | 0.171 |
| When $k_1 < k_{10}$, $k_{1m}$ = | 0.000 | 0.061 | 0.055 | 0.028 | 0.009 |
| When $d_1 \geqq d_{10}$, $d_{1m}$ (nm) = | 31.254 | 39.247 | 35.017 | 23.926 | 20.211 |
| When $d_1 < d_{10}$, $d_{1m}$ (nm) = | 25.519 | 31.618 | 26.178 | 15.560 | 10.679 |
| When $n_2 \geqq n_{20}$, $n_{2m}$ = | 5.876 | 9.377 | 2.281 | 1.832 | 1.773 |
| When $n_2 < n_{20}$, $n_{2m}$ = | 5.233 | 9.207 | 2.051 | 1.635 | 1.577 |
| When $k_2 \geqq k_{20}$, $k_{2m}$ = | 3.362 | 0.715 | 0.699 | 0.412 | 0.320 |
| When $k_2 < k_{20}$, $k_{2m}$ = | 2.751 | 0.513 | 0.439 | 0.253 | 0.185 |
| When $d_2 \geqq d_{20}$, $d_{2m}$ (nm) = | 2.251 | 11.023 | 70.023 | ∞ | ∞ |
| When $d_2 < d_{20}$, $d_{2m}$ (nm) = | 1.807 | 10.812 | 58.076 | 125.396 | 142.606 |

$1.2 < NA \leqq 1.3$
$2 \leqq T \leqq 15$

| Case | 1-06 | 1-07 | 1-08 | 1-09 | 1-10 |
|---|---|---|---|---|---|
| $n_{10}$ | 1.867 | 1.699 | 1.693 | 1.692 | 1.694 |
| $k_{10}$ | 0.070 | 0.063 | 0.058 | 0.069 | 0.074 |
| $d_{10}$ (nm) | 13.235 | 165.016 | 157.920 | 236.756 | 217.672 |
| $n_{20}$ | 1.732 | 1.698 | 1.698 | 6.942 | 1.788 |
| $k_{20}$ | 0.221 | 0.180 | 0.154 | 3.076 | 0.339 |
| $d_{20}$ (nm) | 270.745 | 204.222 | 265.886 | 0.950 | 84.006 |
| When $n_1 \geqq n_{10}$, $n_{1m}$ = | 1.964 | 1.701 | 1.708 | 1.727 | 1.710 |
| When $n_1 < n_{10}$, $n_{1m}$ = | 1.810 | 1.683 | 1.664 | 1.662 | 1.674 |
| When $k_1 \geqq k_{10}$, $k_{1m}$ = | 0.149 | 0.068 | 0.084 | 0.108 | 0.106 |
| When $k_1 < k_{10}$, $k_{1m}$ = | 0.000 | 0.043 | 0.031 | 0.039 | 0.053 |
| When $d_1 \geqq d_{10}$, $d_{1m}$ (nm) = | 20.519 | 166.410 | 170.845 | 255.389 | 226.062 |
| When $d_1 < d_{10}$, $d_{1m}$ (nm) = | 9.259 | 155.941 | 111.504 | 217.630 | 206.257 |
| When $n_2 \geqq n_{20}$, $n_{2m}$ = | 1.809 | 1.721 | 1.754 | 7.503 | 1.909 |
| When $n_2 < n_{20}$, $n_{2m}$ = | 1.603 | 1.694 | 1.667 | 6.491 | 1.763 |
| When $k_2 \geqq k_{20}$, $k_{2m}$ = | 0.293 | 0.188 | 0.194 | 3.321 | 0.395 |
| When $k_2 < k_{20}$, $k_{2m}$ = | 0.152 | 0.139 | 0.113 | 2.487 | 0.243 |
| When $d_2 \geqq d_{20}$, $d_{2m}$ (nm) = | ∞ | 217.552 | ∞ | 1.062 | 100.609 |
| When $d_2 < d_{20}$, $d_{2m}$ (nm) = | 182.495 | 202.082 | 249.694 | 0.781 | 81.237 |

$1.2 < NA \leqq 1.3$
$2 \leqq T \leqq 15$

2/21

| Case | 1-11 | 1-12 | 1-13 |
|---|---|---|---|
| $n_{10}$ | 1.699 | 1.698 | 1.695 |
| $k_{10}$ | 0.071 | 0.065 | 0.054 |
| $d_{10}$ (nm) | 210.274 | 207.280 | 219.181 |
| $n_{20}$ | 1.718 | 1.695 | 1.688 |
| $k_{20}$ | 0.242 | 0.194 | 0.161 |
| $d_{20}$ (nm) | 154.667 | 219.490 | 263.755 |
| When $n_1 \geqq n_{10}$, $n_{1m}$ = | 1.720 | 1.737 | 1.738 |
| When $n_1 < n_{10}$, $n_{1m}$ = | 1.683 | 1.675 | 1.660 |
| When $k_1 \geqq k_{10}$, $k_{1m}$ = | 0.099 | 0.097 | 0.100 |
| When $k_1 < k_{10}$, $k_{1m}$ = | 0.045 | 0.035 | 0.019 |
| When $d_1 \geqq d_{10}$, $d_{1m}$ (nm) = | 229.005 | ∞ | ∞ |
| When $d_1 < d_{10}$, $d_{1m}$ (nm) = | 200.369 | 189.200 | 189.609 |
| When $n_2 \geqq n_{20}$, $n_{2m}$ = | 1.849 | 1.855 | 1.900 |
| When $n_2 < n_{20}$, $n_{2m}$ = | 1.670 | 1.540 | 1.583 |
| When $k_2 \geqq k_{20}$, $k_{2m}$ = | 0.332 | 0.307 | 0.271 |
| When $k_2 < k_{20}$, $k_{2m}$ = | 0.164 | 0.122 | 0.102 |
| When $d_2 \geqq d_{20}$, $d_{2m}$ (nm) = | ∞ | ∞ | ∞ |
| When $d_2 < d_{20}$, $d_{2m}$ (nm) = | 143.819 | 154.002 | 185.363 |

$1.2 < NA \leqq 1.3$
$15 < T \leqq 25$

3/21

| Case | 2-01 | 2-02 | 2-03 | 2-04 | 2-05 |
|---|---|---|---|---|---|
| $n_{10}$ | 1.894 | 1.881 | 1.874 | 1.872 | 1.693 |
| $k_{10}$ | 0.182 | 0.116 | 0.105 | 0.074 | 0.060 |
| $d_{10}$ (nm) | 37.493 | 18.625 | 14.298 | 13.408 | 158.097 |
| $n_{20}$ | 9.246 | 1.766 | 1.701 | 1.733 | 1.697 |
| $k_{20}$ | 0.662 | 0.358 | 0.269 | 0.231 | 0.160 |

-continued

| | | | | | |
|---|---|---|---|---|---|
| $d_{20}$ (nm) | 10.628 | 142.939 | 209.610 | 261.989 | 257.142 |
| When $n_1 \geqq n_{10}$, $n_{1m}$ = | 1.954 | 1.946 | 1.957 | 1.966 | 1.703 |
| When $n_1 < n_{10}$, $n_{1m}$ = | 1.847 | 1.852 | 1.828 | 1.817 | 1.667 |
| When $k_1 \geqq k_{10}$, $k_{1m}$ = | 0.222 | 0.156 | 0.171 | 0.149 | 0.081 |
| When $k_1 < k_{10}$, $k_{1m}$ = | 0.111 | 0.037 | 0.015 | 0.000 | 0.035 |
| When $d_1 \geqq d_{10}$, $d_{1m}$ (nm) = | 41.975 | 24.164 | 20.222 | 20.345 | 165.590 |
| When $d_1 < d_{10}$, $d_{1m}$ (nm) = | 34.168 | 16.466 | 11.264 | 9.664 | 137.726 |
| When $n_2 \geqq n_{20}$, $n_{2m}$ = | 9.356 | 1.841 | 1.772 | 1.809 | 1.744 |
| When $n_2 < n_{20}$, $n_{2m}$ = | 9.153 | 1.650 | 1.579 | 1.602 | 1.674 |
| When $k_2 \geqq k_{20}$, $k_{2m}$ = | 0.784 | 0.442 | 0.334 | 0.302 | 0.195 |
| When $k_2 < k_{20}$, $k_{2m}$ = | 0.549 | 0.280 | 0.198 | 0.162 | 0.120 |
| When $d_2 \geqq d_{20}$, $d_{2m}$ (nm) = | 10.759 | ∞ | ∞ | ∞ | ∞ |
| When $d_2 < d_{20}$, $d_{2m}$ (nm) = | 10.519 | 119.178 | 137.341 | 178.243 | 243.996 |

$1.2 < NA \leqq 1.3$
$15 < T \leqq 25$

| Case | 2-06 | 2-07 | 2-08 | 2-09 | 2-10 |
|---|---|---|---|---|---|
| $n_{10}$ | 1.690 | 1.693 | 1.699 | 1.698 | 1.695 |
| $k_{10}$ | 0.074 | 0.078 | 0.074 | 0.067 | 0.055 |
| $d_{10}$ (nm) | 235.203 | 218.334 | 210.503 | 207.468 | 219.130 |
| $n_{20}$ | 5.632 | 1.803 | 1.719 | 1.694 | 1.687 |
| $k_{20}$ | 4.204 | 0.382 | 0.259 | 0.203 | 0.167 |
| $d_{20}$ (nm) | 0.919 | 74.994 | 145.797 | 210.546 | 255.274 |
| When $n_1 \geqq n_{10}$, $n_{1m}$ = | 1.708 | 1.699 | 1.715 | 1.733 | 1.737 |
| When $n_1 < n_{10}$, $n_{1m}$ = | 1.661 | 1.675 | 1.684 | 1.676 | 1.661 |
| When $k_1 \geqq k_{10}$, $k_{1m}$ = | 0.102 | 0.098 | 0.100 | 0.097 | 0.100 |
| When $k_1 < k_{10}$, $k_{1m}$ = | 0.051 | 0.067 | 0.052 | 0.039 | 0.022 |
| When $d_1 \geqq d_{10}$, $d_{1m}$ (nm) = | 241.533 | 220.890 | 225.049 | ∞ | ∞ |
| When $d_1 < d_{10}$, $d_{1m}$ (nm) = | 217.317 | 207.766 | 201.595 | 191.244 | 190.979 |
| When $n_2 \geqq n_{20}$, $n_{2m}$ = | 6.262 | 1.931 | 1.852 | 1.853 | 1.902 |
| When $n_2 < n_{20}$, $n_{2m}$ = | 5.366 | 1.793 | 1.684 | 1.538 | 1.584 |
| When $k_2 \geqq k_{20}$, $k_{2m}$ = | 4.338 | 0.416 | 0.339 | 0.310 | 0.275 |
| When $k_2 < k_{20}$, $k_{2m}$ = | 3.555 | 0.288 | 0.182 | 0.132 | 0.107 |
| When $d_2 \geqq d_{20}$, $d_{2m}$ (nm) = | 0.986 | 89.025 | ∞ | ∞ | ∞ |
| When $d_2 < d_{20}$, $d_{2m}$ (nm) = | 0.720 | 74.083 | 139.178 | 147.776 | 179.334 |

$1.2 < NA \leqq 1.3$
$25 < T \leqq 35$

| Case | 3-01 | 3-02 | 3-03 | 3-04 | 4/21 3-05 |
|---|---|---|---|---|---|
| $n_{10}$ | 1.855 | 1.894 | 1.879 | 1.879 | 1.692 |
| $k_{10}$ | 0.222 | 0.121 | 0.110 | 0.076 | 0.062 |
| $d_{10}$ (nm) | 38.795 | 19.092 | 14.598 | 13.458 | 158.198 |
| $n_{20}$ | 9.554 | 1.787 | 1.702 | 1.736 | 1.697 |
| $k_{20}$ | 0.714 | 0.392 | 0.285 | 0.242 | 0.168 |
| $d_{20}$ (nm) | 10.003 | 133.195 | 201.011 | 253.439 | 248.709 |
| When $n_1 \geqq n_{10}$, $n_{1m}$ = | 1.905 | 1.955 | 1.958 | 1.971 | 1.699 |
| When $n_1 < n_{10}$, $n_{1m}$ = | 1.821 | 1.868 | 1.836 | 1.826 | 1.670 |
| When $k_1 \geqq k_{10}$, $k_{1m}$ = | 0.258 | 0.156 | 0.172 | 0.149 | 0.078 |
| When $k_1 < k_{10}$, $k_{1m}$ = | 0.159 | 0.047 | 0.022 | 0.000 | 0.041 |
| When $d_1 \geqq d_{10}$, $d_{1m}$ (nm) = | 42.560 | 24.067 | 20.129 | 19.949 | 161.711 |
| When $d_1 < d_{10}$, $d_{1m}$ (nm) = | 36.125 | 17.295 | 11.822 | 9.987 | 144.941 |
| When $n_2 \geqq n_{20}$, $n_{2m}$ = | 9.681 | 1.856 | 1.769 | 1.811 | 1.737 |
| When $n_2 < n_{20}$, $n_{2m}$ = | 9.446 | 1.674 | 1.584 | 1.608 | 1.683 |
| When $k_2 \geqq k_{20}$, $k_{2m}$ = | 0.829 | 0.479 | 0.348 | 0.313 | 0.196 |
| When $k_2 < k_{20}$, $k_{2m}$ = | 0.587 | 0.314 | 0.215 | 0.173 | 0.129 |
| When $d_2 \geqq d_{20}$, $d_{2m}$ (nm) = | 10.138 | ∞ | ∞ | ∞ | ∞ |
| When $d_2 < d_{20}$, $d_{2m}$ (nm) = | 9.892 | 112.716 | 132.762 | 173.492 | 239.168 |

$1.2 < NA \leqq 1.3$
$25 < T \leqq 35$

| Case | 3-06 | 3-07 | 3-08 |
|---|---|---|---|
| $n_{10}$ | 1.699 | 1.698 | 1.695 |
| $k_{10}$ | 0.078 | 0.070 | 0.057 |
| $d_{10}$ (nm) | 210.437 | 207.381 | 219.158 |
| $n_{20}$ | 1.720 | 1.693 | 1.687 |
| $k_{20}$ | 0.280 | 0.215 | 0.175 |
| $d_{20}$ (nm) | 137.855 | 202.487 | 246.765 |
| When $n_1 \geqq n_{10}$, $n_{1m}$ = | 1.710 | 1.730 | 1.737 |
| When $n_1 < n_{10}$, $n_{1m}$ = | 1.686 | 1.678 | 1.661 |
| When $k_1 \geqq k_{10}$, $k_{1m}$ = | 0.100 | 0.097 | 0.101 |
| When $k_1 < k_{10}$, $k_{1m}$ = | 0.063 | 0.046 | 0.025 |
| When $d_1 \geqq d_{10}$, $d_{1m}$ (nm) = | 216.379 | ∞ | ∞ |
| When $d_1 < d_{10}$, $d_{1m}$ (nm) = | 202.875 | 193.042 | 192.539 |
| When $n_2 \geqq n_{20}$, $n_{2m}$ = | 1.855 | 1.841 | 1.910 |
| When $n_2 < n_{20}$, $n_{2m}$ = | 1.702 | 1.535 | 1.588 |
| When $k_2 \geqq k_{20}$, $k_{2m}$ = | 0.336 | 0.312 | 0.280 |
| When $k_2 < k_{20}$, $k_{2m}$ = | 0.208 | 0.146 | 0.114 |
| When $d_2 \geqq d_{20}$, $d_{2m}$ (nm) = | ∞ | ∞ | ∞ |
| When $d_2 < d_{20}$, $d_{2m}$ (nm) = | 134.716 | 142.289 | 200.270 |

$1.2 < NA \leqq 1.3$
$35 < T \leqq 45$

| Case | 4-01 | 4-02 | 4-03 | 4-04 | 5/21 4-05 |
|---|---|---|---|---|---|
| $n_{10}$ | 1.921 | 1.907 | 1.883 | 1.885 | 1.692 |
| $k_{10}$ | 0.198 | 0.132 | 0.117 | 0.078 | 0.064 |
| $d_{10}$ (nm) | 29.852 | 18.597 | 14.666 | 13.425 | 158.019 |
| $n_{20}$ | 2.410 | 1.779 | 1.698 | 1.738 | 1.697 |
| $k_{20}$ | 0.850 | 0.418 | 0.298 | 0.251 | 0.174 |
| $d_{20}$ (nm) | 42.336 | 126.566 | 192.788 | 244.904 | 240.368 |
| When $n_1 \geqq n_{10}$, $n_{1m}$ = | 1.964 | 1.964 | 1.959 | 1.975 | 1.694 |
| When $n_1 < n_{10}$, $n_{1m}$ = | 1.894 | 1.886 | 1.843 | 1.834 | 1.673 |
| When $k_1 \geqq k_{10}$, $k_{1m}$ = | 0.224 | 0.160 | 0.175 | 0.149 | 0.073 |
| When $k_1 < k_{10}$, $k_{1m}$ = | 0.152 | 0.061 | 0.031 | 0.000 | 0.048 |
| When $d_1 \geqq d_{10}$, $d_{1m}$ (nm) = | 33.127 | 22.917 | 19.812 | 19.537 | 159.270 |
| When $d_1 < d_{10}$, $d_{1m}$ (nm) = | 28.245 | 17.267 | 12.114 | 10.202 | 147.983 |
| When $n_2 \geqq n_{20}$, $n_{2m}$ = | 2.530 | 1.833 | 1.762 | 1.812 | 1.732 |
| When $n_2 < n_{20}$, $n_{2m}$ = | 2.288 | 1.667 | 1.583 | 1.611 | 1.691 |
| When $k_2 \geqq k_{20}$, $k_{2m}$ = | 0.928 | 0.492 | 0.359 | 0.320 | 0.195 |
| When $k_2 < k_{20}$, $k_{2m}$ = | 0.730 | 0.344 | 0.229 | 0.182 | 0.145 |
| When $d_2 \geqq d_{20}$, $d_{2m}$ (nm) = | 46.411 | ∞ | ∞ | ∞ | 274.107 |
| When $d_2 < d_{20}$, $d_{2m}$ (nm) = | 39.931 | 107.536 | 154.271 | 167.375 | 234.670 |

$1.2 < NA \leqq 1.3$
$35 < T \leqq 45$

| Case | 4-06 | 4-07 | 4-08 | 4-09 |
|---|---|---|---|---|
| $n_{10}$ | 1.700 | 1.698 | 1.695 | 1.705 |
| $k_{10}$ | 0.081 | 0.072 | 0.059 | 0.053 |
| $d_{10}$ (nm) | 209.560 | 206.609 | 219.174 | 283.412 |
| $n_{20}$ | 1.716 | 1.692 | 1.688 | 1.691 |
| $k_{20}$ | 0.298 | 0.225 | 0.183 | 0.185 |
| $d_{20}$ (nm) | 131.419 | 195.862 | 237.750 | 233.362 |
| When $n_1 \geqq n_{10}$, $n_{1m}$ = | 1.701 | 1.721 | 1.734 | 1.751 |
| When $n_1 < n_{10}$, $n_{1m}$ = | 1.689 | 1.680 | 1.662 | 1.675 |
| When $k_1 \geqq k_{10}$, $k_{1m}$ = | 0.099 | 0.097 | 0.101 | 0.092 |
| When $k_1 < k_{10}$, $k_{1m}$ = | 0.076 | 0.050 | 0.027 | 0.024 |
| When $d_1 \geqq d_{10}$, $d_{1m}$ (nm) = | 210.753 | ∞ | ∞ | ∞ |
| When $d_1 < d_{10}$, $d_{1m}$ (nm) = | 203.620 | 194.085 | 194.045 | 189.814 |
| When $n_2 \geqq n_{20}$, $n_{2m}$ = | 1.846 | 1.812 | 1.920 | 1.889 |

-continued

| | | | | |
|---|---|---|---|---|
| When $n_2 < n_{20}, n_{2m}$ = | 1.712 | 1.528 | 1.594 | 1.515 |
| When $k_2 \geqq k_{20}, k_{2m}$ = | 0.319 | 0.315 | 0.285 | 0.358 |
| When $k_2 < k_{20}, k_{2m}$ = | 0.257 | 0.159 | 0.121 | 0.115 |
| When $d_2 \geqq d_{20}, d_{2m}$ (nm) = | ∞ | ∞ | ∞ | ∞ |
| When $d_2 < d_{20}, d_{2m}$ (nm) = | 130.894 | 179.580 | 197.417 | 162.566 |

$1.2 < NA \leqq 1.3$
$45 < T \leqq 55$

| Case | 5-01 | 5-02 | 5-03 | 5-04 | 6/21 5-05 |
|---|---|---|---|---|---|
| $n_{10}$ | 1.943 | 1.907 | 1.884 | 1.891 | 1.691 |
| $k_{10}$ | 0.213 | 0.153 | 0.123 | 0.078 | 0.066 |
| $d_{10}$ (nm) | 22.907 | 17.372 | 14.585 | 13.392 | 157.377 |
| $n_{20}$ | 1.902 | 1.716 | 1.691 | 1.743 | 1.696 |
| $k_{20}$ | 0.785 | 0.418 | 0.305 | 0.257 | 0.178 |
| $d_{20}$ (nm) | 53.731 | 124.143 | 184.536 | 235.129 | 232.195 |
| When $n_1 \geqq n_{10}, n_{1m}$ = | 1.979 | 1.963 | 1.959 | 1.980 | 1.692 |
| When $n_1 < n_{10}, n_{1m}$ = | 1.934 | 1.892 | 1.845 | 1.841 | 1.676 |
| When $k_1 \geqq k_{10}, k_{1m}$ = | 0.223 | 0.175 | 0.181 | 0.148 | 0.067 |
| When $k_1 < k_{10}, k_{1m}$ = | 0.198 | 0.080 | 0.039 | 0.000 | 0.057 |
| When $d_1 \geqq d_{10}, d_{1m}$ (nm) = | 25.447 | 21.108 | 19.487 | 19.257 | 157.441 |
| When $d_1 < d_{10}, d_{1m}$ (nm) = | 22.431 | 16.482 | 12.133 | 10.346 | 149.670 |
| When $n_2 \geqq n_{20}, n_{2m}$ = | 1.937 | 1.752 | 1.753 | 1.817 | 1.727 |
| When $n_2 < n_{20}, n_{2m}$ = | 1.871 | 1.605 | 1.576 | 1.616 | 1.695 |
| When $k_2 \geqq k_{20}, k_{2m}$ = | 0.813 | 0.464 | 0.362 | 0.326 | 0.187 |
| When $k_2 < k_{20}, k_{2m}$ = | 0.724 | 0.351 | 0.237 | 0.188 | 0.173 |
| When $d_2 \geqq d_{20}, d_{2m}$ (nm) = | 58.954 | ∞ | ∞ | ∞ | 254.885 |
| When $d_2 < d_{20}, d_{2m}$ (nm) = | 51.905 | 103.951 | 122.545 | 158.102 | 231.812 |

$1.2 < NA \leqq 1.3$
$45 < T \leqq 55$

| Case | 5-06 | 5-07 | 5-08 |
|---|---|---|---|
| $n_{10}$ | 1.699 | 1.695 | 1.704 |
| $k_{10}$ | 0.072 | 0.060 | 0.054 |
| $d_{10}$ (nm) | 204.994 | 219.095 | 283.255 |
| $n_{20}$ | 1.688 | 1.689 | 1.689 |
| $k_{20}$ | 0.231 | 0.188 | 0.189 |
| $d_{20}$ (nm) | 192.230 | 228.102 | 224.255 |
| When $n_1 \geqq n_{10}, n_{1m}$ = | 1.718 | 1.729 | 1.749 |
| When $n_1 < n_{10}, n_{1m}$ = | 1.682 | 1.663 | 1.676 |
| When $k_1 \geqq k_{10}, k_{1m}$ = | 0.096 | 0.102 | 0.091 |
| When $k_1 < k_{10}, k_{1m}$ = | 0.048 | 0.030 | 0.025 |
| When $d_1 \geqq d_{10}, d_{1m}$ (nm) = | ∞ | ∞ | ∞ |
| When $d_1 < d_{10}, d_{1m}$ (nm) = | 194.149 | 195.371 | 190.682 |
| When $n_2 \geqq n_{20}, n_{2m}$ = | 1.788 | 1.929 | 1.898 |
| When $n_2 < n_{20}, n_{2m}$ = | 1.641 | 1.601 | 1.530 |
| When $k_2 \geqq k_{20}, k_{2m}$ = | 0.326 | 0.290 | 0.362 |
| When $k_2 < k_{20}, k_{2m}$ = | 0.165 | 0.127 | 0.117 |
| When $d_2 \geqq d_{20}, d_{2m}$ (nm) = | ∞ | ∞ | ∞ |
| When $d_2 < d_{20}, d_{2m}$ (nm) = | 176.978 | 195.845 | 153.544 |

$1.2 < NA \leqq 1.3$
$55 < T \leqq 65$

| Case | 6-01 | 6-02 | 6-03 | 6-04 | 7/21 6-05 |
|---|---|---|---|---|---|
| $n_{10}$ | 1.895 | 1.882 | 1.690 | 1.701 | 1.693 |
| $k_{10}$ | 0.076 | 0.126 | 0.068 | 0.084 | 0.070 |

-continued

| | | | | | |
|---|---|---|---|---|---|
| $d_{10}$ (nm) | 13.537 | 14.752 | 155.845 | 206.275 | 221.382 |
| $n_{20}$ | 1.753 | 1.688 | 1.693 | 1.686 | 1.667 |
| $k_{20}$ | 0.262 | 0.309 | 0.181 | 0.310 | 0.231 |
| $d_{20}$ (nm) | 223.848 | 174.672 | 224.616 | 122.505 | 161.928 |
| When $n_1 \geqq n_{10}, n_{1m}$ = | 1.983 | 1.956 | 1.691 | 1.703 | 1.726 |
| When $n_1 < n_{10}, n_{1m}$ = | 1.846 | 1.842 | 1.680 | 1.695 | 1.686 |
| When $k_1 \geqq k_{10}, k_{1m}$ = | 0.143 | 0.185 | 0.071 | 0.096 | 0.105 |
| When $k_1 < k_{10}, k_{1m}$ = | 0.000 | 0.045 | 0.054 | 0.076 | 0.063 |
| When $d_1 \geqq d_{10}, d_{1m}$ (nm) = | 19.333 | 19.661 | 156.188 | 207.561 | 253.974 |
| When $d_1 < d_{10}, d_{1m}$ (nm) = | 10.604 | 12.234 | 149.873 | 203.306 | 217.847 |
| When $n_2 \geqq n_{20}, n_{2m}$ = | 1.828 | 1.751 | 1.713 | 1.791 | 1.691 |
| When $n_2 < n_{20}, n_{2m}$ = | 1.623 | 1.571 | 1.692 | 1.682 | 1.585 |
| When $k_2 \geqq k_{20}, k_{2m}$ = | 0.332 | 0.365 | 0.184 | 0.352 | 0.284 |
| When $k_2 < k_{20}, k_{2m}$ = | 0.191 | 0.239 | 0.171 | 0.280 | 0.201 |
| When $d_2 \geqq d_{20}, d_{2m}$ (nm) = | ∞ | ∞ | 244.114 | 149.549 | 170.132 |
| When $d_2 < d_{20}, d_{2m}$ (nm) = | 146.194 | 124.203 | 224.269 | 121.948 | 139.231 |

$1.2 < NA \leqq 1.3$
$55 < T \leqq 65$

| Case | 6-06 | 6-07 | 6-08 |
|---|---|---|---|
| $n_{10}$ | 1.695 | 1.695 | 1.703 |
| $k_{10}$ | 0.060 | 0.055 | 0.049 |
| $d_{10}$ (nm) | 218.851 | 215.764 | 278.302 |
| $n_{20}$ | 1.689 | 1.693 | 1.691 |
| $k_{20}$ | 0.190 | 0.162 | 0.159 |
| $d_{20}$ (nm) | 218.129 | 277.062 | 273.241 |
| When $n_1 \geqq n_{10}, n_{1m}$ = | 1.726 | 1.740 | 1.751 |
| When $n_1 < n_{10}, n_{1m}$ = | 1.665 | 1.662 | 1.653 |
| When $k_1 \geqq k_{10}, k_{1m}$ = | 0.102 | 0.097 | 0.092 |
| When $k_1 < k_{10}, k_{1m}$ = | 0.031 | 0.021 | 0.015 |
| When $d_1 \geqq d_{10}, d_{1m}$ (nm) = | ∞ | ∞ | ∞ |
| When $d_1 < d_{10}, d_{1m}$ (nm) = | 196.531 | 170.235 | 166.884 |
| When $n_2 \geqq n_{20}, n_{2m}$ = | 1.935 | 1.919 | 1.925 |
| When $n_2 < n_{20}, n_{2m}$ = | 1.606 | 1.543 | 1.498 |
| When $k_2 \geqq k_{20}, k_{2m}$ = | 0.294 | 0.280 | 0.278 |
| When $k_2 < k_{20}, k_{2m}$ = | 0.130 | 0.102 | 0.095 |
| When $d_2 \geqq d_{20}, d_{2m}$ (nm) = | ∞ | ∞ | ∞ |
| When $d_2 < d_{20}, d_{2m}$ (nm) = | 191.652 | 197.142 | 190.724 |

$1.2 < NA \leqq 1.3$
$65 < T \leqq 75$

| Case | 7-01 | 7-02 | 7-03 | 7-04 | 8/21 7-05 |
|---|---|---|---|---|---|
| $n_{10}$ | 1.881 | 1.879 | 1.898 | 1.873 | 1.715 |
| $k_{10}$ | 0.189 | 0.125 | 0.073 | 0.092 | 0.067 |
| $d_{10}$ (nm) | 17.242 | 15.444 | 14.029 | 12.003 | 99.925 |
| $n_{20}$ | 1.617 | 1.697 | 1.767 | 1.696 | 1.686 |
| $k_{20}$ | 0.409 | 0.320 | 0.271 | 0.218 | 0.167 |
| $d_{20}$ (nm) | 111.921 | 162.536 | 211.582 | 280.785 | 269.056 |
| When $n_1 \geqq n_{10}, n_{1m}$ = | 1.933 | 1.953 | 1.985 | 1.975 | 1.746 |
| When $n_1 < n_{10}, n_{1m}$ = | 1.873 | 1.839 | 1.852 | 1.816 | 1.710 |
| When $k_1 \geqq k_{10}, k_{1m}$ = | 0.202 | 0.184 | 0.136 | 0.174 | 0.081 |
| When $k_1 < k_{10}, k_{1m}$ = | 0.122 | 0.046 | 0.000 | 0.000 | 0.037 |
| When $d_1 \geqq d_{10}, d_{1m}$ (nm) = | 20.550 | 20.523 | 19.818 | 18.551 | 136.285 |
| When $d_1 < d_{10}, d_{1m}$ (nm) = | 16.700 | 12.791 | 11.204 | 8.554 | 98.008 |
| When $n_2 \geqq n_{20}, n_{2m}$ = | 1.633 | 1.761 | 1.845 | 1.780 | 1.699 |

-continued

| | | | | | |
|---|---|---|---|---|---|
| When $n_2 < n_{20}$, $n_{2m}$ = | 1.511 | 1.579 | 1.638 | 1.585 | 1.620 |
| When $k_2 \geqq k_{20}$, $k_{2m}$ = | 0.430 | 0.380 | 0.344 | 0.283 | 0.175 |
| When $k_2 < k_{20}$, $k_{2m}$ = | 0.344 | 0.246 | 0.196 | 0.150 | 0.131 |
| When $d_2 \geqq d_{20}$, $d_{2m}$ (nm) = | ∞ | ∞ | ∞ | ∞ | 278.211 |
| When $d_2 < d_{20}$, $d_{2m}$ (nm) = | 91.266 | 127.980 | 136.666 | 158.294 | 243.285 |

$1.2 < NA \leqq 1.3$
$65 < T \leqq 75$

| Case | 7-06 | 7-07 | 7-08 |
|---|---|---|---|
| $n_{10}$ | 1.693 | 1.695 | 1.695 |
| $k_{10}$ | 0.070 | 0.061 | 0.055 |
| $d_{10}$ (nm) | 221.230 | 218.569 | 215.552 |
| $n_{20}$ | 1.668 | 1.689 | 1.692 |
| $k_{20}$ | 0.236 | 0.193 | 0.164 |
| $d_{20}$ (nm) | 151.884 | 208.598 | 267.637 |
| When $n_1 \geqq n_{10}$, $n_{1m}$ = | 1.724 | 1.724 | 1.741 |
| When $n_1 < n_{10}$, $n_{1m}$ = | 1.686 | 1.666 | 1.661 |
| When $k_1 \geqq k_{10}$, $k_{1m}$ = | 0.105 | 0.101 | 0.097 |
| When $k_1 < k_{10}$, $k_{1m}$ = | 0.064 | 0.031 | 0.021 |
| When $d_1 \geqq d_{10}$, $d_{1m}$ (nm) = | 247.645 | ∞ | ∞ |
| When $d_1 < d_{10}$, $d_{1m}$ (nm) = | 218.101 | 197.493 | 171.385 |
| When $n_2 \geqq n_{20}$, $n_{2m}$ = | 1.689 | 1.934 | 1.918 |
| When $n_2 < n_{20}$, $n_{2m}$ = | 1.586 | 1.609 | 1.542 |
| When $k_2 \geqq k_{20}$, $k_{2m}$ = | 0.286 | 0.296 | 0.281 |
| When $k_2 < k_{20}$, $k_{2m}$ = | 0.205 | 0.130 | 0.101 |
| When $d_2 \geqq d_{20}$, $d_{2m}$ (nm) = | 159.193 | ∞ | ∞ |
| When $d_2 < d_{20}$, $d_{2m}$ (nm) = | 130.698 | 183.027 | 188.504 |

$1.2 < NA \leqq 1.3$
$75 < T \leqq 85$

| Case | 8-01 | 8-02 | 8-03 | 8-04 | 9/21 8-05 |
|---|---|---|---|---|---|
| $n_{10}$ | 1.880 | 1.901 | 1.874 | 1.716 | 1.692 |
| $k_{10}$ | 0.126 | 0.074 | 0.095 | 0.068 | 0.072 |
| $d_{10}$ (nm) | 16.279 | 14.624 | 12.218 | 99.848 | 220.366 |
| $n_{20}$ | 1.709 | 1.778 | 1.694 | 1.687 | 1.668 |
| $k_{20}$ | 0.340 | 0.284 | 0.225 | 0.173 | 0.244 |
| $d_{20}$ (nm) | 151.148 | 201.087 | 271.916 | 259.863 | 143.647 |
| When $n_1 \geqq n_{10}$, $n_{1m}$ = | 1.951 | 1.984 | 1.974 | 1.746 | 1.725 |
| When $n_1 < n_{10}$, $n_{1m}$ = | 1.842 | 1.857 | 1.818 | 1.712 | 1.688 |
| When $k_1 \geqq k_{10}$, $k_{1m}$ = | 0.181 | 0.134 | 0.175 | 0.079 | 0.106 |
| When $k_1 < k_{10}$, $k_{1m}$ = | 0.048 | 0.000 | 0.000 | 0.042 | 0.068 |
| When $d_1 \geqq d_{10}$, $d_{1m}$ (nm) = | 21.358 | 20.311 | 18.650 | 135.917 | 245.491 |
| When $d_1 < d_{10}$, $d_{1m}$ (nm) = | 13.627 | 11.922 | 8.869 | 98.660 | 218.637 |
| When $n_2 \geqq n_{20}$, $n_{2m}$ = | 1.774 | 1.856 | 1.776 | 1.696 | 1.688 |
| When $n_2 < n_{20}$, $n_{2m}$ = | 1.592 | 1.651 | 1.582 | 1.624 | 1.581 |
| When $k_2 \geqq k_{20}$, $k_{2m}$ = | 0.403 | 0.360 | 0.289 | 0.178 | 0.280 |
| When $k_2 < k_{20}$, $k_{2m}$ = | 0.263 | 0.208 | 0.157 | 0.137 | 0.214 |
| When $d_2 \geqq d_{20}$, $d_{2m}$ (nm) = | ∞ | ∞ | ∞ | 265.927 | 149.336 |
| When $d_2 < d_{20}$, $d_{2m}$ (nm) = | 123.537 | 130.884 | 183.486 | 237.438 | 121.404 |

$1.2 < NA \leqq 1.3$
$75 < T \leqq 85$

| Case | 8-06 | 8-07 |
|---|---|---|
| $n_{10}$ | 1.695 | 1.695 |
| $k_{10}$ | 0.062 | 0.056 |
| $d_{10}$ (nm) | 218.447 | 215.754 |
| $n_{20}$ | 1.688 | 1.691 |
| $k_{20}$ | 0.198 | 0.167 |

-continued

| | | |
|---|---|---|
| $d_{20}$ (nm) | 200.044 | 258.621 |
| When $n_1 \geqq n_{10}$, $n_{1m}$ = | 1.724 | 1.740 |
| When $n_1 < n_{10}$, $n_{1m}$ = | 1.667 | 1.661 |
| When $k_1 \geqq k_{10}$, $k_{1m}$ = | 0.102 | 0.097 |
| When $k_1 < k_{10}$, $k_{1m}$ = | 0.033 | 0.022 |
| When $d_1 \geqq d_{10}$, $d_{1m}$ (nm) = | ∞ | ∞ |
| When $d_1 < d_{10}$, $d_{1m}$ (nm) = | 198.178 | 171.868 |
| When $n_2 \geqq n_{20}$, $n_{2m}$ = | 1.931 | 1.916 |
| When $n_2 < n_{20}$, $n_{2m}$ = | 1.605 | 1.542 |
| When $k_2 \geqq k_{20}$, $k_{2m}$ = | 0.296 | 0.282 |
| When $k_2 < k_{20}$, $k_{2m}$ = | 0.132 | 0.105 |
| When $d_2 \geqq d_{20}$, $d_{2m}$ (nm) = | ∞ | ∞ |
| When $d_2 < d_{20}$, $d_{2m}$ (nm) = | 172.147 | 178.623 |

$1.2 < NA \leqq 1.3$
$85 < T \leqq 95$

| Case | 9-01 | 9-02 | 9-03 | 9-04 | 10/21 9-05 |
|---|---|---|---|---|---|
| $n_{10}$ | 1.888 | 1.903 | 1.880 | 1.693 | 1.695 |
| $k_{10}$ | 0.130 | 0.081 | 0.095 | 0.063 | 0.064 |
| $d_{10}$ (nm) | 16.763 | 14.911 | 12.432 | 156.037 | 218.418 |
| $n_{20}$ | 1.718 | 1.775 | 1.700 | 1.696 | 1.685 |
| $k_{20}$ | 0.366 | 0.299 | 0.236 | 0.165 | 0.207 |
| $d_{20}$ (nm) | 141.793 | 193.492 | 262.434 | 252.531 | 192.031 |
| When $n_1 \geqq n_{10}$, $n_{1m}$ = | 1.955 | 1.983 | 1.976 | 1.693 | 1.725 |
| When $n_1 < n_{10}$, $n_{1m}$ = | 1.853 | 1.862 | 1.827 | 1.659 | 1.667 |
| When $k_1 \geqq k_{10}$, $k_{1m}$ = | 0.178 | 0.137 | 0.171 | 0.071 | 0.102 |
| When $k_1 < k_{10}$, $k_{1m}$ = | 0.053 | 0.000 | 0.000 | 0.062 | 0.036 |
| When $d_1 \geqq d_{10}$, $d_{1m}$ (nm) = | 21.482 | 20.338 | 18.582 | 156.116 | 252.664 |
| When $d_1 < d_{10}$, $d_{1m}$ (nm) = | 14.427 | 12.369 | 9.315 | 108.678 | 198.579 |
| When $n_2 \geqq n_{20}$, $n_{2m}$ = | 1.777 | 1.851 | 1.779 | 1.766 | 1.934 |
| When $n_2 < n_{20}$, $n_{2m}$ = | 1.605 | 1.653 | 1.583 | 1.688 | 1.600 |
| When $k_2 \geqq k_{20}$, $k_{2m}$ = | 0.429 | 0.373 | 0.299 | 0.166 | 0.298 |
| When $k_2 < k_{20}$, $k_{2m}$ = | 0.289 | 0.223 | 0.167 | 0.129 | 0.138 |
| When $d_2 \geqq d_{20}$, $d_{2m}$ (nm) = | ∞ | ∞ | ∞ | 252.906 | ∞ |
| When $d_2 < d_{20}$, $d_{2m}$ (nm) = | 118.585 | 127.262 | 178.673 | 249.872 | 164.058 |

$1.2 < NA \leqq 1.3$
$85 < T \leqq 95$

| Case | 9-06 | 9-07 |
|---|---|---|
| $n_{10}$ | 1.695 | 1.704 |
| $k_{10}$ | 0.057 | 0.051 |
| $d_{10}$ (nm) | 216.093 | 278.289 |
| $n_{20}$ | 1.691 | 1.691 |
| $k_{20}$ | 0.173 | 0.173 |
| $d_{20}$ (nm) | 249.945 | 246.105 |
| When $n_1 \geqq n_{10}$, $n_{1m}$ = | 1.738 | 1.752 |
| When $n_1 < n_{10}$, $n_{1m}$ = | 1.662 | 1.653 |
| When $k_1 \geqq k_{10}$, $k_{1m}$ = | 0.098 | 0.092 |
| When $k_1 < k_{10}$, $k_{1m}$ = | 0.022 | 0.016 |
| When $d_1 \geqq d_{10}$, $d_{1m}$ (nm) = | ∞ | ∞ |
| When $d_1 < d_{10}$, $d_{1m}$ (nm) = | 175.267 | 172.533 |
| When $n_2 \geqq n_{20}$, $n_{2m}$ = | 1.919 | 1.830 |
| When $n_2 < n_{20}$, $n_{2m}$ = | 1.543 | 1.507 |
| When $k_2 \geqq k_{20}$, $k_{2m}$ = | 0.284 | 0.291 |
| When $k_2 < k_{20}$, $k_{2m}$ = | 0.111 | 0.108 |
| When $d_2 \geqq d_{20}$, $d_{2m}$ (nm) = | ∞ | ∞ |
| When $d_2 < d_{20}$, $d_{2m}$ (nm) = | 173.633 | 172.262 |

| 1.2 < NA ≦ 1.3<br>95 < T ≦ 105 | | | | | | |
|---|---|---|---|---|---|---|
| Case | 10-01 | 10-02 | 10-03 | 10-04 | 10-05 | 11/21<br>10-06 |
| $n_{10}$ | 1.902 | 1.906 | 1.888 | 1.694 | 1.695 | 1.704 |
| $k_{10}$ | 0.140 | 0.093 | 0.096 | 0.066 | 0.059 | 0.052 |
| $d_{10}$ (nm) | 16.621 | 14.821 | 12.503 | 218.392 | 216.276 | 278.098 |
| $n_{20}$ | 1.717 | 1.761 | 1.706 | 1.682 | 1.691 | 1.689 |
| $k_{20}$ | 0.393 | 0.312 | 0.247 | 0.217 | 0.180 | 0.180 |
| $d_{20}$ (nm) | 134.110 | 187.587 | 253.021 | 183.765 | 241.184 | 237.690 |
| When $n_1 \geqq n_{10}$, $n_{1m}$ = | 1.964 | 1.983 | 1.982 | 1.725 | 1.737 | 1.752 |
| When $n_1 < n_{10}$, $n_{1m}$ = | 1.874 | 1.867 | 1.838 | 1.666 | 1.663 | 1.658 |
| When $k_1 \geqq k_{10}$, $k_{1m}$ = | 0.179 | 0.146 | 0.168 | 0.103 | 0.098 | 0.091 |
| When $k_1 < k_{10}$, $k_{1m}$ = | 0.062 | 0.004 | 0.000 | 0.041 | 0.024 | 0.019 |
| When $d_1 \geqq d_{10}$, $d_{1m}$ (nm) = | 20.729 | 19.885 | 18.297 | 250.100 | ∞ | ∞ |
| When $d_1 < d_{10}$, $d_{1m}$ (nm) = | 14.862 | 12.520 | 9.652 | 198.830 | 185.832 | 180.136 |
| When $n_2 \geqq n_{20}$, $n_{2m}$ = | 1.767 | 1.831 | 1.783 | 1.944 | 1.927 | 1.847 |
| When $n_2 < n_{20}$, $n_{2m}$ = | 1.609 | 1.641 | 1.584 | 1.598 | 1.559 | 1.512 |
| When $k_2 \geqq k_{20}$, $k_{2m}$ = | 0.449 | 0.380 | 0.309 | 0.303 | 0.288 | 0.296 |
| When $k_2 < k_{20}$, $k_{2m}$ = | 0.320 | 0.238 | 0.178 | 0.149 | 0.117 | 0.113 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 113.506 | 124.690 | 172.558 | 157.077 | 167.184 | 165.978 |

| 1.2 < NA ≦ 1.3<br>105 < T ≦ 115 | | | | | |
|---|---|---|---|---|---|
| Case | 11-01 | 11-02 | 11-03 | 11-04 | 12/21<br>11-05 |
| $n_{10}$ | 1.915 | 1.908 | 1.895 | 1.692 | 1.694 |
| $k_{10}$ | 0.153 | 0.105 | 0.097 | 0.060 | 0.068 |
| $d_{10}$ (nm) | 15.972 | 14.452 | 12.386 | 153.833 | 218.491 |
| $n_{20}$ | 1.700 | 1.741 | 1.708 | 1.696 | 1.679 |
| $k_{20}$ | 0.410 | 0.319 | 0.254 | 0.152 | 0.227 |
| $d_{20}$ (nm) | 128.035 | 181.864 | 244.026 | 294.292 | 174.638 |
| When $n_1 \geqq n_{10}$, $n_{1m}$ = | 1.973 | 1.983 | 1.987 | 1.719 | 1.723 |
| When $n_1 < n_{10}$, $n_{1m}$ = | 1.893 | 1.872 | 1.847 | 1.655 | 1.669 |
| When $k_1 \geqq k_{10}$, $k_{1m}$ = | 0.185 | 0.156 | 0.167 | 0.093 | 0.104 |
| When $k_1 < k_{10}$, $k_{1m}$ = | 0.078 | 0.017 | 0.000 | 0.039 | 0.045 |
| When $d_1 \geqq d_{10}$, $d_{1m}$ (nm) = | 19.455 | 19.144 | 17.845 | ∞ | 247.764 |
| When $d_1 < d_{10}$, $d_{1m}$ (nm) = | 14.744 | 12.421 | 9.756 | 107.765 | 205.861 |
| When $n_2 \geqq n_{20}$, $n_{2m}$ = | 1.741 | 1.806 | 1.782 | 1.782 | 1.753 |
| When $n_2 < n_{20}$, $n_{2m}$ = | 1.596 | 1.623 | 1.583 | 1.640 | 1.603 |
| When $k_2 \geqq k_{20}$, $k_{2m}$ = | 0.453 | 0.379 | 0.315 | 0.185 | 0.311 |
| When $k_2 < k_{20}$, $k_{2m}$ = | 0.345 | 0.249 | 0.187 | 0.106 | 0.163 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 107.965 | 122.284 | 164.682 | 240.729 | 150.727 |

| 1.2 < NA ≦ 1.3<br>105 < T ≦ 115 | | |
|---|---|---|
| Case | 11-06 | 11-07 |
| $n_{10}$ | 1.695 | 1.705 |
| $k_{10}$ | 0.060 | 0.054 |
| $d_{10}$ (nm) | 216.291 | 277.828 |
| $n_{20}$ | 1.691 | 1.688 |
| $k_{20}$ | 0.187 | 0.185 |
| $d_{20}$ (nm) | 231.949 | 228.622 |
| When $n_1 \geqq n_{10}$, $n_{1m}$ = | 1.736 | 1.751 |
| When $n_1 < n_{10}$, $n_{1m}$ = | 1.664 | 1.660 |
| When $k_1 \geqq k_{10}$, $k_{1m}$ = | 0.099 | 0.091 |
| When $k_1 < k_{10}$, $k_{1m}$ = | 0.026 | 0.021 |
| When $d_1 \geqq d_{10}$, $d_{1m}$ (nm) = | ∞ | ∞ |
| When $d_1 < d_{10}$, $d_{1m}$ (nm) = | 188.964 | 182.620 |
| When $n_2 \geqq n_{20}$, $n_{2m}$ = | 1.938 | 1.860 |
| When $n_2 < n_{20}$, $n_{2m}$ = | 1.577 | 1.505 |

-continued

| | | |
|---|---|---|
| When $k_2 \geqq k_{20}$, $k_{2m}$ = | 0.293 | 0.298 |
| When $k_2 < k_{20}$, $k_{2m}$ = | 0.122 | 0.117 |
| When $d_2 \geqq d_{20}$, $d_{2m}$ (nm) = | ∞ | ∞ |
| When $d_2 < d_{20}$, $d_{2m}$ (nm) = | 190.206 | 157.223 |

| 1.2 < NA ≦ 1.3<br>115 < T ≦ 125 | | | | | |
|---|---|---|---|---|---|
| Case | 12-01 | 12-02 | 12-03 | 12-04 | 13/21<br>12-05 |
| $n_{10}$ | 1.919 | 1.909 | 1.897 | 1.692 | 1.694 |
| $k_{10}$ | 0.168 | 0.114 | 0.102 | 0.061 | 0.069 |
| $d_{10}$ (nm) | 15.470 | 14.219 | 12.252 | 153.490 | 218.807 |
| $n_{20}$ | 1.675 | 1.728 | 1.703 | 1.695 | 1.679 |
| $k_{20}$ | 0.416 | 0.323 | 0.257 | 0.154 | 0.236 |
| $d_{20}$ (nm) | 121.998 | 174.431 | 235.332 | 285.775 | 164.294 |
| When $n_1 \geqq n_{10}$, $n_{1m}$ = | 1.974 | 1.983 | 1.989 | 1.719 | 1.720 |
| When $n_1 < n_{10}$, $n_{1m}$ = | 1.903 | 1.876 | 1.851 | 1.657 | 1.674 |
| When $k_1 \geqq k_{10}$, $k_{1m}$ = | 0.194 | 0.163 | 0.171 | 0.093 | 0.104 |
| When $k_1 < k_{10}$, $k_{1m}$ = | 0.095 | 0.028 | 0.000 | 0.043 | 0.048 |
| When $d_1 \geqq d_{10}$, $d_{1m}$ (nm) = | 18.537 | 18.641 | 17.506 | 176.125 | 245.819 |
| When $d_1 < d_{10}$, $d_{1m}$ (nm) = | 14.577 | 12.379 | 9.747 | 108.056 | 210.037 |
| When $n_2 \geqq n_{20}$, $n_{2m}$ = | 1.708 | 1.790 | 1.776 | 1.773 | 1.745 |
| When $n_2 < n_{20}$, $n_{2m}$ = | 1.572 | 1.608 | 1.579 | 1.640 | 1.616 |
| When $k_2 \geqq k_{20}$, $k_{2m}$ = | 0.448 | 0.378 | 0.316 | 0.184 | 0.323 |
| When $k_2 < k_{20}$, $k_{2m}$ = | 0.357 | 0.255 | 0.190 | 0.115 | 0.176 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 99.374 | 118.240 | 154.295 | 239.447 | 146.164 |

| 1.2 < NA ≦ 1.3<br>115 < T ≦ 125 | | | |
|---|---|---|---|
| Case | 12-06 | 12-07 | 12-08 |
| $n_{10}$ | 1.695 | 1.696 | 1.706 |
| $k_{10}$ | 0.061 | 0.056 | 0.051 |
| $d_{10}$ (nm) | 216.166 | 214.076 | 276.333 |
| $n_{20}$ | 1.690 | 1.694 | 1.706 |
| $k_{20}$ | 0.192 | 0.163 | 0.162 |

-continued

| | | | |
|---|---|---|---|
| $d_{20}$ (nm) | 222.296 | 280.805 | 273.925 |
| When $n_1 \geqq n_{10}$, $n_{1m}$ = | 1.728 | 1.750 | 1.770 |
| When $n_1 < n_{10}$, $n_{1m}$ = | 1.664 | 1.664 | 1.647 |
| When $k_1 \geqq k_{10}$, $k_{1m}$ = | 0.099 | 0.099 | 0.090 |
| When $k_1 < k_{10}$, $k_{1m}$ = | 0.029 | 0.023 | 0.020 |
| When $d_1 \geqq d_{10}$, $d_{1m}$ (nm) = | ∞ | ∞ | ∞ |
| When $d_1 < d_{10}$, $d_{1m}$ (nm) = | 190.492 | 185.642 | 181.694 |
| When $n_2 \geqq n_{20}$, $n_{2m}$ = | 1.826 | 1.931 | 1.851 |
| When $n_2 < n_{20}$, $n_{2m}$ = | 1.594 | 1.560 | 1.519 |
| When $k_2 \geqq k_{20}$, $k_{2m}$ = | 0.297 | 0.283 | 0.279 |
| When $k_2 < k_{20}$, $k_{2m}$ = | 0.128 | 0.103 | 0.095 |
| When $d_2 \geqq d_{20}$, $d_{2m}$ (nm) = | ∞ | ∞ | ∞ |
| When $d_2 < d_{20}$, $d_{2m}$ (nm) = | 188.671 | 203.385 | 188.718 |

$1.2 < NA \leqq 1.3$
$125 < T \leqq 135$

14/21

| Case | 13-01 | 13-02 | 13-03 | 13-04 | 13-05 |
|---|---|---|---|---|---|
| $n_{10}$ | 1.909 | 1.895 | 1.879 | 1.694 | 1.695 |
| $k_{10}$ | 0.116 | 0.106 | 0.083 | 0.071 | 0.063 |
| $d_{10}$ (nm) | 14.671 | 12.483 | 11.828 | 219.020 | 215.746 |
| $n_{20}$ | 1.733 | 1.700 | 1.710 | 1.682 | 1.690 |
| $k_{20}$ | 0.334 | 0.261 | 0.220 | 0.245 | 0.197 |
| $d_{20}$ (nm) | 163.102 | 225.249 | 280.433 | 153.670 | 212.983 |
| When $n_1 \geqq n_{10}$, $n_{1m}$ = | 1.981 | 1.985 | 1.982 | 1.717 | 1.723 |
| When $n_1 < n_{10}$, $n_{1m}$ = | 1.878 | 1.850 | 1.819 | 1.677 | 1.665 |
| When $k_1 \geqq k_{10}$, $k_{1m}$ = | 0.162 | 0.173 | 0.169 | 0.103 | 0.099 |
| When $k_1 < k_{10}$, $k_{1m}$ = | 0.035 | 0.004 | 0.000 | 0.051 | 0.034 |
| When $d_1 \geqq d_{10}$, $d_{1m}$ (nm) = | 19.040 | 17.738 | 18.242 | 233.783 | ∞ |
| When $d_1 < d_{10}$, $d_{1m}$ (nm) = | 12.910 | 9.987 | 8.329 | 211.731 | 191.269 |
| When $n_2 \geqq n_{20}$, $n_{2m}$ = | 1.795 | 1.771 | 1.785 | 1.724 | 1.797 |
| When $n_2 < n_{20}$, $n_{2m}$ = | 1.610 | 1.575 | 1.592 | 1.634 | 1.609 |
| When $k_2 \geqq k_{20}$, $k_{2m}$ = | 0.389 | 0.319 | 0.285 | 0.337 | 0.302 |
| When $k_2 < k_{20}$, $k_{2m}$ = | 0.261 | 0.192 | 0.153 | 0.187 | 0.133 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 109.327 | 144.773 | 164.318 | 140.585 | 192.523 |

$1.2 < NA \leqq 1.3$
$125 < T \leqq 135$

| Case | 13-06 | 13-07 |
|---|---|---|
| $n_{10}$ | 1.696 | 1.706 |
| $k_{10}$ | 0.057 | 0.052 |
| $d_{10}$ (nm) | 213.723 | 276.363 |
| $n_{20}$ | 1.693 | 1.706 |
| $k_{20}$ | 0.165 | 0.164 |
| $d_{20}$ (nm) | 271.596 | 264.087 |
| When $n_1 \geqq n_{10}$, $n_{1m}$ = | 1.749 | 1.772 |
| When $n_1 < n_{10}$, $n_{1m}$ = | 1.664 | 1.645 |
| When $k_1 \geqq k_{10}$, $k_{1m}$ = | 0.099 | 0.090 |
| When $k_1 < k_{10}$, $k_{1m}$ = | 0.026 | 0.022 |
| When $d_1 \geqq d_{10}$, $d_{1m}$ (nm) = | ∞ | ∞ |
| When $d_1 < d_{10}$, $d_{1m}$ (nm) = | 186.782 | 182.830 |
| When $n_2 \geqq n_{20}$, $n_{2m}$ = | 1.934 | 1.851 |
| When $n_2 < n_{20}$, $n_{2m}$ = | 1.561 | 1.521 |
| When $k_2 \geqq k_{20}$, $k_{2m}$ = | 0.285 | 0.282 |
| When $k_2 < k_{20}$, $k_{2m}$ = | 0.104 | 0.097 |
| When $d_2 \geqq d_{20}$, $d_{2m}$ (nm) = | ∞ | ∞ |
| When $d_2 < d_{20}$, $d_{2m}$ (nm) = | 198.444 | 183.298 |

$1.2 < NA \leqq 1.3$
$135 < T \leqq 145$

15/21

| Case | 14-01 | 14-02 | 14-03 | 14-04 | 14-05 |
|---|---|---|---|---|---|
| $n_{10}$ | 1.910 | 1.892 | 1.879 | 1.694 | 1.694 |
| $k_{10}$ | 0.115 | 0.109 | 0.084 | 0.072 | 0.064 |
| $d_{10}$ (nm) | 15.725 | 12.960 | 12.187 | 218.706 | 215.091 |
| $n_{20}$ | 1.755 | 1.698 | 1.712 | 1.684 | 1.689 |
| $k_{20}$ | 0.355 | 0.268 | 0.226 | 0.254 | 0.201 |
| $d_{20}$ (nm) | 150.207 | 215.505 | 270.397 | 144.577 | 204.614 |
| When $n_1 \geqq n_{10}$, $n_{1m}$ = | 1.980 | 1.980 | 1.979 | 1.708 | 1.720 |
| When $n_1 < n_{10}$, $n_{1m}$ = | 1.881 | 1.848 | 1.820 | 1.676 | 1.666 |
| When $k_1 \geqq k_{10}$, $k_{1m}$ = | 0.157 | 0.174 | 0.167 | 0.100 | 0.099 |
| When $k_1 < k_{10}$, $k_{1m}$ = | 0.036 | 0.011 | 0.000 | 0.054 | 0.038 |
| When $d_1 \geqq d_{10}$, $d_{1m}$ (nm) = | 20.158 | 18.254 | 18.627 | 231.071 | ∞ |
| When $d_1 < d_{10}$, $d_{1m}$ (nm) = | 14.003 | 10.450 | 8.694 | 211.497 | 191.698 |
| When $n_2 \geqq n_{20}$, $n_{2m}$ = | 1.818 | 1.767 | 1.787 | 1.721 | 1.802 |
| When $n_2 < n_{20}$, $n_{2m}$ = | 1.632 | 1.571 | 1.592 | 1.649 | 1.619 |
| When $k_2 \geqq k_{20}$, $k_{2m}$ = | 0.415 | 0.327 | 0.291 | 0.345 | 0.308 |
| When $k_2 < k_{20}$, $k_{2m}$ = | 0.275 | 0.197 | 0.157 | 0.200 | 0.145 |
| When $d_2 \geqq d_{20}$, $d_{2m}$ (nm) = | ∞ | ∞ | ∞ | 160.527 | ∞ |
| When $d_2 < d_{20}$, $d_{2m}$ (nm) = | 119.641 | 139.482 | 181.534 | 134.106 | 186.758 |

$1.2 < NA \leqq 1.3$
$135 < T \leqq 145$

| Case | 14-06 | 14-07 |
|---|---|---|
| $n_{10}$ | 1.696 | 1.706 |
| $k_{10}$ | 0.058 | 0.052 |
| $d_{10}$ (nm) | 213.482 | 276.472 |
| $n_{20}$ | 1.692 | 1.707 |
| $k_{20}$ | 0.169 | 0.168 |
| $d_{20}$ (nm) | 262.678 | 254.823 |
| When $n_1 \geqq n_{10}$, $n_{1m}$ = | 1.748 | 1.771 |
| When $n_1 < n_{10}$, $n_{1m}$ = | 1.665 | 1.644 |
| When $k_1 \geqq k_{10}$, $k_{1m}$ = | 0.100 | 0.090 |
| When $k_1 < k_{10}$, $k_{1m}$ = | 0.028 | 0.024 |
| When $d_1 \geqq d_{10}$, $d_{1m}$ (nm) = | ∞ | ∞ |
| When $d_1 < d_{10}$, $d_{1m}$ (nm) = | 188.144 | 184.314 |
| When $n_2 \geqq n_{20}$, $n_{2m}$ = | 1.933 | 1.854 |
| When $n_2 < n_{20}$, $n_{2m}$ = | 1.561 | 1.522 |
| When $k_2 \geqq k_{20}$, $k_{2m}$ = | 0.288 | 0.286 |
| When $k_2 < k_{20}$, $k_{2m}$ = | 0.109 | 0.100 |
| When $d_2 \geqq d_{20}$, $d_{2m}$ (nm) = | ∞ | ∞ |
| When $d_2 < d_{20}$, $d_{2m}$ (nm) = | 191.540 | 174.816 |

$1.2 < NA \leqq 1.3$
$145 < T \leqq 155$

16/21

| Case | 15-01 | 15-02 | 15-03 | 15-04 | 15-05 |
|---|---|---|---|---|---|
| $n_{10}$ | 1.919 | 1.893 | 1.882 | 1.694 | 1.694 |
| $k_{10}$ | 0.115 | 0.113 | 0.085 | 0.074 | 0.065 |
| $d_{10}$ (nm) | 16.638 | 13.413 | 12.438 | 217.741 | 214.737 |
| $n_{20}$ | 1.785 | 1.697 | 1.715 | 1.683 | 1.687 |
| $k_{20}$ | 0.385 | 0.281 | 0.235 | 0.264 | 0.207 |
| $d_{20}$ (nm) | 138.580 | 206.656 | 261.237 | 137.032 | 196.488 |
| When $n_1 \geqq n_{10}$, $n_{1m}$ = | 1.986 | 1.976 | 1.980 | 1.705 | 1.718 |
| When $n_1 < n_{10}$, $n_{1m}$ = | 1.892 | 1.851 | 1.826 | 1.676 | 1.666 |
| When $k_1 \geqq k_{10}$, $k_{1m}$ = | 0.151 | 0.174 | 0.165 | 0.099 | 0.100 |
| When $k_1 < k_{10}$, $k_{1m}$ = | 0.037 | 0.018 | 0.000 | 0.060 | 0.040 |
| When $d_1 \geqq d_{10}$, $d_{1m}$ (nm) = | 20.946 | 18.588 | 18.692 | 227.547 | ∞ |
| When $d_1 < d_{10}$, $d_{1m}$ (nm) = | 15.073 | 10.996 | 9.087 | 210.480 | 192.120 |
| When $n_2 \geqq n_{20}$, $n_{2m}$ = | 1.846 | 1.763 | 1.789 | 1.722 | 1.834 |

-continued

| | | | | | |
|---|---|---|---|---|---|
| When $n_2 < n_{20}, n_{2m}$ = | 1.665 | 1.571 | 1.591 | 1.652 | 1.629 |
| When $k_2 \geqq k_{20}, k_{2m}$ = | 0.451 | 0.339 | 0.301 | 0.337 | 0.312 |
| When $k_2 < k_{20}, k_{2m}$ = | 0.301 | 0.209 | 0.166 | 0.217 | 0.151 |
| When $d_2 \geqq d_{20}, d_{2m}$ (nm) = | ∞ | ∞ | ∞ | 149.574 | ∞ |
| When $d_2 < d_{20}, d_{2m}$ (nm) = | 113.921 | 135.398 | 177.745 | 128.876 | 178.069 |

$1.2 < NA \leqq 1.3$
$145 < T \leqq 155$

| Case | 15-06 | 15-07 |
|---|---|---|
| $n_{10}$ | 1.695 | 1.707 |
| $k_{10}$ | 0.059 | 0.053 |
| $d_{10}$ (nm) | 213.710 | 276.548 |
| $n_{20}$ | 1.692 | 1.707 |
| $k_{20}$ | 0.173 | 0.174 |
| $d_{20}$ (nm) | 253.675 | 246.168 |
| When $n_1 \geqq n_{10}, n_{1m}$ = | 1.747 | 1.770 |
| When $n_1 < n_{10}, n_{1m}$ = | 1.665 | 1.645 |
| When $k_1 \geqq k_{10}, k_{1m}$ = | 0.100 | 0.089 |
| When $k_1 < k_{10}, k_{1m}$ = | 0.029 | 0.025 |
| When $d_1 \geqq d_{10}, d_{1m}$ (nm) = | ∞ | ∞ |
| When $d_1 < d_{10}, d_{1m}$ (nm) = | 189.864 | 185.926 |
| When $n_2 \geqq n_{20}, n_{2m}$ = | 1.910 | 1.858 |
| When $n_2 < n_{20}, n_{2m}$ = | 1.562 | 1.520 |
| When $k_2 \geqq k_{20}, k_{2m}$ = | 0.289 | 0.291 |
| When $k_2 < k_{20}, k_{2m}$ = | 0.109 | 0.103 |
| When $d_2 \geqq d_{20}, d_{2m}$ (nm) = | ∞ | ∞ |
| When $d_2 < d_{20}, d_{2m}$ (nm) = | 189.584 | 169.414 |

$1.2 < NA \leqq 1.3$
$155 < T \leqq 165$

| Case | 16-01 | 16-02 | 16-03 | 16-04 | 17/21 16-05 |
|---|---|---|---|---|---|
| $n_{10}$ | 1.937 | 1.898 | 1.890 | 1.694 | 1.694 |
| $k_{10}$ | 0.118 | 0.119 | 0.087 | 0.077 | 0.067 |
| $d_{10}$ (nm) | 16.771 | 13.576 | 12.460 | 216.630 | 214.866 |
| $n_{20}$ | 1.806 | 1.695 | 1.718 | 1.679 | 1.684 |
| $k_{20}$ | 0.418 | 0.295 | 0.246 | 0.277 | 0.215 |
| $d_{20}$ (nm) | 129.251 | 198.434 | 252.589 | 129.875 | 188.027 |
| When $n_1 \geqq n_{10}, n_{1m}$ = | 2.001 | 1.978 | 1.985 | 1.707 | 1.716 |
| When $n_1 < n_{10}, n_{1m}$ = | 1.914 | 1.859 | 1.836 | 1.685 | 1.666 |
| When $k_1 \geqq k_{10}, k_{1m}$ = | 0.148 | 0.176 | 0.164 | 0.101 | 0.100 |
| When $k_1 < k_{10}, k_{1m}$ = | 0.045 | 0.025 | 0.000 | 0.067 | 0.040 |
| When $d_1 \geqq d_{10}, d_{1m}$ (nm) = | 20.691 | 18.424 | 18.356 | 225.238 | 231.093 |
| When $d_1 < d_{10}, d_{1m}$ (nm) = | 15.556 | 11.376 | 9.363 | 212.673 | 192.697 |
| When $n_2 \geqq n_{20}, n_{2m}$ = | 1.861 | 1.756 | 1.791 | 1.715 | 1.840 |
| When $n_2 < n_{20}, n_{2m}$ = | 1.690 | 1.574 | 1.591 | 1.643 | 1.628 |
| When $k_2 \geqq k_{20}, k_{2m}$ = | 0.481 | 0.351 | 0.310 | 0.328 | 0.314 |
| When $k_2 < k_{20}, k_{2m}$ = | 0.336 | 0.225 | 0.176 | 0.223 | 0.151 |
| When $d_2 \geqq d_{20}, d_{2m}$ (nm) = | ∞ | ∞ | ∞ | 139.199 | ∞ |
| When $d_2 < d_{20}, d_{2m}$ (nm) = | 109.768 | 131.712 | 172.718 | 120.241 | 167.595 |

$1.2 < NA \leqq 1.3$
$155 < T \leqq 165$

| Case | 16-06 | 16-07 |
|---|---|---|
| $n_{10}$ | 1.695 | 1.707 |
| $k_{10}$ | 0.060 | 0.054 |
| $d_{10}$ (nm) | 214.034 | 276.376 |
| $n_{20}$ | 1.692 | 1.707 |
| $k_{20}$ | 0.179 | 0.181 |
| $d_{20}$ (nm) | 244.657 | 237.806 |
| When $n_1 \geqq n_{10}, n_{1m}$ = | 1.745 | 1.770 |
| When $n_1 < n_{10}, n_{1m}$ = | 1.666 | 1.653 |

-continued

| | | |
|---|---|---|
| When $k_1 \geqq k_{10}, k_{1m}$ = | 0.101 | 0.089 |
| When $k_1 < k_{10}, k_{1m}$ = | 0.030 | 0.027 |
| When $d_1 \geqq d_{10}, d_{1m}$ (nm) = | ∞ | ∞ |
| When $d_1 < d_{10}, d_{1m}$ (nm) = | 191.630 | 187.468 |
| When $n_2 \geqq n_{20}, n_{2m}$ = | 1.889 | 1.864 |
| When $n_2 < n_{20}, n_{2m}$ = | 1.562 | 1.515 |
| When $k_2 \geqq k_{20}, k_{2m}$ = | 0.290 | 0.295 |
| When $k_2 < k_{20}, k_{2m}$ = | 0.115 | 0.110 |
| When $d_2 \geqq d_{20}, d_{2m}$ (nm) = | ∞ | ∞ |
| When $d_2 < d_{20}, d_{2m}$ (nm) = | 179.119 | 164.223 |

$1.2 < NA \leqq 1.3$
$165 < T \leqq 175$

| Case | 17-01 | 17-02 | 17-03 | 17-04 | 18/21 17-05 |
|---|---|---|---|---|---|
| $n_{10}$ | 1.958 | 1.903 | 1.898 | 1.694 | 1.694 |
| $k_{10}$ | 0.128 | 0.127 | 0.090 | 0.080 | 0.068 |
| $d_{10}$ (nm) | 15.815 | 13.420 | 12.296 | 215.821 | 215.165 |
| $n_{20}$ | 1.794 | 1.688 | 1.719 | 1.668 | 1.681 |
| $k_{20}$ | 0.439 | 0.307 | 0.254 | 0.290 | 0.224 |
| $d_{20}$ (nm) | 123.830 | 190.984 | 244.231 | 122.663 | 179.093 |
| When $n_1 \geqq n_{10}, n_{1m}$ = | 2.020 | 1.981 | 1.991 | 1.707 | 1.716 |
| When $n_1 < n_{10}, n_{1m}$ = | 1.942 | 1.867 | 1.846 | 1.692 | 1.665 |
| When $k_1 \geqq k_{10}, k_{1m}$ = | 0.150 | 0.182 | 0.165 | 0.103 | 0.101 |
| When $k_1 < k_{10}, k_{1m}$ = | 0.058 | 0.033 | 0.000 | 0.077 | 0.041 |
| When $d_1 \geqq d_{10}, d_{1m}$ (nm) = | 19.257 | 17.848 | 17.802 | 223.701 | 230.268 |
| When $d_1 < d_{10}, d_{1m}$ (nm) = | 15.087 | 11.461 | 9.465 | 215.120 | 195.890 |
| When $n_2 \geqq n_{20}, n_{2m}$ = | 1.832 | 1.743 | 1.790 | 1.677 | 1.826 |
| When $n_2 < n_{20}, n_{2m}$ = | 1.680 | 1.570 | 1.590 | 1.625 | 1.625 |
| When $k_2 \geqq k_{20}, k_{2m}$ = | 0.483 | 0.357 | 0.316 | 0.321 | 0.315 |
| When $k_2 < k_{20}, k_{2m}$ = | 0.365 | 0.239 | 0.186 | 0.252 | 0.151 |
| When $d_2 \geqq d_{20}, d_{2m}$ (nm) = | ∞ | ∞ | ∞ | 127.631 | ∞ |
| When $d_2 < d_{20}, d_{2m}$ (nm) = | 111.992 | 128.672 | 166.465 | 109.461 | 158.121 |

$1.2 < NA \leqq 1.3$
$165 < T \leqq 175$

| Case | 17-06 | 17-07 |
|---|---|---|
| $n_{10}$ | 1.696 | 1.707 |
| $k_{10}$ | 0.061 | 0.056 |
| $d_{10}$ (nm) | 214.210 | 275.996 |
| $n_{20}$ | 1.692 | 1.705 |
| $k_{20}$ | 0.185 | 0.187 |
| $d_{20}$ (nm) | 235.479 | 229.352 |
| When $n_1 \geqq n_{10}, n_{1m}$ = | 1.744 | 1.770 |
| When $n_1 < n_{10}, n_{1m}$ = | 1.667 | 1.657 |
| When $k_1 \geqq k_{10}, k_{1m}$ = | 0.101 | 0.088 |
| When $k_1 < k_{10}, k_{1m}$ = | 0.031 | 0.030 |
| When $d_1 \geqq d_{10}, d_{1m}$ (nm) = | ∞ | ∞ |
| When $d_1 < d_{10}, d_{1m}$ (nm) = | 193.216 | 188.863 |
| When $n_2 \geqq n_{20}, n_{2m}$ = | 1.887 | 1.872 |
| When $n_2 < n_{20}, n_{2m}$ = | 1.561 | 1.509 |
| When $k_2 \geqq k_{20}, k_{2m}$ = | 0.292 | 0.295 |
| When $k_2 < k_{20}, k_{2m}$ = | 0.120 | 0.115 |
| When $d_2 \geqq d_{20}, d_{2m}$ (nm) = | ∞ | ∞ |
| When $d_2 < d_{20}, d_{2m}$ (nm) = | 161.210 | 156.975 |

1.2 < NA ≦ 1.3
175 < T ≦ 185

| Case | 18-01 | 18-02 | 18-03 | 18-04 | 19/21 18-05 |
|---|---|---|---|---|---|
| $n_{10}$ | 1.907 | 1.904 | 1.694 | 1.696 | 21.704 |
| $k_{10}$ | 0.135 | 0.092 | 0.070 | 0.062 | 0.051 |
| $d_{10}$ (nm) | 13.188 | 12.121 | 215.718 | 214.371 | 274.345 |
| $n_{20}$ | 1.679 | 1.720 | 1.679 | 1.692 | 1.687 |
| $k_{20}$ | 0.313 | 0.260 | 0.233 | 0.190 | 0.159 |
| $d_{20}$ (nm) | 183.151 | 235.214 | 169.072 | 225.802 | 280.556 |
| When $n_1 \geqq n_{10}$, $n_{1m}$ = | 1.982 | 1.997 | 1.715 | 1.743 | 1.760 |
| When $n_1 < n_{10}$, $n_{1m}$ = | 1.873 | 1.854 | 1.666 | 1.668 | 1.658 |
| When $k_1 \geqq k_{10}$, $k_{1m}$ = | 0.188 | 0.166 | 0.102 | 0.102 | 0.090 |
| When $k_1 < k_{10}$, $k_{1m}$ = | 0.044 | 0.000 | 0.044 | 0.032 | 0.018 |
| When $d_1 \geqq d_{10}$, $d_{1m}$ (nm) = | 17.244 | 17.308 | 229.740 | ∞ | ∞ |
| When $d_1 < d_{10}$, $d_{1m}$ (nm) = | 11.395 | 9.486 | 201.461 | 194.630 | 174.558 |
| When $n_2 \geqq n_{20}$, $n_{2m}$ = | 1.730 | 1.790 | 1.771 | 1.836 | 1.900 |
| When $n_2 < n_{20}$, $n_{2m}$ = | 1.562 | 1.589 | 1.630 | 1.559 | 1.518 |
| When $k_2 \geqq k_{20}$, $k_{2m}$ = | 0.359 | 0.319 | 0.318 | 0.293 | 0.259 |
| When $k_2 < k_{20}$, $k_{2m}$ = | 0.249 | 0.193 | 0.159 | 0.124 | 0.097 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 128.127 | 156.903 | 151.088 | 157.464 | 192.992 |

1.2 < NA ≦ 1.3
185 < T ≦ 195

| Case | 19-01 | 19-02 | 19-03 | 19-04 | 20/21 19-05 |
|---|---|---|---|---|---|
| $n_{10}$ | 1.908 | 1.906 | 1.889 | 1.693 | 1.696 |
| $k_{10}$ | 0.140 | 0.092 | 0.087 | 0.071 | 0.064 |
| $d_{10}$ (nm) | 13.288 | 12.370 | 11.418 | 216.427 | 214.510 |
| $n_{20}$ | 1.676 | 1.726 | 1.707 | 1.681 | 1.692 |
| $k_{20}$ | 0.321 | 0.266 | 0.223 | 0.243 | 0.195 |
| $d_{20}$ (nm) | 172.696 | 223.910 | 283.898 | 158.126 | 215.938 |
| When $n_1 \geqq n_{10}$, $n_{1m}$ = | 1.981 | 1.996 | 1.994 | 1.713 | 1.742 |
| When $n_1 < n_{10}$, $n_{1m}$ = | 1.875 | 1.857 | 1.834 | 1.670 | 1.669 |
| When $k_1 \geqq k_{10}$, $k_{1m}$ = | 0.190 | 0.163 | 0.168 | 0.103 | 0.102 |
| When $k_1 < k_{10}$, $k_{1m}$ = | 0.055 | 0.000 | 0.000 | 0.051 | 0.037 |
| When $d_1 \geqq d_{10}$, $d_{1m}$ (nm) = | 17.148 | 17.446 | 17.407 | 228.093 | ∞ |
| When $d_1 < d_{10}$, $d_{1m}$ (nm) = | 11.532 | 9.791 | 8.458 | 205.012 | 195.805 |
| When $n_2 \geqq n_{20}$, $n_{2m}$ = | 1.725 | 1.797 | 1.791 | 1.767 | 1.825 |
| When $n_2 < n_{20}$, $n_{2m}$ = | 1.558 | 1.592 | 1.590 | 1.647 | 1.558 |
| When $k_2 \geqq k_{20}$, $k_{2m}$ = | 0.365 | 0.327 | 0.286 | 0.323 | 0.294 |
| When $k_2 < k_{20}$, $k_{2m}$ = | 0.256 | 0.198 | 0.157 | 0.178 | 0.130 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 125.060 | 143.864 | 171.207 | 144.997 | 180.034 |

1.2 < NA ≦ 1.3
185 < T ≦ 195

| Case | 19-06 | 19-07 |
|---|---|---|
| $n_{10}$ | 1.696 | 1.704 |
| $k_{10}$ | 0.057 | 0.052 |
| $d_{10}$ (nm) | 213.492 | 274.677 |
| $n_{20}$ | 1.691 | 1.687 |
| $k_{20}$ | 0.166 | 0.162 |
| $d_{20}$ (nm) | 273.809 | 270.432 |
| When $n_1 \geqq n_{10}$, $n_{1m}$ = | 1.742 | 1.760 |
| When $n_1 < n_{10}$, $n_{1m}$ = | 1.666 | 1.659 |
| When $k_1 \geqq k_{10}$, $k_{1m}$ = | 0.097 | 0.090 |
| When $k_1 < k_{10}$, $k_{1m}$ = | 0.026 | 0.022 |
| When $d_1 \geqq d_{10}$, $d_{1m}$ (nm) = | ∞ | ∞ |
| When $d_1 < d_{10}$, $d_{1m}$ (nm) = | 178.602 | 175.003 |
| When $n_2 \geqq n_{20}$, $n_{2m}$ = | 1.857 | 1.904 |
| When $n_2 < n_{20}$, $n_{2m}$ = | 1.570 | 1.518 |
| When $k_2 \geqq k_{20}$, $k_{2m}$ = | 0.281 | 0.262 |
| When $k_2 < k_{20}$, $k_{2m}$ = | 0.104 | 0.096 |
| When $d_2 \geqq d_{20}$, $d_{2m}$ (nm) = | ∞ | ∞ |
| When $d_2 < d_{20}$, $d_{2m}$ (nm) = | 199.693 | 186.949 |

1.2 < NA ≦ 1.3
195 < T ≦ 205

| Case | 20-01 | 20-02 | 20-03 | 20-04 | 21/21 20-05 |
|---|---|---|---|---|---|
| $n_{10}$ | 1.907 | 1.904 | 1.887 | 1.693 | 1.696 |
| $k_{10}$ | 0.139 | 0.091 | 0.088 | 0.073 | 0.065 |
| $d_{10}$ (nm) | 13.915 | 13.010 | 11.752 | 216.656 | 214.259 |
| $n_{20}$ | 1.684 | 1.734 | 1.707 | 1.683 | 1.692 |
| $k_{20}$ | 0.334 | 0.275 | 0.227 | 0.253 | 0.201 |
| $d_{20}$ (nm) | 160.500 | 212.141 | 273.737 | 148.279 | 206.980 |
| When $n_1 \geqq n_{10}$, $n_{1m}$ = | 1.978 | 1.992 | 1.990 | 1.700 | 1.743 |
| When $n_1 < n_{10}$, $n_{1m}$ = | 1.874 | 1.857 | 1.833 | 1.671 | 1.670 |
| When $k_1 \geqq k_{10}$, $k_{1m}$ = | 0.186 | 0.158 | 0.167 | 0.098 | 0.102 |
| When $k_1 < k_{10}$, $k_{1m}$ = | 0.059 | 0.000 | 0.000 | 0.062 | 0.044 |
| When $d_1 \geqq d_{10}$, $d_{1m}$ (nm) = | 17.817 | 18.151 | 17.811 | 226.068 | 265.367 |
| When $d_1 < d_{10}$, $d_{1m}$ (nm) = | 12.124 | 10.391 | 8.783 | 207.088 | 196.420 |
| When $n_2 \geqq n_{20}$, $n_{2m}$ = | 1.731 | 1.806 | 1.791 | 1.746 | 1.815 |
| When $n_2 < n_{20}$, $n_{2m}$ = | 1.564 | 1.602 | 1.588 | 1.669 | 1.556 |
| When $k_2 \geqq k_{20}$, $k_{2m}$ = | 0.381 | 0.338 | 0.291 | 0.321 | 0.294 |
| When $k_2 < k_{20}$, $k_{2m}$ = | 0.265 | 0.202 | 0.159 | 0.212 | 0.142 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 125.465 | 136.447 | 180.411 | 144.423 | 187.001 |

1.2 < NA ≦ 1.3
195 < T ≦ 205

| Case | 20-06 | 20-07 |
|---|---|---|
| $n_{10}$ | 1.696 | 1.704 |
| $k_{10}$ | 0.058 | 0.053 |
| $d_{10}$ (nm) | 213.637 | 275.120 |
| $n_{20}$ | 1.690 | 1.687 |
| $k_{20}$ | 0.169 | 0.165 |
| $d_{20}$ (nm) | 264.528 | 260.887 |
| When $n_1 \geqq n_{10}$, $n_{1m}$ = | 1.742 | 1.760 |
| When $n_1 < n_{10}$, $n_{1m}$ = | 1.666 | 1.661 |
| When $k_1 \geqq k_{10}$, $k_{1m}$ = | 0.097 | 0.090 |
| When $k_1 < k_{10}$, $k_{1m}$ = | 0.030 | 0.025 |
| When $d_1 \geqq d_{10}$, $d_{1m}$ (nm) = | ∞ | ∞ |
| When $d_1 < d_{10}$, $d_{1m}$ (nm) = | 183.526 | 175.348 |
| When $n_2 \geqq n_{20}$, $n_{2m}$ = | 1.856 | 1.912 |
| When $n_2 < n_{20}$, $n_{2m}$ = | 1.571 | 1.519 |
| When $k_2 \geqq k_{20}$, $k_{2m}$ = | 0.282 | 0.268 |
| When $k_2 < k_{20}$, $k_{2m}$ = | 0.108 | 0.102 |
| When $d_2 \geqq d_{20}$, $d_{2m}$ (nm) = | ∞ | ∞ |
| When $d_2 < d_{20}$, $d_{2m}$ (nm) = | 202.896 | 181.779 |

In accordance with a fifth embodiment of the invention, an antireflective film has a two-layer structure and is used in a process for manufacturing a semiconductor device by being provided between a resist layer and a silicon oxide layer formed on a surface of a silicon semiconductor substrate and having a thickness T (unit: nm) described below, for exposure of the resist layer in an exposure system having a wavelength of 190 nm to 195 nm and a numerical aperture NA of $1.3<NA\leqq1.4$. In accordance with the fifth embodiment of the invention, an exposure method used in a process for manufacturing a semiconductor device and includes providing an antireflective film having a two-layer structure between a resist layer and a silicon oxide layer formed on a surface of a silicon semiconductor substrate and having a thickness T (unit: nm) described below, and exposing the resist layer in an exposure system having a wavelength of 190 nm to 195 nm and a numerical aperture NA of 1.3<NA≦1.4.

The antireflective film or the antireflective film used in the exposure method according to the fifth embodiment of the invention includes an upper layer having a complex refractive index N, and a lower layer having a complex refractive index $N_2$, the complex refractive indexes $N_1$ and $N_2$ being represented by the following equations:

$$N_1=n_1-k_1i$$

$$N_2=n_2-k_2i$$

Assuming that the thickness of the upper layer is $d_1$ (unit: nm) and the thickness of the lower layer is $d_2$ (unit: nm), when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the following relational expression:

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2\leqq 1$$

However, a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$. In the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm)=", each value (unit: nm) in the right columns is "$d_{1m}-d_{10}$"; in the line of "When $d_1<d_{10}$, $d_{1m}$ (nm)=", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm)=", each value (unit: nm) in the right columns is "$d_{2m}-d_{20}$"; and in the line of "When $d_2<d_{20}$, $d_{2m}$ (nm)=", each value (unit: nm) in the right columns is "$d_{20}-d_{2m}$".

1.3 < NA ≦ 1.4
2 ≦ T ≦ 15

1/20

| Case | 1-01 | 1-02 | 1-03 | 1-04 | 1-05 |
|---|---|---|---|---|---|
| $n_{10}$ | 2.047 | 1.887 | 1.871 | 1.868 | 1.862 |
| $k_{10}$ | 0.012 | 0.120 | 0.106 | 0.075 | 0.065 |
| $d_{10}$ (nm) | 29.751 | 26.980 | 17.106 | 15.339 | 13.830 |
| $n_{20}$ | 6.274 | 1.973 | 1.713 | 1.738 | 1.730 |
| $k_{20}$ | 3.305 | 0.477 | 0.298 | 0.245 | 0.208 |
| $d_{20}$ (nm) | 1.566 | 76.285 | 158.161 | 212.612 | 271.884 |
| When $n_1 \geqq n_{10}$, $n_{1m}$ = | 2.109 | 1.929 | 1.924 | 1.935 | 1.940 |
| When $n_1 < n_{10}$, $n_{1m}$ = | 1.990 | 1.877 | 1.852 | 1.835 | 1.823 |
| When $k_1 \geqq k_{10}$, $k_{1m}$ = | 0.055 | 0.138 | 0.136 | 0.123 | 0.124 |
| When $k_1 < k_{10}$, $k_{1m}$ = | 0.000 | 0.089 | 0.036 | 0.000 | 0.000 |
| When $d_1 \geqq d_{10}$, $d_{1m}$ (nm) = | 32.767 | 31.708 | 21.551 | 20.868 | 20.183 |
| When $d_1 < d_{10}$, $d_{1m}$ (nm) = | 27.509 | 26.309 | 15.640 | 12.771 | 10.913 |
| When $n_2 \geqq n_{20}$, $n_{2m}$ = | 6.594 | 2.028 | 1.750 | 1.789 | 1.793 |
| When $n_2 < n_{20}$, $n_{2m}$ = | 5.978 | 1.933 | 1.627 | 1.639 | 1.618 |
| When $k_2 \geqq k_{20}$, $k_{2m}$ = | 3.556 | 0.507 | 0.335 | 0.292 | 0.258 |
| When $k_2 < k_{20}$, $k_{2m}$ = | 3.013 | 0.403 | 0.242 | 0.188 | 0.152 |
| When $d_2 \geqq d_{20}$, $d_{2m}$ (nm) = | 1.715 | 83.056 | ∞ | ∞ | ∞ |
| When $d_2 < d_{20}$, $d_{2m}$ (nm) = | 1.418 | 75.266 | 136.202 | 175.723 | 191.206 |

1.3 < NA ≦ 1.4
2 ≦ T ≦ 15

| Case | 1-06 | 1-07 | 1-08 | 1-09 | 1-10 |
|---|---|---|---|---|---|
| $n_{10}$ | 1.691 | 1.692 | 1.711 | 1.704 | 1.705 |
| $k_{10}$ | 0.062 | 0.057 | 0.070 | 0.057 | 0.050 |
| $d_{10}$ (nm) | 161.852 | 157.460 | 239.891 | 226.155 | 221.451 |
| $n_{20}$ | 1.688 | 1.697 | 7.420 | 1.689 | 1.695 |
| $k_{20}$ | 0.179 | 0.154 | 3.291 | 0.187 | 0.158 |
| $d_{20}$ (nm) | 207.262 | 266.043 | 0.810 | 202.908 | 261.182 |
| When $n_1 \geqq n_{10}$, $n_{1m}$ = | 1.703 | 1.707 | 1.725 | 1.738 | 1.736 |
| When $n_1 < n_{10}$, $n_{1m}$ = | 1.685 | 1.664 | 1.704 | 1.690 | 1.688 |
| When $k_1 \geqq k_{10}$, $k_{1m}$ = | 0.080 | 0.084 | 0.082 | 0.082 | 0.079 |
| When $k_1 < k_{10}$, $k_{1m}$ = | 0.051 | 0.029 | 0.049 | 0.029 | 0.022 |
| When $d_1 \geqq d_{10}$, $d_{1m}$ (nm) = | 169.125 | 171.143 | 250.745 | ∞ | ∞ |
| When $d_1 < d_{10}$, $d_{1m}$ (nm) = | 157.974 | 129.944 | 235.697 | 215.124 | 204.319 |
| When $n_2 \geqq n_{20}$, $n_{2m}$ = | 1.696 | 1.748 | 7.849 | 1.818 | 1.809 |
| When $n_2 < n_{20}$, $n_{2m}$ = | 1.666 | 1.665 | 7.185 | 1.613 | 1.611 |
| When $k_2 \geqq k_{20}$, $k_{2m}$ = | 0.202 | 0.195 | 3.465 | 0.264 | 0.246 |
| When $k_2 < k_{20}$, $k_{2m}$ = | 0.150 | 0.115 | 2.625 | 0.129 | 0.105 |
| When $d_2 \geqq d_{20}$, $d_{2m}$ (nm) = | 213.501 | ∞ | 0.893 | ∞ | ∞ |
| When $d_2 < d_{20}$, $d_{2m}$ (nm) = | 194.001 | 249.665 | 0.721 | 179.167 | 225.188 |

1.3 < NA ≦ 1.4
2 ≦ T ≦ 15

2/20

| Case | 1-11 |
|---|---|
| $n_{10}$ | 1.695 |
| $k_{10}$ | 0.054 |
| $d_{10}$ (nm) | 267.286 |
| $n_{20}$ | 1.705 |
| $k_{20}$ | 0.184 |
| $d_{20}$ (nm) | 212.751 |
| When $n_1 \geqq n_{10}$, $n_{1m}$ = | 1.731 |
| When $n_1 < n_{10}$, $n_{1m}$ = | 1.655 |
| When $k_1 \geqq k_{10}$, $k_{1m}$ = | 0.080 |
| When $k_1 < k_{10}$, $k_{1m}$ = | 0.025 |
| When $d_1 \geqq d_{10}$, $d_{1m}$ (nm) = | ∞ |
| When $d_1 < d_{10}$, $d_{1m}$ (nm) = | 220.771 |
| When $n_2 \geqq n_{20}$, $n_{2m}$ = | 1.808 |
| When $n_2 < n_{20}$, $n_{2m}$ = | 1.623 |
| When $k_2 \geqq k_{20}$, $k_{2m}$ = | 0.237 |
| When $k_2 < k_{20}$, $k_{2m}$ = | 0.115 |
| When $d_2 \geqq d_{20}$, $d_{2m}$ (nm) = | ∞ |
| When $d_2 < d_{20}$, $d_{2m}$ (nm) = | 175.645 |

| 1.3 < NA ≦ 1.4<br>15 < T ≦ 25 | | | | | |
|---|---|---|---|---|---|
| Case | 2-01 | 2-02 | 2-03 | 2-04 | 3/20<br>2-05 |
| $n_{10}$ | 1.943 | 1.876 | 1.873 | 1.866 | 1.691 |
| $k_{10}$ | 0.121 | 0.112 | 0.080 | 0.068 | 0.064 |
| $d_{10}$ (nm) | 34.905 | 17.699 | 15.588 | 14.042 | 161.844 |
| $n_{20}$ | 6.149 | 1.719 | 1.739 | 1.732 | 1.687 |
| $k_{20}$ | 4.965 | 0.321 | 0.258 | 0.217 | 0.188 |
| $d_{20}$ (nm) | 1.046 | 148.502 | 203.950 | 262.757 | 198.716 |
| When $n_1 \geqq n_{10}$, $n_{1m}$ = | 1.997 | 1.925 | 1.936 | 1.942 | 1.700 |
| When $n_1 < n_{10}$, $n_{1m}$ = | 1.902 | 1.861 | 1.842 | 1.830 | 1.690 |
| When $k_1 \geqq k_{10}$, $k_{1m}$ = | 0.155 | 0.135 | 0.124 | 0.122 | 0.079 |
| When $k_1 < k_{10}$, $k_{1m}$ = | 0.064 | 0.044 | 0.004 | 0.000 | 0.061 |
| When $d_1 \geqq d_{10}$, $d_{1m}$ (nm) = | 38.478 | 21.745 | 20.735 | 20.064 | 166.973 |
| When $d_1 < d_{10}$, $d_{1m}$ (nm) = | 32.365 | 16.569 | 13.305 | 11.354 | 161.165 |
| When $n_2 \geqq n_{20}$, $n_{2m}$ = | 6.640 | 1.749 | 1.787 | 1.793 | 1.688 |
| When $n_2 < n_{20}$, $n_{2m}$ = | 5.695 | 1.636 | 1.643 | 1.623 | 1.668 |
| When $k_2 \geqq k_{20}$, $k_{2m}$ = | 5.267 | 0.354 | 0.304 | 0.266 | 0.197 |
| When $k_2 < k_{20}$, $k_{2m}$ = | 4.500 | 0.266 | 0.202 | 0.162 | 0.165 |
| When $d_2 \geqq d_{20}$, $d_{2m}$ (nm) = | 1.189 | ∞ | ∞ | ∞ | 199.493 |
| When $d_2 < d_{20}$, $d_{2m}$ (nm) = | 0.912 | 129.925 | 173.046 | 186.094 | 188.055 |

| 1.3 < NA ≦ 1.4<br>15 < T ≦ 25 | | | | | |
|---|---|---|---|---|---|
| Case | 2-06 | 2-07 | 2-08 | 2-09 | 2-10 |
| $n_{10}$ | 1.692 | 1.706 | 1.711 | 1.704 | 1.695 |
| $k_{10}$ | 0.059 | 0.052 | 0.075 | 0.059 | 0.056 |
| $d_{10}$ (nm) | 157.652 | 221.303 | 235.815 | 225.762 | 267.452 |
| $n_{20}$ | 1.696 | 1.695 | 6.235 | 1.687 | 1.705 |
| $k_{20}$ | 0.161 | 0.165 | 4.691 | 0.197 | 0.194 |
| $d_{20}$ (nm) | 257.279 | 252.591 | 0.724 | 194.502 | 204.028 |
| When $n_1 \geqq n_{10}$, $n_{1m}$ = | 1.703 | 1.736 | 1.711 | 1.737 | 1.730 |
| When $n_1 < n_{10}$, $n_{1m}$ = | 1.667 | 1.690 | 1.709 | 1.692 | 1.658 |
| When $k_1 \geqq k_{10}$, $k_{1m}$ = | 0.082 | 0.079 | 0.079 | 0.082 | 0.080 |
| When $k_1 < k_{10}$, $k_{1m}$ = | 0.033 | 0.024 | 0.074 | 0.033 | 0.029 |
| When $d_1 \geqq d_{10}$, $d_{1m}$ (nm) = | 165.499 | ∞ | 235.852 | ∞ | ∞ |
| When $d_1 < d_{10}$, $d_{1m}$ (nm) = | 138.474 | 207.206 | 234.721 | 216.211 | 222.458 |
| When $n_2 \geqq n_{20}$, $n_{2m}$ = | 1.740 | 1.797 | 6.407 | 1.814 | 1.798 |
| When $n_2 < n_{20}$, $n_{2m}$ = | 1.670 | 1.616 | 6.233 | 1.613 | 1.629 |
| When $k_2 \geqq k_{20}$, $k_{2m}$ = | 0.196 | 0.249 | 4.693 | 0.270 | 0.240 |
| When $k_2 < k_{20}$, $k_{2m}$ = | 0.121 | 0.111 | 3.940 | 0.138 | 0.122 |
| When $d_2 \geqq d_{20}$, $d_{2m}$ (nm) = | ∞ | ∞ | 0.732 | ∞ | ∞ |
| When $d_2 < d_{20}$, $d_{2m}$ (nm) = | 244.077 | 220.690 | 0.720 | 173.495 | 171.776 |

| 1.3 < NA ≦ 1.4<br>25 < T ≦ 35 | | | | | | |
|---|---|---|---|---|---|---|
| Case | 3-01 | 3-02 | 3-03 | 3-04 | 3-05 | 4/20<br>3-06 |
| $n_{10}$ | 1.883 | 1.879 | 1.872 | 1.692 | 1.705 | 1.706 |
| $k_{10}$ | 0.119 | 0.084 | 0.069 | 0.061 | 0.061 | 0.054 |
| $d_{10}$ (nm) | 18.157 | 15.746 | 14.214 | 157.790 | 225.478 | 221.123 |
| $n_{20}$ | 1.723 | 1.741 | 1.737 | 1.697 | 1.687 | 1.695 |
| $k_{20}$ | 0.349 | 0.274 | 0.228 | 0.168 | 0.209 | 0.173 |
| $d_{20}$ (nm) | 139.788 | 195.542 | 253.893 | 248.784 | 186.105 | 244.149 |
| When $n_1 \geqq n_{10}$, $n_{1m}$ = | 1.927 | 1.939 | 1.945 | 1.699 | 1.735 | 1.735 |
| When $n_1 < n_{10}$, $n_{1m}$ = | 1.873 | 1.852 | 1.839 | 1.671 | 1.694 | 1.692 |
| When $k_1 \geqq k_{10}$, $k_{1m}$ = | 0.135 | 0.123 | 0.119 | 0.079 | 0.082 | 0.078 |
| When $k_1 < k_{10}$, $k_{1m}$ = | 0.055 | 0.011 | 0.000 | 0.039 | 0.038 | 0.026 |
| When $d_1 \geqq d_{10}$, $d_{1m}$ (nm) = | 21.683 | 20.446 | 19.836 | 161.921 | 270.295 | ∞ |
| When $d_1 < d_{10}$, $d_{1m}$ (nm) = | 17.423 | 13.775 | 11.786 | 145.560 | 217.505 | 209.346 |
| When $n_2 \geqq n_{20}$, $n_{2m}$ = | 1.744 | 1.786 | 1.794 | 1.735 | 1.754 | 1.781 |
| When $n_2 < n_{20}$, $n_{2m}$ = | 1.647 | 1.650 | 1.632 | 1.679 | 1.615 | 1.622 |
| When $k_2 \geqq k_{20}$, $k_{2m}$ = | 0.374 | 0.316 | 0.276 | 0.196 | 0.276 | 0.252 |
| When $k_2 < k_{20}$, $k_{2m}$ = | 0.295 | 0.218 | 0.173 | 0.130 | 0.149 | 0.118 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 124.317 | 167.810 | 181.193 | 239.270 | 167.329 | 214.946 |

| 1.3 < NA ≦ 1.4<br>35 < T ≦ 45 | | | | | |
|---|---|---|---|---|---|
| Case | 4-01 | 4-02 | 4-03 | 4-04 | 5/20<br>4-05 |
| $n_{10}$ | 1.890 | 1.886 | 1.877 | 1.692 | 1.705 |
| $k_{10}$ | 0.130 | 0.088 | 0.073 | 0.062 | 0.063 |
| $d_{10}$ (nm) | 18.083 | 15.723 | 14.196 | 157.690 | 225.284 |
| $n_{20}$ | 1.714 | 1.743 | 1.736 | 1.697 | 1.687 |
| $k_{20}$ | 0.371 | 0.287 | 0.236 | 0.175 | 0.220 |
| $d_{20}$ (nm) | 132.495 | 187.112 | 245.779 | 240.328 | 177.345 |
| When $n_1 \geqq n_{10}$, $n_{1m}$ = | 1.928 | 1.943 | 1.947 | 1.695 | 1.732 |
| When $n_1 < n_{10}$, $n_{1m}$ = | 1.886 | 1.862 | 1.846 | 1.674 | 1.696 |
| When $k_1 \geqq k_{10}$, $k_{1m}$ = | 0.137 | 0.123 | 0.120 | 0.075 | 0.081 |
| When $k_1 < k_{10}$, $k_{1m}$ = | 0.069 | 0.018 | 0.000 | 0.046 | 0.042 |
| When $d_1 \geqq d_{10}$, $d_{1m}$ (nm) = | 21.026 | 19.960 | 19.411 | 159.493 | 266.580 |
| When $d_1 < d_{10}$, $d_{1m}$ (nm) = | 17.768 | 14.046 | 12.019 | 148.447 | 218.746 |
| When $n_2 \geqq n_{20}$, $n_{2m}$ = | 1.723 | 1.784 | 1.789 | 1.731 | 1.745 |
| When $n_2 < n_{20}$, $n_{2m}$ = | 1.643 | 1.655 | 1.634 | 1.687 | 1.620 |
| When $k_2 \geqq k_{20}$, $k_{2m}$ = | 0.382 | 0.326 | 0.281 | 0.195 | 0.283 |
| When $k_2 < k_{20}$, $k_{2m}$ = | 0.323 | 0.234 | 0.182 | 0.141 | 0.159 |
| When $d_2 \geqq d_{20}$, $d_{2m}$ (nm) = | ∞ | ∞ | ∞ | 273.632 | ∞ |
| When $d_2 < d_{20}$, $d_{2m}$ (nm) = | 119.322 | 160.895 | 176.028 | 234.699 | 160.070 |

-continued

| 1.3 < NA ≦ 1.4<br>35 < T ≦ 45 | | |
|---|---|---|
| Case | 4-06 | 4-07 |
| $n_{10}$ | 1.706 | 1.695 |
| $k_{10}$ | 0.055 | 0.055 |
| $d_{10}$ (nm) | 220.863 | 262.917 |
| $n_{20}$ | 1.695 | 1.705 |
| $k_{20}$ | 0.180 | 0.178 |
| $d_{20}$ (nm) | 235.453 | 255.408 |
| When $n_1 \geqq n_{10}$, $n_{1m}$ = | 1.734 | 1.723 |
| When $n_1 < n_{10}$, $n_{1m}$ = | 1.693 | 1.660 |
| When $k_1 \geqq k_{10}$, $k_{1m}$ = | 0.078 | 0.082 |
| When $k_1 < k_{10}$, $k_{1m}$ = | 0.027 | 0.031 |
| When $d_1 \geqq d_{10}$, $d_{1m}$ (nm) = | ∞ | ∞ |
| When $d_1 < d_{10}$, $d_{1m}$ (nm) = | 210.617 | 221.552 |
| When $n_2 \geqq n_{20}$, $n_{2m}$ = | 1.767 | 1.832 |
| When $n_2 < n_{20}$, $n_{2m}$ = | 1.630 | 1.613 |
| When $k_2 \geqq k_{20}$, $k_{2m}$ = | 0.252 | 0.241 |
| When $k_2 < k_{20}$, $k_{2m}$ = | 0.123 | 0.108 |
| When $d_2 \geqq d_{20}$, $d_{2m}$ (nm) = | ∞ | ∞ |
| When $d_2 < d_{20}$, $d_{2m}$ (nm) = | 206.982 | 177.439 |

| 1.3 < NA ≦ 1.4<br>45 < T ≦ 55 | | | | | |
|---|---|---|---|---|---|
| Case | 5-01 | 5-02 | 5-03 | 5-04 | 6/20<br>5-05 |
| $n_{10}$ | 1.891 | 1.892 | 1.878 | 1.691 | 1.705 |
| $k_{10}$ | 0.144 | 0.091 | 0.079 | 0.064 | 0.064 |
| $d_{10}$ (nm) | 17.530 | 15.545 | 14.050 | 157.168 | 225.395 |
| $n_{20}$ | 1.686 | 1.744 | 1.728 | 1.696 | 1.686 |
| $k_{20}$ | 0.376 | 0.296 | 0.240 | 0.179 | 0.227 |
| $d_{20}$ (nm) | 126.586 | 178.253 | 238.151 | 231.953 | 167.881 |
| When $n_1 \geqq n_{10}$, $n_{1m}$ = | 1.925 | 1.947 | 1.947 | 1.692 | 1.729 |
| When $n_1 < n_{10}$, $n_{1m}$ = | 1.891 | 1.870 | 1.849 | 1.677 | 1.698 |
| When $k_1 \geqq k_{10}$, $k_{1m}$ = | 0.144 | 0.124 | 0.124 | 0.069 | 0.080 |
| When $k_1 < k_{10}$, $k_{1m}$ = | 0.087 | 0.024 | 0.000 | 0.054 | 0.044 |
| When $d_1 \geqq d_{10}$, $d_{1m}$ (nm) = | 19.955 | 19.462 | 18.998 | 157.553 | 251.532 |
| When $d_1 < d_{10}$, $d_{1m}$ (nm) = | 17.523 | 14.081 | 12.045 | 150.032 | 219.912 |
| When $n_2 \geqq n_{20}$, $n_{2m}$ = | 1.686 | 1.783 | 1.778 | 1.727 | 1.728 |
| When $n_2 < n_{20}$, $n_{2m}$ = | 1.619 | 1.656 | 1.625 | 1.693 | 1.628 |
| When $k_2 \geqq k_{20}$, $k_{2m}$ = | 0.377 | 0.330 | 0.281 | 0.190 | 0.292 |
| When $k_2 < k_{20}$, $k_{2m}$ = | 0.336 | 0.244 | 0.186 | 0.164 | 0.167 |
| When $d_2 \geqq d_{20}$, $d_{2m}$ (nm) = | 127.104 | ∞ | ∞ | 253.769 | ∞ |
| When $d_2 < d_{20}$, $d_{2m}$ (nm) = | 114.397 | 150.903 | 169.614 | 229.862 | 150.571 |

| 1.3 < NA ≦ 1.4<br>45 < T ≦ 55 | | |
|---|---|---|
| Case | 5-06 | 5-07 |
| $n_{10}$ | 1.706 | 1.697 |
| $k_{10}$ | 0.056 | 0.047 |
| $d_{10}$ (nm) | 220.607 | 278.691 |
| $n_{20}$ | 1.694 | 1.700 |
| $k_{20}$ | 0.184 | 0.152 |
| $d_{20}$ (nm) | 226.210 | 281.986 |
| When $n_1 \geqq n_{10}$, $n_{1m}$ = | 1.728 | 1.753 |
| When $n_1 < n_{10}$, $n_{1m}$ = | 1.694 | 1.654 |
| When $k_1 \geqq k_{10}$, $k_{1m}$ = | 0.077 | 0.078 |
| When $k_1 < k_{10}$, $k_{1m}$ = | 0.029 | 0.021 |
| When $d_1 \geqq d_{10}$, $d_{1m}$ (nm) = | ∞ | ∞ |
| When $d_1 < d_{10}$, $d_{1m}$ (nm) = | 210.961 | 211.857 |
| When $n_2 \geqq n_{20}$, $n_{2m}$ = | 1.757 | 1.912 |
| When $n_2 < n_{20}$, $n_{2m}$ = | 1.639 | 1.611 |
| When $k_2 \geqq k_{20}$, $k_{2m}$ = | 0.250 | 0.220 |
| When $k_2 < k_{20}$, $k_{2m}$ = | 0.125 | 0.096 |
| When $d_2 \geqq d_{20}$, $d_{2m}$ (nm) = | ∞ | ∞ |
| When $d_2 < d_{20}$, $d_{2m}$ (nm) = | 199.775 | 202.106 |

| 1.3 < NA ≦ 1.4<br>55 < T ≦ 65 | | | | | | |
|---|---|---|---|---|---|---|
| Case | 6-01 | 6-02 | 6-03 | 6-04 | 6-05 | 7/20<br>6-06 |
| $n_{10}$ | 1.896 | 1.875 | 1.705 | 1.705 | 1.708 | 1.697 |
| $k_{10}$ | 0.091 | 0.087 | 0.064 | 0.057 | 0.053 | 0.047 |
| $d_{10}$ (nm) | 15.652 | 14.019 | 225.606 | 220.354 | 218.289 | 278.413 |
| $n_{20}$ | 1.752 | 1.715 | 1.687 | 1.694 | 1.707 | 1.701 |
| $k_{20}$ | 0.303 | 0.239 | 0.232 | 0.186 | 0.158 | 0.154 |
| $d_{20}$ (nm) | 167.408 | 230.256 | 157.678 | 216.433 | 272.538 | 271.867 |
| When $n_1 \geqq n_{10}$, $n_{1m}$ = | 1.950 | 1.943 | 1.724 | 1.723 | 1.740 | 1.750 |
| When $n_1 < n_{10}$, $n_{1m}$ = | 1.875 | 1.846 | 1.699 | 1.693 | 1.693 | 1.656 |
| When $k_1 \geqq k_{10}$, $k_{1m}$ = | 0.122 | 0.132 | 0.079 | 0.077 | 0.077 | 0.078 |
| When $k_1 < k_{10}$, $k_{1m}$ = | 0.025 | 0.004 | 0.045 | 0.033 | 0.030 | 0.022 |
| When $d_1 \geqq d_{10}$, $d_{1m}$ (nm) = | 19.494 | 18.898 | 247.964 | ∞ | ∞ | ∞ |
| When $d_1 < d_{10}$, $d_{1m}$ (nm) = | 14.295 | 12.042 | 221.101 | 210.599 | 206.669 | 213.947 |
| When $n_2 \geqq n_{20}$, $n_{2m}$ = | 1.792 | 1.763 | 1.721 | 1.752 | 1.799 | 1.923 |
| When $n_2 < n_{20}$, $n_{2m}$ = | 1.662 | 1.612 | 1.638 | 1.648 | 1.579 | 1.614 |
| When $k_2 \geqq k_{20}$, $k_{2m}$ = | 0.337 | 0.279 | 0.301 | 0.247 | 0.230 | 0.223 |
| When $k_2 < k_{20}$, $k_{2m}$ = | 0.249 | 0.186 | 0.176 | 0.128 | 0.106 | 0.097 |
| When $d_2 \geqq d_{20}$, $d_{2m}$ (nm) = | ∞ | ∞ | 172.085 | ∞ | ∞ | ∞ |
| When $d_2 < d_{20}$, $d_{2m}$ (nm) = | 138.575 | 161.008 | 143.974 | 199.200 | 203.487 | 191.019 |

| 1.3 < NA ≦ 1.4<br>65 < T ≦ 75 | | | | | |
|---|---|---|---|---|---|
| Case | 7-01 | 7-02 | 7-03 | 7-04 | 8/20<br>7-05 |
| $n_{10}$ | 1.901 | 1.871 | 1.866 | 1.706 | 1.705 |
| $k_{10}$ | 0.088 | 0.093 | 0.067 | 0.065 | 0.057 |
| $d_{10}$ (nm) | 16.388 | 14.267 | 13.172 | 225.317 | 220.112 |
| $n_{20}$ | 1.774 | 1.706 | 1.724 | 1.687 | 1.694 |
| $k_{20}$ | 0.318 | 0.241 | 0.206 | 0.238 | 0.188 |
| $d_{20}$ (nm) | 154.194 | 221.319 | 275.098 | 147.740 | 206.685 |
| When $n_1 \geqq n_{10}$, $n_{1m}$ = | 1.955 | 1.937 | 1.947 | 1.721 | 1.721 |
| When $n_1 < n_{10}$, $n_{1m}$ = | 1.881 | 1.842 | 1.823 | 1.701 | 1.693 |
| When $k_1 \geqq k_{10}$, $k_{1m}$ = | 0.116 | 0.138 | 0.131 | 0.077 | 0.077 |
| When $k_1 < k_{10}$, $k_{1m}$ = | 0.024 | 0.011 | 0.000 | 0.045 | 0.035 |
| When $d_1 \geqq d_{10}$, $d_{1m}$ (nm) = | 20.279 | 19.161 | 19.228 | 239.263 | 245.793 |
| When $d_1 < d_{10}$, $d_{1m}$ (nm) = | 15.118 | 12.240 | 10.142 | 222.197 | 210.312 |
| When $n_2 \geqq n_{20}$, $n_{2m}$ = | 1.816 | 1.751 | 1.783 | 1.720 | 1.752 |
| When $n_2 < n_{20}$, $n_{2m}$ = | 1.683 | 1.603 | 1.616 | 1.644 | 1.651 |
| When $k_2 \geqq k_{20}$, $k_{2m}$ = | 0.355 | 0.280 | 0.254 | 0.305 | 0.246 |
| When $k_2 < k_{20}$, $k_{2m}$ = | 0.259 | 0.188 | 0.151 | 0.177 | 0.133 |
| When $d_2 \geqq d_{20}$, $d_{2m}$ (nm) = | ∞ | ∞ | ∞ | 161.062 | ∞ |
| When $d_2 < d_{20}$, $d_{2m}$ (nm) = | 132.898 | 152.054 | 192.936 | 136.808 | 191.952 |

| 1.3 < NA ≦ 1.4<br>65 < T ≦ 75 | | |
|---|---|---|
| Case | 7-06 | 7-07 |
| $n_{10}$ | 1.708 | 1.697 |
| $k_{10}$ | 0.053 | 0.047 |
| $d_{10}$ (nm) | 218.342 | 278.070 |
| $n_{20}$ | 1.707 | 1.702 |
| $k_{20}$ | 0.161 | 0.156 |
| $d_{20}$ (nm) | 262.805 | 262.294 |
| When $n_1 \geqq n_{10}$, $n_{1m}$ = | 1.740 | 1.735 |
| When $n_1 < n_{10}$, $n_{1m}$ = | 1.695 | 1.657 |
| When $k_1 \geqq k_{10}$, $k_{1m}$ = | 0.077 | 0.077 |
| When $k_1 < k_{10}$, $k_{1m}$ = | 0.032 | 0.024 |
| When $d_1 \geqq d_{10}$, $d_{1m}$ (nm) = | ∞ | ∞ |
| When $d_1 < d_{10}$, $d_{1m}$ (nm) = | 208.328 | 215.902 |
| When $n_2 \geqq n_{20}$, $n_{2m}$ = | 1.805 | 1.806 |
| When $n_2 < n_{20}$, $n_{2m}$ = | 1.580 | 1.618 |
| When $k_2 \geqq k_{20}$, $k_{2m}$ = | 0.232 | 0.224 |
| When $k_2 < k_{20}$, $k_{2m}$ = | 0.108 | 0.097 |
| When $d_2 \geqq d_{20}$, $d_{2m}$ (nm) = | ∞ | ∞ |
| When $d_2 < d_{20}$, $d_{2m}$ (nm) = | 195.570 | 182.960 |

| 1.3 < NA ≦ 1.4<br>75 < T ≦ 85 | | | | | |
|---|---|---|---|---|---|
| Case | 8-01 | 8-02 | 8-03 | 8-04 | 9/20<br>8-05 |
| $n_{10}$ | 1.908 | 1.871 | 1.869 | 1.706 | 1.705 |
| $k_{10}$ | 0.087 | 0.097 | 0.067 | 0.067 | 0.058 |
| $d_{10}$ (nm) | 17.362 | 14.654 | 13.479 | 224.641 | 220.026 |
| $n_{20}$ | 1.802 | 1.704 | 1.729 | 1.684 | 1.694 |
| $k_{20}$ | 0.342 | 0.250 | 0.214 | 0.248 | 0.194 |
| $d_{20}$ (nm) | 141.959 | 212.121 | 265.153 | 139.263 | 197.616 |
| When $n_1 \geqq n_{10}$, $n_{1m}$ = | 1.960 | 1.935 | 1.947 | 1.720 | 1.721 |
| When $n_1 < n_{10}$, $n_{1m}$ = | 1.891 | 1.843 | 1.828 | 1.704 | 1.694 |
| When $k_1 \geqq k_{10}$, $k_{1m}$ = | 0.111 | 0.140 | 0.128 | 0.074 | 0.078 |
| When $k_1 < k_{10}$, $k_{1m}$ = | 0.023 | 0.016 | 0.000 | 0.049 | 0.035 |
| When $d_1 \geqq d_{10}$, $d_{1m}$ (nm) = | 21.165 | 19.437 | 19.380 | 236.042 | 243.446 |
| When $d_1 < d_{10}$, $d_{1m}$ (nm) = | 16.261 | 12.685 | 10.599 | 223.100 | 210.844 |
| When $n_2 \geqq n_{20}$, $n_{2m}$ = | 1.843 | 1.746 | 1.787 | 1.711 | 1.754 |
| When $n_2 < n_{20}$, $n_{2m}$ = | 1.713 | 1.604 | 1.618 | 1.641 | 1.649 |
| When $k_2 \geqq k_{20}$, $k_{2m}$ = | 0.382 | 0.288 | 0.262 | 0.299 | 0.249 |
| When $k_2 < k_{20}$, $k_{2m}$ = | 0.279 | 0.196 | 0.159 | 0.184 | 0.134 |
| When $d_2 \geqq d_{20}$, $d_{2m}$ (nm) = | ∞ | ∞ | ∞ | 151.104 | ∞ |
| When $d_2 < d_{20}$, $d_{2m}$ (nm) = | 126.652 | 177.678 | 187.664 | 128.169 | 181.064 |

| 1.3 < NA ≦ 1.4<br>75 < T ≦ 85 | | |
|---|---|---|
| Case | 8-06 | 8-07 |
| $n_{10}$ | 1.708 | 1.697 |
| $k_{10}$ | 0.054 | 0.048 |
| $d_{10}$ (nm) | 218.429 | 277.999 |
| $n_{20}$ | 1.707 | 1.702 |
| $k_{20}$ | 0.165 | 0.160 |
| $d_{20}$ (nm) | 253.768 | 253.663 |
| When $n_1 \geqq n_{10}$, $n_{1m}$ = | 1.739 | 1.730 |
| When $n_1 < n_{10}$, $n_{1m}$ = | 1.697 | 1.656 |
| When $k_1 \geqq k_{10}$, $k_{1m}$ = | 0.076 | 0.076 |
| When $k_1 < k_{10}$, $k_{1m}$ = | 0.032 | 0.027 |
| When $d_1 \geqq d_{10}$, $d_{1m}$ (nm) = | ∞ | ∞ |
| When $d_1 < d_{10}$, $d_{1m}$ (nm) = | 209.931 | 217.650 |
| When $n_2 \geqq n_{20}$, $n_{2m}$ = | 1.810 | 1.804 |
| When $n_2 < n_{20}$, $n_{2m}$ = | 1.580 | 1.625 |
| When $k_2 \geqq k_{20}$, $k_{2m}$ = | 0.235 | 0.225 |
| When $k_2 < k_{20}$, $k_{2m}$ = | 0.109 | 0.100 |
| When $d_2 \geqq d_{20}$, $d_{2m}$ (nm) = | ∞ | ∞ |
| When $d_2 < d_{20}$, $d_{2m}$ (nm) = | 216.664 | 177.272 |

| 1.3 < NA ≦ 1.4<br>85 < T ≦ 95 | | | | | | |
|---|---|---|---|---|---|---|
| Case | 9-01 | 9-02 | 9-03 | 9-04 | 9-05 | 10/20<br>9-06 |
| $n_{10}$ | 1.918 | 1.876 | 1.874 | 1.706 | 1.709 | 1.697 |
| $k_{10}$ | 0.092 | 0.100 | 0.069 | 0.060 | 0.055 | 0.050 |
| $d_{10}$ (nm) | 17.977 | 14.944 | 13.674 | 219.996 | 218.382 | 278.074 |
| $n_{20}$ | 1.822 | 1.706 | 1.733 | 1.694 | 1.707 | 1.701 |
| $k_{20}$ | 0.371 | 0.265 | 0.224 | 0.203 | 0.172 | 0.166 |
| $d_{20}$ (nm) | 132.466 | 203.140 | 256.300 | 189.146 | 245.309 | 245.468 |
| When $n_1 \geqq n_{10}$, $n_{1m}$ = | 1.966 | 1.936 | 1.950 | 1.723 | 1.738 | 1.728 |
| When $n_1 < n_{10}$, $n_{1m}$ = | 1.905 | 1.851 | 1.836 | 1.696 | 1.699 | 1.655 |
| When $k_1 \geqq k_{10}$, $k_{1m}$ = | 0.109 | 0.138 | 0.126 | 0.078 | 0.075 | 0.075 |
| When $k_1 < k_{10}$, $k_{1m}$ = | 0.028 | 0.021 | 0.000 | 0.035 | 0.032 | 0.029 |
| When $d_1 \geqq d_{10}$, $d_{1m}$ (nm) = | 21.461 | 19.418 | 19.237 | 242.566 | ∞ | ∞ |
| When $d_1 < d_{10}$, $d_{1m}$ (nm) = | 17.167 | 13.206 | 11.040 | 212.120 | 211.373 | 219.101 |
| When $n_2 \geqq n_{20}$, $n_{2m}$ = | 1.855 | 1.745 | 1.789 | 1.754 | 1.811 | 1.805 |
| When $n_2 < n_{20}$, $n_{2m}$ = | 1.737 | 1.611 | 1.626 | 1.644 | 1.579 | 1.636 |

-continued

| 1.3 < NA ≦ 1.4<br>85 < T ≦ 95<br>Case | 9-01 | 9-02 | 9-03 | 9-04 | 9-05 | 10/20<br>9-06 |
|---|---|---|---|---|---|---|
| When $k_2 \geqq k_{20}$, $k_{2m}$ = | 0.407 | 0.300 | 0.271 | 0.255 | 0.237 | 0.226 |
| When $k_2 < k_{20}$, $k_{2m}$ = | 0.308 | 0.211 | 0.169 | 0.143 | 0.115 | 0.106 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 121.537 | 173.052 | 183.002 | 168.954 | 213.072 | 172.052 |

| 1.3 < NA ≦ 1.4<br>95 < T ≦ 105<br>Case | 10-01 | 10-02 | 10-03 | 10-04 | 10-05 | 11/20<br>10-06 |
|---|---|---|---|---|---|---|
| $n_{10}$ | 1.929 | 1.883 | 1.880 | 1.707 | 1.709 | 1.697 |
| $k_{10}$ | 0.101 | 0.103 | 0.071 | 0.062 | 0.057 | 0.047 |
| $d_{10}$ (nm) | 17.864 | 14.973 | 13.709 | 219.774 | 218.071 | 275.083 |
| $n_{20}$ | 1.821 | 1.709 | 1.736 | 1.693 | 1.706 | 1.700 |
| $k_{20}$ | 0.398 | 0.279 | 0.234 | 0.214 | 0.179 | 0.148 |
| $d_{20}$ (nm) | 125.532 | 194.479 | 247.823 | 180.753 | 237.020 | 295.680 |
| When $n_1 \geqq n_{10}$, $n_{1m}$ = | 1.973 | 1.940 | 1.953 | 1.724 | 1.737 | 1.768 |
| When $n_1 < n_{10}$, $n_{1m}$ = | 1.922 | 1.863 | 1.845 | 1.698 | 1.701 | 1.650 |
| When $k_1 \geqq k_{10}$, $k_{1m}$ = | 0.111 | 0.136 | 0.124 | 0.077 | 0.074 | 0.079 |
| When $k_1 < k_{10}$, $k_{1m}$ = | 0.042 | 0.027 | 0.000 | 0.035 | 0.034 | 0.023 |
| When $d_1 \geqq d_{10}$, $d_{1m}$ (nm) = | 20.839 | 19.023 | 18.857 | 241.722 | ∞ | ∞ |
| When $d_1 < d_{10}$, $d_{1m}$ (nm) = | 17.465 | 13.566 | 11.352 | 213.515 | 212.546 | 200.276 |
| When $n_2 \geqq n_{20}$, $n_{2m}$ = | 1.840 | 1.742 | 1.789 | 1.751 | 1.807 | 1.849 |
| When $n_2 < n_{20}$, $n_{2m}$ = | 1.743 | 1.619 | 1.632 | 1.642 | 1.577 | 1.604 |
| When $k_2 \geqq k_{20}$, $k_{2m}$ = | 0.418 | 0.310 | 0.278 | 0.260 | 0.236 | 0.227 |
| When $k_2 < k_{20}$, $k_{2m}$ = | 0.340 | 0.227 | 0.180 | 0.155 | 0.122 | 0.093 |
| When $d_2 \geqq d_{20}$, $d_{2m}$ (nm) = | 161.544 | ∞ | ∞ | ∞ | ∞ | ∞ |
| When $d_2 < d_{20}$, $d_{2m}$ (nm) = | 119.422 | 166.497 | 178.361 | 161.067 | 205.891 | 212.971 |

| 1.3 < NA ≦ 1.4<br>105 < T ≦ 115<br>Case | 11-01 | 11-02 | 11-03 | 11-04 | 12/20<br>11-05 |
|---|---|---|---|---|---|
| $n_{10}$ | 1.891 | 1.885 | 1.707 | 1.709 | 1.697 |
| $k_{10}$ | 0.108 | 0.074 | 0.064 | 0.058 | 0.048 |
| $d_{10}$ (nm) | 14.702 | 13.594 | 219.485 | 217.678 | 275.043 |
| $n_{20}$ | 1.707 | 1.735 | 1.692 | 1.705 | 1.701 |
| $k_{20}$ | 0.289 | 0.241 | 0.223 | 0.184 | 0.152 |
| $d_{20}$ (nm) | 186.368 | 239.426 | 171.867 | 228.411 | 286.426 |
| When $n_1 \geqq n_{10}$, $n_{1m}$ = | 1.944 | 1.955 | 1.723 | 1.736 | 1.767 |
| When $n_1 < n_{10}$, $n_{1m}$ = | 1.874 | 1.853 | 1.700 | 1.703 | 1.650 |
| When $k_1 \geqq k_{10}$, $k_{1m}$ = | 0.135 | 0.124 | 0.077 | 0.073 | 0.078 |
| When $k_1 < k_{10}$, $k_{1m}$ = | 0.035 | 0.000 | 0.037 | 0.036 | 0.023 |
| When $d_1 \geqq d_{10}$, $d_{1m}$ (nm) = | 18.320 | 18.363 | 240.271 | ∞ | ∞ |
| When $d_1 < d_{10}$, $d_{1m}$ (nm) = | 13.618 | 11.476 | 214.658 | 213.396 | 201.239 |
| When $n_2 \geqq n_{20}$, $n_{2m}$ = | 1.733 | 1.786 | 1.744 | 1.797 | 1.850 |
| When $n_2 < n_{20}$, $n_{2m}$ = | 1.620 | 1.632 | 1.646 | 1.574 | 1.606 |
| When $k_2 \geqq k_{20}$, $k_{2m}$ = | 0.314 | 0.282 | 0.261 | 0.232 | 0.229 |
| When $k_2 < k_{20}$, $k_{2m}$ = | 0.241 | 0.188 | 0.163 | 0.126 | 0.094 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 157.397 | 173.024 | 156.390 | 195.169 | 202.551 |

| 1.3 < NA ≦ 1.4<br>115 < T ≦ 125<br>Case | 12-01 | 12-02 | 12-03 | 12-04 | 13/20<br>12-05 |
|---|---|---|---|---|---|
| $n_{10}$ | 1.896 | 1.887 | 1.692 | 1.707 | 1.709 |
| $k_{10}$ | 0.113 | 0.078 | 0.059 | 0.065 | 0.059 |
| $d_{10}$ (nm) | 14.435 | 13.577 | 153.772 | 219.581 | 217.561 |
| $n_{20}$ | 1.703 | 1.733 | 1.694 | 1.692 | 1.702 |
| $k_{20}$ | 0.295 | 0.244 | 0.154 | 0.231 | 0.188 |
| $d_{20}$ (nm) | 177.615 | 230.253 | 284.837 | 161.904 | 219.131 |
| When $n_1 \geqq n_{10}$, $n_{1m}$ = | 1.947 | 1.955 | 1.718 | 1.720 | 1.728 |
| When $n_1 < n_{10}$, $n_{1m}$ = | 1.882 | 1.856 | 1.664 | 1.701 | 1.703 |
| When $k_1 \geqq k_{10}$, $k_{1m}$ = | 0.136 | 0.126 | 0.090 | 0.076 | 0.072 |
| When $k_1 < k_{10}$, $k_{1m}$ = | 0.044 | 0.000 | 0.044 | 0.041 | 0.040 |
| When $d_1 \geqq d_{10}$, $d_{1m}$ (nm) = | 17.718 | 18.125 | 175.199 | 231.299 | ∞ |
| When $d_1 < d_{10}$, $d_{1m}$ (nm) = | 13.578 | 11.595 | 128.388 | 215.799 | 214.049 |
| When $n_2 \geqq n_{20}$, $n_{2m}$ = | 1.725 | 1.783 | 1.772 | 1.738 | 1.784 |
| When $n_2 < n_{20}$, $n_{2m}$ = | 1.617 | 1.629 | 1.642 | 1.658 | 1.629 |
| When $k_2 \geqq k_{20}$, $k_{2m}$ = | 0.315 | 0.284 | 0.182 | 0.262 | 0.229 |
| When $k_2 < k_{20}$, $k_{2m}$ = | 0.249 | 0.192 | 0.119 | 0.174 | 0.128 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 145.196 | 165.335 | 240.440 | 152.266 | 193.496 |

-continued

| 1.3 < NA ≦ 1.4<br>115 < T ≦ 125 | | |
|---|---|---|
| Case | 12-06 | 12-07 |
| $n_{10}$ | 1.707 | 1.697 |
| $k_{10}$ | 0.053 | 0.048 |
| $d_{10}$ (nm) | 216.484 | 274.812 |
| $n_{20}$ | 1.695 | 1.701 |
| $k_{20}$ | 0.157 | 0.154 |
| $d_{20}$ (nm) | 278.062 | 276.656 |
| When $n_1 \geqq n_{10}$, $n_{1m}$ = | 1.748 | 1.768 |
| When $n_1 < n_{10}$, $n_{1m}$ = | 1.689 | 1.651 |
| When $k_1 \geqq k_{10}$, $k_{1m}$ = | 0.077 | 0.078 |
| When $k_1 < k_{10}$, $k_{1m}$ = | 0.030 | 0.024 |
| When $d_1 \geqq d_{10}$, $d_{1m}$ (nm) = | ∞ | ∞ |
| When $d_1 < d_{10}$, $d_{1m}$ (nm) = | 199.849 | 201.932 |
| When $n_2 \geqq n_{20}$, $n_{2m}$ = | 1.761 | 1.850 |
| When $n_2 < n_{20}$, $n_{2m}$ = | 1.583 | 1.607 |
| When $k_2 \geqq k_{20}$, $k_{2m}$ = | 0.215 | 0.229 |
| When $k_2 < k_{20}$, $k_{2m}$ = | 0.104 | 0.098 |
| When $d_2 \geqq d_{20}$, $d_{2m}$ (nm) = | ∞ | ∞ |
| When $d_2 < d_{20}$, $d_{2m}$ (nm) = | 212.463 | 192.106 |

| 1.3 < NA ≦ 1.4<br>125 < T ≦ 135 | | | | | |
|---|---|---|---|---|---|
| Case | 13-01 | 13-02 | 13-03 | 13-04 | 14/20<br>13-05 |
| $n_{10}$ | 1.898 | 1.885 | 1.868 | 1.707 | 1.708 |
| $k_{10}$ | 0.115 | 0.081 | 0.075 | 0.067 | 0.060 |
| $d_{10}$ (nm) | 14.632 | 13.917 | 12.752 | 219.938 | 217.756 |
| $n_{20}$ | 1.705 | 1.732 | 1.713 | 1.695 | 1.701 |
| $k_{20}$ | 0.303 | 0.248 | 0.206 | 0.239 | 0.192 |
| $d_{20}$ (nm) | 166.646 | 219.851 | 279.921 | 151.390 | 209.457 |
| When $n_1 \geqq n_{10}$, $n_{1m}$ = | 1.949 | 1.951 | 1.949 | 1.716 | 1.721 |
| When $n_1 < n_{10}$, $n_{1m}$ = | 1.886 | 1.855 | 1.830 | 1.703 | 1.704 |
| When $k_1 \geqq k_{10}$, $k_{1m}$ = | 0.135 | 0.127 | 0.135 | 0.075 | 0.072 |
| When $k_1 < k_{10}$, $k_{1m}$ = | 0.050 | 0.002 | 0.000 | 0.050 | 0.045 |
| When $d_1 \geqq d_{10}$, $d_{1m}$ (nm) = | 17.809 | 18.468 | 18.469 | 226.140 | ∞ |
| When $d_1 < d_{10}$, $d_{1m}$ (nm) = | 13.869 | 11.960 | 10.161 | 217.246 | 214.692 |
| When $n_2 \geqq n_{20}$, $n_{2m}$ = | 1.725 | 1.781 | 1.771 | 1.731 | 1.769 |
| When $n_2 < n_{20}$, $n_{2m}$ = | 1.618 | 1.628 | 1.611 | 1.678 | 1.659 |
| When $k_2 \geqq k_{20}$, $k_{2m}$ = | 0.322 | 0.288 | 0.250 | 0.263 | 0.228 |
| When $k_2 < k_{20}$, $k_{2m}$ = | 0.256 | 0.194 | 0.153 | 0.185 | 0.138 |
| When $d_2 \geqq d_{20}$, $d_{2m}$ (nm) = | ∞ | ∞ | ∞ | 179.041 | ∞ |
| When $d_2 < d_{20}$, $d_{2m}$ (nm) = | 136.370 | 153.796 | 194.427 | 147.510 | 199.403 |

| 1.3 < NA ≦ 1.4<br>125 < T ≦ 135 | | |
|---|---|---|
| Case | 13-06 | 13-07 |
| $n_{10}$ | 1.706 | 1.696 |
| $k_{10}$ | 0.054 | 0.049 |
| $d_{10}$ (nm) | 217.065 | 274.075 |
| $n_{20}$ | 1.694 | 1.702 |
| $k_{20}$ | 0.160 | 0.157 |
| $d_{20}$ (nm) | 268.021 | 267.366 |
| When $n_1 \geqq n_{10}$, $n_{1m}$ = | 1.746 | 1.770 |
| When $n_1 < n_{10}$, $n_{1m}$ = | 1.690 | 1.651 |
| When $k_1 \geqq k_{10}$, $k_{1m}$ = | 0.077 | 0.078 |
| When $k_1 < k_{10}$, $k_{1m}$ = | 0.033 | 0.026 |
| When $d_1 \geqq d_{10}$, $d_{1m}$ (nm) = | ∞ | ∞ |
| When $d_1 < d_{10}$, $d_{1m}$ (nm) = | 202.380 | 202.716 |
| When $n_2 \geqq n_{20}$, $n_{2m}$ = | 1.761 | 1.853 |
| When $n_2 < n_{20}$, $n_{2m}$ = | 1.586 | 1.608 |
| When $k_2 \geqq k_{20}$, $k_{2m}$ = | 0.219 | 0.227 |
| When $k_2 < k_{20}$, $k_{2m}$ = | 0.106 | 0.099 |
| When $d_2 \geqq d_{20}$, $d_{2m}$ (nm) = | ∞ | ∞ |
| When $d_2 < d_{20}$, $d_{2m}$ (nm) = | 208.129 | 186.947 |

| 1.3 < NA ≦ 1.4<br>135 < T ≦ 145 | | | | | | |
|---|---|---|---|---|---|---|
| Case | 14-01 | 14-02 | 14-03 | 14-04 | 14-05 | 15/20<br>14-06 |
| $n_{10}$ | 1.899 | 1.882 | 1.870 | 1.708 | 1.707 | 1.696 |
| $k_{10}$ | 0.115 | 0.083 | 0.074 | 0.062 | 0.055 | 0.050 |
| $d_{10}$ (nm) | 15.367 | 14.477 | 13.063 | 217.887 | 217.378 | 273.384 |
| $n_{20}$ | 1.714 | 1.732 | 1.717 | 1.700 | 1.693 | 1.702 |
| $k_{20}$ | 0.318 | 0.256 | 0.212 | 0.197 | 0.164 | 0.160 |
| $d_{20}$ (nm) | 155.141 | 209.893 | 269.637 | 200.272 | 258.646 | 258.714 |
| When $n_1 \geqq n_{10}$, $n_{1m}$ = | 1.949 | 1.947 | 1.949 | 1.716 | 1.744 | 1.741 |
| When $n_1 < n_{10}$, $n_{1m}$ = | 1.888 | 1.854 | 1.833 | 1.704 | 1.691 | 1.652 |
| When $k_1 \geqq k_{10}$, $k_{1m}$ = | 0.132 | 0.127 | 0.132 | 0.071 | 0.077 | 0.078 |
| When $k_1 < k_{10}$, $k_{1m}$ = | 0.051 | 0.006 | 0.000 | 0.050 | 0.036 | 0.028 |
| When $d_1 \geqq d_{10}$, $d_{1m}$ (nm) = | 18.581 | 19.085 | 18.767 | ∞ | ∞ | ∞ |
| When $d_1 < d_{10}$, $d_{1m}$ (nm) = | 14.660 | 12.539 | 10.533 | 215.374 | 204.778 | 209.881 |
| When $n_2 \geqq n_{20}$, $n_{2m}$ = | 1.733 | 1.780 | 1.774 | 1.754 | 1.760 | 1.859 |
| When $n_2 < n_{20}$, $n_{2m}$ = | 1.627 | 1.630 | 1.611 | 1.677 | 1.592 | 1.608 |
| When $k_2 \geqq k_{20}$, $k_{2m}$ = | 0.337 | 0.296 | 0.256 | 0.228 | 0.223 | 0.226 |
| When $k_2 < k_{20}$, $k_{2m}$ = | 0.266 | 0.200 | 0.157 | 0.152 | 0.109 | 0.098 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 131.038 | 171.650 | 189.575 | 195.166 | 202.001 | 178.700 |

1.3 < NA ≦ 1.4
145 < T ≦ 155

16/20

| Case | 15-01 | 15-02 | 15-03 | 15-04 | 15-05 | 15-06 |
|---|---|---|---|---|---|---|
| $n_{10}$ | 1.903 | 1.884 | 1.874 | 1.708 | 1.707 | 1.696 |
| $k_{10}$ | 0.118 | 0.087 | 0.075 | 0.063 | 0.056 | 0.051 |
| $d_{10}$ (nm) | 16.130 | 14.896 | 13.357 | 217.693 | 217.044 | 273.493 |
| $n_{20}$ | 1.723 | 1.733 | 1.722 | 1.700 | 1.694 | 1.702 |
| $k_{20}$ | 0.340 | 0.268 | 0.221 | 0.205 | 0.169 | 0.165 |
| $d_{20}$ (nm) | 145.164 | 201.113 | 260.240 | 191.744 | 250.083 | 250.180 |
| When $n_1 \geqq n_{10}$, $n_{1m}$ = | 1.950 | 1.946 | 1.951 | 1.714 | 1.742 | 1.738 |
| When $n_1 < n_{10}$, $n_{1m}$ = | 1.895 | 1.858 | 1.839 | 1.706 | 1.694 | 1.652 |
| When $k_1 \geqq k_{10}$, $k_{1m}$ = | 0.130 | 0.127 | 0.128 | 0.070 | 0.076 | 0.078 |
| When $k_1 < k_{10}$, $k_{1m}$ = | 0.053 | 0.010 | 0.000 | 0.053 | 0.038 | 0.031 |
| When $d_1 \geqq d_{10}$, $d_{1m}$ (nm) = | 19.240 | 19.361 | 18.857 | 222.035 | ∞ | ∞ |
| When $d_1 < d_{10}$, $d_{1m}$ (nm) = | 15.619 | 13.105 | 10.992 | 216.109 | 206.771 | 213.326 |
| When $n_2 \geqq n_{20}$, $n_{2m}$ = | 1.737 | 1.779 | 1.777 | 1.735 | 1.755 | 1.839 |
| When $n_2 < n_{20}$, $n_{2m}$ = | 1.641 | 1.636 | 1.612 | 1.682 | 1.595 | 1.609 |
| When $k_2 \geqq k_{20}$, $k_{2m}$ = | 0.356 | 0.307 | 0.265 | 0.225 | 0.223 | 0.227 |
| When $k_2 < k_{20}$, $k_{2m}$ = | 0.286 | 0.211 | 0.166 | 0.161 | 0.114 | 0.102 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 126.286 | 170.199 | 185.156 | 187.971 | 215.684 | 171.738 |

1.3 < NA ≦ 1.4
155 < T ≦ 165

17/20

| Case | 16-01 | 16-02 | 16-03 | 16-04 | 16-05 | 16-06 |
|---|---|---|---|---|---|---|
| $n_{10}$ | 1.913 | 1.891 | 1.879 | 1.709 | 1.708 | 1.696 |
| $k_{10}$ | 0.125 | 0.091 | 0.077 | 0.064 | 0.057 | 0.052 |
| $d_{10}$ (nm) | 16.406 | 14.954 | 13.440 | 217.197 | 216.333 | 274.035 |
| $n_{20}$ | 1.727 | 1.734 | 1.724 | 1.700 | 1.694 | 1.700 |
| $k_{20}$ | 0.366 | 0.282 | 0.231 | 0.214 | 0.175 | 0.171 |
| $d_{20}$ (nm) | 136.777 | 193.024 | 251.802 | 183.446 | 241.739 | 241.498 |
| When $n_1 \geqq n_{10}$, $n_{1m}$ = | 1.955 | 1.950 | 1.953 | 1.714 | 1.742 | 1.735 |
| When $n_1 < n_{10}$, $n_{1m}$ = | 1.910 | 1.868 | 1.847 | 1.708 | 1.697 | 1.651 |
| When $k_1 \geqq k_{10}$, $k_{1m}$ = | 0.129 | 0.127 | 0.127 | 0.066 | 0.075 | 0.077 |
| When $k_1 < k_{10}$, $k_{1m}$ = | 0.064 | 0.016 | 0.000 | 0.055 | 0.039 | 0.034 |
| When $d_1 \geqq d_{10}$, $d_{1m}$ (nm) = | 19.185 | 19.061 | 18.574 | 220.596 | ∞ | ∞ |
| When $d_1 < d_{10}$, $d_{1m}$ (nm) = | 16.268 | 13.452 | 11.329 | 216.874 | 208.223 | 215.451 |
| When $n_2 \geqq n_{20}$, $n_{2m}$ = | 1.731 | 1.774 | 1.776 | 1.707 | 1.748 | 1.840 |
| When $n_2 < n_{20}$, $n_{2m}$ = | 1.651 | 1.642 | 1.618 | 1.678 | 1.595 | 1.612 |
| When $k_2 \geqq k_{20}$, $k_{2m}$ = | 0.371 | 0.317 | 0.273 | 0.218 | 0.220 | 0.229 |
| When $k_2 < k_{20}$, $k_{2m}$ = | 0.314 | 0.227 | 0.177 | 0.165 | 0.120 | 0.108 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 121.662 | 164.818 | 180.821 | 179.468 | 209.260 | 166.208 |

1.3 < NA ≦ 1.4
165 < T ≦ 175

18/20

| Case | 17-01 | 17-02 | 17-03 | 17-04 |
|---|---|---|---|---|
| $n_{10}$ | 1.900 | 1.885 | 1.708 | 1.697 |
| $k_{10}$ | 0.097 | 0.082 | 0.058 | 0.048 |
| $d_{10}$ (nm) | 14.674 | 13.311 | 215.615 | 273.453 |
| $n_{20}$ | 1.732 | 1.722 | 1.694 | 1.699 |
| $k_{20}$ | 0.294 | 0.239 | 0.180 | 0.151 |
| $d_{20}$ (nm) | 185.336 | 243.911 | 233.152 | 289.720 |
| When $n_1 \geqq n_{10}$, $n_{1m}$ = | 1.955 | 1.956 | 1.741 | 1.736 |
| When $n_1 < n_{10}$, $n_{1m}$ = | 1.881 | 1.856 | 1.699 | 1.650 |
| When $k_1 \geqq k_{10}$, $k_{1m}$ = | 0.126 | 0.128 | 0.074 | 0.080 |
| When $k_1 < k_{10}$, $k_{1m}$ = | 0.023 | 0.000 | 0.039 | 0.020 |
| When $d_1 \geqq d_{10}$, $d_{1m}$ (nm) = | 18.346 | 18.029 | ∞ | ∞ |
| When $d_1 < d_{10}$, $d_{1m}$ (nm) = | 13.519 | 11.467 | 209.091 | 211.222 |
| When $n_2 \geqq n_{20}$, $n_{2m}$ = | 1.767 | 1.769 | 1.740 | 1.868 |
| When $n_2 < n_{20}$, $n_{2m}$ = | 1.645 | 1.618 | 1.591 | 1.614 |
| When $k_2 \geqq k_{20}$, $k_{2m}$ = | 0.322 | 0.277 | 0.217 | 0.224 |
| When $k_2 < k_{20}$, $k_{2m}$ = | 0.243 | 0.187 | 0.126 | 0.094 |
| When $d_2 \geqq d_{20}$, $d_{2m}$ (nm) = | ∞ | ∞ | ∞ | ∞ |
| When $d_2 < d_{20}$, $d_{2m}$ (nm) = | 156.774 | 176.585 | 198.961 | 204.980 |

1.3 < NA ≦ 1.4
175 < T ≦ 185

| Case | 18-01 | 18-02 | 18-03 | 18-04 | 18-05 |
|---|---|---|---|---|---|
| $n_{10}$ | 1.908 | 1.888 | 1.708 | 1.709 | 1.697 |
| $k_{10}$ | 0.102 | 0.088 | 0.059 | 0.054 | 0.049 |
| $d_{10}$ (nm) | 14.316 | 13.163 | 215.377 | 215.137 | 273.522 |
| $n_{20}$ | 1.730 | 1.716 | 1.693 | 1.702 | 1.700 |

-continued

| | | | | | |
|---|---|---|---|---|---|
| $k_{20}$ | 0.303 | 0.243 | 0.185 | 0.158 | 0.154 |
| $d_{20}$ (nm) | 177.238 | 235.819 | 223.802 | 279.418 | 279.960 |
| When $n_1 \geqq n_{10}$, $n_{1m}$ = | 1.960 | 1.956 | 1.740 | 1.745 | 1.734 |
| When $n_1 < n_{10}$, $n_{1m}$ = | 1.893 | 1.861 | 1.700 | 1.696 | 1.657 |
| When $k_1 \geqq k_{10}$, $k_{1m}$ = | 0.126 | 0.131 | 0.073 | 0.075 | 0.079 |
| When $k_1 < k_{10}$, $k_{1m}$ = | 0.031 | 0.002 | 0.041 | 0.028 | 0.020 |
| When $d_1 \geqq d_{10}$, $d_{1m}$ (nm) = | 17.569 | 17.540 | ∞ | ∞ | ∞ |
| When $d_1 < d_{10}$, $d_{1m}$ (nm) = | 13.467 | 11.504 | 209.546 | 205.939 | 213.387 |
| When $n_2 \geqq n_{20}$, $n_{2m}$ = | 1.759 | 1.759 | 1.736 | 1.790 | 1.874 |
| When $n_2 < n_{20}$, $n_{2m}$ = | 1.644 | 1.611 | 1.587 | 1.604 | 1.617 |
| When $k_2 \geqq k_{20}$, $k_{2m}$ = | 0.325 | 0.278 | 0.217 | 0.211 | 0.226 |
| When $k_2 < k_{20}$, $k_{2m}$ = | 0.256 | 0.193 | 0.129 | 0.105 | 0.095 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 143.259 | 171.381 | 185.714 | 201.921 | 193.505 |

$1.3 < NA \leqq 1.4$
$185 < T \leqq 195$

| Case | 19-01 | 19-02 | 19-03 | 19-04 | 19/20 19-05 |
|---|---|---|---|---|---|
| $n_{10}$ | 1.914 | 1.886 | 1.873 | 1.692 | 1.708 |
| $k_{10}$ | 0.104 | 0.093 | 0.070 | 0.060 | 0.060 |
| $d_{10}$ (nm) | 14.390 | 13.299 | 12.581 | 152.854 | 215.913 |
| $n_{20}$ | 1.735 | 1.710 | 1.721 | 1.693 | 1.692 |

-continued

| | | | | | |
|---|---|---|---|---|---|
| When $n_2 < n_{20}$, $n_{2m}$ = | 1.648 | 1.604 | 1.614 | 1.659 | 1.586 |
| When $k_2 \geqq k_{20}$, $k_{2m}$ = | 0.331 | 0.280 | 0.252 | 0.196 | 0.222 |
| When $k_2 < k_{20}$, $k_{2m}$ = | 0.267 | 0.196 | 0.156 | 0.120 | 0.129 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 144.756 | 162.922 | 193.262 | 243.485 | 177.669 |

$1.3 < NA \leqq 1.4$
$185 < T \leqq 195$

| Case | 19-06 | 19-07 |
|---|---|---|
| $n_{10}$ | 1.708 | 1.697 |
| $k_{10}$ | 0.054 | 0.050 |
| $d_{10}$ (nm) | 215.905 | 273.350 |
| $n_{20}$ | 1.701 | 1.701 |
| $k_{20}$ | 0.161 | 0.157 |
| $d_{20}$ (nm) | 269.362 | 270.178 |
| When $n_1 \geqq n_{10}$, $n_{1m}$ = | 1.744 | 1.732 |
| When $n_1 < n_{10}$, $n_{1m}$ = | 1.697 | 1.658 |
| When $k_1 \geqq k_{10}$, $k_{1m}$ = | 0.075 | 0.078 |
| When $k_1 < k_{10}$, $k_{1m}$ = | 0.029 | 0.021 |
| When $d_1 \geqq d_{10}$, $d_{1m}$ (nm) = | ∞ | ∞ |
| When $d_1 < d_{10}$, $d_{1m}$ (nm) = | 207.633 | 215.326 |
| When $n_2 \geqq n_{20}$, $n_{2m}$ = | 1.795 | 1.877 |
| When $n_2 < n_{20}$, $n_{2m}$ = | 1.605 | 1.619 |
| When $k_2 \geqq k_{20}$, $k_{2m}$ = | 0.216 | 0.228 |
| When $k_2 < k_{20}$, $k_{2m}$ = | 0.105 | 0.098 |
| When $d_2 \geqq d_{20}$, $d_{2m}$ (nm) = | ∞ | ∞ |
| When $d_2 < d_{20}$, $d_{2m}$ (nm) = | 205.481 | 189.945 |

$1.3 < NA \leqq 1.4$
$195 < T \leqq 205$

| Case | 20-01 | 20-02 | 20-03 | 20-04 | 20-05 | 20/20 20-06 |
|---|---|---|---|---|---|---|
| $n_{10}$ | 1.918 | 1.883 | 1.874 | 1.707 | 1.708 | 1.697 |
| $k_{10}$ | 0.103 | 0.095 | 0.068 | 0.061 | 0.055 | 0.050 |
| $d_{10}$ (nm) | 15.177 | 13.742 | 12.955 | 216.749 | 216.874 | 272.522 |
| $n_{20}$ | 1.753 | 1.708 | 1.728 | 1.693 | 1.699 | 1.701 |
| $k_{20}$ | 0.331 | 0.252 | 0.214 | 0.194 | 0.165 | 0.160 |
| $d_{20}$ (nm) | 153.467 | 215.835 | 269.400 | 203.628 | 259.716 | 261.468 |
| When $n_1 \geqq n_{10}$, $n_{1m}$ = | 1.966 | 1.948 | 1.955 | 1.739 | 1.743 | 1.731 |
| When $n_1 < n_{10}$, $n_{1m}$ = | 1.909 | 1.857 | 1.835 | 1.699 | 1.698 | 1.652 |
| When $k_1 \geqq k_{10}$, $k_{1m}$ = | 0.117 | 0.137 | 0.128 | 0.075 | 0.075 | 0.078 |
| When $k_1 < k_{10}$, $k_{1m}$ = | 0.043 | 0.016 | 0.000 | 0.048 | 0.030 | 0.022 |
| When $d_1 \geqq d_{10}$, $d_{1m}$ (nm) = | 18.089 | 18.051 | 18.523 | 256.743 | ∞ | ∞ |
| When $d_1 < d_{10}$, $d_{1m}$ (nm) = | 14.663 | 12.041 | 10.348 | 210.937 | 209.294 | 217.122 |
| When $n_2 \geqq n_{20}$, $n_{2m}$ = | 1.773 | 1.748 | 1.785 | 1.744 | 1.800 | 1.874 |
| When $n_2 < n_{20}$, $n_{2m}$ = | 1.665 | 1.604 | 1.616 | 1.589 | 1.608 | 1.620 |
| When $k_2 \geqq k_{20}$, $k_{2m}$ = | 0.348 | 0.285 | 0.259 | 0.230 | 0.223 | 0.227 |
| When $k_2 < k_{20}$, $k_{2m}$ = | 0.278 | 0.199 | 0.159 | 0.145 | 0.109 | 0.100 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 140.260 | 150.984 | 188.160 | 180.549 | 200.943 | 184.530 |

-continued

| | | | | | |
|---|---|---|---|---|---|
| $k_{20}$ | 0.314 | 0.247 | 0.208 | 0.157 | 0.189 |
| $d_{20}$ (nm) | 166.400 | 226.131 | 280.628 | 278.359 | 213.567 |
| When $n_1 \geqq n_{10}$, $n_{1m}$ = | 1.964 | 1.952 | 1.955 | 1.709 | 1.739 |
| When $n_1 < n_{10}$, $n_{1m}$ = | 1.903 | 1.860 | 1.833 | 1.664 | 1.699 |
| When $k_1 \geqq k_{10}$, $k_{1m}$ = | 0.123 | 0.135 | 0.133 | 0.092 | 0.074 |
| When $k_1 < k_{10}$, $k_{1m}$ = | 0.040 | 0.012 | 0.000 | 0.042 | 0.044 |
| When $d_1 \geqq d_{10}$, $d_{1m}$ (nm) = | 17.353 | 17.539 | 18.087 | 163.046 | ∞ |
| When $d_1 < d_{10}$, $d_{1m}$ (nm) = | 13.759 | 11.668 | 9.947 | 129.659 | 210.046 |
| When $n_2 \geqq n_{20}$, $n_{2m}$ = | 1.759 | 1.750 | 1.778 | 1.784 | 1.739 |

The exposure method according to any one of the first to fifth embodiments of the invention is applied to, for example, submicron patterning in a semiconductor device. Specifically, the exposure method includes the steps of forming the antireflective film according to any one of the embodiments of the invention on a silicon oxide film formed on a surface of the silicon semiconductor substrate, applying a resist layer having a sensitive function on the antireflective film, selectively exposing the resist layer to exposure light (ultraviolet light), and developing the resist layer to form a predetermined resist pattern.

In the antireflective film or the exposure method according to any one of the first to fifth embodiments of the invention (may be simply generically named "the invention" hereinafter), the exposure light (ultraviolet light) has a wavelength of 190 nm to 195 nm and preferably 192 nm to 194 nm. More specifically, an ArF excimer laser at a wavelength of 193 nm is more preferably used as an exposure light source.

Furthermore, the relations $d_1 \leqq 250$ and $d_2 \leqq 250$ are satisfied. In other words, the thicknesses of the upper and lower layers of the antireflective film preferably are smaller than 250 nm. When the thickness of the upper layer or the lower layer exceeds 250 nm, in the step of etching the silicon semiconductor substrate using the resist layer as an etching mask after the exposure of the resist layer to the exposure light and the development thereof, a so-called processing conversion difference (referred to as a "dimensional conversion amount" or "dimensional shift") which represents a difference between the resist pattern dimensions of the resist layer and the actual etching dimensions of the silicon semiconductor substrate is excessively increased, thereby failing to obtain a pattern having a desired shape or size on the silicon semiconductor substrate.

In addition, the refractive index of the resist layer is preferably 1.60 to 1.80. In the use of the resist layer composed of a resist material having a refractive index outside this range, even when the antireflective film satisfies any one of the above-described conditions of the combination ($n_1$, $k_1$, $d_1$, $n_2$, $k_2$, $d_2$), it is difficult to control the reflectance at the interface between the resist layer and the silicon oxide film formed on a surface of the silicon semiconductor substrate to 0.4% or less over the entire region from the incidence angle (maximum incidence angle $\theta_{in\text{-}max}$) of exposure light corresponding to a corresponding numerical aperture to vertical incidence (minimum incidence angle $\theta_{in\text{-}min}$, specifically 0°), thereby failing to obtain an excellent resist pattern.

Furthermore, the space between the resist layer and the exposure system is preferably filled with a medium having a refractive index of 1.44±0.02. Namely, the medium having a refractive index of 1.44±0.02 is preferably used as an immersion liquid, and water is more preferably used as the medium. When the refractive index greatly deviates from this value, even if the antireflective index satisfies any one of the conditions of the combination ($n_1$, $k_1$, $d_1$, $n_2$, $k_2$, $d_2$), it is difficult to control the reflectance at the interface between the resist layer and the silicon oxide film formed on a surface of the silicon semiconductor substrate to 0.4% or less over the entire region from the incidence angle (maximum incidence angle $\theta_{in\text{-}max}$) of exposure light corresponding to the corresponding numerical aperture to vertical incidence (minimum incidence angle $\theta_{in\text{-}min}$, specifically 0°), thereby failing to obtain an excellent resist pattern.

Furthermore, in the exposure method according to any one of the first to fifth embodiments of the invention, a topcoat layer is preferably formed on the resist layer (specifically, on the upper layer). Without the topcoat layer, it may be impossible to suppress the occurrence of an interaction between the resist layer and the immersion liquid (for example, the phenomenon of producing defects in the resist layer due to contact between the resist layer and the immersion liquid), thereby failing to obtain a desirable resist pattern. The topcoat layer may be composed of a material, such as an organic or inorganic material, e.g., polyvinyl alcohol, amorphous fluoropolymer, or NaCl.

In the present invention, the entire region from the incidence angle (maximum incidence angle $\theta_{in\text{-}max}$) of exposure light corresponding to a corresponding numerical aperture to vertical incidence (minimum incidence angle $\theta_{in\text{-}min}$, specifically 0°) may be referred to as the "entire incidence angle region corresponding to the numerical aperture NA of the corresponding exposure system" or simply referred to as the "entire incidence angle region".

The thickness of the resist layer is preferably 2 times to 5 times as large as the minimum size of the resist pattern to be formed. When the thickness of the resist layer is less than 2 times as large as the minimum size of the resist pattern, it may be possible to pattern the resist layer to a predetermined pattern, but the silicon semiconductor substrate is not satisfactorily etched after patterning of the resist layer. In addition, the number of defects in the resist layer may be increased. On the other hand, when the thickness of the resist layer exceeds 5 times as large as the minimum size of the resist pattern, the patterned resist layer may be broken, thereby failing to satisfactorily pattern the silicon semiconductor substrate.

As the material constituting the upper and lower layers of the antireflective film, any material satisfying any one of the conditions of the combination ($n_1$, $k_1$, $d_1$, $n_2$, $k_2$, $d_2$) may be used. Examples of the material constituting the upper and lower layers of the antireflective film include polymer materials, inorganic oxide materials, metal materials, and hybrid materials thereof. Specific examples of the material include polyimide, SiCH films, SiCHN films, SiCOH films, epoxy thermosetting resins, acrylic thermosetting resins, epoxy ultraviolet curable resins, and acrylic ultraviolet curable resins.

In order to improve the adhesion between the antireflective film and the resist layer formed on the antireflective film, the surface of the upper layer constituting the antireflective film may be subjected to surface medication treatment such as silane coupling treatment or the like.

In the use of a single-layer antireflective film, even when the thickness and complex refractive index are changed to any values, it may be generally impossible to control the reflectance to 0.4% or less over the entire incidence angle region corresponding to the numerical aperture NA of the corresponding exposure system. When the antireflective film has an excessively large thickness, the problem of a processing conversion difference occurs in the step of etching the silicon semiconductor substrate after exposure of the resist layer to the exposure light and the development thereof.

On the other hand, in the present invention, the two-layer structure antireflective film having a thickness and complex refractive index in the respective predetermined ranges is formed between the resist and the silicon oxide film formed on a surface of the silicon semiconductor substrate. Therefore, it may be possible to control the reflectance to 0.4% or less over the entire incidence angle region corresponding to the numerical aperture NA of the corresponding exposure system and obtain a resist pattern having a more excellent shape, thereby permitting more submicron processing. In other words, when the numerical aperture NA of the exposure system is each of $0.93 \leqq NA \leqq 1.0$, $1.0 < NA \leqq 1.1$, $1.1 < NA \leqq 1.2$, $1.2 < NA \leqq 1.3$, and $1.3 < NA \leqq 1.4$, by using the two-layer structure antireflective film satisfying the above-described conditions of the thickness and the complex refractive index, it may be possible to control the reflectance to 0.4% or less over the entire region from the incidence angle of exposure light corresponding to the corresponding numerical aperture NA to vertical incidence, thereby obtaining an excellent resist pattern and minimizing the processing conversion difference.

BRIEF DESCRIPTION OF THE DRAWINGS

FIGURE is a graph showing the result of computation of the reflectance dependence of variation in the diameter of contact holes.

DESCRIPTION OF THE PREFERRED EMBODIMENTS

Although embodiments of the present invention will be described with reference to the drawings, description will be first made of the reasons why the reflectance is 0.4% or less over the entire incidence angle region corresponding to the numerical aperture NA of a corresponding exposure system (the entire region from the incidence angle of exposure light corresponding to the numerical aperture of a corresponding exposure system to vertical incidence) according to the embodiments of the invention.

First, a simulation of optimizing the complex refractive indexes $N_1$ and $N_2$ of upper and lower layer of an antireflective film was carried out for minimizing the reflectance over the region from the incidence angle (maximum incidence angle $\theta_{in\text{-}max}$) of most oblique incidence corresponding to a numerical aperture NA to vertical incidence (minimum incidence angle $\theta_{in\text{-}min}$), i.e., the entire incidence angle region. In this simulation, the thicknesses $d_1$ and $d_2$ of the upper and lower layer of the antireflective film were changed from 10 nm to 200 nm in 10 nm increments, and the simulation was carried out in each combination of the thicknesses $d_1$ and $d_2$ using a silicon oxide film having a thickness of 2 nm to 205 nm. Furthermore, the numerical aperture NA of an exposure system was set to each of $0.93 \leqq NA \leqq 1.0$ (specifically, 1.0), $1.0 < NA \leqq 1.1$ (specifically, 1.1), $1.1 < NA \leqq 1.2$ (specifically, 1.2), $1.2 < NA \leqq 1.3$ (specifically, 1.3), and $1.3 < NA \leqq 1.4$ (specifically, 1.4).

In this computation, the reflectance of the two-layer antireflective film was calculated by a calculation method for the Fresnel coefficient of each layer (refer to "Basic Theory of Optical Thin Film" written by Mitsunobu Kobiyama, 2003, issued by Optronics Inc.). The complex refractive indexes of the upper and lower layers were optimized by the Fletcher-Reeves optimization method (refer to "Nonlinear Optimization Problems" written by J. Kowalik, M. R. Osborn, translated by Yoshiyuki Yamamoto and Takeo Koyama, 1970, issued by Baifukan).

In the optimization, when the numerical aperture NA was 1.0, the entire incident angle region was divided into 20 equal parts; when the numerical aperture NA was 1.1, the entire incidence angle region was divided into 22 equal parts; when the numerical aperture NA was 1.2, the entire incidence angle region was divided into 24 equal parts; when the numerical aperture NA was 1.3, the entire incidence angle region was divided into 26 equal parts; and when the numerical aperture NA was 1.4, the entire incidence angle region was divided into 28 equal parts. The reflectance at each incidence angle was calculated, and the square sum of the reflectances at the incidence angles was minimized.

In this way, the numerical aperture NA of the exposure system was set to each of 1.0, 1.1, 1.2, 1.3, and 1.4, and the thicknesses $d_1$ and $d_2$ of the upper and lower layers were changed from 10 nm to 250 nm in 10 nm increments. In each of the cases, the complex refractive indexes of the upper and lower layers were optimized by the above-described method to obtain the optimum complex refractive indexes $N_1$ and $N_2$ of the upper and lower layers.

The reason why computation was not carried out for a thickness above 250 nm was that with a thickness over this value, a processing conversion difference in the etching step is increased, thereby failing to satisfactorily process the silicon semiconductor substrate.

Then, in each of the cases in which the numerical aperture NA of the exposure system was set to each of 1.0, 1.1, 1.2, 1.3, and 1.4, and the thicknesses $d_1$ and $d_2$ of the upper and lower layers were changed from 10 nm to 250 nm in 10 nm increments, the thickness conditions for minimizing the square sum of the reflectances, which was an evaluation function for optimization after the optimization of the complex refractive indexes of the upper and lower layers, were determined on the basis of the results of the above-described computation.

Each of the thicknesses $d_1$ and $d_2$ of the upper and lower layers was further finely divided on the basis of the thickness conditions, and the most preferable complex refractive indexes of the upper and lower layers corresponding to the thickness conditions were determined in detail.

As a result, the most preferable combinations of complex refractive indexes and thicknesses were obtained. Namely, assuming that the complex refractive index $N_1$ of the upper layer (disposed far from the surface of the silicon semiconductor substrate having the silicon oxide film formed on the surface thereof) in the two-layer antireflective film, and the complex refractive index $N_2$ of the lower layer (disposed nearer to the surface of the silicon semiconductor substrate having the silicon oxide film formed on the surface thereof) are defined as follows:

$$N_1 = n_{10} - k_{10} i$$

$$N_2 = n_{20} - k_{20} i$$

and assuming that $d_{10}$ is the thickness (unit: nm) of the upper layer, and $d_{20}$ is the thickness (unit: nm) of the lower layer, the more preferred combinations of $[n_{10}, n_{20}, k_{10}, k_{20}, d_{10}, d_{20}]$ are shown in Tables 1-A to 1-T (numerical aperture NA: $0.93 \leqq NA \leqq 1.0$), Tables 2-A to 2-T (numerical aperture NA: $1.0 < NA \leqq 1.1$), Tables 3-A to 3-T (numerical aperture NA: $1.1 < NA \leqq 1.2$), Tables 4-A to 4-T (numerical aperture NA: $1.2 < NA \leqq 1.3$), and Tables 5-A to 5-T (numerical aperture NA: $1.3 < NA \leqq 1.4$). In other words, with these combinations, the minimum reflectance is achieved.

In Case A-01 to Case A-15 of Table 1-A or Table 11-A which will be described below, each value was obtained with the silicon oxide film having a thickness of 2 nm to 15 nm. In Case B-01 to Case B-22 of Table 1-B or Table 11-B which will be described below, each value was obtained with the silicon oxide film having a thickness of more than 15 nm to 25 nm. In Case C-01 to Case C-18 of Table 1-C or Table 11-C which will be described below, each value was obtained with the silicon oxide film having a thickness of more than 25 nm to 35 nm. In Case D-01 to Case D-20 of Table 1-D or Table 11-D which will be described below, each value was obtained with the silicon oxide film having a thickness of more than 35 nm to 45 nm. In Case E-01 to Case E-17 of Table 1-E or Table 11-E which will be described below, each value was obtained with the silicon oxide film having a thickness of more than 45 nm to 55 nm. In Case F-01 to Case F-17 of Table 1-F or Table 11-F which will be described below, each value was obtained with the silicon oxide film having a thickness of more than 55 nm to 65 nm. In Case G-01 to Case G-16 of Table 1-G or Table 11-G which will be described below, each value was obtained with the silicon oxide film having a thickness of more than 65 nm to 75 nm. In Case H-01 to Case H-16 of Table 1-H or Table 11-H which will be described below, each value was obtained with the silicon oxide film having a thickness of more than 75 nm to 85 nm. In Case I-01 to Case I-23 of Table 1-I or Table 11-I which will be described below, each value was obtained with the silicon oxide film having a thickness of more than 85 nm to 95 nm. In Case J-01 to Case J-15 of Table 1-J or Table 11-J which will be described below, each value was obtained with the silicon oxide film having a thickness of more than 95 nm to 105 nm. In Case K-01 to Case K-13 of Table 1-K or Table 11-K which will be described below, each value was obtained with the silicon oxide film having a thickness of more than 105 nm to 115 nm. In Case L-01 to Case L-12 of Table 1-L or Table 11-L which will be described below, each value was obtained with the silicon oxide film having a thickness of more than 115 nm to 125 nm. In Case M-01 to Case M-12 of Table 1-M or Table 11-M which will be described below, each value was obtained with the silicon oxide film having a thickness of more than 125 nm to 135 nm. In Case N-01 to Case N-12 of Table 1-N or Table 11-N which will be described below, each value was obtained with the silicon oxide film having a thickness of more than 135 nm to 145 nm. In Case O-01 to Case O-13 of Table 1-O or Table 11-O which will be described below, each value was obtained with the silicon oxide film having a thickness of more than 145 nm to 155 nm. In Case P-01 to Case P-14 of Table 1-P or Table 11-P which will be described below, each value was obtained with the silicon oxide film having a thickness of more than 155 nm to 165 nm. In Case Q-01 to Case Q-13 of Table 1-Q or Table 11-Q which will be described below, each value was obtained with the silicon oxide film having a thickness of more than 165 nm to 175 nm. In Case R-01 to Case R-13 of Table 1-R or Table 11-R which will be described below, each value was obtained with the silicon oxide film having a thickness of more than 175 nm to 185 nm. In Case S-01 to Case S-15 of Table 1-S or Table 11-S which will be described below, each value was obtained with the silicon oxide film having a thickness of more than 185 nm to 195 nm. In Case T-01 to Case T-13 of Table 1-T or Table 11-T which will be described below, each value was obtained with the silicon oxide film having a thickness of more than 195 nm to 205 nm.

In Case A-01 to Case A-24 of Table 2-A or Table 12-A which will be described below, each value was obtained with the silicon oxide film having a thickness of 2 nm to 15 nm. In Case B-01 to Case B-22 of Table 2-B or Table 12-B which will be described below, each value was obtained with the silicon oxide film having a thickness of more than 15 nm to 25 nm. In Case C-01 to Case C-16 of Table 2-C or Table 12-C which will be described below, each value was obtained with the silicon oxide film having a thickness of more than 25 nm to 35 nm. In Case D-01 to Case D-14 of Table 2-D or Table 12-D which will be described below, each value was obtained with the silicon oxide film having a thickness of more than 35 nm to 45 nm. In Case E-01 to Case E-14 of Table 2-E or Table 12-E which will be described below, each value was obtained with the silicon oxide film having a thickness of more than 45 nm to 55 nm. In Case F-01 to Case F-16 of Table 2-F or Table 12-F which will be described below, each value was obtained with the silicon oxide film having a thickness of more than 55 nm to 65 nm. In Case G-01 to Case G-16 of Table 2-G or Table 12-G which will be described below, each value was obtained with the silicon oxide film having a thickness of more than 65 nm to 75 nm. In Case H-01 to Case H-17 of Table 2-H or Table 12-H which will be described below, each value was obtained with the silicon oxide film having a thickness of more than 75 nm to 85 nm. In Case I-01 to Case I-15 of Table 2-I or Table 12-I which will be described below, each value was obtained with the silicon oxide film having a thickness of more than 85 nm to 95 nm. In Case J-01 to Case J-13 of Table 2-J or Table 12-J which will be described below, each value was obtained with the silicon oxide film having a thickness of more than 95 nm to 105 nm. In Case K-01 to Case K-12 of Table 2-K or Table 12-K which will be described below, each value was obtained with the silicon oxide film having a thickness of more than 105 nm to 115 nm. In Case L-01 to Case L-13 of Table 2-L or Table 12-L which will be described below, each value was obtained with the silicon oxide film having a thickness of more than 115 nm to 125 nm. In Case M-01 to Case M-11 of Table 2-M or Table 12-M which will be described below, each value was obtained with the silicon oxide film having a thickness of more than 125 nm to 135 nm. In Case N-01 to Case N-12 of Table 2-N or Table 12-N which will be described below, each value was obtained with the silicon oxide film having a thickness of more than 135 nm to 145 nm. In Case O-01 to Case O-12 of Table 2-O or Table 12-O which will be described below, each value was obtained with the silicon oxide film having a thickness of more than 145 nm to 155 nm. In Case P-01 to Case P-12 of Table 2-P or Table 12-P which will be described below, each value was obtained with the silicon oxide film having a thickness of more than 155 nm to 165 nm. In Case Q-01 to Case Q-12 of Table 2-Q or Table 12-Q which will be described below, each value was obtained with the silicon oxide film having a thickness of more than 165 nm to 175 nm. In Case R-01 to Case R-10 of Table 2-R or Table 12-R which will be described below, each value was obtained with the silicon oxide film having a thickness of more than 175 nm to 185 nm. In Case S-01 to Case S-13 of Table 2-S or Table 12-S which will be described below, each value was obtained with the silicon oxide film having a thickness of more than 185 nm to 195 nm. In Case T-01 to Case T-12 of Table 2-T or Table 12-T which will be described below, each value was obtained with the silicon oxide film having a thickness of more than 195 nm to 205 nm.

In Case A-01 to Case A-19 of Table 3-A or Table 13-A which will be described below, each value was obtained with the silicon oxide film having a thickness of 2 nm to 15 nm. In Case B-01 to Case B-17 of Table 3-B or Table 13-B which will be described below, each value was obtained with the silicon oxide film having a thickness of more than 15 nm to 25 nm. In Case C-01 to Case C-14 of Table 3-C or Table 13-C which will be described below, each value was obtained with the silicon oxide film having a thickness of more than 25 nm to 35 nm. In Case D-01 to Case D-13 of Table 3-D or Table 13-D which will be described below, each value was obtained with the silicon oxide film having a thickness of more than 35 nm to 45 nm. In Case E-01 to Case E-13 of Table 3-E or Table 13-E which will be described below, each value was obtained with the silicon oxide film having a thickness of more than 45 nm to 55 nm. In Case F-01 to Case F-12 of Table 3-F or Table 13-F which will be described below, each value was obtained with the silicon oxide film having a thickness of more than 55 nm to 65 nm. In Case G-01 to Case G-13 of Table 3-G or Table 13-G which will be described below, each value was obtained with the silicon oxide film having a thickness of more than 65 nm to 75 nm. In Case H-01 to Case H-15 of Table 3-H or Table 13-H which will be described below, each value was obtained with the silicon oxide film having a thickness of more than 75 nm to 85 nm. In Case I-01 to Case I-13 of Table 3-I or Table 13-I which will be described below, each value was obtained with the silicon oxide film having a thickness of more than 85 nm to 95 nm. In Case J-01 to Case J-12 of Table 3-J or Table 13-J which will be described below, each value was obtained with the silicon oxide film having a thickness of more than 95 nm to 105 nm. In Case K-01 to Case K-09 of Table 3-K or Table 13-K which will be described below, each value was obtained with the silicon oxide film having a thickness of more than 105 nm to 115 nm. In Case L-01 to Case L-10 of Table 3-L or Table 13-L which will be described below, each value was obtained with the silicon oxide film having a thickness of more than 115 nm to 125 nm. In Case M-01 to Case M-09 of Table 3-M or Table 13-M which will be described below, each value was obtained with the silicon oxide film having a thickness of more than 125 nm to 135 nm. In Case N-01 to Case N-10 of Table 3-N or Table 13-N which will be described below, each value was obtained with the silicon oxide film having a thickness of more than 135 nm to 145 nm. In Case O-01 to Case O-09 of Table 3-O or Table 13-O which will be described below, each value was obtained with the silicon oxide film having a thickness of more than 145 nm to 155 nm. In Case P-01 to Case P-09 of Table 3-P or Table 13-P which will be described below, each value was obtained with the silicon oxide film having a thickness of more than 155 nm to 165 nm. In Case Q-01 to Case Q-09 of Table 3-Q or Table 13-Q which will be described below, each value was obtained with the silicon oxide film having a thickness of more than 165 nm to 175 nm. In Case R-01 to Case R-08 of Table 3-R or Table 13-R which will be described below, each value was obtained with the silicon oxide film having a thickness of more than 175 nm to 185 nm. In Case S-01 to Case S-10 of Table 3-S or Table 13-S which will be described below, each value was obtained with the silicon oxide film having a thickness of more than 185 nm to 195 nm. In Case T-01 to Case T-11 of Table 3-T or Table 13-T which will be described below, each value was obtained with the silicon oxide film having a thickness of more than 195 nm to 205 nm.

In Case A-01 to Case A-13 of Table 4-A or Table 14-A which will be described below, each value was obtained with the silicon oxide film having a thickness of 2 nm to 15 nm. In Case B-01 to Case B-10 of Table 4-B or Table 14-B which will be described below, each value was obtained with the silicon oxide film having a thickness of more than 15 nm to 25 nm. In Case C-01 to Case C-08 of Table 4-C or Table 14-C which will be described below, each value was obtained with the silicon oxide film having a thickness of more than 25 nm to 35 nm. In Case D-01 to Case D-09 of Table 4-D or Table 14-D which will be described below, each value was obtained with the silicon oxide film having a thickness of more than 35 nm to 45 nm. In Case E-01 to Case E-08 of Table 4-E or Table 14-E which will be described below, each value was obtained with the silicon oxide film having a thickness of more than 45 nm to 55 nm. In Case F-01 to Case F-08 of Table 4-F or Table 14-F which will be described below, each value was obtained with the silicon oxide film having a thickness of more than 55 nm to 65 nm. In Case G-01 to Case G-08 of Table 4-G or Table 14-G which will be described below, each value was obtained with the silicon oxide film having a thickness of more than 65 nm to 75 nm. In Case H-01 to Case H-07 of Table 4-H or Table 14-H which will be described below, each value was obtained with the silicon oxide film having a thickness of more than 75 nm to 85 nm. In Case I-01 to Case I-07 of Table 4-I or Table 14-I which will be described below, each value was obtained with the silicon oxide film having a thickness of more than 85 nm to 95 nm. In Case J-01 to Case J-06 of Table 4-J or Table 14-J which will be described below, each value was obtained with the silicon oxide film having a thickness of more than 95 nm to 105 nm. In Case K-01 to Case K-07 of Table 4-K or Table 14-K which will be described below, each value was obtained with the silicon oxide film having a thickness of more than 105 nm to 115 nm. In Case L-01 to Case L-08 of Table 4-L or Table 14-L which will be described below, each value was obtained with the silicon oxide film having a thickness of more than 115 nm to 125 nm. In Case M-01 to Case M-07 of Table 4-M or Table 14-M which will be described below, each value was obtained with the silicon oxide film having a thickness of more than 125 nm to 135 nm. In Case N-01 to Case N-07 of Table 4-N or Table 14-N which will be described below, each value was obtained with the silicon oxide film having a thickness of more than 135 nm to 145 nm. In Case O-01 to Case O-07 of Table 4-O or Table 14-O which will be described below, each value was obtained with the silicon oxide film having a thickness of more than 145 nm to 155 nm. In Case P-01 to Case P-07 of Table 4-P or Table 14-P which will be described below, each value was obtained with the silicon oxide film having a thickness of more than 155 nm to 165 nm. In Case Q-01 to Case Q-07 of Table 4-Q or Table 14-Q which will be described below, each value was obtained with the silicon oxide film having a thickness of more than 165 nm to 175 nm. In Case R-01 to Case R-05 of Table 4-R or Table 14-R which will be described below, each value was obtained with the silicon oxide film having a thickness of more than 175 nm to 185 nm. In Case S-01 to Case S-07 of Table 4-S or Table 14-S which will be described below, each value was obtained with the silicon oxide film having a thickness of more than 185 nm to 195 nm. In Case T-01 to Case T-07 of Table 4-T or Table 14-T which will be described below, each value was obtained with the silicon oxide film having a thickness of more than 195 nm to 205 nm.

In Case A-01 to Case A-11 of Table 5-A or Table 15-A which will be described below, each value was obtained with the silicon oxide film having a thickness of 2 nm to 15 nm. In Case B-01 to Case B-10 of Table 5-B or Table 15-B which will be described below, each value was obtained with the silicon oxide film having a thickness of more than 15 nm to 25 nm. In Case C-01 to Case C-06 of Table 5-C or Table 15-C which will be described below, each value was obtained with the silicon oxide film having a thickness of more than 25 nm to 35 nm. In Case D-01 to Case D-07 of Table 5-D or Table 15-D which will be described below, each value was obtained with the silicon oxide film having a thickness of more than 35 nm to 45 nm. In Case E-01 to Case E-07 of Table 5-E or Table 15-E which will be described below, each value was obtained with the silicon oxide film having a thickness of more than 45 nm to 55 nm. In Case F-01 to Case F-06 of Table 5-F or Table 15-F which will be described below, each value was obtained with the silicon oxide film having a thickness of more than 55 nm to 65 nm. In Case G-01 to Case G-07 of Table 5-G or Table 15-G which will be described below, each value was obtained with the silicon oxide film having a thickness of more than 65 nm to 75 nm. In Case H-01 to Case H-07 of Table 5-H or Table 15-H which will be described below, each value was obtained with the silicon oxide film having a thickness of more than 75 nm to 85 nm. In Case I-01 to Case I-06 of Table 5-I or Table 15-I which will be described below, each value was obtained with the silicon oxide film having a thickness of more than 85 nm to 95 nm. In Case J-01 to Case J-06 of Table 5-J or Table 15-J which will be described below, each value was obtained with the silicon oxide film having a thickness of more than 95 nm to 105 nm. In Case K-01 to Case K-05 of Table 5-K or Table 15-K which will be described below, each value was obtained with the silicon oxide film having a thickness of more than 105 nm to 115 nm. In Case L-01 to Case L-07 of Table 5-L or Table 15-L which will be described below, each value was obtained with the silicon oxide film having a thickness of more than 115 nm to 125 nm. In Case M-01 to Case M-07 of Table 5-M or Table 15-M which will be described below, each value was obtained with the silicon oxide film having a thickness of more than 125 nm to 135 nm. In Case N-01 to Case N-06 of Table 5-N or Table 15-N which will be described below, each value was obtained with the silicon oxide film having a thickness of more than 135 nm to 145 nm. In Case O-01 to Case O-06 of Table 5-O or Table 15-O which will be described below, each value was obtained with the silicon oxide film having a thickness of more than 145 nm to 155 nm. In Case P-01 to Case P-06 of Table 5-P or Table 15-P which will be described below, each value was obtained with the silicon oxide film having a thickness of more than 155 nm to 165 nm. In Case Q-01 to Case Q-04 of Table 5-Q or Table 15-Q which will be described below, each value was obtained with the silicon oxide film having a thickness of more than 165 nm to 175 nm. In Case R-01 to Case R-05 of Table 5-R or Table 15-R which will be described below, each value was obtained with the silicon oxide film having a thickness of more than 175 nm to 185 nm. In Case S-01 to Case S-07 of Table 5-S or Table 15-S which will be described below, each value was obtained with the silicon oxide film having a thickness of more than 185 nm to 195 nm. In Case T-01 to Case T-06 of Table 5-T or Table 15-T which will be described below, each value was obtained with the silicon oxide film having a thickness of more than 195 nm to 205 nm.

In other words, under the above-mentioned conditions, when the numerical aperture NA is $0.93 \leqq NA \leqq 1.0$, the minimum reflectance can be obtained at 15 points (15 combinations of $[n_{10}, n_{20}, k_{10}, k_{20}, d_{10}, d_{20}]$) with the silicon oxide film having a thickness of 2 nm to 15 nm; the minimum reflectance can be obtained at 22 points (22 combinations of $[n_{10}, n_{20}, k_{10}, k_{20}, d_{10}, d_{20}]$) with the silicon oxide film having a thickness of more than 15 nm to 25 nm; the minimum reflectance can be obtained at 18 points (18 combinations of $[n_{10}, n_{20}, k_{10}, k_{20}, d_{10}, d_{20}]$) with the silicon oxide film having a thickness of more than 25 nm to 35 nm; the minimum reflectance can be obtained at 20 points (20 combinations of $[n_{10}, n_{20}, k_{10}, k_{20}, d_{10}, d_{20}]$) with the silicon oxide film having a thickness of more than 35 nm to 45 nm; the minimum reflectance can be obtained at 17 points (17 combinations of $[n_{10}, n_{20}, k_{10}, k_{20}, d_{10}, d_{20}]$) with the silicon oxide film having a thickness of more than 45 nm to 55 nm; the minimum reflectance can be obtained at 17 points (17 combinations of $[n_{10}, n_{20}, k_{10}, k_{20}, d_{10}, d_{20}]$) with the silicon oxide film having a thickness of more than 55 nm to 65 nm; the minimum reflectance can be obtained at 16 points (16 combinations of $[n_{10}, n_{20}, k_{10}, k_{20}, d_{10}, d_{20}]$) with the silicon oxide film having a thickness of more than 65 nm to 75 nm; the minimum reflectance can be obtained at 16 points (15 combinations of $[n_{10}, n_{20}, k_{10}, k_{20}, d_{10}, d_{20}]$) with the silicon oxide film having a thickness of more than 75 nm to 85 nm; the minimum reflectance can be obtained at 23 points (23 combinations of $[n_{10}, n_{20}, k_{10}, k_{20}, d_{10}, d_{20}]$) with the silicon oxide film having a thickness of more than 85 nm to 95 nm; the minimum reflectance can be obtained at 15 points (15 combinations of $[n_{10}, n_{20}, k_{10}, k_{20}, d_{10}, d_{20}]$) with the silicon oxide film having a thickness of more than 95 nm to 105 nm; the minimum reflectance can be obtained at 13 points (13 combinations of $[n_{10}, n_{20}, k_{10}, k_{20}, d_{10}, d_{20}]$) with the silicon oxide film having a thickness of more than 105 nm to 115 nm; the minimum reflectance can be obtained at 12 points (12 combinations of $[n_{10}, n_{20}, k_{10}, k_{20}, d_{10}, d_{20}]$) with the silicon oxide film having a thickness of more than 115 nm to 125 nm; the minimum reflectance can be obtained at 12 points (12 combinations of $[n_{10}, n_{20}, k_{10}, k_{20}, d_{10}, d_{20}]$) with the silicon oxide film having a thickness of more than 125 nm to 135 nm; the minimum reflectance can be obtained at 12 points (12 combinations of $[n_{10}, n_{20}, k_{10}, k_{20}, d_{10}, d_{20}]$) with the silicon oxide film having a thickness of more than 135 nm to 145 nm; the minimum reflectance can be obtained at 13 points (13 combinations of $[n_{10}, n_{20}, k_{10}, k_{20}, d_{10}, d_{20}]$) with the silicon oxide film having a thickness of more than 145 nm to 155 nm; the minimum reflectance can be obtained at 14 points (14 combinations of $[n_{10}, n_{20}, k_{10}, k_{20}, d_{10}, d_{20}]$) with the silicon oxide film having a thickness of more than 155 nm to 165 nm; the minimum reflectance can be obtained at 13 points (13 combinations of $[n_{10}, n_{20}, k_{10}, k_{20}, d_{10}, d_{20}]$) with the silicon oxide film having a thickness of more than 165 nm to 175 nm; the minimum reflectance can be obtained at 13 points (13 combinations of $[n_{10}, n_{20}, k_{10}, k_{20}, d_{10}, d_{20}]$) with the silicon oxide film having a thickness of more than 175 nm to 185 nm; the minimum reflectance can be obtained at 15 points (15 combinations of $[n_{10}, n_{20}, k_{10}, k_{20}, d_{10}, d_{20}]$) with the silicon oxide film having a thickness of more than 185 nm to 195 nm; and the minimum reflectance can be obtained at 13 points (13 combinations of $[n_{10}, n_{20}, k_{10}, k_{20}, d_{10}, d_{20}]$) with the silicon oxide film having a thickness of more than 195 nm to 205 nm.

Furthermore, under the above-mentioned conditions, when the numerical aperture NA is $1.0 < NA \leqq 1.1$, the minimum reflectance can be obtained at 24 points (24 combinations of $[n_{10}, n_{20}, k_{10}, k_{20}, d_{10}, d_{20}]$) with the silicon oxide film having a thickness of 2 nm to 15 nm; the minimum reflectance can be obtained at 22 points (22 combinations of $[n_{10}, n_{20}, k_{10}, k_{20}, d_{10}, d_{20}]$) with the silicon oxide film having a thickness of more than 15 nm to 25 nm; the minimum reflectance can be obtained at 16 points (16 combinations of $[n_{10}, n_{20}, k_{10}, k_{20}, d_{10}, d_{20}]$) with the silicon oxide film having a thickness of more than 25 nm to 35 nm; the minimum reflectance can be obtained at 14 points (14 combinations of $[n_{10}, n_{20}, k_{10}, k_{20}, d_{10}, d_{20}]$) with the silicon oxide film having a thickness of more than 35 nm to 45 nm; the minimum reflectance can be obtained at 14 points (14 combinations of $[n_{10}, n_{20}, k_{10}, k_{20}, d_{10}, d_{20}]$) with the silicon oxide film having a thickness of more than 45 nm to 55 nm; the minimum reflectance can be obtained at 16 points (16 combinations of $[n_{10}, n_{20}, k_{10}, k_{20}, d_{10}, d_{20}]$) with the silicon oxide film having a thickness of more than 55 nm to 65 nm; the minimum reflectance can be obtained at 16 points (16 combinations of $[n_{10}, n_{20}, k_{10}, k_{20}, d_{10}, d_{20}]$) with the silicon oxide film having a thickness of more than 65 nm to 75 nm; the minimum reflectance can be obtained at 17 points (17 combinations of $[n_{10}, n_{20}, k_{10}, k_{20}, d_{10}, d_{20}]$) with the silicon oxide film having a thickness of more than 75 nm to 85 nm; the minimum reflectance can be obtained at 15 points (15 combinations of $[n_{10}, n_{20}, k_{10}, k_{20}, d_{10}, d_{20}]$) with the silicon oxide film having a thickness of more than 85 nm to 95 nm; the minimum reflectance can be obtained at 13 points (13 combinations of $[n_{10}, n_{20}, k_{10}, k_{20}, d_{10}, d_{20}]$) with the silicon oxide film having a thickness of more than 95 nm to 105 nm; the minimum reflectance can be obtained at 12 points (12 combinations of $[n_{10}, n_{20}, k_{10}, k_{20}, d_{10}, d_{20}]$) with the silicon oxide film having a thickness of more than 105 nm to 115 nm; the minimum reflectance can be obtained at 13 points (13 combinations of $[n_{10}, n_{20}, k_{10}, k_{20}, d_{10}, d_{20}]$) with the silicon oxide film having a thickness of more than 115 nm to 125 nm; the minimum reflectance can be obtained at 11 points (11 combinations of $[n_{10}, n_{20}, k_{10}, k_{20}, d_{10}, d_{20}]$) with the silicon oxide film having a thickness of more than 125 nm to 135 nm; the minimum reflectance can be obtained at 12 points (12 combinations of $[n_{10}, n_{20}, k_{10}, k_{20}, d_{10}, d_{20}]$) with the silicon oxide film having a thickness of more than 135 nm to 145 nm; the minimum reflectance can be obtained at 12 points (12 combinations of $[n_{10}, n_{20}, k_{10}, k_{20}, d_{10}, d_{20}]$) with the silicon oxide film having a thickness of more than 145 nm to 155 nm; the minimum reflectance can be obtained at 12 points (12 combinations of $[n_{10}, n_{20}, k_{10}, k_{20}, d_{10}, d_{20}]$) with the silicon oxide film having a thickness of more than 155 nm to 165 nm; the minimum reflectance can be obtained at 12 points (12 combinations of $[n_{10}, n_{20}, k_{10}, k_{20}, d_{10}, d_{20}]$) with the silicon oxide film having a thickness of more than 165 nm to 175 nm; the minimum reflectance can be obtained at 10 points (10 combinations of $[n_{10}, n_{20}, k_{10}, k_{20}, d_{10}, d_{20}]$) with the silicon oxide film having a thickness of more than 175 nm to 185 nm; the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of more than 185 nm to 195 nm; and the minimum reflectance can be obtained at 12 points (12 combinations of [$n_{10}$, $n_{20}$, $k_{10}$, $k_{20}$, $d_{10}$, $d_{20}$]) with the silicon oxide film having a thickness of more than 195 nm to 205 nm.

Furthermore, under the above-mentioned conditions, when the numerical aperture NA is $1.1<NA\leqq 1.2$, the minimum reflectance can be obtained at 19 points (19 combinations of [$n_{10}$, $n_{20}$, $k_{10}$, $k_{20}$, $d_{10}$, $d_{20}$]) with the silicon oxide film having a thickness of 2 nm to 15 nm; the minimum reflectance can be obtained at 17 points (17 combinations of [$n_{10}$, $n_{20}$, $k_{10}$, $k_{20}$, $d_{10}$, $d_{20}$]) with the silicon oxide film having a thickness of more than 15 nm to 25 nm; the minimum reflectance can be obtained at 14 points (14 combinations of [$n_{10}$, $n_{20}$, $k_{10}$, $k_{20}$, $d_{10}$, $d_{20}$]) with the silicon oxide film having a thickness of more than 25 nm to 35 nm; the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of more than 35 nm to 45 nm; the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of more than 45 nm to 55 nm; the minimum reflectance can be obtained at 12 points (12 combinations of [$n_{10}$, $n_{20}$, $k_{10}$, $k_{20}$, $d_{10}$, $d_{20}$]) with the silicon oxide film having a thickness of more than 55 nm to 65 nm; the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of more than 65 nm to 75 nm; the minimum reflectance can be obtained at 15 points (15 combinations of [$n_{10}$, $n_{20}$, $k_{10}$, $k_{20}$, $d_{10}$, $d_{20}$]) with the silicon oxide film having a thickness of more than 75 nm to 85 nm; the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of more than 85 nm to 95 nm; the minimum reflectance can be obtained at 12 points (12 combinations of [$n_{10}$, $n_{20}$, $k_{10}$, $k_{20}$, $d_{10}$, $d_{20}$]) with the silicon oxide film having a thickness of more than 95 nm to 105 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 105 nm to 115 nm; the minimum reflectance can be obtained at 10 points (10 combinations of [$n_{10}$, $n_{20}$, $k_{10}$, $k_{20}$, $d_{10}$, $d_{20}$]) with the silicon oxide film having a thickness of more than 115 nm to 125 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 125 nm to 135 nm; the minimum reflectance can be obtained at 10 points (10 combinations of [$n_{10}$, $n_{20}$, $k_{10}$, $k_{20}$, $d_{10}$, $d_{20}$]) with the silicon oxide film having a thickness of more than 135 nm to 145 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 145 nm to 155 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 155 nm to 165 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 165 nm to 175 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 175 nm to 185 nm; the minimum reflectance can be obtained at 10 points (10 combinations of [$n_{10}$, $n_{20}$, $k_{10}$, $k_{20}$, $d_{10}$, $d_{20}$]) with the silicon oxide film having a thickness of more than 185 nm to 195 nm; and the minimum reflectance can be obtained at 11 points (11 combinations of [$n_{10}$, $n_{20}$, $k_{10}$, $k_{20}$, $d_{10}$, $d_{20}$]) with the silicon oxide film having a thickness of more than 195 nm to 205 nm.

In addition, under the above-mentioned conditions, when the numerical aperture NA is $1.2<NA\leqq 1.3$, the minimum reflectance can be obtained at 13 points (13 combinations of [$n_{10}$, $n_{20}$, $k_{10}$, $k_{20}$, $d_{10}$, $d_{20}$]) with the silicon oxide film having a thickness of 2 nm to 15 nm; the minimum reflectance can be obtained at 10 points (10 combinations of [$n_{10}$, $n_{20}$, $k_{10}$, $k_{20}$, $d_{10}$, $d_{20}$]) with the silicon oxide film having a thickness of more than 15 nm to 25 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 25 nm to 35 nm; the minimum reflectance can be obtained at 9 points (9 combinations of [$n_{10}$, $n_{20}$, $k_{10}$, $k_{20}$, $d_{10}$, $d_{20}$]) with the silicon oxide film having a thickness of more than 35 nm to 45 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 45 nm to 55 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 55 nm to 65 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 65 nm to 75 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 75 nm to 85 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 85 nm to 95 nm; the minimum reflectance can be obtained at 6 points (6 combinations of [$n_{10}$, $n_{20}$, $k_{10}$, $k_{20}$, $d_{10}$, $d_{20}$]) with the silicon oxide film having a thickness of more than 95 nm to 105 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 105 nm to 115 nm; the minimum reflectance can be obtained at 8 points (8 combinations of [$n_{10}$, $n_{20}$, $k_{10}$, $k_{20}$, $d_{10}$, $d_{20}$]) with the silicon oxide film having a thickness of more than 115 nm to 125 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 125 nm to 135 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 135 nm to 145 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 145 nm to 155 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 155 nm to 165 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 165 nm to 175 nm; the minimum reflectance can be obtained at 5 points (5 combinations of [$n_{10}$, $n_{20}$, $k_{10}$, $k_{20}$, $d_{10}$, $d_{20}$]) with the silicon oxide film having a thickness of more than 175 nm to 185 nm; the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 185 nm to 195 nm; and the minimum reflectance can be obtained at 7 points (7 combinations of [$n_{10}$, $n_{20}$, $k_{10}$, $k_{20}$, $d_{10}$, $d_{20}$]) with the silicon oxide film having a thickness of more than 195 nm to 205 nm.

Furthermore, under the above-mentioned conditions, when the numerical aperture NA is $1.3<NA\leqq 1.4$, the minimum reflectance can be obtained at 11 points (11 combinations of $[n_{10}, n_{20}, k_{10}, k_{20}, d_{10}, d_{20}]$) with the silicon oxide film having a thickness of 2 nm to 15 nm; the minimum reflectance can be obtained at 10 points (10 combinations of $[n_{10}, n_{20}, k_{10}, k_{20}, d_{10}, d_{20}]$) with the silicon oxide film having a thickness of more than 15 nm to 25 nm; the minimum reflectance can be obtained at 6 points (6 combinations of $[n_{10}, n_{20}, k_{10}, k_{20}, d_{10}, d_{20}]$) with the silicon oxide film having a thickness of more than 25 nm to 35 nm; the minimum reflectance can be obtained at 7 points (7 combinations of $[n_{10}, n_{20}, k_{10}, k_{20}, d_{10}, d_{20}]$) with the silicon oxide film having a thickness of more than 35 nm to 45 nm; the minimum reflectance can be obtained at 7 points (7 combinations of $[n_{10}, n_{20}, k_{10}, k_{20}, d_{10}, d_{20}]$) with the silicon oxide film having a thickness of more than 45 nm to 55 nm; the minimum reflectance can be obtained at 6 points (6 combinations of $[n_{10}, n_{20}, k_{10}, k_{20}, d_{10}, d_{20}]$) with the silicon oxide film having a thickness of more than 55 nm to 65 nm; the minimum reflectance can be obtained at 7 points (7 combinations of $[n_{10}, n_{20}, k_{10}, k_{20}, d_{10}, d_{20}]$) with the silicon oxide film having a thickness of more than 65 nm to 75 nm; the minimum reflectance can be obtained at 7 points (7 combinations of $[n_{10}, n_{20}, k_{10}, k_{20}, d_{10}, d_{20}]$) with the silicon oxide film having a thickness of more than 75 nm to 85 nm; the minimum reflectance can be obtained at 6 points (6 combinations of $[n_{10}, n_{20}, k_{10}, k_{20}, d_{10}, d_{20}]$) with the silicon oxide film having a thickness of more than 85 nm to 95 nm; the minimum reflectance can be obtained at 6 points (6 combinations of $[n_{10}, n_{20}, k_{10}, k_{20}, d_{10}, d_{20}]$) with the silicon oxide film having a thickness of more than 95 nm to 105 nm; the minimum reflectance can be obtained at 5 points (5 combinations of $[n_{10}, n_{20}, k_{10}, k_{20}, d_{10}, d_{20}]$) with the silicon oxide film having a thickness of more than 105 nm to 115 nm; the minimum reflectance can be obtained at 7 points (7 combinations of $[n_{10}, n_{20}, k_{10}, k_{20}, d_{10}, d_{20}]$) with the silicon oxide film having a thickness of more than 115 nm to 125 nm; the minimum reflectance can be obtained at 7 points (7 combinations of $[n_{10}, n_{20}, k_{10}, k_{20}, d_{10}, d_{20}]$) with the silicon oxide film having a thickness of more than 125 nm to 135 nm; the minimum reflectance can be obtained at 6 points (6 combinations of $[n_{10}, n_{20}, k_{10}, k_{20}, d_{10}, d_{20}]$) with the silicon oxide film having a thickness of more than 135 nm to 145 nm; the minimum reflectance can be obtained at 6 points (6 combinations of $[n_{10}, n_{20}, k_{10}, k_{20}, d_{10}, d_{20}]$) with the silicon oxide film having a thickness of more than 145 nm to 155 nm; the minimum reflectance can be obtained at 6 points (6 combinations of $[n_{10}, n_{20}, k_{10}, k_{20}, d_{10}, d_{20}]$) with the silicon oxide film having a thickness of more than 155 nm to 165 nm; the minimum reflectance can be obtained at 4 points (4 combinations of $[n_{10}, n_{20}, k_{10}, k_{20}, d_{10}, d_{20}]$) with the silicon oxide film having a thickness of more than 165 nm to 175 nm; the minimum reflectance can be obtained at 5 points (5 combinations of $[n_{10}, n_{20}, k_{10}, k_{20}, d_{10}, d_{20}]$) with the silicon oxide film having a thickness of more than 175 nm to 185 nm; the minimum reflectance can be obtained at 7 points (7 combinations of $[n_{10}, n_{20}, k_{10}, k_{20}, d_{10}, d_{20}]$) with the silicon oxide film having a thickness of more than 185 nm to 195 nm; and the minimum reflectance can be obtained at 6 points (6 combinations of $[n_{10}, n_{20}, k_{10}, k_{20}, d_{10}, d_{20}]$) with the silicon oxide film having a thickness of more than 195 nm to 205 nm.

TABLE 1-A

| Case | $n_{10}$ | $k_{10}$ | $d_{10}$ | $n_{20}$ | $k_{20}$ | $d_{20}$ |
|---|---|---|---|---|---|---|
| A-01 | 2.0730313 | 0.1156327 | 23.933 | 2.6749484 | 1.5695754 | 9.886 |
| A-02 | 1.8546637 | 0.1676093 | 29.838 | 2.1886012 | 0.6118019 | 59.764 |
| A-03 | 1.8612247 | 0.1278895 | 20.208 | 1.8193379 | 0.4029416 | 139.994 |

TABLE 1-A-continued

| Case | $n_{10}$ | $k_{10}$ | $d_{10}$ | $n_{20}$ | $k_{20}$ | $d_{20}$ |
|---|---|---|---|---|---|---|
| A-04 | 1.8595613 | 0.0953387 | 19.978 | 1.8569207 | 0.3273808 | 190.296 |
| A-05 | 1.7706199 | 0.0916054 | 91.022 | 1.9614270 | 0.4555299 | 69.218 |
| A-06 | 1.7659509 | 0.0861113 | 89.673 | 1.8683083 | 0.3142437 | 129.384 |
| A-07 | 1.7540284 | 0.0810034 | 89.258 | 1.7976000 | 0.2440877 | 193.603 |
| A-08 | 1.7206295 | 0.0765846 | 163.688 | 2.0072987 | 0.9099501 | 15.109 |
| A-09 | 1.7312076 | 0.0743303 | 158.443 | 1.9328063 | 0.4029485 | 69.389 |
| A-10 | 1.7317652 | 0.0746087 | 156.047 | 1.8225538 | 0.2736014 | 132.296 |
| A-11 | 1.7235310 | 0.0712769 | 155.759 | 1.7500411 | 0.2147794 | 197.972 |
| A-12 | 1.7093992 | 0.0595462 | 237.275 | 5.0249130 | 2.4786958 | 1.776 |
| A-13 | 1.7192548 | 0.0668813 | 223.222 | 1.9244861 | 0.3767470 | 68.925 |
| A-14 | 1.7183512 | 0.0690717 | 220.755 | 1.7884626 | 0.2530536 | 134.430 |
| A-15 | 1.7097773 | 0.0638868 | 221.916 | 1.7175992 | 0.2031308 | 199.649 |

TABLE 1-B

| Case | $n_{10}$ | $k_{10}$ | $d_{10}$ | $n_{20}$ | $k_{20}$ | $d_{20}$ |
|---|---|---|---|---|---|---|
| B-01 | 1.8890717 | 0.2231211 | 31.297 | 2.2536461 | 1.9138327 | 8.426 |
| B-02 | 1.8040788 | 0.2224671 | 38.783 | 3.4285504 | 0.7115044 | 30.090 |
| B-03 | 1.8569330 | 0.1887211 | 31.358 | 2.3482559 | 0.7139401 | 49.395 |
| B-04 | 1.8246631 | 0.1852786 | 29.866 | 2.0267942 | 0.6589875 | 61.419 |
| B-05 | 1.8713633 | 0.1359350 | 20.765 | 1.8449284 | 0.4410677 | 129.533 |
| B-06 | 1.8537764 | 0.1095380 | 19.190 | 1.8083352 | 0.3385915 | 190.096 |
| B-07 | 1.8773918 | 0.0811836 | 15.072 | 1.7885130 | 0.2812935 | 250.952 |
| B-08 | 1.7913209 | 0.1069315 | 93.104 | 2.1120296 | 1.5705728 | 8.709 |
| B-09 | 1.7961812 | 0.0967122 | 91.592 | 2.2985234 | 0.5621108 | 49.876 |
| B-10 | 1.7719309 | 0.0907051 | 89.644 | 1.8982310 | 0.3437292 | 119.550 |
| B-11 | 1.7573553 | 0.0844391 | 89.273 | 1.8090385 | 0.2599016 | 184.203 |
| B-12 | 1.7321027 | 0.0771807 | 89.432 | 1.7181480 | 0.2108133 | 254.601 |
| B-13 | 1.7251448 | 0.0782108 | 166.474 | 2.6560327 | 2.0752579 | 4.495 |
| B-14 | 1.7347815 | 0.0789970 | 158.854 | 2.0166404 | 0.4697089 | 58.957 |
| B-15 | 1.7337052 | 0.0782079 | 156.164 | 1.8413069 | 0.2975845 | 122.955 |
| B-16 | 1.7245076 | 0.0739010 | 155.712 | 1.7533528 | 0.2275719 | 189.273 |
| B-17 | 1.7100620 | 0.0639207 | 155.553 | 1.6863114 | 0.1891021 | 256.528 |
| B-18 | 1.7130788 | 0.0658962 | 233.281 | 3.3653368 | 2.7431658 | 2.501 |
| B-19 | 1.7208745 | 0.0708686 | 223.560 | 1.9877972 | 0.4366658 | 59.393 |
| B-20 | 1.7192161 | 0.0720786 | 220.745 | 1.7983405 | 0.2740582 | 125.643 |
| B-21 | 1.7100814 | 0.0661341 | 221.783 | 1.7179584 | 0.2146738 | 191.114 |
| B-22 | 1.7028062 | 0.0572529 | 219.613 | 1.6741304 | 0.1784680 | 256.090 |

TABLE 1-C

| Case | $n_{10}$ | $k_{10}$ | $d_{10}$ | $n_{20}$ | $k_{20}$ | $d_{20}$ |
|---|---|---|---|---|---|---|
| C-01 | 1.7462297 | 0.2650661 | 38.584 | 1.8811342 | 2.5474890 | 6.719 |
| C-02 | 1.7852920 | 0.2379686 | 38.995 | 3.2453891 | 0.8215227 | 29.990 |
| C-03 | 1.8064124 | 0.2063789 | 31.400 | 2.0415396 | 0.7493942 | 55.163 |
| C-04 | 1.8761841 | 0.1465026 | 22.050 | 1.8871554 | 0.4863835 | 118.487 |
| C-05 | 1.8732427 | 0.1107685 | 18.888 | 1.8328297 | 0.3644393 | 179.928 |
| C-06 | 1.8809997 | 0.0844859 | 15.636 | 1.8003278 | 0.2965881 | 241.202 |
| C-07 | 1.8353407 | 0.1336488 | 86.851 | 1.6000470 | 1.7695220 | 10.059 |
| C-08 | 1.8107063 | 0.1074834 | 91.200 | 2.5616901 | 0.6655713 | 40.111 |
| C-09 | 1.7800259 | 0.0966903 | 89.638 | 1.9474319 | 0.3779800 | 109.424 |
| C-10 | 1.7589519 | 0.0885227 | 89.033 | 1.8081258 | 0.2753975 | 177.335 |
| C-11 | 1.7385561 | 0.0961686 | 161.111 | 1.8448216 | 2.2148249 | 5.861 |
| C-12 | 1.7392392 | 0.0859424 | 158.474 | 2.1008270 | 0.5469970 | 50.862 |
| C-13 | 1.7355979 | 0.0828161 | 155.982 | 1.8545146 | 0.3232472 | 115.179 |
| C-14 | 1.7252169 | 0.0770491 | 155.656 | 1.7550901 | 0.2413910 | 181.353 |
| C-15 | 1.7185486 | 0.0788457 | 229.847 | 3.2610273 | 4.4183916 | 1.558 |
| C-16 | 1.7228369 | 0.0769315 | 222.858 | 2.0210736 | 0.5011654 | 62.892 |
| C-17 | 1.7199449 | 0.0760859 | 220.491 | 1.8037789 | 0.2965908 | 118.134 |
| C-18 | 1.7101979 | 0.0687675 | 221.639 | 1.7165312 | 0.2274377 | 183.246 |

TABLE 1-D

| Case | $n_{10}$ | $k_{10}$ | $d_{10}$ | $n_{20}$ | $k_{20}$ | $d_{20}$ |
|---|---|---|---|---|---|---|
| D-01 | 1.8047095 | 0.2694194 | 36.421 | 2.9911125 | 1.0218786 | 30.087 |
| D-02 | 1.8098021 | 0.2379756 | 31.711 | 2.1295160 | 0.9059492 | 46.199 |
| D-03 | 1.8915289 | 0.1677232 | 26.420 | 2.1348336 | 0.5678980 | 93.459 |

TABLE 1-D-continued

| Case | $n_{10}$ | $k_{10}$ | $d_{10}$ | $n_{20}$ | $k_{20}$ | $d_{20}$ |
|---|---|---|---|---|---|---|
| D-04 | 1.8869810 | 0.1583242 | 22.598 | 1.9270572 | 0.5352831 | 108.068 |
| D-05 | 1.8679863 | 0.1633407 | 22.571 | 1.8682373 | 0.5190358 | 112.596 |
| D-06 | 1.8894047 | 0.1134244 | 18.623 | 1.8513003 | 0.3877744 | 170.528 |
| D-07 | 1.9013640 | 0.0821095 | 14.880 | 1.8106171 | 0.3102506 | 232.433 |
| D-08 | 1.7974174 | 0.1211843 | 88.331 | 2.0615819 | 0.7049601 | 48.141 |
| D-09 | 1.7778270 | 0.1038067 | 88.747 | 1.9023003 | 0.4013081 | 106.512 |
| D-10 | 1.7589001 | 0.0931193 | 88.775 | 1.8006679 | 0.2880356 | 170.885 |
| D-11 | 1.7310401 | 0.0827558 | 89.146 | 1.7041670 | 0.2282102 | 240.157 |
| D-12 | 1.7404520 | 0.0960720 | 155.339 | 1.9461112 | 0.5942640 | 50.887 |
| D-13 | 1.7353985 | 0.0882239 | 154.960 | 1.8293633 | 0.3421815 | 110.529 |
| D-14 | 1.7244370 | 0.0802890 | 155.397 | 1.7457172 | 0.2519901 | 174.646 |
| D-15 | 1.7094852 | 0.0677575 | 155.056 | 1.6751093 | 0.2044537 | 241.084 |
| D-16 | 1.7305468 | 0.1083688 | 224.105 | 3.7612310 | 9.7520181 | 0.557 |
| D-17 | 1.7234847 | 0.0859582 | 219.529 | 1.8940064 | 0.5381566 | 52.122 |
| D-18 | 1.7196555 | 0.0809985 | 219.492 | 1.7865237 | 0.3130643 | 112.555 |
| D-19 | 1.7094719 | 0.0713058 | 221.454 | 1.7085534 | 0.2375210 | 175.858 |
| D-20 | 1.7026367 | 0.0605694 | 219.016 | 1.6670562 | 0.1929642 | 239.742 |

TABLE 1-E

| Case | $n_{10}$ | $k_{10}$ | $d_{10}$ | $n_{20}$ | $k_{20}$ | $d_{20}$ |
|---|---|---|---|---|---|---|
| E-01 | 1.7952075 | 0.2631488 | 28.407 | 1.7975159 | 0.9080589 | 49.215 |
| E-02 | 1.8907711 | 0.1709411 | 22.060 | 1.9054700 | 0.5625340 | 101.512 |
| E-03 | 1.9054716 | 0.1139096 | 18.051 | 1.8637077 | 0.4032117 | 161.182 |
| E-04 | 1.9347861 | 0.0660701 | 14.149 | 1.8512928 | 0.3248351 | 218.499 |
| E-05 | 1.9562331 | 0.1018371 | 10.504 | 1.7371318 | 0.3049135 | 238.789 |
| E-06 | 1.7844085 | 0.1367381 | 84.299 | 1.7096132 | 0.6495191 | 54.242 |
| E-07 | 1.7702622 | 0.1105738 | 87.211 | 1.8115599 | 0.4022198 | 106.122 |
| E-08 | 1.7541370 | 0.0973387 | 88.132 | 1.7670571 | 0.2903421 | 167.020 |
| E-09 | 1.7279592 | 0.0846136 | 88.943 | 1.6883751 | 0.2308596 | 233.281 |
| E-10 | 1.7375980 | 0.1054836 | 150.710 | 1.7055974 | 0.5608974 | 53.799 |
| E-11 | 1.7329681 | 0.0932680 | 153.145 | 1.7707311 | 0.3436851 | 107.979 |
| E-12 | 1.7221048 | 0.0829100 | 154.966 | 1.7249696 | 0.2554267 | 168.643 |
| E-13 | 1.7083331 | 0.0687145 | 154.712 | 1.6656993 | 0.2071468 | 233.037 |
| E-14 | 1.7220084 | 0.0940320 | 214.741 | 1.7051250 | 0.5097600 | 53.504 |
| E-15 | 1.7182277 | 0.0857940 | 217.589 | 1.7452872 | 0.3145186 | 108.615 |
| E-16 | 1.7079026 | 0.0731017 | 221.285 | 1.6934483 | 0.2412999 | 168.585 |
| E-17 | 1.7021324 | 0.0613637 | 218.642 | 1.6620357 | 0.1957858 | 230.920 |

TABLE 1-F

| Case | $n_{10}$ | $k_{10}$ | $d_{10}$ | $n_{20}$ | $k_{20}$ | $d_{20}$ |
|---|---|---|---|---|---|---|
| F-01 | 1.7605068 | 0.2771672 | 28.706 | 1.6786286 | 0.9008770 | 43.735 |
| F-02 | 1.8816347 | 0.1829378 | 20.725 | 1.8151288 | 0.5496963 | 99.755 |
| F-03 | 1.9020430 | 0.1268282 | 16.538 | 1.7976518 | 0.3935708 | 160.685 |
| F-04 | 1.9458467 | 0.0703715 | 13.048 | 1.8275971 | 0.3251874 | 213.311 |
| F-05 | 1.9584022 | 0.1032605 | 10.534 | 1.7382432 | 0.3086817 | 229.129 |
| F-06 | 1.7915017 | 0.1460711 | 82.108 | 1.6599684 | 0.6598461 | 47.036 |
| F-07 | 1.7682864 | 0.1152280 | 86.246 | 1.7730752 | 0.3999868 | 100.473 |
| F-08 | 1.7517777 | 0.1000283 | 87.803 | 1.7495420 | 0.2902721 | 159.986 |
| F-09 | 1.7257399 | 0.0854213 | 88.823 | 1.6774661 | 0.2313191 | 224.881 |
| F-10 | 1.7391311 | 0.1111219 | 148.271 | 1.6415570 | 0.5493559 | 47.977 |
| F-11 | 1.7320844 | 0.0968192 | 152.055 | 1.7411899 | 0.3409343 | 101.751 |
| F-12 | 1.7076855 | 0.0689521 | 154.586 | 1.6612710 | 0.2081961 | 223.547 |
| F-13 | 1.7203924 | 0.0842770 | 154.911 | 1.7118542 | 0.2561923 | 160.544 |
| F-14 | 1.7223192 | 0.0985051 | 212.081 | 1.6387426 | 0.4904233 | 48.284 |
| F-15 | 1.7173463 | 0.0890019 | 216.420 | 1.7205682 | 0.3116849 | 102.035 |
| F-16 | 1.7068337 | 0.0738736 | 221.446 | 1.6845656 | 0.2425094 | 159.621 |
| F-17 | 1.7019545 | 0.0615388 | 218.498 | 1.6606500 | 0.1970435 | 220.941 |

TABLE 1-G

| Case | $n_{10}$ | $k_{10}$ | $d_{10}$ | $n_{20}$ | $k_{20}$ | $d_{20}$ |
|---|---|---|---|---|---|---|
| G-01 | 1.7659038 | 0.3040912 | 29.683 | 1.6951746 | 1.0159152 | 32.660 |
| G-02 | 1.8645399 | 0.1945245 | 22.504 | 1.8232494 | 0.5745287 | 88.735 |
| G-03 | 1.8986420 | 0.1330684 | 17.099 | 1.7981378 | 0.4053118 | 150.314 |
| G-04 | 1.9431410 | 0.1068639 | 11.420 | 1.7406778 | 0.3159076 | 217.432 |

TABLE 1-G-continued

| Case | $n_{10}$ | $k_{10}$ | $d_{10}$ | $n_{20}$ | $k_{20}$ | $d_{20}$ |
|---|---|---|---|---|---|---|
| G-05 | 1.8260230 | 0.1610409 | 82.141 | 1.8123655 | 0.8416018 | 29.750 |
| G-06 | 1.7771488 | 0.1183021 | 86.874 | 1.8193233 | 0.4301648 | 86.325 |
| G-07 | 1.7544343 | 0.1010010 | 88.257 | 1.7618403 | 0.3008540 | 147.888 |
| G-08 | 1.7270080 | 0.0859818 | 88.900 | 1.6808707 | 0.2360835 | 214.142 |
| G-09 | 1.7474077 | 0.1187907 | 148.872 | 1.6925268 | 0.6251022 | 34.244 |
| G-10 | 1.7344421 | 0.0986199 | 153.031 | 1.7617910 | 0.3597954 | 89.143 |
| G-11 | 1.7082851 | 0.0693971 | 154.668 | 1.6632564 | 0.2120421 | 213.175 |
| G-12 | 1.7212227 | 0.0845898 | 155.411 | 1.7183974 | 0.2642962 | 149.129 |
| G-13 | 1.7256274 | 0.1038247 | 212.824 | 1.6530934 | 0.5317369 | 36.133 |
| G-14 | 1.7180408 | 0.0895343 | 218.202 | 1.7315716 | 0.3280557 | 89.506 |
| G-15 | 1.7074443 | 0.0742263 | 221.707 | 1.6896767 | 0.2496384 | 148.627 |
| G-16 | 1.7023147 | 0.0619030 | 218.598 | 1.6620389 | 0.2005572 | 210.752 |

TABLE 1-H

| Case | $n_{10}$ | $k_{10}$ | $d_{10}$ | $n_{20}$ | $k_{20}$ | $d_{20}$ |
|---|---|---|---|---|---|---|
| H-01 | 1.7563588 | 0.3324096 | 35.374 | 1.9274523 | 1.4642575 | 17.251 |
| H-02 | 1.8511230 | 0.2092311 | 25.991 | 1.9063465 | 0.6506745 | 73.686 |
| H-03 | 1.8843188 | 0.1443736 | 18.736 | 1.8018968 | 0.4300566 | 139.851 |
| H-04 | 1.9287462 | 0.1105115 | 12.655 | 1.7494498 | 0.3311673 | 205.772 |
| H-05 | 1.8353218 | 0.1759033 | 87.389 | 2.1171648 | 1.3140425 | 13.979 |
| H-06 | 1.7950810 | 0.1221034 | 88.670 | 1.9787137 | 0.5126318 | 67.257 |
| H-07 | 1.7627960 | 0.1022278 | 88.862 | 1.8048095 | 0.3274205 | 133.479 |
| H-08 | 1.7313791 | 0.0877850 | 88.999 | 1.6945552 | 0.2478313 | 202.902 |
| H-09 | 1.7608801 | 0.1266208 | 153.509 | 1.9275665 | 0.9887124 | 15.987 |
| H-10 | 1.7394221 | 0.0996664 | 155.305 | 1.8479873 | 0.4176577 | 72.839 |
| H-11 | 1.7245671 | 0.0857616 | 155.774 | 1.7414131 | 0.2835597 | 136.971 |
| H-12 | 1.7098549 | 0.0711157 | 154.844 | 1.6689951 | 0.2212317 | 203.148 |
| H-13 | 1.7314445 | 0.1087664 | 218.242 | 1.7862714 | 0.7962122 | 18.394 |
| H-14 | 1.7204815 | 0.0894136 | 220.453 | 1.7885409 | 0.3769446 | 74.763 |
| H-15 | 1.7093097 | 0.0755678 | 221.580 | 1.7021793 | 0.2655853 | 137.968 |
| H-16 | 1.7029357 | 0.0634027 | 218.717 | 1.6626290 | 0.2083407 | 201.624 |

TABLE 1-I

| Case | $n_{10}$ | $k_{10}$ | $d_{10}$ | $n_{20}$ | $k_{20}$ | $d_{20}$ |
|---|---|---|---|---|---|---|
| I-01 | 1.7289685 | 0.3314086 | 44.247 | 5.1412592 | 5.4454539 | 1.484 |
| I-02 | 1.8452520 | 0.2255929 | 26.855 | 1.9037614 | 0.7221490 | 66.898 |
| I-03 | 1.8988873 | 0.1475831 | 20.944 | 1.8997324 | 0.4893775 | 122.094 |
| I-04 | 1.8877112 | 0.1535471 | 19.669 | 1.8220692 | 0.4687151 | 129.650 |
| I-05 | 1.9267904 | 0.0947520 | 15.612 | 1.8437835 | 0.3693724 | 183.529 |
| I-06 | 1.9311024 | 0.1132645 | 13.318 | 1.7624681 | 0.3523973 | 195.472 |
| I-07 | 1.9377300 | 0.0882760 | 11.094 | 1.7478213 | 0.2927773 | 252.908 |
| I-08 | 1.8321358 | 0.1783607 | 92.959 | 3.8484718 | 3.7040697 | 2.442 |
| I-09 | 1.8340055 | 0.1409526 | 90.549 | 2.7003837 | 0.6754163 | 40.010 |
| I-10 | 1.7711711 | 0.1059247 | 89.053 | 1.8505388 | 0.3612112 | 121.432 |
| I-11 | 1.7360863 | 0.0911204 | 88.900 | 1.7067614 | 0.2637604 | 192.941 |
| I-12 | 1.7197908 | 0.0799131 | 88.028 | 1.6618119 | 0.2120965 | 257.777 |
| I-13 | 1.7660895 | 0.1278221 | 159.319 | 4.3535883 | 4.0919379 | 1.526 |
| I-14 | 1.7439719 | 0.1032091 | 156.425 | 1.9650733 | 0.4980866 | 59.654 |
| I-15 | 1.7279356 | 0.0888807 | 155.640 | 1.7635448 | 0.3088945 | 126.749 |
| I-16 | 1.7114085 | 0.0740744 | 154.740 | 1.6716288 | 0.2338686 | 194.347 |
| I-17 | 1.7070625 | 0.0641745 | 153.245 | 1.6634512 | 0.1921909 | 254.410 |
| I-18 | 1.7347333 | 0.1100034 | 225.621 | 4.2666617 | 4.0109081 | 1.346 |
| I-19 | 1.7230132 | 0.0920219 | 220.898 | 1.8597675 | 0.4430799 | 63.229 |
| I-20 | 1.7111302 | 0.0786417 | 221.002 | 1.7127614 | 0.2870105 | 128.848 |
| I-21 | 1.7035342 | 0.0659797 | 218.617 | 1.6615801 | 0.2195726 | 193.289 |
| I-22 | 1.7027484 | 0.0572097 | 216.627 | 1.6695991 | 0.1821496 | 251.116 |
| I-23 | 1.7001226 | 0.0542621 | 277.695 | 1.6762439 | 0.1770375 | 248.521 |

TABLE 1-J

| Case | $n_{10}$ | $k_{10}$ | $d_{10}$ | $n_{20}$ | $k_{20}$ | $d_{20}$ |
|---|---|---|---|---|---|---|
| J-01 | 1.8593145 | 0.2496127 | 26.535 | 1.9155767 | 0.8329906 | 59.684 |
| J-02 | 1.9010800 | 0.1636004 | 19.815 | 1.8411706 | 0.5121692 | 120.535 |
| J-03 | 1.9204218 | 0.1149718 | 15.218 | 1.7975616 | 0.3794158 | 182.059 |
| J-04 | 1.9438629 | 0.1088618 | 10.610 | 1.7190727 | 0.2999844 | 250.015 |

TABLE 1-J-continued

| Case | $n_{10}$ | $k_{10}$ | $d_{10}$ | $n_{20}$ | $k_{20}$ | $d_{20}$ |
|---|---|---|---|---|---|---|
| J-05 | 1.8201241 | 0.1437532 | 89.353 | 2.3681639 | 0.7410526 | 43.212 |
| J-06 | 1.7719135 | 0.1119845 | 88.526 | 1.8420973 | 0.3885265 | 115.256 |
| J-07 | 1.7372876 | 0.0953951 | 88.555 | 1.7021944 | 0.2779787 | 185.353 |
| J-08 | 1.7204595 | 0.0830085 | 87.798 | 1.6574450 | 0.2209480 | 249.744 |
| J-09 | 1.7445424 | 0.1106490 | 155.347 | 1.9643384 | 0.5665503 | 53.939 |
| J-10 | 1.7286821 | 0.0936244 | 154.936 | 1.7602486 | 0.3317476 | 119.649 |
| J-11 | 1.7117780 | 0.0773392 | 154.355 | 1.6664488 | 0.2460450 | 186.501 |
| J-12 | 1.7072616 | 0.0664543 | 152.987 | 1.6597858 | 0.2000883 | 246.239 |
| J-13 | 1.7114074 | 0.0830146 | 220.011 | 1.7075466 | 0.3068810 | 121.613 |
| J-14 | 1.7035514 | 0.0688006 | 218.183 | 1.6565327 | 0.2307053 | 185.316 |
| J-15 | 1.7027912 | 0.0591414 | 216.340 | 1.6669294 | 0.1896158 | 242.803 |

TABLE 1-K

| Case | $n_{10}$ | $k_{10}$ | $d_{10}$ | $n_{20}$ | $k_{20}$ | $d_{20}$ |
|---|---|---|---|---|---|---|
| K-01 | 1.8881577 | 0.2795127 | 22.871 | 1.7550786 | 0.8705815 | 60.032 |
| K-02 | 1.9218914 | 0.1797398 | 17.442 | 1.7746647 | 0.5227186 | 119.813 |
| K-03 | 1.9458883 | 0.1322078 | 13.080 | 1.7478516 | 0.3833699 | 181.809 |
| K-04 | 1.9409291 | 0.1179060 | 10.849 | 1.7108849 | 0.3088835 | 241.776 |
| K-05 | 1.7882093 | 0.1515662 | 85.800 | 1.7933752 | 0.6703287 | 55.966 |
| K-06 | 1.7649059 | 0.1193411 | 87.339 | 1.7745734 | 0.3964773 | 113.800 |
| K-07 | 1.7337710 | 0.0996522 | 88.039 | 1.6760618 | 0.2847568 | 179.842 |
| K-08 | 1.7199633 | 0.0855558 | 87.477 | 1.6497564 | 0.2267213 | 241.489 |
| K-09 | 1.7259527 | 0.0989978 | 153.714 | 1.7204930 | 0.3415865 | 115.571 |
| K-10 | 1.7103936 | 0.0800216 | 153.726 | 1.6497935 | 0.2528816 | 179.482 |
| K-11 | 1.7070930 | 0.0681638 | 152.585 | 1.6551703 | 0.2055639 | 237.501 |
| K-12 | 1.7028018 | 0.0710148 | 217.506 | 1.6486663 | 0.2376270 | 177.429 |
| K-13 | 1.7027432 | 0.0605235 | 215.929 | 1.6646615 | 0.1950188 | 233.713 |

TABLE 1-L

| Case | $n_{10}$ | $k_{10}$ | $d_{10}$ | $n_{20}$ | $k_{20}$ | $d_{20}$ |
|---|---|---|---|---|---|---|
| L-01 | 1.8909431 | 0.3085424 | 20.418 | 1.5964478 | 0.8353138 | 60.909 |
| L-02 | 1.9524263 | 0.1909748 | 15.444 | 1.7414925 | 0.5288169 | 116.361 |
| L-03 | 1.9741784 | 0.1389140 | 11.832 | 1.7353816 | 0.3892797 | 176.360 |
| L-04 | 1.9011191 | 0.1449022 | 11.795 | 1.6673230 | 0.3043383 | 237.538 |
| L-05 | 1.7812655 | 0.1647646 | 82.868 | 1.6154117 | 0.6141968 | 58.066 |
| L-06 | 1.7599364 | 0.1268761 | 86.158 | 1.7200975 | 0.3928633 | 111.244 |
| L-07 | 1.7294022 | 0.1028924 | 87.627 | 1.6470339 | 0.2862372 | 173.600 |
| L-08 | 1.7193592 | 0.0869972 | 87.259 | 1.6442041 | 0.2301394 | 231.990 |
| L-09 | 1.7088052 | 0.0815889 | 153.347 | 1.6346844 | 0.2563356 | 171.193 |
| L-10 | 1.7070991 | 0.0689994 | 152.325 | 1.6535493 | 0.2091466 | 227.454 |
| L-11 | 1.7021164 | 0.0722203 | 217.158 | 1.6379690 | 0.2419462 | 168.107 |
| L-12 | 1.7030336 | 0.0611451 | 215.722 | 1.6657846 | 0.1987136 | 223.276 |

TABLE 1-M

| Case | $n_{10}$ | $k_{10}$ | $d_{10}$ | $n_{20}$ | $k_{20}$ | $d_{20}$ |
|---|---|---|---|---|---|---|
| M-01 | 1.8737564 | 0.3367363 | 20.276 | 1.5133470 | 0.8454522 | 55.480 |
| M-02 | 1.9697383 | 0.2020294 | 14.764 | 1.7299638 | 0.5429087 | 109.268 |
| M-03 | 1.9916260 | 0.1477036 | 11.315 | 1.7257470 | 0.3987910 | 168.578 |
| M-04 | 1.9141720 | 0.1461879 | 11.459 | 1.6683491 | 0.3122132 | 226.037 |
| M-05 | 1.7868889 | 0.1795709 | 80.605 | 1.5409994 | 0.6011754 | 53.925 |
| M-06 | 1.7600620 | 0.1342170 | 85.615 | 1.6974715 | 0.3980869 | 104.529 |
| M-07 | 1.7276490 | 0.1044918 | 87.663 | 1.6338870 | 0.2915200 | 164.129 |
| M-08 | 1.7199953 | 0.0874837 | 87.278 | 1.6452183 | 0.2346970 | 221.092 |
| M-09 | 1.7084320 | 0.0820944 | 153.448 | 1.6304269 | 0.2625567 | 160.685 |
| M-10 | 1.7077870 | 0.0691595 | 152.438 | 1.6574806 | 0.2137196 | 216.250 |
| M-11 | 1.7022055 | 0.0725208 | 217.368 | 1.6389178 | 0.2487144 | 157.041 |
| M-12 | 1.7036940 | 0.0612465 | 215.927 | 1.6705104 | 0.2029113 | 212.129 |

TABLE 1-N

| Case | $n_{10}$ | $k_{10}$ | $d_{10}$ | $n_{20}$ | $k_{20}$ | $d_{20}$ |
|---|---|---|---|---|---|---|
| N-01 | 1.8402862 | 0.3700261 | 23.403 | 1.4966418 | 1.0039549 | 41.463 |
| N-02 | 1.9646387 | 0.2123233 | 16.447 | 1.7618069 | 0.5971846 | 94.995 |
| N-03 | 1.9624104 | 0.1584699 | 12.893 | 1.7211612 | 0.4176484 | 156.173 |
| N-04 | 1.9059084 | 0.1473615 | 12.089 | 1.6694213 | 0.3203376 | 216.011 |
| N-05 | 1.8166660 | 0.1977639 | 79.798 | 1.5572201 | 0.7204992 | 40.224 |
| N-06 | 1.7655719 | 0.1384976 | 86.596 | 1.7129955 | 0.4320226 | 91.539 |
| N-07 | 1.7293285 | 0.1055583 | 87.952 | 1.6364176 | 0.3040668 | 153.339 |
| N-08 | 1.7214396 | 0.0882507 | 87.451 | 1.6482275 | 0.2416232 | 210.993 |
| N-09 | 1.7092770 | 0.0826318 | 153.805 | 1.6322979 | 0.2733763 | 150.296 |
| N-10 | 1.7085071 | 0.0697446 | 152.663 | 1.6592624 | 0.2197085 | 206.543 |
| N-11 | 1.7027802 | 0.0728517 | 217.779 | 1.6405373 | 0.2588103 | 146.936 |
| N-12 | 1.7041709 | 0.0617202 | 216.194 | 1.6719897 | 0.2085423 | 202.593 |

TABLE 1-O

| Case | $n_{10}$ | $k_{10}$ | $d_{10}$ | $n_{20}$ | $k_{20}$ | $d_{20}$ |
|---|---|---|---|---|---|---|
| O-01 | 1.8199816 | 0.4068444 | 29.022 | 1.5974175 | 1.4701111 | 24.558 |
| O-02 | 1.9318464 | 0.2280177 | 20.237 | 1.8212470 | 0.6871951 | 79.181 |
| O-03 | 1.9476580 | 0.1546474 | 15.042 | 1.7660961 | 0.4559575 | 140.877 |
| O-04 | 1.9400781 | 0.1580344 | 15.180 | 1.7558824 | 0.4525330 | 141.749 |
| O-05 | 1.9152409 | 0.1421080 | 12.506 | 1.6892699 | 0.3391765 | 204.998 |
| O-06 | 1.8773964 | 0.2151408 | 81.211 | 1.7568637 | 1.2210655 | 20.666 |
| O-07 | 1.7792899 | 0.1408151 | 87.880 | 1.7944868 | 0.5090378 | 75.457 |
| O-08 | 1.7347668 | 0.1082989 | 88.119 | 1.6522930 | 0.3260600 | 142.664 |
| O-09 | 1.7234258 | 0.0907869 | 87.442 | 1.6482492 | 0.2516544 | 202.556 |
| O-10 | 1.7112569 | 0.0850611 | 153.930 | 1.6361524 | 0.2898839 | 141.116 |
| O-11 | 1.7092054 | 0.0717413 | 152.725 | 1.6572540 | 0.2283199 | 198.410 |
| O-12 | 1.7036310 | 0.0749476 | 217.788 | 1.6384900 | 0.2727185 | 138.609 |
| O-13 | 1.7042855 | 0.0635030 | 216.233 | 1.6687346 | 0.2164860 | 194.709 |

TABLE 1-P

| Case | $n_{10}$ | $k_{10}$ | $d_{10}$ | $n_{20}$ | $k_{20}$ | $d_{20}$ |
|---|---|---|---|---|---|---|
| P-01 | 1.8175791 | 0.4385823 | 37.187 | 2.9488620 | 3.6605721 | 5.671 |
| P-02 | 1.9193642 | 0.2501320 | 21.908 | 1.8321620 | 0.7789298 | 69.456 |
| P-03 | 1.9516445 | 0.1607715 | 15.944 | 1.7911399 | 0.4964603 | 129.934 |
| P-04 | 1.9419697 | 0.1648951 | 16.094 | 1.7764317 | 0.4910919 | 131.139 |
| P-05 | 1.9282358 | 0.1504554 | 12.282 | 1.6857745 | 0.3551730 | 198.143 |
| P-06 | 1.8704725 | 0.2299368 | 88.746 | 2.8158519 | 3.0739838 | 4.992 |
| P-07 | 1.7960814 | 0.1479091 | 88.347 | 1.9330235 | 0.6225271 | 60.492 |
| P-08 | 1.7418606 | 0.1134159 | 87.888 | 1.6717189 | 0.3550776 | 132.384 |
| P-09 | 1.7257176 | 0.0948039 | 87.264 | 1.6472351 | 0.2650084 | 194.269 |
| P-10 | 1.7136245 | 0.0896483 | 153.565 | 1.6392609 | 0.3111392 | 132.434 |
| P-11 | 1.7097149 | 0.0750113 | 152.537 | 1.6527377 | 0.2392317 | 190.639 |
| P-12 | 1.7044725 | 0.0790614 | 217.265 | 1.6350180 | 0.2903973 | 130.687 |
| P-13 | 1.7041849 | 0.0664191 | 215.910 | 1.6625759 | 0.2261823 | 187.261 |
| P-14 | 1.7061658 | 0.0592006 | 215.675 | 1.6951633 | 0.1893046 | 240.772 |

TABLE 1-Q

| Case | $n_{10}$ | $k_{10}$ | $d_{10}$ | $n_{20}$ | $k_{20}$ | $d_{20}$ |
|---|---|---|---|---|---|---|
| Q-01 | 1.9650460 | 0.1748342 | 15.368 | 1.7719438 | 0.5219218 | 124.100 |
| Q-02 | 1.9384951 | 0.1550287 | 12.323 | 1.6895811 | 0.3734128 | 189.293 |
| Q-03 | 1.9139584 | 0.1299465 | 11.343 | 1.6883766 | 0.3007198 | 246.427 |
| Q-04 | 1.7857662 | 0.1574086 | 86.539 | 1.7907030 | 0.6497694 | 59.718 |
| Q-05 | 1.7433983 | 0.1202381 | 87.036 | 1.6559011 | 0.3733381 | 125.629 |
| Q-06 | 1.7262549 | 0.0993784 | 86.812 | 1.6373093 | 0.2753256 | 186.729 |
| Q-07 | 1.7236673 | 0.0842645 | 87.109 | 1.6685549 | 0.2274459 | 241.120 |
| Q-08 | 1.7140199 | 0.0949670 | 152.601 | 1.6238426 | 0.3258368 | 125.450 |
| Q-09 | 1.7096017 | 0.0783956 | 152.026 | 1.6437329 | 0.2483227 | 182.921 |
| Q-10 | 1.7107217 | 0.0680252 | 152.100 | 1.6799600 | 0.2063397 | 236.403 |
| Q-11 | 1.7042582 | 0.0836625 | 216.186 | 1.6202806 | 0.3033538 | 123.599 |
| Q-12 | 1.7037677 | 0.0692974 | 215.313 | 1.6544674 | 0.2346728 | 179.446 |
| Q-13 | 1.7056779 | 0.0609868 | 215.198 | 1.6903958 | 0.1952987 | 232.683 |

TABLE 1-R

| Case | $n_{10}$ | $k_{10}$ | $d_{10}$ | $n_{20}$ | $k_{20}$ | $d_{20}$ |
|---|---|---|---|---|---|---|
| R-01 | 1.9750220 | 0.3055970 | 17.312 | 1.6357631 | 0.8207912 | 66.973 |
| R-02 | 1.9943589 | 0.1905841 | 13.627 | 1.7309349 | 0.5263943 | 122.033 |
| R-03 | 1.9365478 | 0.1715491 | 12.200 | 1.6649916 | 0.3790440 | 183.216 |
| R-04 | 1.8874503 | 0.1503402 | 12.006 | 1.6561886 | 0.2991899 | 242.151 |
| R-05 | 1.7406539 | 0.1271964 | 86.109 | 1.6157675 | 0.3771605 | 120.682 |
| R-06 | 1.7253418 | 0.1032843 | 86.339 | 1.6224018 | 0.2809650 | 178.956 |
| R-07 | 1.7237735 | 0.0864157 | 86.885 | 1.6650124 | 0.2327133 | 231.784 |
| R-08 | 1.7126639 | 0.0996282 | 151.701 | 1.5953952 | 0.3310599 | 118.977 |
| R-09 | 1.7091592 | 0.0809109 | 151.551 | 1.6344497 | 0.2545275 | 174.271 |
| R-10 | 1.7108527 | 0.0696108 | 151.827 | 1.6784072 | 0.2111338 | 226.839 |
| R-11 | 1.7032995 | 0.0874338 | 215.388 | 1.6000078 | 0.3100603 | 116.088 |
| R-12 | 1.7035257 | 0.0712651 | 214.888 | 1.6490638 | 0.2413259 | 170.219 |
| R-13 | 1.7058486 | 0.0623526 | 214.924 | 1.6902455 | 0.1999123 | 222.958 |

TABLE 1-S

| Case | $n_{10}$ | $k_{10}$ | $d_{10}$ | $n_{20}$ | $k_{20}$ | $d_{20}$ |
|---|---|---|---|---|---|---|
| S-01 | 2.0157422 | 0.3310994 | 15.233 | 1.5732193 | 0.8191417 | 66.313 |
| S-02 | 1.9298641 | 0.1874025 | 12.335 | 1.6401635 | 0.3856200 | 174.874 |
| S-03 | 1.9158213 | 0.1413868 | 11.496 | 1.6782430 | 0.3150440 | 226.685 |
| S-04 | 1.9035507 | 0.0919796 | 11.593 | 1.7330388 | 0.2716233 | 274.138 |
| S-05 | 1.7387191 | 0.1333266 | 85.772 | 1.5838112 | 0.3839989 | 113.170 |
| S-06 | 1.7256246 | 0.1055723 | 86.279 | 1.6177137 | 0.2895611 | 168.375 |
| S-07 | 1.7253546 | 0.0874820 | 86.928 | 1.6696157 | 0.2389730 | 220.361 |
| S-08 | 1.7287042 | 0.0760165 | 87.515 | 1.7081188 | 0.2041866 | 272.150 |
| S-09 | 1.7096582 | 0.0821714 | 151.624 | 1.6358848 | 0.2635969 | 162.984 |
| S-10 | 1.7121643 | 0.0705329 | 152.001 | 1.6853812 | 0.2167566 | 215.233 |
| S-11 | 1.7151566 | 0.0645755 | 152.412 | 1.7135234 | 0.1842756 | 268.692 |
| S-12 | 1.7029318 | 0.0900998 | 215.656 | 1.5920483 | 0.3226491 | 105.543 |
| S-13 | 1.7041956 | 0.0721897 | 215.114 | 1.6533659 | 0.2502000 | 158.704 |
| S-14 | 1.7070069 | 0.0633145 | 215.207 | 1.6971996 | 0.2048445 | 211.558 |
| S-15 | 1.7080920 | 0.0595697 | 215.250 | 1.7125257 | 0.1741269 | 267.229 |

TABLE 1-T

| Case | $n_{10}$ | $k_{10}$ | $d_{10}$ | $n_{20}$ | $k_{20}$ | $d_{20}$ |
|---|---|---|---|---|---|---|
| T-01 | 1.9115074 | 0.1960527 | 13.258 | 1.6255021 | 0.3984556 | 164.068 |
| T-02 | 1.9153788 | 0.1490337 | 11.515 | 1.6682692 | 0.3197853 | 218.507 |
| T-03 | 1.8712999 | 0.0897979 | 14.536 | 1.7614462 | 0.2821612 | 257.799 |
| T-04 | 1.7275221 | 0.1065695 | 86.590 | 1.6227655 | 0.3041284 | 156.467 |
| T-05 | 1.7279210 | 0.0881248 | 87.122 | 1.6778177 | 0.2471127 | 209.069 |
| T-06 | 1.7316602 | 0.0769958 | 87.563 | 1.7153560 | 0.2092703 | 261.518 |
| T-07 | 1.7109076 | 0.0825870 | 152.078 | 1.6429824 | 0.2767726 | 151.325 |
| T-08 | 1.7140510 | 0.0712311 | 152.368 | 1.6947912 | 0.2239389 | 204.003 |
| T-09 | 1.7169074 | 0.0659464 | 152.739 | 1.7201685 | 0.1888883 | 258.117 |
| T-10 | 1.7034522 | 0.0912009 | 216.873 | 1.5969711 | 0.3506487 | 92.838 |
| T-11 | 1.7053294 | 0.0723641 | 215.802 | 1.6624125 | 0.2625944 | 147.133 |
| T-12 | 1.7084550 | 0.0642090 | 215.782 | 1.7063284 | 0.2112603 | 200.541 |
| T-13 | 1.7088490 | 0.0611230 | 215.750 | 1.7155496 | 0.1784523 | 257.296 |

TABLE 2-A

| Case | $n_{10}$ | $k_{10}$ | $d_{10}$ | $n_{20}$ | $k_{20}$ | $d_{20}$ |
|---|---|---|---|---|---|---|
| A-01 | 2.1002530 | 0.0458360 | 25.245 | 3.6613926 | 2.0917723 | 4.980 |
| A-02 | 1.9014716 | 0.1897321 | 35.107 | 3.6832791 | 0.6232721 | 30.030 |
| A-03 | 1.8817545 | 0.1528631 | 29.787 | 2.2496615 | 0.5909670 | 58.673 |
| A-04 | 1.8713707 | 0.1131033 | 20.680 | 1.8471360 | 0.3799287 | 139.609 |
| A-05 | 1.8894555 | 0.1025295 | 13.808 | 1.7319643 | 0.2879285 | 214.126 |
| A-06 | 1.8919474 | 0.0886250 | 14.825 | 1.7713589 | 0.2959415 | 207.437 |
| A-07 | 1.8730447 | 0.0995044 | 12.107 | 1.6971361 | 0.2384266 | 276.341 |
| A-08 | 1.7734811 | 0.0942049 | 96.210 | 2.0242448 | 0.4293783 | 66.416 |
| A-09 | 1.7581396 | 0.0894114 | 94.485 | 1.8216770 | 0.2841737 | 135.446 |
| A-10 | 1.7209511 | 0.0778149 | 94.005 | 1.6746822 | 0.2144041 | 211.729 |
| A-11 | 1.7166765 | 0.0677623 | 92.667 | 1.6766991 | 0.1797231 | 270.198 |
| A-12 | 1.7166130 | 0.0755230 | 182.689 | 6.5634515 | 3.2079655 | 1.017 |
| A-13 | 1.7322234 | 0.0835200 | 166.765 | 1.9262925 | 0.3700807 | 69.546 |
| A-14 | 1.7049421 | 0.0655754 | 163.194 | 1.6664527 | 0.1954874 | 208.736 |

TABLE 2-A-continued

| Case | $n_{10}$ | $k_{10}$ | $d_{10}$ | $n_{20}$ | $k_{20}$ | $d_{20}$ |
|---|---|---|---|---|---|---|
| A-15 | 1.7064564 | 0.0573750 | 160.636 | 1.6879767 | 0.1655431 | 264.028 |
| A-16 | 1.6929499 | 0.0758677 | 218.538 | 1.7888879 | 0.3373861 | 83.914 |
| A-17 | 1.6905856 | 0.0724871 | 210.998 | 1.7113381 | 0.2424201 | 155.877 |
| A-18 | 1.6919500 | 0.0673580 | 207.119 | 1.6973679 | 0.1951159 | 222.394 |
| A-19 | 1.6995270 | 0.0541447 | 221.890 | 1.6914313 | 0.1602785 | 261.841 |
| A-20 | 1.6946661 | 0.0598692 | 292.769 | 5.7902895 | 2.6464640 | 1.370 |
| A-21 | 1.6927273 | 0.0641185 | 275.960 | 1.7993913 | 0.3510467 | 81.101 |
| A-22 | 1.6938682 | 0.0632641 | 269.814 | 1.7248410 | 0.2487428 | 150.052 |
| A-23 | 1.6959215 | 0.0601626 | 266.236 | 1.7076727 | 0.2009217 | 214.823 |
| A-24 | 1.6965163 | 0.0560943 | 263.874 | 1.6984359 | 0.1709410 | 277.894 |

TABLE 2-B

| Case | $n_{10}$ | $k_{10}$ | $d_{10}$ | $n_{20}$ | $k_{20}$ | $d_{20}$ |
|---|---|---|---|---|---|---|
| B-01 | 1.8588603 | 0.2152026 | 37.726 | 5.0977045 | 0.6974562 | 19.647 |
| B-02 | 1.8671897 | 0.2000001 | 35.681 | 3.0932325 | 0.7063642 | 34.687 |
| B-03 | 1.8793061 | 0.1213485 | 21.414 | 1.8727645 | 0.4149520 | 129.308 |
| B-04 | 1.8953035 | 0.0980077 | 14.908 | 1.7635602 | 0.3109442 | 200.446 |
| B-05 | 1.8743725 | 0.1084578 | 12.201 | 1.6884757 | 0.2470663 | 269.437 |
| B-06 | 1.7693190 | 0.1013402 | 103.520 | 3.2583829 | 2.5781374 | 3.121 |
| B-07 | 1.8089249 | 0.1064114 | 98.052 | 3.5132584 | 0.5501157 | 29.615 |
| B-08 | 1.7628339 | 0.0939832 | 94.416 | 1.8414170 | 0.3092618 | 125.923 |
| B-09 | 1.7223442 | 0.0810686 | 93.840 | 1.6728089 | 0.2260423 | 203.086 |
| B-10 | 1.7176215 | 0.0701007 | 92.613 | 1.6759231 | 0.1876577 | 261.422 |
| B-11 | 1.7053748 | 0.0681661 | 163.030 | 1.6640911 | 0.2056957 | 200.113 |
| B-12 | 1.7067869 | 0.0592936 | 160.569 | 1.6873274 | 0.1726858 | 255.377 |
| B-13 | 1.7234396 | 0.0819972 | 177.819 | 5.0800961 | 4.2173316 | 1.054 |
| B-14 | 1.7309823 | 0.0887627 | 175.110 | 9.5526510 | 0.4602806 | 10.232 |
| B-15 | 1.6924662 | 0.0804140 | 219.254 | 1.8031504 | 0.3794202 | 74.951 |
| B-16 | 1.6899914 | 0.0755734 | 211.286 | 1.7113670 | 0.2592681 | 147.090 |
| B-17 | 1.6915311 | 0.0696615 | 207.258 | 1.6964473 | 0.2049428 | 213.635 |
| B-18 | 1.6993450 | 0.0558443 | 221.722 | 1.6905618 | 0.1670525 | 253.347 |
| B-19 | 1.6920076 | 0.0677866 | 276.645 | 1.8143335 | 0.3967808 | 72.378 |
| B-20 | 1.6934597 | 0.0658489 | 270.093 | 1.7261499 | 0.2668883 | 141.360 |
| B-21 | 1.6956703 | 0.0621151 | 266.327 | 1.7069279 | 0.2113995 | 206.262 |
| B-22 | 1.6963391 | 0.0576411 | 263.935 | 1.6975975 | 0.1780179 | 269.259 |

TABLE 2-C

| Case | $n_{10}$ | $k_{10}$ | $d_{10}$ | $n_{20}$ | $k_{20}$ | $d_{20}$ |
|---|---|---|---|---|---|---|
| C-01 | 1.8231304 | 0.2426967 | 38.982 | 4.7825941 | 0.7852430 | 19.992 |
| C-02 | 1.8934062 | 0.1289044 | 22.067 | 1.9169501 | 0.4577317 | 118.684 |
| C-03 | 1.9014262 | 0.1029443 | 15.306 | 1.7714781 | 0.3309508 | 191.572 |
| C-04 | 1.8787814 | 0.1135143 | 12.334 | 1.6867670 | 0.2583639 | 261.269 |
| C-05 | 1.8198973 | 0.1197953 | 96.975 | 4.7572984 | 0.6218490 | 20.274 |
| C-06 | 1.7669399 | 0.0997580 | 94.208 | 1.8558060 | 0.3364471 | 117.969 |
| C-07 | 1.7235821 | 0.0847397 | 93.618 | 1.6692590 | 0.2394056 | 195.006 |
| C-08 | 1.7188964 | 0.0726255 | 92.505 | 1.6760484 | 0.1967286 | 252.779 |
| C-09 | 1.7058208 | 0.0710513 | 162.764 | 1.6616172 | 0.2176394 | 191.801 |
| C-10 | 1.7073313 | 0.0613671 | 160.462 | 1.6880654 | 0.1807904 | 246.769 |
| C-11 | 1.6893950 | 0.0792587 | 211.356 | 1.7121469 | 0.2795726 | 139.203 |
| C-12 | 1.6912149 | 0.0722082 | 207.241 | 1.6964479 | 0.2163033 | 205.754 |
| C-13 | 1.6993872 | 0.0576769 | 221.603 | 1.6911809 | 0.1749036 | 244.825 |
| C-14 | 1.6931110 | 0.0689939 | 270.168 | 1.7281714 | 0.2885226 | 133.446 |
| C-15 | 1.6955537 | 0.0643335 | 266.333 | 1.7074500 | 0.2235939 | 198.195 |
| C-16 | 1.6962507 | 0.0593120 | 263.960 | 1.6977843 | 0.1860709 | 261.024 |

TABLE 2-D

| Case | $n_{10}$ | $k_{10}$ | $d_{10}$ | $n_{20}$ | $k_{20}$ | $d_{20}$ |
|---|---|---|---|---|---|---|
| D-01 | 1.8741027 | 0.2292405 | 31.502 | 2.4589695 | 0.9273915 | 39.688 |
| D-02 | 1.9162345 | 0.1358555 | 21.455 | 1.9418040 | 0.4998799 | 110.373 |
| D-03 | 1.9099224 | 0.1141224 | 14.789 | 1.7536831 | 0.3442834 | 186.067 |
| D-04 | 1.8839284 | 0.1193744 | 12.268 | 1.6821215 | 0.2672652 | 253.238 |
| D-05 | 1.7973698 | 0.1226911 | 93.176 | 2.1323779 | 0.6525391 | 46.828 |
| D-06 | 1.7231751 | 0.0881939 | 93.194 | 1.6583398 | 0.2493789 | 187.627 |
| D-07 | 1.7198225 | 0.0748307 | 92.273 | 1.6753837 | 0.2040438 | 244.025 |

TABLE 2-D-continued

| Case | $n_{10}$ | $k_{10}$ | $d_{10}$ | $n_{20}$ | $k_{20}$ | $d_{20}$ |
|---|---|---|---|---|---|---|
| D-08 | 1.7057007 | 0.0735111 | 162.218 | 1.6560667 | 0.2270715 | 183.673 |
| D-09 | 1.7079030 | 0.0631371 | 160.241 | 1.6895692 | 0.1875698 | 237.741 |
| D-10 | 1.6886446 | 0.0826816 | 210.810 | 1.7077667 | 0.2975930 | 132.542 |
| D-11 | 1.6995870 | 0.0592337 | 221.497 | 1.6927290 | 0.1818275 | 235.781 |
| D-12 | 1.6927517 | 0.0720967 | 269.568 | 1.7225076 | 0.3075740 | 126.653 |
| D-13 | 1.6954892 | 0.0662812 | 265.955 | 1.7055518 | 0.2340649 | 190.864 |
| D-14 | 1.6961809 | 0.0606151 | 263.663 | 1.6966094 | 0.1927366 | 253.572 |

TABLE 2-E

| Case | $n_{10}$ | $k_{10}$ | $d_{10}$ | $n_{20}$ | $k_{20}$ | $d_{20}$ |
|---|---|---|---|---|---|---|
| E-01 | 1.8808544 | 0.2454152 | 24.855 | 1.8495394 | 0.8565648 | 51.788 |
| E-02 | 1.9316654 | 0.1473610 | 18.765 | 1.8569906 | 0.5034890 | 110.667 |
| E-03 | 1.9082705 | 0.1322705 | 14.189 | 1.7144055 | 0.3458924 | 182.182 |
| E-04 | 1.8785232 | 0.1271526 | 12.435 | 1.6714546 | 0.2699971 | 245.412 |
| E-05 | 1.7211644 | 0.0906139 | 92.694 | 1.6423304 | 0.2528050 | 180.257 |
| E-06 | 1.7204079 | 0.0761160 | 92.018 | 1.6751968 | 0.2080809 | 234.537 |
| E-07 | 1.7050622 | 0.0748972 | 161.630 | 1.6489715 | 0.2315625 | 175.108 |
| E-08 | 1.7085349 | 0.0642166 | 160.005 | 1.6919631 | 0.1914882 | 227.913 |
| E-09 | 1.6878153 | 0.0847734 | 209.683 | 1.6959203 | 0.3070669 | 127.092 |
| E-10 | 1.6980473 | 0.0703784 | 224.445 | 1.6616204 | 0.2238826 | 171.370 |
| E-11 | 1.6999707 | 0.0601951 | 221.512 | 1.6952970 | 0.1862586 | 225.852 |
| E-12 | 1.6924126 | 0.0742318 | 268.357 | 1.7068352 | 0.3173492 | 120.697 |
| E-13 | 1.6955002 | 0.0674212 | 265.225 | 1.7004174 | 0.2397614 | 183.997 |
| E-14 | 1.6961000 | 0.0611797 | 263.146 | 1.6940899 | 0.1962440 | 246.462 |

TABLE 2-F

| Case | $n_{10}$ | $k_{10}$ | $d_{10}$ | $n_{20}$ | $k_{20}$ | $d_{20}$ |
|---|---|---|---|---|---|---|
| F-01 | 1.8609133 | 0.2699154 | 23.275 | 1.6780954 | 0.8091000 | 51.309 |
| F-02 | 1.9462238 | 0.1588548 | 16.938 | 1.8061043 | 0.4989592 | 107.791 |
| F-03 | 1.9002376 | 0.1498745 | 13.880 | 1.6764313 | 0.3420875 | 176.900 |
| F-04 | 1.8750233 | 0.1302055 | 12.592 | 1.6672162 | 0.2718902 | 235.718 |
| F-05 | 1.8816918 | 0.0811209 | 12.084 | 1.7277101 | 0.2394028 | 282.393 |
| F-06 | 1.7196449 | 0.0916508 | 92.440 | 1.6323282 | 0.2539653 | 171.320 |
| F-07 | 1.7211216 | 0.0765241 | 91.942 | 1.6777604 | 0.2105462 | 223.941 |
| F-08 | 1.7282121 | 0.0683348 | 92.298 | 1.7222619 | 0.1825246 | 274.062 |
| F-09 | 1.7047574 | 0.0753118 | 161.355 | 1.6462273 | 0.2341241 | 165.232 |
| F-10 | 1.7094298 | 0.0647325 | 159.970 | 1.6962571 | 0.1938378 | 217.150 |
| F-11 | 1.6870964 | 0.0858972 | 208.556 | 1.6830399 | 0.3090553 | 121.249 |
| F-12 | 1.6986314 | 0.0705958 | 224.893 | 1.6622291 | 0.2274423 | 160.831 |
| F-13 | 1.7003667 | 0.0607285 | 221.557 | 1.6983916 | 0.1887213 | 215.383 |
| F-14 | 1.6951156 | 0.0571177 | 215.781 | 1.6957463 | 0.1617780 | 277.216 |
| F-15 | 1.6955653 | 0.0680298 | 264.644 | 1.6953987 | 0.2417239 | 176.078 |
| F-16 | 1.6958377 | 0.0528303 | 274.984 | 1.6882898 | 0.1657751 | 275.044 |

TABLE 2-G

| Case | $n_{10}$ | $k_{10}$ | $d_{10}$ | $n_{20}$ | $k_{20}$ | $d_{20}$ |
|---|---|---|---|---|---|---|
| .G-01 | 1.8339628 | 0.2973905 | 24.925 | 1.6419965 | 0.8698975 | 41.723 |
| G-02 | 1.9445237 | 0.1726202 | 17.287 | 1.7953047 | 0.5162004 | 98.907 |
| G-03 | 1.8939902 | 0.1563846 | 14.253 | 1.6659458 | 0.3485215 | 167.112 |
| G-04 | 1.8811858 | 0.0833966 | 12.228 | 1.7269957 | 0.2426363 | 272.914 |
| G-05 | 1.7203230 | 0.0922740 | 92.527 | 1.6328842 | 0.2599948 | 160.703 |
| G-06 | 1.7224265 | 0.0770592 | 92.053 | 1.6819841 | 0.2150120 | 213.162 |
| G-07 | 1.7294779 | 0.0692299 | 92.385 | 1.7252879 | 0.1858377 | 263.723 |
| G-08 | 1.7053201 | 0.0757255 | 161.452 | 1.6485370 | 0.2399747 | 154.588 |
| G-09 | 1.7102741 | 0.0654045 | 160.136 | 1.7000507 | 0.1977447 | 206.614 |
| G-10 | 1.7133466 | 0.0629386 | 160.381 | 1.7220503 | 0.1698335 | 260.757 |
| G-11 | 1.6861768 | 0.0881028 | 208.148 | 1.6733849 | 0.3136681 | 112.385 |
| G-12 | 1.6990769 | 0.0709373 | 225.005 | 1.6647354 | 0.2329033 | 150.349 |
| G-13 | 1.7003759 | 0.0613969 | 221.468 | 1.6998938 | 0.1918751 | 205.497 |
| G-14 | 1.6946436 | 0.0577579 | 215.315 | 1.6946016 | 0.1634050 | 268.128 |
| G-15 | 1.6954303 | 0.0690806 | 264.876 | 1.6937197 | 0.2458138 | 165.269 |
| G-16 | 1.6957423 | 0.0532811 | 274.848 | 1.6878755 | 0.1674492 | 265.685 |

TABLE 2-H

| Case | $n_{10}$ | $k_{10}$ | $d_{10}$ | $n_{20}$ | $k_{20}$ | $d_{20}$ |
|---|---|---|---|---|---|---|
| H-01 | 1.9187259 | 0.1881900 | 20.509 | 1.8283337 | 0.5739613 | 84.746 |
| H-02 | 1.8967518 | 0.1527475 | 15.221 | 1.6893708 | 0.3734166 | 154.221 |
| H-03 | 1.8757876 | 0.1318014 | 13.247 | 1.6726776 | 0.2883472 | 215.129 |
| H-04 | 1.8806788 | 0.0899399 | 12.412 | 1.7211162 | 0.2492460 | 265.394 |
| H-05 | 1.7234296 | 0.0945092 | 92.722 | 1.6393014 | 0.2743485 | 150.270 |
| H-06 | 1.7235983 | 0.0790587 | 92.129 | 1.6815454 | 0.2228770 | 204.187 |
| H-07 | 1.7294254 | 0.0706491 | 92.482 | 1.7233644 | 0.1918670 | 255.172 |
| H-08 | 1.7064538 | 0.0777504 | 161.668 | 1.6498826 | 0.2514894 | 145.038 |
| H-09 | 1.7103862 | 0.0670250 | 160.278 | 1.6983722 | 0.2047961 | 197.922 |
| H-10 | 1.7133072 | 0.0637197 | 160.467 | 1.7219131 | 0.1752501 | 251.781 |
| H-11 | 1.6987335 | 0.0728489 | 224.384 | 1.6635130 | 0.2423517 | 141.699 |
| H-12 | 1.6895310 | 0.0798395 | 207.056 | 1.6873868 | 0.2464201 | 160.447 |
| H-13 | 1.6997408 | 0.0628030 | 221.189 | 1.6972371 | 0.1976117 | 197.186 |
| H-14 | 1.6947661 | 0.0583146 | 215.749 | 1.6943199 | 0.1671130 | 258.789 |
| H-15 | 1.6915645 | 0.0796327 | 269.434 | 1.7013553 | 0.3520060 | 90.540 |
| H-16 | 1.6950499 | 0.0706693 | 266.123 | 1.6983222 | 0.2573177 | 152.851 |
| H-17 | 1.6956172 | 0.0541668 | 274.905 | 1.6860233 | 0.1712439 | 257.337 |

TABLE 2-I

| Case | $n_{10}$ | $k_{10}$ | $d_{10}$ | $n_{20}$ | $k_{20}$ | $d_{20}$ |
|---|---|---|---|---|---|---|
| I-01 | 1.8980776 | 0.2063094 | 23.234 | 1.8542997 | 0.6486453 | 73.732 |
| I-02 | 1.9078109 | 0.1489982 | 16.351 | 1.7325536 | 0.4126982 | 141.036 |
| I-03 | 1.8887573 | 0.1336370 | 13.295 | 1.6803356 | 0.3065809 | 205.639 |
| I-04 | 1.8863613 | 0.0963846 | 12.395 | 1.7165602 | 0.2596921 | 258.147 |
| I-05 | 1.7283563 | 0.0991844 | 92.796 | 1.6494143 | 0.2975623 | 140.358 |
| I-06 | 1.7247011 | 0.0825295 | 92.134 | 1.6784446 | 0.2345042 | 196.220 |
| I-07 | 1.7288637 | 0.0727638 | 92.409 | 1.7181265 | 0.1997137 | 247.866 |
| I-08 | 1.7100270 | 0.0697395 | 160.277 | 1.6932584 | 0.2147807 | 190.362 |
| I-09 | 1.7129082 | 0.0648353 | 160.281 | 1.7202855 | 0.1822190 | 243.795 |
| I-10 | 1.6894084 | 0.0825836 | 208.412 | 1.6911413 | 0.2636300 | 148.443 |
| I-11 | 1.6987536 | 0.0651428 | 220.679 | 1.6918669 | 0.2062686 | 189.869 |
| I-12 | 1.6951804 | 0.0592977 | 216.421 | 1.6944812 | 0.1733276 | 249.686 |
| I-13 | 1.6947043 | 0.0728049 | 267.049 | 1.7045529 | 0.2758626 | 142.407 |
| I-14 | 1.6953534 | 0.0654850 | 264.587 | 1.6939885 | 0.2171518 | 204.731 |
| I-15 | 1.6955317 | 0.0555447 | 274.968 | 1.6840742 | 0.1777252 | 249.243 |

TABLE 2-J

| Case | $n_{10}$ | $k_{10}$ | $d_{10}$ | $n_{20}$ | $k_{20}$ | $d_{20}$ |
|---|---|---|---|---|---|---|
| J-01 | 1.9059589 | 0.2274286 | 23.462 | 1.8553331 | 0.7355051 | 66.090 |
| J-02 | 1.9224042 | 0.1550778 | 16.599 | 1.7510181 | 0.4490690 | 131.424 |
| J-03 | 1.8961620 | 0.1385328 | 13.501 | 1.6829419 | 0.3248659 | 196.767 |
| J-04 | 1.8922593 | 0.1041345 | 12.282 | 1.7097147 | 0.2697702 | 251.116 |
| J-05 | 1.7254583 | 0.0865833 | 91.876 | 1.6727903 | 0.2465542 | 188.519 |
| J-06 | 1.7286512 | 0.0752622 | 92.185 | 1.7137581 | 0.2076205 | 240.302 |
| J-07 | 1.7096319 | 0.0728333 | 159.923 | 1.6877059 | 0.2252670 | 182.766 |
| J-08 | 1.7125109 | 0.0665034 | 159.852 | 1.7181911 | 0.1890952 | 235.934 |
| J-09 | 1.6891198 | 0.0853163 | 208.173 | 1.6918411 | 0.2826173 | 141.112 |
| J-10 | 1.6979687 | 0.0677690 | 220.140 | 1.6871092 | 0.2165239 | 182.186 |
| J-11 | 1.6953920 | 0.0607310 | 216.694 | 1.6943518 | 0.1805507 | 240.824 |
| J-12 | 1.6945041 | 0.0754015 | 266.879 | 1.7053190 | 0.2962459 | 134.581 |
| J-13 | 1.6957904 | 0.0613078 | 263.111 | 1.6921380 | 0.1886276 | 257.166 |

TABLE 2-K

| Case | $n_{10}$ | $k_{10}$ | $d_{10}$ | $n_{20}$ | $k_{20}$ | $d_{20}$ |
|---|---|---|---|---|---|---|
| K-01 | 1.9374125 | 0.1704110 | 15.669 | 1.7248980 | 0.4663738 | 126.299 |
| K-02 | 1.9018997 | 0.1487976 | 13.285 | 1.6713435 | 0.3352808 | 189.496 |
| K-03 | 1.8965439 | 0.1142225 | 11.973 | 1.6970963 | 0.2748315 | 244.759 |
| K-04 | 1.7253637 | 0.0900184 | 91.432 | 1.6651786 | 0.2549499 | 180.505 |
| K-05 | 1.7289764 | 0.0775142 | 91.877 | 1.7120256 | 0.2134557 | 231.728 |
| K-06 | 1.7092919 | 0.0753499 | 159.318 | 1.6830351 | 0.2331189 | 174.468 |
| K-07 | 1.7124011 | 0.0683625 | 159.365 | 1.7169838 | 0.1941891 | 227.412 |
| K-08 | 1.6891266 | 0.0867081 | 206.818 | 1.6858604 | 0.2953498 | 138.155 |
| K-09 | 1.6977739 | 0.0698574 | 219.869 | 1.6842611 | 0.2258219 | 173.345 |
| K-10 | 1.6952347 | 0.0623107 | 216.627 | 1.6937881 | 0.1869159 | 231.738 |

TABLE 2-K-continued

| Case | $n_{10}$ | $k_{10}$ | $d_{10}$ | $n_{20}$ | $k_{20}$ | $d_{20}$ |
|---|---|---|---|---|---|---|
| K-11 | 1.6944699 | 0.0775933 | 265.762 | 1.6967397 | 0.3115846 | 129.093 |
| K-12 | 1.6958800 | 0.0528961 | 273.317 | 1.6915993 | 0.1649138 | 288.010 |

TABLE 2-L

| Case | $n_{10}$ | $k_{10}$ | $d_{10}$ | $n_{20}$ | $k_{20}$ | $d_{20}$ |
|---|---|---|---|---|---|---|
| L-01 | 1.9729972 | 0.2768129 | 17.524 | 1.6663342 | 0.7544777 | 64.842 |
| L-02 | 1.9456051 | 0.1915481 | 14.612 | 1.6781309 | 0.4665054 | 122.845 |
| L-03 | 1.9005953 | 0.1591490 | 13.217 | 1.6561276 | 0.3399716 | 181.593 |
| L-04 | 1.8972956 | 0.1121564 | 12.290 | 1.7051607 | 0.2822449 | 233.141 |
| L-05 | 1.7255330 | 0.0922673 | 91.102 | 1.6614760 | 0.2607016 | 171.070 |
| L-06 | 1.7304964 | 0.0792452 | 91.709 | 1.7154952 | 0.2175998 | 221.560 |
| L-07 | 1.7097843 | 0.0770210 | 159.025 | 1.6841289 | 0.2392980 | 164.463 |
| L-08 | 1.7129025 | 0.0702809 | 159.249 | 1.7178163 | 0.1978132 | 217.770 |
| L-09 | 1.7059734 | 0.0642321 | 159.600 | 1.6898319 | 0.1677546 | 279.371 |
| L-10 | 1.6983193 | 0.0712405 | 220.143 | 1.6860819 | 0.2336364 | 162.903 |
| L-11 | 1.6946755 | 0.0639503 | 216.344 | 1.6931001 | 0.1919118 | 222.331 |
| L-12 | 1.6955425 | 0.0535782 | 213.248 | 1.6937343 | 0.1415462 | 338.947 |
| L-13 | 1.6956989 | 0.0539885 | 272.929 | 1.6917939 | 0.1683287 | 278.327 |

TABLE 2-M

| Case | $n_{10}$ | $k_{10}$ | $d_{10}$ | $n_{20}$ | $k_{20}$ | $d_{20}$ |
|---|---|---|---|---|---|---|
| M-01 | 1.8993435 | 0.1093669 | 12.638 | 1.7156529 | 0.2903108 | 220.942 |
| M-02 | 1.9080238 | 0.0778133 | 11.189 | 1.7380285 | 0.2474831 | 275.866 |
| M-03 | 1.7276770 | 0.0934541 | 91.210 | 1.6689251 | 0.2700133 | 159.348 |
| M-04 | 1.7338076 | 0.0808022 | 91.869 | 1.7256843 | 0.2232282 | 209.944 |
| M-05 | 1.7236449 | 0.0736298 | 92.640 | 1.7007078 | 0.1887087 | 271.148 |
| M-06 | 1.7117973 | 0.0782334 | 159.412 | 1.6949465 | 0.2480962 | 152.577 |
| M-07 | 1.7052523 | 0.0648564 | 160.141 | 1.6847092 | 0.1699839 | 269.827 |
| M-08 | 1.6990979 | 0.0723627 | 220.761 | 1.6931390 | 0.2421156 | 151.650 |
| M-09 | 1.6936455 | 0.0657466 | 215.539 | 1.6916565 | 0.1962143 | 213.597 |
| M-10 | 1.6937228 | 0.0602088 | 212.854 | 1.6917935 | 0.1651159 | 273.449 |
| M-11 | 1.6954835 | 0.0549286 | 272.481 | 1.6920522 | 0.1709440 | 269.018 |

TABLE 2-N

| Case | $n_{10}$ | $k_{10}$ | $d_{10}$ | $n_{20}$ | $k_{20}$ | $d_{20}$ |
|---|---|---|---|---|---|---|
| N-01 | 1.9117383 | 0.2302052 | 15.980 | 1.5953517 | 0.4940730 | 105.368 |
| N-02 | 1.8981283 | 0.1070787 | 13.384 | 1.7296497 | 0.3022759 | 209.053 |
| N-03 | 1.9112943 | 0.0649623 | 12.163 | 1.7710787 | 0.2605013 | 259.824 |
| N-04 | 1.7312914 | 0.0945058 | 91.544 | 1.6819509 | 0.2846338 | 147.702 |
| N-05 | 1.7377087 | 0.0827928 | 92.151 | 1.7372931 | 0.2321492 | 198.983 |
| N-06 | 1.7228203 | 0.0749158 | 92.874 | 1.6951594 | 0.1935801 | 262.590 |
| N-07 | 1.7144911 | 0.0796518 | 160.015 | 1.7090445 | 0.2610315 | 141.223 |
| N-08 | 1.7050797 | 0.0657099 | 160.534 | 1.6817729 | 0.1743389 | 260.739 |
| N-09 | 1.6925663 | 0.0675694 | 214.049 | 1.6900690 | 0.2005073 | 206.287 |
| N-10 | 1.6991742 | 0.0739382 | 220.936 | 1.6992675 | 0.2525134 | 141.832 |
| N-11 | 1.6955775 | 0.0548747 | 213.500 | 1.6934763 | 0.1457299 | 319.743 |
| N-12 | 1.6953573 | 0.0556511 | 272.231 | 1.6917841 | 0.1736649 | 260.476 |

TABLE 2-O

| Case | $n_{10}$ | $k_{10}$ | $d_{10}$ | $n_{20}$ | $k_{20}$ | $d_{20}$ |
|---|---|---|---|---|---|---|
| O-01 | 1.8842999 | 0.1660082 | 15.542 | 1.6642092 | 0.3881866 | 148.595 |
| O-02 | 1.9020060 | 0.1078045 | 13.884 | 1.7406676 | 0.3180988 | 199.025 |
| O-03 | 1.9176161 | 0.0733974 | 11.927 | 1.7608162 | 0.2687301 | 254.127 |
| O-04 | 1.7347347 | 0.0970436 | 91.613 | 1.6897518 | 0.3028107 | 138.166 |
| O-05 | 1.7402087 | 0.0854812 | 92.221 | 1.7427648 | 0.2437105 | 190.058 |
| O-06 | 1.7232674 | 0.0768076 | 92.842 | 1.6931409 | 0.2010537 | 254.319 |
| O-07 | 1.7163169 | 0.0822242 | 160.121 | 1.7162208 | 0.2770503 | 132.120 |
| O-08 | 1.7052425 | 0.0670983 | 160.367 | 1.6808978 | 0.1806066 | 252.327 |
| O-09 | 1.6979604 | 0.0765182 | 219.964 | 1.6978817 | 0.2641846 | 134.431 |
| O-10 | 1.6919325 | 0.0693101 | 212.895 | 1.6886216 | 0.2063377 | 199.162 |

TABLE 2-O-continued

| Case | $n_{10}$ | $k_{10}$ | $d_{10}$ | $n_{20}$ | $k_{20}$ | $d_{20}$ |
|---|---|---|---|---|---|---|
| O-11 | 1.6933082 | 0.0619759 | 212.839 | 1.6904544 | 0.1723582 | 255.647 |
| O-12 | 1.6953110 | 0.0563706 | 272.392 | 1.6905212 | 0.1778331 | 252.170 |

TABLE 2-P

| Case | $n_{10}$ | $k_{10}$ | $d_{10}$ | $n_{20}$ | $k_{20}$ | $d_{20}$ |
|---|---|---|---|---|---|---|
| P-01 | 1.9162825 | 0.2485644 | 18.297 | 1.6104232 | 0.6165991 | 83.442 |
| P-02 | 1.8960663 | 0.1719364 | 15.704 | 1.6708316 | 0.4169686 | 139.520 |
| P-03 | 1.9085468 | 0.1144956 | 13.923 | 1.7385514 | 0.3337318 | 191.444 |
| P-04 | 1.9232010 | 0.0848488 | 11.624 | 1.7455678 | 0.2771185 | 248.983 |
| P-05 | 1.7368663 | 0.1019026 | 91.322 | 1.6869885 | 0.3224919 | 130.342 |
| P-06 | 1.7401611 | 0.0886217 | 92.017 | 1.7381402 | 0.2555882 | 182.755 |
| P-07 | 1.7243481 | 0.0791015 | 92.538 | 1.6930588 | 0.2092609 | 245.988 |
| P-08 | 1.7054586 | 0.0688139 | 159.721 | 1.6812702 | 0.1871719 | 244.029 |
| P-09 | 1.6959475 | 0.0801582 | 218.084 | 1.6891859 | 0.2763746 | 128.431 |
| P-10 | 1.6918299 | 0.0707672 | 213.401 | 1.6865968 | 0.2143676 | 190.286 |
| P-11 | 1.6935501 | 0.0625258 | 213.666 | 1.6897170 | 0.1780108 | 246.097 |
| P-12 | 1.6953216 | 0.0573372 | 272.694 | 1.6885432 | 0.1839003 | 243.579 |

TABLE 2-Q

| Case | $n_{10}$ | $k_{10}$ | $d_{10}$ | $n_{20}$ | $k_{20}$ | $d_{20}$ |
|---|---|---|---|---|---|---|
| Q-01 | 1.9620125 | 0.2671830 | 17.281 | 1.6251877 | 0.6875073 | 75.420 |
| Q-02 | 1.9138120 | 0.1838008 | 15.160 | 1.6631095 | 0.4399257 | 132.541 |
| Q-03 | 1.9194872 | 0.1265886 | 13.286 | 1.7204546 | 0.3440475 | 186.036 |
| Q-04 | 1.9263431 | 0.0918160 | 11.575 | 1.7389610 | 0.2853240 | 241.421 |
| Q-05 | 1.7366416 | 0.1083929 | 90.600 | 1.6676220 | 0.3363185 | 124.136 |
| Q-06 | 1.7377165 | 0.0918810 | 91.516 | 1.7225143 | 0.2640565 | 176.484 |
| Q-07 | 1.7250070 | 0.0812670 | 92.096 | 1.6922454 | 0.2155950 | 237.445 |
| Q-08 | 1.7054487 | 0.0704565 | 158.889 | 1.6815182 | 0.1921887 | 235.428 |
| Q-09 | 1.6921136 | 0.0719896 | 214.506 | 1.6833735 | 0.2231205 | 180.418 |
| Q-10 | 1.6937452 | 0.0634118 | 214.086 | 1.6893106 | 0.1840166 | 236.602 |
| Q-11 | 1.6937402 | 0.0634247 | 214.067 | 1.6892020 | 0.1839903 | 236.644 |
| Q-12 | 1.6958036 | 0.0530688 | 271.703 | 1.6918593 | 0.1637010 | 291.452 |

TABLE 2-R

| Case | $n_{10}$ | $k_{10}$ | $d_{10}$ | $n_{20}$ | $k_{20}$ | $d_{20}$ |
|---|---|---|---|---|---|---|
| R-01 | 2.0247974 | 0.2830183 | 15.097 | 1.6266898 | 0.7191283 | 71.681 |
| R-02 | 1.9282935 | 0.1992550 | 14.428 | 1.6428403 | 0.4517072 | 126.823 |
| R-03 | 1.9213955 | 0.1387890 | 13.062 | 1.7027750 | 0.3507816 | 179.475 |
| R-04 | 1.9262173 | 0.1063571 | 11.253 | 1.7173021 | 0.2869739 | 236.027 |
| R-05 | 1.7355101 | 0.0947091 | 91.033 | 1.7079959 | 0.2693832 | 169.192 |
| R-06 | 1.7251933 | 0.0829804 | 91.728 | 1.6903561 | 0.2192539 | 228.367 |
| R-07 | 1.7054174 | 0.0718367 | 158.389 | 1.6812041 | 0.1954390 | 226.084 |
| R-08 | 1.6937830 | 0.0647049 | 214.330 | 1.6889835 | 0.1894046 | 226.812 |
| R-09 | 1.6952847 | 0.0582261 | 213.359 | 1.6934588 | 0.1611341 | 284.005 |
| R-10 | 1.6957027 | 0.0542195 | 271.586 | 1.6918383 | 0.1679902 | 281.728 |

TABLE 2-S

| Case | $n_{10}$ | $k_{10}$ | $d_{10}$ | $n_{20}$ | $k_{20}$ | $d_{20}$ |
|---|---|---|---|---|---|---|
| S-01 | 1.9316549 | 0.2158025 | 14.297 | 1.6202378 | 0.4645248 | 119.165 |
| S-02 | 1.9193011 | 0.1476126 | 13.272 | 1.6935029 | 0.3598725 | 170.049 |
| S-03 | 1.9209840 | 0.1061325 | 11.842 | 1.7241227 | 0.2946413 | 224.030 |
| S-04 | 1.9114684 | 0.1024475 | 10.224 | 1.6976483 | 0.2438294 | 285.021 |
| S-05 | 1.7364379 | 0.0969838 | 91.033 | 1.7085420 | 0.2774318 | 158.680 |
| S-06 | 1.7258494 | 0.0843222 | 91.766 | 1.6907525 | 0.2229229 | 218.067 |
| S-07 | 1.7176246 | 0.0727056 | 91.617 | 1.6784161 | 0.1842107 | 277.206 |
| S-08 | 1.7057732 | 0.0731106 | 158.709 | 1.6805392 | 0.1989479 | 215.842 |
| S-09 | 1.7053832 | 0.0633918 | 158.181 | 1.6859880 | 0.1669818 | 272.384 |
| S-10 | 1.6928552 | 0.0748243 | 216.444 | 1.6825267 | 0.2415835 | 158.548 |
| S-11 | 1.6935473 | 0.0663823 | 214.407 | 1.6888366 | 0.1945007 | 217.060 |

TABLE 2-S-continued

| Case | $n_{10}$ | $k_{10}$ | $d_{10}$ | $n_{20}$ | $k_{20}$ | $d_{20}$ |
|---|---|---|---|---|---|---|
| S-12 | 1.6950516 | 0.0596605 | 213.429 | 1.6925794 | 0.1643538 | 274.430 |
| S-13 | 1.6954923 | 0.0554795 | 271.226 | 1.6917166 | 0.1716832 | 272.356 |

TABLE 2-T

| Case | $n_{10}$ | $k_{10}$ | $d_{10}$ | $n_{20}$ | $k_{20}$ | $d_{20}$ |
|---|---|---|---|---|---|---|
| T-01 | 1.9124203 | 0.1489422 | 14.330 | 1.7039618 | 0.3787231 | 157.291 |
| T-02 | 1.9240615 | 0.1092971 | 12.001 | 1.7245262 | 0.3026113 | 214.201 |
| T-03 | 1.9069086 | 0.1015424 | 10.748 | 1.7018591 | 0.2499950 | 273.963 |
| T-04 | 1.7409810 | 0.0988730 | 91.533 | 1.7256420 | 0.2922591 | 146.253 |
| T-05 | 1.7270720 | 0.0857435 | 92.142 | 1.6923707 | 0.2292874 | 207.814 |
| T-06 | 1.7180387 | 0.0734703 | 91.877 | 1.6777924 | 0.1881130 | 267.481 |
| T-07 | 1.7063746 | 0.0744769 | 159.624 | 1.6791348 | 0.2047799 | 205.830 |
| T-08 | 1.7058520 | 0.0640895 | 158.885 | 1.6855365 | 0.1710983 | 262.479 |
| T-09 | 1.6924739 | 0.0767908 | 216.680 | 1.6850078 | 0.2520629 | 148.712 |
| T-10 | 1.6928977 | 0.0684401 | 213.761 | 1.6885850 | 0.1999527 | 208.689 |
| T-11 | 1.6947635 | 0.0610999 | 213.366 | 1.6918971 | 0.1679521 | 265.388 |
| T-12 | 1.6952371 | 0.0566636 | 270.653 | 1.6914186 | 0.1751623 | 263.994 |

TABLE 3-A

| Case | $n_{10}$ | $k_{10}$ | $d_{10}$ | $n_{20}$ | $k_{20}$ | $d_{20}$ |
|---|---|---|---|---|---|---|
| A-01 | 2.0940641 | 0.0325844 | 26.090 | 4.2290158 | 2.3935124 | 3.632 |
| A-02 | 1.9168406 | 0.1807255 | 35.662 | 5.4932306 | 0.6123354 | 19.087 |
| A-03 | 1.8970115 | 0.1529573 | 31.182 | 2.4318401 | 0.5958382 | 52.406 |
| A-04 | 1.8805879 | 0.1098415 | 13.577 | 1.7032895 | 0.2751108 | 218.193 |
| A-05 | 1.8778358 | 0.1082679 | 19.930 | 1.8340760 | 0.3677230 | 142.226 |
| A-06 | 1.8663312 | 0.0978132 | 12.232 | 1.6938400 | 0.2288643 | 277.705 |
| A-07 | 1.7888608 | 0.1060865 | 103.503 | 4.4234099 | 0.4526804 | 24.164 |
| A-08 | 1.7735009 | 0.0957437 | 98.181 | 2.0208865 | 0.4158741 | 66.693 |
| A-09 | 1.7175310 | 0.0751352 | 95.409 | 1.6658936 | 0.2054797 | 212.937 |
| A-10 | 1.7199475 | 0.0655065 | 94.621 | 1.6963762 | 0.1762614 | 266.043 |
| A-11 | 1.7156729 | 0.0770168 | 188.315 | 6.9620048 | 3.4231449 | 0.879 |
| A-12 | 1.7043499 | 0.0644952 | 165.315 | 1.6731418 | 0.1899705 | 207.250 |
| A-13 | 1.7082412 | 0.0577629 | 163.169 | 1.7075031 | 0.1626792 | 259.766 |
| A-14 | 1.6926126 | 0.0683906 | 237.184 | 6.7859369 | 2.9992529 | 0.993 |
| A-15 | 1.6890888 | 0.0745003 | 217.718 | 1.7770504 | 0.3401503 | 84.925 |
| A-16 | 1.6903292 | 0.0721915 | 210.963 | 1.7111030 | 0.2426612 | 155.846 |
| A-17 | 1.6921355 | 0.0670288 | 207.063 | 1.6978167 | 0.1954345 | 222.387 |
| A-18 | 1.6951475 | 0.0546351 | 219.259 | 1.6889102 | 0.1606659 | 263.728 |
| A-19 | 1.7004017 | 0.0599028 | 265.986 | 1.7029410 | 0.1992607 | 214.965 |

TABLE 3-B

| Case | $n_{10}$ | $k_{10}$ | $d_{10}$ | $n_{20}$ | $k_{20}$ | $d_{20}$ |
|---|---|---|---|---|---|---|
| B-01 | 1.8738578 | 0.2051029 | 37.506 | 6.9151921 | 0.6847654 | 14.288 |
| B-02 | 1.8839217 | 0.1169859 | 20.540 | 1.8488520 | 0.3990514 | 132.865 |
| B-03 | 1.8842367 | 0.1130268 | 14.059 | 1.7087850 | 0.2917115 | 208.377 |
| B-04 | 1.8705650 | 0.1010320 | 12.433 | 1.6946915 | 0.2394813 | 268.610 |
| B-05 | 1.7997475 | 0.1076402 | 101.817 | 5.7702673 | 0.5312541 | 17.283 |
| B-06 | 1.7189014 | 0.0782837 | 95.289 | 1.6643388 | 0.2165956 | 204.139 |
| B-07 | 1.7208712 | 0.0678223 | 94.558 | 1.6960341 | 0.1841027 | 257.386 |
| B-08 | 1.7236639 | 0.0843652 | 181.922 | 5.6387216 | 4.7363270 | 0.821 |
| B-09 | 1.7047019 | 0.0670962 | 165.192 | 1.6715149 | 0.1999125 | 198.564 |
| B-10 | 1.7084293 | 0.0597123 | 163.108 | 1.7074208 | 0.1697699 | 251.199 |
| B-11 | 1.6912240 | 0.0750717 | 235.933 | 5.6089359 | 4.1789938 | 0.921 |
| B-12 | 1.6881032 | 0.0788193 | 218.423 | 1.7881557 | 0.3823123 | 76.059 |
| B-13 | 1.6896993 | 0.0752193 | 211.247 | 1.7110684 | 0.2595743 | 147.061 |
| B-14 | 1.6917374 | 0.0692921 | 207.206 | 1.6970724 | 0.2053429 | 213.576 |
| B-15 | 1.6948846 | 0.0562662 | 219.172 | 1.6877325 | 0.1673191 | 255.276 |
| B-16 | 1.7002883 | 0.0618224 | 266.113 | 1.7025341 | 0.2096252 | 206.193 |
| B-17 | 1.6987256 | 0.0572006 | 264.952 | 1.6934905 | 0.1744162 | 266.771 |

TABLE 3-C

| Case | $n_{10}$ | $k_{10}$ | $d_{10}$ | $n_{20}$ | $k_{20}$ | $d_{20}$ |
|---|---|---|---|---|---|---|
| C-01 | 1.8384852 | 0.2367471 | 38.632 | 4.7928214 | 0.7766058 | 20.034 |
| C-02 | 1.8997218 | 0.1227276 | 21.226 | 1.8945709 | 0.4412749 | 121.762 |
| C-03 | 1.8867733 | 0.1201944 | 14.426 | 1.7066853 | 0.3085187 | 200.277 |
| C-04 | 1.8774399 | 0.1030917 | 12.555 | 1.6978346 | 0.2515853 | 259.495 |
| C-05 | 1.8168537 | 0.1206742 | 98.976 | 5.6725781 | 0.5943855 | 16.950 |
| C-06 | 1.7203847 | 0.0818178 | 95.097 | 1.6625491 | 0.2295920 | 195.706 |
| C-07 | 1.7222308 | 0.0703272 | 94.450 | 1.6972414 | 0.1929579 | 248.789 |
| C-08 | 1.7051744 | 0.0699535 | 164.924 | 1.6707295 | 0.2115581 | 190.095 |
| C-09 | 1.7089344 | 0.0618729 | 162.999 | 1.7091982 | 0.1777196 | 242.642 |
| C-10 | 1.6891179 | 0.0788518 | 211.328 | 1.7121044 | 0.2799946 | 139.125 |
| C-11 | 1.6914863 | 0.0717884 | 207.154 | 1.6970451 | 0.2167627 | 205.768 |
| C-12 | 1.6947006 | 0.0580661 | 219.137 | 1.6875442 | 0.1751428 | 246.865 |
| C-13 | 1.7002933 | 0.0640004 | 266.055 | 1.7022941 | 0.2216801 | 198.139 |
| C-14 | 1.6987290 | 0.0588877 | 264.992 | 1.6933668 | 0.1822428 | 258.415 |

TABLE 3-D

| Case | $n_{10}$ | $k_{10}$ | $d_{10}$ | $n_{20}$ | $k_{20}$ | $d_{20}$ |
|---|---|---|---|---|---|---|
| D-01 | 1.8909619 | 0.2198688 | 30.886 | 2.4457650 | 0.9042920 | 40.480 |
| D-02 | 1.9211597 | 0.1299283 | 20.325 | 1.8999891 | 0.4762728 | 114.977 |
| D-03 | 1.8908364 | 0.1293290 | 14.409 | 1.6971949 | 0.3219355 | 192.850 |
| D-04 | 1.8788634 | 0.1089981 | 12.666 | 1.6934061 | 0.2597468 | 251.595 |
| D-05 | 1.7209142 | 0.0850231 | 94.685 | 1.6569532 | 0.2398462 | 187.582 |
| D-06 | 1.7236493 | 0.0725136 | 94.253 | 1.6994520 | 0.2004026 | 239.752 |
| D-07 | 1.7053690 | 0.0723352 | 164.385 | 1.6690598 | 0.2212238 | 181.544 |
| D-08 | 1.7096103 | 0.0638708 | 162.799 | 1.7121782 | 0.1844639 | 233.616 |
| D-09 | 1.6884398 | 0.0822671 | 210.788 | 1.7077650 | 0.2979850 | 132.459 |
| D-10 | 1.6913141 | 0.0737244 | 206.649 | 1.6954335 | 0.2262249 | 199.430 |
| D-11 | 1.6945163 | 0.0596605 | 219.093 | 1.6879518 | 0.1823501 | 237.943 |
| D-12 | 1.7002615 | 0.0658973 | 265.562 | 1.6991117 | 0.2320843 | 190.875 |
| D-13 | 1.6987767 | 0.0602453 | 264.538 | 1.6924357 | 0.1888152 | 250.808 |

TABLE 3-E

| Case | $n_{10}$ | $k_{10}$ | $d_{10}$ | $n_{20}$ | $k_{20}$ | $d_{20}$ |
|---|---|---|---|---|---|---|
| E-01 | 1.9413239 | 0.1405566 | 18.043 | 1.8442891 | 0.4845639 | 113.109 |
| E-02 | 1.8877645 | 0.1445306 | 14.095 | 1.6688638 | 0.3235014 | 187.292 |
| E-03 | 1.8798429 | 0.1135692 | 12.637 | 1.6888514 | 0.2638544 | 243.053 |
| E-04 | 1.7202563 | 0.0870823 | 94.214 | 1.6489031 | 0.2445724 | 179.182 |
| E-05 | 1.7249517 | 0.0739360 | 94.041 | 1.7027050 | 0.2047377 | 229.905 |
| E-06 | 1.7053831 | 0.0736370 | 163.843 | 1.6671854 | 0.2267475 | 172.382 |
| E-07 | 1.7104785 | 0.0654156 | 162.671 | 1.7160090 | 0.1885946 | 223.774 |
| E-08 | 1.6877471 | 0.0844092 | 209.661 | 1.6959640 | 0.3073448 | 127.018 |
| E-09 | 1.6915115 | 0.0739491 | 205.513 | 1.6904122 | 0.2298496 | 196.556 |
| E-10 | 1.6941672 | 0.0608347 | 218.889 | 1.6879018 | 0.1872431 | 228.501 |
| E-11 | 1.6941096 | 0.0560046 | 215.482 | 1.6938988 | 0.1599964 | 287.470 |
| E-12 | 1.7000691 | 0.0669711 | 264.757 | 1.6924460 | 0.2378630 | 184.028 |
| E-13 | 1.6987341 | 0.0608862 | 263.855 | 1.6911373 | 0.1924284 | 243.250 |

TABLE 3-F

| Case | $n_{10}$ | $k_{10}$ | $d_{10}$ | $n_{20}$ | $k_{20}$ | $d_{20}$ |
|---|---|---|---|---|---|---|
| F-01 | 1.8998120 | 0.2622743 | 21.573 | 1.6944131 | 0.7809017 | 53.320 |
| F-02 | 1.9599431 | 0.1538418 | 15.993 | 1.7907917 | 0.4780154 | 111.028 |
| F-03 | 1.8792360 | 0.1119058 | 12.895 | 1.6940206 | 0.2681658 | 231.714 |
| F-04 | 1.8920036 | 0.0671877 | 11.926 | 1.7462722 | 0.2347435 | 280.522 |
| F-05 | 1.7198405 | 0.0878543 | 93.971 | 1.6452515 | 0.2473168 | 169.419 |
| F-06 | 1.7267515 | 0.0746914 | 93.982 | 1.7088385 | 0.2076415 | 218.911 |
| F-07 | 1.7286377 | 0.0697592 | 94.711 | 1.7257237 | 0.1796886 | 273.487 |
| F-08 | 1.7058235 | 0.0740364 | 163.674 | 1.6690540 | 0.2306007 | 161.946 |
| F-09 | 1.6871196 | 0.0856014 | 208.540 | 1.6832134 | 0.3092532 | 121.170 |
| F-10 | 1.6936372 | 0.0616799 | 218.466 | 1.6877720 | 0.1900717 | 218.772 |
| F-11 | 1.6996002 | 0.0674630 | 264.231 | 1.6851097 | 0.2396601 | 175.944 |
| F-12 | 1.6985143 | 0.0611760 | 263.586 | 1.6903246 | 0.1936289 | 234.054 |

TABLE 3-G

| Case | $n_{10}$ | $k_{10}$ | $d_{10}$ | $n_{20}$ | $k_{20}$ | $d_{20}$ |
|---|---|---|---|---|---|---|
| G-01 | 1.8814830 | 0.2936564 | 22.098 | 1.6321609 | 0.8097385 | 46.190 |
| G-02 | 1.9657443 | 0.1688741 | 15.852 | 1.7726563 | 0.4923001 | 103.170 |
| G-03 | 1.8787154 | 0.1109169 | 13.263 | 1.6996278 | 0.2745566 | 220.404 |
| G-04 | 1.8913468 | 0.0695388 | 12.162 | 1.7469121 | 0.2387131 | 270.807 |
| G-05 | 1.7209187 | 0.0883668 | 94.055 | 1.6482914 | 0.2540527 | 158.511 |
| G-06 | 1.7288665 | 0.0756184 | 94.090 | 1.7153723 | 0.2125971 | 207.924 |
| G-07 | 1.7286370 | 0.0709992 | 94.923 | 1.7241262 | 0.1831189 | 263.961 |
| G-08 | 1.7068032 | 0.0744994 | 163.814 | 1.6739446 | 0.2371534 | 151.052 |
| G-09 | 1.6862856 | 0.0878163 | 208.124 | 1.6736237 | 0.3138657 | 112.320 |
| G-10 | 1.6931399 | 0.0624918 | 217.968 | 1.6872372 | 0.1926334 | 209.546 |
| G-11 | 1.6935780 | 0.0575917 | 214.501 | 1.6927449 | 0.1631490 | 269.036 |
| G-12 | 1.6987845 | 0.0682876 | 264.829 | 1.6826884 | 0.2430960 | 164.540 |
| G-13 | 1.6982075 | 0.0620058 | 264.409 | 1.6907687 | 0.1959423 | 222.065 |

TABLE 3-H

| Case | $n_{10}$ | $k_{10}$ | $d_{10}$ | $n_{20}$ | $k_{20}$ | $d_{20}$ |
|---|---|---|---|---|---|---|
| H-01 | 1.8508920 | 0.3299462 | 26.713 | 1.6561984 | 1.0215947 | 31.481 |
| H-02 | 1.9432602 | 0.1828608 | 18.534 | 1.7922587 | 0.5435792 | 89.452 |
| H-03 | 1.8788012 | 0.1571474 | 15.200 | 1.6553949 | 0.3498651 | 157.519 |
| H-04 | 1.8809660 | 0.1122948 | 13.670 | 1.7045069 | 0.2862016 | 210.391 |
| H-05 | 1.8914032 | 0.0691945 | 12.762 | 1.7559855 | 0.2487147 | 259.753 |
| H-06 | 1.7233184 | 0.0905387 | 94.254 | 1.6520214 | 0.2670378 | 148.504 |
| H-07 | 1.7297992 | 0.0774990 | 94.232 | 1.7157415 | 0.2209454 | 198.899 |
| H-08 | 1.7292921 | 0.0722395 | 94.957 | 1.7247476 | 0.1892941 | 254.857 |
| H-09 | 1.7076375 | 0.0765186 | 163.992 | 1.6752795 | 0.2482558 | 141.650 |
| H-10 | 1.6902915 | 0.0790058 | 206.654 | 1.6879680 | 0.2475793 | 161.284 |
| H-11 | 1.6929156 | 0.0637318 | 217.693 | 1.6856131 | 0.1973081 | 201.188 |
| H-12 | 1.6935338 | 0.0581307 | 214.870 | 1.6920922 | 0.1667488 | 259.776 |
| H-13 | 1.6984313 | 0.0697413 | 266.256 | 1.6871666 | 0.2538157 | 152.235 |
| H-14 | 1.6980068 | 0.0633264 | 265.782 | 1.6912942 | 0.2022310 | 210.360 |
| H-15 | 1.6970347 | 0.0530849 | 275.682 | 1.6884244 | 0.1714348 | 256.304 |

TABLE 3-I

| Case | $n_{10}$ | $k_{10}$ | $d_{10}$ | $n_{20}$ | $k_{20}$ | $d_{20}$ |
|---|---|---|---|---|---|---|
| I-01 | 1.9192397 | 0.1987767 | 21.654 | 1.8264016 | 0.6189774 | 76.882 |
| I-02 | 1.8910111 | 0.1570861 | 15.844 | 1.6782576 | 0.3828036 | 146.288 |
| I-03 | 1.8874292 | 0.1170062 | 13.907 | 1.7063011 | 0.3024107 | 201.867 |
| I-04 | 1.8928956 | 0.0800147 | 12.695 | 1.7424852 | 0.2571531 | 254.323 |
| I-05 | 1.7266669 | 0.0953661 | 94.323 | 1.6542284 | 0.2869718 | 139.595 |
| I-06 | 1.7296393 | 0.0805906 | 94.242 | 1.7097783 | 0.2319224 | 191.543 |
| I-07 | 1.7299249 | 0.0737621 | 94.784 | 1.7252153 | 0.1970612 | 246.491 |
| I-08 | 1.6899362 | 0.0817785 | 208.164 | 1.6924320 | 0.2651701 | 148.618 |
| I-09 | 1.6928826 | 0.0657282 | 217.665 | 1.6832004 | 0.2055611 | 193.166 |
| I-10 | 1.6935628 | 0.0590519 | 215.464 | 1.6914497 | 0.1728158 | 250.826 |
| I-11 | 1.6988269 | 0.0719884 | 266.949 | 1.6930572 | 0.2717519 | 142.233 |
| I-12 | 1.6981501 | 0.0650380 | 266.102 | 1.6910453 | 0.2123559 | 201.439 |
| I-13 | 1.6968464 | 0.0544760 | 275.663 | 1.6860880 | 0.1778694 | 248.323 |

TABLE 3-J

| Case | $n_{10}$ | $k_{10}$ | $d_{10}$ | $n_{20}$ | $k_{20}$ | $d_{20}$ |
|---|---|---|---|---|---|---|
| J-01 | 1.9207610 | 0.2195112 | 22.312 | 1.8258536 | 0.6986358 | 68.737 |
| J-02 | 1.9093240 | 0.1610220 | 16.027 | 1.6981498 | 0.4189775 | 136.163 |
| J-03 | 1.8948938 | 0.1257399 | 13.855 | 1.7003095 | 0.3177305 | 194.613 |
| J-04 | 1.8966282 | 0.0900141 | 12.530 | 1.7305926 | 0.2658040 | 248.346 |
| J-05 | 1.7293323 | 0.0843251 | 93.974 | 1.7018671 | 0.2432029 | 184.391 |
| J-06 | 1.7301568 | 0.0757850 | 94.458 | 1.7237225 | 0.2045935 | 238.500 |
| J-07 | 1.6896128 | 0.0845530 | 207.994 | 1.6930315 | 0.2839311 | 141.193 |
| J-08 | 1.6928686 | 0.0680057 | 217.789 | 1.6806392 | 0.2160083 | 184.741 |
| J-09 | 1.6935394 | 0.0604311 | 215.751 | 1.6908086 | 0.1799717 | 242.024 |
| J-10 | 1.6995193 | 0.0747728 | 266.467 | 1.6953349 | 0.2921202 | 134.479 |
| J-11 | 1.6986281 | 0.0669339 | 265.290 | 1.6902923 | 0.2238725 | 194.429 |
| J-12 | 1.6967467 | 0.0559821 | 275.562 | 1.6844237 | 0.1853984 | 239.846 |

TABLE 3-K

| Case | $n_{10}$ | $k_{10}$ | $d_{10}$ | $n_{20}$ | $k_{20}$ | $d_{20}$ |
|---|---|---|---|---|---|---|
| K-01 | 1.9214172 | 0.1753360 | 15.452 | 1.6804411 | 0.4367098 | 129.893 |
| K-02 | 1.9009993 | 0.1351301 | 13.611 | 1.6899586 | 0.3280314 | 187.370 |
| K-03 | 1.8999222 | 0.0954510 | 12.469 | 1.7262130 | 0.2728992 | 240.318 |
| K-04 | 1.7289797 | 0.0876375 | 93.472 | 1.6943958 | 0.2513033 | 176.630 |
| K-05 | 1.7301397 | 0.0779683 | 94.062 | 1.7208177 | 0.2098777 | 230.281 |
| K-06 | 1.6897075 | 0.0859154 | 206.600 | 1.6860653 | 0.2958058 | 138.770 |
| K-07 | 1.6928599 | 0.0698704 | 218.100 | 1.6784557 | 0.2260347 | 175.355 |
| K-08 | 1.6933895 | 0.0619572 | 215.832 | 1.6904996 | 0.1864736 | 232.785 |
| K-09 | 1.6967442 | 0.0572224 | 275.439 | 1.6838077 | 0.1920294 | 230.401 |

TABLE 3-L

| Case | $n_{10}$ | $k_{10}$ | $d_{10}$ | $n_{20}$ | $k_{20}$ | $d_{20}$ |
|---|---|---|---|---|---|---|
| L-01 | 1.9907624 | 0.2658843 | 16.877 | 1.6777634 | 0.7245088 | 66.041 |
| L-02 | 1.9229056 | 0.1943367 | 14.896 | 1.6435696 | 0.4392836 | 124.711 |
| L-03 | 1.9003143 | 0.1434936 | 13.590 | 1.6791032 | 0.3336019 | 179.139 |
| L-04 | 1.9049048 | 0.0972823 | 12.362 | 1.7269066 | 0.2779612 | 230.763 |
| L-05 | 1.7296380 | 0.0899801 | 93.128 | 1.6935089 | 0.2572784 | 167.093 |
| L-06 | 1.7305285 | 0.0799609 | 93.907 | 1.7196209 | 0.2133806 | 220.978 |
| L-07 | 1.6927568 | 0.0712762 | 218.499 | 1.6781695 | 0.2348207 | 164.929 |
| L-08 | 1.6930586 | 0.0635805 | 215.646 | 1.6903056 | 0.1916344 | 223.237 |
| L-09 | 1.6939267 | 0.0583165 | 213.162 | 1.6934648 | 0.1626221 | 282.414 |
| L-10 | 1.6970265 | 0.0526106 | 273.430 | 1.6908020 | 0.1682270 | 277.869 |

TABLE 3-M

| Case | $n_{10}$ | $k_{10}$ | $d_{10}$ | $n_{20}$ | $k_{20}$ | $d_{20}$ |
|---|---|---|---|---|---|---|
| M-01 | 1.8968086 | 0.1457981 | 14.128 | 1.6815336 | 0.3444919 | 167.613 |
| M-02 | 1.9070303 | 0.0954881 | 12.717 | 1.7369802 | 0.2856144 | 218.968 |
| M-03 | 1.9016797 | 0.0905797 | 10.946 | 1.7110902 | 0.2381911 | 280.601 |
| M-04 | 1.7329805 | 0.0916823 | 93.296 | 1.7056329 | 0.2670261 | 155.076 |
| M-05 | 1.7161015 | 0.0708259 | 94.224 | 1.6780965 | 0.1788543 | 274.399 |
| M-06 | 1.6922053 | 0.0726320 | 218.650 | 1.6800076 | 0.2436881 | 154.426 |
| M-07 | 1.6924923 | 0.0653867 | 214.871 | 1.6897434 | 0.1959626 | 214.392 |
| M-08 | 1.6935584 | 0.0598502 | 212.072 | 1.6927128 | 0.1654173 | 274.211 |
| M-09 | 1.6967916 | 0.0533770 | 273.133 | 1.6904661 | 0.1709158 | 268.389 |

TABLE 3-N

| Case | $n_{10}$ | $k_{10}$ | $d_{10}$ | $n_{20}$ | $k_{20}$ | $d_{20}$ |
|---|---|---|---|---|---|---|
| N-01 | 1.8931613 | 0.1437464 | 15.228 | 1.6981871 | 0.3648670 | 154.635 |
| N-02 | 1.9086798 | 0.0925277 | 13.463 | 1.7547782 | 0.2987738 | 206.696 |
| N-03 | 1.8957546 | 0.1021679 | 11.154 | 1.6965397 | 0.2414267 | 273.752 |
| N-04 | 1.7383088 | 0.0935643 | 93.735 | 1.7255584 | 0.2828024 | 142.972 |
| N-05 | 1.7163304 | 0.0717315 | 94.330 | 1.6763108 | 0.1832109 | 265.207 |
| N-06 | 1.7036586 | 0.0640636 | 161.836 | 1.6842842 | 0.1670348 | 260.021 |
| N-07 | 1.6919166 | 0.0672926 | 213.353 | 1.6889376 | 0.2002175 | 207.074 |
| N-08 | 1.6911838 | 0.0743991 | 218.060 | 1.6805827 | 0.2524809 | 145.761 |
| N-09 | 1.6942185 | 0.0545821 | 211.644 | 1.6930391 | 0.1466022 | 321.654 |
| N-10 | 1.6965335 | 0.0539924 | 273.036 | 1.6894839 | 0.1738185 | 259.712 |

TABLE 3-O

| Case | $n_{10}$ | $k_{10}$ | $d_{10}$ | $n_{20}$ | $k_{20}$ | $d_{20}$ |
|---|---|---|---|---|---|---|
| O-01 | 1.8962402 | 0.1446868 | 16.058 | 1.7149739 | 0.3909951 | 143.691 |
| O-02 | 1.9162756 | 0.0920008 | 13.917 | 1.7705409 | 0.3160160 | 196.340 |
| O-03 | 1.8972293 | 0.1039493 | 11.503 | 1.6986687 | 0.2516185 | 264.437 |
| O-04 | 1.7171631 | 0.0735355 | 94.241 | 1.6756859 | 0.1901883 | 256.660 |
| O-05 | 1.7039366 | 0.0654419 | 161.496 | 1.6849902 | 0.1728826 | 251.490 |
| O-06 | 1.6903081 | 0.0771344 | 216.305 | 1.6786590 | 0.2613948 | 139.207 |
| O-07 | 1.6915399 | 0.0690906 | 212.338 | 1.6881028 | 0.2062149 | 199.770 |
| O-08 | 1.6931731 | 0.0615887 | 211.917 | 1.6918937 | 0.1729009 | 256.415 |
| O-09 | 1.6963857 | 0.0546855 | 273.170 | 1.6879125 | 0.1780863 | 251.444 |

TABLE 3-P

| Case | $n_{10}$ | $k_{10}$ | $d_{10}$ | $n_{20}$ | $k_{20}$ | $d_{20}$ |
|---|---|---|---|---|---|---|
| P-01 | 1.9078860 | 0.1508452 | 16.208 | 1.7232027 | 0.4201511 | 134.826 |
| P-02 | 1.9270939 | 0.0963716 | 13.863 | 1.7738090 | 0.3331580 | 188.374 |
| P-03 | 1.9009914 | 0.1079582 | 11.657 | 1.6981472 | 0.2622250 | 256.036 |
| P-04 | 1.7182026 | 0.0759211 | 93.910 | 1.6754262 | 0.1979303 | 248.261 |
| P-05 | 1.7037276 | 0.0670447 | 160.452 | 1.6860603 | 0.1785858 | 243.357 |
| P-06 | 1.6914048 | 0.0705280 | 212.904 | 1.6862460 | 0.2142065 | 190.804 |
| P-07 | 1.6932944 | 0.0619823 | 213.027 | 1.6912789 | 0.1784688 | 246.475 |
| P-08 | 1.6971949 | 0.0758678 | 268.193 | 1.6840809 | 0.2789945 | 135.240 |
| P-09 | 1.6963748 | 0.0557064 | 273.316 | 1.6860970 | 0.1841499 | 242.973 |

TABLE 3-Q

| Case | $n_{10}$ | $k_{10}$ | $d_{10}$ | $n_{20}$ | $k_{20}$ | $d_{20}$ |
|---|---|---|---|---|---|---|
| Q-01 | 1.9345747 | 0.1082213 | 13.373 | 1.7554016 | 0.3434593 | 183.042 |
| Q-02 | 1.9100928 | 0.1149883 | 11.317 | 1.6916658 | 0.2694423 | 248.707 |
| Q-03 | 1.9218874 | 0.1634556 | 15.608 | 1.7091703 | 0.4402763 | 128.647 |
| Q-04 | 1.7188695 | 0.0782891 | 93.463 | 1.6745648 | 0.2040549 | 239.614 |
| Q-05 | 1.7031385 | 0.0685384 | 159.293 | 1.6866422 | 0.1829170 | 234.977 |
| Q-06 | 1.6934237 | 0.0627890 | 213.592 | 1.6908665 | 0.1844160 | 236.853 |
| Q-07 | 1.6934242 | 0.0627998 | 213.572 | 1.6907829 | 0.1843934 | 236.891 |
| Q-08 | 1.6985617 | 0.0777714 | 264.836 | 1.6854326 | 0.2962369 | 131.733 |
| Q-09 | 1.6963947 | 0.0569261 | 273.344 | 1.6845211 | 0.1907955 | 233.824 |

TABLE 3-R

| Case | $n_{10}$ | $k_{10}$ | $d_{10}$ | $n_{20}$ | $k_{20}$ | $d_{20}$ |
|---|---|---|---|---|---|---|
| R-01 | 1.9329388 | 0.1795701 | 14.789 | 1.6812994 | 0.4483886 | 123.825 |
| R-02 | 1.9368237 | 0.1224596 | 12.921 | 1.7305084 | 0.3477304 | 177.704 |
| R-03 | 1.9141366 | 0.1196035 | 11.206 | 1.6882344 | 0.2744889 | 240.000 |
| R-04 | 1.7191879 | 0.0801581 | 93.133 | 1.6734445 | 0.2077092 | 230.286 |
| R-05 | 1.7029035 | 0.0699625 | 158.805 | 1.6865116 | 0.1862225 | 225.674 |
| R-06 | 1.6933701 | 0.0640425 | 213.864 | 1.6904005 | 0.1898312 | 227.117 |
| R-07 | 1.6939475 | 0.0576888 | 212.435 | 1.6925921 | 0.1618810 | 285.048 |
| R-08 | 1.6969386 | 0.0533290 | 271.986 | 1.6924288 | 0.1673219 | 281.091 |

TABLE 3-S

| Case | $n_{10}$ | $k_{10}$ | $d_{10}$ | $n_{20}$ | $k_{20}$ | $d_{20}$ |
|---|---|---|---|---|---|---|
| S-01 | 1.9315873 | 0.1333486 | 13.169 | 1.7169625 | 0.3552140 | 168.729 |
| S-02 | 1.9153217 | 0.1206110 | 11.351 | 1.6899751 | 0.2797802 | 229.265 |
| S-03 | 1.8972445 | 0.1001874 | 10.604 | 1.6952918 | 0.2334251 | 285.679 |
| S-04 | 1.7198506 | 0.0813984 | 93.215 | 1.6740113 | 0.2110946 | 219.867 |
| S-05 | 1.7209927 | 0.0705203 | 93.408 | 1.6975541 | 0.1793898 | 273.456 |
| S-06 | 1.7035608 | 0.0713918 | 159.462 | 1.6857491 | 0.1901066 | 215.251 |
| S-07 | 1.6916743 | 0.0742011 | 216.137 | 1.6815589 | 0.2413942 | 158.897 |
| S-08 | 1.6930483 | 0.0657083 | 213.861 | 1.6902271 | 0.1951191 | 217.477 |
| S-09 | 1.6936984 | 0.0591625 | 212.273 | 1.6918699 | 0.1652801 | 275.792 |
| S-10 | 1.6968810 | 0.0544417 | 271.786 | 1.6922876 | 0.1708476 | 271.501 |

TABLE 3-T

| Case | $n_{10}$ | $k_{10}$ | $d_{10}$ | $n_{20}$ | $k_{20}$ | $d_{20}$ |
|---|---|---|---|---|---|---|
| T-01 | 1.9249373 | 0.1361664 | 14.155 | 1.7251855 | 0.3723543 | 156.237 |
| T-02 | 1.9134695 | 0.1202777 | 11.822 | 1.6947701 | 0.2878755 | 218.180 |
| T-03 | 1.8970797 | 0.0999072 | 10.899 | 1.6978665 | 0.2388400 | 275.054 |
| T-04 | 1.7208445 | 0.0825059 | 93.633 | 1.6746972 | 0.2167421 | 209.700 |
| T-05 | 1.7215107 | 0.0711590 | 93.747 | 1.6977852 | 0.1834377 | 263.540 |
| T-06 | 1.7046380 | 0.0728087 | 160.840 | 1.6842748 | 0.1961079 | 204.946 |
| T-07 | 1.7071945 | 0.0643745 | 160.796 | 1.7036838 | 0.1674255 | 259.158 |
| T-08 | 1.6911424 | 0.0761042 | 216.237 | 1.6835271 | 0.2518702 | 149.208 |
| T-09 | 1.6924731 | 0.0678273 | 212.933 | 1.6899027 | 0.2006809 | 209.434 |
| T-10 | 1.6944113 | 0.0547711 | 211.610 | 1.6931553 | 0.1468072 | 323.528 |
| T-11 | 1.6967389 | 0.0554960 | 271.524 | 1.6919127 | 0.1743507 | 262.739 |

TABLE 4-A

| Case | $n_{10}$ | $k_{10}$ | $d_{10}$ | $n_{20}$ | $k_{20}$ | $d_{20}$ |
|---|---|---|---|---|---|---|
| A-01 | 2.070 | 0.020 | 27.974 | 5.553 | 3.053 | 2.024 |
| A-02 | 1.955 | 0.138 | 34.826 | 9.284 | 0.606 | 10.907 |
| A-03 | 1.895 | 0.133 | 29.218 | 2.177 | 0.543 | 63.407 |
| A-04 | 1.875 | 0.110 | 17.990 | 1.753 | 0.330 | 152.930 |
| A-05 | 1.870 | 0.101 | 13.959 | 1.700 | 0.255 | 218.765 |
| A-06 | 1.867 | 0.070 | 13.235 | 1.732 | 0.221 | 270.745 |
| A-07 | 1.699 | 0.063 | 165.016 | 1.698 | 0.180 | 204.222 |
| A-08 | 1.693 | 0.058 | 157.920 | 1.698 | 0.154 | 265.886 |
| A-09 | 1.692 | 0.069 | 236.756 | 6.942 | 3.076 | 0.950 |
| A-10 | 1.694 | 0.074 | 217.672 | 1.788 | 0.339 | 84.006 |
| A-11 | 1.699 | 0.071 | 210.274 | 1.718 | 0.242 | 154.667 |
| A-12 | 1.698 | 0.065 | 207.280 | 1.695 | 0.194 | 219.490 |
| A-13 | 1.695 | 0.054 | 219.181 | 1.688 | 0.161 | 263.755 |

TABLE 4-B

| Case | $n_{10}$ | $k_{10}$ | $d_{10}$ | $n_{20}$ | $k_{20}$ | $d_{20}$ |
|---|---|---|---|---|---|---|
| B-01 | 1.894 | 0.182 | 37.493 | 9.246 | 0.662 | 10.628 |
| B-02 | 1.881 | 0.116 | 18.625 | 1.766 | 0.358 | 142.939 |
| B-03 | 1.874 | 0.105 | 14.298 | 1.701 | 0.269 | 209.610 |
| B-04 | 1.872 | 0.074 | 13.408 | 1.733 | 0.231 | 261.989 |
| B-05 | 1.693 | 0.060 | 158.097 | 1.697 | 0.160 | 257.142 |
| B-06 | 1.690 | 0.074 | 235.203 | 5.632 | 4.204 | 0.919 |
| B-07 | 1.693 | 0.078 | 218.334 | 1.803 | 0.382 | 74.994 |
| B-08 | 1.699 | 0.074 | 210.503 | 1.719 | 0.259 | 145.797 |
| B-09 | 1.698 | 0.067 | 207.468 | 1.694 | 0.203 | 210.546 |
| B-10 | 1.695 | 0.055 | 219.130 | 1.687 | 0.167 | 255.274 |

TABLE 4-C

| Case | $n_{10}$ | $k_{10}$ | $d_{10}$ | $n_{20}$ | $k_{20}$ | $d_{20}$ |
|---|---|---|---|---|---|---|
| C-01 | 1.855 | 0.222 | 38.795 | 9.554 | 0.714 | 10.003 |
| C-02 | 1.894 | 0.121 | 19.092 | 1.787 | 0.392 | 133.195 |
| C-03 | 1.879 | 0.110 | 14.598 | 1.702 | 0.285 | 201.011 |
| C-04 | 1.879 | 0.076 | 13.458 | 1.736 | 0.242 | 253.439 |
| C-05 | 1.692 | 0.062 | 158.198 | 1.697 | 0.168 | 248.709 |
| C-06 | 1.699 | 0.078 | 210.437 | 1.720 | 0.280 | 137.855 |
| C-07 | 1.698 | 0.070 | 207.381 | 1.693 | 0.215 | 202.487 |
| C-08 | 1.695 | 0.057 | 219.158 | 1.687 | 0.175 | 246.765 |

TABLE 4-D

| Case | $n_{10}$ | $k_{10}$ | $d_{10}$ | $n_{20}$ | $k_{20}$ | $d_{20}$ |
|---|---|---|---|---|---|---|
| D-01 | 1.921 | 0.198 | 29.852 | 2.410 | 0.850 | 42.336 |
| D-02 | 1.907 | 0.132 | 18.597 | 1.779 | 0.418 | 126.566 |
| D-03 | 1.883 | 0.117 | 14.666 | 1.698 | 0.298 | 192.788 |
| D-04 | 1.885 | 0.078 | 13.425 | 1.738 | 0.251 | 244.904 |
| D-05 | 1.692 | 0.064 | 158.019 | 1.697 | 0.174 | 240.368 |
| D-06 | 1.700 | 0.081 | 209.560 | 1.716 | 0.298 | 131.419 |
| D-07 | 1.698 | 0.072 | 206.609 | 1.692 | 0.225 | 195.862 |
| D-08 | 1.695 | 0.059 | 219.174 | 1.688 | 0.183 | 237.750 |
| D-09 | 1.705 | 0.053 | 283.412 | 1.691 | 0.185 | 233.362 |

TABLE 4-E

| Case | $n_{10}$ | $k_{10}$ | $d_{10}$ | $n_{20}$ | $k_{20}$ | $d_{20}$ |
|---|---|---|---|---|---|---|
| E-01 | 1.943 | 0.213 | 22.907 | 1.902 | 0.785 | 53.731 |
| E-02 | 1.907 | 0.153 | 17.372 | 1.716 | 0.418 | 124.143 |
| E-03 | 1.884 | 0.123 | 14.585 | 1.691 | 0.305 | 184.536 |
| E-04 | 1.891 | 0.078 | 13.392 | 1.743 | 0.257 | 235.129 |
| E-05 | 1.691 | 0.066 | 157.377 | 1.696 | 0.178 | 232.195 |
| E-06 | 1.699 | 0.072 | 204.994 | 1.688 | 0.231 | 192.230 |
| E-07 | 1.695 | 0.060 | 219.095 | 1.689 | 0.188 | 228.102 |
| E-08 | 1.704 | 0.054 | 283.255 | 1.689 | 0.189 | 224.255 |

TABLE 4-F

| Case | $n_{10}$ | $k_{10}$ | $d_{10}$ | $n_{20}$ | $k_{20}$ | $d_{20}$ |
|---|---|---|---|---|---|---|
| F-01 | 1.895 | 0.076 | 13.537 | 1.753 | 0.262 | 223.848 |
| F-02 | 1.882 | 0.126 | 14.752 | 1.688 | 0.309 | 174.672 |
| F-03 | 1.690 | 0.068 | 155.845 | 1.693 | 0.181 | 224.616 |
| F-04 | 1.701 | 0.084 | 206.275 | 1.686 | 0.310 | 122.505 |
| F-05 | 1.693 | 0.070 | 221.382 | 1.667 | 0.231 | 161.928 |
| F-06 | 1.695 | 0.060 | 218.851 | 1.689 | 0.190 | 218.129 |
| F-07 | 1.695 | 0.055 | 215.764 | 1.693 | 0.162 | 277.062 |
| F-08 | 1.703 | 0.049 | 278.302 | 1.691 | 0.159 | 273.241 |

TABLE 4-G

| Case | $n_{10}$ | $k_{10}$ | $d_{10}$ | $n_{20}$ | $k_{20}$ | $d_{20}$ |
|---|---|---|---|---|---|---|
| G-01 | 1.881 | 0.189 | 17.242 | 1.617 | 0.409 | 111.921 |
| G-02 | 1.879 | 0.125 | 15.444 | 1.697 | 0.320 | 162.536 |
| G-03 | 1.898 | 0.073 | 14.029 | 1.767 | 0.271 | 211.582 |
| G-04 | 1.873 | 0.092 | 12.003 | 1.696 | 0.218 | 280.785 |
| G-05 | 1.715 | 0.067 | 99.925 | 1.686 | 0.167 | 269.056 |
| G-06 | 1.693 | 0.070 | 221.230 | 1.668 | 0.236 | 151.884 |
| G-07 | 1.695 | 0.061 | 218.569 | 1.689 | 0.193 | 208.598 |
| G-08 | 1.695 | 0.055 | 215.552 | 1.692 | 0.164 | 267.637 |

TABLE 4-H

| Case | $n_{10}$ | $k_{10}$ | $d_{10}$ | $n_{20}$ | $k_{20}$ | $d_{20}$ |
|---|---|---|---|---|---|---|
| H-01 | 1.880 | 0.126 | 16.279 | 1.709 | 0.340 | 151.148 |
| H-02 | 1.901 | 0.074 | 14.624 | 1.778 | 0.284 | 201.087 |
| H-03 | 1.874 | 0.095 | 12.218 | 1.694 | 0.225 | 271.916 |
| H-04 | 1.716 | 0.068 | 99.848 | 1.687 | 0.173 | 259.863 |
| H-05 | 1.692 | 0.072 | 220.366 | 1.668 | 0.244 | 143.647 |
| H-06 | 1.695 | 0.062 | 218.447 | 1.688 | 0.198 | 200.044 |
| H-07 | 1.695 | 0.056 | 215.754 | 1.691 | 0.167 | 258.621 |

TABLE 4-I

| Case | $n_{10}$ | $k_{10}$ | $d_{10}$ | $n_{20}$ | $k_{20}$ | $d_{20}$ |
|---|---|---|---|---|---|---|
| I-01 | 1.888 | 0.130 | 16.763 | 1.718 | 0.366 | 141.793 |
| I-02 | 1.903 | 0.081 | 14.911 | 1.775 | 0.299 | 193.492 |
| I-03 | 1.880 | 0.095 | 12.432 | 1.700 | 0.236 | 262.434 |
| I-04 | 1.693 | 0.063 | 156.037 | 1.696 | 0.165 | 252.531 |
| I-05 | 1.695 | 0.064 | 218.418 | 1.685 | 0.207 | 192.031 |
| I-06 | 1.695 | 0.057 | 216.093 | 1.691 | 0.173 | 249.945 |
| I-07 | 1.704 | 0.051 | 278.289 | 1.691 | 0.173 | 246.105 |

TABLE 4-J

| Case | $n_{10}$ | $k_{10}$ | $d_{10}$ | $n_{20}$ | $k_{20}$ | $d_{20}$ |
|---|---|---|---|---|---|---|
| J-01 | 1.902 | 0.140 | 16.621 | 1.717 | 0.393 | 134.110 |
| J-02 | 1.906 | 0.093 | 14.821 | 1.761 | 0.312 | 187.587 |
| J-03 | 1.888 | 0.096 | 12.503 | 1.706 | 0.247 | 253.021 |
| J-04 | 1.694 | 0.066 | 218.392 | 1.682 | 0.217 | 183.765 |
| J-05 | 1.695 | 0.059 | 216.276 | 1.691 | 0.180 | 241.184 |
| J-06 | 1.704 | 0.052 | 278.098 | 1.689 | 0.180 | 237.690 |

TABLE 4-K

| Case | $n_{10}$ | $k_{10}$ | $d_{10}$ | $n_{20}$ | $k_{20}$ | $d_{20}$ |
|---|---|---|---|---|---|---|
| K-01 | 1.915 | 0.153 | 15.972 | 1.700 | 0.410 | 128.035 |
| K-02 | 1.908 | 0.105 | 14.452 | 1.741 | 0.319 | 181.864 |
| K-03 | 1.895 | 0.097 | 12.386 | 1.708 | 0.254 | 244.026 |
| K-04 | 1.692 | 0.060 | 153.833 | 1.696 | 0.152 | 294.292 |

TABLE 4-K-continued

| Case | $n_{10}$ | $k_{10}$ | $d_{10}$ | $n_{20}$ | $k_{20}$ | $d_{20}$ |
|---|---|---|---|---|---|---|
| K-05 | 1.694 | 0.068 | 218.491 | 1.679 | 0.227 | 174.638 |
| K-06 | 1.695 | 0.060 | 216.291 | 1.691 | 0.187 | 231.949 |
| K-07 | 1.705 | 0.054 | 277.828 | 1.688 | 0.185 | 228.622 |

TABLE 4-L

| Case | $n_{10}$ | $k_{10}$ | $d_{10}$ | $n_{20}$ | $k_{20}$ | $d_{20}$ |
|---|---|---|---|---|---|---|
| L-01 | 1.919 | 0.168 | 15.470 | 1.675 | 0.416 | 121.998 |
| L-02 | 1.909 | 0.114 | 14.219 | 1.728 | 0.323 | 174.431 |
| L-03 | 1.897 | 0.102 | 12.252 | 1.703 | 0.257 | 235.332 |
| L-04 | 1.692 | 0.061 | 153.490 | 1.695 | 0.154 | 285.775 |
| L-05 | 1.694 | 0.069 | 218.807 | 1.679 | 0.236 | 164.294 |
| L-06 | 1.695 | 0.061 | 216.166 | 1.690 | 0.192 | 222.296 |
| L-07 | 1.696 | 0.056 | 214.076 | 1.694 | 0.163 | 280.805 |
| L-08 | 1.706 | 0.051 | 276.333 | 1.706 | 0.162 | 273.925 |

TABLE 4-M

| Case | $n_{10}$ | $k_{10}$ | $d_{10}$ | $n_{20}$ | $k_{20}$ | $d_{20}$ |
|---|---|---|---|---|---|---|
| M-01 | 1.909 | 0.116 | 14.671 | 1.733 | 0.334 | 163.102 |
| M-02 | 1.895 | 0.106 | 12.483 | 1.700 | 0.261 | 225.249 |
| M-03 | 1.879 | 0.083 | 11.828 | 1.710 | 0.220 | 280.433 |
| M-04 | 1.694 | 0.071 | 219.020 | 1.682 | 0.245 | 153.670 |
| M-05 | 1.695 | 0.063 | 215.746 | 1.690 | 0.197 | 212.983 |
| M-06 | 1.696 | 0.057 | 213.723 | 1.693 | 0.165 | 271.596 |
| M-07 | 1.706 | 0.052 | 276.363 | 1.706 | 0.164 | 264.087 |

TABLE 4-N

| Case | $n_{10}$ | $k_{10}$ | $d_{10}$ | $n_{20}$ | $k_{20}$ | $d_{20}$ |
|---|---|---|---|---|---|---|
| N-01 | 1.910 | 0.115 | 15.725 | 1.755 | 0.355 | 150.207 |
| N-02 | 1.892 | 0.109 | 12.960 | 1.698 | 0.268 | 215.505 |
| N-03 | 1.879 | 0.084 | 12.187 | 1.712 | 0.226 | 270.397 |
| N-04 | 1.694 | 0.072 | 218.706 | 1.684 | 0.254 | 144.577 |
| N-05 | 1.694 | 0.064 | 215.091 | 1.689 | 0.201 | 204.614 |
| N-06 | 1.696 | 0.058 | 213.482 | 1.692 | 0.169 | 262.678 |
| N-07 | 1.706 | 0.052 | 276.472 | 1.707 | 0.168 | 254.823 |

TABLE 4-O

| Case | $n_{10}$ | $k_{10}$ | $d_{10}$ | $n_{20}$ | $k_{20}$ | $d_{20}$ |
|---|---|---|---|---|---|---|
| O-01 | 1.919 | 0.115 | 16.638 | 1.785 | 0.385 | 138.580 |
| O-02 | 1.893 | 0.113 | 13.413 | 1.697 | 0.281 | 206.656 |
| O-03 | 1.882 | 0.085 | 12.438 | 1.715 | 0.235 | 261.237 |
| O-04 | 1.694 | 0.074 | 217.741 | 1.683 | 0.264 | 137.032 |
| O-05 | 1.694 | 0.065 | 214.737 | 1.687 | 0.207 | 196.488 |
| O-06 | 1.695 | 0.059 | 213.710 | 1.692 | 0.173 | 253.675 |
| O-07 | 1.707 | 0.053 | 276.548 | 1.707 | 0.174 | 246.168 |

TABLE 4-P

| Case | $n_{10}$ | $k_{10}$ | $d_{10}$ | $n_{20}$ | $k_{20}$ | $d_{20}$ |
|---|---|---|---|---|---|---|
| P-01 | 1.937 | 0.118 | 16.771 | 1.806 | 0.418 | 129.251 |
| P-02 | 1.898 | 0.119 | 13.576 | 1.695 | 0.295 | 198.434 |
| P-03 | 1.890 | 0.087 | 12.460 | 1.718 | 0.246 | 252.589 |
| P-04 | 1.694 | 0.077 | 216.630 | 1.679 | 0.277 | 129.875 |
| P-05 | 1.694 | 0.067 | 214.866 | 1.684 | 0.215 | 188.027 |
| P-06 | 1.695 | 0.060 | 214.034 | 1.692 | 0.179 | 244.657 |
| P-07 | 1.707 | 0.054 | 276.376 | 1.707 | 0.181 | 237.806 |

TABLE 4-Q

| Case | $n_{10}$ | $k_{10}$ | $d_{10}$ | $n_{20}$ | $k_{20}$ | $d_{20}$ |
|---|---|---|---|---|---|---|
| Q-01 | 1.958 | 0.128 | 15.815 | 1.794 | 0.439 | 123.830 |
| Q-02 | 1.903 | 0.127 | 13.420 | 1.688 | 0.307 | 190.984 |
| Q-03 | 1.898 | 0.090 | 12.296 | 1.719 | 0.254 | 244.231 |
| Q-04 | 1.694 | 0.080 | 215.821 | 1.668 | 0.290 | 122.663 |
| Q-05 | 1.694 | 0.068 | 215.165 | 1.681 | 0.224 | 179.093 |
| Q-06 | 1.696 | 0.061 | 214.210 | 1.692 | 0.185 | 235.479 |
| Q-07 | 1.707 | 0.056 | 275.996 | 1.705 | 0.187 | 229.352 |

TABLE 4-R

| Case | $n_{10}$ | $k_{10}$ | $d_{10}$ | $n_{20}$ | $k_{20}$ | $d_{20}$ |
|---|---|---|---|---|---|---|
| R-01 | 1.907 | 0.135 | 13.188 | 1.679 | 0.313 | 183.151 |
| R-02 | 1.904 | 0.092 | 12.121 | 1.720 | 0.260 | 235.214 |
| R-03 | 1.694 | 0.070 | 215.718 | 1.679 | 0.233 | 169.072 |
| R-04 | 1.696 | 0.062 | 214.371 | 1.692 | 0.190 | 225.802 |
| R-05 | 1.704 | 0.051 | 274.345 | 1.687 | 0.159 | 280.556 |

TABLE 4-S

| Case | $n_{10}$ | $k_{10}$ | $d_{10}$ | $n_{20}$ | $k_{20}$ | $d_{20}$ |
|---|---|---|---|---|---|---|
| S-01 | 1.908 | 0.140 | 13.288 | 1.676 | 0.321 | 172.696 |
| S-02 | 1.906 | 0.092 | 12.370 | 1.726 | 0.266 | 223.910 |
| S-03 | 1.889 | 0.087 | 11.418 | 1.707 | 0.223 | 283.898 |
| S-04 | 1.693 | 0.071 | 216.427 | 1.681 | 0.243 | 158.126 |
| S-05 | 1.696 | 0.064 | 214.510 | 1.692 | 0.195 | 215.938 |
| S-06 | 1.696 | 0.057 | 213.492 | 1.691 | 0.166 | 273.809 |
| S-07 | 1.704 | 0.052 | 274.677 | 1.687 | 0.162 | 270.432 |

TABLE 4-T

| Case | $n_{10}$ | $k_{10}$ | $d_{10}$ | $n_{20}$ | $k_{20}$ | $d_{20}$ |
|---|---|---|---|---|---|---|
| T-01 | 1.907 | 0.139 | 13.915 | 1.684 | 0.334 | 160.500 |
| T-02 | 1.904 | 0.091 | 13.010 | 1.734 | 0.275 | 212.141 |
| T-03 | 1.887 | 0.088 | 11.752 | 1.707 | 0.227 | 273.737 |
| T-04 | 1.693 | 0.073 | 216.656 | 1.683 | 0.253 | 148.279 |
| T-05 | 1.696 | 0.065 | 214.259 | 1.692 | 0.201 | 206.980 |
| T-06 | 1.696 | 0.058 | 213.637 | 1.690 | 0.169 | 264.528 |
| T-07 | 1.704 | 0.053 | 275.120 | 1.687 | 0.165 | 260.887 |

TABLE 5-A

| Case | $n_{10}$ | $k_{10}$ | $d_{10}$ | $n_{20}$ | $k_{20}$ | $d_{20}$ |
|---|---|---|---|---|---|---|
| A-01 | 2.047 | 0.012 | 29.751 | 6.274 | 3.305 | 1.566 |
| A-02 | 1.887 | 0.120 | 26.980 | 1.973 | 0.477 | 76.285 |
| A-03 | 1.871 | 0.106 | 17.106 | 1.713 | 0.298 | 158.161 |
| A-04 | 1.868 | 0.075 | 15.339 | 1.738 | 0.245 | 212.612 |
| A-05 | 1.862 | 0.065 | 13.830 | 1.730 | 0.208 | 271.884 |
| A-06 | 1.691 | 0.062 | 161.852 | 1.688 | 0.179 | 207.262 |
| A-07 | 1.692 | 0.057 | 157.460 | 1.697 | 0.154 | 266.043 |
| A-08 | 1.711 | 0.070 | 239.891 | 7.420 | 3.291 | 0.810 |
| A-09 | 1.704 | 0.057 | 226.155 | 1.689 | 0.187 | 202.908 |
| A-10 | 1.705 | 0.050 | 221.451 | 1.695 | 0.158 | 261.182 |
| A-11 | 1.695 | 0.054 | 267.286 | 1.705 | 0.184 | 212.751 |

TABLE 5-B

| Case | $n_{10}$ | $k_{10}$ | $d_{10}$ | $n_{20}$ | $k_{20}$ | $d_{20}$ |
|---|---|---|---|---|---|---|
| B-01 | 1.943 | 0.121 | 34.905 | 6.149 | 4.965 | 1.046 |
| B-02 | 1.876 | 0.112 | 17.699 | 1.719 | 0.321 | 148.502 |

TABLE 5-B-continued

| Case | $n_{10}$ | $k_{10}$ | $d_{10}$ | $n_{20}$ | $k_{20}$ | $d_{20}$ |
|---|---|---|---|---|---|---|
| B-03 | 1.873 | 0.080 | 15.588 | 1.739 | 0.258 | 203.950 |
| B-04 | 1.866 | 0.068 | 14.042 | 1.732 | 0.217 | 262.757 |
| B-05 | 1.691 | 0.064 | 161.844 | 1.687 | 0.188 | 198.716 |
| B-06 | 1.692 | 0.059 | 157.652 | 1.696 | 0.161 | 257.279 |
| B-07 | 1.706 | 0.052 | 221.303 | 1.695 | 0.165 | 252.591 |
| B-08 | 1.711 | 0.075 | 235.815 | 6.235 | 4.691 | 0.724 |
| B-09 | 1.704 | 0.059 | 225.762 | 1.687 | 0.197 | 194.502 |
| B-10 | 1.695 | 0.056 | 267.452 | 1.705 | 0.194 | 204.028 |

TABLE 5-C

| Case | $n_{10}$ | $k_{10}$ | $d_{10}$ | $n_{20}$ | $k_{20}$ | $d_{20}$ |
|---|---|---|---|---|---|---|
| C-01 | 1.883 | 0.119 | 18.157 | 1.723 | 0.349 | 139.788 |
| C-02 | 1.879 | 0.084 | 15.746 | 1.741 | 0.274 | 195.542 |
| C-03 | 1.872 | 0.069 | 14.214 | 1.737 | 0.228 | 253.893 |
| C-04 | 1.692 | 0.061 | 157.790 | 1.697 | 0.168 | 248.784 |
| C-05 | 1.705 | 0.061 | 225.478 | 1.687 | 0.209 | 186.105 |
| C-06 | 1.706 | 0.054 | 221.123 | 1.695 | 0.173 | 244.149 |

TABLE 5-D

| Case | $n_{10}$ | $k_{10}$ | $d_{10}$ | $n_{20}$ | $k_{20}$ | $d_{20}$ |
|---|---|---|---|---|---|---|
| D-01 | 1.890 | 0.130 | 18.083 | 1.714 | 0.371 | 132.495 |
| D-02 | 1.886 | 0.088 | 15.723 | 1.743 | 0.287 | 187.112 |
| D-03 | 1.877 | 0.073 | 14.196 | 1.736 | 0.236 | 245.779 |
| D-04 | 1.692 | 0.062 | 157.690 | 1.697 | 0.175 | 240.328 |
| D-05 | 1.705 | 0.063 | 225.284 | 1.687 | 0.220 | 177.345 |
| D-06 | 1.706 | 0.055 | 220.863 | 1.695 | 0.180 | 235.453 |
| D-07 | 1.695 | 0.055 | 262.917 | 1.705 | 0.178 | 255.408 |

TABLE 5-E

| Case | $n_{10}$ | $k_{10}$ | $d_{10}$ | $n_{20}$ | $k_{20}$ | $d_{20}$ |
|---|---|---|---|---|---|---|
| E-01 | 1.891 | 0.144 | 17.530 | 1.686 | 0.376 | 126.586 |
| E-02 | 1.892 | 0.091 | 15.545 | 1.744 | 0.296 | 178.253 |
| E-03 | 1.878 | 0.079 | 14.050 | 1.728 | 0.240 | 238.151 |
| E-04 | 1.691 | 0.064 | 157.168 | 1.696 | 0.179 | 231.953 |
| E-05 | 1.705 | 0.064 | 225.395 | 1.686 | 0.227 | 167.881 |
| E-06 | 1.706 | 0.056 | 220.607 | 1.694 | 0.184 | 226.210 |
| E-07 | 1.697 | 0.047 | 278.691 | 1.700 | 0.152 | 281.986 |

TABLE 5-F

| Case | $n_{10}$ | $k_{10}$ | $d_{10}$ | $n_{20}$ | $k_{20}$ | $d_{20}$ |
|---|---|---|---|---|---|---|
| F-01 | 1.896 | 0.091 | 15.652 | 1.752 | 0.303 | 167.408 |
| F-02 | 1.875 | 0.087 | 14.019 | 1.715 | 0.239 | 230.256 |
| F-03 | 1.705 | 0.064 | 225.606 | 1.687 | 0.232 | 157.678 |
| F-04 | 1.705 | 0.057 | 220.354 | 1.694 | 0.186 | 216.433 |
| F-05 | 1.708 | 0.053 | 218.289 | 1.707 | 0.158 | 272.538 |
| F-06 | 1.697 | 0.047 | 278.413 | 1.701 | 0.154 | 271.867 |

TABLE 5-G

| Case | $n_{10}$ | $k_{10}$ | $d_{10}$ | $n_{20}$ | $k_{20}$ | $d_{20}$ |
|---|---|---|---|---|---|---|
| G-01 | 1.901 | 0.088 | 16.388 | 1.774 | 0.318 | 154.194 |
| G-02 | 1.871 | 0.093 | 14.267 | 1.706 | 0.241 | 221.319 |
| G-03 | 1.866 | 0.067 | 13.172 | 1.724 | 0.206 | 275.098 |
| G-04 | 1.706 | 0.065 | 225.317 | 1.687 | 0.238 | 147.740 |

TABLE 5-G-continued

| Case | $n_{10}$ | $k_{10}$ | $d_{10}$ | $n_{20}$ | $k_{20}$ | $d_{20}$ |
|---|---|---|---|---|---|---|
| G-05 | 1.705 | 0.057 | 220.112 | 1.694 | 0.188 | 206.685 |
| G-06 | 1.708 | 0.053 | 218.342 | 1.707 | 0.161 | 262.805 |
| G-07 | 1.697 | 0.047 | 278.070 | 1.702 | 0.156 | 262.294 |

TABLE 5-H

| Case | $n_{10}$ | $k_{10}$ | $d_{10}$ | $n_{20}$ | $k_{20}$ | $d_{20}$ |
|---|---|---|---|---|---|---|
| H-01 | 1.908 | 0.087 | 17.362 | 1.802 | 0.342 | 141.959 |
| H-02 | 1.871 | 0.097 | 14.654 | 1.704 | 0.250 | 212.121 |
| H-03 | 1.869 | 0.067 | 13.479 | 1.729 | 0.214 | 265.153 |
| H-04 | 1.706 | 0.067 | 224.641 | 1.684 | 0.248 | 139.263 |
| H-05 | 1.705 | 0.058 | 220.026 | 1.694 | 0.194 | 197.616 |
| H-06 | 1.708 | 0.054 | 218.429 | 1.707 | 0.165 | 253.768 |
| H-07 | 1.697 | 0.048 | 277.999 | 1.702 | 0.160 | 253.663 |

TABLE 5-I

| Case | $n_{10}$ | $k_{10}$ | $d_{10}$ | $n_{20}$ | $k_{20}$ | $d_{20}$ |
|---|---|---|---|---|---|---|
| I-01 | 1.918 | 0.092 | 17.977 | 1.822 | 0.371 | 132.466 |
| I-02 | 1.876 | 0.100 | 14.944 | 1.706 | 0.265 | 203.140 |
| I-03 | 1.874 | 0.069 | 13.674 | 1.733 | 0.224 | 256.300 |
| I-04 | 1.706 | 0.060 | 219.996 | 1.694 | 0.203 | 189.146 |
| I-05 | 1.709 | 0.055 | 218.382 | 1.707 | 0.172 | 245.309 |
| I-06 | 1.697 | 0.050 | 278.074 | 1.701 | 0.166 | 245.468 |

TABLE 5-J

| Case | $n_{10}$ | $k_{10}$ | $d_{10}$ | $n_{20}$ | $k_{20}$ | $d_{20}$ |
|---|---|---|---|---|---|---|
| J-01 | 1.929 | 0.101 | 17.864 | 1.821 | 0.398 | 125.532 |
| J-02 | 1.883 | 0.103 | 14.973 | 1.709 | 0.279 | 194.479 |
| J-03 | 1.880 | 0.071 | 13.709 | 1.736 | 0.234 | 247.823 |
| J-04 | 1.707 | 0.062 | 219.774 | 1.693 | 0.214 | 180.753 |
| J-05 | 1.709 | 0.057 | 218.071 | 1.706 | 0.179 | 237.020 |
| J-06 | 1.697 | 0.047 | 275.083 | 1.700 | 0.148 | 295.680 |

TABLE 5-K

| Case | $n_{10}$ | $k_{10}$ | $d_{10}$ | $n_{20}$ | $k_{20}$ | $d_{20}$ |
|---|---|---|---|---|---|---|
| K-01 | 1.891 | 0.108 | 14.702 | 1.707 | 0.289 | 186.368 |
| K-02 | 1.885 | 0.074 | 13.594 | 1.735 | 0.241 | 239.426 |
| K-03 | 1.707 | 0.064 | 219.485 | 1.692 | 0.223 | 171.867 |
| K-04 | 1.709 | 0.058 | 217.678 | 1.705 | 0.184 | 228.411 |
| K-05 | 1.697 | 0.048 | 275.043 | 1.701 | 0.152 | 286.426 |

TABLE 5-L

| Case | $n_{10}$ | $k_{10}$ | $d_{10}$ | $n_{20}$ | $k_{20}$ | $d_{20}$ |
|---|---|---|---|---|---|---|
| L-01 | 1.896 | 0.113 | 14.435 | 1.703 | 0.295 | 177.615 |
| L-02 | 1.887 | 0.078 | 13.577 | 1.733 | 0.244 | 230.253 |
| L-03 | 1.692 | 0.059 | 153.772 | 1.694 | 0.154 | 284.837 |
| L-04 | 1.707 | 0.065 | 219.581 | 1.692 | 0.231 | 161.904 |
| L-05 | 1.709 | 0.059 | 217.561 | 1.702 | 0.188 | 219.131 |
| L-06 | 1.707 | 0.053 | 216.484 | 1.695 | 0.157 | 278.062 |
| L-07 | 1.697 | 0.048 | 274.812 | 1.701 | 0.154 | 276.656 |

TABLE 5-M

| Case | $n_{10}$ | $k_{10}$ | $d_{10}$ | $n_{20}$ | $k_{20}$ | $d_{20}$ |
|---|---|---|---|---|---|---|
| M-01 | 1.898 | 0.115 | 14.632 | 1.705 | 0.303 | 166.646 |
| M-02 | 1.885 | 0.081 | 13.917 | 1.732 | 0.248 | 219.851 |
| M-03 | 1.868 | 0.075 | 12.752 | 1.713 | 0.206 | 279.921 |
| M-04 | 1.707 | 0.067 | 219.938 | 1.695 | 0.239 | 151.390 |
| M-05 | 1.708 | 0.060 | 217.756 | 1.701 | 0.192 | 209.457 |
| M-06 | 1.706 | 0.054 | 217.065 | 1.694 | 0.160 | 268.021 |
| M-07 | 1.696 | 0.049 | 274.075 | 1.702 | 0.157 | 267.366 |

TABLE 5-N

| Case | $n_{10}$ | $k_{10}$ | $d_{10}$ | $n_{20}$ | $k_{20}$ | $d_{20}$ |
|---|---|---|---|---|---|---|
| N-01 | 1.899 | 0.115 | 15.367 | 1.714 | 0.318 | 155.141 |
| N-02 | 1.882 | 0.083 | 14.477 | 1.732 | 0.256 | 209.893 |
| N-03 | 1.870 | 0.074 | 13.063 | 1.717 | 0.212 | 269.637 |
| N-04 | 1.708 | 0.062 | 217.887 | 1.700 | 0.197 | 200.272 |
| N-05 | 1.707 | 0.055 | 217.378 | 1.693 | 0.164 | 258.646 |
| N-06 | 1.696 | 0.050 | 273.384 | 1.702 | 0.160 | 258.714 |

TABLE 5-O

| Case | $n_{10}$ | $k_{10}$ | $d_{10}$ | $n_{20}$ | $k_{20}$ | $d_{20}$ |
|---|---|---|---|---|---|---|
| O-01 | 1.903 | 0.118 | 16.130 | 1.723 | 0.340 | 145.164 |
| O-02 | 1.884 | 0.087 | 14.896 | 1.733 | 0.268 | 201.113 |
| O-03 | 1.874 | 0.075 | 13.357 | 1.722 | 0.221 | 260.240 |
| O-04 | 1.708 | 0.063 | 217.693 | 1.700 | 0.205 | 191.744 |
| O-05 | 1.707 | 0.056 | 217.044 | 1.694 | 0.169 | 250.083 |
| O-06 | 1.696 | 0.051 | 273.493 | 1.702 | 0.165 | 250.180 |

TABLE 5-P

| Case | $n_{10}$ | $k_{10}$ | $d_{10}$ | $n_{20}$ | $k_{20}$ | $d_{20}$ |
|---|---|---|---|---|---|---|
| P-01 | 1.913 | 0.125 | 16.406 | 1.727 | 0.366 | 136.777 |
| P-02 | 1.891 | 0.091 | 14.954 | 1.734 | 0.282 | 193.024 |
| P-03 | 1.879 | 0.077 | 13.440 | 1.724 | 0.231 | 251.802 |
| P-04 | 1.709 | 0.064 | 217.197 | 1.700 | 0.214 | 183.446 |
| P-05 | 1.708 | 0.057 | 216.333 | 1.694 | 0.175 | 241.739 |
| P-06 | 1.696 | 0.052 | 274.035 | 1.700 | 0.171 | 241.498 |

TABLE 5-Q

| Case | $n_{10}$ | $k_{10}$ | $d_{10}$ | $n_{20}$ | $k_{20}$ | $d_{20}$ |
|---|---|---|---|---|---|---|
| Q-01 | 1.900 | 0.097 | 14.674 | 1.732 | 0.294 | 185.336 |
| Q-02 | 1.885 | 0.082 | 13.311 | 1.722 | 0.239 | 243.911 |
| Q-03 | 1.708 | 0.058 | 215.615 | 1.694 | 0.180 | 233.152 |
| Q-04 | 1.697 | 0.048 | 273.453 | 1.699 | 0.151 | 289.720 |

TABLE 5-R

| Case | $n_{10}$ | $k_{10}$ | $d_{10}$ | $n_{20}$ | $k_{20}$ | $d_{20}$ |
|---|---|---|---|---|---|---|
| R-01 | 1.908 | 0.102 | 14.316 | 1.730 | 0.303 | 177.238 |
| R-02 | 1.888 | 0.088 | 13.163 | 1.716 | 0.243 | 235.819 |
| R-03 | 1.708 | 0.059 | 215.377 | 1.693 | 0.185 | 223.802 |
| R-04 | 1.709 | 0.054 | 215.137 | 1.702 | 0.158 | 279.418 |
| R-05 | 1.697 | 0.049 | 273.522 | 1.700 | 0.154 | 279.960 |

TABLE 5-S

| Case | $n_{10}$ | $k_{10}$ | $d_{10}$ | $n_{20}$ | $k_{20}$ | $d_{20}$ |
|---|---|---|---|---|---|---|
| S-01 | 1.914 | 0.104 | 14.390 | 1.735 | 0.314 | 166.400 |
| S-02 | 1.886 | 0.093 | 13.299 | 1.710 | 0.247 | 226.131 |
| S-03 | 1.873 | 0.070 | 12.581 | 1.721 | 0.208 | 280.628 |
| S-04 | 1.692 | 0.060 | 152.854 | 1.693 | 0.157 | 278.359 |
| S-05 | 1.708 | 0.060 | 215.913 | 1.692 | 0.189 | 213.567 |
| S-06 | 1.708 | 0.054 | 215.905 | 1.701 | 0.161 | 269.362 |
| S-07 | 1.697 | 0.050 | 273.350 | 1.701 | 0.157 | 270.178 |

TABLE 5-T

| Case | $n_{10}$ | $k_{10}$ | $d_{10}$ | $n_{20}$ | $k_{20}$ | $d_{20}$ |
|---|---|---|---|---|---|---|
| T-01 | 1.918 | 0.103 | 15.177 | 1.753 | 0.331 | 153.467 |
| T-02 | 1.883 | 0.095 | 13.742 | 1.708 | 0.252 | 215.835 |
| T-03 | 1.874 | 0.068 | 12.955 | 1.728 | 0.214 | 269.400 |
| T-04 | 1.707 | 0.061 | 216.749 | 1.693 | 0.194 | 203.628 |
| T-05 | 1.708 | 0.055 | 216.874 | 1.699 | 0.165 | 259.716 |
| T-06 | 1.697 | 0.050 | 272.522 | 1.701 | 0.160 | 261.468 |

By using the combinations of values of [$n_{10}$, $n_{20}$, $k_{10}$, $k_{20}$, $d_{10}$, $d_{20}$] with which the minimum reflectance is obtained, it may be possible to control the reflectance to 0.4% or less over the entire incidence angle region corresponding to the numerical aperture NA of a corresponding exposure system with each of the above-described silicon thicknesses. In other words, each of the combinations is effective from the viewpoint that the reflectance is controlled to 0.4% or less even when the numerical aperture NA is smaller than the corresponding numerical aperture NA.

A simulation was also carried out for determining how far one of the six variables in each of the combinations of values of [$n_{10}$, $n_{20}$, $k_{10}$, $k_{20}$, $d_{10}$, $d_{20}$] varies to produce a reflectance over 0.4%, with the other variables being fixed. The obtained permissible variation ranges are shown in Tables 11-A to 11-T (numerical aperture NA: 0.93≦NA≦1.0), Table 12-A to 12-T (numerical aperture NA: 1.0<NA≦1.1), Tables 13-A to 13-T (numerical aperture NA: 1.1<NA≦1.2), Tables 14-A to 14-T (numerical aperture NA: 1.2<NA≦1.3), and Tables 15-A to 15-T (numerical aperture NA: 1.3<NA≦1.4).

In the tables below, $n_{1\text{-}min}$: minimum $n_{10}$ when the reflectance does not exceed 0.4%

$n_{1\text{-}max}$: maximum $n_{10}$ when the reflectance does not exceed 0.4%

$k_{1\text{-}min}$: minimum $k_{10}$ when the reflectance does not exceed 0.4%

$k_{1\text{-}max}$: maximum $k_{10}$ when the reflectance does not exceed 0.4%

$d_{1\text{-}min}$: minimum $d_{10}$ when the reflectance does not exceed 0.4%

$d_{1\text{-}max}$: maximum $d_{10}$ when the reflectance does not exceed 0.4%

$n_{2\text{-}min}$: minimum $n_{20}$ when the reflectance does not exceed 0.4%

$n_{2\text{-}max}$: maximum $n_{20}$ when the reflectance does not exceed 0.4%

$k_{2\text{-}min}$: minimum $k_{20}$ when the reflectance does not exceed 0.4%

$k_{2\text{-}max}$: maximum $k_{20}$ when the reflectance does not exceed 0.4%

$d_{2\text{-}min}$: minimum $d_{20}$ when the reflectance does not exceed 0.4%

$d_{2\text{-}max}$: maximum $d_{20}$ when the reflectance does not exceed 0.4%

TABLE 11-A

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-01 | 2.1640640 | 1.9857913 | 0.1974881 | 0.0196744 | 28.041 | 20.653 | 2.8958371 | 2.4623117 | 1.8020253 | 1.3735951 | 11.601 | 8.280 |
| A-02 | 1.9428363 | 1.7842939 | 0.2426142 | 0.0835896 | 37.757 | 24.186 | 2.3681593 | 1.9966090 | 0.8289455 | 0.4606508 | 73.757 | 50.598 |
| A-03 | 1.9576297 | 1.7850259 | 0.2148133 | 0.0371729 | 28.994 | 14.134 | 1.9707991 | 1.6413265 | 0.5950778 | 0.2809702 | ∞ | 76.872 |
| A-04 | 1.9545833 | 1.7830354 | 0.1828680 | 0.0038055 | 29.564 | 13.280 | 2.0120708 | 1.6792059 | 0.5256718 | 0.2166960 | ∞ | 114.006 |
| A-05 | 1.8469211 | 1.7238950 | 0.1688100 | 0.0370107 | 108.304 | 82.625 | 2.1059290 | 1.8049561 | 0.6364527 | 0.3320741 | 79.125 | 60.047 |
| A-06 | 1.8384570 | 1.7205432 | 0.1633733 | 0.0309270 | 108.455 | 81.217 | 2.0181484 | 1.7172939 | 0.5191778 | 0.2180047 | ∞ | 111.420 |
| A-07 | 1.8252406 | 1.7110450 | 0.1553613 | 0.0234985 | 112.606 | 80.398 | 1.9560961 | 1.6464941 | 0.4693856 | 0.1619942 | ∞ | 125.300 |
| A-08 | 1.8082491 | 1.6888265 | 0.1477492 | 0.0355519 | 204.157 | 153.730 | 2.1755323 | 1.7768299 | 1.0810475 | 0.7328260 | 18.289 | 11.953 |
| A-09 | 1.8055423 | 1.6936649 | 0.1517070 | 0.0331059 | 193.760 | 148.011 | 2.0676879 | 1.7745190 | 0.5567082 | 0.2860417 | 77.890 | 60.591 |
| A-10 | 1.8017615 | 1.6978504 | 0.1479986 | 0.0337115 | 194.207 | 146.995 | 1.9601734 | 1.6709510 | 0.4604288 | 0.1854154 | ∞ | 118.281 |
| A-11 | 1.7922310 | 1.6913081 | 0.1411744 | 0.0297047 | ∞ | 146.144 | 1.9356368 | 1.5999081 | 0.4195133 | 0.1388846 | ∞ | 168.885 |
| A-12 | 1.8116856 | 1.6696922 | 0.1390970 | 0.0202005 | ∞ | 158.277 | 5.5456759 | 4.3725570 | 3.0211006 | 1.9299177 | 2.102 | 1.426 |
| A-13 | 1.7950873 | 1.6802826 | 0.1431143 | 0.0330178 | ∞ | 210.408 | 2.0588196 | 1.7541309 | 0.5131301 | 0.2574941 | 77.434 | 61.414 |
| A-14 | 1.7910600 | 1.6837394 | 0.1390888 | 0.0381952 | ∞ | 210.291 | 1.9243195 | 1.6212543 | 0.4241486 | 0.1638324 | ∞ | 122.979 |
| A-15 | 1.7794892 | 1.6533564 | 0.1361463 | 0.0317518 | ∞ | 149.513 | 1.9509696 | 1.5482450 | 0.3978720 | 0.1252902 | ∞ | 168.040 |

TABLE 11-B

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-01 | 1.9765106 | 1.8156232 | 0.2993467 | 0.1383360 | 37.031 | 26.788 | 2.5688133 | 1.9441148 | 2.2528476 | 1.6097141 | 10.412 | 6.699 |
| B-02 | 1.8936015 | 1.7361308 | 0.3006593 | 0.1439186 | 45.853 | 33.452 | 3.6189923 | 3.2095929 | 0.9578557 | 0.5340910 | 32.272 | 28.022 |
| B-03 | 1.9437201 | 1.7857966 | 0.2641850 | 0.1051554 | 38.514 | 26.033 | 2.5360575 | 2.1438358 | 0.9462301 | 0.5462985 | 57.826 | 42.823 |
| B-04 | 1.9109595 | 1.7580896 | 0.2587795 | 0.1040725 | 38.022 | 24.153 | 2.2161888 | 1.8334483 | 0.8900922 | 0.5020930 | ∞ | 50.992 |
| B-05 | 1.9658189 | 1.7964891 | 0.2205139 | 0.0453857 | 28.945 | 15.110 | 2.0010759 | 1.6647868 | 0.6448409 | 0.3145296 | ∞ | 72.956 |
| B-06 | 1.9508455 | 1.7771870 | 0.1996149 | 0.0172626 | 28.632 | 12.711 | 1.9628359 | 1.6302505 | 0.5253835 | 0.2259292 | ∞ | 114.040 |
| B-07 | 1.9889922 | 1.7874455 | 0.1849726 | 0.0000000 | 23.915 | 8.830 | 1.9396544 | 1.6111644 | 0.4484736 | 0.1778157 | ∞ | 129.097 |
| B-08 | 1.8698402 | 1.7525465 | 0.1773355 | 0.0550833 | 105.714 | 87.220 | 2.3473775 | 1.8218453 | 1.8615652 | 1.3148452 | 10.681 | 6.993 |
| B-09 | 1.8708198 | 1.7515339 | 0.1710347 | 0.0426253 | 104.773 | 84.697 | 2.4485002 | 2.1326152 | 0.7462001 | 0.4233925 | 54.972 | 44.997 |
| B-10 | 1.8429563 | 1.7284885 | 0.1660140 | 0.0362166 | 105.755 | 82.025 | 2.0545640 | 1.7455125 | 0.5464477 | 0.2423962 | ∞ | 103.928 |
| B-11 | 1.8273334 | 1.7163238 | 0.1568000 | 0.0275202 | 110.921 | 81.205 | 1.9722282 | 1.6572367 | 0.4915459 | 0.1748967 | ∞ | 155.882 |

TABLE 11-B-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-12 | 1.8011164 | 1.6891474 | 0.1510638 | 0.0182928 | 120.168 | 78.348 | 1.8986632 | 1.5701231 | 0.4003568 | 0.1335282 | ∞ | 174.053 |
| B-13 | 1.8084407 | 1.6945466 | 0.1511564 | 0.0399344 | 199.413 | 157.378 | 2.9980065 | 2.2331872 | 2.4336783 | 1.7083805 | 5.430 | 3.555 |
| B-14 | 1.8069373 | 1.7006556 | 0.1532768 | 0.0392717 | 189.895 | 149.881 | 2.1605076 | 1.8499131 | 0.6301800 | 0.3373675 | 65.640 | 52.112 |
| B-15 | 1.8020158 | 1.7028825 | 0.1485546 | 0.0386010 | 190.393 | 148.247 | 1.9771516 | 1.6873554 | 0.4840750 | 0.2045352 | 139.021 | 110.784 |
| B-16 | 1.7917073 | 1.6951753 | 0.1410054 | 0.0335775 | ∞ | 147.319 | 1.9455843 | 1.6038399 | 0.4311522 | 0.1490624 | ∞ | 162.629 |
| B-17 | 1.7748680 | 1.6616038 | 0.1397337 | 0.0177061 | ∞ | 78.362 | 1.9013700 | 1.5474955 | 0.3491302 | 0.1192779 | ∞ | 179.261 |
| B-18 | 1.7995571 | 1.6803054 | 0.1418691 | 0.0318679 | ∞ | 219.267 | 3.9031090 | 2.7804552 | 3.1987078 | 2.1965484 | 3.041 | 1.933 |
| B-19 | 1.7944023 | 1.6892021 | 0.1429939 | 0.0388679 | ∞ | 213.520 | 2.1333770 | 1.8090423 | 0.5728584 | 0.3034224 | 66.373 | 53.138 |
| B-20 | 1.7900144 | 1.6912498 | 0.1382895 | 0.0430014 | ∞ | 212.401 | 1.9348689 | 1.6293818 | 0.4376544 | 0.1798382 | ∞ | 116.162 |
| B-21 | 1.7788302 | 1.6597860 | 0.1352760 | 0.0355396 | ∞ | 150.783 | 1.9606195 | 1.5529755 | 0.4050644 | 0.1340756 | ∞ | 162.711 |
| B-22 | 1.7721141 | 1.6339867 | 0.1393037 | 0.0162605 | ∞ | 131.499 | 1.9223909 | 1.5178206 | 0.3273010 | 0.1102026 | ∞ | 178.998 |

TABLE 11-C

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| C-01 | 1.8231731 | 1.6889531 | 0.3374331 | 0.1966774 | 44.591 | 33.970 | 2.3113613 | 1.5131875 | 2.9933496 | 2.1403332 | 8.568 | 5.252 |
| C-02 | 1.8704238 | 1.7221365 | 0.3164098 | 0.1654295 | 45.636 | 34.013 | 3.4694784 | 2.9935165 | 1.1153984 | 0.6124627 | 32.783 | 27.503 |
| C-03 | 1.8897351 | 1.7427735 | 0.2799519 | 0.1287580 | 39.053 | 25.989 | 2.2531582 | 1.8402493 | 0.9982394 | 0.5793026 | ∞ | 46.183 |
| C-04 | 1.9668640 | 1.8039697 | 0.2284362 | 0.0582238 | 29.734 | 16.727 | 2.0534750 | 1.7043490 | 0.7103495 | 0.3545878 | ∞ | 91.228 |
| C-05 | 1.9700505 | 1.7964873 | 0.2004352 | 0.0167243 | 27.390 | 13.045 | 1.9901918 | 1.6549159 | 0.5568746 | 0.2488619 | ∞ | 108.784 |
| C-06 | 1.9889367 | 1.7945592 | 0.1844224 | 0.0000000 | 24.201 | 9.640 | 1.9544538 | 1.6239008 | 0.4686083 | 0.1907165 | ∞ | 125.539 |
| C-07 | 1.8960963 | 1.7964051 | 0.2027126 | 0.0843971 | 95.043 | 82.386 | 1.8930719 | 1.3306048 | 2.0756683 | 1.4587811 | 12.301 | 7.991 |
| C-08 | 1.8798042 | 1.7688191 | 0.1810991 | 0.0566936 | 102.324 | 85.380 | 2.7319807 | 2.3831586 | 0.8737269 | 0.5058423 | 43.841 | 36.695 |
| C-09 | 1.8486490 | 1.7395303 | 0.1694845 | 0.0435666 | 103.473 | 83.035 | 2.1069571 | 1.7916519 | 0.5819143 | 0.2709792 | 126.455 | 95.942 |
| C-10 | 1.8272295 | 1.7203471 | 0.1588071 | 0.0325461 | 108.030 | 81.756 | 1.9781294 | 1.6565767 | 0.5067391 | 0.1879390 | ∞ | 150.786 |
| C-11 | 1.8014602 | 1.7131679 | 0.1630009 | 0.0629313 | 181.579 | 155.142 | 2.2285130 | 1.4846690 | 2.5305195 | 1.8133466 | 7.152 | 4.542 |
| C-12 | 1.8066818 | 1.7096664 | 0.1562671 | 0.0489514 | 184.788 | 151.277 | 2.2616583 | 1.9259051 | 0.7108605 | 0.4005419 | 56.477 | 45.327 |
| C-13 | 1.8013132 | 1.7087644 | 0.1491455 | 0.0453076 | 186.735 | 149.398 | 1.9970170 | 1.6990226 | 0.5049354 | 0.2258400 | 129.169 | 104.943 |
| C-14 | 1.7901840 | 1.6996005 | 0.1402926 | 0.0386361 | 202.803 | 148.613 | 1.9572801 | 1.6068052 | 0.4427851 | 0.1602228 | ∞ | 156.485 |
| C-15 | 1.7888636 | 1.6964637 | 0.1448234 | 0.0511015 | 272.529 | 222.634 | 4.0234980 | 2.5453376 | 4.9343779 | 3.5870341 | 1.854 | 1.171 |
| C-16 | 1.7922839 | 1.6987061 | 0.1428421 | 0.0481961 | ∞ | 215.666 | 2.1852289 | 1.8344195 | 0.6298531 | 0.3553731 | 59.183 | 47.891 |
| C-17 | 1.7880248 | 1.6988170 | 0.1367243 | 0.0500947 | ∞ | 214.345 | 1.9483736 | 1.6341647 | 0.4469301 | 0.1975503 | 135.897 | 110.811 |
| C-18 | 1.7771523 | 1.6659072 | 0.1338236 | 0.0403214 | ∞ | 152.164 | 1.9734293 | 1.5581486 | 0.4118041 | 0.1461254 | ∞ | 157.174 |

TABLE 11-D

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-01 | 1.8830836 | 1.7450379 | 0.3439324 | 0.1957122 | 41.919 | 32.309 | 3.2738383 | 2.6931938 | 1.3905248 | 0.7652599 | 34.624 | 26.646 |
| D-02 | 1.8894456 | 1.7496568 | 0.3113935 | 0.1623652 | 38.151 | 27.175 | 2.3783942 | 1.9026215 | 1.1913935 | 0.7140034 | ∞ | 38.650 |
| D-03 | 1.9759954 | 1.8236651 | 0.2451292 | 0.0831138 | 33.080 | 21.762 | 2.3455819 | 1.9299789 | 0.8247144 | 0.4185645 | ∞ | 76.091 |
| D-04 | 1.9752561 | 1.8171238 | 0.2392715 | 0.0711709 | 29.642 | 17.776 | 2.1047769 | 1.7365738 | 0.7769713 | 0.3980858 | ∞ | 83.621 |
| D-05 | 1.9566081 | 1.7994560 | 0.2448971 | 0.0778121 | 30.025 | 17.558 | 2.0415795 | 1.6793835 | 0.7460866 | 0.3841615 | ∞ | 85.930 |
| D-06 | 1.9857426 | 1.8133183 | 0.2025784 | 0.0179971 | 26.419 | 13.320 | 2.0120620 | 1.6710122 | 0.5849314 | 0.2699888 | ∞ | 102.487 |
| D-07 | 2.0116008 | 1.8131792 | 0.1836318 | 0.0000000 | 22.601 | 9.497 | 1.9655292 | 1.6338862 | 0.4820573 | 0.2030644 | ∞ | 122.172 |
| D-08 | 1.8608817 | 1.7601212 | 0.1929580 | 0.0733389 | 98.847 | 83.253 | 2.2679467 | 1.8745946 | 0.9047855 | 0.5511698 | 55.349 | 42.174 |
| D-09 | 1.8440660 | 1.7409813 | 0.1747540 | 0.0528949 | 101.494 | 82.953 | 2.0828924 | 1.7400103 | 0.6219074 | 0.2930427 | ∞ | 93.224 |
| D-10 | 1.8255212 | 1.7236487 | 0.1604973 | 0.0385149 | 105.673 | 82.354 | 1.9798220 | 1.6454324 | 0.5164841 | 0.1989646 | ∞ | 143.976 |
| D-11 | 1.7968482 | 1.6917774 | 0.1530963 | 0.0257575 | 114.232 | 79.595 | 1.8993843 | 1.5580000 | 0.4093345 | 0.1476328 | ∞ | 163.096 |
| D-12 | 1.8013651 | 1.7172159 | 0.1603274 | 0.0632058 | 172.074 | 150.204 | 2.1395219 | 1.7587431 | 0.7307801 | 0.4530054 | 57.764 | 44.905 |
| D-13 | 1.7985003 | 1.7134612 | 0.1494702 | 0.0540027 | 182.684 | 149.824 | 1.9978008 | 1.6681646 | 0.5024732 | 0.2441700 | 126.081 | 102.188 |
| D-14 | 1.7870554 | 1.7030564 | 0.1388742 | 0.0447152 | 194.361 | 149.689 | 1.9627277 | 1.5963116 | 0.4437332 | 0.1693082 | ∞ | 149.980 |
| D-15 | 1.7701529 | 1.6661148 | 0.1392675 | 0.0232775 | ∞ | 136.395 | 1.9116010 | 1.5409431 | 0.3522162 | 0.1321796 | ∞ | 167.525 |
| D-16 | 1.7804394 | 1.7273645 | 0.1355612 | 0.0974874 | 236.430 | 223.282 | 4.2192974 | 2.6906610 | 9.9343423 | 7.8844741 | 0.575 | 0.402 |
| D-17 | 1.7877352 | 1.7081588 | 0.1413061 | 0.0629369 | 262.055 | 215.348 | 2.0895557 | 1.7685523 | 0.6334874 | 0.3971031 | 59.549 | 48.398 |
| D-18 | 1.7853294 | 1.7057908 | 0.1336096 | 0.0602063 | ∞ | 215.600 | 1.9530972 | 1.6109988 | 0.4364237 | 0.2120328 | ∞ | 107.664 |
| D-19 | 1.7730937 | 1.6800431 | 0.1318136 | 0.0455306 | ∞ | 206.475 | 1.9842943 | 1.5519103 | 0.4127823 | 0.1614236 | ∞ | 150.626 |
| D-20 | 1.7675878 | 1.6410705 | 0.1387078 | 0.0209832 | ∞ | 138.629 | 1.9336651 | 1.5204424 | 0.3320609 | 0.1218046 | ∞ | 166.659 |

TABLE 11-E

| Case | $n_{1-max}$ | $n_{1-min}$ | $k_{1-max}$ | $k_{1-min}$ | $d_{1-max}$ | $dd_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-01 | 1.8748083 | 1.7393738 | 0.3368671 | 0.1916718 | 34.542 | 24.447 | 2.0181788 | 1.5460267 | 1.1728709 | 0.7418895 | ∞ | 38.073 |
| E-02 | 1.9789816 | 1.8230856 | 0.2533923 | 0.0850353 | 28.756 | 17.639 | 2.0891174 | 1.7028088 | 0.7988426 | 0.4234361 | ∞ | 75.545 |
| E-03 | 2.0023038 | 1.8297941 | 0.2038717 | 0.0168637 | 25.282 | 13.221 | 2.0277165 | 1.6786747 | 0.6012817 | 0.2843445 | ∞ | 94.052 |
| E-04 | 2.0468137 | 1.8446945 | 0.1676424 | 0.0000000 | 20.887 | 9.486 | 2.0073158 | 1.6730946 | 0.5013927 | 0.2164733 | ∞ | 116.551 |
| E-05 | 2.0992751 | 1.8446962 | 0.2341211 | 0.0000000 | 16.445 | 6.421 | 1.8864494 | 1.5577361 | 0.4505861 | 0.1973793 | ∞ | 122.465 |
| E-06 | 1.8491106 | 1.7507915 | 0.2096178 | 0.0945531 | 93.863 | 80.071 | 1.9350344 | 1.5188906 | 0.7893250 | 0.5174866 | 68.488 | 46.386 |

TABLE 11-E-continued

| Case | $n_{1-max}$ | $n_{1-min}$ | $k_{1-max}$ | $k_{1-min}$ | $d_{1-max}$ | $dd_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-07 | 1.8361972 | 1.7368735 | 0.1813258 | 0.0628651 | 99.367 | 82.092 | 2.0044566 | 1.6351146 | 0.5837677 | 0.2983466 | ∞ | 94.158 |
| E-08 | 1.8205420 | 1.7221912 | 0.1627354 | 0.0448936 | 104.538 | 82.385 | 1.9559670 | 1.6053627 | 0.4990396 | 0.2015030 | ∞ | 136.472 |
| E-09 | 1.7925661 | 1.6898427 | 0.1538738 | 0.0292620 | 112.287 | 79.640 | 1.8944932 | 1.5420274 | 0.4023134 | 0.1496426 | ∞ | 155.476 |
| E-10 | 1.7983926 | 1.7197305 | 0.1671071 | 0.0784414 | 164.305 | 147.121 | 1.9619841 | 1.5854387 | 0.6583400 | 0.4392323 | 63.983 | 48.943 |
| E-11 | 1.7955340 | 1.7158697 | 0.1497842 | 0.0635586 | 179.571 | 149.311 | 2.0007177 | 1.5954870 | 0.4697081 | 0.2495811 | ∞ | 101.667 |
| E-12 | 1.7833451 | 1.7048416 | 0.1369505 | 0.0510557 | 189.846 | 150.429 | 1.9612209 | 1.5727870 | 0.4313362 | 0.1724775 | ∞ | 142.230 |
| E-13 | 1.7675774 | 1.6666497 | 0.1392333 | 0.0254638 | ∞ | 137.661 | 1.9130565 | 1.5320665 | 0.3467037 | 0.1345357 | ∞ | 159.605 |
| E-14 | 1.7863651 | 1.7142020 | 0.1395008 | 0.0790479 | 250.434 | 212.771 | 1.9636614 | 1.6583831 | 0.5658537 | 0.3857683 | 63.760 | 51.480 |
| E-15 | 1.7840553 | 1.7114223 | 0.1284575 | 0.0727984 | ∞ | 215.754 | 2.0158573 | 1.6922355 | 0.3953694 | 0.2151582 | ∞ | 106.269 |
| E-16 | 1.7690598 | 1.6843869 | 0.1297423 | 0.0500450 | ∞ | 212.645 | 1.9880870 | 1.5380211 | 0.4067894 | 0.1736986 | ∞ | 142.387 |
| E-17 | 1.7654064 | 1.6439501 | 0.1389686 | 0.0226918 | ∞ | 139.944 | 1.9381099 | 1.5156709 | 0.3302597 | 0.1238534 | ∞ | 177.835 |

TABLE 11-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-01 | 1.8445498 | 1.7028640 | 0.3433769 | 0.2065410 | 35.166 | 24.465 | 1.8840155 | 1.4588886 | 1.1541143 | 0.7278801 | ∞ | 33.984 |
| F-02 | 1.9748025 | 1.8134890 | 0.2687031 | 0.0967476 | 27.589 | 16.388 | 1.9911676 | 1.6052106 | 0.7575345 | 0.4113980 | ∞ | 75.388 |
| F-03 | 2.0056416 | 1.8240852 | 0.2226912 | 0.0264241 | 23.756 | 11.873 | 1.9568925 | 1.6089457 | 0.5715493 | 0.2748867 | ∞ | 89.427 |
| F-04 | 2.0650838 | 1.8519295 | 0.1772441 | 0.0000000 | 19.476 | 8.682 | 1.9832685 | 1.6466413 | 0.4938946 | 0.2150397 | ∞ | 108.866 |
| F-05 | 2.1015333 | 1.8486964 | 0.2338354 | 0.0000000 | 16.441 | 6.545 | 1.8888145 | 1.5568528 | 0.4544922 | 0.1992566 | ∞ | 112.277 |
| F-06 | 1.8622524 | 1.7567983 | 0.2177349 | 0.1041338 | 90.922 | 78.110 | 1.8710036 | 1.4914735 | 0.8036755 | 0.5151159 | 62.376 | 40.547 |
| F-07 | 1.8361037 | 1.7366067 | 0.1859629 | 0.0693234 | 97.842 | 81.540 | 1.9770779 | 1.5840274 | 0.5667495 | 0.2947696 | ∞ | 89.920 |
| F-08 | 1.8189212 | 1.7220536 | 0.1637893 | 0.0490835 | 103.750 | 82.514 | 1.9475986 | 1.5829197 | 0.4906212 | 0.2005944 | ∞ | 127.512 |
| F-09 | 1.7899842 | 1.6878285 | 0.1542946 | 0.0309962 | 111.559 | 79.477 | 1.8924917 | 1.5312942 | 0.3961812 | 0.1493770 | ∞ | 146.311 |
| F-10 | 1.8004922 | 1.7221231 | 0.1725282 | 0.0852650 | 160.535 | 145.052 | 1.8718671 | 1.5444879 | 0.6488188 | 0.4200688 | 60.551 | 43.890 |
| F-11 | 1.7961652 | 1.7179231 | 0.1500467 | 0.0702567 | 178.047 | 148.974 | 1.9680612 | 1.5533127 | 0.4509038 | 0.2461101 | ∞ | 96.779 |
| F-12 | 1.7667150 | 1.6664697 | 0.1392414 | 0.0262031 | ∞ | 138.061 | 1.9143886 | 1.5273989 | 0.3437564 | 0.1347329 | ∞ | 166.803 |
| F-13 | 1.7813348 | 1.7056878 | 0.1353170 | 0.0551168 | 188.103 | 151.058 | 1.9595373 | 1.5581847 | 0.4254916 | 0.1791232 | ∞ | 133.271 |
| F-14 | 1.7822166 | 1.7169481 | 0.1395756 | 0.0867753 | 246.078 | 210.779 | 1.8944201 | 1.6099890 | 0.5389938 | 0.3617453 | 60.493 | 46.957 |
| F-15 | 1.7851393 | 1.7150563 | 0.1230351 | 0.0833794 | 267.416 | 215.816 | 1.9909918 | 1.7059344 | 0.3550419 | 0.2342728 | ∞ | 101.263 |
| F-16 | 1.7671877 | 1.6858645 | 0.1284573 | 0.0522146 | ∞ | 213.696 | 1.9902944 | 1.5291713 | 0.4050314 | 0.1800814 | ∞ | 132.816 |
| F-17 | 1.7651222 | 1.6451528 | 0.1393025 | 0.0231282 | ∞ | 140.264 | 1.9433160 | 1.5134088 | 0.3296937 | 0.1239332 | ∞ | 172.741 |

TABLE 11-G

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| G-01 | 1.8510344 | 1.7079497 | 0.3629205 | 0.2322015 | 35.649 | 25.461 | 1.9179419 | 1.4877015 | 1.3266012 | 0.8121213 | ∞ | 24.910 |
| G-02 | 1.9558961 | 1.7996144 | 0.2741522 | 0.1090704 | 29.623 | 18.109 | 2.0086034 | 1.6054333 | 0.8085387 | 0.4260057 | ∞ | 63.805 |
| G-03 | 2.0007807 | 1.8226508 | 0.2254244 | 0.0333809 | 24.374 | 12.458 | 1.9603631 | 1.6072540 | 0.5891826 | 0.2817351 | ∞ | 80.107 |
| G-04 | 2.0775306 | 1.8401429 | 0.2290099 | 0.0000000 | 17.643 | 7.220 | 1.8945047 | 1.5593252 | 0.4656915 | 0.2042938 | ∞ | 103.866 |
| G-05 | 1.8957386 | 1.7930616 | 0.2284775 | 0.1174850 | 89.439 | 78.698 | 2.0886119 | 1.5366111 | 1.0446792 | 0.6492373 | 42.199 | 24.342 |
| G-06 | 1.8445182 | 1.7463871 | 0.1855165 | 0.0715577 | 97.635 | 82.441 | 2.0389449 | 1.6285494 | 0.6271130 | 0.3140137 | ∞ | 76.060 |
| G-07 | 1.8208637 | 1.7249616 | 0.1633948 | 0.0495411 | 103.378 | 83.068 | 1.9667878 | 1.5975080 | 0.5153303 | 0.2065144 | ∞ | 120.158 |
| G-08 | 1.7914160 | 1.6890869 | 0.1545438 | 0.0310014 | 111.442 | 79.681 | 1.8956181 | 1.5348893 | 0.4029292 | 0.1524641 | ∞ | 137.415 |
| G-09 | 1.8064727 | 1.7324529 | 0.1736747 | 0.0932645 | 159.337 | 146.111 | 1.9712182 | 1.5680749 | 0.7358016 | 0.4694711 | 43.749 | 30.577 |
| G-10 | 1.7976831 | 1.7210876 | 0.1496282 | 0.0723320 | 178.016 | 150.130 | 2.0082485 | 1.5759633 | 0.4835820 | 0.2565849 | ∞ | 84.229 |
| G-11 | 1.7676796 | 1.6668971 | 0.1393459 | 0.0260829 | ∞ | 138.020 | 1.9186141 | 1.5291365 | 0.3482262 | 0.1370580 | ∞ | 155.808 |
| G-12 | 1.7818611 | 1.7063045 | 0.1353393 | 0.0547363 | 188.100 | 151.498 | 1.9748195 | 1.5661855 | 0.4418024 | 0.1833758 | ∞ | 124.682 |
| G-13 | 1.7798254 | 1.7226306 | 0.1373611 | 0.0956167 | 228.804 | 212.101 | 1.9246120 | 1.6316017 | 0.5645213 | 0.3855345 | 45.737 | 35.320 |
| G-14 | 1.7828150 | 1.7158448 | 0.1238214 | 0.0839801 | 266.567 | 217.609 | 1.9304083 | 1.7107074 | 0.3806594 | 0.2479153 | ∞ | 88.680 |
| G-15 | 1.7683830 | 1.6865935 | 0.1284365 | 0.0520461 | ∞ | 214.066 | 2.0034536 | 1.5326101 | 0.4129136 | 0.1829001 | ∞ | 124.317 |
| G-16 | 1.7660183 | 1.6445986 | 0.1391357 | 0.0229907 | ∞ | 140.172 | 1.9466117 | 1.5142130 | 0.3327484 | 0.1259991 | ∞ | 162.119 |

TABLE 11-H

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-01 | 1.8348744 | 1.7017860 | 0.3798462 | 0.2808191 | 40.569 | 31.320 | 2.2991869 | 1.6708019 | 1.7969846 | 1.1828110 | 24.492 | 11.798 |
| H-02 | 1.9378552 | 1.7891528 | 0.2803248 | 0.1232521 | 33.039 | 21.589 | 2.1152589 | 1.6836610 | 0.9407294 | 0.4862702 | ∞ | 55.622 |
| H-03 | 1.9816003 | 1.8123315 | 0.2304942 | 0.0484886 | 26.210 | 13.965 | 1.9677635 | 1.6119358 | 0.6263078 | 0.3015312 | ∞ | 76.216 |
| H-04 | 2.0531456 | 1.8330577 | 0.2233118 | 0.0000000 | 19.209 | 8.222 | 1.9045230 | 1.5691056 | 0.4866935 | 0.2170987 | ∞ | 119.528 |
| H-05 | 1.9032381 | 1.8026375 | 0.2332691 | 0.1296546 | 94.176 | 83.950 | 2.5106963 | 1.7240899 | 1.7198847 | 1.0160017 | 18.225 | 9.869 |
| H-06 | 1.8612260 | 1.7637761 | 0.1850318 | 0.0725318 | 98.433 | 84.409 | 2.1736563 | 1.7881949 | 0.7450683 | 0.3750354 | 78.752 | 56.421 |
| H-07 | 1.8282464 | 1.7322039 | 0.1638123 | 0.0491174 | 102.610 | 83.678 | 2.0065197 | 1.6441979 | 0.5671385 | 0.2268590 | ∞ | 111.470 |
| H-08 | 1.7958627 | 1.6943845 | 0.1554022 | 0.0314630 | 110.744 | 80.478 | 1.9018550 | 1.5486836 | 0.4227446 | 0.1616729 | ∞ | 129.994 |
| H-09 | 1.8204382 | 1.7477014 | 0.1733188 | 0.1005906 | 162.626 | 151.084 | 2.2468682 | 1.5775835 | 1.1545804 | 0.7384256 | 20.369 | 11.413 |
| H-10 | 1.8012800 | 1.7248420 | 0.1501327 | 0.0708798 | 170.938 | 152.125 | 2.0151748 | 1.6653676 | 0.5763906 | 0.2963613 | 83.086 | 66.911 |
| H-11 | 1.7851787 | 1.7084953 | 0.1369615 | 0.0539574 | 187.241 | 151.653 | 1.9886751 | 1.5898995 | 0.4693105 | 0.1905971 | ∞ | 116.509 |

TABLE 11-H-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-12 | 1.7692727 | 1.6693251 | 0.1392713 | 0.0269409 | ∞ | 139.738 | 1.9227537 | 1.5351035 | 0.3603968 | 0.1441040 | ∞ | 173.121 |
| H-13 | 1.7826017 | 1.7298539 | 0.1352886 | 0.1031853 | 230.770 | 217.847 | 2.0789924 | 1.7538251 | 0.8187232 | 0.5751050 | 23.733 | 17.715 |
| H-14 | 1.7835199 | 1.7158807 | 0.1274471 | 0.0787410 | 264.411 | 219.187 | 1.9536996 | 1.5958199 | 0.4569726 | 0.2526929 | 86.365 | 72.843 |
| H-15 | 1.7709992 | 1.6903070 | 0.1287648 | 0.0532839 | ∞ | 215.155 | 2.0153556 | 1.5448258 | 0.4230963 | 0.1875775 | ∞ | 117.185 |
| H-16 | 1.7665771 | 1.6446349 | 0.1382733 | 0.0240191 | ∞ | 140.790 | 1.9481295 | 1.5169100 | 0.3392135 | 0.1321456 | ∞ | 170.934 |

TABLE 11-I

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| I-01 | 1.8010327 | 1.6703051 | 0.3790844 | 0.2860131 | 49.040 | 39.697 | 6.2750068 | 4.0060224 | 6.3084837 | 4.3813279 | 2.011 | 1.105 |
| I-02 | 1.9298895 | 1.7853326 | 0.2927841 | 0.1409628 | 33.486 | 22.674 | 2.1127495 | 1.6827031 | 1.0143560 | 0.5514972 | ∞ | 52.072 |
| I-03 | 1.9897430 | 1.8293451 | 0.2260071 | 0.0543604 | 27.922 | 16.406 | 2.0768797 | 1.7082590 | 0.7280970 | 0.3528321 | ∞ | 86.499 |
| I-04 | 1.9818310 | 1.8176855 | 0.2357004 | 0.0585080 | 26.827 | 15.078 | 1.9901759 | 1.6322669 | 0.6776751 | 0.3358636 | ∞ | 74.175 |
| I-05 | 2.0325692 | 1.8434603 | 0.1884373 | 0.0000000 | 22.396 | 11.017 | 2.0035162 | 1.6644915 | 0.5539257 | 0.2508800 | ∞ | 109.936 |
| I-06 | 2.0503236 | 1.8393702 | 0.2207547 | 0.0000000 | 19.774 | 8.961 | 1.9171324 | 1.5828588 | 0.5124144 | 0.2361131 | ∞ | 116.056 |
| I-07 | 2.0748040 | 1.8271550 | 0.2143905 | 0.0000000 | 17.468 | 6.484 | 1.9053653 | 1.5724832 | 0.4408889 | 0.1848623 | ∞ | 129.507 |
| I-08 | 1.8967501 | 1.7978609 | 0.2321058 | 0.1358900 | 99.873 | 89.276 | 4.7253432 | 3.0478309 | 4.6281749 | 2.8811534 | 3.296 | 1.805 |
| I-09 | 1.8980961 | 1.8025163 | 0.1987565 | 0.0890605 | 98.171 | 86.996 | 2.8922831 | 2.4763163 | 0.9336804 | 0.4984400 | 44.099 | 35.880 |
| I-10 | 1.8353948 | 1.7408879 | 0.1658283 | 0.0523285 | 101.320 | 84.205 | 2.0470219 | 1.6904643 | 0.6008487 | 0.2548880 | ∞ | 103.196 |
| I-11 | 1.7999193 | 1.7010338 | 0.1566929 | 0.0340123 | 109.103 | 81.354 | 1.9088732 | 1.5604748 | 0.4445734 | 0.1750519 | ∞ | 159.368 |
| I-12 | 1.7854499 | 1.6686531 | 0.1595713 | 0.0236692 | 117.512 | 74.034 | 1.8609244 | 1.5175199 | 0.3552154 | 0.1357403 | ∞ | 176.325 |
| I-13 | 1.8244989 | 1.7519220 | 0.1722459 | 0.0986888 | 168.183 | 156.692 | 5.2323444 | 3.4304584 | 4.7853754 | 3.0546576 | 1.899 | 1.115 |
| I-14 | 1.8045445 | 1.7295701 | 0.1511401 | 0.0733300 | 169.665 | 153.355 | 2.1332569 | 1.7780836 | 0.6582710 | 0.3581709 | 67.058 | 53.813 |
| I-15 | 1.7877293 | 1.7127660 | 0.1377613 | 0.0572352 | 185.067 | 151.912 | 1.9754955 | 1.6114989 | 0.4878301 | 0.2114751 | ∞ | 109.119 |
| I-16 | 1.7698545 | 1.6769443 | 0.1389352 | 0.0297641 | ∞ | 142.121 | 1.9212870 | 1.5382413 | 0.3717519 | 0.1547194 | ∞ | 166.932 |
| I-17 | 1.7687629 | 1.6489912 | 0.1464718 | 0.0187435 | ∞ | 124.857 | 1.9093862 | 1.5283218 | 0.3156516 | 0.1239487 | ∞ | 178.253 |
| I-18 | 1.7823383 | 1.7323517 | 0.1360043 | 0.1014499 | 237.517 | 225.014 | 4.8909707 | 3.2979556 | 4.1408226 | 2.8457384 | 1.432 | 0.948 |
| I-19 | 1.7855975 | 1.7187225 | 0.1266313 | 0.0809270 | 261.147 | 219.736 | 2.0323920 | 1.7604730 | 0.5028382 | 0.3025708 | 71.994 | 61.451 |
| I-20 | 1.7723412 | 1.6968651 | 0.1273417 | 0.0587455 | ∞ | 216.538 | 1.9005983 | 1.5558095 | 0.4255322 | 0.2016199 | ∞ | 110.627 |
| I-21 | 1.7658718 | 1.6500332 | 0.1370124 | 0.0266059 | ∞ | 142.074 | 1.9535710 | 1.5188262 | 0.3463206 | 0.1414268 | ∞ | 165.553 |
| I-22 | 1.7705609 | 1.6340802 | 0.1434011 | 0.0161403 | ∞ | 129.746 | 1.9378669 | 1.5210188 | 0.3075256 | 0.1150696 | ∞ | 175.929 |
| I-23 | 1.7800884 | 1.5986944 | 0.1423932 | 0.0152277 | ∞ | 132.671 | 1.9711999 | 1.4724951 | 0.3645229 | 0.1050453 | ∞ | 170.517 |

TABLE 11-J

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| J-01 | 1.9409429 | 1.8021941 | 0.3131894 | 0.1685141 | 32.263 | 22.948 | 2.1266765 | 1.6861902 | 1.1398766 | 0.6573509 | ∞ | 46.952 |
| J-02 | 1.9932822 | 1.8329758 | 0.2432049 | 0.0705755 | 26.396 | 15.656 | 2.0111682 | 1.6483447 | 0.7292981 | 0.3769397 | ∞ | 86.478 |
| J-03 | 2.0278925 | 1.8383637 | 0.2106615 | 0.0048254 | 21.892 | 10.787 | 1.9564959 | 1.6175237 | 0.5535235 | 0.2607610 | ∞ | 108.187 |
| J-04 | 2.0851788 | 1.8312945 | 0.2401716 | 0.0000000 | 16.615 | 6.305 | 1.8770072 | 1.5476420 | 0.4425906 | 0.1917715 | ∞ | 128.340 |
| J-05 | 1.8783297 | 1.7939522 | 0.1960237 | 0.0933894 | 96.880 | 86.306 | 2.5837560 | 2.1571068 | 1.0162369 | 0.5615995 | 48.975 | 38.062 |
| J-06 | 1.8340278 | 1.7448822 | 0.1682003 | 0.0599264 | 99.658 | 84.361 | 2.0380702 | 1.6791847 | 0.6233239 | 0.2810937 | ∞ | 97.676 |
| J-07 | 1.7994764 | 1.7049231 | 0.1581441 | 0.0389876 | 107.073 | 81.918 | 1.9050716 | 1.5552547 | 0.4529885 | 0.1881814 | ∞ | 153.165 |
| J-08 | 1.7846306 | 1.6715154 | 0.1609601 | 0.0274140 | 112.273 | 75.140 | 1.8541601 | 1.5132909 | 0.3609224 | 0.1435457 | ∞ | 170.190 |
| J-09 | 1.7998854 | 1.7353261 | 0.1482564 | 0.0854732 | 166.198 | 153.461 | 2.1593286 | 1.7753687 | 0.6667261 | 0.4228687 | 61.016 | 49.925 |
| J-10 | 1.7863396 | 1.7175981 | 0.1353847 | 0.0659389 | 180.247 | 152.325 | 1.9982564 | 1.6053072 | 0.4773921 | 0.2335628 | ∞ | 109.997 |
| J-11 | 1.7681464 | 1.6819305 | 0.1380740 | 0.0342715 | ∞ | 144.598 | 1.9216978 | 1.5338499 | 0.3746436 | 0.1661414 | ∞ | 160.089 |
| J-12 | 1.7669198 | 1.6515622 | 0.1463713 | 0.0216239 | ∞ | 129.299 | 1.9100226 | 1.5252131 | 0.3191776 | 0.1309355 | ∞ | 172.105 |
| J-13 | 1.7707165 | 1.7040051 | 0.1220832 | 0.0695282 | ∞ | 217.819 | 1.9376772 | 1.5483132 | 0.4043358 | 0.2333336 | ∞ | 104.539 |
| J-14 | 1.7634269 | 1.6553617 | 0.1358159 | 0.0303533 | ∞ | 189.521 | 1.9623054 | 1.5145784 | 0.3489988 | 0.1513852 | ∞ | 158.729 |
| J-15 | 1.7680585 | 1.6373835 | 0.1429634 | 0.0185884 | ∞ | 132.956 | 1.9433515 | 1.5188691 | 0.3114371 | 0.1213260 | ∞ | 169.651 |

TABLE 11-K

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-01 | 1.9707785 | 1.8360788 | 0.3425950 | 0.2023887 | 27.715 | 20.125 | 1.9329888 | 1.5140813 | 1.1219560 | 0.7176091 | ∞ | 45.573 |
| K-02 | 2.0196477 | 1.8536052 | 0.2639073 | 0.0831004 | 23.306 | 13.914 | 1.9357511 | 1.5767961 | 0.7075294 | 0.3937403 | ∞ | 72.232 |
| K-03 | 2.0645663 | 1.8585909 | 0.2374446 | 0.0112678 | 18.917 | 9.310 | 1.9031629 | 1.5653077 | 0.5390913 | 0.2670820 | ∞ | 104.858 |
| K-04 | 2.0786207 | 1.8320900 | 0.2457404 | 0.0000000 | 16.773 | 6.617 | 1.8708739 | 1.5393529 | 0.4503117 | 0.1999821 | ∞ | 123.607 |
| K-05 | 1.8425452 | 1.7719593 | 0.1968678 | 0.1116248 | 92.844 | 83.802 | 1.9910461 | 1.5793420 | 0.7893473 | 0.5451810 | 78.485 | 48.751 |
| K-06 | 1.8250707 | 1.7437914 | 0.1698075 | 0.0718228 | 97.605 | 84.143 | 1.9741547 | 1.6009187 | 0.5756118 | 0.2952627 | ∞ | 99.488 |
| K-07 | 1.7937600 | 1.7041262 | 0.1595997 | 0.0451600 | 104.545 | 82.071 | 1.8857969 | 1.5266501 | 0.4416537 | 0.1958456 | ∞ | 144.226 |
| K-08 | 1.7828027 | 1.6711987 | 0.1628300 | 0.0313846 | 109.589 | 75.289 | 1.8295758 | 1.5032806 | 0.3608888 | 0.1486305 | ∞ | 162.042 |
| K-09 | 1.7810699 | 1.7216656 | 0.1268030 | 0.0823438 | 175.807 | 152.735 | 1.9768505 | 1.5572423 | 0.4221615 | 0.2566463 | ∞ | 112.257 |
| K-10 | 1.7642217 | 1.6821282 | 0.1373190 | 0.0383688 | 182.940 | 144.697 | 1.9234068 | 1.5160325 | 0.3659687 | 0.1739655 | ∞ | 152.160 |
| K-11 | 1.7649885 | 1.6533259 | 0.1472226 | 0.0245664 | ∞ | 131.728 | 1.7830963 | 1.5179791 | 0.3193676 | 0.1355785 | ∞ | 163.972 |

TABLE 11-K-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-12 | 1.7600028 | 1.6605350 | 0.1355277 | 0.0346940 | ∞ | 198.719 | 1.9669273 | 1.5020323 | 0.3468141 | 0.1582667 | ∞ | 150.027 |
| K-13 | 1.7652786 | 1.6418728 | 0.1432970 | 0.0211204 | ∞ | 135.362 | 1.9519198 | 1.5131027 | 0.3139043 | 0.1253960 | ∞ | 161.156 |

TABLE 11-L

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-01 | 1.9805757 | 1.8427363 | 0.3773193 | 0.2296740 | 24.766 | 18.143 | 1.7617713 | 1.4040247 | 1.0059180 | 0.6941285 | ∞ | 44.977 |
| L-02 | 2.0582393 | 1.8830904 | 0.2806928 | 0.0880549 | 20.473 | 12.463 | 1.8985725 | 1.5339046 | 0.6916574 | 0.4025791 | ∞ | 75.356 |
| L-03 | 2.1015526 | 1.8843029 | 0.2490971 | 0.0097038 | 17.008 | 8.572 | 1.8899397 | 1.5484993 | 0.5369665 | 0.2720763 | ∞ | 99.033 |
| L-04 | 2.0306052 | 1.7992233 | 0.2679772 | 0.0204784 | 18.280 | 7.154 | 1.8310388 | 1.5036438 | 0.4411974 | 0.1956323 | ∞ | 118.483 |
| L-05 | 1.8338888 | 1.7723544 | 0.2044936 | 0.1383034 | 88.945 | 81.835 | 1.8276199 | 1.5002786 | 0.6676941 | 0.5063342 | 80.329 | 54.435 |
| L-06 | 1.8206102 | 1.7454442 | 0.1694749 | 0.0862511 | 95.473 | 84.029 | 1.9314879 | 1.5235777 | 0.5240986 | 0.2952742 | ∞ | 103.032 |
| L-07 | 1.7877872 | 1.7013333 | 0.1602300 | 0.0516668 | 102.853 | 81.969 | 1.8638369 | 1.4967507 | 0.4266791 | 0.1970013 | ∞ | 116.786 |
| L-08 | 1.7818580 | 1.6686304 | 0.1646693 | 0.0341982 | 107.829 | 74.760 | 1.7745154 | 1.4951867 | 0.3600673 | 0.1503127 | ∞ | 151.233 |
| L-09 | 1.7605496 | 1.6803665 | 0.1370589 | 0.0427461 | 177.108 | 144.718 | 1.7126080 | 1.4998919 | 0.3597939 | 0.1765700 | ∞ | 142.669 |
| L-10 | 1.7645893 | 1.6563972 | 0.1488224 | 0.0265689 | ∞ | 133.224 | 1.7659346 | 1.5128389 | 0.3206823 | 0.1370177 | ∞ | 153.192 |
| L-11 | 1.7580624 | 1.6651535 | 0.1365795 | 0.0383336 | ∞ | 201.534 | 1.7451455 | 1.4912014 | 0.3491875 | 0.1604448 | ∞ | 139.349 |
| L-12 | 1.7646827 | 1.6459120 | 0.1442677 | 0.0227735 | ∞ | 136.956 | 1.8231992 | 1.5094394 | 0.3175857 | 0.1264736 | ∞ | 150.082 |

TABLE 11-M

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| M-01 | 1.9656620 | 1.8272452 | 0.4002190 | 0.2589422 | 24.403 | 18.176 | 1.6618614 | 1.3463629 | 0.9953093 | 0.6931023 | ∞ | 44.440 |
| M-02 | 2.0805818 | 1.9019600 | 0.2933600 | 0.0973432 | 19.349 | 12.113 | 1.8909403 | 1.5093131 | 0.6985739 | 0.4106662 | ∞ | 78.214 |
| M-03 | 2.1240686 | 1.9025366 | 0.2580161 | 0.0146042 | 16.072 | 8.378 | 1.8829834 | 1.5341772 | 0.5432075 | 0.2767952 | ∞ | 97.972 |
| M-04 | 2.0463656 | 1.8091195 | 0.2704872 | 0.0198024 | 17.616 | 6.990 | 1.8298176 | 1.5065070 | 0.4483924 | 0.2003870 | ∞ | 113.241 |
| M-05 | 1.8346221 | 1.7814641 | 0.2172051 | 0.1623528 | 85.845 | 80.029 | 1.7057113 | 1.4982260 | 0.6335216 | 0.4823449 | 74.094 | 52.226 |
| M-06 | 1.8157041 | 1.7513682 | 0.1669795 | 0.1013813 | 93.932 | 84.386 | 1.9287032 | 1.4845723 | 0.5001755 | 0.2953684 | ∞ | 100.444 |
| M-07 | 1.7849537 | 1.6995924 | 0.1596969 | 0.0551962 | 102.261 | 81.938 | 1.7495426 | 1.4857755 | 0.4263613 | 0.1988052 | ∞ | 130.009 |
| M-08 | 1.7830385 | 1.6675295 | 0.1656893 | 0.0348934 | 107.536 | 74.493 | 1.7604124 | 1.4953428 | 0.3646225 | 0.1519004 | ∞ | 141.305 |
| M-09 | 1.7593389 | 1.6811590 | 0.1373458 | 0.0445858 | 176.094 | 145.009 | 1.6975009 | 1.4959323 | 0.3653363 | 0.1785089 | ∞ | 133.949 |
| M-10 | 1.7660292 | 1.6580873 | 0.1500408 | 0.0267950 | ∞ | 133.655 | 1.7664113 | 1.5149782 | 0.3268824 | 0.1382789 | ∞ | 178.785 |
| M-11 | 1.7581881 | 1.6675241 | 0.1380347 | 0.0395508 | ∞ | 202.677 | 1.7376177 | 1.4911956 | 0.3595090 | 0.1618748 | ∞ | 130.155 |
| M-12 | 1.7661501 | 1.6473109 | 0.1451137 | 0.0228029 | ∞ | 137.385 | 1.8164479 | 1.5119594 | 0.3236023 | 0.1274389 | ∞ | 181.924 |

TABLE 11-N

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| N-01 | 1.9308929 | 1.7942376 | 0.4248943 | 0.3114263 | 27.599 | 21.187 | 1.6733044 | 1.3254125 | 1.2150047 | 0.8122935 | ∞ | 33.320 |
| N-02 | 2.0668469 | 1.9023462 | 0.2944815 | 0.1170071 | 21.058 | 13.856 | 1.9424197 | 1.5287271 | 0.7816085 | 0.4525081 | ∞ | 73.527 |
| N-03 | 2.0815755 | 1.8822127 | 0.2572651 | 0.0377485 | 18.101 | 9.759 | 1.8880509 | 1.5306180 | 0.5717414 | 0.2897138 | ∞ | 90.028 |
| N-04 | 2.0331581 | 1.8054116 | 0.2662567 | 0.0253034 | 18.433 | 7.508 | 1.8297667 | 1.5048766 | 0.4584284 | 0.2062971 | ∞ | 119.932 |
| N-05 | 1.8646227 | 1.8113608 | 0.2337820 | 0.1808352 | 84.337 | 79.289 | 1.7715072 | 1.5007687 | 0.7638684 | 0.5670385 | 58.513 | 38.960 |
| N-06 | 1.8226386 | 1.7585272 | 0.1669851 | 0.1079995 | 94.451 | 85.625 | 1.9890062 | 1.5134605 | 0.5625304 | 0.3165392 | ∞ | 88.401 |
| N-07 | 1.7860045 | 1.7014415 | 0.1599748 | 0.0556450 | 102.201 | 82.327 | 1.7373881 | 1.4915665 | 0.4418842 | 0.2070014 | ∞ | 125.640 |
| N-08 | 1.7844901 | 1.6689970 | 0.1656189 | 0.0350000 | 107.593 | 74.953 | 1.7619897 | 1.5010412 | 0.3737899 | 0.1569772 | ∞ | 134.829 |
| N-09 | 1.7601791 | 1.6820529 | 0.1372717 | 0.0442944 | 176.678 | 145.537 | 1.6980791 | 1.5006390 | 0.3771531 | 0.1853343 | ∞ | 127.521 |
| N-10 | 1.7669520 | 1.6576990 | 0.1499045 | 0.0265976 | ∞ | 133.759 | 1.7681577 | 1.5197385 | 0.3340591 | 0.1427591 | ∞ | 172.727 |
| N-11 | 1.7594305 | 1.6674640 | 0.1377797 | 0.0390528 | ∞ | 202.284 | 1.7367775 | 1.4946242 | 0.3688872 | 0.1686918 | ∞ | 124.146 |
| N-12 | 1.7672862 | 1.6458103 | 0.1449746 | 0.0224892 | ∞ | 136.963 | 1.8168346 | 1.5177282 | 0.3290477 | 0.1317503 | ∞ | 173.664 |

TABLE 11-O

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-01 | 1.8983129 | 1.7713829 | 0.4492907 | 0.3728197 | 32.695 | 26.370 | 1.8885821 | 1.4076568 | 1.7362366 | 1.2101672 | ∞ | 19.131 |
| O-02 | 2.0221369 | 1.8742366 | 0.2986525 | 0.1428175 | 25.315 | 17.418 | 2.0282026 | 1.5883796 | 0.9417727 | 0.5259305 | ∞ | 58.081 |
| O-03 | 2.0538982 | 1.8739141 | 0.2424013 | 0.0480312 | 20.577 | 11.685 | 1.9364611 | 1.5761180 | 0.6315251 | 0.3225835 | ∞ | 77.301 |
| O-04 | 2.0458191 | 1.8670105 | 0.2458201 | 0.0517698 | 20.811 | 11.767 | 1.9264805 | 1.5663584 | 0.6264832 | 0.3193835 | ∞ | 77.707 |
| O-05 | 2.0385649 | 1.8193877 | 0.2557128 | 0.0219835 | 18.714 | 8.116 | 1.8502574 | 1.5146080 | 0.4821269 | 0.2224065 | ∞ | 120.462 |
| O-06 | 1.9309938 | 1.8673549 | 0.2538005 | 0.1883086 | 85.306 | 80.356 | 2.1784360 | 1.3777316 | 1.3849754 | 0.9787327 | 25.718 | 18.689 |
| O-07 | 1.8360843 | 1.7689224 | 0.1740671 | 0.1038864 | 95.456 | 86.511 | 2.0629243 | 1.6089888 | 0.7196957 | 0.3755124 | 90.240 | 70.528 |
| O-08 | 1.7914404 | 1.7087781 | 0.1617681 | 0.0561273 | 102.053 | 83.173 | 1.7728850 | 1.5080181 | 0.4712700 | 0.2252849 | ∞ | 119.073 |
| O-09 | 1.7855461 | 1.6753276 | 0.1657039 | 0.0365901 | 106.634 | 76.325 | 1.7686520 | 1.5043380 | 0.3845023 | 0.1665592 | ∞ | 130.226 |
| O-10 | 1.7619954 | 1.6853206 | 0.1364735 | 0.0449452 | 176.477 | 146.293 | 1.7037330 | 1.5063136 | 0.3897179 | 0.1998033 | ∞ | 121.636 |

TABLE 11-O-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-11 | 1.7666212 | 1.6586696 | 0.1483575 | 0.0277643 | ∞ | 134.971 | 1.7675592 | 1.5223065 | 0.3404988 | 0.1513643 | ∞ | 169.458 |
| O-12 | 1.7600214 | 1.6674457 | 0.1353724 | 0.0398598 | ∞ | 203.372 | 1.7336096 | 1.4983350 | 0.3728491 | 0.1810864 | ∞ | 119.091 |
| O-13 | 1.7666902 | 1.6441133 | 0.1435628 | 0.0234603 | ∞ | 137.297 | 1.8174968 | 1.5205437 | 0.3331058 | 0.1396793 | ∞ | 166.065 |

TABLE 11-P

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| P-01 | 1.8780527 | 1.7841892 | 0.4704720 | 0.4258296 | 39.871 | 36.131 | 3.8374192 | 2.5149643 | 3.8845138 | 3.1011910 | 7.792 | 4.175 |
| P-02 | 2.0045937 | 1.8646596 | 0.3133681 | 0.1698146 | 26.845 | 19.161 | 2.0314015 | 1.6016212 | 1.0660721 | 0.6113773 | ∞ | 52.667 |
| P-03 | 2.0530202 | 1.8803103 | 0.2440748 | 0.0596583 | 21.347 | 12.660 | 1.9574412 | 1.6006931 | 0.6823172 | 0.3617691 | ∞ | 76.147 |
| P-04 | 2.0429780 | 1.8714704 | 0.2483473 | 0.0641517 | 21.618 | 12.745 | 1.9428026 | 1.5864366 | 0.6742389 | 0.3569916 | ∞ | 76.533 |
| P-05 | 2.0522715 | 1.8338352 | 0.2644862 | 0.0276844 | 18.107 | 8.267 | 1.8450555 | 1.5106780 | 0.4971090 | 0.2379952 | ∞ | 116.633 |
| P-06 | 1.9201515 | 1.8546107 | 0.2638968 | 0.2103323 | 92.949 | 87.333 | 3.5726732 | 2.1819396 | 3.6524152 | 2.4498639 | 6.687 | 3.716 |
| P-07 | 1.8500584 | 1.7844224 | 0.1803688 | 0.1065614 | 95.088 | 86.922 | 2.1410667 | 1.7465989 | 0.8707351 | 0.4728347 | 70.310 | 54.362 |
| P-08 | 1.7977896 | 1.7189041 | 0.1636820 | 0.0609733 | 100.778 | 83.843 | 1.8102211 | 1.5260463 | 0.5022919 | 0.2523298 | ∞ | 111.159 |
| P-09 | 1.7862279 | 1.6830174 | 0.1662284 | 0.0400981 | 104.776 | 77.979 | 1.7748938 | 1.5040454 | 0.3960924 | 0.1795690 | ∞ | 158.982 |
| P-10 | 1.7629458 | 1.6959903 | 0.1345482 | 0.0519274 | 174.320 | 148.790 | 1.7045759 | 1.5095881 | 0.3975003 | 0.2207376 | ∞ | 114.980 |
| P-11 | 1.7650921 | 1.6619781 | 0.1465604 | 0.0306449 | ∞ | 136.303 | 1.7644259 | 1.5196188 | 0.3454133 | 0.1625972 | ∞ | 163.210 |
| P-12 | 1.7590465 | 1.6699937 | 0.1316590 | 0.0452796 | ∞ | 205.144 | 1.7266293 | 1.4939047 | 0.3731671 | 0.1985602 | ∞ | 113.183 |
| P-13 | 1.7642216 | 1.6473356 | 0.1416339 | 0.0260138 | ∞ | 138.871 | 1.8208547 | 1.5182326 | 0.3359797 | 0.1495551 | ∞ | 160.163 |
| P-14 | 1.7737928 | 1.6371509 | 0.1427687 | 0.0166726 | ∞ | 129.351 | 1.8670261 | 1.5337143 | 0.3141753 | 0.1193498 | ∞ | 167.687 |

TABLE 11-Q

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-01 | 2.0674276 | 1.8952498 | 0.2578761 | 0.0732289 | 20.370 | 12.412 | 1.9301091 | 1.5792363 | 0.6972600 | 0.3912321 | ∞ | 72.205 |
| Q-02 | 2.0605471 | 1.8471975 | 0.2662409 | 0.0327302 | 17.849 | 8.584 | 1.8468736 | 1.5141404 | 0.5153586 | 0.2562131 | ∞ | 109.642 |
| Q-03 | 2.0481271 | 1.8055599 | 0.2587648 | 0.0000000 | 17.756 | 6.646 | 1.8423927 | 1.5198133 | 0.4376143 | 0.1939864 | ∞ | 127.076 |
| Q-04 | 1.8352950 | 1.7806551 | 0.1760792 | 0.1243874 | 92.494 | 85.916 | 1.8765331 | 1.6017833 | 0.7228468 | 0.5239454 | ∞ | 55.977 |
| Q-05 | 1.7969652 | 1.7245018 | 0.1655054 | 0.0710804 | 98.269 | 83.892 | 1.7758132 | 1.5039943 | 0.4974848 | 0.2749519 | ∞ | 104.163 |
| Q-06 | 1.7846203 | 1.6873547 | 0.1679367 | 0.0455271 | 102.537 | 78.800 | 1.7616062 | 1.4917039 | 0.3987387 | 0.1907248 | ∞ | 120.624 |
| Q-07 | 1.7874820 | 1.6732889 | 0.1648541 | 0.0281745 | 110.048 | 75.133 | 1.7961257 | 1.5163711 | 0.3613314 | 0.1498031 | ∞ | 162.278 |
| Q-08 | 1.7599794 | 1.7028432 | 0.1308972 | 0.0639246 | 169.831 | 149.777 | 1.6725316 | 1.4900523 | 0.3850189 | 0.2400043 | ∞ | 108.348 |
| Q-09 | 1.7622726 | 1.6647970 | 0.1456698 | 0.0349532 | ∞ | 137.674 | 1.7522289 | 1.5081249 | 0.3452538 | 0.1726854 | ∞ | 154.451 |
| Q-10 | 1.7709206 | 1.6506325 | 0.1481192 | 0.0222904 | ∞ | 127.980 | 1.8062734 | 1.5335366 | 0.3214813 | 0.1360272 | ∞ | 163.843 |
| Q-11 | 1.7544340 | 1.6771452 | 0.1276225 | 0.0536259 | ∞ | 206.845 | 1.6988060 | 1.4745640 | 0.3645513 | 0.2146306 | ∞ | 106.178 |
| Q-12 | 1.7604926 | 1.6514825 | 0.1403326 | 0.0298540 | ∞ | 191.762 | 1.8158322 | 1.5066317 | 0.3372143 | 0.1583996 | ∞ | 151.240 |
| Q-13 | 1.7708390 | 1.6398698 | 0.1421452 | 0.0196232 | ∞ | 132.328 | 1.8662406 | 1.5255411 | 0.3153304 | 0.1245821 | ∞ | 160.775 |

TABLE 11-R

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| R-01 | 2.0686011 | 1.9290747 | 0.3646827 | 0.2232118 | 20.748 | 15.605 | 1.7725917 | 1.4250954 | 0.9774342 | 0.6846559 | ∞ | 48.159 |
| R-02 | 2.1057737 | 1.9241441 | 0.2777423 | 0.0807757 | 17.910 | 11.136 | 1.8803477 | 1.5314622 | 0.6785916 | 0.4010256 | ∞ | 74.204 |
| R-03 | 2.0581225 | 1.8471227 | 0.2827637 | 0.0506751 | 17.506 | 8.641 | 1.8209194 | 1.4881826 | 0.5158812 | 0.2638096 | ∞ | 101.942 |
| R-04 | 2.0160417 | 1.7848136 | 0.2764766 | 0.0259725 | 18.735 | 7.136 | 1.8085495 | 1.4912875 | 0.4323967 | 0.1939104 | ∞ | 124.151 |
| R-05 | 1.7919869 | 1.7262105 | 0.1658878 | 0.0818436 | 96.241 | 83.786 | 1.6987387 | 1.4545139 | 0.4704686 | 0.2829052 | ∞ | 96.155 |
| R-06 | 1.7818457 | 1.6875524 | 0.1704119 | 0.0518243 | 100.653 | 78.821 | 1.7357307 | 1.4717707 | 0.3957746 | 0.1960651 | ∞ | 114.313 |
| R-07 | 1.7864151 | 1.6742008 | 0.1665634 | 0.0317893 | 107.735 | 75.495 | 1.7880532 | 1.5078066 | 0.3631259 | 0.1534641 | ∞ | 151.241 |
| R-08 | 1.7551187 | 1.7058048 | 0.1260613 | 0.0733672 | 165.735 | 150.023 | 1.6240183 | 1.4537363 | 0.3656730 | 0.2492789 | ∞ | 100.378 |
| R-09 | 1.7596719 | 1.6665628 | 0.1463430 | 0.0399819 | 173.817 | 139.094 | 1.7390530 | 1.4931057 | 0.3452404 | 0.1780760 | ∞ | 143.243 |
| R-10 | 1.7692084 | 1.6538434 | 0.1486440 | 0.0255447 | ∞ | 130.472 | 1.8042519 | 1.5254556 | 0.3230027 | 0.1389890 | ∞ | 153.607 |
| R-11 | 1.7492113 | 1.6831859 | 0.1255161 | 0.0612754 | 241.079 | 208.986 | 1.6666911 | 1.4444231 | 0.3598271 | 0.2233952 | 129.694 | 97.164 |
| R-12 | 1.7576163 | 1.6562759 | 0.1404728 | 0.0340654 | ∞ | 196.802 | 1.8055298 | 1.4941443 | 0.3412442 | 0.1631900 | ∞ | 140.744 |
| R-13 | 1.7695645 | 1.6433499 | 0.1419181 | 0.0223429 | ∞ | 134.816 | 1.8604189 | 1.5168227 | 0.3181887 | 0.1267727 | ∞ | 150.217 |

TABLE 11-S

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-01 | 2.1066284 | 1.9722278 | 0.3918647 | 0.2424714 | 18.058 | 13.880 | 1.6983133 | 1.3959451 | 0.9356371 | 0.6799376 | ∞ | 48.742 |
| S-02 | 2.0496651 | 1.8417159 | 0.2971437 | 0.0714760 | 17.518 | 8.817 | 1.7914989 | 1.4621715 | 0.5192064 | 0.2672081 | ∞ | 96.374 |
| S-03 | 2.0477146 | 1.8087071 | 0.2690455 | 0.0146962 | 17.668 | 6.939 | 1.8236763 | 1.5090608 | 0.4501576 | 0.2032801 | ∞ | 113.921 |
| S-04 | 2.0388925 | 1.7916110 | 0.2221639 | 0.0000000 | 18.932 | 6.085 | 1.8751494 | 1.5585832 | 0.4137815 | 0.1664536 | ∞ | 135.543 |
| S-05 | 1.7882051 | 1.7276876 | 0.1639748 | 0.0887941 | 94.977 | 84.024 | 1.6337392 | 1.4183937 | 0.4583837 | 0.2861144 | ∞ | 87.183 |

TABLE 11-S-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-06 | 1.7819149 | 1.6860152 | 0.1726072 | 0.0563951 | 99.704 | 78.505 | 1.7230213 | 1.4640186 | 0.4031988 | 0.1996941 | ∞ | 122.946 |
| S-07 | 1.7882233 | 1.6754877 | 0.1680948 | 0.0335916 | 107.097 | 75.784 | 1.7909719 | 1.5092031 | 0.3709737 | 0.1549276 | ∞ | 139.443 |
| S-08 | 1.7966754 | 1.6777130 | 0.1592941 | 0.0183420 | 126.810 | 74.679 | 1.8368322 | 1.5410192 | 0.3573019 | 0.1265255 | ∞ | 161.553 |
| S-09 | 1.7601684 | 1.6707422 | 0.1484202 | 0.0431443 | 172.192 | 140.483 | 1.7421043 | 1.4908567 | 0.3567036 | 0.1810713 | ∞ | 132.966 |
| S-10 | 1.7708264 | 1.6578479 | 0.1494843 | 0.0270356 | ∞ | 131.945 | 1.8111661 | 1.5278995 | 0.3313428 | 0.1397205 | ∞ | 140.924 |
| S-11 | 1.7808365 | 1.6566373 | 0.1449551 | 0.0169888 | ∞ | 76.243 | 1.8495085 | 1.5425871 | 0.3220124 | 0.1131660 | ∞ | 185.922 |
| S-12 | 1.7467185 | 1.6898837 | 0.1280234 | 0.0691355 | 236.068 | 211.744 | 1.6356970 | 1.4330066 | 0.3806984 | 0.2403298 | 115.527 | 85.926 |
| S-13 | 1.7579517 | 1.6604298 | 0.1418869 | 0.0367490 | ∞ | 199.389 | 1.7772417 | 1.5042485 | 0.3539561 | 0.1652781 | ∞ | 134.892 |
| S-14 | 1.7709827 | 1.6467432 | 0.1418484 | 0.0235245 | ∞ | 136.309 | 1.8412669 | 1.5157433 | 0.3250679 | 0.1269148 | ∞ | 137.874 |
| S-15 | 1.7833105 | 1.6368506 | 0.1388995 | 0.0211969 | ∞ | 78.351 | 1.8743702 | 1.5007728 | 0.3112326 | 0.1024191 | ∞ | 189.621 |

TABLE 11-T

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| T-01 | 2.0257518 | 1.8262559 | 0.3005010 | 0.0875737 | 18.604 | 9.528 | 1.7679118 | 1.4475798 | 0.5336131 | 0.2739842 | ∞ | 93.961 |
| T-02 | 2.0479777 | 1.8073282 | 0.2785357 | 0.0221307 | 17.649 | 6.991 | 1.8099135 | 1.5015492 | 0.4539223 | 0.2053530 | ∞ | 112.996 |
| T-03 | 1.9871581 | 1.7770885 | 0.1994500 | 0.0000000 | 23.196 | 8.093 | 1.9026852 | 1.5790720 | 0.4364031 | 0.1719341 | ∞ | 128.896 |
| T-04 | 1.7838038 | 1.6848670 | 0.1747043 | 0.0576925 | 99.860 | 78.285 | 1.7278949 | 1.4701458 | 0.4229907 | 0.2064355 | ∞ | 124.965 |
| T-05 | 1.7916234 | 1.6777831 | 0.1686057 | 0.0337253 | 107.128 | 76.217 | 1.8014530 | 1.5185135 | 0.3835360 | 0.1583273 | ∞ | 132.016 |
| T-06 | 1.8002296 | 1.6820887 | 0.1597473 | 0.0181067 | 123.024 | 75.596 | 1.8474642 | 1.5506746 | 0.3678457 | 0.1294473 | ∞ | 174.507 |
| T-07 | 1.7621698 | 1.6733356 | 0.1509720 | 0.0434793 | 172.927 | 141.368 | 1.7440225 | 1.4980874 | 0.3766420 | 0.1862685 | ∞ | 126.179 |
| T-08 | 1.7741914 | 1.6608259 | 0.1503034 | 0.0266278 | ∞ | 136.057 | 1.8173046 | 1.5378185 | 0.3434213 | 0.1424618 | ∞ | 132.104 |
| T-09 | 1.7840790 | 1.6684943 | 0.1443180 | 0.0203129 | ∞ | 135.294 | 1.8564051 | 1.5512855 | 0.3332231 | 0.1153507 | ∞ | 179.935 |
| T-10 | 1.7471069 | 1.6944812 | 0.1281138 | 0.0746421 | 236.653 | 214.192 | 1.6315414 | 1.4407236 | 0.4303508 | 0.2868047 | 102.870 | 76.063 |
| T-11 | 1.7601548 | 1.6635093 | 0.1434224 | 0.0367891 | ∞ | 200.162 | 1.7816191 | 1.5191484 | 0.3717643 | 0.1702335 | ∞ | 127.588 |
| T-12 | 1.7736039 | 1.6490824 | 0.1417115 | 0.0230579 | ∞ | 136.257 | 1.8481265 | 1.5264627 | 0.3342218 | 0.1320843 | ∞ | 129.282 |
| T-13 | 1.7854335 | 1.6355775 | 0.1377026 | 0.0255652 | ∞ | 139.113 | 1.8781876 | 1.5081985 | 0.3188588 | 0.1038490 | ∞ | 184.086 |

TABLE 12-A

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-01 | 2.1808414 | 2.0202237 | 0.1177452 | 0.0000000 | 28.747 | 22.402 | 3.9125119 | 3.4135251 | 2.3592894 | 1.8675829 | 5.648 | 4.347 |
| A-02 | 1.9782905 | 1.8360883 | 0.2479634 | 0.1031416 | 40.736 | 30.986 | 3.8207998 | 3.5190505 | 0.8046063 | 0.4869196 | 31.482 | 28.563 |
| A-03 | 1.9572245 | 1.8232560 | 0.2092205 | 0.0692901 | 36.696 | 25.347 | 2.3997372 | 2.0823043 | 0.7809511 | 0.4572622 | 67.290 | 50.894 |
| A-04 | 1.9538426 | 1.8147593 | 0.1791482 | 0.0264932 | 28.651 | 16.106 | 1.9706358 | 1.6911106 | 0.5480317 | 0.2766157 | ∞ | 79.863 |
| A-05 | 1.9954675 | 1.8188549 | 0.1923512 | 0.0000000 | 20.889 | 9.610 | 1.8575722 | 1.5763149 | 0.4054773 | 0.1952503 | ∞ | 131.627 |
| A-06 | 1.9921329 | 1.8241056 | 0.1714705 | 0.0000000 | 22.078 | 10.531 | 1.8964406 | 1.6171157 | 0.4240922 | 0.2021757 | ∞ | 127.905 |
| A-07 | 1.9926516 | 1.7867996 | 0.2081128 | 0.0000000 | 19.729 | 7.090 | 1.8245385 | 1.5581041 | 0.3444239 | 0.1530946 | ∞ | 145.985 |
| A-08 | 1.8314145 | 1.7531979 | 0.1372041 | 0.0501875 | 108.784 | 92.474 | 2.1280936 | 1.9006327 | 0.5317342 | 0.3267196 | 72.362 | 59.687 |
| A-09 | 1.8085827 | 1.7459179 | 0.1222105 | 0.0510825 | 109.339 | 92.055 | 1.9395749 | 1.7141758 | 0.3894007 | 0.2106581 | 148.972 | 127.551 |
| A-10 | 1.7697499 | 1.7013515 | 0.1227356 | 0.0337061 | 114.760 | 88.411 | 1.7401521 | 1.5761971 | 0.2871018 | 0.1525706 | ∞ | 185.066 |
| A-11 | 1.7705034 | 1.6801567 | 0.1310643 | 0.0187597 | ∞ | 80.747 | 1.7513585 | 1.5678832 | 0.2526064 | 0.1235964 | ∞ | 193.932 |
| A-12 | 1.7957585 | 1.7015227 | 0.1137432 | 0.0403167 | 227.660 | 177.186 | 6.9395294 | 5.8873138 | 3.6361637 | 2.5922831 | 1.111 | 0.858 |
| A-13 | 1.7825164 | 1.7302739 | 0.1011628 | 0.0733832 | 196.277 | 166.231 | 2.0206052 | 1.9010581 | 0.3810646 | 0.2779408 | 75.306 | 68.640 |
| A-14 | 1.7512995 | 1.6751032 | 0.1082121 | 0.0292668 | ∞ | 148.729 | 1.7116334 | 1.5769923 | 0.2368558 | 0.1408109 | ∞ | 186.687 |
| A-15 | 1.7595350 | 1.6557484 | 0.1180659 | 0.0161714 | ∞ | 77.873 | 1.7725776 | 1.5799665 | 0.2199083 | 0.1145043 | ∞ | 231.353 |
| A-16 | 1.7084088 | 1.6284980 | 0.1055479 | 0.0536387 | 226.749 | 192.832 | 1.9111620 | 1.7640246 | 0.3954086 | 0.2439645 | 100.912 | 81.198 |
| A-17 | 1.7190182 | 1.6287740 | 0.1175933 | 0.0401091 | ∞ | 181.265 | 1.8380935 | 1.6452688 | 0.3389435 | 0.1578009 | ∞ | 143.472 |
| A-18 | 1.7379437 | 1.6272247 | 0.1244722 | 0.0282357 | ∞ | 168.046 | 1.8617526 | 1.5253000 | 0.3218896 | 0.1194775 | ∞ | 150.146 |
| A-19 | 1.7690277 | 1.6380658 | 0.1148478 | 0.0160624 | ∞ | 130.628 | 1.9160211 | 1.5888507 | 0.2656154 | 0.1035866 | ∞ | 186.563 |
| A-20 | 1.7635089 | 1.6370587 | 0.1248802 | 0.0253209 | ∞ | 248.930 | 6.4916237 | 5.0709047 | 3.1703715 | 1.9933341 | 1.674 | 1.017 |
| A-21 | 1.7389565 | 1.6442422 | 0.1261815 | 0.0278478 | ∞ | 246.493 | 1.9590470 | 1.6893522 | 0.5067608 | 0.2299566 | 106.692 | 71.669 |
| A-22 | 1.7475340 | 1.6520457 | 0.1252099 | 0.0255127 | ∞ | 242.366 | 1.9058713 | 1.4340244 | 0.4374233 | 0.1474709 | ∞ | 122.720 |
| A-23 | 1.7615318 | 1.6527086 | 0.1217239 | 0.0195364 | ∞ | 168.752 | 2.1047320 | 1.4652313 | 0.4154847 | 0.1111768 | ∞ | 136.328 |
| A-24 | 1.7766067 | 1.6412832 | 0.1190326 | 0.0138373 | ∞ | 88.740 | 2.0349691 | 1.4805855 | 0.3904136 | 0.0903453 | ∞ | 146.000 |

TABLE 12-B

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-01 | 1.9347331 | 1.7996062 | 0.2750426 | 0.1363683 | 43.318 | 33.493 | 5.2511921 | 4.9279487 | 0.8929957 | 0.5468983 | 20.307 | 18.973 |
| B-02 | 1.9419663 | 1.8082237 | 0.2578651 | 0.1188306 | 41.573 | 31.444 | 3.2513477 | 2.9037476 | 0.9232051 | 0.5460798 | 37.199 | 32.161 |
| B-03 | 1.9591401 | 1.8243427 | 0.1845688 | 0.0348459 | 28.863 | 17.166 | 2.0003048 | 1.7161678 | 0.5962361 | 0.3082796 | ∞ | 103.261 |
| B-04 | 1.9941085 | 1.8294710 | 0.1794493 | 0.0000000 | 21.841 | 10.855 | 1.8890534 | 1.6094807 | 0.4376496 | 0.2159333 | ∞ | 124.328 |
| B-05 | 1.9921874 | 1.7902306 | 0.2161495 | 0.0000000 | 19.560 | 7.407 | 1.8147281 | 1.5495047 | 0.3515218 | 0.1609798 | ∞ | 142.900 |
| B-06 | 1.8367116 | 1.7511159 | 0.1415038 | 0.0585485 | 117.130 | 100.124 | 3.4794803 | 2.8591788 | 2.9219716 | 2.2279274 | 3.496 | 2.624 |
| B-07 | 1.8663175 | 1.7904166 | 0.1454666 | 0.0629788 | 107.043 | 95.314 | 3.6094535 | 3.3869669 | 0.6363755 | 0.4433616 | 30.601 | 28.448 |
| B-08 | 1.8110797 | 1.7530743 | 0.1221582 | 0.0579590 | 106.940 | 92.576 | 1.9534348 | 1.7349314 | 0.4032119 | 0.2333694 | 137.006 | 119.951 |

TABLE 12-B-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-09 | 1.7692729 | 1.7053300 | 0.1224199 | 0.0387908 | 112.135 | 89.219 | 1.7286207 | 1.5759400 | 0.2926499 | 0.1635215 | ∞ | 179.030 |
| B-10 | 1.7701533 | 1.6837482 | 0.1309662 | 0.0215143 | 124.678 | 82.066 | 1.7483486 | 1.5688503 | 0.2577566 | 0.1308303 | ∞ | 187.792 |
| B-11 | 1.7492102 | 1.6798841 | 0.1056795 | 0.0349862 | ∞ | 150.963 | 1.7024517 | 1.5769451 | 0.2396374 | 0.1507445 | ∞ | 180.475 |
| B-12 | 1.7583506 | 1.6574412 | 0.1168094 | 0.0182767 | ∞ | 130.082 | 1.7698774 | 1.5820478 | 0.2232388 | 0.1211306 | ∞ | 225.787 |
| B-13 | 1.7880698 | 1.7139340 | 0.1141298 | 0.0555018 | 209.668 | 174.793 | 5.4095236 | 4.4182919 | 4.5084058 | 3.5265150 | 1.134 | 0.868 |
| B-14 | 1.7899020 | 1.7260251 | 0.1113799 | 0.0687920 | 200.978 | 173.694 | 9.6456356 | 9.4830819 | 0.4801134 | 0.3732738 | 10.334 | 10.156 |
| B-15 | 1.6979410 | 1.6299820 | 0.0967336 | 0.0676101 | 222.002 | 195.947 | 1.9337656 | 1.7944394 | 0.4093689 | 0.2921692 | 89.401 | 74.126 |
| B-16 | 1.7134936 | 1.6304943 | 0.1158895 | 0.0466000 | 229.322 | 184.704 | 1.8372765 | 1.6612144 | 0.3459416 | 0.1743804 | ∞ | 137.319 |
| B-17 | 1.7339774 | 1.6269608 | 0.1244076 | 0.0316488 | ∞ | 169.585 | 1.8519942 | 1.5217329 | 0.3271389 | 0.1269643 | ∞ | 143.855 |
| B-18 | 1.7679045 | 1.6421025 | 0.1142134 | 0.0182430 | ∞ | 136.942 | 1.9207852 | 1.5961025 | 0.2702996 | 0.1092229 | ∞ | 180.258 |
| B-19 | 1.7349739 | 1.6440145 | 0.1270969 | 0.0322690 | ∞ | 248.639 | 1.9861047 | 1.7084167 | 0.5505443 | 0.2637120 | 92.313 | 64.771 |
| B-20 | 1.7457875 | 1.6523659 | 0.1258538 | 0.0278741 | ∞ | 244.451 | 1.9093494 | 1.4410730 | 0.4538915 | 0.1599267 | ∞ | 120.523 |
| B-21 | 1.7603639 | 1.6533522 | 0.1221163 | 0.0218136 | ∞ | 170.127 | 2.1254057 | 1.4577543 | 0.4256915 | 0.1179254 | ∞ | 130.094 |
| B-22 | 1.7754260 | 1.6426635 | 0.1193196 | 0.0159285 | ∞ | 90.544 | 2.0464268 | 1.4759519 | 0.3977860 | 0.0948929 | ∞ | 140.032 |

TABLE 12-C

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| C-01 | 1.8930999 | 1.7732818 | 0.3015456 | 0.1719582 | 44.120 | 35.207 | 4.9698244 | 4.5796632 | 1.0302271 | 0.6019471 | 20.856 | 19.154 |
| C-02 | 1.9701299 | 1.8401421 | 0.1894818 | 0.0431159 | 28.796 | 18.240 | 2.0513300 | 1.7601911 | 0.6580454 | 0.3477707 | ∞ | 96.767 |
| C-03 | 1.9965543 | 1.8387699 | 0.1802441 | 0.0017981 | 21.880 | 11.525 | 1.8973838 | 1.6191258 | 0.4603685 | 0.2347033 | ∞ | 119.691 |
| C-04 | 1.9942257 | 1.7970138 | 0.2187743 | 0.0000000 | 19.381 | 7.773 | 1.8104389 | 1.5459101 | 0.3620504 | 0.1713571 | ∞ | 139.782 |
| C-05 | 1.8678636 | 1.8052953 | 0.1568168 | 0.0833622 | 104.700 | 94.970 | 4.8729893 | 4.6290184 | 0.6966732 | 0.5019222 | 20.806 | 19.723 |
| C-06 | 1.8118435 | 1.7610964 | 0.1197983 | 0.0687717 | 104.921 | 93.165 | 1.9621194 | 1.7520901 | 0.4050714 | 0.2596380 | 127.606 | 114.505 |
| C-07 | 1.7678278 | 1.7092853 | 0.1216732 | 0.0442892 | 109.785 | 89.909 | 1.7142712 | 1.5759594 | 0.2975075 | 0.1768080 | ∞ | 173.302 |
| C-08 | 1.7695373 | 1.6874450 | 0.1309482 | 0.0248496 | 116.803 | 83.168 | 1.7460448 | 1.5717479 | 0.2635914 | 0.1392432 | ∞ | 220.126 |
| C-09 | 1.7463738 | 1.6881292 | 0.1026663 | 0.0407437 | ∞ | 155.686 | 1.6925486 | 1.5797764 | 0.2435170 | 0.1629555 | 205.253 | 174.633 |
| C-10 | 1.7571263 | 1.6600694 | 0.1155040 | 0.0208471 | ∞ | 136.617 | 1.7662295 | 1.5866433 | 0.2273041 | 0.1286859 | ∞ | 220.829 |
| C-11 | 1.7081474 | 1.6332231 | 0.1115853 | 0.0550326 | 220.895 | 187.564 | 1.8379989 | 1.6786605 | 0.3530382 | 0.2012022 | ∞ | 132.380 |
| C-12 | 1.7301370 | 1.6291250 | 0.1232971 | 0.0358093 | ∞ | 171.179 | 1.8496058 | 1.5180543 | 0.3330794 | 0.1358944 | ∞ | 139.728 |
| C-13 | 1.7666980 | 1.6468799 | 0.1134447 | 0.0208227 | ∞ | 140.860 | 1.9306487 | 1.6040642 | 0.2759754 | 0.1154969 | ∞ | 211.039 |
| C-14 | 1.7433466 | 1.6533259 | 0.1266477 | 0.0323570 | ∞ | 246.551 | 1.9142676 | 1.5792065 | 0.4740512 | 0.1745078 | ∞ | 116.083 |
| C-15 | 1.7579646 | 1.6544478 | 0.1224951 | 0.0245935 | ∞ | 171.578 | 2.1504945 | 1.4490724 | 0.4374587 | 0.1256044 | ∞ | 125.994 |
| C-16 | 1.7745198 | 1.6439814 | 0.1195634 | 0.0184221 | ∞ | 144.260 | 2.0614452 | 1.4721825 | 0.4059610 | 0.0996109 | ∞ | 163.579 |

TABLE 12-D

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-01 | 1.9387499 | 1.8274901 | 0.2827500 | 0.1510105 | 36.265 | 28.410 | 2.6651047 | 2.2604026 | 1.1780592 | 0.7481019 | 45.830 | 35.031 |
| D-02 | 1.9911368 | 1.8649942 | 0.1947154 | 0.0518638 | 27.328 | 18.211 | 2.0801817 | 1.7824437 | 0.7046761 | 0.3894856 | ∞ | 89.391 |
| D-03 | 2.0053118 | 1.8488164 | 0.1911195 | 0.0118971 | 20.841 | 11.375 | 1.8790896 | 1.6015383 | 0.4674731 | 0.2482629 | ∞ | 116.048 |
| D-04 | 1.9984316 | 1.8029042 | 0.2242962 | 0.0055279 | 18.958 | 7.919 | 1.8022754 | 1.5415478 | 0.3692367 | 0.1800069 | ∞ | 161.074 |
| D-05 | 1.8367033 | 1.7915287 | 0.1448993 | 0.0959638 | 100.413 | 92.330 | 2.2232544 | 2.0121606 | 0.6927698 | 0.5482850 | 50.856 | 43.913 |
| D-06 | 1.7645533 | 1.7107752 | 0.1215570 | 0.0488641 | 107.088 | 90.071 | 1.6944128 | 1.5681762 | 0.2967935 | 0.1883071 | ∞ | 167.306 |
| D-07 | 1.7686885 | 1.6897749 | 0.1317105 | 0.0281302 | 113.091 | 83.726 | 1.7443327 | 1.5721245 | 0.2674691 | 0.1462606 | ∞ | 212.321 |
| D-08 | 1.7431482 | 1.6903479 | 0.1012162 | 0.0434916 | 186.875 | 156.460 | 1.6837059 | 1.5778783 | 0.2476342 | 0.1736730 | 192.146 | 167.792 |
| D-09 | 1.7561171 | 1.6632973 | 0.1147154 | 0.0233959 | ∞ | 139.092 | 1.7649256 | 1.5954151 | 0.2309121 | 0.1349502 | ∞ | 216.222 |
| D-10 | 1.6992769 | 1.6367293 | 0.1062424 | 0.0636582 | 217.758 | 189.407 | 1.8298004 | 1.6887347 | 0.3588003 | 0.2369851 | ∞ | 129.000 |
| D-11 | 1.7657052 | 1.6515499 | 0.1124392 | 0.0233779 | ∞ | 143.323 | 1.9434736 | 1.6133820 | 0.2816908 | 0.1205092 | ∞ | 202.760 |
| D-12 | 1.7357815 | 1.6550527 | 0.1273897 | 0.0367512 | ∞ | 248.170 | 1.9123721 | 1.6031448 | 0.4942049 | 0.1858577 | ∞ | 111.627 |
| D-13 | 1.7526840 | 1.6557943 | 0.1226776 | 0.0275128 | ∞ | 176.326 | 2.1673377 | 1.4382227 | 0.4469812 | 0.1314001 | ∞ | 121.730 |
| D-14 | 1.7739079 | 1.6446855 | 0.1196764 | 0.0205456 | ∞ | 151.443 | 2.0464263 | 1.4694964 | 0.4122386 | 0.1024998 | ∞ | 169.246 |

TABLE 12-E

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-01 | 1.9441637 | 1.8429272 | 0.2974501 | 0.1749428 | 29.318 | 22.537 | 2.0026070 | 1.6598153 | 1.0485594 | 0.7394921 | ∞ | 42.606 |
| E-02 | 2.0101090 | 1.8833402 | 0.2080006 | 0.0628834 | 24.123 | 16.088 | 1.9875326 | 1.6877633 | 0.6626760 | 0.4002456 | ∞ | 87.502 |
| E-03 | 2.0050503 | 1.8489065 | 0.2105359 | 0.0306079 | 19.910 | 11.032 | 1.8390125 | 1.5618030 | 0.4581653 | 0.2510816 | ∞ | 111.349 |
| E-04 | 1.9912795 | 1.7985134 | 0.2317913 | 0.0160076 | 19.088 | 8.078 | 1.7867732 | 1.5334187 | 0.3697187 | 0.1830317 | ∞ | 151.843 |
| E-05 | 1.7606078 | 1.7088194 | 0.1229858 | 0.0501904 | 105.154 | 89.603 | 1.6745313 | 1.5530078 | 0.2929759 | 0.1936033 | ∞ | 159.881 |
| E-06 | 1.7685195 | 1.6901601 | 0.1333463 | 0.0304605 | 111.335 | 83.682 | 1.7455691 | 1.5702676 | 0.2697093 | 0.1496056 | ∞ | 201.778 |
| E-07 | 1.7407373 | 1.6857263 | 0.1036069 | 0.0414218 | 183.044 | 154.502 | 1.6816095 | 1.5711383 | 0.2532263 | 0.1789661 | 183.178 | 159.350 |
| E-08 | 1.7555063 | 1.6665793 | 0.1149283 | 0.0252627 | ∞ | 140.733 | 1.7670485 | 1.6132301 | 0.2339211 | 0.1377651 | ∞ | 210.561 |
| E-09 | 1.6931474 | 1.6419181 | 0.1017729 | 0.0688444 | 212.031 | 189.996 | 1.8068114 | 1.6851085 | 0.3676980 | 0.2687320 | 159.899 | 125.176 |
| E-10 | 1.7516203 | 1.6732426 | 0.1131103 | 0.0468176 | ∞ | 211.707 | 1.7182256 | 1.5836064 | 0.2959419 | 0.1614839 | ∞ | 149.849 |
| E-11 | 1.7654370 | 1.6553771 | 0.1111497 | 0.0252537 | ∞ | 145.016 | 1.8121549 | 1.6252275 | 0.2864905 | 0.1237879 | ∞ | 197.255 |

TABLE 12-E-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-12 | 1.7310442 | 1.6573405 | 0.1279842 | 0.0397384 | ∞ | 249.228 | 1.8974334 | 1.6040960 | 0.5107330 | 0.2004839 | ∞ | 106.788 |
| E-13 | 1.7491464 | 1.6573153 | 0.1225933 | 0.0291107 | ∞ | 227.942 | 2.0938195 | 1.4260205 | 0.4518073 | 0.1347504 | ∞ | 116.457 |
| E-14 | 1.7737611 | 1.6445485 | 0.1195745 | 0.0217412 | ∞ | 153.499 | 2.0341814 | 1.4657293 | 0.4150721 | 0.1035889 | ∞ | 164.698 |

TABLE 12-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-01 | 1.9309499 | 1.8256862 | 0.3220077 | 0.2034871 | 27.771 | 21.191 | 1.8235422 | 1.5442282 | 0.9417758 | 0.6984530 | 69.490 | 42.671 |
| F-02 | 2.0309565 | 1.9002326 | 0.2214292 | 0.0713829 | 21.890 | 14.677 | 1.9351400 | 1.6211642 | 0.6306132 | 0.3978801 | ∞ | 90.258 |
| F-03 | 1.9982247 | 1.8423031 | 0.2292788 | 0.0501528 | 19.464 | 10.841 | 1.7983820 | 1.5239496 | 0.4454823 | 0.2471535 | ∞ | 108.827 |
| F-04 | 1.9872145 | 1.7950417 | 0.2345780 | 0.0208244 | 19.296 | 8.166 | 1.7776850 | 1.5307746 | 0.3707366 | 0.1836223 | ∞ | 141.236 |
| F-05 | 2.0022033 | 1.7926135 | 0.1918167 | 0.0000000 | 19.700 | 6.937 | 1.8360524 | 1.5745095 | 0.3473032 | 0.1539414 | ∞ | 151.670 |
| F-06 | 1.7586867 | 1.7057167 | 0.1249748 | 0.0510368 | 104.484 | 88.915 | 1.6647586 | 1.5426834 | 0.2931011 | 0.1942278 | ∞ | 150.532 |
| F-07 | 1.7696897 | 1.6897824 | 0.1350373 | 0.0311201 | 111.074 | 83.470 | 1.7511979 | 1.5703862 | 0.2729217 | 0.1501470 | ∞ | 194.177 |
| F-08 | 1.7828581 | 1.6990044 | 0.1261705 | 0.0201879 | 134.309 | 84.108 | 1.8128845 | 1.5998767 | 0.2643117 | 0.1231435 | ∞ | 196.169 |
| F-09 | 1.7405643 | 1.6873270 | 0.1077789 | 0.0431707 | 180.529 | 154.997 | 1.6790179 | 1.5664434 | 0.2609613 | 0.1796234 | 174.384 | 149.123 |
| F-10 | 1.7568981 | 1.6686925 | 0.1156114 | 0.0257725 | ∞ | 141.380 | 1.7726988 | 1.6259935 | 0.2372277 | 0.1379125 | ∞ | 202.825 |
| F-11 | 1.6922087 | 1.6452593 | 0.1009766 | 0.0679431 | 210.803 | 190.171 | 1.7840482 | 1.6730289 | 0.3817165 | 0.2781301 | 147.094 | 119.532 |
| F-12 | 1.7506346 | 1.6758665 | 0.1142225 | 0.0477125 | ∞ | 212.960 | 1.7099525 | 1.5862989 | 0.3041244 | 0.1683896 | 182.910 | 140.704 |
| F-13 | 1.7665789 | 1.6568609 | 0.1097239 | 0.0258750 | ∞ | 145.637 | 1.8049443 | 1.6372819 | 0.2902557 | 0.1270794 | ∞ | 190.688 |
| F-14 | 1.7793673 | 1.6305355 | 0.1135032 | 0.0199937 | ∞ | 156.959 | 1.9211943 | 1.5416899 | 0.2854559 | 0.1015741 | ∞ | 195.958 |
| F-15 | 1.7471315 | 1.6586561 | 0.1223108 | 0.0299292 | ∞ | 230.996 | 2.0783137 | 1.4178145 | 0.4537234 | 0.1372952 | ∞ | 108.954 |
| F-16 | 1.7549368 | 1.6377188 | 0.1212434 | 0.0153205 | ∞ | 161.765 | 1.9672754 | 1.4663281 | 0.3638952 | 0.0922351 | ∞ | 177.545 |

TABLE 12-G

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| G-01 | 1.9074552 | 1.7961906 | 0.3422843 | 0.2520548 | 29.495 | 22.610 | 1.7786603 | 1.5342987 | 1.0346998 | 0.7374305 | 54.222 | 35.976 |
| G-02 | 2.0298789 | 1.9017747 | 0.2316143 | 0.0878033 | 22.071 | 15.195 | 1.9301729 | 1.6008943 | 0.6500908 | 0.4083086 | ∞ | 84.531 |
| G-03 | 1.9904209 | 1.8380210 | 0.2334696 | 0.0588651 | 19.842 | 11.226 | 1.7827243 | 1.5134922 | 0.4506346 | 0.2507456 | ∞ | 102.949 |
| G-04 | 2.0009844 | 1.7934185 | 0.1930633 | 0.0000000 | 19.876 | 7.119 | 1.8350621 | 1.5724645 | 0.3507015 | 0.1561092 | ∞ | 144.234 |
| G-05 | 1.7597286 | 1.7058638 | 0.1254356 | 0.0512351 | 104.617 | 88.871 | 1.6655039 | 1.5427988 | 0.2996432 | 0.1974863 | ∞ | 141.145 |
| G-06 | 1.7714890 | 1.6912364 | 0.1352196 | 0.0309203 | 111.267 | 83.725 | 1.7567216 | 1.5741301 | 0.2784825 | 0.1526719 | ∞ | 185.351 |
| G-07 | 1.7843314 | 1.7014579 | 0.1257631 | 0.0216420 | 133.146 | 84.680 | 1.8170787 | 1.6035057 | 0.2686002 | 0.1254215 | ∞ | 187.805 |
| G-08 | 1.7419644 | 1.6879556 | 0.1088176 | 0.0432548 | 181.354 | 155.167 | 1.6807525 | 1.5671808 | 0.2683500 | 0.1826212 | 163.724 | 139.209 |
| G-09 | 1.7585761 | 1.6686432 | 0.1152971 | 0.0263298 | ∞ | 141.147 | 1.7770454 | 1.6310822 | 0.2407989 | 0.1400994 | 244.852 | 193.529 |
| G-10 | 1.7703131 | 1.6943439 | 0.1031730 | 0.0389335 | ∞ | 154.687 | 1.8232087 | 1.5876936 | 0.2134065 | 0.1128255 | ∞ | 249.911 |
| G-11 | 1.6887573 | 1.6451770 | 0.0975290 | 0.0724180 | 209.185 | 191.053 | 1.7773022 | 1.6675756 | 0.3800804 | 0.2958507 | 138.752 | 111.368 |
| G-12 | 1.7520358 | 1.6759592 | 0.1144883 | 0.0474461 | ∞ | 212.716 | 1.7115860 | 1.5894046 | 0.3088005 | 0.1698918 | 169.537 | 131.748 |
| G-13 | 1.7679846 | 1.6559448 | 0.1088859 | 0.0258647 | ∞ | 145.342 | 1.8076172 | 1.6422363 | 0.2930750 | 0.1273462 | ∞ | 181.729 |
| G-14 | 1.7805664 | 1.6279932 | 0.1137601 | 0.0204922 | ∞ | 159.035 | 1.9186750 | 1.5389729 | 0.2883794 | 0.1013762 | ∞ | 187.281 |
| G-15 | 1.7470441 | 1.6587128 | 0.1220067 | 0.0318895 | ∞ | 231.817 | 2.0959926 | 1.4176711 | 0.4582089 | 0.1395004 | ∞ | 98.800 |
| G-16 | 1.7545533 | 1.6381727 | 0.1214452 | 0.0153368 | ∞ | 162.772 | 1.9685664 | 1.4649641 | 0.3661101 | 0.0928691 | ∞ | 176.415 |

TABLE 12-H

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-01 | 1.9954203 | 1.8787272 | 0.2389065 | 0.1110098 | 25.704 | 18.260 | 1.9728332 | 1.6385461 | 0.7550855 | 0.4544666 | ∞ | 69.433 |
| H-02 | 1.9889747 | 1.8436634 | 0.2240097 | 0.0563217 | 20.861 | 12.234 | 1.8049323 | 1.5360932 | 0.4833361 | 0.2709057 | ∞ | 89.557 |
| H-03 | 1.9838198 | 1.8007681 | 0.2298239 | 0.0248556 | 19.928 | 8.947 | 1.7818109 | 1.5291559 | 0.3890198 | 0.1961341 | ∞ | 132.574 |
| H-04 | 1.9984290 | 1.7954163 | 0.1972446 | 0.0000000 | 19.960 | 7.439 | 1.8304558 | 1.5669780 | 0.3567863 | 0.1621232 | ∞ | 140.921 |
| H-05 | 1.7625812 | 1.7121771 | 0.1234484 | 0.0532482 | 104.547 | 90.003 | 1.6681649 | 1.5502535 | 0.3099723 | 0.2093803 | ∞ | 133.379 |
| H-06 | 1.7717941 | 1.6954404 | 0.1337145 | 0.0320092 | 110.562 | 84.753 | 1.7534790 | 1.5766272 | 0.2839659 | 0.1602488 | ∞ | 177.732 |
| H-07 | 1.7833304 | 1.7023965 | 0.1254477 | 0.0229868 | 132.965 | 85.102 | 1.8136903 | 1.6049709 | 0.2720818 | 0.1311882 | ∞ | 182.349 |
| H-08 | 1.7426659 | 1.6905956 | 0.1032570 | 0.0447133 | 181.549 | 155.657 | 1.6810093 | 1.5708933 | 0.2709547 | 0.1930666 | 151.452 | 131.886 |
| H-09 | 1.7578654 | 1.6675761 | 0.1130004 | 0.0295128 | ∞ | 146.541 | 1.7739569 | 1.6268427 | 0.2432275 | 0.1472412 | 233.444 | 184.408 |
| H-10 | 1.7689847 | 1.6945828 | 0.1028286 | 0.0392727 | ∞ | 154.818 | 1.8251553 | 1.5951052 | 0.2154490 | 0.1183372 | ∞ | 240.104 |
| H-11 | 1.7537859 | 1.6772613 | 0.1128123 | 0.0498203 | ∞ | 212.202 | 1.7095872 | 1.5898778 | 0.3075202 | 0.1714142 | 159.026 | 124.023 |
| H-12 | 1.7107053 | 1.6332028 | 0.1193085 | 0.0550861 | 225.437 | 180.711 | 1.8324906 | 1.6342203 | 0.3444059 | 0.1767509 | ∞ | 147.166 |
| H-13 | 1.7677474 | 1.6550924 | 0.1090469 | 0.0269449 | ∞ | 145.773 | 1.8136422 | 1.6357149 | 0.2956611 | 0.1301069 | ∞ | 171.600 |
| H-14 | 1.7788371 | 1.6293950 | 0.1135283 | 0.0209819 | ∞ | 159.189 | 1.9194994 | 1.5398521 | 0.2882715 | 0.1038879 | ∞ | 177.565 |
| H-15 | 1.7255306 | 1.6596065 | 0.1294789 | 0.0477235 | 299.198 | 252.902 | 1.9082083 | 1.6031338 | 0.5360868 | 0.2232267 | ∞ | 78.707 |
| H-16 | 1.7474986 | 1.6575047 | 0.1223978 | 0.0353812 | ∞ | 232.352 | 1.9688166 | 1.4227350 | 0.4694319 | 0.1444258 | ∞ | 87.559 |
| H-17 | 1.7546479 | 1.6375300 | 0.1213946 | 0.0161077 | ∞ | 162.500 | 1.9667069 | 1.4637968 | 0.3697669 | 0.0968665 | ∞ | 172.248 |

TABLE 12-I

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| I-01 | 1.9692763 | 1.8596266 | 0.2508663 | 0.1332991 | 28.459 | 20.886 | 1.9945549 | 1.6714592 | 0.8746255 | 0.5201810 | ∞ | 58.984 |
| I-02 | 1.9948263 | 1.8576400 | 0.2133537 | 0.0548759 | 21.878 | 13.513 | 1.8484874 | 1.5782359 | 0.5362016 | 0.3067351 | ∞ | 109.380 |
| I-03 | 1.9946679 | 1.8170813 | 0.2276031 | 0.0263690 | 19.535 | 9.387 | 1.7913122 | 1.5290136 | 0.4084559 | 0.2129713 | ∞ | 128.054 |
| I-04 | 2.0026503 | 1.8031069 | 0.2017044 | 0.0000000 | 19.564 | 7.726 | 1.8270961 | 1.5626259 | 0.3662021 | 0.1718345 | ∞ | 139.811 |
| I-05 | 1.7658783 | 1.7227350 | 0.1181285 | 0.0666990 | 103.691 | 91.535 | 1.6673294 | 1.5628945 | 0.3206361 | 0.2315138 | 154.993 | 126.106 |
| I-06 | 1.7705080 | 1.7015382 | 0.1312636 | 0.0353615 | 108.903 | 86.260 | 1.7439231 | 1.5785362 | 0.2895958 | 0.1723692 | ∞ | 172.850 |
| I-07 | 1.7809352 | 1.7034120 | 0.1251832 | 0.0253065 | 120.751 | 85.550 | 1.8032815 | 1.6051419 | 0.2739825 | 0.1391363 | ∞ | 213.651 |
| I-08 | 1.7546144 | 1.6808827 | 0.1087703 | 0.0356038 | ∞ | 151.796 | 1.7653934 | 1.6230533 | 0.2446842 | 0.1582816 | 220.487 | 176.365 |
| I-09 | 1.7659758 | 1.6939299 | 0.1022816 | 0.0399049 | ∞ | 154.614 | 1.8195213 | 1.6017894 | 0.2170334 | 0.1259311 | ∞ | 231.541 |
| I-10 | 1.7062981 | 1.6329753 | 0.1143390 | 0.0650970 | 217.064 | 185.478 | 1.8401354 | 1.6587585 | 0.3337728 | 0.1982443 | ∞ | 138.813 |
| I-11 | 1.7664075 | 1.6564075 | 0.1093932 | 0.0310388 | ∞ | 147.689 | 1.8226250 | 1.6245293 | 0.3002786 | 0.1388931 | ∞ | 164.311 |
| I-12 | 1.7756357 | 1.6331223 | 0.1131198 | 0.0217062 | ∞ | 158.981 | 1.9263867 | 1.5423828 | 0.2890063 | 0.1103601 | ∞ | 172.733 |
| I-13 | 1.7461154 | 1.6571884 | 0.1235032 | 0.0387156 | ∞ | 240.244 | 1.9411447 | 1.4218442 | 0.4838070 | 0.1574935 | ∞ | 78.316 |
| I-14 | 1.7725616 | 1.6455170 | 0.1205680 | 0.0270206 | ∞ | 155.716 | 2.0919097 | 1.4580559 | 0.4358933 | 0.1189182 | ∞ | 129.458 |
| I-15 | 1.7549616 | 1.6368073 | 0.1213638 | 0.0182803 | ∞ | 162.204 | 1.9691181 | 1.4663593 | 0.3758026 | 0.1021307 | ∞ | 167.272 |

TABLE 12-J

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| J-01 | 1.9731500 | 1.8713934 | 0.2654901 | 0.1590912 | 28.020 | 21.477 | 1.9770311 | 1.6750340 | 0.9521030 | 0.6078782 | ∞ | 54.233 |
| J-02 | 2.0065961 | 1.8749738 | 0.2149204 | 0.0648764 | 21.717 | 14.068 | 1.8627784 | 1.5956165 | 0.5755217 | 0.3436625 | ∞ | 102.235 |
| J-03 | 1.9985387 | 1.8286315 | 0.2279896 | 0.0330873 | 19.375 | 9.912 | 1.7930359 | 1.5330530 | 0.4264467 | 0.2311098 | ∞ | 123.013 |
| J-04 | 2.0076389 | 1.8108030 | 0.2086414 | 0.0000000 | 19.065 | 7.927 | 1.8201261 | 1.5562968 | 0.3740609 | 0.1818026 | ∞ | 159.427 |
| J-05 | 1.7680914 | 1.7070538 | 0.1292749 | 0.0424146 | 106.173 | 87.400 | 1.7307823 | 1.5771556 | 0.2927908 | 0.1860452 | ∞ | 166.850 |
| J-06 | 1.7786842 | 1.7054640 | 0.1248020 | 0.0287583 | 114.334 | 86.092 | 1.7945003 | 1.6027705 | 0.2747519 | 0.1474472 | ∞ | 207.069 |
| J-07 | 1.7503216 | 1.6927032 | 0.1035853 | 0.0436439 | ∞ | 154.913 | 1.7550789 | 1.6307222 | 0.2454636 | 0.1705746 | 205.444 | 170.365 |
| J-08 | 1.7628881 | 1.6969970 | 0.1000361 | 0.0434748 | ∞ | 155.309 | 1.8150625 | 1.6041567 | 0.2163902 | 0.1335313 | ∞ | 226.183 |
| J-09 | 1.7023888 | 1.6383727 | 0.1103469 | 0.0710305 | 213.976 | 188.002 | 1.8332938 | 1.6741837 | 0.3342286 | 0.2182044 | ∞ | 137.568 |
| J-10 | 1.7624328 | 1.6604162 | 0.1092583 | 0.0359734 | ∞ | 154.045 | 1.8103025 | 1.6180515 | 0.3074345 | 0.1483537 | ∞ | 157.434 |
| J-11 | 1.7727296 | 1.6421522 | 0.1127977 | 0.0234031 | ∞ | 159.947 | 1.9344715 | 1.5437769 | 0.2923744 | 0.1164235 | ∞ | 166.359 |
| J-12 | 1.7434701 | 1.6582797 | 0.1244701 | 0.0424218 | ∞ | 244.182 | 1.9312150 | 1.4189274 | 0.5004744 | 0.1715095 | ∞ | 112.002 |
| J-13 | 1.7702020 | 1.6413129 | 0.1208964 | 0.0213823 | ∞ | 118.831 | 2.0538922 | 1.4774554 | 0.4144870 | 0.1011447 | ∞ | 136.148 |

TABLE 12-K

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-01 | 2.0218619 | 1.8933890 | 0.2281588 | 0.0789693 | 20.232 | 13.558 | 1.8275836 | 1.5675665 | 0.5773003 | 0.3668426 | ∞ | 94.095 |
| K-02 | 2.0030875 | 1.8362100 | 0.2376098 | 0.0442529 | 18.757 | 9.972 | 1.7780147 | 1.5216621 | 0.4326685 | 0.2435681 | ∞ | 117.945 |
| K-03 | 2.0126645 | 1.8154441 | 0.2207471 | 0.0000000 | 18.396 | 7.885 | 1.8063822 | 1.5463090 | 0.3755212 | 0.1879101 | ∞ | 150.090 |
| K-04 | 1.7651000 | 1.7098608 | 0.1288453 | 0.0482545 | 103.746 | 87.793 | 1.7190324 | 1.5694731 | 0.2931750 | 0.1967102 | ∞ | 158.526 |
| K-05 | 1.7773651 | 1.7081219 | 0.1244173 | 0.0325899 | 110.766 | 86.568 | 1.7918913 | 1.5996025 | 0.2743664 | 0.1535070 | ∞ | 195.827 |
| K-06 | 1.7466075 | 1.6987914 | 0.0994331 | 0.0506673 | 181.377 | 156.295 | 1.7489751 | 1.6459099 | 0.2464233 | 0.1801611 | 192.498 | 165.736 |
| K-07 | 1.7608557 | 1.7034668 | 0.0954377 | 0.0506647 | ∞ | 156.797 | 1.8114198 | 1.6005177 | 0.2122738 | 0.1386373 | ∞ | 222.034 |
| K-08 | 1.7013165 | 1.6482062 | 0.1118924 | 0.0673893 | 212.079 | 190.563 | 1.8012950 | 1.6672679 | 0.3563252 | 0.2167549 | ∞ | 134.528 |
| K-09 | 1.7581609 | 1.6662114 | 0.1081045 | 0.0401626 | ∞ | 202.507 | 1.7674118 | 1.6210202 | 0.3149906 | 0.1578068 | ∞ | 149.985 |
| K-10 | 1.7710892 | 1.6477835 | 0.1125048 | 0.0264342 | ∞ | 162.019 | 1.9431216 | 1.5627285 | 0.2972370 | 0.1216852 | ∞ | 178.844 |
| K-11 | 1.7411044 | 1.6603232 | 0.1249554 | 0.0455071 | ∞ | 245.731 | 1.9169497 | 1.5628151 | 0.5133974 | 0.1871095 | ∞ | 110.475 |
| K-12 | 1.7661840 | 1.6409679 | 0.1208136 | 0.0139715 | ∞ | 93.306 | 1.9665859 | 1.4859340 | 0.3680603 | 0.0919865 | ∞ | 182.028 |

TABLE 12-L

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-01 | 2.0460807 | 1.9550919 | 0.3015443 | 0.2175648 | 20.485 | 16.796 | 1.7248425 | 1.5281103 | 0.8161721 | 0.6645046 | ∞ | 53.473 |
| L-02 | 2.0318624 | 1.9058614 | 0.2472378 | 0.0954800 | 18.757 | 12.872 | 1.7700254 | 1.5169590 | 0.5579569 | 0.3707376 | ∞ | 84.372 |
| L-03 | 2.0008101 | 1.8355257 | 0.2483238 | 0.0575474 | 18.482 | 9.997 | 1.7581930 | 1.5056417 | 0.4335189 | 0.2489083 | ∞ | 110.450 |
| L-04 | 2.0105317 | 1.8182819 | 0.2156634 | 0.0000000 | 18.663 | 8.218 | 1.8122432 | 1.5491304 | 0.3839051 | 0.1936096 | ∞ | 134.819 |
| L-05 | 1.7641121 | 1.7102925 | 0.1308720 | 0.0508488 | 102.429 | 87.618 | 1.7188369 | 1.5620900 | 0.2966073 | 0.2016427 | ∞ | 148.593 |
| L-06 | 1.7783394 | 1.7116952 | 0.1239742 | 0.0361934 | 109.032 | 87.083 | 1.7997420 | 1.5982430 | 0.2759885 | 0.1557675 | ∞ | 156.457 |
| L-07 | 1.7456815 | 1.7019254 | 0.0984309 | 0.0545808 | 176.526 | 156.817 | 1.7472612 | 1.6593706 | 0.2504515 | 0.1845018 | 182.891 | 159.027 |
| L-08 | 1.7608578 | 1.7113778 | 0.0854896 | 0.0641859 | ∞ | 158.813 | 1.8137233 | 1.7101357 | 0.2024677 | 0.1398163 | ∞ | 216.875 |
| L-09 | 1.7611906 | 1.6760307 | 0.1005431 | 0.0363549 | ∞ | 89.194 | 1.8280582 | 1.5602262 | 0.2035395 | 0.1136579 | ∞ | 222.191 |
| L-10 | 1.7563064 | 1.6718276 | 0.1052920 | 0.0433254 | ∞ | 208.681 | 1.7543803 | 1.6367057 | 0.3218591 | 0.1723034 | ∞ | 144.725 |
| L-11 | 1.7306655 | 1.6509731 | 0.1124854 | 0.0292652 | ∞ | 164.553 | 1.8340950 | 1.5870113 | 0.3028945 | 0.1279140 | ∞ | 187.149 |
| L-12 | 1.7824602 | 1.6205047 | 0.1189640 | 0.0164823 | ∞ | 81.070 | 1.9228810 | 1.5664223 | 0.2779451 | 0.0844258 | ∞ | 231.434 |
| L-13 | 1.7671173 | 1.6418353 | 0.1209148 | 0.0150969 | ∞ | 152.912 | 1.9737812 | 1.4829987 | 0.3752843 | 0.0940037 | ∞ | 183.297 |

TABLE 12-M

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| M-01 | 2.0110098 | 1.8219436 | 0.2105546 | 0.0000000 | 19.030 | 8.575 | 1.8226207 | 1.5549815 | 0.3944100 | 0.1976119 | ∞ | 130.545 |
| M-02 | 2.0346730 | 1.8208070 | 0.1881221 | 0.0000000 | 17.927 | 6.976 | 1.8521081 | 1.5816320 | 0.3558327 | 0.1592007 | ∞ | 144.889 |
| M-03 | 1.7672192 | 1.7109472 | 0.1344514 | 0.0523958 | 102.482 | 87.478 | 1.7365020 | 1.5655584 | 0.3097410 | 0.2047594 | 188.837 | 141.660 |
| M-04 | 1.7822635 | 1.7171365 | 0.1230080 | 0.0398903 | 108.764 | 87.918 | 1.8181624 | 1.6058894 | 0.2832612 | 0.1572517 | ∞ | 193.231 |
| M-05 | 1.7759032 | 1.7056346 | 0.1154059 | 0.0292780 | 130.745 | 87.463 | 1.8142014 | 1.5776878 | 0.2626479 | 0.1270021 | ∞ | 198.882 |
| M-06 | 1.7485319 | 1.7058988 | 0.0988620 | 0.0584531 | 176.587 | 157.770 | 1.7583974 | 1.6764358 | 0.2587944 | 0.1866594 | 173.444 | 149.341 |
| M-07 | 1.7603756 | 1.6813045 | 0.1019426 | 0.0341533 | ∞ | 149.820 | 1.7288461 | 1.5578732 | 0.2073948 | 0.1144956 | ∞ | 217.877 |
| M-08 | 1.7585071 | 1.6746582 | 0.1002314 | 0.0451520 | ∞ | 210.626 | 1.7577692 | 1.6626617 | 0.3293141 | 0.1847620 | ∞ | 143.673 |
| M-09 | 1.7247856 | 1.6504741 | 0.1133589 | 0.0315816 | ∞ | 166.946 | 1.8333728 | 1.6038330 | 0.3104587 | 0.1313352 | ∞ | 190.414 |
| M-10 | 1.7635739 | 1.6244198 | 0.1200989 | 0.0237208 | ∞ | 153.287 | 1.9267434 | 1.5504007 | 0.2962768 | 0.1034789 | ∞ | 198.199 |
| M-11 | 1.7687343 | 1.6427834 | 0.1208856 | 0.0152338 | ∞ | 156.634 | 1.9796792 | 1.4797451 | 0.3823795 | 0.0942362 | ∞ | 177.061 |

TABLE 12-N

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| N-01 | 1.9898743 | 1.8798206 | 0.2738954 | 0.1482851 | 19.878 | 14.390 | 1.6581080 | 1.4387562 | 0.5750740 | 0.3879157 | ∞ | 77.830 |
| N-02 | 2.0057028 | 1.8241415 | 0.2035070 | 0.0000000 | 19.908 | 9.289 | 1.8381897 | 1.5697363 | 0.4107890 | 0.2056645 | ∞ | 127.168 |
| N-03 | 2.0294681 | 1.8302982 | 0.1644667 | 0.0000000 | 18.910 | 7.978 | 1.8863058 | 1.6083102 | 0.3765767 | 0.1689852 | ∞ | 136.677 |
| N-04 | 1.7721301 | 1.7134985 | 0.1375917 | 0.0523525 | 103.018 | 87.682 | 1.7531814 | 1.5780642 | 0.3294239 | 0.2126075 | 174.502 | 133.130 |
| N-05 | 1.7864489 | 1.7232433 | 0.1217894 | 0.0439576 | 108.908 | 88.852 | 1.8356927 | 1.6197992 | 0.2939229 | 0.1629134 | ∞ | 186.775 |
| N-06 | 1.7745623 | 1.7056377 | 0.1151904 | 0.0308496 | 127.213 | 87.928 | 1.8040840 | 1.5773042 | 0.2657261 | 0.1305882 | ∞ | 195.501 |
| N-07 | 1.7525086 | 1.7111476 | 0.0973459 | 0.0651206 | 178.717 | 159.090 | 1.7729129 | 1.6972781 | 0.2688526 | 0.1986121 | 162.784 | 139.577 |
| N-08 | 1.7600797 | 1.6845035 | 0.1026179 | 0.0367182 | ∞ | 152.101 | 1.7182206 | 1.5603532 | 0.2115874 | 0.1181353 | ∞ | 212.611 |
| N-09 | 1.7225932 | 1.6464408 | 0.1128660 | 0.0335850 | ∞ | 168.513 | 1.8529047 | 1.6091327 | 0.3205476 | 0.1369856 | ∞ | 184.752 |
| N-10 | 1.7091315 | 1.6736102 | 0.0936172 | 0.0551113 | ∞ | 210.524 | 1.7597802 | 1.6848742 | 0.3389807 | 0.2088989 | 167.444 | 138.726 |
| N-11 | 1.7839857 | 1.6195753 | 0.1182756 | 0.0199614 | ∞ | 84.504 | 1.9294443 | 1.5721994 | 0.2803088 | 0.0874462 | ∞ | 225.527 |
| N-12 | 1.7668392 | 1.6435238 | 0.1208574 | 0.0160771 | ∞ | 158.712 | 1.9813165 | 1.4758930 | 0.3860709 | 0.0943253 | ∞ | 168.748 |

TABLE 12-O

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-01 | 1.9745355 | 1.8234942 | 0.2457067 | 0.0746410 | 21.112 | 12.018 | 1.7617983 | 1.5132070 | 0.4902947 | 0.2839715 | ∞ | 112.417 |
| O-02 | 2.0059733 | 1.8307645 | 0.2000360 | 0.0037738 | 20.285 | 9.900 | 1.8500023 | 1.5836144 | 0.4296295 | 0.2199079 | ∞ | 123.209 |
| O-03 | 2.0367482 | 1.8369179 | 0.1737368 | 0.0000000 | 18.405 | 7.972 | 1.8775081 | 1.5995149 | 0.3826412 | 0.1765084 | ∞ | 135.410 |
| O-04 | 1.7750631 | 1.7178732 | 0.1384535 | 0.0554530 | 102.755 | 88.068 | 1.7619051 | 1.5900936 | 0.3474274 | 0.2293012 | 161.256 | 125.106 |
| O-05 | 1.7879382 | 1.7278942 | 0.1207460 | 0.0485292 | 108.257 | 89.506 | 1.8420848 | 1.6311022 | 0.3013680 | 0.1737569 | ∞ | 180.186 |
| O-06 | 1.7738533 | 1.7077535 | 0.1146640 | 0.0340439 | 126.423 | 88.494 | 1.7692212 | 1.5795898 | 0.2681826 | 0.1376150 | ∞ | 190.100 |
| O-07 | 1.7538681 | 1.7161118 | 0.0873451 | 0.0789735 | 179.349 | 160.065 | 1.7761562 | 1.7153773 | 0.2775923 | 0.2090328 | 144.525 | 132.014 |
| O-08 | 1.7588094 | 1.6871175 | 0.1006359 | 0.0395605 | ∞ | 153.368 | 1.7108087 | 1.5673602 | 0.2119811 | 0.1244213 | ∞ | 219.687 |
| O-09 | 1.7035585 | 1.6747463 | 0.0911300 | 0.0586569 | 224.781 | 209.678 | 1.7518392 | 1.6872775 | 0.3528284 | 0.2335193 | 156.082 | 132.286 |
| O-10 | 1.7216346 | 1.6424549 | 0.1134544 | 0.0365623 | ∞ | 169.343 | 1.9264243 | 1.6046848 | 0.3222850 | 0.1392088 | ∞ | 174.721 |
| O-11 | 1.7578687 | 1.6214869 | 0.1197884 | 0.0270357 | ∞ | 157.982 | 1.9250150 | 1.5515628 | 0.3003661 | 0.1065501 | ∞ | 182.350 |
| O-12 | 1.7639572 | 1.6436984 | 0.1209727 | 0.0163487 | ∞ | 159.615 | 1.9791064 | 1.4724890 | 0.3896116 | 0.0995359 | ∞ | 166.016 |

TABLE 12-P

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| P-01 | 1.9847236 | 1.8976008 | 0.2719445 | 0.1774719 | 21.840 | 17.336 | 1.6496701 | 1.4546273 | 0.6962012 | 0.5022034 | ∞ | 67.364 |
| P-02 | 1.9832269 | 1.8392132 | 0.2453629 | 0.0797892 | 20.874 | 12.542 | 1.7646732 | 1.5226603 | 0.5192793 | 0.3142720 | ∞ | 108.306 |
| P-03 | 2.0103767 | 1.8394819 | 0.2038377 | 0.0095908 | 19.974 | 10.197 | 1.8466362 | 1.5845304 | 0.4440382 | 0.2363331 | ∞ | 119.706 |
| P-04 | 2.0432754 | 1.8428372 | 0.1868630 | 0.0000000 | 17.783 | 7.906 | 1.8621291 | 1.5854238 | 0.3866851 | 0.1853595 | ∞ | 156.590 |
| P-05 | 1.7741173 | 1.7242967 | 0.1351302 | 0.0622176 | 101.341 | 88.768 | 1.7509717 | 1.5946826 | 0.3569804 | 0.2534709 | 146.597 | 117.981 |
| P-06 | 1.7856872 | 1.7302709 | 0.1192358 | 0.0539037 | 106.649 | 89.884 | 1.8276629 | 1.6314312 | 0.3016099 | 0.1875450 | ∞ | 174.202 |
| P-07 | 1.7731677 | 1.7111804 | 0.1136218 | 0.0386816 | 126.186 | 89.003 | 1.7503842 | 1.5831662 | 0.2679962 | 0.1463764 | ∞ | 208.563 |
| P-08 | 1.7564437 | 1.6891097 | 0.0959306 | 0.0430851 | ∞ | 153.752 | 1.7024006 | 1.5705427 | 0.2082205 | 0.1320206 | ∞ | 213.283 |
| P-09 | 1.7058157 | 1.6818545 | 0.0973152 | 0.0630500 | 226.401 | 211.558 | 1.7333167 | 1.6658436 | 0.3406044 | 0.2298866 | 148.002 | 123.372 |
| P-10 | 1.7196925 | 1.6496888 | 0.1133306 | 0.0389129 | ∞ | 170.096 | 1.9296571 | 1.5996742 | 0.3232726 | 0.1404846 | ∞ | 163.013 |
| P-11 | 1.7594009 | 1.6325711 | 0.1189345 | 0.0285000 | ∞ | 158.234 | 1.9322292 | 1.5541457 | 0.3011090 | 0.1132977 | ∞ | 171.578 |
| P-12 | 1.7649224 | 1.6433465 | 0.1212459 | 0.0182393 | ∞ | 159.568 | 1.9802461 | 1.4696260 | 0.3928773 | 0.1053419 | ∞ | 160.374 |

TABLE 12-Q

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-01 | 2.0301412 | 1.9516500 | 0.2802433 | 0.2000761 | 20.310 | 16.839 | 1.6486923 | 1.4686020 | 0.7370642 | 0.5836755 | ∞ | 61.930 |
| Q-02 | 1.9990744 | 1.8621359 | 0.2522920 | 0.0892317 | 19.736 | 12.562 | 1.7518351 | 1.5171305 | 0.5349623 | 0.3426393 | ∞ | 99.977 |

TABLE 12-Q-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-03 | 2.0220568 | 1.8515978 | 0.2160734 | 0.0179265 | 18.790 | 9.959 | 1.8260112 | 1.5671843 | 0.4476571 | 0.2499471 | ∞ | 116.748 |
| Q-04 | 2.0448172 | 1.8474808 | 0.1930916 | 0.0000000 | 17.491 | 8.015 | 1.8536839 | 1.5798021 | 0.3918840 | 0.1948662 | ∞ | 147.129 |
| Q-05 | 1.7689426 | 1.7318137 | 0.1258563 | 0.0778778 | 98.490 | 89.656 | 1.7032214 | 1.5835534 | 0.3498561 | 0.2776698 | 133.970 | 114.292 |
| Q-06 | 1.7797734 | 1.7309685 | 0.1161205 | 0.0612780 | 104.569 | 90.079 | 1.7924899 | 1.6197165 | 0.2934962 | 0.2003493 | ∞ | 169.394 |
| Q-07 | 1.7717697 | 1.7140060 | 0.1124096 | 0.0432885 | 112.170 | 89.250 | 1.7397149 | 1.5821770 | 0.2646063 | 0.1542864 | ∞ | 174.125 |
| Q-08 | 1.7537336 | 1.6908943 | 0.0895630 | 0.0524731 | ∞ | 153.813 | 1.6934713 | 1.5710677 | 0.2028344 | 0.1384875 | 240.566 | 203.250 |
| Q-09 | 1.7178106 | 1.6574518 | 0.1122228 | 0.0404637 | ∞ | 170.492 | 1.9450080 | 1.6067170 | 0.3264909 | 0.1492765 | ∞ | 155.526 |
| Q-10 | 1.7552943 | 1.6404274 | 0.1183093 | 0.0294128 | ∞ | 161.731 | 1.9406400 | 1.5539676 | 0.3006731 | 0.1184026 | ∞ | 161.325 |
| Q-11 | 1.7551794 | 1.6403857 | 0.1183112 | 0.0293952 | ∞ | 161.718 | 1.9404069 | 1.5538468 | 0.3007591 | 0.1183799 | ∞ | 161.350 |
| Q-12 | 1.7757084 | 1.6344645 | 0.1188561 | 0.0124133 | ∞ | 85.367 | 1.9771388 | 1.4858229 | 0.3725975 | 0.0916295 | ∞ | 172.144 |

TABLE 12-R

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| R-01 | 2.0997937 | 2.0218726 | 0.2868782 | 0.2123469 | 17.462 | 15.000 | 1.6335746 | 1.4660111 | 0.7302940 | 0.6251366 | ∞ | 68.681 |
| R-02 | 2.0130213 | 1.8811914 | 0.2647677 | 0.1040938 | 18.475 | 12.286 | 1.7269517 | 1.4965513 | 0.5362372 | 0.3602863 | ∞ | 87.647 |
| R-03 | 2.0224123 | 1.8561904 | 0.2272240 | 0.0320080 | 18.232 | 9.988 | 1.8064078 | 1.5493570 | 0.4487076 | 0.2591703 | ∞ | 111.879 |
| R-04 | 2.0459768 | 1.8476797 | 0.2102645 | 0.0000000 | 16.964 | 7.851 | 1.8312987 | 1.5576781 | 0.3880603 | 0.1975598 | ∞ | 130.490 |
| R-05 | 1.7742699 | 1.7317125 | 0.1117318 | 0.0696713 | 102.013 | 90.234 | 1.7557510 | 1.6037051 | 0.2852255 | 0.2082125 | ∞ | 164.384 |
| R-06 | 1.7702726 | 1.7157072 | 0.1113605 | 0.0466925 | 108.502 | 89.331 | 1.7311532 | 1.5768868 | 0.2610166 | 0.1588267 | ∞ | 165.108 |
| R-07 | 1.7517357 | 1.7009838 | 0.0835762 | 0.0602742 | ∞ | 157.002 | 1.6864580 | 1.5654680 | 0.1997152 | 0.1416243 | 228.056 | 190.676 |
| R-08 | 1.7512891 | 1.6459351 | 0.1177017 | 0.0309195 | ∞ | 163.455 | 1.9510221 | 1.5530143 | 0.3017594 | 0.1226993 | ∞ | 153.276 |
| R-09 | 1.7773648 | 1.6340591 | 0.1184300 | 0.0234996 | ∞ | 86.650 | 1.9395171 | 1.5666778 | 0.2887830 | 0.0998121 | ∞ | 202.089 |
| R-10 | 1.7735603 | 1.6354841 | 0.1192036 | 0.0141670 | ∞ | 86.412 | 1.9807177 | 1.4832299 | 0.3780744 | 0.0917085 | ∞ | 180.638 |

TABLE 12-S

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-01 | 2.0136422 | 1.8885299 | 0.2774577 | 0.1261125 | 17.997 | 12.405 | 1.6999863 | 1.4708628 | 0.5421139 | 0.3735593 | ∞ | 79.704 |
| S-02 | 2.0179864 | 1.8567706 | 0.2336282 | 0.0459598 | 18.296 | 10.310 | 1.7965693 | 1.5368732 | 0.4561433 | 0.2657307 | ∞ | 103.288 |
| S-03 | 2.0356214 | 1.8463124 | 0.2043087 | 0.0000000 | 17.630 | 8.402 | 1.8376872 | 1.5609879 | 0.3977260 | 0.2025636 | ∞ | 128.295 |
| S-04 | 2.0459655 | 1.8181408 | 0.2215369 | 0.0000000 | 16.489 | 6.240 | 1.8197869 | 1.5589385 | 0.3436622 | 0.1577796 | ∞ | 150.300 |
| S-05 | 1.7739721 | 1.7341369 | 0.1088796 | 0.0751162 | 100.976 | 90.557 | 1.7425740 | 1.5990974 | 0.2875246 | 0.2124379 | 201.458 | 155.716 |
| S-06 | 1.7704063 | 1.7171543 | 0.1106833 | 0.0483969 | 107.500 | 89.597 | 1.7268572 | 1.5751372 | 0.2630071 | 0.1602715 | ∞ | 155.652 |
| S-07 | 1.7674183 | 1.6877796 | 0.1261174 | 0.0222393 | 133.384 | 82.345 | 1.7422344 | 1.5581182 | 0.2468377 | 0.1280254 | ∞ | 196.893 |
| S-08 | 1.7513689 | 1.7035698 | 0.0811550 | 0.0633450 | ∞ | 158.014 | 1.6835226 | 1.5618026 | 0.2014601 | 0.1426405 | 216.940 | 182.286 |
| S-09 | 1.7586193 | 1.6685973 | 0.1141426 | 0.0240669 | ∞ | 83.157 | 1.7654326 | 1.5822356 | 0.2120172 | 0.1163580 | ∞ | 237.139 |
| S-10 | 1.7137988 | 1.6680395 | 0.1059657 | 0.0491249 | 229.119 | 204.263 | 1.7697765 | 1.6411901 | 0.3291982 | 0.1743325 | ∞ | 144.048 |
| S-11 | 1.7474572 | 1.6485095 | 0.1171196 | 0.0357085 | ∞ | 165.072 | 1.8280566 | 1.5510143 | 0.3034436 | 0.1290649 | ∞ | 179.186 |
| S-12 | 1.7787527 | 1.6346316 | 0.1183617 | 0.0261766 | ∞ | 87.463 | 1.8679541 | 1.5663111 | 0.2911006 | 0.1032185 | ∞ | 198.817 |
| S-13 | 1.7726370 | 1.6361368 | 0.1193980 | 0.0162059 | ∞ | 87.753 | 1.9860452 | 1.4806863 | 0.3836791 | 0.0927929 | ∞ | 179.065 |

TABLE 12-T

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| T-01 | 2.0071627 | 1.8531930 | 0.2293780 | 0.0535149 | 19.498 | 11.301 | 1.8087482 | 1.5440656 | 0.4807519 | 0.2757971 | ∞ | 96.276 |
| T-02 | 2.0380740 | 1.8507900 | 0.2054336 | 0.0000000 | 17.725 | 8.646 | 1.8398399 | 1.5606505 | 0.4070889 | 0.2066897 | ∞ | 128.122 |
| T-03 | 2.0362226 | 1.8173530 | 0.2147614 | 0.0000000 | 17.154 | 6.676 | 1.8245068 | 1.5601331 | 0.3518237 | 0.1608227 | ∞ | 143.088 |
| T-04 | 1.7793794 | 1.7388911 | 0.1095065 | 0.0767807 | 101.335 | 91.113 | 1.7603905 | 1.6140856 | 0.3028634 | 0.2184932 | 183.927 | 143.961 |
| T-05 | 1.7717729 | 1.7189494 | 0.1103797 | 0.0498157 | 107.737 | 90.141 | 1.7242200 | 1.5794166 | 0.2708170 | 0.1629361 | ∞ | 175.561 |
| T-06 | 1.7679862 | 1.6880265 | 0.1268980 | 0.0240806 | 124.939 | 82.648 | 1.7410932 | 1.5606391 | 0.2520278 | 0.1300588 | ∞ | 190.480 |
| T-07 | 1.7518739 | 1.7045277 | 0.0815216 | 0.0632867 | ∞ | 159.022 | 1.6818826 | 1.5663809 | 0.2073629 | 0.1518209 | 206.838 | 177.698 |
| T-08 | 1.7600708 | 1.6726745 | 0.1144826 | 0.0254494 | ∞ | 139.823 | 1.7630023 | 1.5754755 | 0.2168563 | 0.1186166 | ∞ | 229.643 |
| T-09 | 1.7051240 | 1.6697920 | 0.1003223 | 0.0587171 | 226.744 | 206.645 | 1.7525371 | 1.6631462 | 0.3344603 | 0.2017687 | ∞ | 142.304 |
| T-10 | 1.7430137 | 1.6479600 | 0.1171742 | 0.0413661 | ∞ | 167.230 | 1.8275987 | 1.5443101 | 0.3097891 | 0.1370877 | ∞ | 186.344 |
| T-11 | 1.7810721 | 1.6321133 | 0.1183301 | 0.0288819 | ∞ | 88.546 | 1.8621889 | 1.5669606 | 0.2928605 | 0.1036052 | ∞ | 199.275 |
| T-12 | 1.7725015 | 1.6365482 | 0.1194554 | 0.0184532 | ∞ | 149.323 | 1.9935768 | 1.4771388 | 0.3888085 | 0.0925146 | ∞ | 172.969 |

TABLE 13-A

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-01 | 2.1720487 | 2.0190360 | 0.0998073 | 0.0000000 | 29.506 | 23.369 | 4.5065450 | 3.9578561 | 2.6780229 | 2.1435612 | 4.090 | 3.199 |
| A-02 | 1.9889280 | 1.8532359 | 0.2334903 | 0.0957523 | 40.861 | 31.817 | 5.6119745 | 5.3730219 | 0.7593911 | 0.4942458 | 19.555 | 18.637 |
| A-03 | 1.9671128 | 1.8414524 | 0.2024214 | 0.0689180 | 37.381 | 27.259 | 2.5652264 | 2.2714947 | 0.7753194 | 0.4656319 | 57.845 | 47.163 |

TABLE 13-A-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-04 | 1.9818233 | 1.8170308 | 0.1951662 | 0.0068434 | 20.293 | 9.724 | 1.8180698 | 1.5583872 | 0.3718271 | 0.1895773 | ∞ | 136.446 |
| A-05 | 1.9562672 | 1.8281300 | 0.1673451 | 0.0214857 | 27.313 | 16.058 | 1.9456153 | 1.6882910 | 0.5144381 | 0.2722945 | ∞ | 111.570 |
| A-06 | 1.9807221 | 1.7876777 | 0.2011579 | 0.0000000 | 19.841 | 7.438 | 1.8007663 | 1.5635593 | 0.3207222 | 0.1502473 | ∞ | 149.473 |
| A-07 | 1.8477035 | 1.7783786 | 0.1276783 | 0.0621241 | 112.872 | 101.764 | 4.4702166 | 4.3197430 | 0.4936521 | 0.3719016 | 24.460 | 23.543 |
| A-08 | 1.8224279 | 1.7640502 | 0.1206546 | 0.0598782 | 109.093 | 96.415 | 2.0949539 | 1.9156192 | 0.4653894 | 0.3255164 | 71.691 | 61.322 |
| A-09 | 1.7594524 | 1.7017583 | 0.1133712 | 0.0352231 | 113.681 | 90.604 | 1.7043860 | 1.5829468 | 0.2440392 | 0.1526501 | ∞ | 189.898 |
| A-10 | 1.7683655 | 1.6933740 | 0.1175121 | 0.0195678 | 146.462 | 86.025 | 1.7594853 | 1.5976201 | 0.2284733 | 0.1247184 | ∞ | 231.889 |
| A-11 | 1.7806570 | 1.7073575 | 0.1027419 | 0.0494937 | 227.274 | 185.181 | 7.2591935 | 6.3528446 | 3.7059257 | 2.7293571 | 0.934 | 0.744 |
| A-12 | 1.7460918 | 1.6726421 | 0.0978655 | 0.0306414 | ∞ | 149.169 | 1.7205796 | 1.6010007 | 0.2122593 | 0.1421446 | 224.021 | 188.041 |
| A-13 | 1.7591885 | 1.6605032 | 0.1011064 | 0.0244145 | ∞ | 85.953 | 1.7820661 | 1.6423652 | 0.1952622 | 0.1147092 | ∞ | 243.262 |
| A-14 | 1.7274503 | 1.6161759 | 0.1087495 | 0.0364692 | 256.667 | 193.721 | 7.3492621 | 6.3559101 | 3.2428967 | 2.4345312 | 1.113 | 0.817 |
| A-15 | 1.7084944 | 1.6283283 | 0.1074482 | 0.0502449 | 227.699 | 193.038 | 1.8948007 | 1.7452865 | 0.3962294 | 0.2420534 | 101.616 | 81.255 |
| A-16 | 1.7187472 | 1.6392965 | 0.1177469 | 0.0400931 | 234.733 | 182.491 | 1.8371357 | 1.6447383 | 0.3386903 | 0.1579871 | ∞ | 143.559 |
| A-17 | 1.7377446 | 1.6454277 | 0.1181421 | 0.0282214 | ∞ | 175.647 | 1.8609832 | 1.5256023 | 0.3213354 | 0.1196655 | ∞ | 150.106 |
| A-18 | 1.7725168 | 1.6331589 | 0.1071119 | 0.0192664 | ∞ | 91.095 | 1.9009256 | 1.5809647 | 0.2728278 | 0.1014801 | ∞ | 185.131 |
| A-19 | 1.7616261 | 1.6593531 | 0.1098955 | 0.0221647 | ∞ | 171.453 | 1.9704240 | 1.4713309 | 0.4066631 | 0.1097856 | ∞ | 137.110 |

TABLE 13-B

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-01 | 1.9452543 | 1.8183525 | 0.2592155 | 0.1277543 | 42.717 | 33.586 | 7.0526945 | 6.7683586 | 0.8545920 | 0.5492502 | 14.590 | 13.980 |
| B-02 | 1.9596236 | 1.8362764 | 0.1731162 | 0.0325913 | 27.463 | 16.960 | 1.9622040 | 1.7030756 | 0.5536742 | 0.3010973 | ∞ | 107.506 |
| B-03 | 1.9813839 | 1.8242757 | 0.1934821 | 0.0125348 | 20.541 | 10.411 | 1.8214473 | 1.5655196 | 0.3895985 | 0.2047950 | ∞ | 131.100 |
| B-04 | 1.9821434 | 1.7946251 | 0.2012578 | 0.0000000 | 19.749 | 7.864 | 1.7998074 | 1.5618948 | 0.3311011 | 0.1597047 | ∞ | 145.037 |
| B-05 | 1.8517543 | 1.7899355 | 0.1313438 | 0.0698594 | 110.382 | 100.265 | 5.8281493 | 5.6682336 | 0.5711405 | 0.4462284 | 17.468 | 16.967 |
| B-06 | 1.7589124 | 1.7062293 | 0.1118213 | 0.0409619 | 111.426 | 91.607 | 1.6974565 | 1.5840605 | 0.2492018 | 0.1637367 | ∞ | 183.632 |
| B-07 | 1.7676802 | 1.6970027 | 0.1167957 | 0.0231251 | 123.542 | 87.137 | 1.7571242 | 1.5998537 | 0.2327001 | 0.1321935 | ∞ | 226.644 |
| B-08 | 1.7763495 | 1.7235333 | 0.0863733 | 0.0786401 | 209.450 | 181.880 | 5.6463193 | 5.0251755 | 4.7411024 | 3.9364503 | 0.821 | 0.680 |
| B-09 | 1.7445883 | 1.6767453 | 0.0939346 | 0.0375784 | ∞ | 151.396 | 1.7112989 | 1.6068445 | 0.2158696 | 0.1524272 | 210.231 | 181.611 |
| B-10 | 1.7574612 | 1.6624258 | 0.0986454 | 0.0290140 | ∞ | 135.564 | 1.7808669 | 1.6556117 | 0.1973236 | 0.1215289 | ∞ | 237.437 |
| B-11 | 1.7109823 | 1.6137790 | 0.0997165 | 0.0532321 | 242.436 | 193.346 | 6.2633792 | 5.3764346 | 4.3274325 | 3.5194222 | 0.991 | 0.726 |
| B-12 | 1.6962709 | 1.6298000 | 0.1011874 | 0.0612521 | 222.057 | 196.217 | 1.9128981 | 1.7709938 | 0.4189358 | 0.2786453 | 90.120 | 74.349 |
| B-13 | 1.7132967 | 1.6391097 | 0.1158834 | 0.0465535 | 229.378 | 184.815 | 1.8363492 | 1.6606949 | 0.3455863 | 0.1751285 | ∞ | 137.424 |
| B-14 | 1.7338443 | 1.6454556 | 0.1188319 | 0.0316590 | ∞ | 177.305 | 1.8516317 | 1.5221517 | 0.3265697 | 0.1272105 | ∞ | 143.802 |
| B-15 | 1.7458965 | 1.6358331 | 0.1072745 | 0.0218863 | ∞ | 137.681 | 1.9039898 | 1.5828362 | 0.2766013 | 0.1068491 | ∞ | 179.079 |
| B-16 | 1.7605337 | 1.6620962 | 0.1100645 | 0.0246727 | ∞ | 173.308 | 1.9804345 | 1.4648107 | 0.4162560 | 0.1165234 | ∞ | 132.389 |
| B-17 | 1.7751843 | 1.6392688 | 0.1108102 | 0.0187265 | ∞ | 91.227 | 1.9686516 | 1.4881328 | 0.3955979 | 0.0946164 | ∞ | 141.476 |

TABLE 13-C

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| C-01 | 1.9025379 | 1.7929090 | 0.2878348 | 0.1649490 | 43.365 | 35.188 | 4.9640531 | 4.6075296 | 0.9846002 | 0.6056513 | 20.823 | 19.261 |
| C-02 | 1.9716347 | 1.8539125 | 0.1752020 | 0.0409320 | 27.454 | 18.040 | 2.0121051 | 1.7498504 | 0.6140520 | 0.3407427 | ∞ | 100.236 |
| C-03 | 1.9799544 | 1.8302413 | 0.1965994 | 0.0220193 | 20.598 | 11.008 | 1.8161176 | 1.5657954 | 0.4056733 | 0.2211860 | ∞ | 126.931 |
| C-04 | 1.9864218 | 1.8036777 | 0.2004793 | 0.0000000 | 19.499 | 8.235 | 1.8003554 | 1.5619667 | 0.3429599 | 0.1708627 | ∞ | 170.369 |
| C-05 | 1.8555780 | 1.8119708 | 0.1375602 | 0.0936905 | 105.753 | 98.281 | 5.7336181 | 5.5695654 | 0.6183223 | 0.4948176 | 17.141 | 16.642 |
| C-06 | 1.7574013 | 1.7107521 | 0.1098073 | 0.0471621 | 109.284 | 92.424 | 1.6892691 | 1.5858767 | 0.2550937 | 0.1774106 | ∞ | 177.629 |
| C-07 | 1.7671343 | 1.7011102 | 0.1159156 | 0.0269898 | 116.762 | 88.159 | 1.7562868 | 1.6040395 | 0.2374867 | 0.1407631 | ∞ | 220.550 |
| C-08 | 1.7414378 | 1.6903038 | 0.0890222 | 0.0452270 | ∞ | 159.859 | 1.7014705 | 1.6183980 | 0.2210881 | 0.1650225 | 197.102 | 175.552 |
| C-09 | 1.7557447 | 1.6650428 | 0.0952628 | 0.0349222 | ∞ | 138.687 | 1.7813503 | 1.6705654 | 0.1992455 | 0.1291564 | 285.808 | 232.461 |
| C-10 | 1.7080327 | 1.6395647 | 0.1116081 | 0.0549822 | 220.890 | 187.682 | 1.8374498 | 1.6784593 | 0.3525581 | 0.2020588 | ∞ | 132.217 |
| C-11 | 1.7300752 | 1.6460151 | 0.1196827 | 0.0356226 | ∞ | 178.935 | 1.8492558 | 1.5188530 | 0.3325269 | 0.1361670 | ∞ | 139.642 |
| C-12 | 1.7396481 | 1.6415548 | 0.1074472 | 0.0249850 | ∞ | 141.690 | 1.9105740 | 1.5866092 | 0.2815319 | 0.1134362 | ∞ | 198.401 |
| C-13 | 1.7563944 | 1.6646000 | 0.1100978 | 0.0276710 | ∞ | 174.875 | 1.9927799 | 1.4565116 | 0.4273612 | 0.1239762 | ∞ | 127.927 |
| C-14 | 1.7747873 | 1.6404196 | 0.1109873 | 0.0213816 | ∞ | 143.313 | 1.9792213 | 1.4864771 | 0.4038529 | 0.0993424 | ∞ | 136.771 |

TABLE 13-D

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-01 | 1.9490966 | 1.8500842 | 0.2647931 | 0.1401459 | 35.207 | 28.244 | 2.6311080 | 2.2700265 | 1.1076331 | 0.7427894 | 45.953 | 36.141 |
| D-02 | 1.9914392 | 1.8780786 | 0.1798526 | 0.0501163 | 25.772 | 17.691 | 2.0162696 | 1.7538672 | 0.6433846 | 0.3774728 | ∞ | 94.106 |
| D-03 | 1.9816604 | 1.8366482 | 0.2034537 | 0.0329594 | 20.194 | 11.243 | 1.8013721 | 1.5581067 | 0.4155671 | 0.2353864 | ∞ | 122.408 |
| D-04 | 1.9856163 | 1.8069420 | 0.2051578 | 0.0023074 | 19.386 | 8.506 | 1.7929679 | 1.5568815 | 0.3495088 | 0.1791182 | ∞ | 164.498 |
| D-05 | 1.7549914 | 1.7131823 | 0.1089697 | 0.0521081 | 106.541 | 92.615 | 1.6794153 | 1.5838159 | 0.2592041 | 0.1895496 | 201.172 | 170.921 |
| D-06 | 1.7669110 | 1.7047382 | 0.1153749 | 0.0305763 | 113.648 | 88.847 | 1.7581593 | 1.6081385 | 0.2411728 | 0.1480734 | ∞ | 213.836 |
| D-07 | 1.7381767 | 1.6971854 | 0.0857519 | 0.0501367 | 186.218 | 161.719 | 1.6970322 | 1.6330649 | 0.2270587 | 0.1762567 | 186.228 | 168.269 |
| D-08 | 1.7545493 | 1.6677902 | 0.0908813 | 0.0421582 | ∞ | 156.552 | 1.7806194 | 1.6878813 | 0.1994956 | 0.1354429 | 270.383 | 227.465 |

TABLE 13-D-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-09 | 1.6987657 | 1.6408080 | 0.1062771 | 0.0636318 | 217.801 | 189.505 | 1.8295289 | 1.6886683 | 0.3581889 | 0.2377885 | ∞ | 128.894 |
| D-10 | 1.7270953 | 1.6471258 | 0.1204663 | 0.0383618 | ∞ | 180.122 | 1.8391835 | 1.5896461 | 0.3384880 | 0.1435869 | ∞ | 174.139 |
| D-11 | 1.7345322 | 1.6490573 | 0.1075499 | 0.0277684 | ∞ | 165.143 | 1.9196510 | 1.5922999 | 0.2869411 | 0.1211074 | ∞ | 196.987 |
| D-12 | 1.7517544 | 1.6662856 | 0.1098805 | 0.0311830 | ∞ | 175.693 | 2.0019474 | 1.4458781 | 0.4376849 | 0.1318597 | ∞ | 123.262 |
| D-13 | 1.7748217 | 1.6409606 | 0.1111181 | 0.0236791 | ∞ | 146.934 | 1.9872990 | 1.4839165 | 0.4097955 | 0.1027825 | ∞ | 170.430 |

TABLE 13-E

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-01 | 2.0138007 | 1.9025812 | 0.1889196 | 0.0602526 | 22.865 | 16.001 | 1.9517183 | 1.6887202 | 0.6154098 | 0.3933761 | ∞ | 92.397 |
| E-02 | 1.9781991 | 1.8343526 | 0.2198663 | 0.0499591 | 19.581 | 11.070 | 1.7660977 | 1.5304996 | 0.4097111 | 0.2391227 | ∞ | 117.454 |
| E-03 | 1.9860758 | 1.8081461 | 0.2103990 | 0.0075316 | 19.209 | 8.559 | 1.7856337 | 1.5530104 | 0.3519891 | 0.1831903 | ∞ | 154.955 |
| E-04 | 1.7526647 | 1.7120483 | 0.1113963 | 0.0527354 | 104.884 | 92.053 | 1.6731353 | 1.5761126 | 0.2626584 | 0.1956784 | 189.469 | 162.622 |
| E-05 | 1.7675140 | 1.7072308 | 0.1157390 | 0.0332708 | 111.601 | 89.149 | 1.7648363 | 1.6096801 | 0.2435865 | 0.1516420 | ∞ | 209.841 |
| E-06 | 1.7363451 | 1.6941563 | 0.0885443 | 0.0473541 | 183.090 | 160.396 | 1.7020267 | 1.6379178 | 0.2340864 | 0.1822016 | 178.708 | 160.580 |
| E-07 | 1.7545300 | 1.7026538 | 0.0850531 | 0.0512311 | ∞ | 160.625 | 1.7832820 | 1.7053169 | 0.1967562 | 0.1381600 | 259.555 | 221.269 |
| E-08 | 1.6929448 | 1.6424138 | 0.1017383 | 0.0689490 | 211.936 | 190.074 | 1.8067440 | 1.6852377 | 0.3671092 | 0.2694310 | 159.707 | 125.117 |
| E-09 | 1.7250539 | 1.6484621 | 0.1212697 | 0.0367433 | ∞ | 180.516 | 1.8295455 | 1.6171810 | 0.3450742 | 0.1501022 | ∞ | 175.998 |
| E-10 | 1.7298898 | 1.6531284 | 0.1076218 | 0.0303317 | ∞ | 168.497 | 1.9273671 | 1.5988368 | 0.2920246 | 0.1269904 | ∞ | 191.986 |
| E-11 | 1.7409431 | 1.6315669 | 0.1134179 | 0.0186621 | ∞ | 168.451 | 1.9123265 | 1.5410692 | 0.2838135 | 0.1011768 | ∞ | 202.118 |
| E-12 | 1.7485114 | 1.6667341 | 0.1093856 | 0.0333688 | ∞ | 219.421 | 2.0081308 | 1.4338083 | 0.4451714 | 0.1397307 | ∞ | 117.893 |
| E-13 | 1.7754004 | 1.6404821 | 0.1112097 | 0.0251624 | ∞ | 148.812 | 1.9944125 | 1.4804354 | 0.4116154 | 0.1061955 | ∞ | 165.119 |

TABLE 13-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-01 | 1.9601257 | 1.8751892 | 0.3059474 | 0.2095522 | 25.202 | 20.234 | 1.8164468 | 1.5980789 | 0.8705184 | 0.6940072 | 67.900 | 46.117 |
| F-02 | 2.0398589 | 1.9260429 | 0.2002151 | 0.0695450 | 20.308 | 14.445 | 1.8904816 | 1.6179829 | 0.5766885 | 0.3887588 | ∞ | 96.498 |
| F-03 | 1.9843691 | 1.8078542 | 0.2076175 | 0.0073966 | 19.525 | 8.746 | 1.7884408 | 1.5555782 | 0.3571135 | 0.1854875 | ∞ | 143.521 |
| F-04 | 2.0084257 | 1.8129240 | 0.1683376 | 0.0000000 | 19.037 | 7.510 | 1.8454836 | 1.5945668 | 0.3328661 | 0.1544884 | ∞ | 154.427 |
| F-05 | 1.7523979 | 1.7088750 | 0.1161001 | 0.0495242 | 104.457 | 91.092 | 1.6765101 | 1.5701270 | 0.2688829 | 0.1969664 | 180.251 | 152.144 |
| F-06 | 1.7698912 | 1.7095091 | 0.1165811 | 0.0350662 | 111.229 | 89.360 | 1.7772955 | 1.6126178 | 0.2470494 | 0.1523058 | ∞ | 203.120 |
| F-07 | 1.7769446 | 1.7170251 | 0.1016549 | 0.0334897 | 134.838 | 91.411 | 1.8125328 | 1.6161814 | 0.2312145 | 0.1247643 | ∞ | 199.671 |
| F-08 | 1.7370295 | 1.6882441 | 0.0943208 | 0.0411897 | 181.068 | 157.804 | 1.7003284 | 1.6371863 | 0.2429774 | 0.1834571 | 171.941 | 151.928 |
| F-09 | 1.6920769 | 1.6453411 | 0.1008406 | 0.0681978 | 210.713 | 190.231 | 1.7841289 | 1.6733965 | 0.3812454 | 0.2788296 | 146.846 | 119.488 |
| F-10 | 1.7264082 | 1.6534724 | 0.1079804 | 0.0318447 | ∞ | 170.823 | 1.9308751 | 1.6039207 | 0.2961533 | 0.1293661 | ∞ | 190.337 |
| F-11 | 1.7465606 | 1.6650152 | 0.1088619 | 0.0347884 | ∞ | 228.442 | 2.0212950 | 1.4255198 | 0.4483772 | 0.1442353 | ∞ | 111.164 |
| F-12 | 1.7757445 | 1.6384728 | 0.1115386 | 0.0258965 | ∞ | 150.216 | 2.0078258 | 1.4788219 | 0.4125950 | 0.1076340 | ∞ | 159.321 |

TABLE 13-G

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| G-01 | 1.9471190 | 1.8573741 | 0.3315141 | 0.2613530 | 25.708 | 20.801 | 1.7346194 | 1.5675979 | 0.8995689 | 0.7093589 | 57.803 | 41.774 |
| G-02 | 2.0474789 | 1.9374899 | 0.2088960 | 0.0864229 | 19.832 | 14.615 | 1.8673658 | 1.5897706 | 0.5817484 | 0.3973966 | ∞ | 93.058 |
| G-03 | 1.9824239 | 1.8085042 | 0.2044057 | 0.0083254 | 19.974 | 9.072 | 1.7932069 | 1.5573939 | 0.3849680 | 0.1893626 | ∞ | 136.351 |
| G-04 | 2.0062979 | 1.8143570 | 0.1686660 | 0.0000000 | 19.321 | 7.796 | 1.8473259 | 1.5928289 | 0.3376682 | 0.1570847 | ∞ | 145.892 |
| G-05 | 1.7542439 | 1.7081697 | 0.1184925 | 0.0494801 | 104.746 | 90.724 | 1.6837980 | 1.5715116 | 0.2785474 | 0.2005334 | 169.521 | 142.006 |
| G-06 | 1.7726238 | 1.7123699 | 0.1166609 | 0.0367756 | 111.419 | 89.772 | 1.7864160 | 1.6184643 | 0.2526557 | 0.1551459 | ∞ | 194.224 |
| G-07 | 1.7769720 | 1.7186492 | 0.1001777 | 0.0365461 | 133.697 | 92.110 | 1.8134719 | 1.6157778 | 0.2332031 | 0.1268811 | ∞ | 191.112 |
| G-08 | 1.7390786 | 1.6892495 | 0.0966088 | 0.0411779 | 182.665 | 157.660 | 1.7041582 | 1.6407695 | 0.2518775 | 0.1865211 | 161.346 | 142.069 |
| G-09 | 1.6887905 | 1.6453286 | 0.0973769 | 0.0726992 | 209.133 | 191.092 | 1.7774116 | 1.6679475 | 0.3796946 | 0.2963316 | 138.525 | 111.328 |
| G-10 | 1.7248233 | 1.6512222 | 0.1084745 | 0.0324198 | ∞ | 172.081 | 1.9278793 | 1.6042319 | 0.2985623 | 0.1295572 | ∞ | 181.325 |
| G-11 | 1.7415236 | 1.6337892 | 0.1142946 | 0.0196535 | ∞ | 171.726 | 1.9107844 | 1.5352327 | 0.2910079 | 0.1017293 | ∞ | 187.270 |
| G-12 | 1.7466067 | 1.6612588 | 0.1088919 | 0.0376638 | ∞ | 228.714 | 2.0528886 | 1.4261516 | 0.4501809 | 0.1479690 | ∞ | 101.396 |
| G-13 | 1.7738118 | 1.6458235 | 0.1122805 | 0.0265700 | ∞ | 159.120 | 2.0320602 | 1.4814572 | 0.4174486 | 0.1095128 | ∞ | 145.121 |

TABLE 13-H

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-01 | 1.9093820 | 1.8390537 | 0.3581090 | 0.3272350 | 29.940 | 26.410 | 1.7829342 | 1.6468966 | 1.0386247 | 0.8996928 | 39.677 | 31.112 |
| H-02 | 2.0153745 | 1.9174009 | 0.2170380 | 0.1093354 | 22.851 | 17.243 | 1.8883866 | 1.6174735 | 0.6634327 | 0.4395423 | ∞ | 79.893 |
| H-03 | 1.9647302 | 1.8297937 | 0.2253126 | 0.0678554 | 20.636 | 12.234 | 1.7389105 | 1.5164728 | 0.4345124 | 0.2586530 | ∞ | 120.529 |
| H-04 | 1.9816545 | 1.8137492 | 0.2011229 | 0.0106774 | 20.275 | 9.608 | 1.7978418 | 1.5579065 | 0.3780034 | 0.1994548 | ∞ | 131.911 |
| H-05 | 2.0013018 | 1.8177386 | 0.1627260 | 0.0000000 | 19.873 | 8.421 | 1.8560649 | 1.6039469 | 0.3499451 | 0.1657655 | ∞ | 140.113 |

TABLE 13-H-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-06 | 1.7560430 | 1.7139226 | 0.1150517 | 0.0520707 | 104.620 | 91.864 | 1.6805590 | 1.5776964 | 0.2869340 | 0.2123088 | 157.090 | 134.545 |
| H-07 | 1.7725726 | 1.7150690 | 0.1151625 | 0.0393056 | 110.839 | 90.428 | 1.7830767 | 1.6227447 | 0.2580841 | 0.1632562 | ∞ | 185.077 |
| H-08 | 1.7766383 | 1.7198621 | 0.1001326 | 0.0381111 | 133.403 | 92.343 | 1.8062796 | 1.6196317 | 0.2358518 | 0.1327011 | ∞ | 221.572 |
| H-09 | 1.7394490 | 1.6988680 | 0.0902356 | 0.0479724 | 183.123 | 161.331 | 1.7066699 | 1.6515112 | 0.2558938 | 0.1973818 | 148.631 | 134.181 |
| H-10 | 1.7115878 | 1.6495102 | 0.1198603 | 0.0530207 | 224.718 | 182.356 | 1.8305889 | 1.6343743 | 0.3452063 | 0.1726025 | ∞ | 147.380 |
| H-11 | 1.7250872 | 1.6514825 | 0.1088747 | 0.0347902 | ∞ | 172.283 | 1.9233707 | 1.5996781 | 0.2997373 | 0.1316136 | ∞ | 168.021 |
| H-12 | 1.7407140 | 1.6331408 | 0.1141268 | 0.0203096 | ∞ | 172.203 | 1.9100305 | 1.5355896 | 0.2913496 | 0.1035017 | ∞ | 177.622 |
| H-13 | 1.7471031 | 1.6620323 | 0.1096216 | 0.0405774 | ∞ | 228.740 | 1.9466405 | 1.4315233 | 0.4532749 | 0.1524070 | ∞ | 89.869 |
| H-14 | 1.7718386 | 1.6509768 | 0.1128027 | 0.0288169 | ∞ | 164.882 | 2.0603335 | 1.4823147 | 0.4233479 | 0.1126423 | ∞ | 137.200 |
| H-15 | 1.7539891 | 1.6542454 | 0.1129054 | 0.0154677 | ∞ | 171.237 | 1.9662554 | 1.4686978 | 0.3643352 | 0.0975810 | ∞ | 172.706 |

TABLE 13-I

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| I-01 | 1.9841567 | 1.8929470 | 0.2301414 | 0.1309068 | 26.135 | 20.174 | 1.9251687 | 1.6613405 | 0.7847221 | 0.5068730 | ∞ | 64.093 |
| I-02 | 1.9731131 | 1.8467130 | 0.2181883 | 0.0672045 | 21.025 | 13.219 | 1.7628328 | 1.5401008 | 0.4720736 | 0.2890182 | ∞ | 116.770 |
| I-03 | 1.9847546 | 1.8242615 | 0.2006927 | 0.0159808 | 20.146 | 10.175 | 1.7995335 | 1.5631297 | 0.3942650 | 0.2150157 | ∞ | 127.993 |
| I-04 | 2.0018800 | 1.8207325 | 0.1729103 | 0.0000000 | 19.553 | 8.557 | 1.8422081 | 1.5923558 | 0.3552220 | 0.1740733 | ∞ | 166.372 |
| I-05 | 1.7566279 | 1.7248505 | 0.1029259 | 0.0701745 | 103.501 | 93.887 | 1.6611144 | 1.5864965 | 0.2916410 | 0.2339676 | 141.696 | 128.328 |
| I-06 | 1.7699579 | 1.7183673 | 0.1118467 | 0.0445969 | 109.157 | 91.375 | 1.7640520 | 1.6224517 | 0.2611314 | 0.1755796 | 231.191 | 176.991 |
| I-07 | 1.7753265 | 1.7210064 | 0.1002917 | 0.0397436 | 120.772 | 92.361 | 1.7925457 | 1.6258159 | 0.2371088 | 0.1409162 | ∞ | 216.536 |
| I-08 | 1.7067245 | 1.6474765 | 0.1150085 | 0.0641564 | 216.898 | 185.483 | 1.8393351 | 1.6593778 | 0.3351860 | 0.1964641 | ∞ | 138.890 |
| I-09 | 1.7261004 | 1.6554363 | 0.1093842 | 0.0385285 | ∞ | 172.421 | 1.9258761 | 1.5944381 | 0.3017928 | 0.1380501 | ∞ | 163.419 |
| I-10 | 1.7392219 | 1.6324251 | 0.1138139 | 0.0221025 | ∞ | 172.382 | 1.9139888 | 1.5370320 | 0.2915926 | 0.1098275 | ∞ | 172.892 |
| I-11 | 1.7455957 | 1.6672535 | 0.1103795 | 0.0435045 | ∞ | 231.378 | 1.9406390 | 1.4314495 | 0.4647047 | 0.1613698 | ∞ | 80.857 |
| I-12 | 1.7709553 | 1.6540901 | 0.1126674 | 0.0312832 | ∞ | 167.534 | 2.0446573 | 1.4763028 | 0.4301550 | 0.1186498 | ∞ | 132.049 |
| I-13 | 1.7543354 | 1.6537299 | 0.1132541 | 0.0174070 | ∞ | 171.646 | 1.9679887 | 1.4740873 | 0.3703755 | 0.1029109 | ∞ | 167.788 |

TABLE 13-J

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| J-01 | 1.9809075 | 1.8980328 | 0.2448835 | 0.1566767 | 26.306 | 21.064 | 1.9050955 | 1.6655740 | 0.8575543 | 0.5893231 | ∞ | 57.567 |
| J-02 | 1.9881326 | 1.8692972 | 0.2155252 | 0.0721035 | 20.742 | 13.818 | 1.7803324 | 1.5606498 | 0.5095133 | 0.3258134 | ∞ | 108.866 |
| J-03 | 1.9898169 | 1.8353260 | 0.2061805 | 0.0251796 | 19.620 | 10.507 | 1.7925299 | 1.5591828 | 0.4068723 | 0.2312852 | ∞ | 124.252 |
| J-04 | 2.0048289 | 1.8259971 | 0.1826240 | 0.0000000 | 19.044 | 8.651 | 1.8295110 | 1.5813860 | 0.3602975 | 0.1831844 | ∞ | 161.817 |
| J-05 | 1.7658057 | 1.7224231 | 0.1070729 | 0.0531483 | 106.864 | 92.263 | 1.7399591 | 1.6212152 | 0.2614146 | 0.1896323 | 211.022 | 171.335 |
| J-06 | 1.7732110 | 1.7227862 | 0.0990467 | 0.0434144 | 114.284 | 92.503 | 1.7771808 | 1.6275751 | 0.2355823 | 0.1495093 | ∞ | 209.798 |
| J-07 | 1.7028489 | 1.6476670 | 0.1109898 | 0.0702586 | 213.854 | 188.154 | 1.8328545 | 1.6746514 | 0.3355229 | 0.2162711 | ∞ | 137.496 |
| J-08 | 1.7260375 | 1.6612267 | 0.1098660 | 0.0429837 | ∞ | 173.185 | 1.9344686 | 1.5926693 | 0.3061048 | 0.1491712 | ∞ | 156.257 |
| J-09 | 1.7377532 | 1.6400237 | 0.1135634 | 0.0248634 | ∞ | 172.921 | 1.9216875 | 1.5602507 | 0.2945493 | 0.1157554 | ∞ | 166.398 |
| J-10 | 1.7432131 | 1.6726882 | 0.1106529 | 0.0472960 | ∞ | 247.837 | 1.9339555 | 1.4222282 | 0.4804307 | 0.1767479 | ∞ | 111.927 |
| J-11 | 1.7714442 | 1.6572890 | 0.1121622 | 0.0341617 | ∞ | 175.103 | 2.0302923 | 1.4667157 | 0.4416960 | 0.1265007 | ∞ | 127.501 |
| J-12 | 1.7541063 | 1.6537206 | 0.1135956 | 0.0198615 | ∞ | 172.350 | 1.9712389 | 1.4738671 | 0.3773772 | 0.1079912 | ∞ | 160.845 |

TABLE 13-K

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-01 | 1.9983178 | 1.8855456 | 0.2261637 | 0.0864859 | 19.642 | 13.634 | 1.7551188 | 1.5425749 | 0.5160287 | 0.3496236 | ∞ | 101.168 |
| K-02 | 1.9943696 | 1.8437141 | 0.2144343 | 0.0355134 | 18.947 | 10.561 | 1.7797548 | 1.5498598 | 0.4126749 | 0.2439115 | ∞ | 119.800 |
| K-03 | 2.0067215 | 1.8310354 | 0.1870831 | 0.0000000 | 18.717 | 8.788 | 1.8239278 | 1.5771676 | 0.3649829 | 0.1909253 | ∞ | 152.483 |
| K-04 | 1.7619875 | 1.7257045 | 0.1017354 | 0.0632027 | 104.095 | 92.685 | 1.7185071 | 1.6159717 | 0.2598226 | 0.2008932 | 193.826 | 168.385 |
| K-05 | 1.7711748 | 1.7252984 | 0.0957368 | 0.0496724 | 110.785 | 92.811 | 1.7607140 | 1.6239305 | 0.2306492 | 0.1559959 | ∞ | 219.660 |
| K-06 | 1.7022734 | 1.6493950 | 0.1134178 | 0.0651537 | 212.165 | 190.849 | 1.7995431 | 1.6648067 | 0.3598415 | 0.2134096 | ∞ | 134.580 |
| K-07 | 1.7240928 | 1.6675706 | 0.1098594 | 0.0468406 | ∞ | 202.765 | 1.7562963 | 1.5963244 | 0.3135005 | 0.1629353 | ∞ | 149.959 |
| K-08 | 1.7366122 | 1.6471493 | 0.1133195 | 0.0279789 | ∞ | 174.035 | 1.9321537 | 1.5760624 | 0.2991336 | 0.1222012 | ∞ | 182.726 |
| K-09 | 1.7531614 | 1.6544041 | 0.1138496 | 0.0224971 | ∞ | 173.378 | 1.9783548 | 1.4640140 | 0.3838800 | 0.1110187 | ∞ | 151.059 |

TABLE 13-L

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-01 | 2.0549494 | 1.9887104 | 0.2687077 | 0.2213457 | 19.375 | 16.797 | 1.6842111 | 1.5646066 | 0.7318220 | 0.6514497 | 76.651 | 63.140 |
| L-02 | 1.9979471 | 1.8909061 | 0.2424568 | 0.1060383 | 18.688 | 13.351 | 1.7090749 | 1.5053408 | 0.5051735 | 0.3567702 | ∞ | 91.445 |
| L-03 | 1.9920916 | 1.8443560 | 0.2225708 | 0.0470434 | 18.723 | 10.651 | 1.7668473 | 1.5375419 | 0.4148873 | 0.2500704 | ∞ | 113.125 |
| L-04 | 2.0115430 | 1.8368860 | 0.1884994 | 0.0000000 | 18.392 | 8.839 | 1.8244176 | 1.5756615 | 0.3690709 | 0.1951304 | ∞ | 140.380 |

TABLE 13-L-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-05 | 1.7612213 | 1.7281036 | 0.0984884 | 0.0707686 | 102.646 | 92.769 | 1.7117523 | 1.6117230 | 0.2612885 | 0.2063629 | 181.321 | 163.500 |
| L-06 | 1.7706322 | 1.7284716 | 0.0898852 | 0.0580602 | 109.099 | 93.388 | 1.7381805 | 1.6195807 | 0.2239787 | 0.1587114 | ∞ | 217.375 |
| L-07 | 1.7208195 | 1.6729631 | 0.1077789 | 0.0497272 | ∞ | 209.751 | 1.7454937 | 1.6066082 | 0.3249477 | 0.1758596 | ∞ | 145.915 |
| L-08 | 1.7297676 | 1.6507991 | 0.1133522 | 0.0307998 | ∞ | 175.528 | 1.9419145 | 1.5921733 | 0.3049193 | 0.1282140 | ∞ | 188.840 |
| L-09 | 1.7556516 | 1.6360813 | 0.1134484 | 0.0213219 | ∞ | 95.412 | 1.9237138 | 1.5508817 | 0.2919800 | 0.1031189 | ∞ | 202.744 |
| L-10 | 1.7666102 | 1.6463429 | 0.1110591 | 0.0144441 | ∞ | 153.332 | 1.9727136 | 1.4886157 | 0.3649983 | 0.0940693 | ∞ | 184.106 |

TABLE 13-M

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| M-01 | 1.9868525 | 1.8418415 | 0.2230906 | 0.0537754 | 19.310 | 11.134 | 1.7693119 | 1.5368827 | 0.4273434 | 0.2560434 | ∞ | 103.782 |
| M-02 | 2.0118960 | 1.8413370 | 0.1832860 | 0.0000000 | 18.736 | 9.264 | 1.8361184 | 1.5837515 | 0.3792802 | 0.1990983 | ∞ | 132.806 |
| M-03 | 2.0243543 | 1.8231250 | 0.1937413 | 0.0000000 | 17.384 | 7.159 | 1.8222108 | 1.5748622 | 0.3294630 | 0.1561989 | ∞ | 151.002 |
| M-04 | 1.7654084 | 1.7317244 | 0.0992165 | 0.0739113 | 102.664 | 93.011 | 1.7306377 | 1.6514190 | 0.2706272 | 0.2099826 | 171.773 | 153.191 |
| M-05 | 1.7603752 | 1.6970219 | 0.1104292 | 0.0259297 | 129.169 | 87.896 | 1.7181271 | 1.5764327 | 0.2198406 | 0.1280437 | ∞ | 221.182 |
| M-06 | 1.7175581 | 1.6756245 | 0.1044570 | 0.0533352 | 234.707 | 211.582 | 1.7199356 | 1.6230069 | 0.3386796 | 0.1870792 | ∞ | 140.648 |
| M-07 | 1.7249239 | 1.6504415 | 0.1141074 | 0.0329880 | ∞ | 177.133 | 1.8402671 | 1.6053586 | 0.3133686 | 0.1317597 | ∞ | 190.190 |
| M-08 | 1.7541175 | 1.6375269 | 0.1136307 | 0.0228409 | ∞ | 152.774 | 1.9225920 | 1.5463603 | 0.2962522 | 0.1045323 | ∞ | 198.101 |
| M-09 | 1.7683602 | 1.6451046 | 0.1108928 | 0.0164031 | ∞ | 156.618 | 1.9783298 | 1.4860068 | 0.3698574 | 0.0943533 | ∞ | 177.708 |

TABLE 13-N

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| N-01 | 1.9802060 | 1.8398252 | 0.2174098 | 0.0552918 | 20.594 | 12.118 | 1.7887242 | 1.5524401 | 0.4540138 | 0.2684120 | ∞ | 101.802 |
| N-02 | 2.0094977 | 1.8465936 | 0.1744820 | 0.0000000 | 19.514 | 10.070 | 1.8565714 | 1.6026591 | 0.3977850 | 0.2082049 | ∞ | 127.773 |
| N-03 | 2.0163723 | 1.8188796 | 0.2044640 | 0.0000000 | 17.628 | 7.361 | 1.8096550 | 1.5641533 | 0.3309958 | 0.1587900 | ∞ | 146.108 |
| N-04 | 1.7720564 | 1.7375373 | 0.0990513 | 0.0786058 | 103.274 | 93.567 | 1.7560699 | 1.6964043 | 0.2853780 | 0.2186654 | 161.266 | 142.146 |
| N-05 | 1.7604234 | 1.6962193 | 0.1120477 | 0.0283831 | 127.006 | 87.715 | 1.7164817 | 1.5788328 | 0.2243987 | 0.1314043 | ∞ | 228.314 |
| N-06 | 1.7553578 | 1.6833412 | 0.1021275 | 0.0355150 | ∞ | 152.787 | 1.7217842 | 1.6187618 | 0.1974327 | 0.1187120 | 289.359 | 232.882 |
| N-07 | 1.7231775 | 1.6453711 | 0.1135182 | 0.0347059 | ∞ | 178.582 | 1.9317098 | 1.6087338 | 0.3195486 | 0.1356838 | ∞ | 184.458 |
| N-08 | 1.7102476 | 1.6752512 | 0.1023288 | 0.0575717 | 232.198 | 211.420 | 1.7127689 | 1.6310648 | 0.3402666 | 0.1958098 | 160.891 | 134.410 |
| N-09 | 1.7512229 | 1.6316648 | 0.1098225 | 0.0189119 | ∞ | 84.503 | 1.9194307 | 1.5689876 | 0.2803327 | 0.0869428 | ∞ | 228.630 |
| N-10 | 1.7697135 | 1.6437662 | 0.1108125 | 0.0177314 | ∞ | 158.635 | 1.9791959 | 1.4825638 | 0.3732863 | 0.0956362 | ∞ | 171.216 |

TABLE 13-O

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-01 | 1.9800317 | 1.8447961 | 0.2147271 | 0.0571734 | 21.381 | 12.997 | 1.8077900 | 1.5713801 | 0.4854336 | 0.2914040 | ∞ | 112.779 |
| O-02 | 2.0137085 | 1.8570386 | 0.1692298 | 0.0000000 | 19.769 | 10.712 | 1.8736488 | 1.6214601 | 0.4187980 | 0.2236137 | ∞ | 123.410 |
| O-03 | 2.0138528 | 1.8235025 | 0.2017386 | 0.0000000 | 17.865 | 7.804 | 1.8102373 | 1.5635625 | 0.3414049 | 0.1677940 | ∞ | 168.248 |
| O-04 | 1.7601648 | 1.6983496 | 0.1119901 | 0.0303031 | 126.487 | 88.260 | 1.7138036 | 1.5827428 | 0.2283988 | 0.1382962 | ∞ | 225.124 |
| O-05 | 1.7544396 | 1.6860997 | 0.1012182 | 0.0385571 | ∞ | 154.116 | 1.7154614 | 1.6252636 | 0.2006792 | 0.1246148 | 274.983 | 227.613 |
| O-06 | 1.7098650 | 1.6770281 | 0.1041241 | 0.0670294 | 230.527 | 210.197 | 1.7033404 | 1.6188250 | 0.3292182 | 0.2099482 | 150.644 | 126.709 |
| O-07 | 1.7222565 | 1.6392279 | 0.1141065 | 0.0377210 | ∞ | 179.876 | 1.9211460 | 1.6039157 | 0.3222769 | 0.1379226 | ∞ | 173.494 |
| O-08 | 1.7522796 | 1.6377117 | 0.1133124 | 0.0260626 | ∞ | 157.760 | 1.9204984 | 1.5467472 | 0.3006841 | 0.1064385 | ∞ | 182.190 |
| O-09 | 1.7663100 | 1.6433510 | 0.1109379 | 0.0179460 | ∞ | 159.565 | 1.9769323 | 1.4791027 | 0.3759903 | 0.1009452 | ∞ | 167.431 |

TABLE 13-P

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| P-01 | 1.9886417 | 1.8586649 | 0.2168535 | 0.0622660 | 21.146 | 13.418 | 1.8144820 | 1.5830794 | 0.5150047 | 0.3225034 | ∞ | 107.185 |
| P-02 | 2.0226615 | 1.8700565 | 0.1708931 | 0.0000000 | 19.341 | 10.943 | 1.8760551 | 1.6269706 | 0.4346485 | 0.2414002 | ∞ | 119.778 |
| P-03 | 2.0146852 | 1.8302919 | 0.2026225 | 0.0000000 | 17.790 | 8.150 | 1.8068544 | 1.5608059 | 0.3505465 | 0.1784969 | ∞ | 165.499 |
| P-04 | 1.7592341 | 1.7024556 | 0.1101813 | 0.0325910 | 117.465 | 89.126 | 1.7088649 | 1.5853419 | 0.2301093 | 0.1471381 | ∞ | 218.551 |
| P-05 | 1.7520015 | 1.6881722 | 0.0972790 | 0.0422326 | ∞ | 154.401 | 1.7076826 | 1.6341292 | 0.2024884 | 0.1311199 | 262.818 | 222.098 |
| P-06 | 1.7202854 | 1.6494310 | 0.1139740 | 0.0400397 | ∞ | 180.952 | 1.9227304 | 1.5993051 | 0.3229419 | 0.1415112 | ∞ | 158.449 |
| P-07 | 1.7531211 | 1.6359543 | 0.1129882 | 0.0276769 | ∞ | 161.129 | 1.9283125 | 1.5509749 | 0.3007735 | 0.1132394 | ∞ | 171.437 |
| P-08 | 1.7588209 | 1.6651307 | 0.1168101 | 0.0541222 | ∞ | 248.704 | 1.9315321 | 1.4570680 | 0.4662918 | 0.1750504 | ∞ | 99.190 |
| P-09 | 1.7670193 | 1.6441934 | 0.1112618 | 0.0177193 | ∞ | 159.536 | 1.9788106 | 1.4760433 | 0.3800825 | 0.1068427 | ∞ | 161.759 |

TABLE 13-Q

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-01 | 2.0299629 | 1.8795650 | 0.1824437 | 0.0030821 | 18.478 | 10.745 | 1.8549548 | 1.6100341 | 0.4371519 | 0.2549656 | ∞ | 117.201 |
| Q-02 | 2.0241822 | 1.8402063 | 0.2104778 | 0.0000000 | 17.050 | 8.091 | 1.7978402 | 1.5552364 | 0.3542628 | 0.1872645 | ∞ | 156.884 |
| Q-03 | 2.0003468 | 1.8759108 | 0.2255479 | 0.0756028 | 19.996 | 13.232 | 1.7941019 | 1.5719596 | 0.5267302 | 0.3493046 | ∞ | 100.638 |
| Q-04 | 1.7575390 | 1.7066881 | 0.1073040 | 0.0369781 | 110.062 | 89.912 | 1.7021137 | 1.5868305 | 0.2290280 | 0.1553110 | ∞ | 208.877 |
| Q-05 | 1.7492067 | 1.6897987 | 0.0912703 | 0.0482051 | ∞ | 154.337 | 1.6999394 | 1.6416642 | 0.1981843 | 0.1369514 | 241.011 | 215.366 |
| Q-06 | 1.7509212 | 1.6412923 | 0.1130844 | 0.0286313 | ∞ | 163.308 | 1.9350926 | 1.5513707 | 0.3031575 | 0.1183247 | ∞ | 161.219 |
| Q-07 | 1.7508595 | 1.6412538 | 0.1130854 | 0.0286152 | ∞ | 163.300 | 1.9348833 | 1.5512578 | 0.3031544 | 0.1183046 | ∞ | 161.239 |
| Q-08 | 1.7507785 | 1.6689401 | 0.1147477 | 0.0543205 | ∞ | 246.802 | 1.8962359 | 1.4286565 | 0.4917045 | 0.1834073 | ∞ | 98.263 |
| Q-09 | 1.7662458 | 1.6457575 | 0.1116673 | 0.0200852 | ∞ | 159.401 | 1.9890462 | 1.4730025 | 0.3858334 | 0.1112594 | ∞ | 153.058 |

TABLE 13-R

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| R-01 | 2.0097821 | 1.8916937 | 0.2374473 | 0.0898814 | 18.630 | 12.843 | 1.7577288 | 1.5453582 | 0.5218639 | 0.3655761 | ∞ | 90.971 |
| R-02 | 2.0317871 | 1.8838318 | 0.1969310 | 0.0159166 | 17.716 | 10.512 | 1.8267181 | 1.5838873 | 0.4329416 | 0.2622885 | ∞ | 114.131 |
| R-03 | 2.0272958 | 1.8456368 | 0.2145425 | 0.0010647 | 16.701 | 8.140 | 1.7921077 | 1.5515315 | 0.3569974 | 0.1929557 | ∞ | 144.106 |
| R-04 | 1.7559299 | 1.7096201 | 0.1048919 | 0.0414837 | 107.586 | 90.423 | 1.6965353 | 1.5838925 | 0.2274480 | 0.1602031 | 251.078 | 196.592 |
| R-05 | 1.7470392 | 1.6919122 | 0.0867264 | 0.0547244 | ∞ | 154.865 | 1.6946707 | 1.6466544 | 0.1948761 | 0.1398883 | 228.954 | 207.100 |
| R-06 | 1.7480930 | 1.6471592 | 0.1133882 | 0.0300691 | ∞ | 164.480 | 1.9459815 | 1.5501490 | 0.3044638 | 0.1242550 | ∞ | 156.144 |
| R-07 | 1.7450449 | 1.6336325 | 0.1109200 | 0.0225424 | ∞ | 91.792 | 1.9298992 | 1.5646257 | 0.2873729 | 0.1011132 | ∞ | 203.019 |
| R-08 | 1.7645838 | 1.6472315 | 0.1126210 | 0.0142994 | ∞ | 94.011 | 1.9816561 | 1.4913973 | 0.3724489 | 0.0922621 | ∞ | 182.149 |

TABLE 13-S

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-01 | 2.0234818 | 1.8815995 | 0.2048329 | 0.0333400 | 17.816 | 10.851 | 1.8108235 | 1.5680879 | 0.4373710 | 0.2682193 | ∞ | 106.956 |
| S-02 | 2.0267707 | 1.8481781 | 0.2132843 | 0.0026532 | 16.764 | 8.330 | 1.7921736 | 1.5506917 | 0.3624059 | 0.1965173 | ∞ | 136.736 |
| S-03 | 2.0229843 | 1.8126107 | 0.2118548 | 0.0000000 | 17.006 | 6.626 | 1.7962684 | 1.5649109 | 0.3200096 | 0.1552012 | ∞ | 158.532 |
| S-04 | 1.7559883 | 1.7112226 | 0.1042793 | 0.0434834 | 106.889 | 90.807 | 1.6957276 | 1.5823169 | 0.2295992 | 0.1619821 | 239.298 | 187.719 |
| S-05 | 1.7655105 | 1.7004311 | 0.1139102 | 0.0260367 | 134.109 | 87.275 | 1.7577518 | 1.5898417 | 0.2210292 | 0.1292055 | ∞ | 200.383 |
| S-06 | 1.7463013 | 1.6945386 | 0.0864150 | 0.0553518 | ∞ | 156.288 | 1.6932296 | 1.6495601 | 0.1984453 | 0.1415312 | 218.344 | 197.813 |
| S-07 | 1.7140522 | 1.6689094 | 0.1067597 | 0.0488666 | 229.606 | 205.298 | 1.7670106 | 1.6354554 | 0.3302382 | 0.1778346 | ∞ | 144.458 |
| S-08 | 1.7449807 | 1.6499404 | 0.1138956 | 0.0341556 | ∞ | 165.967 | 1.8280140 | 1.5472376 | 0.3071992 | 0.1308259 | ∞ | 181.573 |
| S-09 | 1.7451425 | 1.6342221 | 0.1113390 | 0.0250732 | ∞ | 92.591 | 1.9359617 | 1.5636167 | 0.2900348 | 0.1046368 | ∞ | 199.846 |
| S-10 | 1.7652844 | 1.6477526 | 0.1126180 | 0.0173421 | ∞ | 94.523 | 1.9878760 | 1.4904395 | 0.3789348 | 0.0928715 | ∞ | 179.072 |

TABLE 13-T

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| T-01 | 2.0128535 | 1.8776497 | 0.2022309 | 0.0428498 | 18.880 | 11.802 | 1.8188903 | 1.5750170 | 0.4593818 | 0.2783052 | ∞ | 96.261 |
| T-02 | 2.0218484 | 1.8485757 | 0.2087384 | 0.0054266 | 17.299 | 8.781 | 1.7965353 | 1.5504452 | 0.3727229 | 0.2011848 | ∞ | 133.321 |
| T-03 | 2.0201608 | 1.8144088 | 0.2083496 | 0.0000000 | 17.323 | 6.915 | 1.7987967 | 1.5653519 | 0.3266562 | 0.1579587 | ∞ | 147.994 |
| T-04 | 1.7570823 | 1.7125413 | 0.1046922 | 0.0447898 | 107.213 | 91.339 | 1.6962268 | 1.5854626 | 0.2358925 | 0.1647035 | ∞ | 182.628 |
| T-05 | 1.7663411 | 1.7014363 | 0.1140704 | 0.0270819 | 125.645 | 87.790 | 1.7579060 | 1.5932893 | 0.2258950 | 0.1313125 | ∞ | 192.437 |
| T-06 | 1.7463849 | 1.6965582 | 0.0888585 | 0.0538134 | ∞ | 158.010 | 1.6935424 | 1.6497399 | 0.2059822 | 0.1521760 | 209.015 | 188.409 |
| T-07 | 1.7606661 | 1.6760043 | 0.0916389 | 0.0386226 | ∞ | 139.323 | 1.7697079 | 1.6752670 | 0.1867139 | 0.1180749 | ∞ | 249.956 |
| T-08 | 1.7055809 | 1.6708934 | 0.1020233 | 0.0556122 | 227.279 | 207.411 | 1.7418425 | 1.6555925 | 0.3358460 | 0.1979701 | ∞ | 139.124 |
| T-09 | 1.7414172 | 1.6493298 | 0.1148927 | 0.0388429 | ∞ | 167.956 | 1.8282133 | 1.5765470 | 0.3167563 | 0.1356247 | ∞ | 187.138 |
| T-10 | 1.7472262 | 1.6351657 | 0.1130011 | 0.0193292 | ∞ | 95.042 | 1.9328660 | 1.5573191 | 0.2795818 | 0.0886016 | ∞ | 229.523 |
| T-11 | 1.7658246 | 1.6480377 | 0.1126115 | 0.0200944 | ∞ | 148.993 | 1.9961766 | 1.4909764 | 0.3854823 | 0.0943336 | ∞ | 179.765 |

TABLE 14-A

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-01 | 2.141 | 2.006 | 0.075 | 0.000 | 31.254 | 25.519 | 5.876 | 5.233 | 3.362 | 2.751 | 2.251 | 1.807 |
| A-02 | 2.017 | 1.896 | 0.180 | 0.061 | 39.247 | 31.618 | 9.377 | 9.207 | 0.715 | 0.513 | 11.023 | 10.812 |
| A-03 | 1.952 | 1.854 | 0.166 | 0.055 | 35.017 | 26.178 | 2.281 | 2.051 | 0.699 | 0.439 | 70.023 | 58.076 |
| A-04 | 1.943 | 1.843 | 0.155 | 0.028 | 23.926 | 15.560 | 1.832 | 1.635 | 0.412 | 0.253 | ∞ | 125.396 |
| A-05 | 1.957 | 1.821 | 0.171 | 0.009 | 20.211 | 10.679 | 1.773 | 1.577 | 0.320 | 0.185 | ∞ | 142.606 |
| A-06 | 1.964 | 1.810 | 0.149 | 0.000 | 20.519 | 9.259 | 1.809 | 1.603 | 0.293 | 0.152 | ∞ | 182.495 |
| A-07 | 1.701 | 1.683 | 0.068 | 0.043 | 166.410 | 155.941 | 1.721 | 1.694 | 0.188 | 0.139 | 217.552 | 202.082 |
| A-08 | 1.708 | 1.664 | 0.084 | 0.031 | 170.845 | 111.504 | 1.754 | 1.667 | 0.194 | 0.113 | ∞ | 249.694 |
| A-09 | 1.727 | 1.662 | 0.108 | 0.039 | 255.389 | 217.630 | 7.503 | 6.491 | 3.321 | 2.487 | 1.062 | 0.781 |
| A-10 | 1.710 | 1.674 | 0.106 | 0.053 | 226.062 | 206.257 | 1.909 | 1.763 | 0.395 | 0.243 | 100.609 | 81.237 |

TABLE 14-A-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-11 | 1.720 | 1.683 | 0.099 | 0.045 | 229.005 | 200.369 | 1.849 | 1.670 | 0.332 | 0.164 | ∞ | 143.819 |
| A-12 | 1.737 | 1.675 | 0.097 | 0.035 | ∞ | 189.200 | 1.855 | 1.540 | 0.307 | 0.122 | ∞ | 154.002 |
| A-13 | 1.738 | 1.660 | 0.100 | 0.019 | ∞ | 189.609 | 1.900 | 1.583 | 0.271 | 0.102 | ∞ | 185.363 |

TABLE 14-B

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-01 | 1.954 | 1.847 | 0.222 | 0.111 | 41.975 | 34.168 | 9.356 | 9.153 | 0.784 | 0.549 | 10.759 | 10.519 |
| B-02 | 1.946 | 1.852 | 0.156 | 0.037 | 24.164 | 16.466 | 1.841 | 1.650 | 0.442 | 0.280 | ∞ | 119.178 |
| B-03 | 1.957 | 1.828 | 0.171 | 0.015 | 20.222 | 11.264 | 1.772 | 1.579 | 0.334 | 0.198 | ∞ | 137.341 |
| B-04 | 1.966 | 1.817 | 0.149 | 0.000 | 20.345 | 9.664 | 1.809 | 1.602 | 0.302 | 0.162 | ∞ | 178.243 |
| B-05 | 1.703 | 1.667 | 0.081 | 0.035 | 165.590 | 137.726 | 1.744 | 1.674 | 0.195 | 0.120 | ∞ | 243.996 |
| B-06 | 1.708 | 1.661 | 0.102 | 0.051 | 241.533 | 217.317 | 6.262 | 5.366 | 4.338 | 3.555 | 0.986 | 0.720 |
| B-07 | 1.699 | 1.675 | 0.098 | 0.067 | 220.890 | 207.766 | 1.931 | 1.793 | 0.416 | 0.288 | 89.025 | 74.083 |
| B-08 | 1.715 | 1.684 | 0.100 | 0.052 | 225.049 | 201.595 | 1.852 | 1.684 | 0.339 | 0.182 | ∞ | 139.178 |
| B-09 | 1.733 | 1.676 | 0.097 | 0.039 | ∞ | 191.244 | 1.853 | 1.538 | 0.310 | 0.132 | ∞ | 147.776 |
| B-10 | 1.737 | 1.661 | 0.100 | 0.022 | ∞ | 190.979 | 1.902 | 1.584 | 0.275 | 0.107 | ∞ | 179.334 |

TABLE 14-C

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| C-01 | 1.905 | 1.821 | 0.258 | 0.159 | 42.560 | 36.125 | 9.681 | 9.446 | 0.829 | 0.587 | 10.138 | 9.892 |
| C-02 | 1.955 | 1.868 | 0.156 | 0.047 | 24.067 | 17.295 | 1.856 | 1.674 | 0.479 | 0.314 | ∞ | 112.716 |
| C-03 | 1.958 | 1.836 | 0.172 | 0.022 | 20.129 | 11.822 | 1.769 | 1.584 | 0.348 | 0.215 | ∞ | 132.762 |
| C-04 | 1.971 | 1.826 | 0.149 | 0.000 | 19.949 | 9.987 | 1.811 | 1.608 | 0.313 | 0.173 | ∞ | 173.492 |
| C-05 | 1.699 | 1.670 | 0.078 | 0.041 | 161.711 | 144.941 | 1.737 | 1.683 | 0.196 | 0.129 | ∞ | 239.168 |
| C-06 | 1.710 | 1.686 | 0.100 | 0.063 | 216.379 | 202.875 | 1.855 | 1.702 | 0.336 | 0.208 | ∞ | 134.716 |
| C-07 | 1.730 | 1.678 | 0.097 | 0.046 | ∞ | 193.042 | 1.841 | 1.535 | 0.312 | 0.146 | ∞ | 142.289 |
| C-08 | 1.737 | 1.661 | 0.101 | 0.025 | ∞ | 192.539 | 1.910 | 1.588 | 0.280 | 0.114 | ∞ | 200.270 |

TABLE 14-D

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-01 | 1.964 | 1.894 | 0.224 | 0.152 | 33.127 | 28.245 | 2.530 | 2.288 | 0.928 | 0.730 | 46.411 | 39.931 |
| D-02 | 1.964 | 1.886 | 0.160 | 0.061 | 22.917 | 17.267 | 1.833 | 1.667 | 0.492 | 0.344 | ∞ | 107.536 |
| D-03 | 1.959 | 1.843 | 0.175 | 0.031 | 19.812 | 12.114 | 1.762 | 1.583 | 0.359 | 0.229 | ∞ | 154.271 |
| D-04 | 1.975 | 1.834 | 0.149 | 0.000 | 19.537 | 10.202 | 1.812 | 1.611 | 0.320 | 0.182 | ∞ | 167.375 |
| D-05 | 1.694 | 1.673 | 0.073 | 0.048 | 159.270 | 147.983 | 1.732 | 1.691 | 0.195 | 0.145 | 274.107 | 234.670 |
| D-06 | 1.701 | 1.689 | 0.099 | 0.076 | 210.753 | 203.620 | 1.846 | 1.712 | 0.319 | 0.257 | ∞ | 130.894 |
| D-07 | 1.721 | 1.680 | 0.097 | 0.050 | ∞ | 194.085 | 1.812 | 1.528 | 0.315 | 0.159 | ∞ | 179.580 |
| D-08 | 1.734 | 1.662 | 0.101 | 0.027 | ∞ | 194.045 | 1.920 | 1.594 | 0.285 | 0.121 | ∞ | 197.417 |
| D-09 | 1.751 | 1.675 | 0.092 | 0.024 | ∞ | 189.814 | 1.889 | 1.515 | 0.358 | 0.115 | ∞ | 162.566 |

TABLE 14-E

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-01 | 1.979 | 1.934 | 0.223 | 0.198 | 25.447 | 22.431 | 1.937 | 1.871 | 0.813 | 0.724 | 58.954 | 51.905 |
| E-02 | 1.963 | 1.892 | 0.175 | 0.080 | 21.108 | 16.482 | 1.752 | 1.605 | 0.464 | 0.351 | ∞ | 103.951 |
| E-03 | 1.959 | 1.845 | 0.181 | 0.039 | 19.487 | 12.133 | 1.753 | 1.576 | 0.362 | 0.237 | ∞ | 122.545 |
| E-04 | 1.980 | 1.841 | 0.148 | 0.000 | 19.257 | 10.346 | 1.817 | 1.616 | 0.326 | 0.188 | ∞ | 158.102 |
| E-05 | 1.692 | 1.676 | 0.067 | 0.057 | 157.441 | 149.670 | 1.727 | 1.695 | 0.187 | 0.173 | 254.885 | 231.812 |
| E-06 | 1.718 | 1.682 | 0.096 | 0.048 | ∞ | 194.149 | 1.788 | 1.641 | 0.326 | 0.165 | ∞ | 176.978 |
| E-07 | 1.729 | 1.663 | 0.102 | 0.030 | ∞ | 195.371 | 1.929 | 1.601 | 0.290 | 0.127 | ∞ | 195.845 |
| E-08 | 1.749 | 1.676 | 0.091 | 0.025 | ∞ | 190.682 | 1.898 | 1.530 | 0.362 | 0.117 | ∞ | 153.544 |

TABLE 14-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-01 | 1.983 | 1.846 | 0.143 | 0.000 | 19.333 | 10.604 | 1.828 | 1.623 | 0.332 | 0.191 | ∞ | 146.194 |
| F-02 | 1.956 | 1.842 | 0.185 | 0.045 | 19.661 | 12.234 | 1.751 | 1.571 | 0.365 | 0.239 | ∞ | 124.203 |

TABLE 14-F-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-03 | 1.691 | 1.680 | 0.071 | 0.054 | 156.188 | 149.873 | 1.713 | 1.692 | 0.184 | 0.171 | 244.114 | 224.269 |
| F-04 | 1.703 | 1.695 | 0.096 | 0.076 | 207.561 | 203.306 | 1.791 | 1.682 | 0.352 | 0.280 | 149.549 | 121.948 |
| F-05 | 1.726 | 1.686 | 0.105 | 0.063 | 253.974 | 217.847 | 1.691 | 1.585 | 0.284 | 0.201 | 170.132 | 139.231 |
| F-06 | 1.726 | 1.665 | 0.102 | 0.031 | ∞ | 196.531 | 1.935 | 1.606 | 0.294 | 0.130 | ∞ | 191.652 |
| F-07 | 1.740 | 1.662 | 0.097 | 0.021 | ∞ | 170.235 | 1.919 | 1.543 | 0.280 | 0.102 | ∞ | 197.142 |
| F-08 | 1.751 | 1.653 | 0.092 | 0.015 | ∞ | 166.884 | 1.925 | 1.498 | 0.278 | 0.095 | ∞ | 190.724 |

TABLE 14-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| G-01 | 1.933 | 1.873 | 0.202 | 0.122 | 20.550 | 16.700 | 1.633 | 1.511 | 0.430 | 0.344 | ∞ | 91.266 |
| G-02 | 1.953 | 1.839 | 0.184 | 0.046 | 20.523 | 12.791 | 1.761 | 1.579 | 0.380 | 0.246 | ∞ | 127.980 |
| G-03 | 1.985 | 1.852 | 0.136 | 0.000 | 19.818 | 11.204 | 1.845 | 1.638 | 0.344 | 0.196 | ∞ | 136.666 |
| G-04 | 1.975 | 1.816 | 0.174 | 0.000 | 18.551 | 8.554 | 1.780 | 1.585 | 0.283 | 0.150 | ∞ | 158.294 |
| G-05 | 1.746 | 1.710 | 0.081 | 0.037 | 136.285 | 98.008 | 1.699 | 1.620 | 0.175 | 0.131 | 278.211 | 243.285 |
| G-06 | 1.724 | 1.686 | 0.105 | 0.064 | 247.645 | 218.101 | 1.689 | 1.586 | 0.286 | 0.205 | 159.193 | 130.698 |
| G-07 | 1.724 | 1.666 | 0.101 | 0.031 | ∞ | 197.493 | 1.934 | 1.609 | 0.296 | 0.130 | ∞ | 183.027 |
| G-08 | 1.741 | 1.661 | 0.097 | 0.021 | ∞ | 171.385 | 1.918 | 1.542 | 0.281 | 0.101 | ∞ | 188.504 |

TABLE 14-H

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-01 | 1.951 | 1.842 | 0.181 | 0.048 | 21.358 | 13.627 | 1.774 | 1.592 | 0.403 | 0.263 | ∞ | 123.537 |
| H-02 | 1.984 | 1.857 | 0.134 | 0.000 | 20.311 | 11.922 | 1.856 | 1.651 | 0.360 | 0.208 | ∞ | 130.884 |
| H-03 | 1.974 | 1.818 | 0.175 | 0.000 | 18.650 | 8.869 | 1.776 | 1.582 | 0.289 | 0.157 | ∞ | 183.486 |
| H-04 | 1.746 | 1.712 | 0.079 | 0.042 | 135.917 | 98.660 | 1.696 | 1.624 | 0.178 | 0.137 | 265.927 | 237.438 |
| H-05 | 1.725 | 1.688 | 0.106 | 0.068 | 245.491 | 218.637 | 1.688 | 1.581 | 0.280 | 0.214 | 149.336 | 121.404 |
| H-06 | 1.724 | 1.667 | 0.102 | 0.033 | ∞ | 198.178 | 1.931 | 1.605 | 0.296 | 0.132 | ∞ | 172.147 |
| H-07 | 1.740 | 1.661 | 0.097 | 0.022 | ∞ | 171.868 | 1.916 | 1.542 | 0.282 | 0.105 | ∞ | 178.623 |

TABLE 14-I

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| I-01 | 1.955 | 1.853 | 0.178 | 0.053 | 21.482 | 14.427 | 1.777 | 1.605 | 0.429 | 0.289 | ∞ | 118.585 |
| I-02 | 1.983 | 1.862 | 0.137 | 0.000 | 20.338 | 12.369 | 1.851 | 1.653 | 0.373 | 0.223 | ∞ | 127.262 |
| I-03 | 1.976 | 1.827 | 0.171 | 0.000 | 18.582 | 9.315 | 1.779 | 1.583 | 0.299 | 0.167 | ∞ | 178.673 |
| I-04 | 1.693 | 1.659 | 0.071 | 0.062 | 156.116 | 108.678 | 1.766 | 1.688 | 0.166 | 0.129 | 252.906 | 249.872 |
| I-05 | 1.725 | 1.667 | 0.102 | 0.036 | 252.664 | 198.579 | 1.934 | 1.600 | 0.298 | 0.138 | ∞ | 164.058 |
| I-06 | 1.738 | 1.662 | 0.098 | 0.022 | ∞ | 175.267 | 1.919 | 1.543 | 0.284 | 0.111 | ∞ | 173.633 |
| I-07 | 1.752 | 1.653 | 0.092 | 0.016 | ∞ | 172.533 | 1.830 | 1.507 | 0.291 | 0.108 | ∞ | 172.262 |

TABLE 14-J

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| J-01 | 1.964 | 1.874 | 0.179 | 0.062 | 20.729 | 14.862 | 1.767 | 1.609 | 0.449 | 0.320 | ∞ | 113.506 |
| J-02 | 1.983 | 1.867 | 0.146 | 0.004 | 19.885 | 12.520 | 1.831 | 1.641 | 0.380 | 0.238 | ∞ | 124.690 |
| J-03 | 1.982 | 1.838 | 0.168 | 0.000 | 18.297 | 9.652 | 1.783 | 1.584 | 0.309 | 0.178 | ∞ | 172.558 |
| J-04 | 1.725 | 1.666 | 0.103 | 0.041 | 250.100 | 198.830 | 1.944 | 1.598 | 0.303 | 0.149 | ∞ | 157.077 |
| J-05 | 1.737 | 1.663 | 0.098 | 0.024 | ∞ | 185.832 | 1.927 | 1.559 | 0.288 | 0.117 | ∞ | 167.184 |
| J-06 | 1.752 | 1.658 | 0.091 | 0.019 | ∞ | 180.136 | 1.847 | 1.512 | 0.296 | 0.113 | ∞ | 165.978 |

TABLE 14-K

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-01 | 1.973 | 1.893 | 0.185 | 0.078 | 19.455 | 14.744 | 1.741 | 1.596 | 0.453 | 0.345 | ∞ | 107.965 |
| K-02 | 1.983 | 1.872 | 0.156 | 0.017 | 19.144 | 12.421 | 1.806 | 1.623 | 0.379 | 0.249 | ∞ | 122.284 |
| K-03 | 1.987 | 1.847 | 0.167 | 0.000 | 17.845 | 9.756 | 1.782 | 1.583 | 0.315 | 0.187 | ∞ | 164.682 |
| K-04 | 1.719 | 1.655 | 0.093 | 0.039 | ∞ | 107.765 | 1.782 | 1.640 | 0.185 | 0.106 | ∞ | 240.729 |
| K-05 | 1.723 | 1.669 | 0.104 | 0.045 | 247.764 | 205.861 | 1.753 | 1.603 | 0.311 | 0.163 | ∞ | 150.727 |

TABLE 14-K-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-06 | 1.736 | 1.664 | 0.099 | 0.026 | ∞ | 188.964 | 1.938 | 1.577 | 0.293 | 0.122 | ∞ | 190.206 |
| K-07 | 1.751 | 1.660 | 0.091 | 0.021 | ∞ | 182.620 | 1.860 | 1.505 | 0.298 | 0.117 | ∞ | 157.223 |

TABLE 14-L

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-01 | 1.974 | 1.903 | 0.194 | 0.095 | 18.537 | 14.577 | 1.708 | 1.572 | 0.448 | 0.357 | ∞ | 99.374 |
| L-02 | 1.983 | 1.876 | 0.163 | 0.028 | 18.641 | 12.379 | 1.790 | 1.608 | 0.378 | 0.255 | ∞ | 118.240 |
| L-03 | 1.989 | 1.851 | 0.171 | 0.000 | 17.506 | 9.747 | 1.776 | 1.579 | 0.316 | 0.190 | ∞ | 154.295 |
| L-04 | 1.719 | 1.657 | 0.093 | 0.043 | 176.125 | 108.056 | 1.773 | 1.640 | 0.184 | 0.115 | ∞ | 239.447 |
| L-05 | 1.720 | 1.674 | 0.104 | 0.048 | 245.819 | 210.037 | 1.745 | 1.616 | 0.323 | 0.176 | ∞ | 146.164 |
| L-06 | 1.728 | 1.664 | 0.099 | 0.029 | ∞ | 190.492 | 1.826 | 1.594 | 0.297 | 0.128 | ∞ | 188.671 |
| L-07 | 1.750 | 1.664 | 0.099 | 0.023 | ∞ | 185.642 | 1.931 | 1.560 | 0.283 | 0.103 | ∞ | 203.385 |
| L-08 | 1.770 | 1.647 | 0.090 | 0.020 | ∞ | 181.694 | 1.851 | 1.519 | 0.279 | 0.095 | ∞ | 188.718 |

TABLE 14-M

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| M-01 | 1.981 | 1.878 | 0.162 | 0.035 | 19.040 | 12.910 | 1.795 | 1.610 | 0.389 | 0.261 | ∞ | 109.327 |
| M-02 | 1.985 | 1.850 | 0.173 | 0.004 | 17.738 | 9.987 | 1.771 | 1.575 | 0.319 | 0.192 | ∞ | 144.773 |
| M-03 | 1.982 | 1.819 | 0.169 | 0.000 | 18.242 | 8.329 | 1.785 | 1.592 | 0.285 | 0.153 | ∞ | 164.318 |
| M-04 | 1.717 | 1.677 | 0.103 | 0.051 | 233.783 | 211.731 | 1.724 | 1.634 | 0.337 | 0.187 | ∞ | 140.585 |
| M-05 | 1.723 | 1.665 | 0.099 | 0.034 | ∞ | 191.269 | 1.797 | 1.609 | 0.302 | 0.133 | ∞ | 192.523 |
| M-06 | 1.749 | 1.664 | 0.099 | 0.026 | ∞ | 186.782 | 1.934 | 1.561 | 0.285 | 0.104 | ∞ | 198.444 |
| M-07 | 1.772 | 1.645 | 0.090 | 0.022 | ∞ | 182.830 | 1.851 | 1.521 | 0.282 | 0.097 | ∞ | 183.298 |

TABLE 14-N

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| N-01 | 1.980 | 1.881 | 0.157 | 0.036 | 20.158 | 14.003 | 1.818 | 1.632 | 0.415 | 0.275 | ∞ | 119.641 |
| N-02 | 1.980 | 1.848 | 0.174 | 0.011 | 18.254 | 10.450 | 1.767 | 1.571 | 0.327 | 0.197 | ∞ | 139.482 |
| N-03 | 1.979 | 1.820 | 0.167 | 0.000 | 18.627 | 8.694 | 1.787 | 1.592 | 0.291 | 0.157 | ∞ | 181.534 |
| N-04 | 1.708 | 1.676 | 0.100 | 0.054 | 231.071 | 211.497 | 1.721 | 1.649 | 0.345 | 0.200 | 160.527 | 134.106 |
| N-05 | 1.720 | 1.666 | 0.099 | 0.038 | ∞ | 191.698 | 1.802 | 1.619 | 0.308 | 0.145 | ∞ | 186.758 |
| N-06 | 1.748 | 1.665 | 0.100 | 0.028 | ∞ | 188.144 | 1.933 | 1.561 | 0.288 | 0.109 | ∞ | 191.540 |
| N-07 | 1.771 | 1.644 | 0.090 | 0.024 | ∞ | 184.314 | 1.854 | 1.522 | 0.286 | 0.100 | ∞ | 174.816 |

TABLE 14-O

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-01 | 1.986 | 1.892 | 0.151 | 0.037 | 20.946 | 15.073 | 1.846 | 1.665 | 0.451 | 0.301 | ∞ | 113.921 |
| O-02 | 1.976 | 1.851 | 0.174 | 0.018 | 18.588 | 10.996 | 1.763 | 1.571 | 0.339 | 0.209 | ∞ | 135.398 |
| O-03 | 1.980 | 1.826 | 0.165 | 0.000 | 18.692 | 9.087 | 1.789 | 1.591 | 0.301 | 0.166 | ∞ | 177.745 |
| O-04 | 1.705 | 1.676 | 0.099 | 0.060 | 227.547 | 210.480 | 1.722 | 1.652 | 0.337 | 0.217 | 149.574 | 128.876 |
| O-05 | 1.718 | 1.666 | 0.100 | 0.040 | ∞ | 192.120 | 1.834 | 1.629 | 0.312 | 0.151 | ∞ | 178.069 |
| O-06 | 1.747 | 1.665 | 0.100 | 0.029 | ∞ | 189.864 | 1.910 | 1.562 | 0.289 | 0.109 | ∞ | 189.584 |
| O-07 | 1.770 | 1.645 | 0.089 | 0.025 | ∞ | 185.926 | 1.858 | 1.520 | 0.291 | 0.103 | ∞ | 169.414 |

TABLE 14-P

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| P-01 | 2.001 | 1.914 | 0.148 | 0.045 | 20.691 | 15.556 | 1.861 | 1.690 | 0.481 | 0.336 | ∞ | 109.768 |
| P-02 | 1.978 | 1.859 | 0.176 | 0.025 | 18.424 | 11.376 | 1.756 | 1.574 | 0.351 | 0.225 | ∞ | 131.712 |
| P-03 | 1.985 | 1.836 | 0.164 | 0.000 | 18.356 | 9.363 | 1.791 | 1.591 | 0.310 | 0.176 | ∞ | 172.718 |
| P-04 | 1.707 | 1.685 | 0.101 | 0.067 | 225.238 | 212.673 | 1.715 | 1.643 | 0.328 | 0.223 | 139.199 | 120.241 |
| P-05 | 1.716 | 1.666 | 0.100 | 0.040 | 231.093 | 192.697 | 1.840 | 1.628 | 0.314 | 0.151 | ∞ | 167.595 |
| P-06 | 1.745 | 1.666 | 0.101 | 0.030 | ∞ | 191.630 | 1.889 | 1.562 | 0.290 | 0.115 | ∞ | 179.119 |
| P-07 | 1.770 | 1.653 | 0.089 | 0.027 | ∞ | 187.468 | 1.864 | 1.515 | 0.295 | 0.110 | ∞ | 164.223 |

TABLE 14-Q

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-01 | 2.020 | 1.942 | 0.150 | 0.058 | 19.257 | 15.087 | 1.832 | 1.680 | 0.483 | 0.365 | ∞ | 111.992 |
| Q-02 | 1.981 | 1.867 | 0.182 | 0.033 | 17.848 | 11.461 | 1.743 | 1.570 | 0.357 | 0.239 | ∞ | 128.672 |
| Q-03 | 1.991 | 1.846 | 0.165 | 0.000 | 17.802 | 9.465 | 1.790 | 1.590 | 0.316 | 0.186 | ∞ | 166.465 |
| Q-04 | 1.707 | 1.692 | 0.103 | 0.077 | 223.701 | 215.120 | 1.677 | 1.625 | 0.321 | 0.252 | 127.631 | 109.461 |
| Q-05 | 1.716 | 1.665 | 0.101 | 0.041 | 230.268 | 195.890 | 1.826 | 1.625 | 0.315 | 0.151 | ∞ | 158.121 |
| Q-06 | 1.744 | 1.667 | 0.101 | 0.031 | ∞ | 193.216 | 1.887 | 1.561 | 0.292 | 0.120 | ∞ | 161.210 |
| Q-07 | 1.770 | 1.657 | 0.088 | 0.030 | ∞ | 188.863 | 1.872 | 1.509 | 0.295 | 0.115 | ∞ | 156.975 |

TABLE 14-R

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| R-01 | 1.982 | 1.873 | 0.188 | 0.044 | 17.244 | 11.395 | 1.730 | 1.562 | 0.359 | 0.249 | ∞ | 128.127 |
| R-02 | 1.997 | 1.854 | 0.166 | 0.000 | 17.308 | 9.486 | 1.790 | 1.589 | 0.319 | 0.193 | ∞ | 156.903 |
| R-03 | 1.715 | 1.666 | 0.102 | 0.044 | 229.740 | 201.461 | 1.771 | 1.630 | 0.318 | 0.159 | ∞ | 151.088 |
| R-04 | 1.743 | 1.668 | 0.102 | 0.032 | ∞ | 194.630 | 1.836 | 1.559 | 0.293 | 0.124 | ∞ | 157.464 |
| R-05 | 1.760 | 1.658 | 0.090 | 0.018 | ∞ | 174.558 | 1.900 | 1.518 | 0.259 | 0.097 | ∞ | 192.992 |

TABLE 14-S

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-01 | 1.981 | 1.875 | 0.190 | 0.055 | 17.148 | 11.532 | 1.725 | 1.558 | 0.365 | 0.256 | ∞ | 125.060 |
| S-02 | 1.996 | 1.857 | 0.163 | 0.000 | 17.446 | 9.791 | 1.797 | 1.592 | 0.327 | 0.198 | ∞ | 143.864 |
| S-03 | 1.994 | 1.834 | 0.168 | 0.000 | 17.407 | 8.458 | 1.791 | 1.590 | 0.286 | 0.157 | ∞ | 171.207 |
| S-04 | 1.713 | 1.670 | 0.103 | 0.051 | 228.093 | 205.012 | 1.767 | 1.647 | 0.323 | 0.178 | ∞ | 144.997 |
| S-05 | 1.742 | 1.669 | 0.102 | 0.037 | ∞ | 195.805 | 1.825 | 1.558 | 0.294 | 0.130 | ∞ | 180.034 |
| S-06 | 1.742 | 1.666 | 0.097 | 0.026 | ∞ | 178.602 | 1.857 | 1.570 | 0.281 | 0.104 | ∞ | 199.693 |
| S-07 | 1.760 | 1.659 | 0.090 | 0.022 | ∞ | 175.003 | 1.904 | 1.518 | 0.262 | 0.096 | ∞ | 186.949 |

TABLE 14-T

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| T-01 | 1.978 | 1.874 | 0.186 | 0.059 | 17.817 | 12.124 | 1.731 | 1.564 | 0.381 | 0.265 | ∞ | 125.465 |
| T-02 | 1.992 | 1.857 | 0.158 | 0.000 | 18.151 | 10.391 | 1.806 | 1.602 | 0.338 | 0.202 | ∞ | 136.447 |
| T-03 | 1.990 | 1.833 | 0.167 | 0.000 | 17.811 | 8.783 | 1.791 | 1.588 | 0.291 | 0.159 | ∞ | 180.411 |
| T-04 | 1.700 | 1.671 | 0.098 | 0.062 | 226.068 | 207.088 | 1.746 | 1.669 | 0.321 | 0.212 | ∞ | 144.423 |
| T-05 | 1.743 | 1.670 | 0.102 | 0.044 | 265.367 | 196.420 | 1.815 | 1.556 | 0.294 | 0.142 | ∞ | 187.001 |
| T-06 | 1.742 | 1.666 | 0.097 | 0.030 | ∞ | 183.526 | 1.856 | 1.571 | 0.282 | 0.108 | ∞ | 202.896 |
| T-07 | 1.760 | 1.661 | 0.090 | 0.025 | ∞ | 175.348 | 1.912 | 1.519 | 0.268 | 0.102 | ∞ | 181.779 |

TABLE 15-A

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| A-01 | 2.109 | 1.990 | 0.055 | 0.000 | 32.767 | 27.509 | 6.594 | 5.978 | 3.556 | 3.013 | 1.715 | 1.418 |
| A-02 | 1.929 | 1.877 | 0.138 | 0.089 | 31.708 | 26.309 | 2.028 | 1.933 | 0.507 | 0.403 | 83.056 | 75.266 |
| A-03 | 1.924 | 1.852 | 0.136 | 0.036 | 21.551 | 15.640 | 1.750 | 1.627 | 0.335 | 0.242 | ∞ | 136.202 |
| A-04 | 1.935 | 1.835 | 0.123 | 0.000 | 20.868 | 12.771 | 1.789 | 1.639 | 0.292 | 0.188 | ∞ | 175.723 |
| A-05 | 1.940 | 1.823 | 0.124 | 0.000 | 20.183 | 10.913 | 1.793 | 1.618 | 0.258 | 0.152 | ∞ | 191.206 |
| A-06 | 1.703 | 1.685 | 0.080 | 0.051 | 169.125 | 157.974 | 1.696 | 1.666 | 0.202 | 0.150 | 213.501 | 194.001 |
| A-07 | 1.707 | 1.664 | 0.084 | 0.029 | 171.143 | 129.944 | 1.748 | 1.665 | 0.195 | 0.115 | ∞ | 249.665 |
| A-08 | 1.725 | 1.704 | 0.082 | 0.049 | 250.745 | 235.697 | 7.849 | 7.185 | 3.465 | 2.625 | 0.893 | 0.721 |
| A-09 | 1.738 | 1.690 | 0.082 | 0.029 | ∞ | 215.124 | 1.818 | 1.613 | 0.264 | 0.129 | ∞ | 179.167 |
| A-10 | 1.736 | 1.688 | 0.079 | 0.022 | ∞ | 204.319 | 1.809 | 1.611 | 0.246 | 0.105 | ∞ | 225.188 |
| A-11 | 1.731 | 1.655 | 0.080 | 0.025 | ∞ | 220.771 | 1.808 | 1.623 | 0.237 | 0.115 | ∞ | 175.645 |

TABLE 15-B

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-01 | 1.997 | 1.902 | 0.155 | 0.064 | 38.478 | 32.365 | 6.640 | 5.695 | 5.267 | 4.500 | 1.189 | 0.912 |
| B-02 | 1.925 | 1.861 | 0.135 | 0.044 | 21.745 | 16.569 | 1.749 | 1.636 | 0.354 | 0.266 | ∞ | 129.925 |
| B-03 | 1.936 | 1.842 | 0.124 | 0.004 | 20.735 | 13.305 | 1.787 | 1.643 | 0.304 | 0.202 | ∞ | 173.046 |

TABLE 15-B-continued

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| B-04 | 1.942 | 1.830 | 0.122 | 0.000 | 20.064 | 11.354 | 1.793 | 1.623 | 0.266 | 0.162 | ∞ | 186.094 |
| B-05 | 1.700 | 1.690 | 0.079 | 0.061 | 166.973 | 161.165 | 1.688 | 1.668 | 0.197 | 0.165 | 199.493 | 188.055 |
| B-06 | 1.703 | 1.667 | 0.082 | 0.033 | 165.499 | 138.474 | 1.740 | 1.670 | 0196 | 0.121 | ∞ | 244.077 |
| B-07 | 1.736 | 1.690 | 0.079 | 0.024 | ∞ | 207.206 | 1.797 | 1.616 | 0.249 | 0.111 | ∞ | 220.690 |
| B-08 | 1.711 | 1.709 | 0.079 | 0.074 | 235.852 | 234.721 | 6.407 | 6.233 | 4.693 | 3.940 | 0.732 | 0.720 |
| B-09 | 1.737 | 1.692 | 0.082 | 0.033 | ∞ | 216.211 | 1.814 | 1.613 | 0.270 | 0.138 | ∞ | 173.495 |
| B-10 | 1.730 | 1.658 | 0.080 | 0.029 | ∞ | 222.458 | 1.798 | 1.629 | 0.240 | 0.122 | ∞ | 171.776 |

TABLE 15-C

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| C-01 | 1.927 | 1.873 | 0.135 | 0.055 | 21.683 | 17.423 | 1.744 | 1.647 | 0.374 | 0.295 | ∞ | 124.317 |
| C-02 | 1.939 | 1.852 | 0.123 | 0.011 | 20.446 | 13.775 | 1.786 | 1.650 | 0.316 | 0.218 | ∞ | 167.810 |
| C-03 | 1.945 | 1.839 | 0.119 | 0.000 | 19.836 | 11.786 | 1.794 | 1.632 | 0.276 | 0.173 | ∞ | 181.193 |
| C-04 | 1.699 | 1.671 | 0.079 | 0.039 | 161.921 | 145.560 | 1.735 | 1.679 | 0.196 | 0.130 | ∞ | 239.270 |
| C-05 | 1.735 | 1.694 | 0.082 | 0.038 | 270.295 | 217.505 | 1.754 | 1.615 | 0.276 | 0.149 | ∞ | 167.329 |
| C-06 | 1.735 | 1.692 | 0.078 | 0.026 | ∞ | 209.346 | 1.781 | 1.622 | 0.252 | 0.118 | ∞ | 214.946 |

TABLE 15-D

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| D-01 | 1.928 | 1.886 | 0.137 | 0.069 | 21.026 | 17.768 | 1.723 | 1.643 | 0.382 | 0.323 | ∞ | 119.322 |
| D-02 | 1.943 | 1.862 | 0.123 | 0.018 | 19.960 | 14.046 | 1.784 | 1.655 | 0.326 | 0.234 | ∞ | 160.895 |
| D-03 | 1.947 | 1.846 | 0.120 | 0.000 | 19.411 | 12.019 | 1.789 | 1.634 | 0.281 | 0.182 | ∞ | 176.028 |
| D-04 | 1.695 | 1.674 | 0.075 | 0.046 | 159.493 | 148.447 | 1.731 | 1.687 | 0.195 | 0.141 | 273.632 | 234.699 |
| D-05 | 1.732 | 1.696 | 0.081 | 0.042 | 266.580 | 218.746 | 1.745 | 1.620 | 0.283 | 0.159 | ∞ | 160.070 |
| D-06 | 1.734 | 1.693 | 0.078 | 0.027 | ∞ | 210.617 | 1.767 | 1.630 | 0.252 | 0.123 | ∞ | 206.982 |
| D-07 | 1.723 | 1.660 | 0.082 | 0.031 | ∞ | 221.552 | 1.832 | 1.613 | 0.241 | 0.108 | ∞ | 177.439 |

TABLE 15-E

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| E-01 | 1.925 | 1.891 | 0.144 | 0.087 | 19.955 | 17.523 | 1.686 | 1.619 | 0.377 | 0.336 | 127.104 | 114.397 |
| E-02 | 1.947 | 1.870 | 0.124 | 0.024 | 19.462 | 14.081 | 1.783 | 1.656 | 0.330 | 0.244 | ∞ | 150.903 |
| E-03 | 1.947 | 1.849 | 0.124 | 0.000 | 18.998 | 12.045 | 1.778 | 1.625 | 0.281 | 0.186 | ∞ | 169.614 |
| E-04 | 1.692 | 1.677 | 0.069 | 0.054 | 157.553 | 150.032 | 1.727 | 1.693 | 0.190 | 0.164 | 253.769 | 229.862 |
| E-05 | 1.729 | 1.698 | 0.080 | 0.044 | 251.532 | 219.912 | 1.728 | 1.628 | 0.292 | 0.167 | ∞ | 150.571 |
| E-06 | 1.728 | 1.694 | 0.077 | 0.029 | ∞ | 210.961 | 1.757 | 1.639 | 0.250 | 0.125 | ∞ | 199.775 |
| E-07 | 1.753 | 1.654 | 0.078 | 0.021 | ∞ | 211.857 | 1.912 | 1.611 | 0.220 | 0.096 | ∞ | 202.106 |

TABLE 15-F

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| F-01 | 1.950 | 1.875 | 0.122 | 0.025 | 19.494 | 14.295 | 1.792 | 1.662 | 0.337 | 0.249 | ∞ | 138.575 |
| F-02 | 1.943 | 1.846 | 0.132 | 0.004 | 18.898 | 12.042 | 1.763 | 1.612 | 0.279 | 0.186 | ∞ | 161.008 |
| F-03 | 1.724 | 1.699 | 0.079 | 0.045 | 247.964 | 221.101 | 1.721 | 1.638 | 0.301 | 0.176 | 172.085 | 143.974 |
| F-04 | 1.723 | 1.693 | 0.077 | 0.033 | ∞ | 210.599 | 1.752 | 1.648 | 0.247 | 0.128 | ∞ | 199.200 |
| F-05 | 1.740 | 1.693 | 0.077 | 0.030 | ∞ | 206.669 | 1.799 | 1.579 | 0.230 | 0.106 | ∞ | 203.487 |
| F-06 | 1.750 | 1.656 | 0.078 | 0.022 | ∞ | 213.947 | 1.923 | 1.614 | 0.223 | 0.097 | ∞ | 191.019 |

TABLE 15-G

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| G-01 | 1.955 | 1.881 | 0.116 | 0.024 | 20.279 | 15.118 | 1.816 | 1.683 | 0.355 | 0.259 | ∞ | 132.898 |
| G-02 | 1.937 | 1.842 | 0.138 | 0.011 | 19.161 | 12.240 | 1.751 | 1.603 | 0.280 | 0.188 | ∞ | 152.054 |
| G-03 | 1.947 | 1.823 | 0.131 | 0.000 | 19.228 | 10.142 | 1.783 | 1.616 | 0.254 | 0.151 | ∞ | 192.936 |
| G-04 | 1.721 | 1.701 | 0.077 | 0.045 | 239.263 | 222.197 | 1.720 | 1.644 | 0.305 | 0.177 | 161.062 | 136.808 |
| G-05 | 1.721 | 1.693 | 0.077 | 0.035 | 245.793 | 210.312 | 1.752 | 1.651 | 0.246 | 0.133 | ∞ | 191.952 |
| G-06 | 1.740 | 1.695 | 0.077 | 0.032 | ∞ | 208.328 | 1.805 | 1.580 | 0.232 | 0.108 | ∞ | 195.570 |
| G-07 | 1.735 | 1.657 | 0.077 | 0.024 | ∞ | 215.902 | 1.806 | 1.618 | 0.224 | 0.097 | ∞ | 182.960 |

TABLE 15-H

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| H-01 | 1.960 | 1.891 | 0.111 | 0.023 | 21.165 | 16.261 | 1.843 | 1.713 | 0.382 | 0.279 | ∞ | 126.652 |
| H-02 | 1.935 | 1.843 | 0.140 | 0.016 | 19.437 | 12.685 | 1.746 | 1.604 | 0.288 | 0.196 | ∞ | 177.678 |
| H-03 | 1.947 | 1.828 | 0.128 | 0.000 | 19.380 | 10.599 | 1.787 | 1.618 | 0.262 | 0.159 | ∞ | 187.664 |
| H-04 | 1.720 | 1.704 | 0.074 | 0.049 | 236.042 | 223.100 | 1.711 | 1.641 | 0.299 | 0.184 | 151.104 | 128.169 |
| H-05 | 1.721 | 1.694 | 0.078 | 0.035 | 243.446 | 210.844 | 1.754 | 1.649 | 0.249 | 0.134 | ∞ | 181.064 |
| H-06 | 1.739 | 1.697 | 0.076 | 0.032 | ∞ | 209.931 | 1.810 | 1.580 | 0.235 | 0.109 | ∞ | 216.664 |
| H-07 | 1.730 | 1.656 | 0.076 | 0.027 | ∞ | 217.650 | 1.804 | 1.625 | 0.225 | 0.100 | ∞ | 177.272 |

TABLE 15-I

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| I-01 | 1.966 | 1.905 | 0.109 | 0.028 | 21.461 | 17.167 | 1.855 | 1.737 | 0.407 | 0.308 | ∞ | 121.537 |
| I-02 | 1.936 | 1.851 | 0.138 | 0.021 | 19.418 | 13.206 | 1.745 | 1.611 | 0.300 | 0.211 | ∞ | 173.052 |
| I-03 | 1.950 | 1.836 | 0.126 | 0.000 | 19.237 | 11.040 | 1.789 | 1.626 | 0.271 | 0.169 | ∞ | 183.002 |
| I-04 | 1.723 | 1.696 | 0.078 | 0.035 | 242.566 | 212.120 | 1.754 | 1.644 | 0.255 | 0.143 | ∞ | 168.954 |
| I-05 | 1.738 | 1.699 | 0.075 | 0.032 | ∞ | 211.373 | 1.811 | 1.579 | 0.237 | 0.115 | ∞ | 213.072 |
| I-06 | 1.728 | 1.655 | 0.075 | 0.029 | ∞ | 219.101 | 1.805 | 1.636 | 0.226 | 0.106 | ∞ | 172.052 |

TABLE 15-J

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| J-01 | 1.973 | 1.922 | 0.111 | 0.042 | 20.839 | 17.465 | 1.840 | 1.743 | 0.418 | 0.340 | 161.544 | 119.422 |
| J-02 | 1.940 | 1.863 | 0.136 | 0.027 | 19.023 | 13.566 | 1.742 | 1.619 | 0.310 | 0.227 | ∞ | 166.497 |
| J-03 | 1.953 | 1.845 | 0.124 | 0.000 | 18.857 | 11.352 | 1.789 | 1.632 | 0.278 | 0.180 | ∞ | 178.361 |
| J-04 | 1.724 | 1.698 | 0.077 | 0.035 | 241.722 | 213.515 | 1.751 | 1.642 | 0.260 | 0.155 | ∞ | 161.067 |
| J-05 | 1.737 | 1.701 | 0.074 | 0.034 | ∞ | 212.546 | 1.807 | 1.577 | 0.236 | 0.122 | ∞ | 205.891 |
| J-06 | 1.768 | 1.650 | 0.079 | 0.023 | ∞ | 200.276 | 1.849 | 1.604 | 0.227 | 0.093 | ∞ | 212.971 |

TABLE 15-K

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| K-01 | 1.944 | 1.874 | 0.135 | 0.035 | 18.320 | 13.618 | 1.733 | 1.620 | 0.314 | 0.241 | ∞ | 157.397 |
| K-02 | 1.955 | 1.853 | 0.124 | 0.000 | 18.363 | 11.476 | 1.786 | 1.632 | 0.282 | 0.188 | ∞ | 173.024 |
| K-03 | 1.723 | 1.700 | 0.077 | 0.037 | 240.271 | 214.658 | 1.744 | 1.646 | 0.261 | 0.163 | ∞ | 156.390 |
| K-04 | 1.736 | 1.703 | 0.073 | 0.036 | ∞ | 213.396 | 1.797 | 1.574 | 0.232 | 0.126 | ∞ | 195.169 |
| K-05 | 1.767 | 1.650 | 0.078 | 0.023 | ∞ | 201.239 | 1.850 | 1.606 | 0.229 | 0.094 | ∞ | 202.551 |

TABLE 15-L

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| L-01 | 1.947 | 1.882 | 0.136 | 0.044 | 17.718 | 13.578 | 1.725 | 1.617 | 0.315 | 0.249 | ∞ | 145.196 |
| L-02 | 1.955 | 1.856 | 0.126 | 0.000 | 18.125 | 11.595 | 1.783 | 1.629 | 0.284 | 0.192 | ∞ | 165.335 |
| L-03 | 1.718 | 1.664 | 0.090 | 0.044 | 175.199 | 128.388 | 1.772 | 1.642 | 0.182 | 0.119 | ∞ | 240.440 |
| L-04 | 1.720 | 1.701 | 0.076 | 0.041 | 231.299 | 215.799 | 1.738 | 1.658 | 0.262 | 0.174 | ∞ | 152.266 |
| L-05 | 1.728 | 1.703 | 0.072 | 0.040 | ∞ | 214.049 | 1.784 | 1.629 | 0.229 | 0.128 | ∞ | 193.496 |
| L-06 | 1.748 | 1.689 | 0.077 | 0.030 | ∞ | 199.849 | 1.761 | 1.583 | 0.215 | 0.104 | ∞ | 212.463 |
| L-07 | 1.768 | 1.651 | 0.078 | 0.024 | ∞ | 201.932 | 1.850 | 1.607 | 0.229 | 0.098 | ∞ | 192.106 |

TABLE 15-M

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| M-01 | 1.949 | 1.886 | 0.135 | 0.050 | 17.809 | 13.869 | 1.725 | 1.618 | 0.322 | 0.256 | ∞ | 136.370 |
| M-02 | 1.951 | 1.855 | 0.127 | 0.002 | 18.468 | 11.960 | 1.781 | 1.628 | 0.288 | 0.194 | ∞ | 153.796 |
| M-03 | 1.949 | 1.830 | 0.135 | 0.000 | 18.469 | 10.161 | 1.771 | 1.611 | 0.250 | 0.153 | ∞ | 194.427 |
| M-04 | 1.716 | 1.703 | 0.075 | 0.050 | 226.140 | 217.246 | 1.731 | 1.678 | 0.263 | 0.185 | 179.041 | 147.510 |
| M-05 | 1.721 | 1.704 | 0.072 | 0.045 | ∞ | 214.692 | 1.769 | 1.659 | 0.228 | 0.138 | ∞ | 199.403 |
| M-06 | 1.746 | 1.690 | 0.077 | 0.033 | ∞ | 202.380 | 1.761 | 1.586 | 0.219 | 0.106 | ∞ | 208.129 |
| M-07 | 1.770 | 1.651 | 0.078 | 0.026 | ∞ | 202.716 | 1.853 | 1.608 | 0.227 | 0.099 | ∞ | 186.947 |

TABLE 15-N

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| N-01 | 1.949 | 1.888 | 0.132 | 0.051 | 18.581 | 14.660 | 1.733 | 1.627 | 0.337 | 0.266 | ∞ | 131.038 |
| N-02 | 1.947 | 1.854 | 0.127 | 0.006 | 19.085 | 12.539 | 1.780 | 1.630 | 0.296 | 0.200 | ∞ | 171.650 |
| N-03 | 1.949 | 1.833 | 0.132 | 0.000 | 18.767 | 10.533 | 1.774 | 1.611 | 0.256 | 0.157 | ∞ | 189.575 |
| N-04 | 1.716 | 1.704 | 0.071 | 0.050 | ∞ | 215.374 | 1.754 | 1.677 | 0.228 | 0.152 | ∞ | 195.166 |
| N-05 | 1.744 | 1.691 | 0.077 | 0.036 | ∞ | 204.778 | 1.760 | 1.592 | 0.223 | 0.109 | ∞ | 202.001 |
| N-06 | 1.741 | 1.652 | 0.078 | 0.028 | ∞ | 209.881 | 1.859 | 1.608 | 0.226 | 0.098 | ∞ | 178.700 |

TABLE 15-O

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| O-01 | 1.950 | 1.895 | 0.130 | 0.053 | 19.240 | 15.619 | 1.737 | 1.641 | 0.356 | 0.286 | ∞ | 126.286 |
| O-02 | 1.946 | 1.858 | 0.127 | 0.010 | 19.361 | 13.105 | 1.779 | 1.636 | 0.307 | 0.211 | ∞ | 170.199 |
| O-03 | 1.951 | 1.839 | 0.128 | 0.000 | 18.857 | 10.992 | 1.777 | 1.612 | 0.265 | 0.166 | ∞ | 185.156 |
| O-04 | 1.714 | 1.706 | 0.070 | 0.053 | 222.035 | 216.109 | 1.735 | 1.682 | 0.225 | 0.161 | ∞ | 187.971 |
| O-05 | 1.742 | 1.694 | 0.076 | 0.038 | ∞ | 206.771 | 1.755 | 1.595 | 0.223 | 0.114 | ∞ | 215.684 |
| O-06 | 1.738 | 1.652 | 0.078 | 0.031 | ∞ | 213.326 | 1.839 | 1.609 | 0.227 | 0.102 | ∞ | 171.738 |

TABLE 15-P

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| P-01 | 1.955 | 1.910 | 0.129 | 0.064 | 19.185 | 16.266 | 1.731 | 1.651 | 0.371 | 0.314 | ∞ | 121.662 |
| P-02 | 1.950 | 1.868 | 0.127 | 0.016 | 19.061 | 13.452 | 1.774 | 1.642 | 0.317 | 0.227 | ∞ | 164.818 |
| P-03 | 1.953 | 1.847 | 0.127 | 0.000 | 18.574 | 11.329 | 1.776 | 1.618 | 0.273 | 0.177 | ∞ | 180.821 |
| P-04 | 1.714 | 1.708 | 0.066 | 0.055 | 220.596 | 216.874 | 1.707 | 1.678 | 0.218 | 0.165 | ∞ | 179.468 |
| P-05 | 1.742 | 1.697 | 0.075 | 0.039 | ∞ | 208.223 | 1.748 | 1.595 | 0.220 | 0.120 | ∞ | 209.260 |
| P-06 | 1.735 | 1.651 | 0.077 | 0.034 | ∞ | 215.451 | 1.840 | 1.612 | 0.229 | 0.108 | ∞ | 166.208 |

TABLE 15-Q

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| Q-01 | 1.955 | 1.881 | 0.126 | 0.023 | 18.346 | 13.519 | 1.767 | 1.645 | 0.322 | 0.243 | ∞ | 156.774 |
| Q-02 | 1.956 | 1.856 | 0.128 | 0.000 | 18.029 | 11.467 | 1.769 | 1.618 | 0.277 | 0.187 | ∞ | 176.585 |
| Q-03 | 1.741 | 1.699 | 0.074 | 0.039 | ∞ | 209.091 | 1.740 | 1.591 | 0.217 | 0.126 | ∞ | 198.961 |
| Q-04 | 1.736 | 1.650 | 0.080 | 0.020 | ∞ | 211.222 | 1.868 | 1.614 | 0.224 | 0.094 | ∞ | 204.980 |

TABLE 15-R

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| R-01 | 1.960 | 1.893 | 0.126 | 0.031 | 17.569 | 13.467 | 1.759 | 1.644 | 0.325 | 0.256 | ∞ | 143.259 |
| R-02 | 1.956 | 1.861 | 0.131 | 0.002 | 17.540 | 11.504 | 1.759 | 1.611 | 0.278 | 0.193 | ∞ | 171.381 |
| R-03 | 1.740 | 1.700 | 0.073 | 0.041 | ∞ | 209.546 | 1.736 | 1.587 | 0.217 | 0.129 | ∞ | 185.714 |
| R-04 | 1.745 | 1.696 | 0.075 | 0.028 | ∞ | 205.939 | 1.790 | 1.604 | 0.211 | 0.105 | ∞ | 201.921 |
| R-05 | 1.734 | 1.657 | 0.079 | 0.020 | ∞ | 213.387 | 1.874 | 1.617 | 0.226 | 0.095 | ∞ | 193.505 |

TABLE 15-S

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| S-01 | 1.964 | 1.903 | 0.123 | 0.040 | 17.353 | 13.759 | 1.759 | 1.648 | 0.331 | 0.267 | ∞ | 144.756 |
| S-02 | 1.952 | 1.860 | 0.135 | 0.012 | 17.539 | 11.668 | 1.750 | 1.604 | 0.280 | 0.196 | ∞ | 162.922 |
| S-03 | 1.955 | 1.833 | 0.133 | 0.000 | 18.087 | 9.947 | 1.778 | 1.614 | 0.252 | 0.156 | ∞ | 193.262 |
| S-04 | 1.709 | 1.664 | 0.092 | 0.042 | 163.046 | 129.659 | 1.784 | 1.659 | 0.196 | 0.120 | ∞ | 243.485 |
| S-05 | 1.739 | 1.699 | 0.074 | 0.044 | ∞ | 210.046 | 1.739 | 1.586 | 0.222 | 0.129 | ∞ | 177.669 |
| S-06 | 1.744 | 1.697 | 0.075 | 0.029 | ∞ | 207.633 | 1.795 | 1.605 | 0.216 | 0.105 | ∞ | 205.481 |
| S-07 | 1.732 | 1.658 | 0.078 | 0.021 | ∞ | 215.326 | 1.877 | 1.619 | 0.228 | 0.098 | ∞ | 189.945 |

TABLE 15-T

| Case | $n_{1-max}$ | $n_{1-min}$ | $k_{1-max}$ | $k_{1-min}$ | $d_{1-max}$ | $d_{1-min}$ | $n_{2-max}$ | $n_{2-min}$ | $k_{2-max}$ | $k_{2-min}$ | $d_{2-max}$ | $d_{2-min}$ |
|---|---|---|---|---|---|---|---|---|---|---|---|---|
| T-01 | 1.966 | 1.909 | 0.117 | 0.043 | 18.089 | 14.663 | 1.773 | 1.665 | 0.348 | 0.278 | ∞ | 140.260 |
| T-02 | 1.948 | 1.857 | 0.137 | 0.016 | 18.051 | 12.041 | 1.748 | 1.604 | 0.285 | 0.199 | ∞ | 150.984 |
| T-03 | 1.955 | 1.835 | 0.128 | 0.000 | 18.523 | 10.348 | 1.785 | 1.616 | 0.259 | 0.159 | ∞ | 188.160 |
| T-04 | 1.739 | 1.699 | 0.075 | 0.048 | 256.743 | 210.937 | 1.744 | 1.589 | 0.230 | 0.145 | ∞ | 180.549 |
| T-05 | 1.743 | 1.698 | 0.075 | 0.030 | ∞ | 209.294 | 1.800 | 1.608 | 0.223 | 0.109 | ∞ | 200.943 |
| T-06 | 1.731 | 1.652 | 0.078 | 0.022 | ∞ | 217.122 | 1.874 | 1.620 | 0.227 | 0.100 | ∞ | 184.530 |

The combinations of values of [$n_{10}$, $n_{20}$, $k_{10}$, $k_{20}$, $d_{10}$, $d_{20}$] are adapted for minimizing the reflectance over the entire incidence angle region corresponding to the numerical aperture NA of a corresponding exposure system. In other words, assuming an evaluation function f for minimization, the evaluation function f is a function of $n_{10}$, $n_{20}$, $k_{10}$, $k_{20}$, $d_{10}$, and $d_{20}$, and the above-described combinations of values of [$n_{10}$, $n_{20}$, $k_{10}$, $k_{20}$, $d_{10}$, $d_{20}$] are combinations for minimizing f($n_{10}$, $n_{20}$, $k_{10}$, $k_{20}$, $d_{10}$, $d_{20}$). Namely, the evaluation function f is minimized by the above-descried combinations of values of [$n_{10}$, $n_{20}$, $k_{10}$, $k_{20}$, $d_{10}$, $d_{20}$].

When multivariable function $f(x_i)$ (i=0, 1, 2, . . . n) is minimized at $x_i=x_{1-min}$, the function $f(x_i)$ near the minimum value may be expressed by the following equation (1). Namely, the function may be approximated by a quadratic function. In the equation (1), symbol "Σ" represents the sum of i=0, 1, 2, . . . n. This applies to equation (2).

$$f(x_i)=\Sigma a_i(x_i-x_{1-min})^2+b \quad (1)$$

In this case, a condition for setting $f(x_i)$ to be a certain constant c larger than b may be expressed by the elliptic function expression (2) wherein $x_{1-c}$ is a value of $x_i$ at $f(x_i)=c$ when only $x_i$ is varied with all other variables being fixed.

$$\Sigma(x_i-x_{1-min})/(x_{i-c}-x_{i-min})^2 \leqq 1 \quad (2)$$

Therefore, by using the values of $n_{i-max}$, $n_{i-min}$, $k_{i-max}$, $k_{i-min}$, $d_{i-max}$, $d_{i-min}$, $n_{2-max}$, $n_{2-min}$, $k_{2-max}$, $k_{2-min}$, $d_{2-max}$, and $d_{2-min}$, with each of which the reflectance is 0.4% when one of the variables is changed with the other being fixed, the reflectance may be controlled to below 0.4% by utilizing $n_{10}$, $n_{20}$, $k_{10}$, $k_{20}$, $d_{10}$, and $d_{20}$ satisfying the following expression (3):

$$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1 \quad (3)$$

However, $n_{1m}$, $n_{2m}$, $k_{1m}$, $k_{2m}$, $d_{1m}$, and $d_{2m}$ take the following values:

$n_{1m}$: $n_{1-max}$ when $n_1 \geqq n_{10}$ and $n_{1-min}$ when $n_1<n_{10}$ $k_{1m}$: $k_{1-max}$ when $k_1 \geqq k_{10}$ and $k_{1-min}$ when $k_1<k_{10}$ $d_{1m}$: $d_{1-max}$ when $d_1 \geqq d_{10}$ and $d_{1-min}$ when $d_1<d_{10}$ $n_{2m}$: $n_{2-max}$ when $n_2 \geqq n_{20}$ and $n_{2-min}$ when $n_2<n_{20}$ $k_{2m}$: $k_{2-max}$ when $k_2 \geqq k_{20}$ and $k_{2-min}$ when $k_2<k_{20}$ $d_{2m}$: $d_{2-max}$ when $d_2 \geqq d_{20}$ and $d_{2-min}$ when $d_2<d_{20}$ The reason for distinguishing the values of $n_{1m}$, $n_{2m}$, $k_{1m}$, $k_{2m}$, $d_{1m}$, and $d_{2m}$ according to the magnitude relations between $n_1$, $n_2$, $k_1$, $k_2$, $d_1$, and $d_2$ and $n_{10}$, $n_{20}$, $k_{10}$, $k_{20}$, $d_{10}$, and $d_{20}$, respectively, is that since the following conditions are not exactly satisfied, $$n_{1-max}-n_{10}=n_{10}-n_{1-min}$$

$$k_{1-max}-k_{10}=k_{10}-k_{1-min}$$

$$d_{1-max}-d_{10}=d_{10}-d_{1-min}$$

$$n_{2-max}-n_{20}=n_{20}-n_{2-min}$$

$$k_{2-max}-k_{20}=k_{20}-k_{2-min}$$

$$d_{2-max}-d_{20}=d_{20}-d_{2-min}$$

definitions of the diameter of an ellipsoid specified by expression (2) are distinguished according to the magnitude relations between $n_1$, $n_2$, $k_1$, $k_2$, $d_1$, and $d_2$ and $n_{10}$, $n_{20}$, $k_{10}$, $k_{20}$, $d_{10}$, and $d_{20}$, respectively. In other words, for example, the curvature of the ellipsoid at $n_1 \geqq n_{10}$ is different from that at $n_1<n_{10}$. This applies to $k_{10}$, $d_{10}$, $n_{20}$, $k_{20}$, and $d_{20}$.

When the numerical aperture NA is $0.93 \leqq NA \leqq 1.0$, a reflectance below 0.4% is secured by selecting any one of the following combinations of values of [$n_{10}$, $n_{20}$, $k_{10}$, $k_{20}$, $d_{10}$, $d_{20}$]:

Case A-01 to Case A-15 with 2 (nm)≦T≦15 (nm)
Case B-01 to Case B-22 with 15 (nm)<T≦25 (nm)
Case C-01 to Case C-18 with 25 (nm)<T≦35 (nm)
Case D-01 to Case D-20 with 35 (nm)<T≦45 (nm)
Case E-01 to Case E-17 with 45 (nm)<T≦55 (nm)
Case F-01 to Case F-17 with 55 (nm)<T≦65 (nm)
Case G-01 to Case G-16 with 65 (nm)<T≦75 (nm)
Case H-01 to Case H-16 with 75 (nm)<T≦85 (nm)
Case I-01 to Case I-23 with 85 (nm)<T≦95 (nm)
Case J-01 to Case J-15 with 95 (nm)<T≦105 (nm)
Case K-01 to Case K-13 with 105 (nm)<T≦115 (nm)
Case L-01 to Case L-12 with 115 (nm)<T≦125 (nm)
Case M-01 to Case M-12 with 125 (nm)<T≦135 (nm)
Case N-01 to Case N-12 with 135 (nm)<T≦145 (nm)
Case O-01 to Case O-13 with 145 (nm)<T≦155 (nm)
Case P-01 to Case P-14 with 155 (nm)<T≦165 (nm)
Case Q-01 to Case Q-13 with 165 (nm)<T≦175 (nm)
Case R-01 to Case R-13 with 175 (nm)<T≦185 (nm)
Case S-01 to Case S-15 with 185 (nm)<T≦195 (nm)
Case T-01 to Case T-13 with 195 (nm)<T≦205 (nm)

In addition, when $n_1$ is in the range of the maximum ($n_{1-max}$) to the minimum ($n_{1-min}$) of $n_{1m}$ in a corresponding case, $k_1$ is in the range of the maximum ($k_{1-max}$) to the minimum ($k_{1-min}$) of $k_{1m}$ in a corresponding case, $d_1$ is in the range of the maximum ($d_{1-max}$) to the minimum ($d_{1-min}$) of $d_{1m}$ in a corresponding case, $n_2$ is in the range of the maximum ($n_{2-max}$) to the minimum ($n_{2-min}$) of $n_{2m}$ in a corresponding case, $k_2$ is in the range of the maximum ($k_{2-max}$) to the minimum ($k_{2-min}$) of $k_{2m}$ in a corresponding case, and $d_2$ is in the range of the maximum ($d_{2-max}$) to the minimum ($d_{2-min}$) of $d_{2m}$ in a corresponding case, it is secured that the reflectance of the antireflective film from the silicon semiconductor substrate does not exceed 0.4% using a value of $n_{1m}$ in a corresponding case on the basis of the magnitude relation between $n_1$ and $n_{10}$, a value of $k_{1m}$ in a corresponding case on the basis of the magnitude relation between $k_1$ and $k_{10}$, a value of $d_{1m}$ in a corresponding case on the basis of the magnitude relation between $d_1$ and $d_{10}$, a value of $n_{2m}$ in a corresponding case on the basis of the magnitude relation between $n_2$ and $n_{20}$, a value of $k_{2m}$ in a corresponding case on the basis of the magnitude relation between $k_2$ and $k_{20}$, and a value of $d_{2m}$ in a corresponding case on the basis of the magnitude relation between $d_2$ and $d_{20}$. As a result, an excellent resist pattern is obtained.

When the numerical aperture NA is 1.0<NA≦1.1, a reflectance below 0.4% is secured by selecting any one of the following combinations of values of $[n_{10}, n_{20}, k_{10}, k_{20}, d_{10}, d_{20}]$:

Case A-01 to Case A-24 with 2 (nm)≦T≦15 (nm)
Case B-01 to Case B-22 with 15 (nm)<T≦25 (nm)
Case C-01 to Case C-16 with 25 (nm)<T≦35 (nm)
Case D-01 to Case D-14 with 35 (nm)<T≦45 (nm)
Case E-01 to Case E-14 with 45 (nm)<T≦55 (nm)
Case F-01 to Case F-16 with 55 (nm)<T≦65 (nm)
Case G-01 to Case G-16 with 65 (nm)<T≦75 (nm)
Case H-01 to Case H-17 with 75 (nm)<T≦85 (nm)
Case I-01 to Case I-15 with 85 (nm)<T≦95 (nm)
Case J-01 to Case J-13 with 95 (nm)<T≦105 (nm)
Case K-01 to Case K-12 with 105 (nm)<T≦115 (nm)
Case L-01 to Case L-13 with 115 (nm)<T≦125 (nm)
Case M-01 to Case M-11 with 125 (nm)<T≦135 (nm)
Case N-01 to Case N-12 with 135 (nm)<T≦145 (nm)
Case O-01 to Case O-12 with 145 (nm)<T≦155 (nm)
Case P-01 to Case P-12 with 155 (nm)<T≦165 (nm)
Case Q-01 to Case Q-12 with 165 (nm)<T≦175 (nm)
Case R-01 to Case R-10 with 175 (nm)<T≦185 (nm)
Case S-01 to Case S-13 with 185 (nm)<T≦195 (nm)
Case T-01 to Case T-12 with 195 (nm)<T≦205 (nm)

In addition, when $n_1$ is in the range of the maximum ($n_{1-max}$) to the minimum ($n_{1-min}$) of $n_{1m}$ in a corresponding case, $k_1$ is in the range of the maximum ($k_{1-max}$) to the minimum ($k_{1-min}$) of $k_{1m}$ in a corresponding case, $d_1$ is in the range of the maximum ($d_{1-max}$) to the minimum ($d_{1-min}$) of $d_{1m}$ in a corresponding case, $n_2$ is in the range of the maximum ($n_{2-max}$) to the minimum ($n_{2-min}$) of $n_{2m}$ in a corresponding case, $k_2$ is in the range of the maximum ($k_{2-max}$) to the minimum ($k_{2-min}$) of $k_{2m}$ in a corresponding case, and $d_2$ is in the range of the maximum ($d_{2-max}$) to the minimum ($d_{2-min}$) of $d_{2m}$ in a corresponding case, it is secured that the reflectance of the antireflective film from the silicon semiconductor substrate does not exceed 0.4% using a value of $n_{1m}$ in a corresponding case on the basis of the magnitude relation between $n_1$ and $n_{10}$, a value of $k_{1m}$ in a corresponding case on the basis of the magnitude relation between $k_1$ and $k_{10}$, a value of $d_{1m}$ in a corresponding case on the basis of the magnitude relation between $d_1$ and $d_{10}$, a value of $n_{2m}$ in a corresponding case on the basis of the magnitude relation between $n_2$ and $n_{20}$, a value of $k_{2m}$ in a corresponding case on the basis of the magnitude relation between $k_2$ and $k_{20}$, and a value of $d_{2m}$ in a corresponding case on the basis of the magnitude relation between $d_2$ and $d_{20}$. As a result, an excellent resist pattern is obtained.

Furthermore, when the numerical aperture NA is 1.1≦NA≦1.2, a reflectance below 0.4% is secured by selecting any one of the following combinations of values of $[n_{10}, n_{20}, k_{10}, k_{20}, d_{10}, d_{20}]$:

Case A-01 to Case A-19 with 2 (nm)≦T≦15 (nm)
Case B-01 to Case B-17 with 15 (nm)<T≦25 (nm)
Case C-01 to Case C-14 with 25 (nm)<T≦35 (nm)
Case D-01 to Case D-13 with 35 (nm)<T≦45 (nm)
Case E-01 to Case E-13 with 45 (nm)<T≦55 (nm)
Case F-01 to Case F-12 with 55 (nm)<T≦65 (nm)
Case G-01 to Case G-13 with 65 (nm)<T≦75 (nm)
Case H-01 to Case H-15 with 75 (nm)<T≦85 (nm)
Case I-01 to Case I-13 with 85 (nm)<T≦95 (nm)
Case J-01 to Case J-12 with 95 (nm)<T≦105 (nm)
Case K-01 to Case K-09 with 105 (nm)<T≦115 (nm)
Case L-01 to Case L-10 with 115 (nm)<T≦125 (nm)
Case M-01 to Case M-09 with 125 (nm)<T≦135 (nm)
Case N-01 to Case N-10 with 135 (nm)<T≦145 (nm)
Case O-01 to Case O-09 with 145 (nm)<T≦155 (nm)
Case P-01 to Case P-09 with 155 (nm)<T≦165 (nm)
Case Q-01 to Case Q-09 with 165 (nm)<T≦175 (nm)
Case R-01 to Case R-08 with 175 (nm)<T≦185 (nm)
Case S-01 to Case S-10 with 185 (nm)<T≦195 (nm)
Case T-01 to Case T-11 with 195 (nm)<T≦205 (nm)

In addition when $n_1$ is in the range of the maximum ($n_{1-max}$) to the minimum ($n_{1-min}$) of $n_{1m}$ in a corresponding case, $k_1$ is in the range of the maximum ($k_{1-max}$) to the minimum ($k_{1-min}$) of $k_{1m}$ in a corresponding case, $d_1$ is in the range of the maximum ($d_{1-max}$) to the minimum ($d_{1-min}$) of $d_{1m}$ in a corresponding case, $n_2$ is in the range of the maximum ($n_{2-max}$) to the minimum ($n_{2-min}$) of $n_{2m}$ in a corresponding case, $k_2$ is in the range of the maximum ($k_{2-max}$) to the minimum ($k_{2-min}$) of $k_{2m}$ in a corresponding case, and $d_2$ is in the range of the maximum ($d_{2-max}$) to the minimum ($d_{2-min}$) of $d_{2m}$ in a corresponding case, it is ensured that the reflectance of the antireflective film from the silicon semiconductor substrate does not exceed 0.4% using a value of $n_{1m}$ in a corresponding case on the basis of the magnitude relation between $n_1$ and $n_{10}$, a value of $k_{1m}$ in a corresponding case on the basis of the magnitude relation between $k_1$ and $k_{10}$, a value of $d_{1m}$ in a corresponding case on the basis of the magnitude relation between $d_1$ and $d_{10}$, a value of $n_{2m}$ in a corresponding case on the basis of the magnitude relation between $n_2$ and $n_{20}$, a value of $k_{2m}$ in a corresponding case on the basis of the magnitude relation between $k_2$ and $k_{20}$, and a value of $d_{2m}$ in a corresponding case on the basis of the magnitude relation between $d_2$ and $d_{20}$. As a result, an excellent resist pattern is obtained.

Furthermore, when the numerical aperture NA is 1.2<NA≦1.3, a reflectance below 0.4% is secured by selecting any one of the following combinations of values of $[n_{10}, n_{20}, k_{10}, k_{20}, d_{10}, d_{20}]$:

Case A-01 to Case A-13 with 2 (nm)≦T≦15 (nm)
Case B-01 to Case B-10 with 15 (nm)<T≦25 (nm)
Case C-01 to Case C-08 with 25 (nm)<T≦35 (nm)
Case D-01 to Case D-09 with 35 (nm)<T≦45 (nm)
Case E-01 to Case E-08 with 45 (nm)<T≦55 (nm)
Case F-01 to Case F-08 with 55 (nm)<T≦65 (nm)
Case G-01 to Case G-08 with 65 (nm)<T≦75 (nm)
Case H-01 to Case H-07 with 75 (nm)<T≦85 (nm)
Case I-01 to Case I-07 with 85 (nm)<T≦95 (nm)
Case J-01 to Case J-06 with 95 (nm)<T≦105 (nm)
Case K-01 to Case K-07 with 105 (nm)<T≦115 (nm)
Case L-01 to Case L-08 with 115 (nm)<T≦125 (nm)
Case M-01 to Case M-07 with 125 (nm)<T≦135 (nm)
Case N-01 to Case N-07 with 135 (nm)<T≦145 (nm)
Case O-01 to Case O-07 with 145 (nm)<T≦155 (nm)
Case P-01 to Case P-07 with 155 (nm)<T≦165 (nm)
Case Q-01 to Case Q-07 with 165 (nm)<T≦175 (nm)
Case R-01 to Case R-05 with 175 (nm)<T≦185 (nm)
Case S-01 to Case S-07 with 185 (nm)<T≦195 (nm)
Case T-01 to Case T-07 with 195 (nm)<T≦205 (nm)

In addition, when $n_1$ is in the range of the maximum ($n_{1-max}$) to the minimum ($n_{1-min}$) of $n_{1m}$ in a corresponding case, $k_1$ is in the range of the maximum ($k_{1-max}$) to the minimum ($k_{1-min}$) of $k_{1m}$ in a corresponding case, $d_1$ is in the range of the maximum ($d_{1-max}$) to the minimum ($d_{1-min}$) of $d_{1m}$ in a corresponding case, $n_2$ is in the range of the maximum ($n_{2-max}$) to the minimum ($n_{2-min}$) of $n_{2m}$ in a corresponding case, $k_2$ is in the range of the maximum ($k_{2-max}$) to the minimum ($k_{2-min}$) of $k_{2m}$ in a corresponding case, and $d_2$ is in the range of the maximum ($d_{2-max}$) to the minimum ($d_{2-min}$) of $d_{2m}$ in a corresponding case, it is secured that the reflectance of the antireflective film from the silicon semiconductor substrate does not exceed 0.4% using a value of $n_{1m}$ in a corresponding case on the basis of the magnitude relation between $n_1$ and $n_{10}$, a value of $k_{1m}$ in a corresponding case on the basis of the magnitude relation between $k_1$ and $k_{10}$, a value of $d_{1m}$ in a corresponding case on the basis of the magnitude relation between $d_1$ and $d_{10}$, a value of $n_{2m}$ in a corresponding case on the basis of the magnitude relation between $n_2$ and $n_{20}$, a value of $k_{2m}$ in a corresponding case on the basis of the magnitude relation between $k_2$ and $k_{20}$, and a value of $d_{2m}$ in a corresponding case on the basis of the magnitude relation between $d_2$ and $d_{20}$. As a result, an excellent resist pattern is obtained.

Furthermore, when the numerical aperture NA is 1.3<NA≦1.4, a reflectance below 0.4% is secured by selecting any one of the following combinations of values of [$n_{10}$, $n_{20}$, $k_{10}$, $k_{20}$, $d_{10}$, $d_{20}$]:

Case A-01 to Case A-11 with 2 (nm)≦T≦15 (nm)
Case B-01 to Case B-10 with 15 (nm)<T≦25 (nm)
Case C-01 to Case C-06 with 25 (nm)<T≦35 (nm)
Case D-01 to Case D-07 with 35 (nm)<T≦45 (nm)
Case E-01 to Case E-07 with 45 (nm)<T≦55 (nm)
Case F-01 to Case F-06 with 55 (nm)<T≦65 (nm)
Case G-01 to Case G-07 with 65 (nm)<T≦75 (nm)
Case H-01 to Case H-07 with 75 (nm)<T≦85 (nm)
Case I-01 to Case I-06 with 85 (nm)<T≦95 (nm)
Case J-01 to Case J-06 with 95 (nm)<T≦105 (nm)
Case K-01 to Case K-05 with 105 (nm)<T≦115 (nm)
Case L-01 to Case L-07 with 115 (nm)<T≦125 (nm)
Case M-01 to Case M-07 with 125 (nm)<T≦135 (nm)
Case N-01 to Case N-06 with 135 (nm)<T≦145 (nm)
Case O-01 to Case O-06 with 145 (nm)<T≦155 (nm)
Case P-01 to Case P-06 with 155 (nm)<T≦165 (nm)
Case Q-01 to Case Q-04 with 165 (nm)<T≦175 (nm)
Case R-01 to Case R-05 with 175 (nm)<T≦185 (nm)
Case S-01 to Case S-07 with 185 (nm)<T≦195 (nm)
Case T-01 to Case T-06 with 195 (nm)<T≦205 (nm)

In addition, when $n_1$ is in the range of the maximum ($n_{1\text{-}max}$) to the minimum ($n_{1\text{-}min}$) of $n_{1m}$ in a corresponding case, $k_1$ is in the range of the maximum ($k_{1\text{-}max}$) to the minimum ($k_{1\text{-}min}$) of $k_{1m}$ in a corresponding case, $d_1$ is in the range of the maximum ($d_{1\text{-}max}$) to the minimum ($d_{1\text{-}min}$) of $d_{1m}$ in a corresponding case, $n_2$ is in the range of the maximum ($n_{2\text{-}max}$) to the minimum ($n_{2\text{-}min}$) of $n_{2m}$ in a corresponding case, $k_2$ is in the range of the maximum ($k_{2\text{-}max}$) to the minimum ($k_{2\text{-}min}$) of $k_{2m}$ in a corresponding case, and $d_2$ is in the range of the maximum ($d_{2\text{-}max}$) to the minimum ($d_{2\text{-}min}$) of $d_{2m}$ in a corresponding case, it is secured that the reflectance of the antireflective film from the silicon semiconductor substrate does not exceed 0.4% using a value of $n_{1m}$ in a corresponding case on the basis of the magnitude relation between $n_1$ and $n_{10}$, a value of $k_{1m}$ in a corresponding case on the basis of the magnitude relation between $k_1$ and $k_{10}$, a value of $d_{1m}$ in a corresponding case on the basis of the magnitude relation between $d_1$ and $d_{10}$, a value of $n_{2m}$ in a corresponding case on the basis of the magnitude relation between $n_2$ and $n_{20}$, a value of $k_{2m}$ in a corresponding case on the basis of the magnitude relation between $k_2$ and $k_{20}$, and a value of $d_{2m}$ in a corresponding case on the basis of the magnitude relation between $d_2$ and $d_{20}$. As a result, an excellent resist pattern is obtained.

In other words, assuming a 6-dimensional ellipsoid having the six variables of ($n_1$, $n_2$, $k_1$, $k_2$, $d_1$, $d_2$) in which the centers are ($n_{10}$, $n_{20}$, $k_{10}$, $k_{20}$, $d_{10}$, and $d_{20}$) and the diameters are absolute values of ($n_{1m}-n_{10}$), ($k_{1m}-k_{10}$), ($d_{1m}-d_{10}$), ($n_{2m}-n_{20}$), ($k_{2m}-k_{20}$), and ($d_{2m}-d_{20}$), the reflectance of the antireflective film may be controlled to 0.4% or less by selecting a combination of any values of ($n_1$, $n_2$, $k_1$, $k_2$, $d_1$, $d_2$) within a range present in the ellipsoid.

EXAMPLES

A two-layer antireflective film having each of the refractive indexes and thicknesses shown in Tables 22, 23, 24, and 25 was formed on a silicon oxide film formed on a surface of a silicon semiconductor substrate by the plasma-enhanced CVD method descried in Japanese Unexamined Patent Application Publication No. 2001-242630 and Proceedings of SPIE 2003, 5039, 152 (K. Babich, et al.). The silicon oxide film was deposited on the silicon substrate by a thermal CVD method. Specifically, the CVD method was performed using $SiH_4$ and $O_2$ as source gases at a reaction temperature set at 400° C.

As described in the above reference documents, the plasma-enhanced CVD method is a method for forming a film in a parallel electrode reactor in which a silicon semiconductor substrate is mounted on one of electrodes. A negative bias voltage is applied to the silicon semiconductor substrate from the electrode, and the pressure in the reactor, the type of the reaction precursor introduced into the reactor (tetramethylsilane, trimethylsilane, tetramethyltetrasiloxne, tetramethylgermane, or oxygen), the flow rate, and the substrate temperature are controlled to form layers having various complex refractive indexes.

In Tables 21, 22, 23, 24, and 25, examples are antireflective films satisfying the conditions of the invention, while comparative examples are comparative antireflective films not satisfying the conditions of the invention.

TABLE 21

| | | 0.93 ≦ NA ≦ 1.0 | | | | | |
|---|---|---|---|---|---|---|---|
| | | Upper layer | | Lower layer | | | |
| | Case | Complex refractive index | Thickness (nm) | Complex refractive index | Thickness (nm) | Thickness of oxide film (nm) | Section pattern |
| Example 1-1 | E-06 | 1.78-0.14i | 85 | 1.71-0.65i | 55 | 50 | A |
| Comp. Example 1-1 | | 1.90-0.21i | 85 | 1.71-0.65i | 30 | 50 | B |
| Example 1-2 | E-12 | 1.72-0.08i | 155 | 1.73-0.25i | 170 | 50 | A |
| Comp. Example 1-2A | | 1.72-0.08i | 155 | 1.73-0.25i | 30 | 50 | B |
| Comp. Example 1-2B | | 1.71-0.65i | 155 | 1.90-0.21i | 30 | 50 | B |
| Example 1-3 | J-06 | 1.77-0.11i | 90 | 1.82-0.39i | 115 | 100 | A |
| Comp. Example 1-3 | | 1.77-0.11i | 90 | 1.82-0.39i | 40 | 100 | B |
| Example 1-4 | J-10 | 1.73-0.09i | 155 | 1.76-0.33i | 120 | 100 | A |
| Example 1-5 | O-07 | 1.78-0.14i | 90 | 1.79-0.50i | 75 | 150 | A |
| Comp. Example 1-5 | | 1.78-0.14i | 90 | 1.79-0.50i | 15 | 150 | B |

TABLE 21-continued 0.93 ≦ NA ≦ 1.0

| | | Upper layer | | Lower layer | | | |
|---|---|---|---|---|---|---|---|
| | Case | Complex refractive index | Thickness (nm) | Complex refractive index | Thickness (nm) | Thickness of oxide film (nm) | Section pattern |
| Example 1-6 | T-04 | 1.73-0.11i | 85 | 1.62-0.30i | 155 | 200 | A |
| Comp. Example 1-6 | | 1.73-0.11i | 85 | 1.62-0.30i | 60 | 200 | B |

TABLE 22

1.0 < NA ≦ 1.1

| | | Upper layer | | Lower layer | | | |
|---|---|---|---|---|---|---|---|
| | Case | Complex refractive index | Thickness (nm) | Complex refractive index | Thickness (nm) | Thickness of oxide film (nm) | Section pattern |
| Example 2-1 | E-05 | 1.72-0.09i | 90 | 1.64-0.25i | 180 | 50 | A |
| Comp. Example 2-1 | | 1.72-0.09i | 90 | 1.64-0.25i | 40 | 50 | B |
| Example 2-2 | E-02 | 1.93-0.15i | 20 | 1.86-0.50i | 110 | 50 | A |
| Comp. Example 2-2 | | 1.93-0.15i | 20 | 1.86-0.50i | 40 | 50 | B |
| Example 2-3 | J-06 | 1.72-0.09i | 90 | 1.64-0.25i | 170 | 60 | A |
| Comp. Example 2-3 | | 1.72-0.09i | 90 | 1.64-0.25i | 30 | 60 | B |
| Example 2-4 | J-02 | 1.93-0.15i | 16 | 1.75-0.45i | 130 | 100 | A |
| Comp. Example 2-4A | | 1.93-0.15i | 16 | 1.75-0.45i | 50 | 100 | B |
| Comp. Example 2-4B | | 1.62-0.30i | 16 | 1.75-0.45i | 130 | 100 | B |
| Example 2-5 | O-04 | 1.73-0.10i | 90 | 1.69-0.30i | 140 | 150 | A |
| Comp. Example 2-5 | | 1.73-0.10i | 90 | 1.69-0.30i | 100 | 150 | B |
| Example 2-6 | T-10 | 1.69-0.07i | 210 | 1.69-0.20i | 210 | 200 | A |
| Comp. Example 2-6 | | 1.69-0.07i | 210 | 1.69-0.20i | 80 | 200 | B |

TABLE 23

1.1 < NA ≦ 1.2

| | | Upper layer | | Lower layer | | | |
|---|---|---|---|---|---|---|---|
| | Case | Complex refractive index | Thickness (nm) | Complex refractive index | Thickness (nm) | Thickness of oxide film (nm) | Section pattern |
| Example 3-1 | E-04 | 1.72-0.09i | 95 | 1.65-0.24i | 180 | 50 | A |
| Comp. Example 3-1 | | 1.72-0.09i | 95 | 1.65-0.24i | 80 | 50 | B |
| Example 3-2 | E-06 | 1.71-0.07i | 165 | 1.67-0.23i | 170 | 50 | A |
| Comp. Example 3-2 | | 1.71-0.07i | 165 | 1.67-0.23i | 80 | 50 | B |
| Example 3-3 | J-05 | 1.73-0.08i | 95 | 1.70-0.24i | 185 | 100 | A |
| Comp. Example 3-3 | | 1.73-0.08i | 95 | 1.70-0.24i | 40 | 100 | B |
| Example 3-4 | O-01 | 1.90-0.14i | 15 | 1.71-0.39i | 150 | 150 | A |
| Comp. Example 3-4 | | 1.61-0.01i | 15 | 1.71-0.39i | 150 | 150 | B |
| Example 3-5 | S-04 | 1.72-0.08i | 95 | 1.67-0.21i | 220 | 190 | A |
| Comp. Example 3-5A | | 1.61-0.01i | 95 | 1.67-0.21i | 220 | 190 | B |
| Comp. Example 3-5B | | 1.72-0.08i | 95 | 1.67-0.21i | 90 | 190 | B |

TABLE 24

1.2 < NA ≦ 1.3

| | | Upper layer | | Lower layer | | | |
|---|---|---|---|---|---|---|---|
| | Case | Complex refractive index | Thickness (nm) | Complex refractive index | Thickness (nm) | Thickness of oxide film (nm) | Section pattern |
| Example 4-1 | E-04 | 1.94-0.21i | 23 | 1.90-0.79i | 54 | 50 | A |
| Comp. Example 4-1 | | 1.94-0.21i | 23 | 1.90-0.79i | 40 | 50 | B |
| Example 4-2 | J-01 | 1.90-0.14i | 17 | 1.72-0.40i | 135 | 100 | A |
| Comp. Example 4-2 | | 1.90-0.14i | 17 | 1.72-0.40i | 50 | 100 | B |
| Comp. Example 4-3 | | 1.94-0.21i | 17 | 1.72-0.40i | 135 | 100 | B |

TABLE 24-continued

| | | 1.2 < NA ≦ 1.3 | | | | | |
|---|---|---|---|---|---|---|---|
| | | Upper layer | | Lower layer | | | |
| | Case | Complex refractive index | Thickness (nm) | Complex refractive index | Thickness (nm) | Thickness of oxide film (nm) | Section pattern |
| Example 4-3 | T-01 | 1.90-0.14i | 14 | 1.68-0.33i | 160 | 200 | A |
| Comp. Example 4-4 | | 1.90-0.14i | 14 | 1.68-0.33i | 50 | 200 | B |

TABLE 25

| | | 1.3 < NA ≦ 1.4 | | | | | |
|---|---|---|---|---|---|---|---|
| | | Upper layer | | Lower layer | | | |
| | Case | Complex refractive index | Thickness (nm) | Complex refractive index | Thickness (nm) | Thickness of oxide film (nm) | Section pattern |
| Example 5-1 | E-01 | 1.90-0.14i | 18 | 1.68-0.47i | 126 | 50 | A |
| Comp. Example 5-1 | | 1.90-0.15i | 18 | 1.68-0.47i | 70 | 50 | B |
| Comp. Example 5-2 | | 1.90-0.14i | 18 | 1.50-0.10i | 126 | 50 | B |
| Example 5-2 | J-01 | 1.93-0.10i | 18 | 1.82-0.40i | 126 | 100 | A |
| Comp. Example 5-3 | | 1.93-0.10i | 70 | 1.82-0.40i | 126 | 100 | B |
| Example 5-3 | O-01 | 1.90-0.12i | 16 | 1.72-0.34i | 145 | 150 | A |
| Comp. Example 5-4 | | 1.90-0.12i | 16 | 1.72-0.34i | 100 | 150 | B |
| Example 5-4 | T-01 | 1.91-0.10i | 15 | 1.75-0.33i | 155 | 200 | A |
| Comp. Example 5-5 | | 1.91-0.10i | 15 | 1.75-0.33i | 70 | 200 | B |

In further detail, in Table 21 showing the results of evaluation with 0.93≦NA≦1.0, Examples 1-1 and 1-2 are antireflective films satisfying the conditions of the invention with the silicon oxide film having a thickness (T) of 45 (nm)<T≦55 (nm), Examples 1-3 and 1-4 are antireflective films satisfying the conditions of the invention with the silicon oxide film having a thickness (T) of 95 (nm)<T≦105 (nm), Example 1-5 is an antireflective film satisfying the conditions of the invention with the silicon oxide film having a thickness (T) of 145 (nm)<T≦155 (nm), and Example 1-6 is an antireflective film satisfying the conditions of the invention with the silicon oxide film having a thickness (T) of 195 (nm)<T≦205 (nm). On the other hand, Comparative Examples 1-1, 1-2A, and 1-2B are antireflective films not satisfying the conditions of the invention with the silicon oxide film having a thickness (T) of 45 (nm)<T≦55 (nm), Comparative Example 1-3 is an antireflective film not satisfying the conditions of the invention with the silicon oxide film having a thickness (T) of 95 (nm)<T≦105 (nm), Comparative Example 1-5 is an antireflective film not satisfying the conditions of the invention with the silicon oxide film having a thickness (T) of 145 (nm)<T≦155 (nm), and Comparative Example 1-6 is an antireflective film not satisfying the conditions of the invention with the silicon oxide film having a thickness (T) of 195 (nm)<T≦205 (nm).

Furthermore, in Table 22 showing the results of evaluation with 1.0<NA≦1.1, Examples 2-1 and 2-2 are antireflective films satisfying the conditions of the invention with the silicon oxide film having a thickness (T) of 45 (nm)<T≦55 (nm), Example 2-3 is an antireflective film satisfying the conditions of the invention with the silicon oxide film having a thickness (T) of 55 (nm)<T≦65 (nm), Example 2-4 is an antireflective film satisfying the conditions of the invention with the silicon oxide film having a thickness (T) of 95 (nm)<T≦105 (nm), Example 2-5 is an antireflective film satisfying the conditions of the invention with the silicon oxide film having a thickness (T) of 145 (nm)<T≦155 (nm), and Example 2-6 is an antireflective film satisfying the conditions of the invention with the silicon oxide film having a thickness (T) of 195 (nm)<T≦205 (nm). On the other hand, Comparative Examples 2-1 and 2-2 are antireflective films not satisfying the conditions of the invention with the silicon oxide film having a thickness (T) of 45 (nm)<T≦55 (nm), Comparative Example 2-3 is an antireflective film not satisfying the conditions of the invention with the silicon oxide film having a thickness (T) of 55 (nm)<T≦65 (nm), Comparative Examples 2-4A and 2-4B are antireflective films not satisfying the conditions of the invention with the silicon oxide film having a thickness (T) of 95 (nm)<T≦105 (nm), Comparative Example 2-5 is an antireflective film not satisfying the conditions of the invention with the silicon oxide film having a thickness (T) of 145 (nm)<T≦155 (nm), and Comparative Example 2-6 is an antireflective film not satisfying the conditions of the invention with the silicon oxide film having a thickness (T) of 195 (nm)<T≦205 (nm).

Furthermore, in Table 23 showing the results of evaluation with 1.1<NA≦1.2, Examples 3-1 and 3-2 are antireflective films satisfying the conditions of the invention with the silicon oxide film having a thickness (T) of 45 (nm)<T≦55 (nm), Example 3-3 is an antireflective film satisfying the conditions of the invention with the silicon oxide film having a thickness (T) of 95 (nm)<T≦105 (nm), Example 3-4 is an antireflective film satisfying the conditions of the invention with the silicon oxide film having a thickness (T) of 145 (nm)<T≦155 (nm), and Example 3-5 is an antireflective film satisfying the conditions of the invention with the silicon oxide film having a thickness (T) of 185 (nm)<T≦195 (nm). On the other hand, Comparative Examples 3-1 and 3-2 are antireflective films not satisfying the conditions of the invention with the silicon oxide film having a thickness (T) of 45 (nm)<T≦55 (nm), Comparative Example 3-3 is an antireflective film not satisfying the conditions of the invention with the silicon oxide film having a thickness (T) of 95 (nm)<T≦105 (nm), Comparative Example 3-4 is an antireflective film not satisfying the conditions of the invention with the silicon oxide film having a thickness (T) of 145 (nm)<T≦155 (nm), and Comparative Examples 3-5A and 3-5B are antireflective films not satisfying the conditions of the invention with the silicon oxide film having a thickness (T) of 185 (nm)<T≦195 (nm).

Furthermore, in Table 24 showing the results of evaluation with 1.2<NA≦1.3, Example 4-1 is an antireflective film satisfying the conditions of the invention with the silicon oxide film having a thickness (T) of 45 (nm)<T≦55 (nm), Example 4-2 is an antireflective film satisfying the conditions of the invention with the silicon oxide film having a thickness (T) of 95 (nm)<T≦105 (nm), and Example 4-3 is an antireflective film satisfying the conditions of the invention with the silicon oxide film having a thickness (T) of 195 (nm)<T≦205 (nm). On the other hand, Comparative Example 4-1 is an antireflective film not satisfying the conditions of the invention with the silicon oxide film having a thickness (T) of 45 (nm)<T≦55 (nm), Comparative Examples 4-2 and 4-3 are antireflective films not satisfying the conditions of the invention with the silicon oxide film having a thickness (T) of 95 (nm)<T≦105 (nm), and Comparative Example 4-4 is an antireflective film not satisfying the conditions of the invention with the silicon oxide film having a thickness (T) of 195 (nm)<T≦205 (nm).

Furthermore, in Table 25 showing the results of evaluation with 1.3<NA≦1.4, Example 5-1 is an antireflective film satisfying the conditions of the invention with the silicon oxide film having a thickness (T) of 45 (nm)<T≦55 (nm), Example 5-2 is an antireflective film satisfying the conditions of the invention with the silicon oxide film having a thickness (T) of 95 (nm)<T≦105 (nm), Example 5-3 is an antireflective film satisfying the conditions of the invention with the silicon oxide film having a thickness (T) of 145 (nm)<T≦155 (nm), and Example 5-4 is an antireflective film satisfying the conditions of the invention with the silicon oxide film having a thickness (T) of 195 (nm)<T≦205 (nm). On the other hand, Comparative Examples 5-1 and 5-2 are antireflective films not satisfying the conditions of the invention with the silicon oxide film having a thickness (T) of 45 (nm)<T≦55 (nm), Comparative Example 5-3 is an antireflective film not satisfying the conditions of the invention with the silicon oxide film having a thickness (T) of 95 (nm)<T≦105 (nm), Comparative Example 5-4 is an antireflective film not satisfying the conditions of the invention with the silicon oxide film having a thickness (T) of 145 (nm)<T≦155 (nm), and Comparative Example 5-5 is an antireflective film not satisfying the conditions of the invention with the silicon oxide film having a thickness (T) of 195 (nm)<T≦205 (nm).

In each of the examples and comparative examples of Tables 21, 22, 22, 23, 24, and 25, the material constituting the upper and lower layers of the antireflective film was SiCOH. The refractive index of each film was measured by an ellipsometer manufactured by SOPRA Corp.

Photoresist ARX2014J manufactured by JRS Co., Ltd. was spin-coated to a thickness of 100 nm as a resist layer on each of the two-layer antireflective films and baked at 105° C. for 60 seconds, and then a top coat material TCX001 manufactured by the same corporation was spin-coated to a thickness of 30 nm as a top coat layer. Then, the whole film was baked at 105° C. for 30 seconds.

Each of the resultant samples was exposed to light by a two-beam interference exposure device. In the two-beam interference exposure device, an ArF excimer laser was used as a light source, and a prism having a triangular or pentagonal sectional shape was disposed on the optical path of laser. Each sample was placed at a distance of 1 mm between the sample and the bottom surface of the prism. For example, when the prism with a triangular sectional shape was used, the apex of the prism was disposed at the center of the laser optical path, and the bottom surface of the prism was opposed to the apex. When laser beams are applied above the prism in the direction to the bottom surface of the prism, the laser beams incident on the two sides of the prism are refracted depending on the angle between the each side and the incident laser beam to change the optical path. The laser beams traveling in different directions are interfered with each other at the bottom surface of the prism to obtain a periodic optical intensity distribution on the sample. As a result, the resist layer is exposed to light. The reduced numerical aperture of the prism used in evaluation with 0.93≦NA≦1.0 was 0.99, the reduced numerical aperture NA of the prism used in evaluation with 1.0<NA≦1.1 was 1.05, the reduced numerical aperture NA of the prism used in evaluation with 1.1<NA≦1.2 was 1.15, the reduced numerical aperture NA of the prism used in evaluation with 1.2<NA≦1.3 was 1.25, and the reduced numerical aperture NA of the prism used in evaluation with 1.3<NA≦1.4 was 1.38.

Furthermore, water was introduced in the distance of 1 mm between each sample and the bottom surface of the prism by means of a capillary phenomenon, and immersion exposure was performed using the water as an immersion liquid.

Each of the samples after exposure was baked at 120° C. for 90 seconds and developed with a standard developer composed of 2.38% TMAH (tetramethylammonium hydroxide) to prepare a sample for resist pattern observation. The shape of the resist layer was observed by observing a section of the broken silicon semiconductor substrate through a scanning electron microscope. At the same time, the precision of the processed shape was measured by a scattered light distribution in the range of 40 μm×40 μm using an optical scattered light meter (SCD-100 manufactured by KLA-Tencor Corporation).

The results of the observation are summarized in Tables 21, 22, 23, 24, and 25 in which a resist pattern having a good rectangular section is shown by symbol A, and a resist pattern having a poor rectangular section is shown by symbol B.

As seen from Tables 21, 22, 23, 24, and 25, the two-layer antireflective film according to any one of the embodiments of the invention is capable of forming a good resist sectional shape, as compared with a two-layer antireflective film not satisfying the conditions of the invention.

As described above, according to any one of the embodiments of the invention, the two-layer antireflective film having a complex refractive index and a thickness within the respective specified ranges is formed between a resist layer and a silicon oxide film formed on a surface of a silicon semiconductor substrate. In this case, the reflectance from the silicon semiconductor substrate may be decreased for the antireflective film corresponding to a predetermined range of the numerical aperture NA of an exposure system, thereby producing a good resist pattern.

Although, in any one of the above-mentioned embodiments, the two-layer antireflective film formed by the plasma-enhanced CVD method is described as an example, the present invention is not limited to this. For example, the two-layer antireflective film may be formed by another method such as a spin coating method or the like.

A semiconductor device was manufactured using the two-layer antireflective film according to any one of the embodiments of the invention. A phase shift mask was used as an exposure mask, and an ArF excimer laser (wavelength λ: 193 nm) was used as a light source for exposure light. Furthermore, a zone illumination method was used. The surface of the resist layer was covered with a water layer, and it was confirmed whether or not a desired pattern could be formed in a resist layer without variation in the line width and shape. As a result, it was found that in any case, a desired pattern can be formed in the resist layer without variation in the line width and shape. In addition, in any case, the reflectance was 0.4% or less.

Specifically, an element separation region having a trench structure was formed. In other words, the two-layer antireflective film was formed on a silicon oxide film formed on a surface of a silicon semiconductor substrate, and a resist layer was formed on the antireflective film and subjected to exposure and development to form the patterned resist layer. Then, the silicon semiconductor substrate on which the silicon oxide film was formed on the surface was etched to a predetermined depth by a RIE method using the patterned resist layer as an etching mask, thereby forming a trench in the silicon semiconductor substrate. Then, an insulating film was formed over the entire surface of the silicon semiconductor substrate including the trench and then removed from the surface of the silicon semiconductor substrate to form an element separation region having a trench structure in which the insulating film was buried in the trench.

Although the invention is described on the basis of the preferred embodiments, the invention is not limited to these embodiments. In each of the embodiments, the constitution of the antireflective film and the thickness and complex refractive index of each layer constituting the antireflective film may be appropriately changed.

What is claimed is:

1. An exposure method used in a process for manufacturing a semiconductor device, the method comprising the steps of:

providing an antireflective film having a two-layer structure between a resist layer and a silicon oxide layer formed on a surface of a silicon semiconductor substrate and having a thickness T (unit: nm) described below; and exposing the resist layer in an exposure system having a wavelength of 190 nm to 195 nm and a numerical aperture NA of $0.93 \leqq NA \leqq 1.0$, the antireflective film including an upper layer having a complex refractive index $N_1$, and a lower layer having a complex refractive index $N_2$, the complex refractive indexes $N_1$ and $N_2$ being represented by the equations $N_1=n_1-k_1 i$ and $N_2=n_2-k_2 i$, respectively;

wherein assuming that the thickness of the upper layer is $d_1$ (unit: nm) and the thickness of the lower layer is $d_2$ (unit: nm), when any one of the combinations of values of $[n_{10}, k_{10}, d_{10}, n_{20}, k_{20}, d_{20}]$ described below is selected depending on the thickness T of the silicon oxide film, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1;$$

a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$; and in the tables below, in the line of "When $n_1 \geqq n_{10}, n_{1m}$=", each value in the right columns is "$n_{1m}-n_{10}$"; in the line of "When $n_1 < n_{10}$, $n_{1m}$=", each value in the right columns is "$n_{10}-n_{1m}$"; in the line of "When $k_1 \geqq k_{10}, k_{1m}$", each value in the right columns is "$k_{1m}-k_{10}$"; in the line of "When $k_1 < k_{10}$, $k_{1m}$=", each value in the right columns is "$k_{10}-k_{1m}$"; in the line of "When $d_1 \geqq d_{10}$, $d_{1m}$ (nm) =", each value (unit: nm) in the right columns is "$d_{1m}-d_{10}$"; in the line of "When $d_{1<d10}$, $d_{1m}$ (nm) =", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2 < n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2 < k_{20}$, $k_{2m}$=", each value in the right columns is "$k_{20}-k_{2m}$"; in the line of "When $d_2 \geqq d_{20}$, $d_{2m}$ (nm) =", each value (unit: nm) in the right columns is "$d_{2m}-d_{20}$"; and in the line of "When $d_2 < d_{20}$, $d_{2m}$ (nm) =", each value (unit: nm) in the right columns is "$d_{20}-d_{2m}$".

$0.93 \leqq NA \leqq 1.0$
$2 \leqq T \leqq 15$

1/35

| Case | 1-01 | 1-02 | 1-03 | 1-04 | 1-05 |
|---|---|---|---|---|---|
| $n_{10}$ | 2.0730 | 1.8547 | 1.8612 | 1.8596 | 1.7706 |
| $k_{10}$ | 0.1156 | 0.1676 | 0.1279 | 0.0953 | 0.0916 |
| $d_{10}$ (nm) | 23.93 | 29.84 | 20.21 | 19.98 | 91.02 |
| $n_{20}$ | 2.6749 | 2.1886 | 1.8193 | 1.8569 | 1.9614 |
| $k_{20}$ | 1.5696 | 0.6118 | 0.4029 | 0.3274 | 0.4555 |
| $d_{20}$ (nm) | 9.886 | 59.76 | 139.99 | 190.30 | 69.22 |
| When $n_1 \geqq n_{10}$, $n_{1m}$ = | 0.0910 | 0.0882 | 0.0964 | 0.0950 | 0.0763 |
| When $n_1 < n_{10}$, $n_{1m}$ = | 0.872 | 0.0704 | 0.0762 | 0.0765 | 0.0467 |
| When $k_1 \geqq k_{10}$, $k_{1m}$ = | 0.819 | 0.0750 | 0.0869 | 0.0875 | 0.0772 |
| When $k_1 < k_{10}$, $k_{1m}$ = | 0.0960 | 0.0840 | 0.0907 | 0.0915 | 0.0546 |
| When $d_1 \geqq d_{10}$, $d_{1m}$ (nm) = | 4.108 | 7.919 | 8.786 | 9.587 | 17.28 |
| When $d_1 < d_{10}$, $d_{1m}$ (nm) = | 3.280 | 5.652 | 6.074 | 6.698 | 8.396 |
| When $n_2 \geqq n_{20}$, $n_{2m}$ = | 0.2209 | 0.1796 | 0.1515 | 0.1552 | 0.1445 |
| When $n_2 < n_{20}$, $n_{2m}$ = | 0.2126 | 0.1920 | 0.1780 | 0.1777 | 0.1565 |
| When $k_2 \geqq k_{20}$, $k_{2m}$ = | 0.2324 | 0.2171 | 0.1921 | 0.1983 | 0.1809 |
| When $k_2 < k_{20}$, $k_{2m}$ = | 0.1960 | 0.1512 | 0.1220 | 0.1107 | 0.1235 |
| When $d_2 \geqq d_{20}$, $d_{2m}$ (nm) = | 1.175 | 13.99 | ∞ | ∞ | 9.907 |
| When $d_2 < d_{20}$, $d_{2m}$ (nm) = | 1.606 | 9.166 | 63.12 | 76.29 | 9.171 |

$0.93 \leqq NA \leqq 1.0$
$2 \leqq T \leqq 15$

| Case | 1-06 | 1-07 | 1-08 | 1-09 | 1-10 |
|---|---|---|---|---|---|
| $n_{10}$ | 1.7660 | 1.7540 | 1.7206 | 1.7312 | 1.7318 |
| $k_{10}$ | 0.0861 | 0.0810 | 0.0766 | 0.0743 | 0.0746 |
| $d_{10}$ (nm) | 89.67 | 89.26 | 163.7 | 158.4 | 156.0 |
| $n_{20}$ | 1.8683 | 1.7976 | 2.0073 | 1.9328 | 1.8226 |
| $k_{20}$ | 0.3142 | 0.2441 | 0.9100 | 0.4029 | 0.2736 |
| $d_{20}$ (nm) | 129.4 | 193.6 | 15.11 | 69.39 | 132.3 |
| When $n_1 \geqq n_{10}$, $n_{1m}$ = | 0.0725061 | 0.0712122 | 0.0876196 | 0.0743347 | 0.0699963 |
| When $n_1 < n_{10}$, $n_{1m}$ = | 0.0454077 | 0.0429834 | 0.0318030 | 0.0375427 | 0.0339148 |
| When $k_1 \geqq k_{10}$, $k_{1m}$ = | 0.0772620 | 0.0743579 | 0.0711646 | 0.0773767 | 0.0733899 |
| When $k_1 < k_{10}$, $k_{1m}$ = | 0.0551843 | 0.0575049 | 0.0410327 | 0.0412244 | 0.0408972 |
| When $d_1 \geqq d_{10}$, $d_{1m}$ (nm) = | 18.782 | 23.348 | 40.469 | 35.317 | 38.161 |
| When $d_1 < d_{10}$, $d_{1m}$ (nm) = | 8.456 | 8.860 | 9.958 | 10.342 | 9.052 |

-continued

| | | | | | |
|---|---|---|---|---|---|
| When $n_2 \geqq n_{20}, n_{2m}$ = | 0.1498401 | 0.1584961 | 0.1682336 | 0.1348816 | 0.1376196 |
| When $n_2 < n_{20}, n_{2m}$ = | 0.1510144 | 0.1511060 | 0.2304688 | 0.1582874 | 0.1516028 |
| When $k_2 \geqq k_{20}, k_{2m}$ = | 0.2049341 | 0.2252979 | 0.1710974 | 0.1537598 | 0.1868274 |
| When $k_2 < k_{20}, k_{2m}$ = | 0.0962390 | 0.0820935 | 0.1771240 | 0.1169067 | 0.0881860 |
| When $d_2 \geqq d_{20}, d_{2m}$ (nm) = | ∞ | ∞ | 3.180 | 8.501 | ∞ |
| When $d_2 < d_{20}, d_{2m}$ (nm) = | 17.963 | 68.303 | 3.157 | 8.798 | 14.016 |

| | $0.93 \leqq NA \leqq 1.0$<br>$2 \leqq T \leqq 15$ | | | | 2/35 |
|---|---|---|---|---|---|
| Case | 1-11 | 1-12 | 1-13 | 1-14 | 1-15 |
| $n_{10}$ | 1.7235310 | 1.7093992 | 1.7192548 | 1.7183512 | 1.7097773 |
| $k_{10}$ | 0.0712769 | 0.0595462 | 0.0668813 | 0.0690717 | 0.0638868 |
| $d_{10}$ (nm) | 155.759 | 237.275 | 223.222 | 220.755 | 221.916 |
| $n_{20}$ | 1.7500411 | 5.0249130 | 1.9244861 | 1.7884626 | 1.7175992 |
| $k_{20}$ | 0.2147794 | 2.4786958 | 0.3767470 | 0.2530536 | 0.2031308 |
| $d_{20}$ (nm) | 197.972 | 1.776 | 68.925 | 134.430 | 199.649 |
| When $n_1 \geqq n_{10}, n_{1m}$ = | 0.0687000 | 0.1022864 | 0.0758325 | 0.0727087 | 0.0697119 |
| When $n_1 < n_{10}, n_{1m}$ = | 0.0322229 | 0.0397070 | 0.0389722 | 0.0346118 | 0.0564209 |
| When $k_1 \geqq k_{10}, k_{1m}$ = | 0.0698975 | 0.0795508 | 0.0762329 | 0.0700171 | 0.0722595 |
| When $k_1 < k_{10}, k_{1m}$ = | 0.0415723 | 0.0393457 | 0.0338635 | 0.0308765 | 0.0321350 |
| When $d_1 \geqq d_{10}, d_{1m}$ (nm) = | ∞ | ∞ | ∞ | ∞ | ∞ |
| When $d_1 < d_{10}, d_{1m}$ (nm) = | 9.616 | 78.998 | 12.815 | 10.464 | 72.402 |
| When $n_2 \geqq n_{20}, n_{2m}$ = | 0.1855957 | 0.5207629 | 0.1343335 | 0.1358569 | 0.2333704 |
| When $n_2 < n_{20}, n_{2m}$ = | 0.1501331 | 0.6523560 | 0.1703552 | 0.1672083 | 0.1693542 |
| When $k_2 \geqq k_{20}, k_{2m}$ = | 0.2047339 | 0.5424048 | 0.1363831 | 0.1710950 | 0.1947412 |
| When $k_2 < k_{20}, k_{2m}$ = | 0.0758948 | 0.5487781 | 0.1192529 | 0.0892212 | 0.0778406 |
| When $d_2 \geqq d_{20}, d_{2m}$ (nm) = | ∞ | 0.325 | 8.509 | ∞ | ∞ |
| When $d_2 < d_{20}, d_{2m}$ (nm) = | 29.087 | 0.351 | 7.511 | 11.451 | 31.610 |

| | $0.93 \leqq NA \leqq 1.0$<br>$15 < T \leqq 25$ | | | | |
|---|---|---|---|---|---|
| Case | 2-01 | 2-02 | 2-03 | 2-04 | 2-05 |
| $n_{10}$ | 1.8890717 | 1.8040788 | 1.8569330 | 1.8246631 | 1.8713633 |
| $k_{10}$ | 0.2231211 | 0.2224671 | 0.1887211 | 0.1852786 | 0.1359350 |
| $d_{10}$ (nm) | 31.297 | 38.783 | 31.358 | 29.866 | 20.765 |
| $n_{20}$ | 2.2536461 | 3.4285504 | 2.3482559 | 2.0267942 | 1.8449284 |
| $k_{20}$ | 1.9138327 | 0.7115044 | 0.7139401 | 0.6589875 | 0.4410677 |
| $d_{20}$ (nm) | 8.426 | 30.090 | 49.395 | 61.419 | 129.533 |
| When $n_1 \geqq n_{10}, n_{1m}$ = | 0.0874390 | 0.0895227 | 0.0867871 | 0.0862964 | 0.0944556 |
| When $n_1 < n_{10}, n_{1m}$ = | 0.0734485 | 0.0679480 | 0.0711365 | 0.0665735 | 0.0748743 |
| When $k_1 \geqq k_{10}, k_{1m}$ = | 0.0762256 | 0.0781921 | 0.0754639 | 0.0735010 | 0.0845789 |
| When $k_1 < k_{10}, k_{1m}$ = | 0.0847852 | 0.0785486 | 0.0835657 | 0.0812061 | 0.0905493 |
| When $d_1 \geqq d_{10}, d_{1m}$ (nm) = | 5.734 | 7.070 | 7.156 | 8.156 | 8.180 |
| When $d_1 < d_{10}, d_{1m}$ (nm) = | 4.509 | 5.331 | 5.325 | 5.713 | 5.655 |
| When $n_2 \geqq n_{20}, n_{2m}$ = | 0.3151672 | 0.1904419 | 0.1878015 | 0.1893945 | 0.1561475 |
| When $n_2 < n_{20}, n_{2m}$ = | 0.3095313 | 0.2189575 | 0.2044202 | 0.1933459 | 0.1801416 |
| When $k_2 \geqq k_{20}, k_{2m}$ = | 0.3390149 | 0.2463513 | 0.2322900 | 0.2311047 | 0.2037732 |
| When $k_2 < k_{20}, k_{2m}$ = | 0.3041187 | 0.1774133 | 0.1676416 | 0.1568945 | 0.1265381 |
| When $d_2 \geqq d_{20}, d_{2m}$ (nm) = | 1.987 | 2.182 | 8.431 | ∞ | ∞ |
| When $d_2 < d_{20}, d_{2m}$ (nm) = | 1.727 | 2.068 | 6.571 | 10.427 | 56.577 |

| | $0.93 \leqq NA \leqq 1.0$<br>$15 < T \leqq 25$ | | | | 3/35 |
|---|---|---|---|---|---|
| Case | 2-06 | 2-07 | 2-08 | 2-09 | 2-10 |
| $n_{10}$ | 1.8537764 | 1.8773918 | 1.7913209 | 1.7961812 | 1.7719309 |
| $k_{10}$ | 0.1095380 | 0.0811836 | 0.1069315 | 0.0967122 | 0.0907051 |
| $d_{10}$ (nm) | 19.190 | 15.072 | 93.104 | 91.592 | 89.644 |
| $n_{20}$ | 1.8083352 | 1.7885130 | 2.1120296 | 2.2985234 | 1.8982310 |
| $k_{20}$ | 0.3385915 | 0.2812935 | 1.5705728 | 0.5621108 | 0.3437292 |
| $d_{20}$ (nm) | 190.096 | 250.952 | 8.709 | 49.876 | 119.550 |
| When $n_1 \geqq n_{10}, n_{1m}$ = | 0.0970691 | 0.1116003 | 0.0785193 | 0.0746387 | 0.0710254 |
| When $n_1 < n_{10}, n_{1m}$ = | 0.0765894 | 0.0899463 | 0.0387744 | 0.0446472 | 0.0434424 |
| When $k_1 \geqq k_{10}, k_{1m}$ = | 0.0900769 | 0.1037891 | 0.0704041 | 0.0743225 | 0.0753088 |
| When $k_1 < k_{10}, k_{1m}$ = | 0.0922754 | 0.0811836 | 0.0518481 | 0.0540869 | 0.0544885 |
| When $d_1 \geqq d_{10}, d_{1m}$ (nm) = | 9.442 | 8.843 | 12.610 | 13.182 | 16.111 |
| When $d_1 < d_{10}, d_{1m}$ (nm) = | 6.479 | 6.242 | 5.884 | 6.895 | 7.619 |
| When $n_2 \geqq n_{20}, n_{2m}$ = | 0.1545007 | 0.1511414 | 0.2353479 | 0.1499768 | 0.1563330 |
| When $n_2 < n_{20}, n_{2m}$ = | 0.1780847 | 0.1773486 | 0.2901843 | 0.1659082 | 0.1527185 |
| When $k_2 \geqq k_{20}, k_{2m}$ = | 0.1867920 | 0.1671802 | 0.2909924 | 0.1840894 | 0.2027185 |
| When $k_2 < k_{20}, k_{2m}$ = | 0.1126624 | 0.1034778 | 0.2557275 | 0.1387183 | 0.1013330 |
| When $d_2 \geqq d_{20}, d_{2m}$ (nm) = | ∞ | ∞ | 1.972 | 5.095 | ∞ |
| When $d_2 < d_{20}, d_{2m}$ (nm) = | 76.056 | 121.855 | 1.716 | 4.880 | 15.622 |

| | $0.93 \leqq NA \leqq 1.0$<br>$15 < T \leqq 25$ | | | | |
|---|---|---|---|---|---|
| Case | 2-11 | 2-12 | 2-13 | 2-14 | 2-15 |
| $n_{10}$ | 1.7573553 | 1.7321027 | 1.7251448 | 1.7347815 | 1.7337052 |
| $k_{10}$ | 0.0844391 | 0.0771807 | 0.0782108 | 0.0789970 | 0.0782079 |
| $d_{10}$ (nm) | 89.273 | 89.432 | 166.474 | 158.854 | 156.164 |
| $n_{20}$ | 1.8090385 | 1.7181480 | 2.6560327 | 2.0166404 | 1.8413069 |
| $k_{20}$ | 0.2599016 | 0.2108133 | 2.0752579 | 0.4697089 | 0.2975845 |
| $d_{20}$ (nm) | 184.203 | 254.601 | 4.495 | 58.957 | 122.955 |

-continued

| | | | | | |
|---|---|---|---|---|---|
| When $n_1 \geqq n_{10}, n_{1m}$ = | 0.0699780 | 0.0690137 | 0.0832959 | 0.0721558 | 0.0683105 |
| When $n_1 < n_{10}, n_{1m}$ = | 0.0410315 | 0.0429553 | 0.0305981 | 0.0341260 | 0.0308228 |
| When $k_1 \geqq k_{10}, k_{1m}$ = | 0.0723608 | 0.0738831 | 0.0729456 | 0.0742798 | 0.0703467 |
| When $k_1 < k_{10}, k_{1m}$ = | 0.0569189 | 0.0588879 | 0.0382764 | 0.0397253 | 0.0396069 |
| When $d_1 \geqq d_{10}, d_{1m}$ (nm) = | 21.648 | 30.736 | 32.939 | 31.041 | 34.229 |
| When $d_1 < d_{10}, d_{1m}$ (nm) = | 8.068 | 11.084 | 9.096 | 8.972 | 7.917 |
| When $n_2 \geqq n_{20}, n_{2m}$ = | 0.1631897 | 0.1805151 | 0.3419739 | 0.1438672 | 0.1358447 |
| When $n_2 < n_{20}, n_{2m}$ = | 0.1518018 | 0.1480249 | 0.4228455 | 0.1667273 | 0.1539514 |
| When $k_2 \geqq k_{20}, k_{2m}$ = | 0.2316443 | 0.1895435 | 0.3584204 | 0.1604712 | 0.1864905 |
| When $k_2 < k_{20}, k_{2m}$ = | 0.0850049 | 0.0772852 | 0.3668774 | 0.1323413 | 0.0930493 |
| When $d_2 \geqq d_{20}, d_{2m}$ (nm) = | ∞ | ∞ | 0.935 | 6.683 | 16.067 |
| When $d_2 < d_{20}, d_{2m}$ (nm) = | 28.321 | 80.547 | 0.940 | 6.845 | 12.170 |

$0.93 \leqq NA \leqq 1.0$
$15 < T \leqq 25$

4/35

| Case | 2-16 | 2-17 | 2-18 | 2-19 | 2-20 |
|---|---|---|---|---|---|
| $n_{10}$ | 1.7245076 | 1.7100620 | 1.7130788 | 1.7208745 | 1.7192161 |
| $k_{10}$ | 0.0739010 | 0.0639207 | 0.0658962 | 0.0708686 | 0.0720786 |
| $d_{10}$ (nm) | 155.712 | 155.553 | 233.281 | 223.560 | 220.745 |
| $n_{20}$ | 1.7533528 | 1.6863114 | 3.3653368 | 1.9877972 | 1.7983405 |
| $k_{20}$ | 0.2275719 | 0.1891021 | 2.7431658 | 0.4366658 | 0.2740582 |
| $d_{20}$ (nm) | 189.273 | 256.528 | 2.501 | 59.393 | 125.643 |
| When $n_1 \geqq n_{10}, n_{1m}$ = | 0.0671997 | 0.0648059 | 0.0864783 | 0.0735278 | 0.0707983 |
| When $n_1 < n_{10}, n_{1m}$ = | 0.0293323 | 0.0484583 | 0.0327734 | 0.0316724 | 0.0279663 |
| When $k_1 \geqq k_{10}, k_{1m}$ = | 0.0671045 | 0.0758130 | 0.0759729 | 0.0721252 | 0.0662109 |
| When $k_1 < k_{10}, k_{1m}$ = | 0.0403235 | 0.0462146 | 0.0340283 | 0.0320007 | 0.0290771 |
| When $d_1 \geqq d_{10}, d_{1m}$ (nm) = | ∞ | ∞ | ∞ | ∞ | ∞ |
| When $d_1 < d_{10}, d_{1m}$ (nm) = | 8.393 | 77.190 | 14.014 | 10.040 | 8.344 |
| When $n_2 \geqq n_{20}, n_{2m}$ = | 0.1922314 | 0.2150586 | 0.5377722 | 0.1455798 | 0.1365283 |
| When $n_2 < n_{20}, n_{2m}$ = | 0.1495129 | 0.1388159 | 0.5848816 | 0.1787549 | 0.1689587 |
| When $k_2 \geqq k_{20}, k_{2m}$ = | 0.2035803 | 0.1600281 | 0.4555420 | 0.1361926 | 0.1635962 |
| When $k_2 < k_{20}, k_{2m}$ = | 0.0785095 | 0.0698242 | 0.5466174 | 0.1332434 | 0.0942200 |
| When $d_2 \geqq d_{20}, d_{2m}$ (nm) = | ∞ | ∞ | 0.540 | 6.979 | ∞ |
| When $d_2 < d_{20}, d_{2m}$ (nm) = | 26.645 | 77.267 | 0.568 | 6.255 | 9.480 |

-continued $0.93 \leqq NA \leqq 1.0$
$15 < T \leqq 25$

| Case | 2-21 | 2-22 |
|---|---|---|
| $n_{10}$ | 1.7100814 | 1.7028062 |
| $k_{10}$ | 0.0661341 | 0.0572529 |
| $d_{10}$ (nm) | 221.783 | 219.613 |
| $n_{20}$ | 1.7179584 | 1.6741304 |
| $k_{20}$ | 0.2146738 | 0.1784680 |
| $d_{20}$ (nm) | 191.114 | 256.090 |
| When $n_1 \geqq n_{10}, n_{1m}$ = | 0.0687488 | 0.0693079 |
| When $n_1 < n_{10}, n_{1m}$ = | 0.0502954 | 0.0688196 |
| When $k_1 \geqq k_{10}, k_{1m}$ = | 0.0691418 | 0.0820508 |
| When $k_1 < k_{10}, k_{1m}$ = | 0.0305945 | 0.0409924 |
| When $d_1 \geqq d_{10}, d_{1m}$ (nm) = | ∞ | ∞ |
| When $d_1 < d_{10}, d_{1m}$ (nm) = | 70.999 | 88.114 |
| When $n_2 \geqq n_{20}, n_{2m}$ = | 0.2426611 | 0.2482605 |
| When $n_2 < n_{20}, n_{2m}$ = | 0.1649829 | 0.1563098 |
| When $k_2 \geqq k_{20}, k_{2m}$ = | 0.1903906 | 0.1488330 |
| When $k_2 < k_{20}, k_{2m}$ = | 0.0805981 | 0.0682654 |
| When $d_2 \geqq d_{20}, d_{2m}$ (nm) = | ∞ | ∞ |
| When $d_2 < d_{20}, d_{2m}$ (nm) = | 28.403 | 77.092 |

$0.93 \leqq NA \leqq 1.0$
$25 < T \leqq 35$

5/35

| Case | 3-01 | 3-02 | 3-03 | 3-04 | 3-05 |
|---|---|---|---|---|---|
| $n_{10}$ | 1.7462297 | 1.7852920 | 1.8064124 | 1.8761841 | 1.8732427 |
| $k_{10}$ | 0.2650661 | 0.2379686 | 0.2063789 | 0.1465026 | 0.1107685 |
| $d_{10}$ (nm) | 38.584 | 38.995 | 31.400 | 22.050 | 18.888 |
| $n_{20}$ | 1.8811342 | 3.2453891 | 2.0415396 | 1.8871554 | 1.8328297 |
| $k_{20}$ | 2.5474890 | 0.8215227 | 0.7493942 | 0.4863835 | 0.3644393 |
| $d_{20}$ (nm) | 6.719 | 29.990 | 55.163 | 118.487 | 179.928 |
| When $n_1 \geqq n_{10}, n_{1m}$ = | 0.0769434 | 0.0851318 | 0.0833228 | 0.0906799 | 0.0968079 |
| When $n_1 < n_{10}, n_{1m}$ = | 0.0572766 | 0.0631555 | 0.0636389 | 0.0722144 | 0.0767554 |
| When $k_1 \geqq k_{10}, k_{1m}$ = | 0.0723669 | 0.0784412 | 0.0735730 | 0.0819336 | 0.0896667 |
| When $k_1 < k_{10}, k_{1m}$ = | 0.0683887 | 0.0725391 | 0.0776208 | 0.0882788 | 0.0940442 |
| When $d_1 \geqq d_{10}, d_{1m}$ (nm) = | 6.007 | 6.642 | 7.652 | 7.684 | 8.502 |
| When $d_1 < d_{10}, d_{1m}$ (nm) = | 4.614 | 4.982 | 5.411 | 5.323 | 5.843 |
| When $n_2 \geqq n_{20}, n_{2m}$ = | 0.4302271 | 0.2240894 | 0.2116187 | 0.1663196 | 0.1573621 |
| When $n_2 < n_{20}, n_{2m}$ = | 0.3679468 | 0.2518726 | 0.2012903 | 0.1828064 | 0.1779138 |
| When $k_2 \geqq k_{20}, k_{2m}$ = | 0.4458606 | 0.2938757 | 0.2488452 | 0.2239661 | 0.1924353 |
| When $k_2 < k_{20}, k_{2m}$ = | 0.4071558 | 0.2090601 | 0.1700916 | 0.1317957 | 0.1155774 |
| When $d_2 \geqq d_{20}, d_{2m}$ (nm) = | 1.849 | 2.793 | ∞ | ∞ | ∞ |
| When $d_2 < d_{20}, d_{2m}$ (nm) = | 1.467 | 2.486 | 8.980 | 27.259 | 71.144 |

$0.93 \leqq NA \leqq 1.0$
$25 < T \leqq 35$

| Case | 3-06 | 3-07 | 3-08 | 3-09 | 3-10 |
|---|---|---|---|---|---|
| $n_{10}$ | 1.8809997 | 1.8353407 | 1.8107063 | 1.7800259 | 1.7589519 |
| $k_{10}$ | 0.0844859 | 0.1336488 | 0.1074834 | 0.0966903 | 0.0885227 |
| $d_{10}$ (nm) | 15.636 | 86.851 | 91.200 | 89.638 | 89.033 |
| $n_{20}$ | 1.8003278 | 1.6000470 | 2.5616901 | 1.9474319 | 1.8081258 |

-continued

| | | | | | |
|---|---|---|---|---|---|
| $k_{20}$ | 0.2965881 | 1.7695220 | 0.6655713 | 0.3779800 | 0.2753975 |
| $d_{20}$ (nm) | 241.202 | 10.059 | 40.111 | 109.424 | 177.335 |
| When $n_1 \geqq n_{10}$, $n_{1m}$ = | 0.1079370 | 0.0607556 | 0.0690979 | 0.0686230 | 0.0682776 |
| When $n_1 < n_{10}$, $n_{1m}$ = | 0.0864404 | 0.0389355 | 0.0418872 | 0.0404956 | 0.0386047 |
| When $k_1 \geqq k_{10}$, $k_{1m}$ = | 0.0999365 | 0.0690637 | 0.0736157 | 0.0727942 | 0.0702844 |
| When $k_1 < k_{10}$, $k_{1m}$ = | 0.0844859 | 0.0492517 | 0.0507898 | 0.0531238 | 0.0559766 |
| When $d_1 \geqq d_{10}$, $d_{1m}$ (nm) = | 8.565 | 8.192 | 11.124 | 13.835 | 18.997 |
| When $d_1 < d_{10}$, $d_{1m}$ (nm) = | 5.996 | 4.465 | 5.820 | 6.603 | 7.278 |
| When $n_2 \geqq n_{20}$, $n_{2m}$ = | 0.1541260 | 0.2930249 | 0.1702905 | 0.1595251 | 0.1700037 |
| When $n_2 < n_{20}$, $n_{2m}$ = | 0.1764270 | 0.2694421 | 0.1785315 | 0.1557800 | 0.1515491 |
| When $k_2 \geqq k_{20}$, $k_{2m}$ = | 0.1720203 | 0.3061462 | 0.2081555 | 0.2039343 | 0.2313416 |
| When $k_2 < k_{20}$, $k_{2m}$ = | 0.1058716 | 0.3107410 | 0.1597290 | 0.1070007 | 0.0874585 |
| When $d_2 \geqq d_{20}$, $d_{2m}$ (nm) = | ∞ | 2.242 | 3.729 | 17.032 | ∞ |
| When $d_2 < d_{20}$, $d_{2m}$ (nm) = | 115.662 | 2.067 | 3.416 | 13.482 | 26.550 |

$0.93 \leqq NA \leqq 1.0$
$25 < T \leqq 35$

6/35

| Case | 3-11 | 3-12 | 3-13 | 3-14 | 3-15 |
|---|---|---|---|---|---|
| $n_{10}$ | 1.7385561 | 1.7392392 | 1.7355979 | 1.7252169 | 1.7185486 |
| $k_{10}$ | 0.0961686 | 0.0859424 | 0.0828161 | 0.0770491 | 0.0788457 |
| $d_{10}$ (nm) | 161.111 | 158.474 | 155.982 | 155.656 | 229.847 |
| $n_{20}$ | 1.8448216 | 2.1008270 | 1.8545146 | 1.7550901 | 3.2610273 |
| $k_{20}$ | 2.2148249 | 0.5469970 | 0.3232472 | 0.2413910 | 4.4183916 |
| $d_{20}$ (nm) | 5.861 | 50.862 | 115.179 | 181.353 | 1.558 |
| When $n_1 \geqq n_{10}$, $n_{1m}$ = | 0.0629041 | 0.0674426 | 0.0657153 | 0.0649670 | 0.0703149 |
| When $n_1 < n_{10}$, $n_{1m}$ = | 0.0253882 | 0.0295728 | 0.0268335 | 0.0256165 | 0.0220850 |
| When $k_1 \geqq k_{10}$, $k_{1m}$ = | 0.0668323 | 0.0703247 | 0.0663293 | 0.0632434 | 0.0659778 |
| When $k_1 < k_{10}$, $k_{1m}$ = | 0.0332373 | 0.0369910 | 0.0375085 | 0.0384131 | 0.0277441 |
| When $d_1 \geqq d_{10}$, $d_{1m}$ (nm) = | 20.469 | 26.314 | 30.753 | 47.147 | 42.683 |
| When $d_1 < d_{10}$, $d_{1m}$ (nm) = | 5.969 | 7.197 | 6.584 | 7.042 | 7.213 |
| When $n_2 \geqq n_{20}$, $n_{2m}$ = | 0.3836914 | 0.1608313 | 0.1425024 | 0.2021899 | 0.7624707 |
| When $n_2 < n_{20}$, $n_{2m}$ = | 0.3601526 | 0.1749219 | 0.1554919 | 0.1482849 | 0.7156897 |
| When $k_2 \geqq k_{20}$, $k_{2m}$ = | 0.3156946 | 0.1638635 | 0.1816882 | 0.2013940 | 0.5159863 |
| When $k_2 < k_{20}$, $k_{2m}$ = | 0.4014783 | 0.1464551 | 0.0974072 | 0.0811682 | 0.8313574 |
| When $d_2 \geqq d_{20}$, $d_{2m}$ (nm) = | 1.291 | 5.616 | 13.990 | ∞ | 0.296 |
| When $d_2 < d_{20}$, $d_{2m}$ (nm) = | 1.319 | 5.535 | 10.236 | 24.868 | 0.387 |

-continued $0.93 \leqq NA \leqq 1.0$
$25 < T \leqq 35$

| Case | 3-16 | 3-17 | 3-18 |
|---|---|---|---|
| $n_{10}$ | 1.7228369 | 1.7199449 | 1.7101979 |
| $k_{10}$ | 0.0769315 | 0.0760859 | 0.0687675 |
| $d_{10}$ (nm) | 222.858 | 220.491 | 221.639 |
| $n_{20}$ | 2.0210736 | 1.8037789 | 1.7165312 |
| $k_{20}$ | 0.5011654 | 0.2965908 | 0.2274377 |
| $d_{20}$ (nm) | 52.892 | 118.134 | 183.246 |
| When $n_1 \geqq n_{10}$, $n_{1m}$ = | 0.0694470 | 0.0680798 | 0.0669543 |
| When $n_1 < n_{10}$, $n_{1m}$ = | 0.0241309 | 0.0211279 | 0.0442908 |
| When $k_1 \geqq k_{10}$, $k_{1m}$ = | 0.0659106 | 0.0606384 | 0.0650562 |
| When $k_1 < k_{10}$, $k_{1m}$ = | 0.0287354 | 0.0259912 | 0.0284460 |
| When $d_1 \geqq d_{10}$, $d_{1m}$ (nm) = | ∞ | ∞ | ∞ |
| When $d_1 < d_{10}$, $d_{1m}$ (nm) = | 7.193 | 6.146 | 69.475 |
| When $n_2 \geqq n_{20}$, $n_{2m}$ = | 0.1641553 | 0.1445947 | 0.2568982 |
| When $n_2 < n_{20}$, $n_{2m}$ = | 0.1866541 | 0.1696143 | 0.1583826 |
| When $k_2 \geqq k_{20}$, $k_{2m}$ = | 0.1286877 | 0.1503394 | 0.1843665 |
| When $k_2 < k_{20}$, $k_{2m}$ = | 0.1457922 | 0.0990405 | 0.0813123 |
| When $d_2 \geqq d_{20}$, $d_{2m}$ (nm) = | 6.290 | 17.763 | ∞ |
| When $d_2 < d_{20}$, $d_{2m}$ (nm) = | 5.002 | 7.323 | 26.072 |

$0.93 \leqq NA \leqq 1.0$
$35 < T \leqq 45$

7/35

| Case | 4-01 | 4-02 | 4-03 | 4-04 | 4-05 |
|---|---|---|---|---|---|
| $n_{10}$ | 1.8047095 | 1.8098021 | 1.8915289 | 1.8869810 | 1.8679863 |
| $k_{10}$ | 0.2694194 | 0.2379756 | 0.1677232 | 0.1583242 | 0.1633407 |
| $d_{10}$ (nm) | 36.421 | 31.711 | 26.420 | 22.598 | 22.571 |
| $n_{20}$ | 2.9911125 | 2.1295160 | 2.1348336 | 1.9270572 | 1.8682373 |
| $k_{20}$ | 1.0218786 | 0.9059492 | 0.5678980 | 0.5352831 | 0.5190358 |
| $d_{20}$ (nm) | 30.087 | 46.199 | 93.459 | 108.068 | 112.596 |
| When $n_1 \geqq n_{10}$, $n_{1m}$ = | 0.0783740 | 0.0796436 | 0.0844666 | 0.0882751 | 0.0886218 |
| When $n_1 < n_{10}$, $n_{1m}$ = | 0.0596716 | 0.0601453 | 0.0678638 | 0.0698572 | 0.0685303 |
| When $k_1 \geqq k_{10}$, $k_{1m}$ = | 0.0745129 | 0.0734180 | 0.0774060 | 0.0809473 | 0.0815564 |
| When $k_1 < k_{10}$, $k_{1m}$ = | 0.0737073 | 0.0756104 | 0.0846094 | 0.0871533 | 0.0855286 |
| When $d_1 \geqq d_{10}$, $d_{1m}$ (nm) = | 5.498 | 6.440 | 6.660 | 7.044 | 7.454 |
| When $d_1 < d_{10}$, $d_{1m}$ (nm) = | 4.112 | 4.536 | 4.657 | 4.822 | 5.013 |
| When $n_2 \geqq n_{20}$, $n_{2m}$ = | 0.2827258 | 0.2488782 | 0.2107483 | 0.1777197 | 0.1733423 |
| When $n_2 < n_{20}$, $n_{2m}$ = | 0.2979187 | 0.2268945 | 0.2048547 | 0.1904834 | 0.1888538 |
| When $k_2 \geqq k_{20}$, $k_{2m}$ = | 0.3686462 | 0.2854443 | 0.2568164 | 0.2416882 | 0.2270508 |
| When $k_2 < k_{20}$, $k_{2m}$ = | 0.2566187 | 0.1919458 | 0.1493335 | 0.1371973 | 0.1348743 |
| When $d_2 \geqq d_{20}$, $d_{2m}$ (nm) = | 4.536 | ∞ | ∞ | ∞ | ∞ |
| When $d_2 < d_{20}$, $d_{2m}$ (nm) = | 3.441 | 7.549 | 17.368 | 24.447 | 26.666 |

$0.93 \leqq NA \leqq 1.0$
$35 < T \leqq 45$

| Case | 4-06 | 4-07 | 4-08 | 4-09 | 4-10 |
|---|---|---|---|---|---|
| $n_{10}$ | 1.8894047 | 1.9013640 | 1.7974174 | 1.7778270 | 1.7589001 |
| $k_{10}$ | 0.1134244 | 0.0821095 | 0.1211843 | 0.1038067 | 0.0931193 |
| $d_{10}$ (nm) | 18.623 | 14.880 | 88.331 | 88.747 | 88.775 |
| $n_{20}$ | 1.8513003 | 1.8106171 | 2.0615819 | 1.9023003 | 1.8006679 |

-continued

| | | | | | |
|---|---|---|---|---|---|
| $k_{20}$ | 0.3877744 | 0.3102506 | 0.7049601 | 0.4013081 | 0.2880356 |
| $d_{20}$ (nm) | 170.528 | 232.433 | 48.141 | 106.512 | 170.885 |
| When $n_1 \geqq n_{10}, n_{1m}$ = | 0.0963379 | 0.1102368 | 0.0634644 | 0.0662390 | 0.0666211 |
| When $n_1 < n_{10}, n_{1m}$ = | 0.0760864 | 0.0881848 | 0.0372961 | 0.0368457 | 0.0352515 |
| When $k_1 \geqq k_{10}, k_{1m}$ = | 0.0891541 | 0.1015222 | 0.0717737 | 0.0709473 | 0.0673779 |
| When $k_1 < k_{10}, k_{1m}$ = | 0.0954272 | 0.0821095 | 0.0478455 | 0.0509119 | 0.0546045 |
| When $d_1 \geqq d_{10}, d_{1m}$ (nm) = | 7.796 | 7.721 | 10.517 | 12.746 | 16.898 |
| When $d_1 < d_{10}, d_{1m}$ (nm) = | 5.302 | 5.383 | 5.078 | 5.794 | 6.421 |
| When $n_2 \geqq n_{20}, n_{2m}$ = | 0.1607617 | 0.1549121 | 0.2063647 | 0.1805920 | 0.1791541 |
| When $n_2 < n_{20}, n_{2m}$ = | 0.1802881 | 0.1767310 | 0.1869873 | 0.1622900 | 0.1552356 |
| When $k_2 \geqq k_{20}, k_{2m}$ = | 0.1971570 | 0.1718066 | 0.1998254 | 0.2205994 | 0.2284485 |
| When $k_2 < k_{20}, k_{2m}$ = | 0.1177856 | 0.1071863 | 0.1537903 | 0.1082654 | 0.0890710 |
| When $d_2 \geqq d_{20}, d_{2m}$ (nm) = | ∞ | ∞ | 7.208 | ∞ | ∞ |
| When $d_2 < d_{20}, d_{2m}$ (nm) = | 68.041 | 110.260 | 5.967 | 13.288 | 26.909 |

$0.93 \leqq NA \leqq 1.0$
$35 < T \leqq 45$

8/35

| Case | 4-11 | 4-12 | 4-13 | 4-14 | 4-15 |
|---|---|---|---|---|---|
| $n_{10}$ | 1.7310401 | 1.7404520 | 1.7353985 | 1.7244370 | 1.7094852 |
| $k_{10}$ | 0.0827558 | 0.0960720 | 0.0882239 | 0.0802890 | 0.0677575 |
| $d_{10}$ (nm) | 89.146 | 155.339 | 154.960 | 155.397 | 155.056 |
| $n_{20}$ | 1.7041670 | 1.9461112 | 1.8293633 | 1.7457172 | 1.6751093 |
| $k_{20}$ | 0.2282102 | 0.5942640 | 0.3421815 | 0.2519901 | 0.2044537 |
| $d_{20}$ (nm) | 240.157 | 50.887 | 110.529 | 174.646 | 241.084 |
| When $n_1 \geqq n_{10}, n_{1m}$ = | 0.0658081 | 0.0609131 | 0.0631018 | 0.0626184 | 0.0606677 |
| When $n_1 < n_{10}, n_{1m}$ = | 0.0392627 | 0.0232361 | 0.0219373 | 0.0213806 | 0.0433704 |
| When $k_1 \geqq k_{10}, k_{1m}$ = | 0.0703406 | 0.0642554 | 0.0612463 | 0.0585852 | 0.0715100 |
| When $k_1 < k_{10}, k_{1m}$ = | 0.0569983 | 0.0328662 | 0.0342212 | 0.0355737 | 0.0444800 |
| When $d_1 \geqq d_{10}, d_{1m}$ (nm) = | 25.085 | 16.735 | 27.723 | 38.964 | ∞ |
| When $d_1 < d_{10}, d_{1m}$ (nm) = | 9.551 | 5.135 | 5.136 | 5.707 | 18.661 |
| When $n_2 \geqq n_{20}, n_{2m}$ = | 0.1952173 | 0.1934106 | 0.1684375 | 0.2170105 | 0.2364917 |
| When $n_2 < n_{20}, n_{2m}$ = | 0.1461670 | 0.1873682 | 0.1611987 | 0.1494055 | 0.1341663 |
| When $k_2 \geqq k_{20}, k_{2m}$ = | 0.1811243 | 0.1365161 | 0.1602917 | 0.1917432 | 0.1477625 |
| When $k_2 < k_{20}, k_{2m}$ = | 0.0805774 | 0.1412585 | 0.0980115 | 0.0826819 | 0.0722742 |
| When $d_2 \geqq d_{20}, d_{2m}$ (nm) = | ∞ | 6.877 | 15.552 | ∞ | ∞ |
| When $d_2 < d_{20}, d_{2m}$ (nm) = | 77.061 | 5.982 | 8.340 | 24.666 | 73.559 |

-continued $0.93 \leqq NA \leqq 1.0$
$35 < T \leqq 45$

| Case | 4-16 | 4-17 | 4-18 | 4-19 | 4-20 |
|---|---|---|---|---|---|
| $n_{10}$ | 1.7305468 | 1.7234847 | 1.7196555 | 1.7094719 | 1.7026367 |
| $k_{10}$ | 0.1083688 | 0.0859582 | 0.0809985 | 0.0713058 | 0.0605694 |
| $d_{10}$ (nm) | 224.105 | 219.529 | 219.492 | 221.454 | 219.016 |
| $n_{20}$ | 3.7612310 | 1.8940064 | 1.7865237 | 1.7085534 | 1.6670562 |
| $k_{20}$ | 9.7520181 | 0.5381566 | 0.3130643 | 0.2375210 | 0.1929642 |
| $d_{20}$ (nm) | 0.557 | 52.122 | 112.555 | 175.858 | 239.742 |
| When $n_1 \geqq n_{10}, n_{1m}$ = | 0.0498926 | 0.0642505 | 0.0656738 | 0.0636218 | 0.0649512 |
| When $n_1 < n_{10}, n_{1m}$ = | 0.0031824 | 0.0153259 | 0.0138647 | 0.0294287 | 0.0615662 |
| When $k_1 \geqq k_{10}, k_{1m}$ = | 0.0271924 | 0.0553479 | 0.0526111 | 0.0605078 | 0.0781384 |
| When $k_1 < k_{10}, k_{1m}$ = | 0.0108813 | 0.0230212 | 0.0207922 | 0.0257751 | 0.0395862 |
| When $d_1 \geqq d_{10}, d_{1m}$ (nm) = | 12.324 | 42.526 | ∞ | ∞ | ∞ |
| When $d_1 < d_{10}, d_{1m}$ (nm) = | 0.823 | 4.181 | 3.891 | 14.979 | 80.387 |
| When $n_2 \geqq n_{20}, n_{2m}$ = | 0.4580664 | 0.1955493 | 0.1665735 | 0.2757410 | 0.2666089 |
| When $n_2 < n_{20}, n_{2m}$ = | 1.0705701 | 0.1254541 | 0.1755249 | 0.1566431 | 0.1466138 |
| When $k_2 \geqq k_{20}, k_{2m}$ = | 0.1823242 | 0.0953308 | 0.1233594 | 0.1752612 | 0.1390967 |
| When $k_2 < k_{20}, k_{2m}$ = | 1.8675439 | 0.1410535 | 0.1010315 | 0.0760974 | 0.0711597 |
| When $d_2 \geqq d_{20}, d_{2m}$ (nm) = | 0.019 | 7.428 | ∞ | ∞ | ∞ |
| When $d_2 < d_{20}, d_{2m}$ (nm) = | 0.155 | 3.724 | 4.890 | 25.232 | 73.082 |

$0.93 \leqq NA \leqq 1.0$
$45 < T \leqq 55$

9/35

| Case | 5-01 | 5-02 | 5-03 | 5-04 | 5-05 |
|---|---|---|---|---|---|
| $n_{10}$ | 1.7952075 | 1.8907711 | 1.9054716 | 1.9347861 | 1.9562331 |
| $k_{10}$ | 0.2631488 | 0.1709411 | 0.1139096 | 0.0660701 | 0.1018371 |
| $d_{10}$ (nm) | 28.407 | 22.060 | 18.051 | 14.149 | 10.504 |
| $n_{20}$ | 1.7975159 | 1.9054700 | 1.8637077 | 1.8512928 | 1.7371318 |
| $k_{20}$ | 0.9080589 | 0.5625340 | 0.4032117 | 0.3248351 | 0.3049135 |
| $d_{20}$ (nm) | 49.215 | 101.512 | 161.182 | 218.499 | 238.789 |
| When $n_1 \geqq n_{10}, n_{1m}$ = | 0.0796008 | 0.0882104 | 0.0968323 | 0.1120276 | 0.1430420 |
| When $n_1 < n_{10}, n_{1m}$ = | 0.0558337 | 0.0676855 | 0.0756775 | 0.0900916 | 0.1115369 |
| When $k_1 \geqq k_{10}, k_{1m}$ = | 0.0737183 | 0.0824512 | 0.0899622 | 0.1015723 | 0.1322839 |
| When $k_1 < k_{10}, k_{1m}$ = | 0.0714771 | 0.0859058 | 0.0970459 | 0.0660701 | 0.1018371 |
| When $d_1 \geqq d_{10}, d_{1m}$ (nm) = | 6.136 | 6.696 | 7.231 | 6.738 | 5.941 |
| When $d_1 < d_{10}, d_{1m}$ (nm) = | 3.959 | 4.421 | 4.830 | 4.663 | 4.082 |
| When $n_2 \geqq n_{20}, n_{2m}$ = | 0.2206628 | 0.1836475 | 0.1640088 | 0.1560229 | 0.1493176 |
| When $n_2 < n_{20}, n_{2m}$ = | 0.2514893 | 0.2026611 | 0.1850330 | 0.1781982 | 0.1793958 |
| When $k_2 \geqq k_{20}, k_{2m}$ = | 0.2648120 | 0.2363086 | 0.1980701 | 0.1765576 | 0.1456726 |
| When $k_2 < k_{20}, k_{2m}$ = | 0.1661694 | 0.1390979 | 0.1188672 | 0.1083618 | 0.1075342 |

-continued

| | | | | | |
|---|---|---|---|---|---|
| When $d_2 \geqq d_{20}, d_{2m}$ (nm) = | ∞ | ∞ | ∞ | ∞ | ∞ |
| When $d_2 < d_{20}, d_{2m}$ (nm) = | 11.142 | 25.966 | 67.131 | 101.947 | 116.324 |

| | $0.93 \leqq NA \leqq 1.0$ $45 < T \leqq 55$ | | | | |
|---|---|---|---|---|---|
| Case | 5-06 | 5-07 | 5-08 | 5-09 | 5-10 |
| $n_{10}$ | 1.7844085 | 1.7702622 | 1.7541370 | 1.7279592 | 1.7375980 |
| $k_{10}$ | 0.1367381 | 0.1105738 | 0.0973387 | 0.0846136 | 0.1054836 |
| $d_{10}$ (nm) | 84.299 | 87.211 | 88.132 | 88.943 | 150.710 |
| $n_{20}$ | 1.7096132 | 1.8115599 | 1.7670571 | 1.6883751 | 1.7055974 |
| $k_{20}$ | 0.6495191 | 0.4022198 | 0.2903421 | 0.2308596 | 0.5608974 |
| $d_{20}$ (nm) | 54.242 | 106.122 | 167.020 | 233.281 | 53.799 |
| When $n_1 \geqq n_{10}, n_{1m}$ = | 0.0647021 | 0.0659351 | 0.0664050 | 0.0646069 | 0.0607947 |
| When $n_1 < n_{10}, n_{1m}$ = | 0.0336169 | 0.0333887 | 0.0319458 | 0.0381165 | 0.0178674 |
| When $k_1 \geqq k_{10}, k_{1m}$ = | 0.0728796 | 0.0707520 | 0.0653967 | 0.0692603 | 0.0616235 |
| When $k_1 < k_{10}, k_{1m}$ = | 0.0421851 | 0.0477087 | 0.0524451 | 0.0553516 | 0.0270422 |
| When $d_1 \geqq d_{10}, d_{1m}$ (nm) = | 9.564 | 12.156 | 16.406 | 23.344 | 13.595 |
| When $d_1 < d_{10}, d_{1m}$ (nm) = | 4.227 | 5.119 | 5.747 | 9.303 | 3.589 |
| When $n_2 \geqq n_{20}, n_{2m}$ = | 0.2254211 | 0.1928967 | 0.1889099 | 0.2061182 | 0.2563867 |
| When $n_2 < n_{20}, n_{2m}$ = | 0.1907227 | 0.1764453 | 0.1616943 | 0.1463477 | 0.1201587 |
| When $k_2 \geqq k_{20}, k_{2m}$ = | 0.1398059 | 0.1815479 | 0.2086975 | 0.1714539 | 0.0974426 |
| When $k_2 < k_{20}, k_{2m}$ = | 0.1320325 | 0.1038733 | 0.0888391 | 0.0812170 | 0.1216650 |
| When $d_2 \geqq d_{20}, d_{2m}$ (nm) = | 14.246 | ∞ | ∞ | ∞ | 10.184 |
| When $d_2 < d_{20}, d_{2m}$ (nm) = | 7.856 | 11.965 | 30.548 | 77.806 | 4.856 |

10/35

| | $0.93 \leqq NA \leqq 1.0$ $45 < T \leqq 55$ | | | | |
|---|---|---|---|---|---|
| Case | 5-11 | 5-12 | 5-13 | 5-14 | 5-15 |
| $n_{10}$ | 1.7329681 | 1.7221048 | 1.7083331 | 1.7220084 | 1.7182277 |
| $k_{10}$ | 0.0932680 | 0.0829100 | 0.0687145 | 0.0940320 | 0.0857940 |
| $d_{10}$ (nm) | 153.145 | 154.966 | 154.712 | 214.741 | 217.589 |
| $n_{20}$ | 1.7707311 | 1.7249696 | 1.6656993 | 1.7051250 | 1.7452872 |
| $k_{20}$ | 0.3436851 | 0.2554267 | 0.2071468 | 0.5097600 | 0.3145186 |
| $d_{20}$ (nm) | 107.979 | 168.643 | 233.037 | 53.504 | 108.615 |
| When $n_1 \geqq n_{10}, n_{1m}$ = | 0.0625659 | 0.0612402 | 0.0592444 | 0.0643567 | 0.0658276 |
| When $n_1 < n_{10}, n_{1m}$ = | 0.0170984 | 0.0172632 | 0.0416833 | 0.0078064 | 0.0068054 |
| When $k_1 \geqq k_{10}, k_{1m}$ = | 0.0565161 | 0.0540405 | 0.0705188 | 0.0454688 | 0.0426636 |
| When $k_1 < k_{10}, k_{1m}$ = | 0.0297095 | 0.0318542 | 0.0432507 | 0.0149841 | 0.0129956 |
| When $d_1 \geqq d_{10}, d_{1m}$ (nm) = | 26.425 | 34.880 | ∞ | 35.694 | ∞ |
| When $d_1 < d_{10}, d_{1m}$ (nm) = | 3.834 | 4.536 | 17.051 | 1.969 | 1.835 |
| When $n_2 \geqq n_{20}, n_{2m}$ = | 0.2299866 | 0.2362512 | 0.2473572 | 0.2585364 | 0.2705701 |
| When $n_2 < n_{20}, n_{2m}$ = | 0.1752441 | 0.1521826 | 0.1336328 | 0.0467419 | 0.0530518 |
| When $k_2 \geqq k_{20}, k_{2m}$ = | 0.1260229 | 0.1759094 | 0.1395569 | 0.0560938 | 0.0808508 |
| When $k_2 < k_{20}, k_{2m}$ = | 0.0941040 | 0.0829492 | 0.0726111 | 0.1239917 | 0.0993604 |
| When $d_2 \geqq d_{20}, d_{2m}$ (nm) = | ∞ | ∞ | ∞ | 10.256 | ∞ |
| When $d_2 < d_{20}, d_{2m}$ (nm) = | 6.312 | 26.413 | 73.432 | 2.024 | 2.346 |

| | $0.93 \leqq NA \leqq 1.0$ $45 < T \leqq 55$ | |
|---|---|---|
| Case | 5-16 | 5-17 |
| $n_{10}$ | 1.7079026 | 1.7021324 |
| $k_{10}$ | 0.0731017 | 0.0613637 |
| $d_{10}$ (nm) | 221.285 | 218.642 |
| $n_{20}$ | 1.6934483 | 1.6620357 |
| $k_{20}$ | 0.2412999 | 0.1957858 |
| $d_{20}$ (nm) | 168.585 | 230.920 |
| When $n_1 \geqq n_{10}, n_{1m}$ = | 0.0611572 | 0.0632739 |
| When $n_1 < n_{10}, n_{1m}$ = | 0.0235156 | 0.0581824 |
| When $k_1 \geqq k_{10}, k_{1m}$ = | 0.0566406 | 0.0776050 |
| When $k_1 < k_{10}, k_{1m}$ = | 0.0230566 | 0.0386719 |
| When $d_1 \geqq d_{10}, d_{1m}$ (nm) = | ∞ | ∞ |
| When $d_1 < d_{10}, d_{1m}$ (nm) = | 8.641 | 78.699 |
| When $n_2 \geqq n_{20}, n_{2m}$ = | 0.2946387 | 0.2760742 |
| When $n_2 < n_{20}, n_{2m}$ = | 0.1554272 | 0.1463647 |
| When $k_2 \geqq k_{20}, k_{2m}$ = | 0.1654895 | 0.1344739 |
| When $k_2 < k_{20}, k_{2m}$ = | 0.0676013 | 0.0719324 |
| When $d_2 \geqq d_{20}, d_{2m}$ (nm) = | ∞ | ∞ |
| When $d_2 < d_{20}, d_{2m}$ (nm) = | 26.199 | 53.085 |

11/35

| | $0.93 \leqq NA \leqq 1.0$ $55 < T \leqq 65$ | | | | |
|---|---|---|---|---|---|
| Case | 6-01 | 6-02 | 6-03 | 6-04 | 6-05 |
| $n_{10}$ | 1.7605068 | 1.8816347 | 1.9020430 | 1.9458467 | 1.9584022 |
| $k_{10}$ | 0.2771672 | 0.1829378 | 0.1268282 | 0.0703715 | 0.1032605 |
| $d_{10}$ (nm) | 28.706 | 20.725 | 16.538 | 13.048 | 10.534 |
| $n_{20}$ | 1.6786286 | 1.8151288 | 1.7976518 | 1.8275971 | 1.7382432 |
| $k_{20}$ | 0.9008770 | 0.5496963 | 0.3935708 | 0.3251874 | 0.3086817 |
| $d_{20}$ (nm) | 43.735 | 99.755 | 160.685 | 213.311 | 229.129 |
| When $n_1 \geqq n_{10}, n_{1m}$ = | 0.0840430 | 0.0931677 | 0.1035986 | 0.1192371 | 0.1431311 |
| When $n_1 < n_{10}, n_{1m}$ = | 0.0576428 | 0.0681458 | 0.0779578 | 0.0939172 | 0.1097058 |
| When $k_1 \geqq k_{10}, k_{1m}$ = | 0.0662097 | 0.0857654 | 0.0958630 | 0.1068726 | 0.1305750 |
| When $k_1 < k_{10}, k_{1m}$ = | 0.0706262 | 0.0861902 | 0.1004041 | 0.0703715 | 0.1032605 |
| When $d_1 \geqq d_{10}, d_{1m}$ (nm) = | 6.461 | 6.864 | 7.218 | 6.428 | 5.908 |
| When $d_1 < d_{10}, d_{1m}$ (nm) = | 4.241 | 4.337 | 4.665 | 4.365 | 3.988 |
| When $n_2 \geqq n_{20}, n_{2m}$ = | 0.2053870 | 0.1760388 | 0.1592407 | 0.1556714 | 0.1505713 |
| When $n_2 < n_{20}, n_{2m}$ = | 0.2197400 | 0.2099182 | 0.1887061 | 0.1809558 | 0.1813904 |
| When $k_2 \geqq k_{20}, k_{2m}$ = | 0.2532373 | 0.2078381 | 0.1779785 | 0.1687073 | 0.1458105 |

-continued

| | | | | | |
|---|---|---|---|---|---|
| When $k_2 < k_{20}, k_{2m}$ = | 0.1729968 | 0.1382983 | 0.1186841 | 0.1101477 | 0.1094250 |
| When $d_2 \geqq d_{20}, d_{2m}$ (nm) = | ∞ | ∞ | ∞ | ∞ | ∞ |
| When $d_2 < d_{20}, d_{2m}$ (nm) = | 9.750 | 24.367 | 71.258 | 104.445 | 116.852 |

| | $0.93 \leqq NA \leqq 1.0$<br>$55 < T \leqq 65$ | | | | |
|---|---|---|---|---|---|
| Case | 6-06 | 6-07 | 6-08 | 6-09 | 6-10 |
| $n_{10}$ | 1.7915017 | 1.7682864 | 1.7517777 | 1.7257399 | 1.7391311 |
| $k_{10}$ | 0.1460711 | 0.1152280 | 0.1000283 | 0.0854213 | 0.1111219 |
| $d_{10}$ (nm) | 82.108 | 86.246 | 87.803 | 88.823 | 148.271 |
| $n_{20}$ | 1.6599684 | 1.7730752 | 1.7495420 | 1.6774661 | 1.6415570 |
| $k_{20}$ | 0.6598461 | 0.3999868 | 0.2902721 | 0.2313191 | 0.5493559 |
| $d_{20}$ (nm) | 47.036 | 100.473 | 159.986 | 224.881 | 47.977 |
| When $n_1 \geqq n_{10}, n_{1m}$ = | 0.0707507 | 0.0678174 | 0.0671436 | 0.0642444 | 0.0613611 |
| When $n_1 < n_{10}, n_{1m}$ = | 0.0347034 | 0.0316797 | 0.0297241 | 0.0379114 | 0.0170081 |
| When $k_1 \geqq k_{10}, k_{1m}$ = | 0.0716638 | 0.0707349 | 0.0637610 | 0.0688733 | 0.0614063 |
| When $k_1 < k_{10}, k_{1m}$ = | 0.0419373 | 0.0459045 | 0.0509448 | 0.0544250 | 0.0258569 |
| When $d_1 \geqq d_{10}, d_{1m}$ (nm) = | 8.814 | 11.596 | 15.946 | 22.736 | 12.264 |
| When $d_1 < d_{10}, d_{1m}$ (nm) = | 3.999 | 4.706 | 5.289 | 9.347 | 3.219 |
| When $n_2 \geqq n_{20}, n_{2m}$ = | 0.2110352 | 0.2040027 | 0.1980566 | 0.2150256 | 0.2303101 |
| When $n_2 < n_{20}, n_{2m}$ = | 0.1684949 | 0.1890479 | 0.1666223 | 0.1461719 | 0.0970691 |
| When $k_2 \geqq k_{20}, k_{2m}$ = | 0.1438293 | 0.1667627 | 0.2003491 | 0.1648621 | 0.0994629 |
| When $k_2 < k_{20}, k_{2m}$ = | 0.1447302 | 0.1052173 | 0.0896777 | 0.0819421 | 0.1292871 |
| When $d_2 \geqq d_{20}, d_{2m}$ (nm) = | 15.339 | ∞ | ∞ | ∞ | 12.574 |
| When $d_2 < d_{20}, d_{2m}$ (nm) = | 6.489 | 10.552 | 32.474 | 78.570 | 4.088 |

12/35

| | $0.93 \leqq NA \leqq 1.0$<br>$55 < T \leqq 65$ | | | | |
|---|---|---|---|---|---|
| Case | 6-11 | 6-12 | 6-13 | 6-14 | 6-15 |
| $n_{10}$ | 1.7320844 | 1.7076855 | 1.7203924 | 1.7223192 | 1.7173463 |
| $k_{10}$ | 0.0968192 | 0.0689521 | 0.0842770 | 0.0985051 | 0.0890019 |
| $d_{10}$ (nm) | 152.055 | 154.586 | 154.911 | 212.081 | 216.420 |
| $n_{20}$ | 1.7411899 | 1.6612710 | 1.7118542 | 1.6387426 | 1.7205682 |
| $k_{20}$ | 0.3409343 | 0.2081961 | 0.2561923 | 0.4904233 | 0.3116849 |
| $d_{20}$ (nm) | 101.751 | 223.547 | 160.544 | 48.284 | 102.035 |
| When $n_1 \geqq n_{10}, n_{1m}$ = | 0.0640808 | 0.0590295 | 0.0609424 | 0.0598975 | 0.0677930 |
| When $n_1 < n_{10}, n_{1m}$ = | 0.0141614 | 0.0412158 | 0.0147046 | 0.0053711 | 0.0022900 |
| When $k_1 \geqq k_{10}, k_{1m}$ = | 0.0532275 | 0.0702893 | 0.0510400 | 0.0410706 | 0.0340332 |
| When $k_1 < k_{10}, k_{1m}$ = | 0.0265625 | 0.0427490 | 0.0291602 | 0.0117297 | 0.0056226 |
| When $d_1 \geqq d_{10}, d_{1m}$ (nm) = | 25.992 | ∞ | 33.192 | 33.998 | 50.996 |

-continued

| | | | | | |
|---|---|---|---|---|---|
| When $d_1 < d_{10}, d_{1m}$ (nm) = | 3.082 | 16.525 | 3.853 | 1.301 | 0.604 |
| When $n_2 \geqq n_{20}, n_{2m}$ = | 0.2268713 | 0.2531177 | 0.2476831 | 0.2556775 | 0.2704236 |
| When $n_2 < n_{20}, n_{2m}$ = | 0.1878772 | 0.1338721 | 0.1536694 | 0.0287537 | 0.0146338 |
| When $k_2 \geqq k_{20}, k_{2m}$ = | 0.1099695 | 0.1355603 | 0.1692993 | 0.0485706 | 0.0433569 |
| When $k_2 < k_{20}, k_{2m}$ = | 0.0948242 | 0.0734631 | 0.0770691 | 0.1286780 | 0.0774121 |
| When $d_2 \geqq d_{20}, d_{2m}$ (nm) = | ∞ | ∞ | ∞ | 12.209 | ∞ |
| When $d_2 < d_{20}, d_{2m}$ (nm) = | 4.972 | 56.744 | 27.273 | 1.327 | 0.772 |

| | $0.93 \leqq NA \leqq 1.0$<br>$55 < T \leqq 65$ | |
|---|---|---|
| Case | 6-16 | 6-17 |
| $n_{10}$ | 1.7068337 | 1.7019545 |
| $k_{10}$ | 0.0738736 | 0.0615388 |
| $d_{10}$ (nm) | 221.446 | 218.498 |
| $n_{20}$ | 1.6845656 | 1.6606500 |
| $k_{20}$ | 0.2425094 | 0.1970435 |
| $d_{20}$ (nm) | 159.621 | 220.941 |
| When $n_1 \geqq n_{10}, n_{1m}$ = | 0.0603540 | 0.0631677 |
| When $n_1 < n_{10}, n_{1m}$ = | 0.0209692 | 0.0568018 |
| When $k_1 \geqq k_{10}, k_{1m}$ = | 0.0545837 | 0.0777637 |
| When $k_1 < k_{10}, k_{1m}$ = | 0.0216589 | 0.0384106 |
| When $d_1 \geqq d_{10}, d_{1m}$ (nm) = | ∞ | ∞ |
| When $d_1 < d_{10}, d_{1m}$ (nm) = | 7.750 | 78.234 |
| When $n_2 \geqq n_{20}, n_{2m}$ = | 0.3057288 | 0.2826660 |
| When $n_2 < n_{20}, n_{2m}$ = | 0.1553943 | 0.1472412 |
| When $k_2 \geqq k_{20}, k_{2m}$ = | 0.1625220 | 0.1326501 |
| When $k_2 < k_{20}, k_{2m}$ = | 0.0624280 | 0.0731104 |
| When $d_2 \geqq d_{20}, d_{2m}$ (nm) = | ∞ | ∞ |
| When $d_2 < d_{20}, d_{2m}$ (nm) = | 26.805 | 48.201 |

13/35

| | $0.93 \leqq NA \leqq 1.0$<br>$65 < T \leqq 75$ | | | | |
|---|---|---|---|---|---|
| Case | 7-01 | 7-02 | 7-03 | 7-04 | 7-05 |
| $n_{10}$ | 1.7659038 | 1.8645399 | 1.8986420 | 1.9431410 | 1.8260230 |
| $k_{10}$ | 0.3040912 | 0.1945245 | 0.1330684 | 0.1068639 | 0.1610409 |
| $d_{10}$ (nm) | 29.683 | 22.504 | 17.099 | 11.420 | 82.141 |
| $n_{20}$ | 1.6951746 | 1.8232494 | 1.7981378 | 1.7406778 | 1.8123655 |
| $k_{20}$ | 1.0159152 | 0.5745287 | 0.4053118 | 0.3159076 | 0.8416018 |
| $d_{20}$ (nm) | 32.660 | 88.735 | 150.314 | 217.432 | 29.750 |
| When $n_1 \geqq n_{10}, n_{1m}$ = | 0.0851306 | 0.0913562 | 0.1021387 | 0.1343896 | 0.0697156 |
| When $n_1 < n_{10}, n_{1m}$ = | 0.0579541 | 0.0649255 | 0.0759912 | 0.1029980 | 0.0329614 |
| When $k_1 \geqq k_{10}, k_{1m}$ = | 0.0588293 | 0.0796277 | 0.0923560 | 0.1221460 | 0.0674365 |
| When $k_1 < k_{10}, k_{1m}$ = | 0.0718896 | 0.0854541 | 0.0996875 | 0.1068639 | 0.0435559 |
| When $d_1 \geqq d_{10}, d_{1m}$ (nm) = | 5.966 | 7.118 | 7.275 | 6.222 | 7.298 |
| When $d_1 < d_{10}, d_{1m}$ (nm) = | 4.222 | 4.395 | 4.641 | 4.200 | 3.443 |
| When $n_2 \geqq n_{20}, n_{2m}$ = | 0.2227673 | 0.1853540 | 0.1622253 | 0.1538269 | 0.2762463 |
| When $n_2 < n_{20}, n_{2m}$ = | 0.2074731 | 0.2178162 | 0.1908838 | 0.1813525 | 0.2757544 |
| When $k_2 \geqq k_{20}, k_{2m}$ = | 0.3106860 | 0.2340100 | 0.1838708 | 0.1497839 | 0.2030774 |

-continued

| | | | | | |
|---|---|---|---|---|---|
| When $k_2$ < $k_{20}$, $k_{2m}$ = | 0.2037939 | 0.1485229 | 0.1235767 | 0.1116138 | 0.1923645 |
| When $d_2 \geqq d_{20}$, $d_{2m}$ (nm) = | ∞ | ∞ | ∞ | ∞ | 12.449 |
| When $d_2 < d_{20}$, $d_{2m}$ (nm) = | 7.750 | 24.931 | 70.207 | 113.565 | 5.408 |

$0.93 \leqq NA \leqq 1.0$
$65 < T \leqq 75$

| Case | 7-06 | 7-07 | 7-08 | 7-09 | 7-10 |
|---|---|---|---|---|---|
| $n_{10}$ | 1.7771488 | 1.7544343 | 1.7270080 | 1.7474077 | 1.7344421 |
| $k_{10}$ | 0.1183021 | 0.1010010 | 0.0859818 | 0.1187907 | 0.0986199 |
| $d_{10}$ (nm) | 86.874 | 88.257 | 88.900 | 148.872 | 153.031 |
| $n_{20}$ | 1.8193233 | 1.7618403 | 1.6808707 | 1.6925268 | 1.7617910 |
| $k_{20}$ | 0.4301648 | 0.3008540 | 0.2360835 | 0.6251022 | 0.3597954 |
| $d_{20}$ (nm) | 86.325 | 147.888 | 214.142 | 34.244 | 89.143 |
| When $n_1 \geqq n_{10}$, $n_{1m}$ = | 0.0673694 | 0.0664294 | 0.0644080 | 0.0590649 | 0.0632410 |
| When $n_1 < n_{10}$, $n_{1m}$ = | 0.0307617 | 0.0294727 | 0.0379211 | 0.0149548 | 0.0133545 |
| When $k_1 \geqq k_{10}$, $k_{1m}$ = | 0.0672144 | 0.0623938 | 0.0685620 | 0.0548840 | 0.0510083 |
| When $k_1 < k_{10}$, $k_{1m}$ = | 0.0467444 | 0.0514600 | 0.0549805 | 0.0255261 | 0.0262878 |
| When $d_1 \geqq d_{10}$, $d_{1m}$ (nm) = | 10.761 | 15.121 | 22.543 | 10.466 | 24.985 |
| When $d_1 < d_{10}$, $d_{1m}$ (nm) = | 4.433 | 5.189 | 9.219 | 2.761 | 2.901 |
| When $n_2 \geqq n_{20}$, $n_{2m}$ = | 0.2196216 | 0.2049475 | 0.2147473 | 0.2786914 | 0.2464575 |
| When $n_2 < n_{20}$, $n_{2m}$ = | 0.1907739 | 0.1643323 | 0.1459814 | 0.1244519 | 0.1858276 |
| When $k_2 \geqq k_{20}$, $k_{2m}$ = | 0.1969482 | 0.2144763 | 0.1668457 | 0.1106995 | 0.1237866 |
| When $k_2 < k_{20}$, $k_{2m}$ = | 0.1161511 | 0.0943396 | 0.0836194 | 0.1556311 | 0.1032104 |
| When $d_2 \geqq d_{20}$, $d_{2m}$ (nm) = | ∞ | ∞ | ∞ | 9.505 | ∞ |
| When $d_2 < d_{20}$, $d_{2m}$ (nm) = | 10.265 | 27.730 | 76.727 | 3.667 | 4.914 |

$0.93 \leqq NA \leqq 1.0$
$65 < T \leqq 75$

14/35

| Case | 7-11 | 7-12 | 7-13 | 7-14 | 7-15 |
|---|---|---|---|---|---|
| $n_{10}$ | 1.7082851 | 1.7212227 | 1.7256274 | 1.7180408 | 1.7074443 |
| $k_{10}$ | 0.0693971 | 0.0845898 | 0.1038247 | 0.0895343 | 0.0742263 |
| $d_{10}$ (nm) | 154.668 | 155.411 | 212.824 | 218.202 | 221.707 |
| $n_{20}$ | 1.6632564 | 1.7183974 | 1.6530934 | 1.7315716 | 1.6896767 |
| $k_{20}$ | 0.2120421 | 0.2642962 | 0.5317369 | 0.3280557 | 0.2496384 |
| $d_{20}$ (nm) | 213.175 | 149.129 | 36.133 | 89.506 | 148.627 |
| When $n_1 \geqq n_{10}$, $n_{1m}$ = | 0.0593945 | 0.0606384 | 0.0541980 | 0.0647742 | 0.0609387 |
| When $n_1 < n_{10}$, $n_{1m}$ = | 0.0413879 | 0.0149182 | 0.0029968 | 0.0021960 | 0.0208508 |
| When $k_1 \geqq k_{10}$, $k_{1m}$ = | 0.0699487 | 0.0507495 | 0.0335364 | 0.0342871 | 0.0542102 |
| When $k_1 < k_{10}$, $k_{1m}$ = | 0.0433142 | 0.0298535 | 0.0082080 | 0.0055542 | 0.0221802 |
| When $d_1 \geqq d_{10}$, $d_{1m}$ (nm) = | ∞ | 32.689 | 15.980 | 48.365 | ∞ |

-continued

| | | | | | |
|---|---|---|---|---|---|
| When $d_1 < d_{10}$, $d_{1m}$ (nm) = | 16.649 | 3.913 | 0.723 | 0.594 | 7.641 |
| When $n_2 \geqq n_{20}$, $n_{2m}$ = | 0.2553577 | 0.2564221 | 0.2715186 | 0.1988367 | 0.3137769 |
| When $n_2 < n_{20}$, $n_{2m}$ = | 0.1341199 | 0.1522119 | 0.0214917 | 0.0208643 | 0.1570667 |
| When $k_2 \geqq k_{20}$, $k_{2m}$ = | 0.1361841 | 0.1775061 | 0.0327844 | 0.0526038 | 0.1632751 |
| When $k_2 < k_{20}$, $k_{2m}$ = | 0.0749841 | 0.0809204 | 0.1462024 | 0.0801404 | 0.0667383 |
| When $d_2 \geqq d_{20}$, $d_{2m}$ (nm) = | ∞ | ∞ | 9.604 | ∞ | ∞ |
| When $d_2 < d_{20}$, $d_{2m}$ (nm) = | 57.367 | 24.447 | 0.813 | 0.826 | 24.310 |

$0.93 \leqq NA \leqq 1.0$
$65 < T \leqq 75$

| Case | 7-16 |
|---|---|
| $n_{10}$ | 1.7023147 |
| $k_{10}$ | 0.0619030 |
| $d_{10}$ (nm) | 218.598 |
| $n_{20}$ | 1.6620389 |
| $k_{20}$ | 0.2005572 |
| $d_{20}$ (nm) | 210.752 |
| When $n_1 \geqq n_{10}$, $n_{1m}$ = | 0.0637036 |
| When $n_1 < n_{10}$, $n_{1m}$ = | 0.0577161 |
| When $k_1 \geqq k_{10}$, $k_{1m}$ = | 0.0772327 |
| When $k_1 < k_{10}$, $k_{1m}$ = | 0.0389124 |
| When $d_1 \geqq d_{10}$, $d_{1m}$ (nm) = | ∞ |
| When $d_1 < d_{10}$, $d_{1m}$ (nm) = | 78.427 |
| When $n_2 \geqq n_{20}$, $n_{2m}$ = | 0.2845728 |
| When $n_2 < n_{20}$, $n_{2m}$ = | 0.1478259 |
| When $k_2 \geqq k_{20}$, $k_{2m}$ = | 0.1321912 |
| When $k_2 < k_{20}$, $k_{2m}$ = | 0.0745581 |
| When $d_2 \geqq d_{20}$, $d_{2m}$ (nm) = | ∞ |
| When $d_2 < d_{20}$, $d_{2m}$ (nm) = | 48.632 |

$0.93 \leqq NA \leqq 1.0$
$75 < T \leqq 85$

15/35

| Case | 8-01 | 8-02 | 8-03 | 8-04 | 8-05 |
|---|---|---|---|---|---|
| $n_{10}$ | 1.7563588 | 1.8511230 | 1.8843188 | 1.9287462 | 1.8353218 |
| $k_{10}$ | 0.3324096 | 0.2092311 | 0.1443736 | 0.1105115 | 0.1759033 |
| $d_{10}$ (nm) | 35.374 | 25.991 | 18.736 | 12.655 | 87.389 |
| $n_{20}$ | 1.9274523 | 1.9063465 | 1.8018968 | 1.7494498 | 2.1171648 |
| $k_{20}$ | 1.4642575 | 0.6506745 | 0.4300566 | 0.3311673 | 1.3140425 |
| $d_{20}$ (nm) | 17.251 | 73.686 | 139.851 | 205.772 | 13.979 |
| When $n_1 \geqq n_{10}$, $n_{1m}$ = | 0.0785156 | 0.0867322 | 0.0972815 | 0.1243994 | 0.0679163 |
| When $n_1 < n_{10}$, $n_{1m}$ = | 0.0545728 | 0.0619702 | 0.0719873 | 0.0956885 | 0.0326843 |
| When $k_1 \geqq k_{10}$, $k_{1m}$ = | 0.0474365 | 0.0710938 | 0.0861206 | 0.1128003 | 0.0573657 |
| When $k_1 < k_{10}$, $k_{1m}$ = | 0.0515906 | 0.0859790 | 0.0958850 | 0.1105115 | 0.0462488 |
| When $d_1 \geqq d_{10}$, $d_{1m}$ (nm) = | 5.195 | 7.048 | 7.475 | 6.554 | 6.786 |
| When $d_1 < d_{10}$, $d_{1m}$ (nm) = | 4.054 | 4.401 | 4.771 | 4.433 | 3.439 |
| When $n_2 \geqq n_{20}$, $n_{2m}$ = | 0.3717346 | 0.2089124 | 0.1658667 | 0.1550732 | 0.3935315 |
| When $n_2 < n_{20}$, $n_{2m}$ = | 0.2566504 | 0.2226855 | 0.1899609 | 0.1803442 | 0.3930750 |
| When $k_2 \geqq k_{20}$, $k_{2m}$ = | 0.3327271 | 0.2900549 | 0.1962512 | 0.1555261 | 0.4058423 |

-continued

| | | | | | |
|---|---|---|---|---|---|
| When $k_2 < k_{20}, k_{2m}$ = | 0.2814465 | 0.1644043 | 0.1285254 | 0.1140686 | 0.2980408 |
| When $d_2 \geqq d_{20}, d_{2m}$ (nm) = | 7.242 | ∞ | ∞ | ∞ | 4.246 |
| When $d_2 < d_{20}, d_{2m}$ (nm) = | 5.453 | 18.064 | 63.635 | 86.244 | 4.110 |

| | $0.93 \leqq NA \leqq 1.0$<br>$75 < T \leqq 85$ | | | | |
|---|---|---|---|---|---|
| Case | 8-06 | 8-07 | 8-08 | 8-09 | 8-10 |
| $n_{10}$ | 1.7950810 | 1.7627960 | 1.7313791 | 1.7608801 | 1.7394221 |
| $k_{10}$ | 0.1221034 | 0.1022278 | 0.0877850 | 0.1266208 | 0.0996664 |
| $d_{10}$ (nm) | 88.670 | 88.862 | 88.999 | 153.509 | 155.305 |
| $n_{20}$ | 1.9787137 | 1.8048095 | 1.6945552 | 1.9275665 | 1.8479873 |
| $k_{20}$ | 0.5126318 | 0.3274205 | 0.2478313 | 0.9887124 | 0.4176577 |
| $d_{20}$ (nm) | 67.257 | 133.479 | 202.902 | 15.987 | 72.839 |
| When $n_1 \geqq n_{10}, n_{1m}$ = | 0.0661450 | 0.0654504 | 0.0644836 | 0.0595581 | 0.0618579 |
| When $n_1 < n_{10}, n_{1m}$ = | 0.0313049 | 0.0305920 | 0.0369946 | 0.0131787 | 0.0145801 |
| When $k_1 \geqq k_{10}, k_{1m}$ = | 0.0629285 | 0.0615845 | 0.0676172 | 0.0466980 | 0.0504663 |
| When $k_1 < k_{10}, k_{1m}$ = | 0.0495715 | 0.0531104 | 0.0563220 | 0.0260303 | 0.0287866 |
| When $d_1 \geqq d_{10}, d_{1m}$ (nm) = | 9.764 | 13.747 | 21.746 | 9.118 | 15.633 |
| When $d_1 < d_{10}, d_{1m}$ (nm) = | 4.261 | 5.184 | 8.521 | 2.425 | 3.180 |
| When $n_2 \geqq n_{20}, n_{2m}$ = | 0.1949426 | 0.2017102 | 0.2072998 | 0.3193018 | 0.1671875 |
| When $n_2 < n_{20}, n_{2m}$ = | 0.1905188 | 0.1606116 | 0.1458716 | 0.3499829 | 0.1826196 |
| When $k_2 \geqq k_{20}, k_{2m}$ = | 0.2324365 | 0.2397180 | 0.1749133 | 0.1658679 | 0.1587329 |
| When $k_2 < k_{20}, k_{2m}$ = | 0.1375964 | 0.1005615 | 0.0861584 | 0.2502869 | 0.1212964 |
| When $d_2 \geqq d_{20}, d_{2m}$ (nm) = | 11.495 | ∞ | ∞ | 4.383 | 10.247 |
| When $d_2 < d_{20}, d_{2m}$ (nm) = | 10.836 | 22.009 | 72.908 | 4.573 | 5.928 |

16/35

| | $0.93 \leqq NA \leqq 1.0$<br>$75 < T \leqq 85$ | | | | |
|---|---|---|---|---|---|
| Case | 8-11 | 8-12 | 8-13 | 8-14 | 8-15 |
| $n_{10}$ | 1.7245671 | 1.7098549 | 1.7314445 | 1.7204815 | 1.7093097 |
| $k_{10}$ | 0.0857616 | 0.0711157 | 0.1087664 | 0.0894136 | 0.0755678 |
| $d_{10}$ (nm) | 155.774 | 154.844 | 218.242 | 220.453 | 221.580 |
| $n_{20}$ | 1.7414131 | 1.6689951 | 1.7862714 | 1.7885409 | 1.7021793 |
| $k_{20}$ | 0.2835597 | 0.2212317 | 0.7962122 | 0.3769446 | 0.2655853 |
| $d_{20}$ (nm) | 136.971 | 203.148 | 18.394 | 74.763 | 137.968 |
| When $n_1 \geqq n_{10}, n_{1m}$ = | 0.0606116 | 0.0594177 | 0.0511572 | 0.0630383 | 0.0616895 |
| When $n_1 < n_{10}, n_{1m}$ = | 0.0160718 | 0.0405298 | 0.0015906 | 0.0046008 | 0.0190027 |
| When $k_1 \geqq k_{10}, k_{1m}$ = | 0.0512000 | 0.0681555 | 0.0265222 | 0.0380334 | 0.0531970 |
| When $k_1 < k_{10}, k_{1m}$ = | 0.0318042 | 0.0441748 | 0.0055811 | 0.0106726 | 0.0222839 |
| When $d_1 \geqq d_{10}, d_{1m}$ (nm) = | 31.466 | ∞ | 12.528 | 43.958 | ∞ |

-continued

| | | | | | |
|---|---|---|---|---|---|
| When $d_1 < d_{10}, d_{1m}$ (nm) = | 4.121 | 15.106 | 0.395 | 1.266 | 6.425 |
| When $n_2 \geqq n_{20}, n_{2m}$ = | 0.2472620 | 0.2537585 | 0.2927209 | 0.1651587 | 0.3131763 |
| When $n_2 < n_{20}, n_{2m}$ = | 0.1515137 | 0.1338916 | 0.0324463 | 0.1927209 | 0.1573535 |
| When $k_2 \geqq k_{20}, k_{2m}$ = | 0.1857507 | 0.1391650 | 0.0225110 | 0.0800281 | 0.1575110 |
| When $k_2 < k_{20}, k_{2m}$ = | 0.0929626 | 0.0771277 | 0.2211072 | 0.1242517 | 0.0780078 |
| When $d_2 \geqq d_{20}, d_{2m}$ (nm) = | ∞ | ∞ | 5.339 | 11.602 | ∞ |
| When $d_2 < d_{20}, d_{2m}$ (nm) = | 20.462 | 30.027 | 0.679 | 1.920 | 20.783 |

| $0.93 \leqq NA \leqq 1.0$<br>$75 < T \leqq 85$ | |
|---|---|
| Case | 8-16 |
| $n_{10}$ | 1.7029357 |
| $k_{10}$ | 0.0634027 |
| $d_{10}$ (nm) | 218.717 |
| $n_{20}$ | 1.6626290 |
| $k_{20}$ | 0.2083407 |
| $d_{20}$ (nm) | 201.624 |
| When $n_1 \geqq n_{10}, n_{1m}$ = | 0.0636414 |
| When $n_1 < n_{10}, n_{1m}$ = | 0.0583008 |
| When $k_1 \geqq k_{10}, k_{1m}$ = | 0.0748706 |
| When $k_1 < k_{10}, k_{1m}$ = | 0.0393835 |
| When $d_1 \geqq d_{10}, d_{1m}$ (nm) = | ∞ |
| When $d_1 < d_{10}, d_{1m}$ (nm) = | 77.927 |
| When $n_2 \geqq n_{20}, n_{2m}$ = | 0.2855005 |
| When $n_2 < n_{20}, n_{2m}$ = | 0.1457190 |
| When $k_2 \geqq k_{20}, k_{2m}$ = | 0.1308728 |
| When $k_2 < k_{20}, k_{2m}$ = | 0.0761951 |
| When $d_2 \geqq d_{20}, d_{2m}$ (nm) = | ∞ |
| When $d_2 < d_{20}, d_{2m}$ (nm) = | 30.691 |

17/35

| | $0.93 \leqq NA \leqq 1.0$<br>$85 < T \leqq 95$ | | | | |
|---|---|---|---|---|---|
| Case | 9-01 | 9-02 | 9-03 | 9-04 | 9-05 |
| $n_{10}$ | 1.7289685 | 1.8452520 | 1.8988873 | 1.8877112 | 1.9267904 |
| $k_{10}$ | 0.3314086 | 0.2255929 | 0.1475831 | 0.1535471 | 0.0947520 |
| $d_{10}$ (nm) | 44.247 | 26.855 | 20.944 | 19.669 | 15.612 |
| $n_{20}$ | 5.1412592 | 1.9037614 | 1.8997324 | 1.8220692 | 1.8437835 |
| $k_{20}$ | 5.4454539 | 0.7221490 | 0.4893775 | 0.4687151 | 0.3693724 |
| $d_{20}$ (nm) | 1.484 | 66.898 | 122.094 | 129.650 | 183.529 |
| When $n_1 \geqq n_{10}, n_{1m}$ = | 0.0720642 | 0.0846375 | 0.0908557 | 0.0941199 | 0.1057788 |
| When $n_1 < n_{10}, n_{1m}$ = | 0.0586633 | 0.0599194 | 0.0695422 | 0.0700256 | 0.0833301 |
| When $k_1 \geqq k_{10}, k_{1m}$ = | 0.0476758 | 0.0671912 | 0.0784241 | 0.0821533 | 0.0936853 |
| When $k_1 < k_{10}, k_{1m}$ = | 0.0453955 | 0.0846301 | 0.0932227 | 0.0950391 | 0.0947520 |
| When $d_1 \geqq d_{10}, d_{1m}$ (nm) = | 4.793 | 6.632 | 6.977 | 7.158 | 6.784 |
| When $d_1 < d_{10}, d_{1m}$ (nm) = | 4.550 | 4.181 | 4.538 | 4.591 | 4.595 |
| When $n_2 \geqq n_{20}, n_{2m}$ = | 1.1337476 | 0.2089880 | 0.1771472 | 0.1681067 | 0.1597327 |
| When $n_2 < n_{20}, n_{2m}$ = | 1.1352368 | 0.2210583 | 0.1914734 | 0.1898022 | 0.1792920 |
| When $k_2 \geqq k_{20}, k_{2m}$ = | 0.8630298 | 0.2922070 | 0.2387195 | 0.2089600 | 0.1845532 |

-continued

| | | | | | |
|---|---|---|---|---|---|
| When $k_2 <$ $k_{20}, k_{2m}$ = | 1.0641260 | 0.1706519 | 0.1365454 | 0.1328516 | 0.1184924 |
| When $d_2 \geqq$ $d_{20}, d_{2m}$ (nm) = | 0.527 | ∞ | ∞ | ∞ | ∞ |
| When $d_2 <$ $d_{20}, d_{2m}$ (nm) = | 0.379 | 14.827 | 35.595 | 55.475 | 73.593 |

| | 0.93 ≦ NA ≦ 1.0<br>85 < T ≦ 95 | | | | |
|---|---|---|---|---|---|
| Case | 9-06 | 9-07 | 9-08 | 9-09 | 9-10 |
| $n_{10}$ | 1.9311024 | 1.9377300 | 1.8321358 | 1.8340055 | 1.7711711 |
| $k_{10}$ | 0.1132645 | 0.0882760 | 0.1783607 | 0.1409526 | 0.1059247 |
| $d_{10}$ (nm) | 13.318 | 11.094 | 92.959 | 90.549 | 89.053 |
| $n_{20}$ | 1.7624681 | 1.7478213 | 3.8484718 | 2.7003837 | 1.8505388 |
| $k_{20}$ | 0.3523973 | 0.2927773 | 3.7040697 | 0.6754163 | 0.3612112 |
| $d_{20}$ (nm) | 195.472 | 252.908 | 2.442 | 40.010 | 121.432 |
| When $n_1 \geqq$ $n_{10}, n_{1m}$ = | 0.1192212 | 0.1370740 | 0.0646143 | 0.0640906 | 0.0642236 |
| When $n_1 <$ $n_{10}, n_{1m}$ = | 0.0917322 | 0.1105750 | 0.0342749 | 0.0314893 | 0.0302832 |
| When $k_1 \geqq$ $k_{10}, k_{1m}$ = | 0.1074902 | 0.1261145 | 0.0537451 | 0.0578040 | 0.0599036 |
| When $k_1 <$ $k_{10}, k_{1m}$ = | 0.1132645 | 0.0882760 | 0.0424707 | 0.0518921 | 0.0535962 |
| When $d_1 \geqq$ $d_{10}, d_{1m}$ (nm) = | 6.457 | 6.373 | 6.914 | 7.622 | 12.267 |
| When $d_1 <$ $d_{10}, d_{1m}$ (nm) = | 4.357 | 4.610 | 3.684 | 3.553 | 4.848 |
| When $n_2 \geqq$ $n_{20}, n_{2m}$ = | 0.1546643 | 0.1575439 | 0.8768713 | 0.1918994 | 0.1964832 |
| When $n_2 <$ $n_{20}, n_{2m}$ = | 0.1796094 | 0.1753381 | 0.8006409 | 0.2240674 | 0.1600745 |
| When $k_2 \geqq$ $k_{20}, k_{2m}$ = | 0.1600171 | 0.1481116 | 0.9241052 | 0.2582642 | 0.2396375 |
| When $k_2 <$ $k_{20}, k_{2m}$ = | 0.1162842 | 0.1079150 | 0.8229163 | 0.1769763 | 0.1063232 |
| When $d_2 \geqq$ $d_{20}, d_{2m}$ (nm) = | ∞ | ∞ | 0.854 | 4.088 | ∞ |
| When $d_2 <$ $d_{20}, d_{2m}$ (nm) = | 79.416 | 123.401 | 0.636 | 4.130 | 18.235 |

18/35

| | 0.93 ≦ NA ≦ 1.0<br>85 < T ≦ 95 | | | | |
|---|---|---|---|---|---|
| Case | 9-11 | 9-12 | 9-13 | 9-14 | 9-15 |
| $n_{10}$ | 1.7360863 | 1.7197908 | 1.7660895 | 1.7439719 | 1.7279356 |
| $k_{10}$ | 0.0911204 | 0.0799131 | 0.1278221 | 0.1032091 | 0.0888807 |
| $d_{10}$ (nm) | 88.900 | 88.028 | 159.319 | 156.425 | 155.640 |
| $n_{20}$ | 1.7067614 | 1.6618119 | 4.3535883 | 1.9650733 | 1.7635448 |
| $k_{20}$ | 0.2637604 | 0.2120965 | 4.0919379 | 0.4980866 | 0.3088945 |
| $d_{20}$ (nm) | 192.941 | 257.777 | 1.526 | 59.654 | 126.749 |
| When $n_1 \geqq$ $n_{10}, n_{1m}$ = | 0.0638330 | 0.0656592 | 0.0584094 | 0.0605725 | 0.0597937 |
| When $n_1 <$ $n_{10}, n_{1m}$ = | 0.0350525 | 0.0511377 | 0.0141675 | 0.0144019 | 0.0151697 |
| When $k_1 \geqq$ $k_{10}, k_{1m}$ = | 0.0655725 | 0.0796582 | 0.0444238 | 0.0479309 | 0.0488806 |
| When $k_1 <$ $k_{10}, k_{1m}$ = | 0.0571082 | 0.0562439 | 0.0291333 | 0.0298792 | 0.0316455 |
| When $d_1 \geqq$ $d_{10}, d_{1m}$ (nm) = | 20.203 | 29.484 | 8.864 | 13.240 | 29.427 |
| When $d_1 <$ $d_{10}, d_{1m}$ (nm) = | 7.546 | 13.995 | 2.626 | 3.070 | 3.728 |
| When $n_2 \geqq$ $n_{20}, n_{2m}$ = | 0.2021118 | 0.1991125 | 0.8787561 | 0.1681836 | 0.2119507 |
| When $n_2 <$ $n_{20}, n_{2m}$ = | 0.1462866 | 0.1442920 | 0.9231299 | 0.1869897 | 0.1520459 |
| When $k_2 \geqq$ $k_{20}, k_{2m}$ = | 0.1808130 | 0.1431189 | 0.6934375 | 0.1601843 | 0.1789355 |
| When $k_2 <$ $k_{20}, k_{2m}$ = | 0.0887085 | 0.0763562 | 1.0372803 | 0.1399158 | 0.0974194 |
| When $d_2 \geqq$ $d_{20}, d_{2m}$ (nm) = | ∞ | ∞ | 0.372 | 7.404 | ∞ |
| When $d_2 <$ $d_{20}, d_{2m}$ (nm) = | 33.573 | 81.452 | 0.412 | 5.841 | 17.631 |

| | 0.93 ≦ NA ≦ 1.0<br>85 < T ≦ 95 | | | | |
|---|---|---|---|---|---|
| Case | 9-16 | 9-17 | 9-18 | 9-19 | 9-20 |
| $n_{10}$ | 1.7114085 | 1.7070625 | 1.7347333 | 1.7230132 | 1.7111302 |
| $k_{10}$ | 0.0740744 | 0.0641745 | 0.1100034 | 0.0920219 | 0.0786417 |
| $d_{10}$ (nm) | 154.740 | 153.245 | 225.621 | 220.898 | 221.002 |
| $n_{20}$ | 1.6716288 | 1.6634512 | 4.2666617 | 1.8597675 | 1.7127614 |
| $k_{20}$ | 0.2338686 | 0.1921909 | 4.0109081 | 0.4430799 | 0.2870105 |
| $d_{20}$ (nm) | 194.347 | 254.410 | 1.346 | 63.229 | 128.848 |
| When $n_1 \geqq$ $n_{10}, n_{1m}$ = | 0.0584460 | 0.0617004 | 0.0476050 | 0.0625842 | 0.0612109 |
| When $n_1 <$ $n_{10}, n_{1m}$ = | 0.0344641 | 0.0580713 | 0.0023816 | 0.0042908 | 0.0142651 |
| When $k_1 \geqq$ $k_{10}, k_{1m}$ = | 0.0648608 | 0.0822974 | 0.0260010 | 0.0346094 | 0.0487000 |
| When $k_1 <$ $k_{10}, k_{1m}$ = | 0.0443103 | 0.0454309 | 0.0085535 | 0.0110950 | 0.0198962 |
| When $d_1 \geqq$ $d_{10}, d_{1m}$ (nm) = | ∞ | ∞ | 11.896 | 40.249 | ∞ |
| When $d_1 <$ $d_{10}, d_{1m}$ (nm) = | 12.619 | 28.388 | 0.607 | 1.162 | 4.464 |
| When $n_2 \geqq$ $n_{20}, n_{2m}$ = | 0.2496582 | 0.2459351 | 0.6243091 | 0.1726245 | 0.1878369 |
| When $n_2 <$ $n_{20}, n_{2m}$ = | 0.1333875 | 0.1351294 | 0.9687061 | 0.0992944 | 0.1569519 |
| When $k_2 \geqq$ $k_{20}, k_{2m}$ = | 0.1378833 | 0.1234607 | 0.1299146 | 0.0597583 | 0.1385217 |
| When $k_2 <$ $k_{20}, k_{2m}$ = | 0.0791492 | 0.0682422 | 1.1651697 | 0.1405090 | 0.0853906 |
| When $d_2 \geqq$ $d_{20}, d_{2m}$ (nm) = | ∞ | ∞ | 0.085 | 8.765 | ∞ |
| When $d_2 <$ $d_{20}, d_{2m}$ (nm) = | 27.415 | 76.157 | 0.398 | 1.778 | 18.221 |

19/35

| | 0.93 ≦ NA ≦ 1.0<br>85 < T ≦ 95 | | |
|---|---|---|---|
| Case | 9-21 | 9-22 | 9-23 |
| $n_{10}$ | 1.7035342 | 1.7027484 | 1.7001226 |
| $k_{10}$ | 0.0659797 | 0.0572097 | 0.0542621 |
| $d_{10}$ (nm) | 218.617 | 216.627 | 277.695 |
| $n_{20}$ | 1.6615801 | 1.6695991 | 1.6762439 |
| $k_{20}$ | 0.2195726 | 0.1821496 | 0.1770375 |
| $d_{20}$ (nm) | 193.289 | 251.116 | 248.521 |
| When $n_1 \geqq n_{10}, n_{1m}$ = | 0.0623376 | 0.0678125 | 0.0799658 |
| When $n_1 < n_{10}, n_{1m}$ = | 0.0535010 | 0.0686682 | 0.1014282 |
| When $k_1 \geqq k_{10}, k_{1m}$ = | 0.0710327 | 0.0861914 | 0.0881311 |
| When $k_1 < k_{10}, k_{1m}$ = | 0.0393738 | 0.0410693 | 0.0390344 |

-continued

| | | | |
|---|---|---|---|
| When $d_1 \geqq d_{10}$, $d_{1m}$ (nm) = | ∞ | ∞ | ∞ |
| When $d_1 < d_{10}$, $d_{1m}$ (nm) = | 76.543 | 86.880 | 145.024 |
| When $n_2 \geqq n_{20}$, $n_{2m}$ = | 0.2919910 | 0.2682678 | 0.2949561 |
| When $n_2 < n_{20}$, $n_{2m}$ = | 0.1427539 | 0.1485803 | 0.2037488 |
| When $k_2 \geqq k_{20}$, $k_{2m}$ = | 0.1267480 | 0.1253760 | 0.1874854 |
| When $k_2 < k_{20}$, $k_{2m}$ = | 0.0781458 | 0.0670801 | 0.0719922 |
| When $d_2 \geqq d_{20}$, $d_{2m}$ (nm) = | ∞ | ∞ | ∞ |
| When $d_2 < d_{20}$, $d_{2m}$ (nm) = | 27.736 | 75.187 | 78.004 |

$0.93 \leqq NA \leqq 1.0$
$95 < T \leqq 105$

| Case | 10-01 | 10-02 | 10-03 | 10-04 | 10-05 |
|---|---|---|---|---|---|
| $n_{10}$ | 1.8593145 | 1.9010800 | 1.9204218 | 1.9438629 | 1.8201241 |
| $k_{10}$ | 0.2496127 | 0.1636004 | 0.1149718 | 0.1088618 | 0.1437532 |
| $d_{10}$ (nm) | 26.535 | 19.815 | 15.218 | 10.610 | 89.353 |
| $n_{20}$ | 1.9155767 | 1.8411706 | 1.7975616 | 1.7190727 | 2.3681639 |
| $k_{20}$ | 0.8329906 | 0.5121692 | 0.3794158 | 0.2999844 | 0.7410526 |
| $d_{20}$ (nm) | 59.684 | 120.535 | 182.059 | 250.015 | 43.212 |
| When $n_1 \geqq n_{10}$, $n_{1m}$ = | 0.0816284 | 0.0922021 | 0.1074707 | 0.1413159 | 0.0582056 |
| When $n_1 < n_{10}$, $n_{1m}$ = | 0.0571204 | 0.0681042 | 0.0820581 | 0.1125684 | 0.0261719 |
| When $k_1 \geqq k_{10}$, $k_{1m}$ = | 0.0635767 | 0.0796045 | 0.0956897 | 0.1313098 | 0.0522705 |
| When $k_1 < k_{10}$, $k_{1m}$ = | 0.0810986 | 0.0930249 | 0.1101465 | 0.1088618 | 0.0503638 |
| When $d_1 \geqq d_{10}$, $d_{1m}$ (nm) = | 5.728 | 6.581 | 6.674 | 6.005 | 7.527 |
| When $d_1 < d_{10}$, $d_{1m}$ (nm) = | 3.587 | 4.159 | 4.431 | 4.306 | 3.047 |
| When $n_2 \geqq n_{20}$, $n_{2m}$ = | 0.2110999 | 0.1699976 | 0.1589343 | 0.1579346 | 0.2155920 |
| When $n_2 < n_{20}$, $n_{2m}$ = | 0.2273865 | 0.1928259 | 0.1800378 | 0.1714307 | 0.2110571 |
| When $k_2 \geqq k_{20}$, $k_{2m}$ = | 0.3068860 | 0.2171289 | 0.1741077 | 0.1426062 | 0.2751843 |
| When $k_2 < k_{20}$, $k_{2m}$ = | 0.1756396 | 0.1352295 | 0.1186548 | 0.1082129 | 0.1794531 |
| When $d_2 \geqq d_{20}$, $d_{2m}$ (nm) = | ∞ | ∞ | ∞ | ∞ | 5.764 |
| When $d_2 < d_{20}$, $d_{2m}$ (nm) = | 12.732 | 34.057 | 73.872 | 121.675 | 5.150 |

$0.93 \leqq NA \leqq 1.0$
$95 < T \leqq 105$

20/35

| Case | 10-06 | 10-07 | 10-08 | 10-09 | 10-10 |
|---|---|---|---|---|---|
| $n_{10}$ | 1.7719135 | 1.7372876 | 1.7204595 | 1.7445424 | 1.7286821 |
| $k_{10}$ | 0.1119845 | 0.0953951 | 0.0830085 | 0.1106490 | 0.0936244 |
| $d_{10}$ (nm) | 88.526 | 88.555 | 87.798 | 155.347 | 154.936 |
| $n_{20}$ | 1.8420973 | 1.7021944 | 1.6574450 | 1.9643384 | 1.7602486 |
| $k_{20}$ | 0.3885265 | 0.2779787 | 0.2209480 | 0.5665503 | 0.3317476 |
| $d_{20}$ (nm) | 115.256 | 185.353 | 249.744 | 53.939 | 119.649 |
| When $n_1 \geqq n_{10}$, $n_{1m}$ = | 0.0621143 | 0.0621887 | 0.0641711 | 0.0553430 | 0.0576575 |
| When $n_1 < n_{10}$, $n_{1m}$ = | 0.0270313 | 0.0323645 | 0.0489441 | 0.0092163 | 0.0110840 |
| When $k_1 \geqq k_{10}$, $k_{1m}$ = | 0.0562158 | 0.0627490 | 0.0779517 | 0.0376074 | 0.0417603 |
| When $k_1 < k_{10}$, $k_{1m}$ = | 0.0520581 | 0.0564075 | 0.0555945 | 0.0251758 | 0.0276855 |
| When $d_1 \geqq d_{10}$, $d_{1m}$ (nm) = | 11.132 | 18.518 | 24.475 | 10.852 | 25.311 |
| When $d_1 < d_{10}$, $d_{1m}$ (nm) = | 4.165 | 6.637 | 12.657 | 1.885 | 2.611 |
| When $n_2 \geqq n_{20}$, $n_{2m}$ = | 0.1959729 | 0.2028772 | 0.1967151 | 0.1949902 | 0.2380078 |
| When $n_2 < n_{20}$, $n_{2m}$ = | 0.1629126 | 0.1469397 | 0.1441541 | 0.1889697 | 0.1549414 |
| When $k_2 \geqq k_{20}$, $k_{2m}$ = | 0.2347974 | 0.1750098 | 0.1399744 | 0.1001758 | 0.1456445 |
| When $k_2 < k_{20}$, $k_{2m}$ = | 0.1074329 | 0.0897974 | 0.0774023 | 0.1436816 | 0.0981848 |
| When $d_2 \geqq d_{20}$, $d_{2m}$ (nm) = | ∞ | ∞ | ∞ | 7.077 | ∞ |
| When $d_2 < d_{20}$, $d_{2m}$ (nm) = | 17.579 | 32.188 | 79.555 | 4.014 | 9.652 |

$0.93 \leqq NA \leqq 1.0$
$95 < T \leqq 105$

| Case | 10-11 | 10-12 | 10-13 | 10-14 | 10-15 |
|---|---|---|---|---|---|
| $n_{10}$ | 1.7117780 | 1.7072616 | 1.7114074 | 1.7035514 | 1.7027912 |
| $k_{10}$ | 0.0773392 | 0.0664543 | 0.0830146 | 0.0688006 | 0.0591414 |
| $d_{10}$ (nm) | 154.355 | 152.987 | 220.011 | 218.183 | 216.340 |
| $n_{20}$ | 1.6664488 | 1.6597858 | 1.7075466 | 1.6565327 | 1.6669294 |
| $k_{20}$ | 0.2460450 | 0.2000883 | 0.3068810 | 0.2307053 | 0.1896158 |
| $d_{20}$ (nm) | 186.501 | 246.239 | 121.613 | 185.316 | 242.803 |
| When $n_1 \geqq n_{10}$, $n_{1m}$ = | 0.0563684 | 0.0596582 | 0.0593091 | 0.0598755 | 0.0652673 |
| When $n_1 < n_{10}$, $n_{1m}$ = | 0.0298474 | 0.0556995 | 0.0074023 | 0.0481897 | 0.0654077 |
| When $k_1 \geqq k_{10}$, $k_{1m}$ = | 0.0607349 | 0.0799170 | 0.0390686 | 0.0670154 | 0.0838220 |
| When $k_1 < k_{10}$, $k_{1m}$ = | 0.0430676 | 0.0448303 | 0.0134863 | 0.0384473 | 0.0405530 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 9.756 | 23.688 | 2.192 | 28.661 | 83.384 |
| When $n_2 \geqq n_{20}$, $n_{2m}$ = | 0.2552490 | 0.2502368 | 0.2301306 | 0.3057727 | 0.2764221 |
| When $n_2 < n_{20}$, $n_{2m}$ = | 0.1325989 | 0.1345728 | 0.1592334 | 0.1419543 | 0.1480603 |
| When $k_2 \geqq k_{20}$, $k_{2m}$ = | 0.1285986 | 0.1190894 | 0.0974548 | 0.1182935 | 0.1218213 |
| When $k_2 < k_{20}$, $k_{2m}$ = | 0.0799036 | 0.0691528 | 0.0735474 | 0.0793201 | 0.0682898 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 26.413 | 74.134 | 17.074 | 26.587 | 73.152 |

$0.93 \leqq NA \leqq 1.0$
$105 < T \leqq 115$

21/35

| Case | 11-01 | 11-02 | 11-03 | 11-04 | 11-05 |
|---|---|---|---|---|---|
| $n_{10}$ | 1.8881577 | 1.9218914 | 1.9458883 | 1.9409291 | 1.7882093 |
| $k_{10}$ | 0.2795127 | 0.1797398 | 0.1322078 | 0.1179060 | 0.1515662 |
| $d_{10}$ (nm) | 22.871 | 17.442 | 13.080 | 10.849 | 85.800 |
| $n_{20}$ | 1.7550786 | 1.7746647 | 1.7478516 | 1.7108849 | 1.7933752 |
| $k_{20}$ | 0.8705815 | 0.5227186 | 0.3833699 | 0.3088835 | 0.6703287 |
| $d_{20}$ (nm) | 60.032 | 119.813 | 181.809 | 241.776 | 55.966 |
| When $n_1 \geqq n_{10}$, $n_{1m}$ = | 0.0826208 | 0.0977563 | 0.1186780 | 0.1376917 | 0.0543359 |
| When $n_1 < n_{10}$, $n_{1m}$ = | 0.0520789 | 0.0682861 | 0.0872974 | 0.1088391 | 0.0162500 |

-continued

| | | | | | |
|---|---|---|---|---|---|
| When $k_1 \geqq k_{10}, k_{1m}$ = | 0.0630823 | 0.0841675 | 0.1052368 | 0.1278345 | 0.0453015 |
| When $k_1 < k_{10}, k_{1m}$ = | 0.0771240 | 0.0966394 | 0.1209399 | 0.1179060 | 0.0399414 |
| When $d_1 \geqq d_{10}, d_{1m}$ (nm) = | 4.844 | 5.864 | 5.837 | 5.925 | 7.044 |
| When $d_1 < d_{10}, d_{1m}$ (nm) = | 2.746 | 3.528 | 3.770 | 4.232 | 1.998 |
| When $n_2 \geqq n_{20}, n_{2m}$ = | 0.1779102 | 0.1610864 | 0.1553113 | 0.1599890 | 0.1976709 |
| When $n_2 < n_{20}, n_{2m}$ = | 0.2409973 | 0.1978687 | 0.1825439 | 0.1715320 | 0.2140332 |
| When $k_2 \geqq k_{20}, k_{2m}$ = | 0.2513745 | 0.1848108 | 0.1557214 | 0.1414282 | 0.1190186 |
| When $k_2 < k_{20}, k_{2m}$ = | 0.1529724 | 0.1289783 | 0.1162878 | 0.1089014 | 0.1251477 |
| When $d_2 \geqq d_{20}, d_{2m}$ (nm) = | ∞ | ∞ | ∞ | ∞ | 22.520 |
| When $d_2 < d_{20}, d_{2m}$ (nm) = | 14.459 | 47.581 | 76.951 | 118.169 | 7.215 |

$0.93 \leqq NA \leqq 1.0$
$105 < T \leqq 115$

| Case | 11-06 | 11-07 | 11-08 | 11-09 | 11-10 |
|---|---|---|---|---|---|
| $n_{10}$ | 1.7649059 | 1.7337710 | 1.7199633 | 1.7259527 | 1.7103936 |
| $k_{10}$ | 0.1193411 | 0.0996522 | 0.0855558 | 0.0989978 | 0.0800216 |
| $d_{10}$ (nm) | 87.339 | 88.039 | 87.477 | 153.714 | 153.726 |
| $n_{20}$ | 1.7745734 | 1.6760618 | 1.6497564 | 1.7204930 | 1.6497935 |
| $k_{20}$ | 0.3964773 | 0.2847568 | 0.2267213 | 0.3415865 | 0.2528816 |
| $d_{20}$ (nm) | 113.800 | 179.842 | 241.489 | 115.571 | 179.482 |
| When $n_1 \geqq n_{10}, n_{1m}$ = | 0.0601648 | 0.0599890 | 0.0628394 | 0.0551172 | 0.0538281 |
| When $n_1 < n_{10}, n_{1m}$ = | 0.0211145 | 0.0296448 | 0.0487646 | 0.0042871 | 0.0282654 |
| When $k_1 \geqq k_{10}, k_{1m}$ = | 0.0504663 | 0.0599475 | 0.0772742 | 0.0278052 | 0.0572974 |
| When $k_1 < k_{10}, k_{1m}$ = | 0.0475183 | 0.0544922 | 0.0541711 | 0.0166541 | 0.0416528 |
| When $d_1 \geqq d_{10}, d_{1m}$ (nm) = | 10.266 | 16.506 | 22.112 | 22.094 | 29.214 |
| When $d_1 < d_{10}, d_{1m}$ (nm) = | 3.195 | 5.968 | 12.188 | 0.978 | 9.029 |
| When $n_2 \geqq n_{20}, n_{2m}$ = | 0.1995813 | 0.2097351 | 0.1798193 | 0.2563574 | 0.2736133 |
| When $n_2 < n_{20}, n_{2m}$ = | 0.1736548 | 0.1494116 | 0.1464758 | 0.1632507 | 0.1337610 |
| When $k_2 \geqq k_{20}, k_{2m}$ = | 0.1791345 | 0.1568970 | 0.1341675 | 0.0805750 | 0.1130872 |
| When $k_2 < k_{20}, k_{2m}$ = | 0.1012146 | 0.0889111 | 0.0780908 | 0.0849402 | 0.0789160 |
| When $d_2 \geqq d_{20}, d_{2m}$ (nm) = | ∞ | ∞ | ∞ | ∞ | ∞ |
| When $d_2 < d_{20}, d_{2m}$ (nm) = | 14.312 | 35.616 | 79.447 | 3.314 | 27.322 |

$0.93 \leqq NA \leqq 1.0$
$105 < T \leqq 115$

22/35

| Case | 11-11 | 11-12 | 11-13 |
|---|---|---|---|
| $n_{10}$ | 1.7070930 | 1.7028018 | 1.7027432 |
| $k_{10}$ | 0.0681638 | 0.0710148 | 0.0605235 |
| $d_{10}$ (nm) | 152.585 | 217.506 | 215.929 |
| $n_{20}$ | 1.6551703 | 1.6456663 | 1.6646615 |
| $k_{20}$ | 0.2055639 | 0.2376270 | 0.1950188 |
| $d_{20}$ (nm) | 237.501 | 177.429 | 233.713 |
| When $n_1 \geqq n_{10}, n_{1m}$ = | 0.0578955 | 0.0572009 | 0.0625354 |
| When $n_1 < n_{10}, n_{1m}$ = | 0.0537671 | 0.0422668 | 0.0608704 |
| When $k_1 \geqq k_{10}, k_{1m}$ = | 0.0790588 | 0.0645129 | 0.0827734 |
| When $k_1 < k_{10}, k_{1m}$ = | 0.0435974 | 0.0363208 | 0.0394031 |
| When $d_1 \geqq d_{10}, d_{1m}$ (nm) = | ∞ | ∞ | ∞ |
| When $d_1 < d_{10}, d_{1m}$ (nm) = | 20.858 | 18.787 | 80.567 |
| When $n_2 \geqq n_{20}, n_{2m}$ = | 0.1279260 | 0.3212610 | 0.2872583 |
| When $n_2 < n_{20}, n_{2m}$ = | 0.1371912 | 0.1436340 | 0.1515588 |
| When $k_2 \geqq k_{20}, k_{2m}$ = | 0.1138037 | 0.1091870 | 0.1188855 |
| When $k_2 < k_{20}, k_{2m}$ = | 0.0699854 | 0.0793604 | 0.0696228 |
| When $d_2 \geqq d_{20}, d_{2m}$ (nm) = | ∞ | ∞ | ∞ |
| When $d_2 < d_{20}, d_{2m}$ (nm) = | 73.529 | 27.402 | 72.558 |

$0.93 \leqq NA \leqq 1.0$
$115 < T \leqq 125$

| Case | 12-01 | 12-02 | 12-03 | 12-04 | 12-05 |
|---|---|---|---|---|---|
| $n_{10}$ | 1.8909431 | 1.9524263 | 1.9741784 | 1.9011191 | 1.7812655 |
| $k_{10}$ | 0.3085424 | 0.1909748 | 0.1389140 | 0.1449022 | 0.1647646 |
| $d_{10}$ (nm) | 20.418 | 15.444 | 11.832 | 11.795 | 82.868 |
| $n_{20}$ | 1.5964478 | 1.7414925 | 1.7353816 | 1.6673230 | 1.6154117 |
| $k_{20}$ | 0.8353138 | 0.5288169 | 0.3892797 | 0.3043383 | 0.6141968 |
| $d_{20}$ (nm) | 60.909 | 116.361 | 176.360 | 237.538 | 58.066 |
| When $n_1 \geqq n_{10}, n_{1m}$ = | 0.0896326 | 0.1058130 | 0.1273743 | 0.1294861 | 0.0526233 |
| When $n_1 < n_{10}, n_{1m}$ = | 0.0482068 | 0.0693359 | 0.0898755 | 0.1018958 | 0.0089111 |
| When $k_1 \geqq k_{10}, k_{1m}$ = | 0.0687769 | 0.0897180 | 0.1101831 | 0.1230750 | 0.0397290 |
| When $k_1 < k_{10}, k_{1m}$ = | 0.0788684 | 0.1029199 | 0.1292102 | 0.1244238 | 0.0264612 |
| When $d_1 \geqq d_{10}, d_{1m}$ (nm) = | 4.348 | 5.029 | 5.176 | 6.485 | 6.077 |
| When $d_1 < d_{10}, d_{1m}$ (nm) = | 2.275 | 2.981 | 3.260 | 4.641 | 1.033 |
| When $n_2 \geqq n_{20}, n_{2m}$ = | 0.1653235 | 0.1570801 | 0.1545581 | 0.1637158 | 0.2122083 |
| When $n_2 < n_{20}, n_{2m}$ = | 0.1924231 | 0.2075879 | 0.1868823 | 0.1636792 | 0.1151331 |
| When $k_2 \geqq k_{20}, k_{2m}$ = | 0.1706042 | 0.1628406 | 0.1476868 | 0.1368591 | 0.0534973 |
| When $k_2 < k_{20}, k_{2m}$ = | 0.1411853 | 0.1262378 | 0.1172034 | 0.1087061 | 0.1078625 |
| When $d_2 \geqq d_{20}, d_{2m}$ (nm) = | ∞ | ∞ | ∞ | ∞ | 22.263 |
| When $d_2 < d_{20}, d_{2m}$ (nm) = | 15.932 | 41.005 | 77.327 | 119.056 | 3.631 |

$0.93 \leqq NA \leqq 1.0$
$115 < T \leqq 125$

23/35

| Case | 12-06 | 12-07 | 12-08 | 12-09 | 12-10 |
|---|---|---|---|---|---|
| $n_{10}$ | 1.7599364 | 1.7294022 | 1.7193592 | 1.7088052 | 1.7070991 |
| $k_{10}$ | 0.1268761 | 0.1028924 | 0.0869972 | 0.0815889 | 0.0689994 |
| $d_{10}$ (nm) | 86.158 | 87.627 | 87.259 | 153.347 | 152.325 |
| $n_{20}$ | 1.7200975 | 1.6470339 | 1.6442041 | 1.6346844 | 1.6535493 |
| $k_{20}$ | 0.3928633 | 0.2862372 | 0.2301394 | 0.2563356 | 0.2091466 |
| $d_{20}$ (nm) | 111.244 | 173.600 | 231.990 | 171.193 | 227.454 |
| When $n_1 \geqq n_{10}, n_{1m}$ = | 0.0606738 | 0.0583850 | 0.0624988 | 0.0517444 | 0.0574902 |
| When $n_1 < n_{10}, n_{1m}$ = | 0.0144922 | 0.0280688 | 0.0507288 | 0.0284387 | 0.0507019 |
| When $k_1 \geqq k_{10}, k_{1m}$ = | 0.0425989 | 0.0573376 | 0.0776721 | 0.0554700 | 0.0798230 |

-continued

| | | | | | |
|---|---|---|---|---|---|
| When $k_1 < k_{10}, k_{1m}$ = | 0.0406250 | 0.0512256 | 0.0527991 | 0.0388428 | 0.0424304 |
| When $d_1 \geqq d_{10}, d_{1m}$ (nm) = | 9.315 | 15.226 | 20.570 | 23.760 | ∞ |
| When $d_1 < d_{10}, d_{1m}$ (nm) = | 2.129 | 5.657 | 12.499 | 8.630 | 19.101 |
| When $n_2 \geqq n_{20}, n_{2m}$ = | 0.2113904 | 0.2168030 | 0.1303113 | 0.0779236 | 0.1123853 |
| When $n_2 < n_{20}, n_{2m}$ = | 0.1965198 | 0.1502832 | 0.1490173 | 0.1347925 | 0.1407104 |
| When $k_2 \geqq k_{20}, k_{2m}$ = | 0.1312354 | 0.1404419 | 0.1299280 | 0.1034583 | 0.1115356 |
| When $k_2 < k_{20}, k_{2m}$ = | 0.0975891 | 0.0892358 | 0.0798267 | 0.0797656 | 0.0721289 |
| When $d_2 \geqq d_{20}, d_{2m}$ (nm) = | ∞ | ∞ | ∞ | ∞ | ∞ |
| When $d_2 < d_{20}, d_{2m}$ (nm) = | 8.212 | 56.813 | 80.756 | 28.524 | 74.263 |

$0.93 \leqq NA \leqq 1.0$
$115 < T \leqq 125$

| Case | 12-11 | 12-12 |
|---|---|---|
| $n_{10}$ | 1.7021164 | 1.7030336 |
| $k_{10}$ | 0.0722203 | 0.0611451 |
| $d_{10}$ (nm) | 217.158 | 215.722 |
| $n_{20}$ | 1.6379690 | 1.6657846 |
| $k_{20}$ | 0.2419462 | 0.1987136 |
| $d_{20}$ (nm) | 168.107 | 223.276 |
| When $n_1 \geqq n_{10}, n_{1m}$ = | 0.0559460 | 0.0616492 |
| When $n_1 < n_{10}, n_{1m}$ = | 0.0369629 | 0.0571216 |
| When $k_1 \geqq k_{10}, k_{1m}$ = | 0.0643591 | 0.0831226 |
| When $k_1 < k_{10}, k_{1m}$ = | 0.0338867 | 0.0383716 |
| When $d_1 \geqq d_{10}, d_{1m}$ (nm) = | ∞ | ∞ |
| When $d_1 < d_{10}, d_{1m}$ (nm) = | 15.623 | 78.766 |
| When $n_2 \geqq n_{20}, n_{2m}$ = | 0.1071765 | 0.1574146 |
| When $n_2 < n_{20}, n_{2m}$ = | 0.1467676 | 0.1563452 |
| When $k_2 \geqq k_{20}, k_{2m}$ = | 0.1072412 | 0.1188721 |
| When $k_2 < k_{20}, k_{2m}$ = | 0.0815015 | 0.0722400 |
| When $d_2 \geqq d_{20}, d_{2m}$ (nm) = | ∞ | ∞ |
| When $d_2 < d_{20}, d_{2m}$ (nm) = | 28.758 | 73.194 |

$0.93 \leqq NA \leqq 1.0$
$125 < T \leqq 135$

24/35

| Case | 13-01 | 13-02 | 13-03 | 13-04 | 13-05 |
|---|---|---|---|---|---|
| $n_{10}$ | 1.8737564 | 1.9697383 | 1.9916260 | 1.9141720 | 1.7868889 |
| $k_{10}$ | 0.3367363 | 0.2020294 | 0.1477036 | 0.1461879 | 0.1795709 |
| $d_{10}$ (nm) | 20.276 | 14.764 | 11.315 | 11.459 | 80.605 |
| $n_{20}$ | 1.5133470 | 1.7299638 | 1.7257470 | 1.6683491 | 1.5409994 |
| $k_{20}$ | 0.8454522 | 0.5429087 | 0.3987910 | 0.3122132 | 0.6011754 |
| $d_{20}$ (nm) | 55.480 | 109.268 | 168.578 | 226.037 | 53.925 |
| When $n_1 \geqq n_{10}, n_{1m}$ = | 0.0919055 | 0.1108435 | 0.1324426 | 0.1321936 | 0.0477332 |
| When $n_1 < n_{10}, n_{1m}$ = | 0.0465112 | 0.0677783 | 0.0890894 | 0.1050525 | 0.0054248 |
| When $k_1 \geqq k_{10}, k_{1m}$ = | 0.0634827 | 0.0913306 | 0.1103125 | 0.1242993 | 0.0376343 |
| When $k_1 < k_{10}, k_{1m}$ = | 0.0777942 | 0.1046863 | 0.1330994 | 0.1263855 | 0.0172180 |
| When $d_1 \geqq d_{10}, d_{1m}$ (nm) = | 4.127 | 4.585 | 4.757 | 6.157 | 5.240 |
| When $d_1 < d_{10}, d_{1m}$ (nm) = | 2.100 | 2.651 | 2.937 | 4.469 | 0.576 |
| When $n_2 \geqq n_{20}, n_{2m}$ = | 0.1485144 | 0.1609766 | 0.1572363 | 0.1614685 | 0.1647119 |
| When $n_2 < n_{20}, n_{2m}$ = | 0.1669641 | 0.2206506 | 0.1915698 | 0.1618420 | 0.0427734 |
| When $k_2 \geqq k_{20}, k_{2m}$ = | 0.1498572 | 0.1556653 | 0.1444165 | 0.1361792 | 0.0323462 |
| When $k_2 < k_{20}, k_{2m}$ = | 0.1523499 | 0.1322424 | 0.1219958 | 0.1118262 | 0.1188306 |
| When $d_2 \geqq d_{20}, d_{2m}$ (nm) = | ∞ | ∞ | ∞ | ∞ | 20.169 |
| When $d_2 < d_{20}, d_{2m}$ (nm) = | 11.040 | 31.054 | 70.606 | 112.796 | 1.698 |

$0.93 \leqq NA \leqq 1.0$
$125 < T \leqq 135$

| Case | 13-06 | 13-07 | 13-08 | 13-09 | 13-10 |
|---|---|---|---|---|---|
| $n_{10}$ | 1.7600620 | 1.7276490 | 1.7199953 | 1.7084320 | 1.7077870 |
| $k_{10}$ | 0.1342170 | 0.1044918 | 0.0874837 | 0.0820944 | 0.0691595 |
| $d_{10}$ (nm) | 85.615 | 87.663 | 87.278 | 153.448 | 152.438 |
| $n_{20}$ | 1.6974715 | 1.6338870 | 1.6452183 | 1.6304269 | 1.6574806 |
| $k_{20}$ | 0.3980869 | 0.2915200 | 0.2346970 | 0.2625567 | 0.2137196 |
| $d_{20}$ (nm) | 104.529 | 164.129 | 221.092 | 160.685 | 216.250 |
| When $n_1 \geqq n_{10}, n_{1m}$ = | 0.0556421 | 0.0573047 | 0.0630432 | 0.0509070 | 0.0582422 |
| When $n_1 < n_{10}, n_{1m}$ = | 0.0086938 | 0.0280566 | 0.0524658 | 0.0272729 | 0.0496997 |
| When $k_1 \geqq k_{10}, k_{1m}$ = | 0.0327625 | 0.0552051 | 0.0782056 | 0.0552515 | 0.0808813 |
| When $k_1 < k_{10}, k_{1m}$ = | 0.0328357 | 0.0492957 | 0.0525903 | 0.0375085 | 0.0423645 |
| When $d_1 \geqq d_{10}, d_{1m}$ (nm) = | 8.316 | 14.598 | 20.258 | 22.646 | ∞ |
| When $d_1 < d_{10}, d_{1m}$ (nm) = | 1.229 | 5.725 | 12.785 | 8.439 | 18.783 |
| When $n_2 \geqq n_{20}, n_{2m}$ = | 0.2312317 | 0.1156555 | 0.1151941 | 0.0670740 | 0.1089307 |
| When $n_2 < n_{20}, n_{2m}$ = | 0.2128992 | 0.1481116 | 0.1498755 | 0.1344946 | 0.1425024 |
| When $k_2 \geqq k_{20}, k_{2m}$ = | 0.1020886 | 0.1348413 | 0.1299255 | 0.1027795 | 0.1131628 |
| When $k_2 < k_{20}, k_{2m}$ = | 0.1027185 | 0.0927148 | 0.0827966 | 0.0840479 | 0.0754407 |
| When $d_2 \geqq d_{20}, d_{2m}$ (nm) = | ∞ | ∞ | ∞ | ∞ | ∞ |
| When $d_2 < d_{20}, d_{2m}$ (nm) = | 4.085 | 34.120 | 79.786 | 26.736 | 37.465 |

$0.93 \leqq NA \leqq 1.0$
$125 < T \leqq 135$

25/35

| Case | 13-11 | 13-12 |
|---|---|---|
| $n_{10}$ | 1.7022055 | 1.7036940 |
| $k_{10}$ | 0.0725208 | 0.0612465 |
| $d_{10}$ (nm) | 217.368 | 215.927 |
| $n_{20}$ | 1.6389178 | 1.6705104 |
| $k_{20}$ | 0.2487144 | 0.2029113 |
| $d_{20}$ (nm) | 157.041 | 212.129 |
| When $n_1 \geqq n_{10}, n_{1m}$ = | 0.0559827 | 0.0624561 |
| When $n_1 < n_{10}, n_{1m}$ = | 0.0346814 | 0.0563831 |
| When $k_1 \geqq k_{10}, k_{1m}$ = | 0.0655139 | 0.0838672 |
| When $k_1 < k_{10}, k_{1m}$ = | 0.0329700 | 0.0384436 |
| When $d_1 \geqq d_{10}, d_{1m}$ (nm) = | ∞ | ∞ |
| When $d_1 < d_{10}, d_{1m}$ (nm) = | 14.691 | 78.542 |
| When $n_2 \geqq n_{20}, n_{2m}$ = | 0.0987000 | 0.1459375 |

-continued

| | | |
|---|---|---|
| When $n_2 < n_{20}, n_{2m}$ = | 0.1477222 | 0.1585510 |
| When $k_2 \geqq k_{20}, k_{2m}$ = | 0.1107947 | 0.1206909 |
| When $k_2 < k_{20}, k_{2m}$ = | 0.0868396 | 0.0754724 |
| When $d_2 \geqq d_{20}, d_{2m}$ (nm) = | ∞ | ∞ |
| When $d_2 < d_{20}, d_{2m}$ (nm) = | 26.886 | 30.205 |

0.93 ≦ NA ≦ 1.0
135 < T ≦ 145

| Case | 14-01 | 14-02 | 14-03 | 14-04 | 14-05 |
|---|---|---|---|---|---|
| $n_{10}$ | 1.8402862 | 1.9646387 | 1.9624104 | 1.9059084 | 1.8166660 |
| $k_{10}$ | 0.3700261 | 0.2123233 | 0.1584699 | 0.1473615 | 0.1977639 |
| $d_{10}$ (nm) | 23.403 | 16.447 | 12.893 | 12.089 | 79.798 |
| $n_{20}$ | 1.4966418 | 1.7618069 | 1.7211612 | 1.6694213 | 1.5572201 |
| $k_{20}$ | 1.0039549 | 0.5971846 | 0.4176484 | 0.3203376 | 0.7204992 |
| $d_{20}$ (nm) | 41.463 | 94.995 | 156.173 | 216.011 | 40.224 |
| When $n_1 \geqq n_{10}, n_{1m}$ = | 0.0906067 | 0.1022083 | 0.1191650 | 0.1272498 | 0.0481567 |
| When $n_1 < n_{10}, n_{1m}$ = | 0.0460486 | 0.0622925 | 0.0801978 | 0.1004968 | 0.0053052 |
| When $k_1 \geqq k_{10}, k_{1m}$ = | 0.0548682 | 0.0821582 | 0.0987952 | 0.1188953 | 0.0360181 |
| When $k_1 < k_{10}, k_{1m}$ = | 0.0585999 | 0.0953162 | 0.1207214 | 0.1220581 | 0.0169287 |
| When $d_1 \geqq d_{10}, d_{1m}$ (nm) = | 4.196 | 4.611 | 5.209 | 6.343 | 4.539 |
| When $d_1 < d_{10}, d_{1m}$ (nm) = | 2.216 | 2.591 | 3.134 | 4.582 | 0.509 |
| When $n_2 \geqq n_{20}, n_{2m}$ = | 0.1766626 | 0.1806128 | 0.1668896 | 0.1603455 | 0.2142871 |
| When $n_2 < n_{20}, n_{2m}$ = | 0.1712292 | 0.2330798 | 0.1905432 | 0.1645447 | 0.0564514 |
| When $k_2 \geqq k_{20}, k_{2m}$ = | 0.2110498 | 0.1844238 | 0.1540930 | 0.1380908 | 0.0433691 |
| When $k_2 < k_{20}, k_{2m}$ = | 0.1916614 | 0.1446765 | 0.1279346 | 0.1140405 | 0.1534607 |
| When $d_2 \geqq d_{20}, d_{2m}$ (nm) = | ∞ | ∞ | ∞ | ∞ | 18.289 |
| When $d_2 < d_{20}, d_{2m}$ (nm) = | 8.143 | 21.467 | 66.145 | 96.079 | 1.264 |

0.93 ≦ NA ≦ 1.0
135 < T ≦ 145

26/35

| Case | 14-06 | 14-07 | 14-08 | 14-09 | 14-10 |
|---|---|---|---|---|---|
| $n_{10}$ | 1.7655719 | 1.7293285 | 1.7214396 | 1.7092770 | 1.7085071 |
| $k_{10}$ | 0.1384976 | 0.1055583 | 0.0882507 | 0.0826318 | 0.0697446 |
| $d_{10}$ (nm) | 86.596 | 87.952 | 87.451 | 153.805 | 152.663 |
| $n_{20}$ | 1.7129955 | 1.6364176 | 1.6482275 | 1.6322979 | 1.6592624 |
| $k_{20}$ | 0.4320226 | 0.3040668 | 0.2416232 | 0.2733763 | 0.2197085 |
| $d_{20}$ (nm) | 91.539 | 153.339 | 210.993 | 150.296 | 206.543 |
| When $n_1 \geqq n_{10}, n_{1m}$ = | 0.0570667 | 0.0566760 | 0.0630505 | 0.0509021 | 0.0584448 |
| When $n_1 < n_{10}, n_{1m}$ = | 0.0070447 | 0.0278870 | 0.0524426 | 0.0272241 | 0.0508081 |
| When $k_1 \geqq k_{10}, k_{1m}$ = | 0.0284875 | 0.0544165 | 0.0773682 | 0.0546399 | 0.0801599 |
| When $k_1 < k_{10}, k_{1m}$ = | 0.0304980 | 0.0499133 | 0.0532507 | 0.0383374 | 0.0431470 |
| When $d_1 \geqq d_{10}, d_{1m}$ (nm) = | 7.855 | 14.249 | 20.142 | 22.873 | ∞ |
| When $d_1 < d_{10}, d_{1m}$ (nm) = | 0.972 | 5.625 | 12.498 | 8.268 | 18.904 |
| When $n_2 \geqq n_{20}, n_{2m}$ = | 0.2760107 | 0.1009705 | 0.1137622 | 0.0657813 | 0.1088953 |
| When $n_2 < n_{20}, n_{2m}$ = | 0.1995349 | 0.1448511 | 0.1471863 | 0.1316589 | 0.1395239 |
| When $k_2 \geqq k_{20}, k_{2m}$ = | 0.1305078 | 0.1378174 | 0.1321667 | 0.1037769 | 0.1143506 |
| When $k_2 < k_{20}, k_{2m}$ = | 0.1154834 | 0.0970654 | 0.0846460 | 0.0880420 | 0.0769495 |
| When $d_2 \geqq d_{20}, d_{2m}$ (nm) = | ∞ | ∞ | ∞ | ∞ | ∞ |
| When $d_2 < d_{20}, d_{2m}$ (nm) = | 3.137 | 27.699 | 76.164 | 22.775 | 33.816 |

0.93 ≦ NA ≦ 1.0
135 < T ≦ 145

| Case | 14-11 | 14-12 |
|---|---|---|
| $n_{10}$ | 1.7027802 | 1.7041709 |
| $k_{10}$ | 0.0728517 | 0.0617202 |
| $d_{10}$ (nm) | 217.779 | 216.194 |
| $n_{20}$ | 1.6405373 | 1.6719897 |
| $k_{20}$ | 0.2588103 | 0.2085423 |
| $d_{20}$ (nm) | 146.936 | 202.593 |
| When $n_1 \geqq n_{10}, n_{1m}$ = | 0.0566504 | 0.0631152 |
| When $n_1 < n_{10}, n_{1m}$ = | 0.0353162 | 0.0583606 |
| When $k_1 \geqq k_{10}, k_{1m}$ = | 0.0649280 | 0.0832544 |
| When $k_1 < k_{10}, k_{1m}$ = | 0.0337988 | 0.0392310 |
| When $d_1 \geqq d_{10}, d_{1m}$ (nm) = | ∞ | ∞ |
| When $d_1 < d_{10}, d_{1m}$ (nm) = | 15.495 | 79.231 |
| When $n_2 \geqq n_{20}, n_{2m}$ = | 0.0962402 | 0.1448450 |
| When $n_2 < n_{20}, n_{2m}$ = | 0.1459131 | 0.1542615 |
| When $k_2 \geqq k_{20}, k_{2m}$ = | 0.1100769 | 0.1205054 |
| When $k_2 < k_{20}, k_{2m}$ = | 0.0901184 | 0.0767920 |
| When $d_2 \geqq d_{20}, d_{2m}$ (nm) = | ∞ | ∞ |
| When $d_2 < d_{20}, d_{2m}$ (nm) = | 22.790 | 28.928 |

0.93 ≦ NA ≦ 1.0
145 < T ≦ 155

27/35

| Case | 15-01 | 15-02 | 15-03 | 15-04 | 15-05 |
|---|---|---|---|---|---|
| $n_{10}$ | 1.8199816 | 1.9318464 | 1.9476580 | 1.9400781 | 1.9152409 |
| $k_{10}$ | 0.4068444 | 0.2280177 | 0.1546474 | 0.1580344 | 0.1421080 |
| $d_{10}$ (nm) | 29.022 | 20.237 | 15.042 | 15.180 | 12.506 |
| $n_{20}$ | 1.5974175 | 1.8212470 | 1.7660961 | 1.7558824 | 1.6892699 |
| $k_{20}$ | 1.4701111 | 0.6871951 | 0.4559575 | 0.4525330 | 0.3391765 |
| $d_{20}$ (nm) | 24.558 | 79.181 | 140.877 | 141.749 | 204.998 |
| When $n_1 \geqq n_{10}, n_{1m}$ = | 0.0783313 | 0.0902905 | 0.1062402 | 0.1057410 | 0.1233240 |
| When $n_1 < n_{10}, n_{1m}$ = | 0.0485986 | 0.0576099 | 0.0737439 | 0.0730676 | 0.0958533 |
| When $k_1 \geqq k_{10}, k_{1m}$ = | 0.0424463 | 0.0706348 | 0.0877539 | 0.0877856 | 0.1136047 |
| When $k_1 < k_{10}, k_{1m}$ = | 0.0340247 | 0.0852002 | 0.1066162 | 0.1062646 | 0.1201245 |
| When $d_1 \geqq d_{10}, d_{1m}$ (nm) = | 3.673 | 5.078 | 5.535 | 5.630 | 6.208 |
| When $d_1 < d_{10}, d_{1m}$ (nm) = | 2.651 | 2.819 | 3.357 | 3.413 | 4.390 |
| When $n_2 \geqq n_{20}, n_{2m}$ = | 0.2911646 | 0.2069556 | 0.1703650 | 0.1705981 | 0.1609875 |
| When $n_2 < n_{20}, n_{2m}$ = | 0.1897607 | 0.2328674 | 0.1899780 | 0.1895239 | 0.1746619 |
| When $k_2 \geqq k_{20}, k_{2m}$ = | 0.2661255 | 0.2545776 | 0.1755676 | 0.1739502 | 0.1429504 |
| When $k_2 < k_{20}, k_{2m}$ = | 0.2599438 | 0.1612646 | 0.1333740 | 0.1331494 | 0.1167700 |
| When $d_2 \geqq d_{20}, d_{2m}$ (nm) = | ∞ | ∞ | ∞ | ∞ | ∞ |

-continued

| | | | | | |
|---|---|---|---|---|---|
| When $d_2$ < $d_{20}$, $d_{2m}$ (nm) = | 5.427 | 21.100 | 63.576 | 64.042 | 84.536 |

| 0.93 ≦ NA ≦ 1.0<br>145 < T ≦ 155 | | | | | |
|---|---|---|---|---|---|
| Case | 15-06 | 15-07 | 15-08 | 15-09 | 15-10 |
| $n_{10}$ | 1.8773964 | 1.7792899 | 1.7347668 | 1.7234258 | 1.7112569 |
| $k_{10}$ | 0.2151408 | 0.1408151 | 0.1082989 | 0.0907869 | 0.0850611 |
| $d_{10}$ (nm) | 81.211 | 87.880 | 88.119 | 87.442 | 153.930 |
| $n_{20}$ | 1.7568637 | 1.7944868 | 1.6522930 | 1.6482492 | 1.6361524 |
| $k_{20}$ | 1.2210655 | 0.5090378 | 0.3260600 | 0.2516544 | 0.2898839 |
| $d_{20}$ (nm) | 20.666 | 75.457 | 142.664 | 202.556 | 141.116 |
| When $n_1$ ≧ $n_{10}$, $n_{1m}$ = | 0.0535974 | 0.0567944 | 0.0566736 | 0.0621204 | 0.0507385 |
| When $n_1$ < $n_{10}$, $n_{1m}$ = | 0.0100415 | 0.0103674 | 0.0259888 | 0.0480981 | 0.0259363 |
| When $k_1$ ≧ $k_{10}$, $k_{1m}$ = | 0.0386597 | 0.0332520 | 0.0534692 | 0.0749170 | 0.0514124 |
| When $k_1$ < $k_{10}$, $k_{1m}$ = | 0.0268323 | 0.0369287 | 0.0521716 | 0.0541968 | 0.0401160 |
| When $d_1$ ≧ $d_{10}$, $d_{1m}$ (nm) = | 4.095 | 7.577 | 13.934 | 19.192 | 22.547 |
| When $d_1$ < $d_{10}$, $d_{1m}$ (nm) = | 0.855 | 1.369 | 4.946 | 11.117 | 7.637 |
| When $n_2$ ≧ $n_{20}$, $n_{2m}$ = | 0.4215723 | 0.2684375 | 0.1205920 | 0.1204028 | 0.0675806 |
| When $n_2$ < $n_{20}$, $n_{2m}$ = | 0.3791321 | 0.1854980 | 0.1442749 | 0.1439111 | 0.1298389 |
| When $k_2$ ≧ $k_{20}$, $k_{2m}$ = | 0.1639099 | 0.2106580 | 0.1452100 | 0.1328479 | 0.0998340 |
| When $k_2$ < $k_{20}$, $k_{2m}$ = | 0.2423328 | 0.1335254 | 0.1007751 | 0.0850952 | 0.0900806 |
| When $d_2$ ≧ $d_{20}$, $d_{2m}$ (nm) = | 5.052 | 14.783 | ∞ | ∞ | ∞ |
| When $d_2$ < $d_{20}$, $d_{2m}$ (nm) = | 1.977 | 4.929 | 23.591 | 72.330 | 19.479 |

| 0.93 ≦ NA ≦ 1.0<br>145 < T ≦ 155 | | | 28/35 |
|---|---|---|---|
| Case | 15-11 | 15-12 | 15-13 |
| $n_{10}$ | 1.7092054 | 1.7036310 | 1.7042855 |
| $k_{10}$ | 0.0717413 | 0.0749476 | 0.0635030 |
| $d_{10}$ (nm) | 152.725 | 217.788 | 216.233 |
| $n_{20}$ | 1.6572540 | 1.6384900 | 1.6687346 |
| $k_{20}$ | 0.2283199 | 0.2727185 | 0.2164860 |
| $d_{20}$ (nm) | 198.410 | 138.609 | 194.709 |
| When $n_1$ ≧ $n_{10}$, $n_{1m}$ = | 0.0574158 | 0.0563904 | 0.0624048 |
| When $n_1$ < $n_{10}$, $n_{1m}$ = | 0.0505359 | 0.0361853 | 0.0601721 |
| When $k_1$ ≧ $k_{10}$, $k_{1m}$ = | 0.0766162 | 0.0604248 | 0.0800598 |
| When $k_1$ < $k_{10}$, $k_{1m}$ = | 0.0439771 | 0.0350879 | 0.0400427 |
| When $d_1$ ≧ $d_{10}$, $d_{1m}$ (nm) = | ∞ | ∞ | ∞ |
| When $d_1$ < $d_{10}$, $d_{1m}$ (nm) = | 17.754 | 14.415 | 78.936 |
| When $n_2$ ≧ $n_{20}$, $n_{2m}$ = | 0.1103052 | 0.0951196 | 0.1487622 |
| When $n_2$ < $n_{20}$, $n_{2m}$ = | 0.1349475 | 0.1401550 | 0.1481909 |
| When $k_2$ ≧ $k_{20}$, $k_{2m}$ = | 0.1121790 | 0.1001306 | 0.1166199 |
| When $k_2$ < $k_{20}$, $k_{2m}$ = | 0.0769556 | 0.0916321 | 0.0768066 |
| When $d_2$ ≧ $d_{20}$, $d_{2m}$ (nm) = | ∞ | ∞ | ∞ |
| When $d_2$ < $d_{20}$, $d_{2m}$ (nm) = | 28.953 | 19.518 | 28.644 |

-continued

| 0.93 ≦ NA ≦ 1.0<br>155 < T ≦ 165 | | | | | |
|---|---|---|---|---|---|
| Case | 16-01 | 16-02 | 16-03 | 16-04 | 16-05 |
| $n_{10}$ | 1.8175791 | 1.9193642 | 1.9516445 | 1.9419697 | 1.9282358 |
| $k_{10}$ | 0.4385823 | 0.2501320 | 0.1607715 | 0.1648951 | 0.1504554 |
| $d_{10}$ (nm) | 37.187 | 21.908 | 15.944 | 16.094 | 12.282 |
| $n_{20}$ | 2.9488620 | 1.8321620 | 1.7911399 | 1.7764317 | 1.6857745 |
| $k_{20}$ | 3.6605721 | 0.7789298 | 0.4964603 | 0.4910919 | 0.3551730 |
| $d_{20}$ (nm) | 5.671 | 69.456 | 129.934 | 131.139 | 198.143 |
| When $n_1$ ≧ $n_{10}$, $n_{1m}$ = | 0.0604736 | 0.0852295 | 0.1013757 | 0.1010083 | 0.1240356 |
| When $n_1$ < $n_{10}$, $n_{1m}$ = | 0.0333899 | 0.0547046 | 0.0713342 | 0.0704993 | 0.0944006 |
| When $k_1$ ≧ $k_{10}$, $k_{1m}$ = | 0.0318896 | 0.0632361 | 0.0833032 | 0.0834521 | 0.1140308 |
| When $k_1$ < $k_{10}$, $k_{1m}$ = | 0.0127527 | 0.0803174 | 0.1011133 | 0.1007434 | 0.1227710 |
| When $d_1$ ≧ $d_{10}$, $d_{1m}$ (nm) = | 2.684 | 4.937 | 5.403 | 5.524 | 5.825 |
| When $d_1$ < $d_{10}$, $d_{1m}$ (nm) = | 1.056 | 2.746 | 3.284 | 3.349 | 4.015 |
| When $n_2$ ≧ $n_{20}$, $n_{2m}$ = | 0.8885571 | 0.1992395 | 0.1663013 | 0.1663708 | 0.1592810 |
| When $n_2$ < $n_{20}$, $n_{2m}$ = | 0.4338977 | 0.2305408 | 0.1904468 | 0.1899951 | 0.1750964 |
| When $k_2$ ≧ $k_{20}$, $k_{2m}$ = | 0.2239417 | 0.2871423 | 0.1858569 | 0.1831470 | 0.1419360 |
| When $k_2$ < $k_{20}$, $k_{2m}$ = | 0.5593811 | 0.1675525 | 0.1346912 | 0.1341003 | 0.1171777 |
| When $d_2$ ≧ $d_{20}$, $d_{2m}$ (nm) = | 2.121 | ∞ | ∞ | ∞ | ∞ |
| When $d_2$ < $d_{20}$, $d_{2m}$ (nm) = | 1.497 | 16.789 | 53.787 | 54.606 | 81.510 |

| 0.93 ≦ NA ≦ 1.0<br>155 < T ≦ 165 | | | | | 29/35 |
|---|---|---|---|---|---|
| Case | 16-06 | 16-07 | 16-08 | 16-09 | 16-10 |
| $n_{10}$ | 1.8704725 | 1.7960814 | 1.7418606 | 1.7257176 | 1.7136245 |
| $k_{10}$ | 0.2299368 | 0.1479091 | 0.1134159 | 0.0948039 | 0.0896483 |
| $d_{10}$ (nm) | 88.746 | 88.347 | 87.888 | 87.264 | 153.565 |
| $n_{20}$ | 2.8158519 | 1.9330235 | 1.6717189 | 1.6472351 | 1.6392609 |
| $k_{20}$ | 3.0739838 | 0.6225271 | 0.3550776 | 0.2650084 | 0.3111392 |
| $d_{20}$ (nm) | 4.992 | 60.492 | 132.384 | 194.269 | 132.434 |
| When $n_1$ ≧ $n_{10}$, $n_{1m}$ = | 0.0496790 | 0.0539771 | 0.0559290 | 0.0605103 | 0.0493213 |
| When $n_1$ < $n_{10}$, $n_{1m}$ = | 0.0158618 | 0.0116589 | 0.0229565 | 0.0427002 | 0.0176343 |
| When $k_1$ ≧ $k_{10}$, $k_{1m}$ = | 0.0339600 | 0.0324597 | 0.0502661 | 0.0714246 | 0.0448999 |
| When $k_1$ < $k_{10}$, $k_{1m}$ = | 0.0196045 | 0.0413477 | 0.0524426 | 0.0547058 | 0.0377209 |
| When $d_1$ ≧ $d_{10}$, $d_{1m}$ (nm) = | 4.203 | 6.741 | 12.890 | 17.512 | 20.755 |
| When $d_1$ < $d_{10}$, $d_{1m}$ (nm) = | 1.412 | 1.425 | 4.045 | 9.285 | 4.775 |
| When $n_2$ ≧ $n_{20}$, $n_{2m}$ = | 0.7568213 | 0.2080432 | 0.1385022 | 0.1276587 | 0.0653149 |
| When $n_2$ < $n_{20}$, $n_{2m}$ = | 0.6339124 | 0.1864246 | 0.1456726 | 0.1431897 | 0.1296729 |
| When $k_2$ ≧ $k_{20}$, $k_{2m}$ = | 0.5784314 | 0.2482080 | 0.1472144 | 0.1310840 | 0.0863611 |
| When $k_2$ < $k_{20}$, $k_{2m}$ = | 0.6241199 | 0.1496924 | 0.1027478 | 0.0854395 | 0.0904016 |

-continued

| | | | | | |
|---|---|---|---|---|---|
| When $d_2 \geqq d_{20}, d_{2m}$ (nm) = | 1.695 | 9.818 | ∞ | ∞ | ∞ |
| When $d_2 < d_{20}, d_{2m}$ (nm) = | 1.276 | 6.130 | 21.225 | 35.287 | 17.454 |

| $0.93 \leqq NA \leqq 1.0$<br>$155 < T \leqq 165$ | | | | |
|---|---|---|---|---|
| Case | 16-11 | 16-12 | 16-13 | 16-14 |
| $n_{10}$ | 1.7097149 | 1.7044725 | 1.7041849 | 1.7061658 |
| $k_{10}$ | 0.0750113 | 0.0790614 | 0.0664191 | 0.0592006 |
| $d_{10}$ (nm) | 152.537 | 217.265 | 215.910 | 215.675 |
| $n_{20}$ | 1.6527377 | 1.6350180 | 1.6625759 | 1.6951633 |
| $k_{20}$ | 0.2392317 | 0.2903973 | 0.2261823 | 0.1893046 |
| $d_{20}$ (nm) | 190.639 | 130.687 | 187.261 | 240.772 |
| When $n_1 \geqq n_{10}, n_{1m}$ = | 0.0553772 | 0.0545740 | 0.0600366 | 0.0676270 |
| When $n_1 < n_{10}, n_{1m}$ = | 0.0477368 | 0.0344788 | 0.0568494 | 0.0690149 |
| When $k_1 \geqq k_{10}, k_{1m}$ = | 0.0715491 | 0.0525977 | 0.0752148 | 0.0835681 |
| When $k_1 < k_{10}, k_{1m}$ = | 0.0443665 | 0.0337817 | 0.0404053 | 0.0425281 |
| When $d_1 \geqq d_{10}, d_{1m}$ (nm) = | ∞ | ∞ | ∞ | ∞ |
| When $d_1 < d_{10}, d_{1m}$ (nm) = | 16.235 | 12.121 | 77.039 | 86.324 |
| When $n_2 \geqq n_{20}, n_{2m}$ = | 0.1116882 | 0.0916113 | 0.1582788 | 0.1718628 |
| When $n_2 < n_{20}, n_{2m}$ = | 0.1331189 | 0.1411133 | 0.1443433 | 0.1614490 |
| When $k_2 \geqq k_{20}, k_{2m}$ = | 0.1061816 | 0.0827698 | 0.1097974 | 0.1248706 |
| When $k_2 < k_{20}, k_{2m}$ = | 0.0766345 | 0.0918372 | 0.0766272 | 0.0699548 |
| When $d_2 \geqq d_{20}, d_{2m}$ (nm) = | ∞ | ∞ | ∞ | ∞ |
| When $d_2 < d_{20}, d_{2m}$ (nm) = | 27.428 | 17.505 | 27.098 | 73.085 |

30/35

| $0.93 \leqq NA \leqq 1.0$<br>$165 < T \leqq 175$ | | | | | |
|---|---|---|---|---|---|
| Case | 17-01 | 17-02 | 17-03 | 17-04 | 17-05 |
| $n_{10}$ | 1.9650460 | 1.9384951 | 1.9139584 | 1.7857662 | 1.7433983 |
| $k_{10}$ | 0.1748342 | 0.1550287 | 0.1299465 | 0.1574086 | 0.1202381 |
| $d_{10}$ (nm) | 15.368 | 12.323 | 11.343 | 86.539 | 87.036 |
| $n_{20}$ | 1.7719438 | 1.6895811 | 1.6883766 | 1.7907030 | 1.6559011 |
| $k_{20}$ | 0.5219218 | 0.3734128 | 0.3007198 | 0.6497694 | 0.3733381 |
| $d_{20}$ (nm) | 124.100 | 189.293 | 246.427 | 59.718 | 125.629 |
| When $n_1 \geqq n_{10}, n_{1m}$ = | 0.1023816 | 0.1220520 | 0.1341687 | 0.0495288 | 0.0535669 |
| When $n_1 < n_{10}, n_{1m}$ = | 0.0697961 | 0.0912976 | 0.1083984 | 0.0051111 | 0.0188965 |
| When $k_1 \geqq k_{10}, k_{1m}$ = | 0.0830420 | 0.1112122 | 0.1288184 | 0.0186707 | 0.0452673 |
| When $k_1 < k_{10}, k_{1m}$ = | 0.1016052 | 0.1222986 | 0.1299465 | 0.0330212 | 0.0491577 |
| When $d_1 \geqq d_{10}, d_{1m}$ (nm) = | 5.001 | 5.526 | 6.413 | 5.954 | 11.233 |
| When $d_1 < d_{10}, d_{1m}$ (nm) = | 2.956 | 3.739 | 4.697 | 0.624 | 3.144 |
| When $n_2 \geqq n_{20}, n_{2m}$ = | 0.1581653 | 0.1572925 | 0.1540161 | 0.0858301 | 0.1199121 |
| When $n_2 < n_{20}, n_{2m}$ = | 0.1927075 | 0.1754407 | 0.1685632 | 0.1889197 | 0.1519067 |
| When $k_2 \geqq k_{20}, k_{2m}$ = | 0.1753381 | 0.1419458 | 0.1368945 | 0.0730774 | 0.1241467 |
| When $k_2 < k_{20}, k_{2m}$ = | 0.1306897 | 0.1171997 | 0.1067334 | 0.1258240 | 0.0983862 |
| When $d_2 \geqq d_{20}, d_{2m}$ (nm) = | ∞ | ∞ | ∞ | ∞ | ∞ |
| When $d_2 < d_{20}, d_{2m}$ (nm) = | 51.895 | 79.651 | 119.351 | 3.741 | 21.467 |

| $0.93 \leqq NA \leqq 1.0$<br>$165 < T \leqq 175$ | | | | | |
|---|---|---|---|---|---|
| Case | 17-06 | 17-07 | 17-08 | 17-09 | 17-10 |
| $n_{10}$ | 1.7262549 | 1.7236673 | 1.7140199 | 1.7096017 | 1.7107217 |
| $k_{10}$ | 0.0993784 | 0.0842645 | 0.0949670 | 0.0783956 | 0.0680252 |
| $d_{10}$ (nm) | 86.812 | 87.109 | 152.601 | 152.026 | 152.100 |
| $n_{20}$ | 1.6373093 | 1.6685549 | 1.6238426 | 1.6437329 | 1.6799600 |
| $k_{20}$ | 0.2753256 | 0.2274459 | 0.3258368 | 0.2483227 | 0.2063397 |
| $d_{20}$ (nm) | 186.729 | 241.120 | 125.450 | 182.921 | 236.403 |
| When $n_1 \geqq n_{10}, n_{1m}$ = | 0.0583655 | 0.0638147 | 0.0459595 | 0.0526709 | 0.0601990 |
| When $n_1 < n_{10}, n_{1m}$ = | 0.0389001 | 0.0503784 | 0.0111768 | 0.0448047 | 0.0600891 |
| When $k_1 \geqq k_{10}, k_{1m}$ = | 0.0685583 | 0.0805896 | 0.0359302 | 0.0672742 | 0.0800940 |
| When $k_1 < k_{10}, k_{1m}$ = | 0.0538513 | 0.0560901 | 0.0310425 | 0.0434424 | 0.0457349 |
| When $d_1 \geqq d_{10}, d_{1m}$ (nm) = | 15.725 | 22.939 | 17.229 | ∞ | ∞ |
| When $d_1 < d_{10}, d_{1m}$ (nm) = | 8.012 | 11.976 | 2.824 | 14.351 | 24.120 |
| When $n_2 \geqq n_{20}, n_{2m}$ = | 0.1242969 | 0.1275708 | 0.0486890 | 0.1084961 | 0.1263135 |
| When $n_2 < n_{20}, n_{2m}$ = | 0.1456055 | 0.1521838 | 0.1337903 | 0.1356079 | 0.1464233 |
| When $k_2 \geqq k_{20}, k_{2m}$ = | 0.1234131 | 0.1338855 | 0.0591821 | 0.0969312 | 0.1151416 |
| When $k_2 < k_{20}, k_{2m}$ = | 0.0846008 | 0.0776428 | 0.0858325 | 0.0756372 | 0.0703125 |
| When $d_2 \geqq d_{20}, d_{2m}$ (nm) = | ∞ | ∞ | ∞ | ∞ | ∞ |
| When $d_2 < d_{20}, d_{2m}$ (nm) = | 66.105 | 78.842 | 17.102 | 28.470 | 72.561 |

31/35

| $0.93 \leqq NA \leqq 1.0$<br>$165 < T \leqq 175$ | | | |
|---|---|---|---|
| Case | 17-11 | 17-12 | 17-13 |
| $n_{10}$ | 1.7042582 | 1.7037677 | 1.7056779 |
| $k_{10}$ | 0.0836625 | 0.0692974 | 0.0609868 |
| $d_{10}$ (nm) | 216.186 | 215.313 | 215.198 |
| $n_{20}$ | 1.6202806 | 1.6544674 | 1.6903958 |
| $k_{20}$ | 0.3033538 | 0.2346728 | 0.1952987 |
| $d_{20}$ (nm) | 123.599 | 179.446 | 232.683 |
| When $n_1 \geqq n_{10}, n_{1m}$ = | 0.0501758 | 0.0567249 | 0.0651611 |
| When $n_1 < n_{10}, n_{1m}$ = | 0.0271130 | 0.0522852 | 0.0658081 |
| When $k_1 \geqq k_{10}, k_{1m}$ = | 0.0439600 | 0.0710352 | 0.0811584 |
| When $k_1 < k_{10}, k_{1m}$ = | 0.0300366 | 0.0394434 | 0.0413635 |
| When $d_1 \geqq d_{10}, d_{1m}$ (nm) = | ∞ | ∞ | ∞ |
| When $d_1 < d_{10}, d_{1m}$ (nm) = | 9.341 | 23.552 | 82.870 |
| When $n_2 \geqq n_{20}, n_{2m}$ = | 0.0785254 | 0.1613647 | 0.1758447 |
| When $n_2 < n_{20}, n_{2m}$ = | 0.1457166 | 0.1478357 | 0.1648547 |
| When $k_2 \geqq k_{20}, k_{2m}$ = | 0.0611975 | 0.1025415 | 0.1200317 |
| When $k_2 < k_{20}, k_{2m}$ = | 0.0887231 | 0.0762732 | 0.0707166 |
| When $d_2 \geqq d_{20}, d_{2m}$ (nm) = | ∞ | ∞ | ∞ |
| When $d_2 < d_{20}, d_{2m}$ (nm) = | 17.421 | 28.206 | 71.908 |

-continued

| | $0.93 \leqq NA \leqq 1.0$ $175 < T \leqq 185$ | | | | |
|---|---|---|---|---|---|
| Case | 18-01 | 18-02 | 18-03 | 18-04 | 18-05 |
| $n_{10}$ | 1.9750220 | 1.9943589 | 1.9365478 | 1.8874503 | 1.7406539 |
| $k_{10}$ | 0.3055970 | 0.1905841 | 0.1715491 | 0.1503402 | 0.1271964 |
| $d_{10}$ (nm) | 17.312 | 13.627 | 12.200 | 12.006 | 86.109 |
| $n_{20}$ | 1.6357631 | 1.7309349 | 1.6649916 | 1.6561886 | 1.6157675 |
| $k_{20}$ | 0.8207912 | 0.5263943 | 0.3790440 | 0.2991899 | 0.3771605 |
| $d_{20}$ (nm) | 66.973 | 122.033 | 183.216 | 242.151 | 120.682 |
| When $n_1 \geqq n_{10}, n_{1m}$ = | 0.0935791 | 0.1114148 | 0.1215747 | 0.1285913 | 0.0513330 |
| When $n_1 < n_{10}, n_{1m}$ = | 0.0459473 | 0.0702148 | 0.0894250 | 0.1026367 | 0.0144434 |
| When $k_1 \geqq k_{10}, k_{1m}$ = | 0.0590857 | 0.0871582 | 0.1112146 | 0.1261365 | 0.0386914 |
| When $k_1 < k_{10}, k_{1m}$ = | 0.0823853 | 0.1098083 | 0.1208740 | 0.1243677 | 0.0453528 |
| When $d_1 \geqq d_{10}, d_{1m}$ (nm) = | 3.436 | 4.283 | 5.306 | 6.728 | 10.132 |
| When $d_1 < d_{10}, d_{1m}$ (nm) = | 1.707 | 2.491 | 3.559 | 4.870 | 2.323 |
| When $n_2 \geqq n_{20}, n_{2m}$ = | 0.1368286 | 0.1494128 | 0.1559277 | 0.1523608 | 0.0829712 |
| When $n_2 < n_{20}, n_{2m}$ = | 0.2106677 | 0.1994727 | 0.1768091 | 0.1649011 | 0.1612537 |
| When $k_2 \geqq k_{20}, k_{2m}$ = | 0.1566431 | 0.1521973 | 0.1368372 | 0.1332068 | 0.0933081 |
| When $k_2 < k_{20}, k_{2m}$ = | 0.1361353 | 0.1253687 | 0.1152344 | 0.1052795 | 0.0942554 |
| When $d_2 \geqq d_{20}, d_{2m}$ (nm) = | ∞ | ∞ | ∞ | ∞ | ∞ |
| When $d_2 < d_{20}, d_{2m}$ (nm) = | 18.814 | 47.829 | 81.274 | 118.000 | 24.527 |

32/35

| | $0.93 \leqq NA \leqq 1.0$ $175 < T \leqq 185$ | | | | |
|---|---|---|---|---|---|
| Case | 18-06 | 18-07 | 18-08 | 18-09 | 18-10 |
| $n_{10}$ | 1.7253418 | 1.7237735 | 1.7126639 | 1.7091592 | 1.7108527 |
| $k_{10}$ | 0.1032843 | 0.0864157 | 0.0996282 | 0.0809109 | 0.0696108 |
| $d_{10}$ (nm) | 86.339 | 86.885 | 151.701 | 151.551 | 151.827 |
| $n_{20}$ | 1.6224018 | 1.6650124 | 1.5953952 | 1.6344497 | 1.6784072 |
| $k_{20}$ | 0.2809650 | 0.2327133 | 0.3310599 | 0.2545275 | 0.2111338 |
| $d_{20}$ (nm) | 178.956 | 231.784 | 118.977 | 174.271 | 226.839 |
| When $n_1 \geqq n_{10}, n_{1m}$ = | 0.0565039 | 0.0626416 | 0.0424548 | 0.0505127 | 0.0583557 |
| When $n_1 < n_{10}, n_{1m}$ = | 0.0377893 | 0.0495728 | 0.0068591 | 0.0425964 | 0.0570093 |
| When $k_1 \geqq k_{10}, k_{1m}$ = | 0.0671277 | 0.0801477 | 0.0264331 | 0.0654321 | 0.0790332 |
| When $k_1 < k_{10}, k_{1m}$ = | 0.0514600 | 0.0546265 | 0.0262610 | 0.0409290 | 0.0440662 |
| When $d_1 \geqq d_{10}, d_{1m}$ (nm) = | 14.314 | 20.851 | 14.034 | 22.266 | ∞ |
| When $d_1 < d_{10}, d_{1m}$ (nm) = | 7.519 | 11.390 | 1.678 | 12.457 | 21.354 |
| When $n_2 \geqq n_{20}, n_{2m}$ = | 0.1133289 | 0.1230408 | 0.0286230 | 0.1046033 | 0.1258447 |
| When $n_2 < n_{20}, n_{2m}$ = | 0.1506311 | 0.1572058 | 0.1416589 | 0.1413440 | 0.1529517 |
| When $k_2 \geqq k_{20}, k_{2m}$ = | 0.1148096 | 0.1304126 | 0.0346130 | 0.0907129 | 0.1118689 |
| When $k_2 < k_{20}, k_{2m}$ = | 0.0848999 | 0.0792493 | 0.0817810 | 0.0764514 | 0.0721448 |
| When $d_2 \geqq d_{20}, d_{2m}$ (nm) = | ∞ | ∞ | ∞ | ∞ | ∞ |
| When $d_2 < d_{20}, d_{2m}$ (nm) = | 64.642 | 80.544 | 18.599 | 31.028 | 73.232 |

| | $0.93 \leqq NA \leqq 1.0$ $175 < T \leqq 185$ | | |
|---|---|---|---|
| Case | 18-11 | 18-12 | 18-13 |
| $n_{10}$ | 1.7032995 | 1.7035257 | 1.7058486 |
| $k_{10}$ | 0.0874338 | 0.0712651 | 0.0623526 |
| $d_{10}$ (nm) | 215.388 | 214.888 | 214.924 |
| $n_{20}$ | 1.6000078 | 1.6490638 | 1.6902455 |
| $k_{20}$ | 0.3100603 | 0.2413259 | 0.1999123 |
| $d_{20}$ (nm) | 116.088 | 170.219 | 222.958 |
| When $n_1 \geqq n_{10}, n_{1m}$ = | 0.0459119 | 0.0540906 | 0.0637158 |
| When $n_1 < n_{10}, n_{1m}$ = | 0.0201135 | 0.0472498 | 0.0624988 |
| When $k_1 \geqq k_{10}, k_{1m}$ = | 0.0380823 | 0.0692078 | 0.0795654 |
| When $k_1 < k_{10}, k_{1m}$ = | 0.0261584 | 0.0371997 | 0.0400098 |
| When $d_1 \geqq d_{10}, d_{1m}$ (nm) = | 25.691 | ∞ | ∞ |
| When $d_1 < d_{10}, d_{1m}$ (nm) = | 6.401 | 18.086 | 80.109 |
| When $n_2 \geqq n_{20}, n_{2m}$ = | 0.0666833 | 0.1564661 | 0.1701733 |
| When $n_2 < n_{20}, n_{2m}$ = | 0.1555847 | 0.1549194 | 0.1734229 |
| When $k_2 \geqq k_{20}, k_{2m}$ = | 0.0497668 | 0.0999182 | 0.1182764 |
| When $k_2 < k_{20}, k_{2m}$ = | 0.0866650 | 0.0781360 | 0.0731396 |
| When $d_2 \geqq d_{20}, d_{2m}$ (nm) = | 13.606 | ∞ | ∞ |
| When $d_2 < d_{20}, d_{2m}$ (nm) = | 18.924 | 29.474 | 72.740 |

33/35

| | $0.93 \leqq NA \leqq 1.0$ $185 < T \leqq 195$ | | | | |
|---|---|---|---|---|---|
| Case | 19-01 | 19-02 | 19-03 | 19-04 | 19-05 |
| $n_{10}$ | 2.0157422 | 1.9298641 | 1.9158213 | 1.9035507 | 1.7387191 |
| $k_{10}$ | 0.3310994 | 0.1874025 | 0.1413868 | 0.0919796 | 0.1333266 |
| $d_{10}$ (nm) | 15.233 | 12.335 | 11.496 | 11.593 | 85.772 |
| $n_{20}$ | 1.5732193 | 1.6401635 | 1.6782430 | 1.7330388 | 1.5838112 |
| $k_{20}$ | 0.8191417 | 0.3856200 | 0.3150440 | 0.2716233 | 0.3839989 |
| $d_{20}$ (nm) | 66.313 | 174.874 | 226.685 | 274.138 | 113.170 |
| When $n_1 \geqq n_{10}, n_{1m}$ = | 0.0908862 | 0.1198010 | 0.1318933 | 0.1353418 | 0.0494861 |
| When $n_1 < n_{10}, n_{1m}$ = | 0.0435144 | 0.0881482 | 0.1071143 | 0.1119397 | 0.0110315 |
| When $k_1 \geqq k_{10}, k_{1m}$ = | 0.0607654 | 0.1097412 | 0.1276587 | 0.1301843 | 0.0306482 |
| When $k_1 < k_{10}, k_{1m}$ = | 0.0886279 | 0.1159265 | 0.1266907 | 0.0919796 | 0.0445325 |
| When $d_1 \geqq d_{10}, d_{1m}$ (nm) = | 2.825 | 5.183 | 6.173 | 7.339 | 9.205 |
| When $d_1 < d_{10}, d_{1m}$ (nm) = | 1.353 | 3.517 | 4.556 | 5.508 | 1.748 |
| When $n_2 \geqq n_{20}, n_{2m}$ = | 0.1250940 | 0.1513354 | 0.1454334 | 0.1421106 | 0.0499280 |
| When $n_2 < n_{20}, n_{2m}$ = | 0.1772742 | 0.1779919 | 0.1691821 | 0.1744556 | 0.1654175 |
| When $k_2 \geqq k_{20}, k_{2m}$ = | 0.1164954 | 0.1335864 | 0.1351135 | 0.1421582 | 0.0743848 |
| When $k_2 < k_{20}, k_{2m}$ = | 0.1392041 | 0.1184119 | 0.1117639 | 0.1051697 | 0.0978845 |
| When $d_2 \geqq d_{20}, d_{2m}$ (nm) = | ∞ | ∞ | ∞ | ∞ | ∞ |
| When $d_2 < d_{20}, d_{2m}$ (nm) = | 17.571 | 78.501 | 112.763 | 138.595 | 25.987 |

-continued

| Case | 0.93 ≦ NA ≦ 1.0<br>185 < T ≦ 195<br>19-06 | 19-07 | 19-08 | 19-09 | 19-10 |
|---|---|---|---|---|---|
| $n_{10}$ | 1.7256246 | 1.7253546 | 1.7287042 | 1.7096582 | 1.7121643 |
| $k_{10}$ | 0.1055723 | 0.0874820 | 0.0760165 | 0.0821714 | 0.0705329 |
| $d_{10}$ (nm) | 86.279 | 86.928 | 87.515 | 151.624 | 152.001 |
| $n_{20}$ | 1.6177137 | 1.6696157 | 1.7081188 | 1.6358848 | 1.6853812 |
| $k_{20}$ | 0.2895611 | 0.2389730 | 0.2041866 | 0.2635969 | 0.2167566 |
| $d_{20}$ (nm) | 168.375 | 220.361 | 272.150 | 162.984 | 215.233 |
| When $n_1 \geqq n_{10}$, $n_{1m}$ = | 0.0562903 | 0.0628687 | 0.0679712 | 0.0505103 | 0.0586621 |
| When $n_1 < n_{10}$, $n_{1m}$ = | 0.0396094 | 0.0498669 | 0.0509912 | 0.0389160 | 0.0543164 |
| When $k_1 \geqq k_{10}$, $k_{1m}$ = | 0.0670349 | 0.0806128 | 0.0832776 | 0.0662488 | 0.0789514 |
| When $k_1 < k_{10}$, $k_{1m}$ = | 0.0491772 | 0.0538904 | 0.0576746 | 0.0390271 | 0.0434973 |
| When $d_1 \geqq d_{10}$, $d_{1m}$ (nm) = | 13.425 | 20.169 | 39.294 | 20.568 | ∞ |
| When $d_1 < d_{10}$, $d_{1m}$ (nm) = | 7.774 | 11.144 | 12.836 | 11.141 | 20.056 |
| When $n_2 \geqq n_{20}$, $n_{2m}$ = | 0.1053076 | 0.1213562 | 0.1287134 | 0.1062195 | 0.1257849 |
| When $n_2 < n_{20}$, $n_{2m}$ = | 0.1536951 | 0.1604126 | 0.1670996 | 0.1450281 | 0.1574817 |
| When $k_2 \geqq k_{20}$, $k_{2m}$ = | 0.1136377 | 0.1320007 | 0.1531152 | 0.0931067 | 0.1145862 |
| When $k_2 < k_{20}$, $k_{2m}$ = | 0.0898669 | 0.0840454 | 0.0776611 | 0.0825256 | 0.0770361 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 45.429 | 80.918 | 110.597 | 30.017 | 74.310 |

34/35

| Case | 0.93 ≦ NA ≦ 1.0<br>185 < T ≦ 195<br>19-11 | 19-12 | 19-13 | 19-14 | 19-15 |
|---|---|---|---|---|---|
| $n_{10}$ | 1.7151566 | 1.7029318 | 1.7041956 | 1.7070069 | 1.7080920 |
| $k_{10}$ | 0.0645755 | 0.0900998 | 0.0721897 | 0.0633145 | 0.0595697 |
| $d_{10}$ (nm) | 152.412 | 215.656 | 215.114 | 215.207 | 215.250 |
| $n_{20}$ | 1.7135234 | 1.5920483 | 1.6533659 | 1.6971996 | 1.7125257 |
| $k_{20}$ | 0.1842756 | 0.3226491 | 0.2502000 | 0.2048445 | 0.1741269 |
| $d_{20}$ (nm) | 268.692 | 105.543 | 158.704 | 211.558 | 267.229 |
| When $n_1 \geqq n_{10}$, $n_{1m}$ = | 0.0656799 | 0.0437866 | 0.0537561 | 0.0639758 | 0.0752185 |
| When $n_1 < n_{10}$, $n_{1m}$ = | 0.0585193 | 0.0130481 | 0.0437659 | 0.0602637 | 0.0712415 |
| When $k_1 \geqq k_{10}$, $k_{1m}$ = | 0.0803796 | 0.0379236 | 0.0696973 | 0.0785339 | 0.0793298 |
| When $k_1 < k_{10}$, $k_{1m}$ = | 0.0475867 | 0.0209644 | 0.0354407 | 0.0397900 | 0.0383728 |
| When $d_1 \geqq d_{10}$, $d_{1m}$ (nm) = | ∞ | 20.412 | ∞ | ∞ | ∞ |
| When $d_1 < d_{10}$, $d_{1m}$ (nm) = | 76.169 | 3.912 | 15.725 | 78.897 | 136.900 |
| When $n_2 \geqq n_{20}$, $n_{2m}$ = | 0.1359851 | 0.0436487 | 0.1238757 | 0.1440674 | 0.1618445 |
| When $n_2 < n_{20}$, $n_{2m}$ = | 0.1709363 | 0.1590417 | 0.1491174 | 0.1814563 | 0.2117529 |
| When $k_2 \geqq k_{20}$, $k_{2m}$ = | 0.1377368 | 0.0580493 | 0.1037561 | 0.1202234 | 0.1371057 |
| When $k_2 < k_{20}$, $k_{2m}$ = | 0.0711096 | 0.0823193 | 0.0849219 | 0.0779297 | 0.0717078 |

-continued

| | | | | | |
|---|---|---|---|---|---|
| When $d_2 \geqq d_{20}$, $d_{2m}$ (nm) = | ∞ | 9.984 | ∞ | ∞ | ∞ |
| When $d_2 < d_{20}$, $d_{2m}$ (nm) = | 82.771 | 19.617 | 23.813 | 73.684 | 77.607 |

| Case | 0.93 ≦ NA ≦ 1.0<br>195 < T ≦ 205<br>20-01 | 20-02 | 20-03 | 20-04 | 20-05 |
|---|---|---|---|---|---|
| $n_{10}$ | 1.9115074 | 1.9153788 | 1.8712999 | 1.7275221 | 1.7279210 |
| $k_{10}$ | 0.1960527 | 0.1490337 | 0.0897979 | 0.1065695 | 0.0881248 |
| $d_{10}$ (nm) | 13.258 | 11.515 | 14.536 | 86.590 | 87.122 |
| $n_{20}$ | 1.6255021 | 1.6682692 | 1.7614462 | 1.6227655 | 1.6778177 |
| $k_{20}$ | 0.3984556 | 0.3197853 | 0.2821612 | 0.3041284 | 0.2471127 |
| $d_{20}$ (nm) | 164.068 | 218.507 | 257.799 | 156.467 | 209.069 |
| When $n_1 \geqq n_{10}$, $n_{1m}$ = | 0.1142444 | 0.1325989 | 0.1158582 | 0.0562817 | 0.0637024 |
| When $n_1 < n_{10}$, $n_{1m}$ = | 0.0852515 | 0.1080505 | 0.0942114 | 0.0426550 | 0.0501379 |
| When $k_1 \geqq k_{10}$, $k_{1m}$ = | 0.1044482 | 0.1295020 | 0.1096521 | 0.0681348 | 0.0804810 |
| When $k_1 < k_{10}$, $k_{1m}$ = | 0.1084790 | 0.1269031 | 0.0897979 | 0.0488770 | 0.0543994 |
| When $d_1 \geqq d_{10}$, $d_{1m}$ (nm) = | 5.346 | 6.134 | 8.659 | 13.270 | 20.006 |
| When $d_1 < d_{10}$, $d_{1m}$ (nm) = | 3.730 | 4.524 | 6.443 | 8.305 | 10.905 |
| When $n_2 \geqq n_{20}$, $n_{2m}$ = | 0.1424097 | 0.1416443 | 0.1412390 | 0.1051294 | 0.1236353 |
| When $n_2 < n_{20}$, $n_{2m}$ = | 0.1779224 | 0.1667200 | 0.1823743 | 0.1526196 | 0.1593042 |
| When $k_2 \geqq k_{20}$, $k_{2m}$ = | 0.1351575 | 0.1341370 | 0.1542419 | 0.1188623 | 0.1364233 |
| When $k_2 < k_{20}$, $k_{2m}$ = | 0.1244714 | 0.1144324 | 0.1102271 | 0.0976929 | 0.0887854 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 70.107 | 105.511 | 128.903 | 31.502 | 77.053 |

35/35

| Case | 0.93 ≦ NA ≦ 1.0<br>195 < T ≦ 205<br>20-06 | 20-07 | 20-08 | 20-09 | 20-10 |
|---|---|---|---|---|---|
| $n_{10}$ | 1.7316602 | 1.7109076 | 1.7140510 | 1.7169074 | 1.7034522 |
| $k_{10}$ | 0.0769958 | 0.0825870 | 0.0712311 | 0.0659464 | 0.0912009 |
| $d_{10}$ (nm) | 87.563 | 152.078 | 152.368 | 152.739 | 216.873 |
| $n_{20}$ | 1.7153560 | 1.6429824 | 1.6947912 | 1.7201685 | 1.5969711 |
| $k_{20}$ | 0.2092703 | 0.2767726 | 0.2239389 | 0.1888883 | 0.3506487 |
| $d_{20}$ (nm) | 261.518 | 151.325 | 204.003 | 258.117 | 92.838 |
| When $n_1 \geqq n_{10}$, $n_{1m}$ = | 0.0685693 | 0.0512622 | 0.0601404 | 0.0671716 | 0.0436548 |
| When $n_1 < n_{10}$, $n_{1m}$ = | 0.0495715 | 0.0375720 | 0.0532251 | 0.0484131 | 0.0089709 |
| When $k_1 \geqq k_{10}$, $k_{1m}$ = | 0.0827515 | 0.0683850 | 0.0790723 | 0.0783716 | 0.0369128 |
| When $k_1 < k_{10}$, $k_{1m}$ = | 0.0588892 | 0.0391077 | 0.0446033 | 0.0456335 | 0.0165588 |
| When $d_1 \geqq d_{10}$, $d_{1m}$ (nm) = | 35.460 | 20.848 | ∞ | ∞ | 19.781 |
| When $d_1 < d_{10}$, $d_{1m}$ (nm) = | 11.967 | 10.711 | 16.311 | 17.445 | 2.680 |

-continued

| | | | | | |
|---|---|---|---|---|---|
| When $n_2 \geqq n_{20}$, $n_{2m}$ = | 0.1321082 | 0.1010400 | 0.1225134 | 0.1362366 | 0.0345703 |
| When $n_2 < n_{20}$, $n_{2m}$ = | 0.1646814 | 0.1448950 | 0.1569727 | 0.1688831 | 0.1562476 |
| When $k_2 \geqq k_{20}$, $k_{2m}$ = | 0.1585754 | 0.0998694 | 0.1194824 | 0.1443347 | 0.0797021 |
| When $k_2 < k_{20}$, $k_{2m}$ = | 0.0798230 | 0.0905042 | 0.0814771 | 0.0735376 | 0.0638440 |
| When $d_2 \geqq d_{20}$, $d_{2m}$ (nm) = | ∞ | ∞ | ∞ | ∞ | 10.032 |
| When $d_2 < d_{20}$, $d_{2m}$ (nm) = | 87.011 | 25.146 | 71.899 | 78.182 | 16.775 |

| $0.93 \leqq NA \leqq 1.0$<br>$195 < T \leqq 205$ | | | |
|---|---|---|---|
| Case | 20-11 | 20-12 | 20-13 |
| $n_{10}$ | 1.7053294 | 1.7084550 | 1.7088490 |
| $k_{10}$ | 0.0723641 | 0.0642090 | 0.0611230 |
| $d_{10}$ (nm) | 215.802 | 215.782 | 215.750 |
| $n_{20}$ | 1.6624125 | 1.7063284 | 1.7155496 |
| $k_{20}$ | 0.2625944 | 0.2112603 | 0.1784523 |
| $d_{20}$ (nm) | 147.133 | 200.541 | 257.296 |
| When $n_1 \geqq n_{10}$, $n_{1m}$ = | 0.0548254 | 0.0651489 | 0.0765845 |
| When $n_1 < n_{10}$, $n_{1m}$ = | 0.0418201 | 0.0593726 | 0.0732715 |
| When $k_1 \geqq k_{10}$, $k_{1m}$ = | 0.0710583 | 0.0775024 | 0.0765796 |
| When $k_1 < k_{10}$, $k_{1m}$ = | 0.0355750 | 0.0411511 | 0.0355579 |
| When $d_1 \geqq d_{10}$, $d_{1m}$ (nm) = | ∞ | ∞ | ∞ |
| When $d_1 < d_{10}$, $d_{1m}$ (nm) = | 15.640 | 79.525 | 76.637 |
| When $n_2 \geqq n_{20}$, $n_{2m}$ = | 0.1192065 | 0.1417981 | 0.1626379 |
| When $n_2 < n_{20}$, $n_{2m}$ = | 0.1432642 | 0.1798657 | 0.2073511 |
| When $k_2 \geqq k_{20}$, $k_{2m}$ = | 0.1091699 | 0.1229614 | 0.1404065 |
| When $k_2 < k_{20}$, $k_{2m}$ = | 0.0923608 | 0.0791760 | 0.0746033 |
| When $d_2 \geqq d_{20}$, $d_{2m}$ (nm) = | ∞ | ∞ | ∞ |
| When $d_2 < d_{20}$, $d_{2m}$ (nm) = | 19.545 | 71.258 | 73.210. |

2. An exposure method used in a process for manufacturing a semiconductor device, the method comprising the steps of:

providing an antireflective film having a two-layer structure between a resist layer and a silicon oxide layer formed on a surface of a silicon semiconductor substrate and having a thickness T (unit: nm) described below; and exposing the resist layer in an exposure system having a wavelength of 190 nm to 195 nm and a numerical aperture NA of $1.0 < NA \leqq 1.1$, the antireflective film including an upper layer having a complex refractive index $N_1$, and a lower layer having a complex refractive index $N_2$, the complex refractive indexes $N_1$ and $N_2$ being represented by the equations $N_1 = n_1 - k_1 i$ and $N_2 = n_2 - k_2 i$, respectively;

wherein assuming that the thickness of the upper layer is $d_1$ (unit: nm) and the thickness of the lower layer is $d_2$ (unit: nm), when any one of the combinations of values of $[n_{10}, k_{10}, d_{10}, n_{20}, k_{20}, d_{20}]$ described below is selected depending on the thickness T of the silicon oxide film, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1;$$

a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of dim in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$;and a value of $d_{2m}$ in a corresponding case is selected on the basis of a magnitude relation between $d_2$ and $d_{20}$; and in the tables below, in the line of "When $n_1 \geqq n_{10}$, $n_{1m}$=", each value in the right columns is "$n_{1m}-n_{10}$"; in the line of "When $n_1<n_{10}$, $n_{1m}$=", each value in the right columns is "$n_{10}-n_{1m}$"; in the line of "When $k_1 \geqq k_{10}$, $k_{1m}$", each value in the right columns is "$k_{1m}-k_{10}$"; in the line of "When $k_1<k_{10}$, $k_{1m}$=", each value in the right columns is "$k_{10}-k_{1m}$"; in the line of "When $d_1 \geqq d_{10}$, $d_{1m}$ (nm) =", each value (unit: nm) in the right columns is "$d_{1m}-d_{10}$"; in the line of "When $d_1<d_{10}$, $d_{1m}$ (nm) =", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$, $d_{2m}$ (nm) =", each value (unit: nm) in the right columns is "$d_{2m}-d_{20}$"; and in the line of "When $d_2<d_{20}$, $d_{2m}$ (nm) =", each value (unit: nm) in the right columns is "$d_{20}-d_{2m}$".

| $1.0 < NA \leqq 1.1$<br>$2 \leqq T \leqq 15$ | | | | | 1/34 |
|---|---|---|---|---|---|
| Case | 1-01 | 1-02 | 1-03 | 1-04 | 1-05 |
| $n_{10}$ | 2.1002530 | 1.9014716 | 1.8817545 | 1.8713707 | 1.8894555 |
| $k_{10}$ | 0.0458360 | 0.1897321 | 0.1528631 | 0.1131033 | 0.1025295 |
| $d_{10}$ (nm) | 25.245 | 35.107 | 29.787 | 20.680 | 13.808 |
| $n_{20}$ | 3.6613926 | 3.6832791 | 2.2496615 | 1.8471360 | 1.7319643 |
| $k_{20}$ | 2.0917723 | 0.6232721 | 0.5909670 | 0.3799287 | 0.2879285 |
| $d_{20}$ (nm) | 4.980 | 30.030 | 58.673 | 139.609 | 214.126 |
| When $n_1 \geqq n_{10}$, $n_{1m}$ = | 0.0805884 | 0.0768188 | 0.0754700 | 0.0824719 | 0.1060120 |
| When $n_1 < n_{10}$, $n_{1m}$ = | 0.0800293 | 0.0653833 | 0.0584985 | 0.0566113 | 0.0706006 |
| When $k_1 \geqq k_{10}$, $k_{1m}$ = | 0.0719092 | 0.0582312 | 0.0563574 | 0.0660449 | 0.0898218 |
| When $k_1 < k_{10}$, $k_{1m}$ = | 0.0458360 | 0.0865906 | 0.0835730 | 0.0866101 | 0.1025295 |
| When $d_1 \geqq d_{10}$, $d_{1m}$ (nm) = | 3.502 | 5.628 | 6.909 | 7.972 | 7.080 |
| When $d_1 < d_{10}$, $d_{1m}$ (nm) = | 2.843 | 4.121 | 4.441 | 4.574 | 4.198 |
| When $n_2 \geqq n_{20}$, $n_{2m}$ = | 0.2511194 | 0.1375208 | 0.1500757 | 0.1234998 | 0.1256079 |
| When $n_2 < n_{20}$, $n_{2m}$ = | 0.2478674 | 0.1642285 | 0.1673572 | 0.1560254 | 0.1556494 |
| When $k_2 \geqq k_{20}$, $k_{2m}$ = | 0.2675171 | 0.1813342 | 0.1899841 | 0.1681030 | 0.1175488 |

-continued

| | | | | | |
|---|---|---|---|---|---|
| When $k_2 < k_{20}$, $k_{2m}$ = | 0.2241895 | 0.1363525 | 0.1337048 | 0.1033130 | 0.0926782 |
| When $d_2 \geqq d_{20}$, $d_{2m}$ (nm) = | 0.668 | 1.453 | 8.618 | ∞ | ∞ |
| When $d_2 < d_{20}$, $d_{2m}$ (nm) = | 0.632 | 1.466 | 7.778 | 59.745 | 82.499 |

| $1.0 < NA \leqq 1.1$ $2 \leqq T \leqq 15$ | | | | | |
|---|---|---|---|---|---|
| Case | 1-06 | 1-07 | 1-08 | 1-09 | 1-10 |
| $n_{10}$ | 1.8919474 | 1.8730447 | 1.7734811 | 1.7581396 | 1.7209511 |
| $k_{10}$ | 0.0886250 | 0.0995044 | 0.0942049 | 0.0894114 | 0.0778149 |
| $d_{10}$ (nm) | 14.825 | 12.107 | 96.210 | 94.485 | 94.005 |
| $n_{20}$ | 1.7713589 | 1.6971361 | 2.0242448 | 1.8216770 | 1.6746822 |
| $k_{20}$ | 0.2959415 | 0.2384266 | 0.4293783 | 0.2841737 | 0.2144041 |
| $d_{20}$ (nm) | 207.437 | 276.341 | 66.416 | 135.446 | 211.729 |
| When $n_1 \geqq n_{10}$, $n_{1m}$ = | 0.1001855 | 0.1196069 | 0.0579333 | 0.0504431 | 0.0487988 |
| When $n_1 < n_{10}$, $n_{1m}$ = | 0.0678418 | 0.0862451 | 0.0202832 | 0.0122217 | 0.0195996 |
| When $k_1 \geqq k_{10}$, $k_{1m}$ = | 0.0828455 | 0.1086084 | 0.0429993 | 0.0327991 | 0.0449207 |
| When $k_1 < k_{10}$, $k_{1m}$ = | 0.0886250 | 0.0995044 | 0.0440173 | 0.0383289 | 0.0441089 |
| When $d_1 \geqq d_{10}$, $d_{1m}$ (nm) = | 7.253 | 7.622 | 12.574 | 14.854 | 20.756 |
| When $d_1 < d_{10}$, $d_{1m}$ (nm) = | 4.294 | 5.017 | 3.736 | 2.430 | 5.594 |
| When $n_2 \geqq n_{20}$, $n_{2m}$ = | 0.1250818 | 0.1274023 | 0.1038489 | 0.1178979 | 0.0654700 |
| When $n_2 < n_{20}$, $n_{2m}$ = | 0.1542432 | 0.1390320 | 0.1236121 | 0.1075012 | 0.0984851 |
| When $k_2 \geqq k_{20}$, $k_{2m}$ = | 0.1281506 | 0.1059973 | 0.1023560 | 0.1052271 | 0.0726978 |
| When $k_2 < k_{20}$, $k_{2m}$ = | 0.0937659 | 0.0853320 | 0.1026587 | 0.0735156 | 0.0618335 |
| When $d_2 \geqq d_{20}$, $d_{2m}$ (nm) = | ∞ | ∞ | 5.946 | 13.526 | ∞ |
| When $d_2 < d_{20}$, $d_{2m}$ (nm) = | 79.532 | 130.356 | 6.729 | 7.895 | 26.663 |

| $1.0 < NA \leqq 1.1$ $2 \leqq T \leqq 15$ | | | | | 2/34 |
|---|---|---|---|---|---|
| Case | 1-11 | 1-12 | 1-13 | 1-14 | 1-15 |
| $n_{10}$ | 1.7166765 | 1.7166130 | 1.7322234 | 1.7049421 | 1.7064564 |
| $k_{10}$ | 0.0677623 | 0.0755230 | 0.0835200 | 0.0655754 | 0.0573750 |
| $d_{10}$ (nm) | 92.667 | 182.689 | 166.765 | 163.194 | 160.636 |
| $n_{20}$ | 1.6766991 | 6.5634515 | 1.9262925 | 1.6664527 | 1.6879767 |
| $k_{20}$ | 0.1797231 | 3.2079655 | 0.3700807 | 0.1954874 | 0.1655431 |
| $d_{20}$ (nm) | 270.198 | 1.017 | 69.546 | 208.736 | 264.028 |
| When $n_1 \geqq n_{10}$, $n_{1m}$ = | 0.0538269 | 0.0791455 | 0.0502930 | 0.0463574 | 0.0530786 |
| When $n_1 < n_{10}$, $n_{1m}$ = | 0.0365198 | 0.0150903 | 0.0019495 | 0.0298389 | 0.0507080 |
| When $k_1 \geqq k_{10}$, $k_{1m}$ = | 0.0633020 | 0.0382202 | 0.0176428 | 0.0426367 | 0.0606909 |
| When $k_1 < k_{10}$, $k_{1m}$ = | 0.0490027 | 0.0352063 | 0.0101367 | 0.0363086 | 0.0412036 |
| When $d_1 \geqq d_{10}$, $d_{1m}$ (nm) = | ∞ | 44.970 | 29.513 | ∞ | ∞ |
| When $d_1 < d_{10}$, $d_{1m}$ (nm) = | 11.921 | 5.503 | 0.534 | 14.465 | 82.763 |
| When $n_2 \geqq n_{20}$, $n_{2m}$ = | 0.0746594 | 0.3760779 | 0.0943127 | 0.0451807 | 0.0846008 |
| When $n_2 < n_{20}$, $n_{2m}$ = | 0.1088159 | 0.6761377 | 0.0252344 | 0.0894604 | 0.1080103 |
| When $k_2 \geqq k_{20}$, $k_{2m}$ = | 0.0728833 | 0.4281982 | 0.0109839 | 0.0413684 | 0.0543652 |
| When $k_2 < k_{20}$, $k_{2m}$ = | 0.0561267 | 0.6156824 | 0.0921399 | 0.0546765 | 0.0510388 |
| When $d_2 \geqq d_{20}$, $d_{2m}$ (nm) = | ∞ | 0.095 | 5.760 | ∞ | ∞ |
| When $d_2 < d_{20}$, $d_{2m}$ (nm) = | 76.266 | 0.159 | 0.905 | 22.049 | 32.675 |

| $1.0 < NA \leqq 1.1$ $2 \leqq T \leqq 15$ | | | | | |
|---|---|---|---|---|---|
| Case | 1-16 | 1-17 | 1-18 | 1-19 | 1-20 |
| $n_{10}$ | 1.6929499 | 1.6905856 | 1.6919500 | 1.6995270 | 1.6946661 |
| $k_{10}$ | 0.0758677 | 0.0724871 | 0.0673580 | 0.0541447 | 0.0598692 |
| $d_{10}$ (nm) | 218.538 | 210.998 | 207.119 | 221.890 | 292.769 |
| $n_{20}$ | 1.7888879 | 1.7113381 | 1.6973679 | 1.6914313 | 5.7902895 |
| $k_{20}$ | 0.3373861 | 0.2424201 | 0.1951159 | 0.1602785 | 2.6464640 |
| $d_{20}$ (nm) | 83.914 | 155.877 | 222.394 | 261.841 | 1.370 |
| When $n_1 \geqq n_{10}$, $n_{1m}$ = | 0.0154590 | 0.0284326 | 0.0459937 | 0.0695007 | 0.0688428 |
| When $n_1 < n_{10}$, $n_{1m}$ = | 0.0644519 | 0.0618115 | 0.0647253 | 0.0614612 | 0.0576074 |
| When $k_1 \geqq k_{10}$, $k_{1m}$ = | 0.0296802 | 0.0451062 | 0.0571143 | 0.0607031 | 0.0650110 |
| When $k_1 < k_{10}$, $k_{1m}$ = | 0.0222290 | 0.0323779 | 0.0391223 | 0.0380823 | 0.0345483 |
| When $d_1 \geqq d_{10}$, $d_{1m}$ (nm) = | 8.212 | ∞ | ∞ | ∞ | ∞ |
| When $d_1 < d_{10}$, $d_{1m}$ (nm) = | 25.706 | 29.733 | 39.073 | 91.262 | 43.839 |
| When $n_2 \geqq n_{20}$, $n_{2m}$ = | 0.1222742 | 0.1267554 | 0.1643848 | 0.2245898 | 0.7013342 |
| When $n_2 < n_{20}$, $n_{2m}$ = | 0.0248633 | 0.0660693 | 0.1720679 | 0.1025806 | 0.7193848 |
| When $k_2 \geqq k_{20}$, $k_{2m}$ = | 0.0580225 | 0.0965234 | 0.1267737 | 0.1053369 | 0.5239075 |
| When $k_2 < k_{20}$, $k_{2m}$ = | 0.0934216 | 0.0846191 | 0.0756384 | 0.0566919 | 0.6531299 |

-continued

| | | | | | |
|---|---|---|---|---|---|
| When $d_2 \geqq d_{20}$, $d_{2m}$ (nm) = | 16.998 | ∞ | ∞ | ∞ | 0.304 |
| When $d_2 < d_{20}$, $d_{2m}$ (nm) = | 2.716 | 12.405 | 72.248 | 75.278 | 0.354 |

$1.0 < NA \leqq 1.1$
$2 \leqq T \leqq 15$

3/34

| Case | 1-21 | 1-22 | 1-23 | 1-24 |
|---|---|---|---|---|
| $n_{10}$ | 1.6927273 | 1.6938682 | 1.6959215 | 1.6965163 |
| $k_{10}$ | 0.0641185 | 0.0632641 | 0.0601626 | 0.0560943 |
| $d_{10}$ (nm) | 275.960 | 269.814 | 266.236 | 263.874 |
| $n_{20}$ | 1.7993913 | 1.7248410 | 1.7076727 | 1.6984359 |
| $k_{20}$ | 0.3510467 | 0.2487428 | 0.2009217 | 0.1709410 |
| $d_{20}$ (nm) | 81.101 | 150.052 | 214.823 | 277.894 |
| When $n_1 \geqq n_{10}$, $n_{1m}$ = | 0.0462292 | 0.0536658 | 0.0656104 | 0.0800903 |
| When $n_1 < n_{10}$, $n_{1m}$ = | 0.0484851 | 0.0418225 | 0.0432129 | 0.0552332 |
| When $k_1 \geqq k_{10}$, $k_{1m}$ = | 0.0620630 | 0.0619458 | 0.0615613 | 0.0629382 |
| When $k_1 < k_{10}$, $k_{1m}$ = | 0.0362708 | 0.0377515 | 0.0406262 | 0.0422571 |
| When $d_1 \geqq d_{10}$, $d_{1m}$ (nm) = | ∞ | ∞ | ∞ | ∞ |
| When $d_1 < d_{10}$, $d_{1m}$ (nm) = | 29.467 | 27.448 | 97.485 | 175.134 |
| When $n_2 \geqq n_{20}$, $n_{2m}$ = | 0.1596558 | 0.1810303 | 0.3970593 | 0.3365332 |
| When $n_2 < n_{20}$, $n_{2m}$ = | 0.1100391 | 0.2908167 | 0.2424414 | 0.2178503 |
| When $k_2 \geqq k_{20}$, $k_{2m}$ = | 0.1557141 | 0.1886804 | 0.2145630 | 0.2194727 |
| When $k_2 < k_{20}$, $k_{2m}$ = | 0.1210901 | 0.1012720 | 0.0897449 | 0.0805957 |
| When $d_2 \geqq d_{20}$, $d_{2m}$ (nm) = | 25.591 | ∞ | ∞ | ∞ |
| When $d_2 < d_{20}$, $d_{2m}$ (nm) = | 9.432 | 27.332 | 78.495 | 131.894 |

$1.0 < NA \leqq 1.1$
$15 < T \leqq 25$

| Case | 2-01 | 2-02 | 2-03 | 2-04 | 2-05 |
|---|---|---|---|---|---|
| $n_{10}$ | 1.8588603 | 1.8671897 | 1.8793061 | 1.8953035 | 1.8743725 |
| $k_{10}$ | 0.2152026 | 0.2000001 | 0.1213485 | 0.0980077 | 0.1084578 |
| $d_{10}$ (nm) | 37.726 | 35.681 | 21.414 | 14.908 | 12.201 |
| $n_{20}$ | 5.0977045 | 3.0932325 | 1.8727645 | 1.7635602 | 1.6884757 |
| $k_{20}$ | 0.6974562 | 0.7063642 | 0.4149520 | 0.3109442 | 0.2470663 |
| $d_{20}$ (nm) | 19.647 | 34.687 | 129.308 | 200.446 | 269.437 |
| When $n_1 \geqq n_{10}$, $n_{1m}$ = | 0.0758728 | 0.0747766 | 0.0798340 | 0.0988049 | 0.1178149 |
| When $n_1 < n_{10}$, $n_{1m}$ = | 0.0592542 | 0.0589661 | 0.0549634 | 0.0658325 | 0.0841418 |
| When $k_1 \geqq k_{10}$, $k_{1m}$ = | 0.0598401 | 0.0578650 | 0.0632202 | 0.0814417 | 0.1076917 |
| When $k_1 < k_{10}$, $k_{1m}$ = | 0.0788342 | 0.0811694 | 0.0865027 | 0.0980077 | 0.1084578 |
| When $d_1 \geqq d_{10}$, $d_{1m}$ (nm) = | 5.593 | 5.891 | 7.449 | 6.933 | 7.359 |
| When $d_1 < d_{10}$, $d_{1m}$ (nm) = | 4.233 | 4.238 | 4.249 | 4.053 | 4.794 |
| When $n_2 \geqq n_{20}$, $n_{2m}$ = | 0.1534875 | 0.1581152 | 0.1275403 | 0.1254932 | 0.1262524 |
| When $n_2 < n_{20}$, $n_{2m}$ = | 0.1697559 | 0.1894849 | 0.1565967 | 0.1540796 | 0.1389709 |
| When $k_2 \geqq k_{20}$, $k_{2m}$ = | 0.1955396 | 0.2168408 | 0.1812842 | 0.1267053 | 0.1044556 |
| When $k_2 < k_{20}$, $k_{2m}$ = | 0.1505579 | 0.1602844 | 0.1066724 | 0.0950110 | 0.0860864 |
| When $d_2 \geqq d_{20}$, $d_{2m}$ (nm) = | 0.659 | 2.512 | ∞ | ∞ | ∞ |
| When $d_2 < d_{20}$, $d_{2m}$ (nm) = | 0.674 | 2.526 | 26.047 | 76.118 | 126.536 |

$1.0 < NA \leqq 1.1$
$15 < T \leqq 25$

4/34

| Case | 2-06 | 2-07 | 2-08 | 2-09 | 2-10 |
|---|---|---|---|---|---|
| $n_{10}$ | 1.7693190 | 1.8089249 | 1.7628339 | 1.7223442 | 1.7176215 |
| $k_{10}$ | 0.1013402 | 0.1064114 | 0.0939832 | 0.0810686 | 0.0701007 |
| $d_{10}$ (nm) | 103.520 | 98.052 | 94.416 | 93.840 | 92.613 |
| $n_{20}$ | 3.2583829 | 3.5132584 | 1.8414170 | 1.6728089 | 1.6759231 |
| $k_{20}$ | 2.5781374 | 0.5501157 | 0.3092618 | 0.2260423 | 0.1876577 |
| $d_{20}$ (nm) | 3.121 | 29.615 | 125.923 | 203.086 | 261.422 |
| When $n_1 \geqq n_{10}$, $n_{1m}$ = | 0.0673926 | 0.0573926 | 0.0482458 | 0.0469287 | 0.0525317 |
| When $n_1 < n_{10}$, $n_{1m}$ = | 0.0182031 | 0.0185083 | 0.0097595 | 0.0170142 | 0.0338733 |
| When $k_1 \geqq k_{10}$, $k_{1m}$ = | 0.0401636 | 0.0390552 | 0.0281750 | 0.0413513 | 0.0608655 |
| When $k_1 < k_{10}$, $k_{1m}$ = | 0.0427917 | 0.0434326 | 0.0360242 | 0.0422778 | 0.0485864 |
| When $d_1 \geqq d_{10}$, $d_{1m}$ (nm) = | 13.610 | 8.991 | 12.525 | 18.295 | 32.066 |
| When $d_1 < d_{10}$, $d_{1m}$ (nm) = | 3.396 | 2.738 | 1.840 | 4.621 | 10.547 |

-continued

| | | | | | |
|---|---|---|---|---|---|
| When $n_2 \geqq n_{20}$, $n_{2m}$ = | 0.2210974 | 0.0961951 | 0.1120178 | 0.0558118 | 0.0724255 |
| When $n_2 < n_{20}$, $n_{2m}$ = | 0.3992041 | 0.1262915 | 0.1064856 | 0.0968689 | 0.1070728 |
| When $k_2 \geqq k_{20}$, $k_{2m}$ = | 0.3438342 | 0.0862598 | 0.0939502 | 0.0666077 | 0.0700989 |
| When $k_2 < k_{20}$, $k_{2m}$ = | 0.3502100 | 0.1067542 | 0.0758923 | 0.0625208 | 0.0568274 |
| When $d_2 \geqq d_{20}$, $d_{2m}$ (nm) = | 0.375 | 0.986 | 11.083 | ∞ | ∞ |
| When $d_2 < d_{20}$, $d_{2m}$ (nm) = | 0.497 | 1.167 | 5.972 | 24.056 | 73.630 |

$1.0 < NA \leqq 1.1$
$15 < T \leqq 25$

| Case | 2-11 | 2-12 | 2-13 | 2-14 | 2-15 |
|---|---|---|---|---|---|
| $n_{10}$ | 1.7053748 | 1.7067869 | 1.7234396 | 1.7309823 | 1.6924662 |
| $k_{10}$ | 0.0681661 | 0.0592936 | 0.0819972 | 0.0887627 | 0.0804140 |
| $d_{10}$ (nm) | 163.030 | 160.569 | 177.819 | 175.110 | 219.254 |
| $n_{20}$ | 1.6640911 | 1.6873274 | 5.0800961 | 9.5526510 | 1.8031504 |
| $k_{20}$ | 0.2056957 | 0.1726858 | 4.2173316 | 0.4602806 | 0.3794202 |
| $d_{20}$ (nm) | 200.113 | 255.377 | 1.054 | 10.232 | 74.951 |
| When $n_1 \geqq n_{10}$, $n_{1m}$ = | 0.0438354 | 0.0515637 | 0.0646301 | 0.0589197 | 0.0054749 |
| When $n_1 < n_{10}$, $n_{1m}$ = | 0.0254907 | 0.0493457 | 0.0095056 | 0.0049573 | 0.0624841 |
| When $k_1 \geqq k_{10}$, $k_{1m}$ = | 0.0375134 | 0.0575159 | 0.0321326 | 0.0226172 | 0.0163196 |
| When $k_1 < k_{10}$, $k_{1m}$ = | 0.0331799 | 0.0410168 | 0.0264954 | 0.0199707 | 0.0128040 |
| When $d_1 \geqq d_{10}$, $d_{1m}$ (nm) = | ∞ | ∞ | 31.849 | 25.868 | 2.747 |
| When $d_1 < d_{10}$, $d_{1m}$ (nm) = | 12.067 | 30.487 | 3.026 | 1.416 | 23.308 |
| When $n_2 \geqq n_{20}$, $n_{2m}$ = | 0.0383606 | 0.0825500 | 0.3294275 | 0.0929846 | 0.1306152 |
| When $n_2 < n_{20}$, $n_{2m}$ = | 0.0871460 | 0.1052795 | 0.6618042 | 0.0695691 | 0.0087109 |
| When $k_2 \geqq k_{20}$, $k_{2m}$ = | 0.0339417 | 0.0505530 | 0.2910742 | 0.0198328 | 0.0299487 |
| When $k_2 < k_{20}$, $k_{2m}$ = | 0.0549512 | 0.0515552 | 0.6908167 | 0.0870068 | 0.0872510 |
| When $d_2 \geqq d_{20}$, $d_{2m}$ (nm) = | ∞ | ∞ | 0.079 | 0.102 | 14.451 |
| When $d_2 < d_{20}$, $d_{2m}$ (nm) = | 19.637 | 29.589 | 0.186 | 0.076 | 0.824 |

$1.0 < NA \leqq 1.1$
$15 < T \leqq 25$

5/34

| Case | 2-16 | 2-17 | 2-18 | 2-19 | 2-20 |
|---|---|---|---|---|---|
| $n_{10}$ | 1.6899914 | 1.6915311 | 1.6993450 | 1.6920076 | 1.6934597 |
| $k_{10}$ | 0.0755734 | 0.0696615 | 0.0558443 | 0.0677866 | 0.0658489 |
| $d_{10}$ (nm) | 211.286 | 207.258 | 221.722 | 276.645 | 270.093 |
| $n_{20}$ | 1.7113670 | 1.6964473 | 1.6905618 | 1.8143335 | 1.7261499 |
| $k_{20}$ | 0.2592681 | 0.2049428 | 0.1670525 | 0.3967808 | 0.2668883 |
| $d_{20}$ (nm) | 147.090 | 213.635 | 253.347 | 72.378 | 141.360 |
| When $n_1 \geqq n_{10}$, $n_{1m}$ = | 0.0235022 | 0.0424463 | 0.0685596 | 0.0429663 | 0.0523279 |
| When $n_1 < n_{10}$, $n_{1m}$ = | 0.0594971 | 0.0645703 | 0.0572424 | 0.0479932 | 0.0410938 |
| When $k_1 \geqq k_{10}$, $k_{1m}$ = | 0.0403162 | 0.0547461 | 0.0583691 | 0.0593103 | 0.0600049 |
| When $k_1 < k_{10}$, $k_{1m}$ = | 0.0289734 | 0.0380127 | 0.0376013 | 0.0355176 | 0.0379749 |
| When $d_1 \geqq d_{10}$, $d_{1m}$ (nm) = | 18.036 | ∞ | ∞ | ∞ | ∞ |
| When $d_1 < d_{10}$, $d_{1m}$ (nm) = | 26.582 | 37.673 | 84.779 | 28.006 | 25.642 |
| When $n_2 \geqq n_{20}$, $n_{2m}$ = | 0.1259094 | 0.1555469 | 0.2302234 | 0.1717712 | 0.1831995 |
| When $n_2 < n_{20}$, $n_{2m}$ = | 0.0501526 | 0.1747144 | 0.0944592 | 0.1059167 | 0.2850769 |
| When $k_2 \geqq k_{20}$, $k_{2m}$ = | 0.0866736 | 0.1221960 | 0.1032471 | 0.1537634 | 0.1870032 |
| When $k_2 < k_{20}$, $k_{2m}$ = | 0.0848877 | 0.0779785 | 0.0578296 | 0.1330688 | 0.1069617 |
| When $d_2 \geqq d_{20}$, $d_{2m}$ (nm) = | ∞ | ∞ | ∞ | 19.935 | ∞ |
| When $d_2 < d_{20}$, $d_{2m}$ (nm) = | 9.771 | 69.780 | 73.090 | 7.607 | 20.837 |

$1.0 < NA \leqq 1.1$
$15 < T \leqq 25$

| Case | 2-21 | 2-22 |
|---|---|---|
| $n_{10}$ | 1.6956703 | 1.6963391 |
| $k_{10}$ | 0.0621151 | 0.0576411 |
| $d_{10}$ (nm) | 266.327 | 263.935 |
| $n_{20}$ | 1.7069279 | 1.6975975 |
| $k_{20}$ | 0.2113995 | 0.1780179 |
| $d_{20}$ (nm) | 206.262 | 269.259 |
| When $n_1 \geqq n_{10}$, $n_{1m}$ = | 0.0646936 | 0.0790869 |
| When $n_1 < n_{10}$, $n_{1m}$ = | 0.0423181 | 0.0536755 |
| When $k_1 \geqq k_{10}$, $k_{1m}$ = | 0.0600012 | 0.0616785 |
| When $k_1 < k_{10}$, $k_{1m}$ = | 0.0403015 | 0.0417126 |
| When $d_1 \geqq d_{10}$, $d_{1m}$ (nm) = | ∞ | ∞ |
| When $d_1 < d_{10}$, $d_{1m}$ (nm) = | 96.199 | 173.391 |
| When $n_2 \geqq n_{20}$, $n_{2m}$ = | 0.4184778 | 0.3488293 |

-continued

| | | |
|---|---|---|
| When $n_2 < n_{20}$, $n_{2m}$ = | 0.2491736 | 0.2216455 |
| When $k_2 \geqq k_{20}$, $k_{2m}$ = | 0.2142920 | 0.2197681 |
| When $k_2 < k_{20}$, $k_{2m}$ = | 0.0934741 | 0.0831250 |
| When $d_2 \geqq d_{20}$, $d_{2m}$ (nm) = | ∞ | ∞ |
| When $d_2 < d_{20}$, $d_{2m}$ (nm) = | 76.168 | 129.228 |

$1.0 < NA \leqq 1.1$
$25 < T \leqq 35$

6/34

| Case | 3-01 | 3-02 | 3-03 | 3-04 | 3-05 |
|---|---|---|---|---|---|
| $n_{10}$ | 1.8231304 | 1.8934062 | 1.9014262 | 1.8787814 | 1.8198973 |
| $k_{10}$ | 0.2426967 | 0.1289044 | 0.1029443 | 0.1135143 | 0.1197953 |
| $d_{10}$ (nm) | 38.982 | 22.067 | 15.306 | 12.334 | 96.975 |
| $n_{20}$ | 4.7825941 | 1.9169501 | 1.7714781 | 1.6867670 | 4.7572984 |
| $k_{20}$ | 0.7852430 | 0.4577317 | 0.3309508 | 0.2583639 | 0.6218490 |
| $d_{20}$ (nm) | 19.992 | 118.684 | 191.572 | 261.269 | 20.274 |
| When $n_1 \geqq n_{10}$, $n_{1m}$ = | 0.0699695 | 0.0767236 | 0.0951282 | 0.1154443 | 0.0479663 |
| When $n_1 < n_{10}$, $n_{1m}$ = | 0.0498486 | 0.0532642 | 0.0626563 | 0.0817676 | 0.0146021 |
| When $k_1 \geqq k_{10}$, $k_{1m}$ = | 0.0588489 | 0.0605774 | 0.0772998 | 0.1052600 | 0.0370215 |
| When $k_1 < k_{10}$, $k_{1m}$ = | 0.0707385 | 0.0857886 | 0.1011462 | 0.1135143 | 0.0364331 |
| When $d_1 \geqq d_{10}$, $d_{1m}$ (nm) = | 5.137 | 6.730 | 6.574 | 7.047 | 7.725 |
| When $d_1 < d_{10}$, $d_{1m}$ (nm) = | 3.775 | 3.826 | 3.782 | 4.562 | 2.005 |
| When $n_2 \geqq n_{20}$, $n_{2m}$ = | 0.1872302 | 0.1343799 | 0.1259058 | 0.1236719 | 0.1156909 |
| When $n_2 < n_{20}$, $n_{2m}$ = | 0.2029309 | 0.1567590 | 0.1523523 | 0.1408569 | 0.1282800 |
| When $k_2 \geqq k_{20}$, $k_{2m}$ = | 0.2449841 | 0.2003137 | 0.1294177 | 0.1036865 | 0.0748242 |
| When $k_2 < k_{20}$, $k_{2m}$ = | 0.1832959 | 0.1099609 | 0.0962476 | 0.0870068 | 0.1199268 |
| When $d_2 \geqq d_{20}$, $d_{2m}$ (nm) = | 0.864 | ∞ | ∞ | ∞ | 0.532 |
| When $d_2 < d_{20}$, $d_{2m}$ (nm) = | 0.839 | 21.916 | 71.881 | 121.487 | 0.552 |

$1.0 < NA \leqq 1.1$
$25 < T \leqq 35$

| Case | 3-06 | 3-07 | 3-08 | 3-09 | 3-10 |
|---|---|---|---|---|---|
| $n_{10}$ | 1.7669399 | 1.7235821 | 1.7188964 | 1.7058208 | 1.7073313 |
| $k_{10}$ | 0.0997580 | 0.0847397 | 0.0726255 | 0.0710513 | 0.0613671 |
| $d_{10}$ (nm) | 94.208 | 93.618 | 92.505 | 162.764 | 160.462 |
| $n_{20}$ | 1.8558060 | 1.6692590 | 1.6760484 | 1.6616172 | 1.6880654 |
| $k_{20}$ | 0.3364471 | 0.2394056 | 0.1967286 | 0.2176394 | 0.1807904 |
| $d_{20}$ (nm) | 117.969 | 195.006 | 252.779 | 191.801 | 246.769 |
| When $n_1 \geqq n_{10}$, $n_{1m}$ = | 0.0449036 | 0.0442456 | 0.0506409 | 0.0405530 | 0.0497949 |
| When $n_1 < n_{10}$, $n_{1m}$ = | 0.0058435 | 0.0142969 | 0.0314514 | 0.0176917 | 0.0472620 |
| When $k_1 \geqq k_{10}$, $k_{1m}$ = | 0.0200403 | 0.0369336 | 0.0583228 | 0.0316150 | 0.0541370 |
| When $k_1 < k_{10}$, $k_{1m}$ = | 0.0309863 | 0.0404504 | 0.0477759 | 0.0303076 | 0.0405200 |
| When $d_1 \geqq d_{10}$, $d_{1m}$ (nm) = | 10.713 | 16.167 | 24.298 | ∞ | ∞ |
| When $d_1 < d_{10}$, $d_{1m}$ (nm) = | 1.043 | 3.709 | 9.337 | 7.078 | 23.845 |
| When $n_2 \geqq n_{20}$, $n_{2m}$ = | 0.1063135 | 0.0450122 | 0.0699963 | 0.0309314 | 0.0781641 |
| When $n_2 < n_{20}$, $n_{2m}$ = | 0.1037158 | 0.0932996 | 0.1043005 | 0.0818408 | 0.1014221 |
| When $k_2 \geqq k_{20}$, $k_{2m}$ = | 0.0686243 | 0.0581018 | 0.0668628 | 0.0258777 | 0.0465137 |
| When $k_2 < k_{20}$, $k_{2m}$ = | 0.0768091 | 0.0625977 | 0.0574854 | 0.0546838 | 0.0521045 |
| When $d_2 \geqq d_{20}$, $d_{2m}$ (nm) = | 9.637 | ∞ | ∞ | 13.452 | ∞ |
| When $d_2 < d_{20}$, $d_{2m}$ (nm) = | 3.465 | 21.705 | 32.653 | 17.168 | 25.940 |

$1.0 < NA \leqq 1.1$
$25 < T \leqq 35$

7/34

| Case | 3-11 | 3-12 | 3-13 | 3-14 | 3-15 | 3-16 |
|---|---|---|---|---|---|---|
| $n_{10}$ | 1.6893950 | 1.6912149 | 1.6993872 | 1.6931110 | 1.6955537 | 1.6962507 |
| $k_{10}$ | 0.0792587 | 0.0722082 | 0.0576769 | 0.0689939 | 0.0643335 | 0.0593120 |
| $d_{10}$ (nm) | 211.356 | 207.241 | 221.603 | 270.168 | 266.333 | 263.960 |
| $n_{20}$ | 1.7121469 | 1.6964479 | 1.6911809 | 1.7281714 | 1.7074500 | 1.6977843 |
| $k_{20}$ | 0.2795726 | 0.2163033 | 0.1749036 | 0.2885226 | 0.2235939 | 0.1860709 |
| $d_{20}$ (nm) | 139.203 | 205.754 | 244.825 | 133.446 | 198.195 | 261.024 |
| When $n_1 \geqq n_{10}$, $n_{1m}$ = | 0.0187524 | 0.0389221 | 0.0673108 | 0.0502356 | 0.0624109 | 0.0782690 |
| When $n_1 < n_{10}$, $n_{1m}$ = | 0.0561719 | 0.0620898 | 0.0525073 | 0.0397852 | 0.0411060 | 0.0522693 |
| When $k_1 \geqq k_{10}$, $k_{1m}$ = | 0.0323267 | 0.0510889 | 0.0557678 | 0.0576538 | 0.0581616 | 0.0602515 |

-continued

| 1.0 < NA ≦ 1.1<br>25 < T ≦ 35 | | | | | | 7/34 |
|---|---|---|---|---|---|---|
| Case | 3-11 | 3-12 | 3-13 | 3-14 | 3-15 | 3-16 |
| When $k_1 < k_{10}$, $k_{1m}$ = | 0.0242261 | 0.0363989 | 0.0368542 | 0.0366370 | 0.0397400 | 0.0408899 |
| When $d_1 \geqq d_{10}$, $d_{1m}$ (nm) = | 9.539 | ∞ | ∞ | ∞ | ∞ | ∞ |
| When $d_1 < d_{10}$, $d_{1m}$ (nm) = | 23.792 | 36.062 | 80.743 | 23.618 | 94.755 | 119.700 |
| When $n_2 \geqq n_{20}$, $n_{2m}$ = | 0.1258521 | 0.1531580 | 0.2394678 | 0.1860962 | 0.4430444 | 0.3636609 |
| When $n_2 < n_{20}$, $n_{2m}$ = | 0.0334863 | 0.1783936 | 0.0871167 | 0.1489648 | 0.2583777 | 0.2256018 |
| When $k_2 \geqq k_{20}$, $k_{2m}$ = | 0.0734656 | 0.1167761 | 0.1010718 | 0.1855286 | 0.2138647 | 0.2198901 |
| When $k_2 < k_{20}$, $k_{2m}$ = | 0.0783704 | 0.0804089 | 0.0594067 | 0.1140149 | 0.0979895 | 0.0864600 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 6.823 | 66.025 | 33.786 | 17.363 | 72.201 | 97.445 |

| 1.0 < NA ≦ 1.1<br>35 < T ≦ 45 | | | | | 8/34 |
|---|---|---|---|---|---|
| Case | 4-01 | 4-02 | 4-03 | 4-04 | 4-05 |
| $n_{10}$ | 1.8741027 | 1.9162345 | 1.9099224 | 1.8839284 | 1.7973698 |
| $k_{10}$ | 0.2292405 | 0.1358555 | 0.1141224 | 0.1193744 | 0.1226911 |
| $d_{10}$ (nm) | 31.502 | 21.455 | 14.789 | 12.268 | 93.176 |
| $n_{20}$ | 2.4589695 | 1.9418040 | 1.7536831 | 1.6821215 | 2.1323779 |
| $k_{20}$ | 0.9273915 | 0.4998799 | 0.3442834 | 0.2672652 | 0.6525391 |
| $d_{20}$ (nm) | 39.688 | 110.373 | 186.067 | 253.238 | 46.828 |
| When $n_1 \geqq n_{10}$, $n_{1m}$ = | 0.0646472 | 0.0749023 | 0.0953894 | 0.1145032 | 0.0393335 |
| When $n_1 < n_{10}$, $n_{1m}$ = | 0.0466125 | 0.0512402 | 0.0611060 | 0.0810242 | 0.0058411 |
| When $k_1 \geqq k_{10}$, $k_{1m}$ = | 0.0535095 | 0.0588599 | 0.0769971 | 0.1049219 | 0.0222083 |
| When $k_1 < k_{10}$, $k_{1m}$ = | 0.0782300 | 0.0839917 | 0.1022253 | 0.1138464 | 0.0267273 |
| When $d_1 \geqq d_{10}$, $d_{1m}$ (nm) = | 4.763 | 5.873 | 6.052 | 6.690 | 7.237 |
| When $d_1 < d_{10}$, $d_{1m}$ (nm) = | 3.092 | 3.244 | 3.414 | 4.349 | 0.847 |
| When $n_2 \geqq n_{20}$, $n_{2m}$ = | 0.2061353 | 0.1383777 | 0.1254065 | 0.1201538 | 0.0908765 |
| When $n_2 < n_{20}$, $n_{2m}$ = | 0.1985669 | 0.1593604 | 0.1521448 | 0.1405737 | 0.1202173 |
| When $k_2 \geqq k_{20}$, $k_{2m}$ = | 0.2506677 | 0.2047961 | 0.1231897 | 0.1019714 | 0.0402307 |
| When $k_2 < k_{20}$, $k_{2m}$ = | 0.1792896 | 0.1103943 | 0.0960205 | 0.0872583 | 0.1042542 |
| When $d_2 \geqq d_{20}$, $d_{2m}$ (nm) = | 6.142 | ∞ | ∞ | ∞ | 4.028 |
| When $d_2 < d_{20}$, $d_{2m}$ (nm) = | 4.657 | 20.982 | 70.019 | 92.164 | 2.915 |

| 1.0 < NA ≦ 1.1<br>35 < T ≦ 45 | | | | | |
|---|---|---|---|---|---|
| Case | 4-06 | 4-07 | 4-08 | 4-09 | 4-10 |
| $n_{10}$ | 1.7231751 | 1.7198225 | 1.7057007 | 1.7079030 | 1.6886446 |
| $k_{10}$ | 0.0881939 | 0.0748307 | 0.0735111 | 0.0631371 | 0.0826816 |
| $d_{10}$ (nm) | 93.194 | 92.273 | 162.218 | 160.241 | 210.810 |
| $n_{20}$ | 1.6583398 | 1.6753837 | 1.6560667 | 1.6895692 | 1.7077667 |
| $k_{20}$ | 0.2493789 | 0.2040438 | 0.2270715 | 0.1875698 | 0.2975930 |
| $d_{20}$ (nm) | 187.627 | 244.025 | 183.673 | 237.741 | 132.542 |
| When $n_1 \geqq n_{10}$, $n_{1m}$ = | 0.0413782 | 0.0488660 | 0.0374475 | 0.0482141 | 0.0106323 |
| When $n_1 < n_{10}$, $n_{1m}$ = | 0.0123999 | 0.0300476 | 0.0153528 | 0.0446057 | 0.0519153 |
| When $k_1 \geqq k_{10}$, $k_{1m}$ = | 0.0333630 | 0.0568799 | 0.0277051 | 0.0515784 | 0.0235608 |
| When $k_1 < k_{10}$, $k_{1m}$ = | 0.0393298 | 0.0467004 | 0.0300195 | 0.0397412 | 0.0190234 |
| When $d_1 \geqq d_{10}$, $d_{1m}$ (nm) = | 13.894 | 20.818 | 24.657 | ∞ | 6.948 |
| When $d_1 < d_{10}$, $d_{1m}$ (nm) = | 3.123 | 8.547 | 5.758 | 21.149 | 21.403 |
| When $n_2 \geqq n_{20}$, $n_{2m}$ = | 0.0360730 | 0.0689490 | 0.0276392 | 0.0753564 | 0.1220337 |
| When $n_2 < n_{20}$, $n_{2m}$ = | 0.0901636 | 0.1032593 | 0.0781885 | 0.0941541 | 0.0190320 |
| When $k_2 \geqq k_{20}$, $k_{2m}$ = | 0.0474146 | 0.0634253 | 0.0205627 | 0.0433423 | 0.0612073 |
| When $k_2 < k_{20}$, $k_{2m}$ = | 0.0610718 | 0.0577832 | 0.0533984 | 0.0526196 | 0.0606079 |
| When $d_2 \geqq d_{20}$, $d_{2m}$ (nm) = | ∞ | ∞ | 8.473 | ∞ | ∞ |
| When $d_2 < d_{20}$, $d_{2m}$ (nm) = | 20.321 | 31.703 | 15.881 | 21.519 | 3.543 |

1.0 < NA ≦ 1.1
35 < T ≦ 45

9/34

| Case | 4-11 | 4-12 | 4-13 | 4-14 |
|---|---|---|---|---|
| $n_{10}$ | 1.6995870 | 1.6927517 | 1.6954892 | 1.6961809 |
| $k_{10}$ | 0.0592337 | 0.0720967 | 0.0662812 | 0.0606151 |
| $d_{10}$ (nm) | 221.497 | 269.568 | 265.955 | 263.663 |
| $n_{20}$ | 1.6927290 | 1.7225076 | 1.7055518 | 1.6966094 |
| $k_{20}$ | 0.1818275 | 0.3075740 | 0.2340649 | 0.1927366 |
| $d_{20}$ (nm) | 235.781 | 126.653 | 190.864 | 253.572 |
| When $n_1 \geqq n_{10}$, $n_{1m}$ = | 0.0661182 | 0.0430298 | 0.0571948 | 0.0777271 |
| When $n_1 < n_{10}$, $n_{1m}$ = | 0.0480371 | 0.0376990 | 0.0396948 | 0.0514954 |
| When $k_1 \geqq k_{10}$, $k_{1m}$ = | 0.0532056 | 0.0552930 | 0.0563965 | 0.0590613 |
| When $k_1 < k_{10}$, $k_{1m}$ = | 0.0358557 | 0.0353455 | 0.0387683 | 0.0400696 |
| When $d_1 \geqq d_{10}$, $d_{1m}$ (nm) = | ∞ | ∞ | ∞ | ∞ |
| When $d_1 < d_{10}$, $d_{1m}$ (nm) = | 78.174 | 21.398 | 89.629 | 112.221 |
| When $n_2 \geqq n_{20}$, $n_{2m}$ = | 0.2507446 | 0.1898645 | 0.4617859 | 0.3498169 |
| When $n_2 < n_{20}$, $n_{2m}$ = | 0.0793469 | 0.1193628 | 0.2673291 | 0.2271130 |
| When $k_2 \geqq k_{20}$, $k_{2m}$ = | 0.0998633 | 0.1866309 | 0.2129163 | 0.2195020 |
| When $k_2 < k_{20}$, $k_{2m}$ = | 0.0613184 | 0.1217163 | 0.1026648 | 0.0902368 |
| When $d_2 \geqq d_{20}$, $d_{2m}$ (nm) = | ∞ | ∞ | ∞ | ∞ |
| When $d_2 < d_{20}$, $d_{2m}$ (nm) = | 33.021 | 15.026 | 69.134 | 84.327 |

1.0 < NA ≦ 1.1
45 < T ≦ 55

| Case | 5-01 | 5-02 | 5-03 | 5-04 | 5-05 |
|---|---|---|---|---|---|
| $n_{10}$ | 1.8808544 | 1.9316654 | 1.9082705 | 1.8785232 | 1.7211644 |
| $k_{10}$ | 0.2454152 | 0.1473610 | 0.1322705 | 0.1271526 | 0.0906139 |
| $d_{10}$ (nm) | 24.855 | 18.765 | 14.189 | 12.435 | 92.694 |
| $n_{20}$ | 1.8495394 | 1.8569906 | 1.7144055 | 1.6714546 | 1.6423304 |
| $k_{20}$ | 0.8565648 | 0.5034890 | 0.3458924 | 0.2699971 | 0.2528050 |
| $d_{20}$ (nm) | 51.788 | 110.667 | 182.182 | 245.412 | 180.257 |
| When $n_1 \geqq n_{10}$, $n_{1m}$ = | 0.0633093 | 0.0784436 | 0.0967798 | 0.1127563 | 0.0394434 |
| When $n_1 < n_{10}$, $n_{1m}$ = | 0.0379272 | 0.0483252 | 0.0593640 | 0.0800098 | 0.0123450 |
| When $k_1 \geqq k_{10}$, $k_{1m}$ = | 0.0520349 | 0.0606396 | 0.0782654 | 0.1046387 | 0.0323718 |
| When $k_1 < k_{10}$, $k_{1m}$ = | 0.0704724 | 0.0844775 | 0.1016626 | 0.1111450 | 0.0404236 |
| When $d_1 \geqq d_{10}$, $d_{1m}$ (nm) = | 4.463 | 5.359 | 5.721 | 6.653 | 12.460 |
| When $d_1 < d_{10}$, $d_{1m}$ (nm) = | 2.319 | 2.677 | 3.157 | 4.357 | 3.091 |
| When $n_2 \geqq n_{20}$, $n_{2m}$ = | 0.1530676 | 0.1305420 | 0.1246069 | 0.1153186 | 0.0322009 |
| When $n_2 < n_{20}$, $n_{2m}$ = | 0.1897241 | 0.1692273 | 0.1526025 | 0.1380359 | 0.0893225 |
| When $k_2 \geqq k_{20}$, $k_{2m}$ = | 0.1919946 | 0.1591870 | 0.1122729 | 0.0997217 | 0.0401709 |
| When $k_2 < k_{20}$, $k_{2m}$ = | 0.1170728 | 0.1032434 | 0.0948108 | 0.0869653 | 0.0592017 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 9.182 | 23.164 | 70.833 | 93.569 | 20.376 |

1.0 < NA ≦ 1.1
45 < T ≦ 55

10/34

| Case | 5-06 | 5-07 | 5-08 | 5-09 | 5-10 |
|---|---|---|---|---|---|
| $n_{10}$ | 1.7204079 | 1.7050622 | 1.7085349 | 1.6878153 | 1.6980473 |
| $k_{10}$ | 0.0761160 | 0.0748972 | 0.0642166 | 0.0847734 | 0.0703784 |
| $d_{10}$ (nm) | 92.018 | 161.630 | 160.005 | 209.683 | 224.445 |
| $n_{20}$ | 1.6751968 | 1.6489715 | 1.6919631 | 1.6959203 | 1.6616204 |
| $k_{20}$ | 0.2080809 | 0.2315625 | 0.1914882 | 0.3070669 | 0.2238826 |
| $d_{20}$ (nm) | 234.537 | 175.108 | 227.913 | 127.092 | 171.370 |
| When $n_1 \geqq n_{10}$, $n_{1m}$ = | 0.0481116 | 0.0356750 | 0.0469714 | 0.0053320 | 0.0535730 |
| When $n_1 < n_{10}$, $n_{1m}$ = | 0.0302478 | 0.0193359 | 0.0419556 | 0.0458972 | 0.0248047 |
| When $k_1 \geqq k_{10}$, $k_{1m}$ = | 0.0572302 | 0.0287097 | 0.0507117 | 0.0169995 | 0.0427319 |
| When $k_1 < k_{10}$, $k_{1m}$ = | 0.0456555 | 0.0334753 | 0.0389539 | 0.0159290 | 0.0235608 |
| When $d_1 \geqq d_{10}$, $d_{1m}$ (nm) = | 19.317 | 21.414 | ∞ | 2.347 | ∞ |
| When $d_1 < d_{10}$, $d_{1m}$ (nm) = | 8.336 | 7.128 | 19.272 | 19.688 | 12.738 |
| When $n_2 \geqq n_{20}$, $n_{2m}$ = | 0.0703723 | 0.0326379 | 0.0750854 | 0.1108911 | 0.0566052 |
| When $n_2 < n_{20}$, $n_{2m}$ = | 0.1049292 | 0.0778333 | 0.0787329 | 0.0108118 | 0.0780139 |
| When $k_2 \geqq k_{20}$, $k_{2m}$ = | 0.0616284 | 0.0216638 | 0.0424329 | 0.0606311 | 0.0720593 |
| When $k_2 < k_{20}$, $k_{2m}$ = | 0.0584753 | 0.0525964 | 0.0537231 | 0.0383350 | 0.0623987 |
| When $d_2 \geqq d_{20}$, $d_{2m}$ (nm) = | ∞ | 8.070 | ∞ | 32.807 | ∞ |
| When $d_2 < d_{20}$, $d_{2m}$ (nm) = | 32.758 | 15.758 | 17.351 | 1.915 | 21.521 |

-continued

| 1.0 < NA ≦ 1.1<br>45 < T ≦ 55 | | | | |
|---|---|---|---|---|
| Case | 5-11 | 5-12 | 5-13 | 5-14 |
| $n_{10}$ | 1.6999707 | 1.6924126 | 1.6955002 | 1.6961000 |
| $k_{10}$ | 0.0601951 | 0.0742318 | 0.0674212 | 0.0611797 |
| $d_{10}$ (nm) | 221.512 | 268.357 | 265.225 | 263.146 |
| $n_{20}$ | 1.6952970 | 1.7068352 | 1.7004174 | 1.6940899 |
| $k_{20}$ | 0.1862586 | 0.3173492 | 0.2397614 | 0.1962440 |
| $d_{20}$ (nm) | 225.852 | 120.697 | 183.997 | 246.462 |
| When $n_1 \geqq n_{10}$, $n_{1m}$ = | 0.0654663 | 0.0386316 | 0.0536462 | 0.0776611 |
| When $n_1 < n_{10}$, $n_{1m}$ = | 0.0445935 | 0.0350720 | 0.0381848 | 0.0515515 |
| When $k_1 \geqq k_{10}$, $k_{1m}$ = | 0.0509546 | 0.0537524 | 0.0551721 | 0.0583948 |
| When $k_1 < k_{10}$, $k_{1m}$ = | 0.0349414 | 0.0344934 | 0.0383105 | 0.0394385 |
| When $d_1 \geqq d_{10}$, $d_{1m}$ (nm) = | ∞ | ∞ | ∞ | ∞ |
| When $d_1 < d_{10}$, $d_{1m}$ (nm) = | 76.496 | 19.128 | 37.283 | 109.648 |
| When $n_2 \geqq n_{20}$, $n_{2m}$ = | 0.1168579 | 0.1905981 | 0.3934021 | 0.3400916 |
| When $n_2 < n_{20}$, $n_{2m}$ = | 0.0700696 | 0.1027393 | 0.2743970 | 0.2283606 |
| When $k_2 \geqq k_{20}$, $k_{2m}$ = | 0.1002319 | 0.1933838 | 0.2120459 | 0.2188281 |
| When $k_2 < k_{20}$, $k_{2m}$ = | 0.0624707 | 0.1168652 | 0.1050110 | 0.0926550 |
| When $d_2 \geqq d_{20}$, $d_{2m}$ (nm) = | ∞ | ∞ | ∞ | ∞ |
| When $d_2 < d_{20}$, $d_{2m}$ (nm) = | 28.597 | 13.909 | 67.541 | 81.764 |

11/34

| 1.0 < NA ≦ 1.1<br>55 < T ≦ 65 | | | | | |
|---|---|---|---|---|---|
| Case | 6-01 | 6-02 | 6-03 | 6-04 | 6-05 |
| $n_{10}$ | 1.8609133 | 1.9462238 | 1.9002376 | 1.8750233 | 1.8816918 |
| $k_{10}$ | 0.2699154 | 0.1588548 | 0.1498745 | 0.1302055 | 0.0811209 |
| $d_{10}$ (nm) | 23.275 | 16.938 | 13.880 | 12.592 | 12.084 |
| $n_{20}$ | 1.6780954 | 1.8061043 | 1.6764313 | 1.6672162 | 1.7277101 |
| $k_{20}$ | 0.8091000 | 0.4989592 | 0.3420875 | 0.2718902 | 0.2394028 |
| $d_{20}$ (nm) | 51.309 | 107.791 | 176.900 | 235.718 | 282.393 |
| When $n_1 \geqq n_{10}$, $n_{1m}$ = | 0.0700366 | 0.0847327 | 0.0979871 | 0.1121912 | 0.1205115 |
| When $n_1 < n_{10}$, $n_{1m}$ = | 0.0352271 | 0.0459912 | 0.0579346 | 0.0799817 | 0.0890784 |
| When $k_1 \geqq k_{10}$, $k_{1m}$ = | 0.0520923 | 0.0625745 | 0.0794043 | 0.1043726 | 0.1106958 |
| When $k_1 < k_{10}$, $k_{1m}$ = | 0.0664282 | 0.0874719 | 0.0997217 | 0.1093811 | 0.0811209 |
| When $d_1 \geqq d_{10}$, $d_{1m}$ (nm) = | 4.496 | 4.952 | 5.583 | 6.704 | 7.616 |
| When $d_1 < d_{10}$, $d_{1m}$ (nm) = | 2.084 | 2.260 | 3.039 | 4.426 | 5.147 |
| When $n_2 \geqq n_{20}$, $n_{2m}$ = | 0.1454468 | 0.1290356 | 0.1219507 | 0.1104688 | 0.1083423 |
| When $n_2 < n_{20}$, $n_{2m}$ = | 0.1338672 | 0.1849402 | 0.1524817 | 0.1364417 | 0.1532007 |
| When $k_2 \geqq k_{20}$, $k_{2m}$ = | 0.1326758 | 0.1316541 | 0.1033948 | 0.0988464 | 0.1079004 |
| When $k_2 < k_{20}$, $k_{2m}$ = | 0.1106470 | 0.1010791 | 0.0949341 | 0.0882678 | 0.0854614 |
| When $d_2 \geqq d_{20}$, $d_{2m}$ (nm) = | 18.182 | ∞ | ∞ | ∞ | ∞ |
| When $d_2 < d_{20}$, $d_{2m}$ (nm) = | 8.638 | 17.532 | 68.073 | 94.482 | 130.723 |

| 1.0 < NA ≦ 1.1<br>55 < T ≦ 65 | | | | | |
|---|---|---|---|---|---|
| Case | 6-06 | 6-07 | 6-08 | 6-09 | 6-10 |
| $n_{10}$ | 1.7196449 | 1.7211216 | 1.7282121 | 1.7047574 | 1.7094298 |
| $k_{10}$ | 0.0916508 | 0.0765241 | 0.0683348 | 0.0753118 | 0.0647325 |
| $d_{10}$ (nm) | 92.440 | 91.942 | 92.298 | 161.355 | 159.970 |
| $n_{20}$ | 1.6323282 | 1.6777604 | 1.7222619 | 1.6462273 | 1.6962571 |
| $k_{20}$ | 0.2539653 | 0.2105462 | 0.1825246 | 0.2341241 | 0.1938378 |
| $d_{20}$ (nm) | 171.320 | 223.941 | 274.062 | 165.232 | 217.150 |
| When $n_1 \geqq n_{10}$, $n_{1m}$ = | 0.0390417 | 0.0485681 | 0.0546460 | 0.0358069 | 0.0474683 |
| When $n_1 < n_{10}$, $n_{1m}$ = | 0.0139282 | 0.0313391 | 0.0292078 | 0.0174304 | 0.0407373 |
| When $k_1 \geqq k_{10}$, $k_{1m}$ = | 0.0333240 | 0.0585132 | 0.0578357 | 0.0324670 | 0.0508789 |
| When $k_1 < k_{10}$, $k_{1m}$ = | 0.0406140 | 0.0454041 | 0.0481470 | 0.0321411 | 0.0389600 |
| When $d_1 \geqq d_{10}$, $d_{1m}$ (nm) = | 12.043 | 19.132 | 42.010 | 19.174 | ∞ |
| When $d_1 < d_{10}$, $d_{1m}$ (nm) = | 3.525 | 8.472 | 8.190 | 6.358 | 18.590 |
| When $n_2 \geqq n_{20}$, $n_{2m}$ = | 0.0324304 | 0.0734375 | 0.0906226 | 0.0327905 | 0.0764417 |
| When $n_2 < n_{20}$, $n_{2m}$ = | 0.0896448 | 0.1073743 | 0.1223853 | 0.0797839 | 0.0702637 |
| When $k_2 \geqq k_{20}$, $k_{2m}$ = | 0.0391357 | 0.0623755 | 0.0817871 | 0.0268372 | 0.0433899 |
| When $k_2 < k_{20}$, $k_{2m}$ = | 0.0597375 | 0.0603992 | 0.0593811 | 0.0545007 | 0.0559253 |
| When $d_2 \geqq d_{20}$, $d_{2m}$ (nm) = | ∞ | ∞ | ∞ | 9.153 | ∞ |
| When $d_2 < d_{20}$, $d_{2m}$ (nm) = | 20.788 | 29.764 | 77.892 | 16.109 | 14.325 |

1.0 < NA ≦ 1.1
55 < T ≦ 65

12/34

| Case | 6-11 | 6-12 | 6-13 | 6-14 | 6-15 | 6-16 |
|---|---|---|---|---|---|---|
| $n_{10}$ | 1.6870964 | 1.6986314 | 1.7003667 | 1.6951156 | 1.6955653 | 1.6958377 |
| $k_{10}$ | 0.0858972 | 0.0705958 | 0.0607285 | 0.0571177 | 0.0680298 | 0.0528303 |
| $d_{10}$ (nm) | 208.556 | 224.893 | 221.557 | 215.781 | 264.644 | 274.984 |
| $n_{20}$ | 1.6830399 | 1.6622291 | 1.6983916 | 1.6957463 | 1.6953987 | 1.6882898 |
| $k_{20}$ | 0.3090553 | 0.2274423 | 0.1887213 | 0.1617780 | 0.2417239 | 0.1657751 |
| $d_{20}$ (nm) | 121.249 | 160.831 | 215.383 | 277.216 | 176.078 | 275.044 |
| When $n_1 \geqq n_{10}$, $n_{1m}$ = | 0.0051123 | 0.0520032 | 0.0662122 | 0.0842517 | 0.0515662 | 0.0590991 |
| When $n_1 < n_{10}$, $n_{1m}$ = | 0.0418372 | 0.0227649 | 0.0435059 | 0.0645801 | 0.0369092 | 0.0581189 |
| When $k_1 \geqq k_{10}$, $k_{1m}$ = | 0.0150793 | 0.0436267 | 0.0489954 | 0.0563855 | 0.0542810 | 0.0684131 |
| When $k_1 < k_{10}$, $k_{1m}$ = | 0.0179541 | 0.0228833 | 0.0348535 | 0.0371240 | 0.0381006 | 0.0375098 |
| When $d_1 \geqq d_{10}$, $d_{1m}$ (nm) = | 2.247 | ∞ | ∞ | ∞ | ∞ | ∞ |
| When $d_1 < d_{10}$, $d_{1m}$ (nm) = | 18.385 | 11.933 | 75.920 | 58.822 | 33.649 | 113.219 |
| When $n_2 \geqq n_{20}$, $n_{2m}$ = | 0.1010083 | 0.0477234 | 0.1065527 | 0.2254480 | 0.3829150 | 0.2789856 |
| When $n_2 < n_{20}$, $n_{2m}$ = | 0.0100110 | 0.0759302 | 0.0611096 | 0.1540564 | 0.2775842 | 0.2219617 |
| When $k_2 \geqq k_{20}$, $k_{2m}$ = | 0.0726611 | 0.0766821 | 0.1015344 | 0.1236780 | 0.2119995 | 0.1981201 |
| When $k_2 < k_{20}$, $k_{2m}$ = | 0.0309253 | 0.0590527 | 0.0616418 | 0.0602039 | 0.1044287 | 0.0735400 |
| When $d_2 \geqq d_{20}$, $d_{2m}$ (nm) = | 25.845 | 22.079 | ∞ | ∞ | ∞ | ∞ |
| When $d_2 < d_{20}$, $d_{2m}$ (nm) = | 1.717 | 20.127 | 24.695 | 81.257 | 67.124 | 97.500 |

1.0 < NA ≦ 1.1
65 < T ≦ 75

13/34

| Case | 7-01 | 7-02 | 7-03 | 7-04 | 7-05 |
|---|---|---|---|---|---|
| $n_{10}$ | 1.8339628 | 1.9445237 | 1.8939902 | 1.8811858 | 1.7203230 |
| $k_{10}$ | 0.2973905 | 0.1726202 | 0.1563846 | 0.0833966 | 0.0922740 |
| $d_{10}$ (nm) | 24.925 | 17.287 | 14.253 | 12.228 | 92.527 |
| $n_{20}$ | 1.6419965 | 1.7953047 | 1.6659458 | 1.7269957 | 1.6328842 |
| $k_{20}$ | 0.8698975 | 0.5162004 | 0.3485215 | 0.2426363 | 0.2599948 |
| $d_{20}$ (nm) | 41.723 | 98.907 | 167.112 | 272.914 | 160.703 |
| When $n_1 \geqq n_{10}$, $n_{1m}$ = | 0.0734924 | 0.0853552 | 0.0964307 | 0.1197986 | 0.0394055 |
| When $n_1 < n_{10}$, $n_{1m}$ = | 0.0377722 | 0.0427490 | 0.0559692 | 0.0877673 | 0.0144592 |
| When $k_1 \geqq k_{10}$, $k_{1m}$ = | 0.0448938 | 0.0589941 | 0.0770850 | 0.1096667 | 0.0331616 |
| When $k_1 < k_{10}$, $k_{1m}$ = | 0.0453357 | 0.0848169 | 0.0975195 | 0.0833966 | 0.0410388 |
| When $d_1 \geqq d_{10}$, $d_{1m}$ (nm) = | 4.571 | 4.784 | 5.590 | 7.648 | 12.091 |
| When $d_1 < d_{10}$, $d_{1m}$ (nm) = | 2.315 | 2.092 | 3.027 | 5.109 | 3.655 |
| When $n_2 \geqq n_{20}$, $n_{2m}$ = | 0.1366638 | 0.1348682 | 0.1167786 | 0.1080664 | 0.0326196 |
| When $n_2 < n_{20}$, $n_{2m}$ = | 0.1076978 | 0.1944104 | 0.1524536 | 0.1545313 | 0.0900854 |
| When $k_2 \geqq k_{20}$, $k_{2m}$ = | 0.1648022 | 0.1338904 | 0.1021130 | 0.1080652 | 0.0396484 |
| When $k_2 < k_{20}$, $k_{2m}$ = | 0.1324670 | 0.1078918 | 0.0977759 | 0.0865271 | 0.0625085 |
| When $d_2 \geqq d_{20}$, $d_{2m}$ (nm) = | 12.499 | ∞ | ∞ | ∞ | ∞ |
| When $d_2 < d_{20}$, $d_{2m}$ (nm) = | 5.747 | 14.376 | 64.164 | 128.680 | 19.557 |

1.0 < NA ≦ 1.1
65 < T ≦ 75

| Case | 7-06 | 7-07 | 7-08 | 7-09 | 7-10 |
|---|---|---|---|---|---|
| $n_{10}$ | 1.7224265 | 1.7294779 | 1.7053201 | 1.7102741 | 1.7133466 |
| $k_{10}$ | 0.0770592 | 0.0692299 | 0.0757255 | 0.0654045 | 0.0629386 |
| $d_{10}$ (nm) | 92.053 | 92.385 | 161.452 | 160.136 | 160.381 |
| $n_{20}$ | 1.6819841 | 1.7252879 | 1.6485370 | 1.7000507 | 1.7220503 |
| $k_{20}$ | 0.2150120 | 0.1858377 | 0.2399747 | 0.1977447 | 0.1698335 |
| $d_{20}$ (nm) | 213.162 | 263.723 | 154.588 | 206.614 | 260.757 |
| When $n_1 \geqq n_{10}$, $n_{1m}$ = | 0.0490625 | 0.0548535 | 0.0366443 | 0.0483020 | 0.0569666 |
| When $n_1 < n_{10}$, $n_{1m}$ = | 0.0311902 | 0.0280200 | 0.0173645 | 0.0416309 | 0.0190027 |
| When $k_1 \geqq k_{10}$, $k_{1m}$ = | 0.0581604 | 0.0565332 | 0.0330920 | 0.0498926 | 0.0402344 |
| When $k_1 < k_{10}$, $k_{1m}$ = | 0.0461389 | 0.0475879 | 0.0324707 | 0.0390747 | 0.0240051 |
| When $d_1 \geqq d_{10}$, $d_{1m}$ (nm) = | 19.214 | 40.761 | 19.902 | ∞ | ∞ |
| When $d_1 < d_{10}$, $d_{1m}$ (nm) = | 8.328 | 7.705 | 6.285 | 18.989 | 5.694 |
| When $n_2 \geqq n_{20}$, $n_{2m}$ = | 0.0747375 | 0.0917908 | 0.0322156 | 0.0769946 | 0.1011584 |
| When $n_2 < n_{20}$, $n_{2m}$ = | 0.1078540 | 0.1217822 | 0.0813562 | 0.0689685 | 0.1343567 |
| When $k_2 \geqq k_{20}$, $k_{2m}$ = | 0.0634705 | 0.0827625 | 0.0283752 | 0.0430542 | 0.0435730 |
| When $k_2 < k_{20}$, $k_{2m}$ = | 0.0623401 | 0.0604163 | 0.0573535 | 0.0576453 | 0.0570081 |
| When $d_2 \geqq d_{20}$, $d_{2m}$ (nm) = | ∞ | ∞ | 9.136 | 38.239 | ∞ |
| When $d_2 < d_{20}$, $d_{2m}$ (nm) = | 27.810 | 75.918 | 15.379 | 13.085 | 10.847 |

1.0 < NA ≦ 1.1
65 < T ≦ 75

14/34

| Case | 7-11 | 7-12 | 7-13 | 7-14 | 7-15 | 7-16 |
|---|---|---|---|---|---|---|
| $n_{10}$ | 1.6861768 | 1.6990769 | 1.7003759 | 1.6946436 | 1.6954303 | 1.6957423 |
| $k_{10}$ | 0.0881028 | 0.0709373 | 0.0613969 | 0.0577579 | 0.0690806 | 0.0532811 |
| $d_{10}$ (nm) | 208.148 | 225.005 | 221.468 | 215.315 | 264.876 | 274.848 |
| $n_{20}$ | 1.6733849 | 1.6647354 | 1.6998938 | 1.6946016 | 1.6937197 | 1.6878755 |
| $k_{20}$ | 0.3136681 | 0.2329033 | 0.1918751 | 0.1634050 | 0.2458138 | 0.1674492 |
| $d_{20}$ (nm) | 112.385 | 150.349 | 205.497 | 268.128 | 165.269 | 265.685 |
| When $n_1 \geqq n_{10}$, $n_{1m}$ = | 0.0025806 | 0.0529590 | 0.0676086 | 0.0859229 | 0.0516138 | 0.0588110 |
| When $n_1 < n_{10}$, $n_{1m}$ = | 0.0409998 | 0.0231177 | 0.0444312 | 0.0666504 | 0.0367175 | 0.0575696 |
| When $k_1 \geqq k_{10}$, $k_{1m}$ = | 0.0094263 | 0.0435510 | 0.0474890 | 0.0560022 | 0.0529260 | 0.0681641 |
| When $k_1 < k_{10}$, $k_{1m}$ = | 0.0156848 | 0.0234912 | 0.0355322 | 0.0372656 | 0.0371912 | 0.0379443 |
| When $d_1 \geqq d_{10}$, $d_{1m}$ (nm) = | 1.037 | ∞ | ∞ | ∞ | ∞ | ∞ |
| When $d_1 < d_{10}$, $d_{1m}$ (nm) = | 17.094 | 12.289 | 76.126 | 56.280 | 33.058 | 112.076 |
| When $n_2 \geqq n_{20}$, $n_{2m}$ = | 0.1039172 | 0.0468506 | 0.1077234 | 0.2240735 | 0.4022729 | 0.2806909 |
| When $n_2 < n_{20}$, $n_{2m}$ = | 0.0058093 | 0.0753308 | 0.0576575 | 0.1556287 | 0.2760486 | 0.2229114 |
| When $k_2 \geqq k_{20}$, $k_{2m}$ = | 0.0664124 | 0.0758972 | 0.1012000 | 0.1249744 | 0.2123950 | 0.1986609 |
| When $k_2 < k_{20}$, $k_{2m}$ = | 0.0178174 | 0.0630115 | 0.0645288 | 0.0620288 | 0.1063135 | 0.0745801 |
| When $d_2 \geqq d_{20}$, $d_{2m}$ (nm) = | 26.367 | 19.187 | ∞ | ∞ | ∞ | ∞ |
| When $d_2 < d_{20}$, $d_{2m}$ (nm) = | 1.017 | 18.602 | 23.769 | 80.847 | 66.469 | 89.270 |

1.0 < NA ≦ 1.1
75 < T ≦ 85

15/34

| Case | 8-01 | 8-02 | 8-03 | 8-04 | 8-05 |
|---|---|---|---|---|---|
| $n_{10}$ | 1.9187259 | 1.8967518 | 1.8757876 | 1.8806788 | 1.7234296 |
| $k_{10}$ | 0.1881900 | 0.1527475 | 0.1318014 | 0.0899399 | 0.0945092 |
| $d_{10}$ (nm) | 20.509 | 15.221 | 13.247 | 12.412 | 92.722 |
| $n_{20}$ | 1.8283337 | 1.6893708 | 1.6726776 | 1.7211162 | 1.6393014 |
| $k_{20}$ | 0.5739613 | 0.3734166 | 0.2883472 | 0.2492460 | 0.2743485 |
| $d_{20}$ (nm) | 84.746 | 154.221 | 215.129 | 265.394 | 150.270 |
| When $n_1 \geqq n_{10}$, $n_{1m}$ = | 0.0766943 | 0.0922229 | 0.1080322 | 0.1177502 | 0.0391516 |
| When $n_1 < n_{10}$, $n_{1m}$ = | 0.0399988 | 0.0530884 | 0.0750195 | 0.0852625 | 0.0112524 |
| When $k_1 \geqq k_{10}$, $k_{1m}$ = | 0.0507166 | 0.0712622 | 0.0980225 | 0.1073047 | 0.0289392 |
| When $k_1 < k_{10}$, $k_{1m}$ = | 0.0771802 | 0.0964258 | 0.1069458 | 0.0899399 | 0.0412610 |
| When $d_1 \geqq d_{10}$, $d_{1m}$ (nm) = | 5.195 | 5.640 | 6.681 | 7.548 | 11.825 |
| When $d_1 < d_{10}$, $d_{1m}$ (nm) = | 2.249 | 2.987 | 4.301 | 4.972 | 2.719 |
| When $n_2 \geqq n_{20}$, $n_{2m}$ = | 0.1444995 | 0.1155615 | 0.1091333 | 0.1093396 | 0.0288635 |
| When $n_2 < n_{20}$, $n_{2m}$ = | 0.1897876 | 0.1532776 | 0.1435217 | 0.1541382 | 0.0890479 |
| When $k_2 \geqq k_{20}$, $k_{2m}$ = | 0.1811243 | 0.1099194 | 0.1006726 | 0.1075403 | 0.0356238 |
| When $k_2 < k_{20}$, $k_{2m}$ = | 0.1194946 | 0.1025110 | 0.0922131 | 0.0871228 | 0.0649683 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 15.313 | 64.664 | 82.555 | 124.472 | 16.892 |

1.0 < NA ≦ 1.1
75 < T ≦ 85

| Case | 8-06 | 8-07 | 8-08 | 8-09 | 8-10 |
|---|---|---|---|---|---|
| $n_{10}$ | 1.7235983 | 1.7294254 | 1.7064538 | 1.7103862 | 1.7133072 |
| $k_{10}$ | 0.0790587 | 0.0706491 | 0.0777504 | 0.0670250 | 0.0637197 |
| $d_{10}$ (nm) | 92.129 | 92.482 | 161.668 | 160.278 | 160.467 |
| $n_{20}$ | 1.6815454 | 1.7233644 | 1.6498826 | 1.6983722 | 1.7219131 |
| $k_{20}$ | 0.2228770 | 0.1918670 | 0.2514894 | 0.2047961 | 0.1752501 |
| $d_{20}$ (nm) | 204.187 | 255.172 | 145.038 | 197.922 | 251.781 |
| When $n_1 \geqq n_{10}$, $n_{1m}$ = | 0.0481958 | 0.0539050 | 0.0362122 | 0.0474792 | 0.0556775 |
| When $n_1 < n_{10}$, $n_{1m}$ = | 0.0281580 | 0.0270288 | 0.0158582 | 0.0428101 | 0.0187244 |
| When $k_1 \geqq k_{10}$, $k_{1m}$ = | 0.0546558 | 0.0547986 | 0.0255066 | 0.0459753 | 0.0391089 |
| When $k_1 < k_{10}$, $k_{1m}$ = | 0.0470496 | 0.0476624 | 0.0330371 | 0.0375122 | 0.0244470 |
| When $d_1 \geqq d_{10}$, $d_{1m}$ (nm) = | 18.433 | 40.484 | 19.881 | ∞ | ∞ |
| When $d_1 < d_{10}$, $d_{1m}$ (nm) = | 7.376 | 7.380 | 6.011 | 13.737 | 5.649 |
| When $n_2 \geqq n_{20}$, $n_{2m}$ = | 0.0719336 | 0.0903259 | 0.0311267 | 0.0755847 | 0.1032422 |
| When $n_2 < n_{20}$, $n_{2m}$ = | 0.1049182 | 0.1183936 | 0.0789893 | 0.0715295 | 0.1268079 |
| When $k_2 \geqq k_{20}$, $k_{2m}$ = | 0.0610889 | 0.0802148 | 0.0194653 | 0.0384314 | 0.0401990 |
| When $k_2 < k_{20}$, $k_{2m}$ = | 0.0626282 | 0.0606787 | 0.0584229 | 0.0575549 | 0.0569128 |
| When $d_2 \geqq d_{20}$, $d_{2m}$ (nm) = | ∞ | ∞ | 6.414 | 35.522 | ∞ |
| When $d_2 < d_{20}$, $d_{2m}$ (nm) = | 26.455 | 72.823 | 13.152 | 13.515 | 11.677 |

1.0 < NA ≦ 1.1
75 < T ≦ 85

16/34

| Case | 8-11 | 8-12 | 8-13 | 8-14 | 8-15 |
|---|---|---|---|---|---|
| $n_{10}$ | 1.6987335 | 1.6895310 | 1.6997408 | 1.6947661 | 1.6915645 |
| $k_{10}$ | 0.0728489 | 0.0798395 | 0.0628030 | 0.0583146 | 0.0796327 |
| $d_{10}$ (nm) | 224.384 | 207.056 | 221.189 | 215.749 | 269.434 |
| $n_{20}$ | 1.6635130 | 1.6873868 | 1.6972371 | 1.6943199 | 1.7013553 |
| $k_{20}$ | 0.2423517 | 0.2464201 | 0.1976117 | 0.1671130 | 0.3520060 |
| $d_{20}$ (nm) | 141.699 | 160.447 | 197.186 | 258.789 | 90.540 |
| When $n_1 \geqq n_{10}$, $n_{1m}$ = | 0.0550525 | 0.0211743 | 0.0680066 | 0.0840710 | 0.0339661 |
| When $n_1 < n_{10}$, $n_{1m}$ = | 0.0214722 | 0.0563281 | 0.0446484 | 0.0653711 | 0.0319580 |
| When $k_1 \geqq k_{10}$, $k_{1m}$ = | 0.0399634 | 0.0394690 | 0.0462439 | 0.0552136 | 0.0498462 |
| When $k_1 < k_{10}$, $k_{1m}$ = | 0.0230286 | 0.0247534 | 0.0358582 | 0.0373328 | 0.0319092 |
| When $d_1 \geqq d_{10}$, $d_{1m}$ (nm) = | ∞ | 18.382 | ∞ | ∞ | 29.764 |
| When $d_1 < d_{10}$, $d_{1m}$ (nm) = | 12.181 | 26.345 | 75.416 | 56.560 | 16.533 |
| When $n_2 \geqq n_{20}$, $n_{2m}$ = | 0.0460742 | 0.1451038 | 0.1164050 | 0.2251794 | 0.2068530 |
| When $n_2 < n_{20}$, $n_{2m}$ = | 0.0736353 | 0.0531665 | 0.0615222 | 0.1544678 | 0.0982214 |
| When $k_2 \geqq k_{20}$, $k_{2m}$ = | 0.0651685 | 0.0979858 | 0.0980493 | 0.1211584 | 0.1840808 |
| When $k_2 < k_{20}$, $k_{2m}$ = | 0.0709375 | 0.0696692 | 0.0675049 | 0.0632251 | 0.1287793 |
| When $d_2 \geqq d_{20}$, $d_{2m}$ (nm) = | 17.326 | ∞ | ∞ | ∞ | ∞ |
| When $d_2 < d_{20}$, $d_{2m}$ (nm) = | 17.676 | 13.280 | 25.586 | 81.223 | 11.833 |

1.0 < NA ≦ 1.1
75 < T ≦ 85

| Case | 8-16 | 8-17 |
|---|---|---|
| $n_{10}$ | 1.6950499 | 1.6956172 |
| $k_{10}$ | 0.0706693 | 0.0541668 |
| $d_{10}$ (nm) | 266.123 | 274.905 |
| $n_{20}$ | 1.6983222 | 1.6860233 |
| $k_{20}$ | 0.2573177 | 0.1712439 |
| $d_{20}$ (nm) | 152.851 | 257.337 |
| When $n_1 \geqq n_{10}$, $n_{1m}$ = | 0.0524487 | 0.0590308 |
| When $n_1 < n_{10}$, $n_{1m}$ = | 0.0375452 | 0.0580872 |
| When $k_1 \geqq k_{10}$, $k_{1m}$ = | 0.0517285 | 0.0672278 |
| When $k_1 < k_{10}$, $k_{1m}$ = | 0.0352881 | 0.0380591 |
| When $d_1 \geqq d_{10}$, $d_{1m}$ (nm) = | ∞ | ∞ |
| When $d_1 < d_{10}$, $d_{1m}$ (nm) = | 33.771 | 112.404 |
| When $n_2 \geqq n_{20}$, $n_{2m}$ = | 0.2704944 | 0.2806836 |
| When $n_2 < n_{20}$, $n_{2m}$ = | 0.2755872 | 0.2222266 |
| When $k_2 \geqq k_{20}$, $k_{2m}$ = | 0.2121143 | 0.1985229 |
| When $k_2 < k_{20}$, $k_{2m}$ = | 0.1128918 | 0.0743774 |
| When $d_2 \geqq d_{20}$, $d_{2m}$ (nm) = | ∞ | ∞ |
| When $d_2 < d_{20}$, $d_{2m}$ (nm) = | 65.292 | 85.089 |

1.0 < NA ≦ 1.1
85 < T ≦ 95

17/34

| Case | 9-01 | 9-02 | 9-03 | 9-04 | 9-05 |
|---|---|---|---|---|---|
| $n_{10}$ | 1.8980776 | 1.9078109 | 1.8887573 | 1.8863613 | 1.7283563 |
| $k_{10}$ | 0.2063094 | 0.1489982 | 0.1336370 | 0.0963846 | 0.0991844 |
| $d_{10}$ (nm) | 23.234 | 16.351 | 13.295 | 12.395 | 92.796 |
| $n_{20}$ | 1.8542997 | 1.7325536 | 1.6803356 | 1.7165602 | 1.6494143 |
| $k_{20}$ | 0.6486453 | 0.4126982 | 0.3065809 | 0.2596921 | 0.2975623 |
| $d_{20}$ (nm) | 73.732 | 141.036 | 205.639 | 258.147 | 140.358 |
| When $n_1 \geqq n_{10}$, $n_{1m}$ = | 0.0711987 | 0.0870154 | 0.1059106 | 0.1162891 | 0.0375220 |
| When $n_1 < n_{10}$, $n_{1m}$ = | 0.0384509 | 0.0501709 | 0.0716760 | 0.0832544 | 0.0056213 |
| When $k_1 \geqq k_{10}$, $k_{1m}$ = | 0.0445569 | 0.0643555 | 0.0939661 | 0.1053198 | 0.0189441 |
| When $k_1 < k_{10}$, $k_{1m}$ = | 0.0730103 | 0.0941223 | 0.1072681 | 0.0963846 | 0.0324854 |
| When $d_1 \geqq d_{10}$, $d_{1m}$ (nm) = | 5.225 | 5.526 | 6.240 | 7.169 | 10.895 |
| When $d_1 < d_{10}$, $d_{1m}$ (nm) = | 2.347 | 2.839 | 3.908 | 4.670 | 1.261 |
| When $n_2 \geqq n_{20}$, $n_{2m}$ = | 0.1402551 | 0.1159338 | 0.1109766 | 0.1105359 | 0.0179150 |
| When $n_2 < n_{20}$, $n_{2m}$ = | 0.1828406 | 0.1543176 | 0.1513220 | 0.1539343 | 0.0865198 |
| When $k_2 \geqq k_{20}$, $k_{2m}$ = | 0.2259802 | 0.1235034 | 0.1018750 | 0.1065100 | 0.0230737 |
| When $k_2 < k_{20}$, $k_{2m}$ = | 0.1284644 | 0.1059631 | 0.0936096 | 0.0878577 | 0.0660486 |
| When $d_2 \geqq d_{20}$, $d_{2m}$ (nm) = | ∞ | ∞ | ∞ | ∞ | 14.635 |
| When $d_2 < d_{20}$, $d_{2m}$ (nm) = | 14.747 | 31.656 | 77.584 | 118.336 | 14.252 |

-continued

| 1.0 < NA ≦ 1.1<br>85 < T ≦ 95 | | | | | |
|---|---|---|---|---|---|
| Case | 9-06 | 9-07 | 9-08 | 9-09 | 9-10 |
| $n_{10}$ | 1.7247011 | 1.7288637 | 1.7100270 | 1.7129082 | 1.6894084 |
| $k_{10}$ | 0.0825295 | 0.0727638 | 0.0697395 | 0.0648353 | 0.0825836 |
| $d_{10}$ (nm) | 92.134 | 92.409 | 160.277 | 160.281 | 208.412 |
| $n_{20}$ | 1.6784446 | 1.7181265 | 1.6932584 | 1.7202855 | 1.6911413 |
| $k_{20}$ | 0.2345042 | 0.1997137 | 0.2147807 | 0.1822190 | 0.2636300 |
| $d_{20}$ (nm) | 196.220 | 247.866 | 190.362 | 243.795 | 148.443 |
| When $n_1 \geqq n_{10}$, $n_{1m}$ = | 0.0458069 | 0.0520715 | 0.0445874 | 0.0530676 | 0.0168896 |
| When $n_1 < n_{10}$, $n_{1m}$ = | 0.0231628 | 0.0254517 | 0.0291443 | 0.0189783 | 0.0564331 |
| When $k_1 \geqq k_{10}$, $k_{1m}$ = | 0.0487341 | 0.0524194 | 0.0390308 | 0.0374463 | 0.0317554 |
| When $k_1 < k_{10}$, $k_{1m}$ = | 0.0471680 | 0.0474573 | 0.0341357 | 0.0249304 | 0.0174866 |
| When $d_1 \geqq d_{10}$, $d_{1m}$ (nm) = | 16.768 | 28.342 | ∞ | ∞ | 8.653 |
| When $d_1 < d_{10}$, $d_{1m}$ (nm) = | 5.875 | 6.859 | 8.481 | 5.666 | 22.933 |
| When $n_2 \geqq n_{20}$, $n_{2m}$ = | 0.0654785 | 0.0851550 | 0.0721350 | 0.0992358 | 0.1489941 |
| When $n_2 < n_{20}$, $n_{2m}$ = | 0.0999084 | 0.1129846 | 0.0702051 | 0.1184961 | 0.0323828 |
| When $k_2 \geqq k_{20}$, $k_{2m}$ = | 0.0550916 | 0.0742688 | 0.0299036 | 0.0348145 | 0.0701428 |
| When $k_2 < k_{20}$, $k_{2m}$ = | 0.0621350 | 0.0605774 | 0.0564990 | 0.0562878 | 0.0653857 |
| When $d_2 \geqq d_{20}$, $d_{2m}$ (nm) = | ∞ | ∞ | 30.126 | ∞ | ∞ |
| When $d_2 < d_{20}$, $d_{2m}$ (nm) = | 23.369 | 34.214 | 13.997 | 12.255 | 9.630 |

18/34

| 1.0 < NA ≦ 1.1<br>85 < T ≦ 95 | | | | | |
|---|---|---|---|---|---|
| Case | 9-11 | 9-12 | 9-13 | 9-14 | 9-15 |
| $n_{10}$ | 1.6987536 | 1.6951804 | 1.6947043 | 1.6953534 | 1.6955317 |
| $k_{10}$ | 0.0651428 | 0.0592977 | 0.0728049 | 0.0654850 | 0.0555447 |
| $d_{10}$ (nm) | 220.679 | 216.421 | 267.049 | 264.587 | 274.968 |
| $n_{20}$ | 1.6918669 | 1.6944812 | 1.7045529 | 1.6939885 | 1.6840742 |
| $k_{20}$ | 0.2062686 | 0.1733276 | 0.2758626 | 0.2171518 | 0.1777252 |
| $d_{20}$ (nm) | 189.869 | 249.686 | 142.407 | 204.731 | 249.243 |
| When $n_1 \geqq n_{10}$, $n_{1m}$ = | 0.0676538 | 0.0804553 | 0.0514111 | 0.0772083 | 0.0594299 |
| When $n_1 < n_{10}$, $n_{1m}$ = | 0.0423462 | 0.0620581 | 0.0375159 | 0.0498364 | 0.0587244 |
| When $k_1 \geqq k_{10}$, $k_{1m}$ = | 0.0442505 | 0.0538220 | 0.0506982 | 0.0550830 | 0.0658191 |
| When $k_1 < k_{10}$, $k_{1m}$ = | 0.0341040 | 0.0375916 | 0.0340894 | 0.0384644 | 0.0372644 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 72.990 | 57.440 | 26.805 | 108.871 | 112.765 |
| When $n_2 \geqq n_{20}$, $n_{2m}$ = | 0.1307581 | 0.2319055 | 0.2365918 | 0.3979211 | 0.2850439 |
| When $n_2 < n_{20}$, $n_{2m}$ = | 0.0673376 | 0.1520984 | 0.2827087 | 0.2359326 | 0.2177148 |
| When $k_2 \geqq k_{20}$, $k_{2m}$ = | 0.0940100 | 0.1156787 | 0.2079443 | 0.2187415 | 0.1980774 |
| When $k_2 < k_{20}$, $k_{2m}$ = | 0.0673755 | 0.0629675 | 0.1183691 | 0.0982336 | 0.0755945 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 25.557 | 76.954 | 64.091 | 75.273 | 81.971 |

| 1.0 < NA ≦ 1.1<br>95 < T ≦ 105 | | | | | |
|---|---|---|---|---|---|
| Case | 10-01 | 10-02 | 10-03 | 10-04 | 10-05 |
| $n_{10}$ | 1.9059589 | 1.9224042 | 1.8961620 | 1.8922593 | 1.7254583 |
| $k_{10}$ | 0.2274286 | 0.1550778 | 0.1385328 | 0.1041345 | 0.0865833 |
| $d_{10}$ (nm) | 23.462 | 16.599 | 13.501 | 12.282 | 91.876 |
| $n_{20}$ | 1.8553331 | 1.7510181 | 1.6829419 | 1.7097147 | 1.6727903 |
| $k_{20}$ | 0.7355051 | 0.4490690 | 0.3248659 | 0.2697702 | 0.2465542 |
| $d_{20}$ (nm) | 66.090 | 131.424 | 196.767 | 251.116 | 188.519 |
| When $n_1 \geqq n_{10}$, $n_{1m}$ = | 0.0671912 | 0.0841919 | 0.1023767 | 0.1153796 | 0.0426331 |
| When $n_1 < n_{10}$, $n_{1m}$ = | 0.0345654 | 0.0474304 | 0.0675305 | 0.0814563 | 0.0184045 |
| When $k_1 \geqq k_{10}$, $k_{1m}$ = | 0.0380615 | 0.0598425 | 0.0894568 | 0.1045068 | 0.0426917 |
| When $k_1 < k_{10}$, $k_{1m}$ = | 0.0683374 | 0.0902014 | 0.1054456 | 0.1041345 | 0.0441687 |
| When $d_1 \geqq d_{10}$, $d_{1m}$ (nm) = | 4.558 | 5.118 | 5.874 | 6.783 | 14.297 |
| When $d_1 < d_{10}$, $d_{1m}$ (nm) = | 1.985 | 2.531 | 3.589 | 4.355 | 4.476 |
| When $n_2 \geqq n_{20}$, $n_{2m}$ = | 0.1216980 | 0.1117603 | 0.1100940 | 0.1104114 | 0.0579919 |
| When $n_2 < n_{20}$, $n_{2m}$ = | 0.1802991 | 0.1554016 | 0.1498889 | 0.1534180 | 0.0956348 |
| When $k_2 \geqq k_{20}$, $k_{2m}$ = | 0.2165979 | 0.1264526 | 0.1015808 | 0.1042908 | 0.0462366 |
| When $k_2 < k_{20}$, $k_{2m}$ = | 0.1276270 | 0.1054065 | 0.0937561 | 0.0879675 | 0.0605090 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 11.858 | 29.189 | 73.755 | 91.689 | 21.669 |

| 1.0 < NA ≦ 1.1<br>95 < T ≦ 105 | | | | | 19/34 |
|---|---|---|---|---|---|
| Case | 10-06 | 10-07 | 10-08 | 10-09 | 10-10 |
| $n_{10}$ | 1.7286512 | 1.7096319 | 1.7125109 | 1.6891198 | 1.6979687 |
| $k_{10}$ | 0.0752622 | 0.0728333 | 0.0665034 | 0.0853163 | 0.0677690 |
| $d_{10}$ (nm) | 92.185 | 159.923 | 159.852 | 208.173 | 220.140 |
| $n_{20}$ | 1.7137581 | 1.6877059 | 1.7181911 | 1.6918411 | 1.6871092 |
| $k_{20}$ | 0.2076205 | 0.2252670 | 0.1890952 | 0.2826173 | 0.2165239 |
| $d_{20}$ (nm) | 240.302 | 182.766 | 235.934 | 141.112 | 182.186 |
| When $n_1 \geqq n_{10}$, $n_{1m}$ = | 0.0500330 | 0.0406897 | 0.0503772 | 0.0132690 | 0.0644641 |
| When $n_1 < n_{10}$, $n_{1m}$ = | 0.0231873 | 0.0169287 | 0.0155139 | 0.0507471 | 0.0375525 |
| When $k_1 \geqq k_{10}$, $k_{1m}$ = | 0.0495398 | 0.0307520 | 0.0335327 | 0.0250305 | 0.0414893 |
| When $k_1 < k_{10}$, $k_{1m}$ = | 0.0465039 | 0.0291895 | 0.0230286 | 0.0142859 | 0.0317957 |
| When $d_1 \geqq d_{10}$, $d_{1m}$ (nm) = | 22.149 | ∞ | ∞ | 5.803 | ∞ |
| When $d_1 < d_{10}$, $d_{1m}$ (nm) = | 6.093 | 5.010 | 4.544 | 20.171 | 66.095 |
| When $n_2 \geqq n_{20}$, $n_{2m}$ = | 0.0807422 | 0.0673730 | 0.0968713 | 0.1414526 | 0.1231934 |
| When $n_2 < n_{20}$, $n_{2m}$ = | 0.1109875 | 0.0569836 | 0.1140344 | 0.0176575 | 0.0690576 |
| When $k_2 \geqq k_{20}$, $k_{2m}$ = | 0.0671313 | 0.0201965 | 0.0272949 | 0.0516113 | 0.0909106 |
| When $k_2 < k_{20}$, $k_{2m}$ = | 0.0601733 | 0.0546924 | 0.0555640 | 0.0644128 | 0.0681702 |
| When $d_2 \geqq d_{20}$, $d_{2m}$ (nm) = | ∞ | 22.678 | ∞ | ∞ | ∞ |
| When $d_2 < d_{20}$, $d_{2m}$ (nm) = | 33.234 | 12.401 | 9.751 | 3.545 | 24.752 |

| 1.0 < NA ≦ 1.1<br>95 < T ≦ 105 | | | |
|---|---|---|---|
| Case | 10-11 | 10-12 | 10-13 |
| $n_{10}$ | 1.6953920 | 1.6945041 | 1.6957904 |
| $k_{10}$ | 0.0607310 | 0.0754015 | 0.0613078 |
| $d_{10}$ (nm) | 216.694 | 266.879 | 263.111 |
| $n_{20}$ | 1.6943518 | 1.7053190 | 1.6921380 |
| $k_{20}$ | 0.1805507 | 0.2962459 | 0.1886276 |
| $d_{20}$ (nm) | 240.824 | 134.581 | 257.166 |
| When $n_1 \geqq n_{10}$, $n_{1m}$ = | 0.0773376 | 0.0489661 | 0.0744116 |
| When $n_1 < n_{10}$, $n_{1m}$ = | 0.0532397 | 0.0362244 | 0.0544775 |
| When $k_1 \geqq k_{10}$, $k_{1m}$ = | 0.0520667 | 0.0490686 | 0.0595886 |
| When $k_1 < k_{10}$, $k_{1m}$ = | 0.0373279 | 0.0329797 | 0.0399255 |
| When $d_1 \geqq d_{10}$, $d_{1m}$ (nm) = | ∞ | ∞ | ∞ |
| When $d_1 < d_{10}$, $d_{1m}$ (nm) = | 56.748 | 22.698 | 144.280 |
| When $n_2 \geqq n_{20}$, $n_{2m}$ = | 0.2401196 | 0.2258960 | 0.3617542 |
| When $n_2 < n_{20}$, $n_{2m}$ = | 0.1505750 | 0.2863916 | 0.2146826 |
| When $k_2 \geqq k_{20}$, $k_{2m}$ = | 0.1118237 | 0.2042285 | 0.2258594 |
| When $k_2 < k_{20}$, $k_{2m}$ = | 0.0641272 | 0.1247363 | 0.0874829 |
| When $d_2 \geqq d_{20}$, $d_{2m}$ (nm) = | ∞ | ∞ | ∞ |
| When $d_2 < d_{20}$, $d_{2m}$ (nm) = | 74.466 | 22.579 | 121.018 |

| 1.0 < NA ≦ 1.1<br>105 < T ≦ 115 | | | | | 20/34 |
|---|---|---|---|---|---|
| Case | 11-01 | 11-02 | 11-03 | 11-04 | 11-05 |
| $n_{10}$ | 1.9374125 | 1.9018997 | 1.8965439 | 1.7253637 | 1.7289764 |
| $k_{10}$ | 0.1704110 | 0.1487976 | 0.1142225 | 0.0900184 | 0.0775142 |
| $d_{10}$ (nm) | 15.669 | 13.285 | 11.973 | 91.432 | 91.877 |
| $n_{20}$ | 1.7248980 | 1.6713435 | 1.6970963 | 1.6651786 | 1.7120256 |
| $k_{20}$ | 0.4663738 | 0.3352808 | 0.2748315 | 0.2549499 | 0.2134557 |
| $d_{20}$ (nm) | 126.299 | 189.496 | 244.759 | 180.505 | 231.728 |
| When $n_1 \geqq n_{10}$, $n_{1m}$ = | 0.0844495 | 0.1011877 | 0.1161206 | 0.0397363 | 0.0483887 |
| When $n_1 < n_{10}$, $n_{1m}$ = | 0.0440234 | 0.0656897 | 0.0810999 | 0.0155029 | 0.0208545 |
| When $k_1 \geqq k_{10}$, $k_{1m}$ = | 0.0577478 | 0.0888123 | 0.1065247 | 0.0388269 | 0.0469031 |
| When $k_1 < k_{10}$, $k_{1m}$ = | 0.0914417 | 0.1045447 | 0.1142225 | 0.0417639 | 0.0449243 |
| When $d_1 \geqq d_{10}$, $d_{1m}$ (nm) = | 4.564 | 5.473 | 6.423 | 12.314 | 18.889 |
| When $d_1 < d_{10}$, $d_{1m}$ (nm) = | 2.111 | 3.313 | 4.088 | 3.639 | 5.309 |
| When $n_2 \geqq n_{20}$, $n_{2m}$ = | 0.1026855 | 0.1066711 | 0.1092859 | 0.0538538 | 0.0798657 |
| When $n_2 < n_{20}$, $n_{2m}$ = | 0.1573315 | 0.1496814 | 0.1507874 | 0.0957056 | 0.1124231 |
| When $k_2 \geqq k_{20}$, $k_{2m}$ = | 0.1109265 | 0.0973877 | 0.1006897 | 0.0382251 | 0.0609106 |
| When $k_2 < k_{20}$, $k_{2m}$ = | 0.0995313 | 0.0917126 | 0.0869214 | 0.0582397 | 0.0599487 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 32.204 | 71.551 | 94.669 | 21.979 | 35.901 |

-continued

| 1.0 < NA ≦ 1.1<br>105 < T ≦ 115 | | | | | |
|---|---|---|---|---|---|
| Case | 11-06 | 11-07 | 11-08 | 11-09 | 11-10 |
| $n_{10}$ | 1.7092919 | 1.7124011 | 1.6891266 | 1.6977739 | 1.6952347 |
| $k_{10}$ | 0.0753499 | 0.0683625 | 0.0867081 | 0.0698574 | 0.0623107 |
| $d_{10}$ (nm) | 159.318 | 159.365 | 206.818 | 219.869 | 216.627 |
| $n_{20}$ | 1.6830351 | 1.7169838 | 1.6858604 | 1.6842611 | 1.6937881 |
| $k_{20}$ | 0.2331189 | 0.1941891 | 0.2953498 | 0.2258219 | 0.1869159 |
| $d_{20}$ (nm) | 174.468 | 227.412 | 138.155 | 173.345 | 231.738 |
| When $n_1 \geqq n_{10}$, $n_{1m}$ = | 0.0373157 | 0.0484546 | 0.0121899 | 0.0603870 | 0.0758545 |
| When $n_1 < n_{10}$, $n_{1m}$ = | 0.0105005 | 0.0089343 | 0.0409204 | 0.0315625 | 0.0474512 |
| When $k_1 \geqq k_{10}$, $k_{1m}$ = | 0.0240833 | 0.0270752 | 0.0251843 | 0.0382471 | 0.0501941 |
| When $k_1 < k_{10}$, $k_{1m}$ = | 0.0246826 | 0.0176978 | 0.0193188 | 0.0296948 | 0.0358765 |
| When $d_1 \geqq d_{10}$, $d_{1m}$ (nm) = | 22.059 | ∞ | 5.261 | ∞ | ∞ |
| When $d_1 < d_{10}$, $d_{1m}$ (nm) = | 3.023 | 2.568 | 16.255 | V17.363 | 54.608 |
| When $n_2 \geqq n_{20}$, $n_{2m}$ = | 0.0659399 | 0.0944360 | 0.1154346 | 0.0831506 | 0.2493335 |
| When $n_2 < n_{20}$, $n_{2m}$ = | 0.0371252 | 0.1164661 | 0.0185925 | 0.0632410 | 0.1310596 |
| When $k_2 \geqq k_{20}$, $k_{2m}$ = | 0.0133044 | 0.0180847 | 0.0609753 | 0.0891687 | 0.1103210 |
| When $k_2 < k_{20}$, $k_{2m}$ = | 0.0529578 | 0.0555518 | 0.0785950 | 0.0680151 | 0.0652307 |
| When $d_2 \geqq d_{20}$, $d_{2m}$ (nm) = | 18.030 | ∞ | ∞ | ∞ | ∞ |
| When $d_2 < d_{20}$, $d_{2m}$ (nm) = | 8.732 | 5.378 | 3.627 | 23.361 | 52.894 |

21/34

| 1.0 < NA ≦ 1.1<br>105 < T ≦ 115 | | |
|---|---|---|
| Case | 11-11 | 11-12 |
| $n_{10}$ | 1.6944699 | 1.6958800 |
| $k_{10}$ | 0.0775933 | 0.0528961 |
| $d_{10}$ (nm) | 265.762 | 273.317 |
| $n_{20}$ | 1.6967397 | 1.6915993 |
| $k_{20}$ | 0.3115846 | 0.1649138 |
| $d_{20}$ (nm) | 129.093 | 288.010 |
| When $n_1 \geqq n_{10}$, $n_{1m}$ = | 0.0466345 | 0.0703040 |
| When $n_1 < n_{10}$, $n_{1m}$ = | 0.0341467 | 0.0549121 |
| When $k_1 \geqq k_{10}$, $k_{1m}$ = | 0.0473621 | 0.0679175 |
| When $k_1 < k_{10}$, $k_{1m}$ = | 0.0320862 | 0.0389246 |
| When $d_1 \geqq d_{10}$, $d_{1m}$ (nm) = | ∞ | ∞ |
| When $d_1 < d_{10}$, $d_{1m}$ (nm) = | 20.031 | 180.011 |
| When $n_2 \geqq n_{20}$, $n_{2m}$ = | 0.2202100 | 0.2749866 |
| When $n_2 < n_{20}$, $n_{2m}$ = | 0.1339246 | 0.2056653 |
| When $k_2 \geqq k_{20}$, $k_{2m}$ = | 0.2018127 | 0.2031665 |
| When $k_2 < k_{20}$, $k_{2m}$ = | 0.1244751 | 0.0729272 |
| When $d_2 \geqq d_{20}$, $d_{2m}$ (nm) = | ∞ | ∞ |
| When $d_2 < d_{20}$, $d_{2m}$ (nm) = | 18.618 | 105.982 |

| 1.0 < NA ≦ 1.1<br>115 < T ≦ 125 | | | | | |
|---|---|---|---|---|---|
| Case | 12-01 | 12-02 | 12-03 | 12-04 | 12-05 |
| $n_{10}$ | 1.9729972 | 1.9456051 | 1.9005953 | 1.8972956 | 1.7255330 |
| $k_{10}$ | 0.2768129 | 0.1915481 | 0.1591490 | 0.1121564 | 0.0922673 |
| $d_{10}$ (nm) | 17.524 | 14.612 | 13.217 | 12.290 | 91.102 |
| $n_{20}$ | 1.6663342 | 1.6781309 | 1.6561276 | 1.7051607 | 1.6614760 |
| $k_{20}$ | 0.7544777 | 0.4665054 | 0.3399716 | 0.2822449 | 0.2607016 |
| $d_{20}$ (nm) | 64.842 | 122.845 | 181.593 | 233.141 | 171.070 |
| When $n_1 \geqq n_{10}$, $n_{1m}$ = | 0.0730835 | 0.0862573 | 0.1002148 | 0.1132361 | 0.0385791 |
| When $n_1 < n_{10}$, $n_{1m}$ = | 0.0179053 | 0.0397437 | 0.0650696 | 0.0790137 | 0.0152405 |
| When $k_1 \geqq k_{10}$, $k_{1m}$ = | 0.0247314 | 0.0556897 | 0.0891748 | 0.1035071 | 0.0386047 |
| When $k_1 < k_{10}$, $k_{1m}$ = | 0.0592480 | 0.0960681 | 0.1016016 | 0.1121564 | 0.0414185 |
| When $d_1 \geqq d_{10}$, $d_{1m}$ (nm) = | 2.961 | 4.145 | 5.266 | 6.373 | 11.328 |
| When $d_1 < d_{10}$, $d_{1m}$ (nm) = | 0.729 | 1.739 | 3.220 | 4.072 | 3.483 |
| When $n_2 \geqq n_{20}$, $n_{2m}$ = | 0.0585083 | 0.0918945 | 0.1020654 | 0.1070825 | 0.0573608 |
| When $n_2 < n_{20}$, $n_{2m}$ = | 0.1382239 | 0.1611719 | 0.1504858 | 0.1560303 | 0.0993860 |
| When $k_2 \geqq k_{20}$, $k_{2m}$ = | 0.0616943 | 0.0914514 | 0.0935474 | 0.1016602 | 0.0359058 |
| When $k_2 < k_{20}$, $k_{2m}$ = | 0.0899731 | 0.0957678 | 0.0910632 | 0.0886353 | 0.0590588 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 11.368 | 38.474 | 71.143 | 98.322 | 22.477 |

| Case | 12-06 | 12-07 | 12-08 | 12-09 | 12-10 |
|---|---|---|---|---|---|
| 1.0 < NA ≦ 1.1, 115 < T ≦ 125 | | | | | 22/34 |
| $n_{10}$ | 1.7304964 | 1.7097843 | 1.7129025 | 1.7059734 | 1.6983193 |
| $k_{10}$ | 0.0792452 | 0.0770210 | 0.0702809 | 0.0642321 | 0.0712405 |
| $d_{10}$ (nm) | 91.709 | 159.025 | 159.249 | 159.600 | 220.143 |
| $n_{20}$ | 1.7154952 | 1.6841289 | 1.7178163 | 1.6898319 | 1.6860819 |
| $k_{20}$ | 0.2175998 | 0.2392980 | 0.1978132 | 0.1677546 | 0.2336364 |
| $d_{20}$ (nm) | 221.560 | 164.463 | 217.770 | 279.371 | 162.903 |
| When $n_1 \geqq n_{10}$, $n_{1m}$ = | 0.0478430 | 0.0358972 | 0.0479553 | 0.0552173 | 0.0579871 |
| When $n_1 < n_{10}$, $n_{1m}$ = | 0.0188013 | 0.0078589 | 0.0015247 | 0.0299426 | 0.0264917 |
| When $k_1 \geqq k_{10}$, $k_{1m}$ = | 0.0447290 | 0.0214099 | 0.0152087 | 0.0363110 | 0.0340515 |
| When $k_1 < k_{10}$, $k_{1m}$ = | 0.0430518 | 0.0224402 | 0.0060950 | 0.0278772 | 0.0279150 |
| When $d_1 \geqq d_{10}$, $d_{1m}$ (nm) = | 17.323 | 17.500 | ∞ | ∞ | ∞ |
| When $d_1 < d_{10}$, $d_{1m}$ (nm) = | 4.626 | 2.208 | 0.436 | 70.406 | 11.462 |
| When $n_2 \geqq n_{20}$, $n_{2m}$ = | 0.0842468 | 0.0631323 | 0.0959070 | 0.1382263 | 0.0682983 |
| When $n_2 < n_{20}$, $n_{2m}$ = | 0.1172522 | 0.0247583 | 0.0076807 | 0.1296057 | 0.0493762 |
| When $k_2 \geqq k_{20}$, $k_{2m}$ = | 0.0583887 | 0.0111536 | 0.0046545 | 0.0357849 | 0.0882227 |
| When $k_2 < k_{20}$, $k_{2m}$ = | 0.0618323 | 0.0547961 | 0.0579968 | 0.0540967 | 0.0613330 |
| When $d_2 \geqq d_{20}$, $d_{2m}$ (nm) = | ∞ | 18.428 | ∞ | ∞ | ∞ |
| When $d_2 < d_{20}$, $d_{2m}$ (nm) = | 65.102 | 5.436 | 0.894 | 57.180 | 18.177 |

| Case | 12-11 | 12-12 | 12-13 |
|---|---|---|---|
| 1.0 < NA ≦ 1.1, 115 < T ≦ 125 | | | |
| $n_{10}$ | 1.6946755 | 1.6955425 | 1.6956989 |
| $k_{10}$ | 0.0639503 | 0.0535782 | 0.0539885 |
| $d_{10}$ (nm) | 216.344 | 213.248 | 272.929 |
| $n_{20}$ | 1.6931001 | 1.6937343 | 1.6917939 |
| $k_{20}$ | 0.1919118 | 0.1415462 | 0.1683287 |
| $d_{20}$ (nm) | 222.331 | 338.947 | 278.327 |
| When $n_1 \geqq n_{10}$, $n_{1m}$ = | 0.0359900 | 0.0869177 | 0.0714185 |
| When $n_1 < n_{10}$, $n_{1m}$ = | 0.0437024 | 0.0750378 | 0.0538635 |
| When $k_1 \geqq k_{10}$, $k_{1m}$ = | 0.0485352 | 0.0653857 | 0.0669263 |
| When $k_1 < k_{10}$, $k_{1m}$ = | 0.0346851 | 0.0370959 | 0.0388916 |
| When $d_1 \geqq d_{10}$, $d_{1m}$ (nm) = | ∞ | ∞ | ∞ |
| When $d_1 < d_{10}$, $d_{1m}$ (nm) = | 51.791 | 132.178 | 120.018 |
| When $n_2 \geqq n_{20}$, $n_{2m}$ = | 0.1409949 | 0.2291467 | 0.2819873 |
| When $n_2 < n_{20}$, $n_{2m}$ = | 0.1060889 | 0.1273120 | 0.2087952 |
| When $k_2 \geqq k_{20}$, $k_{2m}$ = | 0.1109827 | 0.1363989 | 0.2069556 |
| When $k_2 < k_{20}$, $k_{2m}$ = | 0.0639978 | 0.0571204 | 0.0743250 |
| When $d_2 \geqq d_{20}$, $d_{2m}$ (nm) = | ∞ | ∞ | ∞ |
| When $d_2 < d_{20}$, $d_{2m}$ (nm) = | 35.182 | 107.512 | 95.030 |

| Case | 13-01 | 13-02 | 13-03 | 13-04 | 13-05 |
|---|---|---|---|---|---|
| 1.0 < NA ≦ 1.1, 125 < T ≦ 135 | | | | | 23/34 |
| $n_{10}$ | 1.8993435 | 1.9080238 | 1.7276770 | 1.7338076 | 1.7236449 |
| $k_{10}$ | 0.1093669 | 0.0778133 | 0.0934541 | 0.0808022 | 0.0736298 |
| $d_{10}$ (nm) | 12.638 | 11.189 | 91.210 | 91.869 | 92.640 |
| $n_{20}$ | 1.7156529 | 1.7380285 | 1.6689251 | 1.7256843 | 1.7007078 |
| $k_{20}$ | 0.2903108 | 0.2474831 | 0.2700133 | 0.2232282 | 0.1887087 |
| $d_{20}$ (nm) | 220.942 | 275.866 | 159.348 | 209.944 | 271.148 |
| When $n_1 \geqq n_{10}$, $n_{1m}$ = | 0.1116663 | 0.1266492 | 0.0395422 | 0.0484558 | 0.0522583 |
| When $n_1 < n_{10}$, $n_{1m}$ = | 0.0773999 | 0.0872168 | 0.0167297 | 0.0166711 | 0.0180103 |
| When $k_1 \geqq k_{10}$, $k_{1m}$ = | 0.1011877 | 0.1103088 | 0.0409973 | 0.0422058 | 0.0417761 |
| When $k_1 < k_{10}$, $k_{1m}$ = | 0.1093669 | 0.0778133 | 0.0410583 | 0.0409119 | 0.0443518 |
| When $d_1 \geqq d_{10}$, $d_{1m}$ (nm) = | 6.392 | 6.737 | 11.272 | 16.895 | 38.105 |
| When $d_1 < d_{10}$, $d_{1m}$ (nm) = | 4.063 | 4.214 | 3.733 | 3.952 | 5.177 |
| When $n_2 \geqq n_{20}$, $n_{2m}$ = | 0.1069678 | 0.1140796 | 0.0675769 | 0.0924780 | 0.1134937 |
| When $n_2 < n_{20}$, $n_{2m}$ = | 0.1606714 | 0.1563965 | 0.1033667 | 0.1197949 | 0.1230200 |
| When $k_2 \geqq k_{20}$, $k_{2m}$ = | 0.1040991 | 0.1083496 | 0.0397278 | 0.0600330 | 0.0739392 |
| When $k_2 < k_{20}$, $k_{2m}$ = | 0.0926990 | 0.0882825 | 0.0652539 | 0.0659766 | 0.0617065 |
| When $d_2 \geqq d_{20}$, $d_{2m}$ (nm) = | ∞ | ∞ | 29.488 | ∞ | ∞ |
| When $d_2 < d_{20}$, $d_{2m}$ (nm) = | 90.398 | 130.978 | 17.688 | 16.714 | 72.265 |

-continued

| 1.0 < NA ≦ 1.1, 125 < T ≦ 135 | | | | | |
|---|---|---|---|---|---|
| Case | 13-06 | 13-07 | 13-08 | 13-09 | 13-10 |
| $n_{10}$ | 1.7117973 | 1.7052523 | 1.6990979 | 1.6936455 | 1.6937228 |
| $k_{10}$ | 0.0782334 | 0.0648564 | 0.0723627 | 0.0657466 | 0.0602088 |
| $d_{10}$ (nm) | 159.412 | 160.141 | 220.761 | 215.539 | 212.854 |
| $n_{20}$ | 1.6949465 | 1.6847092 | 1.6931390 | 1.6916565 | 1.6917935 |
| $k_{20}$ | 0.2480962 | 0.1699839 | 0.2421156 | 0.1962143 | 0.1651159 |
| $d_{20}$ (nm) | 152.577 | 269.827 | 151.650 | 213.597 | 273.449 |
| When $n_1 \geqq n_{10}$, $n_{1m}$ = | 0.0367346 | 0.0551233 | 0.0594092 | 0.0311401 | 0.0698511 |
| When $n_1 < n_{10}$, $n_{1m}$ = | 0.0058984 | 0.0239478 | 0.0244397 | 0.0431714 | 0.0693030 |
| When $k_1 \geqq k_{10}$, $k_{1m}$ = | 0.0206287 | 0.0370862 | 0.0278687 | 0.0476123 | 0.0598901 |
| When $k_1 < k_{10}$, $k_{1m}$ = | 0.0197803 | 0.0307031 | 0.0272107 | 0.0341650 | 0.0364880 |
| When $d_1 \geqq d_{10}$, $d_{1m}$ (nm) = | 17.175 | ∞ | ∞ | ∞ | ∞ |
| When $d_1 < d_{10}$, $d_{1m}$ (nm) = | 1.642 | 10.322 | 10.135 | 48.593 | 59.568 |
| When $n_2 \geqq n_{20}$, $n_{2m}$ = | 0.0634509 | 0.0441370 | 0.0646301 | 0.1417163 | 0.2349500 |
| When $n_2 < n_{20}$, $n_{2m}$ = | 0.0185107 | 0.1268359 | 0.0304773 | 0.0878235 | 0.1413928 |
| When $k_2 \geqq k_{20}$, $k_{2m}$ = | 0.0106982 | 0.0374109 | 0.0871985 | 0.1142444 | 0.1311609 |
| When $k_2 < k_{20}$, $k_{2m}$ = | 0.0614368 | 0.0554883 | 0.0573535 | 0.0648792 | 0.0616370 |
| When $d_2 \geqq d_{20}$, $d_{2m}$ (nm) = | 20.867 | ∞ | ∞ | ∞ | ∞ |
| When $d_2 < d_{20}$, $d_{2m}$ (nm) = | 3.236 | 51.950 | 7.977 | 23.183 | 75.250 |

| 1.0 < NA ≦ 1.1, 125 < T ≦ 135 | |
|---|---|
| Case | 13-11 |
| $n_{10}$ | 1.6954835 |
| $k_{10}$ | 0.0549286 |
| $d_{10}$ (nm) | 272.481 |
| $n_{20}$ | 1.6920522 |
| $k_{20}$ | 0.1709440 |
| $d_{20}$ (nm) | 269.018 |
| When $n_1 \geqq n_{10}$, $n_{1m}$ = | 0.0732507 |
| When $n_1 < n_{10}$, $n_{1m}$ = | 0.0527002 |
| When $k_1 \geqq k_{10}$, $k_{1m}$ = | 0.0659570 |
| When $k_1 < k_{10}$, $k_{1m}$ = | 0.0396948 |
| When $d_1 \geqq d_{10}$, $d_{1m}$ (nm) = | ∞ |
| When $d_1 < d_{10}$, $d_{1m}$ (nm) = | 115.848 |
| When $n_2 \geqq n_{20}$, $n_{2m}$ = | 0.2876270 |
| When $n_2 < n_{20}$, $n_{2m}$ = | 0.2123071 |
| When $k_2 \geqq k_{20}$, $k_{2m}$ = | 0.2114355 |
| When $k_2 < k_{20}$, $k_{2m}$ = | 0.0767078 |
| When $d_2 \geqq d_{20}$, $d_{2m}$ (nm) = | ∞ |
| When $d_2 < d_{20}$, $d_{2m}$ (nm) = | 91.957 |

24/34

| 1.0 < NA ≦ 1.1, 135 < T ≦ 145 | | | | | |
|---|---|---|---|---|---|
| Case | 14-01 | 14-02 | 14-03 | 14-04 | 14-05 |
| $n_{10}$ | 1.9117383 | 1.8981283 | 1.9112943 | 1.7312914 | 1.7377087 |
| $k_{10}$ | 0.2302052 | 0.1070787 | 0.0649623 | 0.0945058 | 0.0827928 |
| $d_{10}$ (nm) | 15.980 | 13.384 | 12.163 | 91.544 | 92.151 |
| $n_{20}$ | 1.5953517 | 1.7296497 | 1.7710787 | 1.6819509 | 1.7372931 |
| $k_{20}$ | 0.4940730 | 0.3022759 | 0.2605013 | 0.2846338 | 0.2321492 |
| $d_{20}$ (nm) | 105.368 | 209.053 | 259.824 | 147.702 | 198.983 |
| When $n_1 \geqq n_{10}$, $n_{1m}$ = | 0.0781360 | 0.1075745 | 0.1181738 | 0.0408386 | 0.0487402 |
| When $n_1 < n_{10}$, $n_{1m}$ = | 0.0319177 | 0.0739868 | 0.0809961 | 0.0177930 | 0.0144653 |
| When $k_1 \geqq k_{10}$, $k_{1m}$ = | 0.0436902 | 0.0964282 | 0.0995044 | 0.0430859 | 0.0389966 |
| When $k_1 < k_{10}$, $k_{1m}$ = | 0.0819202 | 0.1070787 | 0.0649623 | 0.0421533 | 0.0388171 |
| When $d_1 \geqq d_{10}$, $d_{1m}$ (nm) = | 3.898 | 6.524 | 6.747 | 11.475 | 16.758 |
| When $d_1 < d_{10}$, $d_{1m}$ (nm) = | 1.590 | 4.095 | 4.185 | 3.862 | 3.299 |
| When $n_2 \geqq n_{20}$, $n_{2m}$ = | 0.0627563 | 0.1085400 | 0.1152271 | 0.0712305 | 0.0983997 |
| When $n_2 < n_{20}$, $n_{2m}$ = | 0.1565955 | 0.1599133 | 0.1627686 | 0.1038867 | 0.1174939 |
| When $k_2 \geqq k_{20}$, $k_{2m}$ = | 0.0810010 | 0.1085132 | 0.1160754 | 0.0447900 | 0.0617737 |
| When $k_2 < k_{20}$, $k_{2m}$ = | 0.1061572 | 0.0966113 | 0.0915161 | 0.0720264 | 0.0692358 |
| When $d_2 \geqq d_{20}$, $d_{2m}$ (nm) = | ∞ | ∞ | ∞ | 26.800 | ∞ |
| When $d_2 < d_{20}$, $d_{2m}$ (nm) = | 27.538 | 81.885 | 123.147 | 14.572 | 12.208 |

1.0 < NA ≦ 1.1
135 < T ≦ 145

25/34

| Case | 14-06 | 14-07 | 14-08 | 14-09 | 14-10 |
|---|---|---|---|---|---|
| $n_{10}$ | 1.7228203 | 1.7144911 | 1.7050797 | 1.6925663 | 1.6991742 |
| $k_{10}$ | 0.0749158 | 0.0796518 | 0.0657099 | 0.0675694 | 0.0739382 |
| $d_{10}$ (nm) | 92.874 | 160.015 | 160.534 | 214.049 | 220.936 |
| $n_{20}$ | 1.6951594 | 1.7090445 | 1.6817729 | 1.6900690 | 1.6992675 |
| $k_{20}$ | 0.1935801 | 0.2610315 | 0.1743389 | 0.2005073 | 0.2525134 |
| $d_{20}$ (nm) | 262.590 | 141.223 | 260.739 | 206.287 | 141.832 |
| When $n_1 \geqq n_{10}$, $n_{1m}$ = | 0.0517419 | 0.0380176 | 0.0550000 | 0.0300269 | 0.0099573 |
| When $n_1 < n_{10}$, $n_{1m}$ = | 0.0171826 | 0.0033435 | 0.0205762 | 0.0461255 | 0.0255640 |
| When $k_1 \geqq k_{10}$, $k_{1m}$ = | 0.0402747 | 0.0176941 | 0.0369080 | 0.0452966 | 0.0196790 |
| When $k_1 < k_{10}$, $k_{1m}$ = | 0.0440662 | 0.0145313 | 0.0289917 | 0.0339844 | 0.0188269 |
| When $d_1 \geqq d_{10}$, $d_{1m}$ (nm) = | 34.339 | 18.702 | ∞ | ∞ | ∞ |
| When $d_1 < d_{10}$, $d_{1m}$ (nm) = | 4.946 | 0.924 | 8.433 | 45.536 | 10.412 |
| When $n_2 \geqq n_{20}$, $n_{2m}$ = | 0.1089246 | 0.0638684 | 0.0364478 | 0.1628357 | 0.0605127 |
| When $n_2 < n_{20}$, $n_{2m}$ = | 0.1178552 | 0.0117664 | 0.1214197 | 0.0809363 | 0.0143933 |
| When $k_2 \geqq k_{20}$, $k_{2m}$ = | 0.0721460 | 0.0078210 | 0.0372485 | 0.1200403 | 0.0864673 |
| When $k_2 < k_{20}$, $k_{2m}$ = | 0.0629919 | 0.0624194 | 0.0562036 | 0.0635217 | 0.0436145 |
| When $d_2 \geqq d_{20}$, $d_{2m}$ (nm) = | ∞ | 21.562 | ∞ | ∞ | 25.612 |
| When $d_2 < d_{20}$, $d_{2m}$ (nm) = | 67.089 | 1.645 | 48.128 | 21.535 | 3.107 |

1.0 < NA ≦ 1.1
135 < T ≦ 145

| Case | 14-11 | 14-12 |
|---|---|---|
| $n_{10}$ | 1.6955775 | 1.6953573 |
| $k_{10}$ | 0.0548747 | 0.0556511 |
| $d_{10}$ (nm) | 213.500 | 272.231 |
| $n_{20}$ | 1.6934763 | 1.6917841 |
| $k_{20}$ | 0.1457299 | 0.1736649 |
| $d_{20}$ (nm) | 319.743 | 260.476 |
| When $n_1 \geqq n_{10}$, $n_{1m}$ = | 0.0884082 | 0.0714819 |
| When $n_1 < n_{10}$, $n_{1m}$ = | 0.0760022 | 0.0518335 |
| When $k_1 \geqq k_{10}$, $k_{1m}$ = | 0.0634009 | 0.0652063 |
| When $k_1 < k_{10}$, $k_{1m}$ = | 0.0349133 | 0.0395740 |
| When $d_1 \geqq d_{10}$, $d_{1m}$ (nm) = | ∞ | ∞ |
| When $d_1 < d_{10}$, $d_{1m}$ (nm) = | 128.996 | 113.518 |
| When $n_2 \geqq n_{20}$, $n_{2m}$ = | 0.2359680 | 0.2895325 |
| When $n_2 < n_{20}$, $n_{2m}$ = | 0.1212769 | 0.2158911 |
| When $k_2 \geqq k_{20}$, $k_{2m}$ = | 0.1345789 | 0.2124060 |
| When $k_2 < k_{20}$, $k_{2m}$ = | 0.0582837 | 0.0793396 |
| When $d_2 \geqq d_{20}$, $d_{2m}$ (nm) = | ∞ | ∞ |
| When $d_2 < d_{20}$, $d_{2m}$ (nm) = | 94.216 | 91.728 |

1.0 < NA ≦ 1.1
145 < T ≦ 155

26/34

| Case | 15-01 | 15-02 | 15-03 | 15-04 | 15-05 |
|---|---|---|---|---|---|
| $n_{10}$ | 1.8842999 | 1.9020060 | 1.9176161 | 1.7347347 | 1.7402087 |
| $k_{10}$ | 0.1660082 | 0.1078045 | 0.0733974 | 0.0970436 | 0.0854812 |
| $d_{10}$ (nm) | 15.542 | 13.884 | 11.927 | 91.613 | 92.221 |
| $n_{20}$ | 1.6642092 | 1.7406676 | 1.7608162 | 1.6897518 | 1.7427648 |
| $k_{20}$ | 0.3881866 | 0.3180988 | 0.2687301 | 0.3028107 | 0.2437105 |
| $d_{20}$ (nm) | 148.595 | 199.025 | 254.127 | 138.166 | 190.058 |
| When $n_1 \geqq n_{10}$, $n_{1m}$ = | 0.0902356 | 0.1039673 | 0.1191321 | 0.0403284 | 0.0477295 |
| When $n_1 < n_{10}$, $n_{1m}$ = | 0.0608057 | 0.0712415 | 0.0806982 | 0.0168616 | 0.0123145 |
| When $k_1 \geqq k_{10}$, $k_{1m}$ = | 0.0796985 | 0.0922314 | 0.1003394 | 0.0414099 | 0.0352649 |
| When $k_1 < k_{10}$, $k_{1m}$ = | 0.0913672 | 0.1040308 | 0.0733974 | 0.0415906 | 0.0369519 |
| When $d_1 \geqq d_{10}$, $d_{1m}$ (nm) = | 5.569 | 6.401 | 6.478 | 11.141 | 16.036 |
| When $d_1 < d_{10}$, $d_{1m}$ (nm) = | 3.524 | 3.984 | 3.954 | 3.546 | 2.715 |
| When $n_2 \geqq n_{20}$, $n_{2m}$ = | 0.0975891 | 0.1093347 | 0.1166919 | 0.0721533 | 0.0993201 |
| When $n_2 < n_{20}$, $n_{2m}$ = | 0.1510022 | 0.1570532 | 0.1613013 | 0.0996582 | 0.1116626 |
| When $k_2 \geqq k_{20}$, $k_{2m}$ = | 0.1021082 | 0.1115308 | 0.1139111 | 0.0446167 | 0.0576575 |
| When $k_2 < k_{20}$, $k_{2m}$ = | 0.1042151 | 0.0981909 | 0.0922217 | 0.0735095 | 0.0699536 |
| When $d_2 \geqq d_{20}$, $d_{2m}$ (nm) = | ∞ | ∞ | ∞ | 23.089 | ∞ |
| When $d_2 < d_{20}$, $d_{2m}$ (nm) = | 36.178 | 75.817 | 118.717 | 13.060 | 9.872 |

-continued

| 1.0 < NA ≦ 1.1<br>145 < T ≦ 155 | | | | | |
|---|---|---|---|---|---|
| Case | 15-06 | 15-07 | 15-08 | 15-09 | 15-10 |
| $n_{10}$ | 1.7232674 | 1.7163169 | 1.7052425 | 1.6979604 | 1.6919325 |
| $k_{10}$ | 0.0768076 | 0.0822242 | 0.0670983 | 0.0765182 | 0.0693101 |
| $d_{10}$ (nm) | 92.842 | 160.121 | 160.367 | 219.964 | 212.895 |
| $n_{20}$ | 1.6931409 | 1.7162208 | 1.6808978 | 1.6978817 | 1.6886216 |
| $k_{20}$ | 0.2010537 | 0.2770503 | 0.1806066 | 0.2641846 | 0.2063377 |
| $d_{20}$ (nm) | 254.319 | 132.120 | 252.327 | 134.431 | 199.162 |
| When $n_1 \geqq n_{10}$, $n_{1m}$ = | 0.0505859 | 0.0375513 | 0.0535669 | 0.0055981 | 0.0297021 |
| When $n_1 < n_{10}$, $n_{1m}$ = | 0.0155139 | 0.0002051 | 0.0181250 | 0.0232141 | 0.0494775 |
| When $k_1 \geqq k_{10}$, $k_{1m}$ = | 0.0378564 | 0.0051208 | 0.0335376 | 0.0146118 | 0.0441443 |
| When $k_1 < k_{10}$, $k_{1m}$ = | 0.0427637 | 0.0032507 | 0.0275378 | 0.0178613 | 0.0327478 |
| When $d_1 \geqq d_{10}$, $d_{1m}$ (nm) = | 33.581 | 19.229 | ∞ | 4.817 | ∞ |
| When $d_1 < d_{10}$, $d_{1m}$ (nm) = | 4.347 | 0.056 | 6.999 | 10.286 | 43.553 |
| When $n_2 \geqq n_{20}$, $n_{2m}$ = | 0.0760803 | 0.0599353 | 0.0299109 | 0.0539575 | 0.2378027 |
| When $n_2 < n_{20}$, $n_{2m}$ = | 0.1135510 | 0.0008435 | 0.1135376 | 0.0106042 | 0.0839368 |
| When $k_2 \geqq k_{20}$, $k_{2m}$ = | 0.0671289 | 0.0005420 | 0.0313745 | 0.0886438 | 0.1159473 |
| When $k_2 < k_{20}$, $k_{2m}$ = | 0.0634387 | 0.0680176 | 0.0561853 | 0.0306653 | 0.0671289 |
| When $d_2 \geqq d_{20}$, $d_{2m}$ (nm) = | ∞ | 12.405 | ∞ | 21.650 | ∞ |
| When $d_2 < d_{20}$, $d_{2m}$ (nm) = | 64.219 | 0.105 | 32.640 | 2.145 | 24.441 |

27/34

| 1.0 < NA ≦ 1.1<br>145 < T ≦ 155 | | |
|---|---|---|
| Case | 15-11 | 15-12 |
| $n_{10}$ | 1.6933082 | 1.6953110 |
| $k_{10}$ | 0.0619759 | 0.0563706 |
| $d_{10}$ (nm) | 212.839 | 272.392 |
| $n_{20}$ | 1.6904544 | 1.6905212 |
| $k_{20}$ | 0.1723582 | 0.1778331 |
| $d_{20}$ (nm) | 255.647 | 252.170 |
| When $n_1 \geqq n_{10}$, $n_{1m}$ = | 0.0645605 | 0.0686462 |
| When $n_1 < n_{10}$, $n_{1m}$ = | 0.0718213 | 0.0516125 |
| When $k_1 \geqq k_{10}$, $k_{1m}$ = | 0.0578125 | 0.0646021 |
| When $k_1 < k_{10}$, $k_{1m}$ = | 0.0349402 | 0.0400220 |
| When $d_1 \geqq d_{10}$, $d_{1m}$ (nm) = | ∞ | ∞ |
| When $d_1 < d_{10}$, $d_{1m}$ (nm) = | 54.857 | 112.777 |
| When $n_2 \geqq n_{20}$, $n_{2m}$ = | 0.2345605 | 0.2885852 |
| When $n_2 < n_{20}$, $n_{2m}$ = | 0.1388916 | 0.2180322 |
| When $k_2 \geqq k_{20}$, $k_{2m}$ = | 0.1280078 | 0.2117786 |
| When $k_2 < k_{20}$, $k_{2m}$ = | 0.0658081 | 0.0782971 |
| When $d_2 \geqq d_{20}$, $d_{2m}$ (nm) = | ∞ | ∞ |
| When $d_2 < d_{20}$, $d_{2m}$ (nm) = | 73.297 | 86.154 |

| 1.0 < NA ≦ 1.1<br>155 < T ≦ 165 | | | | | |
|---|---|---|---|---|---|
| Case | 16-01 | 16-02 | 16-03 | 16-04 | 16-05 |
| $n_{10}$ | 1.9162825 | 1.8960663 | 1.9085468 | 1.9232010 | 1.7368663 |
| $k_{10}$ | 0.2485644 | 0.1719364 | 0.1144956 | 0.0848488 | 0.1019026 |
| $d_{10}$ (nm) | 18.297 | 15.704 | 13.923 | 11.624 | 91.322 |
| $n_{20}$ | 1.6104232 | 1.6708316 | 1.7385514 | 1.7455678 | 1.6869885 |
| $k_{20}$ | 0.6165991 | 0.4169686 | 0.3337318 | 0.2771185 | 0.3224919 |
| $d_{20}$ (nm) | 83.442 | 139.520 | 191.444 | 248.983 | 130.342 |
| When $n_1 \geqq n_{10}$, $n_{1m}$ = | 0.0684412 | 0.0871606 | 0.1018298 | 0.1200745 | 0.0372510 |
| When $n_1 < n_{10}$, $n_{1m}$ = | 0.0186816 | 0.0568530 | 0.0690649 | 0.0803638 | 0.0125696 |
| When $k_1 \geqq k_{10}$, $k_{1m}$ = | 0.0233801 | 0.0734265 | 0.0893420 | 0.1020142 | 0.0332275 |
| When $k_1 < k_{10}$, $k_{1m}$ = | 0.0710925 | 0.0921472 | 0.1049048 | 0.0848488 | 0.0396851 |
| When $d_1 \geqq d_{10}$, $d_{1m}$ (nm) = | 3.544 | 5.170 | 6.051 | 6.159 | 10.019 |
| When $d_1 < d_{10}$, $d_{1m}$ (nm) = | 0.960 | 3.162 | 3.726 | 3.719 | 2.554 |
| When $n_2 \geqq n_{20}$, $n_{2m}$ = | 0.0392468 | 0.0938416 | 0.1080847 | 0.1165613 | 0.0639832 |
| When $n_2 < n_{20}$, $n_{2m}$ = | 0.1557959 | 0.1481714 | 0.1540210 | 0.1601440 | 0.0923059 |
| When $k_2 \geqq k_{20}$, $k_{2m}$ = | 0.0796021 | 0.1023108 | 0.1103064 | 0.1095667 | 0.0344885 |
| When $k_2 < k_{20}$, $k_{2m}$ = | 0.1143958 | 0.1026965 | 0.0973987 | 0.0917590 | 0.0690210 |
| When $d_2 \geqq d_{20}$, $d_{2m}$ (nm) = | ∞ | ∞ | ∞ | ∞ | 16.255 |
| When $d_2 < d_{20}$, $d_{2m}$ (nm) = | 16.079 | 31.215 | 71.737 | 92.392 | 12.361 |

| 1.0 < NA ≦ 1.1<br>155 < T ≦ 165<br>Case | 16-06 | 16-07 | 16-08 | 16-09 | 28/34<br>16-10 |
|---|---|---|---|---|---|
| $n_{10}$ | 1.7401611 | 1.7243481 | 1.7054586 | 1.6959475 | 1.6918299 |
| $k_{10}$ | 0.0886217 | 0.0791015 | 0.0688139 | 0.0801582 | 0.0707672 |
| $d_{10}$ (nm) | 92.017 | 92.538 | 159.721 | 218.084 | 213.401 |
| $n_{20}$ | 1.7381402 | 1.6930588 | 1.6812702 | 1.6891859 | 1.6865968 |
| $k_{20}$ | 0.2555882 | 0.2092609 | 0.1871719 | 0.2763746 | 0.2143676 |
| $d_{20}$ (nm) | 182.755 | 245.988 | 244.029 | 128.431 | 190.286 |
| When $n_1 \geqq n_{10}$, $n_{1m}$ = | 0.0455261 | 0.0488196 | 0.0509851 | 0.0098682 | 0.0278625 |
| When $n_1 < n_{10}$, $n_{1m}$ = | 0.0098901 | 0.0131677 | 0.0163489 | 0.0140930 | 0.0421411 |
| When $k_1 \geqq k_{10}$, $k_{1m}$ = | 0.0306140 | 0.0345203 | 0.0271167 | 0.0171570 | 0.0425635 |
| When $k_1 < k_{10}$, $k_{1m}$ = | 0.0347180 | 0.0404199 | 0.0257288 | 0.0171082 | 0.0318542 |
| When $d_1 \geqq d_{10}$, $d_{1m}$ (nm) = | 14.632 | 33.648 | ∞ | 8.318 | ∞ |
| When $d_1 < d_{10}$, $d_{1m}$ (nm) = | 2.133 | 3.535 | 5.969 | 6.525 | 43.306 |
| When $n_2 \geqq n_{20}$, $n_{2m}$ = | 0.0895227 | 0.0573254 | 0.0211304 | 0.0441309 | 0.2430603 |
| When $n_2 < n_{20}$, $n_{2m}$ = | 0.1067090 | 0.1098926 | 0.1107275 | 0.0233423 | 0.0869226 |
| When $k_2 \geqq k_{20}$, $k_{2m}$ = | 0.0460217 | 0.0587354 | 0.0210486 | 0.0642297 | 0.1089050 |
| When $k_2 < k_{20}$, $k_{2m}$ = | 0.0680432 | 0.0628845 | 0.0551514 | 0.0464880 | 0.0738831 |
| When $d_2 \geqq d_{20}$, $d_{2m}$ (nm) = | ∞ | ∞ | ∞ | 19.572 | ∞ |
| When $d_2 < d_{20}$, $d_{2m}$ (nm) = | 8.553 | 37.425 | 30.745 | 5.059 | 27.273 |

| 1.0 < NA ≦ 1.1<br>155 < T ≦ 165<br>Case | 16-11 | 16-12 |
|---|---|---|
| $n_{10}$ | 1.6935501 | 1.6953216 |
| $k_{10}$ | 0.0625258 | 0.0573372 |
| $d_{10}$ (nm) | 213.666 | 272.694 |
| $n_{20}$ | 1.6897170 | 1.6885432 |
| $k_{20}$ | 0.1780108 | 0.1839003 |
| $d_{20}$ (nm) | 246.097 | 243.579 |
| When $n_1 \geqq n_{10}$, $n_{1m}$ = | 0.0658508 | 0.0696008 |
| When $n_1 < n_{10}$, $n_{1m}$ = | 0.0609790 | 0.0519751 |
| When $k_1 \geqq k_{10}$, $k_{1m}$ = | 0.0564087 | 0.0639087 |
| When $k_1 < k_{10}$, $k_{1m}$ = | 0.0340259 | 0.0390979 |
| When $d_1 \geqq d_{10}$, $d_{1m}$ (nm) = | ∞ | ∞ |
| When $d_1 < d_{10}$, $d_{1m}$ (nm) = | 55.431 | 113.126 |
| When $n_2 \geqq n_{20}$, $n_{2m}$ = | 0.2425122 | 0.2917029 |
| When $n_2 < n_{20}$, $n_{2m}$ = | 0.1355713 | 0.2189172 |
| When $k_2 \geqq k_{20}$, $k_{2m}$ = | 0.1230981 | 0.2089771 |
| When $k_2 < k_{20}$, $k_{2m}$ = | 0.0647131 | 0.0785583 |
| When $d_2 \geqq d_{20}$, $d_{2m}$ (nm) = | ∞ | ∞ |
| When $d_2 < d_{20}$, $d_{2m}$ (nm) = | 74.519 | 83.205 |

| 1.0 < NA ≦ 1.1<br>165 < T ≦ 175<br>Case | 17-01 | 17-02 | 17-03 | 17-04 | 29/34<br>17-05 |
|---|---|---|---|---|---|
| $n_{10}$ | 1.9620125 | 1.9138120 | 1.9194872 | 1.9263431 | 1.7366416 |
| $k_{10}$ | 0.2671830 | 0.1838008 | 0.1265886 | 0.0918160 | 0.1083929 |
| $d_{10}$ (nm) | 17.281 | 15.160 | 13.286 | 11.575 | 90.600 |
| $n_{20}$ | 1.6251877 | 1.6631095 | 1.7204546 | 1.7389610 | 1.6676220 |
| $k_{20}$ | 0.6875073 | 0.4399257 | 0.3440475 | 0.2853240 | 0.3363185 |
| $d_{20}$ (nm) | 75.420 | 132.541 | 186.036 | 241.421 | 124.136 |
| When $n_1 \geqq n_{10}$, $n_{1m}$ = | 0.0681287 | 0.0852625 | 0.1025696 | 0.1184741 | 0.0323010 |
| When $n_1 < n_{10}$, $n_{1m}$ = | 0.0103625 | 0.0516760 | 0.0678894 | 0.0788623 | 0.0048279 |
| When $k_1 \geqq k_{10}$, $k_{1m}$ = | 0.0130603 | 0.0684912 | 0.0894849 | 0.1012756 | 0.0174634 |
| When $k_1 < k_{10}$, $k_{1m}$ = | 0.0671069 | 0.0945691 | 0.1086621 | 0.0918160 | 0.0305151 |
| When $d_1 \geqq d_{10}$, $d_{1m}$ (nm) = | 3.029 | 4.576 | 5.503 | 5.915 | 7.890 |
| When $d_1 < d_{10}$, $d_{1m}$ (nm) = | 0.441 | 2.597 | 3.327 | 3.560 | 0.944 |
| When $n_2 \geqq n_{20}$, $n_{2m}$ = | 0.0235046 | 0.0887256 | 0.1055566 | 0.1147229 | 0.0355994 |
| When $n_2 < n_{20}$, $n_{2m}$ = | 0.1565857 | 0.1459790 | 0.1532703 | 0.1591589 | 0.0840686 |
| When $k_2 \geqq k_{20}$, $k_{2m}$ = | 0.0495569 | 0.0950366 | 0.1036096 | 0.1065601 | 0.0135376 |
| When $k_2 < k_{20}$, $k_{2m}$ = | 0.1038318 | 0.0972864 | 0.0941003 | 0.0904578 | 0.0586487 |
| When $d_2 \geqq d_{20}$, $d_{2m}$ (nm) = | ∞ | ∞ | ∞ | ∞ | 9.834 |
| When $d_2 < d_{20}$, $d_{2m}$ (nm) = | 13.490 | 32.564 | 69.289 | 94.292 | 9.844 |

-continued

| Case | 1.0 < NA ≦ 1.1<br>165 < T ≦ 175<br>17-06 | 17-07 | 17-08 | 17-09 | 17-10 |
|---|---|---|---|---|---|
| $n_{10}$ | 1.7377165 | 1.7250070 | 1.7054487 | 1.6921136 | 1.6937452 |
| $k_{10}$ | 0.0918810 | 0.0812670 | 0.0704565 | 0.0719896 | 0.0634118 |
| $d_{10}$ (nm) | 91.516 | 92.096 | 158.889 | 214.506 | 214.086 |
| $n_{20}$ | 1.7225143 | 1.6922454 | 1.6815182 | 1.6833735 | 1.6893106 |
| $k_{20}$ | 0.2640565 | 0.2155950 | 0.1921887 | 0.2231205 | 0.1840166 |
| $d_{20}$ (nm) | 176.484 | 237.445 | 235.428 | 180.418 | 236.602 |
| When $n_1 \geqq n_{10}$, $n_{1m}$ = | 0.0420569 | 0.0467627 | 0.0482849 | 0.0256970 | 0.0615491 |
| When $n_1 < n_{10}$, $n_{1m}$ = | 0.0067480 | 0.0110010 | 0.0145544 | 0.0346619 | 0.0533179 |
| When $k_1 \geqq k_{10}$, $k_{1m}$ = | 0.0242395 | 0.0311426 | 0.0191064 | 0.0402332 | 0.0548975 |
| When $k_1 < k_{10}$, $k_{1m}$ = | 0.0306030 | 0.0379785 | 0.0179834 | 0.0315259 | 0.0339990 |
| When $d_1 \geqq d_{10}$, $d_{1m}$ (nm) = | 13.053 | 20.074 | ∞ | ∞ | ∞ |
| When $d_1 < d_{10}$, $d_{1m}$ (nm) = | 1.437 | 2.846 | 5.076 | 44.014 | 52.355 |
| When $n_2 \geqq n_{20}$, $n_{2m}$ = | 0.0699756 | 0.0474695 | 0.0119531 | 0.2616345 | 0.2513293 |
| When $n_2 < n_{20}$, $n_{2m}$ = | 0.1027979 | 0.1100684 | 0.1104504 | 0.0766565 | 0.1353430 |
| When $k_2 \geqq k_{20}$, $k_{2m}$ = | 0.0294397 | 0.0490112 | 0.0106458 | 0.1033704 | 0.1166565 |
| When $k_2 < k_{20}$, $k_{2m}$ = | 0.0637073 | 0.0613086 | 0.0537012 | 0.0738440 | 0.0656140 |
| When $d_2 \geqq d_{20}$, $d_{2m}$ (nm) = | ∞ | ∞ | 5.139 | ∞ | ∞ |
| When $d_2 < d_{20}$, $d_{2m}$ (nm) = | 7.091 | 63.320 | 32.177 | 24.892 | 75.277 |

30/34

| Case | 1.0 < NA ≦ 1.1<br>165 < T ≦ 175<br>17-11 | 17-12 |
|---|---|---|
| $n_{10}$ | 1.6937402 | 1.6958036 |
| $k_{10}$ | 0.0634247 | 0.0530688 |
| $d_{10}$ (nm) | 214.067 | 271.703 |
| $n_{20}$ | 1.6892020 | 1.6918593 |
| $k_{20}$ | 0.1839903 | 0.1637010 |
| $d_{20}$ (nm) | 236.644 | 291.452 |
| When $n_1 \geqq n_{10}$, $n_{1m}$ = | 0.0614392 | 0.0799048 |
| When $n_1 < n_{10}$, $n_{1m}$ = | 0.0533545 | 0.0613391 |
| When $k_1 \geqq k_{10}$, $k_{1m}$ = | 0.0548865 | 0.0657874 |
| When $k_1 < k_{10}$, $k_{1m}$ = | 0.0340295 | 0.0406555 |
| When $d_1 \geqq d_{10}$, $d_{1m}$ (nm) = | ∞ | ∞ |
| When $d_1 < d_{10}$, $d_{1m}$ (nm) = | 52.349 | 186.337 |
| When $n_2 \geqq n_{20}$, $n_{2m}$ = | 0.2512048 | 0.2852795 |
| When $n_2 < n_{20}$, $n_{2m}$ = | 0.1353552 | 0.2060364 |
| When $k_2 \geqq k_{20}$, $k_{2m}$ = | 0.1167688 | 0.2088965 |
| When $k_2 < k_{20}$, $k_{2m}$ = | 0.0656104 | 0.0720715 |
| When $d_2 \geqq d_{20}$, $d_{2m}$ (nm) = | ∞ | ∞ |
| When $d_2 < d_{20}$, $d_{2m}$ (nm) = | 75.294 | 119.308 |

| Case | 1.0 < NA ≦ 1.1<br>175 < T ≦ 185<br>18-01 | 18-02 | 18-03 | 18-04 | 18-05 |
|---|---|---|---|---|---|
| $n_{10}$ | 2.0247974 | 1.9282935 | 1.9213955 | 1.9262173 | 1.7355101 |
| $k_{10}$ | 0.2830183 | 0.1992550 | 0.1387890 | 0.1063571 | 0.0947091 |
| $d_{10}$ (nm) | 15.097 | 14.428 | 13.062 | 11.253 | 91.033 |
| $n_{20}$ | 1.6266898 | 1.6428403 | 1.7027750 | 1.7173021 | 1.7079959 |
| $k_{20}$ | 0.7191283 | 0.4517072 | 0.3507816 | 0.2869739 | 0.2693832 |
| $d_{20}$ (nm) | 71.681 | 126.823 | 179.475 | 236.027 | 169.192 |
| When $n_1 \geqq n_{10}$, $n_{1m}$ = | 0.0749963 | 0.0847278 | 0.1010168 | 0.1197595 | 0.0387598 |
| When $n_1 < n_{10}$, $n_{1m}$ = | 0.0029248 | 0.0471021 | 0.0652051 | 0.0785376 | 0.0037976 |
| When $k_1 \geqq k_{10}$, $k_{1m}$ = | 0.0038599 | 0.0655127 | 0.0884351 | 0.1039075 | 0.0170227 |
| When $k_1 < k_{10}$, $k_{1m}$ = | 0.0706714 | 0.0951611 | 0.1067810 | 0.1063571 | 0.0250378 |
| When $d_1 \geqq d_{10}$, $d_{1m}$ (nm) = | 2.365 | 4.047 | 5.170 | 5.710 | 10.979 |
| When $d_1 < d_{10}$, $d_{1m}$ (nm) = | 0.098 | 2.142 | 3.074 | 3.403 | 0.799 |
| When $n_2 \geqq n_{20}$, $n_{2m}$ = | 0.0068848 | 0.0841113 | 0.1036328 | 0.1139966 | 0.0477551 |
| When $n_2 < n_{20}$, $n_{2m}$ = | 0.1606787 | 0.1462891 | 0.1534180 | 0.1596240 | 0.1042908 |
| When $k_2 \geqq k_{20}$, $k_{2m}$ = | 0.0111658 | 0.0845300 | 0.0979260 | 0.1010864 | 0.0158423 |
| When $k_2 < k_{20}$, $k_{2m}$ = | 0.0939917 | 0.0914209 | 0.0916113 | 0.0894141 | 0.0611707 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 3.000 | 39.175 | 67.597 | 105.537 | 4.807 |

1.0 < NA ≦ 1.1
175 < T ≦ 185

31/34

| Case | 18-06 | 18-07 | 18-08 | 18-09 | 18-10 |
|---|---|---|---|---|---|
| $n_{10}$ | 1.7251933 | 1.7054174 | 1.6937830 | 1.6952847 | 1.6957027 |
| $k_{10}$ | 0.0829804 | 0.0718367 | 0.0647049 | 0.0582261 | 0.0542195 |
| $d_{10}$ (nm) | 91.728 | 158.389 | 214.330 | 213.359 | 271.586 |
| $n_{20}$ | 1.6903561 | 1.6812041 | 1.6889835 | 1.6934588 | 1.6918383 |
| $k_{20}$ | 0.2192539 | 0.1954390 | 0.1894046 | 0.1611341 | 0.1679902 |
| $d_{20}$ (nm) | 228.367 | 226.084 | 226.812 | 284.005 | 281.728 |
| When $n_1 \geqq n_{10}$, $n_{1m}$ = | 0.0450793 | 0.0463184 | 0.0575061 | 0.0820801 | 0.0778577 |
| When $n_1 < n_{10}$, $n_{1m}$ = | 0.0094861 | 0.0044336 | 0.0478479 | 0.0612256 | 0.0602185 |
| When $k_1 \geqq k_{10}$, $k_{1m}$ = | 0.0283801 | 0.0117395 | 0.0529968 | 0.0602039 | 0.0649841 |
| When $k_1 < k_{10}$, $k_{1m}$ = | 0.0362878 | 0.0115625 | 0.0337854 | 0.0347266 | 0.0400525 |
| When $d_1 \geqq d_{10}$, $d_{1m}$ (nm) = | 16.774 | ∞ | ∞ | ∞ | ∞ |
| When $d_1 < d_{10}$, $d_{1m}$ (nm) = | 2.397 | 1.386 | 50.875 | 126.709 | 185.173 |
| When $n_2 \geqq n_{20}$, $n_{2m}$ = | 0.0407971 | 0.0052539 | 0.2620386 | 0.2460583 | 0.2888794 |
| When $n_2 < n_{20}$, $n_{2m}$ = | 0.1134692 | 0.1157361 | 0.1359692 | 0.1267810 | 0.2086084 |
| When $k_2 \geqq k_{20}$, $k_{2m}$ = | 0.0417627 | 0.0042761 | 0.1123547 | 0.1276489 | 0.2100842 |
| When $k_2 < k_{20}$, $k_{2m}$ = | 0.0604272 | 0.0538147 | 0.0667053 | 0.0613220 | 0.0762817 |
| When $d_2 \geqq d_{20}$, $d_{2m}$ (nm) = | ∞ | 1.973 | ∞ | ∞ | ∞ |
| When $d_2 < d_{20}$, $d_{2m}$ (nm) = | 63.259 | 35.408 | 73.536 | 81.916 | 101.090 |

1.0 < NA ≦ 1.1
185 < T ≦ 195

| Case | 19-01 | 19-02 | 19-03 | 19-04 | 19-05 |
|---|---|---|---|---|---|
| $n_{10}$ | 1.9316549 | 1.9193011 | 1.9209840 | 1.9114684 | 1.7364379 |
| $k_{10}$ | 0.2158025 | 0.1476126 | 0.1061325 | 0.1024475 | 0.0969838 |
| $d_{10}$ (nm) | 14.297 | 13.272 | 11.842 | 10.224 | 91.033 |
| $n_{20}$ | 1.6202378 | 1.6935029 | 1.7241227 | 1.6976483 | 1.7085420 |
| $k_{20}$ | 0.4645248 | 0.3598725 | 0.2946413 | 0.2438294 | 0.2774318 |
| $d_{20}$ (nm) | 119.165 | 170.049 | 224.030 | 285.021 | 158.680 |
| When $n_1 \geqq n_{10}$, $n_{1m}$ = | 0.0819873 | 0.0986853 | 0.1146375 | 0.1344971 | 0.0375342 |
| When $n_1 < n_{10}$, $n_{1m}$ = | 0.0431250 | 0.0625305 | 0.0746716 | 0.0933276 | 0.0023010 |
| When $k_1 \geqq k_{10}$, $k_{1m}$ = | 0.0616553 | 0.0860156 | 0.0981763 | 0.1190894 | 0.0118958 |
| When $k_1 < k_{10}$, $k_{1m}$ = | 0.0896899 | 0.1016528 | 0.1061325 | 0.1024475 | 0.0218677 |
| When $d_1 \geqq d_{10}$, $d_{1m}$ (nm) = | 3.700 | 5.023 | 5.787 | 6.264 | 9.942 |
| When $d_1 < d_{10}$, $d_{1m}$ (nm) = | 1.892 | 2.963 | 3.440 | 3.984 | 0.476 |
| When $n_2 \geqq n_{20}$, $n_{2m}$ = | 0.0797485 | 0.1030664 | 0.1135645 | 0.1221387 | 0.0340320 |
| When $n_2 < n_{20}$, $n_{2m}$ = | 0.1493750 | 0.1566296 | 0.1631348 | 0.1387097 | 0.1094446 |
| When $k_2 \geqq k_{20}$, $k_{2m}$ = | 0.0775891 | 0.0962708 | 0.1030847 | 0.0998328 | 0.0100928 |
| When $k_2 < k_{20}$, $k_{2m}$ = | 0.0909656 | 0.0941418 | 0.0920776 | 0.0860498 | 0.0649939 |
| When $d_2 \geqq d_{20}$, $d_{2m}$ (nm) = | ∞ | ∞ | ∞ | ∞ | 42.778 |
| When $d_2 < d_{20}$, $d_{2m}$ (nm) = | 39.461 | 66.761 | 95.735 | 134.721 | 2.964 |

1.0 < NA ≦ 1.1
185 < T ≦ 195

32/34

| Case | 19-06 | 19-07 | 19-08 | 19-09 | 19-10 |
|---|---|---|---|---|---|
| $n_{10}$ | 1.7258494 | 1.7176246 | 1.7057732 | 1.7053832 | 1.6928552 |
| $k_{10}$ | 0.0843222 | 0.0727056 | 0.0731106 | 0.0633918 | 0.0748243 |
| $d_{10}$ (nm) | 91.766 | 91.617 | 158.709 | 158.181 | 216.444 |
| $n_{20}$ | 1.6907525 | 1.6784161 | 1.6805392 | 1.6859880 | 1.6825267 |
| $k_{20}$ | 0.2229229 | 0.1842107 | 0.1989479 | 0.1669818 | 0.2415835 |
| $d_{20}$ (nm) | 218.067 | 277.206 | 215.842 | 272.384 | 158.548 |
| When $n_1 \geqq n_{10}$, $n_{1m}$ = | 0.0445569 | 0.0497937 | 0.0455957 | 0.0532361 | 0.0209436 |
| When $n_1 < n_{10}$, $n_{1m}$ = | 0.0086951 | 0.0298450 | 0.0022034 | 0.0367859 | 0.0248157 |
| When $k_1 \geqq k_{10}$, $k_{1m}$ = | 0.0263611 | 0.0534119 | 0.0080444 | 0.0507507 | 0.0311414 |
| When $k_1 < k_{10}$, $k_{1m}$ = | 0.0359253 | 0.0504663 | 0.0097656 | 0.0393250 | 0.0256995 |
| When $d_1 \geqq d_{10}$, $d_{1m}$ (nm) = | 15.734 | 41.766 | ∞ | ∞ | 12.676 |
| When $d_1 < d_{10}$, $d_{1m}$ (nm) = | 2.168 | 9.272 | 0.695 | 75.025 | 12.180 |
| When $n_2 \geqq n_{20}$, $n_{2m}$ = | 0.0361047 | 0.0638184 | 0.0029834 | 0.0794446 | 0.0872498 |
| When $n_2 < n_{20}$, $n_{2m}$ = | 0.1156152 | 0.1202979 | 0.1187366 | 0.1037524 | 0.0413367 |
| When $k_2 \geqq k_{20}$, $k_{2m}$ = | 0.0400842 | 0.0626270 | 0.0025122 | 0.0450354 | 0.0876147 |
| When $k_2 < k_{20}$, $k_{2m}$ = | 0.0626514 | 0.0561853 | 0.0563074 | 0.0506238 | 0.0672510 |
| When $d_2 \geqq d_{20}$, $d_{2m}$ (nm) = | ∞ | ∞ | 1.098 | ∞ | ∞ |
| When $d_2 < d_{20}$, $d_{2m}$ (nm) = | 62.415 | 80.313 | 33.556 | 35.245 | 14.500 |

-continued

| | 1.0 < NA ≦ 1.1<br>185 < T ≦ 195 | | |
|---|---|---|---|
| Case | 19-11 | 19-12 | 19-13 |
| $n_{10}$ | 1.6935473 | 1.6950516 | 1.6954923 |
| $k_{10}$ | 0.0663823 | 0.0596605 | 0.0554795 |
| $d_{10}$ (nm) | 214.407 | 213.429 | 271.226 |
| $n_{20}$ | 1.6888366 | 1.6925794 | 1.6917166 |
| $k_{20}$ | 0.1945007 | 0.1643538 | 0.1716832 |
| $d_{20}$ (nm) | 217.060 | 274.430 | 272.356 |
| When $n_1 \geqq n_{10}$, $n_{1m}$ = | 0.0539099 | 0.0837012 | 0.0771448 |
| When $n_1 < n_{10}$, $n_{1m}$ = | 0.0450378 | 0.0604199 | 0.0593555 |
| When $k_1 \geqq k_{10}$, $k_{1m}$ = | 0.0507373 | 0.0587012 | 0.0639185 |
| When $k_1 < k_{10}$, $k_{1m}$ = | 0.0306738 | 0.0334839 | 0.0392737 |
| When $d_1 \geqq d_{10}$, $d_{1m}$ (nm) = | ∞ | ∞ | ∞ |
| When $d_1 < d_{10}$, $d_{1m}$ (nm) = | 49.334 | 125.965 | 183.474 |
| When $n_2 \geqq n_{20}$, $n_{2m}$ = | 0.1392200 | 0.1753748 | 0.2943286 |
| When $n_2 < n_{20}$, $n_{2m}$ = | 0.1378223 | 0.1262683 | 0.2110303 |
| When $k_2 \geqq k_{20}$, $k_{2m}$ = | 0.1089429 | 0.1267468 | 0.2119958 |
| When $k_2 < k_{20}$, $k_{2m}$ = | 0.0654358 | 0.0611353 | 0.0788904 |
| When $d_2 \geqq d_{20}$, $d_{2m}$ (nm) = | ∞ | ∞ | ∞ |
| When $d_2 < d_{20}$, $d_{2m}$ (nm) = | 37.875 | 75.613 | 93.291 |

| | | 1.0 < NA ≦ 1.1<br>195 < T ≦ 205 | | | |
|---|---|---|---|---|---|
| | | | | | 33/34 |
| Case | 20-01 | 20-02 | 20-03 | 20-04 | 20-05 |
| $n_{10}$ | 1.9124203 | 1.9240615 | 1.9069086 | 1.7409810 | 1.7270720 |
| $k_{10}$ | 0.1489422 | 0.1092971 | 0.1015424 | 0.0988730 | 0.0857435 |
| $d_{10}$ (nm) | 14.330 | 12.001 | 10.748 | 91.533 | 92.142 |
| $n_{20}$ | 1.7039618 | 1.7245262 | 1.7018591 | 1.7256420 | 1.6923707 |
| $k_{20}$ | 0.3787231 | 0.3026113 | 0.2499950 | 0.2922591 | 0.2292874 |
| $d_{20}$ (nm) | 157.291 | 214.201 | 273.963 | 146.253 | 207.814 |
| When $n_1 \geqq n_{10}$, $n_{1m}$ = | 0.0947424 | 0.1140125 | 0.1293140 | 0.0383984 | 0.0447009 |
| When $n_1 < n_{10}$, $n_{1m}$ = | 0.0592273 | 0.0732715 | 0.0895557 | 0.0020898 | 0.0081226 |
| When $k_1 \geqq k_{10}$, $k_{1m}$ = | 0.0804358 | 0.0961365 | 0.1132190 | 0.0106335 | 0.0246362 |
| When $k_1 < k_{10}$, $k_{1m}$ = | 0.0954272 | 0.1092971 | 0.1015424 | 0.0220923 | 0.0359277 |
| When $d_1 \geqq d_{10}$, $d_{1m}$ (nm) = | 5.168 | 5.724 | 6.406 | 9.801 | 15.595 |
| When $d_1 < d_{10}$, $d_{1m}$ (nm) = | 3.029 | 3.355 | 4.072 | 0.420 | 2.001 |
| When $n_2 \geqq n_{20}$, $n_{2m}$ = | 0.1047864 | 0.1153137 | 0.1226477 | 0.0347485 | 0.0318494 |
| When $n_2 < n_{20}$, $n_{2m}$ = | 0.1598962 | 0.1638757 | 0.1417261 | 0.1115564 | 0.1129541 |
| When $k_2 \geqq k_{20}$, $k_{2m}$ = | 0.1020288 | 0.1044775 | 0.1018286 | 0.0106042 | 0.0415295 |
| When $k_2 < k_{20}$, $k_{2m}$ = | 0.1029260 | 0.0959216 | 0.0891724 | 0.0737659 | 0.0663513 |
| When $d_2 \geqq d_{20}$, $d_{2m}$ (nm) = | ∞ | ∞ | ∞ | 37.674 | ∞ |
| When $d_2 < d_{20}$, $d_{2m}$ (nm) = | 61.016 | 86.078 | 130.875 | 2.293 | 32.252 |

| | | 1.0 < NA ≦ 1.1<br>195 < T ≦ 205 | | | |
|---|---|---|---|---|---|
| Case | 20-06 | 20-07 | 20-08 | 20-09 | 20-10 |
| $n_{10}$ | 1.7180387 | 1.7063746 | 1.7058520 | 1.6924739 | 1.6928977 |
| $k_{10}$ | 0.0734703 | 0.0744769 | 0.0640895 | 0.0767908 | 0.0684401 |
| $d_{10}$ (nm) | 91.877 | 159.624 | 158.885 | 216.680 | 213.761 |
| $n_{20}$ | 1.6777924 | 1.6791348 | 1.6855365 | 1.6850078 | 1.6885850 |
| $k_{20}$ | 0.1881130 | 0.2047799 | 0.1710983 | 0.2520629 | 0.1999527 |
| $d_{20}$ (nm) | 267.481 | 205.830 | 262.479 | 148.712 | 208.689 |
| When $n_1 \geqq n_{10}$, $n_{1m}$ = | 0.0499475 | 0.0454993 | 0.0542188 | 0.0126501 | 0.0501160 |
| When $n_1 < n_{10}$, $n_{1m}$ = | 0.0300122 | 0.0018469 | 0.0331775 | 0.0226819 | 0.0449377 |
| When $k_1 \geqq k_{10}$, $k_{1m}$ = | 0.0534277 | 0.0070447 | 0.0503931 | 0.0235315 | 0.0487341 |
| When $k_1 < k_{10}$, $k_{1m}$ = | 0.0493896 | 0.0111902 | 0.0386401 | 0.0180737 | 0.0270740 |
| When $d_1 \geqq d_{10}$, $d_{1m}$ (nm) = | 33.063 | ∞ | ∞ | 10.064 | ∞ |
| When $d_1 < d_{10}$, $d_{1m}$ (nm) = | 9.229 | 0.603 | 19.062 | 10.036 | 46.531 |
| When $n_2 \geqq n_{20}$, $n_{2m}$ = | 0.0633008 | 0.0027478 | 0.0774658 | 0.0675293 | 0.1390137 |
| When $n_2 < n_{20}$, $n_{2m}$ = | 0.1171533 | 0.1127539 | 0.1100610 | 0.0218616 | 0.1442749 |
| When $k_2 \geqq k_{20}$, $k_{2m}$ = | 0.0639148 | 0.0025830 | 0.0457581 | 0.0823975 | 0.1098364 |
| When $k_2 < k_{20}$, $k_{2m}$ = | 0.0580542 | 0.0529590 | 0.0524817 | 0.0502942 | 0.0628650 |
| When $d_2 \geqq d_{20}$, $d_{2m}$ (nm) = | ∞ | 1.007 | ∞ | ∞ | ∞ |
| When $d_2 < d_{20}$, $d_{2m}$ (nm) = | 77.001 | 28.132 | 32.836 | 6.408 | 22.345 |

| 1.0 < NA ≦ 1.1 195 < T ≦ 205 | | 34/34 |
|---|---|---|
| Case | 20-11 | 20-12 |
| $n_{10}$ | 1.6947635 | 1.6952371 |
| $k_{10}$ | 0.0610999 | 0.0566636 |
| $d_{10}$ (nm) | 213.366 | 270.653 |
| $n_{20}$ | 1.6918971 | 1.6914186 |
| $k_{20}$ | 0.1679521 | 0.1751623 |
| $d_{20}$ (nm) | 265.388 | 263.994 |
| When $n_1 \geqq n_{10}$, $n_{1m}$ = | 0.0863086 | 0.0772644 |
| When $n_1 < n_{10}$, $n_{1m}$ = | 0.0626501 | 0.0586890 |
| When $k_1 \geqq k_{10}$, $k_{1m}$ = | 0.0572302 | 0.0627917 |
| When $k_1 < k_{10}$, $k_{1m}$ = | 0.0322180 | 0.0382104 |
| When $d_1 \geqq d_{10}$, $d_{1m}$ (nm) = | ∞ | ∞ |
| When $d_1 < d_{10}$, $d_{1m}$ (nm) = | 124.819 | 121.330 |
| When $n_2 \geqq n_{20}$, $n_{2m}$ = | 0.1702917 | 0.3021582 |
| When $n_2 < n_{20}$, $n_{2m}$ = | 0.1249365 | 0.2142798 |
| When $k_2 \geqq k_{20}$, $k_{2m}$ = | 0.1249084 | 0.2136462 |
| When $k_2 < k_{20}$, $k_{2m}$ = | 0.0643469 | 0.0826477 |
| When $d_2 \geqq d_{20}$, $d_{2m}$ (nm) = | ∞ | ∞ |
| When $d_2 < d_{20}$, $d_{2m}$ (nm) = | 66.113 | 91.025. |

3. An exposure method used in a process for manufacturing a semiconductor device, the method comprising the steps of:

providing an antireflective film having a two-layer structure between a resist layer and a silicon oxide layer formed on a surface of a silicon semiconductor substrate and having a thickness T (unit: nm) described below; and exposing the resist layer in an exposure system having a wavelength of 190 nm to 195 nm and a numerical aperture NA of $1.1 < NA \leqq 1.2$, the antireflective film including an upper layer having a complex refractive index $N_1$, and a lower layer having a complex refractive index $N_2$, the complex refractive indexes $N_1$ and $N_2$ being represented by the equations $N_1 = n_1 - k_1 i$ and $N_2 = n_2 - k_2 i$, respectively;

wherein assuming that the thickness of the upper layer is $d_1$ (unit: nm) and the thickness of the. lower layer is $d_2$ (unit: nm) , when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_{2m}-k_{20})\}^2+\{(d_2-d_{20})/(d_{2m}-d_{20})\}^2 \leqq 1;$$

a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$;a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$; and in the tables below, in the line of "When $n_1 \geqq n_{10}$, $n_{1m}$=", each value in the right columns is "$n_{1m}-n_{10}$"; in the line of "When $n_1 < N_{10}$, $n_{1m}$=", each value in the right columns is "$n_{10}-n_{1m}$"; in the line of "When $k_1 \geqq k_{10}$, $k_{1m}$", each value in the right columns is "$k_{1m}-k_{10}$"; in the line of "When $k_1 < k_{10}$, $k_{1m}$=", each value in the right columns is "$k_{1m}$"; in the line of "When $d_1 \geqq d_{10}$, $d_{1m}$ (nm) =", each value (unit: nm) in the right columns is "$d_{1m}-d_{10}$"; in the line of "When $d_1 < d_{10}$, $d_{1m}$ (nm) =", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2 < n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2 < k_{20}$, $k_{2m}$=", each value in the right columns is "$k_{20}-k_{2m}$"; in the line of "When $d_2 \geqq d_{20}$, $d_{2m}$ (nm) =", each value (unit: nm) in the right columns is "$d_{2m}-d_{20}$"; and in the line of 37 When $d_2 < d_{20}$, $d_{2m}$ (nm) =", each value (unit: nm) in the right columns is "$d_{20}-d_{2m}$".

| 1.1 < NA ≦ 1.2 2 ≦ T ≦ 15 | | | | | 1/27 |
|---|---|---|---|---|---|
| Case | 1-01 | 1-02 | 1-03 | 1-04 | 1-05 |
| $n_{10}$ | 2.0940641 | 1.9168406 | 1.8970115 | 1.8805879 | 1.8778358 |
| $k_{10}$ | 0.0325844 | 0.1807255 | 0.1529573 | 0.1098415 | 0.1082679 |
| $d_{10}$ (nm) | 26.090 | 35.662 | 31.182 | 13.577 | 19.930 |
| $n_{20}$ | 4.2290158 | 5.4932306 | 2.4318401 | 1.7032895 | 1.8340760 |
| $k_{20}$ | 2.3935124 | 0.6123354 | 0.5958382 | 0.2751108 | 0.3677230 |
| $d_{20}$ (nm) | 3.632 | 19.087 | 52.406 | 218.193 | 142.226 |
| When $n_1 \geqq n_{10}$, $n_{1m}$ = | 0.0779846 | 0.0720874 | 0.0701013 | 0.1012354 | 0.0784314 |
| When $n_1 < n_{10}$, $n_{1m}$ = | 0.0750281 | 0.0636047 | 0.0555591 | 0.0635571 | 0.0497058 |
| When $k_1 \geqq k_{10}$, $k_{1m}$ = | 0.0672229 | 0.0527649 | 0.0494641 | 0.0853247 | 0.0590771 |
| When $k_1 < k_{10}$, $k_{1m}$ = | 0.0325844 | 0.0849731 | 0.0840393 | 0.1029980 | 0.0867822 |
| When $d_1 \geqq d_{10}$, $d_{1m}$ (nm) = | 3.416 | 5.199 | 6.198 | 6.716 | 7.382 |
| When $d_1 < d_{10}$, $d_{1m}$ (nm) = | 2.721 | 3.845 | 3.923 | 3.853 | 3.873 |
| When $n_2 \geqq n_{20}$, $n_{2m}$ = | 0.2775293 | 0.1187439 | 0.1333862 | 0.1147803 | 0.1115393 |
| When $n_2 < n_{20}$, $n_{2m}$ = | 0.2711597 | 0.1202087 | 0.1603455 | 0.1449023 | 0.1457849 |
| When $k_2 \geqq k_{20}$, $k_{2m}$ = | 0.2845105 | 0.1470557 | 0.1794812 | 0.0967163 | 0.1467151 |
| When $k_2 < k_{20}$, $k_{2m}$ = | 0.2499512 | 0.1180896 | 0.1302063 | 0.0855334 | 0.0954285 |
| When $d_2 \geqq d_{20}$, $d_{2m}$ (nm) = | 0.458 | 0.467 | 5.440 | ∞ | ∞ |
| When $d_2 < d_{20}$, $d_{2m}$ (nm) = | 0.433 | 0.450 | 5.242 | 81.747 | 30.656 |

-continued

| 1.1 < NA ≦ 1.2<br>2 ≦ T ≦ 15 | | | | | |
|---|---|---|---|---|---|
| Case | 1-06 | 1-07 | 1-08 | 1-09 | 1-10 |
| $n_{10}$ | 1.8663312 | 1.7888608 | 1.7735009 | 1.7175310 | 1.7199475 |
| $k_{10}$ | 0.0978132 | 0.1060865 | 0.0957437 | 0.0751352 | 0.0655065 |
| $d_{10}$ (nm) | 12.232 | 103.503 | 98.181 | 95.409 | 94.621 |
| $n_{20}$ | 1.6938400 | 4.4234099 | 2.0208865 | 1.6658936 | 1.6963762 |
| $k_{20}$ | 0.2288643 | 0.4526804 | 0.4158741 | 0.2054797 | 0.1762614 |
| $d_{20}$ (nm) | 277.705 | 24.164 | 66.693 | 212.937 | 266.043 |
| When $n_1 \geqq n_{10}$, $n_{1m}$ = | 0.1143909 | 0.0588428 | 0.0489270 | 0.0419214 | 0.0484180 |
| When $n_1 < n_{10}$, $n_{1m}$ = | 0.0786536 | 0.0104822 | 0.0094507 | 0.0157727 | 0.0265735 |
| When $k_1 \geqq k_{10}$, $k_{1m}$ = | 0.1033447 | 0.0215918 | 0.0249109 | 0.0382361 | 0.0520056 |
| When $k_1 < k_{10}$, $k_{1m}$ = | 0.0978132 | 0.0439624 | 0.0358655 | 0.0399121 | 0.0459387 |
| When $d_1 \geqq d_{10}$, $d_{1m}$ (nm) = | 7.609 | 9.370 | 10.912 | 18.272 | 51.841 |
| When $d_1 < d_{10}$, $d_{1m}$ (nm) = | 4.794 | 1.739 | 1.766 | 4.805 | 8.596 |
| When $n_2 \geqq n_{20}$, $n_{2m}$ = | 0.1069236 | 0.0468066 | 0.0740674 | 0.0384924 | 0.0631091 |
| When $n_2 < n_{20}$, $n_{2m}$ = | 0.1302808 | 0.1036670 | 0.1052673 | 0.0829468 | 0.0987561 |
| When $k_2 \geqq k_{20}$, $k_{2m}$ = | 0.0918579 | 0.0409717 | 0.0495154 | 0.0385596 | 0.0522119 |
| When $k_2 < k_{20}$, $k_{2m}$ = | 0.0786169 | 0.0807788 | 0.0903577 | 0.0528296 | 0.0515430 |
| When $d_2 \geqq d_{20}$, $d_{2m}$ (nm) = | ∞ | 0.296 | 4.999 | ∞ | ∞ |
| When $d_2 < d_{20}$, $d_{2m}$ (nm) = | 128.233 | 0.621 | 5.371 | 23.038 | 34.154 |

| 1.1 < NA ≦ 1.2<br>2 ≦ T ≦ 15 | | | | | 2/27 |
|---|---|---|---|---|---|
| Case | 1-11 | 1-12 | 1-13 | 1-14 | 1-15 |
| $n_{10}$ | 1.7156729 | 1.7043499 | 1.7082412 | 1.6926126 | 1.6890888 |
| $k_{10}$ | 0.0770168 | 0.0644952 | 0.0577629 | 0.0683906 | 0.0745003 |
| $d_{10}$ (nm) | 188.315 | 165.315 | 163.169 | 237.184 | 217.718 |
| $n_{20}$ | 6.9620048 | 1.6731418 | 1.7075031 | 6.7859369 | 1.7770504 |
| $k_{20}$ | 3.4231449 | 0.1899705 | 0.1626792 | 2.9992529 | 0.3401503 |
| $d_{20}$ (nm) | 0.879 | 207.250 | 259.766 | 0.993 | 84.925 |
| When $n_1 \geqq n_{10}$, $n_{1m}$ = | 0.0649841 | 0.0417419 | 0.0509473 | 0.0348376 | 0.0194055 |
| When $n_1 < n_{10}$, $n_{1m}$ = | 0.0083154 | 0.0317078 | 0.0477380 | 0.0764368 | 0.0607605 |
| When $k_1 \geqq k_{10}$, $k_{1m}$ = | 0.0257251 | 0.0333704 | 0.0433435 | 0.0403589 | 0.0329480 |
| When $k_1 < k_{10}$, $k_{1m}$ = | 0.0275232 | 0.0338538 | 0.0333484 | 0.0319214 | 0.0242554 |
| When $d_1 \geqq d_{10}$, $d_{1m}$ (nm) = | 38.959 | ∞ | ∞ | 19.483 | 9.981 |
| When $d_1 < d_{10}$, $d_{1m}$ (nm) = | 3.134 | 16.146 | 77.216 | 43.463 | 24.681 |
| When $n_2 \geqq n_{20}$, $n_{2m}$ = | 0.2971887 | 0.0474377 | 0.0745630 | 0.5633252 | 0.1177502 |
| When $n_2 < n_{20}$, $n_{2m}$ = | 0.6091602 | 0.0721411 | 0.0651379 | 0.4300269 | 0.0317639 |
| When $k_2 \geqq k_{20}$, $k_{2m}$ = | 0.2827808 | 0.0222888 | 0.0325830 | 0.2436438 | 0.0560791 |
| When $k_2 < k_{20}$, $k_{2m}$ = | 0.6937878 | 0.0478259 | 0.0479700 | 0.5647217 | 0.0980969 |
| When $d_2 \geqq d_{20}$, $d_{2m}$ (nm) = | 0.055 | 16.772 | ∞ | 0.120 | 16.691 |
| When $d_2 < d_{20}$, $d_{2m}$ (nm) = | 0.135 | 19.208 | 16.504 | 0.176 | 3.670 |

| 1.1 < NA ≦ 1.2<br>2 ≦ T ≦ 15 | | | | |
|---|---|---|---|---|
| Case | 1-16 | 1-17 | 1-18 | 1-19 |
| $n_{10}$ | 1.6903292 | 1.6921355 | 1.6951475 | 1.7004017 |
| $k_{10}$ | 0.0721915 | 0.0670288 | 0.0546351 | 0.0599028 |
| $d_{10}$ (nm) | 210.963 | 207.063 | 219.259 | 265.986 |
| $n_{20}$ | 1.7111030 | 1.6978167 | 1.6889102 | 1.7029410 |
| $k_{20}$ | 0.2426612 | 0.1954345 | 0.1606659 | 0.1992607 |
| $d_{20}$ (nm) | 155.846 | 222.387 | 263.728 | 214.965 |
| When $n_1 \geqq n_{10}$, $n_{1m}$ = | 0.0284180 | 0.0456091 | 0.0773694 | 0.0612244 |
| When $n_1 < n_{10}$, $n_{1m}$ = | 0.0510327 | 0.0467078 | 0.0619885 | 0.0410486 |
| When $k_1 \geqq k_{10}$, $k_{1m}$ = | 0.0455554 | 0.0511133 | 0.0524768 | 0.0499927 |
| When $k_1 < k_{10}$, $k_{1m}$ = | 0.0320984 | 0.0388074 | 0.0353687 | 0.0377380 |
| When $d_1 \geqq d_{10}$, $d_{1m}$ (nm) = | 23.770 | ∞ | ∞ | ∞ |
| When $d_1 < d_{10}$, $d_{1m}$ (nm) = | 28.472 | 31.416 | 128.164 | 94.534 |
| When $n_2 \geqq n_{20}$, $n_{2m}$ = | 0.1260327 | 0.1631665 | 0.2120154 | 0.2674829 |
| When $n_2 < n_{20}$, $n_{2m}$ = | 0.0663647 | 0.1722144 | 0.1079456 | 0.2316101 |
| When $k_2 \geqq k_{20}$, $k_{2m}$ = | 0.0960291 | 0.1259009 | 0.1121619 | 0.2074023 |
| When $k_2 < k_{20}$, $k_{2m}$ = | 0.0846741 | 0.0757690 | 0.0591858 | 0.0894751 |
| When $d_2 \geqq d_{20}$, $d_{2m}$ (nm) = | ∞ | ∞ | ∞ | ∞ |
| When $d_2 < d_{20}$, $d_{2m}$ (nm) = | 12.288 | 72.281 | 78.597 | 77.855 |

1.1 < NA ≦ 1.2
15 < T ≦ 25

3/27

| Case | 2-01 | 2-02 | 2-03 | 2-04 | 2-05 |
|---|---|---|---|---|---|
| $n_{10}$ | 1.8738578 | 1.8839217 | 1.8842367 | 1.8705650 | 1.7997475 |
| $k_{10}$ | 0.2051029 | 0.1169859 | 0.1130268 | 0.1010320 | 0.1076402 |
| $d_{10}$ (nm) | 37.506 | 20.540 | 14.059 | 12.433 | 101.817 |
| $n_{20}$ | 6.9151921 | 1.8488520 | 1.7087850 | 1.6946915 | 5.7702673 |
| $k_{20}$ | 0.6847654 | 0.3990514 | 0.2917115 | 0.2394813 | 0.5312541 |
| $d_{20}$ (nm) | 14.288 | 132.865 | 208.377 | 268.610 | 17.283 |
| When $n_1 \geqq n_{10}$, $n_{1m}$ = | 0.0713965 | 0.0757019 | 0.0971472 | 0.1115784 | 0.0520068 |
| When $n_1 < n_{10}$, $n_{1m}$ = | 0.0555054 | 0.0476453 | 0.0599609 | 0.0759399 | 0.0098120 |
| When $k_1 \geqq k_{10}$, $k_{1m}$ = | 0.0541125 | 0.0561304 | 0.0804553 | 0.1002258 | 0.0237036 |
| When $k_1 < k_{10}$, $k_{1m}$ = | 0.0773486 | 0.0843945 | 0.1004919 | 0.1010320 | 0.0377808 |
| When $d_1 \geqq d_{10}$, $d_{1m}$ (nm) = | 5.211 | 6.923 | 6.482 | 7.316 | 8.566 |
| When $d_1 < d_{10}$, $d_{1m}$ (nm) = | 3.920 | 3.580 | 3.648 | 4.569 | 1.552 |
| When $n_2 \geqq n_{20}$, $n_{2m}$ = | 0.1375024 | 0.1133521 | 0.1126624 | 0.1051160 | 0.0578821 |
| When $n_2 < n_{20}$, $n_{2m}$ = | 0.1468335 | 0.1457764 | 0.1432654 | 0.1327966 | 0.1020337 |
| When $k_2 \geqq k_{20}$, $k_{2m}$ = | 0.1698267 | 0.1546228 | 0.0978870 | 0.0916199 | 0.0398865 |
| When $k_2 < k_{20}$, $k_{2m}$ = | 0.1355151 | 0.0979541 | 0.0869165 | 0.0797766 | 0.0850256 |
| When $d_2 \geqq d_{20}$, $d_{2m}$ (nm) = | 0.302 | ∞ | ∞ | ∞ | 0.186 |
| When $d_2 < d_{20}$, $d_{2m}$ (nm) = | 0.308 | 25.359 | 77.278 | 123.573 | 0.315 |

1.1 < NA ≦ 1.2
15 < T ≦ 25

| Case | 2-06 | 2-07 | 2-08 | 2-09 | 2-10 |
|---|---|---|---|---|---|
| $n_{10}$ | 1.7189014 | 1.7208712 | 1.7236639 | 1.7047019 | 1.7084293 |
| $k_{10}$ | 0.0782837 | 0.0678223 | 0.0843652 | 0.0670962 | 0.0597123 |
| $d_{10}$ (nm) | 95.289 | 94.558 | 181.922 | 165.192 | 163.108 |
| $n_{20}$ | 1.6643388 | 1.6960341 | 5.6387216 | 1.6715149 | 1.7074208 |
| $k_{20}$ | 0.2165956 | 0.1841027 | 4.7363270 | 0.1999125 | 0.1697699 |
| $d_{20}$ (nm) | 204.139 | 257.386 | 0.821 | 198.564 | 251.199 |
| When $n_1 \geqq n_{10}$, $n_{1m}$ = | 0.0400110 | 0.0468091 | 0.0526855 | 0.0398865 | 0.0490320 |
| When $n_1 < n_{10}$, $n_{1m}$ = | 0.0126721 | 0.0238684 | 0.0001306 | 0.0279565 | 0.0460034 |
| When $k_1 \geqq k_{10}$, $k_{1m}$ = | 0.0335376 | 0.0489734 | 0.0020081 | 0.0268384 | 0.0389331 |
| When $k_1 < k_{10}$, $k_{1m}$ = | 0.0373218 | 0.0446973 | 0.0057251 | 0.0295178 | 0.0306982 |
| When $d_1 \geqq d_{10}$, $d_{1m}$ (nm) = | 16.137 | 28.984 | 27.528 | ∞ | ∞ |
| When $d_1 < d_{10}$, $d_{1m}$ (nm) = | 3.682 | 7.422 | 0.042 | 13.795 | 27.544 |
| When $n_2 \geqq n_{20}$, $n_{2m}$ = | 0.0331177 | 0.0610901 | 0.0075977 | 0.0397839 | 0.0734460 |
| When $n_2 < n_{20}$, $n_{2m}$ = | 0.0802783 | 0.0961804 | 0.6135461 | 0.0646704 | 0.0518091 |
| When $k_2 \geqq k_{20}$, $k_{2m}$ = | 0.0326062 | 0.0485974 | 0.0047754 | 0.0159570 | 0.0275537 |
| When $k_2 < k_{20}$, $k_{2m}$ = | 0.0528589 | 0.0519092 | 0.7998767 | 0.0474854 | 0.0482410 |
| When $d_2 \geqq d_{20}$, $d_{2m}$ (nm) = | ∞ | ∞ | 0.001 | 11.667 | ∞ |
| When $d_2 < d_{20}$, $d_{2m}$ (nm) = | 20.507 | 30.742 | 0.141 | 16.953 | 13.761 |

1.1 < NA ≦ 1.2
15 < T ≦ 25

4/27

| Case | 2-11 | 2-12 | 2-13 | 2-14 | 2-15 |
|---|---|---|---|---|---|
| $n_{10}$ | 1.6912240 | 1.6881032 | 1.6896993 | 1.6917374 | 1.6948846 |
| $k_{10}$ | 0.0750717 | 0.0788193 | 0.0752193 | 0.0692921 | 0.0562662 |
| $d_{10}$ (nm) | 235.933 | 218.423 | 211.247 | 207.206 | 219.172 |
| $n_{20}$ | 5.6089359 | 1.7881557 | 1.7110684 | 1.6970724 | 1.6877325 |
| $k_{20}$ | 4.1789938 | 0.3823123 | 0.2595743 | 0.2053429 | 0.1673191 |
| $d_{20}$ (nm) | 0.921 | 76.059 | 147.061 | 213.576 | 255.276 |
| When $n_1 \geqq n_{10}$, $n_{1m}$ = | 0.0197583 | 0.0081677 | 0.0235974 | 0.0421069 | 0.0510120 |
| When $n_1 < n_{10}$, $n_{1m}$ = | 0.0774451 | 0.0583032 | 0.0505896 | 0.0462817 | 0.0590515 |
| When $k_1 \geqq k_{10}$, $k_{1m}$ = | 0.0246448 | 0.0223682 | 0.0406641 | 0.0495398 | 0.0510083 |
| When $k_1 < k_{10}$, $k_{1m}$ = | 0.0218396 | 0.0175671 | 0.0286658 | 0.0376331 | 0.0343799 |
| When $d_1 \geqq d_{10}$, $d_{1m}$ (nm) = | 6.504 | 3.634 | 18.131 | ∞ | ∞ |
| When $d_1 < d_{10}$, $d_{1m}$ (nm) = | 42.587 | 22.206 | 26.432 | 29.901 | 81.491 |
| When $n_2 \geqq n_{20}$, $n_{2m}$ = | 0.6544434 | 0.1247424 | 0.1252808 | 0.1545593 | 0.2162573 |
| When $n_2 < n_{20}$, $n_{2m}$ = | 0.2325012 | 0.0171619 | 0.0503735 | 0.1749207 | 0.1048962 |
| When $k_2 \geqq k_{20}$, $k_{2m}$ = | 0.1484387 | 0.0366235 | 0.0860120 | 0.1212268 | 0.1092822 |
| When $k_2 < k_{20}$, $k_{2m}$ = | 0.6595715 | 0.1036670 | 0.0844458 | 0.0781323 | 0.0604700 |
| When $d_2 \geqq d_{20}$, $d_{2m}$ (nm) = | 0.071 | 14.060 | ∞ | ∞ | ∞ |
| When $d_2 < d_{20}$, $d_{2m}$ (nm) = | 0.195 | 1.711 | 9.636 | 69.774 | 76.197 |

-continued

| 1.1 < NA ≦ 1.2<br>15 < T ≦ 25 | | |
|---|---|---|
| Case | 2-16 | 2-17 |
| $n_{10}$ | 1.7002883 | 1.6987256 |
| $k_{10}$ | 0.0618224 | 0.0572006 |
| $d_{10}$ (nm) | 266.113 | 264.952 |
| $n_{20}$ | 1.7025341 | 1.6934905 |
| $k_{20}$ | 0.2096252 | 0.1744162 |
| $d_{20}$ (nm) | 206.193 | 266.771 |
| When $n_1 \geqq n_{10}$, $n_{1m}$ = | 0.0602454 | 0.0764587 |
| When $n_1 < n_{10}$, $n_{1m}$ = | 0.0381921 | 0.0594568 |
| When $k_1 \geqq k_{10}$, $k_{1m}$ = | 0.0482422 | 0.0536096 |
| When $k_1 < k_{10}$, $k_{1m}$ = | 0.0371497 | 0.0384741 |
| When $d_1 \geqq d_{10}$, $d_{1m}$ (nm) = | ∞ | ∞ |
| When $d_1 < d_{10}$, $d_{1m}$ (nm) = | 92.805 | 173.726 |
| When $n_2 \geqq n_{20}$, $n_{2m}$ = | 0.2779004 | 0.2751611 |
| When $n_2 < n_{20}$, $n_{2m}$ = | 0.2377234 | 0.2053577 |
| When $k_2 \geqq k_{20}$, $k_{2m}$ = | 0.2066309 | 0.2211816 |
| When $k_2 < k_{20}$, $k_{2m}$ = | 0.0931018 | 0.0797998 |
| When $d_2 \geqq d_{20}$, $d_{2m}$ (nm) = | ∞ | ∞ |
| When $d_2 < d_{20}$, $d_{2m}$ (nm) = | 73.805 | 125.295 |

| 1.1 < NA ≦ 1.2<br>25 < T ≦ 35 | | | | | |
|---|---|---|---|---|---|
| | | | | | 5/27 |
| Case | 3-01 | 3-02 | 3-03 | 3-04 | 3-05 |
| $n_{10}$ | 1.8384852 | 1.8997218 | 1.8867733 | 1.8774399 | 1.8168537 |
| $k_{10}$ | 0.2367471 | 0.1227276 | 0.1201944 | 0.1030917 | 0.1206742 |
| $d_{10}$ (nm) | 38.632 | 21.226 | 14.426 | 12.555 | 98.976 |
| $n_{20}$ | 4.7928214 | 1.8945709 | 1.7066853 | 1.6978346 | 5.6725781 |
| $k_{20}$ | 0.7766058 | 0.4412749 | 0.3085187 | 0.2515853 | 0.5943855 |
| $d_{20}$ (nm) | 20.034 | 121.762 | 200.277 | 259.495 | 16.950 |
| When $n_1 \geqq n_{10}$, $n_{1m}$ = | 0.0640527 | 0.0719128 | 0.0931812 | 0.1089819 | 0.0387244 |
| When $n_1 < n_{10}$, $n_{1m}$ = | 0.0455762 | 0.0458093 | 0.0565320 | 0.0737622 | 0.0048828 |
| When $k_1 \geqq k_{10}$, $k_{1m}$ = | 0.0510876 | 0.0524744 | 0.0764050 | 0.0973877 | 0.0168860 |
| When $k_1 < k_{10}$, $k_{1m}$ = | 0.0717981 | 0.0817957 | 0.0981750 | 0.1030917 | 0.0269836 |
| When $d_1 \geqq d_{10}$, $d_{1m}$ (nm) = | 4.733 | 6.228 | 6.172 | 6.944 | 6.776 |
| When $d_1 < d_{10}$, $d_{1m}$ (nm) = | 3.444 | 3.186 | 3.418 | 4.320 | 0.695 |
| When $n_2 \geqq n_{20}$, $n_{2m}$ = | 0.1712317 | 0.1175342 | 0.1094324 | 0.1025208 | 0.0610400 |
| When $n_2 < n_{20}$, $n_{2m}$ = | 0.1852917 | 0.1447205 | 0.1408899 | 0.1358679 | 0.1030127 |
| When $k_2 \geqq k_{20}$, $k_{2m}$ = | 0.2079944 | 0.1727771 | 0.0971545 | 0.0913745 | 0.0239368 |
| When $k_2 < k_{20}$, $k_{2m}$ = | 0.1709546 | 0.1005322 | 0.0873328 | 0.0807227 | 0.0995679 |
| When $d_2 \geqq d_{20}$, $d_{2m}$ (nm) = | 0.789 | ∞ | ∞ | ∞ | 0.191 |
| When $d_2 < d_{20}$, $d_{2m}$ (nm) = | 0.773 | 21.526 | 73.345 | 89.127 | 0.308 |

| 1.1 < NA ≦ 1.2<br>25 < T ≦ 35 | | | | | |
|---|---|---|---|---|---|
| Case | 3-06 | 3-07 | 3-08 | 3-09 | 3-10 |
| $n_{10}$ | 1.7203847 | 1.7222308 | 1.7051744 | 1.7089344 | 1.6891179 |
| $k_{10}$ | 0.0818178 | 0.0703272 | 0.0699535 | 0.0618729 | 0.0788518 |
| $d_{10}$ (nm) | 95.097 | 94.450 | 164.924 | 162.999 | 211.328 |
| $n_{20}$ | 1.6625491 | 1.6972414 | 1.6707295 | 1.7091982 | 1.7121044 |
| $k_{20}$ | 0.2295920 | 0.1929579 | 0.2115581 | 0.1777196 | 0.2799946 |
| $d_{20}$ (nm) | 195.706 | 248.789 | 190.095 | 242.642 | 139.125 |
| When $n_1 \geqq n_{10}$, $n_{1m}$ = | 0.0370166 | 0.0449036 | 0.0362634 | 0.0468103 | 0.0189148 |
| When $n_1 < n_{10}$, $n_{1m}$ = | 0.0096326 | 0.0211206 | 0.0148706 | 0.0438916 | 0.0495532 |
| When $k_1 \geqq k_{10}$, $k_{1m}$ = | 0.0279895 | 0.0455884 | 0.0190686 | 0.0333899 | 0.0327563 |
| When $k_1 < k_{10}$, $k_{1m}$ = | 0.0346558 | 0.0433374 | 0.0247266 | 0.0269507 | 0.0238696 |
| When $d_1 \geqq d_{10}$, $d_{1m}$ (nm) = | 14.187 | 22.312 | ∞ | ∞ | 9.561 |
| When $d_1 < d_{10}$, $d_{1m}$ (nm) = | 2.673 | 6.291 | 5.065 | 24.312 | 23.646 |
| When $n_2 \geqq n_{20}$, $n_{2m}$ = | 0.0267200 | 0.0590454 | 0.0307410 | 0.0721521 | 0.1253455 |
| When $n_2 < n_{20}$, $n_{2m}$ = | 0.0766724 | 0.0932019 | 0.0523315 | 0.0386328 | 0.0336450 |
| When $k_2 \geqq k_{20}$, $k_{2m}$ = | 0.0255017 | 0.0445288 | 0.0095300 | 0.0215259 | 0.0725635 |
| When $k_2 < k_{20}$, $k_{2m}$ = | 0.0521814 | 0.0521948 | 0.0465356 | 0.0485632 | 0.0779358 |
| When $d_2 \geqq d_{20}$, $d_{2m}$ (nm) = | ∞ | ∞ | 7.007 | 43.167 | ∞ |
| When $d_2 < d_{20}$, $d_{2m}$ (nm) = | 18.077 | 28.239 | 14.543 | 10.181 | 6.908 |

1.1 < NA ≦ 1.2
25 < T ≦ 35

6/27

| Case | 3-11 | 3-12 | 3-13 | 3-14 |
|---|---|---|---|---|
| $n_{10}$ | 1.6914863 | 1.6947006 | 1.7002933 | 1.6987290 |
| $k_{10}$ | 0.0717884 | 0.0580661 | 0.0640004 | 0.0588877 |
| $d_{10}$ (nm) | 207.154 | 219.137 | 266.055 | 264.992 |
| $n_{20}$ | 1.6970451 | 1.6875442 | 1.7022941 | 1.6933668 |
| $k_{20}$ | 0.2167627 | 0.1751428 | 0.2216801 | 0.1822428 |
| $d_{20}$ (nm) | 205.768 | 246.865 | 198.139 | 258.415 |
| When $n_1 \geqq n_{10}$, $n_{1m}$ = | 0.0385889 | 0.0449475 | 0.0561011 | 0.0760583 |
| When $n_1 < n_{10}$, $n_{1m}$ = | 0.0454712 | 0.0531458 | 0.0356934 | 0.0583093 |
| When $k_1 \geqq k_{10}$, $k_{1m}$ = | 0.0478943 | 0.0493811 | 0.0460974 | 0.0520996 |
| When $k_1 < k_{10}$, $k_{1m}$ = | 0.0361658 | 0.0330811 | 0.0363293 | 0.0375061 |
| When $d_1 \geqq d_{10}$, $d_{1m}$ (nm) = | ∞ | ∞ | ∞ | ∞ |
| When $d_1 < d_{10}$, $d_{1m}$ (nm) = | 28.219 | 77.448 | 91.180 | 121.680 |
| When $n_2 \geqq n_{20}$, $n_{2m}$ = | 0.1522107 | 0.2230298 | 0.2904858 | 0.2858545 |
| When $n_2 < n_{20}$, $n_{2m}$ = | 0.1781921 | 0.1009351 | 0.2457825 | 0.2068896 |
| When $k_2 \geqq k_{20}$, $k_{2m}$ = | 0.1157642 | 0.1063892 | 0.2056812 | 0.2216101 |
| When $k_2 < k_{20}$, $k_{2m}$ = | 0.0805957 | 0.0617065 | 0.0977039 | 0.0829004 |
| When $d_2 \geqq d_{20}$, $d_{2m}$ (nm) = | ∞ | ∞ | ∞ | ∞ |
| When $d_2 < d_{20}$, $d_{2m}$ (nm) = | 66.127 | 48.464 | 70.211 | 121.644 |

1.1 < NA ≦ 1.2
35 < T ≦ 45

| Case | 4-01 | 4-02 | 4-03 | 4-04 | 4-05 |
|---|---|---|---|---|---|
| $n_{10}$ | 1.8909619 | 1.9211597 | 1.8908364 | 1.8788634 | 1.7209142 |
| $k_{10}$ | 0.2198688 | 0.1299283 | 0.1293290 | 0.1089981 | 0.0850231 |
| $d_{10}$ (nm) | 30.886 | 20.325 | 14.409 | 12.666 | 94.685 |
| $n_{20}$ | 2.4457650 | 1.8999891 | 1.6971949 | 1.6934061 | 1.6569532 |
| $k_{20}$ | 0.9042920 | 0.4762728 | 0.3219355 | 0.2597468 | 0.2398462 |
| $d_{20}$ (nm) | 40.480 | 114.977 | 192.850 | 251.595 | 187.582 |
| When $n_1 \geqq n_{10}$, $n_{1m}$ = | 0.0581348 | 0.0702795 | 0.0908240 | 0.1067529 | 0.0340771 |
| When $n_1 < n_{10}$, $n_{1m}$ = | 0.0408777 | 0.0430811 | 0.0541882 | 0.0719214 | 0.0077319 |
| When $k_1 \geqq k_{10}$, $k_{1m}$ = | 0.0449243 | 0.0499243 | 0.0741248 | 0.0961597 | 0.0239465 |
| When $k_1 < k_{10}$, $k_{1m}$ = | 0.0797229 | 0.0798120 | 0.0963696 | 0.1066907 | 0.0329150 |
| When $d_1 \geqq d_{10}$, $d_{1m}$ (nm) = | 4.322 | 5.448 | 5.786 | 6.719 | 11.856 |
| When $d_1 < d_{10}$, $d_{1m}$ (nm) = | 2.642 | 2.634 | 3.166 | 4.161 | 2.071 |
| When $n_2 \geqq n_{20}$, $n_{2m}$ = | 0.1853430 | 0.1162805 | 0.1041772 | 0.0995618 | 0.0224622 |
| When $n_2 < n_{20}$, $n_{2m}$ = | 0.1757385 | 0.1461218 | 0.1390881 | 0.1365247 | 0.0731372 |
| When $k_2 \geqq k_{20}$, $k_{2m}$ = | 0.2033411 | 0.1671118 | 0.0936316 | 0.0897620 | 0.0193579 |
| When $k_2 < k_{20}$, $k_{2m}$ = | 0.1615027 | 0.0988000 | 0.0865491 | 0.0806287 | 0.0502966 |
| When $d_2 \geqq d_{20}$, $d_{2m}$ (nm) = | 5.473 | ∞ | ∞ | ∞ | 13.590 |
| When $d_2 < d_{20}$, $d_{2m}$ (nm) = | 4.339 | 20.871 | 70.442 | 87.096 | 16.661 |

1.1 < NA ≦ 1.2
35 < T ≦ 45

7/27

| Case | 4-06 | 4-07 | 4-08 | 4-09 | 4-10 |
|---|---|---|---|---|---|
| $n_{10}$ | 1.7236493 | 1.7053690 | 1.7096103 | 1.6884398 | 1.6913141 |
| $k_{10}$ | 0.0725136 | 0.0723352 | 0.0638708 | 0.0822671 | 0.0737244 |
| $d_{10}$ (nm) | 94.253 | 164.385 | 162.799 | 210.788 | 206.649 |
| $n_{20}$ | 1.6994520 | 1.6690598 | 1.7121782 | 1.7077650 | 1.6954335 |
| $k_{20}$ | 0.2004026 | 0.2212238 | 0.1844639 | 0.2979850 | 0.2262249 |
| $d_{20}$ (nm) | 239.752 | 181.544 | 233.616 | 132.459 | 199.430 |
| When $n_1 \geqq n_{10}$, $n_{1m}$ = | 0.0432617 | 0.0328076 | 0.0449390 | 0.0103259 | 0.0357813 |
| When $n_1 < n_{10}$, $n_{1m}$ = | 0.0189111 | 0.0081836 | 0.0418201 | 0.0476318 | 0.0441882 |
| When $k_1 \geqq k_{10}$, $k_{1m}$ = | 0.0428613 | 0.0134167 | 0.0270105 | 0.0240100 | 0.0467419 |
| When $k_1 < k_{10}$, $k_{1m}$ = | 0.0419373 | 0.0221985 | 0.0217126 | 0.0186353 | 0.0353625 |
| When $d_1 \geqq d_{10}$, $d_{1m}$ (nm) = | 19.395 | 21.834 | ∞ | 7.013 | ∞ |
| When $d_1 < d_{10}$, $d_{1m}$ (nm) = | 5.406 | 2.666 | 6.246 | 21.283 | 26.527 |
| When $n_2 \geqq n_{20}$, $n_{2m}$ = | 0.0587073 | 0.0279724 | 0.0684412 | 0.1217639 | 0.1437500 |
| When $n_2 < n_{20}$, $n_{2m}$ = | 0.0913135 | 0.0359949 | 0.0242969 | 0.0190967 | 0.1057874 |
| When $k_2 \geqq k_{20}$, $k_{2m}$ = | 0.0407703 | 0.0058350 | 0.0150317 | 0.0602039 | 0.1122632 |
| When $k_2 < k_{20}$, $k_{2m}$ = | 0.0523291 | 0.0449670 | 0.0490210 | 0.0601965 | 0.0826379 |
| When $d_2 \geqq d_{20}$, $d_{2m}$ (nm) = | ∞ | 4.683 | 36.767 | ∞ | ∞ |
| When $d_2 < d_{20}$, $d_{2m}$ (nm) = | 25.916 | 13.275 | 6.151 | 3.566 | 25.291 |

-continued

| 1.1 < NA ≦ 1.2<br>35 < T ≦ 45 | | | |
|---|---|---|---|
| Case | 4-11 | 4-12 | 4-13 |
| $n_{10}$ | 1.6945163 | 1.7002615 | 1.6987767 |
| $k_{10}$ | 0.0596605 | 0.0658973 | 0.0602453 |
| $d_{10}$ (nm) | 219.093 | 265.562 | 264.538 |
| $n_{20}$ | 1.6879518 | 1.6991117 | 1.6924357 |
| $k_{20}$ | 0.1823501 | 0.2320843 | 0.1888152 |
| $d_{20}$ (nm) | 237.943 | 190.875 | 250.808 |
| When $n_1 \geqq n_{10}$, $n_{1m}$ = | 0.0400159 | 0.0514929 | 0.0760449 |
| When $n_1 < n_{10}$, $n_{1m}$ = | 0.0454590 | 0.0339758 | 0.0578162 |
| When $k_1 \geqq k_{10}$, $k_{1m}$ = | 0.0478894 | 0.0439832 | 0.0508728 |
| When $k_1 < k_{10}$, $k_{1m}$ = | 0.0318921 | 0.0347144 | 0.0365662 |
| When $d_1 \geqq d_{10}$, $d_{1m}$ (nm) = | ∞ | ∞ | ∞ |
| When $d_1 < d_{10}$, $d_{1m}$ (nm) = | 53.950 | 89.870 | 117.603 |
| When $n_2 \geqq n_{20}$, $n_{2m}$ = | 0.2316992 | 0.3028357 | 0.2948633 |
| When $n_2 < n_{20}$, $n_{2m}$ = | 0.0956519 | 0.2532336 | 0.2085193 |
| When $k_2 \geqq k_{20}$, $k_{2m}$ = | 0.1045911 | 0.2056006 | 0.2209802 |
| When $k_2 < k_{20}$, $k_{2m}$ = | 0.0612427 | 0.1002246 | 0.0860327 |
| When $d_2 \geqq d_{20}$, $d_{2m}$ (nm) = | ∞ | ∞ | ∞ |
| When $d_2 < d_{20}$, $d_{2m}$ (nm) = | 40.957 | 67.613 | 80.377 |

| 1.1 < NA ≦ 1.2<br>45 < T ≦ 55 | | | | | |
|---|---|---|---|---|---|
| | | | | | 8/27 |
| Case | 5-01 | 5-02 | 5-03 | 5-04 | 5-05 |
| $n_{10}$ | 1.9413239 | 1.8877645 | 1.8798429 | 1.7202563 | 1.7249517 |
| $k_{10}$ | 0.1405566 | 0.1445306 | 0.1135692 | 0.0870823 | 0.0739360 |
| $d_{10}$ (nm) | 18.043 | 14.095 | 12.637 | 94.214 | 94.041 |
| $n_{20}$ | 1.8442891 | 1.6688638 | 1.6888514 | 1.6489031 | 1.7027050 |
| $k_{20}$ | 0.4845639 | 0.3235014 | 0.2638544 | 0.2445724 | 0.2047377 |
| $d_{20}$ (nm) | 113.109 | 187.292 | 243.053 | 179.182 | 229.905 |
| When $n_1 \geqq n_{10}$, $n_{1m}$ = | 0.0724768 | 0.0904346 | 0.1062329 | 0.0324084 | 0.0425623 |
| When $n_1 < n_{10}$, $n_{1m}$ = | 0.0387427 | 0.0534119 | 0.0716968 | 0.0082080 | 0.0177209 |
| When $k_1 \geqq k_{10}$, $k_{1m}$ = | 0.0483630 | 0.0753357 | 0.0968298 | 0.0243140 | 0.0418030 |
| When $k_1 < k_{10}$, $k_{1m}$ = | 0.0803040 | 0.0945715 | 0.1060376 | 0.0343469 | 0.0406653 |
| When $d_1 \geqq d_{10}$, $d_{1m}$ (nm) = | 4.823 | 5.486 | 6.573 | 10.670 | 17.560 |
| When $d_1 < d_{10}$, $d_{1m}$ (nm) = | 2.042 | 3.025 | 4.077 | 2.161 | 4.892 |
| When $n_2 \geqq n_{20}$, $n_{2m}$ = | 0.1074292 | 0.0972339 | 0.0967822 | 0.0242322 | 0.0621313 |
| When $n_2 < n_{20}$, $n_{2m}$ = | 0.1555688 | 0.1383643 | 0.1358411 | 0.0727905 | 0.0930249 |
| When $k_2 \geqq k_{20}$, $k_{2m}$ = | 0.1308459 | 0.0862097 | 0.0881348 | 0.0180859 | 0.0388489 |
| When $k_2 < k_{20}$, $k_{2m}$ = | 0.0911877 | 0.0843787 | 0.0806641 | 0.0488940 | 0.0530957 |
| When $d_2 \geqq d_{20}$, $d_{2m}$ (nm) = | ∞ | ∞ | ∞ | 10.287 | ∞ |
| When $d_2 < d_{20}$, $d_{2m}$ (nm) = | 20.712 | 69.838 | 88.098 | 16.560 | 20.064 |

| 1.1 < NA ≦ 1.2<br>45 < T ≦ 55 | | | | | |
|---|---|---|---|---|---|
| Case | 5-06 | 5-07 | 5-08 | 5-09 | 5-10 |
| $n_{10}$ | 1.7053831 | 1.7104785 | 1.6877471 | 1.6915115 | 1.6941672 |
| $k_{10}$ | 0.0736370 | 0.0654156 | 0.0844092 | 0.0739491 | 0.0608347 |
| $d_{10}$ (nm) | 163.843 | 162.671 | 209.661 | 205.513 | 218.889 |
| $n_{20}$ | 1.6671854 | 1.7160090 | 1.6959640 | 1.6904122 | 1.6879018 |
| $k_{20}$ | 0.2267475 | 0.1885946 | 0.3073448 | 0.2298496 | 0.1872431 |
| $d_{20}$ (nm) | 172.382 | 223.774 | 127.018 | 196.556 | 228.501 |
| When $n_1 \geqq n_{10}$, $n_{1m}$ = | 0.0309619 | 0.0440515 | 0.0051978 | 0.0335425 | 0.0357227 |
| When $n_1 < n_{10}$, $n_{1m}$ = | 0.0112268 | 0.0078247 | 0.0453333 | 0.0430493 | 0.0410388 |
| When $k_1 \geqq k_{10}$, $k_{1m}$ = | 0.0149072 | 0.0196375 | 0.0173291 | 0.0473206 | 0.0467871 |
| When $k_1 < k_{10}$, $k_{1m}$ = | 0.0262830 | 0.0141846 | 0.0154602 | 0.0372058 | 0.0305029 |
| When $d_1 \geqq d_{10}$, $d_{1m}$ (nm) = | 19.247 | ∞ | 2.276 | ∞ | ∞ |
| When $d_1 < d_{10}$, $d_{1m}$ (nm) = | 3.447 | 2.046 | 19.587 | 24.997 | 50.391 |
| When $n_2 \geqq n_{20}$, $n_{2m}$ = | 0.0348413 | 0.0672729 | 0.1107800 | 0.1391333 | 0.2394653 |
| When $n_2 < n_{20}$, $n_{2m}$ = | 0.0292676 | 0.0106921 | 0.0107263 | 0.0732312 | 0.0890649 |
| When $k_2 \geqq k_{20}$, $k_{2m}$ = | 0.0073389 | 0.0081616 | 0.0597644 | 0.1152246 | 0.1047815 |
| When $k_2 < k_{20}$, $k_{2m}$ = | 0.0445459 | 0.0504346 | 0.0379138 | 0.0797473 | 0.0602527 |
| When $d_2 \geqq d_{20}$, $d_{2m}$ (nm) = | 6.326 | 35.781 | 32.689 | ∞ | ∞ |
| When $d_2 < d_{20}$, $d_{2m}$ (nm) = | 11.802 | 2.505 | 1.901 | 20.558 | 36.515 |

| Case | 1.1 < NA ≦ 1.2 45 < T ≦ 55 5-11 | 5-12 | 9/27 5-13 |
|---|---|---|---|
| $n_{10}$ | 1.6941096 | 1.7000691 | 1.6987341 |
| $k_{10}$ | 0.0560046 | 0.0669711 | 0.0608862 |
| $d_{10}$ (nm) | 215.482 | 264.757 | 263.855 |
| $n_{20}$ | 1.6938988 | 1.6924460 | 1.6911373 |
| $k_{20}$ | 0.1599964 | 0.2378630 | 0.1924284 |
| $d_{20}$ (nm) | 287.470 | 184.028 | 243.250 |
| When $n_1 \geqq n_{10}$, $n_{1m}$ = | 0.0468335 | 0.0484424 | 0.0766663 |
| When $n_1 < n_{10}$, $n_{1m}$ = | 0.0625427 | 0.0333350 | 0.0582520 |
| When $k_1 \geqq k_{10}$, $k_{1m}$ = | 0.0574133 | 0.0424146 | 0.0503235 |
| When $k_1 < k_{10}$, $k_{1m}$ = | 0.0373425 | 0.0336023 | 0.0357239 |
| When $d_1 \geqq d_{10}$, $d_{1m}$ (nm) = | ∞ | ∞ | ∞ |
| When $d_1 < d_{10}$, $d_{1m}$ (nm) = | 47.031 | 45.336 | 115.043 |
| When $n_2 \geqq n_{20}$, $n_{2m}$ = | 0.2184277 | 0.3156848 | 0.3032751 |
| When $n_2 < n_{20}$, $n_{2m}$ = | 0.1528296 | 0.2586377 | 0.2107019 |
| When $k_2 \geqq k_{20}$, $k_{2m}$ = | 0.1238171 | 0.2073083 | 0.2191870 |
| When $k_2 < k_{20}$, $k_{2m}$ = | 0.0588196 | 0.0981323 | 0.0862329 |
| When $d_2 \geqq d_{20}$, $d_{2m}$ (nm) = | ∞ | ∞ | ∞ |
| When $d_2 < d_{20}$, $d_{2m}$ (nm) = | 85.352 | 66.135 | 78.131 |

| Case | 1.1 < NA ≦ 1.2 55 < T ≦ 65 6-01 | 6-02 | 6-03 | 6-04 | 6-05 |
|---|---|---|---|---|---|
| $n_{10}$ | 1.8998120 | 1.9599431 | 1.8792360 | 1.8920036 | 1.7198405 |
| $k_{10}$ | 0.2622743 | 0.1538418 | 0.1119058 | 0.0671877 | 0.0878543 |
| $d_{10}$ (nm) | 21.573 | 15.993 | 12.895 | 11.926 | 93.971 |
| $n_{20}$ | 1.6944131 | 1.7907917 | 1.6940206 | 1.7462722 | 1.6452515 |
| $k_{20}$ | 0.7809017 | 0.4780154 | 0.2681658 | 0.2347435 | 0.2473168 |
| $d_{20}$ (nm) | 53.320 | 111.028 | 231.714 | 280.522 | 169.419 |
| When $n_1 \geqq n_{10}$, $n_{1m}$ = | 0.0603137 | 0.0799158 | 0.1051331 | 0.1164221 | 0.0325574 |
| When $n_1 < n_{10}$, $n_{1m}$ = | 0.0246228 | 0.0339001 | 0.0713818 | 0.0790796 | 0.0109656 |
| When $k_1 \geqq k_{10}$, $k_{1m}$ = | 0.0436731 | 0.0463733 | 0.0957117 | 0.1011499 | 0.0282458 |
| When $k_1 < k_{10}$, $k_{1m}$ = | 0.0527222 | 0.0842969 | 0.1045093 | 0.0671877 | 0.0383301 |
| When $d_1 \geqq d_{10}$, $d_{1m}$ (nm) = | 3.630 | 4.315 | 6.630 | 7.111 | 10.486 |
| When $d_1 < d_{10}$, $d_{1m}$ (nm) = | 1.338 | 1.548 | 4.149 | 4.416 | 2.879 |
| When $n_2 \geqq n_{20}$, $n_{2m}$ = | 0.1220337 | 0.0996899 | 0.0944202 | 0.0992114 | 0.0312585 |
| When $n_2 < n_{20}$, $n_{2m}$ = | 0.0963342 | 0.1728088 | 0.1384424 | 0.1517053 | 0.0751245 |
| When $k_2 \geqq k_{20}$, $k_{2m}$ = | 0.0896167 | 0.0986731 | 0.0889478 | 0.0981226 | 0.0215662 |
| When $k_2 < k_{20}$, $k_{2m}$ = | 0.0868945 | 0.0892566 | 0.0826782 | 0.0802551 | 0.0503503 |
| When $d_2 \geqq d_{20}$, $d_{2m}$ (nm) = | 14.581 | ∞ | ∞ | ∞ | 10.833 |
| When $d_2 < d_{20}$, $d_{2m}$ (nm) = | 7.202 | 14.530 | 88.193 | 126.095 | 17.275 |

| Case | 1.1 < NA ≦ 1.2 55 < T ≦ 65 6-06 | 6-07 | 6-08 | 6-09 | 10/27 6-10 |
|---|---|---|---|---|---|
| $n_{10}$ | 1.7267515 | 1.7286377 | 1.7058235 | 1.6871196 | 1.6936372 |
| $k_{10}$ | 0.0746914 | 0.0697592 | 0.0740364 | 0.0856014 | 0.0616799 |
| $d_{10}$ (nm) | 93.982 | 94.711 | 163.674 | 208.540 | 218.466 |
| $n_{20}$ | 1.7088385 | 1.7257237 | 1.6690540 | 1.6832134 | 1.6877720 |
| $k_{20}$ | 0.2076415 | 0.1796886 | 0.2306007 | 0.3092532 | 0.1900717 |
| $d_{20}$ (nm) | 218.911 | 273.487 | 161.946 | 121.170 | 218.772 |
| When $n_1 \geqq n_{10}$, $n_{1m}$ = | 0.0431396 | 0.0483069 | 0.0312061 | 0.0049573 | 0.0327710 |
| When $n_1 < n_{10}$, $n_{1m}$ = | 0.0172424 | 0.0116125 | 0.0175793 | 0.0417786 | 0.0401648 |
| When $k_1 \geqq k_{10}$, $k_{1m}$ = | 0.0418896 | 0.0318958 | 0.0202844 | 0.0152393 | 0.0462805 |
| When $k_1 < k_{10}$, $k_{1m}$ = | 0.0396252 | 0.0362695 | 0.0328467 | 0.0174036 | 0.0298352 |
| When $d_1 \geqq d_{10}$, $d_{1m}$ (nm) = | 17.247 | 40.127 | 17.394 | 2.172 | ∞ |
| When $d_1 < d_{10}$, $d_{1m}$ (nm) = | 4.621 | 3.300 | 5.870 | 18.309 | 47.643 |
| When $n_2 \geqq n_{20}$, $n_{2m}$ = | 0.0684570 | 0.0868091 | 0.0312744 | 0.1009155 | 0.2431030 |
| When $n_2 < n_{20}$, $n_{2m}$ = | 0.0962207 | 0.1095422 | 0.0318677 | 0.0098169 | 0.0838513 |
| When $k_2 \geqq k_{20}$, $k_{2m}$ = | 0.0394080 | 0.0515259 | 0.0123767 | 0.0719922 | 0.1060815 |
| When $k_2 < k_{20}$, $k_{2m}$ = | 0.0553357 | 0.0549243 | 0.0471436 | 0.0304236 | 0.0607056 |
| When $d_2 \geqq d_{20}$, $d_{2m}$ (nm) = | ∞ | ∞ | 9.995 | 25.676 | ∞ |
| When $d_2 < d_{20}$, $d_{2m}$ (nm) = | 15.791 | 73.815 | 10.017 | 1.682 | 28.435 |

-continued

| 1.1 < NA ≦ 1.2<br>55 < T ≦ 65 | | |
|---|---|---|
| Case | 6-11 | 6-12 |
| $n_{10}$ | 1.6996002 | 1.6985143 |
| $k_{10}$ | 0.0674630 | 0.0611760 |
| $d_{10}$ (nm) | 264.231 | 263.586 |
| $n_{20}$ | 1.6851097 | 1.6903246 |
| $k_{20}$ | 0.2396601 | 0.1936289 |
| $d_{20}$ (nm) | 175.944 | 234.054 |
| When $n_1 \geqq n_{10}$, $n_{1m}$ = | 0.0469604 | 0.0772302 |
| When $n_1 < n_{10}$, $n_{1m}$ = | 0.0345850 | 0.0600415 |
| When $k_1 \geqq k_{10}$, $k_{1m}$ = | 0.0413989 | 0.0503625 |
| When $k_1 < k_{10}$, $k_{1m}$ = | 0.0326746 | 0.0352795 |
| When $d_1 \geqq d_{10}$, $d_{1m}$ (nm) = | ∞ | ∞ |
| When $d_1 < d_{10}$, $d_{1m}$ (nm) = | 35.789 | 113.370 |
| When $n_2 \geqq n_{20}$, $n_{2m}$ = | 0.3361853 | 0.3175012 |
| When $n_2 < n_{20}$, $n_{2m}$ = | 0.2595898 | 0.2115027 |
| When $k_2 \geqq k_{20}$, $k_{2m}$ = | 0.2087170 | 0.2189661 |
| When $k_2 < k_{20}$, $k_{2m}$ = | 0.0954248 | 0.0859949 |
| When $d_2 \geqq d_{20}$, $d_{2m}$ (nm) = | ∞ | ∞ |
| When $d_2 < d_{20}$, $d_{2m}$ (nm) = | 64.780 | 74.733 |

| 1.1 < NA ≦ 1.2<br>65 < T ≦ 75 | | | | | |
|---|---|---|---|---|---|
| | | | | | 11/27 |
| Case | 7-01 | 7-02 | 7-03 | 7-04 | 7-05 |
| $n_{10}$ | 1.8814830 | 1.9657443 | 1.8787154 | 1.8913468 | 1.7209187 |
| $k_{10}$ | 0.2936564 | 0.1688741 | 0.1109169 | 0.0695388 | 0.0883668 |
| $d_{10}$ (nm) | 22.098 | 15.852 | 13.263 | 12.162 | 94.055 |
| $n_{20}$ | 1.6321609 | 1.7726563 | 1.6996278 | 1.7469121 | 1.6482914 |
| $k_{20}$ | 0.8097385 | 0.4923001 | 0.2745566 | 0.2387131 | 0.2540527 |
| $d_{20}$ (nm) | 46.190 | 103.170 | 220.404 | 270.807 | 158.511 |
| When $n_1 \geqq n_{10}$, $n_{1m}$ = | 0.0656360 | 0.0817346 | 0.1037085 | 0.1149512 | 0.0333252 |
| When $n_1 < n_{10}$, $n_{1m}$ = | 0.0241089 | 0.0282544 | 0.0702112 | 0.0769897 | 0.0127490 |
| When $k_1 \geqq k_{10}$, $k_{1m}$ = | 0.0378577 | 0.0400220 | 0.0934888 | 0.0991272 | 0.0301257 |
| When $k_1 < k_{10}$, $k_{1m}$ = | 0.0323035 | 0.0824512 | 0.1025916 | 0.0695388 | 0.0388867 |
| When $d_1 \geqq d_{10}$, $d_{1m}$ (nm) = | 3.610 | 3.980 | 6.711 | 7.159 | 10.691 |
| When $d_1 < d_{10}$, $d_{1m}$ (nm) = | 1.297 | 1.237 | 4.191 | 4.366 | 3.330 |
| When $n_2 \geqq n_{20}$, $n_{2m}$ = | 0.1024585 | 0.0947095 | 0.0935791 | 0.1004138 | 0.0355066 |
| When $n_2 < n_{20}$, $n_{2m}$ = | 0.0645630 | 0.1828857 | 0.1422339 | 0.1540833 | 0.0767798 |
| When $k_2 \geqq k_{20}$, $k_{2m}$ = | 0.0898303 | 0.0894482 | 0.0904114 | 0.0989551 | 0.0244946 |
| When $k_2 < k_{20}$, $k_{2m}$ = | 0.1003796 | 0.0949036 | 0.0851941 | 0.0816284 | 0.0535193 |
| When $d_2 \geqq d_{20}$, $d_{2m}$ (nm) = | 11.613 | ∞ | ∞ | ∞ | 11.010 |
| When $d_2 < d_{20}$, $d_{2m}$ (nm) = | 4.416 | 10.112 | 84.053 | 124.915 | 16.505 |

| 1.1 < NA ≦ 1.2<br>65 < T ≦ 75 | | | | | |
|---|---|---|---|---|---|
| Case | 7-06 | 7-07 | 7-08 | 7-09 | 7-10 |
| $n_{10}$ | 1.7288665 | 1.7286370 | 1.7068032 | 1.6862856 | 1.6931399 |
| $k_{10}$ | 0.0756184 | 0.0709992 | 0.0744994 | 0.0878163 | 0.0624918 |
| $d_{10}$ (nm) | 94.090 | 94.923 | 163.814 | 208.124 | 217.968 |
| $n_{20}$ | 1.7153723 | 1.7241262 | 1.6739446 | 1.6736237 | 1.6872372 |
| $k_{20}$ | 0.2125971 | 0.1831189 | 0.2371534 | 0.3138657 | 0.1926334 |
| $d_{20}$ (nm) | 207.924 | 263.961 | 151.052 | 112.320 | 209.546 |
| When $n_1 \geqq n_{10}$, $n_{1m}$ = | 0.0437573 | 0.0483350 | 0.0322754 | 0.0025049 | 0.0316833 |
| When $n_1 < n_{10}$, $n_{1m}$ = | 0.0164966 | 0.0099878 | 0.0175537 | 0.0409570 | 0.0419177 |
| When $k_1 \geqq k_{10}$, $k_{1m}$ = | 0.0410425 | 0.0291785 | 0.0221094 | 0.0095605 | 0.0459827 |
| When $k_1 < k_{10}$, $k_{1m}$ = | 0.0388428 | 0.0344531 | 0.0333215 | 0.0151172 | 0.0300720 |
| When $d_1 \geqq d_{10}$, $d_{1m}$ (nm) = | 17.329 | 38.775 | 18.851 | 1.009 | ∞ |
| When $d_1 < d_{10}$, $d_{1m}$ (nm) = | 4.318 | 2.813 | 6.154 | 17.032 | 45.887 |
| When $n_2 \geqq n_{20}$, $n_{2m}$ = | 0.0710437 | 0.0893457 | 0.0302136 | 0.1037878 | 0.2406421 |
| When $n_2 < n_{20}$, $n_{2m}$ = | 0.0969080 | 0.1083484 | 0.0331750 | 0.0056763 | 0.0830054 |
| When $k_2 \geqq k_{20}$, $k_{2m}$ = | 0.0400586 | 0.0500842 | 0.0147241 | 0.0658289 | 0.1059290 |
| When $k_2 < k_{20}$, $k_{2m}$ = | 0.0574512 | 0.0562378 | 0.0506323 | 0.0175342 | 0.0630762 |
| When $d_2 \geqq d_{20}$, $d_{2m}$ (nm) = | ∞ | ∞ | 10.293 | 26.205 | ∞ |
| When $d_2 < d_{20}$, $d_{2m}$ (nm) = | 13.701 | 72.849 | 8.984 | 0.992 | 28.220 |

| 1.1 < NA ≦ 1.2<br>65 < T ≦ 75 | | | |
|---|---|---|---|
| Case | 7-11 | 7-12 | 12/27<br>7-13 |
| $n_{10}$ | 1.6935780 | 1.6987845 | 1.6982075 |
| $k_{10}$ | 0.0575917 | 0.0682876 | 0.0620058 |
| $d_{10}$ (nm) | 214.501 | 264.829 | 264.409 |
| $n_{20}$ | 1.6927449 | 1.6826884 | 1.6907687 |
| $k_{20}$ | 0.1631490 | 0.2430960 | 0.1959423 |
| $d_{20}$ (nm) | 269.036 | 164.540 | 222.065 |
| When $n_1 \geqq n_{10}$, $n_{1m}$ = | 0.0479456 | 0.0478223 | 0.0756042 |
| When $n_1 < n_{10}$, $n_{1m}$ = | 0.0597888 | 0.0375256 | 0.0523840 |
| When $k_1 \geqq k_{10}$, $k_{1m}$ = | 0.0567029 | 0.0406042 | 0.0502747 |
| When $k_1 < k_{10}$, $k_{1m}$ = | 0.0379382 | 0.0306238 | 0.0354358 |
| When $d_1 \geqq d_{10}$, $d_{1m}$ (nm) = | ∞ | ∞ | ∞ |
| When $d_1 < d_{10}$, $d_{1m}$ (nm) = | 42.775 | 36.115 | 105.289 |
| When $n_2 \geqq n_{20}$, $n_{2m}$ = | 0.2180396 | 0.3702002 | 0.3412915 |
| When $n_2 < n_{20}$, $n_{2m}$ = | 0.1575122 | 0.2565369 | 0.2093115 |
| When $k_2 \geqq k_{20}$, $k_{2m}$ = | 0.1278589 | 0.2070850 | 0.2215063 |
| When $k_2 < k_{20}$, $k_{2m}$ = | 0.0614197 | 0.0951270 | 0.0864294 |
| When $d_2 \geqq d_{20}$, $d_{2m}$ (nm) = | ∞ | ∞ | ∞ |
| When $d_2 < d_{20}$, $d_{2m}$ (nm) = | 81.766 | 63.144 | 76.945 |

| 1.1 < NA ≦ 1.2<br>75 < T ≦ 85 | | | | | |
|---|---|---|---|---|---|
| Case | 8-01 | 8-02 | 8-03 | 8-04 | 8-05 |
| $n_{10}$ | 1.8508920 | 1.9432602 | 1.8788012 | 1.8809660 | 1.8914032 |
| $k_{10}$ | 0.3299462 | 0.1828608 | 0.1571474 | 0.1122948 | 0.0691945 |
| $d_{10}$ (nm) | 26.713 | 18.534 | 15.200 | 13.670 | 12.762 |
| $n_{20}$ | 1.6561984 | 1.7922587 | 1.6553949 | 1.7045069 | 1.7559855 |
| $k_{20}$ | 1.0215947 | 0.5435792 | 0.3498651 | 0.2862016 | 0.2487147 |
| $d_{20}$ (nm) | 31.481 | 89.452 | 157.519 | 210.391 | 259.753 |
| When $n_1 \geqq n_{10}$, $n_{1m}$ = | 0.0584900 | 0.0721143 | 0.0859290 | 0.1006885 | 0.1098987 |
| When $n_1 < n_{10}$, $n_{1m}$ = | 0.0118384 | 0.0258594 | 0.0490076 | 0.0672168 | 0.0736646 |
| When $k_1 \geqq k_{10}$, $k_{1m}$ = | 0.0281628 | 0.0341772 | 0.0681653 | 0.0888281 | 0.0935315 |
| When $k_1 < k_{10}$, $k_{1m}$ = | 0.0027112 | 0.0735254 | 0.0892920 | 0.1016174 | 0.0691945 |
| When $d_1 \geqq d_{10}$, $d_{1m}$ (nm) = | 3.227 | 4.317 | 5.436 | 6.605 | 7.111 |
| When $d_1 < d_{10}$, $d_{1m}$ (nm) = | 0.304 | 1.291 | 2.967 | 4.063 | 4.341 |
| When $n_2 \geqq n_{20}$, $n_{2m}$ = | 0.1267358 | 0.0961279 | 0.0835156 | 0.0933350 | 0.1000793 |
| When $n_2 < n_{20}$, $n_{2m}$ = | 0.0093018 | 0.1747852 | 0.1389221 | 0.1466003 | 0.1520386 |
| When $k_2 \geqq k_{20}$, $k_{2m}$ = | 0.0170300 | 0.1198535 | 0.0846472 | 0.0918018 | 0.1012305 |
| When $k_2 < k_{20}$, $k_{2m}$ = | 0.1219019 | 0.1040369 | 0.0912122 | 0.0867468 | 0.0829492 |
| When $d_2 \geqq d_{20}$, $d_{2m}$ (nm) = | 8.195 | ∞ | ∞ | ∞ | ∞ |
| When $d_2 < d_{20}$, $d_{2m}$ (nm) = | 0.369 | 9.559 | 36.990 | 78.480 | 119.640 |

| 1.1 < NA ≦ 1.2<br>75 < T ≦ 85 | | | | | |
|---|---|---|---|---|---|
| Case | 8-06 | 8-07 | 8-08 | 8-09 | 13/27<br>8-10 |
| $n_{10}$ | 1.7233184 | 1.7297992 | 1.7292921 | 1.7076375 | 1.6902915 |
| $k_{10}$ | 0.0905387 | 0.0774990 | 0.0722395 | 0.0765186 | 0.0790058 |
| $d_{10}$ (nm) | 94.254 | 94.232 | 94.957 | 163.992 | 206.654 |
| $n_{20}$ | 1.6520214 | 1.7157415 | 1.7247476 | 1.6752795 | 1.6879680 |
| $k_{20}$ | 0.2670378 | 0.2209454 | 0.1892941 | 0.2482558 | 0.2475793 |
| $d_{20}$ (nm) | 148.504 | 198.899 | 254.857 | 141.650 | 161.284 |
| When $n_1 \geqq n_{10}$, $n_{1m}$ = | 0.0327246 | 0.0427734 | 0.0473462 | 0.0318115 | 0.0212964 |
| When $n_1 < n_{10}$, $n_{1m}$ = | 0.0093958 | 0.0147302 | 0.0094299 | 0.0087695 | 0.0407813 |
| When $k_1 \geqq k_{10}$, $k_{1m}$ = | 0.0245129 | 0.0376636 | 0.0278931 | 0.0137170 | 0.0408545 |
| When $k_1 < k_{10}$, $k_{1m}$ = | 0.0384680 | 0.0381934 | 0.0341284 | 0.0285461 | 0.0259851 |
| When $d_1 \geqq d_{10}$, $d_{1m}$ (nm) = | 10.366 | 16.607 | 38.446 | 19.131 | 18.064 |
| When $d_1 < d_{10}$, $d_{1m}$ (nm) = | 2.389 | 3.804 | 2.614 | 2.661 | 24.299 |
| When $n_2 \geqq n_{20}$, $n_{2m}$ = | 0.0285376 | 0.0673352 | 0.0815320 | 0.0313904 | 0.1426208 |
| When $n_2 < n_{20}$, $n_{2m}$ = | 0.0743250 | 0.0929968 | 0.1051160 | 0.0237683 | 0.0535938 |
| When $k_2 \geqq k_{20}$, $k_{2m}$ = | 0.0198962 | 0.0371387 | 0.0465576 | 0.0076379 | 0.0976270 |
| When $k_2 < k_{20}$, $k_{2m}$ = | 0.0547290 | 0.0576892 | 0.0565930 | 0.0508740 | 0.0749768 |
| When $d_2 \geqq d_{20}$, $d_{2m}$ (nm) = | 8.585 | ∞ | ∞ | 6.981 | ∞ |
| When $d_2 < d_{20}$, $d_{2m}$ (nm) = | 13.959 | 13.822 | 33.284 | 7.469 | 13.904 |

-continued

| 1.1 < NA ≦ 1.2<br>75 < T ≦ 85 | | | | | |
|---|---|---|---|---|---|
| Case | 8-11 | 8-12 | 8-13 | 8-14 | 8-15 |
| $n_{10}$ | 1.6929156 | 1.6935338 | 1.6984313 | 1.6980068 | 1.6970347 |
| $k_{10}$ | 0.0637318 | 0.0581307 | 0.0697413 | 0.0633264 | 0.0530849 |
| $d_{10}$ (nm) | 217.693 | 214.870 | 266.256 | 265.782 | 275.682 |
| $n_{20}$ | 1.6856131 | 1.6920922 | 1.6871666 | 1.6912942 | 1.6884244 |
| $k_{20}$ | 0.1973081 | 0.1667488 | 0.2538157 | 0.2022310 | 0.1714348 |
| $d_{20}$ (nm) | 201.188 | 259.776 | 152.235 | 210.360 | 256.304 |
| When $n_1 \geqq n_{10}$, $n_{1m}$ = | 0.0321716 | 0.0471802 | 0.0486719 | 0.0738318 | 0.0569543 |
| When $n_1 < n_{10}$, $n_{1m}$ = | 0.0414331 | 0.0603931 | 0.0363989 | 0.0470300 | 0.0427893 |
| When $k_1 \geqq k_{10}$, $k_{1m}$ = | 0.0451428 | 0.0559961 | 0.0398804 | 0.0494763 | 0.0598206 |
| When $k_1 < k_{10}$, $k_{1m}$ = | 0.0289417 | 0.0378210 | 0.0291638 | 0.0345105 | 0.0376172 |
| When $d_1 \geqq d_{10}$, $d_{1m}$ (nm) = | ∞ | ∞ | ∞ | ∞ | ∞ |
| When $d_1 < d_{10}$, $d_{1m}$ (nm) = | 45.410 | 42.667 | 37.515 | 100.900 | 104.445 |
| When $n_2 \geqq n_{20}$, $n_{2m}$ = | 0.2377576 | 0.2179382 | 0.2594739 | 0.3590393 | 0.2768311 |
| When $n_2 < n_{20}$, $n_{2m}$ = | 0.0859351 | 0.1565027 | 0.2556433 | 0.2089795 | 0.2197266 |
| When $k_2 \geqq k_{20}$, $k_{2m}$ = | 0.1024292 | 0.1246008 | 0.1994592 | 0.2211169 | 0.1929004 |
| When $k_2 < k_{20}$, $k_{2m}$ = | 0.0656946 | 0.0632471 | 0.1014087 | 0.0895886 | 0.0738538 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 33.167 | 82.155 | 62.366 | 73.160 | 83.598 |

14/27

| 1.1 < NA ≦ 1.2<br>85 < T ≦ 95 | | | | | |
|---|---|---|---|---|---|
| Case | 9-01 | 9-02 | 9-03 | 9-04 | 9-05 |
| $n_{10}$ | 1.9192397 | 1.8910111 | 1.8874292 | 1.8928956 | 1.7266669 |
| $k_{10}$ | 0.1987767 | 0.1570861 | 0.1170062 | 0.0800147 | 0.0953661 |
| $d_{10}$ (nm) | 21.654 | 15.844 | 13.907 | 12.695 | 94.323 |
| $n_{20}$ | 1.8264016 | 1.6782576 | 1.7063011 | 1.7424852 | 1.6542284 |
| $k_{20}$ | 0.6189774 | 0.3828036 | 0.3024107 | 0.2571531 | 0.2869718 |
| $d_{20}$ (nm) | 76.882 | 146.288 | 201.867 | 254.323 | 139.595 |
| When $n_1 \geqq n_{10}$, $n_{1m}$ = | 0.0649170 | 0.0821021 | 0.0973254 | 0.1089844 | 0.0299609 |
| When $n_1 < n_{10}$, $n_{1m}$ = | 0.0262927 | 0.0442981 | 0.0631677 | 0.0721631 | 0.0018164 |
| When $k_1 \geqq k_{10}$, $k_{1m}$ = | 0.0313647 | 0.0611023 | 0.0836865 | 0.0928955 | 0.0075598 |
| When $k_1 < k_{10}$, $k_{1m}$ = | 0.0678699 | 0.0898816 | 0.1010254 | 0.0800147 | 0.0251917 |
| When $d_1 \geqq d_{10}$, $d_{1m}$ (nm) = | 4.482 | 5.181 | 6.239 | 6.859 | 9.178 |
| When $d_1 < d_{10}$, $d_{1m}$ (nm) = | 1.480 | 2.625 | 3.732 | 4.138 | 0.436 |
| When $n_2 \geqq n_{20}$, $n_{2m}$ = | 0.0987671 | 0.0845752 | 0.0932324 | 0.0997229 | 0.0068860 |
| When $n_2 < n_{20}$, $n_{2m}$ = | 0.1650610 | 0.1381567 | 0.1431714 | 0.1501294 | 0.0677319 |
| When $k_2 \geqq k_{20}$, $k_{2m}$ = | 0.1657446 | 0.0892700 | 0.0918542 | 0.0980688 | 0.0046692 |
| When $k_2 < k_{20}$, $k_{2m}$ = | 0.1121045 | 0.0937854 | 0.0873950 | 0.0830798 | 0.0530042 |
| When $d_2 \geqq d_{20}$, $d_{2m}$ (nm) = | ∞ | ∞ | ∞ | ∞ | 2.101 |
| When $d_2 < d_{20}$, $d_{2m}$ (nm) = | 12.789 | 29.518 | 73.873 | 87.951 | 11.267 |

| 1.1 < NA ≦ 1.2<br>85 < T ≦ 95 | | | | | |
|---|---|---|---|---|---|
| Case | 9-06 | 9-07 | 9-08 | 9-09 | 9-10 |
| $n_{10}$ | 1.7296393 | 1.7299249 | 1.6899362 | 1.6928826 | 1.6935628 |
| $k_{10}$ | 0.0805906 | 0.0737621 | 0.0817785 | 0.0657282 | 0.0590519 |
| $d_{10}$ (nm) | 94.242 | 94.784 | 208.164 | 217.665 | 215.464 |
| $n_{20}$ | 1.7097783 | 1.7252153 | 1.6924320 | 1.6832004 | 1.6914497 |
| $k_{20}$ | 0.2319224 | 0.1970612 | 0.2651701 | 0.2055611 | 0.1728158 |
| $d_{20}$ (nm) | 191.543 | 246.491 | 148.618 | 193.166 | 250.826 |
| When $n_1 \geqq n_{10}$, $n_{1m}$ = | 0.0403186 | 0.0454016 | 0.0167883 | 0.0332178 | 0.0456592 |
| When $n_1 < n_{10}$, $n_{1m}$ = | 0.0112720 | 0.0089185 | 0.0424597 | 0.0374463 | 0.0611377 |
| When $k_1 \geqq k_{10}$, $k_{1m}$ = | 0.0312561 | 0.0265295 | 0.0332300 | 0.0436560 | 0.0547620 |
| When $k_1 < k_{10}$, $k_{1m}$ = | 0.0359937 | 0.0340186 | 0.0176221 | 0.0271997 | 0.0369495 |
| When $d_1 \geqq d_{10}$, $d_{1m}$ (nm) = | 14.915 | 25.988 | 8.734 | ∞ | ∞ |
| When $d_1 < d_{10}$, $d_{1m}$ (nm) = | 2.867 | 2.423 | 22.681 | 45.245 | 43.081 |
| When $n_2 \geqq n_{20}$, $n_{2m}$ = | 0.0542737 | 0.0673303 | 0.1469031 | 0.2426758 | 0.2225391 |
| When $n_2 < n_{20}$, $n_{2m}$ = | 0.0873267 | 0.0993994 | 0.0330542 | 0.0887622 | 0.1544177 |
| When $k_2 \geqq k_{20}$, $k_{2m}$ = | 0.0292090 | 0.0400476 | 0.0700159 | 0.0962317 | 0.1187769 |
| When $k_2 < k_{20}$, $k_{2m}$ = | 0.0563428 | 0.0561450 | 0.0687061 | 0.0675110 | 0.0629883 |
| When $d_2 \geqq d_{20}$, $d_{2m}$ (nm) = | 39.648 | ∞ | ∞ | ∞ | ∞ |
| When $d_2 < d_{20}$, $d_{2m}$ (nm) = | 14.552 | 29.955 | 9.727 | 29.747 | 77.934 |

1.1 < NA ≦ 1.2
85 < T ≦ 95

15/27

| Case | 9-11 | 9-12 | 9-13 |
|---|---|---|---|
| $n_{10}$ | 1.6988269 | 1.6981501 | 1.6968464 |
| $k_{10}$ | 0.0719884 | 0.0650380 | 0.0544760 |
| $d_{10}$ (nm) | 266.949 | 266.102 | 275.663 |
| $n_{20}$ | 1.6930572 | 1.6910453 | 1.6860880 |
| $k_{20}$ | 0.2717519 | 0.2123559 | 0.1778694 |
| $d_{20}$ (nm) | 142.233 | 201.439 | 248.323 |
| When $n_1 \geqq n_{10}$, $n_{1m}$ = | 0.0467688 | 0.0728052 | 0.0574890 |
| When $n_1 < n_{10}$, $n_{1m}$ = | 0.0315735 | 0.0440601 | 0.0431165 |
| When $k_1 \geqq k_{10}$, $k_{1m}$ = | 0.0383911 | 0.0476294 | 0.0587781 |
| When $k_1 < k_{10}$, $k_{1m}$ = | 0.0284839 | 0.0337549 | 0.0370691 |
| When $d_1 \geqq d_{10}$, $d_{1m}$ (nm) = | ∞ | ∞ | ∞ |
| When $d_1 < d_{10}$, $d_{1m}$ (nm) = | 35.571 | 98.568 | 104.018 |
| When $n_2 \geqq n_{20}$, $n_{2m}$ = | 0.2475818 | 0.3536121 | 0.2819006 |
| When $n_2 < n_{20}$, $n_{2m}$ = | 0.2616077 | 0.2147424 | 0.2120007 |
| When $k_2 \geqq k_{20}$, $k_{2m}$ = | 0.1929529 | 0.2177991 | 0.1925061 |
| When $k_2 < k_{20}$, $k_{2m}$ = | 0.1103821 | 0.0937061 | 0.0749585 |
| When $d_2 \geqq d_{20}$, $d_{2m}$ (nm) = | ∞ | ∞ | ∞ |
| When $d_2 < d_{20}$, $d_{2m}$ (nm) = | 61.377 | 69.390 | 80.535 |

1.1 < NA ≦ 1.2
95 < T ≦ 105

| Case | 10-01 | 10-02 | 10-03 | 10-04 | 10-05 |
|---|---|---|---|---|---|
| $n_{10}$ | 1.9207610 | 1.9093240 | 1.8948938 | 1.8966282 | 1.7293323 |
| $k_{10}$ | 0.2195112 | 0.1610220 | 0.1257399 | 0.0900141 | 0.0843251 |
| $d_{10}$ (nm) | 22.312 | 16.027 | 13.855 | 12.530 | 93.974 |
| $n_{20}$ | 1.8258536 | 1.6981498 | 1.7003095 | 1.7305926 | 1.7018671 |
| $k_{20}$ | 0.6986358 | 0.4189775 | 0.3177305 | 0.2658040 | 0.2432029 |
| $d_{20}$ (nm) | 68.737 | 136.163 | 194.613 | 248.346 | 184.391 |
| When $n_1 \geqq n_{10}$, $n_{1m}$ = | 0.0601465 | 0.0788086 | 0.0949231 | 0.1082007 | 0.0364734 |
| When $n_1 < n_{10}$, $n_{1m}$ = | 0.0227283 | 0.0400269 | 0.0595679 | 0.0706311 | 0.0069092 |
| When $k_1 \geqq k_{10}$, $k_{1m}$ = | 0.0253723 | 0.0545032 | 0.0804407 | 0.0926099 | 0.0227478 |
| When $k_1 < k_{10}$, $k_{1m}$ = | 0.0628345 | 0.0889185 | 0.1005603 | 0.0900141 | 0.0311768 |
| When $d_1 \geqq d_{10}$, $d_{1m}$ (nm) = | 3.994 | 4.715 | 5.765 | 6.514 | 12.891 |
| When $d_1 < d_{10}$, $d_{1m}$ (nm) = | 1.248 | 2.209 | 3.348 | 3.879 | 1.711 |
| When $n_2 \geqq n_{20}$, $n_{2m}$ = | 0.0792419 | 0.0821826 | 0.0922205 | 0.0989185 | 0.0380920 |
| When $n_2 < n_{20}$, $n_{2m}$ = | 0.1602795 | 0.1375000 | 0.1411267 | 0.1492065 | 0.0806519 |
| When $k_2 \geqq k_{20}$, $k_{2m}$ = | 0.1589185 | 0.0905359 | 0.0891418 | 0.0944934 | 0.0182117 |
| When $k_2 < k_{20}$, $k_{2m}$ = | 0.1093127 | 0.0931641 | 0.0864453 | 0.0826196 | 0.0535706 |
| When $d_2 \geqq d_{20}$, $d_{2m}$ (nm) = | ∞ | ∞ | ∞ | ∞ | 26.631 |
| When $d_2 < d_{20}$, $d_{2m}$ (nm) = | 11.170 | 27.297 | 70.361 | 86.529 | 13.056 |

1.1 < NA ≦ 1.2
95 < T ≦ 105

16/27

| Case | 10-06 | 10-07 | 10-08 | 10-09 | 10-10 |
|---|---|---|---|---|---|
| $n_{10}$ | 1.7301568 | 1.6896128 | 1.6928686 | 1.6935394 | 1.6995193 |
| $k_{10}$ | 0.0757850 | 0.0845530 | 0.0680057 | 0.0604311 | 0.0747728 |
| $d_{10}$ (nm) | 94.458 | 207.994 | 217.789 | 215.751 | 266.467 |
| $n_{20}$ | 1.7237225 | 1.6930315 | 1.6806392 | 1.6908086 | 1.6953349 |
| $k_{20}$ | 0.2045935 | 0.2839311 | 0.2160083 | 0.1799717 | 0.2921202 |
| $d_{20}$ (nm) | 238.500 | 141.193 | 184.741 | 242.024 | 134.479 |
| When $n_1 \geqq n_{10}$, $n_{1m}$ = | 0.0430542 | 0.0132361 | 0.0331689 | 0.0442139 | 0.0436938 |
| When $n_1 < n_{10}$, $n_{1m}$ = | 0.0073706 | 0.0419458 | 0.0316418 | 0.0535156 | 0.0268311 |
| When $k_1 \geqq k_{10}$, $k_{1m}$ = | 0.0232617 | 0.0264368 | 0.0418604 | 0.0531323 | 0.0358801 |
| When $k_1 < k_{10}$, $k_{1m}$ = | 0.0323706 | 0.0142944 | 0.0250220 | 0.0355676 | 0.0274768 |
| When $d_1 \geqq d_{10}$, $d_{1m}$ (nm) = | 19.826 | 5.860 | ∞ | ∞ | ∞ |
| When $d_1 < d_{10}$, $d_{1m}$ (nm) = | 1.955 | 19.840 | 44.604 | 42.829 | 18.631 |
| When $n_2 \geqq n_{20}$, $n_{2m}$ = | 0.0534583 | 0.1398230 | 0.2538293 | 0.2308789 | 0.2386206 |
| When $n_2 < n_{20}$, $n_{2m}$ = | 0.0961475 | 0.0183801 | 0.0879700 | 0.1305579 | 0.2731067 |
| When $k_2 \geqq k_{20}$, $k_{2m}$ = | 0.0309888 | 0.0515918 | 0.0900964 | 0.1145776 | 0.1883105 |
| When $k_2 < k_{20}$, $k_{2m}$ = | 0.0550842 | 0.0676599 | 0.0668372 | 0.0642163 | 0.1153723 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 28.701 | 3.697 | 28.484 | 75.626 | 22.552 |

-continued

| 1.1 < NA ≦ 1.2 95 < T ≦ 105 | | |
|---|---|---|
| Case | 10-11 | 10-12 |
| $n_{10}$ | 1.6986281 | 1.6967467 |
| $k_{10}$ | 0.0669339 | 0.0559821 |
| $d_{10}$ (nm) | 265.290 | 275.562 |
| $n_{20}$ | 1.6902923 | 1.6844237 |
| $k_{20}$ | 0.2238725 | 0.1853984 |
| $d_{20}$ (nm) | 194.429 | 239.846 |
| When $n_1 \geqq n_{10}$, $n_{1m}$ = | 0.0728162 | 0.0573596 |
| When $n_1 < n_{10}$, $n_{1m}$ = | 0.0413391 | 0.0430261 |
| When $k_1 \geqq k_{10}$, $k_{1m}$ = | 0.0452283 | 0.0576135 |
| When $k_1 < k_{10}$, $k_{1m}$ = | 0.0327722 | 0.0361206 |
| When $d_1 \geqq d_{10}$, $d_{1m}$ (nm) = | ∞ | ∞ |
| When $d_1 < d_{10}$, $d_{1m}$ (nm) = | 90.187 | 103.212 |
| When $n_2 \geqq n_{20}$, $n_{2m}$ = | 0.3400000 | 0.2868152 |
| When $n_2 < n_{20}$, $n_{2m}$ = | 0.2235767 | 0.2105566 |
| When $k_2 \geqq k_{20}$, $k_{2m}$ = | 0.2178235 | 0.1919788 |
| When $k_2 < k_{20}$, $k_{2m}$ = | 0.0973718 | 0.0774072 |
| When $d_2 \geqq d_{20}$, $d_{2m}$ (nm) = | ∞ | ∞ |
| When $d_2 < d_{20}$, $d_{2m}$ (nm) = | 66.928 | 79.000 |

| 1.1 < NA ≦ 1.2 105 < T ≦ 115 | | | | | 17/27 |
|---|---|---|---|---|---|
| Case | 11-01 | 11-02 | 11-03 | 11-04 | 11-05 |
| $n_{10}$ | 1.9214172 | 1.9009993 | 1.8999222 | 1.7289797 | 1.7301397 |
| $k_{10}$ | 0.1753360 | 0.1351301 | 0.0954510 | 0.0876375 | 0.0779683 |
| $d_{10}$ (nm) | 15.452 | 13.611 | 12.469 | 93.472 | 94.062 |
| $n_{20}$ | 1.6804411 | 1.6899586 | 1.7262130 | 1.6943958 | 1.7208177 |
| $k_{20}$ | 0.4367098 | 0.3280314 | 0.2728992 | 0.2513033 | 0.2098777 |
| $d_{20}$ (nm) | 129.893 | 187.370 | 240.318 | 176.630 | 230.281 |
| When $n_1 \geqq n_{10}$, $n_{1m}$ = | 0.0769006 | 0.0933704 | 0.1067993 | 0.0330078 | 0.0410352 |
| When $n_1 < n_{10}$, $n_{1m}$ = | 0.0358716 | 0.0572852 | 0.0688867 | 0.0032751 | 0.0048413 |
| When $k_1 \geqq k_{10}$, $k_{1m}$ = | 0.0508276 | 0.0793042 | 0.0916321 | 0.0140979 | 0.0177686 |
| When $k_1 < k_{10}$, $k_{1m}$ = | 0.0888501 | 0.0996167 | 0.0954510 | 0.0244348 | 0.0282959 |
| When $d_1 \geqq d_{10}$, $d_{1m}$ (nm) = | 4.190 | 5.335 | 6.248 | 10.623 | 16.723 |
| When $d_1 < d_{10}$, $d_{1m}$ (nm) = | 1.818 | 3.051 | 3.681 | 0.787 | 1.251 |
| When $n_2 \geqq n_{20}$, $n_{2m}$ = | 0.0746777 | 0.0897961 | 0.0977148 | 0.0241113 | 0.0398962 |
| When $n_2 < n_{20}$, $n_{2m}$ = | 0.1378662 | 0.1400989 | 0.1490454 | 0.0784241 | 0.0968872 |
| When $k_2 \geqq k_{20}$, $k_{2m}$ = | 0.0793188 | 0.0846436 | 0.0920837 | 0.0085193 | 0.0207715 |
| When $k_2 < k_{20}$, $k_{2m}$ = | 0.0870862 | 0.0841199 | 0.0819739 | 0.0504102 | 0.0538818 |
| When $d_2 \geqq d_{20}$, $d_{2m}$ (nm) = | ∞ | ∞ | ∞ | 17.196 | ∞ |
| When $d_2 < d_{20}$, $d_{2m}$ (nm) = | 28.725 | 67.570 | 87.835 | 8.245 | 10.621 |

| 1.1 < NA ≦ 1.2 105 < T ≦ 115 | | | | |
|---|---|---|---|---|
| Case | 11-06 | 11-07 | 11-08 | 11-09 |
| $n_{10}$ | 1.6897075 | 1.6928599 | 1.6933895 | 1.6967442 |
| $k_{10}$ | 0.0859154 | 0.0698704 | 0.0619572 | 0.0572224 |
| $d_{10}$ (nm) | 206.600 | 218.100 | 215.832 | 275.439 |
| $n_{20}$ | 1.6860653 | 1.6784557 | 1.6904996 | 1.6838077 |
| $k_{20}$ | 0.2958058 | 0.2260347 | 0.1864736 | 0.1920294 |
| $d_{20}$ (nm) | 138.770 | 175.355 | 232.785 | 230.401 |
| When $n_1 \geqq n_{10}$, $n_{1m}$ = | 0.0125659 | 0.0312329 | 0.0432227 | 0.0564172 |
| When $n_1 < n_{10}$, $n_{1m}$ = | 0.0403125 | 0.0252893 | 0.0462402 | 0.0423401 |
| When $k_1 \geqq k_{10}$, $k_{1m}$ = | 0.0275024 | 0.0399890 | 0.0513623 | 0.0566272 |
| When $k_1 < k_{10}$, $k_{1m}$ = | 0.0207617 | 0.0230298 | 0.0339783 | 0.0347253 |
| When $d_1 \geqq d_{10}$, $d_{1m}$ (nm) = | 5.565 | ∞ | ∞ | ∞ |
| When $d_1 < d_{10}$, $d_{1m}$ (nm) = | 15.751 | 15.335 | 41.797 | 102.062 |
| When $n_2 \geqq n_{20}$, $n_{2m}$ = | 0.1134778 | 0.0778406 | 0.2416541 | 0.2945471 |
| When $n_2 < n_{20}$, $n_{2m}$ = | 0.0212585 | 0.0821313 | 0.1144373 | 0.2197937 |
| When $k_2 \geqq k_{20}$, $k_{2m}$ = | 0.0640356 | 0.0874658 | 0.1126599 | 0.1918506 |
| When $k_2 < k_{20}$, $k_{2m}$ = | 0.0823962 | 0.0630994 | 0.0642725 | 0.0810107 |
| When $d_2 \geqq d_{20}$, $d_{2m}$ (nm) = | ∞ | ∞ | ∞ | ∞ |
| When $d_2 < d_{20}$, $d_{2m}$ (nm) = | 4.190 | 25.396 | 50.058 | 79.342 |

1.1 < NA ≦ 1.2
115 < T ≦ 125

18/27

| Case | 12-01 | 12-02 | 12-03 | 12-04 | 12-05 |
|---|---|---|---|---|---|
| $n_{10}$ | 1.9907624 | 1.9229056 | 1.9003143 | 1.9049048 | 1.7296380 |
| $k_{10}$ | 0.2658843 | 0.1943367 | 0.1434936 | 0.0972823 | 0.0899801 |
| $d_{10}$ (nm) | 16.877 | 14.896 | 13.590 | 12.362 | 93.128 |
| $n_{20}$ | 1.6777634 | 1.6435696 | 1.6791032 | 1.7269066 | 1.6935089 |
| $k_{20}$ | 0.7245088 | 0.4392836 | 0.3336019 | 0.2779612 | 0.2572784 |
| $d_{20}$ (nm) | 66.041 | 124.711 | 179.139 | 230.763 | 167.093 |
| When $n_1 \geqq n_{10}$, $n_{1m}$ = | 0.0641870 | 0.0750415 | 0.0917773 | 0.1066382 | 0.0315833 |
| When $n_1 < n_{10}$, $n_{1m}$ = | 0.0020520 | 0.0319995 | 0.0559583 | 0.0680188 | 0.0015344 |
| When $k_1 \geqq k_{10}$, $k_{1m}$ = | 0.0028235 | 0.0481201 | 0.0790771 | 0.0912170 | 0.0085083 |
| When $k_1 < k_{10}$, $k_{1m}$ = | 0.0445386 | 0.0882983 | 0.0964502 | 0.0972823 | 0.0192114 |
| When $d_1 \geqq d_{10}$, $d_{1m}$ (nm) = | 2.498 | 3.792 | 5.133 | 6.031 | 9.518 |
| When $d_1 < d_{10}$, $d_{1m}$ (nm) = | 0.080 | 1.544 | 2.939 | 3.522 | 0.359 |
| When $n_2 \geqq n_{20}$, $n_{2m}$ = | 0.0064478 | 0.0655054 | 0.0877441 | 0.0975110 | 0.0182434 |
| When $n_2 < n_{20}$, $n_{2m}$ = | 0.1131567 | 0.1382288 | 0.1415613 | 0.1512451 | 0.0817859 |
| When $k_2 \geqq k_{20}$, $k_{2m}$ = | 0.0073132 | 0.0658899 | 0.0812854 | 0.0911096 | 0.0040100 |
| When $k_2 < k_{20}$, $k_{2m}$ = | 0.0730591 | 0.0825134 | 0.0835315 | 0.0828308 | 0.0509155 |
| When $d_2 \geqq d_{20}$, $d_{2m}$ (nm) = | 10.610 | ∞ | ∞ | ∞ | 14.228 |
| When $d_2 < d_{20}$, $d_{2m}$ (nm) = | 2.901 | 33.267 | 66.014 | 90.382 | 3.593 |

1.1 < NA ≦ 1.2
115 < T ≦ 125

| Case | 12-06 | 12-07 | 12-08 | 12-09 | 12-10 |
|---|---|---|---|---|---|
| $n_{10}$ | 1.7305285 | 1.6927568 | 1.6930586 | 1.6939267 | 1.6970265 |
| $k_{10}$ | 0.0799609 | 0.0712762 | 0.0635805 | 0.0583165 | 0.0526106 |
| $d_{10}$ (nm) | 93.907 | 218.499 | 215.646 | 213.162 | 273.430 |
| $n_{20}$ | 1.7196209 | 1.6781695 | 1.6903056 | 1.6934648 | 1.6908020 |
| $k_{20}$ | 0.2133806 | 0.2348207 | 0.0196344 | 0.1626221 | 0.1682270 |
| $d_{20}$ (nm) | 220.978 | 164.929 | 223.237 | 282.414 | 277.869 |
| When $n_1 \geqq n_{10}$, $n_{1m}$ = | 0.0401038 | 0.0280627 | 0.0367090 | 0.0617249 | 0.0695837 |
| When $n_1 < n_{10}$, $n_{1m}$ = | 0.0020569 | 0.0197937 | 0.0422595 | 0.0578455 | 0.0506836 |
| When $k_1 \geqq k_{10}$, $k_{1m}$ = | 0.0099243 | 0.0365027 | 0.0497717 | 0.0551318 | 0.0584485 |
| When $k_1 < k_{10}$, $k_{1m}$ = | 0.0219006 | 0.0215491 | 0.0327808 | 0.0369946 | 0.0381665 |
| When $d_1 \geqq d_{10}$, $d_{1m}$ (nm) = | 15.192 | ∞ | ∞ | ∞ | ∞ |
| When $d_1 < d_{10}$, $d_{1m}$ (nm) = | 0.519 | 8.747 | 40.119 | 117.750 | 120.098 |
| When $n_2 \geqq n_{20}$, $n_{2m}$ = | 0.0185596 | 0.0673242 | 0.2516089 | 0.2302490 | 0.2819116 |
| When $n_2 < n_{20}$, $n_{2m}$ = | 0.1000403 | 0.0715613 | 0.0981323 | 0.1425830 | 0.2021863 |
| When $k_2 \geqq k_{20}$, $k_{2m}$ = | 0.0105981 | 0.0901270 | 0.1132849 | 0.1293579 | 0.1967712 |
| When $k_2 < k_{20}$, $k_{2m}$ = | 0.0546692 | 0.0589612 | 0.0634204 | 0.0595032 | 0.0741577 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 3.602 | 19.014 | 34.397 | 79.670 | 93.763 |

1.1 < NA ≦ 1.2
125 < T ≦ 135

19/27

| Case | 13-01 | 13-02 | 13-03 | 13-04 | 13-05 |
|---|---|---|---|---|---|
| $n_{10}$ | 1.8968086 | 1.9070303 | 1.9016797 | 1.7329805 | 1.7161015 |
| $k_{10}$ | 0.1457981 | 0.0954881 | 0.0905797 | 0.0916823 | 0.0708259 |
| $d_{10}$ (nm) | 14.128 | 12.717 | 10.946 | 93.296 | 94.224 |
| $n_{20}$ | 1.6815336 | 1.7369802 | 1.7110902 | 1.7056329 | 1.6780965 |
| $k_{20}$ | 0.3444919 | 0.2856144 | 0.2381911 | 0.2670261 | 0.1788543 |
| $d_{20}$ (nm) | 167.613 | 218.968 | 280.601 | 155.076 | 274.399 |
| When $n_1 \geqq n_{10}$, $n_{1m}$ = | 0.0900439 | 0.1048657 | 0.1226746 | 0.0324280 | 0.0442737 |
| When $n_1 < n_{10}$, $n_{1m}$ = | 0.0549670 | 0.0656934 | 0.0785547 | 0.0012561 | 0.0190796 |
| When $k_1 \geqq k_{10}$, $k_{1m}$ = | 0.0772925 | 0.0877979 | 0.1031616 | 0.0075342 | 0.0396033 |
| When $k_1 < k_{10}$, $k_{1m}$ = | 0.0920227 | 0.0954881 | 0.0905767 | 0.0177710 | 0.0448962 |
| When $d_1 \geqq d_{10}$, $d_{1m}$ (nm) = | 5.183 | 6.019 | 6.438 | 9.368 | 34.945 |
| When $d_1 < d_{10}$, $d_{1m}$ (nm) = | 2.993 | 3.453 | 3.787 | 0.285 | 6.328 |
| When $n_2 \geqq n_{20}$, $n_{2m}$ = | 0.0877783 | 0.0991382 | 0.1111206 | 0.0250049 | 0.0400305 |
| When $n_2 < n_{20}$, $n_{2m}$ = | 0.1446509 | 0.1532288 | 0.1362280 | 0.0542139 | 0.1016638 |
| When $k_2 \geqq k_{20}$, $k_{2m}$ = | 0.0828516 | 0.0936658 | 0.0912720 | 0.0036011 | 0.0409863 |
| When $k_2 < k_{20}$, $k_{2m}$ = | 0.0884485 | 0.0865161 | 0.0819922 | 0.0570435 | 0.0508105 |
| When $d_2 \geqq d_{20}$, $d_{2m}$ (nm) = | ∞ | ∞ | ∞ | 16.698 | ∞ |
| When $d_2 < d_{20}$, $d_{2m}$ (nm) = | 63.831 | 86.162 | 129.598 | 1.884 | 53.218 |

-continued

| | 1.1 < NA ≦ 1.2<br>125 < T ≦ 135 | | | |
|---|---|---|---|---|
| Case | 13-06 | 13-07 | 13-08 | 13-09 |
| $n_{10}$ | 1.6922053 | 1.6924923 | 1.6935584 | 1.6967916 |
| $k_{10}$ | 0.0726320 | 0.0653867 | 0.0598502 | 0.0533770 |
| $d_{10}$ (nm) | 218.650 | 214.871 | 212.072 | 273.133 |
| $n_{20}$ | 1.6800076 | 1.6897434 | 1.6927128 | 1.6904661 |
| $k_{20}$ | 0.2436881 | 0.1959626 | 0.1654173 | 0.1709158 |
| $d_{20}$ (nm) | 154.426 | 214.392 | 274.211 | 268.389 |
| When $n_1 \geqq n_{10}$, $n_{1m}$ = | 0.0253528 | 0.0324316 | 0.0605591 | 0.0715686 |
| When $n_1 < n_{10}$, $n_{1m}$ = | 0.0165808 | 0.0420508 | 0.0560315 | 0.0516870 |
| When $k_1 \geqq k_{10}$, $k_{1m}$ = | 0.0318250 | 0.0487207 | 0.0537805 | 0.0575159 |
| When $k_1 < k_{10}$, $k_{1m}$ = | 0.0192969 | 0.0323987 | 0.0370093 | 0.0369739 |
| When $d_1 \geqq d_{10}$, $d_{1m}$ (nm) = | 16.057 | ∞ | ∞ | ∞ |
| When $d_1 < d_{10}$, $d_{1m}$ (nm) = | 7.067 | 37.738 | 59.298 | 116.516 |
| When $n_2 \geqq n_{20}$, $n_{2m}$ = | 0.0399280 | 0.1505237 | 0.2298792 | 0.2878638 |
| When $n_2 < n_{20}$, $n_{2m}$ = | 0.0570007 | 0.0843848 | 0.1463525 | 0.2044592 |
| When $k_2 \geqq k_{20}$, $k_{2m}$ = | 0.0949915 | 0.1174060 | 0.1308350 | 0.1989417 |
| When $k_2 < k_{20}$, $k_{2m}$ = | 0.0566089 | 0.0642029 | 0.0608850 | 0.0765625 |
| When $d_2 \geqq d_{20}$, $d_{2m}$ (nm) = | ∞ | ∞ | ∞ | ∞ |
| When $d_2 < d_{20}$, $d_{2m}$ (nm) = | 13.778 | 24.202 | 76.110 | 90.681 |

| | 1.1 < NA ≦ 1.2<br>135 < T ≦ 145 | | | | |
|---|---|---|---|---|---|
| | | | | | 20/27 |
| Case | 14-01 | 14-02 | 14-03 | 14-04 | 14-05 |
| $n_{10}$ | 1.8931613 | 1.9086798 | 1.8957546 | 1.7383088 | 1.7163304 |
| $k_{10}$ | 0.1437464 | 0.0925277 | 0.1021679 | 0.0935643 | 0.0717315 |
| $d_{10}$ (nm) | 15.228 | 13.463 | 11.154 | 93.735 | 94.330 |
| $n_{20}$ | 1.6981871 | 1.7547782 | 1.6965397 | 1.7255584 | 1.6763108 |
| $k_{20}$ | 0.3648670 | 0.2987738 | 0.2414267 | 0.2828024 | 0.1832109 |
| $d_{20}$ (nm) | 154.635 | 206.696 | 273.752 | 142.972 | 265.207 |
| When $n_1 \geqq n_{10}$, $n_{1m}$ = | 0.0870447 | 0.1008179 | 0.1206177 | 0.0337476 | 0.0440930 |
| When $n_1 < n_{10}$, $n_{1m}$ = | 0.0533362 | 0.0620862 | 0.0768750 | 0.0007715 | 0.0201111 |
| When $k_1 \geqq k_{10}$, $k_{1m}$ = | 0.0736633 | 0.0819543 | 0.1022961 | 0.0054871 | 0.0403162 |
| When $k_1 < k_{10}$, $k_{1m}$ = | 0.0884546 | 0.0925277 | 0.1021679 | 0.0149585 | 0.0433484 |
| When $d_1 \geqq d_{10}$, $d_{1m}$ (nm) = | 5.366 | 6.051 | 6.474 | 9.539 | 32.676 |
| When $d_1 < d_{10}$, $d_{1m}$ (nm) = | 3.110 | 3.392 | 3.792 | 0.168 | 6.615 |
| When $n_2 \geqq n_{20}$, $n_{2m}$ = | 0.0905371 | 0.1017932 | 0.1131152 | 0.0305115 | 0.0401709 |
| When $n_2 < n_{20}$, $n_{2m}$ = | 0.1457471 | 0.1521191 | 0.1323865 | 0.0291541 | 0.0974780 |
| When $k_2 \geqq k_{20}$, $k_{2m}$ = | 0.0891467 | 0.0990112 | 0.0895691 | 0.0025757 | 0.0411877 |
| When $k_2 < k_{20}$, $k_{2m}$ = | 0.0964551 | 0.0905688 | 0.0826367 | 0.0641370 | 0.0518066 |
| $d_{2m}$ (nm) = | ∞ | ∞ | ∞ | 18.295 | ∞ |
| When $d_2 < d_{20}$, $d_{2m}$ (nm) = | 52.833 | 78.923 | 127.644 | 0.825 | 36.894 |

| | 1.1 < NA ≦ 1.2<br>135 < T ≦ 145 | | | | |
|---|---|---|---|---|---|
| Case | 14-06 | 14-07 | 14-08 | 14-09 | 14-10 |
| $n_{10}$ | 1.7036586 | 1.6919166 | 1.6911838 | 1.6942185 | 1.6965335 |
| $k_{10}$ | 0.0640636 | 0.0672926 | 0.0743991 | 0.0545821 | 0.0539924 |
| $d_{10}$ (nm) | 161.836 | 213.353 | 218.060 | 211.644 | 273.036 |
| $n_{20}$ | 1.6842842 | 1.6889376 | 1.6805827 | 1.6930391 | 1.6894839 |
| $k_{20}$ | 0.1670348 | 0.2002175 | 0.2524809 | 0.1466022 | 0.1738185 |
| $d_{20}$ (nm) | 260.021 | 207.074 | 145.761 | 321.654 | 259.712 |
| When $n_1 \geqq n_{10}$, $n_{1m}$ = | 0.0516992 | 0.0312610 | 0.0190637 | 0.0570044 | 0.0731799 |
| When $n_1 < n_{10}$, $n_{1m}$ = | 0.0203174 | 0.0465454 | 0.0159326 | 0.0625537 | 0.0527673 |
| When $k_1 \geqq k_{10}$, $k_{1m}$ = | 0.0380640 | 0.0462256 | 0.0279297 | 0.0552405 | 0.0568201 |
| When $k_1 < k_{10}$, $k_{1m}$ = | 0.0285486 | 0.0325867 | 0.0168274 | 0.0356702 | 0.0362610 |
| When $d_1 \geqq d_{10}$, $d_{1m}$ (nm) = | ∞ | ∞ | 14.138 | ∞ | ∞ |
| When $d_1 < d_{10}$, $d_{1m}$ (nm) = | 9.049 | 34.771 | 6.640 | 127.140 | 114.401 |
| When $n_2 \geqq n_{20}$, $n_{2m}$ = | 0.0375000 | 0.2427722 | 0.0321863 | 0.2263916 | 0.2897119 |
| When $n_2 < n_{20}$, $n_{2m}$ = | 0.0655225 | 0.0802039 | 0.0495178 | 0.1240515 | 0.2069202 |
| When $k_2 \geqq k_{20}$, $k_{2m}$ = | 0.0303979 | 0.1193311 | 0.0877856 | 0.1337305 | 0.1994678 |
| When $k_2 < k_{20}$, $k_{2m}$ = | 0.0483228 | 0.0645337 | 0.0566711 | 0.0596594 | 0.0781824 |
| When $d_2 \geqq d_{20}$, $d_{2m}$ (nm) = | 29.338 | ∞ | 15.130 | ∞ | ∞ |
| When $d_2 < d_{20}$, $d_{2m}$ (nm) = | 27.139 | 22.617 | 11.351 | 93.024 | 88.496 |

| 1.1 < NA ≦ 1.2<br>145 < T ≦ 155 | | | | | 21/27 |
|---|---|---|---|---|---|
| Case | 15-01 | 15-02 | 15-03 | 15-04 | 15-05 |
| $n_{10}$ | 1.8962402 | 1.9162756 | 1.8972293 | 1.7171631 | 1.7039366 |
| $k_{10}$ | 0.1446868 | 0.0920008 | 0.1039493 | 0.0735355 | 0.0654419 |
| $d_{10}$ (nm) | 16.058 | 13.917 | 11.503 | 94.241 | 161.496 |
| $n_{20}$ | 1.7149739 | 1.7705409 | 1.6986687 | 1.6756859 | 1.6849902 |
| $k_{20}$ | 0.3909951 | 0.3160160 | 0.2516185 | 0.1901883 | 0.1728826 |
| $d_{20}$ (nm) | 143.691 | 196.340 | 264.437 | 256.660 | 251.490 |
| When $n_1 \geqq n_{10}$, $n_{1m}$ = | 0.0837915 | 0.0974329 | 0.1166235 | 0.0430017 | 0.0505029 |
| When $n_1 < n_{10}$, $n_{1m}$ = | 0.0514441 | 0.0592371 | 0.0737268 | 0.0188135 | 0.0178369 |
| When $k_1 \geqq k_{10}$, $k_{1m}$ = | 0.0700403 | 0.0772290 | 0.0977893 | 0.0384546 | 0.0357764 |
| When $k_1 < k_{10}$, $k_{1m}$ = | 0.0675134 | 0.0920008 | 0.1039493 | 0.0432324 | 0.0268848 |
| When $d_1 \geqq d_{10}$, $d_{1m}$ (nm) = | 5.323 | 5.852 | 6.362 | 32.246 | ∞ |
| When $d_1 < d_{10}$, $d_{1m}$ (nm) = | 3.062 | 3.205 | 3.699 | 5.981 | 7.380 |
| When $n_2 \geqq n_{20}$, $n_{2m}$ = | 0.0928162 | 0.1031079 | 0.1115686 | 0.0381177 | 0.0304712 |
| When $n_2 < n_{20}$, $n_{2m}$ = | 0.1435938 | 0.1490808 | 0.1351062 | 0.0929431 | 0.0597266 |
| When $k_2 \geqq k_{20}$, $k_{2m}$ = | 0.0944385 | 0.1027820 | 0.0897864 | 0.0382104 | 0.0277966 |
| When $k_2 < k_{20}$, $k_{2m}$ = | 0.0995911 | 0.0924023 | 0.0838245 | 0.0516921 | 0.0462678 |
| When $d_2 \geqq d_{20}$, $d_{2m}$ (nm) = | ∞ | ∞ | ∞ | ∞ | 23.493 |
| When $d_2 < d_{20}$, $d_{2m}$ (nm) = | 30.912 | 72.930 | 96.188 | 31.536 | 23.876 |

| 1.1 < NA ≦ 1.2<br>145 < T ≦ 155 | | | | |
|---|---|---|---|---|
| Case | 15-06 | 15-07 | 15-08 | 15-09 |
| $n_{10}$ | 1.6903081 | 1.6915399 | 1.6931731 | 1.6963857 |
| $k_{10}$ | 0.0771344 | 0.0690906 | 0.0615887 | 0.0546865 |
| $d_{10}$ (nm) | 216.305 | 212.338 | 211.917 | 273.170 |
| $n_{20}$ | 1.6786590 | 1.6881028 | 1.6918937 | 1.6879125 |
| $k_{20}$ | 0.2613948 | 0.2062149 | 0.1729009 | 0.1780863 |
| $d_{20}$ (nm) | 139.207 | 199.770 | 256.415 | 251.444 |
| When $n_1 \geqq n_{10}$, $n_{1m}$ = | 0.0195569 | 0.0307166 | 0.0591064 | 0.0699243 |
| When $n_1 < n_{10}$, $n_{1m}$ = | 0.0132800 | 0.0523120 | 0.0554614 | 0.0530347 |
| When $k_1 \geqq k_{10}$, $k_{1m}$ = | 0.0269897 | 0.04450159 | 0.0517236 | 0.0562524 |
| When $k_1 < k_{10}$, $k_{1m}$ = | 0.0101050 | 0.0313696 | 0.0355261 | 0.0367395 |
| When $d_1 \geqq d_{10}$, $d_{1m}$ (nm) = | 14.222 | ∞ | ∞ | ∞ |
| When $d_1 < d_{10}$, $d_{1m}$ (nm) = | 6.108 | 32.462 | 54.157 | 113.606 |
| When $n_2 \geqq n_{20}$, $n_{2m}$ = | 0.0246814 | 0.2330432 | 0.2286047 | 0.2890198 |
| When $n_2 < n_{20}$, $n_{2m}$ = | 0.0598340 | 0.0841870 | 0.1451465 | 0.2088098 |
| When $k_2 \geqq k_{20}$, $k_{2m}$ = | 0.0678235 | 0.1160620 | 0.1277832 | 0.1979041 |
| When $k_2 < k_{20}$, $k_{2m}$ = | 0.0514465 | 0.0682922 | 0.0664624 | 0.0771411 |
| When $d_2 \geqq d_{20}$, $d_{2m}$ (nm) = | 11.437 | ∞ | ∞ | ∞ |
| When $d_2 < d_{20}$, $d_{2m}$ (nm) = | 12.498 | 26.276 | 74.225 | 84.013 |

| 1.1 < NA ≦ 1.2<br>155 < T ≦ 165 | | | | | 22/27 |
|---|---|---|---|---|---|
| Case | 16-01 | 16-02 | 16-03 | 16-04 | 16-05 |
| $n_{10}$ | 1.9078860 | 1.9270939 | 1.9009914 | 1.7182026 | 1.7037276 |
| $k_{10}$ | 0.1508452 | 0.0963716 | 0.1079582 | 0.0759211 | 0.0670447 |
| $d_{10}$ (nm) | 16.208 | 13.863 | 11.657 | 93.910 | 160.452 |
| $n_{20}$ | 1.7232027 | 1.7738090 | 1.6981472 | 1.6754262 | 1.6860603 |
| $k_{20}$ | 0.4201511 | 0.3331580 | 0.2622250 | 0.1979303 | 0.1785858 |
| $d_{20}$ (nm) | 134.826 | 188.374 | 256.036 | 248.261 | 243.357 |
| When $n_1 \geqq n_{10}$, $n_{1m}$ = | 0.0807556 | 0.0955676 | 0.1136938 | 0.0410315 | 0.0482739 |
| When $n_1 < n_{10}$, $n_{1m}$ = | 0.0492212 | 0.0570374 | 0.0706995 | 0.0157471 | 0.0155554 |
| When $k_1 \geqq k_{10}$, $k_{1m}$ = | 0.0660083 | 0.0745215 | 0.0946643 | 0.0342603 | 0.0302344 |
| When $k_1 < k_{10}$, $k_{1m}$ = | 0.0885791 | 0.0963716 | 0.1079582 | 0.0433301 | 0.0248120 |
| When $d_1 \geqq d_{10}$, $d_{1m}$ (nm) = | 4.938 | 5.477 | 6.133 | 23.554 | ∞ |
| When $d_1 < d_{10}$, $d_{1m}$ (nm) = | 2.790 | 2.920 | 3.507 | 4.784 | 6.051 |
| When $n_2 \geqq n_{20}$, $n_{2m}$ = | 0.0912793 | 0.1022461 | 0.1087073 | 0.0334387 | 0.0216223 |
| When $n_2 < n_{20}$, $n_{2m}$ = | 0.1401233 | 0.1468384 | 0.1373413 | 0.0900842 | 0.0519312 |
| When $k_2 \geqq k_{20}$, $k_{2m}$ = | 0.0948535 | 0.1014905 | 0.0883215 | 0.0321790 | 0.0239026 |
| When $k_2 < k_{20}$, $k_{2m}$ = | 0.0976477 | 0.0917578 | 0.0837280 | 0.0507922 | 0.0474658 |
| When $d_2 \geqq d_{20}$, $d_{2m}$ (nm) = | ∞ | ∞ | ∞ | ∞ | 19.461 |
| When $d_2 < d_{20}$, $d_{2m}$ (nm) = | 27.641 | 68.596 | 90.537 | 29.710 | 21.259 |

-continued

| $1.1 < NA \leqq 1.2$ $155 < T \leqq 165$ Case | 16-06 | 16-07 | 16-08 | 16-09 |
|---|---|---|---|---|
| $n_{10}$ | 1.6914048 | 1.6932944 | 1.6971949 | 1.6963748 |
| $k_{10}$ | 0.0705280 | 0.0619823 | 0.0758678 | 0.0557064 |
| $d_{10}$ (nm) | 212.904 | 213.027 | 268.193 | 273.316 |
| $n_{20}$ | 1.6862460 | 1.6912789 | 1.6840809 | 1.6860970 |
| $k_{20}$ | 0.2142065 | 0.1784688 | 0.2789945 | 0.1841499 |
| $d_{20}$ (nm) | 190.804 | 246.475 | 135.240 | 242.973 |
| When $n_1 \geqq n_{10}$, $n_{1m}$ = | 0.0288806 | 0.0598267 | 0.0616260 | 0.0706445 |
| When $n_1 < n_{10}$, $n_{1m}$ = | 0.0419739 | 0.0573401 | 0.0320642 | 0.0521814 |
| When $k_1 \geqq k_{10}$, $k_{1m}$ = | 0.0434460 | 0.0510059 | 0.0409424 | 0.0555554 |
| When $k_1 < k_{10}$, $k_{1m}$ = | 0.0304883 | 0.0343054 | 0.0217456 | 0.0379871 |
| When $d_1 \geqq d_{10}$, $d_{1m}$ (nm) = | ∞ | ∞ | ∞ | ∞ |
| When $d_1 < d_{10}$, $d_{1m}$ (nm) = | 31.951 | 51.898 | 19.489 | 113.780 |
| When $n_2 \geqq n_{20}$, $n_{2m}$ = | 0.2364844 | 0.2370337 | 0.2474512 | 0.2927136 |
| When $n_2 < n_{20}$, $n_{2m}$ = | 0.0869409 | 0.1403040 | 0.2270129 | 0.2100537 |
| When $k_2 \geqq k_{20}$, $k_{2m}$ = | 0.1067354 | 0.1223047 | 0.1872974 | 0.1959326 |
| When $k_2 < k_{20}$, $k_{2m}$ = | 0.0726953 | 0.0652295 | 0.1039441 | 0.0773071 |
| When $d_2 \geqq d_{20}$, $d_{2m}$ (nm) = | ∞ | ∞ | ∞ | ∞ |
| When $d_2 < d_{20}$, $d_{2m}$ (nm) = | 34.355 | 75.037 | 36.050 | 81.214 |

23/27

| $1.1 < NA \leqq 1.2$ $165 < T \leqq 175$ Case | 17-01 | 17-02 | 17-03 | 17-04 | 17-05 |
|---|---|---|---|---|---|
| $n_{10}$ | 1.9345747 | 1.9100928 | 1.9218874 | 1.7188695 | 1.7031385 |
| $k_{10}$ | 0.1082213 | 0.1149883 | 0.1634556 | 0.0782891 | 0.0685384 |
| $d_{10}$ (nm) | 13.373 | 11.317 | 15.608 | 93.463 | 159.293 |
| $n_{20}$ | 1.7554016 | 1.6916658 | 1.7091703 | 1.6745648 | 1.6866422 |
| $k_{20}$ | 0.3434593 | 0.2694423 | 0.4402763 | 0.2040549 | 0.1829170 |
| $d_{20}$ (nm) | 183.042 | 248.707 | 128.647 | 239.614 | 234.977 |
| When $n_1 \geqq n_{10}$, $n_{1m}$ = | 0.0953882 | 0.1140894 | 0.0784595 | 0.0386694 | 0.0460681 |
| When $n_1 < n_{10}$, $n_{1m}$ = | 0.0550098 | 0.0698865 | 0.0459766 | 0.0121814 | 0.0133398 |
| When $k_1 \geqq k_{10}$, $k_{1m}$ = | 0.0742224 | 0.0954895 | 0.0620923 | 0.0290149 | 0.0227319 |
| When $k_1 < k_{10}$, $k_{1m}$ = | 0.1051392 | 0.1149883 | 0.0876528 | 0.0413110 | 0.0203333 |
| When $d_1 \geqq d_{10}$, $d_{1m}$ (nm) = | 5.105 | 5.733 | 4.388 | 16.599 | ∞ |
| When $d_1 < d_{10}$, $d_{1m}$ (nm) = | 2.628 | 3.226 | 2.376 | 3.551 | 4.956 |
| When $n_2 \geqq n_{20}$, $n_{2m}$ = | 0.0995532 | 0.1061743 | 0.0849316 | 0.0275488 | 0.0132971 |
| When $n_2 < n_{20}$, $n_{2m}$ = | 0.1453674 | 0.1364294 | 0.1372107 | 0.0877344 | 0.0449780 |
| When $k_2 \geqq k_{20}$, $k_{2m}$ = | 0.0936926 | 0.0848206 | 0.0864539 | 0.0249731 | 0.0152673 |
| When $k_2 < k_{20}$, $k_{2m}$ = | 0.0884937 | 0.0821777 | 0.0909717 | 0.0487439 | 0.0459656 |
| When $d_2 \geqq d_{20}$, $d_{2m}$ (nm) = | ∞ | ∞ | ∞ | ∞ | 6.034 |
| When $d_2 < d_{20}$, $d_{2m}$ (nm) = | 65.841 | 91.823 | 28.009 | 30.737 | 19.612 |

| $1.1 < NA \leqq 1.2$ $165 < T \leqq 175$ Case | 17-06 | 17-07 | 17-08 | 17-09 |
|---|---|---|---|---|
| $n_{10}$ | 1.6934237 | 1.6934242 | 1.6985617 | 1.6963947 |
| $k_{10}$ | 0.0627890 | 0.0627998 | 0.0777714 | 0.0569261 |
| $d_{10}$ (nm) | 213.592 | 213.572 | 264.836 | 273.344 |
| $n_{20}$ | 1.6908665 | 1.6907829 | 1.6854326 | 1.6845211 |
| $k_{20}$ | 0.1844160 | 0.1843934 | 0.2962369 | 0.1907955 |
| $d_{20}$ (nm) | 236.853 | 236.891 | 131.733 | 233.824 |
| When $n_1 \geqq n_{10}$, $n_{1m}$ = | 0.0574976 | 0.0574353 | 0.0522168 | 0.0698511 |
| When $n_1 < n_{10}$, $n_{1m}$ = | 0.0521313 | 0.0521704 | 0.0296216 | 0.0506372 |
| When $k_1 \geqq k_{10}$, $k_{1m}$ = | 0.0502954 | 0.0502856 | 0.0369763 | 0.0547412 |
| When $k_1 < k_{10}$, $k_{1m}$ = | 0.0341577 | 0.0341846 | 0.0234509 | 0.0366406 |
| When $d_1 \geqq d_{10}$, $d_{1m}$ (nm) = | ∞ | ∞ | ∞ | ∞ |
| When $d_1 < d_{10}$, $d_{1m}$ (nm) = | 50.284 | 50.272 | 18.034 | 113.943 |
| When $n_2 \geqq n_{20}$, $n_{2m}$ = | 0.2442261 | 0.2441003 | 0.2108032 | 0.3045251 |
| When $n_2 < n_{20}$, $n_{2m}$ = | 0.1394958 | 0.1395251 | 0.2567761 | 0.2115186 |
| When $k_2 \geqq k_{20}$, $k_{2m}$ = | 0.1187415 | 0.1187610 | 0.1954675 | 0.1950378 |
| When $k_2 < k_{20}$, $k_{2m}$ = | 0.0660913 | 0.0660889 | 0.1128296 | 0.0795361 |
| When $d_2 \geqq d_{20}$, $d_{2m}$ (nm) = | ∞ | ∞ | ∞ | ∞ |
| When $d_2 < d_{20}$, $d_{2m}$ (nm) = | 75.634 | 75.652 | 33.470 | 80.767 |

| 1.1 < NA ≦ 1.2<br>175 < T ≦ 185 | | | | | 24/27 |
|---|---|---|---|---|---|
| Case | 18-01 | 18-02 | 18-03 | 18-04 | 18-05 |
| $n_{10}$ | 1.9329388 | 1.9368237 | 1.9141366 | 1.7191879 | 1.7029035 |
| $k_{10}$ | 0.1795701 | 0.1224596 | 0.1196035 | 0.0801581 | 0.0699625 |
| $d_{10}$ (nm) | 14.789 | 12.921 | 11.206 | 93.133 | 158.805 |
| $n_{20}$ | 1.6812994 | 1.7305084 | 1.6882344 | 1.6734445 | 1.6865116 |
| $k_{20}$ | 0.4483886 | 0.3477304 | 0.2744889 | 0.2077092 | 0.1862225 |
| $d_{20}$ (nm) | 123.825 | 177.704 | 240.000 | 230.286 | 225.674 |
| When $n_1 \geqq n_{10}$, $n_{1m}$ = | 0.0768433 | 0.0949634 | 0.1131592 | 0.0367419 | 0.0441357 |
| When $n_1 < n_{10}$, $n_{1m}$ = | 0.0412451 | 0.0529919 | 0.0684998 | 0.0095679 | 0.0109912 |
| When $k_1 \geqq k_{10}$, $k_{1m}$ = | 0.0578772 | 0.0744714 | 0.0949390 | 0.0247339 | 0.0167639 |
| When $k_1 < k_{10}$, $k_{1m}$ = | 0.0896887 | 0.1065430 | 0.1185388 | 0.0386743 | 0.0152380 |
| When $d_1 \geqq d_{10}$, $d_{1m}$ (nm) = | 3.840 | 4.794 | 5.495 | 14.453 | ∞ |
| When $d_1 < d_{10}$, $d_{1m}$ (nm) = | 1.946 | 2.409 | 3.066 | 2.710 | 3.941 |
| When $n_2 \geqq n_{20}$, $n_{2m}$ = | 0.0764294 | 0.0962097 | 0.1038733 | 0.0230908 | 0.0081592 |
| When $n_2 < n_{20}$, $n_{2m}$ = | 0.1359412 | 0.1466211 | 0.1367029 | 0.0895520 | 0.0398572 |
| When $k_2 \geqq k_{20}$, $k_{2m}$ = | 0.0734753 | 0.0852112 | 0.0825085 | 0.0197388 | 0.0086536 |
| When $k_2 < k_{20}$, $k_{2m}$ = | 0.0828125 | 0.0854419 | 0.0815332 | 0.0475061 | 0.0463342 |
| When $d_2 \geqq d_{20}$, $d_{2m}$ (nm) = | ∞ | ∞ | ∞ | 20.793 | 3.280 |
| When $d_2 < d_{20}$, $d_{2m}$ (nm) = | 32.854 | 63.574 | 95.894 | 33.693 | 18.574 |

| 1.1 < NA ≦ 1.2<br>175 < T ≦ 185 | | | |
|---|---|---|---|
| Case | 18-06 | 18-07 | 18-08 |
| $n_{10}$ | 1.6933701 | 1.6939475 | 1.6969386 |
| $k_{10}$ | 0.0640425 | 0.0576888 | 0.0533290 |
| $d_{10}$ (nm) | 213.864 | 212.435 | 271.986 |
| $n_{20}$ | 1.6904005 | 1.6925921 | 1.6924288 |
| $k_{20}$ | 0.1898312 | 0.1618810 | 0.1673219 |
| $d_{20}$ (nm) | 227.117 | 285.048 | 281.091 |
| When $n_1 \geqq n_{10}$, $n_{1m}$ = | 0.0547229 | 0.0510974 | 0.0676453 |
| When $n_1 < n_{10}$, $n_{1m}$ = | 0.0462109 | 0.0603149 | 0.0497070 |
| When $k_1 \geqq k_{10}$, $k_{1m}$ = | 0.0493457 | 0.0532312 | 0.0592920 |
| When $k_1 < k_{10}$, $k_{1m}$ = | 0.0339734 | 0.0351465 | 0.0390295 |
| When $d_1 \geqq d_{10}$, $d_{1m}$ (nm) = | ∞ | ∞ | ∞ |
| When $d_1 < d_{10}$, $d_{1m}$ (nm) = | 49.384 | 120.643 | 177.975 |
| When $n_2 \geqq n_{20}$, $n_{2m}$ = | 0.2555811 | 0.2373071 | 0.2892273 |
| When $n_2 < n_{20}$, $n_{2m}$ = | 0.1402515 | 0.1279663 | 0.2010315 |
| When $k_2 \geqq k_{20}$, $k_{2m}$ = | 0.1146326 | 0.1254919 | 0.2051270 |
| When $k_2 < k_{20}$, $k_{2m}$ = | 0.0655762 | 0.0607678 | 0.0750598 |
| When $d_2 \geqq d_{20}$, $d_{2m}$ (nm) = | ∞ | ∞ | ∞ |
| When $d_2 < d_{20}$, $d_{2m}$ (nm) = | 70.972 | 82.029 | 98.942 |

| 1.1 < NA ≦ 1.2<br>185 < T ≦ 195 | | | | | 25/27 |
|---|---|---|---|---|---|
| Case | 19-01 | 19-02 | 19-03 | 19-04 | 19-05 |
| $n_{10}$ | 1.9315873 | 1.9153217 | 1.8972445 | 1.7198506 | 1.7209927 |
| $k_{10}$ | 0.1333486 | 0.1206110 | 0.1001874 | 0.0813984 | 0.0705203 |
| $d_{10}$ (nm) | 13.169 | 11.351 | 10.604 | 93.215 | 93.408 |
| $n_{20}$ | 1.7169625 | 1.6899751 | 1.6952918 | 1.6740113 | 1.6975541 |
| $k_{20}$ | 0.3552140 | 0.2797802 | 0.2334251 | 0.2110946 | 0.1793898 |
| $d_{20}$ (nm) | 168.729 | 229.265 | 285.679 | 219.867 | 273.456 |
| When $n_1 \geqq n_{10}$, $n_{1m}$ = | 0.0918945 | 0.1114490 | 0.1257397 | 0.0361377 | 0.0445178 |
| When $n_1 < n_{10}$, $n_{1m}$ = | 0.0499878 | 0.0671436 | 0.0846338 | 0.0086279 | 0.0205615 |
| When $k_1 \geqq k_{10}$, $k_{1m}$ = | 0.0714844 | 0.0926733 | 0.1116675 | 0.0228809 | 0.0433899 |
| When $k_1 < k_{10}$, $k_{1m}$ = | 0.1000085 | 0.1179578 | 0.1001874 | 0.0379150 | 0.0444836 |
| When $d_1 \geqq d_{10}$, $d_{1m}$ (nm) = | 4.647 | 5.413 | 6.402 | 13.674 | 40.701 |
| When $d_1 < d_{10}$, $d_{1m}$ (nm) = | 2.318 | 3.021 | 3.978 | 2.409 | 6.133 |
| When $n_2 \geqq n_{20}$, $n_{2m}$ = | 0.0938611 | 0.1021985 | 0.1009766 | 0.0217163 | 0.0601978 |
| When $n_2 < n_{20}$, $n_{2m}$ = | 0.1488745 | 0.1392834 | 0.1303809 | 0.0916943 | 0.1077124 |
| When $k_2 \geqq k_{20}$, $k_{2m}$ = | 0.0821570 | 0.0826257 | 0.0865845 | 0.0185046 | 0.0416394 |
| When $k_2 < k_{20}$, $k_{2m}$ = | 0.0869946 | 0.0832629 | 0.0782239 | 0.0491125 | 0.0501843 |
| When $d_2 \geqq d_{20}$, $d_{2m}$ (nm) = | ∞ | ∞ | ∞ | 19.431 | ∞ |
| When $d_2 < d_{20}$, $d_{2m}$ (nm) = | 61.773 | 92.529 | 127.146 | 32.148 | 73.073 |

-continued

| 1.1 < NA ≦ 1.2<br>185 < T ≦ 195 | | | | | |
|---|---|---|---|---|---|
| Case | 19-06 | 19-07 | 19-08 | 19-09 | 19-10 |
| $n_{10}$ | 1.7035608 | 1.6916743 | 1.6930483 | 1.6936984 | 1.6968810 |
| $k_{10}$ | 0.0713918 | 0.0742011 | 0.0657083 | 0.0591625 | 0.0544417 |
| $d_{10}$ (nm) | 159.462 | 216.137 | 213.861 | 212.273 | 271.786 |
| $n_{20}$ | 1.6857491 | 1.6815589 | 1.6902271 | 1.6918699 | 1.6922876 |
| $k_{20}$ | 0.1901066 | 0.2413942 | 0.1951191 | 0.1652801 | 0.1708476 |
| $d_{20}$ (nm) | 215.251 | 158.897 | 217.477 | 275.792 | 271.501 |
| When $n_1 \geqq n_{10}$, $n_{1m}$ = | 0.0427405 | 0.0223779 | 0.0519324 | 0.0514441 | 0.0684033 |
| When $n_1 < n_{10}$, $n_{1m}$ = | 0.0090222 | 0.0227649 | 0.0431079 | 0.0594763 | 0.0491284 |
| When $k_1 \geqq k_{10}$, $k_{1m}$ = | 0.0150232 | 0.0325586 | 0.0481873 | 0.0521765 | 0.0581763 |
| When $k_1 < k_{10}$, $k_{1m}$ = | 0.0160400 | 0.0253345 | 0.0315527 | 0.0340894 | 0.0370996 |
| When $d_1 \geqq d_{10}$, $d_{1m}$ (nm) = | ∞ | 13.469 | ∞ | ∞ | ∞ |
| When $d_1 < d_{10}$, $d_{1m}$ (nm) = | 3.174 | 10.839 | 47.894 | 119.682 | 177.263 |
| When $n_2 \geqq n_{20}$, $n_{2m}$ = | 0.0074805 | 0.0864617 | 0.1377869 | 0.2440918 | 0.2955884 |
| When $n_2 < n_{20}$, $n_{2m}$ = | 0.0361890 | 0.0461035 | 0.1429895 | 0.1282532 | 0.2018481 |
| When $k_2 \geqq k_{20}$, $k_{2m}$ = | 0.0083386 | 0.0888440 | 0.1120801 | 0.1247546 | 0.2080872 |
| When $k_2 < k_{20}$, $k_{2m}$ = | 0.0485754 | 0.0635596 | 0.0642932 | 0.0606433 | 0.0779761 |
| When $d_2 \geqq d_{20}$, $d_{2m}$ (nm) = | 3.092 | ∞ | ∞ | ∞ | ∞ |
| When $d_2 < d_{20}$, $d_{2m}$ (nm) = | 17.439 | 14.439 | 35.904 | 75.946 | 92.429 |

| 1.1 < NA ≦ 1.2<br>195 < T ≦ 205 | | | | | 26/27 |
|---|---|---|---|---|---|
| Case | 20-01 | 20-02 | 20-03 | 20-04 | 20-05 |
| $n_{10}$ | 1.9249373 | 1.9134695 | 1.8970797 | 1.7208445 | 1.7215107 |
| $k_{10}$ | 0.1361664 | 0.1202777 | 0.0999072 | 0.0825059 | 0.0711590 |
| $d_{10}$ (nm) | 14.155 | 11.822 | 10.899 | 93.633 | 93.747 |
| $n_{20}$ | 1.7251855 | 1.6947701 | 1.6978665 | 1.6746972 | 1.6977852 |
| $k_{20}$ | 0.3723543 | 0.2878755 | 0.2388400 | 0.2167421 | 0.1834377 |
| $d_{20}$ (nm) | 156.237 | 218.180 | 275.054 | 209.700 | 263.540 |
| When $n_1 \geqq n_{10}$, $n_{1m}$ = | 0.0879163 | 0.1083789 | 0.1230811 | 0.0362378 | 0.0448303 |
| When $n_1 < n_{10}$, $n_{1m}$ = | 0.0472876 | 0.0648938 | 0.0826709 | 0.0083032 | 0.0200745 |
| When $k_1 \geqq k_{10}$, $k_{1m}$ = | 0.0660645 | 0.0884607 | 0.1084424 | 0.0221863 | 0.0429114 |
| When $k_1 < k_{10}$, $k_{1m}$ = | 0.0933167 | 0.1148511 | 0.0999072 | 0.0377161 | 0.0440771 |
| When $d_1 \geqq d_{10}$, $d_{1m}$ (nm) = | 4.725 | 5.477 | 6.424 | 13.579 | 31.897 |
| When $d_1 < d_{10}$, $d_{1m}$ (nm) = | 2.353 | 3.040 | 3.984 | 2.294 | 5.957 |
| When $n_2 \geqq n_{20}$, $n_{2m}$ = | 0.0937048 | 0.1017651 | 0.1009302 | 0.0215295 | 0.0601208 |
| When $n_2 < n_{20}$, $n_{2m}$ = | 0.1501685 | 0.1443250 | 0.1325146 | 0.0892346 | 0.1044958 |
| When $k_2 \geqq k_{20}$, $k_{2m}$ = | 0.0870276 | 0.0848474 | 0.0878162 | 0.0191504 | 0.0424573 |
| When $k_2 < k_{20}$, $k_{2m}$ = | 0.0940491 | 0.0866907 | 0.0808813 | 0.0520386 | 0.0521252 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 59.976 | 84.859 | 127.060 | 27.072 | 71.102 |

| 1.1 < NA ≦ 1.2<br>195 < T ≦ 205 | | | | | |
|---|---|---|---|---|---|
| Case | 20-06 | 20-07 | 20-08 | 20-09 | 20-10 |
| $n_{10}$ | 1.7046380 | 1.7071945 | 1.6911424 | 1.6924731 | 1.6944113 |
| $k_{10}$ | 0.0728087 | 0.0643745 | 0.0761042 | 0.0678273 | 0.0547711 |
| $d_{10}$ (nm) | 160.840 | 160.796 | 216.237 | 212.933 | 211.610 |
| $n_{20}$ | 1.6842748 | 1.7036838 | 1.6835271 | 1.6899027 | 1.6931553 |
| $k_{20}$ | 0.1961079 | 0.1674255 | 0.2518702 | 0.2006809 | 0.1468072 |
| $d_{20}$ (nm) | 204.946 | 259.158 | 149.208 | 209.434 | 323.528 |
| When $n_1 \geqq n_{10}$, $n_{1m}$ = | 0.0417468 | 0.0534717 | 0.0144385 | 0.0489441 | 0.0528149 |
| When $n_1 < n_{10}$, $n_{1m}$ = | 0.0080798 | 0.0311902 | 0.0202490 | 0.0431433 | 0.0592456 |
| When $k_1 \geqq k_{10}$, $k_{1m}$ = | 0.0160498 | 0.0272644 | 0.0259192 | 0.0470654 | 0.0582300 |
| When $k_1 < k_{10}$, $k_{1m}$ = | 0.0189954 | 0.0257520 | 0.0204919 | 0.0289844 | 0.0354419 |
| When $d_1 \geqq d_{10}$, $d_{1m}$ (nm) = | ∞ | ∞ | 11.042 | ∞ | ∞ |
| When $d_1 < d_{10}$, $d_{1m}$ (nm) = | 2.830 | 21.473 | 8.826 | 44.978 | 116.569 |
| When $n_2 \geqq n_{20}$, $n_{2m}$ = | 0.0092676 | 0.0660242 | 0.0583154 | 0.1383105 | 0.2397107 |
| When $n_2 < n_{20}$, $n_{2m}$ = | 0.0345349 | 0.0284167 | 0.0279346 | 0.1133557 | 0.1358362 |
| When $k_2 \geqq k_{20}$, $k_{2m}$ = | 0.0098743 | 0.0192883 | 0.0839758 | 0.1160754 | 0.1327747 |
| When $k_2 < k_{20}$, $k_{2m}$ = | 0.0439319 | 0.0493506 | 0.0539001 | 0.0650562 | 0.0582056 |
| When $d_2 \geqq d_{20}$, $d_{2m}$ (nm) = | 4.069 | ∞ | ∞ | ∞ | ∞ |
| When $d_2 < d_{20}$, $d_{2m}$ (nm) = | 16.537 | 9.202 | 10.084 | 22.297 | 94.005 |

| 1.1 < NA ≦ 1.2<br>195 < T ≦ 205 | |
|---|---|
| Case | 27/27<br>20-11 |
| $n_{10}$ | 1.6967389 |
| $k_{10}$ | 0.0554960 |
| $d_{10}$ (nm) | 271.524 |
| $n_{20}$ | 1.6919127 |
| $k_{20}$ | 0.1743507 |
| $d_{20}$ (nm) | 262.739 |
| When $n_1 \geqq n_{10}$, $n_{1m}$ = | 0.0690857 |
| When $n_1 < n_{10}$, $n_{1m}$ = | 0.0487012 |
| When $k_1 \geqq k_{10}$, $k_{1m}$ = | 0.0571155 |
| When $k_1 < k_{10}$, $k_{1m}$ = | 0.0354016 |
| When $d_1 \geqq d_{10}$, $d_{1m}$ (nm) = | ∞ |
| When $d_1 < d_{10}$, $d_{1m}$ (nm) = | 122.531 |
| When $n_2 \geqq n_{20}$, $n_{2m}$ = | 0.3042639 |
| When $n_2 < n_{20}$, $n_{2m}$ = | 0.2009363 |
| When $k_2 \geqq k_{20}$, $k_{2m}$ = | 0.2111316 |
| When $k_2 < k_{20}$, $k_{2m}$ = | 0.0800171 |
| When $d_2 \geqq d_{20}$, $d_{2m}$ (nm) = | ∞ |
| When $d_2 < d_{20}$, $d_{2m}$ (nm) = | 82.974. |

4. An exposure method used in a process for manufacturing a semiconductor device, the method comprising the steps of:

providing an antireflective film having a two-layer structure between a resist layer and a silicon oxide layer formed on a surface of a silicon semiconductor substrate having a thickness T (unit: nm) described below; and exposing the resist layer in an exposure system having a wavelength of 190 nm to 195 nm and a numerical aperture NA of 1.2<NA≦1.3, the antireflective film including an upper layer having a complex refractive index $N_1$, and a lower layer having a complex refractive index $N_2$, the complex refractive indexes $N_1$ and $N_2$ being represented by the equations $N_1=n_1-k_1i$ and $N_2=n_2-k_2i$, respectively;

wherein assuming that the thickness of the upper layer is $d_1$ (unit: nm) and the thickness of the lower layer is $d_2$ (unit: nm), when any one of the combinations of values of [$n_{10}$, $k_{10}$, $d_{10}$, $n_{20}$, $k_{20}$, $d_{20}$] described below is selected depending on the thickness T of the silicon oxide film, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2\leqq 1;$$

a value of $n_{1m}$ in a corresponding case is selected on the basis of a magnitude relation between $n_1$ and $n_{10}$; a value Of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$; and in the tables below, in the line of "When $n_1 \geqq n_{10}$, $n_{1m}$=", each value in the right columns is "$n_{1m}-n_{10}$; in the line of "When $n_1<n_{10}$, $n_{1m}$=", each value in the right columns is "$n_{10}-n_{1m}$"; in the line of "When $k_1 \geqq k_{10}$, $k_{1m}$", each value in the right columns is "$k_{1m}-k_{10}$"; in the line of "When $k_1<k_{10}$, $k_{1m}$=", each value in the right columns is "$k_{10}-k_{1m}$"; in the line of "When $d_{1 \geqq d10}$, $d_{1m}$ (nm) =", each value (unit: nm) in the right columns is "$d_{1m}-d_{10}$"; in the line of "When $d_1<d_{10}$, $d_{1m}$ (nm) =", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2<n_{20}$, $n_{2m}$=", each value in the right columns is "$n_{20}-n_{2m}$"; in the line of "When $k_2 \geqq k_{20}$, $k_{2m}$", each value in the right columns is "$k_{2m}-k_{20}$"; in the line of "When $k_2<k_{20}$, $k_{2m}$=", each value in the right columns is "$k_{20}-k_{2m}$"; in the line of "When $d_2 \geqq d_{20}$ , $d_{2m}$ (nm) =", each value (unit: nm) in the right columns is "$d_{2m}-d_{20}$"; and in the line of "When $d_2<d_{20}$, $d_{2m}$ (nm) =", each value (unit: nm) in the right columns is "$d_{20}-d_{2m}$".

| 1.2 < NA ≦ 1.3<br>2 ≦ T ≦ 15 | | | | | 1/21 |
|---|---|---|---|---|---|
| Case | 1-01 | 1-02 | 1-03 | 1-04 | 1-05 |
| $n_{10}$ | 2.070 | 1.955 | 1.895 | 1.875 | 1.870 |
| $k_{10}$ | 0.020 | 0.138 | 0.133 | 0.110 | 0.101 |
| $d_{10}$ (nm) | 27.974 | 34.826 | 29.218 | 17.990 | 13.959 |
| $n_{20}$ | 5.553 | 9.284 | 2.177 | 1.753 | 1.700 |
| $k_{20}$ | 3.053 | 0.606 | 0.543 | 0.330 | 0.255 |
| $d_{20}$ (nm) | 2.024 | 10.907 | 63.407 | 152.930 | 218.765 |
| When $n_1 \geqq n_{10}$, $n_{1m}$ = | 2.141 | 2.017 | 1.952 | 1.943 | 1.957 |
| When $n_1 < n_{10}$, $n_{1m}$ = | 2.006 | 1.896 | 1.854 | 1.843 | 1.821 |
| When $k_1 \geqq k_{10}$, $k_{1m}$ = | 0.075 | 0.180 | 0.166 | 0.155 | 0.171 |
| When $k_1 < k_{10}$, $k_{1m}$ = | 0.000 | 0.061 | 0.055 | 0.028 | 0.009 |
| When $d_1 \geqq d_{10}$, $d_{1m}$ (nm) = | 31.254 | 39.247 | 35.017 | 23.926 | 20.211 |
| When $d_1 < d_{10}$, $d_{1m}$ (nm) = | 25.519 | 31.618 | 26.178 | 15.560 | 10.679 |
| When $n_2 \geqq n_{20}$, $n_{2m}$ = | 5.876 | 9.377 | 2.281 | 1.832 | 1.773 |
| When $n_2 < n_{20}$, $n_{2m}$ = | 5.233 | 9.207 | 2.051 | 1.635 | 1.577 |
| When $k_2 \geqq k_{20}$, $k_{2m}$ = | 3.362 | 0.715 | 0.699 | 0.412 | 0.320 |
| When $k_2 < k_{20}$, $k_{2m}$ = | 2.751 | 0.513 | 0.439 | 0.253 | 0.185 |
| When $d_2 \geqq d_{20}$, $d_{2m}$ (nm) = | 2.251 | 11.023 | 70.023 | ∞ | ∞ |
| When $d_2 < d_{20}$, $d_{2m}$ (nm) = | 1.807 | 10.812 | 58.076 | 125.396 | 142.606 |

| 1.2 < NA ≦ 1.3<br>2 ≦ T ≦ 15 | | | | | |
|---|---|---|---|---|---|
| Case | 1-06 | 1-07 | 1-08 | 1-09 | 1-10 |
| $n_{10}$ | 1.867 | 1.699 | 1.693 | 1.692 | 1.694 |
| $k_{10}$ | 0.070 | 0.063 | 0.058 | 0.069 | 0.074 |
| $d_{10}$ (nm) | 13.235 | 165.016 | 157.920 | 236.756 | 217.672 |
| $n_{20}$ | 1.732 | 1.698 | 1.698 | 6.942 | 1.788 |
| $k_{20}$ | 0.221 | 0.180 | 0.154 | 3.076 | 0.339 |
| $d_{20}$ (nm) | 270.745 | 204.222 | 265.886 | 0.950 | 84.006 |
| When $n_1 \geqq n_{10}$, $n_{1m}$ = | 1.964 | 1.701 | 1.708 | 1.727 | 1.710 |
| When $n_1 < n_{10}$, $n_{1m}$ = | 1.810 | 1.683 | 1.664 | 1.662 | 1.674 |
| When $k_1 \geqq k_{10}$, $k_{1m}$ = | 0.149 | 0.068 | 0.084 | 0.108 | 0.106 |
| When $k_1 < k_{10}$, $k_{1m}$ = | 0.000 | 0.043 | 0.031 | 0.039 | 0.053 |
| When $d_1 \geqq d_{10}$, $d_{1m}$ (nm) = | 20.519 | 166.410 | 170.845 | 255.389 | 226.062 |
| When $d_1 < d_{10}$, $d_{1m}$ (nm) = | 9.259 | 155.941 | 111.504 | 217.630 | 206.257 |
| When $n_2 \geqq n_{20}$, $n_{2m}$ = | 1.809 | 1.721 | 1.754 | 7.503 | 1.909 |
| When $n_2 < n_{20}$, $n_{2m}$ = | 1.603 | 1.694 | 1.667 | 6.491 | 1.763 |
| When $k_2 \geqq k_{20}$, $k_{2m}$ = | 0.293 | 0.188 | 0.194 | 3.321 | 0.395 |
| When $k_2 < k_{20}$, $k_{2m}$ = | 0.152 | 0.139 | 0.113 | 2.487 | 0.243 |
| When $d_2 \geqq d_{20}$, $d_{2m}$ (nm) = | ∞ | 217.552 | ∞ | 1.062 | 100.609 |
| When $d_2 < d_{20}$, $d_{2m}$ (nm) = | 182.495 | 202.082 | 249.694 | 0.781 | 81.237 |

| $1.2 < NA \leqq 1.3$<br>$2 \leqq T \leqq 15$ | | | 2/21 |
|---|---|---|---|
| Case | 1-11 | 1-12 | 1-13 |
| $n_{10}$ | 1.699 | 1.698 | 1.695 |
| $k_{10}$ | 0.071 | 0.065 | 0.054 |
| $d_{10}$ (nm) | 210.274 | 207.280 | 219.181 |
| $n_{20}$ | 1.718 | 1.695 | 1.688 |
| $k_{20}$ | 0.242 | 0.194 | 0.161 |
| $d_{20}$ (nm) | 154.667 | 219.490 | 263.755 |
| When $n_1 \geqq n_{10}$, $n_{1m}$ = | 1.720 | 1.737 | 1.738 |
| When $n_1 < n_{10}$, $n_{1m}$ = | 1.683 | 1.675 | 1.660 |
| When $k_1 \geqq k_{10}$, $k_{1m}$ = | 0.099 | 0.097 | 0.100 |
| When $k_1 < k_{10}$, $k_{1m}$ = | 0.045 | 0.035 | 0.019 |
| When $d_1 \geqq d_{10}$, $d_{1m}$ (nm) = | 229.005 | ∞ | ∞ |
| When $d_1 < d_{10}$, $d_{1m}$ (nm) = | 200.369 | 189.200 | 189.609 |
| When $n_2 \geqq n_{20}$, $n_{2m}$ = | 1.849 | 1.855 | 1.900 |
| When $n_2 < n_{20}$, $n_{2m}$ = | 1.670 | 1.540 | 1.583 |
| When $k_2 \geqq k_{20}$, $k_{2m}$ = | 0.332 | 0.307 | 0.271 |
| When $k_2 < k_{20}$, $k_{2m}$ = | 0.164 | 0.122 | 0.102 |
| When $d_2 \geqq d_{20}$, $d_{2m}$ (nm) = | ∞ | ∞ | ∞ |
| When $d_2 < d_{20}$, $d_{2m}$ (nm) = | 143.819 | 154.002 | 185.363 |

| $1.2 < NA \leqq 1.3$<br>$1 < < T \leqq 25$ | | | | | 3/21 |
|---|---|---|---|---|---|
| Case | 2-01 | 2-02 | 2-03 | 2-04 | 2-05 |
| $n_{10}$ | 1.894 | 1.881 | 1.874 | 1.872 | 1.693 |
| $k_{10}$ | 0.182 | 0.116 | 0.105 | 0.074 | 0.060 |
| $d_{10}$ (nm) | 37.493 | 18.625 | 14.298 | 13.408 | 158.097 |
| $n_{20}$ | 9.246 | 1.766 | 1.701 | 1.733 | 1.697 |
| $k_{20}$ | 0.662 | 0.358 | 0.269 | 0.231 | 0.160 |
| $d_{20}$ (nm) | 10.628 | 142.939 | 209.610 | 261.989 | 257.142 |
| When $n_1 \geqq n_{10}$, $n_{1m}$ = | 1.954 | 1.946 | 1.957 | 1.966 | 1.703 |
| When $n_1 < n_{10}$, $n_{1m}$ = | 1.847 | 1.852 | 1.828 | 1.817 | 1.667 |
| When $k_1 \geqq k_{10}$, $k_{1m}$ = | 0.222 | 0.156 | 0.171 | 0.149 | 0.081 |
| When $k_1 < k_{10}$, $k_{1m}$ = | 0.111 | 0.037 | 0.015 | 0.000 | 0.035 |
| When $d_1 \geqq d_{10}$, $d_{1m}$ (nm) = | 41.975 | 24.164 | 20.222 | 20.345 | 165.590 |
| When $d_1 < d_{10}$, $d_{1m}$ (nm) = | 34.168 | 16.466 | 11.264 | 9.664 | 137.726 |
| When $n_2 \geqq n_{20}$, $n_{2m}$ = | 9.356 | 1.841 | 1.772 | 1.809 | 1.744 |
| When $n_2 < n_{20}$, $n_{2m}$ = | 9.153 | 1.650 | 1.579 | 1.602 | 1.674 |
| When $k_2 \geqq k_{20}$, $k_{2m}$ = | 0.784 | 0.442 | 0.334 | 0.302 | 0.195 |
| When $k_2 < k_{20}$, $k_{2m}$ = | 0.549 | 0.280 | 0.198 | 0.162 | 0.120 |
| When $d_2 \geqq d_{20}$, $d_{2m}$ (nm) = | 10.759 | ∞ | ∞ | ∞ | ∞ |
| When $d_2 < d_{20}$, $d_{2m}$ (nm) = | 10.519 | 119.178 | 137.341 | 178.243 | 243.996 |

| $1.2 < NA \leqq 1.3$<br>$1 < < T \leqq 25$ | | | | | |
|---|---|---|---|---|---|
| Case | 2-06 | 2-07 | 2-08 | 2-09 | 2-10 |
| $n_{10}$ | 1.690 | 1.693 | 1.699 | 1.698 | 1.695 |
| $k_{10}$ | 0.074 | 0.078 | 0.074 | 0.067 | 0.055 |
| $d_{10}$ (nm) | 235.203 | 218.334 | 210.503 | 207.468 | 219.130 |
| $n_{20}$ | 5.632 | 1.803 | 1.719 | 1.694 | 1.687 |
| $k_{20}$ | 4.204 | 0.382 | 0.259 | 0.203 | 0.167 |
| $d_{20}$ (nm) | 0.919 | 74.994 | 145.797 | 210.546 | 255.274 |
| When $n_1 \geqq n_{10}$, $n_{1m}$ = | 1.708 | 1.699 | 1.715 | 1.733 | 1.737 |
| When $n_1 < n_{10}$, $n_{1m}$ = | 1.661 | 1.675 | 1.684 | 1.676 | 1.661 |
| When $k_1 \geqq k_{10}$, $k_{1m}$ = | 0.102 | 0.098 | 0.100 | 0.097 | 0.100 |
| When $k_1 < k_{10}$, $k_{1m}$ = | 0.051 | 0.067 | 0.052 | 0.039 | 0.022 |
| When $d_1 \geqq d_{10}$, $d_{1m}$ (nm) = | 241.533 | 220.890 | 225.049 | ∞ | ∞ |
| When $d_1 < d_{10}$, $d_{1m}$ (nm) = | 217.317 | 207.766 | 201.595 | 191.244 | 190.979 |
| When $n_2 \geqq n_{20}$, $n_{2m}$ = | 6.262 | 1.931 | 1.852 | 1.853 | 1.902 |
| When $n_2 < n_{20}$, $n_{2m}$ = | 5.366 | 1.793 | 1.684 | 1.538 | 1.584 |
| When $k_2 \geqq k_{20}$, $k_{2m}$ = | 4.338 | 0.416 | 0.339 | 0.310 | 0.275 |
| When $k_2 < k_{20}$, $k_{2m}$ = | 3.555 | 0.288 | 0.182 | 0.132 | 0.107 |
| When $d_2 \geqq d_{20}$, $d_{2m}$ (nm) = | 0.986 | 89.025 | ∞ | ∞ | ∞ |
| When $d_2 < d_{20}$, $d_{2m}$ (nm) = | 0.720 | 74.083 | 139.178 | 147.776 | 179.334 |

| $1.2 < NA \leqq 1.3$<br>$25 < T \leqq 35$ | | | | | 4/21 |
|---|---|---|---|---|---|
| Case | 3-01 | 3-02 | 3-03 | 3-04 | 3-05 |
| $n_{10}$ | 1.855 | 1.894 | 1.879 | 1.879 | 1.692 |
| $k_{10}$ | 0.222 | 0.121 | 0.110 | 0.076 | 0.062 |
| $d_{10}$ (nm) | 38.795 | 19.092 | 14.598 | 13.458 | 158.198 |
| $n_{20}$ | 9.554 | 1.787 | 1.702 | 1.736 | 1.697 |
| $k_{20}$ | 0.714 | 0.392 | 0.285 | 0.242 | 0.168 |
| $d_{20}$ (nm) | 10.003 | 133.195 | 201.011 | 253.439 | 248.709 |
| When $n_1 \geqq n_{10}$, $n_{1m}$ = | 1.905 | 1.955 | 1.958 | 1.971 | 1.699 |
| When $n_1 < n_{10}$, $n_{1m}$ = | 1.821 | 1.868 | 1.836 | 1.826 | 1.670 |
| When $k_1 \geqq k_{10}$, $k_{1m}$ = | 0.258 | 0.156 | 0.172 | 0.149 | 0.078 |
| When $k_1 < k_{10}$, $k_{1m}$ = | 0.159 | 0.047 | 0.022 | 0.000 | 0.041 |
| When $d_1 \geqq d_{10}$, $d_{1m}$ (nm) = | 42.560 | 24.067 | 20.129 | 19.949 | 161.711 |
| When $d_1 < d_{10}$, $d_{1m}$ (nm) = | 36.125 | 17.295 | 11.822 | 9.987 | 144.941 |
| When $n_2 \geqq n_{20}$, $n_{2m}$ = | 9.681 | 1.856 | 1.769 | 1.811 | 1.737 |
| When $n_2 < n_{20}$, $n_{2m}$ = | 9.446 | 1.674 | 1.584 | 1.608 | 1.683 |
| When $k_2 \geqq k_{20}$, $k_{2m}$ = | 0.829 | 0.479 | 0.348 | 0.313 | 0.196 |
| When $k_2 < k_{20}$, $k_{2m}$ = | 0.587 | 0.314 | 0.215 | 0.173 | 0.129 |
| When $d_2 \geqq d_{20}$, $d_{2m}$ (nm) = | 10.138 | ∞ | ∞ | ∞ | ∞ |
| When $d_2 < d_{20}$, $d_{2m}$ (nm) = | 9.892 | 112.716 | 132.762 | 173.492 | 239.168 |

| $1.2 < NA \leqq 1.3$<br>$25 < T \leqq 35$ | | | |
|---|---|---|---|
| Case | 3-06 | 3-07 | 3-08 |
| $n_{10}$ | 1.699 | 1.698 | 1.695 |
| $k_{10}$ | 0.078 | 0.070 | 0.057 |
| $d_{10}$ (nm) | 210.437 | 207.381 | 219.158 |
| $n_{20}$ | 1.720 | 1.693 | 1.687 |
| $k_{20}$ | 0.280 | 0.215 | 0.175 |
| $d_{20}$ (nm) | 137.855 | 202.487 | 246.765 |
| When $n_1 \geqq n_{10}$, $n_{1m}$ = | 1.710 | 1.730 | 1.737 |
| When $n_1 < n_{10}$, $n_{1m}$ = | 1.686 | 1.678 | 1.661 |
| When $k_1 \geqq k_{10}$, $k_{1m}$ = | 0.100 | 0.097 | 0.101 |
| When $k_1 < k_{10}$, $k_{1m}$ = | 0.063 | 0.046 | 0.025 |
| When $d_1 \geqq d_{10}$, $d_{1m}$ (nm) = | 216.379 | ∞ | ∞ |
| When $d_1 < d_{10}$, $d_{1m}$ (nm) = | 202.875 | 193.042 | 192.539 |
| When $n_2 \geqq n_{20}$, $n_{2m}$ = | 1.855 | 1.841 | 1.910 |
| When $n_2 < n_{20}$, $n_{2m}$ = | 1.702 | 1.535 | 1.588 |
| When $k_2 \geqq k_{20}$, $k_{2m}$ = | 0.336 | 0.312 | 0.280 |
| When $k_2 < k_{20}$, $k_{2m}$ = | 0.208 | 0.146 | 0.114 |
| When $d_2 \geqq d_{20}$, $d_{2m}$ (nm) = | ∞ | ∞ | ∞ |
| When $d_2 < d_{20}$, $d_{2m}$ (nm) = | 134.716 | 142.289 | 200.270 |

| $1.2 < NA \leqq 1.3$<br>$35 < T \leqq 45$ | | | | | 5/21 |
|---|---|---|---|---|---|
| Case | 4-01 | 4-02 | 4-03 | 4-04 | 4-05 |
| $n_{10}$ | 1.921 | 1.907 | 1.883 | 1.885 | 1.692 |
| $k_{10}$ | 0.198 | 0.132 | 0.117 | 0.078 | 0.064 |
| $d_{10}$ (nm) | 29.852 | 18.597 | 14.666 | 13.425 | 158.019 |

-continued

| | | | | | |
|---|---|---|---|---|---|
| $n_{20}$ | 2.410 | 1.779 | 1.698 | 1.738 | 1.697 |
| $k_{20}$ | 0.850 | 0.418 | 0.298 | 0.251 | 0.174 |
| $d_{20}$ (nm) | 42.336 | 126.566 | 192.788 | 244.904 | 240.368 |
| When $n_1 \geqq n_{10}$, $n_{1m}$ = | 1.964 | 1.964 | 1.959 | 1.975 | 1.694 |
| When $n_1 < n_{10}$, $n_{1m}$ = | 1.894 | 1.886 | 1.843 | 1.834 | 1.673 |
| When $k_1 \geqq k_{10}$, $k_{1m}$ = | 0.224 | 0.160 | 0.175 | 0.149 | 0.073 |
| When $k_1 < k_{10}$, $k_{1m}$ = | 0.152 | 0.061 | 0.031 | 0.000 | 0.048 |
| When $d_1 \geqq d_{10}$, $d_{1m}$ (nm) = | 33.127 | 22.917 | 19.812 | 19.537 | 159.270 |
| When $d_1 < d_{10}$, $d_{1m}$ (nm) = | 28.245 | 17.267 | 12.114 | 10.202 | 147.983 |
| When $n_2 \geqq n_{20}$, $n_{2m}$ = | 2.530 | 1.833 | 1.762 | 1.812 | 1.732 |
| When $n_2 < n_{20}$, $n_{2m}$ = | 2.288 | 1.667 | 1.583 | 1.611 | 1.691 |
| When $k_2 \geqq k_{20}$, $k_{2m}$ = | 0.928 | 0.492 | 0.359 | 0.320 | 0.195 |
| When $k_2 < k_{20}$, $k_{2m}$ = | 0.730 | 0.344 | 0.229 | 0.182 | 0.145 |
| When $d_2 \geqq d_{20}$, $d_{2m}$ (nm) = | 46.411 | ∞ | ∞ | ∞ | 274.107 |
| When $d_2 < d_{20}$, $d_{2m}$ (nm) = | 39.931 | 107.536 | 154.271 | 167.375 | 234.670 |

$1.2 < NA \leqq 1.3$
$35 < T \leqq 45$

| Case | 4-06 | 4-07 | 4-08 | 4-09 |
|---|---|---|---|---|
| $n_{10}$ | 1.700 | 1.698 | 1.695 | 1.705 |
| $k_{10}$ | 0.081 | 0.072 | 0.059 | 0.053 |
| $d_{10}$ (nm) | 209.560 | 206.609 | 219.174 | 283.412 |
| $n_{20}$ | 1.716 | 1.692 | 1.688 | 1.691 |
| $k_{20}$ | 0.298 | 0.225 | 0.183 | 0.185 |
| $d_{20}$ (nm) | 131.419 | 195.862 | 237.750 | 233.362 |
| When $n_1 \geqq n_{10}$, $n_{1m}$ = | 1.701 | 1.721 | 1.734 | 1.751 |
| When $n_1 < n_{10}$, $n_{1m}$ = | 1.689 | 1.680 | 1.662 | 1.675 |
| When $k_1 \geqq k_{10}$, $k_{1m}$ = | 0.099 | 0.097 | 0.101 | 0.092 |
| When $k_1 < k_{10}$, $k_{1m}$ = | 0.076 | 0.050 | 0.027 | 0.024 |
| When $d_1 \geqq d_{10}$, $d_{1m}$ (nm) = | 210.753 | ∞ | ∞ | ∞ |
| When $d_1 < d_{10}$, $d_{1m}$ (nm) = | 203.620 | 194.085 | 194.045 | 189.814 |
| When $n_2 \geqq n_{20}$, $n_{2m}$ = | 1.846 | 1.812 | 1.920 | 1.889 |
| When $n_2 < n_{20}$, $n_{2m}$ = | 1.712 | 1.528 | 1.594 | 1.515 |
| When $k_2 \geqq k_{20}$, $k_{2m}$ = | 0.319 | 0.315 | 0.285 | 0.358 |
| When $k_2 < k_{20}$, $k_{2m}$ = | 0.257 | 0.159 | 0.121 | 0.115 |
| When $d_2 \geqq d_{20}$, $d_{2m}$ (nm) = | ∞ | ∞ | ∞ | ∞ |
| When $d_2 < d_{20}$, $d_{2m}$ (nm) = | 130.894 | 179.580 | 197.417 | 162.566 |

$1.2 < NA \leqq 1.3$
$45 < T \leqq 55$

| Case | 5-01 | 5-02 | 5-03 | 5-04 | 6/21 5-05 |
|---|---|---|---|---|---|
| $n_{10}$ | 1.943 | 1.907 | 1.884 | 1.891 | 1.691 |
| $k_{10}$ | 0.213 | 0.153 | 0.123 | 0.078 | 0.066 |
| $d_{10}$ (nm) | 22.907 | 17.372 | 14.585 | 13.392 | 157.377 |
| $n_{20}$ | 1.902 | 1.716 | 1.691 | 1.743 | 1.696 |
| $k_{20}$ | 0.785 | 0.418 | 0.305 | 0.257 | 0.178 |
| $d_{20}$ (nm) | 53.731 | 124.143 | 184.536 | 235.129 | 232.195 |
| When $n_1 \geqq n_{10}$, $n_{1m}$ = | 1.979 | 1.963 | 1.959 | 1.980 | 1.692 |
| When $n_1 < n_{10}$, $n_{1m}$ = | 1.934 | 1.892 | 1.845 | 1.841 | 1.676 |
| When $k_1 \geqq k_{10}$, $k_{1m}$ = | 0.223 | 0.175 | 0.181 | 0.148 | 0.067 |
| When $k_1 < k_{10}$, $k_{1m}$ = | 0.198 | 0.080 | 0.039 | 0.000 | 0.057 |
| When $d_1 \geqq d_{10}$, $d_{1m}$ (nm) = | 25.447 | 21.108 | 19.487 | 19.257 | 157.441 |
| When $d_1 < d_{10}$, $d_{1m}$ (nm) = | 22.431 | 16.482 | 12.133 | 10.346 | 149.670 |
| When $n_2 \geqq n_{20}$, $n_{2m}$ = | 1.937 | 1.752 | 1.753 | 1.817 | 1.727 |
| When $n_2 < n_{20}$, $n_{2m}$ = | 1.871 | 1.605 | 1.576 | 1.616 | 1.695 |
| When $k_2 \geqq k_{20}$, $k_{2m}$ = | 0.813 | 0.464 | 0.362 | 0.326 | 0.187 |
| When $k_2 < k_{20}$, $k_{2m}$ = | 0.724 | 0.351 | 0.237 | 0.188 | 0.173 |
| When $d_2 \geqq d_{20}$, $d_{2m}$ (nm) = | 58.954 | ∞ | ∞ | ∞ | 254.885 |
| When $d_2 < d_{20}$, $d_{2m}$ (nm) = | 51.905 | 103.951 | 122.545 | 158.102 | 231.812 |

-continued $1.2 < NA \leqq 1.3$
$45 < T \leqq 55$

| Case | 5-06 | 5-07 | 5-08 |
|---|---|---|---|
| $n_{10}$ | 1.699 | 1.695 | 1.704 |
| $k_{10}$ | 0.072 | 0.060 | 0.054 |
| $d_{10}$ (nm) | 204.994 | 219.095 | 283.255 |
| $n_{20}$ | 1.688 | 1.689 | 1.689 |
| $k_{20}$ | 0.231 | 0.188 | 0.189 |
| $d_{20}$ (nm) | 192.230 | 228.102 | 224.255 |
| When $n_1 \geqq n_{10}$, $n_{1m}$ = | 1.718 | 1.729 | 1.749 |
| When $n_1 < n_{10}$, $n_{1m}$ = | 1.682 | 1.663 | 1.676 |
| When $k_1 \geqq k_{10}$, $k_{1m}$ = | 0.096 | 0.102 | 0.091 |
| When $k_1 < k_{10}$, $k_{1m}$ = | 0.048 | 0.030 | 0.025 |
| When $d_1 \geqq d_{10}$, $d_{1m}$ (nm) = | ∞ | ∞ | ∞ |
| When $d_1 < d_{10}$, $d_{1m}$ (nm) = | 194.149 | 195.371 | 190.682 |
| When $n_2 \geqq n_{20}$, $n_{2m}$ = | 1.788 | 1.929 | 1.898 |
| When $n_2 < n_{20}$, $n_{2m}$ = | 1.641 | 1.601 | 1.530 |
| When $k_2 \geqq k_{20}$, $k_{2m}$ = | 0.326 | 0.290 | 0.362 |
| When $k_2 < k_{20}$, $k_{2m}$ = | 0.165 | 0.127 | 0.117 |
| When $d_2 \geqq d_{20}$, $d_{2m}$ (nm) = | ∞ | ∞ | ∞ |
| When $d_2 < d_{20}$, $d_{2m}$ (nm) = | 176.978 | 195.845 | 153.544 |

$1.2 < NA \leqq 1.3$
$55 < T \leqq 65$

| Case | 6-01 | 6-02 | 6-03 | 6-04 | 7/21 6-05 |
|---|---|---|---|---|---|
| $n_{10}$ | 1.895 | 1.882 | 1.690 | 1.701 | 1.693 |
| $k_{10}$ | 0.076 | 0.126 | 0.068 | 0.084 | 0.070 |
| $d_{10}$ (nm) | 13.537 | 14.752 | 155.845 | 206.275 | 221.382 |
| $n_{20}$ | 1.753 | 1.688 | 1.693 | 1.686 | 1.667 |
| $k_{20}$ | 0.262 | 0.309 | 0.181 | 0.310 | 0.231 |
| $d_{20}$ (nm) | 223.848 | 174.672 | 224.616 | 122.505 | 161.928 |
| When $n_1 \geqq n_{10}$, $n_{1m}$ = | 1.983 | 1.956 | 1.691 | 1.703 | 1.726 |
| When $n_1 < n_{10}$, $n_{1m}$ = | 1.846 | 1.842 | 1.680 | 1.695 | 1.686 |
| When $k_1 \geqq k_{10}$, $k_{1m}$ = | 0.143 | 0.185 | 0.071 | 0.096 | 0.105 |
| When $k_1 < k_{10}$, $k_{1m}$ = | 0.000 | 0.045 | 0.054 | 0.076 | 0.063 |
| When $d_1 \geqq d_{10}$, $d_{1m}$ (nm) = | 19.333 | 19.661 | 156.188 | 207.561 | 253.974 |
| When $d_1 < d_{10}$, $d_{1m}$ (nm) = | 10.604 | 12.234 | 149.873 | 203.306 | 217.847 |
| When $n_2 \geqq n_{20}$, $n_{2m}$ = | 1.828 | 1.751 | 1.713 | 1.791 | 1.691 |
| When $n_2 < n_{20}$, $n_{2m}$ = | 1.623 | 1.571 | 1.692 | 1.682 | 1.585 |
| When $k_2 \geqq k_{20}$, $k_{2m}$ = | 0.332 | 0.365 | 0.184 | 0.352 | 0.284 |
| When $k_2 < k_{20}$, $k_{2m}$ = | 0.191 | 0.239 | 0.171 | 0.280 | 0.201 |
| When $d_2 \geqq d_{20}$, $d_{2m}$ (nm) = | ∞ | ∞ | 244.114 | 149.549 | 170.132 |
| When $d_2 < d_{20}$, $d_{2m}$ (nm) = | 146.194 | 124.203 | 224.269 | 121.948 | 139.231 |

$1.2 < NA \leqq 1.3$
$55 < T \leqq 65$

| Case | 6-06 | 6-07 | 6-08 |
|---|---|---|---|
| $n_{10}$ | 1.695 | 1.695 | 1.703 |
| $k_{10}$ | 0.060 | 0.055 | 0.049 |
| $d_{10}$ (nm) | 218.851 | 215.764 | 278.302 |
| $n_{20}$ | 1.689 | 1.693 | 1.691 |
| $k_{20}$ | 0.190 | 0.162 | 0.159 |
| $d_{20}$ (nm) | 218.129 | 277.062 | 273.241 |
| When $n_1 \geqq n_{10}$, $n_{1m}$ = | 1.726 | 1.740 | 1.751 |
| When $n_1 < n_{10}$, $n_{1m}$ = | 1.665 | 1.662 | 1.653 |
| When $k_1 \geqq k_{10}$, $k_{1m}$ = | 0.102 | 0.097 | 0.092 |
| When $k_1 < k_{10}$, $k_{1m}$ = | 0.031 | 0.021 | 0.015 |
| When $d_1 \geqq d_{10}$, $d_{1m}$ (nm) = | ∞ | ∞ | ∞ |
| When $d_1 < d_{10}$, $d_{1m}$ (nm) = | 196.531 | 170.235 | 166.884 |
| When $n_2 \geqq n_{20}$, $n_{2m}$ = | 1.935 | 1.919 | 1.925 |
| When $n_2 < n_{20}$, $n_{2m}$ = | 1.606 | 1.543 | 1.498 |
| When $k_2 \geqq k_{20}$, $k_{2m}$ = | 0.294 | 0.280 | 0.278 |
| When $k_2 < k_{20}$, $k_{2m}$ = | 0.130 | 0.102 | 0.095 |

-continued

| | | | |
|---|---|---|---|
| When $d_2 \geqq d_{20}$, $d_{2m}$ (nm) = | ∞ | ∞ | ∞ |
| When $d_2 < d_{20}$, $d_{2m}$ (nm) = | 191.652 | 197.142 | 190.724 |

$1.2 < NA \leqq 1.3$
$65 < T \leqq 75$

8/21

| Case | 7-01 | 7-02 | 7-03 | 7-04 | 7-05 |
|---|---|---|---|---|---|
| $n_{10}$ | 1.881 | 1.879 | 1.898 | 1.873 | 1.715 |
| $k_{10}$ | 0.189 | 0.125 | 0.073 | 0.092 | 0.067 |
| $d_{10}$ (nm) | 17.242 | 15.444 | 14.029 | 12.003 | 99.925 |
| $n_{20}$ | 1.617 | 1.697 | 1.767 | 1.696 | 1.686 |
| $k_{20}$ | 0.409 | 0.320 | 0.271 | 0.218 | 0.167 |
| $d_{20}$ (nm) | 111.921 | 162.536 | 211.582 | 280.785 | 269.056 |
| When $n_1 \geqq n_{10}$, $n_{1m}$ = | 1.933 | 1.953 | 1.985 | 1.975 | 1.746 |
| When $n_1 < n_{10}$, $n_{1m}$ = | 1.873 | 1.839 | 1.852 | 1.816 | 1.710 |
| When $k_1 \geqq k_{10}$, $k_{1m}$ = | 0.202 | 0.184 | 0.136 | 0.174 | 0.081 |
| When $k_1 < k_{10}$, $k_{1m}$ = | 0.122 | 0.046 | 0.000 | 0.000 | 0.037 |
| When $d_1 \geqq d_{10}$, $d_{1m}$ (nm) = | 20.550 | 20.523 | 19.818 | 18.551 | 136.285 |
| When $d_1 < d_{10}$, $d_{1m}$ (nm) = | 16.700 | 12.791 | 11.204 | 8.554 | 98.008 |
| When $n_2 \geqq n_{20}$, $n_{2m}$ = | 1.633 | 1.761 | 1.845 | 1.780 | 1.699 |
| When $n_2 < n_{20}$, $n_{2m}$ = | 1.511 | 1.579 | 1.638 | 1.585 | 1.620 |
| When $k_2 \geqq k_{20}$, $k_{2m}$ = | 0.430 | 0.380 | 0.344 | 0.283 | 0.175 |
| When $k_2 < k_{20}$, $k_{2m}$ = | 0.344 | 0.246 | 0.196 | 0.150 | 0.131 |
| When $d_2 \geqq d_{20}$, $d_{2m}$ (nm) = | ∞ | ∞ | ∞ | ∞ | 278.211 |
| When $d_2 < d_{20}$, $d_{2m}$ (nm) = | 91.266 | 127.980 | 136.666 | 158.294 | 243.285 |

$1.2 < NA \leqq 1.3$
$65 < T \leqq 75$

| Case | 7-06 | 7-07 | 7-08 |
|---|---|---|---|
| $n_{10}$ | 1.693 | 1.695 | 1.695 |
| $k_{10}$ | 0.070 | 0.061 | 0.055 |
| $d_{10}$ (nm) | 221.230 | 218.569 | 215.552 |
| $n_{20}$ | 1.668 | 1.689 | 1.692 |
| $k_{20}$ | 0.236 | 0.193 | 0.164 |
| $d_{20}$ (nm) | 151.884 | 208.598 | 267.637 |
| When $n_1 \geqq n_{10}$, $n_{1m}$ = | 1.724 | 1.724 | 1.741 |
| When $n_1 < n_{10}$, $n_{1m}$ = | 1.686 | 1.666 | 1.661 |
| When $k_1 \geqq k_{10}$, $k_{1m}$ = | 0.105 | 0.101 | 0.097 |
| When $k_1 < k_{10}$, $k_{1m}$ = | 0.064 | 0.031 | 0.021 |
| When $d_1 \geqq d_{10}$, $d_{1m}$ (nm) = | 247.645 | ∞ | ∞ |
| When $d_1 < d_{10}$, $d_{1m}$ (nm) = | 218.101 | 197.493 | 171.385 |
| When $n_2 \geqq n_{20}$, $n_{2m}$ = | 1.689 | 1.934 | 1.918 |
| When $n_2 < n_{20}$, $n_{2m}$ = | 1.586 | 1.609 | 1.542 |
| When $k_2 \geqq k_{20}$, $k_{2m}$ = | 0.286 | 0.296 | 0.281 |
| When $k_2 < k_{20}$, $k_{2m}$ = | 0.205 | 0.130 | 0.101 |
| When $d_2 \geqq d_{20}$, $d_{2m}$ (nm) = | 159.193 | ∞ | ∞ |
| When $d_2 < d_{20}$, $d_{2m}$ (nm) = | 130.698 | 183.027 | 188.504 |

$1.2 < NA \leqq 1.3$
$75 < T \leqq 85$

9/21

| Case | 8-01 | 8-02 | 8-03 | 8-04 | 8-05 |
|---|---|---|---|---|---|
| $n_{10}$ | 1.880 | 1.901 | 1.874 | 1.716 | 1.692 |
| $k_{10}$ | 0.126 | 0.074 | 0.095 | 0.068 | 0.072 |
| $d_{10}$ (nm) | 16.279 | 14.624 | 12.218 | 99.848 | 220.366 |
| $n_{20}$ | 1.709 | 1.778 | 1.694 | 1.687 | 1.668 |
| $k_{20}$ | 0.340 | 0.284 | 0.225 | 0.173 | 0.244 |
| $d_{20}$ (nm) | 151.148 | 201.087 | 271.916 | 259.863 | 143.647 |
| When $n_1 \geqq n_{10}$, $n_{1m}$ = | 1.951 | 1.984 | 1.974 | 1.746 | 1.725 |
| When $n_1 < n_{10}$, $n_{1m}$ = | 1.842 | 1.857 | 1.818 | 1.712 | 1.688 |
| When $k_1 \geqq k_{10}$, $k_{1m}$ = | 0.181 | 0.134 | 0.175 | 0.079 | 0.106 |
| When $k_1 < k_{10}$, $k_{1m}$ = | 0.048 | 0.000 | 0.000 | 0.042 | 0.068 |
| When $d_1 \geqq d_{10}$, $d_{1m}$ (nm) = | 21.358 | 20.311 | 18.650 | 135.917 | 245.491 |
| When $d_1 < d_{10}$, $d_{1m}$ (nm) = | 13.627 | 11.922 | 8.869 | 98.660 | 218.637 |
| When $n_2 \geqq n_{20}$, $n_{2m}$ = | 1.774 | 1.856 | 1.776 | 1.696 | 1.688 |
| When $n_2 < n_{20}$, $n_{2m}$ = | 1.592 | 1.651 | 1.582 | 1.624 | 1.581 |
| When $k_2 \geqq k_{20}$, $k_{2m}$ = | 0.403 | 0.360 | 0.289 | 0.178 | 0.280 |
| When $k_2 < k_{20}$, $k_{2m}$ = | 0.263 | 0.208 | 0.157 | 0.137 | 0.214 |
| When $d_2 \geqq d_{20}$, $d_{2m}$ (nm) = | ∞ | ∞ | ∞ | 265.927 | 149.336 |
| When $d_2 < d_{20}$, $d_{2m}$ (nm) = | 123.537 | 130.884 | 183.486 | 237.438 | 121.404 |

$1.2 < NA \leqq 1.3$
$75 < T \leqq 85$

| Case | 8-06 | 8-07 |
|---|---|---|
| $n_{10}$ | 1.695 | 1.695 |
| $k_{10}$ | 0.062 | 0.056 |
| $d_{10}$ (nm) | 218.447 | 215.754 |
| $n_{20}$ | 1.688 | 1.691 |
| $k_{20}$ | 0.198 | 0.167 |
| $d_{20}$ (nm) | 200.044 | 258.621 |
| When $n_1 \geqq n_{10}$, $n_{1m}$ = | 1.724 | 1.740 |
| When $n_1 < n_{10}$, $n_{1m}$ = | 1.667 | 1.661 |
| When $k_1 \geqq k_{10}$, $k_{1m}$ = | 0.102 | 0.097 |
| When $k_1 < k_{10}$, $k_{1m}$ = | 0.033 | 0.022 |
| When $d_1 \geqq d_{10}$, $d_{1m}$ (nm) = | ∞ | ∞ |
| When $d_1 < d_{10}$, $d_{1m}$ (nm) = | 198.178 | 171.868 |
| When $n_2 \geqq n_{20}$, $n_{2m}$ = | 1.931 | 1.916 |
| When $n_2 < n_{20}$, $n_{2m}$ = | 1.605 | 1.542 |
| When $k_2 \geqq k_{20}$, $k_{2m}$ = | 0.296 | 0.282 |
| When $k_2 < k_{20}$, $k_{2m}$ = | 0.132 | 0.105 |
| When $d_2 \geqq d_{20}$, $d_{2m}$ (nm) = | ∞ | ∞ |
| When $d_2 < d_{20}$, $d_{2m}$ (nm) = | 172.147 | 178.623 |

$1.2 < NA \leqq 1.3$
$85 < T \leqq 95$

10/21

| Case | 9-01 | 9-02 | 9-03 | 9-04 | 9-05 |
|---|---|---|---|---|---|
| $n_{10}$ | 1.888 | 1.903 | 1.880 | 1.693 | 1.695 |
| $k_{10}$ | 0.130 | 0.081 | 0.095 | 0.063 | 0.064 |
| $d_{10}$ (nm) | 16.763 | 14.911 | 12.432 | 156.037 | 218.418 |
| $n_{20}$ | 1.718 | 1.775 | 1.700 | 1.696 | 1.685 |
| $k_{20}$ | 0.366 | 0.299 | 0.236 | 0.165 | 0.207 |
| $d_{20}$ (nm) | 141.793 | 193.492 | 262.434 | 252.531 | 192.031 |
| When $n_1 \geqq n_{10}$, $n_{1m}$ = | 1.955 | 1.983 | 1.976 | 1.693 | 1.725 |
| When $n_1 < n_{10}$, $n_{1m}$ = | 1.853 | 1.862 | 1.827 | 1.659 | 1.667 |
| When $k_1 \geqq k_{10}$, $k_{1m}$ = | 0.178 | 0.137 | 0.171 | 0.071 | 0.102 |
| When $k_1 < k_{10}$, $k_{1m}$ = | 0.053 | 0.000 | 0.000 | 0.062 | 0.036 |
| When $d_1 \geqq d_{10}$, $d_{1m}$ (nm) = | 21.482 | 20.338 | 18.582 | 156.116 | 252.664 |
| When $d_1 < d_{10}$, $d_{1m}$ (nm) = | 14.427 | 12.369 | 9.315 | 108.678 | 198.579 |
| When $n_2 \geqq n_{20}$, $n_{2m}$ = | 1.777 | 1.851 | 1.779 | 1.766 | 1.934 |
| When $n_2 < n_{20}$, $n_{2m}$ = | 1.605 | 1.653 | 1.583 | 1.688 | 1.600 |
| When $k_2 \geqq k_{20}$, $k_{2m}$ = | 0.429 | 0.373 | 0.299 | 0.166 | 0.298 |
| When $k_2 < k_{20}$, $k_{2m}$ = | 0.289 | 0.223 | 0.167 | 0.129 | 0.138 |
| When $d_2 \geqq d_{20}$, $d_{2m}$ (nm) = | ∞ | ∞ | ∞ | 252.906 | ∞ |
| When $d_2 < d_{20}$, $d_{2m}$ (nm) = | 118.585 | 127.262 | 178.673 | 249.872 | 164.058 |

-continued

| 1.2 < NA ≦ 1.3<br>85 < T ≦ 95 | | |
|---|---|---|
| Case | 9-06 | 9-07 |
| $n_{10}$ | 1.695 | 1.704 |
| $k_{10}$ | 0.057 | 0.051 |
| $d_{10}$ (nm) | 216.093 | 278.289 |
| $n_{20}$ | 1.691 | 1.691 |
| $k_{20}$ | 0.173 | 0.173 |
| $d_{20}$ (nm) | 249.945 | 246.105 |
| When $n_1 \geqq n_{10}$, $n_{1m}$ = | 1.738 | 1.752 |
| When $n_1 < n_{10}$, $n_{1m}$ = | 1.662 | 1.653 |
| When $k_1 \geqq k_{10}$, $k_{1m}$ = | 0.098 | 0.092 |
| When $k_1 < k_{10}$, $k_{1m}$ = | 0.022 | 0.016 |
| When $d_1 \geqq d_{10}$, $d_{1m}$ (nm) = | ∞ | ∞ |
| When $d_1 < d_{10}$, $d_{1m}$ (nm) = | 175.267 | 172.533 |
| When $n_2 \geqq n_{20}$, $n_{2m}$ = | 1.919 | 1.830 |
| When $n_2 < n_{20}$, $n_{2m}$ = | 1.543 | 1.507 |
| When $k_2 \geqq k_{20}$, $k_{2m}$ = | 0.284 | 0.291 |
| When $k_2 < k_{20}$, $k_{2m}$ = | 0.111 | 0.108 |
| When $d_2 \geqq d_{20}$, $d_{2m}$ (nm) = | ∞ | ∞ |
| When $d_2 < d_{20}$, $d_{2m}$ (nm) = | 173.633 | 172.262 |

-continued

| | | | | | |
|---|---|---|---|---|---|
| When $k_1 < k_{10}$, $k_{1m}$ = | 0.078 | 0.017 | 0.000 | 0.039 | 0.045 |
| When $d_1 \geqq d_{10}$, $d_{1m}$ (nm) = | 19.455 | 19.144 | 17.845 | ∞ | 247.764 |
| When $d_1 < d_{10}$, $d_{1m}$ (nm) = | 14.744 | 12.421 | 9.756 | 107.765 | 205.861 |
| When $n_2 \geqq n_{20}$, $n_{2m}$ = | 1.741 | 1.806 | 1.782 | 1.782 | 1.753 |
| When $n_2 < n_{20}$, $n_{2m}$ = | 1.596 | 1.623 | 1.583 | 1.640 | 1.603 |
| When $k_2 \geqq k_{20}$, $k_{2m}$ = | 0.453 | 0.379 | 0.315 | 0.185 | 0.311 |
| When $k_2 < k_{20}$, $k_{2m}$ = | 0.345 | 0.249 | 0.187 | 0.106 | 0.163 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 107.965 | 122.284 | 164.682 | 240.729 | 150.727 |

| 1.2 < NA ≦ 1.3<br>105 < T ≦ 115 | | |
|---|---|---|
| Case | 11-06 | 11-07 |
| $n_{10}$ | 1.695 | 1.705 |
| $k_{10}$ | 0.060 | 0.054 |
| $d_{10}$ (nm) | 216.291 | 277.828 |
| $n_{20}$ | 1.691 | 1.688 |
| $k_{20}$ | 0.187 | 0.185 |
| $d_{20}$ (nm) | 231.949 | 228.622 |
| When $n_1 \geqq n_{10}$, $n_{1m}$ = | 1.736 | 1.751 |

| 1.2 < NA ≦ 1.3<br>95 < T ≦ 105 | | | | | | |
|---|---|---|---|---|---|---|
| Case | 10-01 | 10-02 | 10-03 | 10-04 | 10-05 | 11/21<br>10-06 |
| $n_{10}$ | 1.902 | 1.906 | 1.888 | 1.694 | 1.695 | 1.704 |
| $k_{10}$ | 0.140 | 0.093 | 0.096 | 0.066 | 0.059 | 0.052 |
| $d_{10}$ (nm) | 16.621 | 14.821 | 12.503 | 218.392 | 216.276 | 278.098 |
| $n_{20}$ | 1.717 | 1.761 | 1.706 | 1.682 | 1.691 | 1.689 |
| $k_{20}$ | 0.393 | 0.312 | 0.247 | 0.217 | 0.180 | 0.180 |
| $d_{20}$ (nm) | 134.110 | 187.587 | 253.021 | 183.765 | 241.184 | 237.690 |
| When $n_1 \geqq n_{10}$, $n_{1m}$ = | 1.964 | 1.983 | 1.982 | 1.725 | 1.737 | 1.752 |
| When $n_1 < n_{10}$, $n_{1m}$ = | 1.874 | 1.867 | 1.838 | 1.666 | 1.663 | 1.658 |
| When $k_1 \geqq k_{10}$, $k_{1m}$ = | 0.179 | 0.146 | 0.168 | 0.103 | 0.098 | 0.091 |
| When $k_1 < k_{10}$, $k_{1m}$ = | 0.062 | 0.004 | 0.000 | 0.041 | 0.024 | 0.019 |
| When $d_1 \geqq d_{10}$, $d_{1m}$ (nm) = | 20.729 | 19.885 | 18.297 | 250.100 | ∞ | ∞ |
| When $d_1 < d_{10}$, $d_{1m}$ (nm) = | 14.862 | 12.520 | 9.652 | 198.830 | 185.832 | 180.136 |
| When $n_2 \geqq n_{20}$, $n_{2m}$ = | 1.767 | 1.831 | 1.783 | 1.944 | 1.927 | 1.847 |
| When $n_2 < n_{20}$, $n_{2m}$ = | 1.609 | 1.641 | 1.584 | 1.598 | 1.559 | 1.512 |
| When $k_2 \geqq k_{20}$, $k_{2m}$ = | 0.449 | 0.380 | 0.309 | 0.303 | 0.288 | 0.296 |
| When $k_2 < k_{20}$, $k_{2m}$ = | 0.320 | 0.238 | 0.178 | 0.149 | 0.117 | 0.113 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 113.506 | 124.690 | 172.558 | 157.077 | 167.184 | 165.978 |

| 1.2 < NA ≦ 1.3<br>105 < T ≦ 115 | | | | | |
|---|---|---|---|---|---|
| Case | 11-01 | 11-02 | 11-03 | 11-04 | 12/21<br>11-05 |
| $n_{10}$ | 1.915 | 1.908 | 1.895 | 1.692 | 1.694 |
| $k_{10}$ | 0.153 | 0.105 | 0.097 | 0.060 | 0.068 |
| $d_{10}$ (nm) | 15.972 | 14.452 | 12.386 | 153.833 | 218.491 |
| $n_{20}$ | 1.700 | 1.741 | 1.708 | 1.696 | 1.679 |
| $k_{20}$ | 0.410 | 0.319 | 0.254 | 0.152 | 0.227 |
| $d_{20}$ (nm) | 128.035 | 181.864 | 244.026 | 294.292 | 174.638 |
| When $n_1 \geqq n_{10}$, $n_{1m}$ = | 1.973 | 1.983 | 1.987 | 1.719 | 1.723 |
| When $n_1 < n_{10}$, $n_{1m}$ = | 1.893 | 1.872 | 1.847 | 1.655 | 1.669 |
| When $k_1 \geqq k_{10}$, $k_{1m}$ = | 0.185 | 0.156 | 0.167 | 0.093 | 0.104 |

-continued

| | | |
|---|---|---|
| When $n_1 < n_{10}$, $n_{1m}$ = | 1.664 | 1.660 |
| When $k_1 \geqq k_{10}$, $k_{1m}$ = | 0.099 | 0.091 |
| When $k_1 < k_{10}$, $k_{1m}$ = | 0.026 | 0.021 |
| When $d_1 \geqq d_{10}$, $d_{1m}$ (nm) = | ∞ | ∞ |
| When $d_1 < d_{10}$, $d_{1m}$ (nm) = | 188.964 | 182.620 |
| When $n_2 \geqq n_{20}$, $n_{2m}$ = | 1.938 | 1.860 |
| When $n_2 < n_{20}$, $n_{2m}$ = | 1.577 | 1.505 |
| When $k_2 \geqq k_{20}$, $k_{2m}$ = | 0.293 | 0.298 |
| When $k_2 < k_{20}$, $k_{2m}$ = | 0.122 | 0.117 |
| When $d_2 \geqq d_{20}$, $d_{2m}$ (nm) = | ∞ | ∞ |
| When $d_2 < d_{20}$, $d_{2m}$ (nm) = | 190.206 | 157.223 |

| 1.2 < NA ≦ 1.3<br>115 < T ≦ 125 | | | | | 13/21 |
|---|---|---|---|---|---|
| Case | 12-01 | 12-02 | 12-03 | 12-04 | 12-05 |
| $n_{10}$ | 1.919 | 1.909 | 1.897 | 1.692 | 1.694 |
| $k_{10}$ | 0.168 | 0.114 | 0.102 | 0.061 | 0.069 |
| $d_{10}$ (nm) | 15.470 | 14.219 | 12.252 | 153.490 | 218.807 |
| $n_{20}$ | 1.675 | 1.728 | 1.703 | 1.695 | 1.679 |
| $k_{20}$ | 0.416 | 0.323 | 0.257 | 0.154 | 0.236 |
| $d_{20}$ (nm) | 121.998 | 174.431 | 235.332 | 285.775 | 164.294 |
| When $n_1 \geqq n_{10}$, $n_{1m}$ = | 1.974 | 1.983 | 1.989 | 1.719 | 1.720 |
| When $n_1 < n_{10}$, $n_{1m}$ = | 1.903 | 1.876 | 1.851 | 1.657 | 1.674 |
| When $k_1 \geqq k_{10}$, $k_{1m}$ = | 0.194 | 0.163 | 0.171 | 0.093 | 0.104 |
| When $k_1 < k_{10}$, $k_{1m}$ = | 0.095 | 0.028 | 0.000 | 0.043 | 0.048 |
| When $d_1 \geqq d_{10}$, $d_{1m}$ (nm) = | 18.537 | 18.641 | 17.506 | 176.125 | 245.819 |
| When $d_1 < d_{10}$, $d_{1m}$ (nm) = | 14.577 | 12.379 | 9.747 | 108.056 | 210.037 |
| When $n_2 \geqq n_{20}$, $n_{2m}$ = | 1.708 | 1.790 | 1.776 | 1.773 | 1.745 |
| When $n_2 < n_{20}$, $n_{2m}$ = | 1.572 | 1.608 | 1.579 | 1.640 | 1.616 |
| When $k_2 \geqq k_{20}$, $k_{2m}$ = | 0.448 | 0.378 | 0.316 | 0.184 | 0.323 |
| When $k_2 < k_{20}$, $k_{2m}$ = | 0.357 | 0.255 | 0.190 | 0.115 | 0.176 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 99.374 | 118.240 | 154.295 | 239.447 | 146.164 |

| 1.2 < NA ≦ 1.3<br>115 < T ≦ 125 | | | |
|---|---|---|---|
| Case | 12-06 | 12-07 | 12-08 |
| $n_{10}$ | 1.695 | 1.696 | 1.706 |
| $k_{10}$ | 0.061 | 0.056 | 0.051 |
| $d_{10}$ (nm) | 216.166 | 214.076 | 276.333 |
| $n_{20}$ | 1.690 | 1.694 | 1.706 |
| $k_{20}$ | 0.192 | 0.163 | 0.162 |
| $d_{20}$ (nm) | 222.296 | 280.805 | 273.925 |
| When $n_1 \geqq n_{10}$, $n_{1m}$ = | 1.728 | 1.750 | 1.770 |
| When $n_1 < n_{10}$, $n_{1m}$ = | 1.664 | 1.664 | 1.647 |
| When $k_1 \geqq k_{10}$, $k_{1m}$ = | 0.099 | 0.099 | 0.090 |
| When $k_1 < k_{10}$, $k_{1m}$ = | 0.029 | 0.023 | 0.020 |
| When $d_1 \geqq d_{10}$, $d_{1m}$ (nm) = | ∞ | ∞ | ∞ |
| When $d_1 < d_{10}$, $d_{1m}$ (nm) = | 190.492 | 185.642 | 181.694 |
| When $n_2 \geqq n_{20}$, $n_{2m}$ = | 1.826 | 1.931 | 1.851 |
| When $n_2 < n_{20}$, $n_{2m}$ = | 1.594 | 1.560 | 1.519 |
| When $k_2 \geqq k_{20}$, $k_{2m}$ = | 0.297 | 0.283 | 0.279 |
| When $k_2 < k_{20}$, $k_{2m}$ = | 0.128 | 0.103 | 0.095 |
| When $d_2 \geqq d_{20}$, $d_{2m}$ (nm) = | ∞ | ∞ | ∞ |
| When $d_2 < d_{20}$, $d_{2m}$ (nm) = | 188.671 | 203.385 | 188.718 |

| 1.2 < NA ≦ 1.3<br>125 < T ≦ 135 | | | | | 14/21 |
|---|---|---|---|---|---|
| Case | 13-01 | 13-02 | 13-03 | 13-04 | 13-05 |
| $n_{10}$ | 1.909 | 1.895 | 1.879 | 1.694 | 1.695 |
| $k_{10}$ | 0.116 | 0.106 | 0.083 | 0.071 | 0.063 |
| $d_{10}$ (nm) | 14.671 | 12.483 | 11.828 | 219.020 | 215.746 |
| $n_{20}$ | 1.733 | 1.700 | 1.710 | 1.682 | 1.690 |
| $k_{20}$ | 0.334 | 0.261 | 0.220 | 0.245 | 0.197 |
| $d_{20}$ (nm) | 163.102 | 225.249 | 280.433 | 153.670 | 212.983 |
| When $n_1 \geqq n_{10}$, $n_{1m}$ = | 1.981 | 1.985 | 1.982 | 1.717 | 1.723 |
| When $n_1 < n_{10}$, $n_{1m}$ = | 1.878 | 1.850 | 1.819 | 1.677 | 1.665 |
| When $k_1 \geqq k_{10}$, $k_{1m}$ = | 0.162 | 0.173 | 0.169 | 0.103 | 0.099 |
| When $k_1 < k_{10}$, $k_{1m}$ = | 0.035 | 0.004 | 0.000 | 0.051 | 0.034 |
| When $d_1 \geqq d_{10}$, $d_{1m}$ (nm) = | 19.040 | 17.738 | 18.242 | 233.783 | ∞ |
| When $d_1 < d_{10}$, $d_{1m}$ (nm) = | 12.910 | 9.987 | 8.329 | 211.731 | 191.269 |
| When $n_2 \geqq n_{20}$, $n_{2m}$ = | 1.795 | 1.771 | 1.785 | 1.724 | 1.797 |
| When $n_2 < n_{20}$, $n_{2m}$ = | 1.610 | 1.575 | 1.592 | 1.634 | 1.609 |
| When $k_2 \geqq k_{20}$, $k_{2m}$ = | 0.389 | 0.319 | 0.285 | 0.337 | 0.302 |
| When $k_2 < k_{20}$, $k_{2m}$ = | 0.261 | 0.192 | 0.153 | 0.187 | 0.133 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 109.327 | 144.773 | 164.318 | 140.585 | 192.523 |

-continued

| 1.2 < NA ≦ 1.3<br>125 < T ≦ 135 | | |
|---|---|---|
| Case | 13-06 | 13-07 |
| $n_{10}$ | 1.696 | 1.706 |
| $k_{10}$ | 0.057 | 0.052 |
| $d_{10}$ (nm) | 213.723 | 276.363 |
| $n_{20}$ | 1.693 | 1.706 |
| $k_{20}$ | 0.165 | 0.164 |
| $d_{20}$ (nm) | 271.596 | 264.087 |
| When $n_1 \geqq n_{10}$, $n_{1m}$ = | 1.749 | 1.772 |
| When $n_1 < n_{10}$, $n_{1m}$ = | 1.664 | 1.645 |
| When $k_1 \geqq k_{10}$, $k_{1m}$ = | 0.099 | 0.090 |
| When $k_1 < k_{10}$, $k_{1m}$ = | 0.026 | 0.022 |
| When $d_1 \geqq d_{10}$, $d_{1m}$ (nm) = | ∞ | ∞ |
| When $d_1 < d_{10}$, $d_{1m}$ (nm) = | 186.782 | 182.830 |
| When $n_2 \geqq n_{20}$, $n_{2m}$ = | 1.934 | 1.851 |
| When $n_2 < n_{20}$, $n_{2m}$ = | 1.561 | 1.521 |
| When $k_2 \geqq k_{20}$, $k_{2m}$ = | 0.285 | 0.282 |
| When $k_2 < k_{20}$, $k_{2m}$ = | 0.104 | 0.097 |
| When $d_2 \geqq d_{20}$, $d_{2m}$ (nm) = | ∞ | ∞ |
| When $d_2 < d_{20}$, $d_{2m}$ (nm) = | 198.444 | 183.298 |

| 1.2 < NA ≦ 1.3<br>135 < T ≦ 145 | | | | | 15/21 |
|---|---|---|---|---|---|
| Case | 14-01 | 14-02 | 14-03 | 14-04 | 14-05 |
| $n_{10}$ | 1.910 | 1.892 | 1.879 | 1.694 | 1.694 |
| $k_{10}$ | 0.115 | 0.109 | 0.084 | 0.072 | 0.064 |
| $d_{10}$ (nm) | 15.725 | 12.960 | 12.187 | 218.706 | 215.091 |
| $n_{20}$ | 1.755 | 1.698 | 1.712 | 1.684 | 1.689 |
| $k_{20}$ | 0.355 | 0.268 | 0.226 | 0.254 | 0.201 |
| $d_{20}$ (nm) | 150.207 | 215.505 | 270.397 | 144.577 | 204.614 |
| When $n_1 \geqq n_{10}$, $n_{1m}$ = | 1.980 | 1.980 | 1.979 | 1.708 | 1.720 |
| When $n_1 < n_{10}$, $n_{1m}$ = | 1.881 | 1.848 | 1.820 | 1.676 | 1.666 |
| When $k_1 \geqq k_{10}$, $k_{1m}$ = | 0.157 | 0.174 | 0.167 | 0.100 | 0.099 |
| When $k_1 < k_{10}$, $k_{1m}$ = | 0.036 | 0.011 | 0.000 | 0.054 | 0.038 |
| When $d_1 \geqq d_{10}$, $d_{1m}$ (nm) = | 20.158 | 18.254 | 18.627 | 231.071 | ∞ |
| When $d_1 < d_{10}$, $d_{1m}$ (nm) = | 14.003 | 10.450 | 8.694 | 211.497 | 191.698 |
| When $n_2 \geqq n_{20}$, $n_{2m}$ = | 1.818 | 1.767 | 1.787 | 1.721 | 1.802 |
| When $n_2 < n_{20}$, $n_{2m}$ = | 1.632 | 1.571 | 1.592 | 1.649 | 1.619 |
| When $k_2 \geqq k_{20}$, $k_{2m}$ = | 0.415 | 0.327 | 0.291 | 0.345 | 0.308 |
| When $k_2 < k_{20}$, $k_{2m}$ = | 0.275 | 0.197 | 0.157 | 0.200 | 0.145 |
| When $d_2 \geqq d_{20}$, $d_{2m}$ (nm) = | ∞ | ∞ | ∞ | 160.527 | ∞ |
| When $d_2 < d_{20}$, $d_{2m}$ (nm) = | 119.641 | 139.482 | 181.534 | 134.106 | 186.758 |

| 1.2 < NA ≦ 1.3<br>135 < T ≦ 145 | | |
|---|---|---|
| Case | 14-06 | 14-07 |
| $n_{10}$ | 1.696 | 1.706 |
| $k_{10}$ | 0.058 | 0.052 |
| $d_{10}$ (nm) | 213.482 | 276.472 |
| $n_{20}$ | 1.692 | 1.707 |
| $k_{20}$ | 0.169 | 0.168 |
| $d_{20}$ (nm) | 262.678 | 254.823 |
| When $n_1 \geqq n_{10}$, $n_{1m}$ = | 1.748 | 1.771 |
| When $n_1 < n_{10}$, $n_{1m}$ = | 1.665 | 1.644 |

-continued

| | | |
|---|---|---|
| When $k_1 \geqq k_{10}$, $k_{1m}$ = | 0.100 | 0.090 |
| When $k_1 < k_{10}$, $k_{1m}$ = | 0.028 | 0.024 |
| When $d_1 \geqq d_{10}$, $d_{1m}$ (nm) = | ∞ | ∞ |
| When $d_1 < d_{10}$, $d_{1m}$ (nm) = | 188.144 | 184.314 |
| When $n_2 \geqq n_{20}$, $n_{2m}$ = | 1.933 | 1.854 |
| When $n_2 < n_{20}$, $n_{2m}$ = | 1.561 | 1.522 |
| When $k_2 \geqq k_{20}$, $k_{2m}$ = | 0.288 | 0.286 |
| When $k_2 < k_{20}$, $k_{2m}$ = | 0.109 | 0.100 |
| When $d_2 \geqq d_{20}$, $d_{2m}$ (nm) = | ∞ | ∞ |
| When $d_2 < d_{20}$, $d_{2m}$ (nm) = | 191.540 | 174.816 |

1.2 < NA ≦ 1.3
145 < T ≦ 155

16/21

| Case | 15-01 | 15-02 | 15-03 | 15-04 | 15-05 |
|---|---|---|---|---|---|
| $n_{10}$ | 1.919 | 1.893 | 1.882 | 1.694 | 1.694 |
| $k_{10}$ | 0.115 | 0.113 | 0.085 | 0.074 | 0.065 |
| $d_{10}$ (nm) | 16.638 | 13.413 | 12.438 | 217.741 | 214.737 |
| $n_{20}$ | 1.785 | 1.697 | 1.715 | 1.683 | 1.687 |
| $k_{20}$ | 0.385 | 0.281 | 0.235 | 0.264 | 0.207 |
| $d_{20}$ (nm) | 138.580 | 206.656 | 261.237 | 137.032 | 196.488 |
| When $n_1 \geqq n_{10}$, $n_{1m}$ = | 1.986 | 1.976 | 1.980 | 1.705 | 1.718 |
| When $n_1 < n_{10}$, $n_{1m}$ = | 1.892 | 1.851 | 1.826 | 1.676 | 1.666 |
| When $k_1 \geqq k_{10}$, $k_{1m}$ = | 0.151 | 0.174 | 0.165 | 0.099 | 0.100 |
| When $k_1 < k_{10}$, $k_{1m}$ = | 0.037 | 0.018 | 0.000 | 0.060 | 0.040 |
| When $d_1 \geqq d_{10}$, $d_{1m}$ (nm) = | 20.946 | 18.588 | 18.692 | 227.547 | ∞ |
| When $d_1 < d_{10}$, $d_{1m}$ (nm) = | 15.073 | 10.996 | 9.087 | 210.480 | 192.120 |
| When $n_2 \geqq n_{20}$, $n_{2m}$ = | 1.846 | 1.763 | 1.789 | 1.722 | 1.834 |
| When $n_2 < n_{20}$, $n_{2m}$ = | 1.665 | 1.571 | 1.591 | 1.652 | 1.629 |
| When $k_2 \geqq k_{20}$, $k_{2m}$ = | 0.451 | 0.339 | 0.301 | 0.337 | 0.312 |
| When $k_2 < k_{20}$, $k_{2m}$ = | 0.301 | 0.209 | 0.166 | 0.217 | 0.151 |
| When $d_2 \geqq d_{20}$, $d_{2m}$ (nm) = | ∞ | ∞ | ∞ | 149.574 | ∞ |
| When $d_2 < d_{20}$, $d_{2m}$ (nm) = | 113.921 | 135.398 | 177.745 | 128.876 | 178.069 |

1.2 < NA ≦ 1.3
145 < T ≦ 155

| Case | 15-06 | 15-07 |
|---|---|---|
| $n_{10}$ | 1.695 | 1.707 |
| $k_{10}$ | 0.059 | 0.053 |
| $d_{10}$ (nm) | 213.710 | 276.548 |
| $n_{20}$ | 1.692 | 1.707 |
| $k_{20}$ | 0.173 | 0.174 |
| $d_{20}$ (nm) | 253.675 | 246.168 |
| When $n_1 \geqq n_{10}$, $n_{1m}$ = | 1.747 | 1.770 |
| When $n_1 < n_{10}$, $n_{1m}$ = | 1.665 | 1.645 |
| When $k_1 \geqq k_{10}$, $k_{1m}$ = | 0.100 | 0.089 |
| When $k_1 < k_{10}$, $k_{1m}$ = | 0.029 | 0.025 |
| When $d_1 \geqq d_{10}$, $d_{1m}$ (nm) = | ∞ | ∞ |
| When $d_1 < d_{10}$, $d_{1m}$ (nm) = | 189.864 | 185.926 |
| When $n_2 \geqq n_{20}$, $n_{2m}$ = | 1.910 | 1.858 |
| When $n_2 < n_{20}$, $n_{2m}$ = | 1.562 | 1.520 |
| When $k_2 \geqq k_{20}$, $k_{2m}$ = | 0.289 | 0.291 |
| When $k_2 < k_{20}$, $k_{2m}$ = | 0.109 | 0.103 |
| When $d_2 \geqq d_{20}$, $d_{2m}$ (nm) = | ∞ | ∞ |
| When $d_2 < d_{20}$, $d_{2m}$ (nm) = | 189.584 | 169.414 |

1.2 < NA ≦ 1.3
155 < T ≦ 165

17/21

| Case | 16-01 | 16-02 | 16-03 | 16-04 | 16-05 |
|---|---|---|---|---|---|
| $n_{10}$ | 1.937 | 1.898 | 1.890 | 1.694 | 1.694 |
| $k_{10}$ | 0.118 | 0.119 | 0.087 | 0.077 | 0.067 |
| $d_{10}$ (nm) | 16.771 | 13.576 | 12.460 | 216.630 | 214.866 |
| $n_{20}$ | 1.806 | 1.695 | 1.718 | 1.679 | 1.684 |
| $k_{20}$ | 0.418 | 0.295 | 0.246 | 0.277 | 0.215 |
| $d_{20}$ (nm) | 129.251 | 198.434 | 252.589 | 129.875 | 188.027 |
| When $n_1 \geqq n_{10}$, $n_{1m}$ = | 2.001 | 1.978 | 1.985 | 1.707 | 1.716 |
| When $n_1 < n_{10}$, $n_{1m}$ = | 1.914 | 1.859 | 1.836 | 1.685 | 1.666 |
| When $k_1 \geqq k_{10}$, $k_{1m}$ = | 0.148 | 0.176 | 0.164 | 0.101 | 0.100 |
| When $k_1 < k_{10}$, $k_{1m}$ = | 0.045 | 0.025 | 0.000 | 0.067 | 0.040 |
| When $d_1 \geqq d_{10}$, $d_{1m}$ (nm) = | 20.691 | 18.424 | 18.356 | 225.238 | 231.093 |
| When $d_1 < d_{10}$, $d_{1m}$ (nm) = | 15.556 | 11.376 | 9.363 | 212.673 | 192.697 |
| When $n_2 \geqq n_{20}$, $n_{2m}$ = | 1.861 | 1.756 | 1.791 | 1.715 | 1.840 |
| When $n_2 < n_{20}$, $n_{2m}$ = | 1.690 | 1.574 | 1.591 | 1.643 | 1.628 |
| When $k_2 \geqq k_{20}$, $k_{2m}$ = | 0.481 | 0.351 | 0.310 | 0.328 | 0.314 |
| When $k_2 < k_{20}$, $k_{2m}$ = | 0.336 | 0.225 | 0.176 | 0.223 | 0.151 |
| When $d_2 \geqq d_{20}$, $d_{2m}$ (nm) = | ∞ | ∞ | ∞ | 139.199 | ∞ |
| When $d_2 < d_{20}$, $d_{2m}$ (nm) = | 109.768 | 131.712 | 172.718 | 120.241 | 167.595 |

1.2 < NA ≦ 1.3
155 < T ≦ 165

| Case | 16-06 | 16-07 |
|---|---|---|
| $n_{10}$ | 1.695 | 1.707 |
| $k_{10}$ | 0.060 | 0.054 |
| $d_{10}$ (nm) | 214.034 | 276.376 |
| $n_{20}$ | 1.692 | 1.707 |
| $k_{20}$ | 0.179 | 0.181 |
| $d_{20}$ (nm) | 244.657 | 237.806 |
| When $n_1 \geqq n_{10}$, $n_{1m}$ = | 1.745 | 1.770 |
| When $n_1 < n_{10}$, $n_{1m}$ = | 1.666 | 1.653 |
| When $k_1 \geqq k_{10}$, $k_{1m}$ = | 0.101 | 0.089 |
| When $k_1 < k_{10}$, $k_{1m}$ = | 0.030 | 0.027 |
| When $d_1 \geqq d_{10}$, $d_{1m}$ (nm) = | ∞ | ∞ |
| When $d_1 < d_{10}$, $d_{1m}$ (nm) = | 191.630 | 187.468 |
| When $n_2 \geqq n_{20}$, $n_{2m}$ = | 1.889 | 1.864 |
| When $n_2 < n_{20}$, $n_{2m}$ = | 1.562 | 1.515 |
| When $k_2 \geqq k_{20}$, $k_{2m}$ = | 0.290 | 0.295 |
| When $k_2 < k_{20}$, $k_{2m}$ = | 0.115 | 0.110 |
| When $d_2 \geqq d_{20}$, $d_{2m}$ (nm) = | ∞ | ∞ |
| When $d_2 < d_{20}$, $d_{2m}$ (nm) = | 179.119 | 164.223 |

1.2 < NA ≦ 1.3
165 < T ≦ 175

18/21

| Case | 17-01 | 17-02 | 17-03 | 17-04 | 17-05 |
|---|---|---|---|---|---|
| $n_{10}$ | 1.958 | 1.903 | 1.898 | 1.694 | 1.694 |
| $k_{10}$ | 0.128 | 0.127 | 0.090 | 0.080 | 0.068 |
| $d_{10}$ (nm) | 15.815 | 13.420 | 12.296 | 215.821 | 215.165 |
| $n_{20}$ | 1.794 | 1.688 | 1.719 | 1.668 | 1.681 |
| $k_{20}$ | 0.439 | 0.307 | 0.254 | 0.290 | 0.224 |
| $d_{20}$ (nm) | 123.830 | 190.984 | 244.231 | 122.663 | 179.093 |
| When $n_1 \geqq n_{10}$, $n_{1m}$ = | 2.020 | 1.981 | 1.991 | 1.707 | 1.716 |
| When $n_1 < n_{10}$, $n_{1m}$ = | 1.942 | 1.867 | 1.846 | 1.692 | 1.665 |
| When $k_1 \geqq k_{10}$, $k_{1m}$ = | 0.150 | 0.182 | 0.165 | 0.103 | 0.101 |
| When $k_1 < k_{10}$, $k_{1m}$ = | 0.058 | 0.033 | 0.000 | 0.077 | 0.041 |
| When $d_1 \geqq d_{10}$, $d_{1m}$ (nm) = | 19.257 | 17.848 | 17.802 | 223.701 | 230.268 |
| When $d_1 < d_{10}$, $d_{1m}$ (nm) = | 15.087 | 11.461 | 9.465 | 215.120 | 195.890 |
| When $n_2 \geqq n_{20}$, $n_{2m}$ = | 1.832 | 1.743 | 1.790 | 1.677 | 1.826 |

-continued

| | | | | | |
|---|---|---|---|---|---|
| When $n_2 < n_{20}$, $n_{2m}$ = | 1.680 | 1.570 | 1.590 | 1.625 | 1.625 |
| When $k_2 \geqq k_{20}$, $k_{2m}$ = | 0.483 | 0.357 | 0.316 | 0.321 | 0.315 |
| When $k_2 < k_{20}$, $k_{2m}$ = | 0.365 | 0.239 | 0.186 | 0.252 | 0.151 |
| When $d_2 \geqq d_{20}$, $d_{2m}$ (nm) = | ∞ | ∞ | ∞ | 127.631 | ∞ |
| When $d_2 < d_{20}$, $d_{2m}$ (nm) = | 111.992 | 128.672 | 166.465 | 109.461 | 158.121 |

1.2 < NA ≦ 1.3
165 < T ≦ 175

| Case | 17-06 | 17-07 |
|---|---|---|
| $n_{10}$ | 1.696 | 1.707 |
| $k_{10}$ | 0.061 | 0.056 |
| $d_{10}$ (nm) | 214.210 | 275.996 |
| $n_{20}$ | 1.692 | 1.705 |
| $k_{20}$ | 0.185 | 0.187 |
| $d_{20}$ (nm) | 235.479 | 229.352 |
| When $n_1 \geqq n_{10}$, $n_{1m}$ = | 1.744 | 1.770 |
| When $n_1 < n_{10}$, $n_{1m}$ = | 1.667 | 1.657 |
| When $k_1 \geqq k_{10}$, $k_{1m}$ = | 0.101 | 0.088 |
| When $k_1 < k_{10}$, $k_{1m}$ = | 0.031 | 0.030 |
| When $d_1 \geqq d_{10}$, $d_{1m}$ (nm) = | ∞ | ∞ |
| When $d_1 < d_{10}$, $d_{1m}$ (nm) = | 193.216 | 188.863 |
| When $n_2 \geqq n_{20}$, $n_{2m}$ = | 1.887 | 1.872 |
| When $n_2 < n_{20}$, $n_{2m}$ = | 1.561 | 1.509 |
| When $k_2 \geqq k_{20}$, $k_{2m}$ = | 0.292 | 0.295 |
| When $k_2 < k_{20}$, $k_{2m}$ = | 0.120 | 0.115 |
| When $d_2 \geqq d_{20}$, $d_{2m}$ (nm) = | ∞ | ∞ |
| When $d_2 < d_{20}$, $d_{2m}$ (nm) = | 161.210 | 156.975 |

1.2 < NA ≦ 1.3
175 < T ≦ 185

| Case | 18-01 | 18-02 | 18-03 | 18-04 | 19/21<br>18-05 |
|---|---|---|---|---|---|
| $n_{10}$ | 1.907 | 1.904 | 1.694 | 1.696 | 1.704 |
| $k_{10}$ | 0.135 | 0.092 | 0.070 | 0.062 | 0.051 |
| $d_{10}$ (nm) | 13.188 | 12.121 | 215.718 | 214.371 | 274.345 |
| $n_{20}$ | 1.679 | 1.720 | 1.679 | 1.692 | 1.687 |
| $k_{20}$ | 0.313 | 0.260 | 0.233 | 0.190 | 0.159 |
| $d_{20}$ (nm) | 183.151 | 235.214 | 169.072 | 225.802 | 280.556 |
| When $n_1 \geqq n_{10}$, $n_{1m}$ = | 1.982 | 1.997 | 1.715 | 1.743 | 1.760 |
| When $n_1 < n_{10}$, $n_{1m}$ = | 1.873 | 1.854 | 1.666 | 1.668 | 1.658 |
| When $k_1 \geqq k_{10}$, $k_{1m}$ = | 0.188 | 0.166 | 0.102 | 0.102 | 0.090 |
| When $k_1 < k_{10}$, $k_{1m}$ = | 0.044 | 0.000 | 0.044 | 0.032 | 0.018 |
| When $d_1 \geqq d_{10}$, $d_{1m}$ (nm) = | 17.244 | 17.308 | 229.740 | ∞ | ∞ |
| When $d_1 < d_{10}$, $d_{1m}$ (nm) = | 11.395 | 9.486 | 201.461 | 194.630 | 174.558 |
| When $n_2 \geqq n_{20}$, $n_{2m}$ = | 1.730 | 1.790 | 1.771 | 1.836 | 1.900 |
| When $n_2 < n_{20}$, $n_{2m}$ = | 1.562 | 1.589 | 1.630 | 1.559 | 1.518 |
| When $k_2 \geqq k_{20}$, $k_{2m}$ = | 0.359 | 0.319 | 0.318 | 0.293 | 0.259 |
| When $k_2 < k_{20}$, $k_{2m}$ = | 0.249 | 0.193 | 0.159 | 0.124 | 0.097 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 128.127 | 156.903 | 151.088 | 157.464 | 192.992 |

1.2 < NA ≦ 1.3
185 < T ≦ 195

| Case | 19-01 | 19-02 | 19-03 | 19-04 | 20/21<br>19-05 |
|---|---|---|---|---|---|
| $n_{10}$ | 1.908 | 1.906 | 1.889 | 1.693 | 1.696 |
| $k_{10}$ | 0.140 | 0.092 | 0.087 | 0.071 | 0.064 |
| $d_{10}$ (nm) | 13.288 | 12.370 | 11.418 | 216.427 | 214.510 |

-continued

| | | | | | |
|---|---|---|---|---|---|
| $n_{20}$ | 1.676 | 1.726 | 1.707 | 1.681 | 1.692 |
| $k_{20}$ | 0.321 | 0.266 | 0.223 | 0.243 | 0.195 |
| $d_{20}$ (nm) | 172.696 | 223.910 | 283.898 | 158.126 | 215.938 |
| When $n_1 \geqq n_{10}$, $n_{1m}$ = | 1.981 | 1.996 | 1.994 | 1.713 | 1.742 |
| When $n_1 < n_{10}$, $n_{1m}$ = | 1.875 | 1.857 | 1.834 | 1.670 | 1.669 |
| When $k_1 \geqq k_{10}$, $k_{1m}$ = | 0.190 | 0.163 | 0.168 | 0.103 | 0.102 |
| When $k_1 < k_{10}$, $k_{1m}$ = | 0.055 | 0.000 | 0.000 | 0.051 | 0.037 |
| When $d_1 \geqq d_{10}$, $d_{1m}$ (nm) = | 17.148 | 17.446 | 17.407 | 228.093 | ∞ |
| When $d_1 < d_{10}$, $d_{1m}$ (nm) = | 11.532 | 9.791 | 8.458 | 205.012 | 195.805 |
| When $n_2 \geqq n_{20}$, $n_{2m}$ = | 1.725 | 1.797 | 1.791 | 1.767 | 1.825 |
| When $n_2 < n_{20}$, $n_{2m}$ = | 1.558 | 1.592 | 1.590 | 1.647 | 1.558 |
| When $k_2 \geqq k_{20}$, $k_{2m}$ = | 0.365 | 0.327 | 0.286 | 0.323 | 0.294 |
| When $k_2 < k_{20}$, $k_{2m}$ = | 0.256 | 0.198 | 0.157 | 0.178 | 0.130 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 125.060 | 143.864 | 171.207 | 144.997 | 180.034 |

1.2 < NA ≦ 1.3
185 < T ≦ 195

| Case | 19-06 | 19-07 |
|---|---|---|
| $n_{10}$ | 1.696 | 1.704 |
| $k_{10}$ | 0.057 | 0.052 |
| $d_{10}$ (nm) | 213.492 | 274.677 |
| $n_{20}$ | 1.691 | 1.687 |
| $k_{20}$ | 0.166 | 0.162 |
| $d_{20}$ (nm) | 273.809 | 270.432 |
| When $n_1 \geqq n_{10}$, $n_{1m}$ = | 1.742 | 1.760 |
| When $n_1 < n_{10}$, $n_{1m}$ = | 1.666 | 1.659 |
| When $k_1 \geqq k_{10}$, $k_{1m}$ = | 0.097 | 0.090 |
| When $k_1 < k_{10}$, $k_{1m}$ = | 0.026 | 0.022 |
| When $d_1 \geqq d_{10}$, $d_{1m}$ (nm) = | ∞ | ∞ |
| When $d_1 < d_{10}$, $d_{1m}$ (nm) = | 178.602 | 175.003 |
| When $n_2 \geqq n_{20}$, $n_{2m}$ = | 1.857 | 1.904 |
| When $n_2 < n_{20}$, $n_{2m}$ = | 1.570 | 1.518 |
| When $k_2 \geqq k_{20}$, $k_{2m}$ = | 0.281 | 0.262 |
| When $k_2 < k_{20}$, $k_{2m}$ = | 0.104 | 0.096 |
| When $d_2 \geqq d_{20}$, $d_{2m}$ (nm) = | ∞ | ∞ |
| When $d_2 < d_{20}$, $d_{2m}$ (nm) = | 199.693 | 186.949 |

1.2 < NA ≦ 1.3
195 < T ≦ 205

| Case | 20-01 | 20-02 | 20-03 | 20-04 | 21/21<br>20-05 |
|---|---|---|---|---|---|
| $n_{10}$ | 1.907 | 1.904 | 1.887 | 1.693 | 1.696 |
| $k_{10}$ | 0.139 | 0.091 | 0.088 | 0.073 | 0.065 |
| $d_{10}$ (nm) | 13.915 | 13.010 | 11.752 | 216.656 | 214.259 |
| $n_{20}$ | 1.684 | 1.734 | 1.707 | 1.683 | 1.692 |
| $k_{20}$ | 0.334 | 0.275 | 0.227 | 0.253 | 0.201 |
| $d_{20}$ (nm) | 160.500 | 212.141 | 273.737 | 148.279 | 206.980 |
| When $n_1 \geqq n_{10}$, $n_{1m}$ = | 1.978 | 1.992 | 1.990 | 1.700 | 1.743 |
| When $n_1 < n_{10}$, $n_{1m}$ = | 1.874 | 1.857 | 1.833 | 1.671 | 1.670 |
| When $k_1 \geqq k_{10}$, $k_{1m}$ = | 0.186 | 0.158 | 0.167 | 0.098 | 0.102 |
| When $k_1 < k_{10}$, $k_{1m}$ = | 0.059 | 0.000 | 0.000 | 0.062 | 0.044 |
| When $d_1 \geqq d_{10}$, $d_{1m}$ (nm) = | 17.817 | 18.151 | 17.811 | 226.068 | 265.367 |
| When $d_1 < d_{10}$, $d_{1m}$ (nm) = | 12.124 | 10.391 | 8.783 | 207.088 | 196.420 |
| When $n_2 \geqq n_{20}$, $n_{2m}$ = | 1.731 | 1.806 | 1.791 | 1.746 | 1.815 |
| When $n_2 < n_{20}$, $n_{2m}$ = | 1.564 | 1.602 | 1.588 | 1.669 | 1.556 |
| When $k_2 \geqq k_{20}$, $k_{2m}$ = | 0.381 | 0.338 | 0.291 | 0.321 | 0.294 |
| When $k_2 < k_{20}$, $k_{2m}$ = | 0.265 | 0.202 | 0.159 | 0.212 | 0.142 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 125.465 | 136.447 | 180.411 | 144.423 | 187.001 |

-continued

| 1.2 < NA ≦ 1.3<br>195 < T ≦ 205 | | |
|---|---|---|
| Case | 20-06 | 20-07 |
| $n_{10}$ | 1.696 | 1.704 |
| $k_{10}$ | 0.058 | 0.053 |
| $d_{10}$ (nm) | 213.637 | 275.120 |
| $n_{20}$ | 1.690 | 1.687 |
| $k_{20}$ | 0.169 | 0.165 |
| $d_{20}$ (nm) | 264.528 | 260.887 |
| When $n_1 \geqq n_{10}$, $n_{1m}$ = | 1.742 | 1.760 |
| When $n_1 < n_{10}$, $n_{1m}$ = | 1.666 | 1.661 |
| When $k_1 \geqq k_{10}$, $k_{1m}$ = | 0.097 | 0.090 |
| When $k_1 < k_{10}$, $k_{1m}$ = | 0.030 | 0.025 |
| When $d_1 \geqq d_{10}$, $d_{1m}$ (nm) = | ∞ | ∞ |
| When $d_1 < d_{10}$, $d_{1m}$ (nm) = | 183.526 | 175.348 |
| When $n_2 \geqq n_{20}$, $n_{2m}$ = | 1.856 | 1.912 |
| When $n_2 < n_{20}$, $n_{2m}$ = | 1.571 | 1.519 |
| When $k_2 \geqq k_{20}$, $k_{2m}$ = | 0.282 | 0.268 |
| When $k_2 < k_{20}$, $k_{2m}$ = | 0.108 | 0.102 |
| When $d_2 \geqq d_{20}$, $d_{2m}$ (nm) = | ∞ | ∞ |
| When $d_2 < d_{20}$, $d_{2m}$ (nm) = | 202.896 | 181.779. |

5. An exposure method used in a process for manufacturing a semiconductor device, the method comprising the steps of:

providing an antireflective film having a two-layer structure between a resist layer and a silicon oxide layer formed on a surface of a silicon semiconductor substrate and having a thickness T (unit: nm) described below; and exposing the resist layer in an exposure system having a wavelength of 190 nm to 195 nm and a numerical aperture NA of $1.3 < NA \leqq 1.4$, the antireflective film including an upper layer having a complex refractive index $N_1$, and a lower layer having a complex refractive index $N_2$, the complex refractive indexes $N_1$ and $N_2$ being represented by the equations $N_1 = n_1 - k_1 i$ and $N_2 = n_2 - k_2 i$, respectively;

wherein assuming that the thickness of the upper layer is $d_1$ (unit: nm) and the thickness of the lower layer is $d_2$ (unit: nm) , when any one of the combinations of values of $[n_{10}, k_{10}, d_{10}, n_{20}, k_{20}, d_{20}]$ described below is selected depending on the thickness T of the silicon oxide film, $n_1$, $k_1$, $d_1$, $n_2$, $k_2$, and $d_2$ satisfy the relational expression $$\{(n_1-n_{10})/(n_{1m}-n_{10})\}^2+\{(k_1-k_{10})/(k_{1m}-k_{10})\}^2+\{(d_1-d_{10})/(d_{1m}-d_{10})\}^2+\{(n_2-n_{20})/(n_{2m}-n_{20})\}^2+\{(k_2-k_{20})/(k_{2m}-k_{20})\}^2+\{(d_2-d_{20})/(d_{2m}-d_{20})\}^2 \leqq 1;$$

a value of $n_{1m}$ in a corresponding case is selected on the basis of a magnitude relation between $n_1$ and $n_{10}$; a value of $k_{1m}$ in a corresponding case is selected on the basis of a magnitude relation between $k_1$ and $k_{10}$; a value of $d_{1m}$ in a corresponding case is selected on the basis of a magnitude relation between $d_1$ and $d_{10}$; a value of $n_{2m}$ in a corresponding case is selected on the basis of a magnitude relation between $n_2$ and $n_{20}$; a value of $k_{2m}$ in a corresponding case is selected on the basis of a magnitude relation between $k_2$ and $k_{20}$; and a value of $d_{2m}$ in a corresponding case is selected on the basis of a magnitude relation between $d_2$ and $d_{20}$; and in the tables below, in the line of "When $n_1 \geqq n_{10}$, $n_{1m}$=", each value in the right columns is "$n_{1m}-n_{10}$"; in the line of "When $n_1 < n_{10}$, $n_{1m}$=", each value in the right columns is "$n_{10}-n_{1m}$"; in the line of "When $k_1 \geqq k_{10}$, $k_{1m}$=", each value in the right columns is "$k_{1m}-k_{10}$"; in the line of "When $k_1 < k_{10}$, $k_{1m}$=" each value in the right columns is "$k_{1m}$"; in the line of "When $d_1 \geqq d_{10}$, $d_{1m}$ (nm) =", each value (unit: nm) in the right columns is "$d_{1m}-d_{10}$"; in the line of "When $d_1 < d_{10}$, $d_{1m}$ (nm) =", each value (unit: nm) in the right columns is "$d_{10}-d_{1m}$"; in the line of "When $n_2 \geqq n_{20}$, $n_{2m}$=", each value in the right columns is "$n_{2m}-n_{20}$"; in the line of "When $n_2 < n_{20}$, $n_{2m}$=", each value in the right columns is "$n_{20}-n_{2m}$"; in the line of "When $k_2 \geqq k_{20}$, $k_{2m}$=", each value in the right columns is "$k_{2m}-k_{20}$"; in the line of "When $k_2 < k_{20}$, $k_{2m}$=", each value in the right columns is "$k_{20}-k_{2m}$"; in the line of "When $d_2 \geqq d_{20}$, $d_{2m}$ (nm) =", each value (unit: nm) in the right columns is "$d_{2m}-d_{20}$"; and in the line of "When $d_2 < d_{20}$, $d_{2m}$ (nm) =", each value (unit: nm) in the right columns is "$d_{20}-d_{2m}$".

| 1.3 < NA ≦ 1.4<br>2 ≦ T ≦ 15 | | | | | 1/20 |
|---|---|---|---|---|---|
| Case | 1-01 | 1-02 | 1-03 | 1-04 | 1-05 |
| $n_{10}$ | 2.047 | 1.887 | 1.871 | 1.868 | 1.862 |
| $k_{10}$ | 0.012 | 0.120 | 0.106 | 0.075 | 0.065 |
| $d_{10}$ (nm) | 29.751 | 26.980 | 17.106 | 15.339 | 13.830 |
| $n_{20}$ | 6.274 | 1.973 | 1.713 | 1.738 | 1.730 |
| $k_{20}$ | 3.305 | 0.477 | 0.298 | 0.245 | 0.208 |
| $d_{20}$ (nm) | 1.566 | 76.285 | 158.161 | 212.612 | 271.884 |
| When $n_1 \geqq n_{10}$, $n_{1m}$ = | 2.109 | 1.929 | 1.924 | 1.935 | 1.940 |
| When $n_1 < n_{10}$, $n_{1m}$ = | 1.990 | 1.877 | 1.852 | 1.835 | 1.823 |
| When $k_1 \geqq k_{10}$, $k_{1m}$ = | 0.055 | 0.138 | 0.136 | 0.123 | 0.124 |
| When $k_1 < k_{10}$, $k_{1m}$ = | 0.000 | 0.089 | 0.036 | 0.000 | 0.000 |
| When $d_1 \geqq d_{10}$, $d_{1m}$ (nm) = | 32.767 | 31.708 | 21.551 | 20.868 | 20.183 |
| When $d_1 < d_{10}$, $d_{1m}$ (nm) = | 27.509 | 26.309 | 15.640 | 12.771 | 10.913 |
| When $n_2 \geqq n_{20}$, $n_{2m}$ = | 6.594 | 2.028 | 1.750 | 1.789 | 1.793 |
| When $n_2 < n_{20}$, $n_{2m}$ = | 5.978 | 1.933 | 1.627 | 1.639 | 1.618 |
| When $k_2 \geqq k_{20}$, $k_{2m}$ = | 3.556 | 0.507 | 0.335 | 0.292 | 0.258 |
| When $k_2 < k_{20}$, $k_{2m}$ = | 3.013 | 0.403 | 0.242 | 0.188 | 0.152 |
| When $d_2 \geqq d_{20}$, $d_{2m}$ (nm) = | 1.715 | 83.056 | ∞ | ∞ | ∞ |
| When $d_2 < d_{20}$, $d_{2m}$ (nm) = | 1.418 | 75.266 | 136.202 | 175.723 | 191.206 |

| 1.3 < NA ≦ 1.4<br>2 ≦ T ≦ 15 | | | | | |
|---|---|---|---|---|---|
| Case | 1-06 | 1-07 | 1-08 | 1-09 | 1-10 |
| $n_{10}$ | 1.691 | 1.692 | 1.711 | 1.704 | 1.705 |
| $k_{10}$ | 0.062 | 0.057 | 0.070 | 0.057 | 0.050 |
| $d_{10}$ (nm) | 161.852 | 157.460 | 239.891 | 226.155 | 221.451 |
| $n_{20}$ | 1.688 | 1.697 | 7.420 | 1.689 | 1.695 |
| $k_{20}$ | 0.179 | 0.154 | 3.291 | 0.187 | 0.158 |
| $d_{20}$ (nm) | 207.262 | 266.043 | 0.810 | 202.908 | 261.182 |
| When $n_1 \geqq n_{10}$, $n_{1m}$ = | 1.703 | 1.707 | 1.725 | 1.738 | 1.736 |
| When $n_1 < n_{10}$, $n_{1m}$ = | 1.685 | 1.664 | 1.704 | 1.690 | 1.688 |
| When $k_1 \geqq k_{10}$, $k_{1m}$ = | 0.080 | 0.084 | 0.082 | 0.082 | 0.079 |
| When $k_1 < k_{10}$, $k_{1m}$ = | 0.051 | 0.029 | 0.049 | 0.029 | 0.022 |
| When $d_1 \geqq d_{10}$, $d_{1m}$ (nm) = | 169.125 | 171.143 | 250.745 | ∞ | ∞ |
| When $d_1 < d_{10}$, $d_{1m}$ (nm) = | 157.974 | 129.944 | 235.697 | 215.124 | 204.319 |
| When $n_2 \geqq n_{20}$, $n_{2m}$ = | 1.696 | 1.748 | 7.849 | 1.818 | 1.809 |
| When $n_2 < n_{20}$, $n_{2m}$ = | 1.666 | 1.665 | 7.185 | 1.613 | 1.611 |
| When $k_2 \geqq k_{20}$, $k_{2m}$ = | 0.202 | 0.195 | 3.465 | 0.264 | 0.246 |
| When $k_2 < k_{20}$, $k_{2m}$ = | 0.150 | 0.115 | 2.625 | 0.129 | 0.105 |
| When $d_2 \geqq d_{20}$, $d_{2m}$ (nm) = | 213.501 | ∞ | 0.893 | ∞ | ∞ |
| When $d_2 < d_{20}$, $d_{2m}$ (nm) = | 194.001 | 249.665 | 0.721 | 179.167 | 225.188 |

1.3 NA ≦ 1.4
2 ≦ T ≦ 15

2/20

| Case | 1-11 |
|---|---|
| $n_{10}$ | 1.695 |
| $k_{10}$ | 0.054 |
| $d_{10}$ (nm) | 267.286 |
| $n_{20}$ | 1.705 |
| $k_{20}$ | 0.184 |
| $d_{20}$ (nm) | 212.751 |
| When $n_1 \geqq n_{10}$, $n_{1m}$ = | 1.731 |
| When $n_1 < n_{10}$, $n_{1m}$ = | 1.655 |
| When $k_1 \geqq k_{10}$, $k_{1m}$ = | 0.080 |
| When $k_1 < k_{10}$, $k_{1m}$ = | 0.025 |
| When $d_1 \geqq d_{10}$, $d_{1m}$ (nm) = | ∞ |
| When $d_1 < d_{10}$, $d_{1m}$ (nm) = | 220.771 |
| When $n_2 \geqq n_{20}$, $n_{2m}$ = | 1.808 |
| When $n_2 < n_{20}$, $n_{2m}$ = | 1.623 |
| When $k_2 \geqq k_{20}$, $k_{2m}$ = | 0.237 |
| When $k_2 < k_{20}$, $k_{2m}$ = | 0.115 |
| When $d_2 \geqq d_{20}$, $d_{2m}$ (nm) = | ∞ |
| When $d_2 < d_{20}$, $d_{2m}$ (nm) = | 175.645 |

1.3 < NA ≦ 1.4
15 < T ≦ 25

3/20

| Case | 2-01 | 2-02 | 2-03 | 2-04 | 2-05 |
|---|---|---|---|---|---|
| $n_{10}$ | 1.943 | 1.876 | 1.873 | 1.866 | 1.691 |
| $k_{10}$ | 0.121 | 0.112 | 0.080 | 0.068 | 0.064 |
| $d_{10}$ (nm) | 34.905 | 17.699 | 15.588 | 14.042 | 161.844 |
| $n_{20}$ | 6.149 | 1.719 | 1.739 | 1.732 | 1.687 |
| $k_{20}$ | 4.965 | 0.321 | 0.258 | 0.217 | 0.188 |
| $d_{20}$ (nm) | 1.046 | 148.502 | 203.950 | 262.757 | 198.716 |
| When $n_1 \geqq n_{10}$, $n_{1m}$ = | 1.997 | 1.925 | 1.936 | 1.942 | 1.700 |
| When $n_1 < n_{10}$, $n_{1m}$ = | 1.902 | 1.861 | 1.842 | 1.830 | 1.690 |
| When $k_1 \geqq k_{10}$, $k_{1m}$ = | 0.155 | 0.135 | 0.124 | 0.122 | 0.079 |
| When $k_1 < k_{10}$, $k_{1m}$ = | 0.064 | 0.044 | 0.004 | 0.000 | 0.061 |
| When $d_1 \geqq d_{10}$, $d_{1m}$ (nm) = | 38.478 | 21.745 | 20.735 | 20.064 | 166.973 |
| When $d_1 < d_{10}$, $d_{1m}$ (nm) = | 32.365 | 16.569 | 13.305 | 11.354 | 161.165 |
| When $n_2 \geqq n_{20}$, $n_{2m}$ = | 6.640 | 1.749 | 1.787 | 1.793 | 1.688 |
| When $n_2 < n_{20}$, $n_{2m}$ = | 5.695 | 1.636 | 1.643 | 1.623 | 1.668 |
| When $k_2 \geqq k_{20}$, $k_{2m}$ = | 5.267 | 0.354 | 0.304 | 0.266 | 0.197 |
| When $k_2 < k_{20}$, $k_{2m}$ = | 4.500 | 0.266 | 0.202 | 0.162 | 0.165 |
| When $d_2 \geqq d_{20}$, $d_{2m}$ (nm) = | 1.189 | ∞ | ∞ | ∞ | 199.493 |
| When $d_2 < d_{20}$, $d_{2m}$ (nm) = | 0.912 | 129.925 | 173.046 | 186.094 | 188.055 |

1.3 < NA ≦ 1.4
15 < T ≦ 25

| Case | 2-06 | 2-07 | 2-08 | 2-09 | 2-10 |
|---|---|---|---|---|---|
| $n_{10}$ | 1.692 | 1.706 | 1.711 | 1.704 | 1.695 |
| $k_{10}$ | 0.059 | 0.052 | 0.075 | 0.059 | 0.056 |
| $d_{10}$ (nm) | 157.652 | 221.303 | 235.815 | 225.762 | 267.452 |
| $n_{20}$ | 1.696 | 1.695 | 6.235 | 1.687 | 1.705 |
| $k_{20}$ | 0.161 | 0.165 | 4.691 | 0.197 | 0.194 |
| $d_{20}$ (nm) | 257.279 | 252.591 | 0.724 | 194.502 | 204.028 |
| When $n_1 \geqq n_{10}$, $n_{1m}$ = | 1.703 | 1.736 | 1.711 | 1.737 | 1.730 |
| When $n_1 < n_{10}$, $n_{1m}$ = | 1.667 | 1.690 | 1.709 | 1.692 | 1.658 |
| When $k_1 \geqq k_{10}$, $k_{1m}$ = | 0.082 | 0.079 | 0.079 | 0.082 | 0.080 |
| When $k_1 < k_{10}$, $k_{1m}$ = | 0.033 | 0.024 | 0.074 | 0.033 | 0.029 |
| When $d_1 \geqq d_{10}$, $d_{1m}$ (nm) = | 165.499 | ∞ | 235.852 | ∞ | ∞ |
| When $d_1 < d_{10}$, $d_{1m}$ (nm) = | 138.474 | 207.206 | 234.721 | 216.211 | 222.458 |
| When $n_2 \geqq n_{20}$, $n_{2m}$ = | 1.740 | 1.797 | 6.407 | 1.814 | 1.798 |
| When $n_2 < n_{20}$, $n_{2m}$ = | 1.670 | 1.616 | 6.233 | 1.613 | 1.629 |
| When $k_2 \geqq k_{20}$, $k_{2m}$ = | 0.196 | 0.249 | 4.693 | 0.270 | 0.240 |
| When $k_2 < k_{20}$, $k_{2m}$ = | 0.121 | 0.111 | 3.940 | 0.138 | 0.122 |
| When $d_2 \geqq d_{20}$, $d_{2m}$ (nm) = | ∞ | ∞ | 0.732 | ∞ | ∞ |
| When $d_2 < d_{20}$, $d_{2m}$ (nm) = | 244.077 | 220.690 | 0.720 | 173.495 | 171.776 |

1.3 < NA ≦ 1.4
25 < T ≦ 35

4/20

| Case | 3-01 | 3-02 | 3-03 | 3-04 | 3-05 | 3-06 |
|---|---|---|---|---|---|---|
| $n_{10}$ | 1.883 | 1.879 | 1.872 | 1.692 | 1.705 | 1.706 |
| $k_{10}$ | 0.119 | 0.084 | 0.069 | 0.061 | 0.061 | 0.054 |
| $d_{10}$ (nm) | 18.157 | 15.746 | 14.214 | 157.790 | 225.478 | 221.123 |
| $n_{20}$ | 1.723 | 1.741 | 1.737 | 1.697 | 1.687 | 1.695 |
| $k_{20}$ | 0.349 | 0.274 | 0.228 | 0.168 | 0.209 | 0.173 |
| $d_{20}$ (nm) | 139.788 | 195.542 | 253.893 | 248.784 | 186.105 | 244.149 |
| When $n_1 \geqq n_{10}$, $n_{1m}$ = | 1.927 | 1.939 | 1.945 | 1.699 | 1.735 | 1.735 |
| When $n_1 < n_{10}$, $n_{1m}$ = | 1.873 | 1.852 | 1.839 | 1.671 | 1.694 | 1.692 |
| When $k_1 \geqq k_{10}$, $k_{1m}$ = | 0.135 | 0.123 | 0.119 | 0.079 | 0.082 | 0.078 |
| When $k_1 < k_{10}$, $k_{1m}$ = | 0.055 | 0.011 | 0.000 | 0.039 | 0.038 | 0.026 |
| When $d_1 \geqq d_{10}$, $d_{1m}$ (nm) = | 21.683 | 20.446 | 19.836 | 161.921 | 270.295 | ∞ |
| When $d_1 < d_{10}$, $d_{1m}$ (nm) = | 17.423 | 13.775 | 11.786 | 145.560 | 217.505 | 209.346 |
| When $n_2 \geqq n_{20}$, $n_{2m}$ = | 1.744 | 1.786 | 1.794 | 1.735 | 1.754 | 1.781 |
| When $n_2 < n_{20}$, $n_{2m}$ = | 1.647 | 1.650 | 1.632 | 1.679 | 1.615 | 1.622 |
| When $k_2 \geqq k_{20}$, $k_{2m}$ = | 0.374 | 0.316 | 0.276 | 0.196 | 0.276 | 0.252 |
| When $k_2 < k_{20}$, $k_{2m}$ = | 0.295 | 0.218 | 0.173 | 0.130 | 0.149 | 0.118 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 124.317 | 167.810 | 181.193 | 239.270 | 167.329 | 214.946 |

1.3 < NA ≦ 1.4
35 < T ≦ 45

5/20

| Case | 4-01 | 4-02 | 4-03 | 4-04 | 4-05 |
|---|---|---|---|---|---|
| $n_{10}$ | 1.890 | 1.886 | 1.877 | 1.692 | 1.705 |
| $k_{10}$ | 0.130 | 0.088 | 0.073 | 0.062 | 0.063 |
| $d_{10}$ (nm) | 18.083 | 15.723 | 14.196 | 157.690 | 225.284 |
| $n_{20}$ | 1.714 | 1.743 | 1.736 | 1.697 | 1.687 |
| $k_{20}$ | 0.371 | 0.287 | 0.236 | 0.175 | 0.220 |
| $d_{20}$ (nm) | 132.495 | 187.112 | 245.779 | 240.328 | 177.345 |
| When $n_1 \geqq n_{10}$, $n_{1m}$ = | 1.928 | 1.943 | 1.947 | 1.695 | 1.732 |
| When $n_1 < n_{10}$, $n_{1m}$ = | 1.886 | 1.862 | 1.846 | 1.674 | 1.696 |
| When $k_1 \geqq k_{10}$, $k_{1m}$ = | 0.137 | 0.123 | 0.120 | 0.075 | 0.081 |
| When $k_1 < k_{10}$, $k_{1m}$ = | 0.069 | 0.018 | 0.000 | 0.046 | 0.042 |
| When $d_1 \geqq d_{10}$, $d_{1m}$ (nm) = | 21.026 | 19.960 | 19.411 | 159.493 | 266.580 |
| When $d_1 < d_{10}$, $d_{1m}$ (nm) = | 17.768 | 14.046 | 12.019 | 148.447 | 218.746 |
| When $n_2 \geqq n_{20}$, $n_{2m}$ = | 1.723 | 1.784 | 1.789 | 1.731 | 1.745 |
| When $n_2 < n_{20}$, $n_{2m}$ = | 1.643 | 1.655 | 1.634 | 1.687 | 1.620 |
| When $k_2 \geqq k_{20}$, $k_{2m}$ = | 0.382 | 0.326 | 0.281 | 0.195 | 0.283 |
| When $k_2 < k_{20}$, $k_{2m}$ = | 0.323 | 0.234 | 0.182 | 0.141 | 0.159 |
| When $d_2 \geqq d_{20}$, $d_{2m}$ (nm) = | ∞ | ∞ | ∞ | 273.632 | ∞ |
| When $d_2 < d_{20}$, $d_{2m}$ (nm) = | 119.322 | 160.895 | 176.028 | 234.699 | 160.070 |

1.3 < NA ≦ 1.4
35 < T ≦ 45

| Case | 4-06 | 4-07 |
|---|---|---|
| $n_{10}$ | 1.706 | 1.695 |
| $k_{10}$ | 0.055 | 0.055 |
| $d_{10}$ (nm) | 220.863 | 262.917 |
| $n_{20}$ | 1.695 | 1.705 |
| $k_{20}$ | 0.180 | 0.178 |
| $d_{20}$ (nm) | 235.453 | 255.408 |
| When $n_1 \geqq n_{10}$, $n_{1m}$ = | 1.734 | 1.723 |
| When $n_1 < n_{10}$, $n_{1m}$ = | 1.693 | 1.660 |
| When $k_1 \geqq k_{10}$, $k_{1m}$ = | 0.078 | 0.082 |
| When $k_1 < k_{10}$, $k_{1m}$ = | 0.027 | 0.031 |
| When $d_1 \geqq d_{10}$, $d_{1m}$ (nm) = | ∞ | ∞ |
| When $d_1 < d_{10}$, $d_{1m}$ (nm) = | 210.617 | 221.552 |
| When $n_2 \geqq n_{20}$, $n_{2m}$ = | 1.767 | 1.832 |
| When $n_2 < n_{20}$, $n_{2m}$ = | 1.630 | 1.613 |
| When $k_2 \geqq k_{20}$, $k_{2m}$ = | 0.252 | 0.241 |
| When $k_2 < k_{20}$, $k_{2m}$ = | 0.123 | 0.108 |
| When $d_2 \geqq d_{20}$, $d_{2m}$ (nm) = | ∞ | ∞ |
| When $d_2 < d_{20}$, $d_{2m}$ (nm) = | 206.982 | 177.439 |

1.3 < NA ≦ 1.4
45 < T ≦ 55

6/20

| Case | 5-01 | 5-02 | 5-03 | 5-04 | 5-05 |
|---|---|---|---|---|---|
| $n_{10}$ | 1.891 | 1.892 | 1.878 | 1.691 | 1.705 |
| $k_{10}$ | 0.144 | 0.091 | 0.079 | 0.064 | 0.064 |
| $d_{10}$ (nm) | 17.530 | 15.545 | 14.050 | 157.168 | 225.395 |
| $n_{20}$ | 1.686 | 1.744 | 1.728 | 1.696 | 1.686 |
| $k_{20}$ | 0.376 | 0.296 | 0.240 | 0.179 | 0.227 |
| $d_{20}$ (nm) | 126.586 | 178.253 | 238.151 | 231.953 | 167.881 |
| When $n_1 \geqq n_{10}$, $n_{1m}$ = | 1.925 | 1.947 | 1.947 | 1.692 | 1.729 |
| When $n_1 < n_{10}$, $n_{1m}$ = | 1.891 | 1.870 | 1.849 | 1.677 | 1.698 |
| When $k_1 \geqq k_{10}$, $k_{1m}$ = | 0.144 | 0.124 | 0.124 | 0.069 | 0.080 |
| When $k_1 < k_{10}$, $k_{1m}$ = | 0.087 | 0.024 | 0.000 | 0.054 | 0.044 |
| When $d_1 \geqq d_{10}$, $d_{1m}$ (nm) = | 19.955 | 19.462 | 18.998 | 157.553 | 251.532 |
| When $d_1 < d_{10}$, $d_{1m}$ (nm) = | 17.523 | 14.081 | 12.045 | 150.032 | 219.912 |
| When $n_2 \geqq n_{20}$, $n_{2m}$ = | 1.686 | 1.783 | 1.778 | 1.727 | 1.728 |
| When $n_2 < n_{20}$, $n_{2m}$ = | 1.619 | 1.656 | 1.625 | 1.693 | 1.628 |
| When $k_2 \geqq k_{20}$, $k_{2m}$ = | 0.377 | 0.330 | 0.281 | 0.190 | 0.292 |
| When $k_2 < k_{20}$, $k_{2m}$ = | 0.336 | 0.244 | 0.186 | 0.164 | 0.167 |
| When $d_2 \geqq d_{20}$, $d_{2m}$ (nm) = | 127.104 | ∞ | ∞ | 253.769 | ∞ |
| When $d_2 < d_{20}$, $d_{2m}$ (nm) = | 114.397 | 150.903 | 169.614 | 229.862 | 150.571 |

1.3 < NA ≦ 1.4
45 < T ≦ 55

| Case | 5-06 | 5-07 |
|---|---|---|
| $n_{10}$ | 1.706 | 1.697 |
| $k_{10}$ | 0.056 | 0.047 |
| $d_{10}$ (nm) | 220.607 | 278.691 |
| $n_{20}$ | 1.694 | 1.700 |
| $k_{20}$ | 0.184 | 0.152 |
| $d_{20}$ (nm) | 226.210 | 281.986 |
| When $n_1 \geqq n_{10}$, $n_{1m}$ = | 1.728 | 1.753 |
| When $n_1 < n_{10}$, $n_{1m}$ = | 1.694 | 1.654 |
| When $k_1 \geqq k_{10}$, $k_{1m}$ = | 0.077 | 0.078 |
| When $k_1 < k_{10}$, $k_{1m}$ = | 0.029 | 0.021 |
| When $d_1 \geqq d_{10}$, $d_{1m}$ (nm) = | ∞ | ∞ |
| When $d_1 < d_{10}$, $d_{1m}$ (nm) = | 210.961 | 211.857 |
| When $n_2 \geqq n_{20}$, $n_{2m}$ = | 1.757 | 1.912 |
| When $n_2 < n_{20}$, $n_{2m}$ = | 1.639 | 1.611 |
| When $k_2 \geqq k_{20}$, $k_{2m}$ = | 0.250 | 0.220 |
| When $k_2 < k_{20}$, $k_{2m}$ = | 0.125 | 0.096 |
| When $d_2 \geqq d_{20}$, $d_{2m}$ (nm) = | ∞ | ∞ |
| When $d_2 < d_{20}$, $d_{2m}$ (nm) = | 199.775 | 202.106 |

1.3 < NA ≦ 1.4
55 < T ≦ 65

7/20

| Case | 6-01 | 6-02 | 6-03 | 6-04 | 6-05 | 6-06 |
|---|---|---|---|---|---|---|
| $n_{10}$ | 1.896 | 1.875 | 1.705 | 1.705 | 1.708 | 1.697 |
| $k_{10}$ | 0.091 | 0.087 | 0.064 | 0.057 | 0.053 | 0.047 |
| $d_{10}$ (nm) | 15.652 | 14.019 | 225.606 | 220.354 | 218.289 | 278.413 |
| $n_{20}$ | 1.752 | 1.715 | 1.687 | 1.694 | 1.707 | 1.701 |
| $k_{20}$ | 0.303 | 0.239 | 0.232 | 0.186 | 0.158 | 0.154 |
| $d_{20}$ (nm) | 167.408 | 230.256 | 157.678 | 216.433 | 272.538 | 271.867 |
| When $n_1 \geqq n_{10}$, $n_{1m}$ = | 1.950 | 1.943 | 1.724 | 1.723 | 1.740 | 1.750 |
| When $n_1 < n_{10}$, $n_{1m}$ = | 1.875 | 1.846 | 1.699 | 1.693 | 1.693 | 1.656 |
| When $k_1 \geqq k_{10}$, $k_{1m}$ = | 0.122 | 0.132 | 0.079 | 0.077 | 0.077 | 0.078 |
| When $k_1 < k_{10}$, $k_{1m}$ = | 0.025 | 0.004 | 0.045 | 0.033 | 0.030 | 0.022 |
| When $d_1 \geqq d_{10}$, $d_{1m}$ (nm) = | 19.494 | 18.898 | 247.964 | ∞ | ∞ | ∞ |
| When $d_1 < d_{10}$, $d_{1m}$ (nm) = | 14.295 | 12.042 | 221.101 | 210.599 | 206.669 | 213.947 |
| When $n_2 \geqq n_{20}$, $n_{2m}$ = | 1.792 | 1.763 | 1.721 | 1.752 | 1.799 | 1.923 |
| When $n_2 < n_{20}$, $n_{2m}$ = | 1.662 | 1.612 | 1.638 | 1.648 | 1.579 | 1.614 |

-continued

| 1.3 < NA ≦ 1.4<br>55 < T ≦ 65 | | | | | | |
|---|---|---|---|---|---|---|
| Case | 6-01 | 6-02 | 6-03 | 6-04 | 6-05 | 7/20<br>6-06 |
| When $k_2 \geqq k_{20}$, $k_{2m}$ = | 0.337 | 0.279 | 0.301 | 0.247 | 0.230 | 0.223 |
| When $k_2 < k_{20}$, $k_{2m}$ = | 0.249 | 0.186 | 0.176 | 0.128 | 0.106 | 0.097 |
| When $d_2 \geqq d_{20}$, $d_{2m}$ (nm) = | ∞ | ∞ | 172.085 | ∞ | ∞ | ∞ |
| When $d_2 < d_{20}$, $d_{2m}$ (nm) = | 138.575 | 161.008 | 143.974 | 199.200 | 203.487 | 191.019 |

| 1.3 < NA ≦ 1.4<br>65 < T ≦ 75 | | | | | |
|---|---|---|---|---|---|
| Case | 7-01 | 7-02 | 7-03 | 7-04 | 8/20<br>7-05 |
| $n_{10}$ | 1.901 | 1.871 | 1.866 | 1.706 | 1.705 |
| $k_{10}$ | 0.088 | 0.093 | 0.067 | 0.065 | 0.057 |
| $d_{10}$ (nm) | 16.388 | 14.267 | 13.172 | 225.317 | 220.112 |
| $n_{20}$ | 1.774 | 1.706 | 1.724 | 1.687 | 1.694 |
| $k_{20}$ | 0.318 | 0.241 | 0.206 | 0.238 | 0.188 |
| $d_{20}$ (nm) | 154.194 | 221.319 | 275.098 | 147.740 | 206.685 |
| When $n_1 \geqq n_{10}$, $n_{1m}$ = | 1.955 | 1.937 | 1.947 | 1.721 | 1.721 |
| When $n_1 < n_{10}$, $n_{1m}$ = | 1.881 | 1.842 | 1.823 | 1.701 | 1.693 |
| When $k_1 \geqq k_{10}$, $k_{1m}$ = | 0.116 | 0.138 | 0.131 | 0.077 | 0.077 |
| When $k_1 < k_{10}$, $k_{1m}$ = | 0.024 | 0.011 | 0.000 | 0.045 | 0.035 |
| When $d_1 \geqq d_{10}$, $d_{1m}$ (nm) = | 20.279 | 19.161 | 19.228 | 239.263 | 245.793 |
| When $d_1 < d_{10}$, $d_{1m}$ (nm) = | 15.118 | 12.240 | 10.142 | 222.197 | 210.312 |
| When $n_2 \geqq n_{20}$, $n_{2m}$ = | 1.816 | 1.751 | 1.783 | 1.720 | 1.752 |
| When $n_2 < n_{20}$, $n_{2m}$ = | 1.683 | 1.603 | 1.616 | 1.644 | 1.651 |
| When $k_2 \geqq k_{20}$, $k_{2m}$ = | 0.355 | 0.280 | 0.254 | 0.305 | 0.246 |
| When $k_2 < k_{20}$, $k_{2m}$ = | 0.259 | 0.188 | 0.151 | 0.177 | 0.133 |
| When $d_2 \geqq d_{20}$, $d_{2m}$ (nm) = | ∞ | ∞ | ∞ | 161.062 | ∞ |
| When $d_2 < d_{20}$, $d_{2m}$ (nm) = | 132.898 | 152.054 | 192.936 | 136.808 | 191.952 |

| 1.3 < NA ≦ 1.4<br>75 < T ≦ 85 | | | | | |
|---|---|---|---|---|---|
| Case | 8-01 | 8-02 | 8-03 | 8-04 | 9/20<br>8-05 |
| $n_{10}$ | 1.908 | 1.871 | 1.869 | 1.706 | 1.705 |
| $k_{10}$ | 0.087 | 0.097 | 0.067 | 0.067 | 0.058 |
| $d_{10}$ (nm) | 17.362 | 14.654 | 13.479 | 224.641 | 220.026 |
| $n_{20}$ | 1.802 | 1.704 | 1.729 | 1.684 | 1.694 |
| $k_{20}$ | 0.342 | 0.250 | 0.214 | 0.248 | 0.194 |
| $d_{20}$ (nm) | 141.959 | 212.121 | 265.153 | 139.263 | 197.616 |
| When $n_1 \geqq n_{10}$, $n_{1m}$ = | 1.960 | 1.935 | 1.947 | 1.720 | 1.721 |
| When $n_1 < n_{10}$, $n_{1m}$ = | 1.891 | 1.843 | 1.828 | 1.704 | 1.694 |
| When $k_1 \geqq k_{10}$, $k_{1m}$ = | 0.111 | 0.140 | 0.128 | 0.074 | 0.078 |
| When $k_1 < k_{10}$, $k_{1m}$ = | 0.023 | 0.016 | 0.000 | 0.049 | 0.035 |
| When $d_1 \geqq d_{10}$, $d_{1m}$ (nm) = | 21.165 | 19.437 | 19.380 | 236.042 | 243.446 |
| When $d_1 < d_{10}$, $d_{1m}$ (nm) = | 16.261 | 12.685 | 10.599 | 223.100 | 210.844 |
| When $n_2 \geqq n_{20}$, $n_{2m}$ = | 1.843 | 1.746 | 1.787 | 1.711 | 1.754 |
| When $n_2 < n_{20}$, $n_{2m}$ = | 1.713 | 1.604 | 1.618 | 1.641 | 1.649 |
| When $k_2 \geqq k_{20}$, $k_{2m}$ = | 0.382 | 0.288 | 0.262 | 0.299 | 0.249 |
| When $k_2 < k_{20}$, $k_{2m}$ = | 0.279 | 0.196 | 0.159 | 0.184 | 0.134 |
| When $d_2 \geqq d_{20}$, $d_{2m}$ (nm) = | ∞ | ∞ | ∞ | 151.104 | ∞ |
| When $d_2 < d_{20}$, $d_{2m}$ (nm) = | 126.652 | 177.678 | 187.664 | 128.169 | 181.064 |

| 1.3 < NA ≦ 1.4<br>65 < T ≦ 75 | | |
|---|---|---|
| Case | 7-06 | 7-07 |
| $n_{10}$ | 1.708 | 1.697 |
| $k_{10}$ | 0.053 | 0.047 |
| $d_{10}$ (nm) | 218.342 | 278.070 |
| $n_{20}$ | 1.707 | 1.702 |
| $k_{20}$ | 0.161 | 0.156 |
| $d_{20}$ (nm) | 262.805 | 262.294 |
| When $n_1 \geqq n_{10}$, $n_{1m}$ = | 1.740 | 1.735 |
| When $n_1 < n_{10}$, $n_{1m}$ = | 1.695 | 1.657 |
| When $k_1 \geqq k_{10}$, $k_{1m}$ = | 0.077 | 0.077 |
| When $k_1 < k_{10}$, $k_{1m}$ = | 0.032 | 0.024 |
| When $d_1 \geqq d_{10}$, $d_{1m}$ (nm) = | ∞ | ∞ |
| When $d_1 < d_{10}$, $d_{1m}$ (nm) = | 208.328 | 215.902 |
| When $n_2 \geqq n_{20}$, $n_{2m}$ = | 1.805 | 1.806 |
| When $n_2 < n_{20}$, $n_{2m}$ = | 1.580 | 1.618 |
| When $k_2 \geqq k_{20}$, $k_{2m}$ = | 0.232 | 0.224 |
| When $k_2 < k_{20}$, $k_{2m}$ = | 0.108 | 0.097 |
| When $d_2 \geqq d_{20}$, $d_{2m}$ (nm) = | ∞ | ∞ |
| When $d_2 < d_{20}$, $d_{2m}$ (nm) = | 195.570 | 182.960 |

| 1.3 < NA ≦ 1.4<br>75 < T ≦ 85 | | |
|---|---|---|
| Case | 8-06 | 8-07 |
| $n_{10}$ | 1.708 | 1.697 |
| $k_{10}$ | 0.054 | 0.048 |
| $d_{10}$ (nm) | 218.429 | 277.999 |
| $n_{20}$ | 1.707 | 1.702 |
| $k_{20}$ | 0.165 | 0.160 |
| $d_{20}$ (nm) | 253.768 | 253.663 |
| When $n_1 \geqq n_{10}$, $n_{1m}$ = | 1.739 | 1.730 |
| When $n_1 < n_{10}$, $n_{1m}$ = | 1.697 | 1.656 |
| When $k_1 \geqq k_{10}$, $k_{1m}$ = | 0.076 | 0.076 |
| When $k_1 < k_{10}$, $k_{1m}$ = | 0.032 | 0.027 |
| When $d_1 \geqq d_{10}$, $d_{1m}$ (nm) = | ∞ | ∞ |
| When $d_1 < d_{10}$, $d_{1m}$ (nm) = | 209.931 | 217.650 |
| When $n_2 \geqq n_{20}$, $n_{2m}$ = | 1.810 | 1.804 |
| When $n_2 < n_{20}$, $n_{2m}$ = | 1.580 | 1.625 |
| When $k_2 \geqq k_{20}$, $k_{2m}$ = | 0.235 | 0.225 |
| When $k_2 < k_{20}$, $k_{2m}$ = | 0.109 | 0.100 |
| When $d_2 \geqq d_{20}$, $d_{2m}$ (nm) = | ∞ | ∞ |
| When $d_2 < d_{20}$, $d_{2m}$ (nm) = | 216.664 | 177.272 |

1.3 < NA ≦ 1.4
85 < T ≦ 95

| Case | 9-01 | 9-02 | 9-03 | 9-04 | 9-05 | 10/20 9-06 |
|---|---|---|---|---|---|---|
| $n_{10}$ | 1.918 | 1.876 | 1.874 | 1.706 | 1.709 | 1.697 |
| $k_{10}$ | 0.092 | 0.100 | 0.069 | 0.060 | 0.055 | 0.050 |
| $d_{10}$ (nm) | 17.977 | 14.944 | 13.674 | 219.996 | 218.382 | 278.074 |
| $n_{20}$ | 1.822 | 1.706 | 1.733 | 1.694 | 1.707 | 1.701 |
| $k_{20}$ | 0.371 | 0.265 | 0.224 | 0.203 | 0.172 | 0.166 |
| $d_{20}$ (nm) | 132.466 | 203.140 | 256.300 | 189.146 | 245.309 | 245.468 |
| When $n_1 \geqq n_{10}$, $n_{1m}$ = | 1.966 | 1.936 | 1.950 | 1.723 | 1.738 | 1.728 |
| When $n_1 < n_{10}$, $n_{1m}$ = | 1.905 | 1.851 | 1.836 | 1.696 | 1.699 | 1.655 |
| When $k_1 \geqq k_{10}$, $k_{1m}$ = | 0.109 | 0.138 | 0.126 | 0.078 | 0.075 | 0.075 |
| When $k_1 < k_{10}$, $k_{1m}$ = | 0.028 | 0.021 | 0.000 | 0.035 | 0.032 | 0.029 |
| When $d_1 \geqq d_{10}$, $d_{1m}$ (nm) = | 21.461 | 19.418 | 19.237 | 242.566 | ∞ | ∞ |
| When $d_1 < d_{10}$, $d_{1m}$ (nm) = | 17.167 | 13.206 | 11.040 | 212.120 | 211.373 | 219.101 |
| When $n_2 \geqq n_{20}$, $n_{2m}$ = | 1.855 | 1.745 | 1.789 | 1.754 | 1.811 | 1.805 |
| When $n_2 < n_{20}$, $n_{2m}$ = | 1.737 | 1.611 | 1.626 | 1.644 | 1.579 | 1.636 |
| When $k_2 \geqq k_{20}$, $k_{2m}$ = | 0.407 | 0.300 | 0.271 | 0.255 | 0.237 | 0.226 |
| When $k_2 < k_{20}$, $k_{2m}$ = | 0.308 | 0.211 | 0.169 | 0.143 | 0.115 | 0.106 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 121.537 | 173.052 | 183.002 | 168.954 | 213.072 | 172.052 |

1.3 < NA ≦ 1.4
95 < T ≦ 105

| | 10-01 | 10-02 | 10-03 | 10-04 | 11/20 10-05 |
|---|---|---|---|---|---|
| $n_{10}$ | 1.929 | 1.883 | 1.880 | 1.707 | 1.709 |
| $k_{10}$ | 0.101 | 0.103 | 0.071 | 0.062 | 0.057 |
| $d_{10}$ (nm) | 17.864 | 14.973 | 13.709 | 219.774 | 218.071 |
| $n_{20}$ | 1.821 | 1.709 | 1.736 | 1.693 | 1.706 |
| $k_{20}$ | 0.398 | 0.279 | 0.234 | 0.214 | 0.179 |
| $d_{20}$ (nm) | 125.532 | 194.479 | 247.823 | 180.753 | 237.020 |
| When $n_1 \geqq n_{10}$, $n_{1m}$ = | 1.973 | 1.940 | 1.953 | 1.724 | 1.737 |
| When $n_1 < n_{10}$, $n_{1m}$ = | 1.922 | 1.863 | 1.845 | 1.698 | 1.701 |
| When $k_1 \geqq k_{10}$, $k_{1m}$ = | 0.111 | 0.136 | 0.124 | 0.077 | 0.074 |
| When $k_1 < k_{10}$, $k_{1m}$ = | 0.042 | 0.027 | 0.000 | 0.035 | 0.034 |
| When $d_1 \geqq d_{10}$, $d_{1m}$ (nm) = | 20.839 | 19.023 | 18.857 | 241.722 | ∞ |
| When $d_1 < d_{10}$, $d_{1m}$ (nm) = | 17.465 | 13.566 | 11.352 | 213.515 | 212.546 |
| When $n_2 \geqq n_{20}$, $n_{2m}$ = | 1.840 | 1.742 | 1.789 | 1.751 | 1.807 |
| When $n_2 < n_{20}$, $n_{2m}$ = | 1.743 | 1.619 | 1.632 | 1.642 | 1.577 |
| When $k_2 \geqq k_{20}$, $k_{2m}$ = | 0.418 | 0.310 | 0.278 | 0.260 | 0.236 |
| When $k_2 < k_{20}$, $k_{2m}$ = | 0.340 | 0.227 | 0.180 | 0.155 | 0.122 |
| When $d_2 \geqq d_{20}$, $d_{2m}$ (nm) = | 161.544 | ∞ | ∞ | ∞ | ∞ |
| When $d_2 < d_{20}$, $d_{2m}$ (nm) = | 119.422 | 166.497 | 178.361 | 161.067 | 205.891 |

1.3 < NA ≦ 1.4
95 < T ≦ 105

| Case | 10-06 |
|---|---|
| $n_{10}$ | 1.697 |
| $k_{10}$ | 0.047 |
| $d_{10}$ (nm) | 275.083 |
| $n_{20}$ | 1.700 |
| $k_{20}$ | 0.148 |
| $d_{20}$ (nm) | 295.680 |
| When $n_1 \geqq n_{10}$, $n_{1m}$ = | 1.768 |
| When $n_1 < n_{10}$, $n_{1m}$ = | 1.650 |
| When $k_1 \geqq k_{10}$, $k_{1m}$ = | 0.079 |
| When $k_1 < k_{10}$, $k_{1m}$ = | 0.023 |
| When $d_1 \geqq d_{10}$, $d_{1m}$ (nm) = | ∞ |
| When $d_1 < d_{10}$, $d_{1m}$ (nm) = | 200.276 |
| When $n_2 \geqq n_{20}$, $n_{2m}$ = | 1.849 |
| When $n_2 < n_{20}$, $n_{2m}$ = | 1.604 |
| When $k_2 \geqq k_{20}$, $k_{2m}$ = | 0.227 |
| When $k_2 < k_{20}$, $k_{2m}$ = | 0.093 |
| When $d_2 \geqq d_{20}$, $d_{2m}$ (nm) = | ∞ |
| When $d_2 < d_{20}$, $d_{2m}$ (nm) = | 212.971 |

1.3 < NA ≦ 1.4
105 < T ≦ 115

| Case | 11-01 | 11-02 | 11-03 | 11-04 | 12/20 11-05 |
|---|---|---|---|---|---|
| $n_{10}$ | 1.891 | 1.885 | 1.707 | 1.709 | 1.697 |
| $k_{10}$ | 0.108 | 0.074 | 0.064 | 0.058 | 0.048 |
| $d_{10}$ (nm) | 14.702 | 13.594 | 219.485 | 217.678 | 275.043 |
| $n_{20}$ | 1.707 | 1.735 | 1.692 | 1.705 | 1.701 |
| $k_{20}$ | 0.289 | 0.241 | 0.223 | 0.184 | 0.152 |
| $d_{20}$ (nm) | 186.368 | 239.426 | 171.867 | 228.411 | 286.426 |
| When $n_1 \geqq n_{10}$, $n_{1m}$ = | 1.944 | 1.955 | 1.723 | 1.736 | 1.767 |
| When $n_1 < n_{10}$, $n_{1m}$ = | 1.874 | 1.853 | 1.700 | 1.703 | 1.650 |
| When $k_1 \geqq k_{10}$, $k_{1m}$ = | 0.135 | 0.124 | 0.077 | 0.073 | 0.078 |
| When $k_1 < k_{10}$, $k_{1m}$ = | 0.035 | 0.000 | 0.037 | 0.036 | 0.023 |
| When $d_1 \geqq d_{10}$, $d_{1m}$ (nm) = | 18.320 | 18.363 | 240.271 | ∞ | ∞ |
| When $d_1 < d_{10}$, $d_{1m}$ (nm) = | 13.618 | 11.476 | 214.658 | 213.396 | 201.239 |
| When $n_2 \geqq n_{20}$, $n_{2m}$ = | 1.733 | 1.786 | 1.744 | 1.797 | 1.850 |
| When $n_2 < n_{20}$, $n_{2m}$ = | 1.620 | 1.632 | 1.646 | 1.574 | 1.606 |
| When $k_2 \geqq k_{20}$, $k_{2m}$ = | 0.314 | 0.282 | 0.261 | 0.232 | 0.229 |
| When $k_2 < k_{20}$, $k_{2m}$ = | 0.241 | 0.188 | 0.163 | 0.126 | 0.094 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 157.397 | 173.024 | 156.390 | 195.169 | 202.551 |

| Case | 12-01 | 12-02 | 12-03 | 12-04 | 13/20 12-05 |
|---|---|---|---|---|---|
| | 1.3 < NA ≦ 1.4 115 < T ≦ 125 | | | | |
| $n_{10}$ | 1.896 | 1.887 | 1.692 | 1.707 | 1.709 |
| $k_{10}$ | 0.113 | 0.078 | 0.059 | 0.065 | 0.059 |
| $d_{10}$ (nm) | 14.435 | 13.577 | 153.772 | 219.581 | 217.561 |
| $n_{20}$ | 1.703 | 1.733 | 1.694 | 1.692 | 1.702 |
| $k_{20}$ | 0.295 | 0.244 | 0.154 | 0.231 | 0.188 |
| $d_{20}$ (nm) | 177.615 | 230.253 | 284.837 | 161.904 | 219.131 |
| When $n_1 \geqq n_{10}$, $n_{1m}$ = | 1.947 | 1.955 | 1.718 | 1.720 | 1.728 |
| When $n_1 < n_{10}$, $n_{1m}$ = | 1.882 | 1.856 | 1.664 | 1.701 | 1.703 |
| When $k_1 \geqq k_{10}$, $k_{1m}$ = | 0.136 | 0.126 | 0.090 | 0.076 | 0.072 |
| When $k_1 < k_{10}$, $k_{1m}$ = | 0.044 | 0.000 | 0.044 | 0.041 | 0.040 |
| When $d_1 \geqq d_{10}$, $d_{1m}$ (nm) = | 17.718 | 18.125 | 175.199 | 231.299 | ∞ |
| When $d_1 < d_{10}$, $d_{1m}$ (nm) = | 13.578 | 11.595 | 128.388 | 215.799 | 214.049 |
| When $n_2 \geqq n_{20}$, $n_{2m}$ = | 1.725 | 1.783 | 1.772 | 1.738 | 1.784 |
| When $n_2 < n_{20}$, $n_{2m}$ = | 1.617 | 1.629 | 1.642 | 1.658 | 1.629 |
| When $k_2 \geqq k_{20}$, $k_{2m}$ = | 0.315 | 0.284 | 0.182 | 0.262 | 0.229 |
| When $k_2 < k_{20}$, $k_{2m}$ = | 0.249 | 0.192 | 0.119 | 0.174 | 0.128 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 145.196 | 165.335 | 240.440 | 152.266 | 193.496 |

| Case | 12-06 | 12-07 |
|---|---|---|
| | 1.3 < NA ≦ 1.4 115 < T ≦ 125 | |
| $n_{10}$ | 1.707 | 1.697 |
| $k_{10}$ | 0.053 | 0.048 |
| $d_{10}$ (nm) | 216.484 | 274.812 |
| $n_{20}$ | 1.695 | 1.701 |
| $k_{20}$ | 0.157 | 0.154 |
| $d_{20}$ (nm) | 278.062 | 276.656 |
| When $n_1 \geqq n_{10}$, $n_{1m}$ = | 1.748 | 1.768 |
| When $n_1 < n_{10}$, $n_{1m}$ = | 1.689 | 1.651 |
| When $k_1 \geqq k_{10}$, $k_{1m}$ = | 0.077 | 0.078 |
| When $k_1 < k_{10}$, $k_{1m}$ = | 0.030 | 0.024 |
| When $d_1 \geqq d_{10}$, $d_{1m}$ (nm) = | ∞ | ∞ |
| When $d_1 < d_{10}$, $d_{1m}$ (nm) = | 199.849 | 201.932 |
| When $n_2 \geqq n_{20}$, $n_{2m}$ = | 1.761 | 1.850 |
| When $n_2 < n_{20}$, $n_{2m}$ = | 1.583 | 1.607 |
| When $k_2 \geqq k_{20}$, $k_{2m}$ = | 0.215 | 0.229 |
| When $k_2 < k_{20}$, $k_{2m}$ = | 0.104 | 0.098 |
| When $d_2 \geqq d_{20}$, $d_{2m}$ (nm) = | ∞ | ∞ |
| When $d_2 < d_{20}$, $d_{2m}$ (nm) = | 212.463 | 192.106 |

| Case | 13-01 | 13-02 | 13-03 | 13-04 | 14/20 13-05 |
|---|---|---|---|---|---|
| | 1.3 < NA ≦ 1.4 125 < T ≦ 135 | | | | |
| $n_{10}$ | 1.898 | 1.885 | 1.868 | 1.707 | 1.708 |
| $k_{10}$ | 0.115 | 0.081 | 0.075 | 0.067 | 0.060 |
| $d_{10}$ (nm) | 14.632 | 13.917 | 12.752 | 219.938 | 217.756 |
| $n_{20}$ | 1.705 | 1.732 | 1.713 | 1.695 | 1.701 |
| $k_{20}$ | 0.303 | 0.248 | 0.206 | 0.239 | 0.192 |
| $d_{20}$ (nm) | 166.646 | 219.851 | 279.921 | 151.390 | 209.457 |
| When $n_1 \geqq n_{10}$, $n_{1m}$ = | 1.949 | 1.951 | 1.949 | 1.716 | 1.721 |
| When $n_1 < n_{10}$, $n_{1m}$ = | 1.886 | 1.855 | 1.830 | 1.703 | 1.704 |
| When $k_1 \geqq k_{10}$, $k_{1m}$ = | 0.135 | 0.127 | 0.135 | 0.075 | 0.072 |
| When $k_1 < k_{10}$, $k_{1m}$ = | 0.050 | 0.002 | 0.000 | 0.050 | 0.045 |
| When $d_1 \geqq d_{10}$, $d_{1m}$ (nm) = | 17.809 | 18.468 | 18.469 | 226.140 | ∞ |
| When $d_1 < d_{10}$, $d_{1m}$ (nm) = | 13.869 | 11.960 | 10.161 | 217.246 | 214.692 |
| When $n_2 \geqq n_{20}$, $n_{2m}$ = | 1.725 | 1.781 | 1.771 | 1.731 | 1.769 |
| When $n_2 < n_{20}$, $n_{2m}$ = | 1.618 | 1.628 | 1.611 | 1.678 | 1.659 |
| When $k_2 \geqq k_{20}$, $k_{2m}$ = | 0.322 | 0.288 | 0.250 | 0.263 | 0.228 |
| When $k_2 < k_{20}$, $k_{2m}$ = | 0.256 | 0.194 | 0.153 | 0.185 | 0.138 |
| When $d_2 \geqq d_{20}$, $d_{2m}$ (nm) = | ∞ | ∞ | ∞ | 179.041 | ∞ |
| When $d_2 < d_{20}$, $d_{2m}$ (nm) = | 136.370 | 153.796 | 194.427 | 147.510 | 199.403 |

| Case | 13-06 | 13-07 |
|---|---|---|
| | 1.3 < NA ≦ 1.4 125 < T ≦ 135 | |
| $n_{10}$ | 1.706 | 1.696 |
| $k_{10}$ | 0.054 | 0.049 |
| $d_{10}$ (nm) | 217.065 | 274.075 |
| $n_{20}$ | 1.694 | 1.702 |
| $k_{20}$ | 0.160 | 0.157 |
| $d_{20}$ (nm) | 268.021 | 267.366 |
| When $n_1 \geqq n_{10}$, $n_{1m}$ = | 1.746 | 1.770 |
| When $n_1 < n_{10}$, $n_{1m}$ = | 1.690 | 1.651 |
| When $k_1 \geqq k_{10}$, $k_{1m}$ = | 0.077 | 0.078 |
| When $k_1 < k_{10}$, $k_{1m}$ = | 0.033 | 0.026 |
| When $d_1 \geqq d_{10}$, $d_{1m}$ (nm) = | ∞ | ∞ |
| When $d_1 < d_{10}$, $d_{1m}$ (nm) = | 202.380 | 202.716 |
| When $n_2 \geqq n_{20}$, $n_{2m}$ = | 1.761 | 1.853 |
| When $n_2 < n_{20}$, $n_{2m}$ = | 1.586 | 1.608 |
| When $k_2 \geqq k_{20}$, $k_{2m}$ = | 0.219 | 0.227 |
| When $k_2 < k_{20}$, $k_{2m}$ = | 0.106 | 0.099 |
| When $d_2 \geqq d_{20}$, $d_{2m}$ (nm) = | ∞ | ∞ |
| When $d_2 < d_{20}$, $d_{2m}$ (nm) = | 208.129 | 186.947 |

| Case | 14-01 | 14-02 | 14-03 | 14-04 | 14-05 | 15/20 14-06 |
|---|---|---|---|---|---|---|
| | 1.3 < NA ≦ 1.4 135 < T ≦ 145 | | | | | |
| $n_{10}$ | 1.899 | 1.882 | 1.870 | 1.708 | 1.707 | 1.696 |
| $k_{10}$ | 0.115 | 0.083 | 0.074 | 0.062 | 0.055 | 0.050 |
| $d_{10}$ (nm) | 15.367 | 14.477 | 13.063 | 217.887 | 217.378 | 273.384 |
| $n_{20}$ | 1.714 | 1.732 | 1.717 | 1.700 | 1.693 | 1.702 |
| $k_{20}$ | 0.318 | 0.256 | 0.212 | 0.197 | 0.164 | 0.160 |
| $d_{20}$ (nm) | 155.141 | 209.893 | 269.637 | 200.272 | 258.646 | 258.714 |
| When $n_1 \geqq n_{10}$, $n_{1m}$ = | 1.949 | 1.947 | 1.949 | 1.716 | 1.744 | 1.741 |
| When $n_1 < n_{10}$, $n_{1m}$ = | 1.888 | 1.854 | 1.833 | 1.704 | 1.691 | 1.652 |
| When $k_1 \geqq k_{10}$, $k_{1m}$ = | 0.132 | 0.127 | 0.132 | 0.071 | 0.077 | 0.078 |
| When $k_1 < k_{10}$, $k_{1m}$ = | 0.051 | 0.006 | 0.000 | 0.050 | 0.036 | 0.028 |
| When $d_1 \geqq d_{10}$, $d_{1m}$ (nm) = | 18.581 | 19.085 | 18.767 | ∞ | ∞ | ∞ |
| When $d_1 < d_{10}$, $d_{1m}$ (nm) = | 14.660 | 12.539 | 10.533 | 215.374 | 204.778 | 209.881 |
| When $n_2 \geqq n_{20}$, $n_{2m}$ = | 1.733 | 1.780 | 1.774 | 1.754 | 1.760 | 1.859 |
| When $n_2 < n_{20}$, $n_{2m}$ = | 1.627 | 1.630 | 1.611 | 1.677 | 1.592 | 1.608 |

-continued 1.3 < NA ≦ 1.4
135 < T ≦ 145

| Case | 14-01 | 14-02 | 14-03 | 14-04 | 14-05 | 15/20 14-06 |
|---|---|---|---|---|---|---|
| When $k_2 \geqq k_{20}$, $k_{2m}$ = | 0.337 | 0.296 | 0.256 | 0.228 | 0.223 | 0.226 |
| When $k_2 < k_{20}$, $k_{2m}$ = | 0.266 | 0.200 | 0.157 | 0.152 | 0.109 | 0.098 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 131.038 | 171.650 | 189.575 | 195.166 | 202.001 | 178.700 |

1.3 < NA ≦ 1.4
145 < T ≦ 155

| Case | 15-01 | 15-02 | 15-03 | 15-04 | 15-05 | 16/20 15-06 |
|---|---|---|---|---|---|---|
| $n_{10}$ | 1.903 | 1.884 | 1.874 | 1.708 | 1.707 | 1.696 |
| $k_{10}$ | 0.118 | 0.087 | 0.075 | 0.063 | 0.056 | 0.051 |
| $d_{10}$ (nm) | 16.130 | 14.896 | 13.357 | 217.693 | 217.044 | 273.493 |
| $n_{20}$ | 1.723 | 1.733 | 1.722 | 1.700 | 1.694 | 1.702 |
| $k_{20}$ | 0.340 | 0.268 | 0.221 | 0.205 | 0.169 | 0.165 |
| $d_{20}$ (nm) | 145.164 | 201.113 | 260.240 | 191.744 | 250.083 | 250.180 |
| When $n_1 \geqq n_{10}$, $n_{1m}$ = | 1.950 | 1.946 | 1.951 | 1.714 | 1.742 | 1.738 |
| When $n_1 < n_{10}$, $n_{1m}$ = | 1.895 | 1.858 | 1.839 | 1.706 | 1.694 | 1.652 |
| When $k_1 \geqq k_{10}$, $k_{1m}$ = | 0.130 | 0.127 | 0.128 | 0.070 | 0.076 | 0.078 |
| When $k_1 < k_{10}$, $k_{1m}$ = | 0.053 | 0.010 | 0.000 | 0.053 | 0.038 | 0.031 |
| When $d_1 \geqq d_{10}$, $d_{1m}$ (nm) = | 19.240 | 19.361 | 18.857 | 222.035 | ∞ | ∞ |
| When $d_1 < d_{10}$, $d_{1m}$ (nm) = | 15.619 | 13.105 | 10.992 | 216.109 | 206.771 | 213.326 |
| When $n_2 \geqq n_{20}$, $n_{2m}$ = | 1.737 | 1.779 | 1.777 | 1.735 | 1.755 | 1.839 |
| When $n_2 < n_{20}$, $n_{2m}$ = | 1.641 | 1.636 | 1.612 | 1.682 | 1.595 | 1.609 |
| When $k_2 \geqq k_{20}$, $k_{2m}$ = | 0.356 | 0.307 | 0.265 | 0.225 | 0.223 | 0.227 |
| When $k_2 < k_{20}$, $k_{2m}$ = | 0.286 | 0.211 | 0.166 | 0.161 | 0.114 | 0.102 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 126.286 | 170.199 | 185.156 | 187.971 | 215.684 | 171.738 |

1.3 < NA ≦ 1.4
155 < T ≦ 165

| Case | 16-01 | 16-02 | 16-03 | 16-04 | 16-05 | 17/20 16-06 |
|---|---|---|---|---|---|---|
| $n_{10}$ | 1.913 | 1.891 | 1.879 | 1.709 | 1.708 | 1.696 |
| $k_{10}$ | 0.125 | 0.091 | 0.077 | 0.064 | 0.057 | 0.052 |
| $d_{10}$ (nm) | 16.406 | 14.954 | 13.440 | 217.197 | 216.333 | 274.035 |
| $n_{20}$ | 1.727 | 1.734 | 1.724 | 1.700 | 1.694 | 1.700 |
| $k_{20}$ | 0.366 | 0.282 | 0.231 | 0.214 | 0.175 | 0.171 |
| $d_{20}$ (nm) | 136.777 | 193.024 | 251.802 | 183.446 | 241.739 | 241.498 |
| When $n_1 \geqq n_{10}$, $n_{1m}$ = | 1.955 | 1.950 | 1.953 | 1.714 | 1.742 | 1.735 |
| When $n_1 < n_{10}$, $n_{1m}$ = | 1.910 | 1.868 | 1.847 | 1.708 | 1.697 | 1.651 |
| When $k_1 \geqq k_{10}$, $k_{1m}$ = | 0.129 | 0.127 | 0.127 | 0.066 | 0.075 | 0.077 |
| When $k_1 < k_{10}$, $k_{1m}$ = | 0.064 | 0.016 | 0.000 | 0.055 | 0.039 | 0.034 |
| When $d_1 \geqq d_{10}$, $d_{1m}$ (nm) = | 19.185 | 19.061 | 18.574 | 220.596 | ∞ | ∞ |
| When $d_1 < d_{10}$, $d_{1m}$ (nm) = | 16.268 | 13.452 | 11.329 | 216.874 | 208.223 | 215.451 |
| When $n_2 \geqq n_{20}$, $n_{2m}$ = | 1.731 | 1.774 | 1.776 | 1.707 | 1.748 | 1.840 |
| When $n_2 < n_{20}$, $n_{2m}$ = | 1.651 | 1.642 | 1.618 | 1.678 | 1.595 | 1.612 |
| When $k_2 \geqq k_{20}$, $k_{2m}$ = | 0.371 | 0.317 | 0.273 | 0.218 | 0.220 | 0.229 |
| When $k_2 < k_{20}$, $k_{2m}$ = | 0.314 | 0.227 | 0.177 | 0.165 | 0.120 | 0.108 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 121.662 | 164.818 | 180.821 | 179.468 | 209.260 | 166.208 |

| 1.3 < NA ≦ 1.4<br>165 < T ≦ 175 | | | | 18/20 |
|---|---|---|---|---|
| Case | 17-01 | 17-02 | 17-03 | 17-04 |
| $n_{10}$ | 1.900 | 1.885 | 1.708 | 1.697 |
| $k_{10}$ | 0.097 | 0.082 | 0.058 | 0.048 |
| $d_{10}$ (nm) | 14.674 | 13.311 | 215.615 | 273.453 |
| $n_{20}$ | 1.732 | 1.722 | 1.694 | 1.699 |
| $k_{20}$ | 0.294 | 0.239 | 0.180 | 0.151 |
| $d_{20}$ (nm) | 185.336 | 243.911 | 233.152 | 289.720 |
| When $n_1 \geqq n_{10}$, $n_{1m}$ = | 1.955 | 1.956 | 1.741 | 1.736 |
| When $n_1 < n_{10}$, $n_{1m}$ = | 1.881 | 1.856 | 1.699 | 1.650 |
| When $k_1 \geqq k_{10}$, $k_{1m}$ = | 0.126 | 0.128 | 0.074 | 0.080 |
| When $k_1 < k_{10}$, $k_{1m}$ = | 0.023 | 0.000 | 0.039 | 0.020 |
| When $d_1 \geqq d_{10}$, $d_{1m}$ (nm) = | 18.346 | 18.029 | ∞ | ∞ |
| When $d_1 < d_{10}$, $d_{1m}$ (nm) = | 13.519 | 11.467 | 209.091 | 211.222 |
| When $n_2 \geqq n_{20}$, $n_{2m}$ = | 1.767 | 1.769 | 1.740 | 1.868 |
| When $n_2 < n_{20}$, $n_{2m}$ = | 1.645 | 1.618 | 1.591 | 1.614 |
| When $k_2 \geqq k_{20}$, $k_{2m}$ = | 0.322 | 0.277 | 0.217 | 0.224 |
| When $k_2 < k_{20}$, $k_{2m}$ = | 0.243 | 0.187 | 0.126 | 0.094 |
| When $d_2 \geqq d_{20}$, $d_{2m}$ (nm) = | ∞ | ∞ | ∞ | ∞ |
| When $d_2 < d_{20}$, $d_{2m}$ (nm) = | 156.774 | 176.585 | 198.961 | 204.980 |

| 1.3 < NA ≦ 1.4<br>175 < T ≦ 185 | | | | | |
|---|---|---|---|---|---|
| Case | 18-01 | 18-02 | 18-03 | 18-04 | 18-05 |
| $n_{10}$ | 1.908 | 1.888 | 1.708 | 1.709 | 1.697 |
| $k_{10}$ | 0.102 | 0.088 | 0.059 | 0.054 | 0.049 |
| $d_{10}$ (nm) | 14.316 | 13.163 | 215.377 | 215.137 | 273.522 |
| $n_{20}$ | 1.730 | 1.716 | 1.693 | 1.702 | 1.700 |
| $k_{20}$ | 0.303 | 0.243 | 0.185 | 0.158 | 0.154 |
| $d_{20}$ (nm) | 177.238 | 235.819 | 223.802 | 279.418 | 279.960 |
| When $n_1 \geqq n_{10}$, $n_{1m}$ = | 1.960 | 1.956 | 1.740 | 1.745 | 1.734 |
| When $n_1 < n_{10}$, $n_{1m}$ = | 1.893 | 1.861 | 1.700 | 1.696 | 1.657 |
| When $k_1 \geqq k_{10}$, $k_{1m}$ = | 0.126 | 0.131 | 0.073 | 0.075 | 0.079 |
| When $k_1 < k_{10}$, $k_{1m}$ = | 0.031 | 0.002 | 0.041 | 0.028 | 0.020 |
| When $d_1 \geqq d_{10}$, $d_{1m}$ (nm) = | 17.569 | 17.540 | ∞ | ∞ | ∞ |
| When $d_1 < d_{10}$, $d_{1m}$ (nm) = | 13.467 | 11.504 | 209.546 | 205.939 | 213.387 |
| When $n_2 \geqq n_{20}$, $n_{2m}$ = | 1.759 | 1.759 | 1.736 | 1.790 | 1.874 |
| When $n_2 < n_{20}$, $n_{2m}$ = | 1.644 | 1.611 | 1.587 | 1.604 | 1.617 |
| When $k_2 \geqq k_{20}$, $k_{2m}$ = | 0.325 | 0.278 | 0.217 | 0.211 | 0.226 |
| When $k_2 < k_{20}$, $k_{2m}$ = | 0.256 | 0.193 | 0.129 | 0.105 | 0.095 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 143.259 | 171.381 | 185.714 | 201.921 | 193.505 |

| 1.3 < NA ≦ 1.4<br>185 < T ≦ 195 | | | | | 19/20 |
|---|---|---|---|---|---|
| Case | 19-01 | 19-02 | 19-03 | 19-04 | 19-05 |
| $n_{10}$ | 1.914 | 1.886 | 1.873 | 1.692 | 1.708 |
| $k_{10}$ | 0.104 | 0.093 | 0.070 | 0.060 | 0.060 |
| $d_{10}$ (nm) | 14.390 | 13.299 | 12.581 | 152.854 | 215.913 |
| $n_{20}$ | 1.735 | 1.710 | 1.721 | 1.693 | 1.692 |
| $k_{20}$ | 0.314 | 0.247 | 0.208 | 0.157 | 0.189 |
| $d_{20}$ (nm) | 166.400 | 226.131 | 280.628 | 278.359 | 213.567 |
| When $n_1 \geqq n_{10}$, $n_{1m}$ = | 1.964 | 1.952 | 1.955 | 1.709 | 1.739 |
| When $n_1 < n_{10}$, $n_{1m}$ = | 1.903 | 1.860 | 1.833 | 1.664 | 1.699 |
| When $k_1 \geqq k_{10}$, $k_{1m}$ = | 0.123 | 0.135 | 0.133 | 0.092 | 0.074 |
| When $k_1 < k_{10}$, $k_{1m}$ = | 0.040 | 0.012 | 0.000 | 0.042 | 0.044 |
| When $d_1 \geqq d_{10}$, $d_{1m}$ (nm) = | 17.353 | 17.539 | 18.087 | 163.046 | ∞ |
| When $d_1 < d_{10}$, $d_{1m}$ (nm) = | 13.759 | 11.668 | 9.947 | 129.659 | 210.046 |
| When $n_2 \geqq n_{20}$, $n_{2m}$ = | 1.759 | 1.750 | 1.778 | 1.784 | 1.739 |
| When $n_2 < n_{20}$, $n_{2m}$ = | 1.648 | 1.604 | 1.614 | 1.659 | 1.586 |
| When $k_2 \geqq k_{20}$, $k_{2m}$ = | 0.331 | 0.280 | 0.252 | 0.196 | 0.222 |
| When $k_2 < k_{20}$, $k_{2m}$ = | 0.267 | 0.196 | 0.156 | 0.120 | 0.129 |
| When $d_2 \geqq d_{20}$, $d_{2m}$ (nm) = | ∞ | ∞ | ∞ | ∞ | ∞ |
| When $d_2 < d_{20}$, $d_{2m}$ (nm) = | 144.756 | 162.922 | 193.262 | 243.485 | 177.669 |

| 1.3 < NA ≦ 1.4<br>185 < T ≦ 195 | | |
|---|---|---|
| Case | 19-06 | 19-07 |
| $n_{10}$ | 1.708 | 1.697 |
| $k_{10}$ | 0.054 | 0.050 |
| $d_{10}$ (nm) | 215.905 | 273.350 |
| $n_{20}$ | 1.701 | 1.701 |
| $k_{20}$ | 0.161 | 0.157 |
| $d_{20}$ (nm) | 269.362 | 270.178 |
| When $n_1 \geqq n_{10}$, $n_{1m}$ = | 1.744 | 1.732 |
| When $n_1 < n_{10}$, $n_{1m}$ = | 1.697 | 1.658 |
| When $k_1 \geqq k_{10}$, $k_{1m}$ = | 0.075 | 0.078 |
| When $k_1 < k_{10}$, $k_{1m}$ = | 0.029 | 0.021 |
| When $d_1 \geqq d_{10}$, $d_{1m}$ (nm) = | ∞ | ∞ |
| When $d_1 < d_{10}$, $d_{1m}$ (nm) = | 207.633 | 215.326 |
| When $n_2 \geqq n_{20}$, $n_{2m}$ = | 1.795 | 1.877 |
| When $n_2 < n_{20}$, $n_{2m}$ = | 1.605 | 1.619 |
| When $k_2 \geqq k_{20}$, $k_{2m}$ = | 0.216 | 0.228 |
| When $k_2 < k_{20}$, $k_{2m}$ = | 0.105 | 0.098 |
| When $d_2 \geqq d_{20}$, $d_{2m}$ (nm) = | ∞ | ∞ |
| When $d_2 < d_{20}$, $d_{2m}$ (nm) = | 205.481 | 189.945 |

| 1.3 < NA ≦ 1.4<br>195 < T ≦ 205 | | | | | | 20/20 |
|---|---|---|---|---|---|---|
| Case | 20-01 | 20-02 | 20-03 | 20-04 | 20-05 | 20-06 |
| $n_{10}$ | 1.918 | 1.883 | 1.874 | 1.707 | 1.708 | 1.697 |
| $k_{10}$ | 0.103 | 0.095 | 0.068 | 0.061 | 0.055 | 0.050 |
| $d_{10}$ (nm) | 15.177 | 13.742 | 12.955 | 216.749 | 216.874 | 272.522 |
| $n_{20}$ | 1.753 | 1.708 | 1.728 | 1.693 | 1.699 | 1.701 |
| $k_{20}$ | 0.331 | 0.252 | 0.214 | 0.194 | 0.165 | 0.160 |
| $d_{20}$ (nm) | 153.467 | 215.835 | 269.400 | 203.628 | 259.716 | 261.468 |
| When $n_1 \geqq n_{10}$, $n_{1m}$ = | 1.966 | 1.948 | 1.955 | 1.739 | 1.743 | 1.731 |
| When $n_1 < n_{10}$, $n_{1m}$ = | 1.909 | 1.857 | 1.835 | 1.699 | 1.698 | 1.652 |
| When $k_1 \geqq k_{10}$, $k_{1m}$ = | 0.117 | 0.137 | 0.128 | 0.075 | 0.075 | 0.078 |
| When $k_1 < k_{10}$, $k_{1m}$ = | 0.043 | 0.016 | 0.000 | 0.048 | 0.030 | 0.022 |
| When $d_1 \geqq d_{10}$, $d_{1m}$ (nm) = | 18.089 | 18.051 | 18.523 | 256.743 | ∞ | ∞ |
| When $d_1 < d_{10}$, $d_{1m}$ (nm) = | 14.663 | 12.041 | 10.348 | 210.937 | 209.294 | 217.122 |
| When $n_2 \geqq n_{20}$, $n_{2m}$ = | 1.773 | 1.748 | 1.785 | 1.744 | 1.800 | 1.874 |
| When $n_2 < n_{20}$, $n_{2m}$ = | 1.665 | 1.604 | 1.616 | 1.589 | 1.608 | 1.620 |

-continued

| | 1.3 < NA ≦ 1.4<br>195 < T ≦ 205 | | | | | |
|---|---|---|---|---|---|---|
| Case | 20-01 | 20-02 | 20-03 | 20-04 | 20-05 | 20/20<br>20-06 |
| When $k_2 \geqq k_{20}$, $k_{2m}$ = | 0.348 | 0.285 | 0.259 | 0.230 | 0.223 | 0.227 |
| When $k_2 < k_{20}$, $k_{2m}$ = | 0.278 | 0.199 | 0.159 | 0.145 | 0.109 | 0.100 |
| When $d_2 \geqq d_{20}$, $d_{2m}$ (nm) = | ∞ | ∞ | ∞ | ∞ | ∞ | ∞ |
| When $d_2 < d_{20}$, $d_{2m}$ (nm) = | 140.260 | 150.984 | 188.160 | 180.549 | 200.943 | 184.530. |

6. The exposure method according to any one of claims 1 to 5, wherein the relations $d_1 \leqq 250$ and $d_2 \leqq 250$ are satisfied.

7. The exposure method according to any one of claims 1 to 5, wherein the refractive index of the resist layer is 1.60 to 1.80.

8. The exposure method according to any one of claims 1 to 5, wherein a topcoat layer is formed on the resist layer.

9. The exposure method according to any one of claims 1 to 5, wherein the space between the resist layer and the exposure system is filled with a medium having a refractive index of 1.44±0.02.

10. The exposure method according to Claim 9, wherein the medium is water.

* * * * *